US012225819B2

(12) United States Patent
Mun et al.

(10) Patent No.: US 12,225,819 B2
(45) Date of Patent: Feb. 11, 2025

(54) ORGANIC ELECTRONIC DEVICE

(71) Applicant: DUK SAN NEOLUX CO., LTD., Cheonan-si (KR)

(72) Inventors: Soung Yun Mun, Cheonan-si (KR); Min Ji Jo, Cheonan-si (KR); Chi Hyun Park, Cheonan-si (KR); Yong Wook Park, Cheonan-si (KR); Sun Hee Lee, Cheonan-si (KR); Jung Geun Lee, Cheonan-si (KR)

(73) Assignee: Duk San Neolux Co., Ltd. (KR)

(*) Notice: Subject to any disclaimer, the term of this patent is extended or adjusted under 35 U.S.C. 154(b) by 252 days.

(21) Appl. No.: 17/631,592

(22) PCT Filed: Jul. 30, 2020

(86) PCT No.: PCT/KR2020/010045

§ 371 (c)(1),
(2) Date: Jan. 31, 2022

(87) PCT Pub. No.: WO2021/025372

PCT Pub. Date: Feb. 11, 2021

(65) Prior Publication Data

US 2022/0376189 A1 Nov. 24, 2022

(30) Foreign Application Priority Data

Aug. 2, 2019 (KR) ........................ 10-2019-0094551
Apr. 20, 2020 (KR) ........................ 10-2020-0047638
Jul. 3, 2020 (KR) ........................ 10-2020-0082278

(51) Int. Cl.
*H01L 51/50* (2006.01)
*H10K 85/60* (2023.01)
(Continued)

(52) U.S. Cl.
CPC ....... *H10K 85/6574* (2023.02); *H10K 85/631* (2023.02); *H10K 85/6576* (2023.02); *H10K 50/125* (2023.02); *H10K 50/15* (2023.02)

(58) Field of Classification Search
CPC ............. H10K 85/6574; H10K 85/631; H10K 85/6576
See application file for complete search history.

(56) References Cited

U.S. PATENT DOCUMENTS 9,871,201 B2 1/2018 Pflumm et al.
9,917,272 B2 3/2018 Voges et al.
(Continued)

FOREIGN PATENT DOCUMENTS

CN 104718636 A 6/2015
CN 110010783 A 7/2019
(Continued)

OTHER PUBLICATIONS

Springer, R. et al. "Cool white light-emitting three stack OLED structures for AMOLED display applications", Optics Express, 2016, vol. 24, No. 24, pp. 28131-28142.
(Continued)

*Primary Examiner* — Anthony Ho
(74) *Attorney, Agent, or Firm* — Harness, Dickey & Pierce, P.L.C.

(57) ABSTRACT

Embodiments of the present invention relate to an organic electronic device capable of ensuring high luminous efficiency, low driving voltage and high heat resistance, and improving color purity or lifespan.

22 Claims, 5 Drawing Sheets

(51) Int. Cl.
*H10K 50/125* (2023.01)
*H10K 50/15* (2023.01)

(56) References Cited

U.S. PATENT DOCUMENTS

| | | | |
|---|---|---|---|
| 10,270,052 B2 | 4/2019 | Voges et al. |
| 2017/0237013 A1 | 8/2017 | Park et al. |
| 2018/0151806 A2 | 5/2018 | Park et al. |
| 2019/0245148 A1 | 8/2019 | Park et al. |
| 2019/0296244 A1 | 9/2019 | Mun et al. |
| 2019/0296248 A1 | 9/2019 | Mun et al. |

FOREIGN PATENT DOCUMENTS

| | | | |
|---|---|---|---|
| EP | 3518304 | A1 | 7/2019 |
| KR | 2016-0011522 | A | 2/2016 |
| KR | 2016-0074630 | A | 6/2016 |
| KR | 101668448 | B1 | 10/2016 |
| KR | 1020170080287 | A | 7/2017 |
| KR | 101789998 | B1 | 10/2017 |
| KR | 1020180034692 | A | 4/2018 |
| KR | 1020190003789 | A | 1/2019 |
| WO | 2013135352 | A1 | 9/2013 |
| WO | 2019066250 | A1 | 4/2019 |

OTHER PUBLICATIONS

International Search Report (English and Korean) and Written Opinion of the ISA (Korean) issued in PCT/KR2020/010045, mailed Nov. 16, 2020; ISA/KR.

ORGANIC ELECTRONIC DEVICE

CROSS-REFERENCE TO RELATED APPLICATIONS

This application is a U.S. National Phase Application under 35 U.S.C. 371 of International Application No. PCT/KR2020/010045, filed on Jul. 30, 2020, which claims the benefit of priority to Korean Patent Application No. 10-2019-0094551, filed on Aug. 2, 2019, Korean Patent Application No. 10-2020-0047638, filed on Apr. 20, 2020, and Korean Patent Application No. 10-2020-0082278, filed on Jul. 3, 2020. The entire disclosures of the above applications are incorporated by reference for all purposes as if fully set forth herein. In addition, when this application claims priority in countries other than the U.S.A. on the same basis, the entire contents of which are hereby incorporated by reference.

TECHNICAL FIELD

Embodiments of the present disclosure relate to an organic electronic device.

BACKGROUND ART

In general, organic electroluminescence refers to a phenomenon in which electrical energy is converted into light energy using an organic material. An organic electronic device using organic electroluminescence has a structure generally including an anode, a cathode, and an organic material layer positioned between the anode and the cathode. The organic material layer has a multilayer structure comprised of a plurality of layers formed of different materials to improve the efficiency and stability of the organic electronic device.

Currently, in the portable display market, displays are increasing in size to be large-area displays. Since portable displays are provided with a battery serving as a limited power source, portable displays require more efficient power consumption than that required by conventional portable displays. In addition, in this situation, not only the challenge for efficient power consumption but also challenges related to luminous efficiency and lifespan need to be solved.

In order to overcome the problems related to the power consumption, luminous efficiency, and lifespan, research on a tandem organic electronic device in which the organic material layer includes two or more stacks (or emission units) each including an emission layer has been undertaken. In particular, research for improving consumption, luminous efficiency, and lifespan by improving the organic material included in the stacks has been undertaken.

Efficiency, lifespan, a driving voltage, and the like are related to each other. An increase in efficiency leads to a relative decrease in driving voltage, by which the crystallization of the organic material due to Joule heating during driving may be reduced, thereby increasing the lifespan. However, simply improving the organic material layer may not maximize efficiency. This is because, when the optimal combination of the energy level and T1 value between each organic material and the intrinsic properties (e.g., mobility, interfacial properties) of the material are achieved, both increased lifespan and high efficiency may be achieved. Therefore, it is necessary to develop a material that may efficiently achieve charge balance in an emission layer while having high thermal stability.

In particular, in a tandem organic electronic device, the efficiency, lifespan, and driving voltage of the organic electronic device may vary depending on which organic materials are combined and used in specific layers.

DISCLOSURE

Technical Problem

Embodiments of the present disclosure may provide an organic electronic device having a low driving voltage, high efficiency, high color purity, and increased lifespan.

Technical Solution

In one aspect, an organic electronic device according to embodiments of the present disclosure includes a first electrode, a second electrode, and an organic material layer. The organic material layer is positioned between the first electrode and the second electrode, and includes a first stack, a second stack, and a third stack.

The first stack includes a first hole transport region, a first emission layer, and a first electron transport region.

The first hole transport region includes a first hole transport layer and a first auxiliary emission layer.

The first hole transport layer or the first auxiliary emission layer includes a first compound represented by the following Formula 1.

[Formula 1]

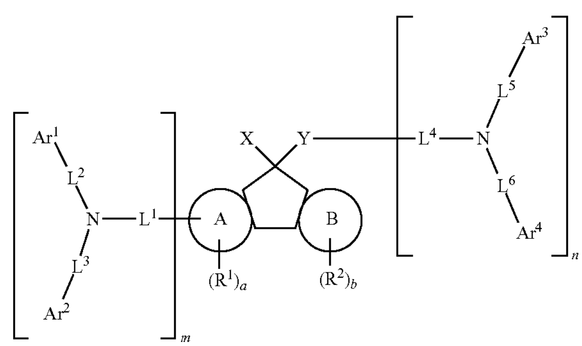

Advantageous Effects

Embodiments of the present disclosure may provide an organic electronic device in which high luminous efficiency, a low driving voltage, high thermal resistance, significantly improved color purity, and significantly increased lifespan are realized.

BEST MODE

Figure 1:
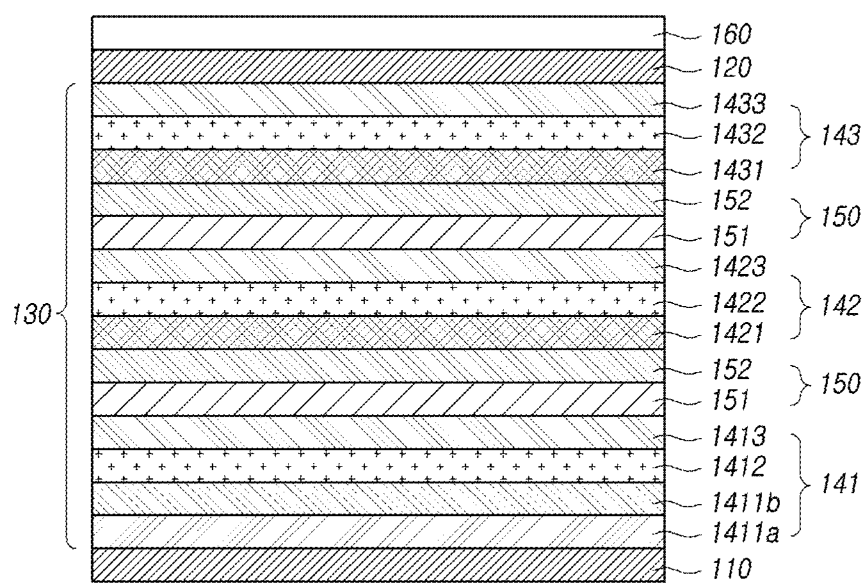
FIG. 1 is a diagram schematically illustrating an organic electronic device according to embodiments of the present disclosure.

Hereinafter, embodiments of the present disclosure will be described in detail with reference to the illustrative drawings.

In designating elements of the drawings by reference numerals, the same elements will be designated by the same reference numerals although they are shown in different drawings. Further, in the following description of the present disclosure, a detailed description of known functions and configurations incorporated herein will be omitted in the case in which the subject matter of the present disclosure may be rendered unclear thereby. It will be understood that the terms "comprise", "have", "consist of", and any variations thereof used herein are intended to cover non-exclusive inclusions unless explicitly stated to the contrary. Descriptions of elements in the singular form used herein are intended to include descriptions of elements in the plural form, unless explicitly stated to the contrary.

In addition, terms, such as first, second, A, B, (a), or (b), may be used herein when describing elements of the present disclosure. Each of these terminologies is not used to define an essence, order, or sequence of a corresponding element but used merely to distinguish the corresponding element from other elements.

It will be understood that when an element is referred to as being "connected", "coupled", or "joined" to another element, not only can it be "directly connected, coupled, or joined" to the other element, but it can also be "indirectly connected, coupled, or joined" to the other element via an "intervening" element. Here, the intervening element may be included in one or more of the two elements "connected", "coupled", or "joined" to each other.

In addition, it will be understood that when an element, such as a layer, a film, or a region, or a plate, is referred to as being "above" or "on" another element, not only can it be "directly" above or on the other element, but it can also be "indirectly" above or on the other element or layer via an "intervening" element. In contrast, when an element is referred to as being "directly" above or on another element, it will be understood that no intervening element is interposed.

When time relative terms, such as "after", "subsequent to", "next", "before", and the like, are used to describe elements, operating or manufacturing methods, and the like, these terms may be used to describe non-consecutive or non-sequential processes or operations unless the term "directly" or "immediately" is used together.

In addition, when any numerical values for elements or corresponding information are mentioned, it should be considered that numerical values for elements or corresponding information include a tolerance or error range that may be caused by various factors (e.g., process factors, internal or external impact, noise, etc.) even when a relevant description is not specified.

Unless otherwise stated, the term "halo" or "halogen", as used herein, refers to fluorine (F), chlorine (Cl), bromine (Br), iodine (I), or the like.

Unless otherwise stated, the term "alkyl" or "alkyl group", as used herein, may have a single bond of 1 to 60 carbon atoms, and refer to saturated aliphatic functional radicals including a straight chain alkyl group, a branched chain alkyl group, a cycloalkyl (alicyclic) group, an alkyl-substituted cycloalkyl group, or a cycloalkyl-substituted alkyl group.

Unless otherwise stated, the term "haloalkyl" or "halogen alkyl", as used herein, may include a halogen-substituted alkyl group.

Unless otherwise stated, the term "alkenyl" or "alkynyl", as used herein, may have a double or triple bond of 2 to 60 carbon atoms and include a straight chain group or a branched chain group.

Unless otherwise stated, the term "cycloalkyl" as used herein may refer to alkyl forming a ring having 3 to 60 carbon atoms.

The term "alkoxy group" or "alkyloxy group", as used herein, refers to an alkyl group to which an oxygen radical is bonded and, unless otherwise stated, may have 1 to 60 carbon atoms.

The term "alkenoxyl group", "alkenoxy group", "alkenyloxyl group", or "alkenyloxy group" refers to an alkenyl group to which an oxygen radical is attached, and unless otherwise stated, may have 2 to 60 carbon atoms.

Unless otherwise stated, the term "aryl group" or "arylene group", as used herein, has, but is not limited thereto, 6 to 60 carbon atoms. Herein, the aryl group or the arylene group may include a monocyclic compound, a ring assembly, fused polycyclic systems, a spiro compound, or the like. For example, the aryl group includes, but is not limited to, a phenyl group, biphenyl, naphthyl, anthryl, indenyl, phenanthryl, triphenylenyl, pyrenyl, peryleneyl, chrysenyl, naphthacenyl, fluoranthenyl, and the like. Naphthyl may include 1-naphthyl and 2-naphthyl, and anthryl may include 1-anthryl, 2-anthryl, and 9-anthryl.

Unless stated otherwise, the term "fluorenyl group" or "fluorenylene group", as used herein, may refer to a monovalent or divalent functional group of fluorene. In addition, the "fluorenyl group" or "fluorenylene group" may refer to a substituted fluorenyl group or a substituted fluorenylene group. The "substituted fluorenyl group" or the "substituted fluorenylene group" may refer to a monovalent or divalent functional group of substituted fluorene. The term "substituted fluorene" may refer to a compound in which at least one of substituent R, R', R", or R''' below is a functional group other than hydrogen, and include a case in which R and R' are bonded to each other to form a spiro compound together with carbon atoms bonded thereto.

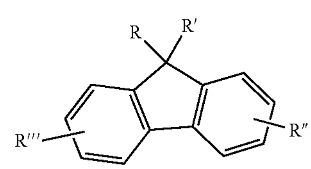

The term "spiro compound", as used herein, has "a spiro union", which refers to a union of two rings sharing only one atom. In this case, the atom shared by the two rings is referred to as a "spiro atom". Such spiro compounds are referred to, for example, as "monospiro", "dispiro", and "trispiro" compounds depending on the number of spiro atoms included in the compound.

The term "heterocyclic group", as used herein, includes not only aromatic rings, such as a "heteroaryl group" or a "heteroarylene group", but also non-aromatic rings, and unless stated otherwise, refers to, but is not limited to, monocyclic and multicyclic rings each including one or more heteroatoms and having 2 to 60 carbon atoms. The term "heteroatom", as used herein, refers to N, O, S, P, or Si, unless stated otherwise. The "heterocyclic group" may refer to monocyclic compounds, ring assemblies, fused polycyclic systems, spiro compounds, or the like including heteroatoms.

In addition, the "heterocyclic group", as used herein, may include rings having $SO_2$ in place of a ring-forming carbon atom. For example, the "heterocyclic group" may include the following compound.

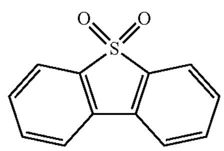 [SMILES: O=S1(=O)c2ccccc2-c2ccccc21]

The term "ring", as used herein, may refer to monocyclic rings and polycyclic rings, include not only hydrocarbon rings but also hetero rings including at least one heteroatom, and include aromatic rings and non-aromatic rings.

The term "polycyclic ring", as used herein, may include ring assemblies, fused polycyclic systems, and spiro compounds. The polycyclic ring may include not only aromatic compounds but also non-aromatic compounds, and include not only hydrocarbon rings but also hetero rings including at least one heteroatom.

The term "aliphatic cyclic group", as used herein, may refer to cyclic hydrocarbons except for aromatic hydrocarbons, include single rings, ring assemblies, fused ring systems, spiro compounds, and the like, and unless stated otherwise, mean rings each having 3 to 60 carbon atoms. For example, a fused system of benzene which is an aromatic ring and cyclohexane which is a non-aromatic ring corresponds to an aliphatic ring.

The term "ring assembly", as used herein, refers to a compound in which two or more rings (single rings or fused ring systems) are connected directly by a single or double bond. For example, in the aryl group, the ring assembly may be, but is not limited to, a biphenyl group, a terphenyl group, or the like.

The term "fused polycyclic system", as used herein, refers to a form of fused rings sharing at least two atoms. For example, in the aryl group, the fused polycyclic system may be, but is not limited to, naphthalenyl group, a phenanthrenyl group, a fluorenyl group, or the like.

In addition, in the case that prefixes are named consecutively, this means that substituents are listed in the order of the prefixes. For example, an aryl alkoxy group may refer to an alkoxy group substituted with an aryl group, an alkoxy carbonyl group may refer to a carbonyl group substituted with an alkoxy group, and an aryl carbonyl alkenyl group may refer to an alkenyl group substituted with an arylcarbonyl group. Here, the arylcarbonyl group may be a carbonyl group substituted with an aryl group.

Unless clearly stated otherwise, the term "substituted" in the term "substituted or non-substituted", as used herein, may refer to, but is not limited to, deuterium, a halogen, an amino group, a nitrile group, a nitro group, a $C_1$-$C_{20}$ alkyl group, a $C_1$-$C_{20}$ alkoxy group, a $C_1$-$C_{20}$ alkyl amine group, a $C_1$-$C_{20}$ alkylthiophene group, a $C_6$-$C_{20}$ arylthiophene group, a $C_2$-$C_{20}$ alkenyl group, a $C_2$-$C_{20}$ alkynil group, a $C_3$-$C_{20}$ cycloalkyl group, a $C_6$-$C_{25}$ aryl group, a $C_6$-$C_{25}$ aryl group substituted with deuterium, a $C_8$-$C_{20}$ aryl alkenyl group, a silane group, a boron group, a germanium group, and a $C_2$-$C_{20}$ heterocyclic group including at least one heteroatom selected from the group consisting of O, N, S, Si, or P.

Herein, "the name of a functional group" corresponding to the aryl group, the arylene group, the heterocyclic group, or the like illustrated as each symbol and a substituent thereof may be written in "the name of the functional group on which the valence thereof is reflected" or may be written in "the name of the parent compound thereof". For example, phenanthrene, i.e., a type of aryl group, may be written in group names by distinguishing the valence. That is, a monovalent phenanthrene "group" may be written as "phenanthryl (group)", while a divalent phenanthrene "group" may be written as "phenanthrylene (group)". Alternatively, the phenanthrene groups may be written as "phenanthrene", i.e. the name of the parent compound, regardless of the valence. Similarly, pyrimidine may be written as "pyrimidine" regardless of the valence or may be written in group names each corresponding to the valence, in which a monovalent pyrimidine group is written as pyrimidinyl (group) and a divalent pyrimidine group is written as pyrimidinylene (group). Accordingly, when the type of a substituent is written in the name of the parent compound herein, the written name may refer to an n-valence "group" formed by the desorption of a carbon atom and/or a heteroatom-bonded hydrogen atom from the parent compound.

In addition, unless clearly stated otherwise, formulas used herein may be applied in the same manner as the definition of the substituent based on the exponential definition of the following Formula.

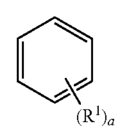

Here, when a is 0, the substituent $R^1$ is absent. This means that all hydrogens are bonded to carbons of the benzene ring. In this case, hydrogen bonded to carbon may not be shown, and the chemical Formula or compound may be described. When a is 1, one substituent $R^1$ is bonded to any one of carbon atoms of the benzene ring. When a is 2 or 3, substituents $R^1$ may respectively be combined as follows. When a is 4 to 6, substituents $R^1$ may be bonded to carbon atoms of the benzene ring. When a is an integer equal to or greater than 2, $R^1$s may be the same or different.

(a-2)

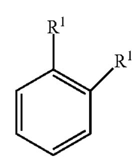

(a-3)

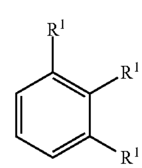

Herein, the substituents bonded to form rings, respectively, means that adjacent groups are bonded to each other to form a single ring or two or more fused rings. The single ring or the two or more fused rings formed in this manner may also include a hetero ring including at least one hetero atom, and include an aromatic ring and a non-aromatic ring.

Herein, the organic electronic device may refer to one or more compounds between an anode and a cathode, or an organic light-emitting diode (OLED) including the anode, the cathode, and the one or more compounds positioned between the anode and the cathode.

In addition, herein, in some cases, the organic electronic device may refer to an OLED and a panel on which the OLED is provided, or an electronic apparatus including the panel and a circuit. For example, the electronic apparatus may be, but is not limited to, a display device, an illumination device, a solar cell, a portable or mobile terminal (e.g., a smartphone, a tablet computer, a personal digital assistant (PDA), an electronic dictionary, or a portable media player (PMP)), a navigation terminal, a game machine, various TVs, and various computer monitors. The electronic apparatus may be any type of apparatus including the above-described component(s).

FIG. 1 is a diagram schematically illustrating an organic electronic device according to embodiments of the present disclosure.

An organic electronic device 100 according to embodiments includes a first electrode 110, a second electrode 120, and an organic material layer 130 positioned between the first electrode 110 and the second electrode 120 and including a first stack 141, a second stack 142, and a third stack 143.

Although FIG. 1 illustrates embodiments in which the second stack 142 is positioned above the first stack 141 and the third stack 143 is positioned above the second stack 142, embodiments of the present disclosure are not limited thereto.

For example, the first electrode 110 may be an anode, whereas the second electrode 120 may be a cathode. The organic material layer 130 is a layer positioned between the first electrode 110 and the second electrode 120 and including an organic material. The organic material layer 130 may be comprised of a plurality of layers.

In an example, the first electrode 110 may be a transparent electrode, whereas the second electrode 120 may be a reflecting electrode. In another example, the first electrode 110 may be a reflecting electrode, whereas the second electrode 120 may be a transparent electrode.

Since the organic material layer 130 includes at least three stacks, the organic electronic device according to embodiments may be, for example, a tandem organic electronic device including a plurality of stacks. The organic material layer may be realized by repeatedly stacking the same stack three or more times or stacking three or more different stacks.

The above-described three or more stacks may include the first stack 141, the second stack 142, and the third stack 143.

The first stack 141 includes a first hole transport region 1411, a first emission layer 1412, and a first electron transport region 1413.

The first emission layer 1412 is a layer emitting light energy generated by electron-hole recombination. For example, the first emission layer 1412 may include a host material and a dopant.

The first hole transport region 1411 may be, for example, a region positioned between the first electrode 110 serving as an anode and the first emission layer 1412 to transport holes from the first electrode 110 to the first emission layer 1412. The first electron transport region 1413 may be, for example, a region positioned between the second electrode 120 serving as a cathode and the first emission layer 1412 to transport electrons from the second electrode 120 to the emission layer.

The first hole transport region 1411 may include a P-type dopant, whereas the first electron transport region 1413 may include an N-type dopant. Here, a P-doped layer refers to a layer doped with a P-type dopant to have more positive properties (i.e., the properties of holes) than before. In contrast, an N-doped layer refers to a layer doped with an N-type dopant to have more negative properties (i.e., the properties of electrons) than before.

The thickness of the first hole transport region 1411 may be from 10 nm to 100 nm. The lower limit of the thickness of the first hole transport region 1411 may be, for example, 15 nm or more or 20 nm or more. The upper limit of the thickness of the first hole transport region 1411 may be, for example, 90 nm or less or 80 nm or less. When the thickness of the first hole transport region 1411 is within this range, the organic electronic device may have high luminous efficiency, a low driving voltage, and increased lifespan.

The organic material layer 130 may include one or more charge generation layers 150 positioned between the stacks. The charge generation layers 150 refer to layers generating holes and electrons when a voltage is applied thereto. When three or more stacks are provided, the charge generation layers 150 may be positioned between the stacks. Here, the plurality of charge generation layers 150 may be the same as or different from each other. Since the charge generation layers 150 are disposed between the stacks, the current efficiency of each of the stacks can be increased and electric charges can be properly distributed over the stacks.

Specifically, each of the charge generation layers 150 may be provided between two adjacent stacks and serve to drive a tandem organic light-emitting device using only a pair of an anode and a cathode without separate internal electrodes positioned between the stacks.

The charge generation layers 150 may include, for example, an N-type charge generation layer 151 and a P-type charge generation layer 152. For example, the N-type charge generation layer 151 may be positioned adjacent to the first electrode 110 serving as an anode, whereas the P-type charge generation layer 152 may be positioned adjacent to the second electrode 120 serving as a cathode.

A capping layer 160 may be positioned above the second electrode 120. When the capping layer 160 is formed, the optical efficiency of the organic electronic device may be improved.

In a top emission organic electronic device, the capping layer 160 may serve to reduce optical energy loss in the second electrode 120 caused by surface plasmon polaritons (SPPs). In a bottom emission organic electronic device, the capping layer 160 may serve to buffer the second electrode 120.

The first hole transport region 1411 includes a first hole transport layer 1411*a* and a first auxiliary emission layer 1411*b*. The first auxiliary emission layer 1411*b* may be positioned between, for example, the first emission layer 1412 and the first hole transport layer 1411*a*.

The first electron transport region 1413 may include an electron transport layer (not shown).

Figure 2:
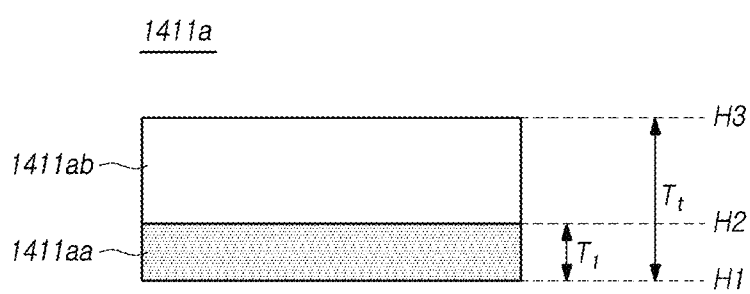
FIG. 2 is a diagram schematically illustrating the first hole transport layer of the organic electronic device according to embodiments of the present disclosure.

FIG. 2 is a diagram schematically illustrating the first hole transport layer 1411*a* of the organic electronic device according to embodiments of the present disclosure.

Referring to FIG. 2, the thickness Tt of the first hole transport layer 1411*a* may be defined as the distance between H1 and H3. H1 may be a boundary between the first hole transport layer 1411*a* and any layer positioned below the first hole transport layer, for example, the first electrode. H3 may be a boundary between the first hole transport layer 1411*a* and any layer positioned above the first hole transport layer, for example, the first auxiliary emission layer 1411*b*.

The thickness Tt of the first hole transport layer 1411*a* may be from 250 Å to 700 Å. The lower limit of the thickness Tt of the first hole transport layer 1411*a* may be, for example, 260 Å or more or 270 Å or more. The upper limit of the thickness Tt of the first hole transport layer 1411*a* may be, for example, 650 Å or less or 600 Å or less.

When the thickness of the first hole transport layer 1411*a* meets the above-described range, the first hole transport layer 1411*a* may include a hole transport material in an amount sufficient to have superior hole injection and transport functions while preventing electric charges from being excessively injected, thereby providing an organic electronic device having a low thickness while being superior in terms of driving voltage, efficiency, or lifespan.

In the first hole transport layer 1411*a,* 10% to 50% of the thickness Tt of the first hole transport layer may be doped with a first doping material. The portion of the first hole transport layer 1411*a* doped with the first doping material may be referred to as a first doping material-doped layer 1411*aa*. The first hole transport layer 1411*a* may include the first doping material-doped layer 1411*aa* doped with the first doping material and a first doping material undoped layer 1411*ab* not doped with the first doping material. The first doping material undoped layer 1411*ab* may be positioned between the first doping material-doped layer 1411*aa* and the first emission layer.

For example, the first hole transport layer 1411*a* may include a hole transport material. The first doping material-doped layer 1411*aa* may be a layer including the first doping material in addition to the hole transport material. The hole transport material is not particularly limited as long as it is a material having hole transport properties. For example, the hole transport material may be at least one selected from a first compound or a fourth compound.

The thickness $T_1$ of the first doping material-doped layer 141*aa* may be 10% to 50% of the thickness of the first hole transport layer 1411*a*. The thickness $T_1$ of the first doping material-doped layer 1411*aa* may be defined as the distance between H1 and H2. H2 may be a boundary between the first doping material-doped layer 1411*aa* and the first doping material undoped layer 1411*ab*.

The lower limit of the ratio of the thickness $T_1$ of the first doping material-doped layer 1411*aa* with respect to the thickness of the first hole transport layer 1411*a* may be, for example, 12% or more or 15% or more. The upper limit of the ratio of the thickness $T_1$ of the first doping material-doped layer with respect to the thickness Tt of the first hole transport layer 1411*a* may be, for example, 40% or less or 30% or less.

The thickness $T_1$ of the first doping material-doped layer 1411*aa* may be, for example, from 30 Å to 300 Å while meeting the above-described range of the ratio with respect to the thickness Tt of the first hole transport layer. The lower limit of the thickness $T_1$ of the first doping material-doped layer 1411*aa* may be, for example, 60 Å or more or 80 Å or more, whereas the upper limit of the thickness $T_1$ of the first doping material-doped layer 1411*aa* may be, for example, 200 Å or less or 150 Å or less.

When the thickness $T_1$ of the first doping material-doped layer 1411*aa* meets the above-described ranges of the ratio and the thickness, the generation of holes and electric charges in the first hole transport layer 1411*a* may be promoted to facilitate the injection of holes into the first emission layer 1412, thereby providing an organic electronic device superior in terms of lifespan or efficiency. It is thus possible to prevent the problem of short circuits in the device and prevent fabrication costs from being increased through excessive use of the doping material.

The first doping material-doped layer may include the first compound, and include 5 to 15 parts by weight of the first doping material with respect to 100 parts by weight of the first compound.

The first doping material-doped layer may include at least one of the first compound or the fourth compound, and include 5 to 15 parts by weight of the first doping material with respect to 100 parts by weight of a total amount of the first compound and the fourth compound. The lower limit of the doping ratio of the first doping material may be, for example, 7 parts by weight or more or 9 parts by weight or more. The upper limit of the doping ratio of the first doping material may be, for example, 13 parts by weight or less or 11 parts by weight or less.

When the doping ratio of the first doping material meets the above-described range, the generation of holes and electric charges in the first hole transport layer may be promoted to facilitate the injection of holes into the first emission layer, thereby providing an organic electronic device superior in terms of lifespan or efficiency. It is thus possible to prevent the problem of short circuits in the device and prevent fabrication costs from being increased by excessive use of the doping material.

For the second stack 142 and the third stack 143, what has been described above for the first stack 141 may equally be applied, unless clearly stated otherwise.

The second stack 142 may include a second hole transport region, a second emission layer, and a second electron transport region. Regarding the second hole transport region, the second emission layer, and the second electron transport region, what has been described above for the first hole transport region 1411, the first emission layer 1412, and the first electron transport region 1413 may equally be applied, unless clearly stated otherwise.

The second hole transport region may include a second hole transport layer and a second auxiliary emission layer. Regarding the second hole transport layer and the second auxiliary emission layer, what has been described above for the first hole transport layer 1411*a* and the first auxiliary emission layer 1411*b* may equally be applied, unless clearly stated otherwise.

Regarding the thickness and the doping of the second hole transport layer, what has been described above for the thickness and the doping of the first hole transport layer 1411*a* may equally be applied.

The thickness of the second hole transport layer may be from 250 Å to 700 Å. The lower limit of the thickness of the second hole transport layer may be, for example, 260 Å or more or 270 Å or more. The upper limit of the thickness of the second hole transport layer may be, for example, 650 Å or less or 600 Å or less.

When the thickness of the second hole transport layer meets the above-described range, the second hole transport layer may include a hole transport material in an amount sufficient to have superior hole injection and transport functions and prevent electric charges from being excessively injected, thereby providing an organic electronic device having a low thickness while being superior in terms of driving voltage, efficiency, or lifespan.

In the second hole transport layer, 10% to 50% of the thickness of the second hole transport layer may be doped with a second doping material. The portion of the second hole transport layer doped with the second doping material may be referred to as a second doping material-doped layer. The second hole transport layer may include the second doping material-doped layer doped with the second doping material and a second doping material undoped layer not doped with the second doping material. The second doping material undoped layer may be positioned between the second doping material-doped layer and the second emission layer.

For example, the second hole transport layer may include a hole transport material. The second doping material-doped layer may be a layer including the second doping material in addition to the hole transport material. The transport material is not particularly limited as long as it is a material having hole transport properties. For example, the hole transport material may be a second compound.

The thickness of the second doping material-doped layer may be 10% to 50% of the thickness of the second hole transport layer. The lower limit of the ratio of the thickness of the second doping material-doped layer with respect to the thickness of the second hole transport layer may be, for example, 12% or more or 15% or more. The upper limit of the ratio of the thickness of the second doping material-doped layer with respect to the thickness of the second hole transport layer may be, for example, 40% or less or 30% or less.

The thickness of the second doping material-doped layer may be, for example, from 30 Å to 300 Å while meeting the above-described range of the ratio with respect to the thickness of the second hole transport layer. The lower limit of the thickness of the second doping material-doped layer may be, for example, 60 Å or more or 80 Å or more, whereas the upper limit of the thickness of the second doping material-doped layer may be, for example, 200 Å or less or 150 Å or less.

When the thickness of the second doping material-doped layer meets the above-described ranges of the ratio and the thickness, the generation of holes and electric charges in the second hole transport layer may be promoted to facilitate the injection of holes into the second emission layer, thereby providing an organic electronic device superior in terms of lifespan or efficiency. It is possible to prevent the problem of short circuits in the device and prevent fabrication cost from being increased by excessive use of the doping material.

The second doping material-doped layer may include the second compound, and include 5 to 15 parts by weight of the second doping material with respect to 100 parts by weight of the second compound.

The second doping material-doped layer may include the second compound, and include 5 to 15 parts by weight of the second doping material with respect to 100 parts by weight of the second compound. The lower limit of the doping ratio of the second doping material may be, for example, 7 parts by weight or more or 9 parts by weight or more. The upper limit of the doping ratio of the second doping material may be, for example, 13 parts by weight or less or 11 parts by weight or less.

When the doping ratio of the second doping material meets the above-described range, the generation of holes and electric charges in the second hole transport layer may be promoted to facilitate the injection of holes into the second emission layer, thereby providing an organic electronic device superior in terms of lifespan or efficiency. It is possible to prevent the problem of short circuits in the device and prevent fabrication cost from being increased by excessive use of the doping material.

The third stack 143 may include a third hole transport region, a third emission layer, and a third electron transport region. Regarding the third hole transport region, the third emission layer, and the third electron transport region, what has been described above for the first hole transport region 1411, the first emission layer 1412, and the first electron transport region 1413 may equally be applied, unless clearly stated otherwise.

The third hole transport region may include a third hole transport layer and a third auxiliary emission layer. Regarding the third hole transport layer and the third auxiliary emission layer, what has been described above for the first hole transport layer 1411*a* and the first auxiliary emission layer 1411*b* may equally be applied, unless clearly stated otherwise.

Regarding the thickness and the doping of the third hole transport layer, what has been described above for the thickness and the doping of the first hole transport layer 1411*a* may equally be applied.

The thickness of the third hole transport layer may be from 250 Å to 700 Å. The lower limit of the thickness of the third hole transport layer may be, for example, 260 Å or more or 270 Å or more. The upper limit of the thickness of the third hole transport layer may be, for example, 650 Å or less or 600 Å or less.

When the thickness of the third hole transport layer meets the above-described range, the third hole transport layer may include a hole transport material in an amount sufficient to have superior hole injection and transport functions and prevent electric charges from being excessively injected, thereby providing an organic electronic device having a low thickness while being superior in terms of driving voltage, efficiency, or lifespan.

In the third hole transport layer, 10% to 50% of the thickness of the third hole transport layer may be doped with a third doping material. The portion of the third hole transport layer doped with the third doping material may be referred to as a third doping material-doped layer. The third hole transport layer may include the third doping material-doped layer doped with the third doping material and a third doping material undoped layer not doped with the third doping material. The third doping material undoped layer may be positioned between the third doping material-doped layer and the third emission layer.

For example, the third hole transport layer may include a hole transport material. The third doping material-doped layer may be a layer including the third doping material in addition to the hole transport material. The transport material is not particularly limited as long as it is a material having hole transport properties. For example, the hole transport material may be at least one of the first compound or the fourth compound.

The thickness of the third doping material-doped layer may be 10% to 50% of the thickness of the third hole transport layer. The lower limit of the ratio of the thickness of the third doping material-doped layer with respect to the thickness of the third hole transport layer may be, for example, 12% or more or 15% or more. The upper limit of the ratio of the thickness of the third doping material-doped layer with respect to the thickness of the third hole transport layer may be, for example, 40% or less or 30% or less.

The thickness of the third doping material-doped layer may be, for example, from 30 Å to 300 Å while meeting the above-described range of the ratio with respect to the thickness of the third hole transport layer. The lower limit of the thickness of the third doping material-doped layer may be, for example, 60 Å or more or 80 Å or more, whereas the upper limit of the thickness of the third doping material-doped layer may be, for example, 200 Å or less or 150 Å or less.

When the thickness of the third doping material-doped layer meets the above-described ranges of the ratio and the thickness, the generation of holes and electric charges in the third hole transport layer may be promoted to facilitate the injection of holes into the third emission layer, thereby providing an organic electronic device superior in terms of lifespan or efficiency. It is possible to prevent the problem of short circuits in the device and prevent fabrication cost from being increased by excessive use of the doping material. The third doping material-doped layer may include the third compound, and include 5 to 15 parts by weight of the third doping material with respect to 100 parts by weight of the third compound.

The third doping material-doped layer may include the third compound, and include 5 to 15 parts by weight of the third doping material with respect to 100 parts by weight of the third compound. The lower limit of the doping ratio of the third doping material may be, for example, 7 parts by weight or more or 9 parts by weight or more. The upper limit of the doping ratio of the third doping material may be, for example, 13 parts by weight or less or 11 parts by weight or less.

When the doping ratio of the third doping material meets the above-described range, the generation of holes and electric charges in the third hole transport layer may be promoted to facilitate the injection of holes into the third emission layer, thereby providing an organic electronic device superior in terms of lifespan or efficiency. It is possible to prevent the problem of short circuits in the device and prevent fabrication cost from being increased by excessive use of the doping material.

Figure 3:
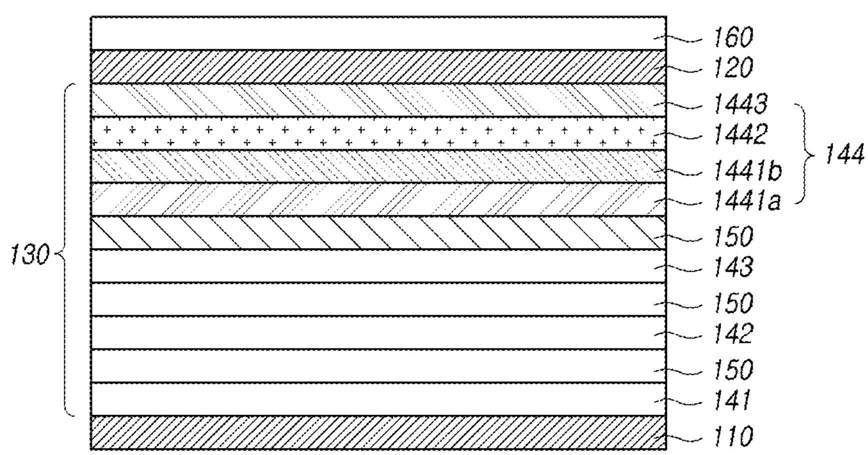
FIGS. 3 and 4 are diagrams schematically illustrating the organic electronic device according to embodiments of the present disclosure.

FIG. 3 is a diagram schematically illustrating an organic electronic device according to embodiments of the present disclosure.

Referring to FIG. 3, the organic material layer of the organic electronic device according to embodiments of the present disclosure may further include a fourth stack 144.

Regarding the fourth stack 144, the what has been described above for the first stack 141 may equally be applied, unless clearly stated otherwise.

In embodiments illustrated in FIG. 1, the first electrode 110, the first stack 141, the second stack 142, the third stack 143, the fourth stack 144, and the second electrode 120 are sequentially stacked. However, embodiments of the present disclosure are not limited to this organic electronic device. The upper and lower positional relationship of the first stack 141 to the fourth stack 144 may be different from that illustrated in FIG. 3 as long as the first stack 141 to the fourth stack 144 are positioned between the first electrode 110 and the second electrode 120.

The fourth stack 144 may include a fourth hole transport region 1441, a fourth emission layer 1442, and a fourth electron transport region 1443. Regarding the fourth hole transport region 1441, the fourth emission layer 1442, and fourth electron transport region, what has been described above for the first hole transport region 1411, the first emission layer 1412, and the first electron transport region 1413 may equally be applied, unless clearly stated otherwise.

The fourth hole transport region 1441 may include a fourth hole transport layer 1441*a* and a fourth auxiliary emission layer 1441*b*. Regarding the fourth hole transport layer 1441*a* and the fourth auxiliary emission layer 1441*b*, what has been described above for the first hole transport layer 1411*a* and the first auxiliary emission layer 1411*b* may equally be applied, unless clearly stated otherwise.

Regarding the thickness and the doping of the fourth hole transport layer 1441*a*, what has been described above for the thickness and the doping of the first hole transport layer 1411*a* may equally be applied, unless clearly stated otherwise.

The thickness of the fourth hole transport layer 1441*a* may be from 250 Å to 700 Å. The lower limit of the thickness of the fourth hole transport layer 1441*a* may be, for example, 260 Å or more or 270 Å or more. The upper limit of the thickness of the fourth hole transport layer 1441*a* may be, for example, 650 Å or less or 600 Å or less.

When the thickness of the fourth hole transport layer 1441*a* meets the above-described range, the fourth hole transport layer 1441*a* may include a hole transport material in an amount sufficient to have superior hole injection and transport functions and prevent electric charges from being excessively injected, thereby providing an organic electronic device having a low thickness while being superior in terms of driving voltage, efficiency, or lifespan.

In the fourth hole transport layer 1441*a*, 10% to 50% of the thickness of the fourth hole transport layer 1441*a* may be doped with a fourth doping material. The portion of the fourth hole transport 1441*a* doped with the fourth doping material may be referred to as a fourth doping material-doped layer. The fourth hole transport layer 1441*a* may include the fourth doping material-doped layer doped with the fourth doping material and a fourth doping material undoped layer not doped with the fourth doping material. The fourth doping material undoped layer may be positioned between the fourth doping material-doped layer and the fourth emission layer.

For example, the fourth hole transport layer may include a hole transport material. The fourth doping material-doped layer may be a layer including the fourth doping material in addition to the hole transport material. The transport material is not particularly limited as long as it is a material having hole transport properties. For example, the hole transport material may be at least one of a fifth compound or a sixth compound.

The thickness of the fourth doping material-doped layer may be 10% to 50% of the thickness of the fourth hole transport layer. The lower limit of the ratio of the thickness of the fourth doping material-doped layer with respect to the thickness of the fourth hole transport layer 1441*a* may be, for example, 12% or more or 15% or more. The upper limit of the ratio of the thickness of the fourth doping material-doped layer with respect to the thickness of the fourth hole transport layer 1441*a* may be, for example, 40% or less or 30% or less.

The thickness of the fourth doping material-doped layer may be, for example, from 30 Å to 300 Å while meeting the above-described range of the ratio with respect to the thickness of the fourth hole transport layer 1441*a*. The lower limit of the thickness of the fourth doping material-doped layer may be, for example, 60 Å or more or 80 Å or more, whereas the upper limit of the thickness of the fourth doping material-doped layer may be, for example, 200 Å or less or 150 Å or less.

When the thickness of the fourth doping material-doped layer meets the above-described ranges of the ratio and the thickness, the generation of holes and electric charges in the fourth hole transport layer 1441*a* may be promoted to facilitate the injection of holes into the fourth emission layer 1442, thereby providing an organic electronic device superior in terms of lifespan or efficiency. It is possible to prevent the problem of short circuits in the device and prevent fabrication cost from being increased by excessive use of the doping material.

Figure 4:
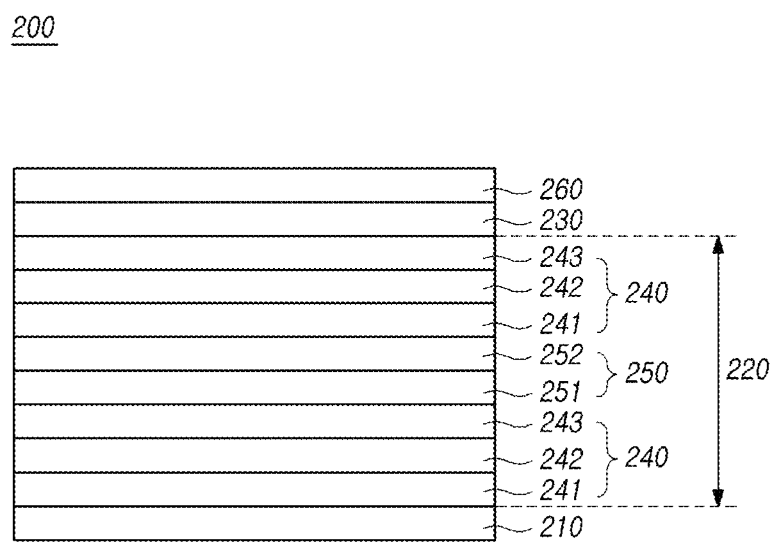

FIG. 4 is a diagram schematically illustrating an organic electronic device according to embodiments of the present disclosure.

An organic electronic device 200 according to embodiments includes a first electrode 210, a second electrode 230, and an organic material layer 220 positioned between t the first electrode 210 and the second electrode 230 and including at least two stacks 240.

For example, the first electrode 210 may be an anode, whereas the second electrode 230 may be a cathode. The organic material layer 220 is a layer positioned between the first electrode 210 and the second electrode 230 and including an organic material. The organic material layer 220 may be comprised of a plurality of layers.

In an example, the first electrode 210 may be a transparent electrode, whereas the second electrode 230 may be a reflecting electrode. In another example, the first electrode 210 may be a reflecting electrode, whereas the second electrode 230 may be a transparent electrode.

Since the organic material layer 220 includes at least two stacks, the organic electronic device according to embodiments may be, for example, a tandem organic electronic device including a plurality of stacks. The organic material layer may be realized by repeatedly stacking the same stack two or more times or by stacking two or more different stacks.

Each of the above-described three or more stacks 240 includes a hole transport region 241, an emission layer 242, and an electron transport region 243. The hole transport region 241 may be a region, for example, positioned between the first electrode 210 serving as an anode and the emission layer 242 to transport holes from the first electrode 210 to the emission layer 242. The electron transport region 243 may be, for example, a region positioned between the second electrode 230 serving as a cathode and the emission layer 242 to transport electrons from the second electrode 230 to the emission layer.

The emission layer 242 is a layer in which energy generated by electron-hole recombination is emitted as light. For example, the emission layer 242 may include a host material and a dopant.

The thickness of the hole transport region may be from 10 nm to 100 nm. The lower limit of the thickness of the hole transport region may be, for example, 15 nm or more or 20 nm or more. The upper limit of the thickness of the hole transport region may be, for example, 80 nm or less or 60 nm or less. When the thickness of the hole transport region is within this range, the organic electronic device may have high luminous efficiency, a low driving voltage, and increased lifespan.

The organic material layer 220 may include one or more charge generation layers 250 positioned between the stacks 240. When three or more stacks 240 are provided, the charge generation layers 250 may be positioned between the stacks 240. Here, the plurality of charge generation layers 250 may be the same as or different from each other. Since the charge generation layers 250 are disposed between the stacks, the current efficiency of each of the stacks can be increased and electric charges can be properly distributed over the stacks.

The charge generation layers 250 may include, for example, an N-type charge generation layer 251 and a P-type charge generation layer 252. For example, the N-type charge generation layer 251 may be positioned adjacent to the first electrode 210 serving as an anode, whereas the P-type charge generation layer 252 may be positioned adjacent to the second electrode 230 serving as a cathode.

The charge generation layers 250 and the stacks 240 may be repeatedly positioned n times, where n is a positive integer. For example, n may be an integer from 1 to 5. For example, when n is 2, the organic material layer may include three stacks and two charge generation layers.

A capping layer 260 may be positioned above the second electrode 230. When the capping layer 260 is formed, the optical efficiency of the organic electronic device may be improved.

In a top emission organic electronic device, the capping layer 260 may serve to reduce optical energy loss in the second electrode 230 caused by SPPs. In a bottom emission organic electronic device, the capping layer 260 may serve to buffer the second electrode 230.

In the hole transport region 241 of each of the plurality of stacks 240, at least one hole transport region 241 includes a first hole transport layer and a second hole transport layer. For example, when the organic material layer includes two stacks, one of two hole transport layers of the two stacks may include a first hole transport layer and a second hole transport layer, or each of the two hole transport layers may include a first hole transport layer and a second hole transport layer.

Figure 5:
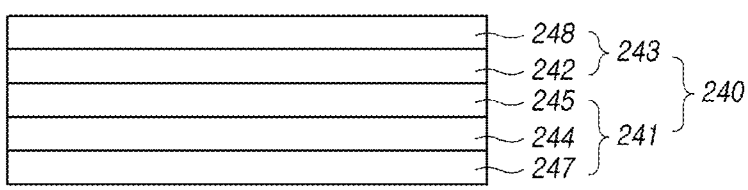
FIG. 5 is a diagram schematically illustrating a stack of an organic electronic device according to embodiments of the present disclosure.

FIG. 5 is a diagram schematically illustrating a stack 240 according to embodiments of the present disclosure.

Referring to FIG. 5, at least one hole transport region 241 may include a first hole transport layer 244 and a second hole transport layer 245. For example, the first hole transport layer 244 and the second hole transport layer 245 may be positioned in the hole transport region 241 such that the first hole transport layer 244 is positioned more adjacent to the first electrode 210 than the second hole transport layer 245 and the second hole transport layer 245 is positioned more adjacent to the second electrode 230 than the first hole transport layer 244. In addition, the second hole transport layer 245 may be positioned more adjacent to the emission layer 242 than the first hole transport layer 244.

Although not shown in FIG. 5, the hole transport region 241 may further include a third hole transport layer (not shown). The third hole transport layer may be positioned, for example, between the first hole transport layer 244 and the second hole transport layer 245. In the above illustration, the first hole transport layer 244 may be positioned more adjacent to the first electrode 210 than the second hole transport layer 245, the second hole transport layer 245 may be positioned more adjacent to the emission layer 242 than the first hole transport layer 244, and the third hole transport layer may be positioned between the first hole transport layer 244 and the second hole transport layer 245.

The electron transport region 243 may include an electron transport layer 248.

The above-described first hole transport layer may include a seventh compound. The seventh compound may include a radical of a compound represented by Formula A to be described below, and may be represented by Formula C or Formula D to be described below. The above-described second hole transport layer may include an eighth compound. The eighth compound may include a radical of a compound represented by Formula A or Formula B to be described below, and may be represented by Formula C or Formula D to be described below.

As the first hole transport layer includes the seventh compound and the second hole transport layer includes the eighth compound, the luminous efficiency, lifespan, driving voltage, and color purity of the organic electronic device may be further improved.

The above-described third hole transport layer may include a ninth compound. The above-described ninth compound includes a radical of a compound represented by Formula A or Formula B to be described below, and is represented by Formula C or Formula D to be described below. In addition, the ninth compound is different from the eighth compound. When the hole transport region 241 further includes the above-described third hole transport layer, the luminous efficiency, lifespan, driving voltage, and color purity of the organic electronic device may be further improved.

The first hole transport layer including the seventh compound may mean that one or more types of the seventh compound are included. For example, the first hole transport layer may include two different types of seventh compound.

The second hole transport layer including the eighth compound may mean that one or more types of eighth compound are included. For example, the second hole transport layer may include two different types of eighth compound.

The third hole transport layer including the ninth compound may mean that one or more types of ninth compound are included. For example, the third hole transport layer may include two different types of ninth compound.

The organic electronic device according to embodiments of the present disclosure may be a top emission organic electronic device, a bottom emission organic electronic device, or a dual emission organic electronic device depending on the material used.

A white organic light emitting device (WOLED) is advantageous in that high resolution may be easily realized and processability is superior. In addition, the WOLED may be fabricated using conventional color filter technologies of liquid crystal displays (LCDs). A variety of structures have been proposed and patented for a white organic electronic device mainly used as a backlight unit. Representatively, there are a side-by-side method in which red (R), green (G), and blue (B) emission units are disposed in a planar direction, a stacking method in which R, G, and B emission layers are stacked in the top-bottom direction, a color conversion material (CCM) method using photoluminescence of an inorganic fluorescence material using electroluminescence caused by the blue (B) organic emission layer and light from the electroluminescence, and the like. The present disclosure may also be applied to such WOLEDs.

The first hole transport layer 1411*a* or the first auxiliary emission layer 1411*b* may include the first compound represented by the following Formula 1. In another example, the first hole transport layer 1411*a* and the first auxiliary emission layer 1411*b* may include the first compound represented by the following Formula 1.

[Formula 1]

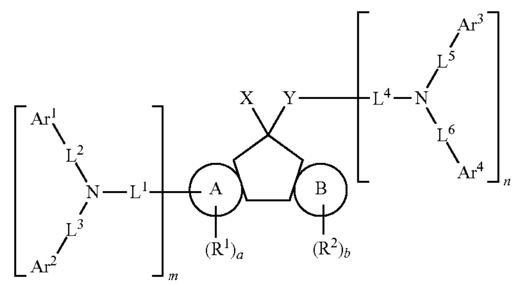

Hereinafter, Formula 1 will be described.

Each of m and n is independently 0 or 1, where m+n is 1.

Each of $Ar^1$ and $Ar^2$ is selected from the group consisting of a $C_6$-$C_{60}$ aryl group; a fluorenyl group; a $C_2$-$C_{60}$ heterocyclic group including at least one heteroatom of O, N, S, Si, or P; or a fused ring group of a $C_3$-$C_{60}$ aliphatic ring and a $C_6$-$C_{60}$ aromatic ring.

Each of $Ar^1$ and $Ar^2$ may be selected from the group consisting of a $C_6$-$C_{60}$ aryl group; a fluorenyl group; or a $C_2$-$C_{60}$ heterocyclic group including at least one heteroatom of O, N, S, Si, or P.

When one of $Ar^1$ and $Ar^2$ is an aryl group, one of Arl and $Ar^2$ which is an aryl group may be, for example, a $C_6$-$C_{60}$ aryl group, a $C_6$-$C_{40}$ aryl group, a $C_6$-$C_{25}$ aryl group, or a $C_6$-$C_{10}$ aryl group.

When one of $Ar^1$ and $Ar^2$ is a heterocyclic group, one of $Ar^1$ and $Ar^2$ which is a heterocyclic group may be, for example, a $C_2$-$C_{40}$ heterocyclic group including at least one hetero atom selected from O, N, S, Si, or P, a $C_2$-$C_{20}$ heterocyclic group including at least one hetero atom selected from O, N, S, Si, or P, or a $C_2$-$C_{10}$ heterocyclic group including at least one hetero atom selected from O, N, S, Si, or P.

Each of $Ar^3$ and $Ar^4$ is independently selected from the group consisting of a $C_6$-$C_{60}$ aryl group; a fluorenyl group; a $C_2$-$C_{60}$ heterocyclic group including at least one heteroatom of O, N, S, Si, or P; or a fused ring group of a $C_3$-$C_{60}$ aliphatic ring and a $C_6$-$C_{60}$ aromatic ring.

Each of $Ar^3$ and $Ar^4$ may independently be a $C_6$-$C_{60}$ aryl group.

When one of $Ar^3$ and $Ar^4$ is an aryl group, one of $Ar^3$ and $Ar^4$ which is an aryl group may be, for example, a $C_6$-$C_{60}$ aryl group, a $C_6$-$C_{40}$ aryl group, a $C_6$-$C_{25}$ aryl group, or a $C_6$-$C_{10}$ aryl group.

Each of $L^1$ to $L^6$ is independently selected from the group consisting of a single bond; a $C_6$-$C_{60}$ arylene group; a fluorenylene group; $C_2$-$C_{60}$ heterocyclic group including at least one hetero atom of O, N, S, Si, or P; or a fused ring group of a $C_3$-$C_{60}$ aliphatic ring and a $C_6$-$C_{60}$ aromatic ring.

Each of $L^1$ to $L^6$ may be independently selected from the group consisting of a single bond; a $C_6$-$C_{60}$ arylene group; or $C_2$-$C_{60}$ heterocyclic group including at least one hetero atom of O, N, S, Si, or P.

When one of $L^1$ to $L^6$ is an arylene group, one of $L^1$ to $L^6$ which is an arylene group may be, for example, a $C_6$-$C_{60}$ arylene group, a $C_6$-$C_{40}$ arylene group, a $C_6$-$C_{25}$ arylene group, or a $C_6$-$C_{10}$ arylene group.

When one of $L^1$ to $L^6$ is a heterocyclic group, one of $L^1$ to $L^6$ which is a heterocyclic group may be, for example, a $C_2$-$C_{40}$ heterocyclic group including at least one hetero atom of O, N, S, Si, or P, a $C_2$-$C_{20}$ heterocyclic group including at least one hetero atom of O, N, S, Si, or P, or a $C_2$-$C_{10}$ heterocyclic group including at least one hetero atom of O, N, S, Si, or P.

X may be selected from the group consisting of hydrogen; deuterium; a $C_6$-$C_{30}$ aryl group; a fluorenyl group; a $C_2$-$C_{30}$ heterocyclic group including at least one hetero atom of O, N, S, Si, or P; a fused ring group of a $C_3$-$C_{30}$ aliphatic ring and a $C_6$-$C_{30}$ aromatic ring; $C_1$-$C_{30}$ alkyl group; $C_2$-$C_{20}$ alkenyl group; or $C_2$-$C_{20}$ alkynyl group.

X may be selected from the group consisting of hydrogen; deuterium; a $C_6$-$C_{30}$ aryl group; a fluorenyl group; a $C_2$-$C_{30}$ heterocyclic group including at least one hetero atom of O, N, S, Si, or P; or $C_1$-$C_{30}$ alkyl group.

When X is an aryl group, X which is an aryl group may be, for example, a $C_6$-$C_{60}$ aryl group, a $C_6$-$C_{40}$ aryl group, a $C_6$-$C_{25}$ aryl group, or a $C_6$-$C_{10}$ aryl group.

When X is a heterocyclic group, X which is a heterocyclic group may be, for example, a $C_2$-$C_{40}$ heterocyclic group including at least one hetero atom of O, N, S, Si, or P, a $C_2$-$C_{20}$ heterocyclic group including at least one hetero atom of O, N, S, Si, or P, or a $C_2$-$C_{10}$ heterocyclic group including at least one hetero atom of O, N, S, Si, or P.

Y is selected from the group consisting of hydrogen; deuterium; a $C_6$-$C_{30}$ aryl group; a fluorenyl group; a $C_2$-$C_{30}$ heterocyclic group including at least one hetero atom of O, N, S, Si, or P; a fused ring group of a $C_3$-$C_{30}$ aliphatic ring and a $C_6$-$C_{30}$ aromatic ring; $C_1$-$C_{30}$ alkyl group; $C_2$-$C_{20}$ alkenyl group; or $C_2$-$C_{20}$ alkynyl group when n is 0, and is selected from the group consisting of a $C_6$-$C_{60}$ arylene group; a fluorenylene group; $C_2$-$C_{60}$ heterocyclic group including at least one hetero atom of O, N, S, Si, or P; or a fused ring group of a $C_3$-$C_{60}$ aliphatic ring and a $C_6$-$C_{60}$ aromatic ring when n is 1.

When n is 0, Y may be selected from the group consisting of hydrogen; deuterium; a $C_6$-$C_{30}$ aryl group; a fluorenyl group; a $C_2$-$C_{30}$ heterocyclic group including at least one hetero atom of O, N, S, Si, or P; or $C_1$-$C_{30}$ alkyl group.

When n is 1, Y may be selected from the group consisting of a $C_6$-$C_{60}$ arylene group; a fluorenylene group; or $C_2$-$C_{60}$ heterocyclic group including at least one hetero atom of O, N, S, Si, or P.

When Y is an aryl group, Y which is an aryl group may be, for example, a $C_6$-$C_{60}$ aryl group, a $C_6$-$C_{40}$ aryl group, a $C_6$-$C_{25}$ aryl group, or a $C_6$-$C_{10}$ aryl group.

When Y is an arylene group which is an arylene group may be, for example, a $C_6$-$C_{60}$ arylene group, a $C_6$-$C_{40}$ arylene group, a $C_6$-$C_{25}$ arylene group, or a $C_6$-$C_{10}$ arylene group.

When Y is a heterocyclic group, Y which is a heterocyclic group may be, for example, a $C_2$-$C_{40}$ heterocyclic group including at least one hetero atom of O, N, S, Si, or P, a $C_2$-$C_{20}$ heterocyclic group including at least one hetero atom of O, N, S, Si, or P, a $C_2$-$C_{10}$ heterocyclic group including at least one hetero atom of O, N, S, Si, or P.

X and Y may be bonded to form a spiro compound.

Each of ring A and ring B is independently a $C_6$-$C_{10}$ aryl group.

Each of $R^1$ and $R^2$ is independently selected from the group consisting of deuterium; a halogen; a $C_6$-$C_{30}$ aryl group; a fluorenyl group; a $C_2$-$C_{30}$ heterocyclic group including at least one hetero atom of O, N, S, Si, or P; a fused ring group of a $C_3$-$C_{30}$ aliphatic ring and a $C_6$-$C_{30}$ aromatic ring; a $C_1$-$C_{30}$ alkyl group; a $C_2$-$C_{20}$ alkenyl group; a $C_2$-$C_{20}$ alkynyl group; a $C_1$-$C_{30}$ alkoxyl group; or a $C_6$-$C_{30}$ aryloxy group.

Each of $R^1$ and $R^2$ may be independently selected from the group consisting of deuterium; a $C_6$-$C_{30}$ aryl group; a fluorenyl group; or a $C_2$-$C_{30}$ heterocyclic group including at least one hetero atom of O, N, S, Si, or P.

When one of $R^1$ and $R^2$ is an aryl group, one of $R^1$ and $R^2$ which is an aryl group may be, for example, a $C_6$-$C_{60}$ aryl group, a $C_6$-$C_{40}$ aryl group, a $C_6$-$C_{25}$ aryl group, or a $C_6$-$C_{10}$ aryl group.

When one of $R^1$ and $R^2$ is a heterocyclic group, one of $R^1$ and $R^2$ which is a heterocyclic group may be, for example, a $C_2$-$C_{40}$ heterocyclic group including at least one hetero atom of O, N, S, Si, or P, a $C_2$-$C_{20}$ heterocyclic group including at least one hetero atom of O, N, S, Si, or P, or a $C_2$-$C_{10}$ heterocyclic group including at least one hetero atom of O, N, S, Si, or P.

a is an integer from 0 to 7, and b is an integer from 0 to 8.

In Formula 1, each of an aryl group, a fluorenyl group, a heterocyclic group, a fused ring group, an alkyl group, an alkenyl group, an alkynyl group, an alkoxyl group, an aryloxy group, an arylene group, and a fluorenylene group may be further substituted with one or more substituents selected from the group consisting of deuterium; a halogen group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{25}$ aryl group; a $C_6$-$C_{25}$ aryl group substituted with deuterium; a fluorenyl group; a $C_2$-$C_{20}$ heterocyclic group; or a $C_3$-$C_{20}$ cycloalkyl group.

Each of the further substituted substituents may be further substituted with one or more substituents selected from the group consisting of deuterium; a halogen group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{25}$ aryl group; a $C_6$-$C_{25}$ aryl group substituted with deuterium; a fluorenyl group; a $C_2$-$C_{20}$ heterocyclic group; or a $C_3$-$C_{20}$ cycloalkyl group. These substituents may be bonded to form a ring.

The first compound may be represented by one of the following Formula 2 to Formula 5.

[Formula 2]

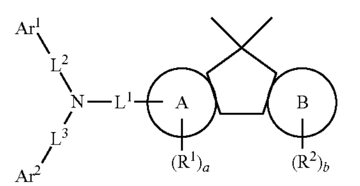

[Formula 3]

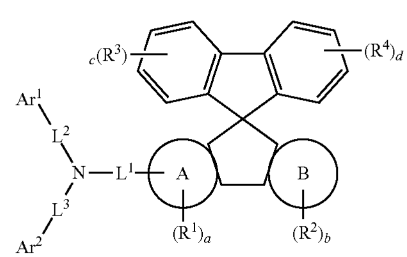

[Formula 4]

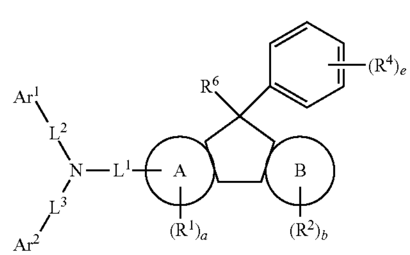

-continued

[Formula 5]

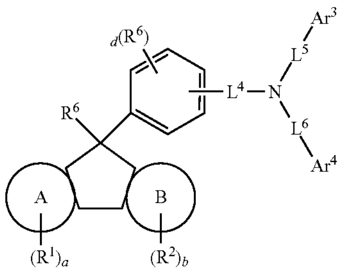

Hereinafter, Formula 2 to Formula 5 will be described.

Each of c and d is independently an integer from 0 to 4, and e is an integer from 0 to 5.

i) Each of $R^3$, $R^4$, and $R^6$ may be independently selected from the group consisting of deuterium; a halogen; a $C_6$-$C_{30}$ aryl group; a fluorenyl group; a $C_2$-$C_{30}$ heterocyclic group including at least one heteroatom of O, N, S, Si, or P; a fused ring group of a $C_3$-$C_{30}$ aliphatic ring and a $C_6$-$C_{30}$ aromatic ring; a $C_1$-$C_{30}$ alkyl group; a $C_2$-$C_{20}$ alkenyl group; a $C_2$-$C_{20}$ alkynyl group; a $C_1$-$C_{30}$ alkoxyl group; or a $C_6$-$C_{30}$ aryloxy group. Alternatively, ii) a plurality of $R^3$s, a plurality of $R^4$s, and a plurality of $R^6$s may be bonded to form rings, respectively.

Each of $R^3$, $R^4$, and $R^6$ may be independently selected from the group consisting of deuterium; a $C_6$-$C_{30}$ aryl group; or a $C_2$-$C_{30}$ heterocyclic group including at least one heteroatom of O, N, S, Si, or P.

$R^5$ may be selected from the group consisting of hydrogen; deuterium; a halogen; a $C_6$-$C_{30}$ aryl group; a fluorenyl group; a $C_2$-$C_{30}$ heterocyclic group including at least one heteroatom of O, N, S, Si, or P; a fused ring group of a $C_3$-$C_{30}$ aliphatic ring and a $C_6$-$C_{30}$ aromatic ring; a $C_1$-$C_{30}$ alkyl group; a $C_2$-$C_{20}$ alkenyl group; a $C_2$-$C_{20}$ alkynyl group; a $C_1$-$C_{30}$ alkoxyl group; or a $C_6$-$C_{30}$ aryloxy group.

$R^5$ may be selected from the group consisting of hydrogen; deuterium; a $C_6$-$C_{30}$ aryl group; or a $C_2$-$C_{30}$ heterocyclic group including at least one heteroatom of O, N, S, Si, or P.

When one of $R^3$, $R^4$, and $R^6$ is an aryl group, one of $R^3$, $R^4$, and $R^6$ which is an aryl group may be, for example, a $C_6$-$C_{60}$ aryl group, a $C_6$-$C_{40}$ aryl group, a $C_6$-$C_{25}$ aryl group, or a $C_6$-$C_{10}$ aryl group.

When one of $R^3$, $R^4$, and $R^6$ is a heterocyclic group, one of $R^3$, $R^4$, and $R^6$ which is a heterocyclic group may be, for example, a $C_2$-$C_{40}$ heterocyclic group including at least one hetero atom of O, N, S, Si, or P, a $C_2$-$C_{20}$ heterocyclic group including at least one hetero atom of O, N, S, Si, or P, or a $C_2$-$C_{10}$ heterocyclic group including at least one hetero atom of O, N, S, Si, or P.

$Ar^1$ to $Ar^4$, $L^1$ to $L^6$, $R^1$, $R^2$, a, and b are the same as $Ar^1$ to $Ar^4$, $L^1$ to $L^6$, $R^1$, $R^2$, a, and b defined in the description of Formula 1.

The first compound may be represented by one of the following Formula 6 to Formula 9.

[Formula 6]

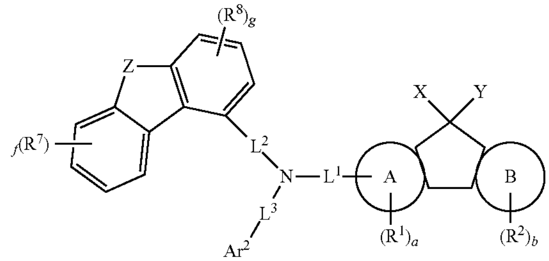

[Formula 7]

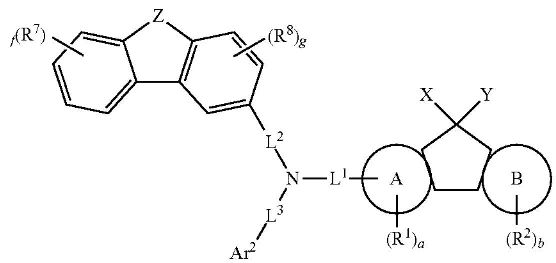

[Formula 8]

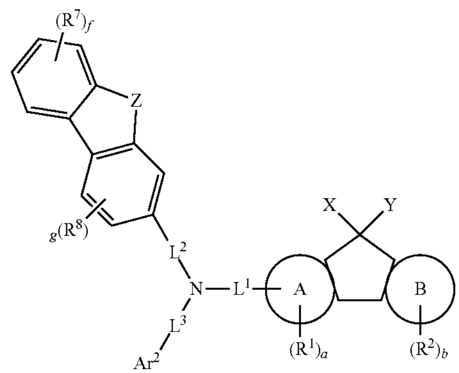

[Formula 9]

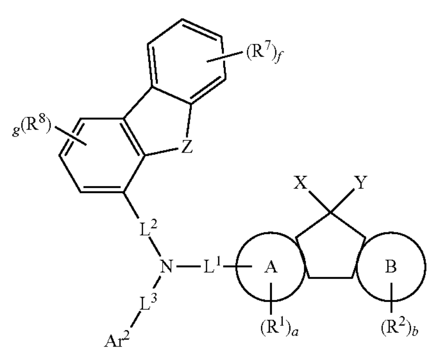

Hereinafter, Formula 6 to Formula 9 will be described.

Z is O, S, NR', or CR'R".

R' and R" may be respectively and independently selected from the group consisting of a $C_1$-$C_{30}$ alkyl group; a $C_6$-$C_{30}$ aryl group; or a $C_3$-$C_{30}$ heterocyclic group including at least one hetero atom of O, N, S, Si, or P, or bonded to form spiro compounds, respectively.

When one of R' and R" is an aryl group, one of R' and R" which is an aryl group may be, for example, a $C_6$-$C_{60}$ aryl group, a $C_6$-$C_{40}$ aryl group, a $C_6$-$C_{25}$ aryl group, or a $C_6$-$C_{10}$ aryl group.

When one of R' and R" is a heterocyclic group, one of R' and R" which is a heterocyclic group may be, for example, a $C_2$-$C_{40}$ heterocyclic group including at least one hetero atom of O, N, S, Si, or P, a $C_2$-$C_{20}$ heterocyclic group including at least one hetero atom of O, N, S, Si, or P, a $C_2$-$C_{10}$ heterocyclic group including at least one hetero atom of O, N, S, Si, or P.

i) Each of $R^7$ and $R^8$ may be independently selected from the group consisting of deuterium; a halogen; a $C_6$-$C_{30}$ aryl group; a fluorenyl group; a $C_2$-$C_{30}$ heterocyclic group including at least one heteroatom of O, N, S, Si, or P; a fused ring group of a $C_3$-$C_{30}$ aliphatic ring and a $C_6$-$C_{30}$ aromatic ring; a $C_1$-$C_{30}$ alkyl group; a $C_2$-$C_{20}$ alkenyl group; a $C_2$-$C_{20}$ alkynyl group; a $C_1$-$C_{30}$ alkoxyl group; or a $C_6$-$C_{30}$ aryloxy group. Alternatively, ii) a plurality of $R^7$s and a plurality of $R^8$s may be bonded to form rings, respectively.

i) Each of $R^7$ and $R^8$ may be independently selected from the group consisting of deuterium; a $C_6$-$C_{30}$ aryl group; a fluorenyl group; or a $C_2$-$C_{30}$ heterocyclic group including at least one heteroatom of O, N, S, Si, or P, and ii) a plurality of $R^7$s and a plurality of $R^8$s may be bonded to form rings, respectively.

When one of $R^7$ and $R^8$ is an aryl group, one of $R^7$ and $R^8$ which is an aryl group may be, for example, a $C_6$-$C_{60}$ aryl group, a $C_6$-$C_{40}$ aryl group, a $C_6$-$C_{25}$ aryl group, or a $C_6$-$C_{10}$ aryl group.

When one of $R^7$ and $R^8$ is a heterocyclic group, one of $R^7$ and $R^8$ which is a heterocyclic group may be, for example, a $C_2$-$C_{40}$ heterocyclic group including at least one hetero atom selected from O, N, S, Si, or P, a $C_2$-$C_{20}$ heterocyclic group including at least one hetero atom selected from O, N, S, Si, or P, or a $C_2$-$C_{10}$ heterocyclic group including at least one hetero atom selected from O, N, S, Si, or P.

f is an integer from 0 to 4, and g is an integer from 0 to 3.

$Ar^2$, $L^1$ to $L^3$, ring A, ring B, X, Y, $R^1$, $R^2$, a, and b are the same as $Ar^2$, $L^1$ to $L^3$, ring A, ring B, X, Y, $R^1$, $R^2$, a, and b defined above in the description of Formula 1.

The first compound may be represented by one of the following Formula 10 to Formula 12.

[Formula 10]

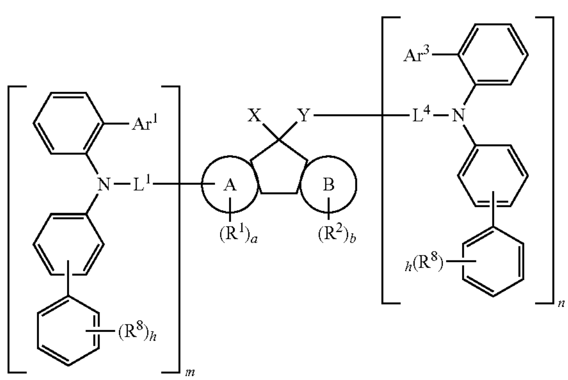

-continued

[Formula 11]

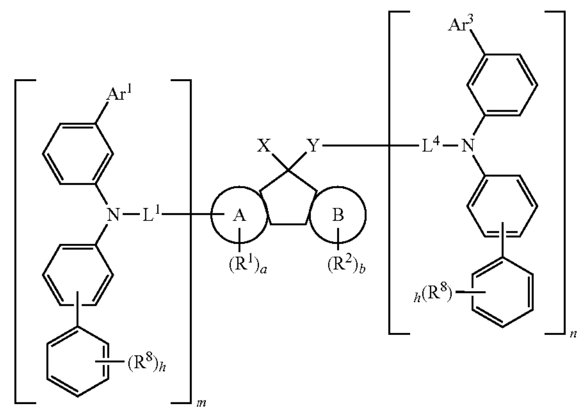

[Formula 12]

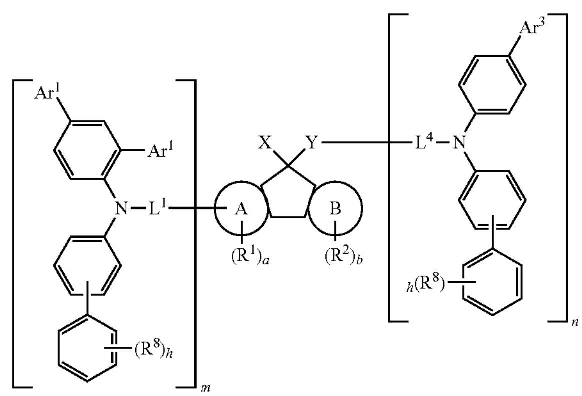

Hereinafter, Formula 10 to Formula 12 will be described.

i) $R^9$ may be independently selected from the group consisting of deuterium; a halogen; a $C_6$-$C_{30}$ aryl group; a fluorenyl group; a $C_2$-$C_{30}$ heterocyclic group including at least one heteroatom of O, N, S, Si, or P; a fused ring group of a $C_3$-$C_{30}$ aliphatic ring and a $C_6$-$C_{30}$ aromatic ring; a $C_1$-$C_{30}$ alkyl group; a $C_2$-$C_{20}$ alkenyl group; a $C_2$-$C_{20}$ alkynyl group; a $C_1$-$C_{30}$ alkoxyl group; or a $C_6$-$C_{30}$ aryloxy group, and ii) a plurality of $R^9$s may be bonded to form a ring.

i) $R^9$ may be independently selected from the group consisting of deuterium; a halogen; a $C_6$-$C_{30}$ aryl group; a $C_2$-$C_{30}$ heterocyclic group including at least one heteroatom of O, N, S, Si, or P; or a $C_1$-$C_{30}$ alkyl group, and ii) a plurality of $R^{21}$s, a plurality of $R^{22}$s, a plurality of $R^{23}$s, a plurality of $R_9$s may be bonded to form a ring.

When $R^9$ is an aryl group, $R^9$ which is an aryl group may be, for example, a $C_6$-$C_{60}$ aryl group, a $C_6$-$C_{40}$ aryl group, a $C_6$-$C_{25}$ aryl group, or a $C_6$-$C_{10}$ aryl group.

When $R^9$ is a heterocyclic group, $R^9$ which is a heterocyclic group may be, for example, a $C_2$-$C_{40}$ heterocyclic group including at least one hetero atom selected from O, N, S, Si, or P, a $C_2$-$C_{20}$ heterocyclic group including at least one hetero atom selected from O, N, S, Si, or P, or a $C_2$-$C_{10}$ heterocyclic group including at least one hetero atom selected from O, N, S, Si, or P.

$Ar^1$, $Ar^3$, $L^1$, $L^4$, ring A, ring B, X, Y, $R^1$, $R^2$, a, and b are the same as $Ar^1$, $Ar^3$, $L^1$, $L^4$, ring A, ring B, X, Y, $R^1$, $R^2$, a, and b defined above in the description of Formula 1.

The first compound may be one of the following compounds

-continued
P1-1
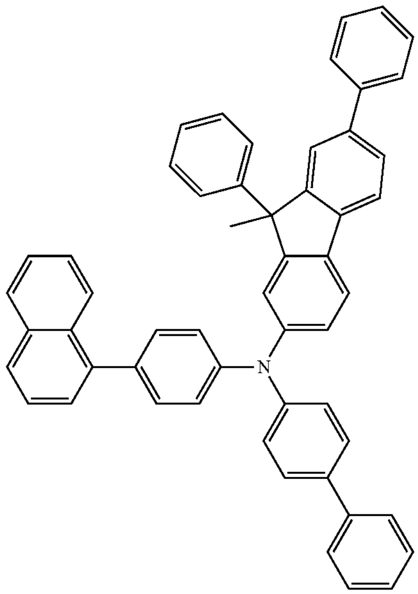
P1-2
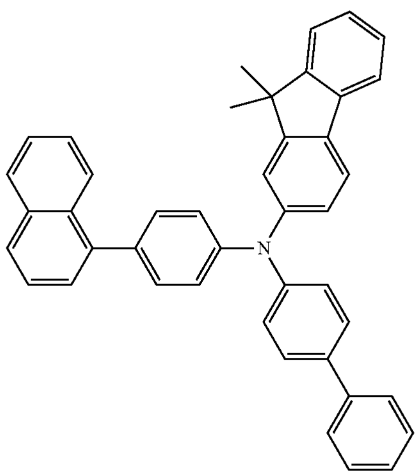
P1-3
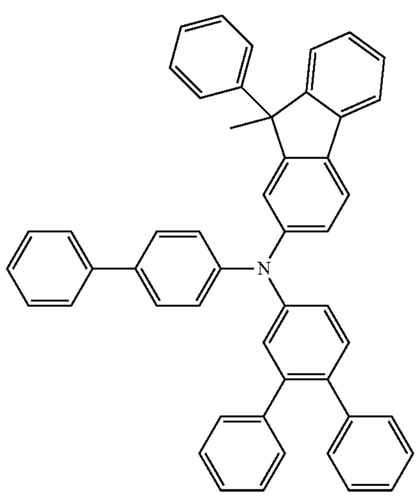
P1-4
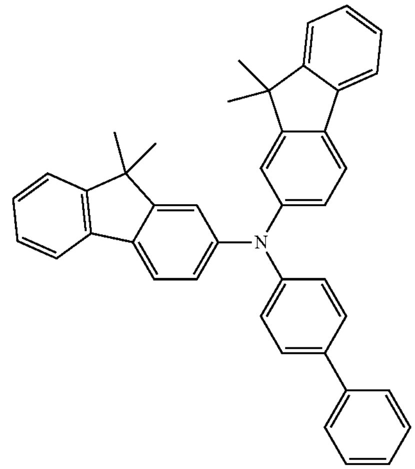
P1-5
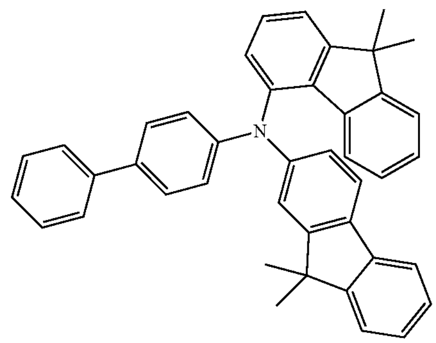
P1-6
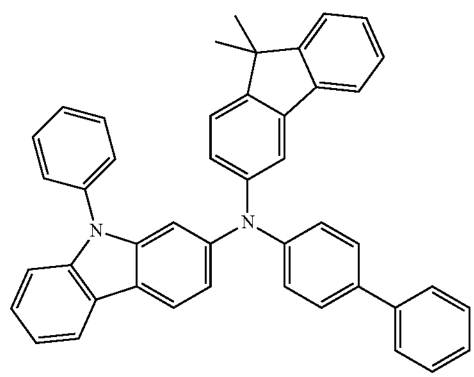
P1-7
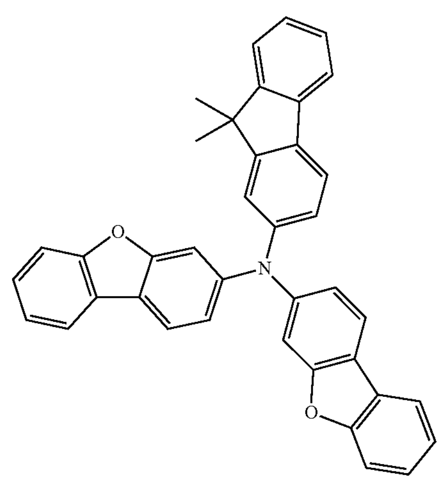

-continued
P1-8
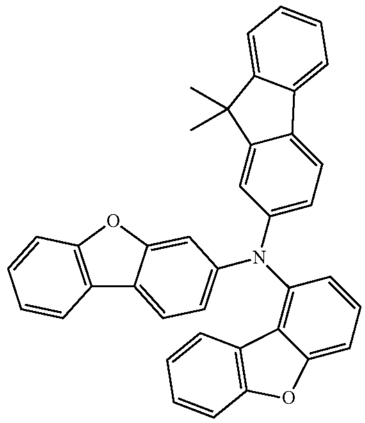
P1-9
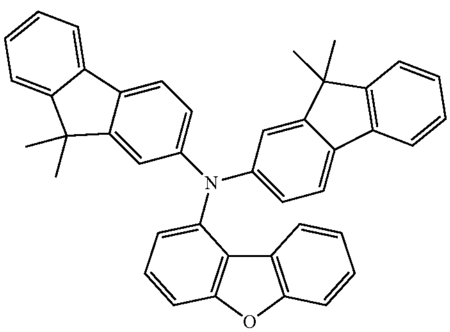
P1-10
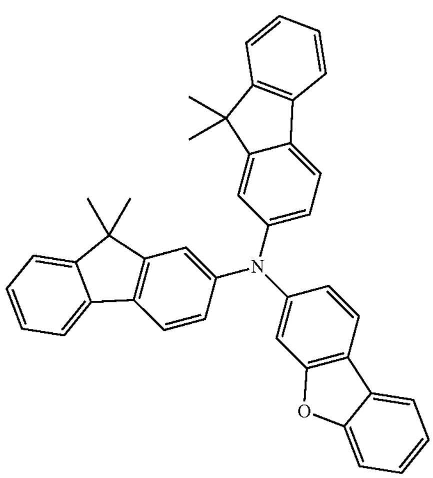
-continued
P1-11
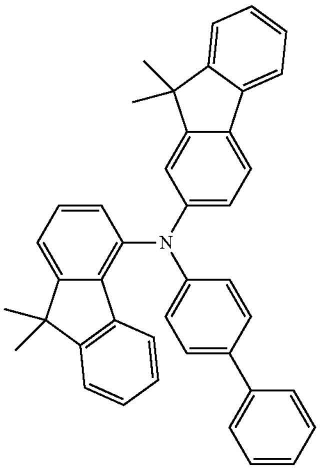
P1-12
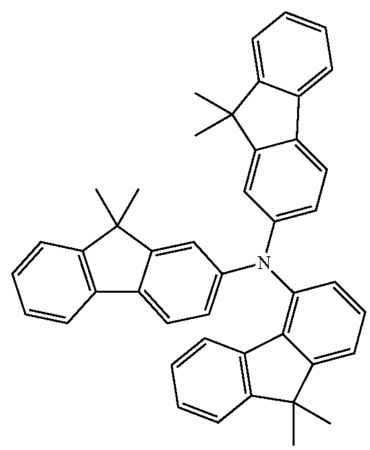
P1-13
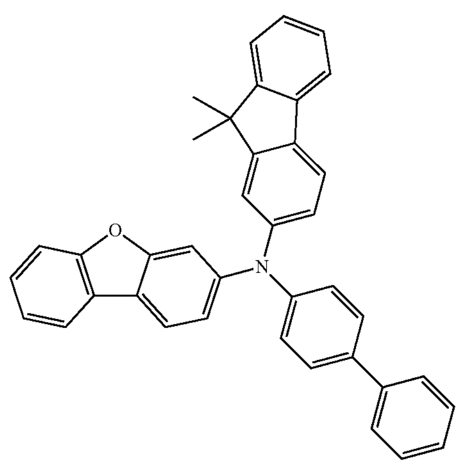

-continued
P1-14
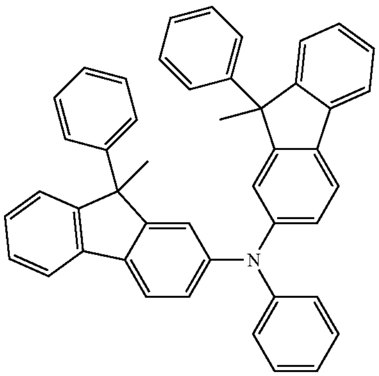
P1-15
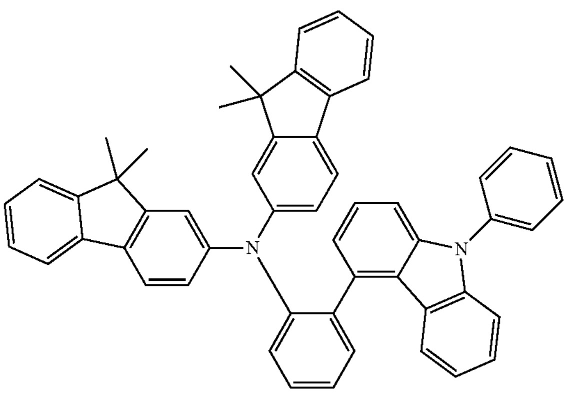
P1-16
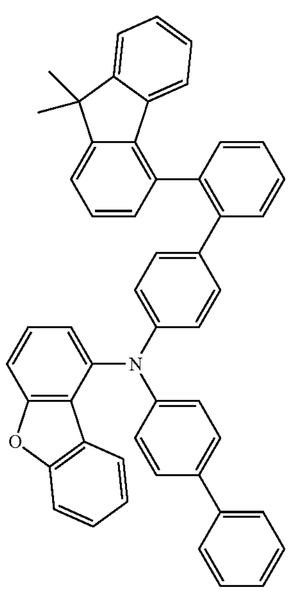
-continued
P1-17
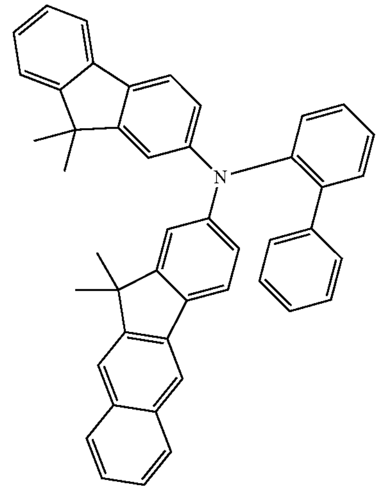
P1-18
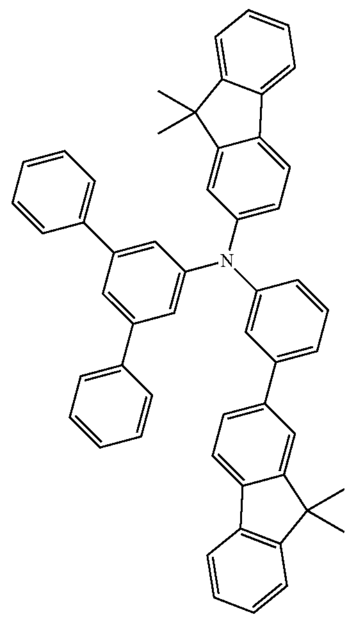
P1-19
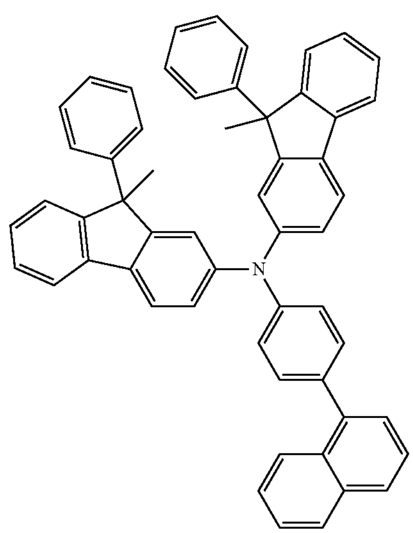

P1-20
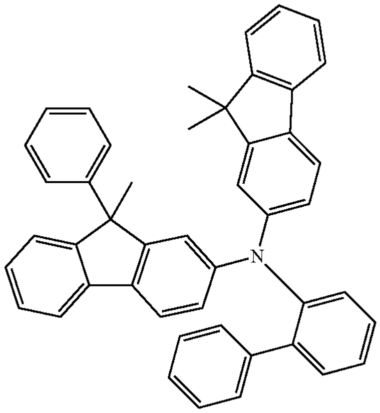
P2-1
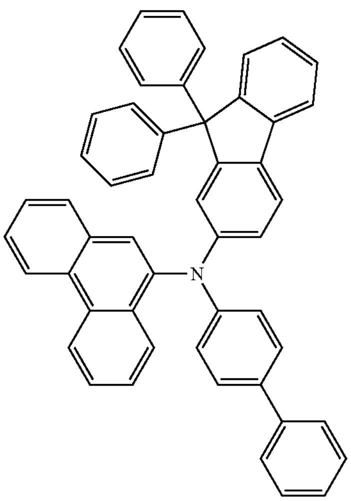
P2-2
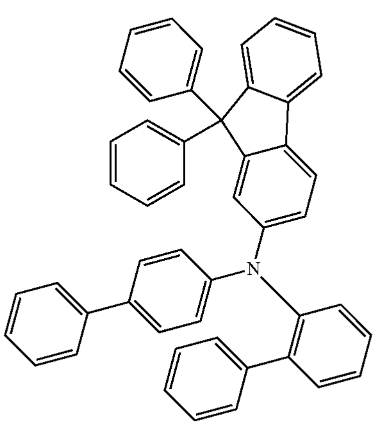
P2-3
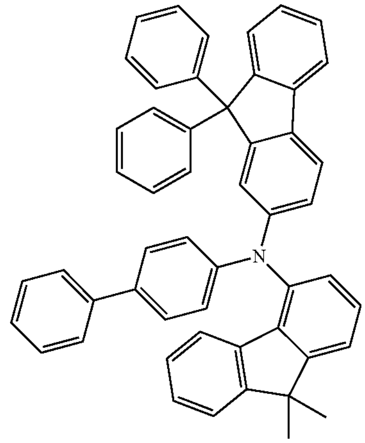
P2-4
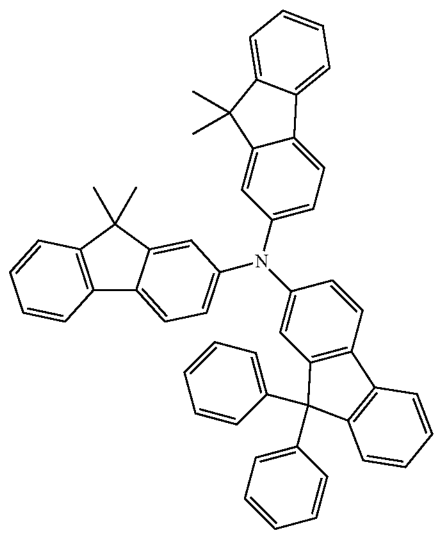
P2-5
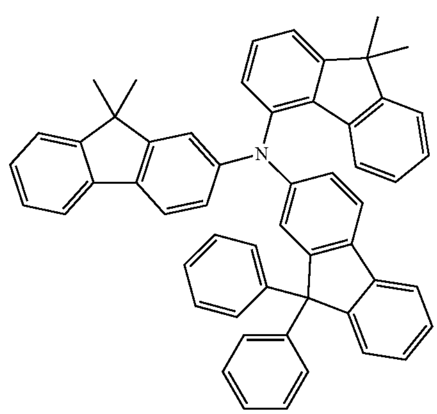

-continued
P2-6
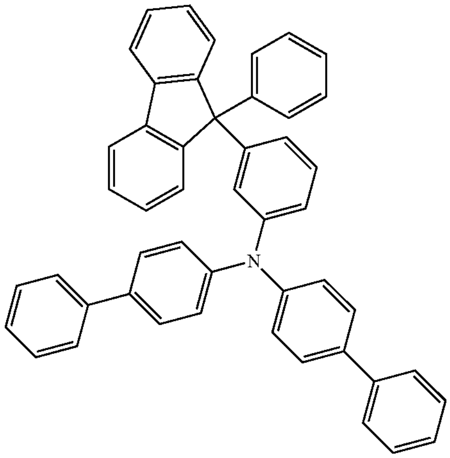
P2-7
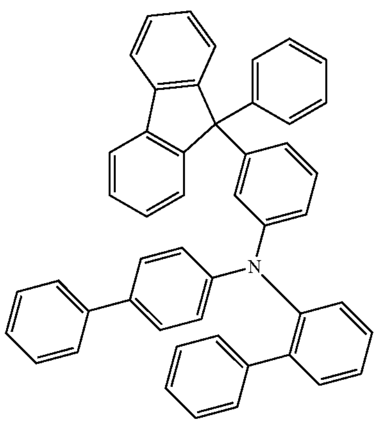
P2-8
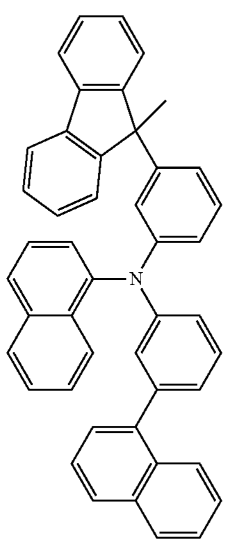
-continued
P2-9
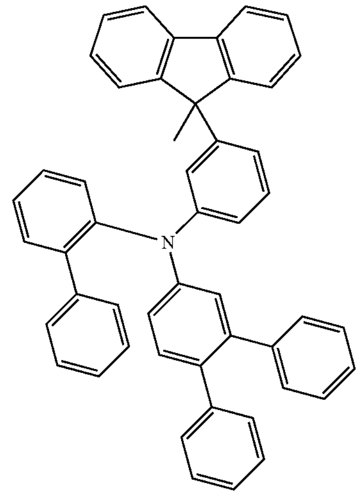
P2-10
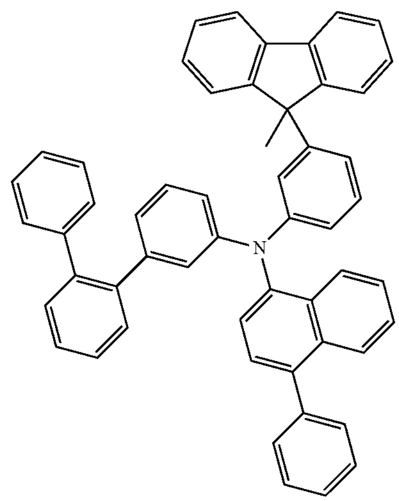
P2-11
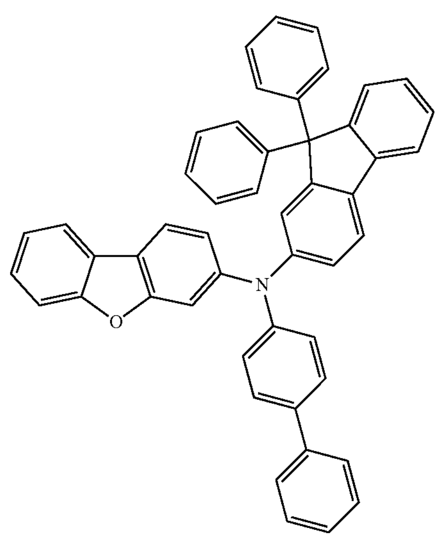

P2-12
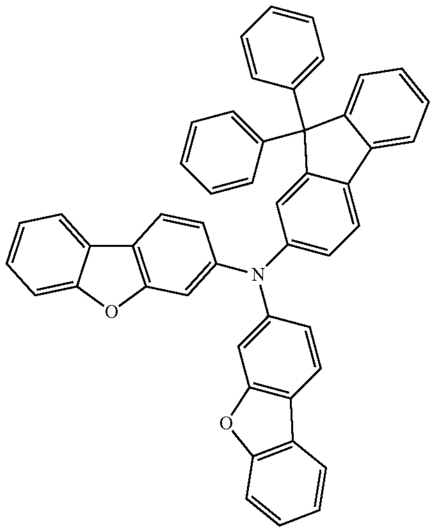
P2-13
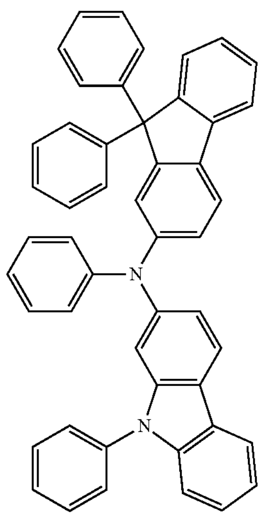
P2-14
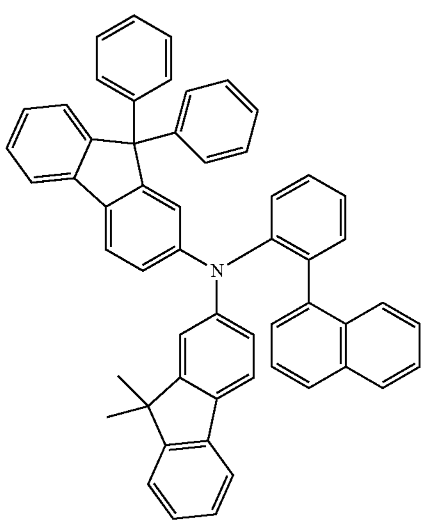
P2-15
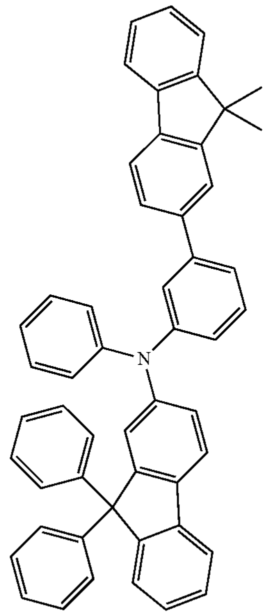
P2-16
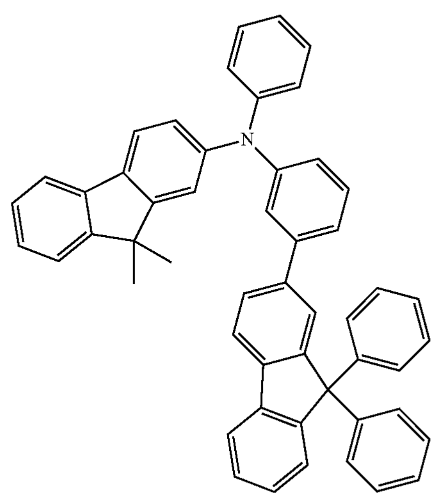

-continued
P2-17
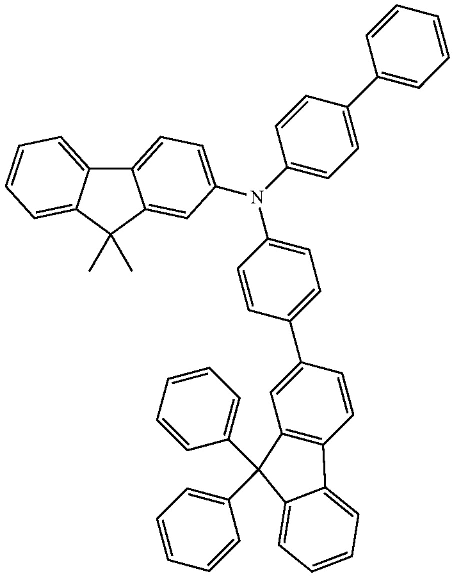
P2-18
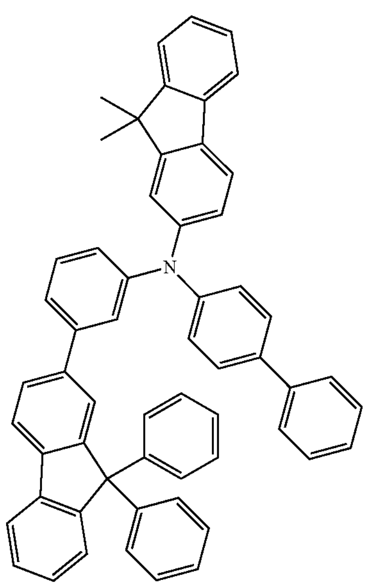
-continued
P2-19
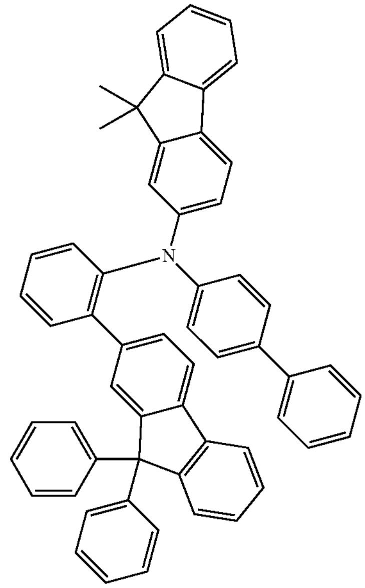
P2-20
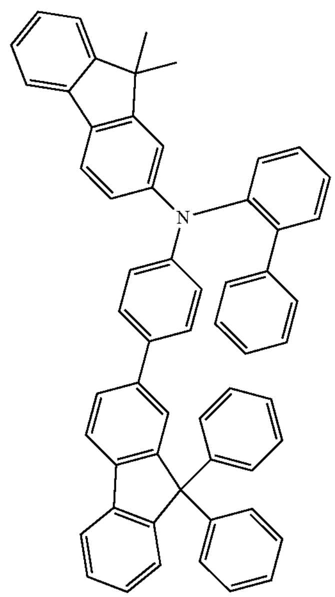
P2-21
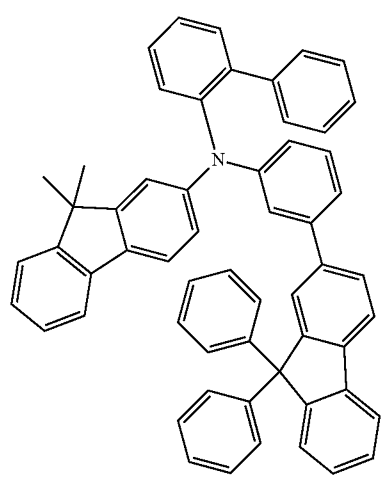

-continued
P2-22
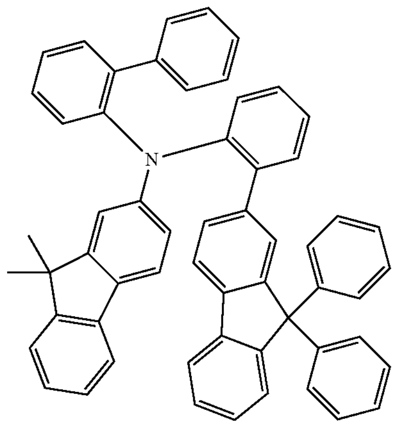
P2-23
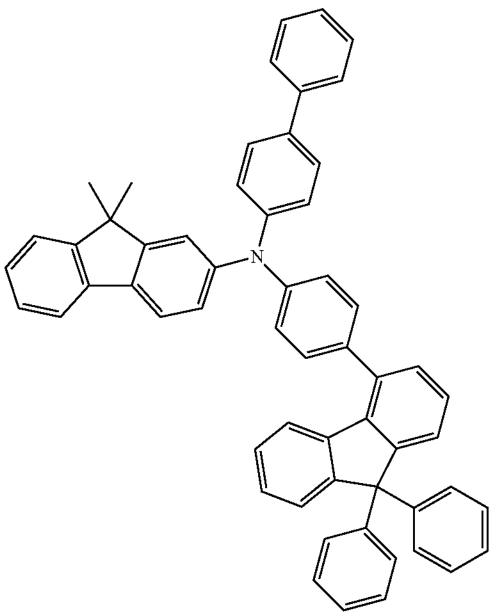
P2-24
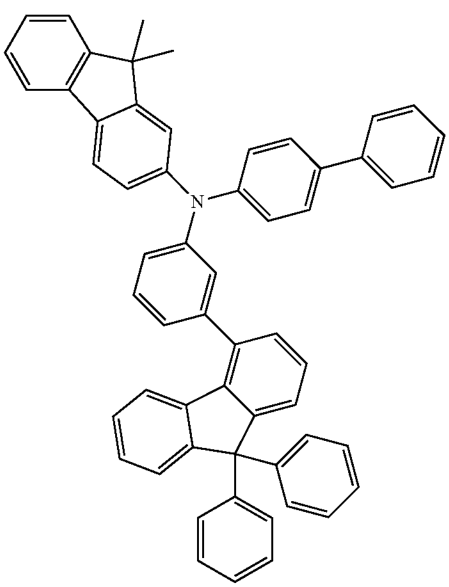
-continued
P2-25
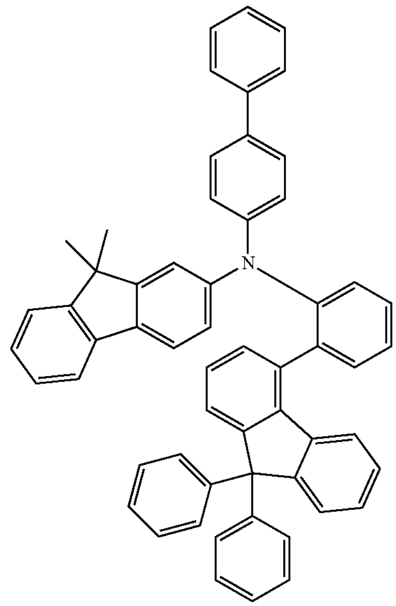
P2-26
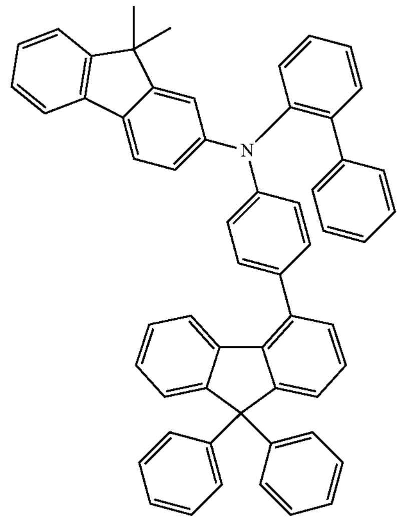
P2-27
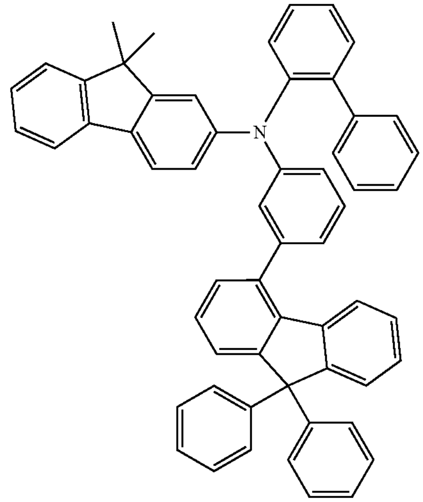

-continued
P2-28
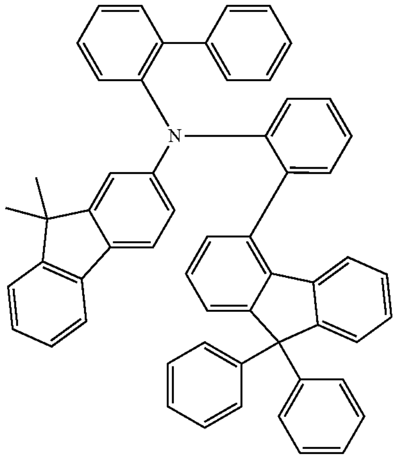
P2-29
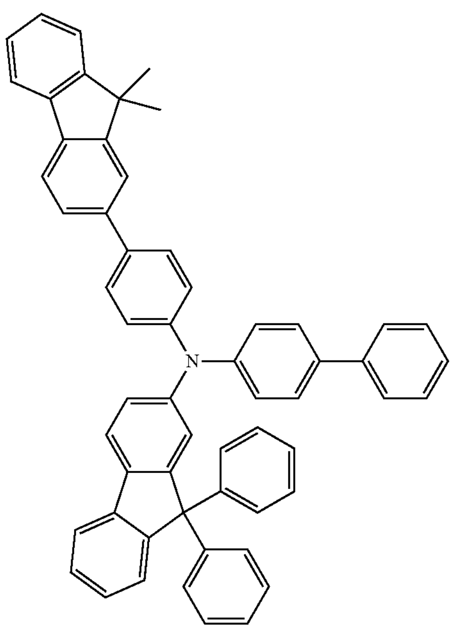
-continued
P2-30
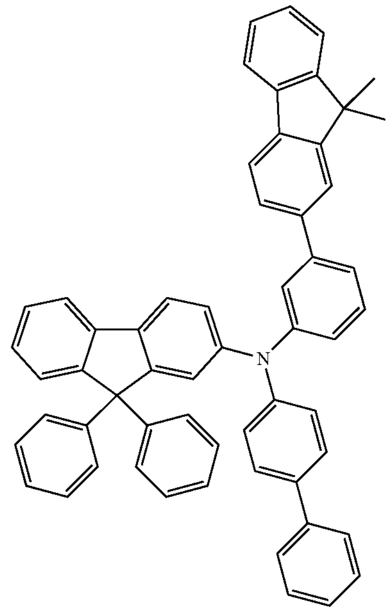
P2-31
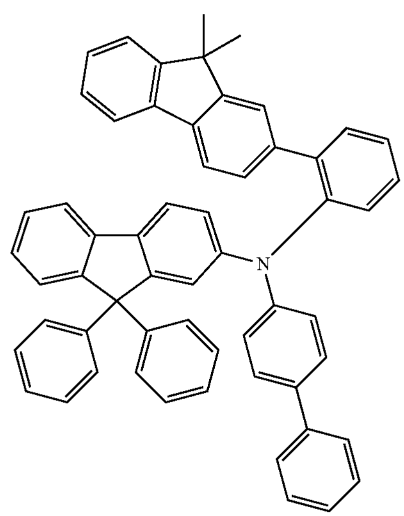

-continued
P2-32
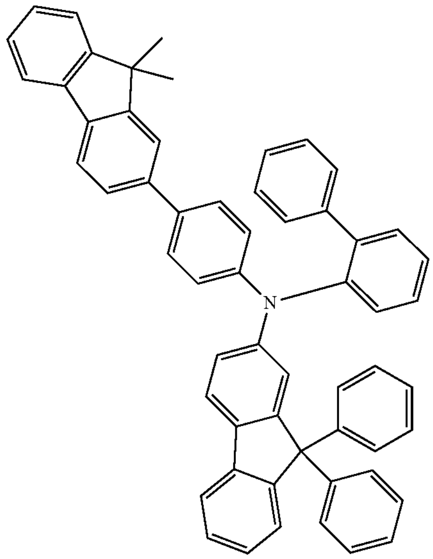
P2-33
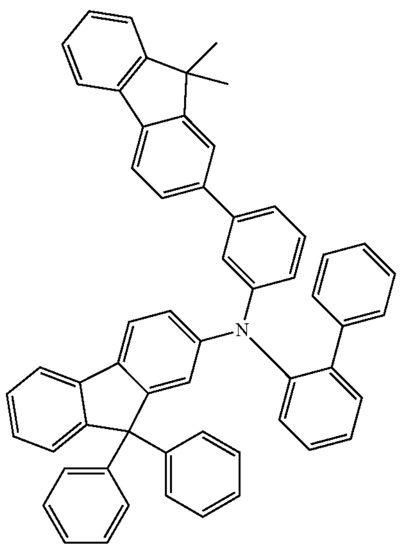
P2-34
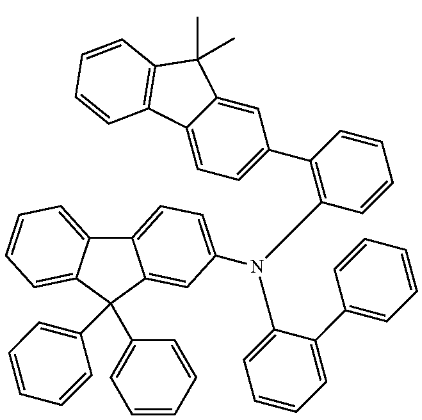
-continued
P2-35
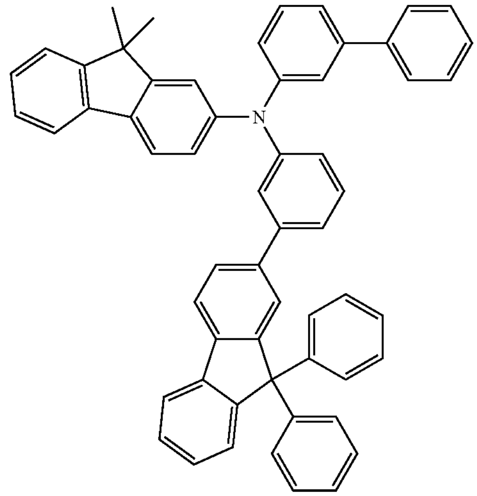
P2-36
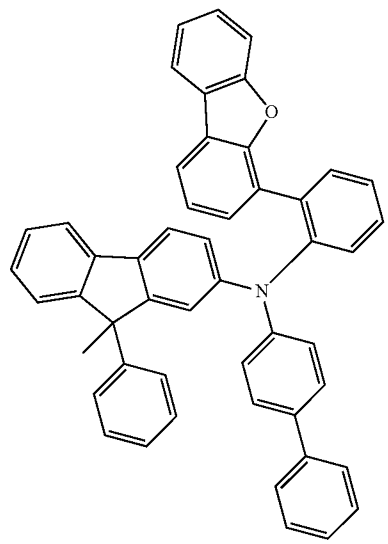
P2-37
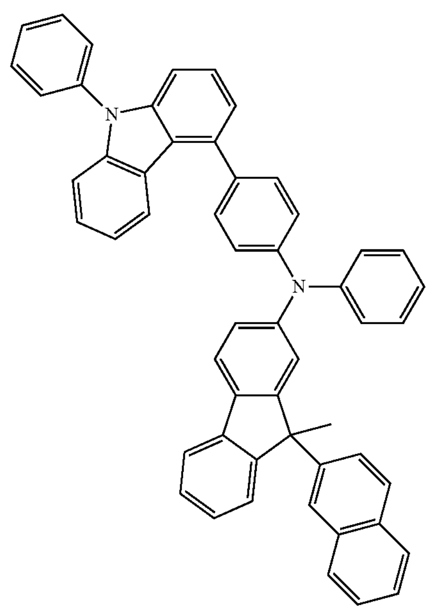

P2-38
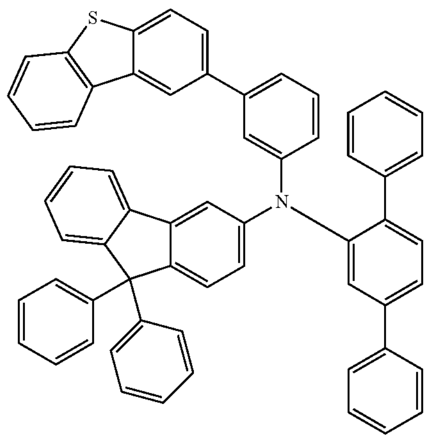
P2-39
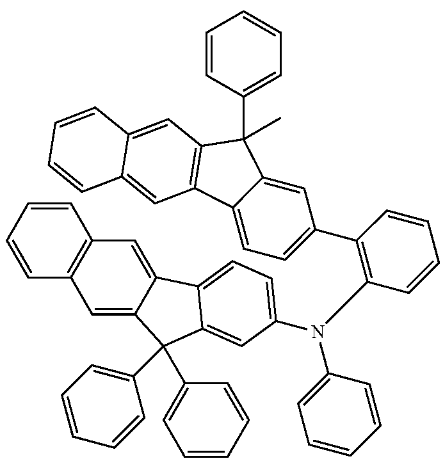
P2-40
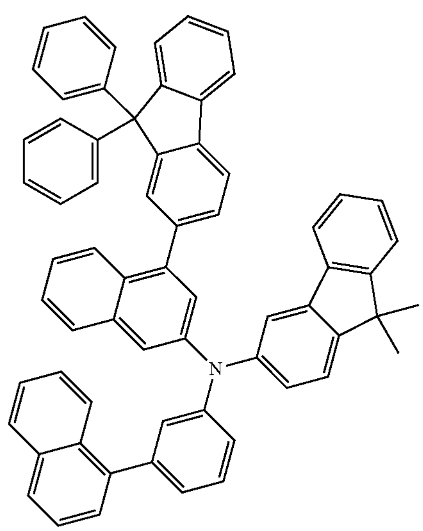
P3-1
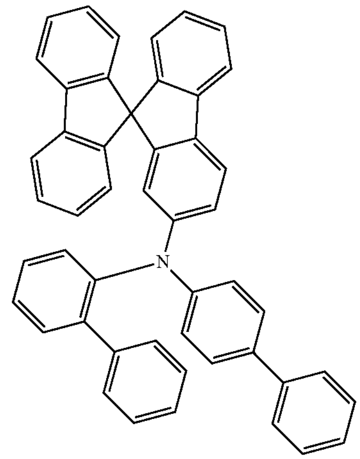
P3-2
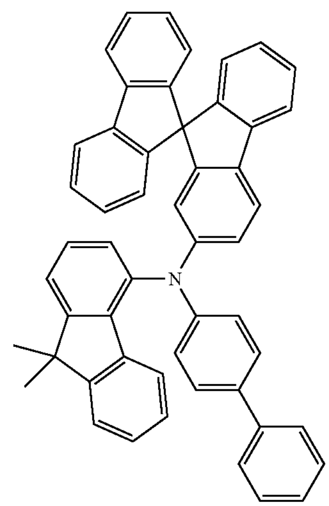
P3-3
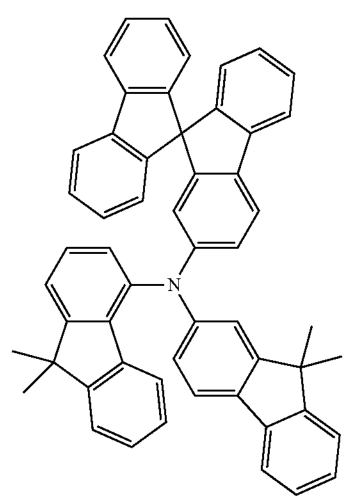

-continued
P3-4
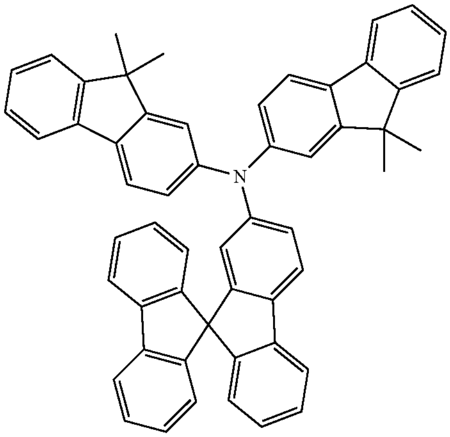
P3-5
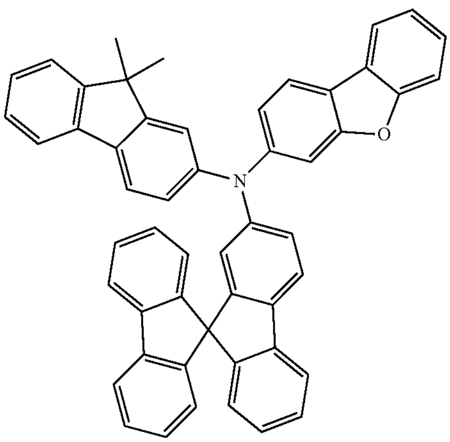
P3-6
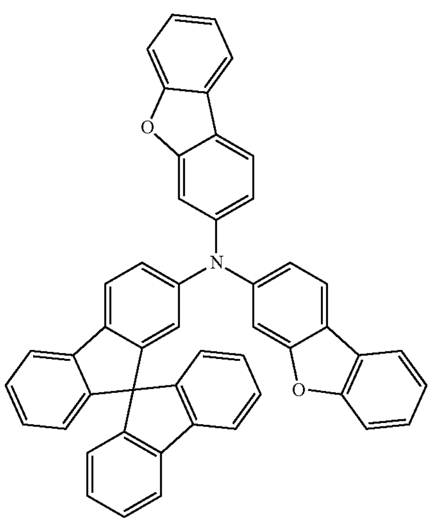
-continued
P3-7
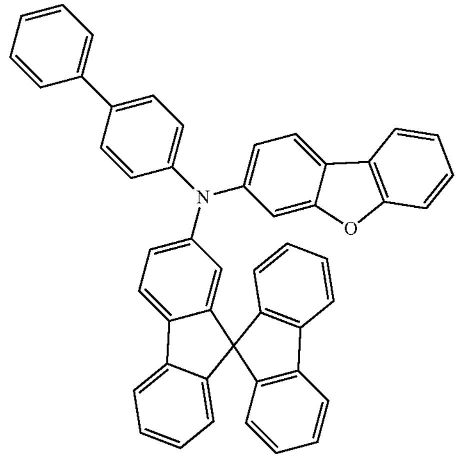
P3-8
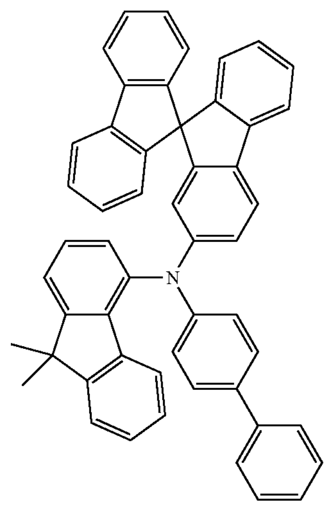
P3-9
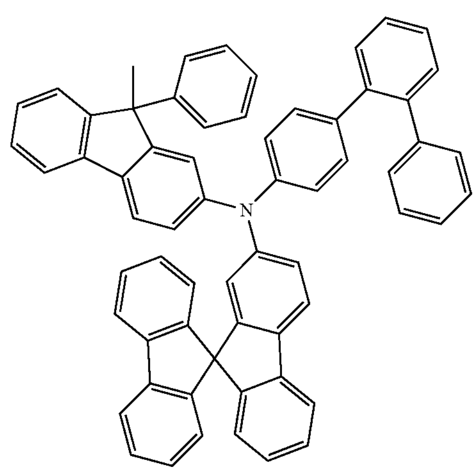

-continued
P3-10
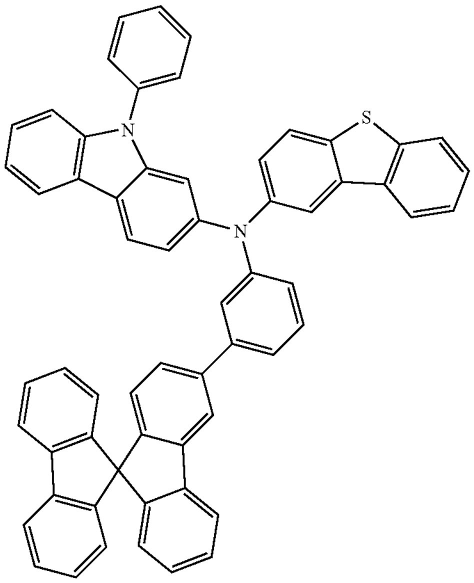
P3-11
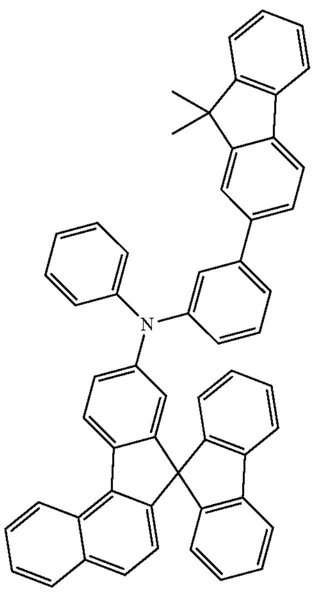
P3-12
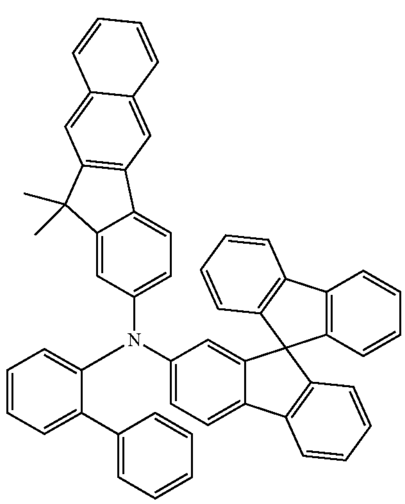
-continued
P3-13
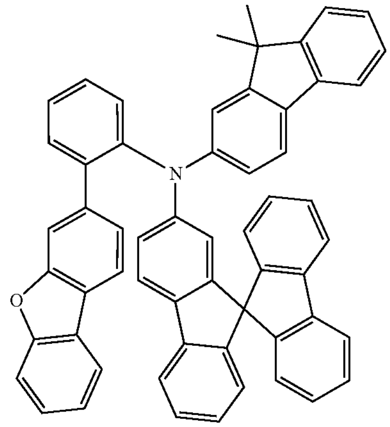
P3-14
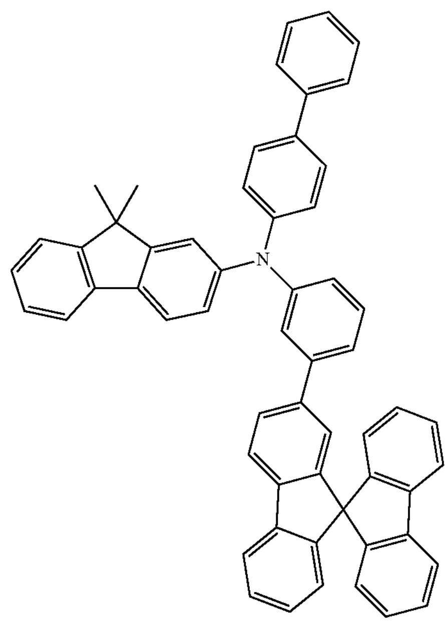
P3-15
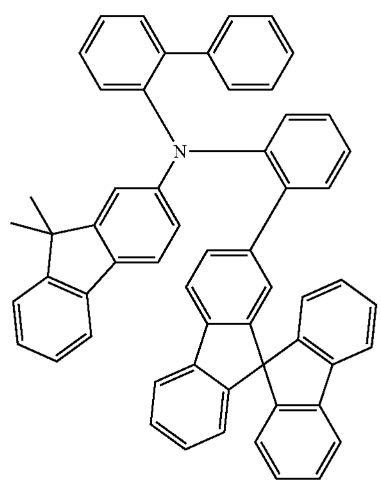

P3-16
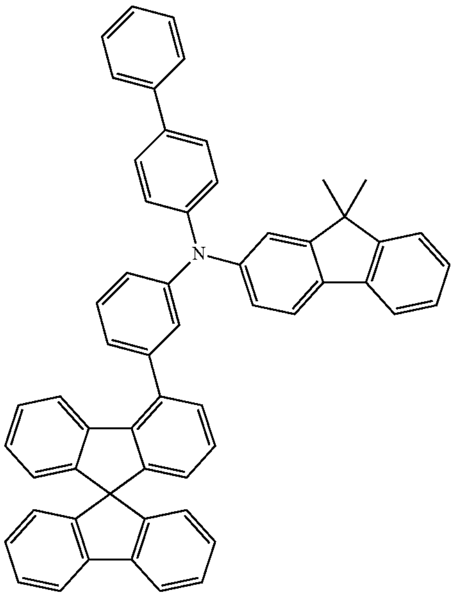
P3-17
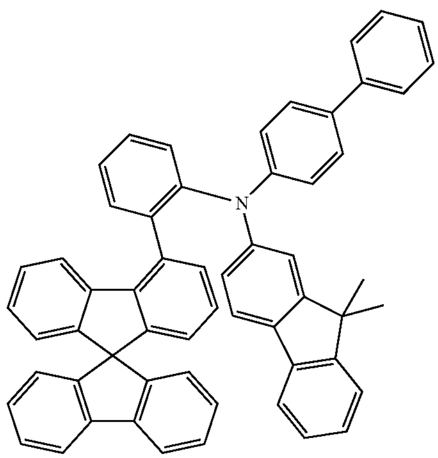
P3-18
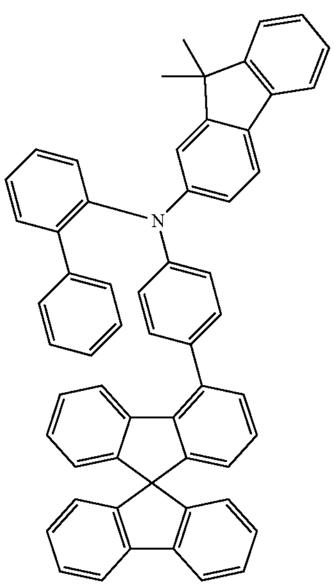
P3-19
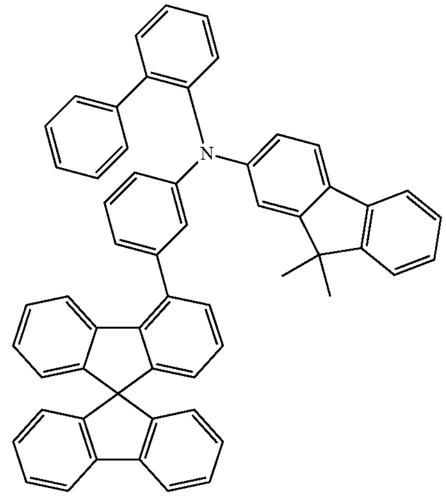
P3-20
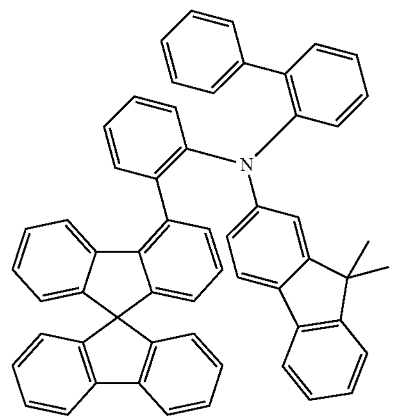
P3-21
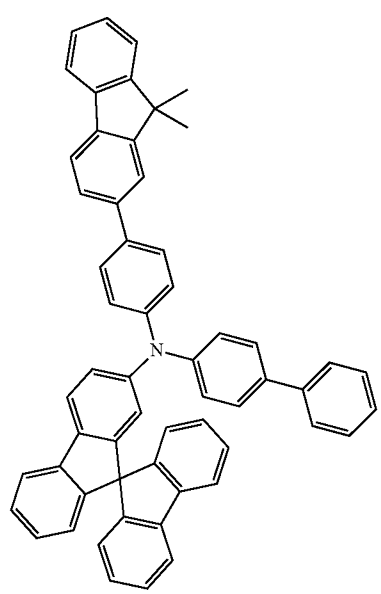

-continued
P3-22
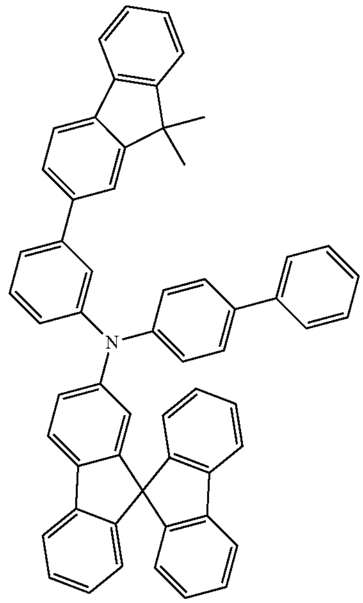
P3-23
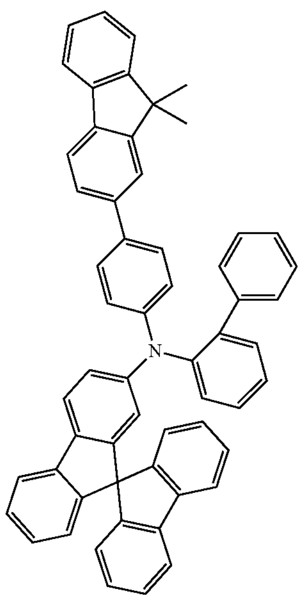
P3-24
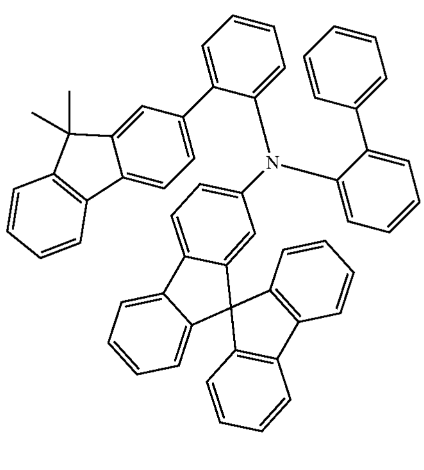
-continued
P3-25
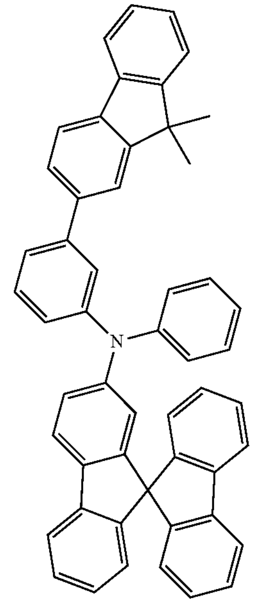
P3-26
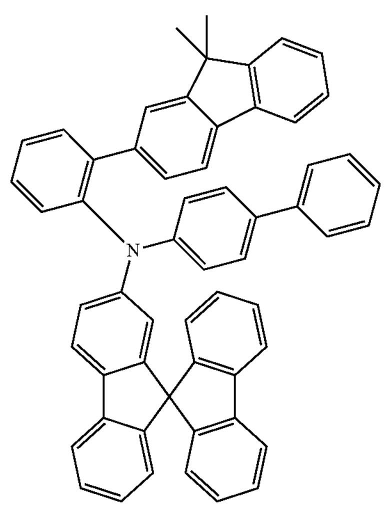

-continued
P3-27
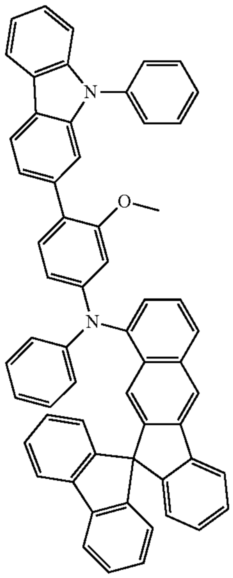
P3-28
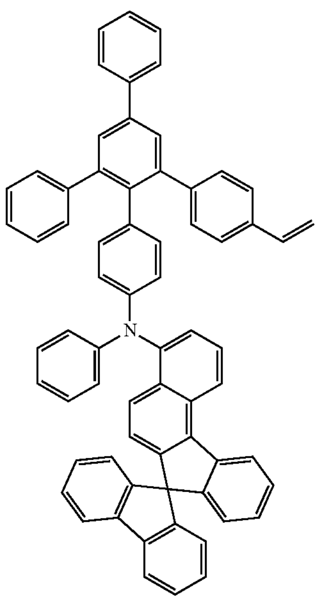
P3-29
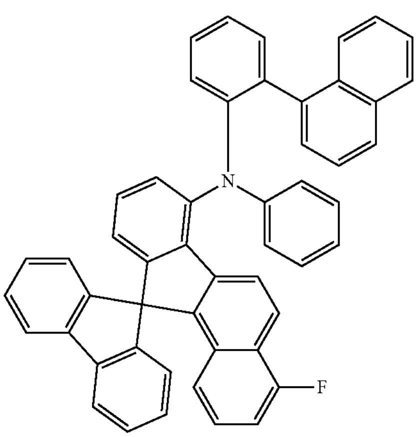
-continued
P3-30
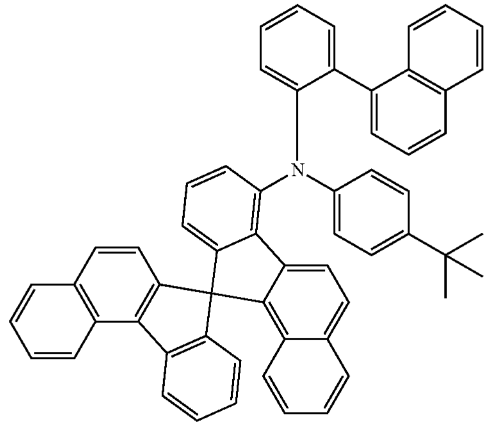
P4-1
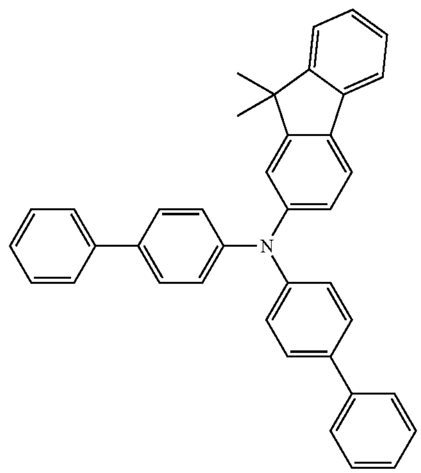
P4-2
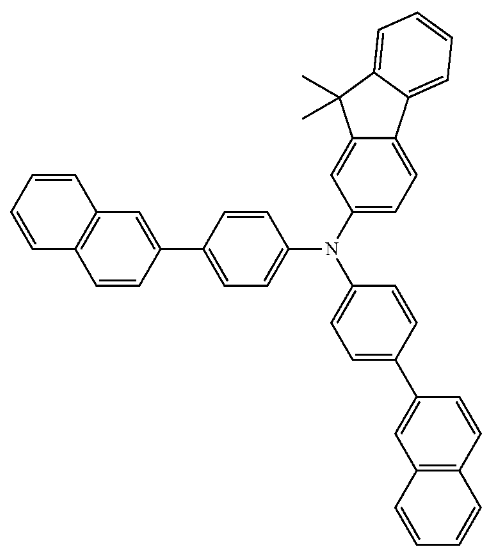

-continued
P4-3
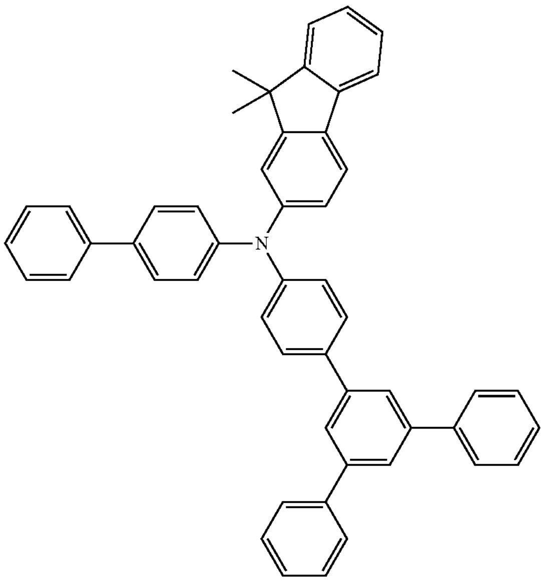
P4-4
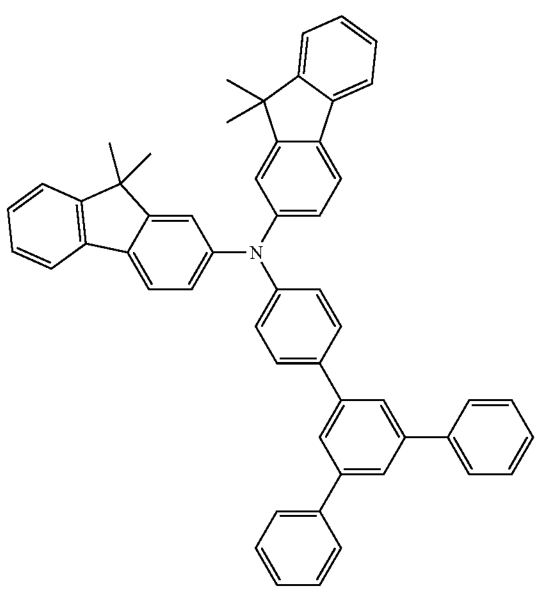
-continued
P4-5
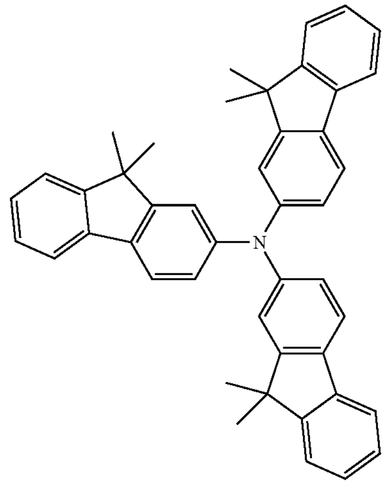
P4-6
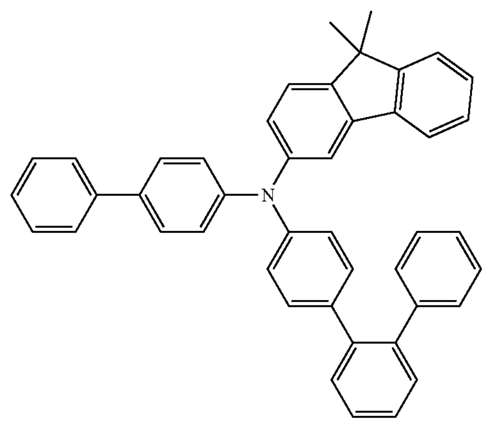
P4-7
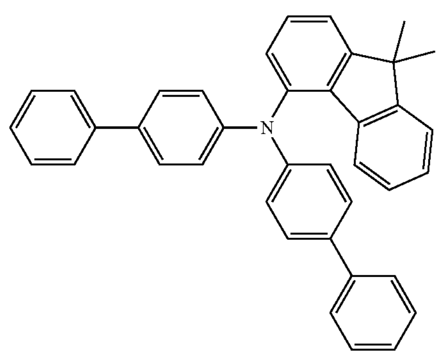

P4-8
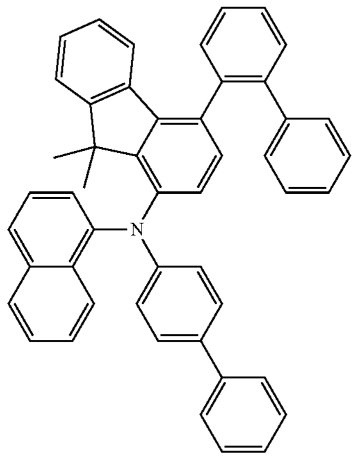
P4-9
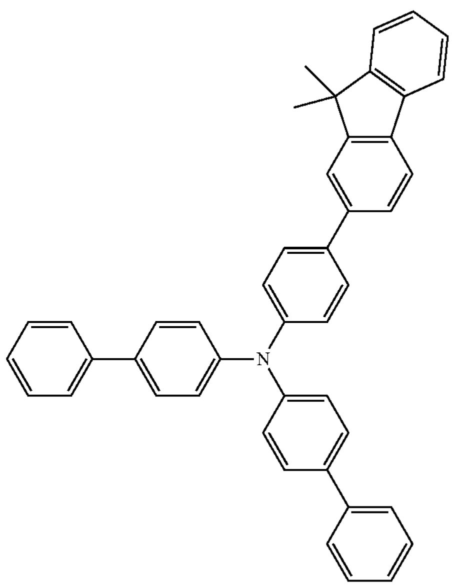
P4-10
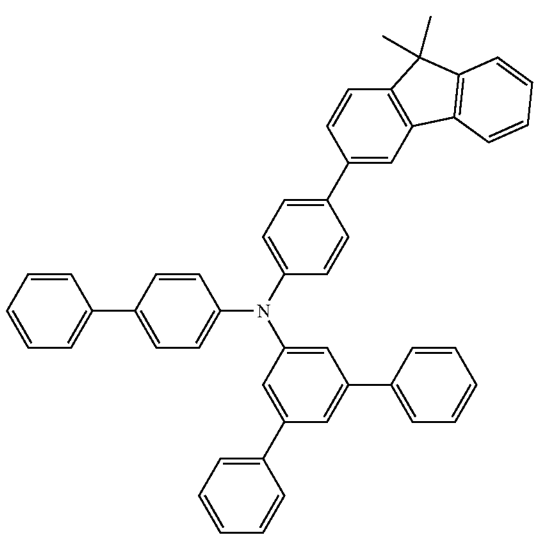
P4-11
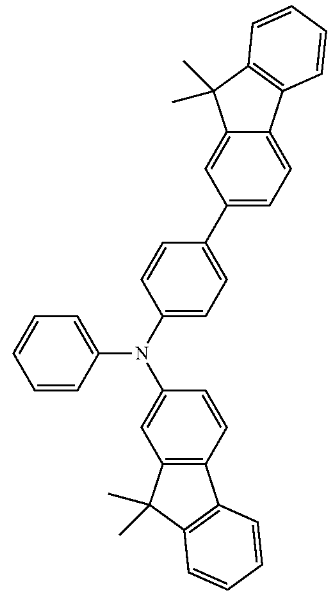
P4-12
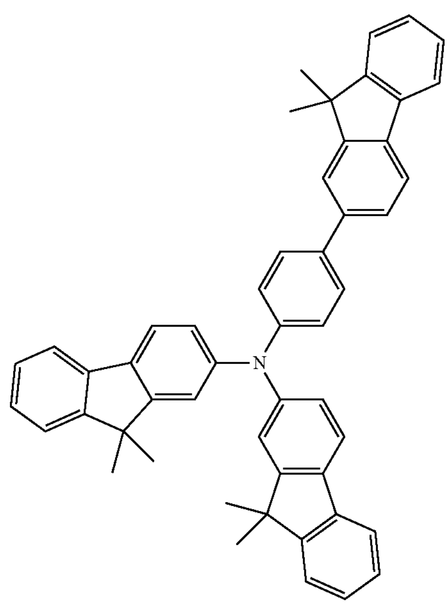

-continued
P4-13
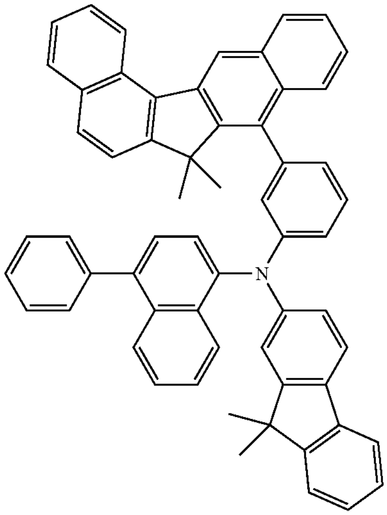
P4-14
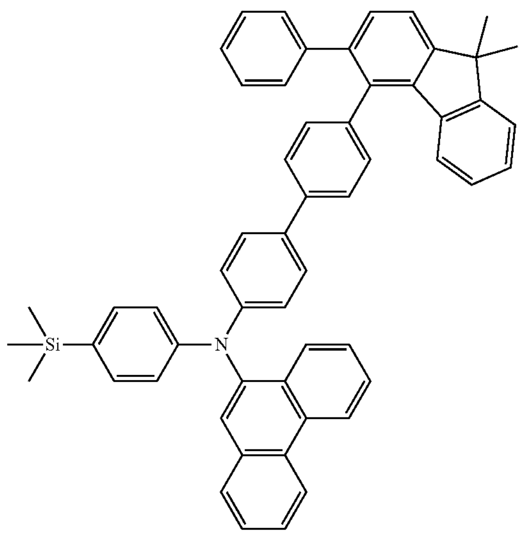
P4-15
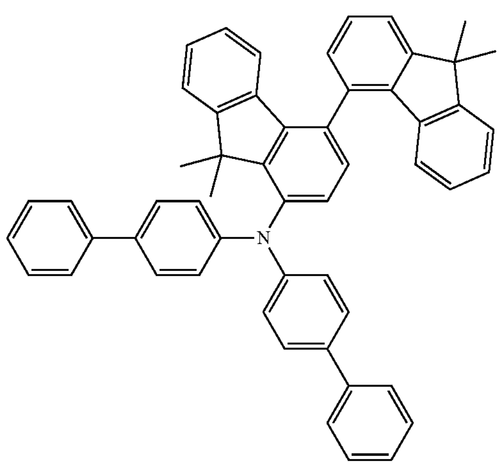
-continued
P4-16
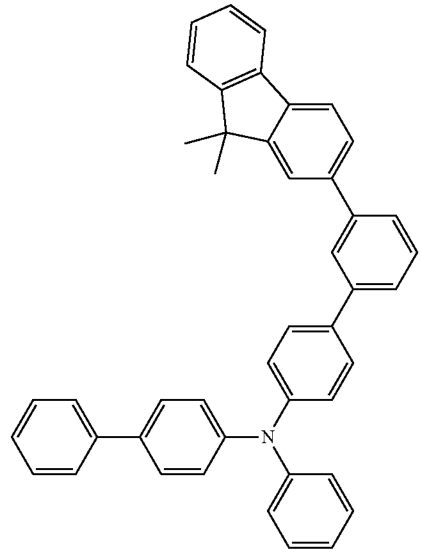
P4-17
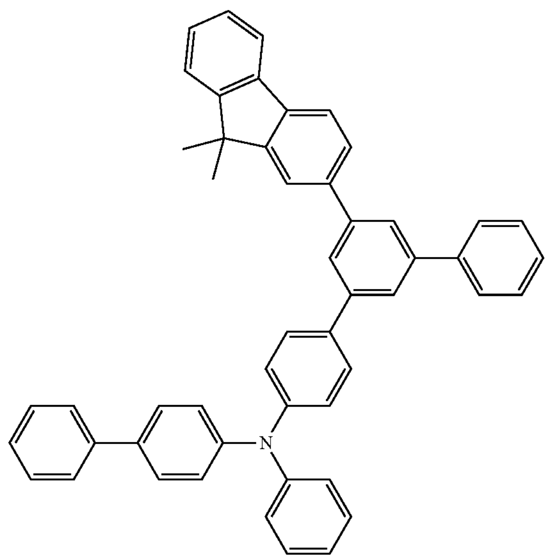
P4-18
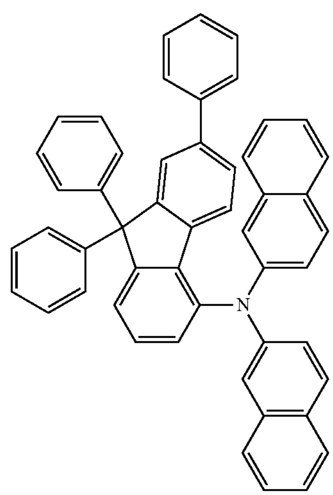

-continued
P4-19
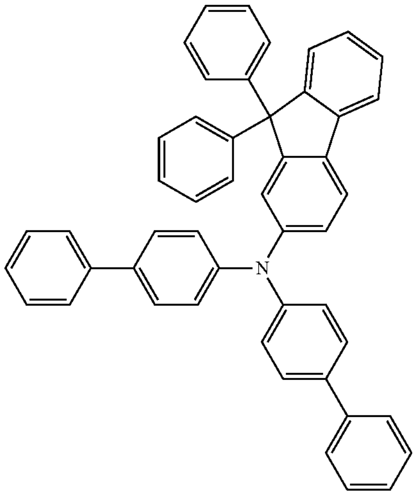
P4-20
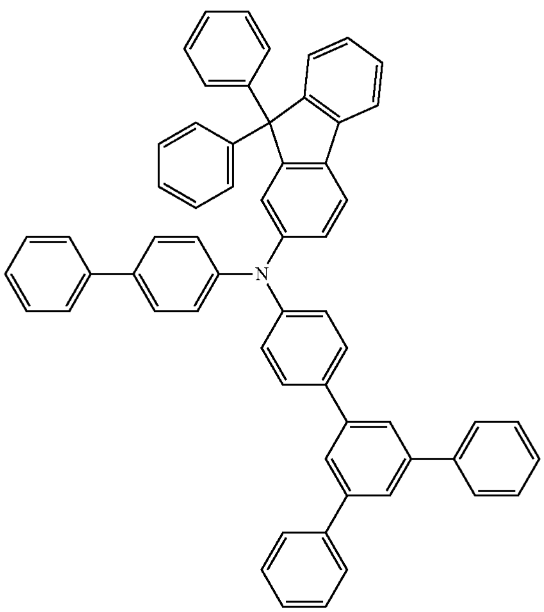
P4-21
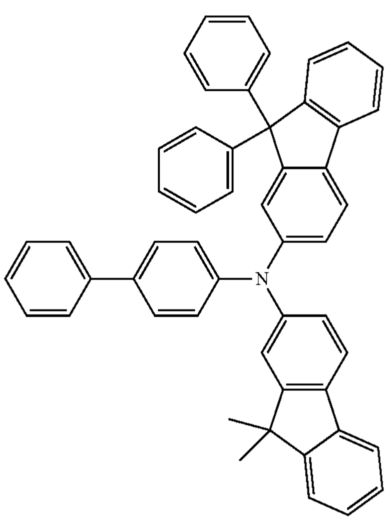
-continued
P4-22
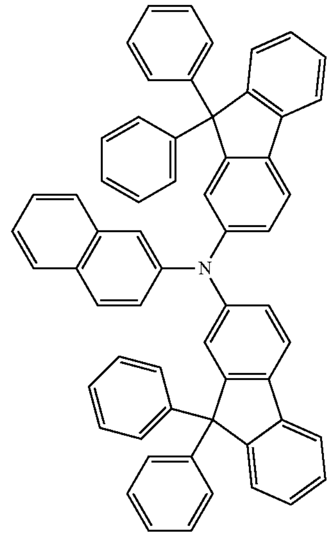
P4-23
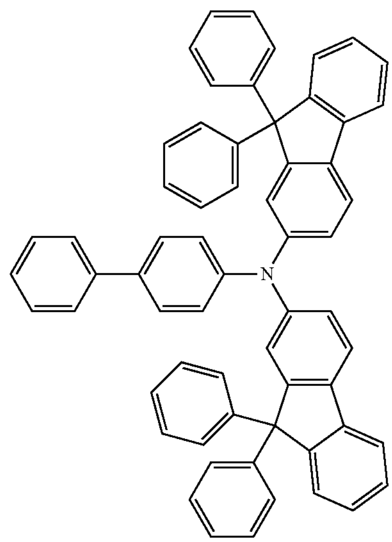
P4-24
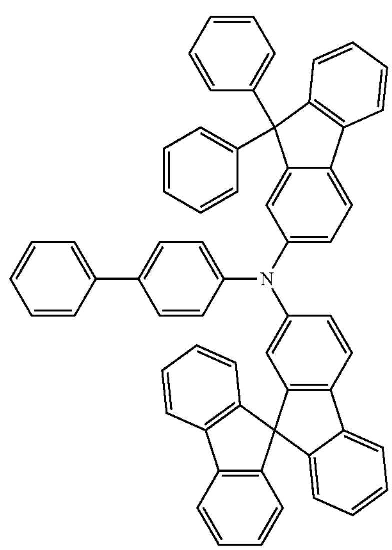

-continued
P4-25
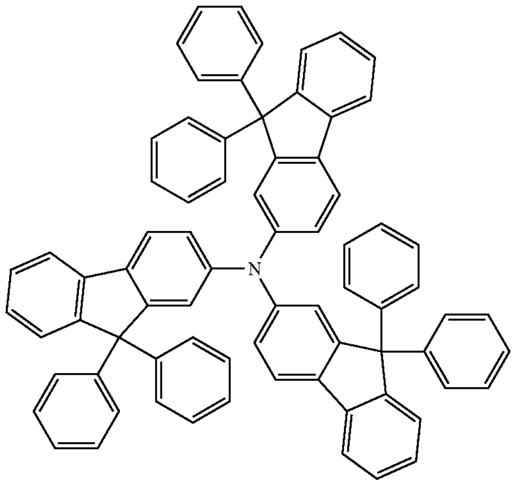
P4-26
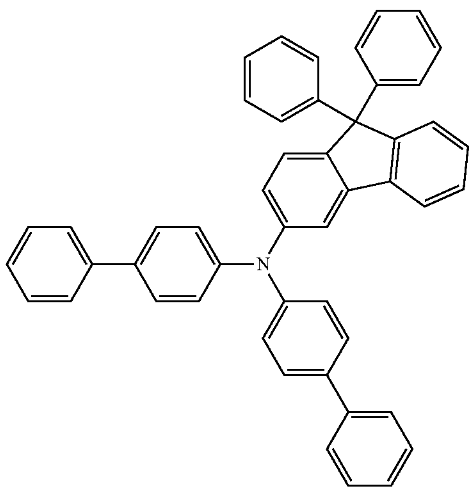
P4-27
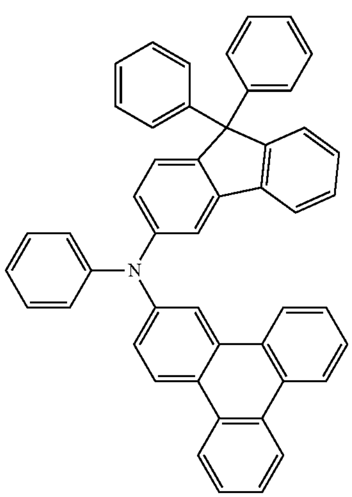
-continued
P4-28
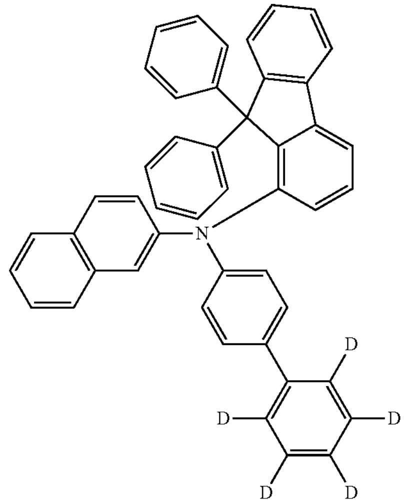
P4-29
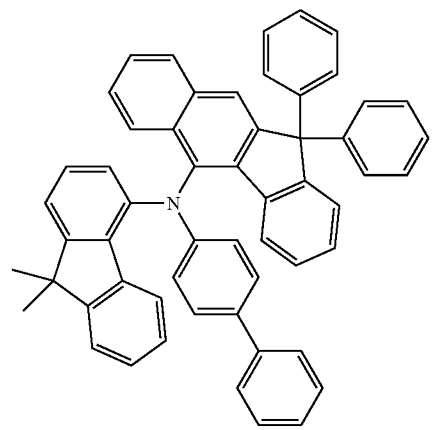
P4-30
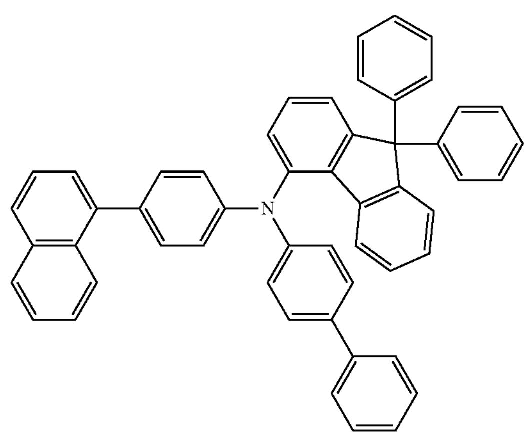

-continued
P4-31
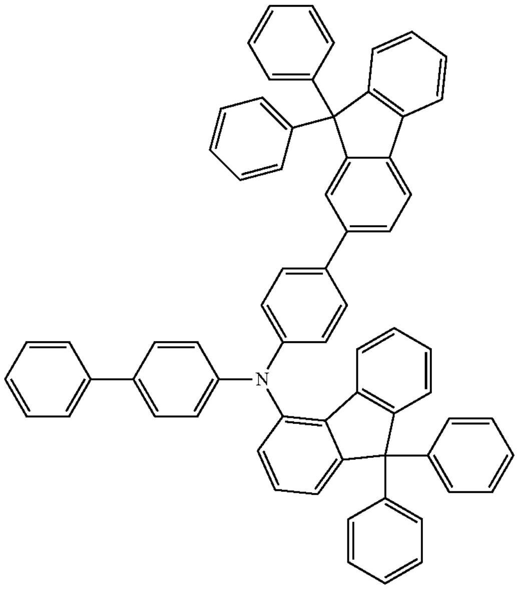
P4-33
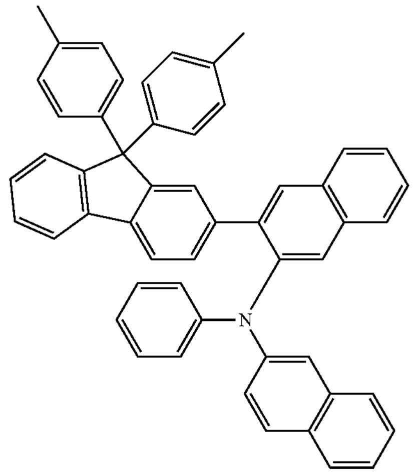
P4-32
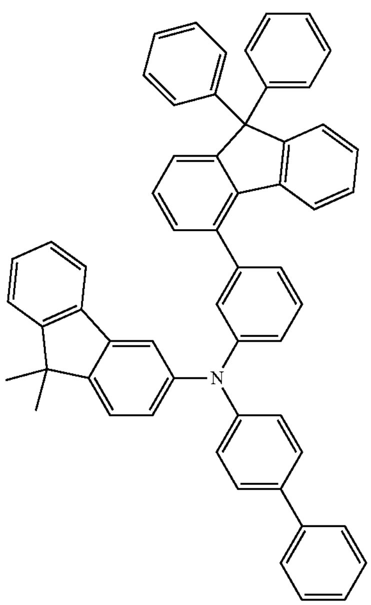
P4-34
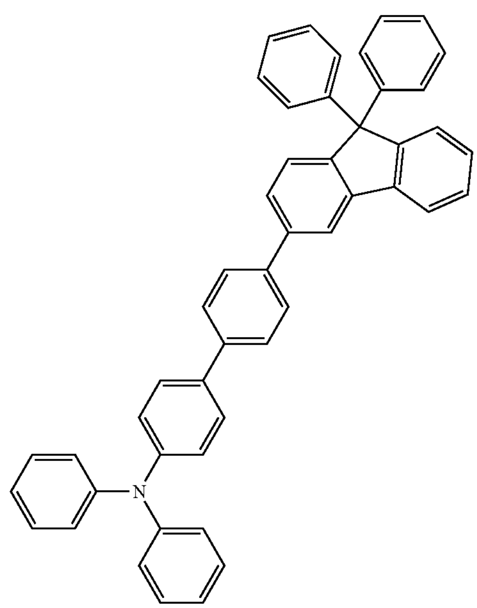

-continued
P4-35
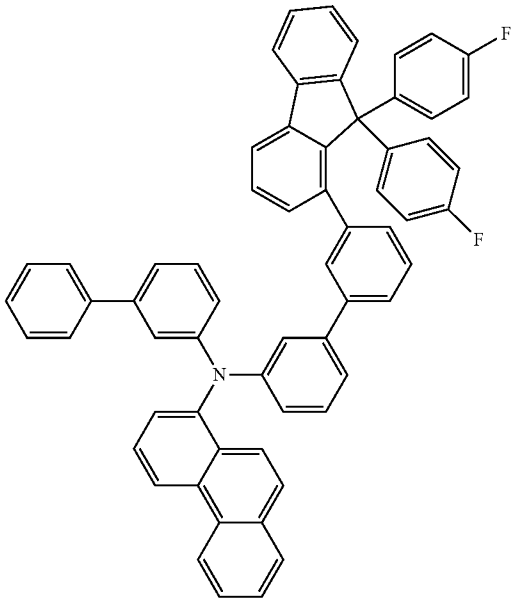
P4-36
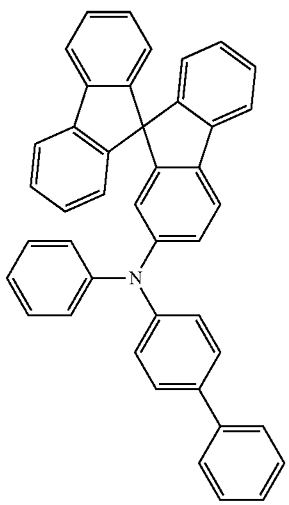
P4-37
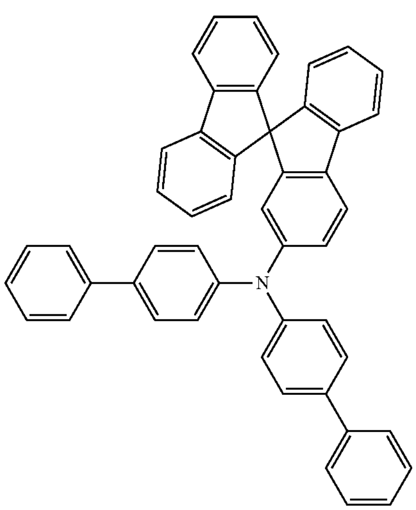
-continued
P4-38
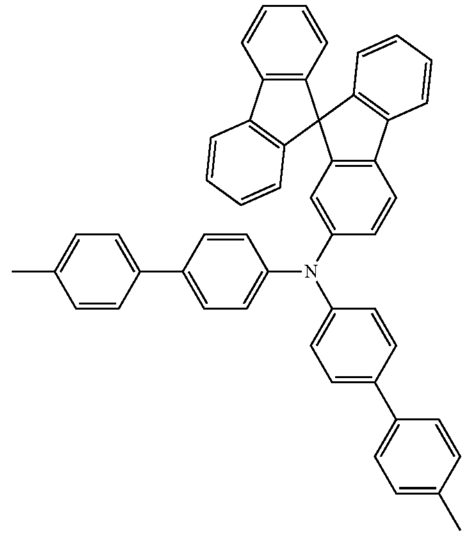
P4-39
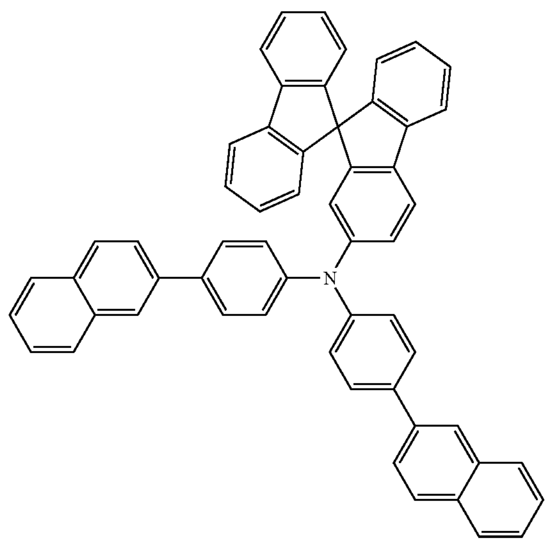
P4-40
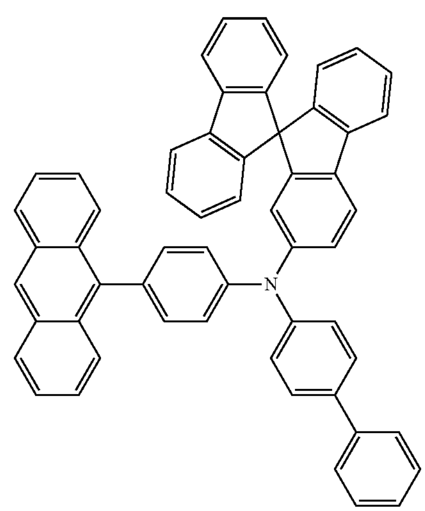

-continued
P4-41
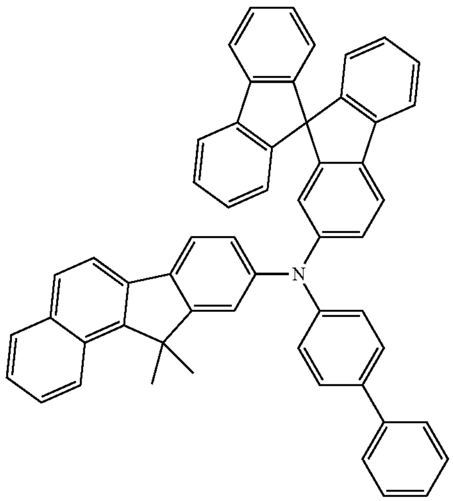
P4-42
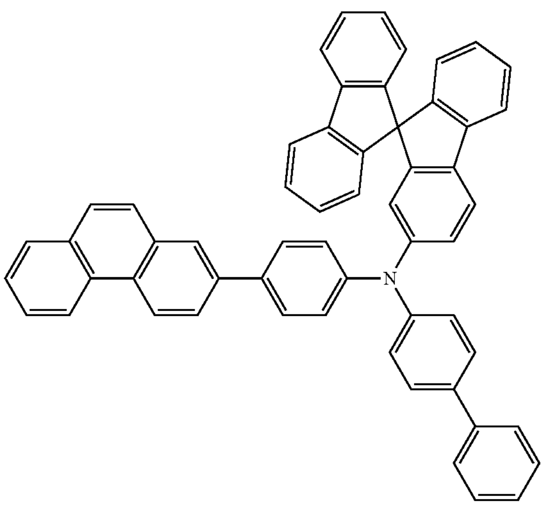
P4-43
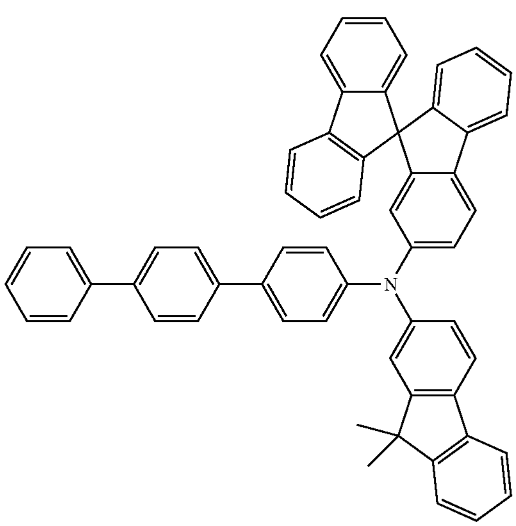
-continued
P4-44
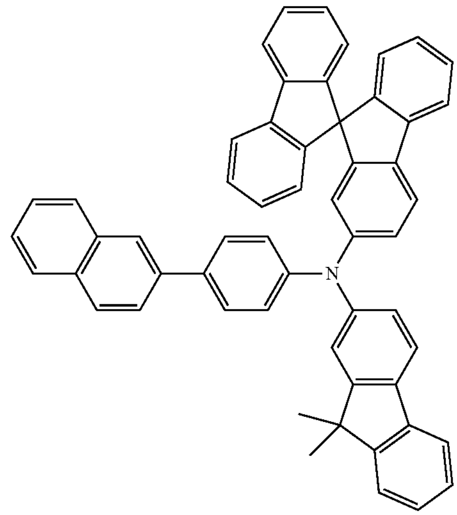
P4-45
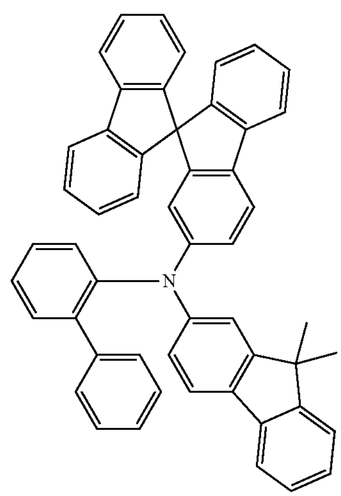
P4-46
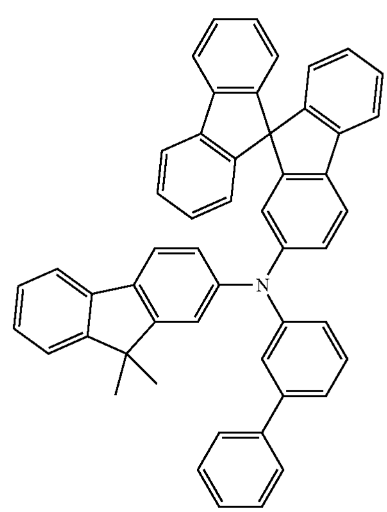

-continued
P4-47
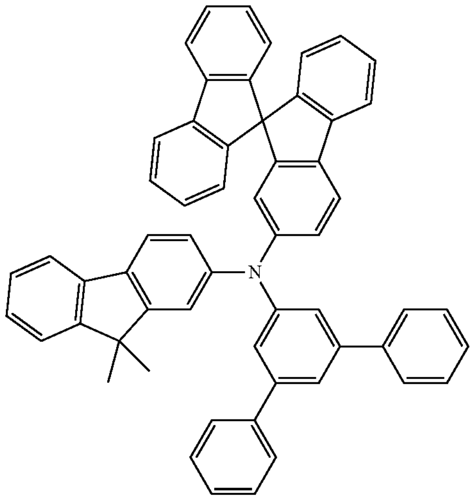
P4-48
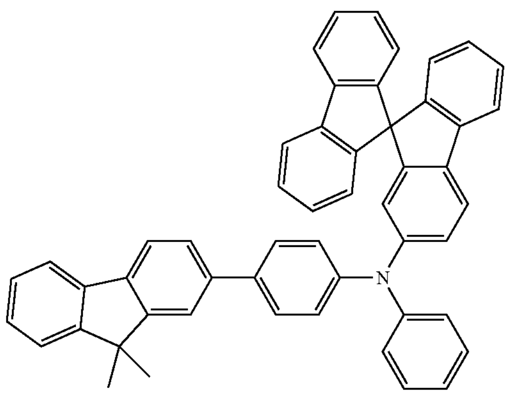
P4-49
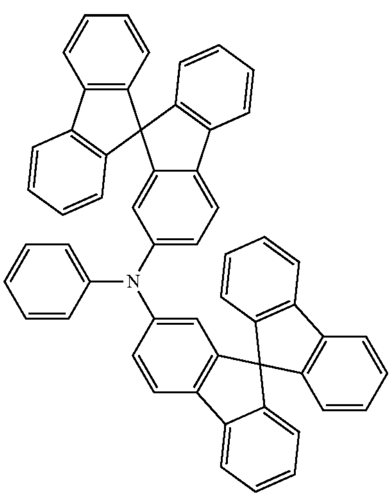
-continued
P4-50
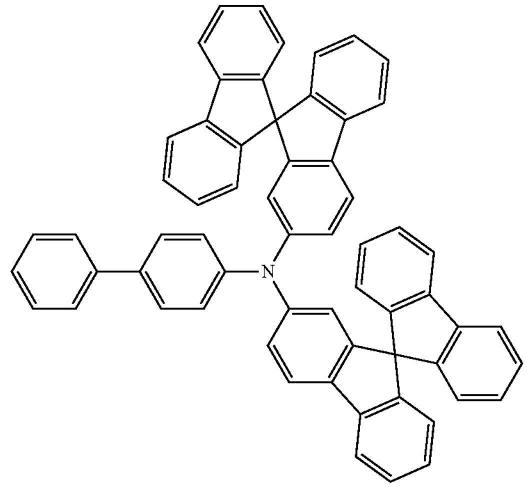
P4-51
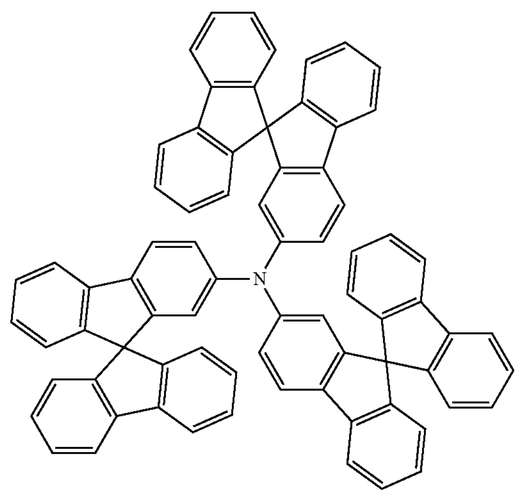
P4-52
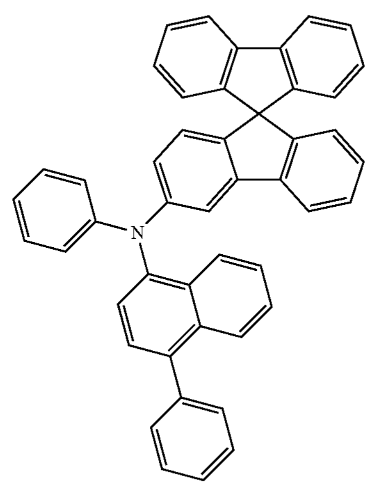

-continued
P4-53
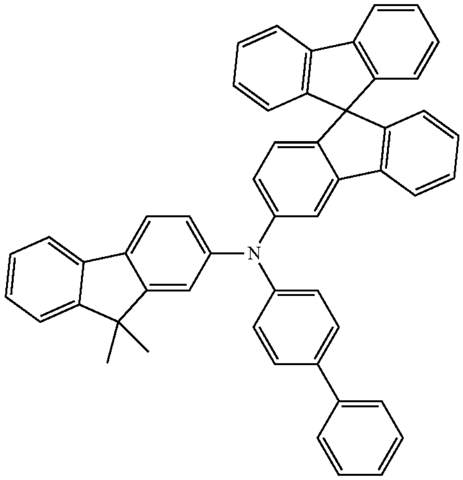
P4-54
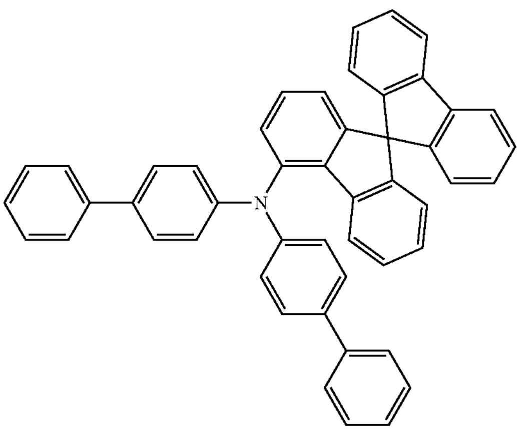
P4-55
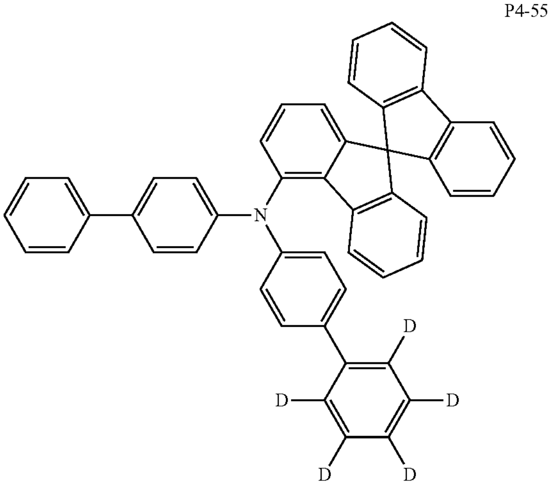
-continued
P4-56
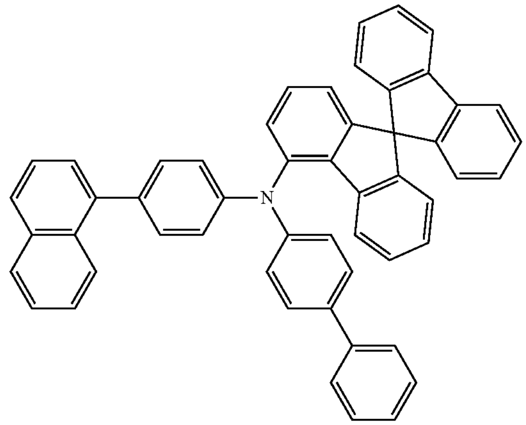
P4-57
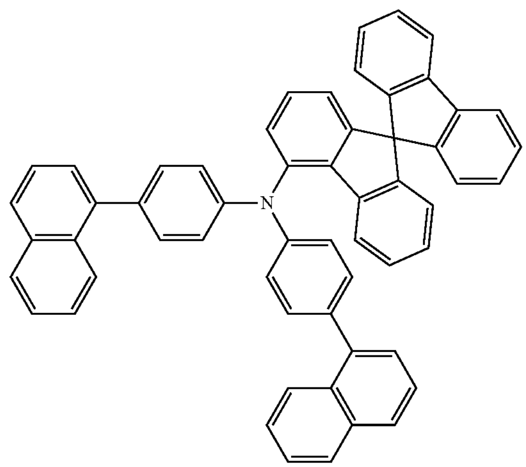
P4-58
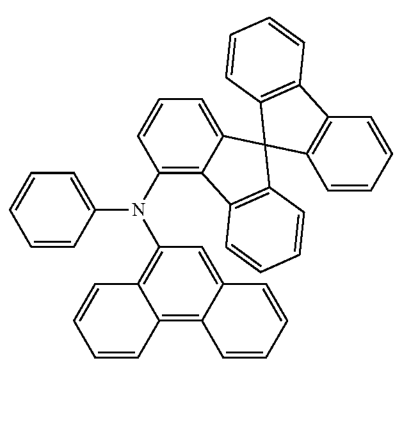

-continued
P4-59
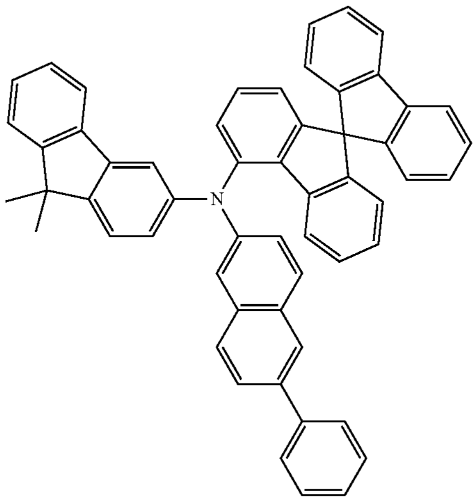
P4-60
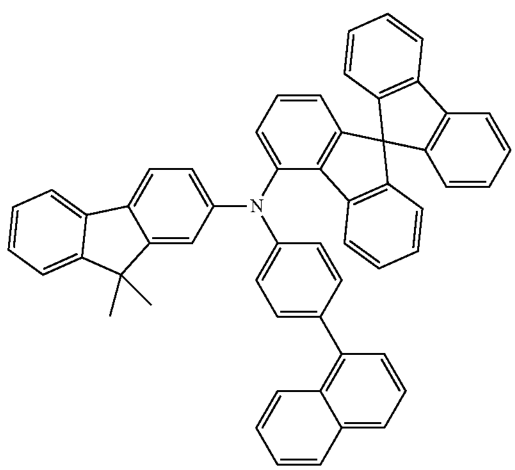
P4-61
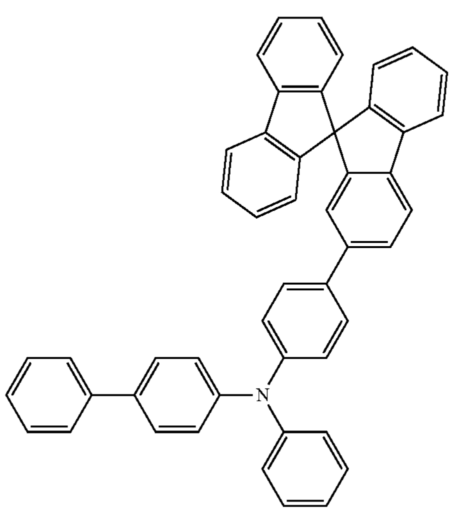
-continued
P4-62
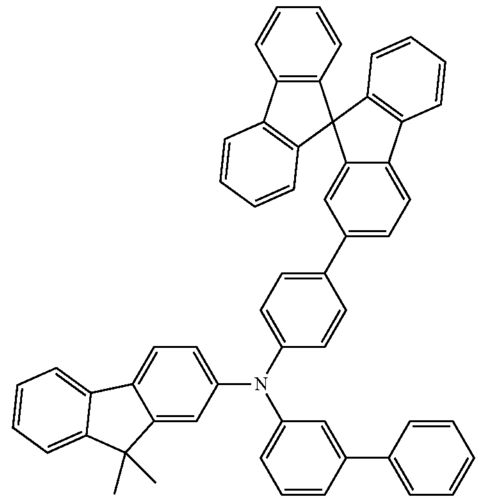
P4-63
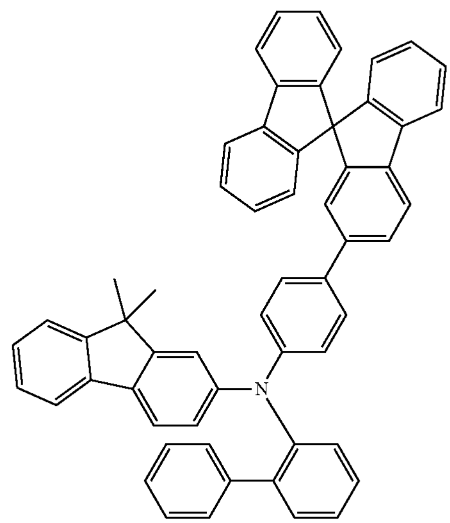
P4-64
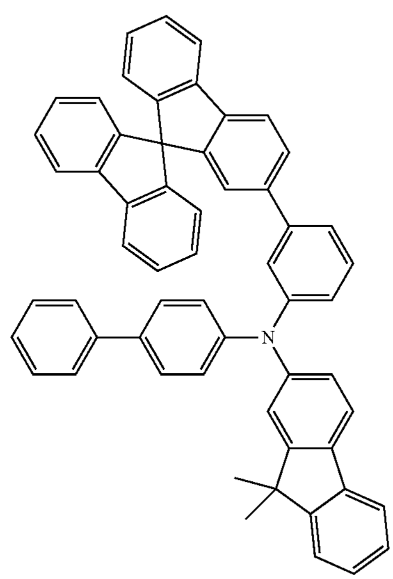

-continued
P4-65
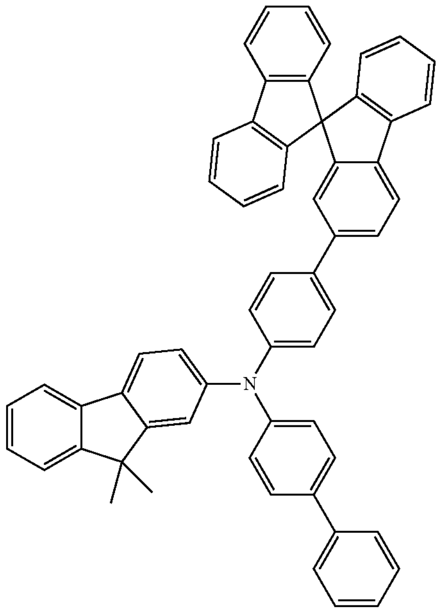
P4-66
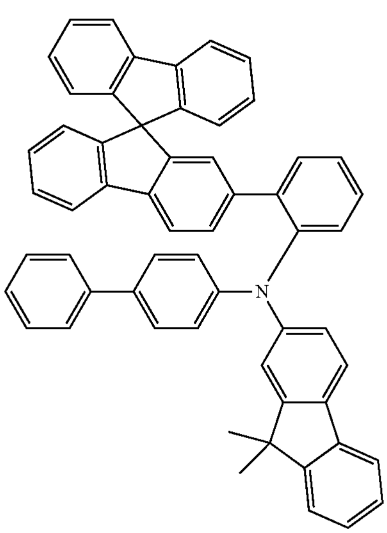
-continued
P4-67
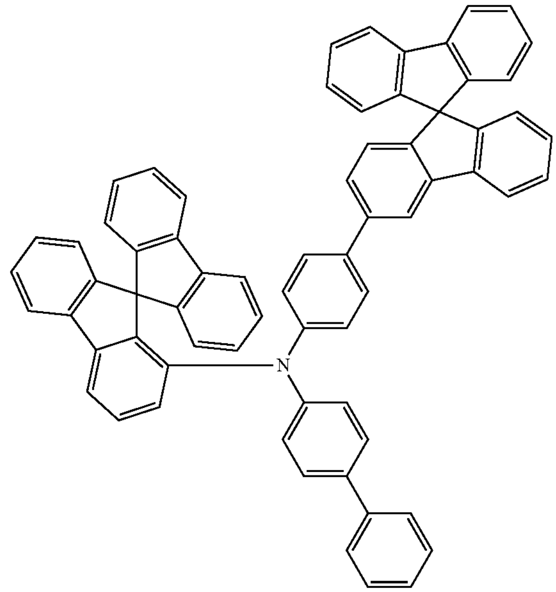
P4-68
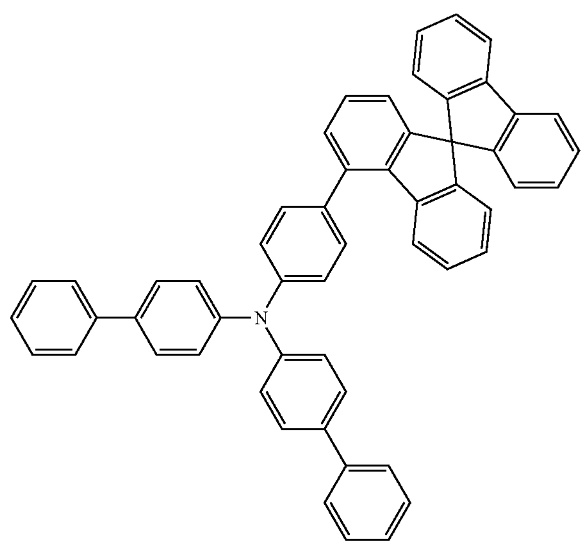

-continued
P4-69
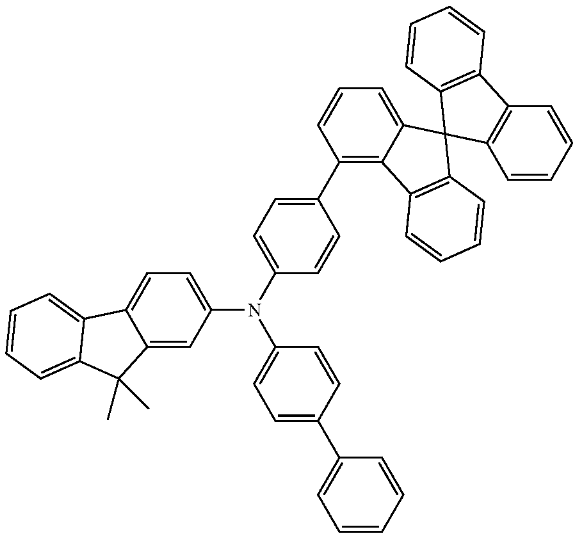
P4-70
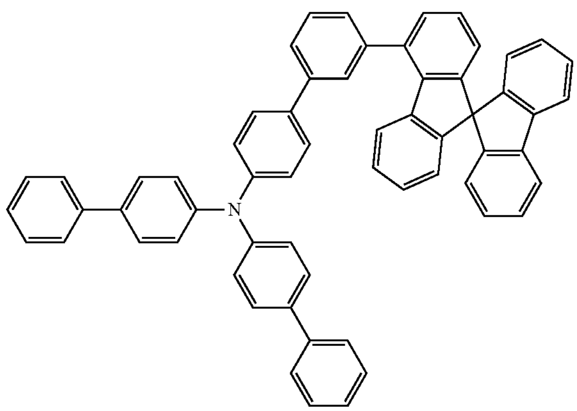
P5-1
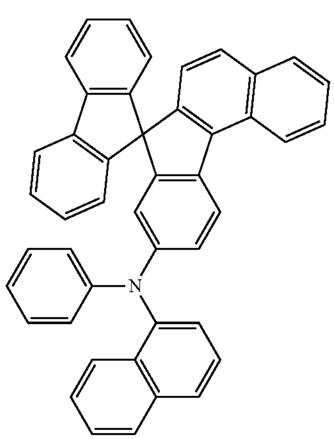
-continued
P5-2
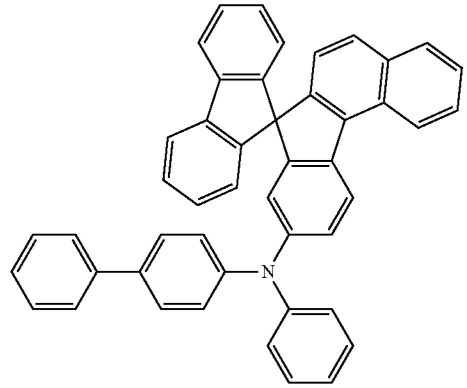
P5-3
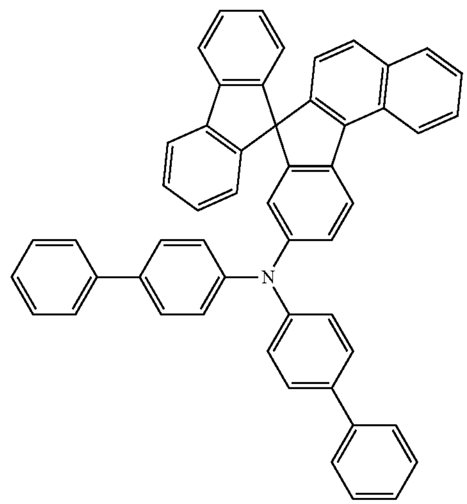
P5-4
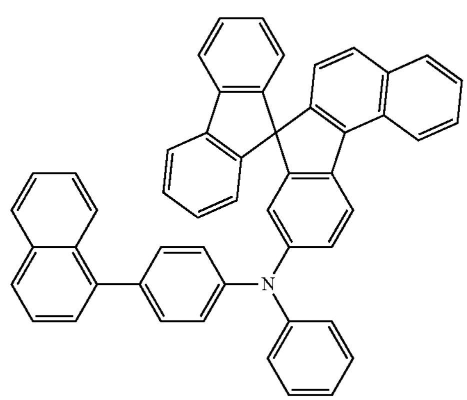

-continued
P5-5
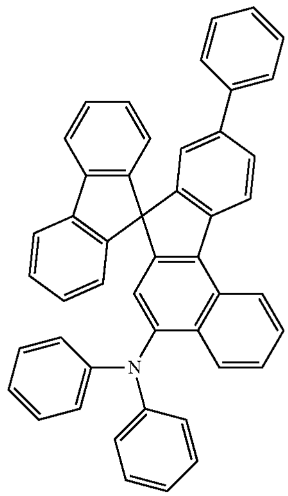
P5-6
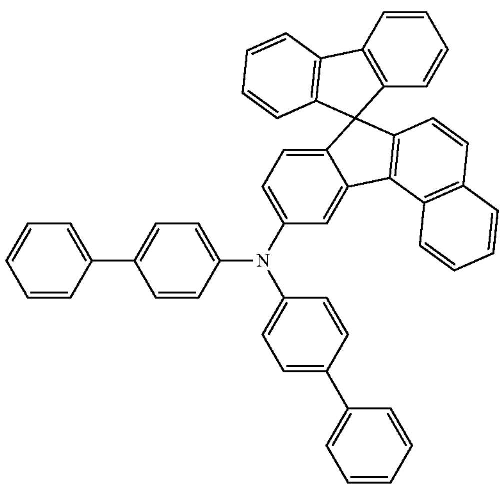
P5-7
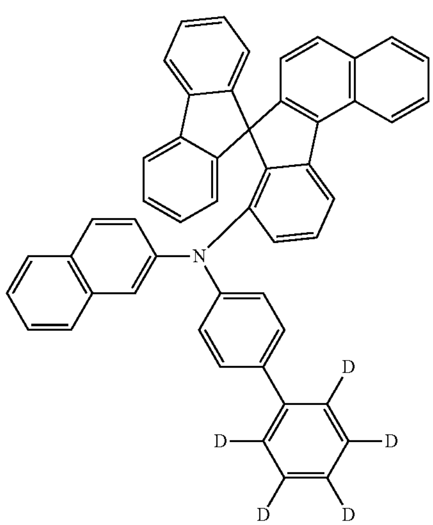
-continued
P5-8
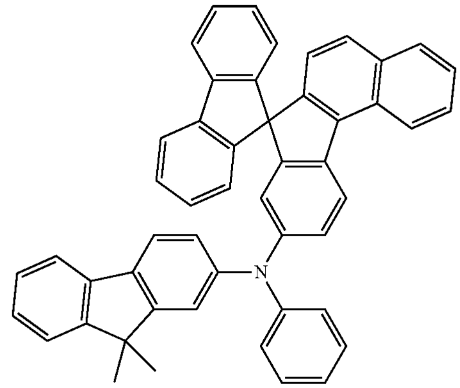
P5-9
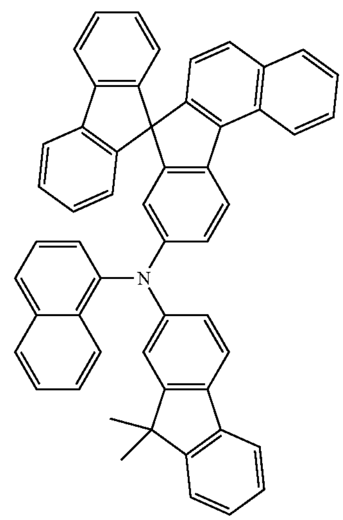
P5-10
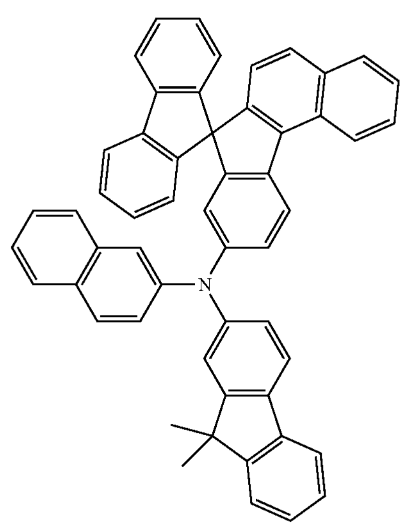

-continued
P5-11
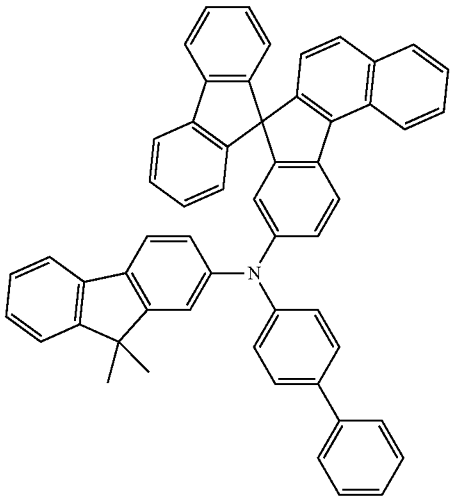
P5-12
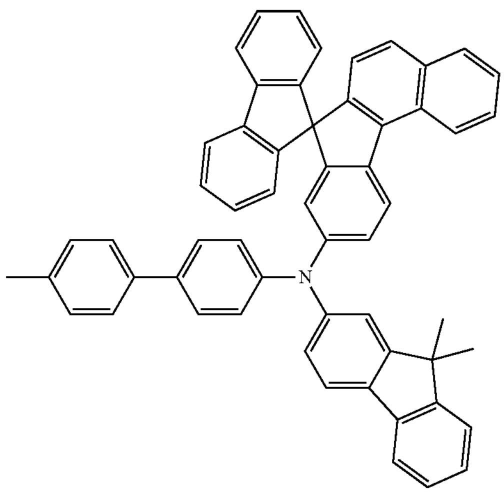
P5-13
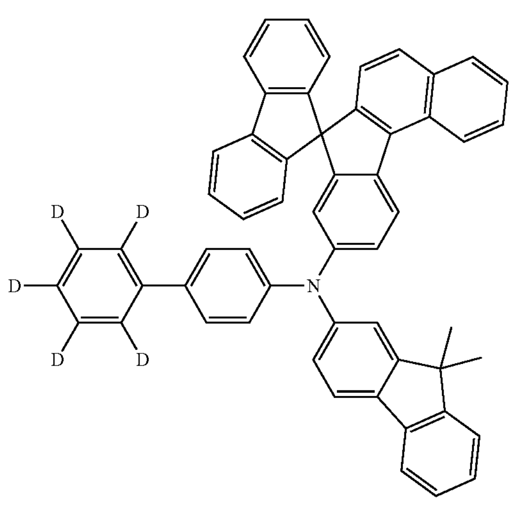
-continued
P5-14
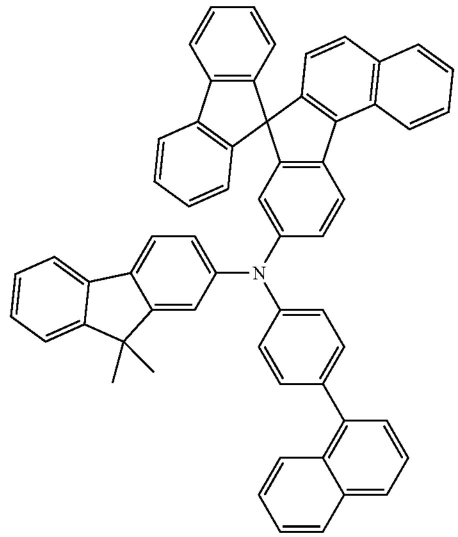
P5-15
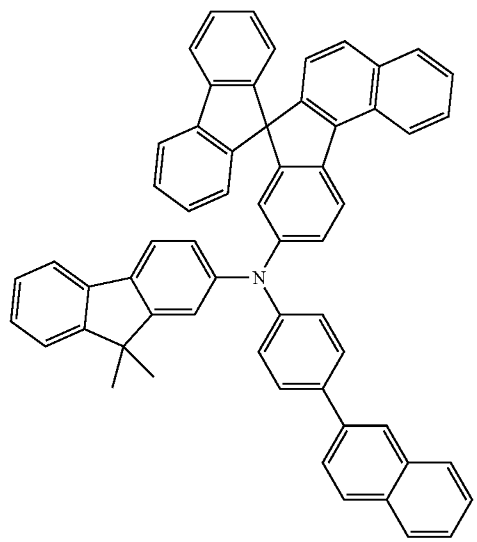
P5-16
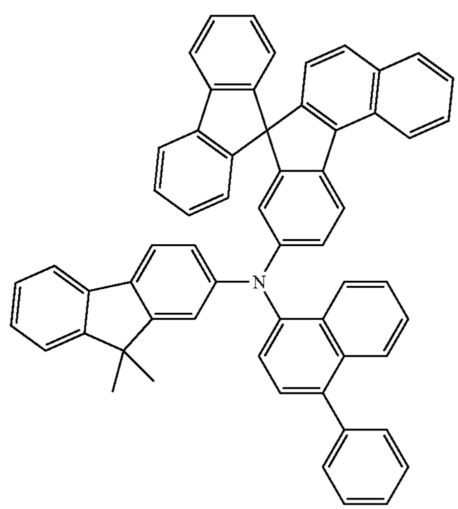

-continued
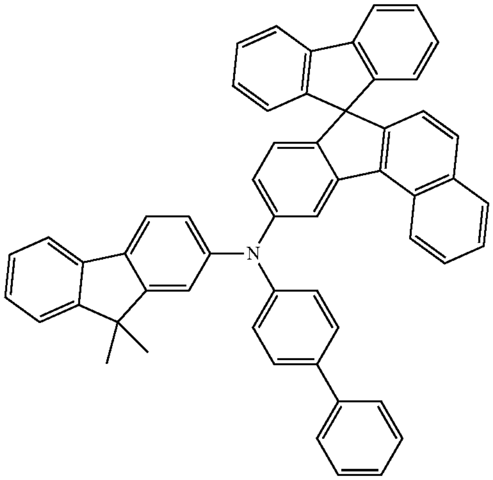
P5-17
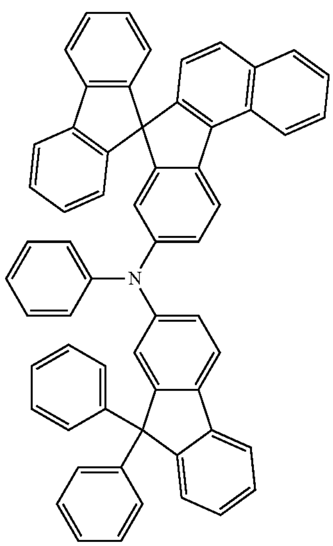
P5-18
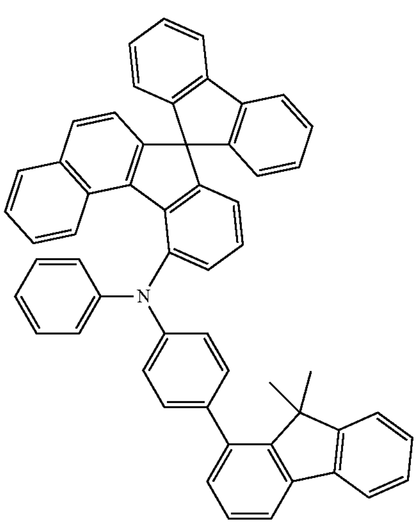
P5-19
-continued
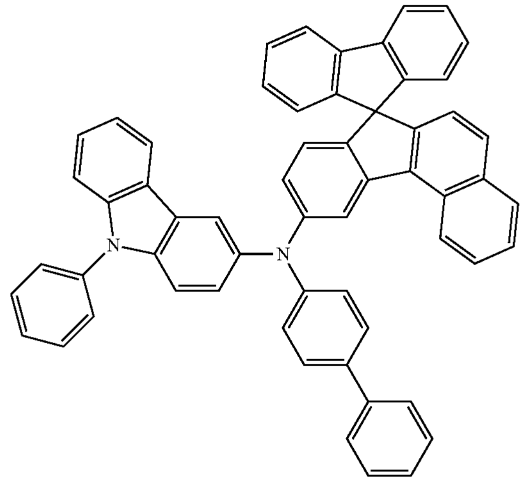
P5-20
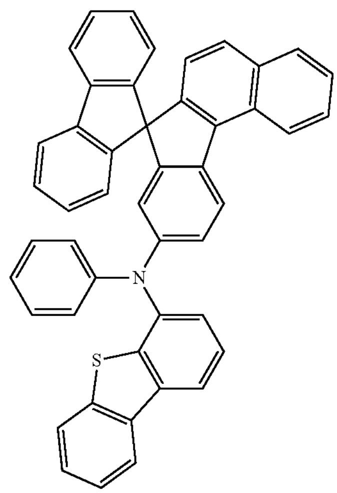
P5-21
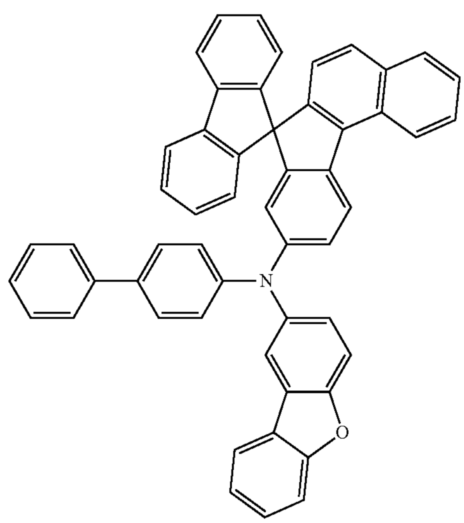
P5-22

-continued
P5-23
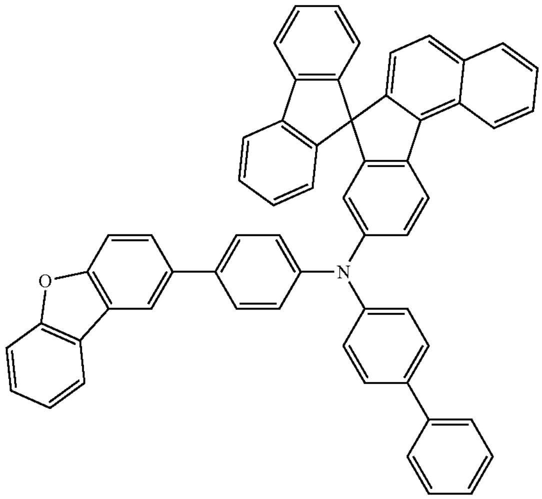
P5-24
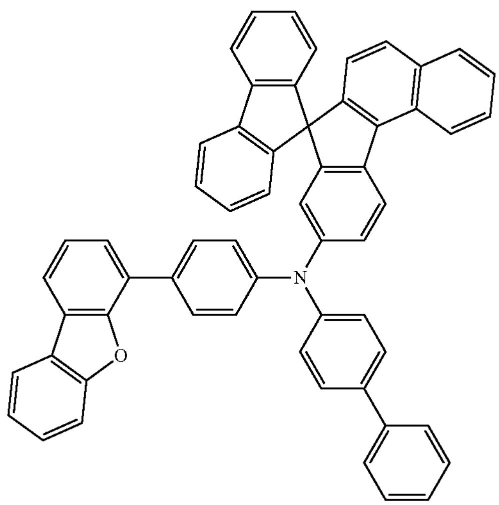
P5-25
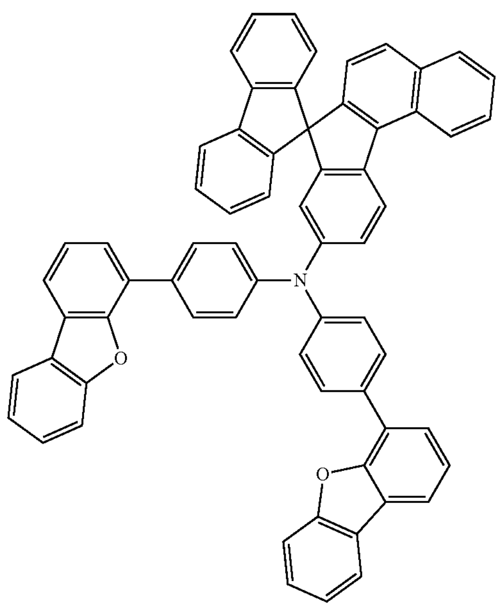
-continued
P5-26
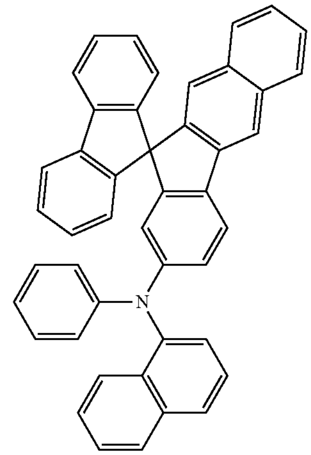
P5-27
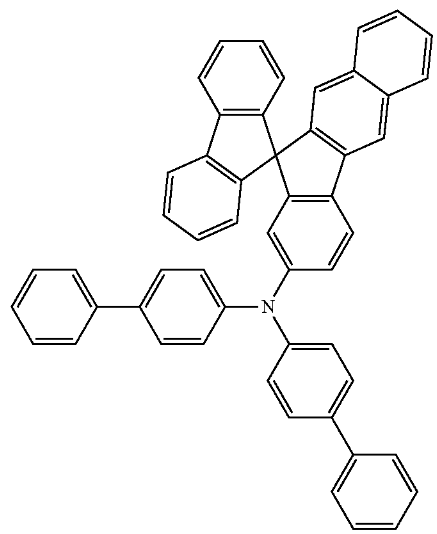
P5-28
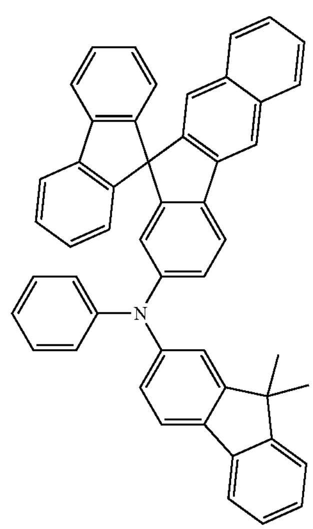

-continued
P5-29
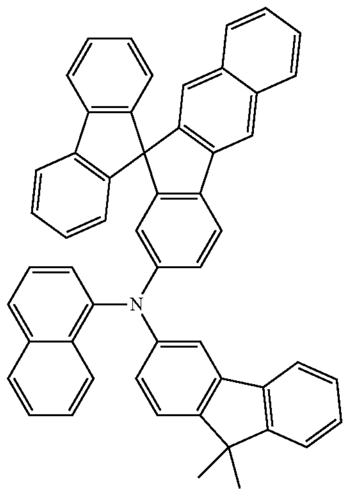
P5-30
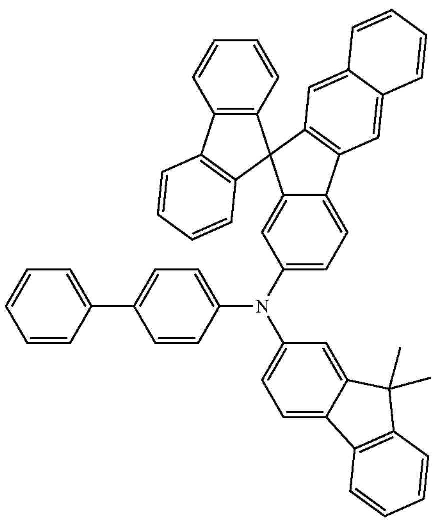
P5-31
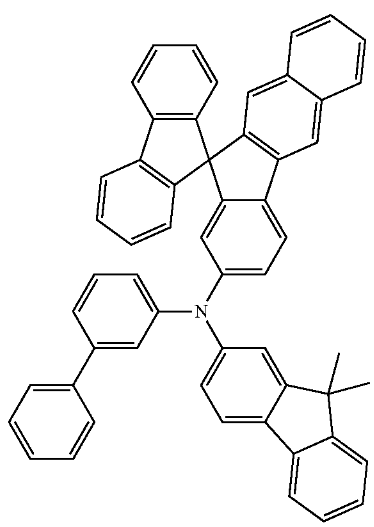
-continued
P5-32
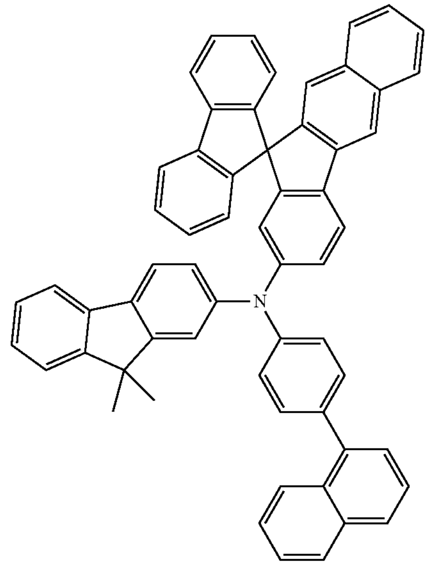
P5-33
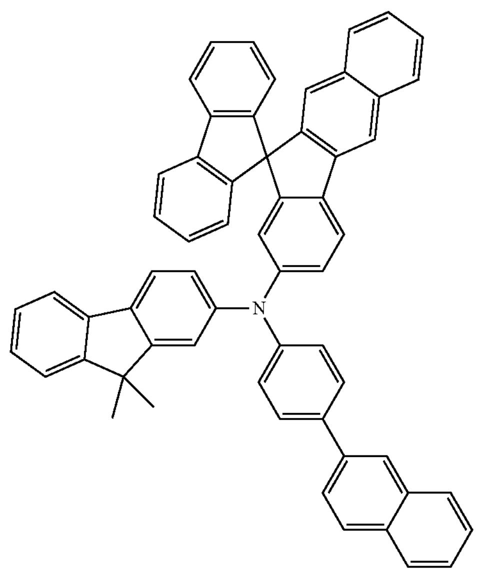
P5-34
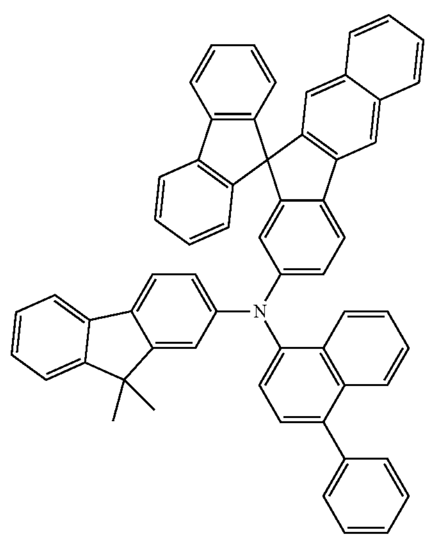

-continued
P5-35
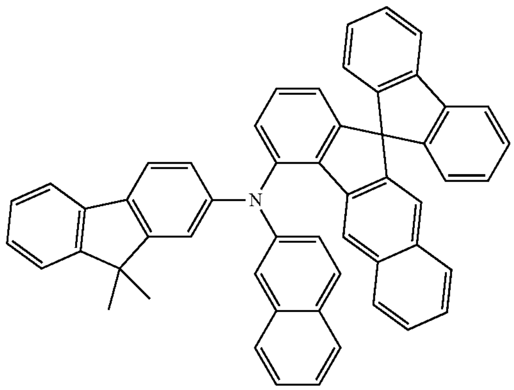
P5-36
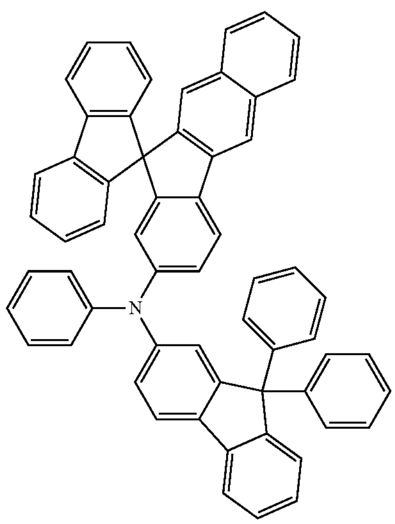
P5-37
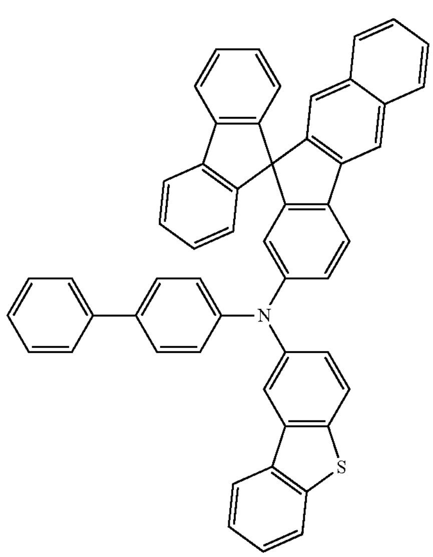
-continued
P5-38
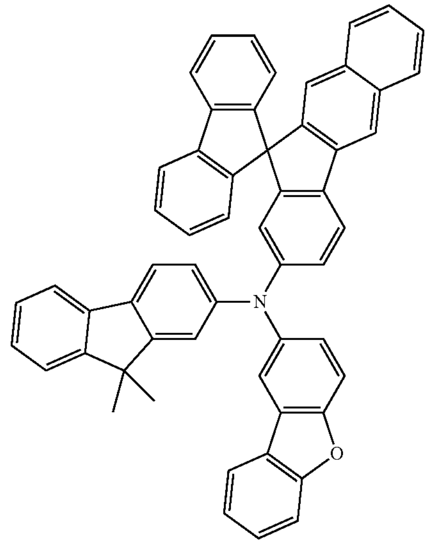
P5-39
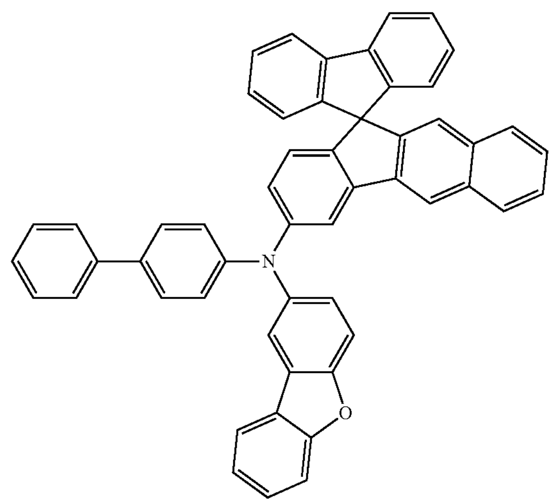
P5-40
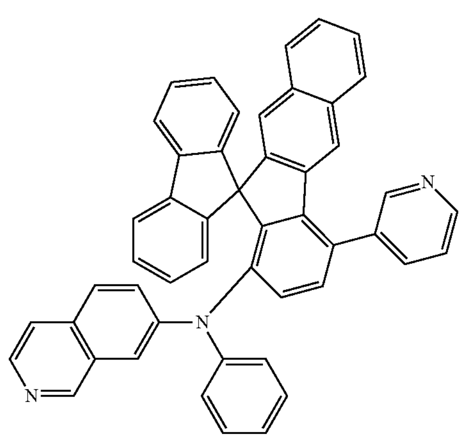

-continued
P5-41
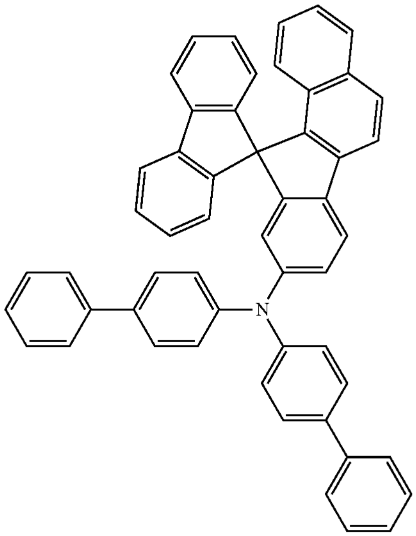
P5-42
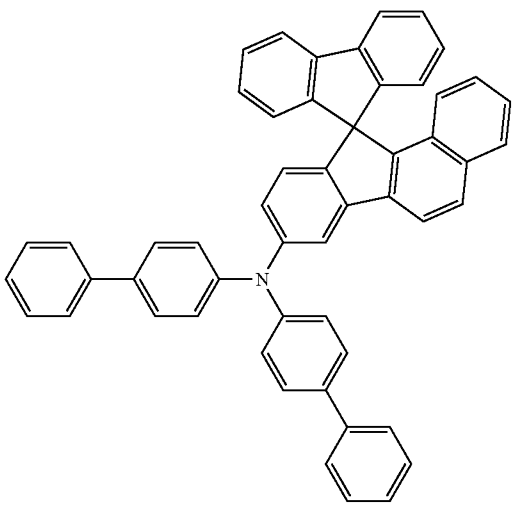
P5-43
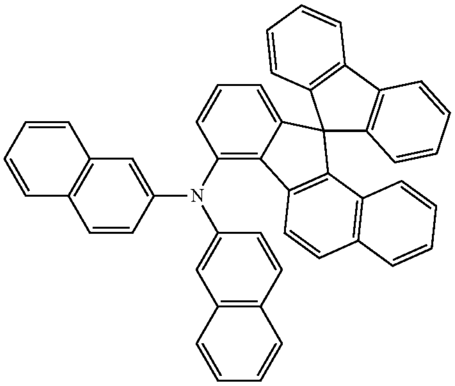
-continued
P5-44
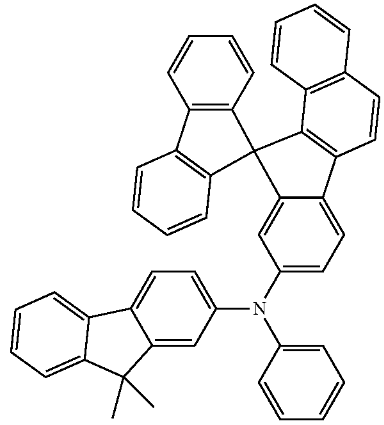
P5-45
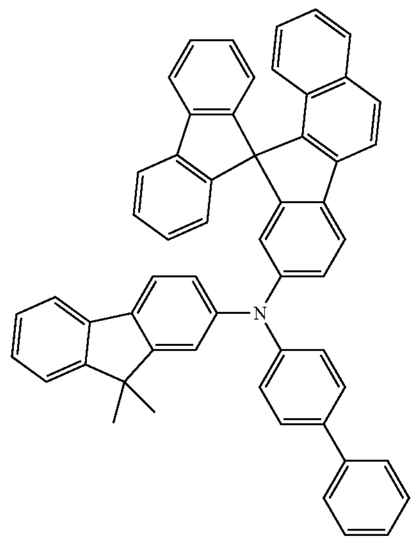
P5-46
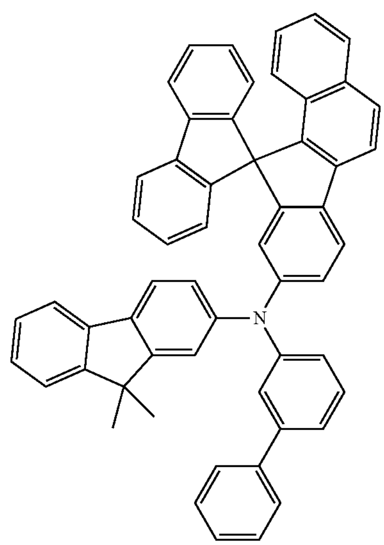

-continued
P5-47
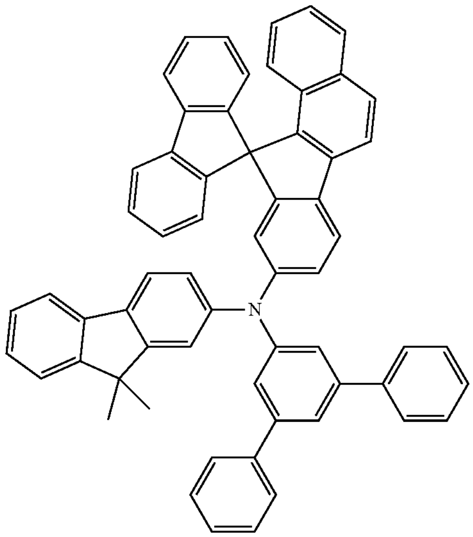
P5-48
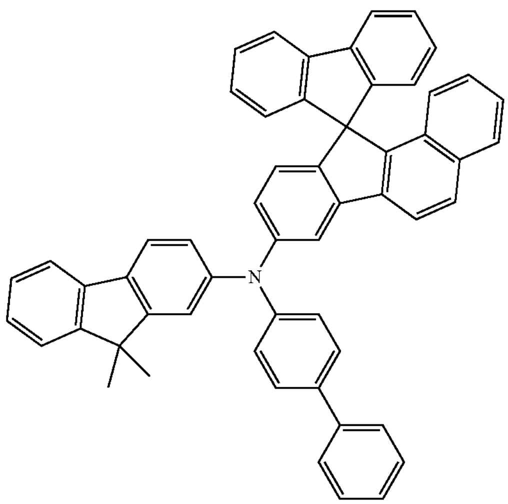
P5-49
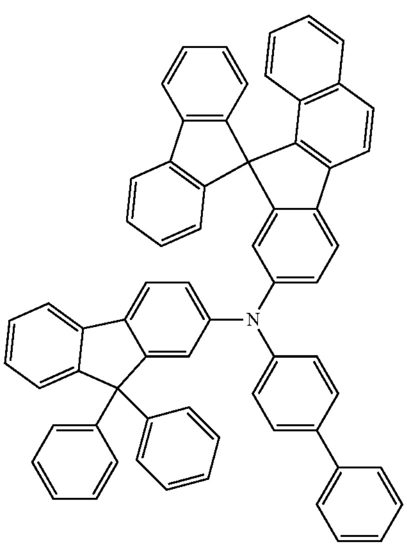
-continued
P5-50
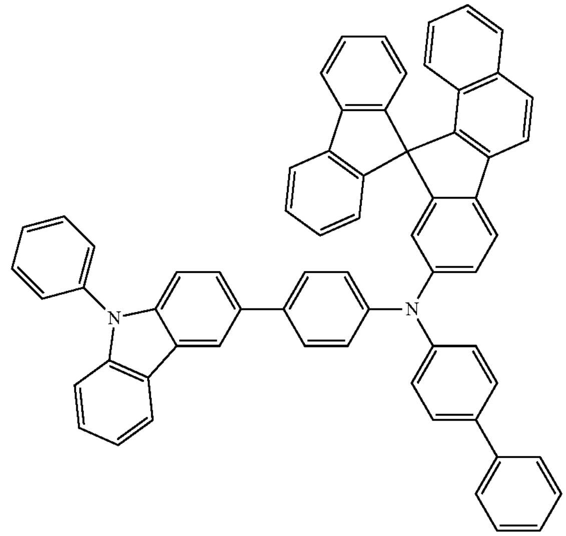
P5-51
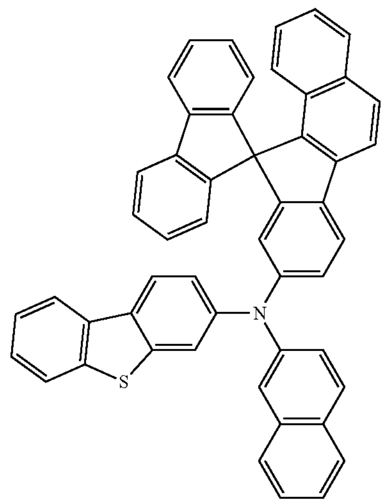
P5-52
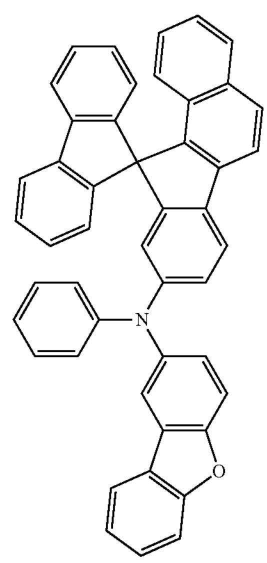

-continued
P5-53
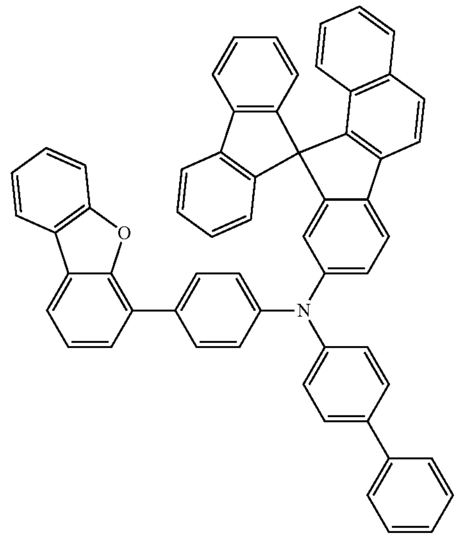
P5-54
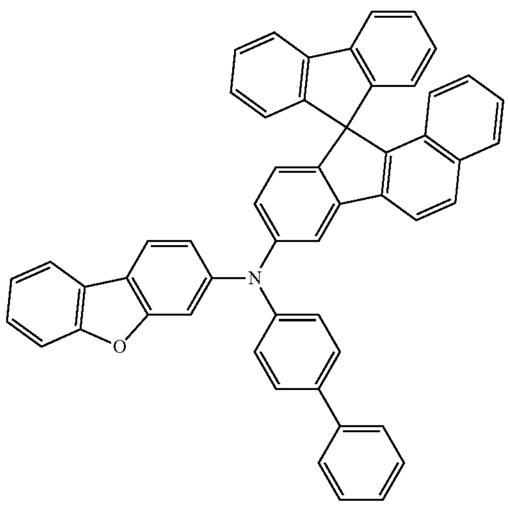
P5-55
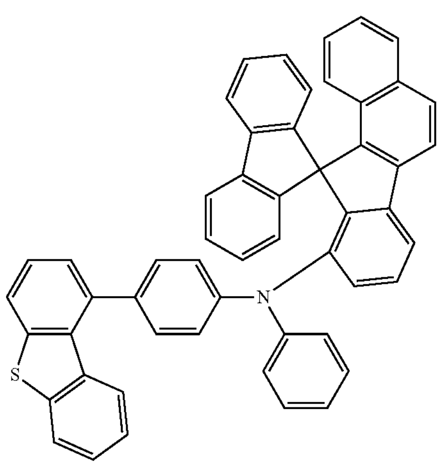
-continued
P5-56
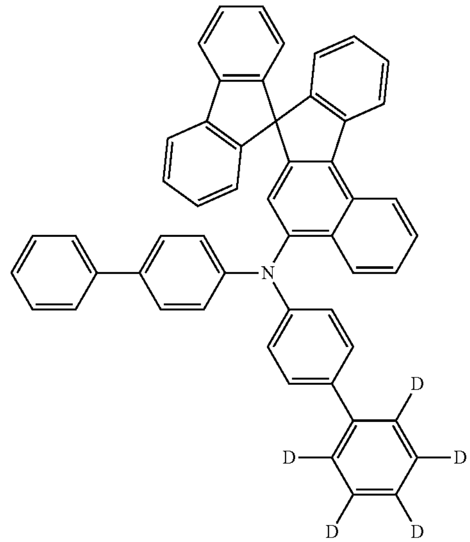
P5-57
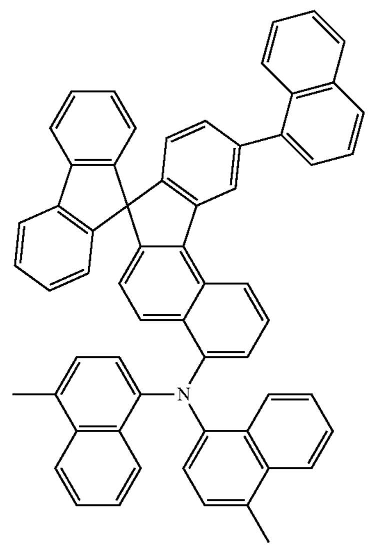
P5-58
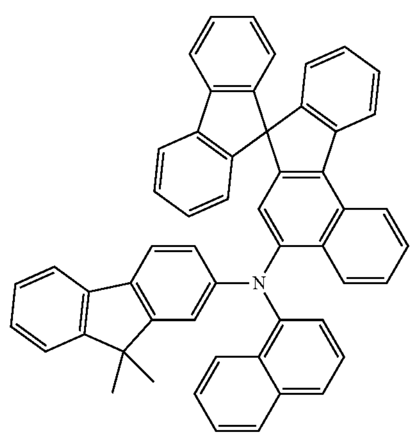

-continued
P5-59
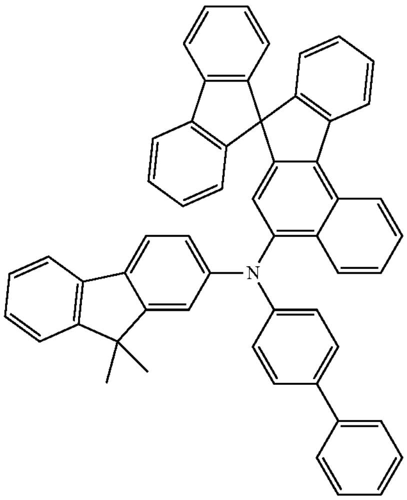
P5-60
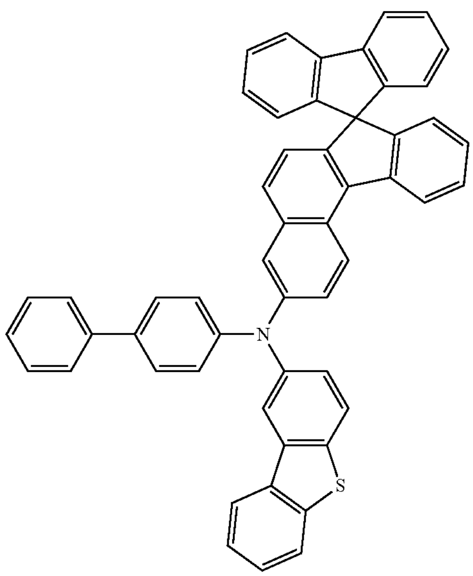
P5-61
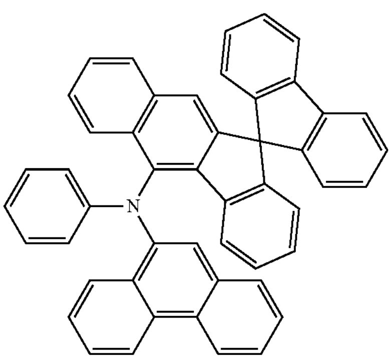
-continued
P5-62
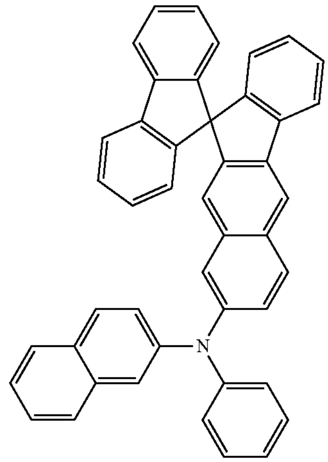
P5-63
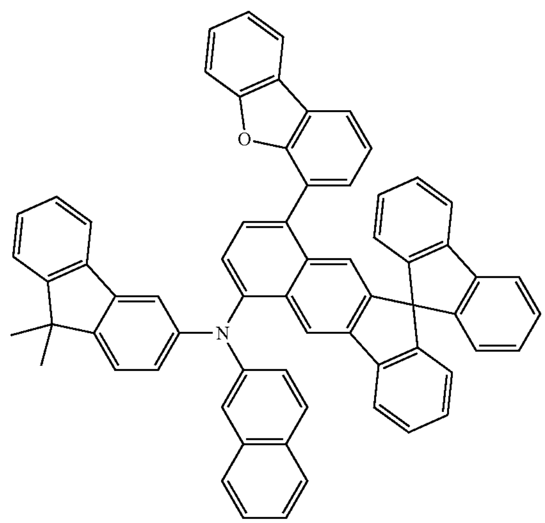
P5-64
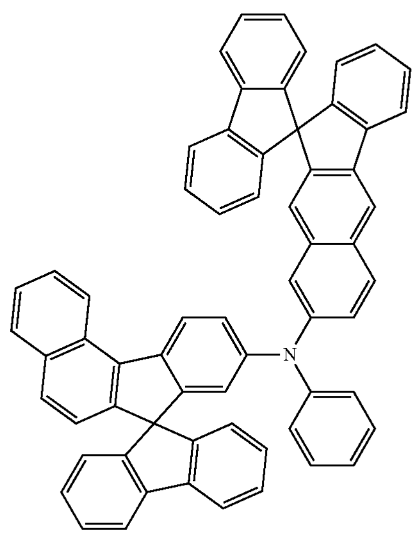

-continued
P5-65
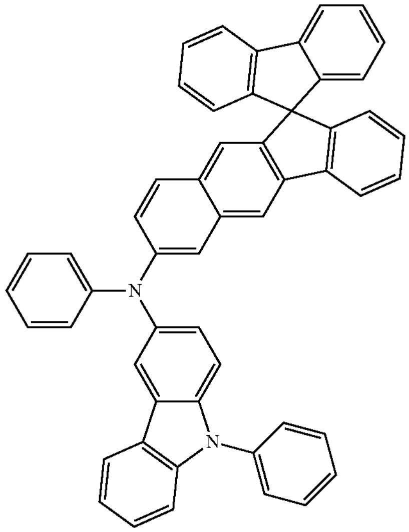
P5-66
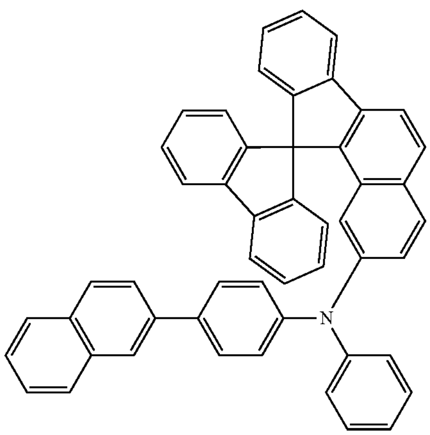
P5-67
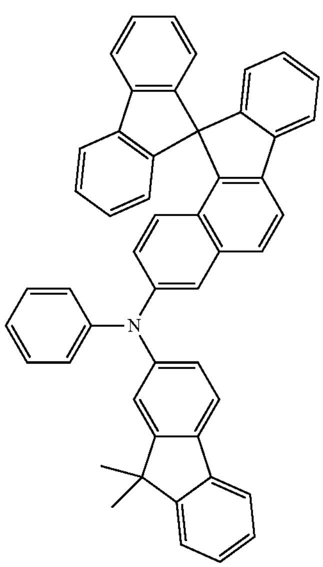
-continued
P5-68
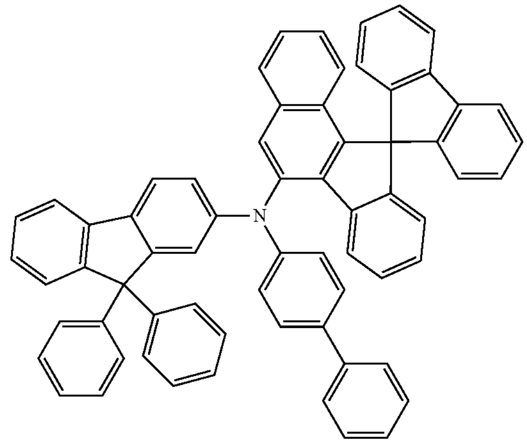
P5-69
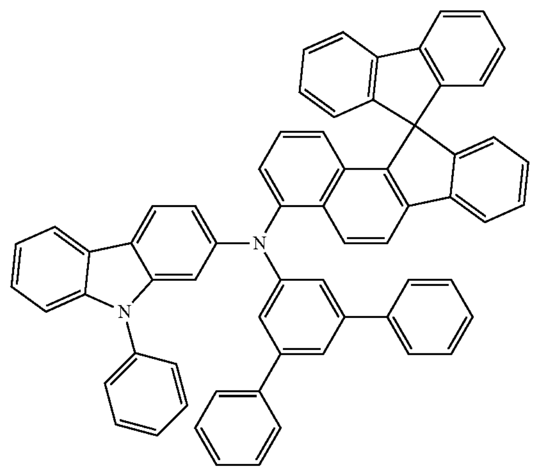
P5-70
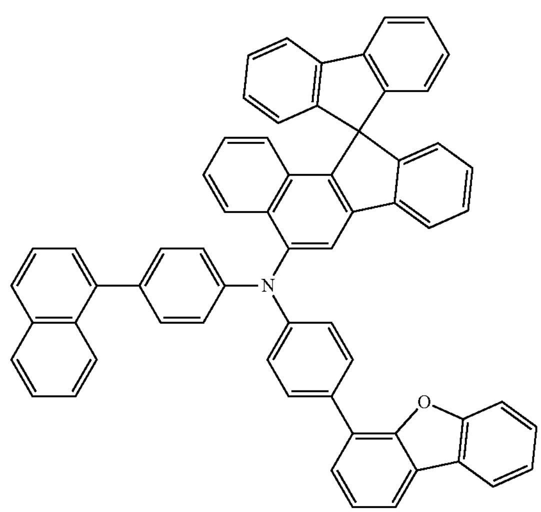

-continued
P5-71
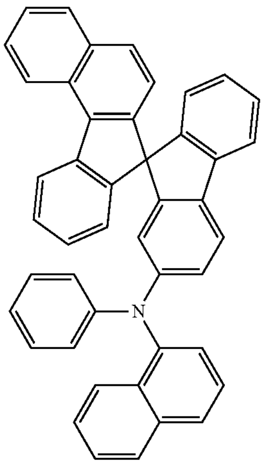
P5-72
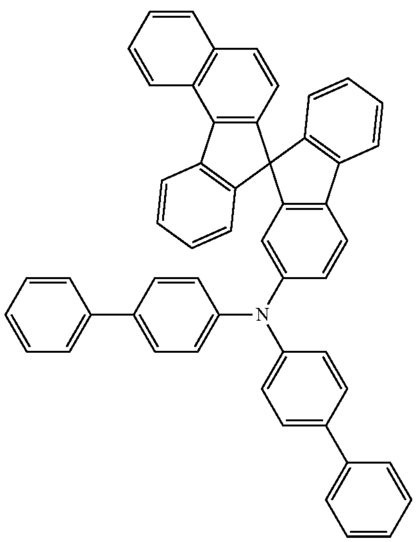
P5-73
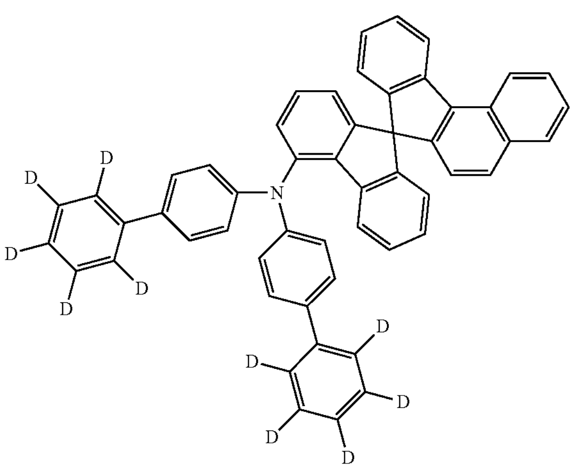
-continued
P5-74
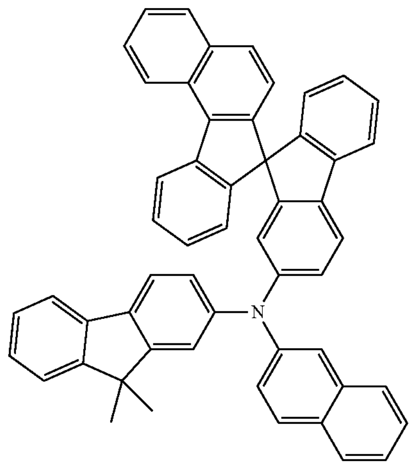
P5-75
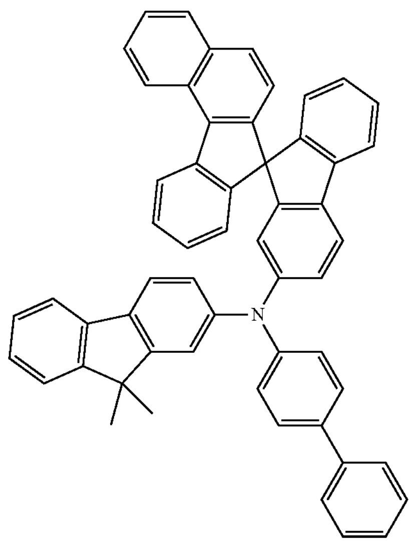
P5-76
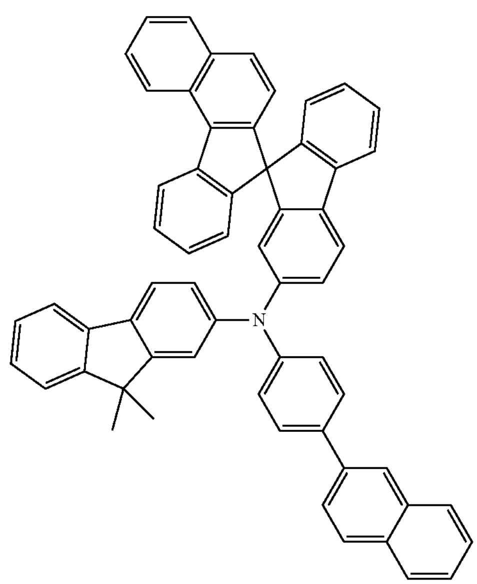

-continued
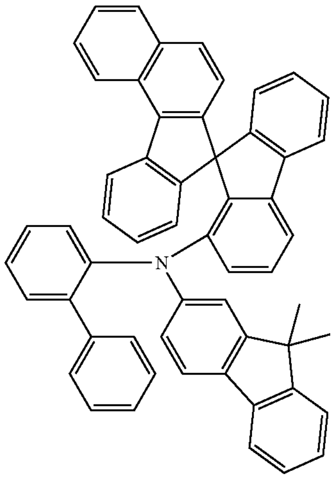
P5-77
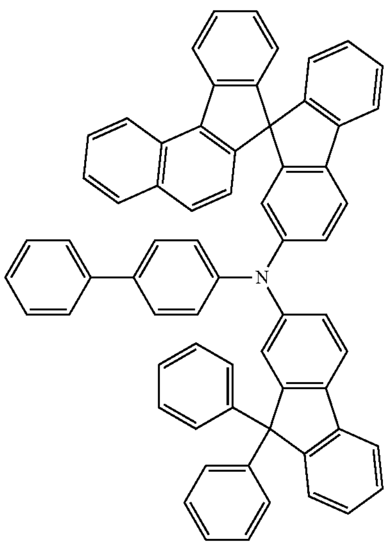
P5-78
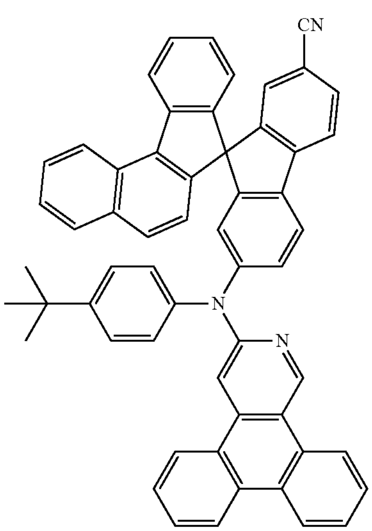
P5-79
-continued
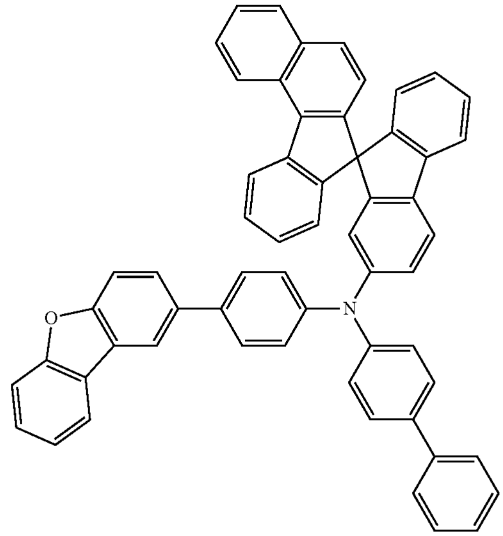
P5-80
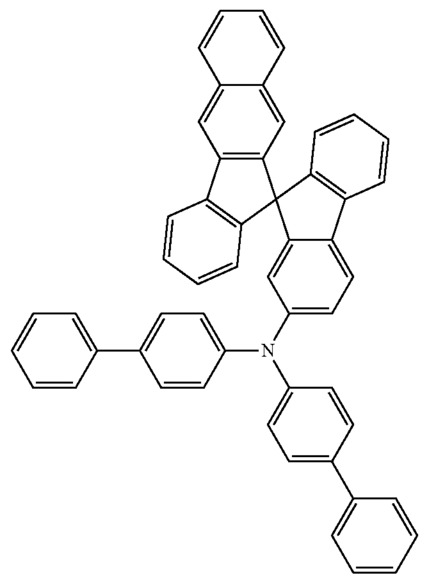
P5-81
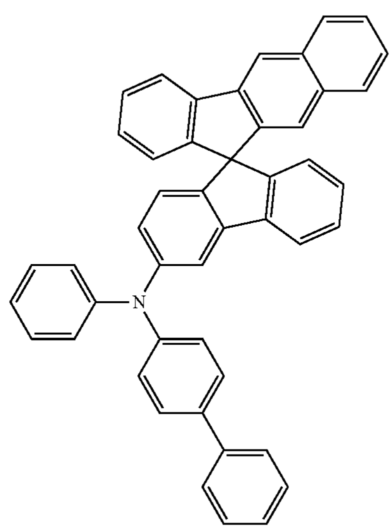
P5-82

-continued
P5-83
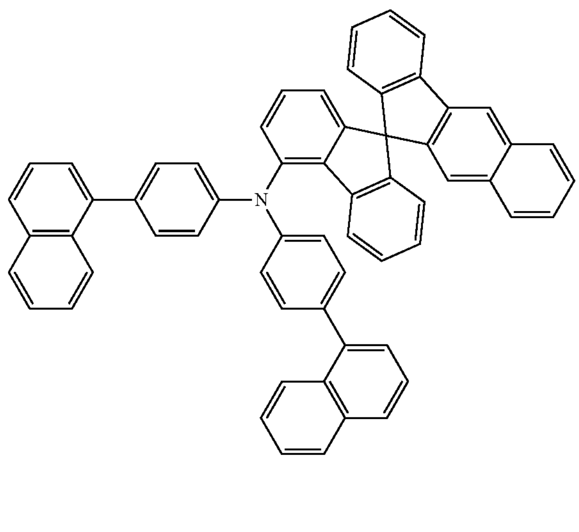
P5-84
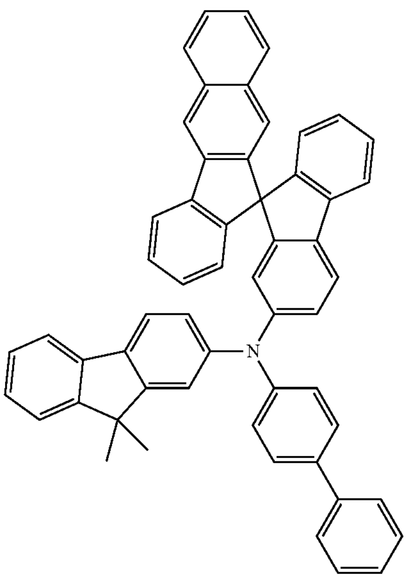
P5-85
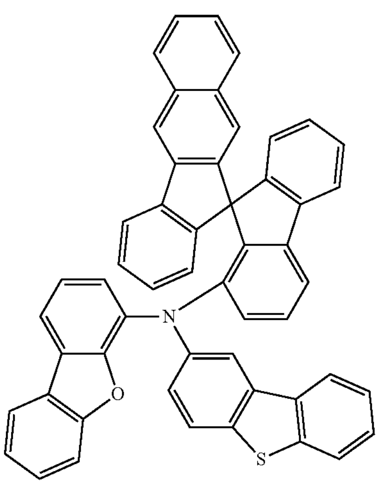
-continued
P5-86
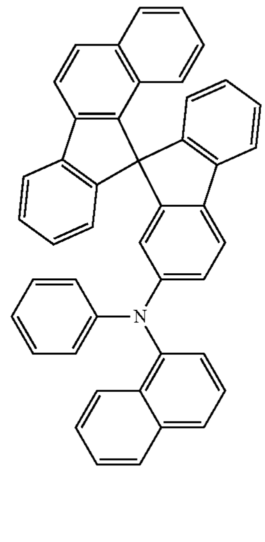
P5-87
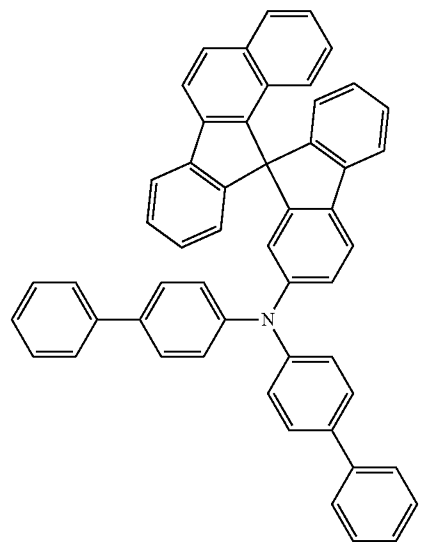
P5-88
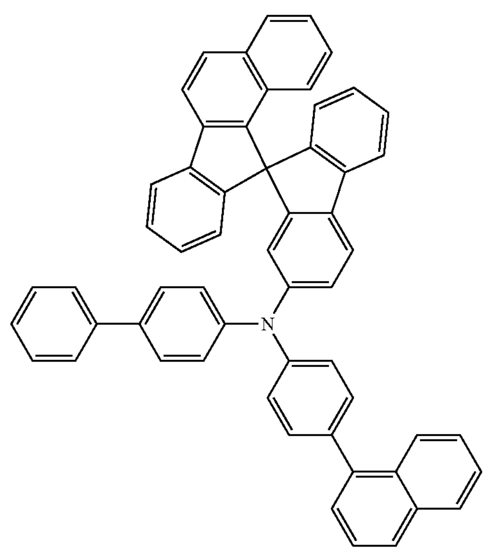

-continued
P5-89
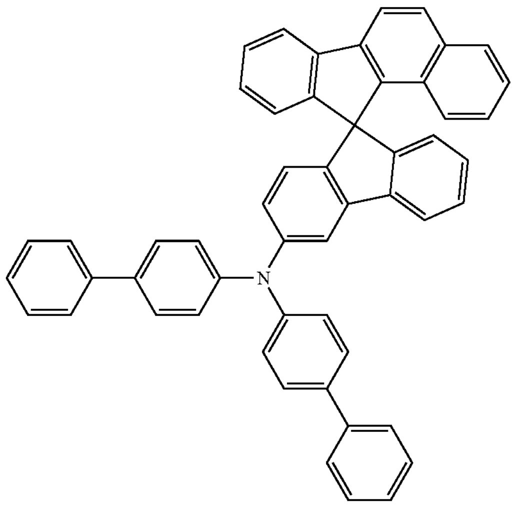
P5-90
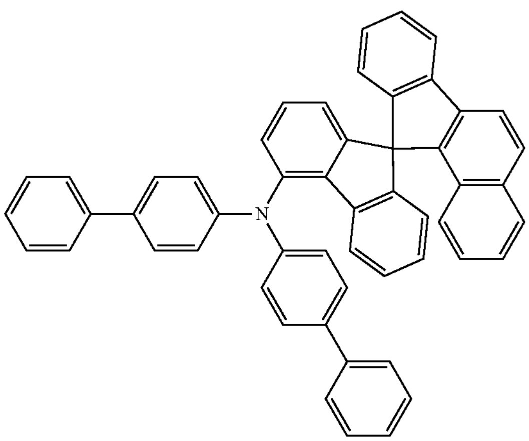
P5-91
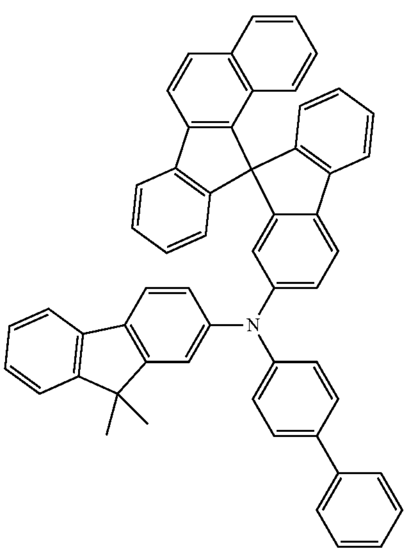
-continued
P5-92
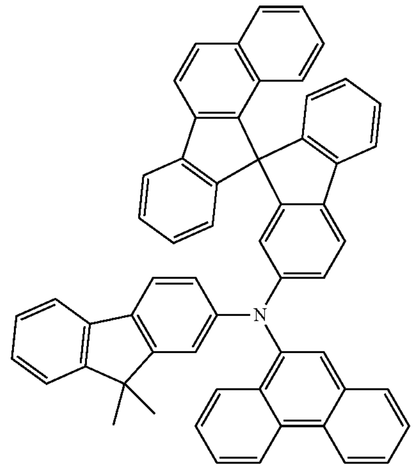
P5-93
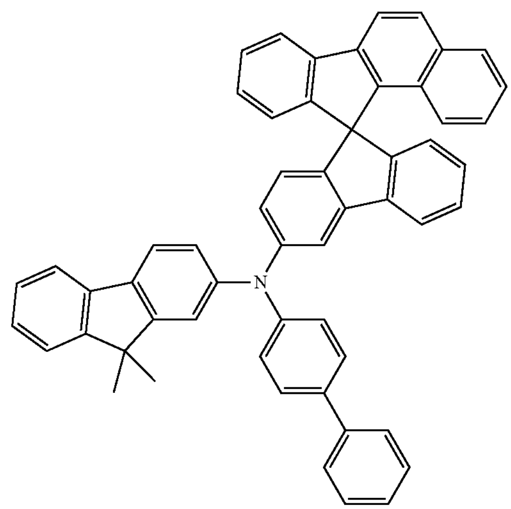
P5-94
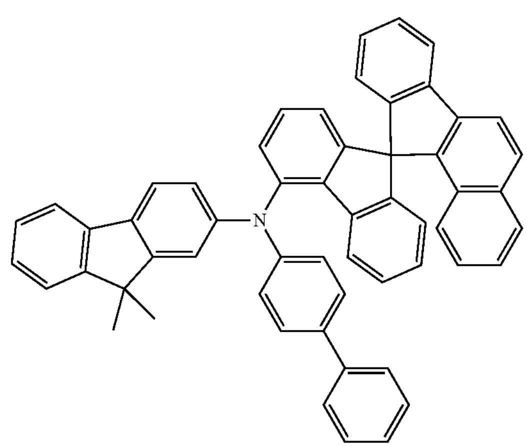

-continued
P5-95
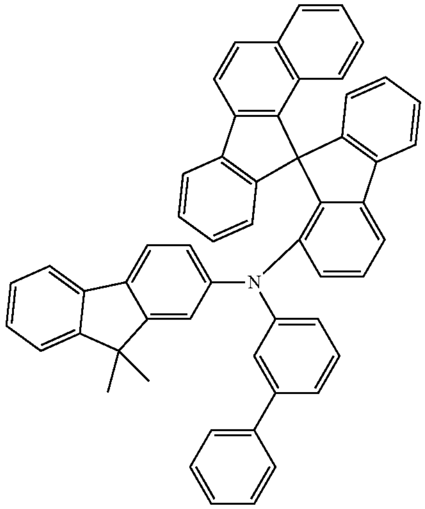
P5-96
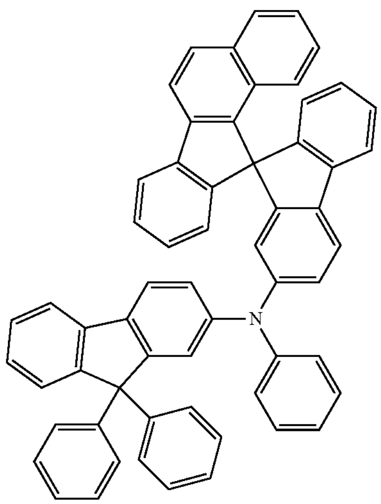
P5-97
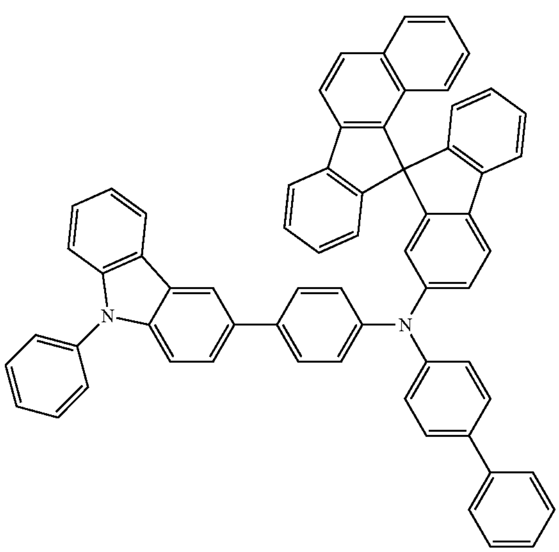
-continued
P5-98
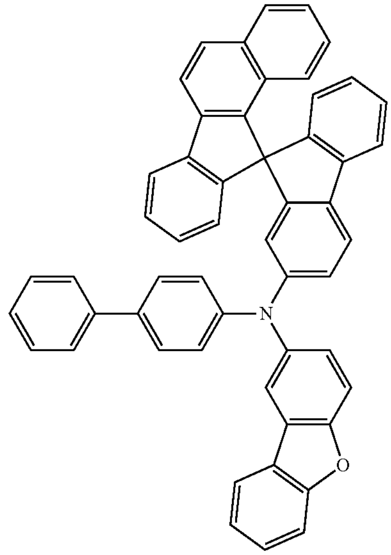
P5-99
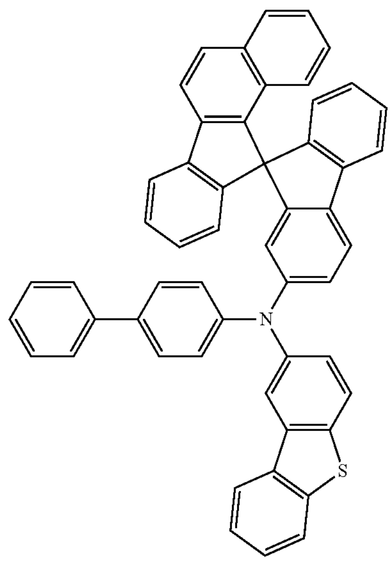
P5-100
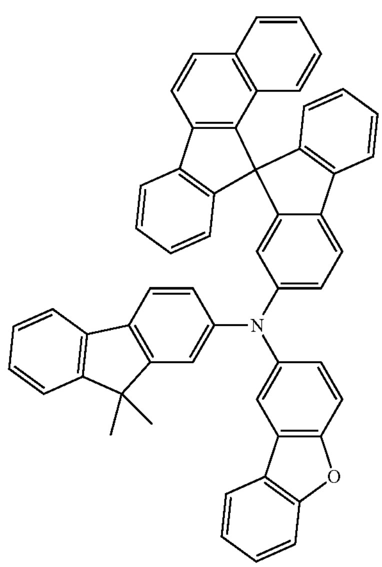

P5-101
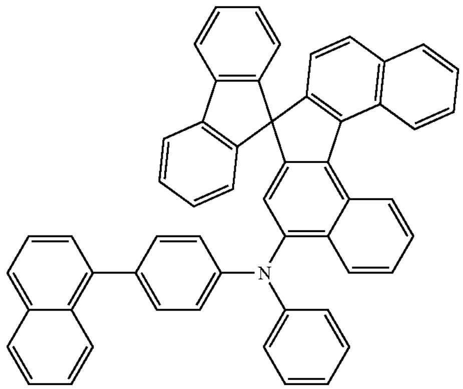
P5-102
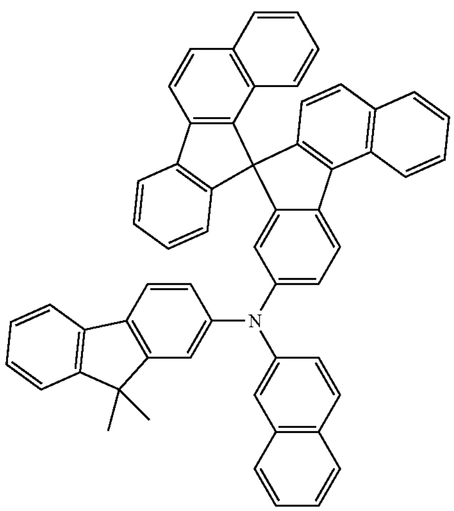
P5-103
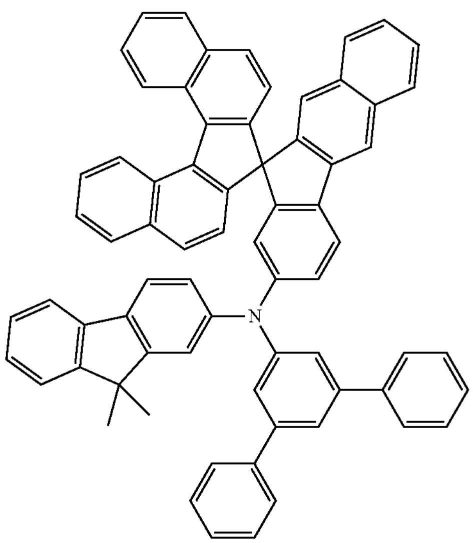
P5-104
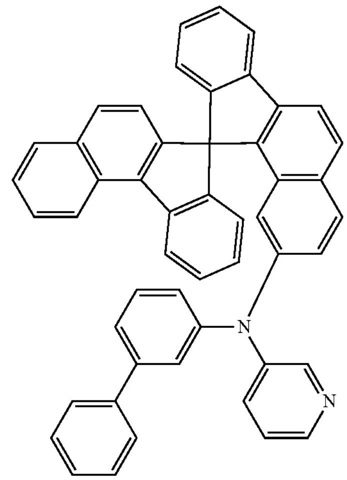
P5-105
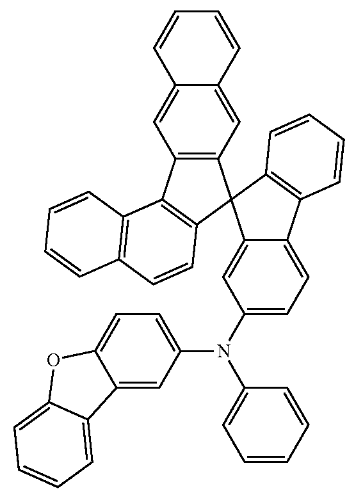
P5-106
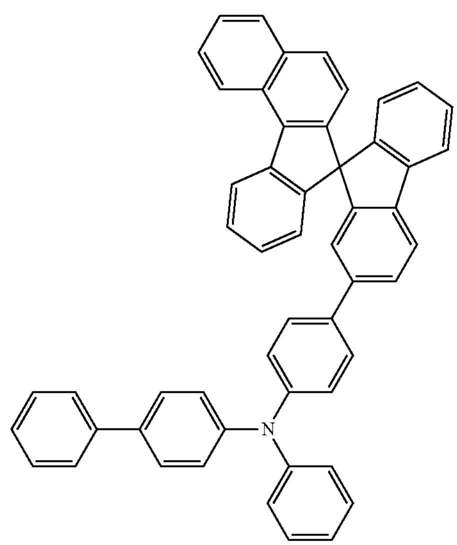

-continued
P5-107
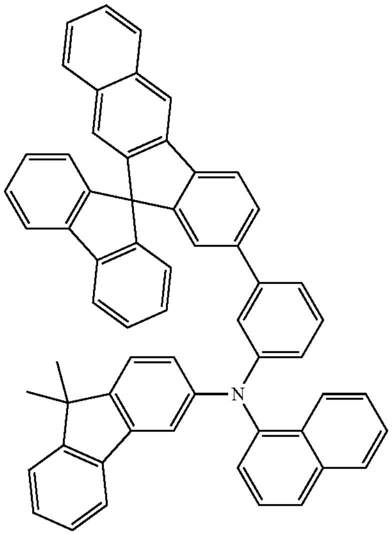
P5-108
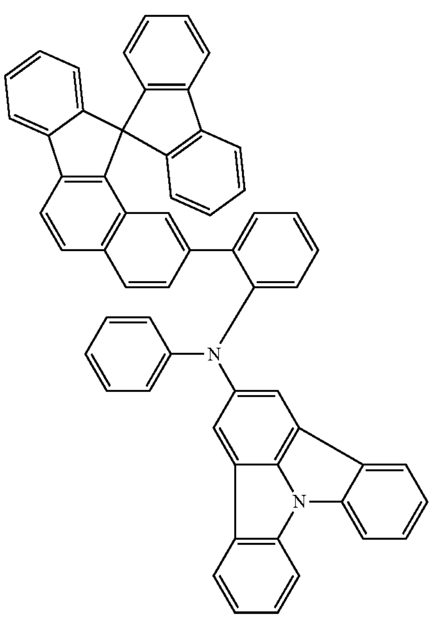
-continued
P5-109
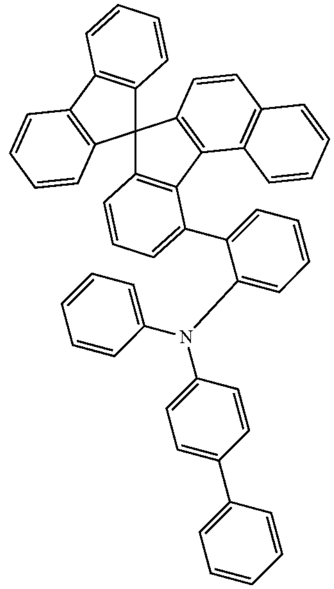
P5-110
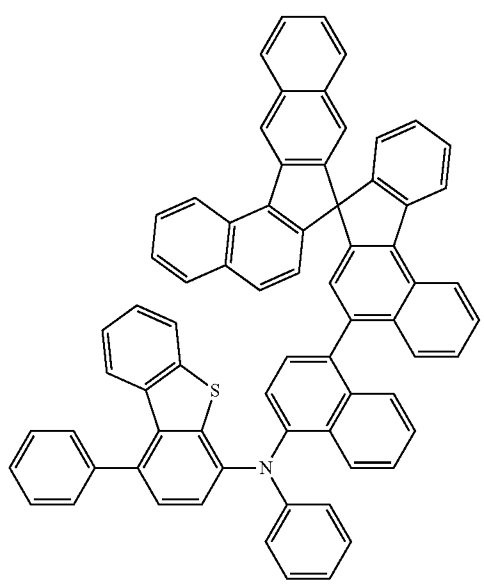

-continued
P5-111
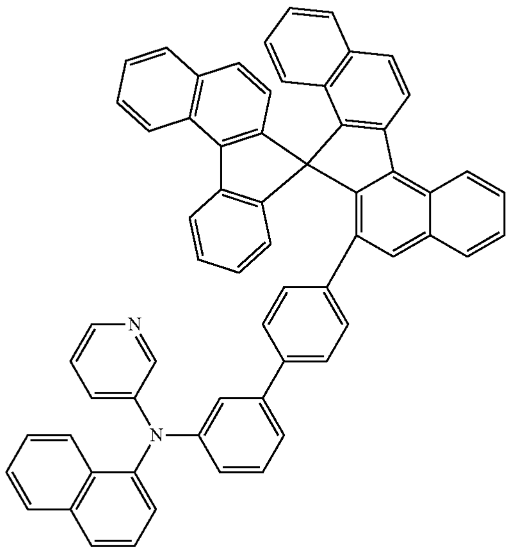
P5-112
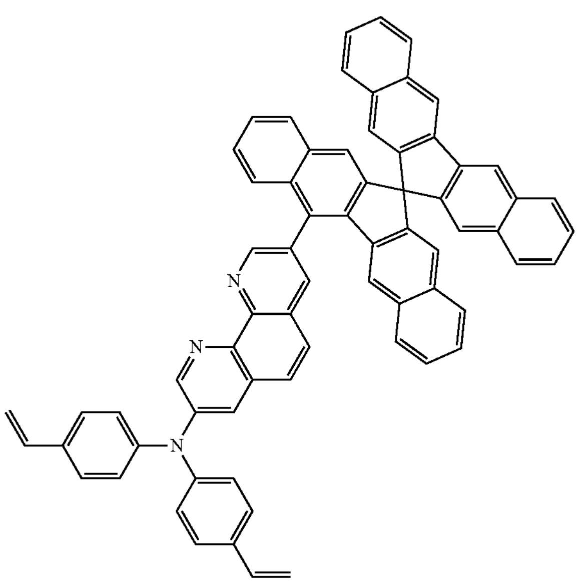
-continued
P5-113
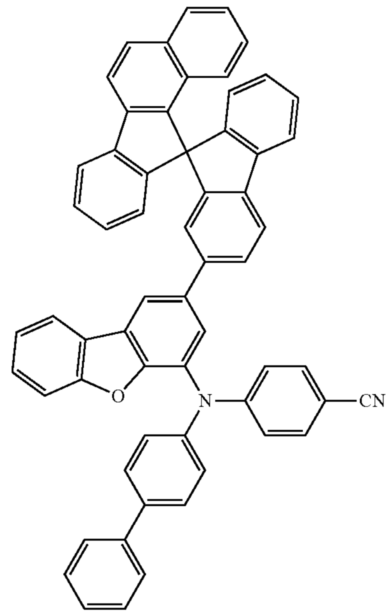
P5-114
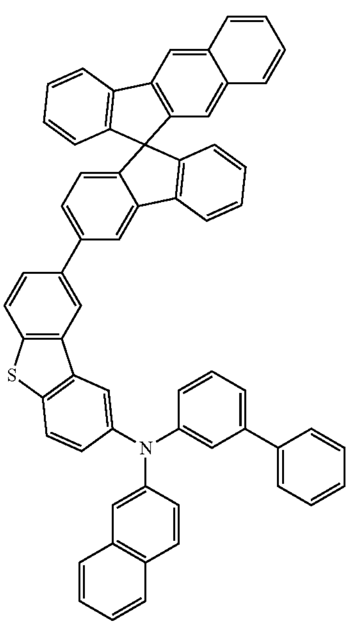

-continued
P5-115
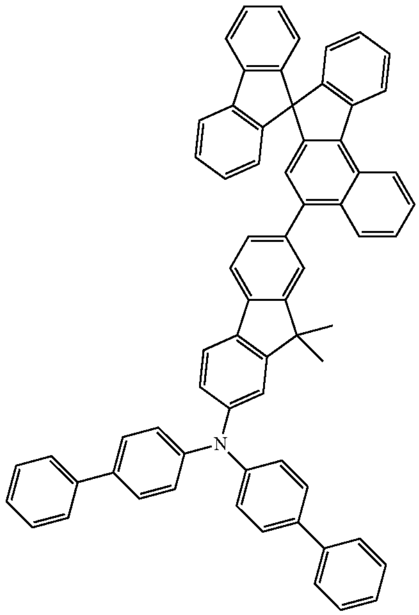
P6-1
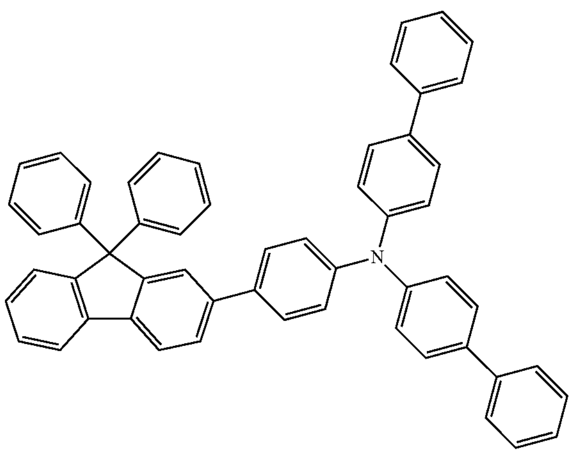
P6-2
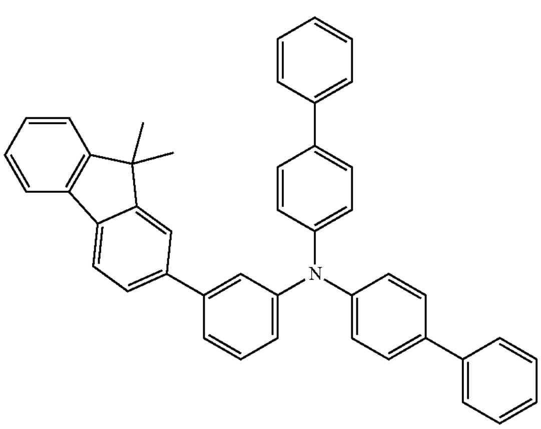
-continued
P6-3
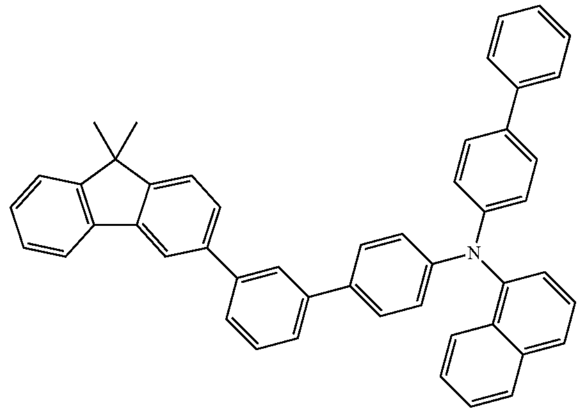
P6-4
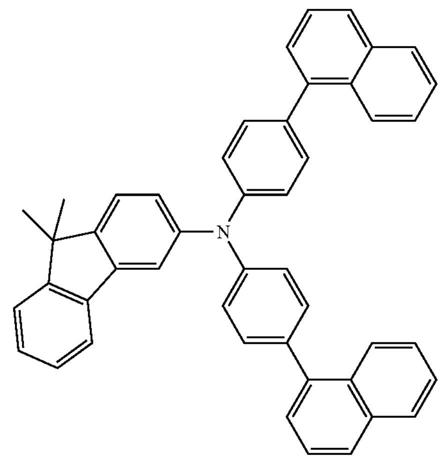
P6-5
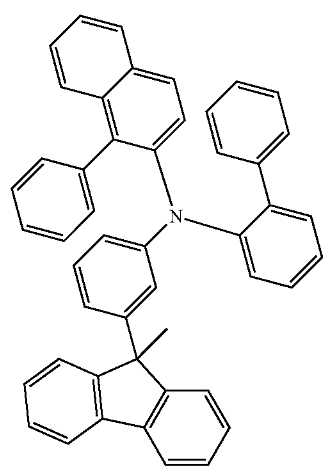

P6-6
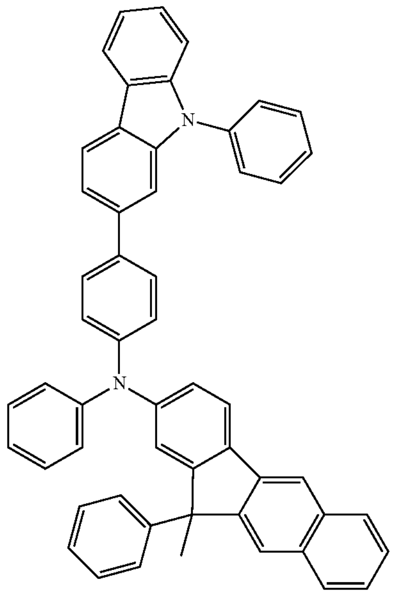
P6-7
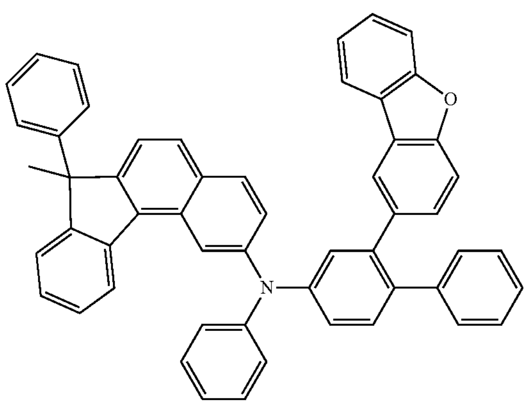
P6-8
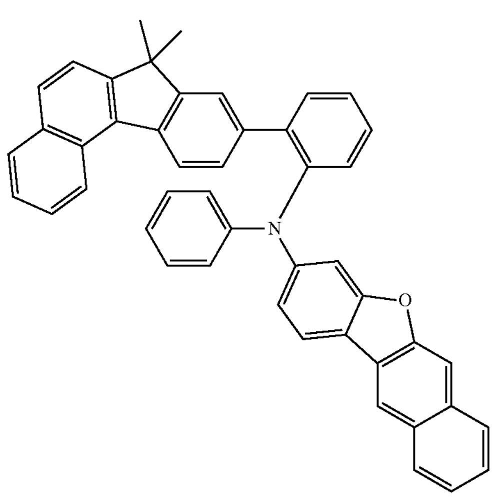
P6-9
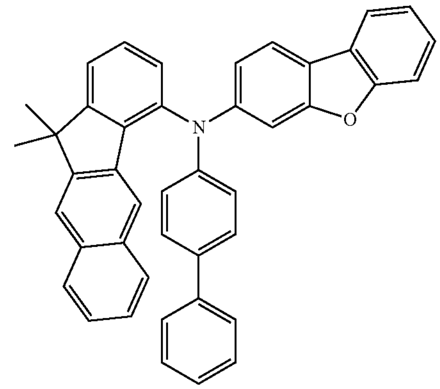
P6-10
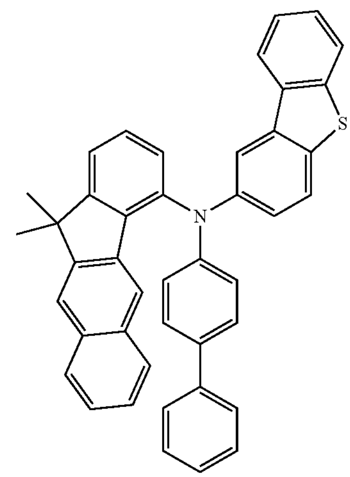
P6-11
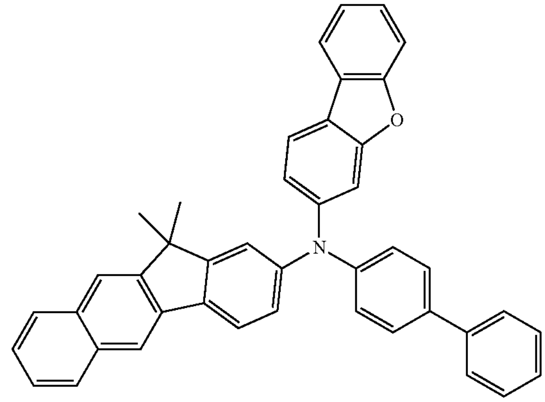

-continued
P6-12
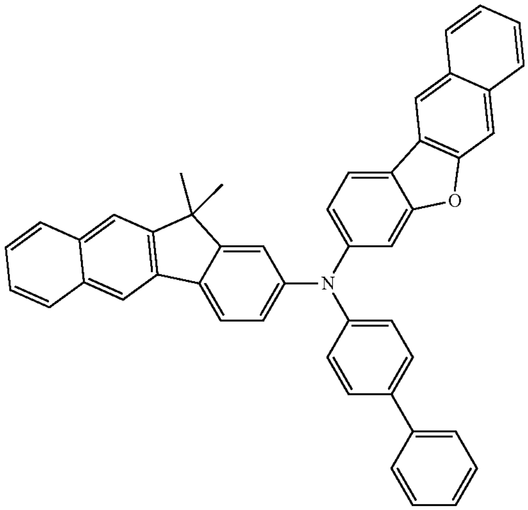
P6-13
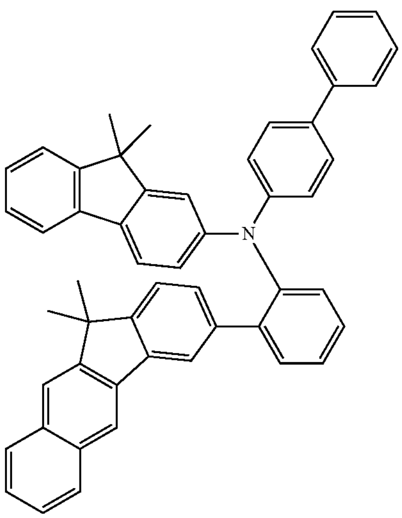
P6-14
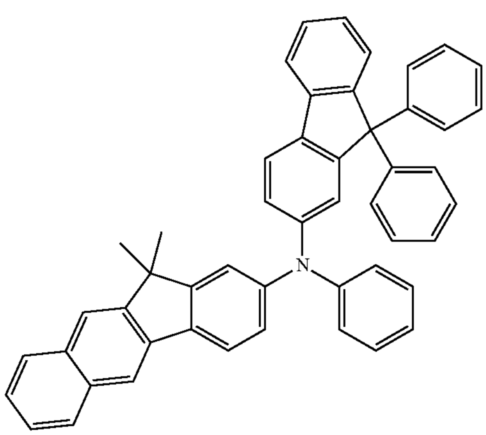
-continued
P6-15
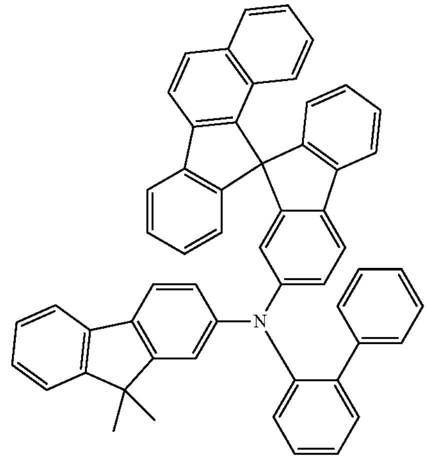
P6-16
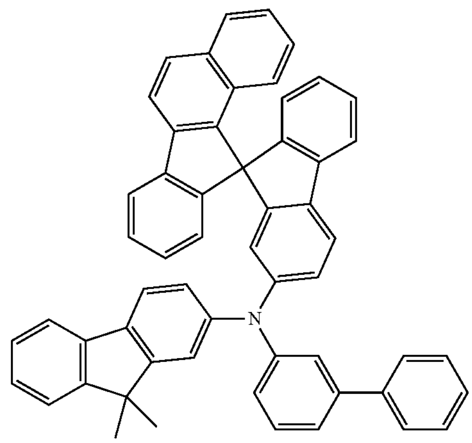
P6-17
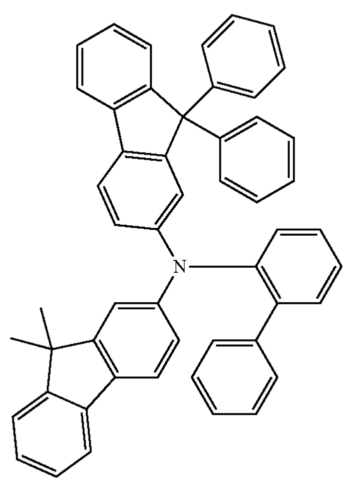

P6-18
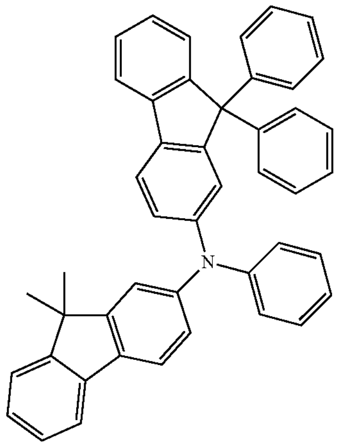
P6-21
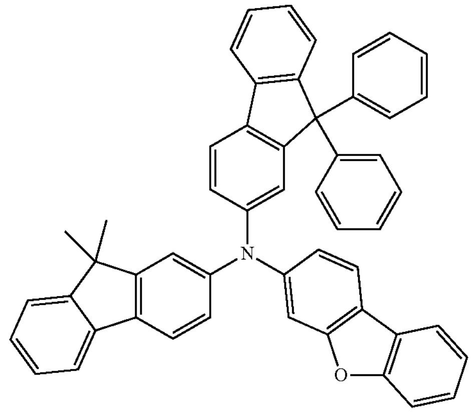
P6-19
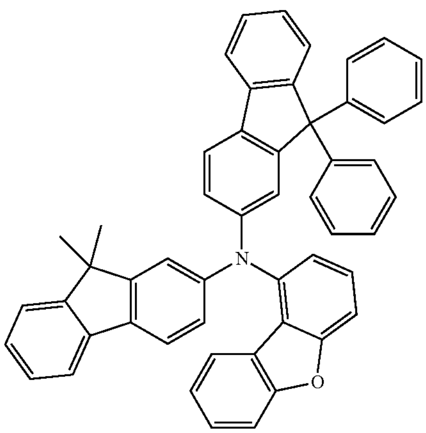
P6-22
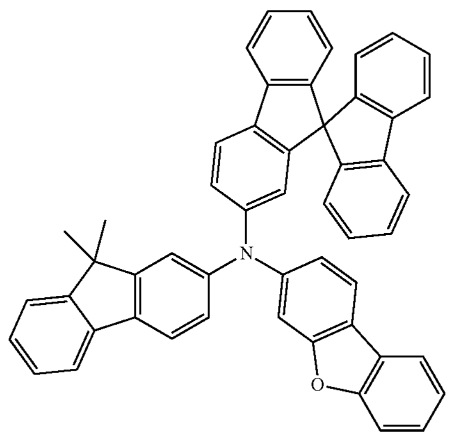
P6-20
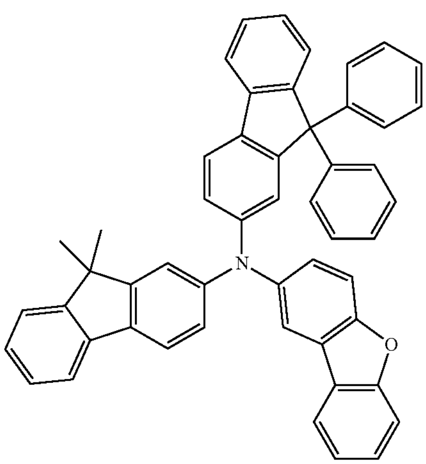
P6-23
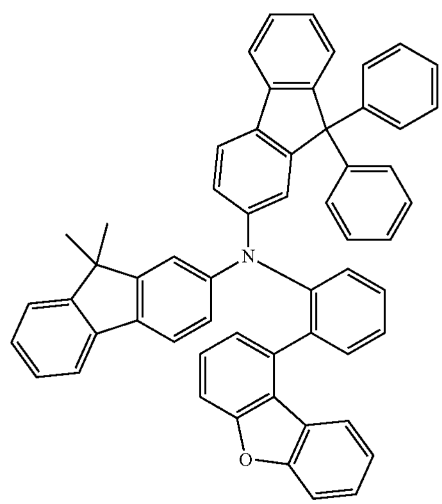

-continued
P6-24
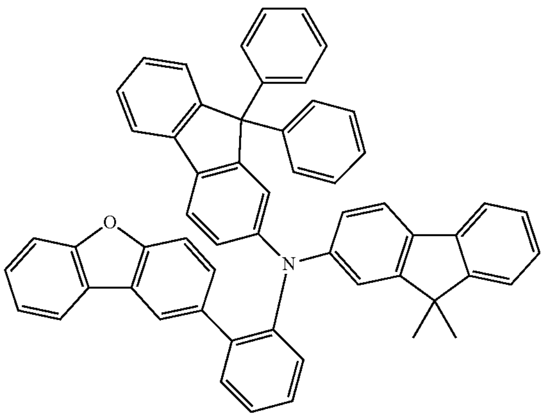
P6-25
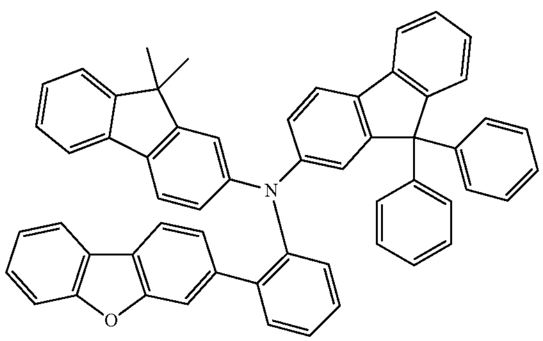
P6-26
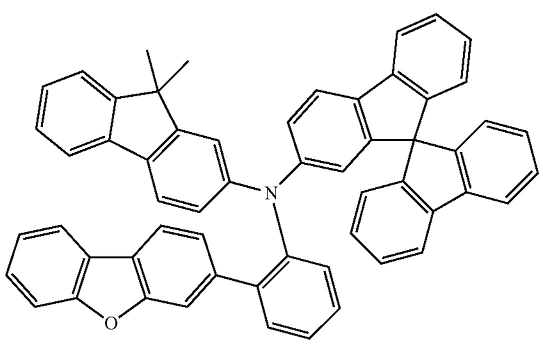
P6-27
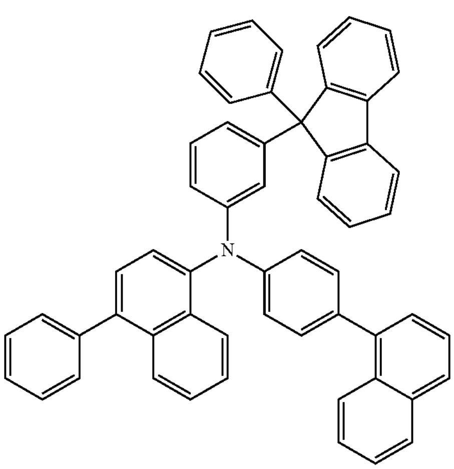
-continued
P6-28
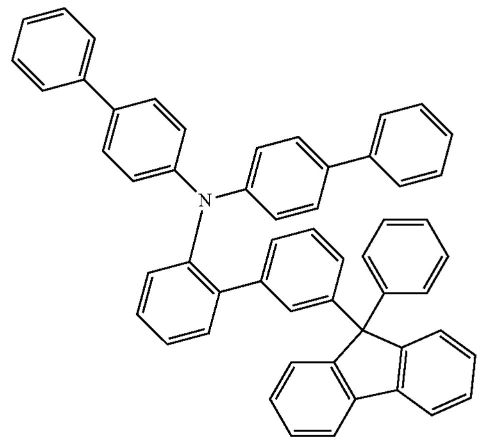
P6-29
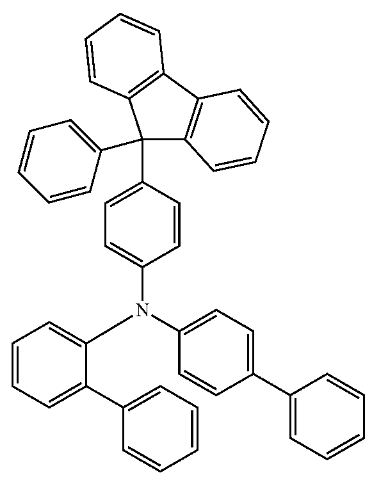
P6-30
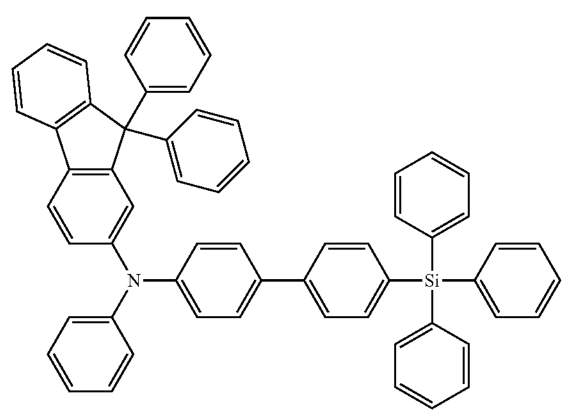

-continued
P6-31
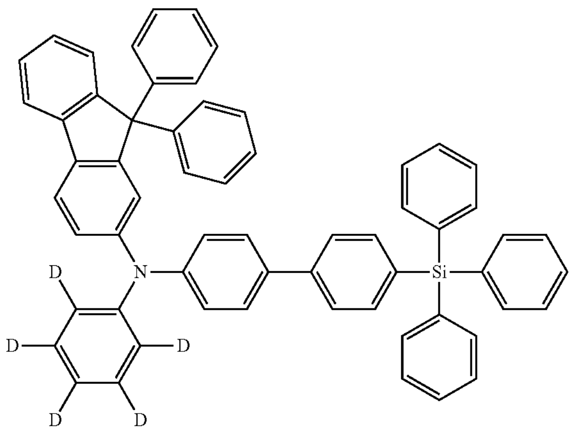
P6-32
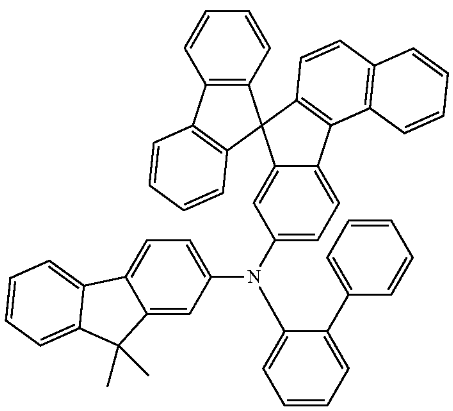
P6-33
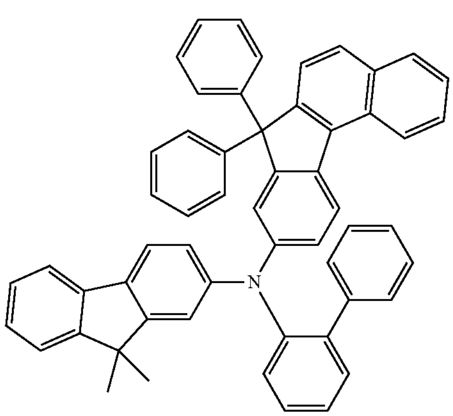
-continued
P6-34
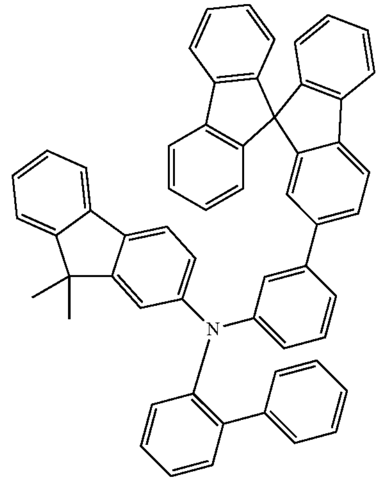
P6-35
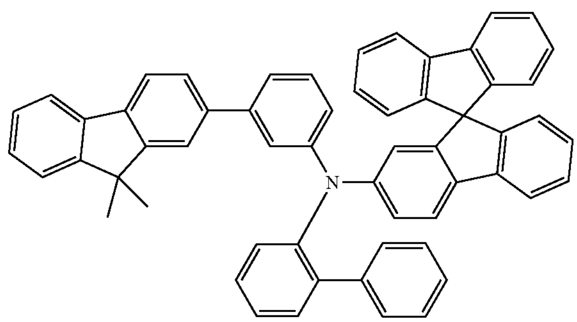
P6-36
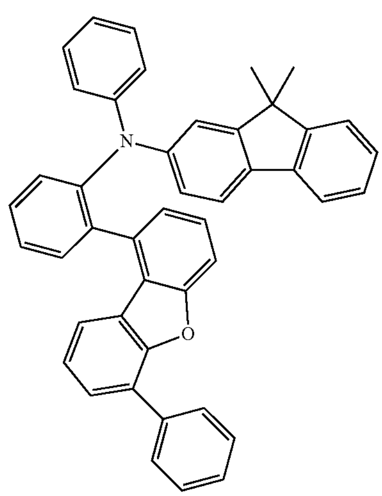

-continued

P6-37

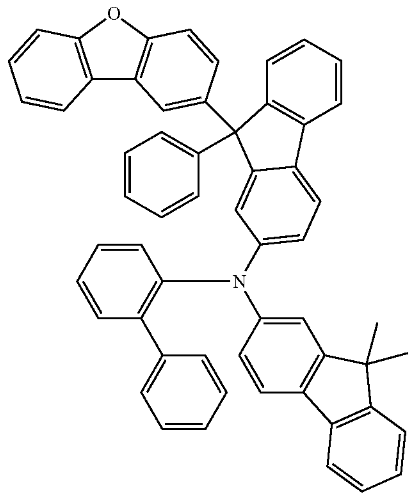

P6-38

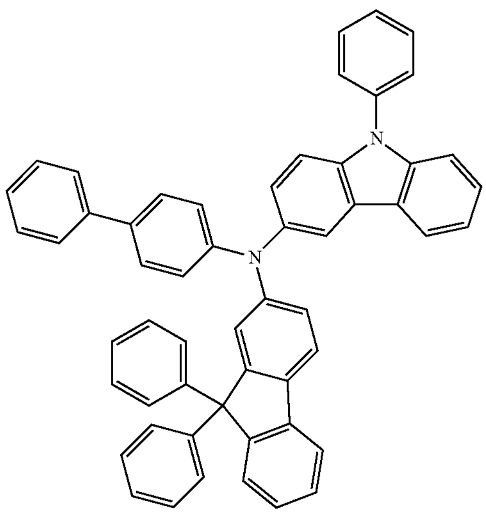

P6-39

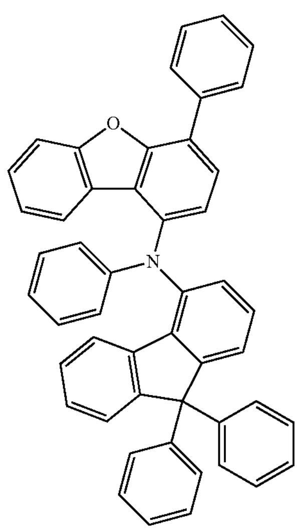

When the first hole transport layer 1411*a* or the first auxiliary emission layer 1411*b* includes the above-described first compound and the first hole transport layer 1411*a* meets the above-described thickness and doping conditions, an organic electronic device having superior efficiency or increased lifespan may be provided.

The second hole transport layer or the second auxiliary emission layer may include the second compound represented by Formula 1. In another example, each of the second hole transport layer and the second auxiliary emission layer may include the second compound represented by Formula 1.

When the second hole transport layer or the second auxiliary emission layer includes the above-described second compound and the second hole transport layer meets the above-described thickness and doping conditions, an organic electronic device having superior efficiency or increased lifespan may be provided.

The third hole transport layer or the third auxiliary emission layer may include the third compound represented by Formula 1. In another example, each of the third hole transport layer and the third auxiliary emission layer may include the third compound represented by Formula 1.

When the third hole transport layer or the third auxiliary emission layer includes the third compound and the third hole transport layer meets the above-described thickness and doping conditions, an organic electronic device having superior efficiency or increased lifespan may be provided.

The fourth hole transport layer 1441*a* or the fourth auxiliary emission layer 1441*b* may include the fifth compound represented by Formula 1. In another example, the fourth hole transport layer 1441*a* and a fourth auxiliary emission layer 1441*b* may include the fifth compound represented by Formula 1.

When the fourth hole transport layer or the fourth auxiliary emission layer includes the fifth compound and the fourth hole transport layer meets the above-described thickness and doping conditions, an organic electronic device having superior efficiency or increased lifespan may be provided.

Regarding the second compound, the third compound, and the fifth compound, what has been described above for the first compound may equally be applied, unless clearly stated otherwise.

In another example, the first hole transport layer 1411*a* or the first auxiliary emission layer 1411*b* may include at least one of the first compound or the fourth compound. In another example, the first hole transport layer 1411*a* or the first auxiliary emission layer 1411*b* may include at least one of the first compound or the fourth compound.

The first hole transport layer 1411*a* or the first auxiliary emission layer 1411*b* includes at least one of the first compound or the fourth compound and the first hole transport layer 1411*a* meets the above-described thickness and doping conditions, an organic electronic device having superior efficiency or increased lifespan may be provided.

In another example, the fourth hole transport layer 1441*a* or the fourth auxiliary emission layer 1441*b* may include at least one of the fifth compound or the sixth compound. In another example, the fourth hole transport layer 1441*a* and the fourth auxiliary emission layer 1441*b* may include at least one of the fifth compound or the sixth compound.

When the fourth hole transport layer 1441*a* or the fourth auxiliary emission layer 1441*b* includes at least one of the fifth compound or the sixth compound and the fourth hole transport layer 1441*a* meets the above-described thickness and doping conditions, an organic electronic device having superior efficiency or increased lifespan may be provided.

The fourth compound may include a radical of a compound represented by the following Formula A or Formula B, and be represented by at least one of compounds represented by the following Formula C or Formula D.

[Formulas A, B, C, and D]

<Formula A>

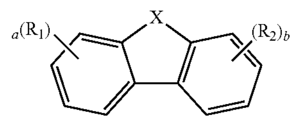

<Formula B>

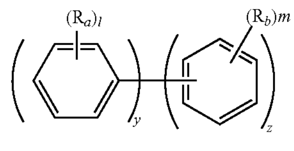

<Formula C>

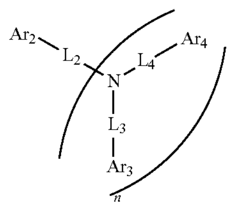

<Formula D>

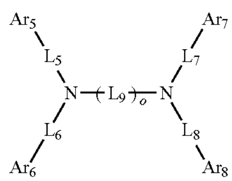

In embodiments of the present disclosure, the description that "any compound includes a radical of a compound represented by Formula A or Formula B and is represented by Formula C or Formula D" may mean that the compound has a structure represented by Formula C or Formula D and is an n-valent radical of a compound in which one or more of substituents and linkages in Formula C or Formula D are represented by Formula A or Formula B (here, n is an integer equal to or greater than 1). On the other hand, the description that "any compound includes a radical of a compound represented by Formula A or Formula B and is represented by Formula C or Formula D" may not mean that the compound includes the radical of the compound represented by Formula A or Formula B in the form of an n-valent radical but may mean that the compound does not include the radical of the compound, represented by Formula A or Formula B, in the form of an n-valent radical but includes the radical of the compound represented by Formula A or Formula B in a state in which the radical is covalently bonded an element of a compound represented by Formula C or Formula D.

Hereinafter, Formula A will be described.

Each of a and b is independently an integer from 0 to 4.

X is O, S, CR'R", or N-$L_1$-$Ar_1$.

$R_1$ and $R_2$ are respectively and independently selected from the group consisting of deuterium; tritium; a halogen; a cyano group; a nitro group; a $C_6$-$C_{60}$ aryl group; a fluorenyl group; a $C_2$-$C_{60}$ heterocyclic group including at least one hetero atom of O, N, S, Si, or P; a fused ring group of a $C_3$-$C_{60}$ aliphatic ring and a $C_6$-$C_{60}$ aromatic ring; a $C_1$-$C_{50}$ alkyl group; a $C_2$-$C_{20}$ alkenyl group; a $C_2$-$C_{20}$ alkynyl group; a $C_1$-$C_{30}$ alkoxyl group; or a $C_6$-$C_{30}$ aryloxy group. $R^1$s and $R^2$s may be bonded to form rings, respectively.

When $R_1$ or $R_2$ is an aryl group, $R_1$ or $R_2$ may be, for example, a $C_6$-$C_{60}$ aryl group, a $C_6$-$C_{40}$ aryl group, a $C_6$-$C_{25}$ aryl group, or a $C_6$-$C_{10}$ aryl group.

When $R_1$ or $R_2$ is a heterocyclic group, $R_1$ or $R_2$ may be, for example, a $C_2$-$C_{60}$ heterocyclic group, a $C_2$-$C_{40}$ heterocyclic group, or a $C_2$-$C_{20}$ heterocyclic group.

Each of R' and R" is independently selected from the group consisting of hydrogen; deuterium; a $C_6$-$C_{60}$ aryl group; a fluorenyl group; a $C_2$-$C_{60}$ heterocyclic group including at least one hetero atom of O, N, S, Si, or P; or a fused ring group of a $C_3$-$C_{60}$ aliphatic ring and a $C_6$-$C_{60}$ aromatic ring. The R' and R" may be bonded to form rings, respectively.

When R' or R" is an aryl group, R' or R" may be, for example, a $C_6$-$C_{60}$ aryl group, a $C_6$-$C_{40}$ aryl group, a $C_6$-$C_{25}$ aryl group, or a $C_6$-$C_{10}$ aryl group.

When R' or R" is a heterocyclic group, R' or R" may be, for example, a $C_2$-$C_{60}$ heterocyclic group, a $C_2$-$C_{40}$ heterocyclic group, or a $C_2$-$C_{20}$ heterocyclic group.

$L_1$ is selected from the group consisting of a single bond; a $C_6$-$C_{60}$ arylene group; a fluorenylene group; a $C_2$-$C_{60}$ heterocyclic group including at least one hetero atom of O, N, S, Si, or P; or a fused ring group of a $C_3$-$C_{60}$ aliphatic ring and a $C_6$-$C_{60}$ aromatic ring.

When $L_1$ is an arylene group, $L_1$ may be, for example, a $C_6$-$C_{60}$ arylene group, a $C_6$-$C_{40}$ arylene group, a $C_6$-$C_{25}$ arylene group, or a $C_6$-$C_{10}$ arylene group.

When $L_1$ is a heterocyclic group, $L_1$ may be, for example, a $C_2$-$C_{60}$ heterocyclic group, a $C_2$-$C_{40}$ heterocyclic group, or a $C_2$-$C_{20}$ heterocyclic group.

$Ar_1$ is selected from the group consisting of a $C_6$-$C_{60}$ aryl group; a fluorenyl group; a $C_2$-$C_{60}$ heterocyclic group including at least one hetero atom of O, N, S, Si, or P; or a fused ring group of a $C_3$-$C_{60}$ aliphatic ring and a $C_6$-$C_{60}$ aromatic ring.

When $Ar_1$ is an aryl group, $Ar_1$ may be, for example, a $C_6$-$C_{60}$ aryl group, a $C_6$-$C_{40}$ aryl group, a $C_6$-$C_{25}$ aryl group, or a $C_6$-$C_{10}$ aryl group.

When $Ar_1$ is a heterocyclic group, $Ar_1$ may be, for example, a $C_2$-$C_{60}$ heterocyclic group, a $C_2$-$C_{40}$ heterocyclic group, or a $C_2$-$C_{20}$ heterocyclic group.

Hereinafter, Formula B will be described.

l is an integer from 0 to 5.

m is an integer from 0 to 4.

each y and z is an integer from 0 to 4, where y+z is not zero (0).

Each of $R_a$ and $R_b$ is independently selected from the group consisting of deuterium; tritium; a halogen; a cyano group; a nitro group; a $C_6$-$C_{60}$ aryl group; a fluorenyl group; a $C_2$-$C_{60}$ heterocyclic group including at least one hetero atom of O, N, S, Si, or P; a fused ring group of a $C_3$-$C_{60}$ aliphatic ring and a $C_6$-$C_{60}$ aromatic ring; a $C_1$-$C_{60}$ alkyl group; a $C_2$-$C_{20}$ alkenyl group; a $C_2$-$C_{20}$ alkynyl group; a $C_1$-$C_{30}$ alkoxyl group; or a $C_6$-$C_{30}$ aryloxy group. $R_a$s and $R_b$s may be bonded to form rings, respectively.

When $R_a$ or $R_b$ is an aryl group, $R_a$ or $R_b$ may be, for example, a $C_6$-$C_{60}$ aryl group, a $C_6$-$C_{40}$ aryl group, a $C_6$-$C_{25}$ aryl group, or a $C_6$-$C_{10}$ aryl group.

When $R_a$ or $R_b$ is a heterocyclic group, $R_a$ or $R_b$ may be, for example, a $C_2$-$C_{60}$ heterocyclic group, a $C_2$-$C_{40}$ heterocyclic group, or a $C_2$-$C_{20}$ heterocyclic group.

Hereinafter, Formula C will be described.

n is 1 or 2.

$Ar_2$ is a radical of a compound represented by Formula A or a radical of a compound represented by Formula B.

Each of $Ar_3$ and $Ar_4$ is independently selected from the group consisting of a $C_6$-$C_{60}$ aryl group; a fluorenyl group;

a $C_2$-$C_{60}$ heterocyclic group including at least one hetero atom of O, N, S, Si, or P; or a fused ring group of a $C_3$-$C_{60}$ aliphatic ring and a $C_6$-$C_{60}$ aromatic ring.

When $Ar_3$ or $Ar_4$ is an aryl group, $Ar_3$ or $Ar_4$ may be, for example, a $C_6$-$C_{60}$ aryl group, a $C_6$-$C_{40}$ aryl group, a $C_6$-$C_{25}$ aryl group, or a $C_6$-$C_{10}$ aryl group.

$Ar_3$ or $Ar_4$ is a heterocyclic group, $Ar_3$ or $Ar_4$ may be, for example, a $C_2$-$C_{60}$ heterocyclic group, a $C_2$-$C_{40}$ heterocyclic group, or a $C_2$-$C_{20}$ heterocyclic group.

Each of $L_2$ to $L_4$ is independently selected from the group consisting of a single bond; a $C_6$-$C_{60}$ arylene group; a fluorenylene group; or a $C_2$-$C_{60}$ heterocyclic group including at least one hetero atom of O, N, S, Si, or P.

When one of $L_2$ to $L_4$ is an arylene group, one of $L_2$ to $L_4$ may be, for example, a $C_6$-$C_{60}$ arylene group, a $C_6$-$C_{40}$ arylene group, a $C_6$-$C_{25}$ arylene group, or a $C_6$-$C_{10}$ arylene group.

When one of $L_2$ to $L_4$ is a heterocyclic group, one of $L_2$ to $L_4$ may be, for example, a $C_2$-$C_{60}$ heterocyclic group, a $C_2$-$C_{40}$ heterocyclic group, or a $C_2$-$C_{20}$ heterocyclic group.

Hereinafter, Formula D will be described.

o is an integer from 1 to 4.

Each of $Ar_5$ to $Ar_8$ is independently selected from the group consisting of a $C_6$-$C_{60}$ aryl group; a fluorenyl group; a $C_2$-$C_{60}$ heterocyclic group including at least one hetero atom of O, N, S, Si, or P; or a fused ring group of a $C_3$-$C_{60}$ aliphatic ring and a $C_6$-$C_{60}$ aromatic ring.

When one of $Ar_5$ to $Ar_8$ is an aryl group, one of $Ar_5$ to $Ar_8$ may be, for example, a $C_6$-$C_{60}$ aryl group, a $C_6$-$C_{40}$ aryl group, a $C_6$-$C_{25}$ aryl group, or a $C_6$-$C_{10}$ aryl group.

When one of $Ar_5$ to $Ar_8$ is a heterocyclic group, one of $Ar_5$ to $Ar_8$ may be, for example, a $C_2$-$C_{60}$ heterocyclic group, a $C_2$-$C_{40}$ heterocyclic group, or a $C_2$-$C_{20}$ heterocyclic group.

Each of $L_5$ to $L_9$ is independently selected from the group consisting of a single bond; a $C_6$-$C_{60}$ arylene group; a fluorenylene group; a $C_2$-$C_{60}$ heterocyclic group including at least one hetero atom of O, N, S, Si, or P; or a fused ring group of a $C_3$-$C_{60}$ aliphatic ring and a $C_6$-$C_{60}$ aromatic ring. $L_9$ may be a radical of a compound represented by Formula A or a radical of a compound represented by Formula B.

When one of $L_5$ to $L_9$ is an arylene group, one of $L_5$ to $L_9$ may be, for example, a $C_6$-$C_{60}$ arylene group, a $C_6$-$C_{40}$ arylene group, a $C_6$-$C_{25}$ arylene group, or a $C_6$-$C_{10}$ arylene group.

When one of $L_5$ to $L_9$ is a heterocyclic group, one of $L_5$ to $L_9$ may be, for example, a $C_2$-$C_{60}$ heterocyclic group, a $C_2$-$C_{40}$ heterocyclic group, or a $C_2$-$C_{20}$ heterocyclic group.

In Formula A to Formula D, each of the aryl group, fluorenyl group, the heterocyclic group, the fused ring group, the alkyl group, the alkenyl group, the alkynyl group, the alkoxyl group, the aryloxy group, the arylene group, and the fluorenylene group may be further substituted with one or more substituents selected from the group consisting of deuterium; a nitro group; a nitrile group; a halogen group; amino group; a $C_1$-$C_{20}$ alkylthio group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{25}$ aryl group; a $C_6$-$C_{25}$ aryl group substituted with deuterium; a fluorenyl group; a $C_2$-$C_{20}$ heterocyclic group; a $C_3$-$C_{20}$ cycloalkyl group; a $C_7$-$C_{20}$ aryl alkyl group; or a $C_8$-$C_{20}$ aryl alkenyl group. In addition, the further substituted substituents may be bonded to form a ring. Each of the further substituted substituents may be further substituted with one or more substituents selected from the group consisting of deuterium; a nitro group; a nitrile group; a halogen group; an amino group; a $C_1$-$C_{20}$ alkylthio group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{25}$ aryl group; a $C_6$-$C_{25}$ aryl group substituted with deuterium; a fluorenyl group; a $C_2$-$C_{20}$ heterocyclic group; a $C_3$-$C_{20}$ cycloalkyl group; a $C_7$-$C_{20}$ aryl alkyl group; or a $C_8$-$C_{20}$ aryl alkenyl group. In addition, theses substituents may be bonded to form a ring.

The fourth compound may include a radical of a compound represented by Formula A, be represented by Formula C, and be represented by one of the following Formula H-1 to Formula H-5.

[Formulas H-1 and H-2]

<Formula H-1>

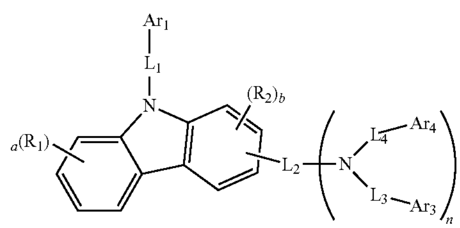

<Formula H-2>

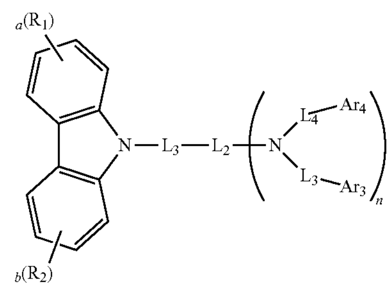

[Formulas H-3, H-4, and H-5]

<Formula H-3>

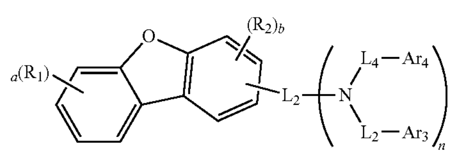

<Formula H-4>

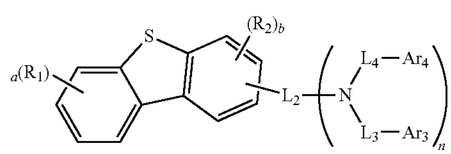

<Formula H-5>

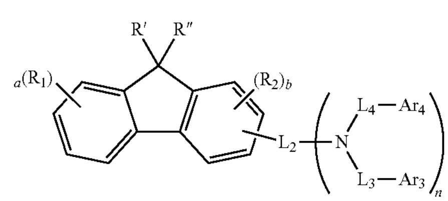

In Formula H-1 to Formula H-5, a, b, n, $R_1$, $R_2$, R', R'', $Ar_1$, $Ar_3$, $Ar_4$, and $L_1$ to $L_4$ are the same as a, b, $R_1$, $R_2$, R', R'', $Ar_1$, $Ar_3$, $Ar_4$, and $L_1$ to $L_4$ defined in the description of Formula A to Formula D.

The fourth compound may include a radical of a compound represented by Formula A, be represented by Formula D, and be represented by one of the following Formula I-1 to Formula I-3.

[Formulas I-1 and I-2]

<Formula I-1>

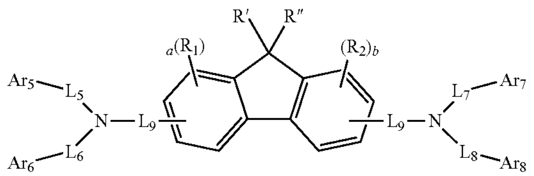

<Formula I-2>

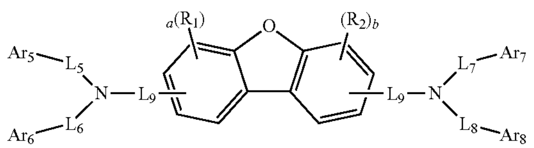

[Formula I-3]

<Formula I-3>

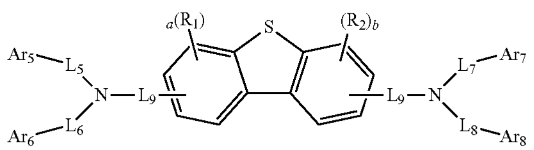

In Formula I-1 to Formula I-3, a, b, $R_1$, $R_2$, R', R", $Ar_5$ to $Ar_8$, and $L_5$ to $L_9$ are the same as a, b, $R_1$, $R_2$, R', R", $Ar_5$ to $Ar_8$, and $L_5$ to $L_9$ defined in the description of Formula A to Formula D.

The fourth compound may include a radical of a compound represented by Formula A, be represented by Formula D, and be represented by one of the following Formula I-4 to Formula I-6.

[Formulas I-4, I-5, and I-6]

<Formula I-4>

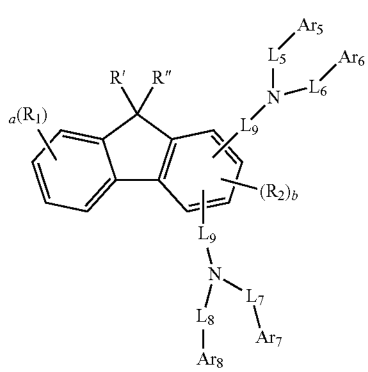

-continued

<Formula I-5>

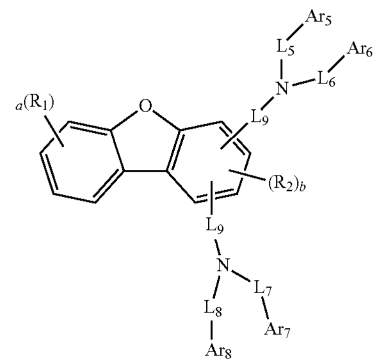

<Formula I-6>

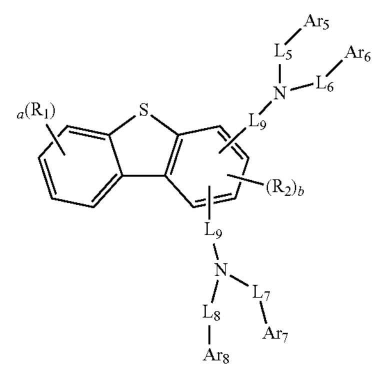

In Formula I-4 to Formula I-6, a, b, $R_1$, $R_2$, R', R", $Ar_5$ to $Ar_8$, and $L_5$ to $L_9$ are the same as a, b, $R_1$, $R_2$, R', R", $Ar_5$ to $Ar_8$, and $L_5$ to $L_9$ defined in the description of Formula A to Formula D.

The fourth compound may include a radical of a compound represented by Formula B, be represented by Formula C or Formula D, and be represented by one of the following Formula J-1 to Formula J-3.

[Formula J-1 and J-2]

<Formula J-1>

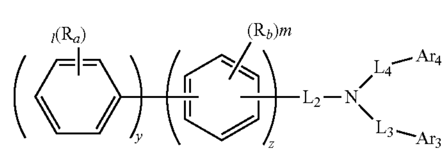

<Formula J-2>

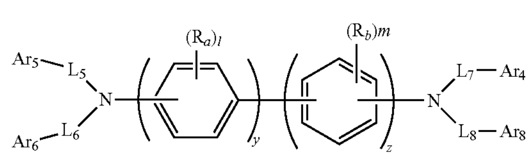

<Formula J-3>

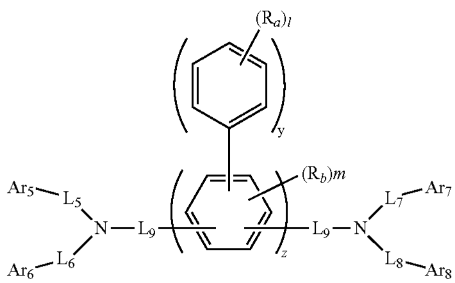

In Formula J-1 to J-3, l, m, n, y, z, $R_a$, $R_b$, $Ar_3$ to $Ar_8$, and $L_5$ to $L_9$ are the same as l, m, n, $R_a$, $R_b$, $Ar_3$ to $Ar_8$, and $L_5$ to $L_9$ defined in the description of Formula A to Formula D.

Formula H-1 may be represented by the following Formula H-1-A or Formula H-1-B.

[Formula H-1-A and H-1-B]

<Formula H-1-A>

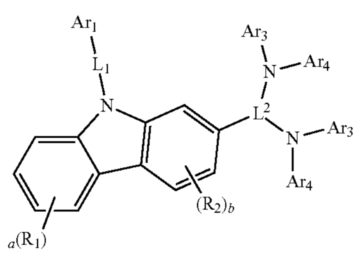

<Formula H-1-B>

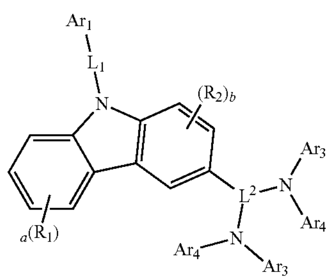

In Formula H-1-A and Formula H-1-B, a, b, $R_1$, $R_2$, $Ar_1$, $Ar_3$, $Ar_4$, and $L_1$ to $L_4$ are the same as a, b, $R_1$, $R_2$, $Ar_1$, $Ar_3$, $Ar_4$, and $L_1$ to $L_4$ defined in the description of Formula A to Formula 5 D.

Each of $L_1$ to $L_8$ may be independently represented by one of the following Formula b-1 to Formula b-13.

[Formulas b-1, b-2, b-3, b-4, b-5, and b-6]

<Formula b-1>

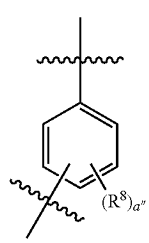

<Formula b-2>

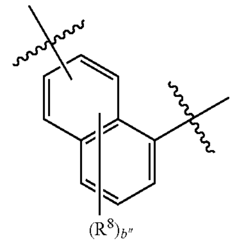

<Formula b-3>

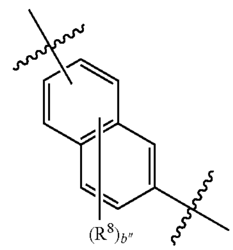

<Formula b-4>

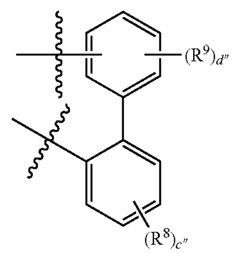

<Formula b-5>

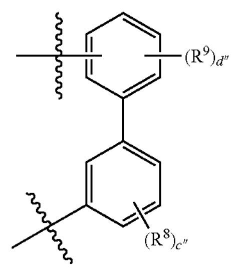

<Formula b-6>

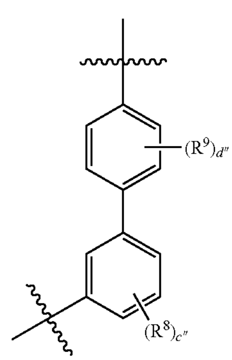

-continued

[Formulas b-7, b-8, b-9, and b-10]

<Formula b-7>

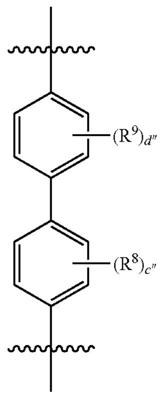

<Formula b-8>

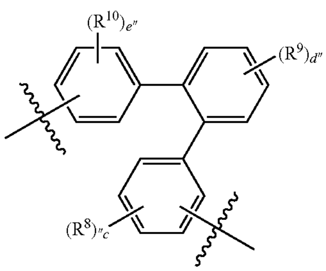

<Formula b-9>

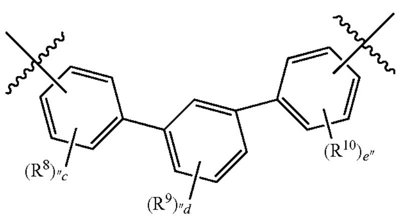

<Formula b-10>

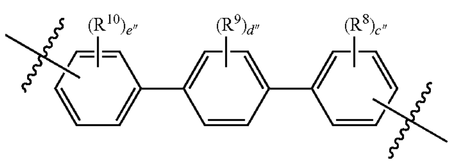

[Formulas b-11, b-12, and b-13]

<Formula b-11>

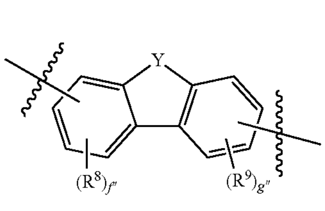

<Formula b-12>

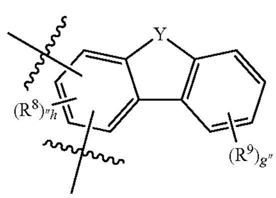

-continued

<Formula b-13>

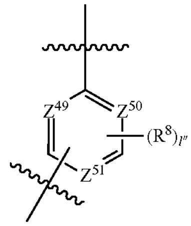

Hereinafter, Formula b-1 to Formula b-13 will be described.

Y is respectively and independently N-$L^6$-$Ar^9$, O, S, or $CR^dR^e$.

$L^6$ is the same as $L_1$ defined in the description of Formula A to Formula D.

$Ar^9$ is the same as $Ar_1$ defined in the description of Formula A to Formula D.

$R^d$ and $R^e$ are the same as R' and R" defined in the description of Formula A to Formula D.

Each a", c", d", and e" is independently an integer from 0 to 4, and b" is respectively and independently an integer from 0 to 6.

f" and g" are independently an integer from 0 to 3, h" is an integer from 0 to 2, and i" is an integer 0 or 1.

Each of $R^8$ to $R^{10}$ is independently selected from the group consisting of hydrogen; deuterium; tritium; a halogen; a cyano group; a nitro group; a $C_6$-$C_{60}$ aryl group; fluorenyl group; a $C_2$-$C_{60}$ heterocyclic group including at least one hetero atom selected from the group consisting of O, N, S, Si, or P; a fused ring group of a $C_3$-$C_{60}$ aliphatic ring and a $C_6$-$C_{60}$ aromatic ring; a $C_1$-$C_{50}$ alkyl group; a $C_2$-$C_{20}$ alkenyl group; a $C_2$-$C_{20}$ alkynyl group; a $C_1$-$C_{30}$ alkoxyl group; a $C_6$-$C_{30}$ aryloxy group, or -$L^a$-N($R^d$)($R^e$). $R^8$s to $R^{10}$s may be bonded to form rings, respectively.

$L^a$ is selected from the group consisting of a single bond; a $C_6$-$C_{60}$ arylene group; a fluorenylene group; a $C_2$-$C_{60}$ heterocyclic group including at least one hetero atom of O, N, S, Si, or P; a fused ring group of a $C_3$-$C_{60}$ aliphatic ring and a $C_6$-$C_{60}$ aromatic ring; and a $C_3$-$C_{60}$ aliphatic hydrocarbon group.

Each of $R^d$ and $R^e$ is independently selected from the group consisting of a $C_6$-$C_{60}$ aryl group; a fluorenyl group; a $C_2$-$C_{60}$ heterocyclic group including at least one hetero atom selected from the group consisting of O, N, S, Si, or P; and a fused ring group of a $C_3$-$C_{60}$ aliphatic ring and a $C_6$-$C_{60}$ aromatic ring.

Each of $Z^{49}$, $Z^{50}$, and $Z^{51}$ is independently $CR^f$ or N, at least one of $Z^{49}$, $Z^{50}$, or $Z^{51}$ is N.

$R^f$ is selected from the group consisting of hydrogen; deuterium; tritium; a halogen; a cyano group; a nitro group; a $C_6$-$C_{60}$ aryl group; a fluorenyl group; a $C_2$-$C_{60}$ heterocyclic group including at least one hetero atom selected from the group consisting of O, N, S, Si, or P; a fused ring group of a $C_3$-$C_{60}$ aliphatic ring and a $C_6$-$C_{60}$ aromatic ring; a $C_1$-$C_{50}$ alkyl group; a $C_2$-$C_{20}$ alkenyl group; a $C_2$-$C_{20}$ alkynyl group; a $C_1$-$C_{30}$ alkoxyl group; or a $C_6$-$C_{30}$ aryloxy group. Adjacent $R^8$ and $R^f$ may be bonded to form a ring.

The fourth compound may include a radical of a compound represented by Formula A, be represented by Formula C, be one or more of the following compound 1-1 to compound 6-35.

-continued
1-1
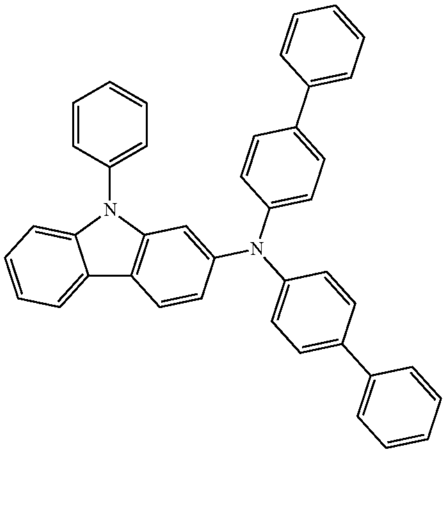
1-2
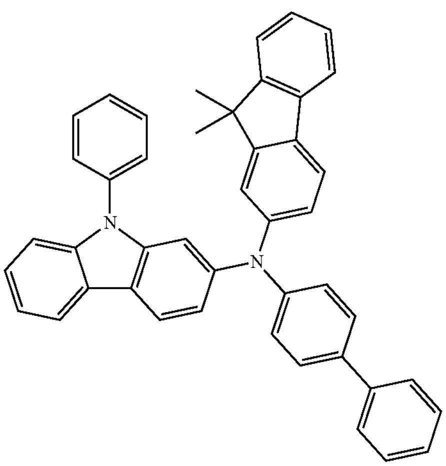
1-3
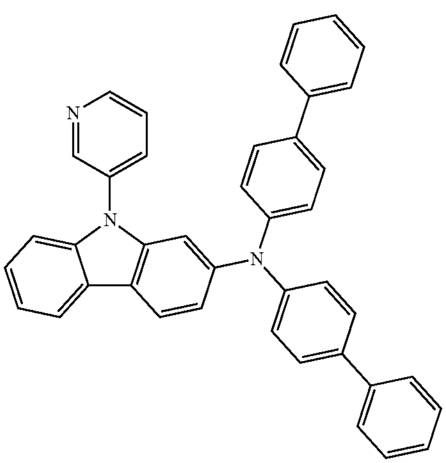
1-4
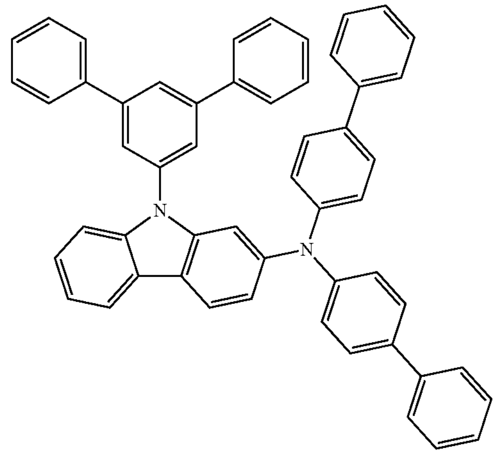
1-5
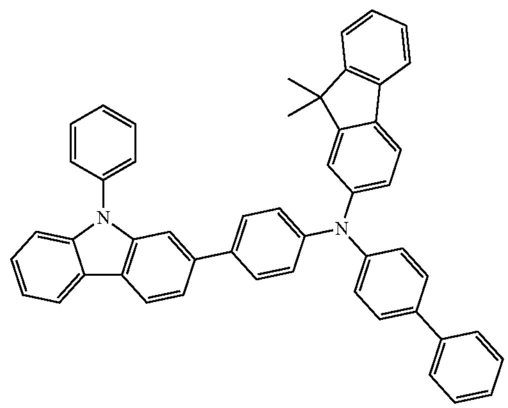
1-6
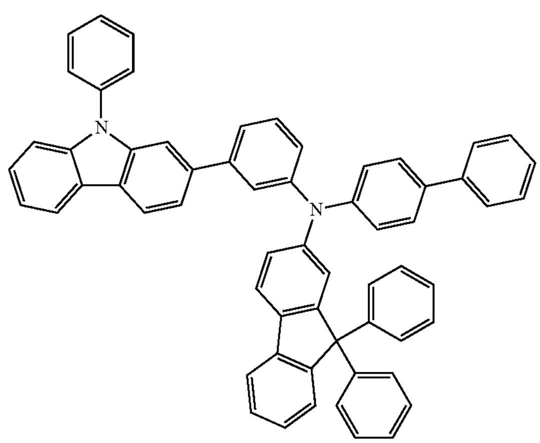

-continued
1-7
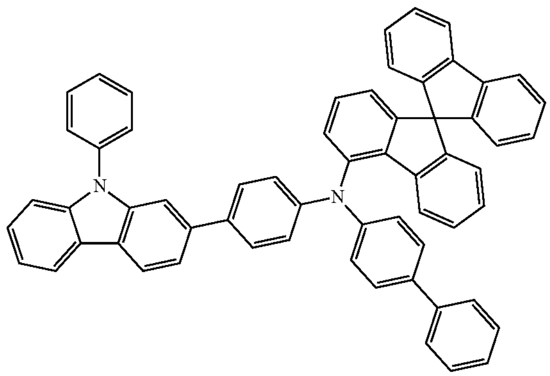
1-8
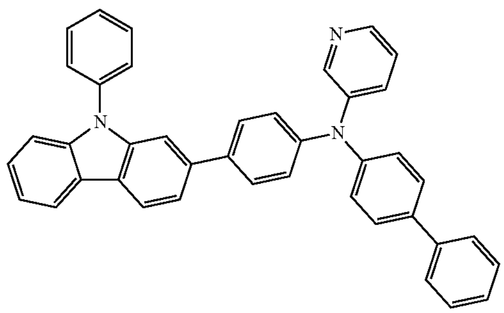
1-9
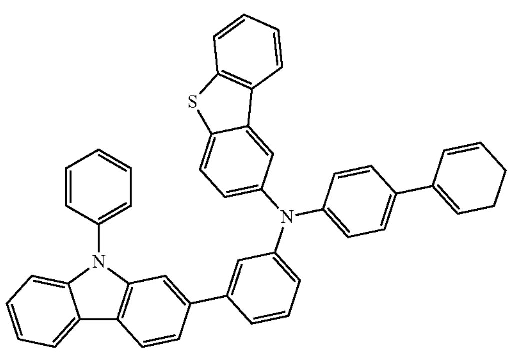
1-10
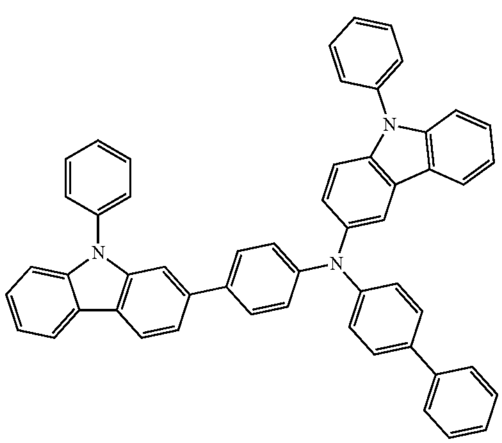
-continued
1-11
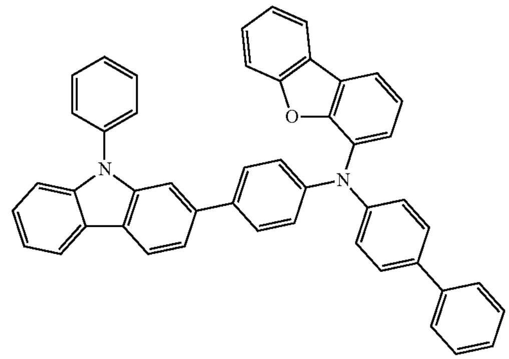
1-12
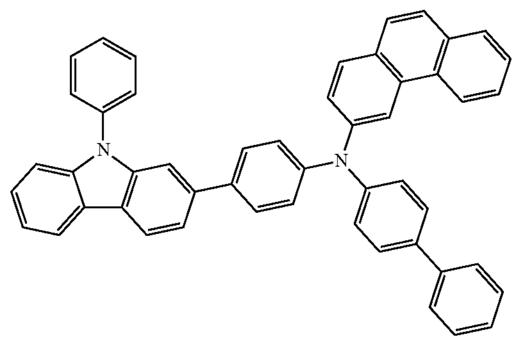
1-13
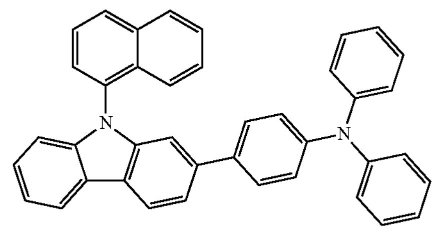
1-14
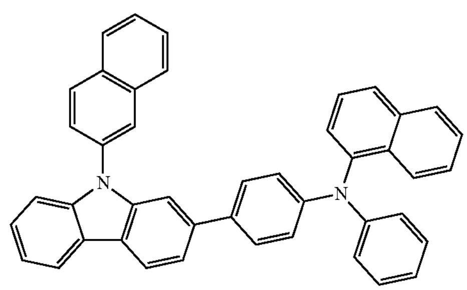
1-15
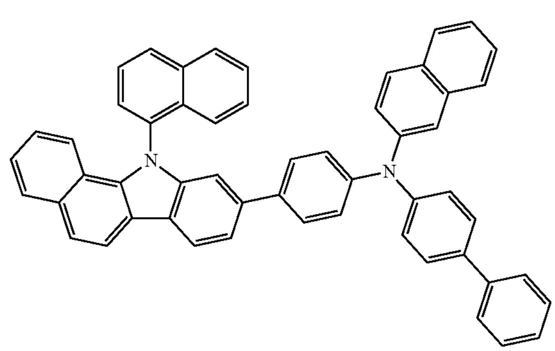

-continued
1-16
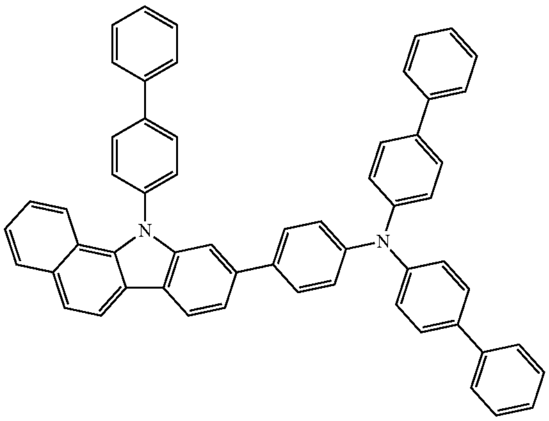
1-17
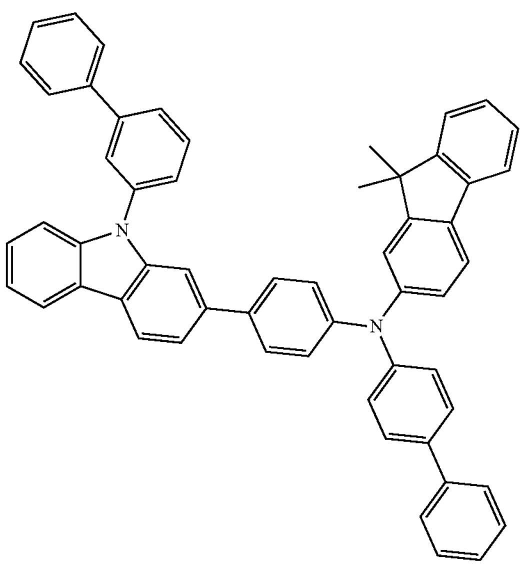
1-18
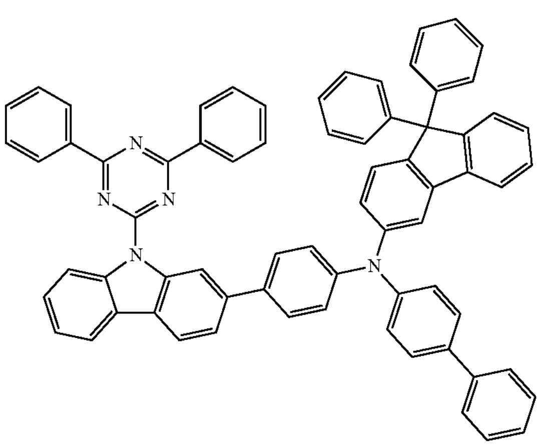
-continued
1-19
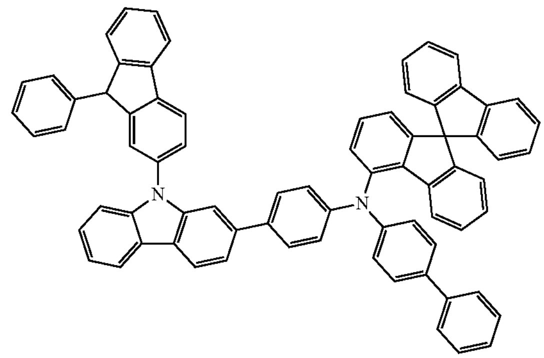
1-20
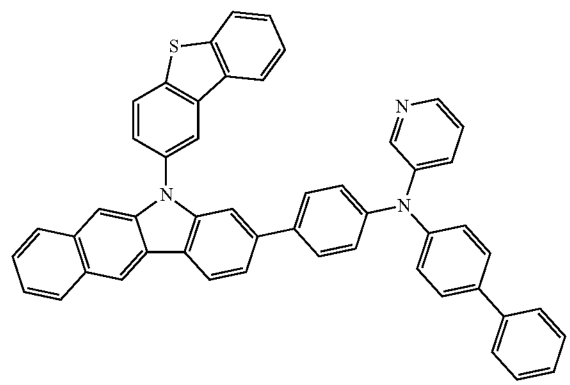
1-21
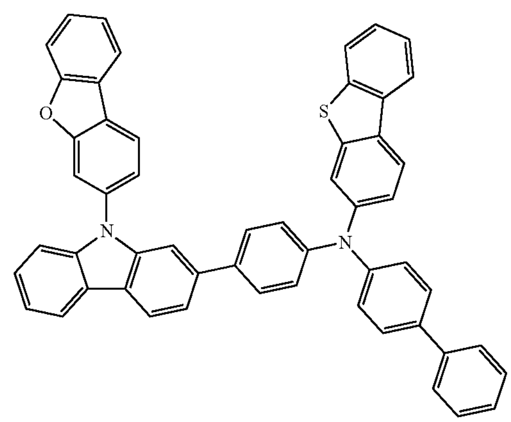
1-22
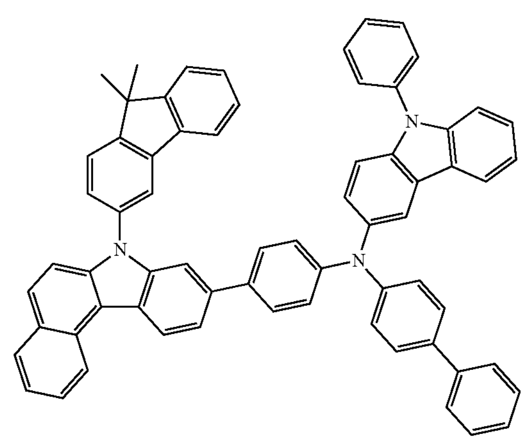

-continued
1-23
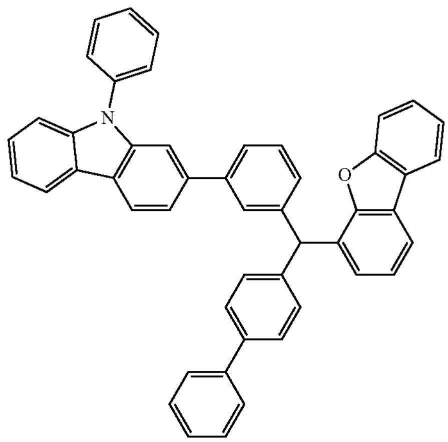
1-24
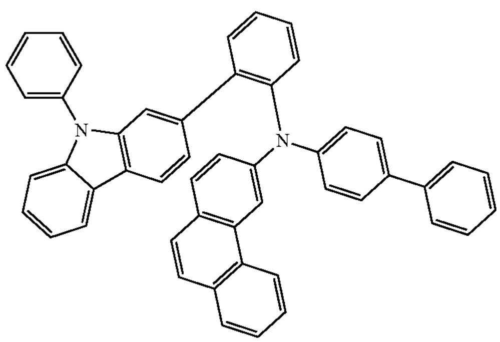
1-25
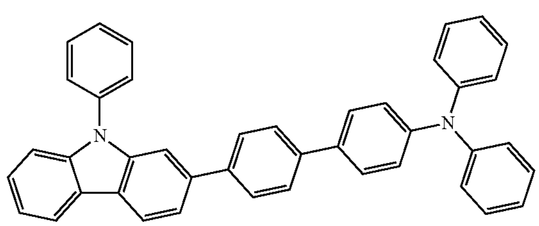
1-26
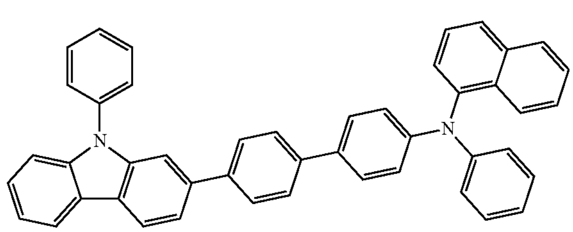
-continued
1-27
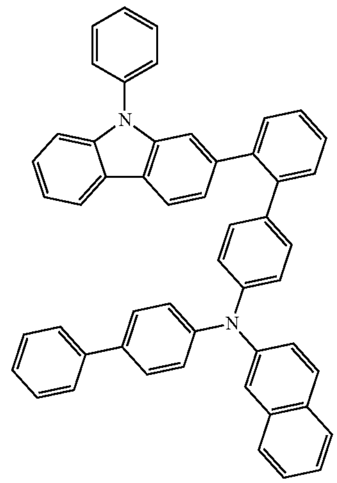
1-28
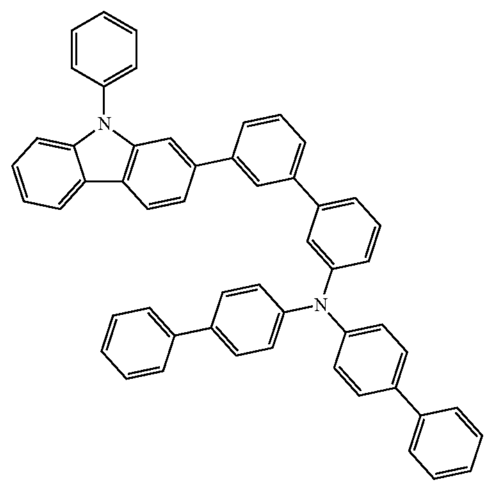
1-29
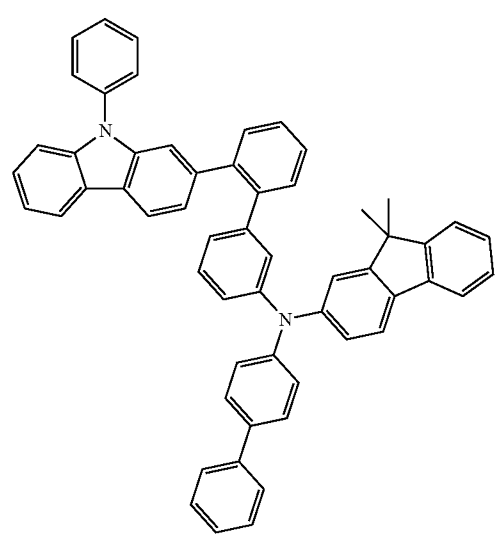

-continued
1-30
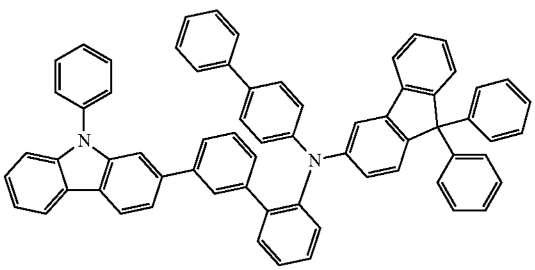
1-31
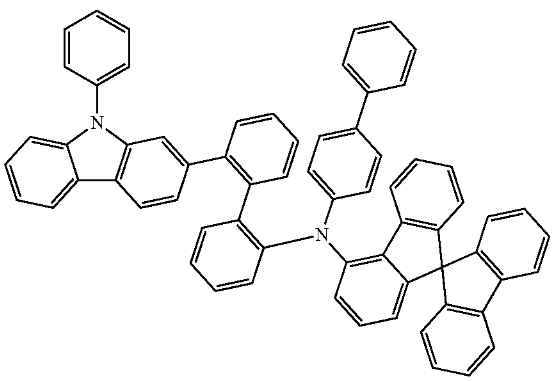
1-32
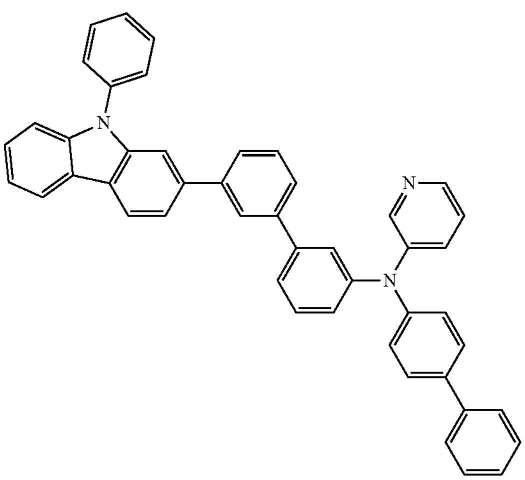
1-33
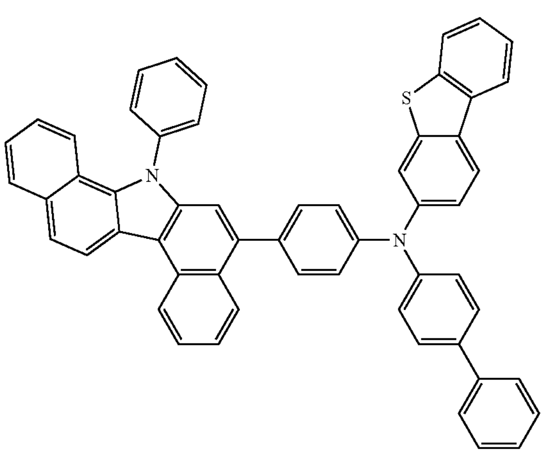
-continued
1-34
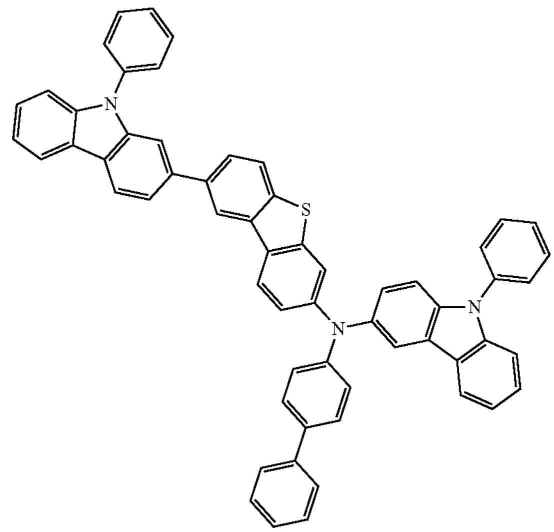
1-35
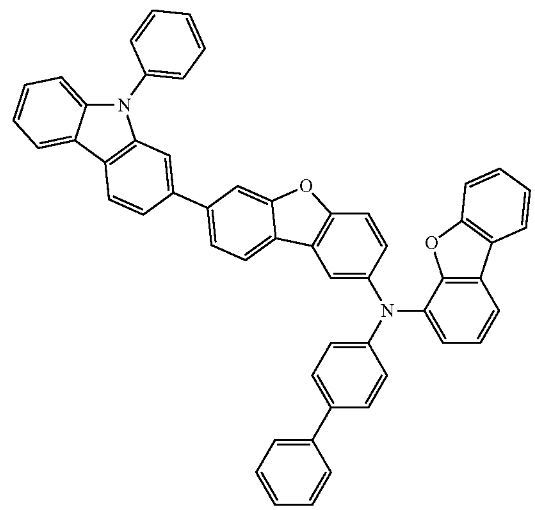
1-36
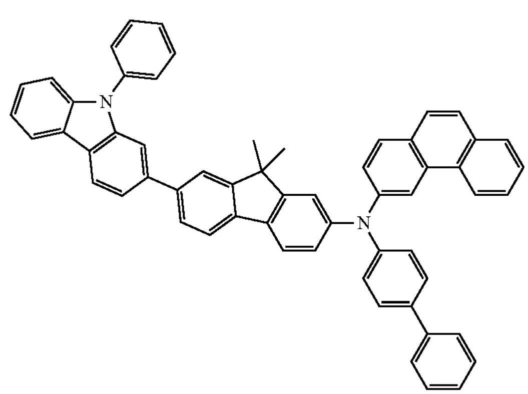

-continued
1-37
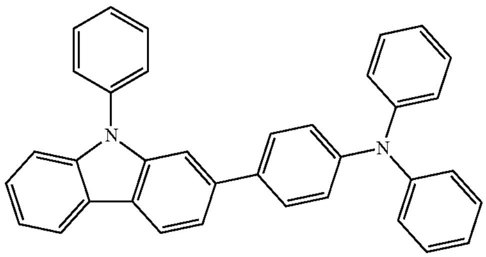
1-38
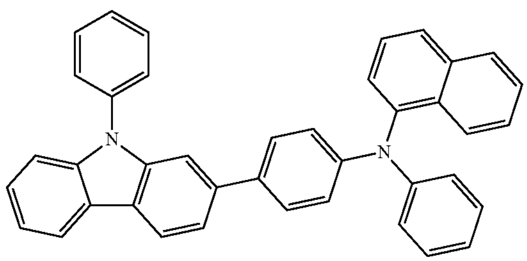
1-39
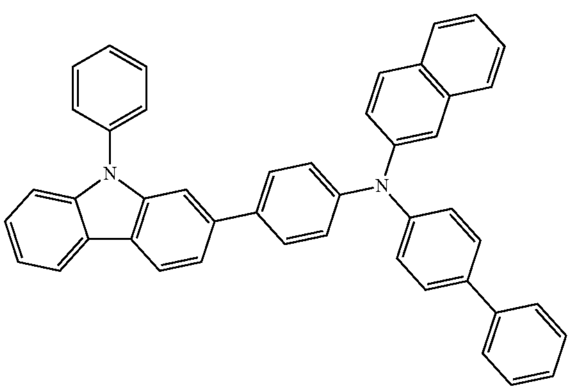
1-40
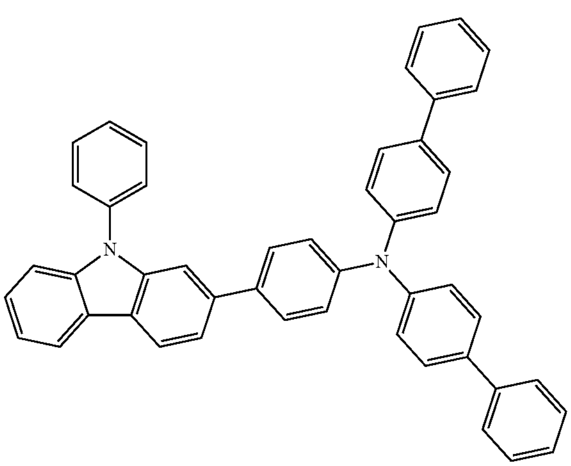
-continued
1-41
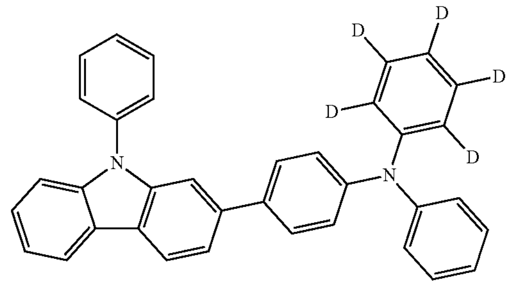
1-42
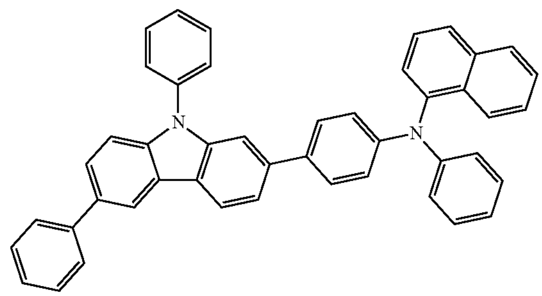
1-43
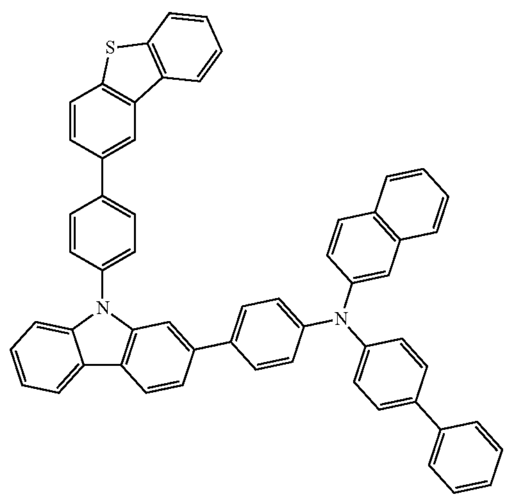
1-44
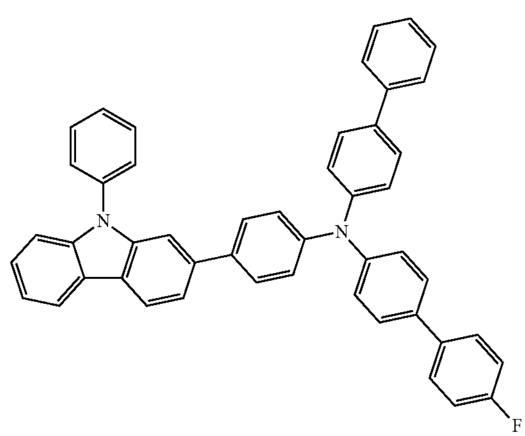

1-45
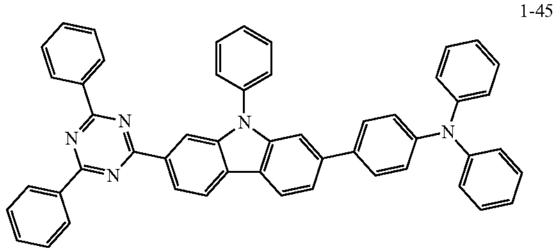
1-46
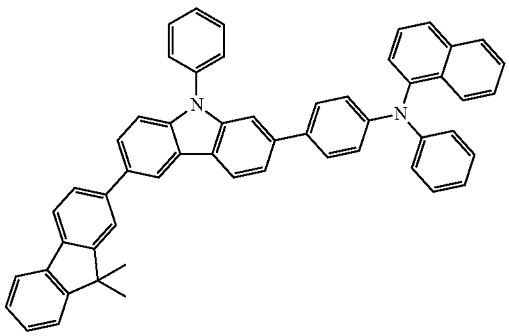
1-47
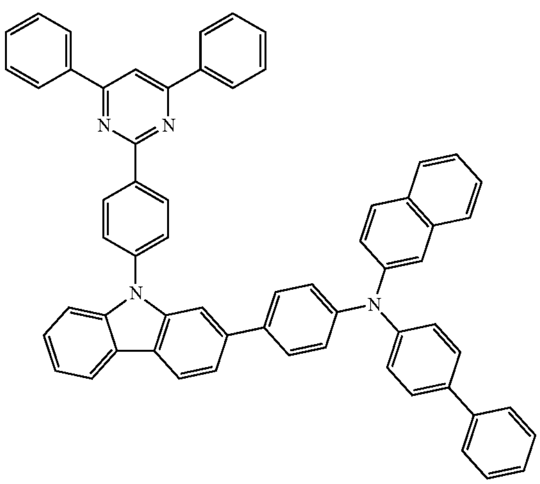
1-48
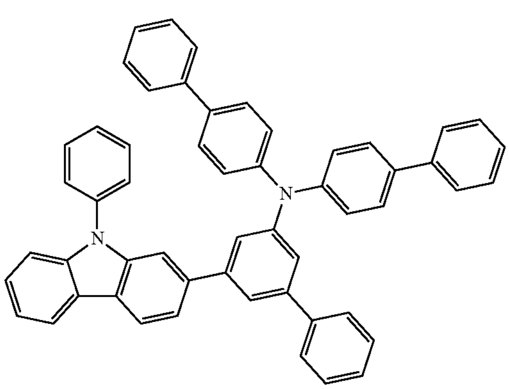
1-49
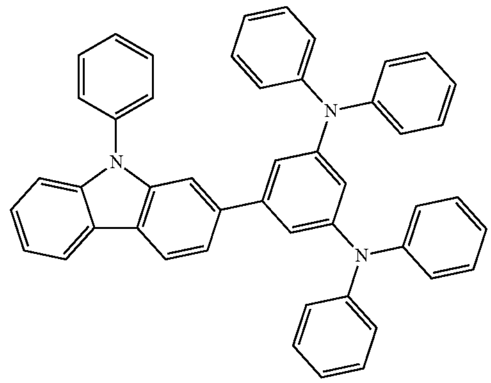
1-50
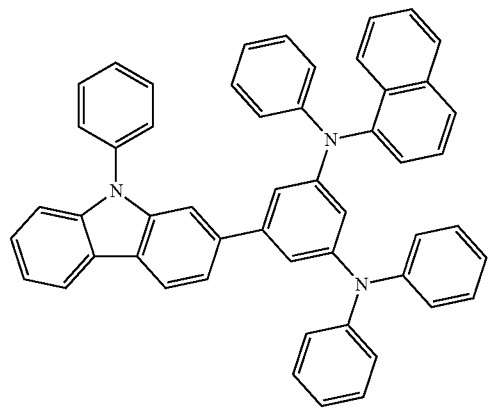
1-51
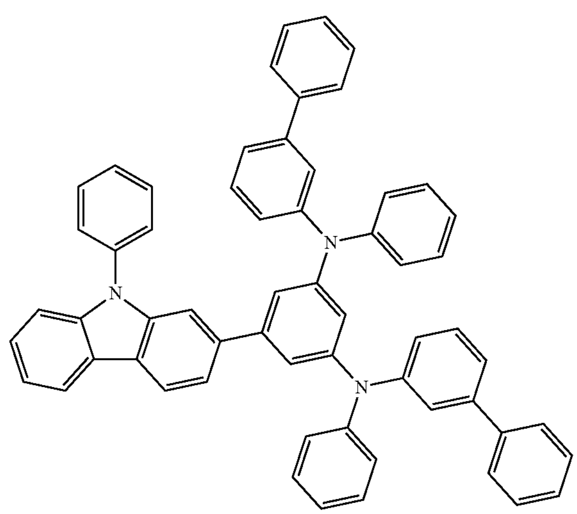

-continued
1-52
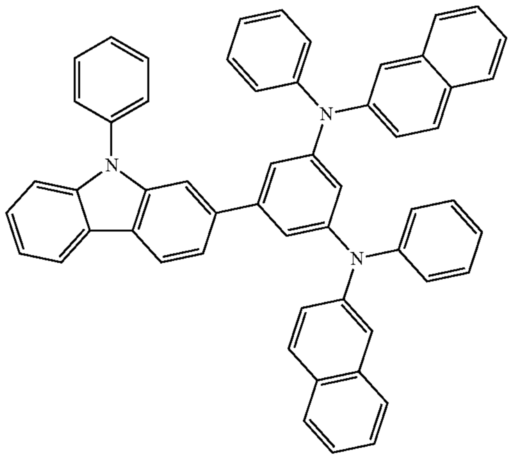
1-53
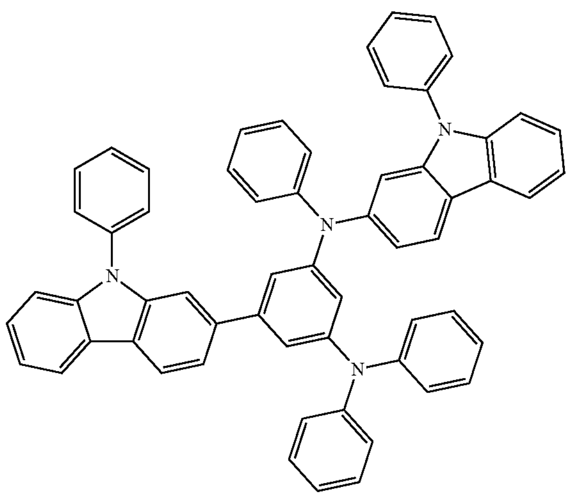
1-54
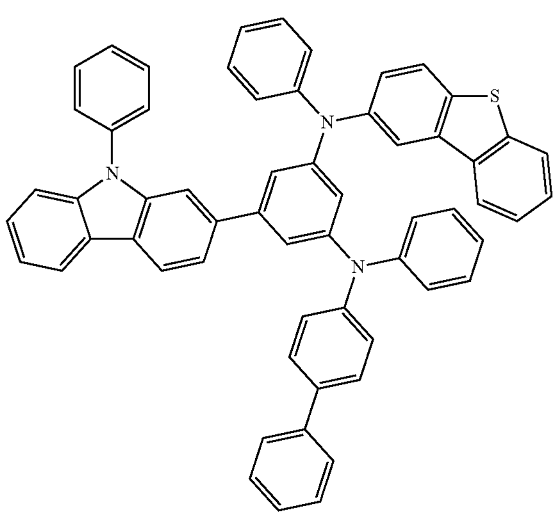
-continued
1-55
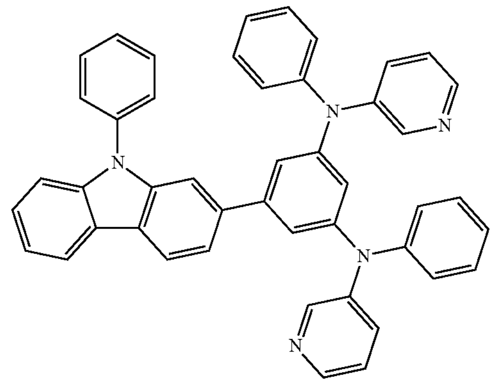
1-56
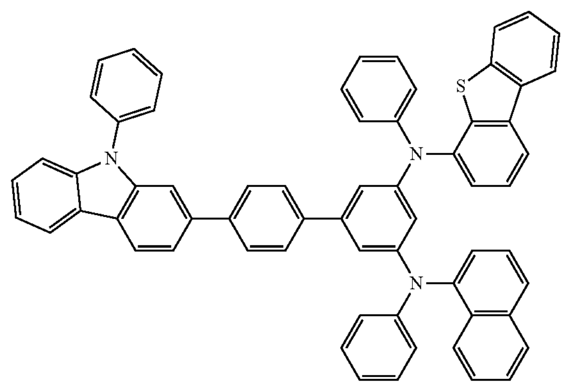
1-57
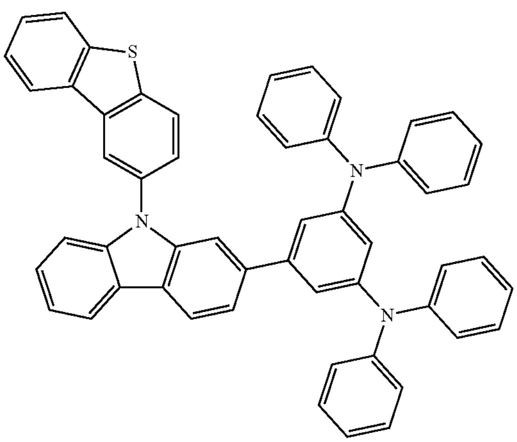
1-58
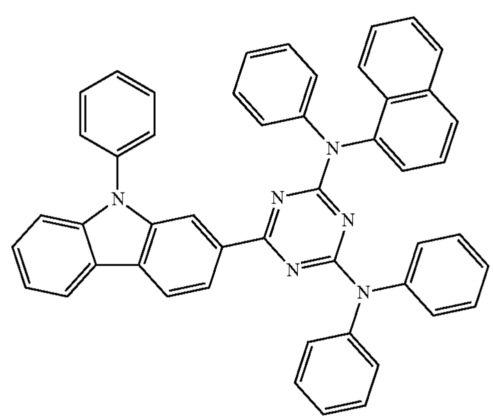

1-59
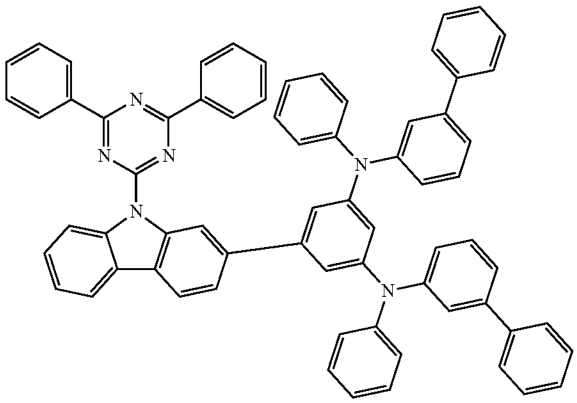
1-60
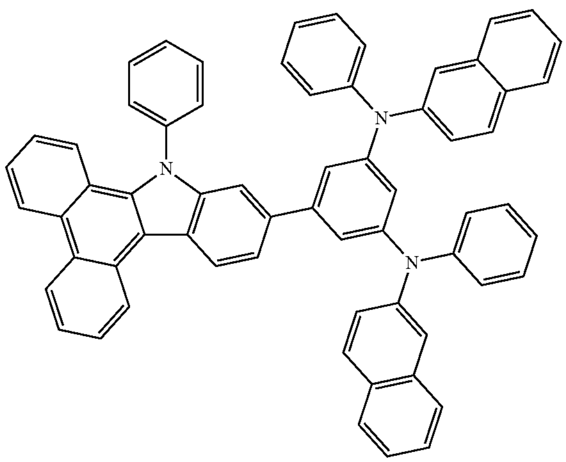
1-61
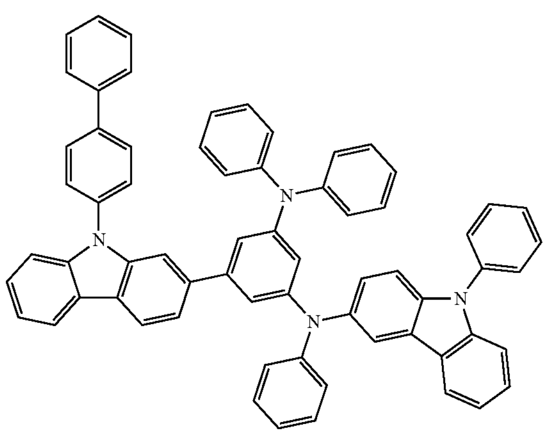
1-62
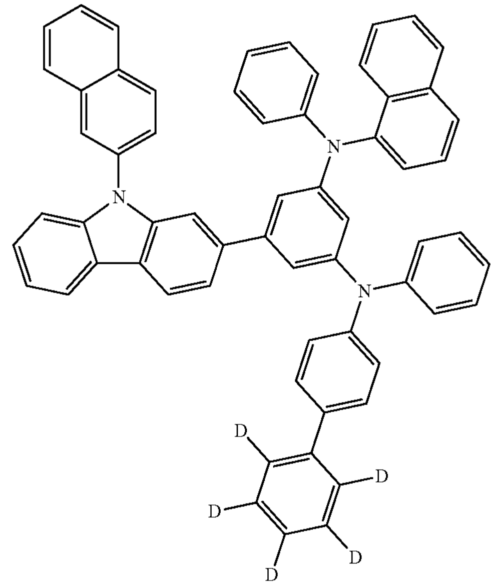
1-63
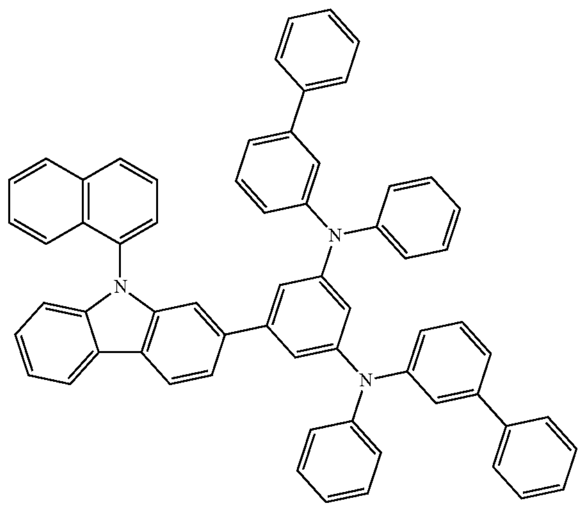
1-64
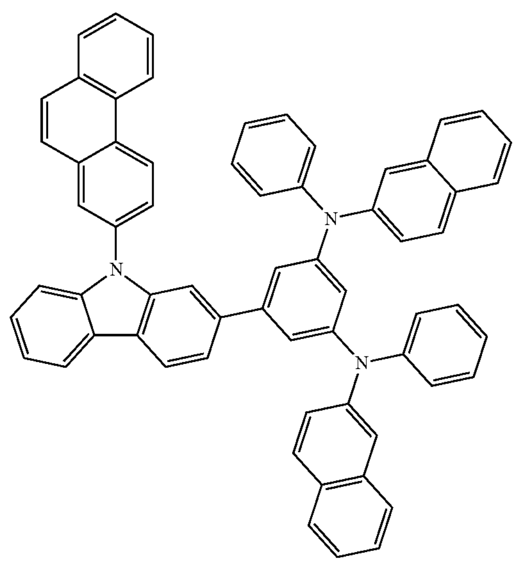

1-65
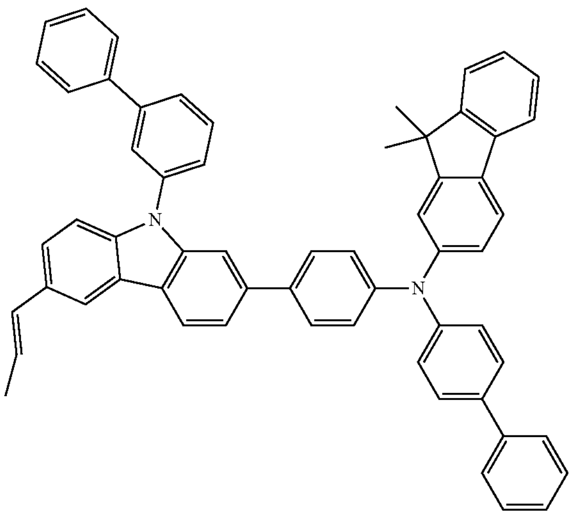
1-66
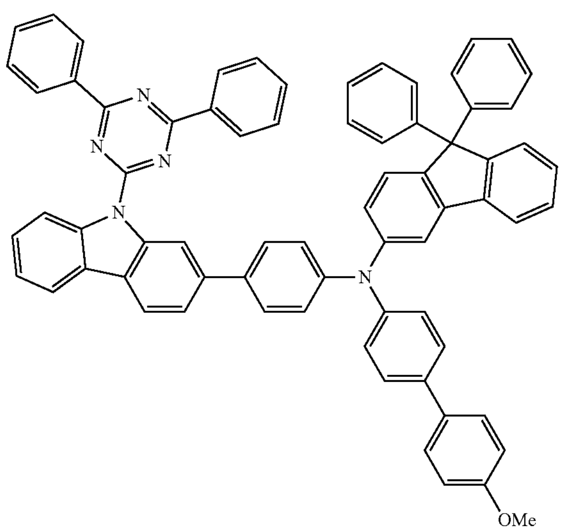
1-67
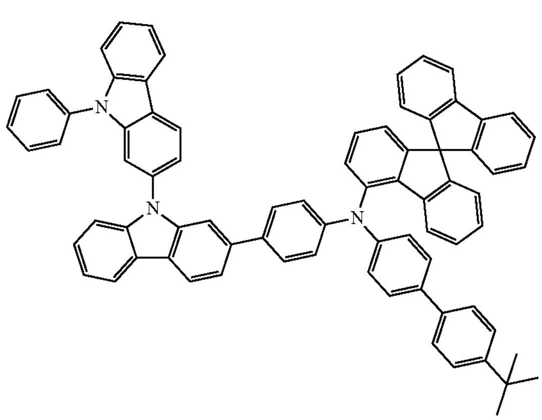
1-68
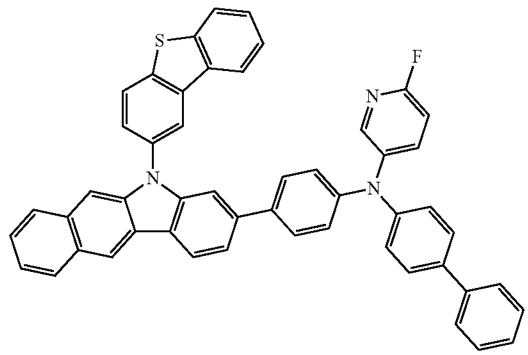
1-69
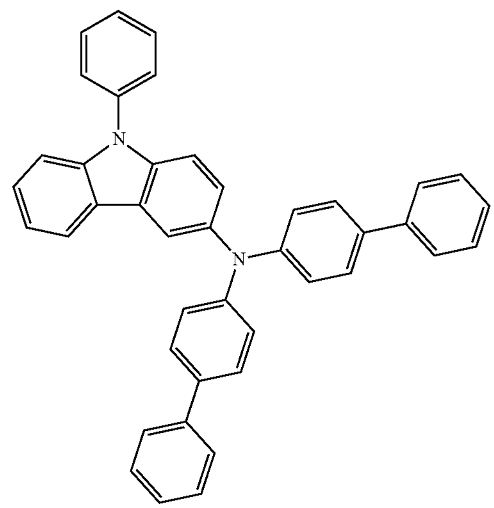
1-70
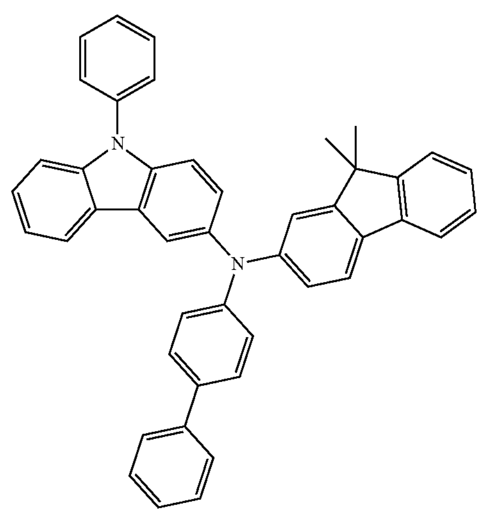

-continued
1-71
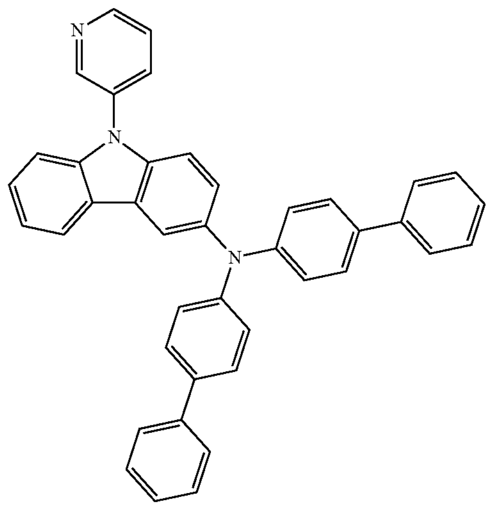
1-72
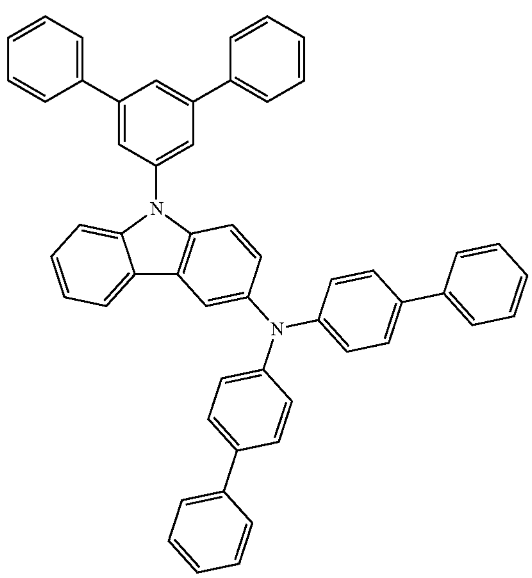
-continued
1-73
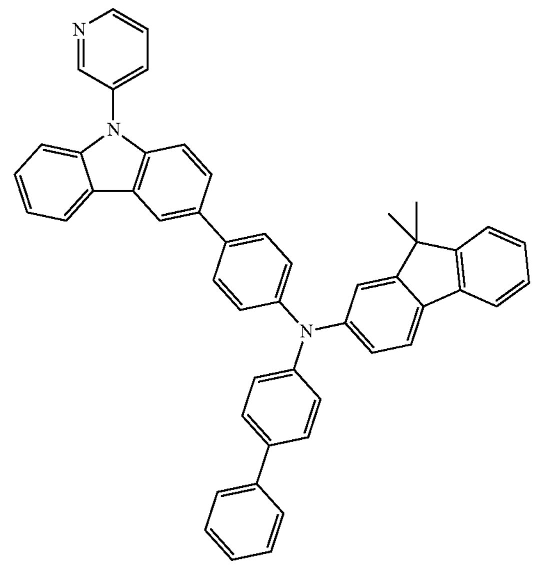
1-74
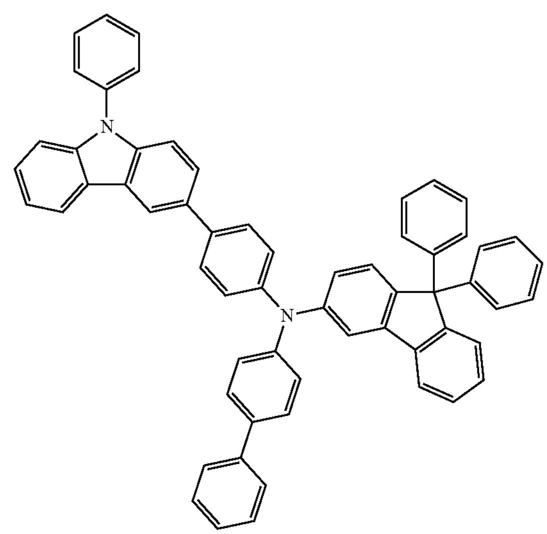

-continued
1-75
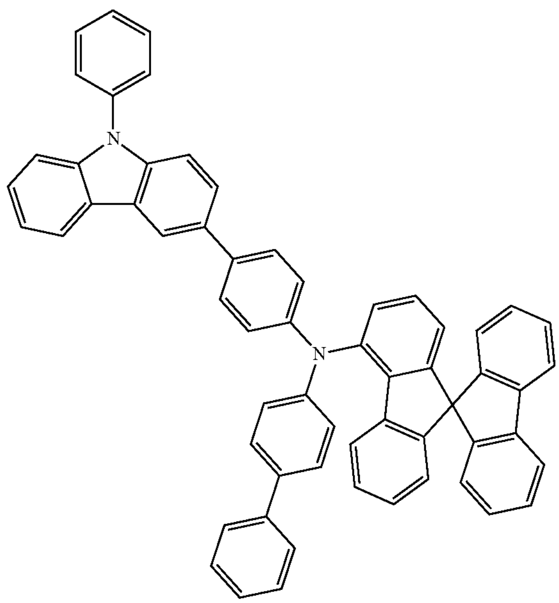
1-76
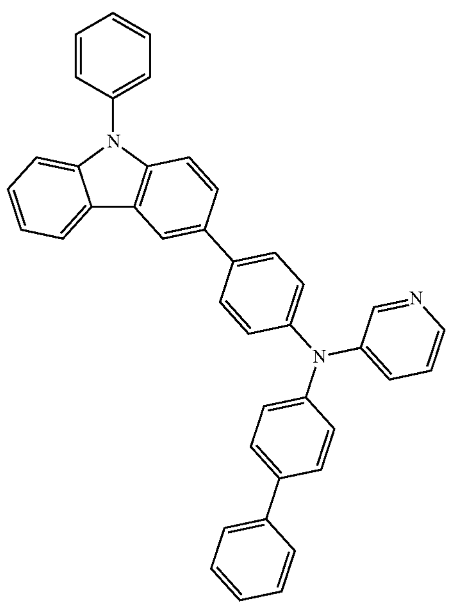
1-77
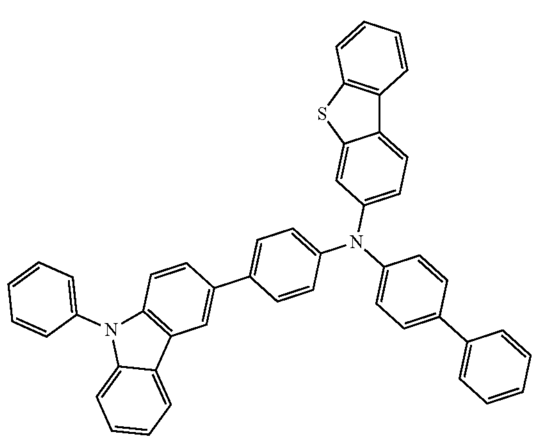
-continued
1-78
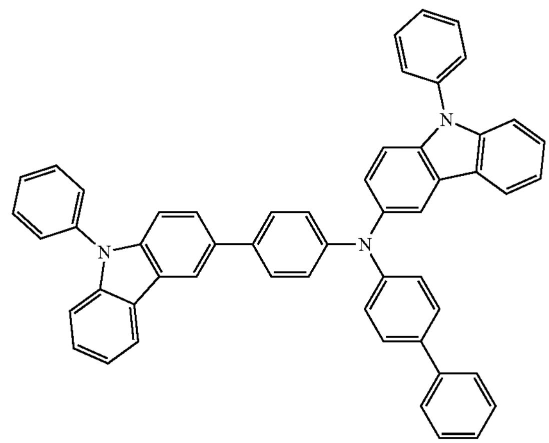
1-79
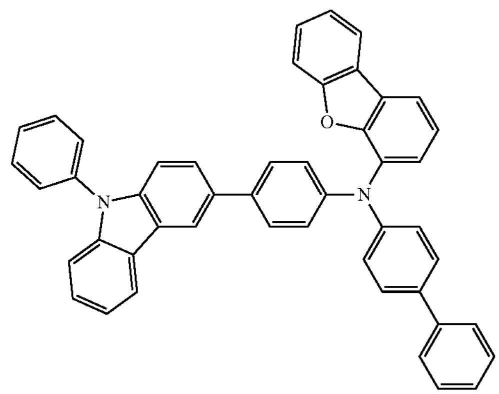
1-80
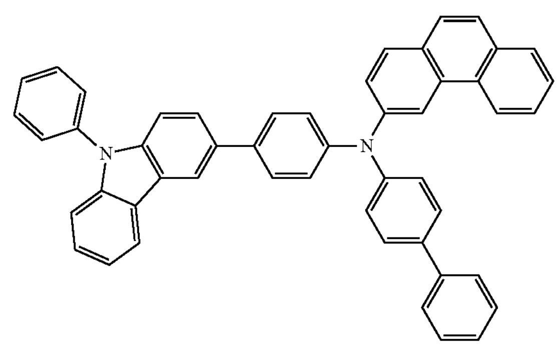
1-81
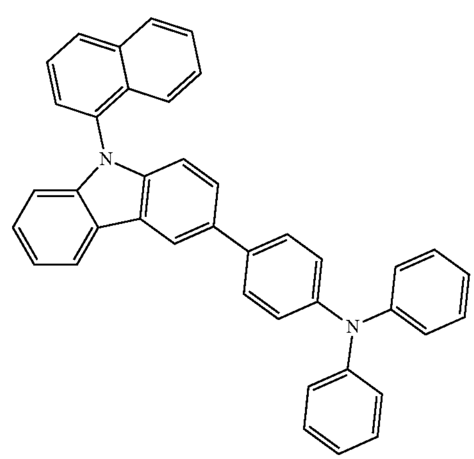

-continued
1-82
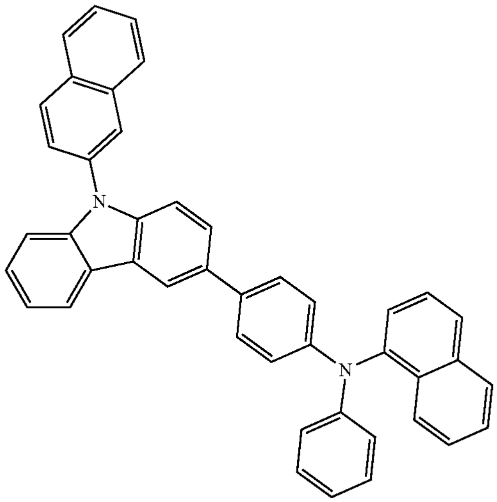
1-83
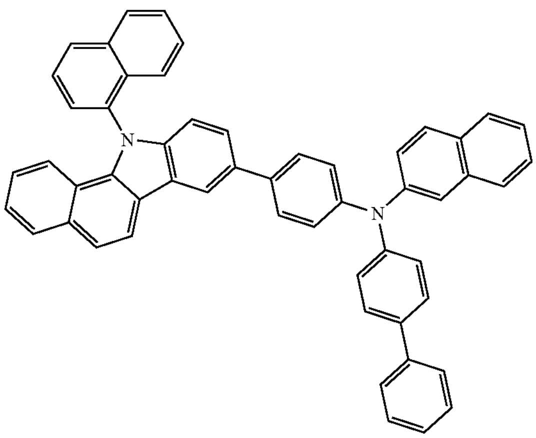
1-84
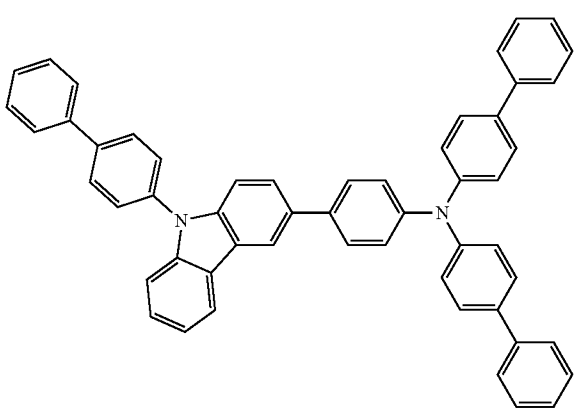
-continued
1-85
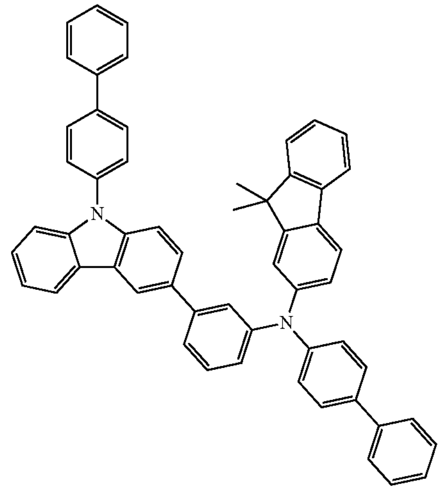
1-86
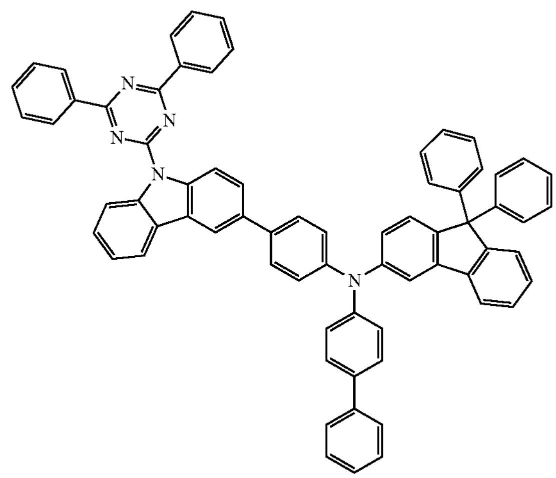
1-87
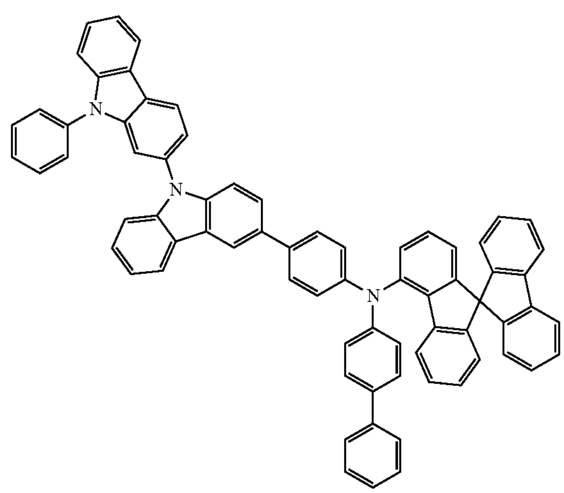

-continued
1-88
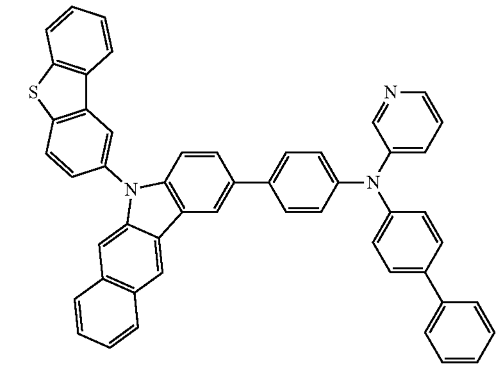
1-89
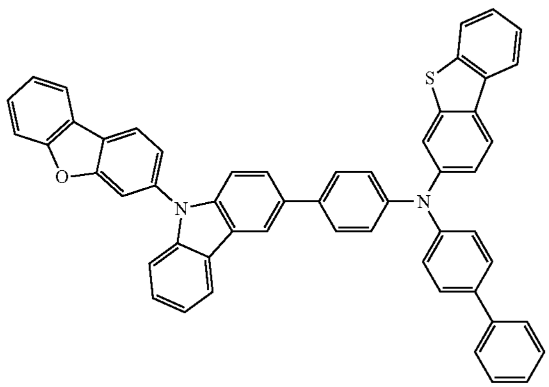
1-90
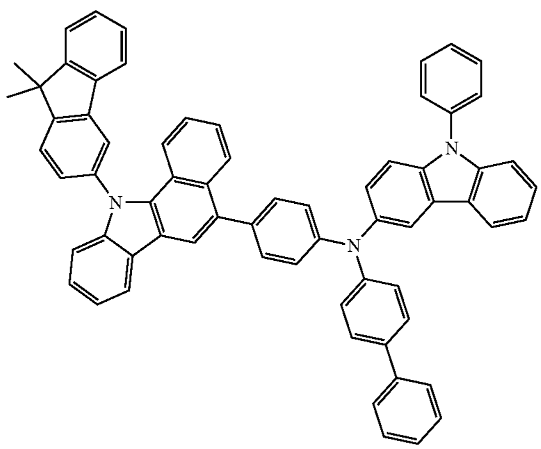
1-91
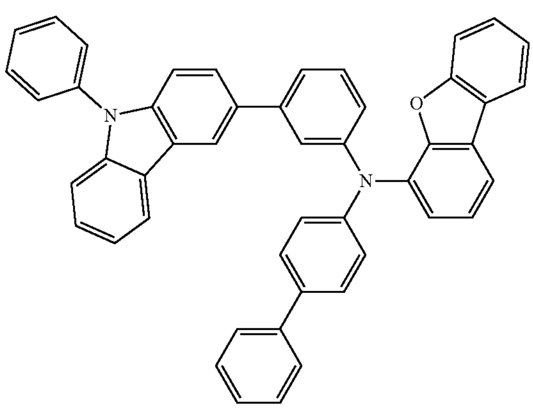
-continued
1-92
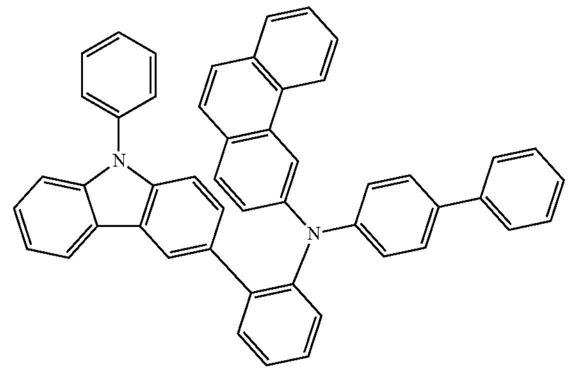
1-93
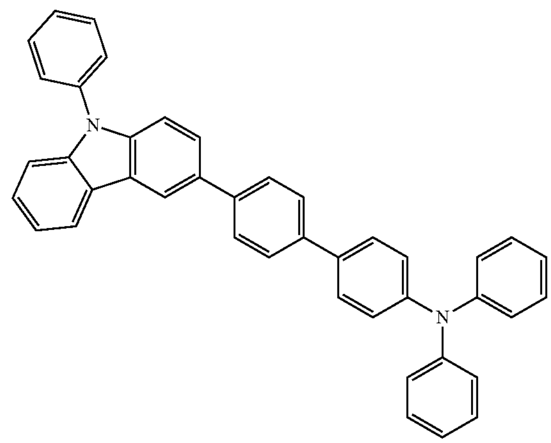
1-94
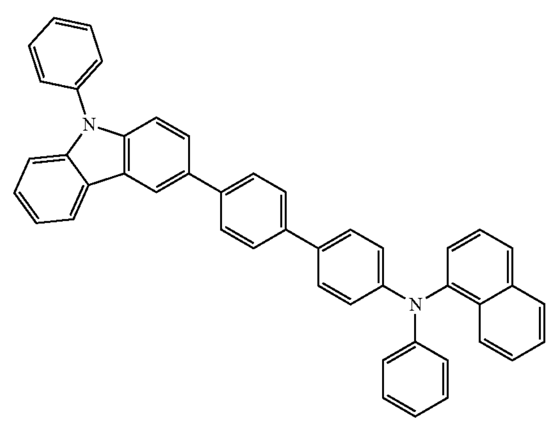

-continued
1-95
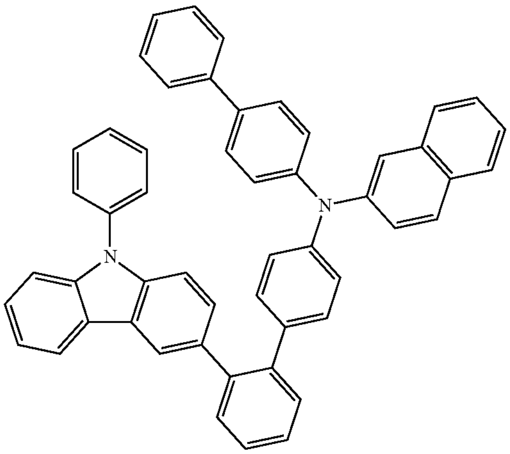
1-96
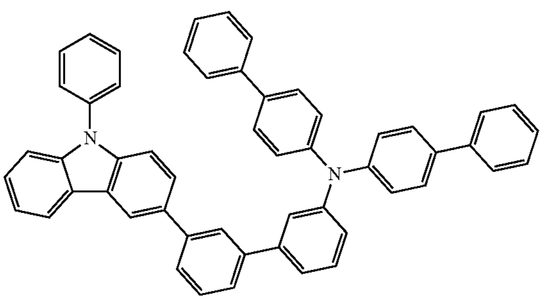
1-97
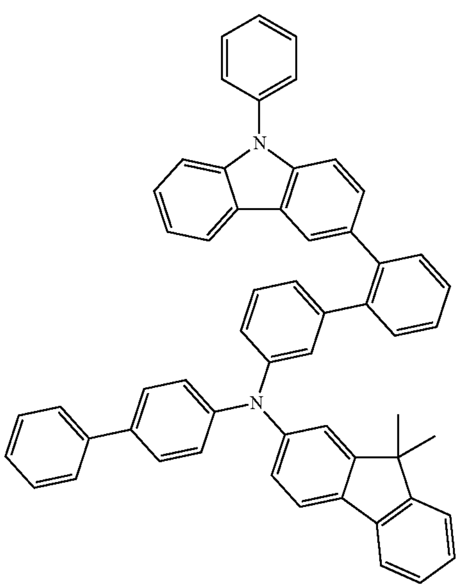
-continued
1-98
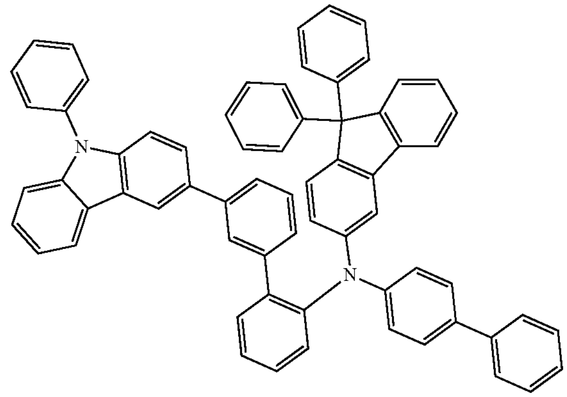
1-99
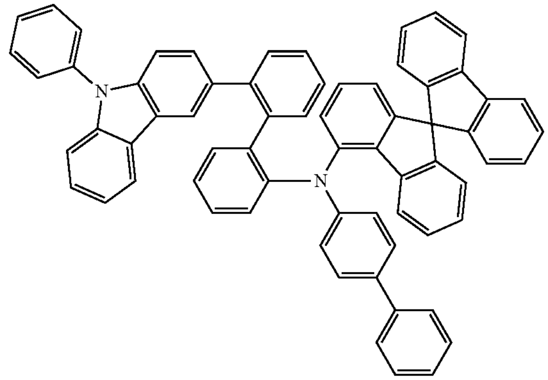
1-100
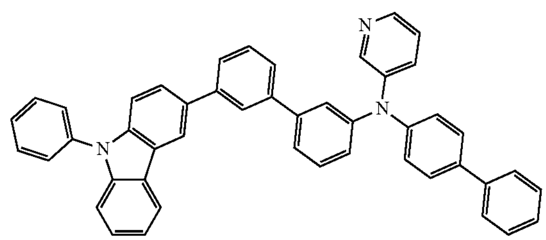
1-101
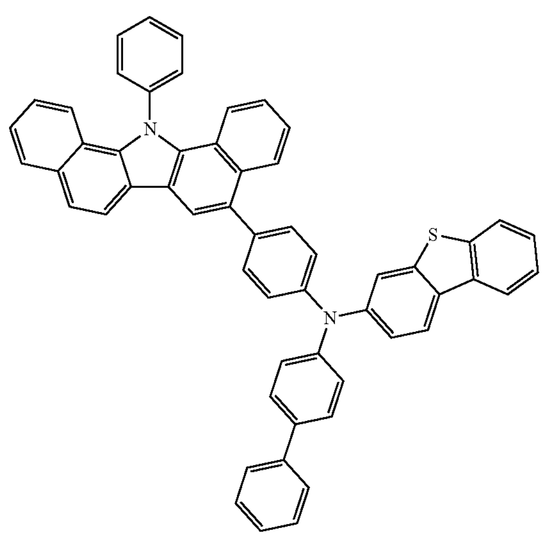

-continued
1-102
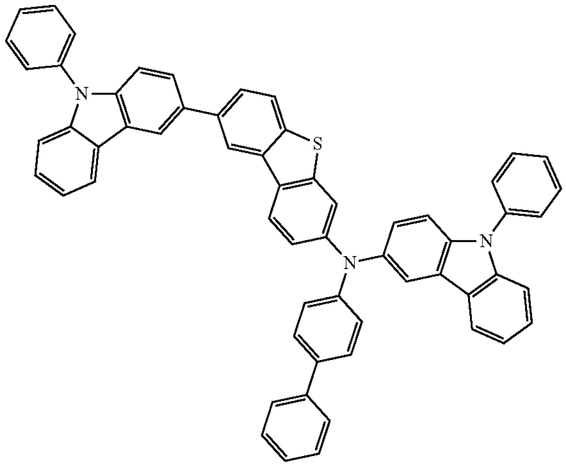
1-103
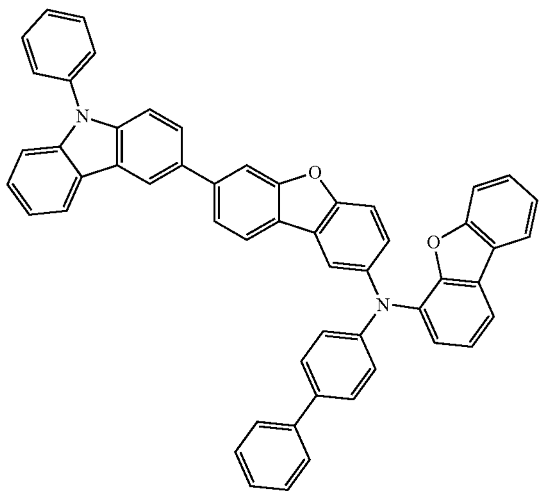
1-104
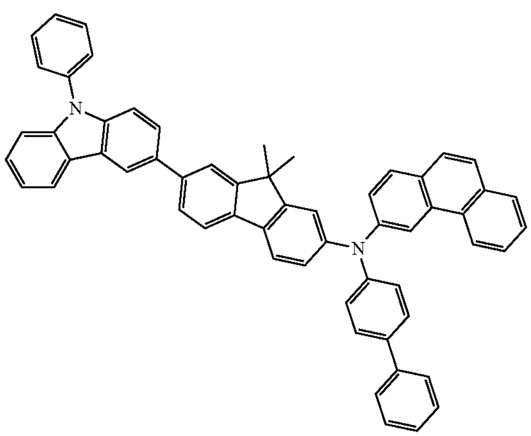
-continued
1-105
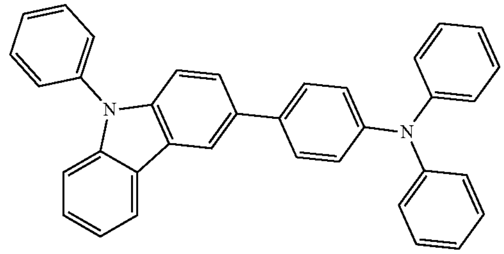
1-106
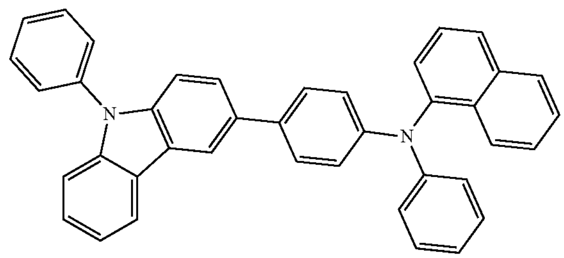
1-107
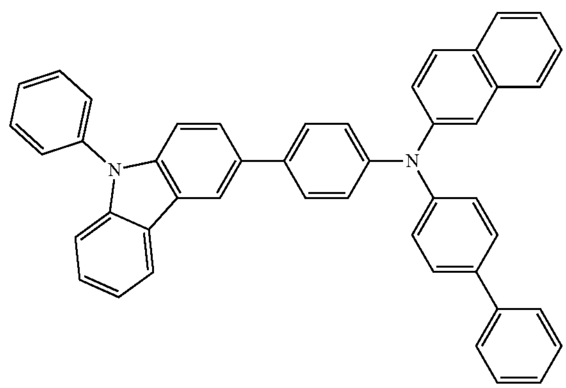
1-108
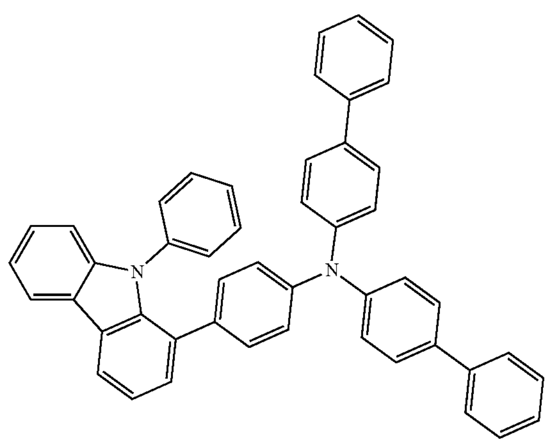

-continued
1-109
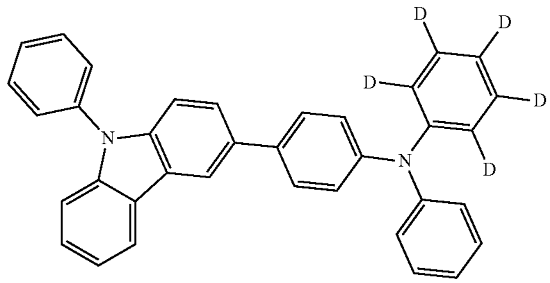
1-110
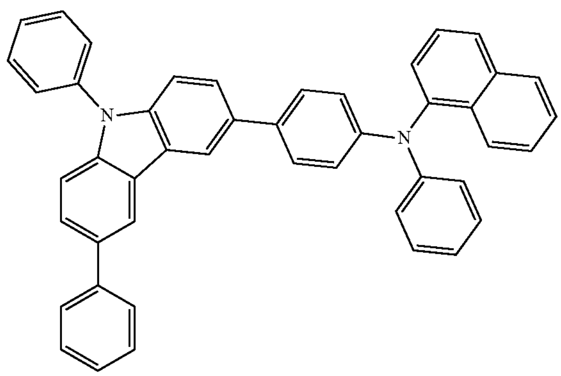
1-111
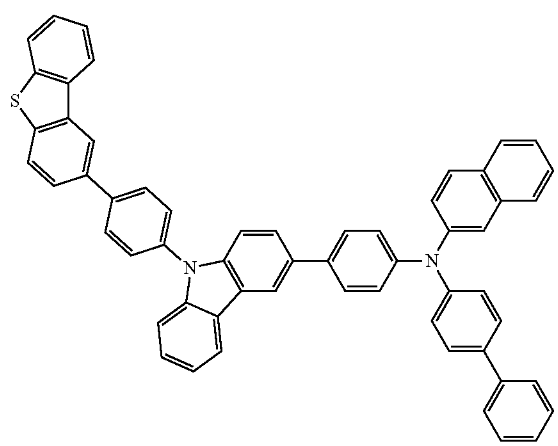
-continued
1-112
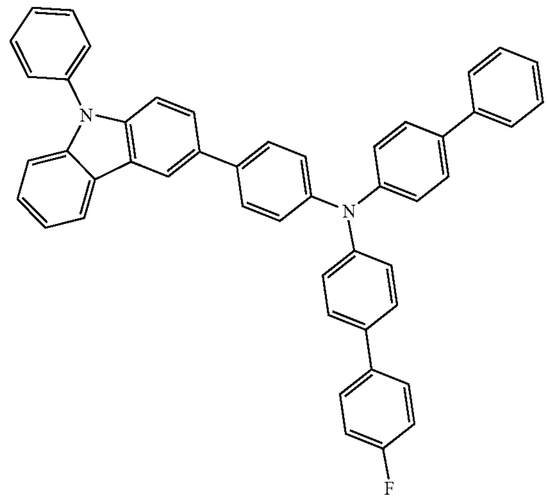
1-113
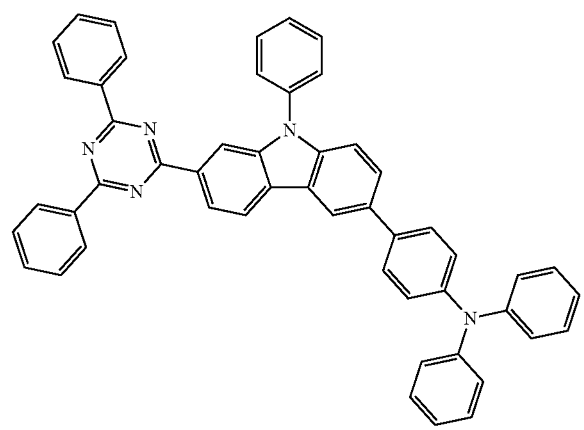
1-114
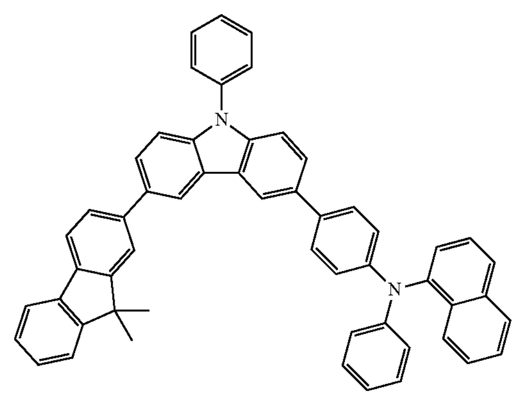

-continued
1-115
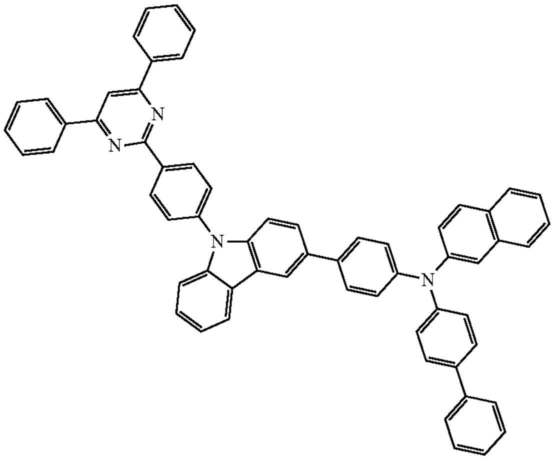
1-116
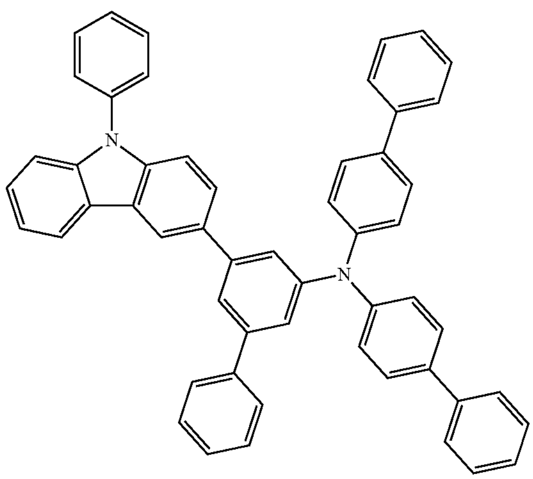
1-117
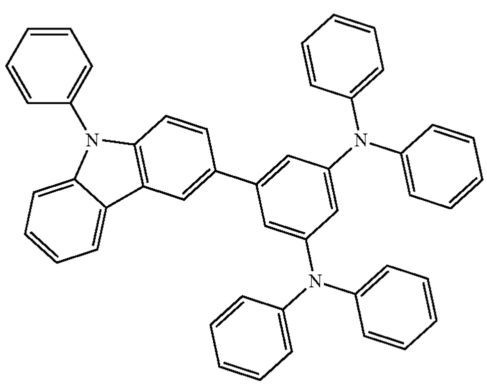
-continued
1-118
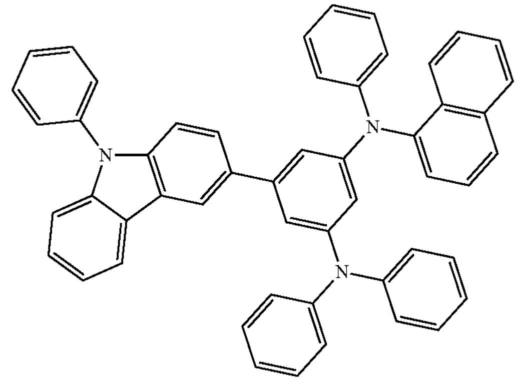
1-119
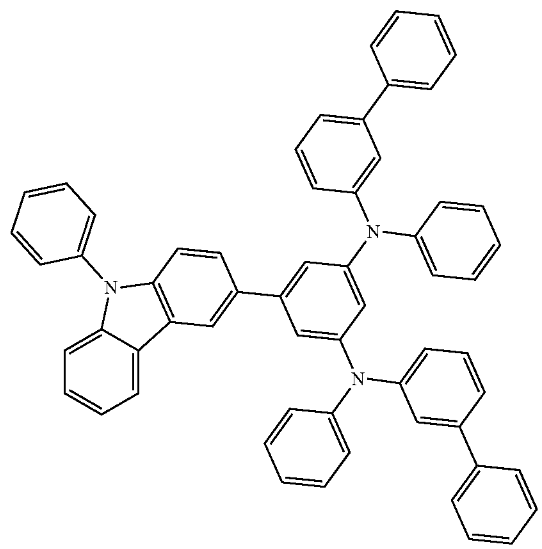
1-120
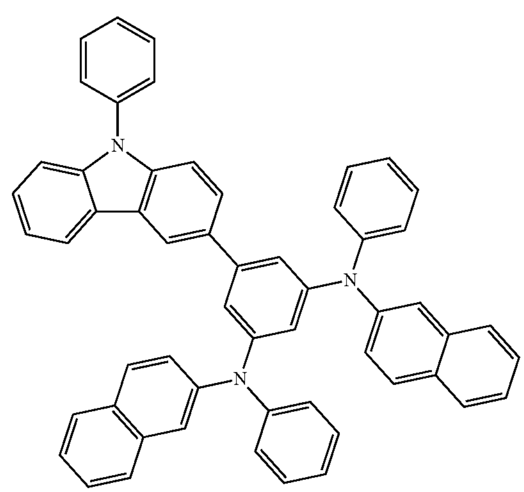

-continued
1-121
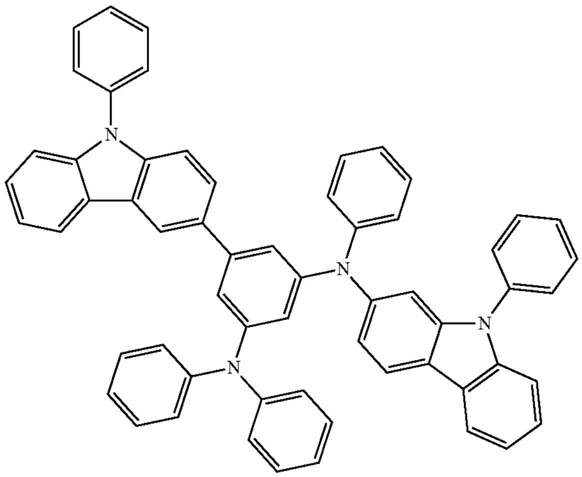
1-122
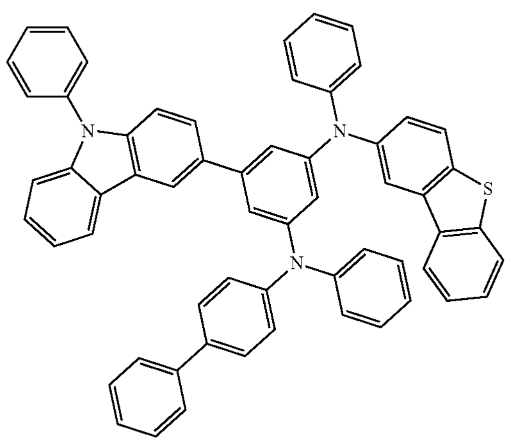
1-123
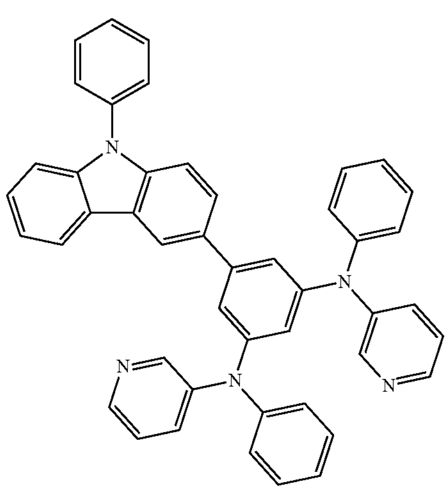
-continued
1-124
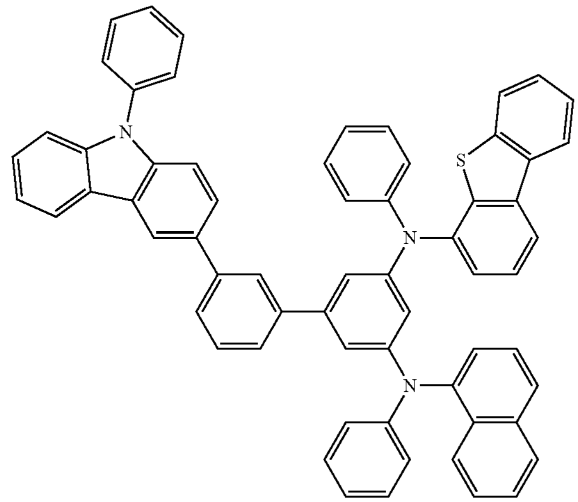
1-125
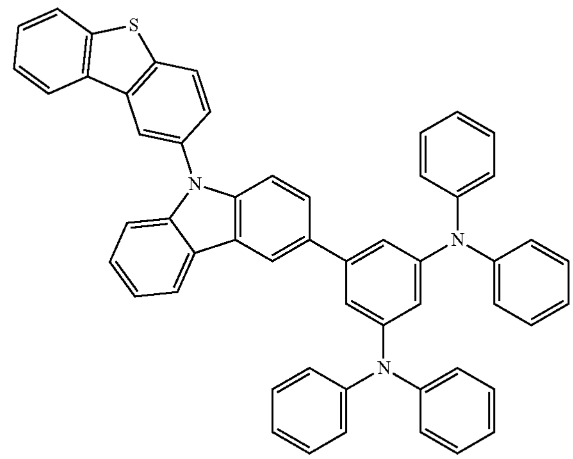
1-126
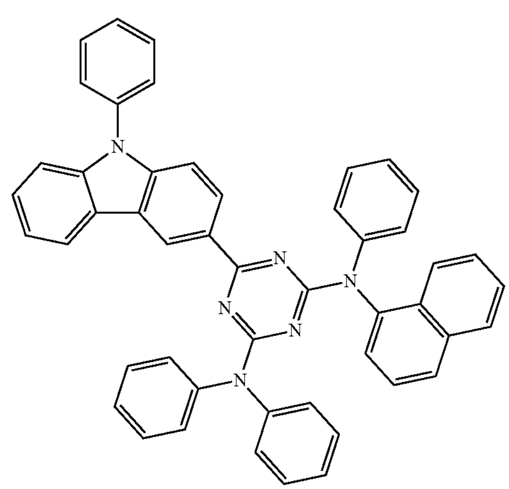

-continued
1-127
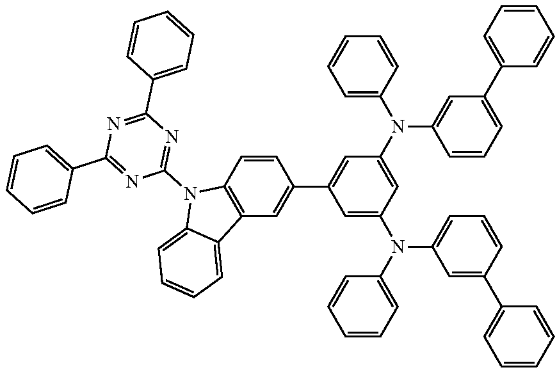
1-128
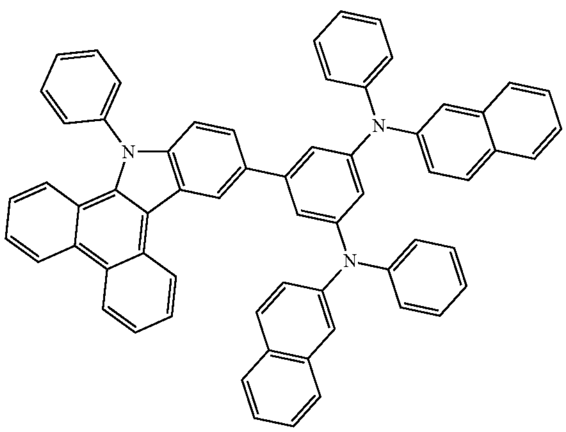
1-129
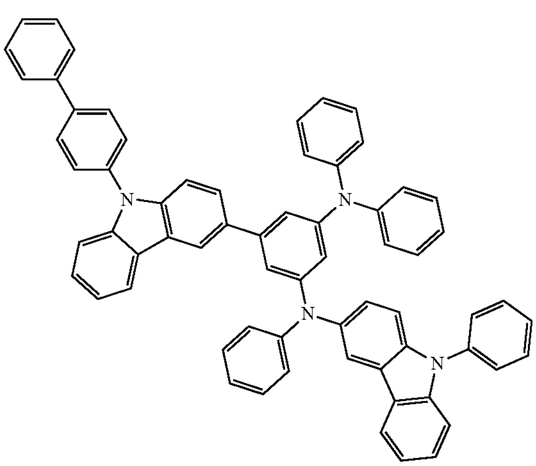
-continued
1-130
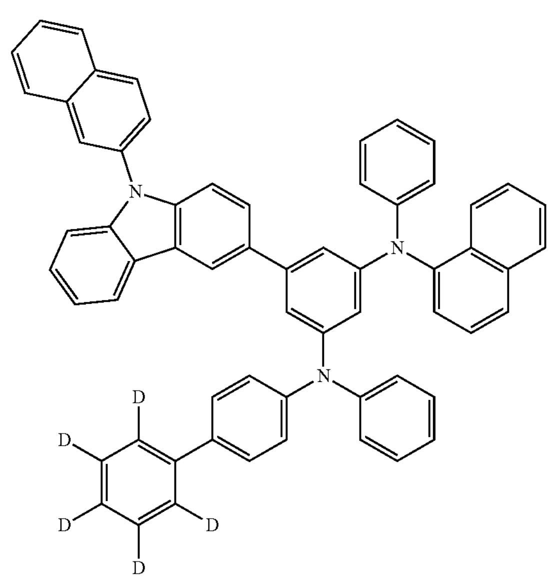
1-131
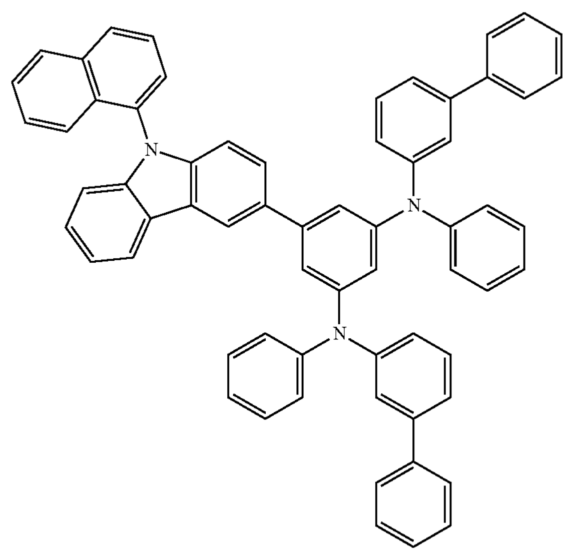
1-132
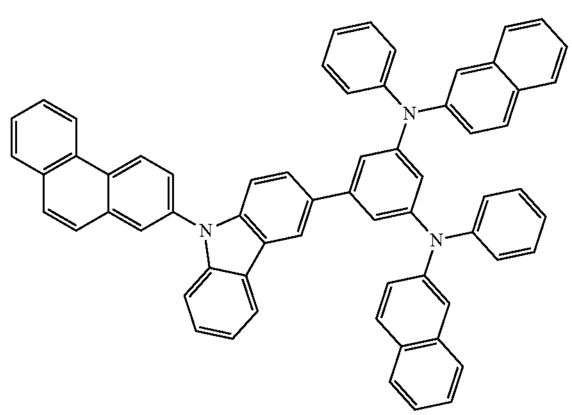

1-133
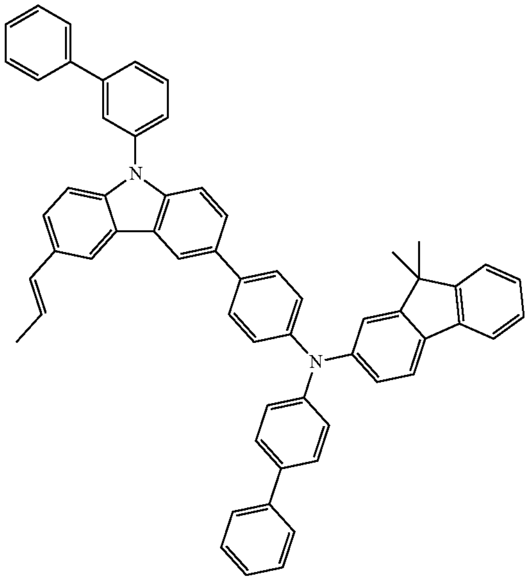
1-134
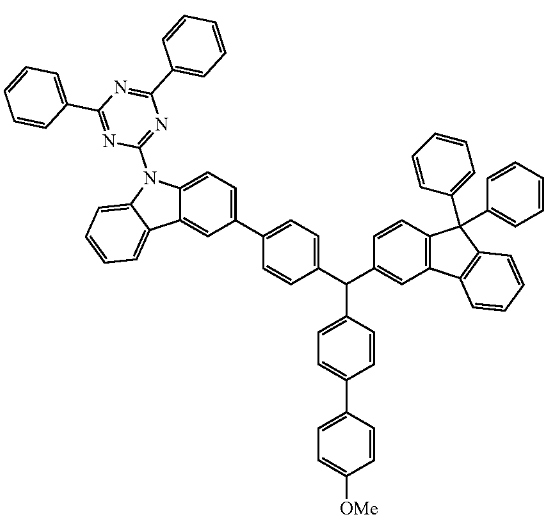
1-135
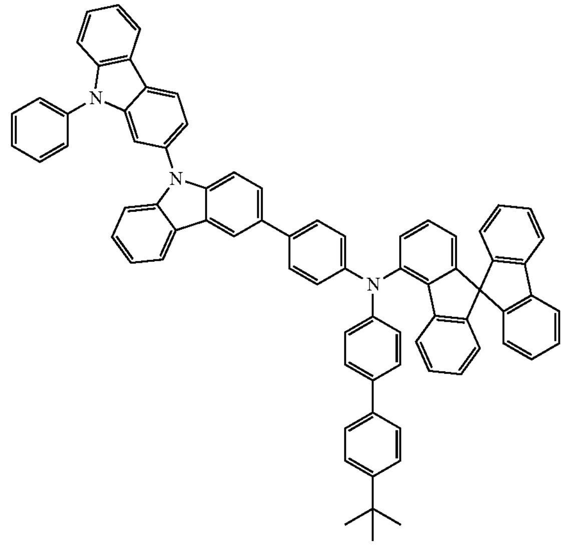
1-136
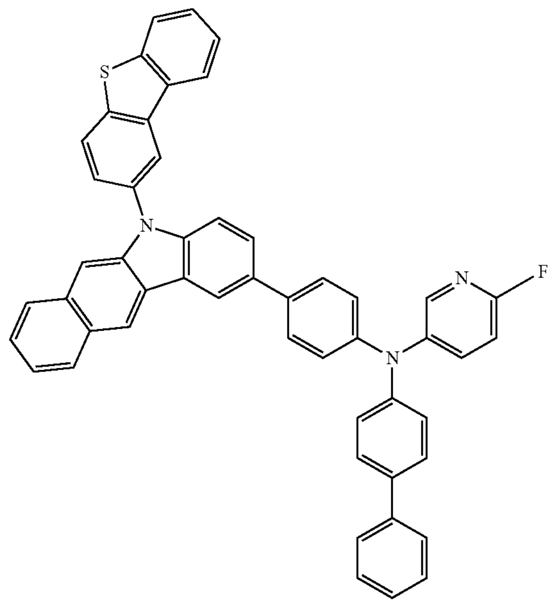
1-137
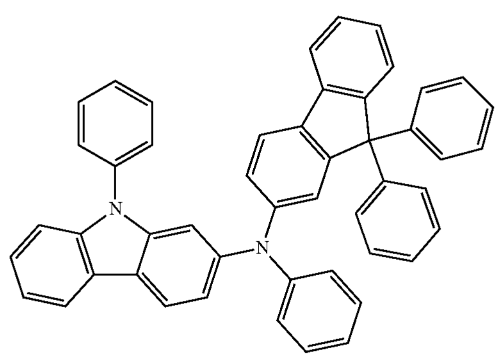

-continued
2-1
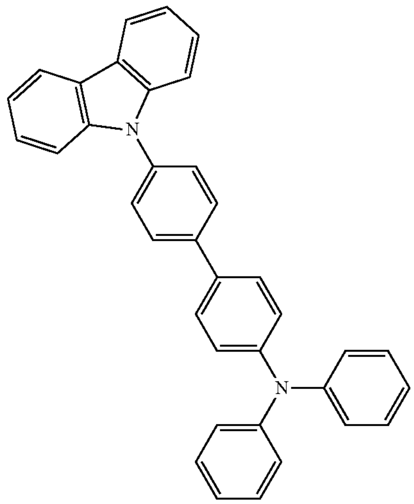
2-2
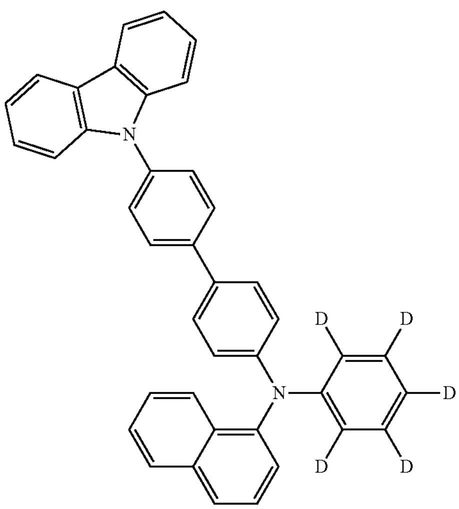
2-3
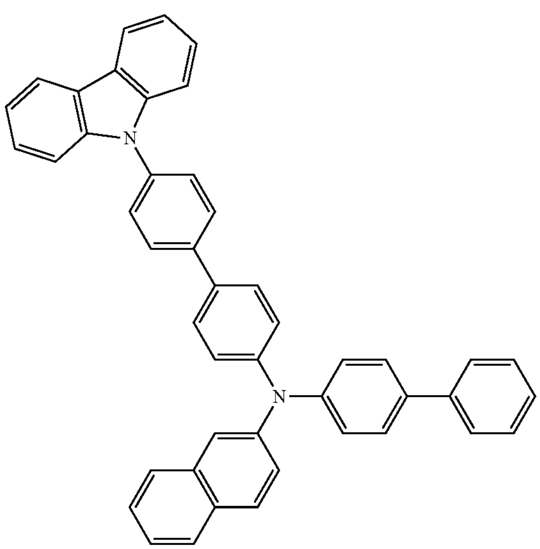
-continued
2-4
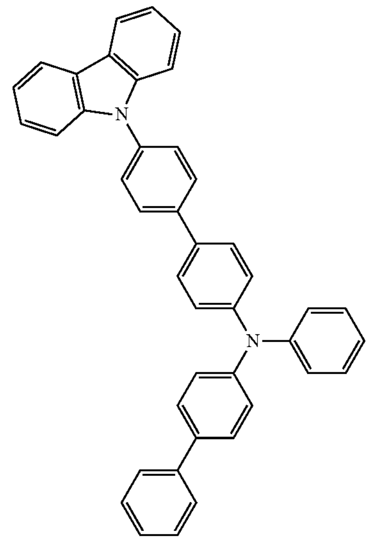
2-5
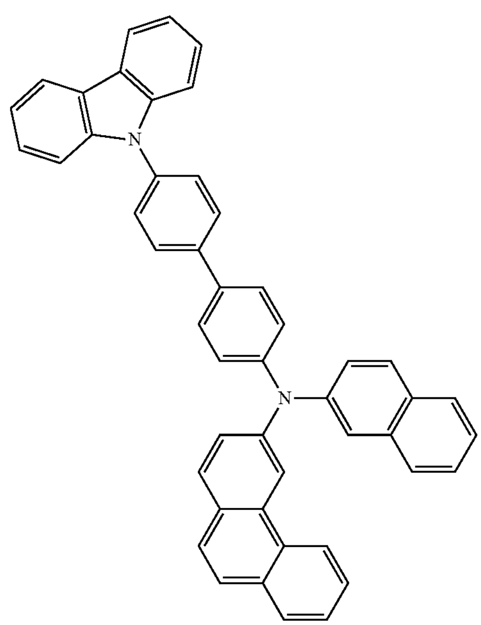

-continued
2-6
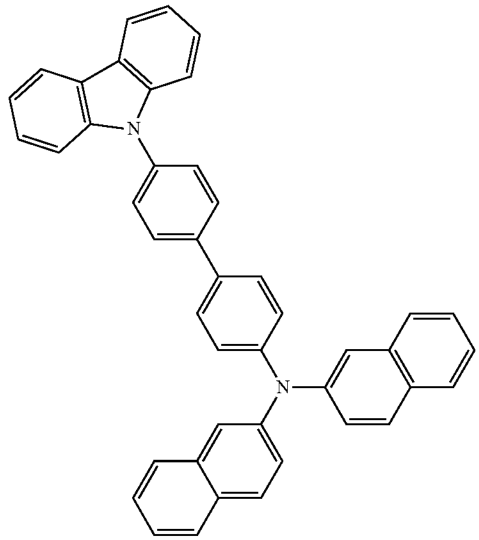
2-7
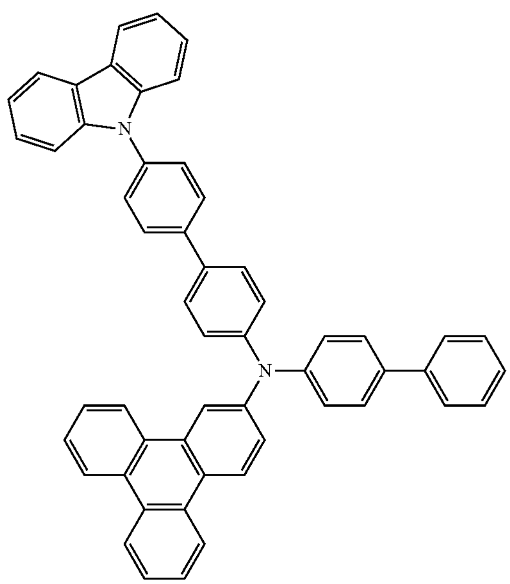
2-8
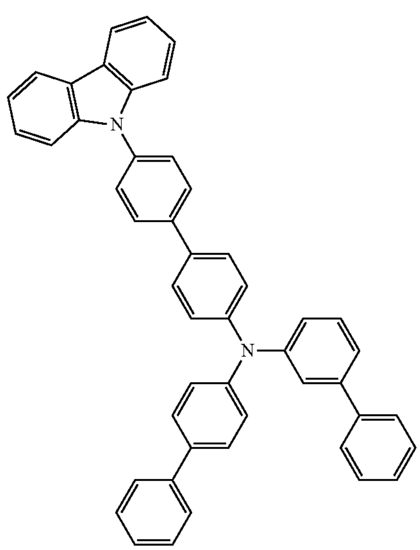
-continued
2-9
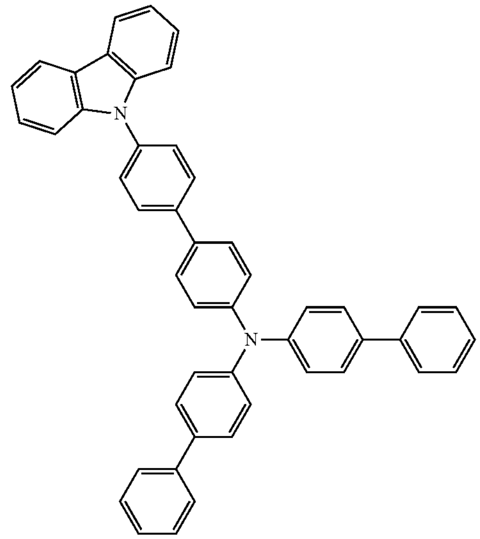
2-10
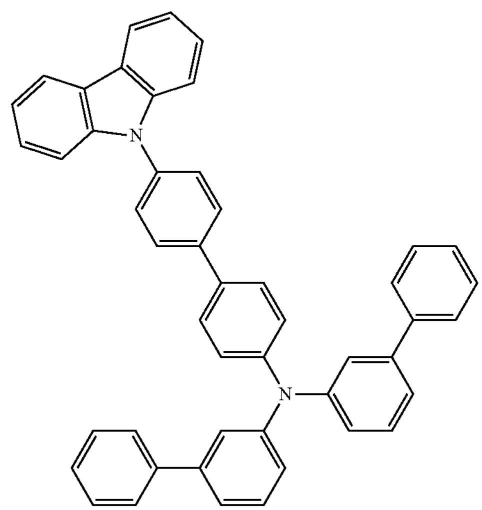
2-11
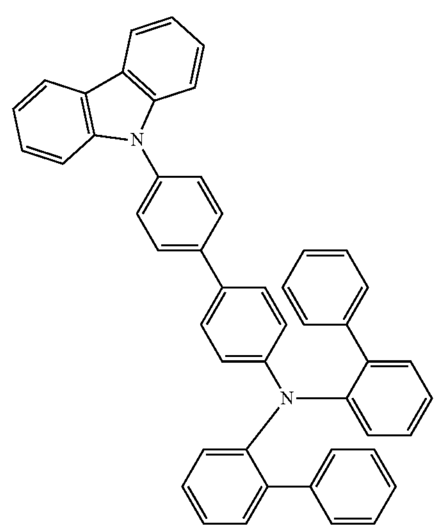

-continued
2-12
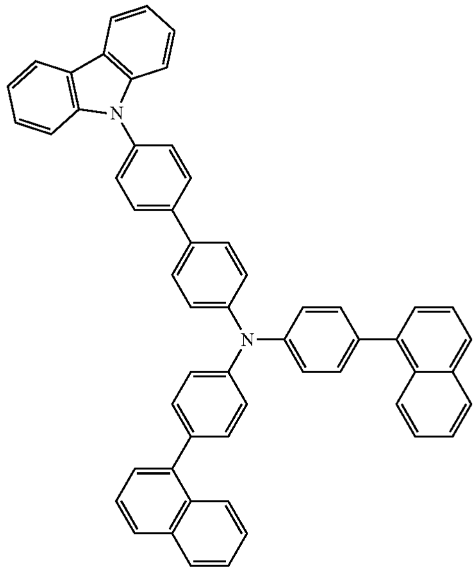
2-13
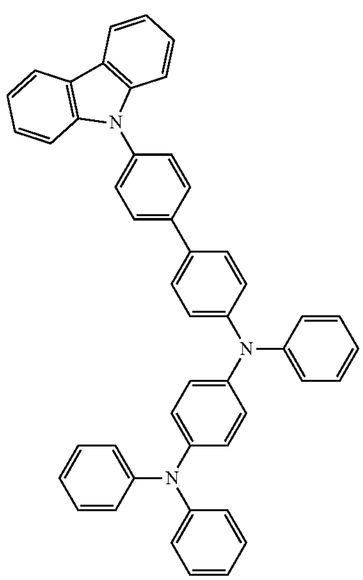
-continued
2-14
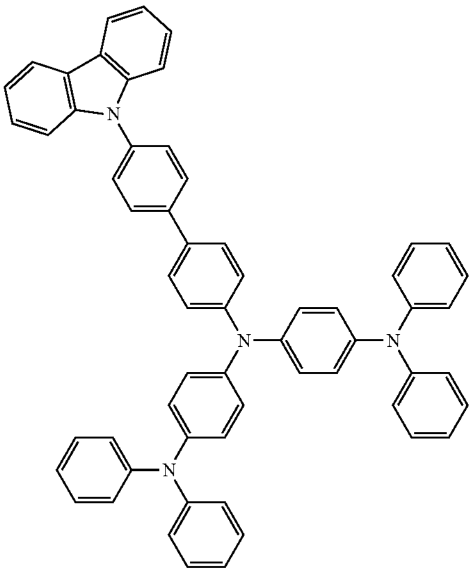
2-15
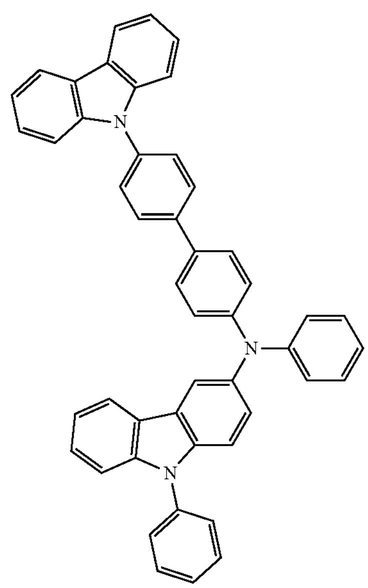

-continued
2-16
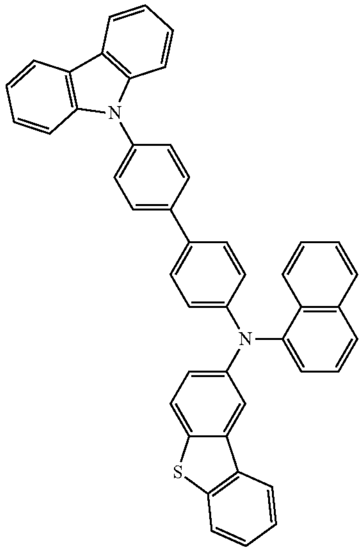
2-17
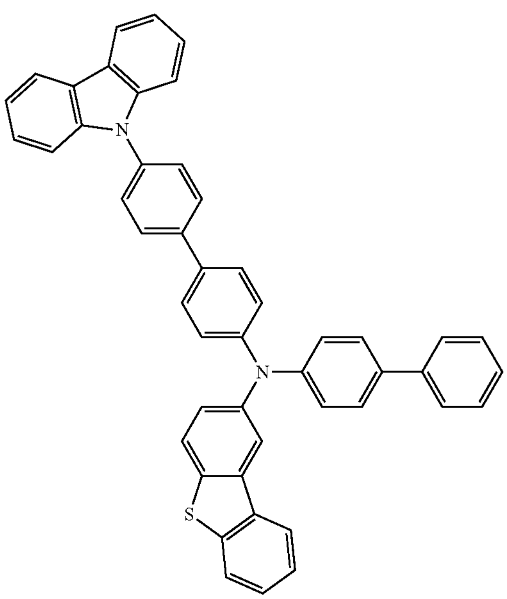
-continued
2-18
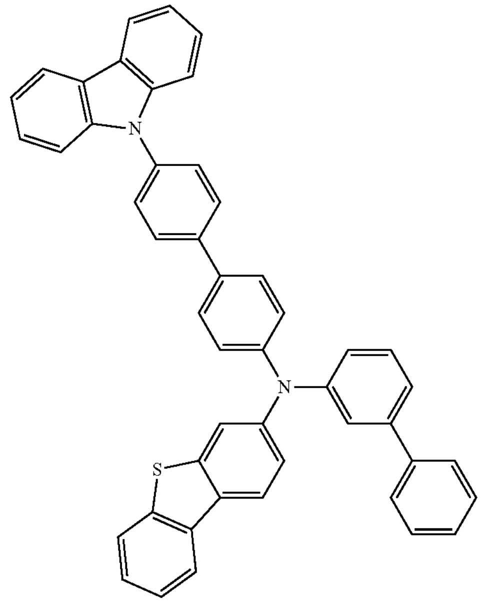
2-19
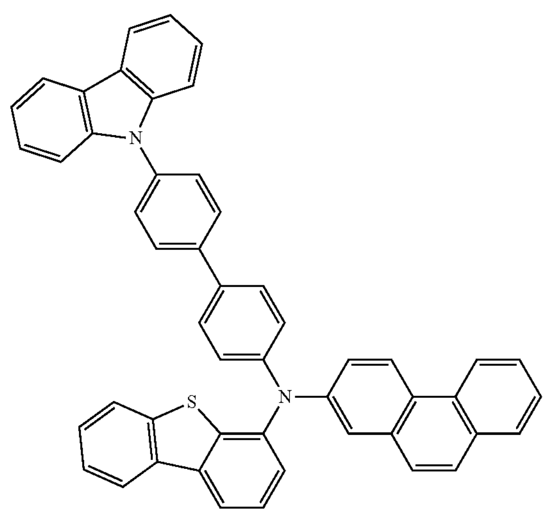

-continued
2-20
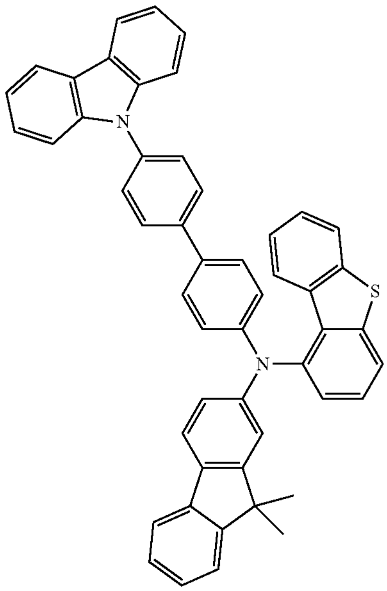
2-21
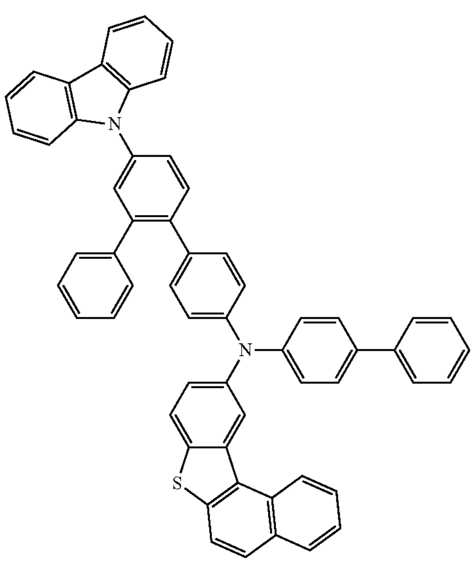
-continued
2-22
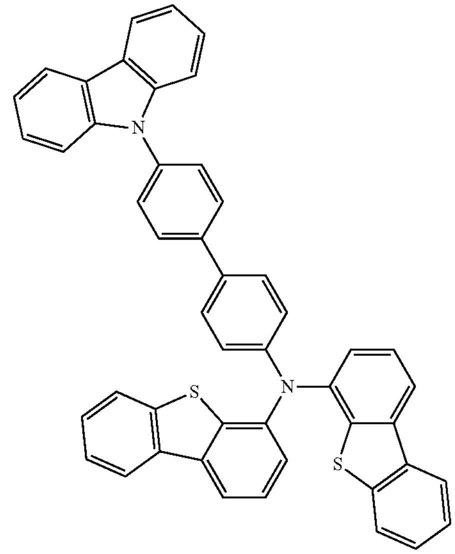
2-23
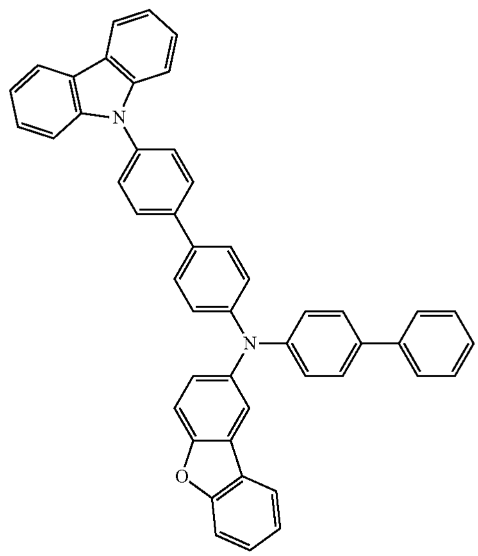
2-24
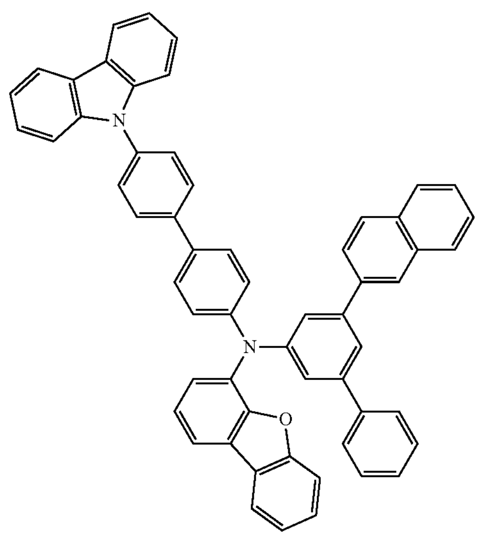

-continued
2-25
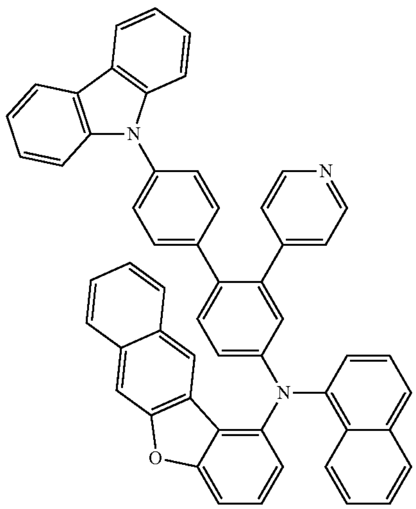
2-26
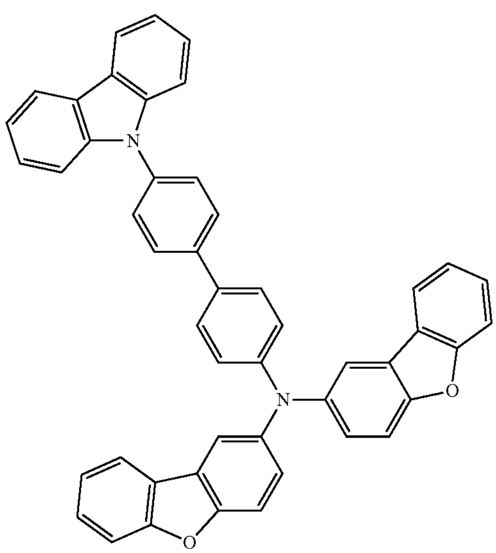
2-27
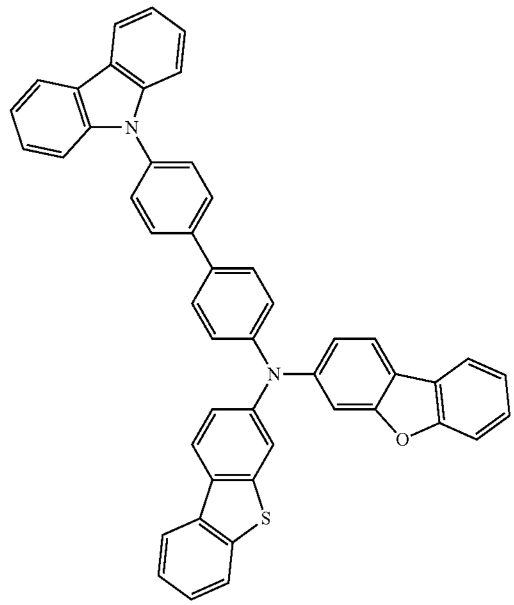
2-28
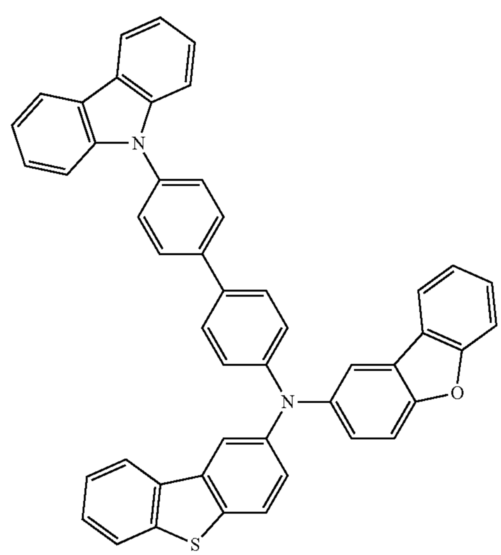

-continued
2-29
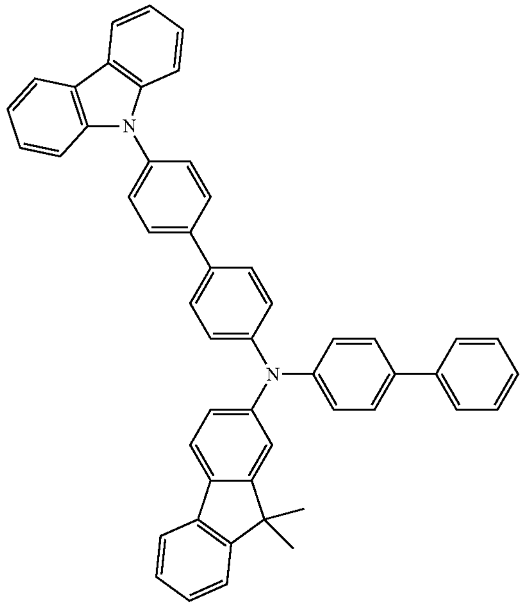
2-30
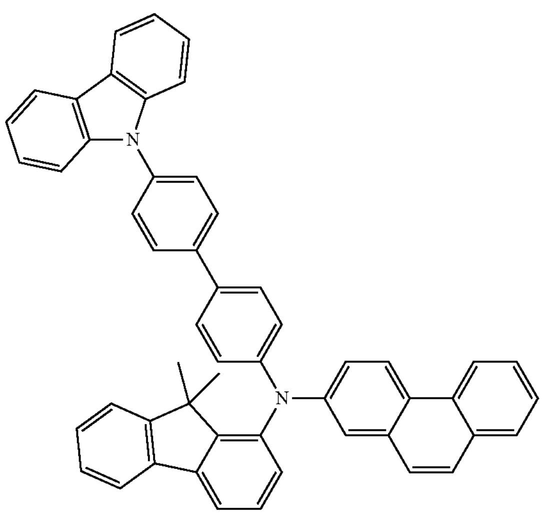
-continued
2-31
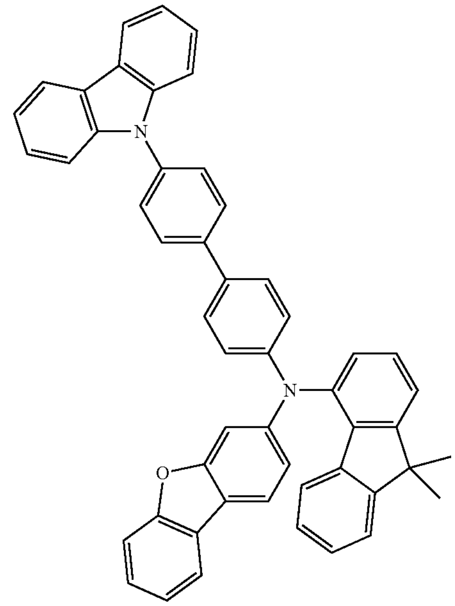
2-32
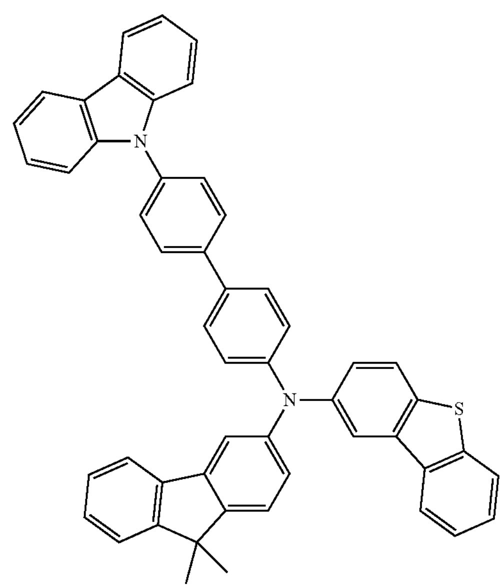

-continued
2-33
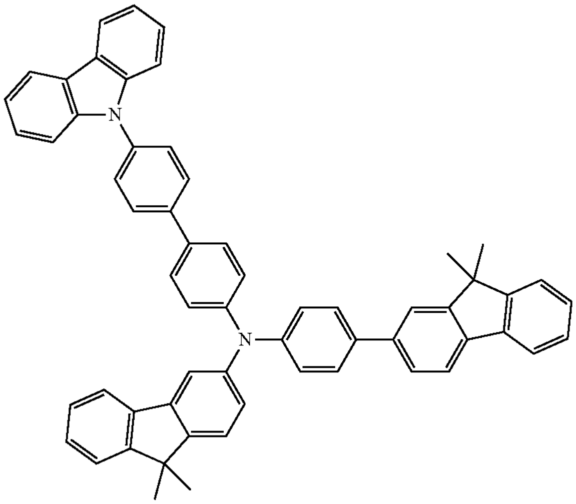
2-34
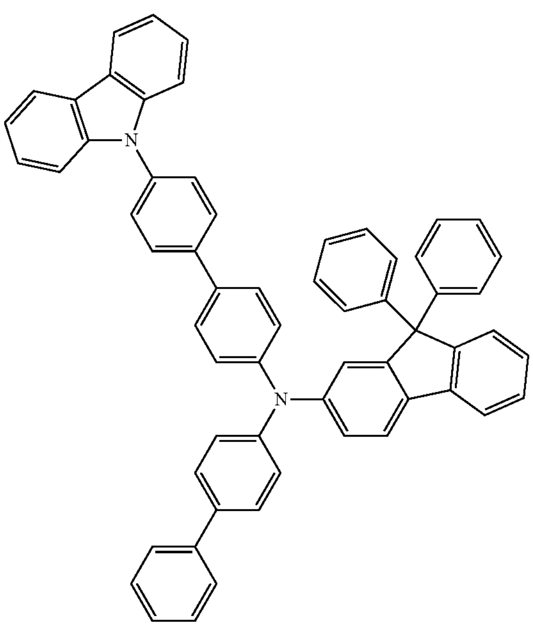
-continued
2-35
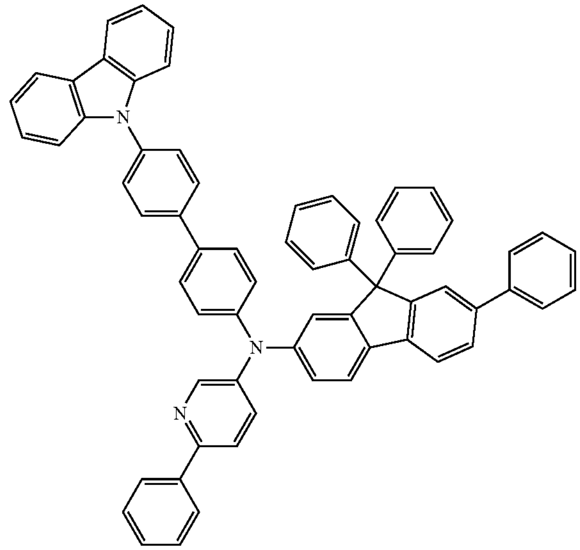
2-36
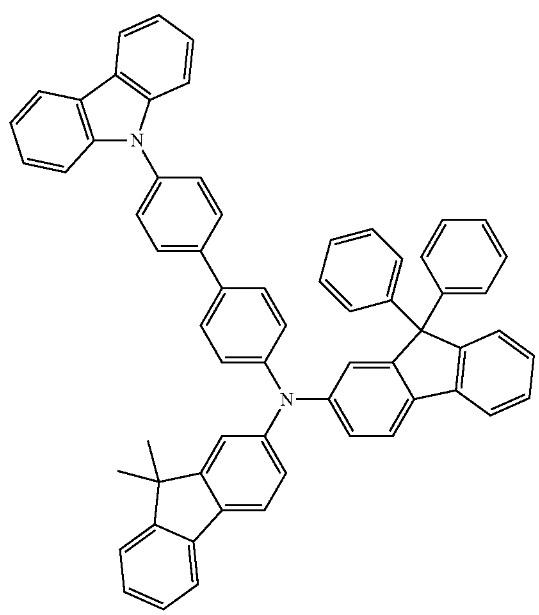

2-37
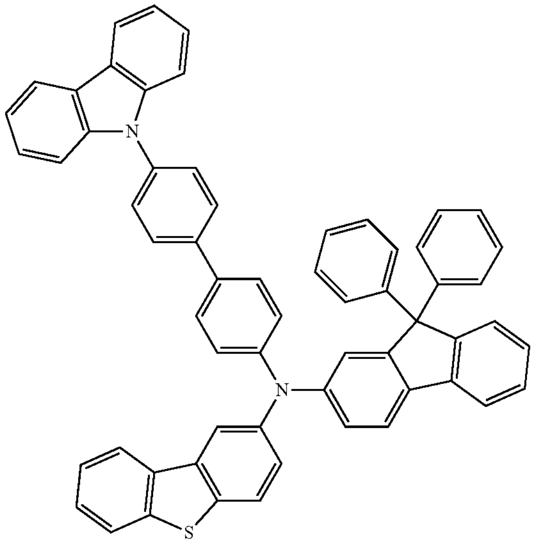
2-38
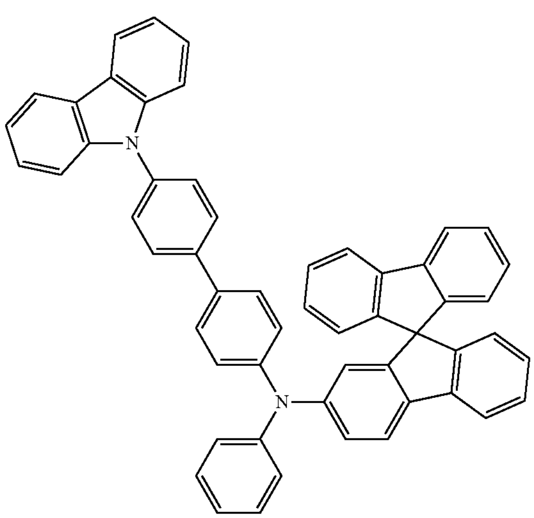
2-39
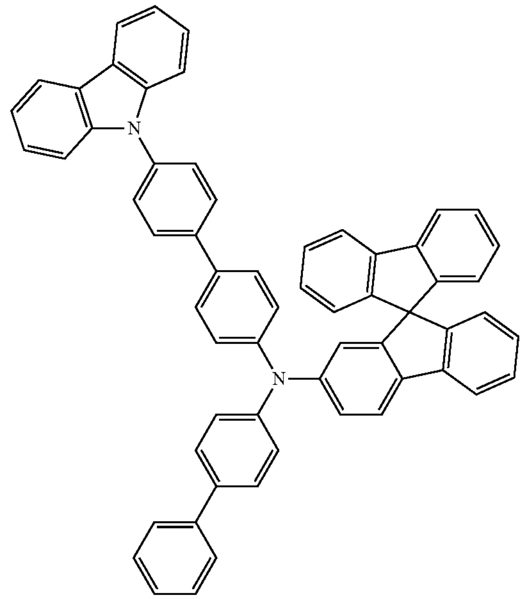
2-40
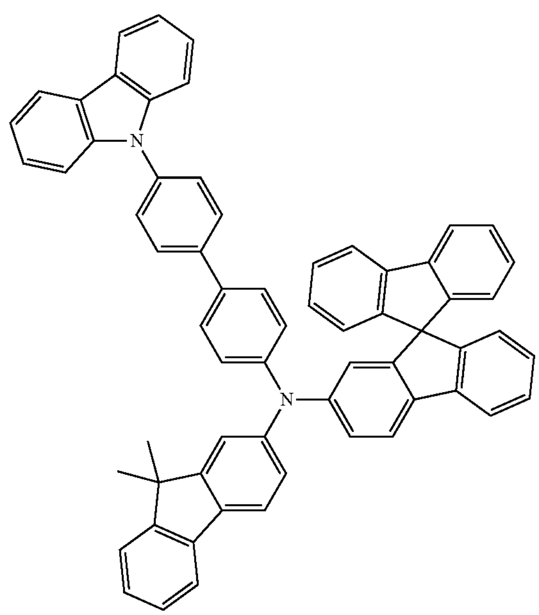

-continued
2-41
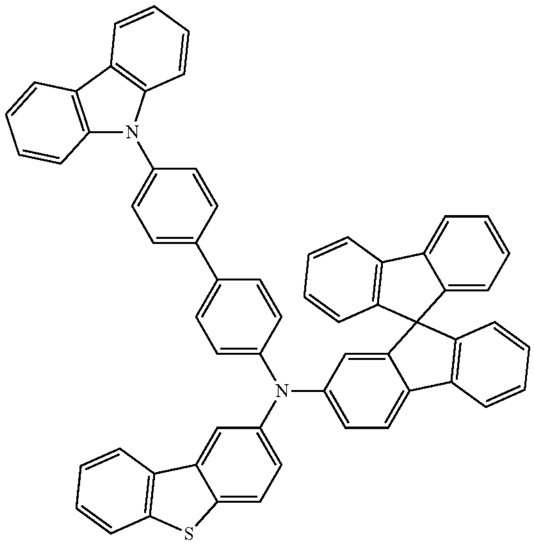
2-42
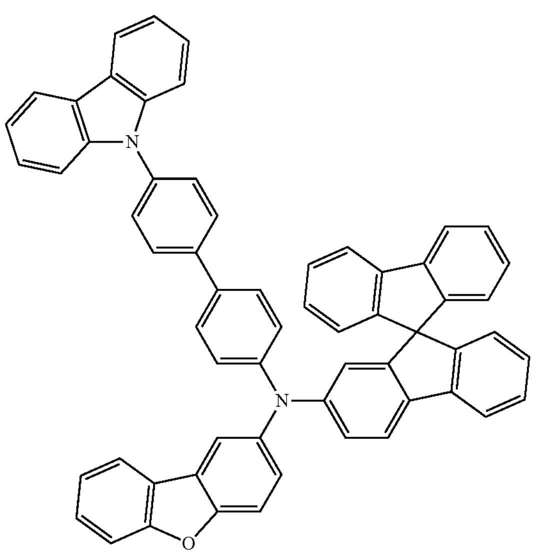
-continued
2-43
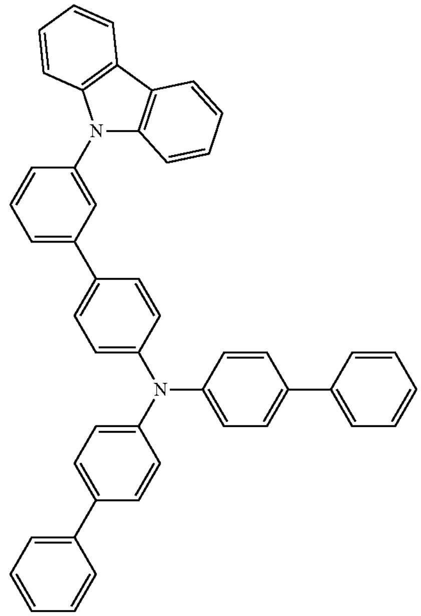
2-44
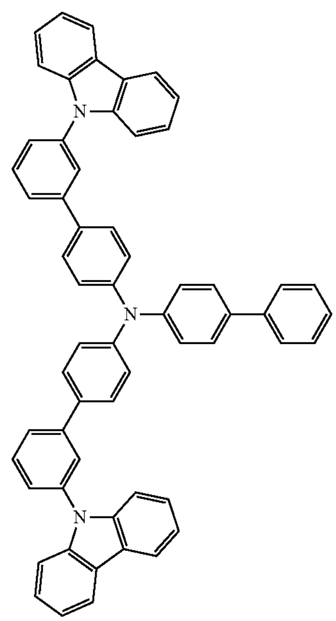

2-45
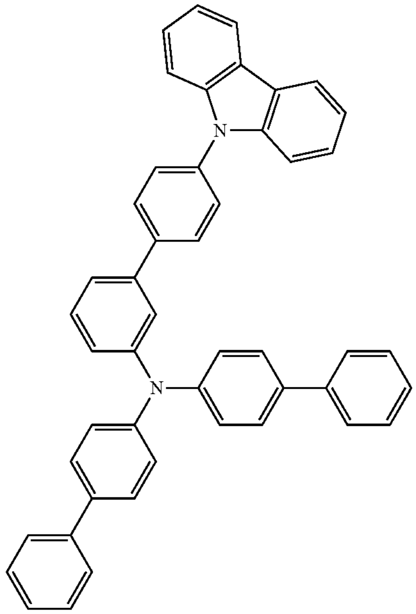
2-46
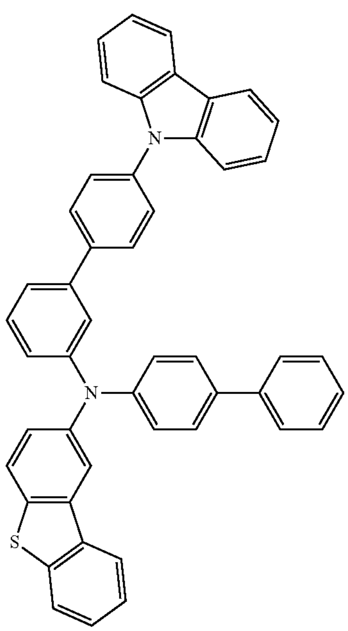
2-47
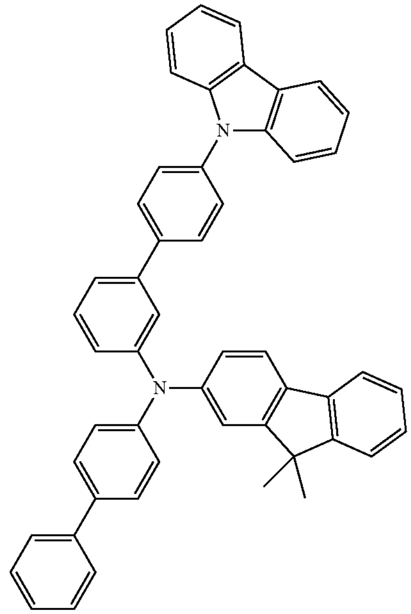
2-48
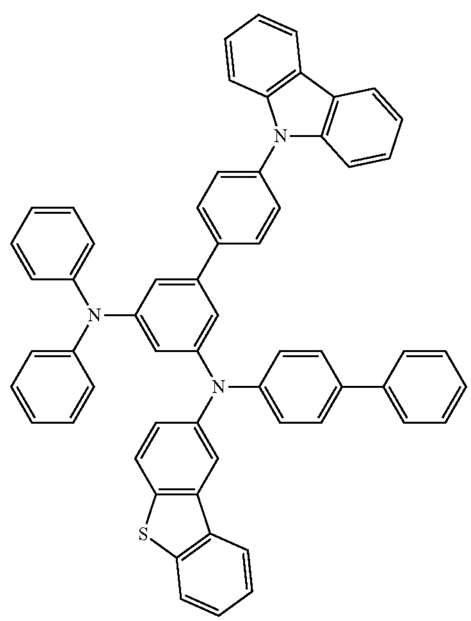

-continued
2-49
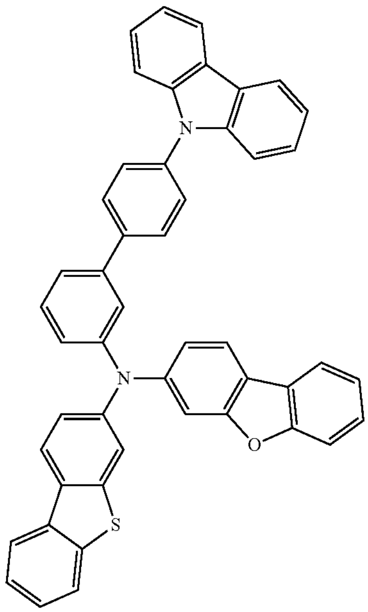
2-50
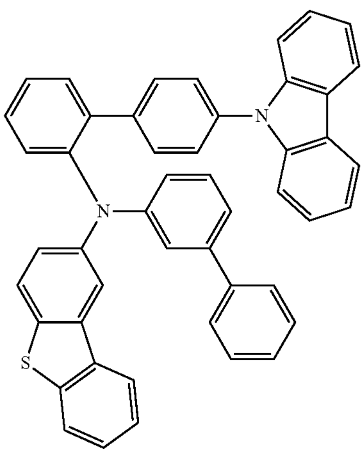
2-51
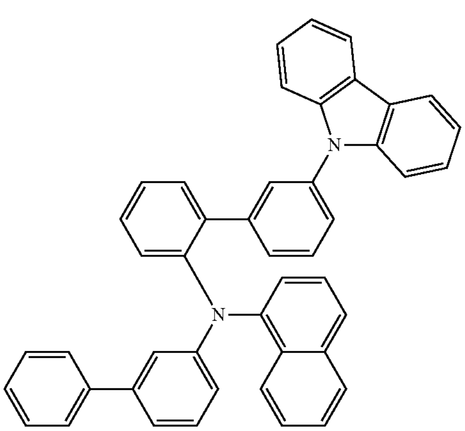
-continued
2-52
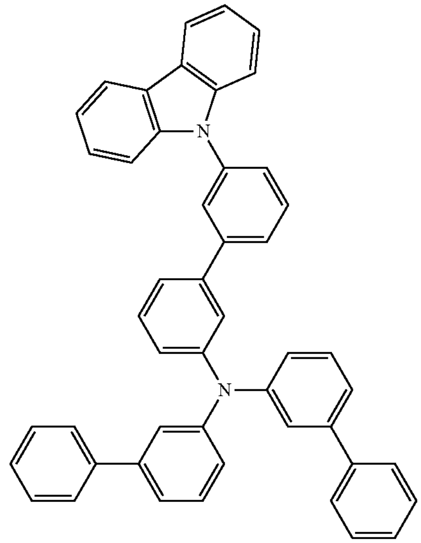
2-53
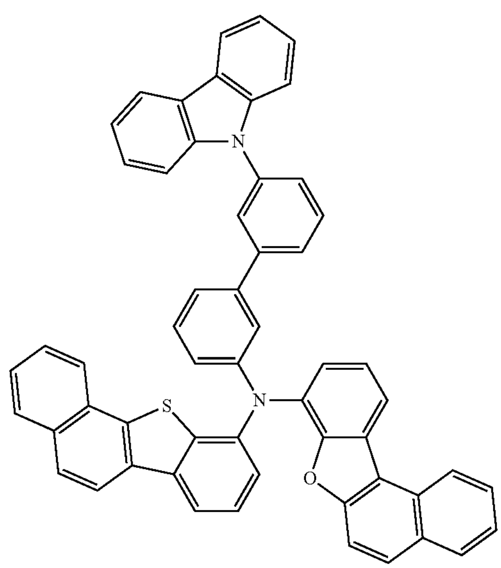

-continued
2-54
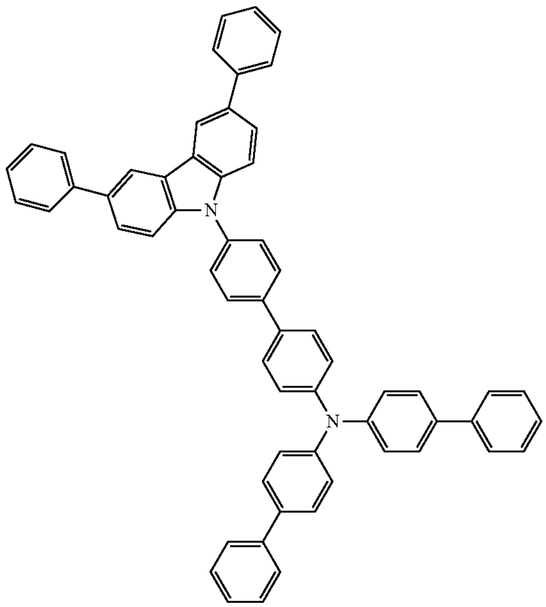
2-55
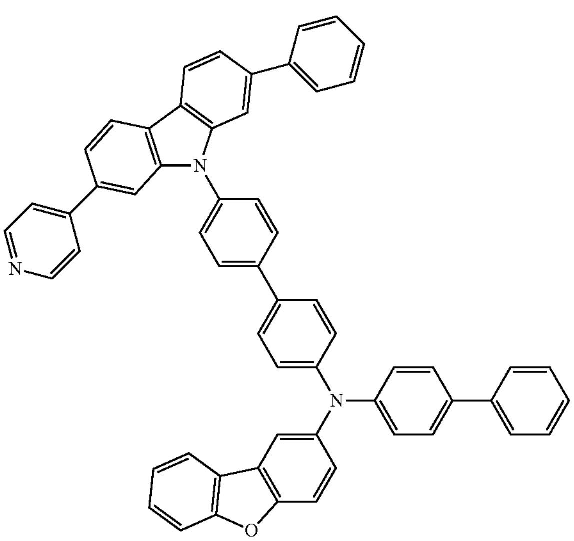
-continued
2-56
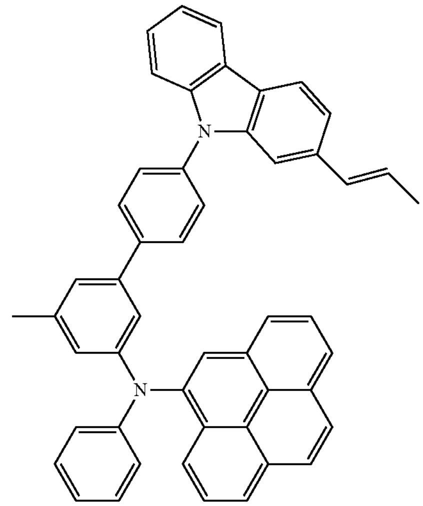
2-57
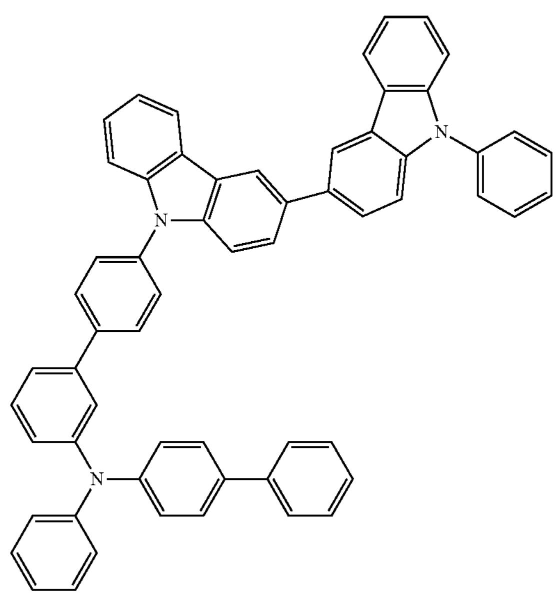

-continued
2-58
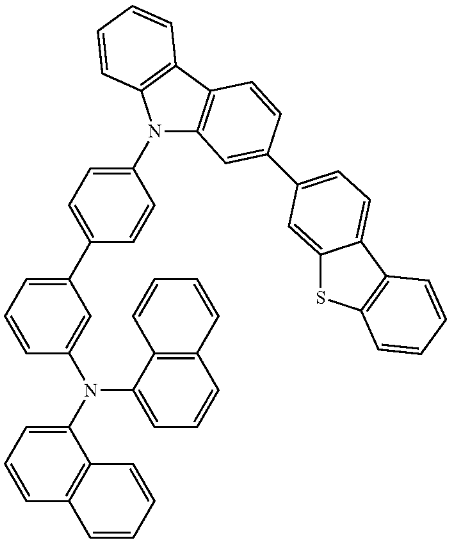
2-59
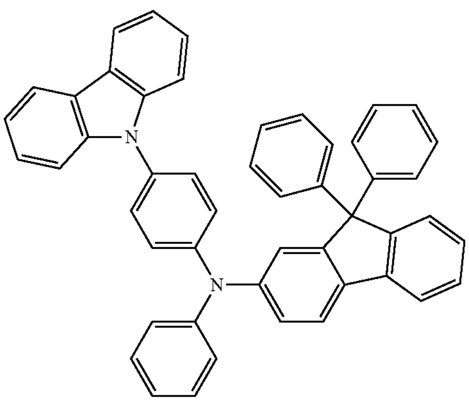
2-60
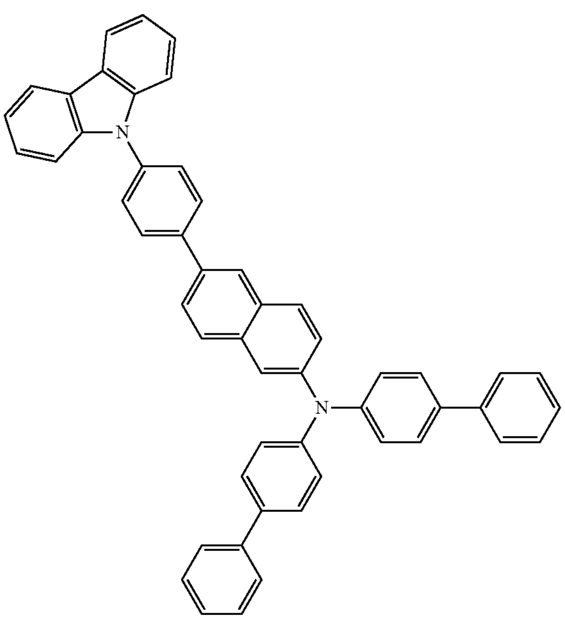
-continued
2-61
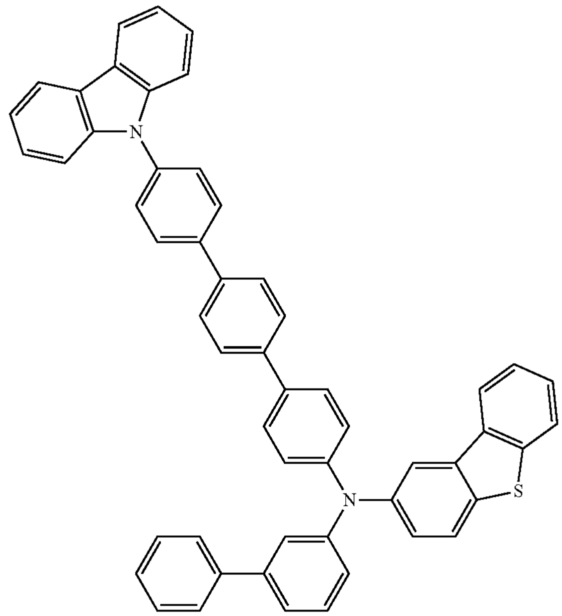
2-62
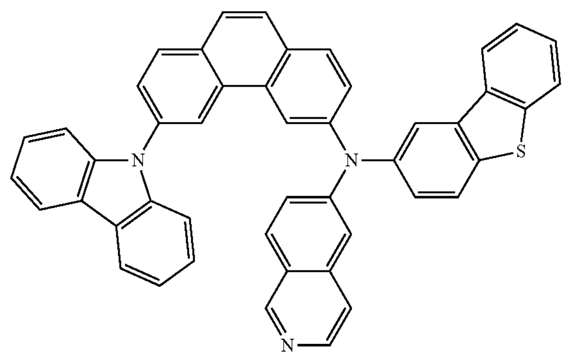
2-63
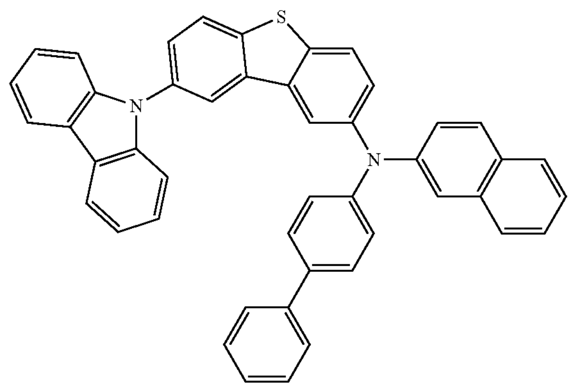

2-64
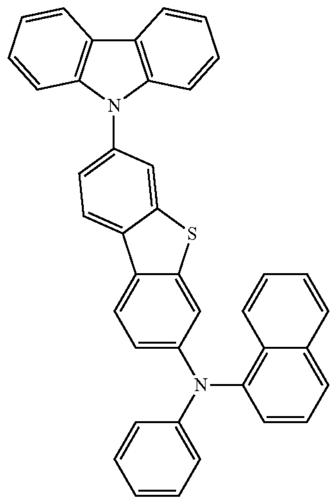
2-65
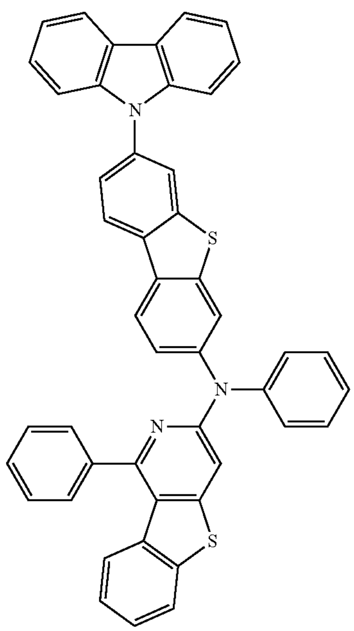
2-66
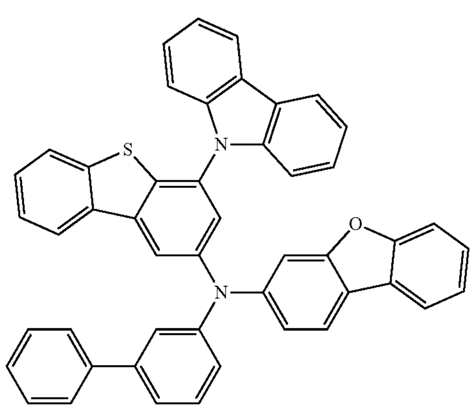
2-67
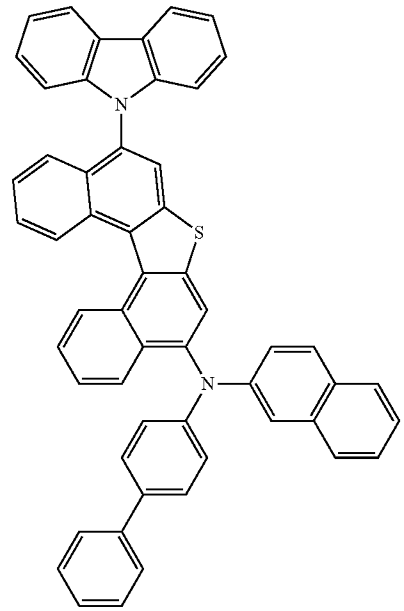
2-68
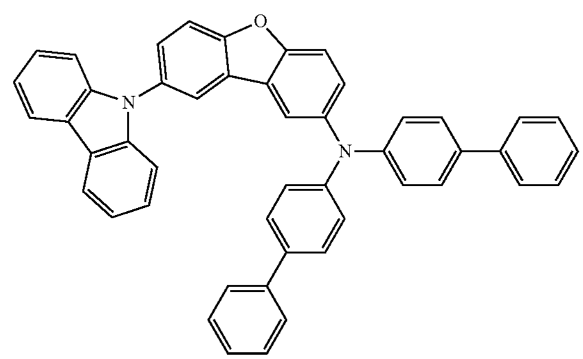
2-69
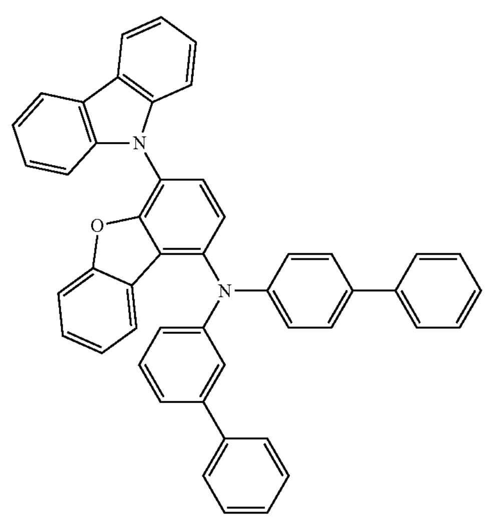

-continued
2-70
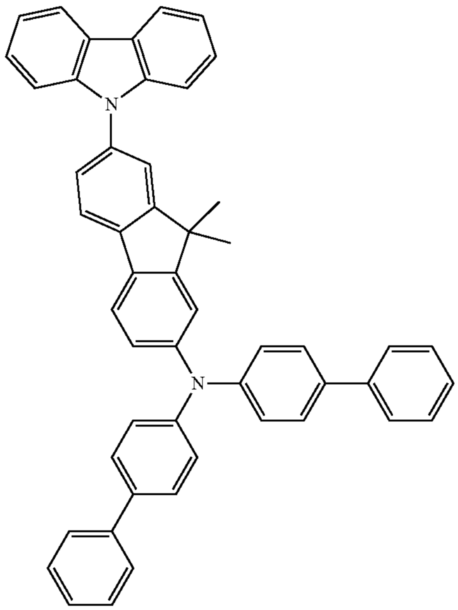
2-71
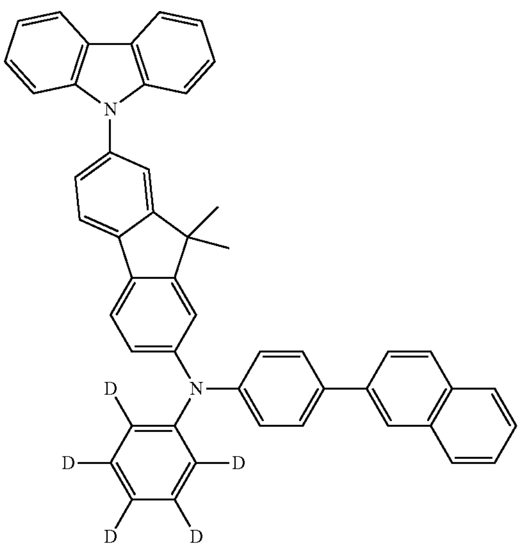
2-72
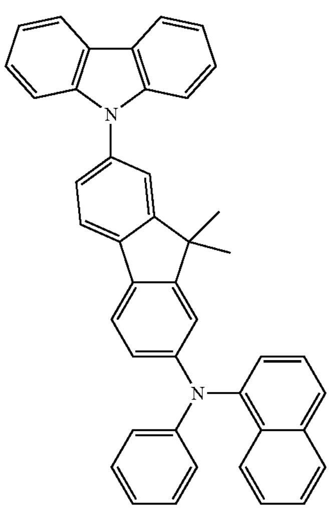
-continued
2-73
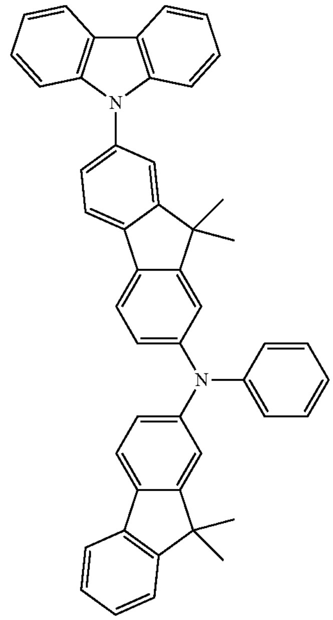
2-74
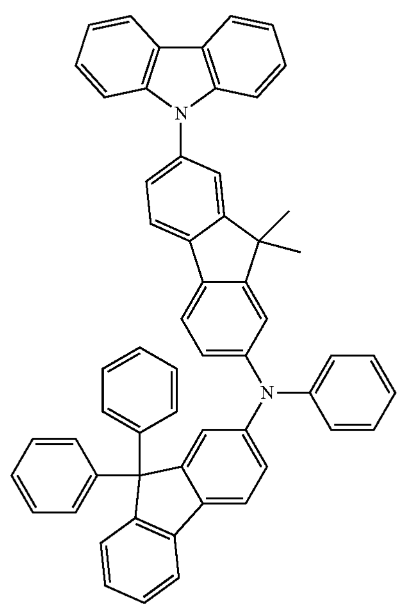

-continued
2-75
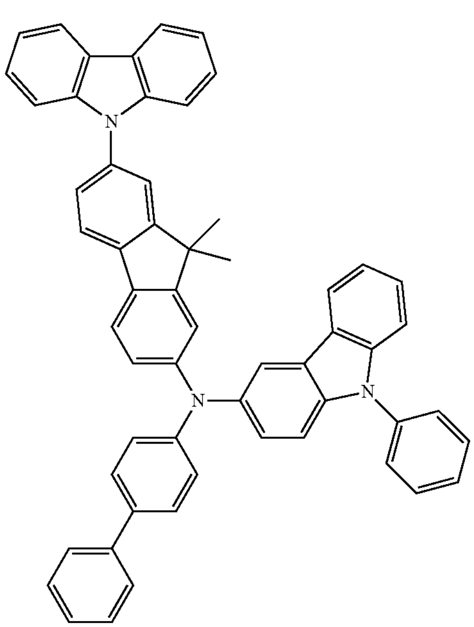
2-76
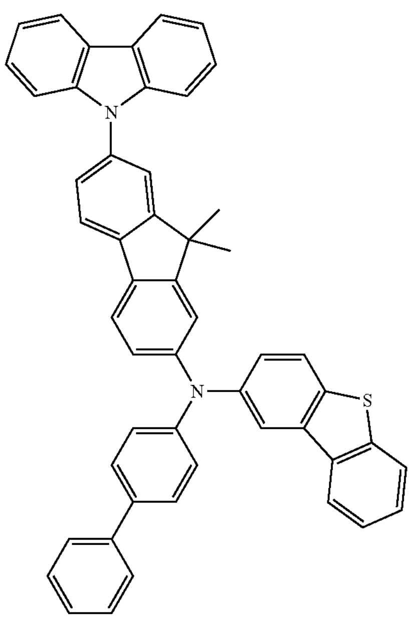
-continued
2-77
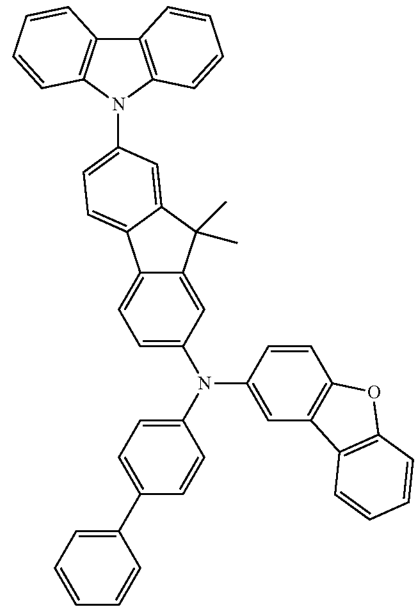
2-78
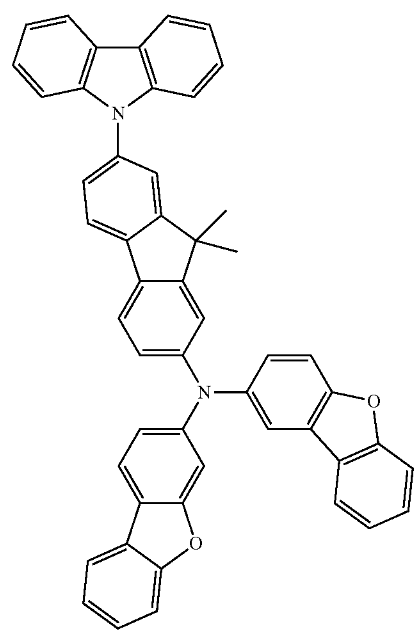

2-79
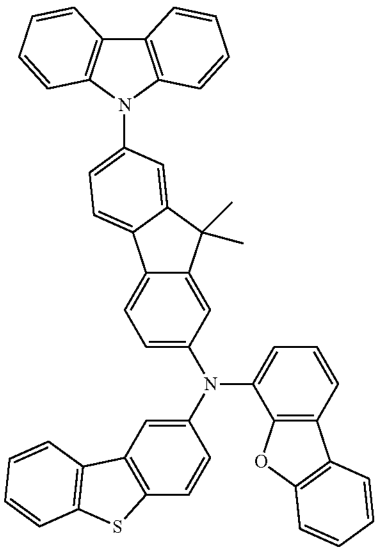
2-80
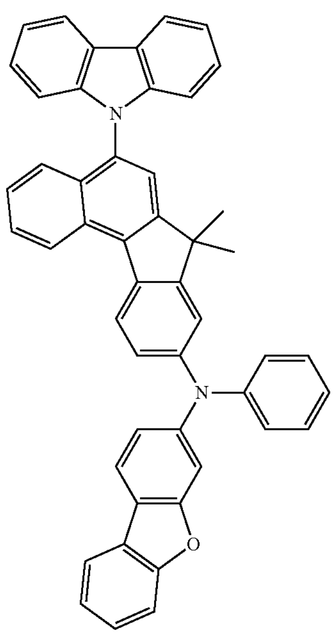
2-81
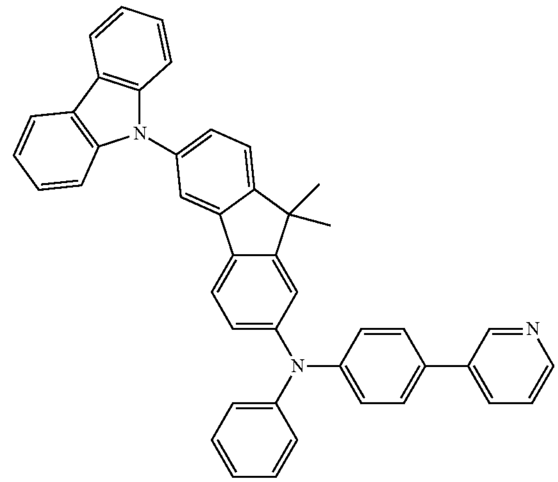
2-82
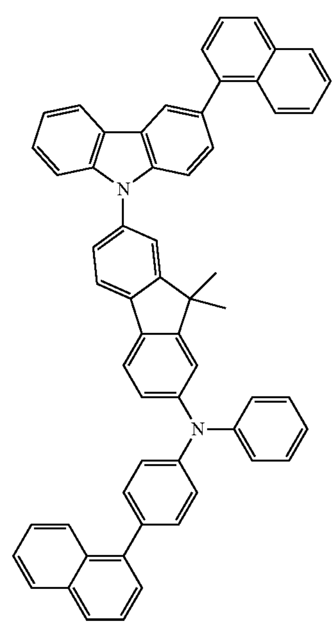

-continued
2-83
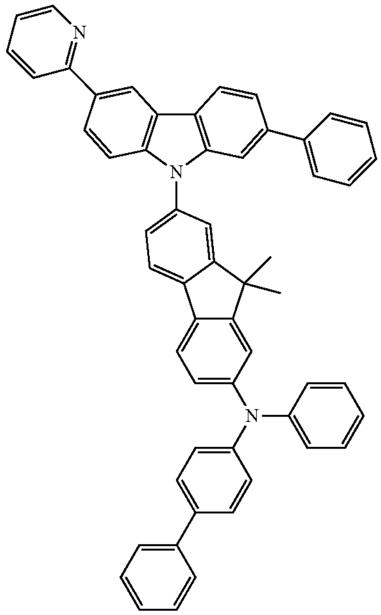
2-84
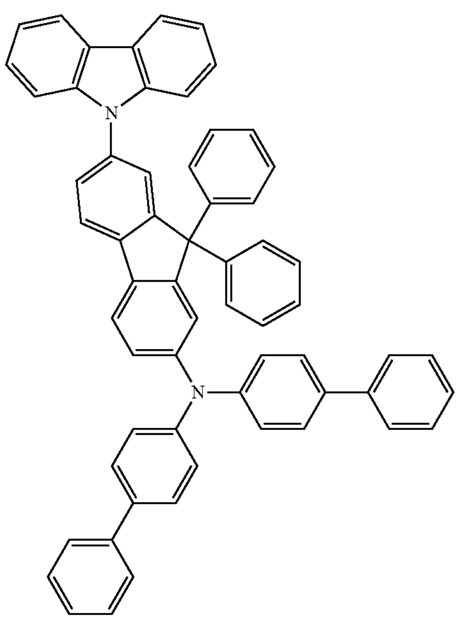
-continued
2-85
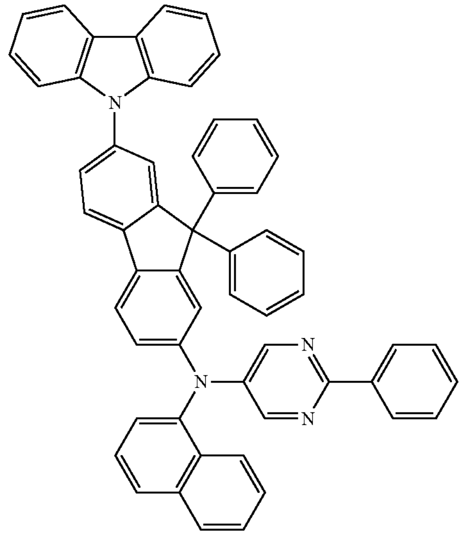
2-86
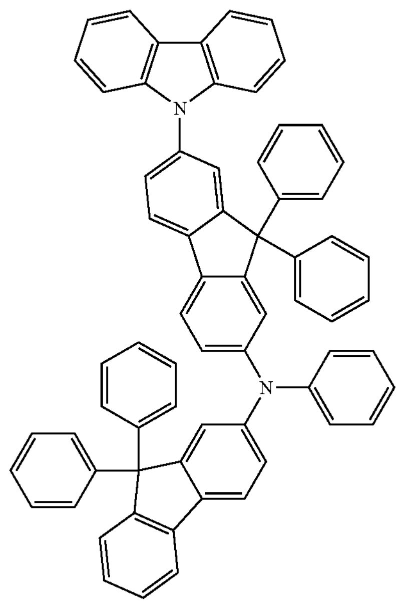
2-87
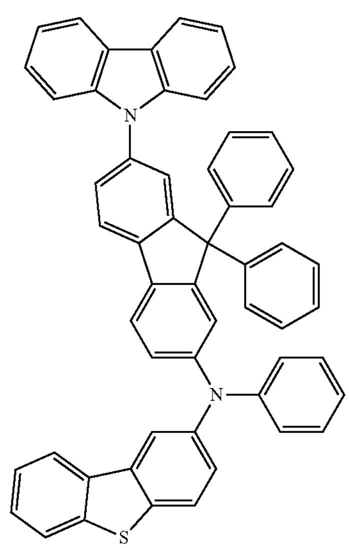

-continued
2-88
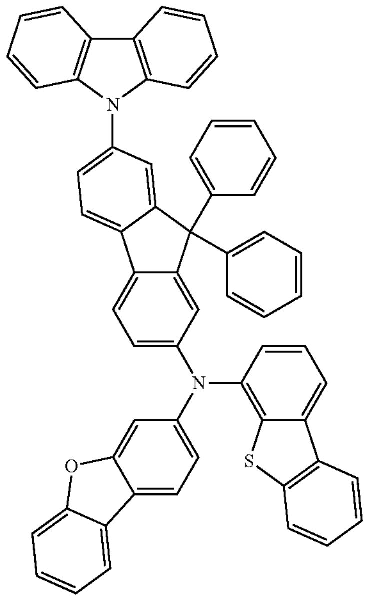
2-89
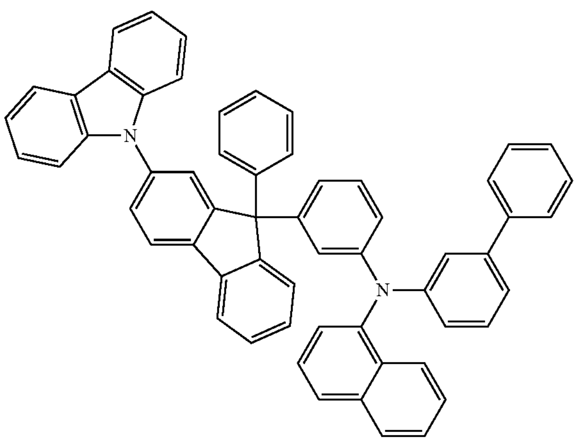
2-90
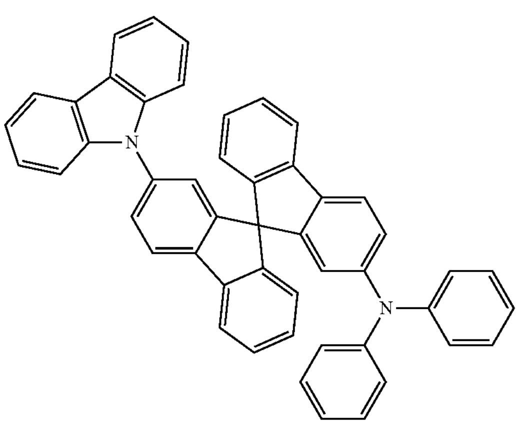
-continued
2-91
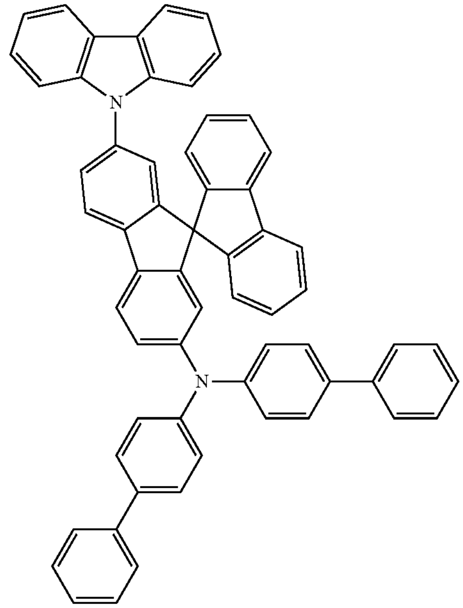
2-92
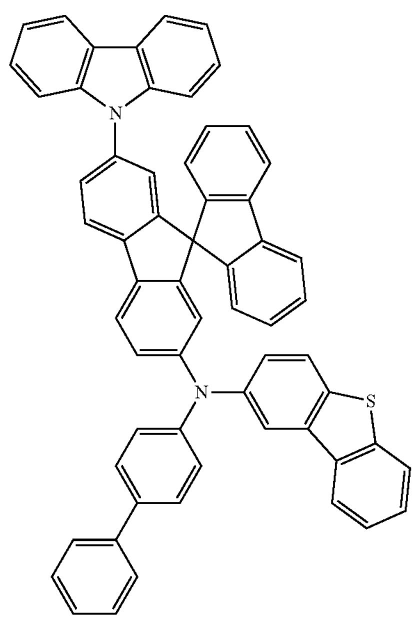

-continued
2-93
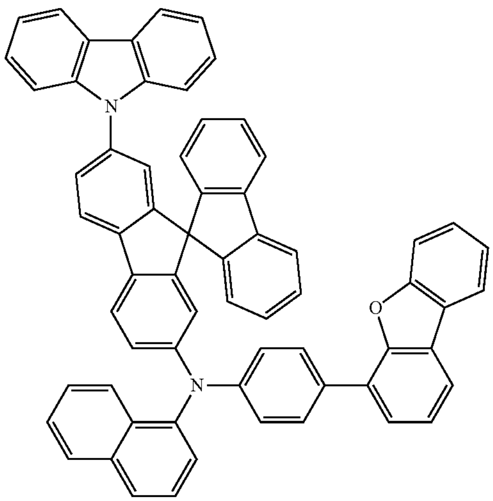
2-94
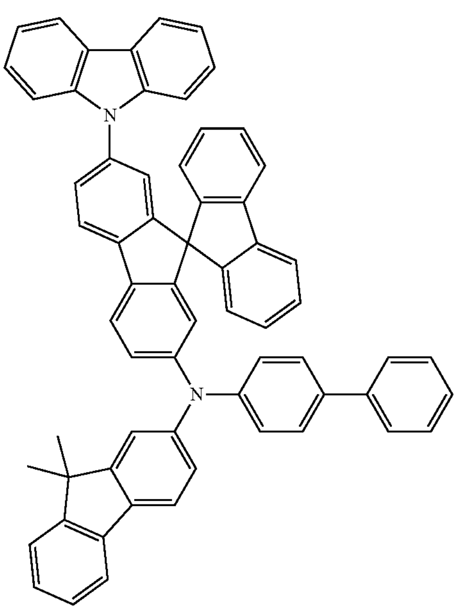
-continued
2-95
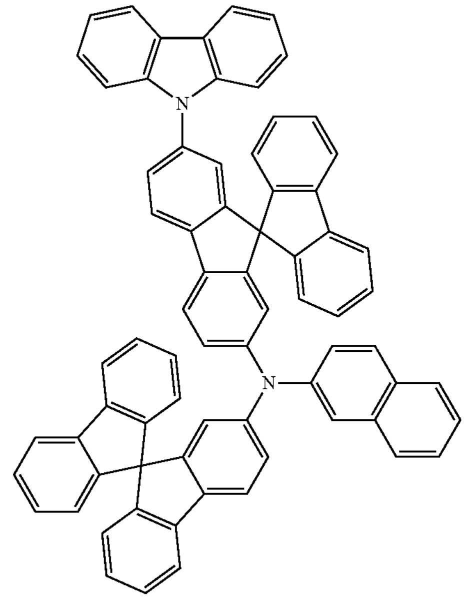
2-96
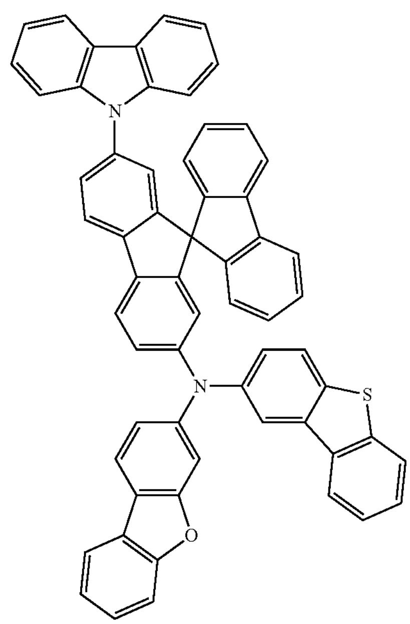

-continued
2-97
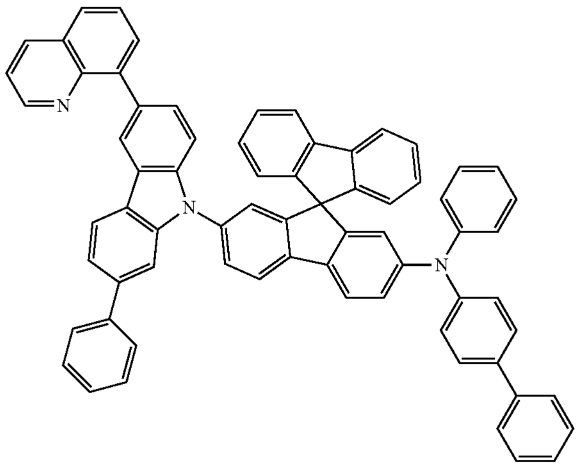
2-98
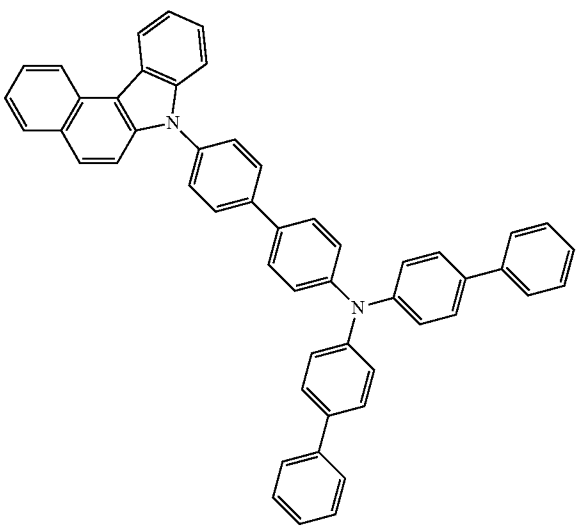
2-99
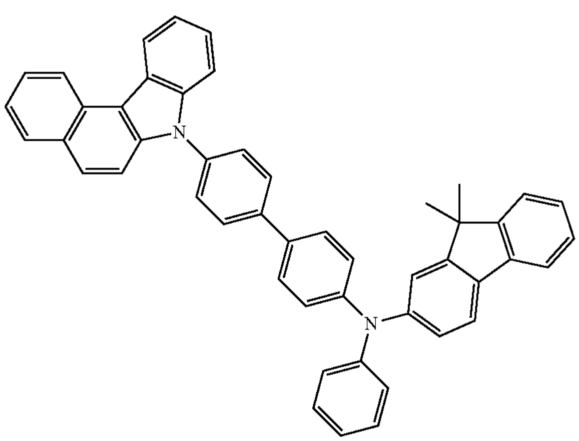
-continued
2-100
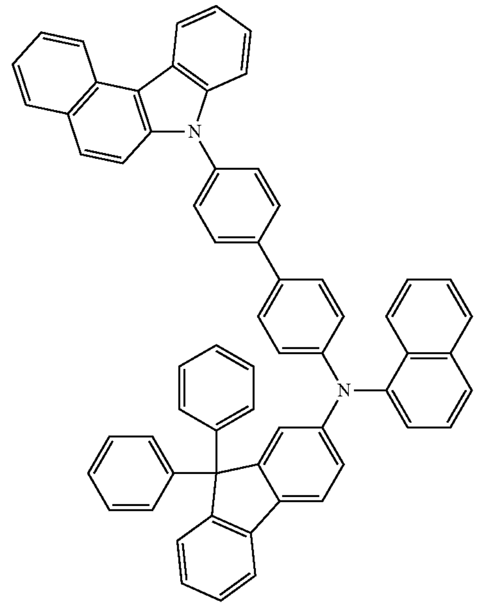
2-101
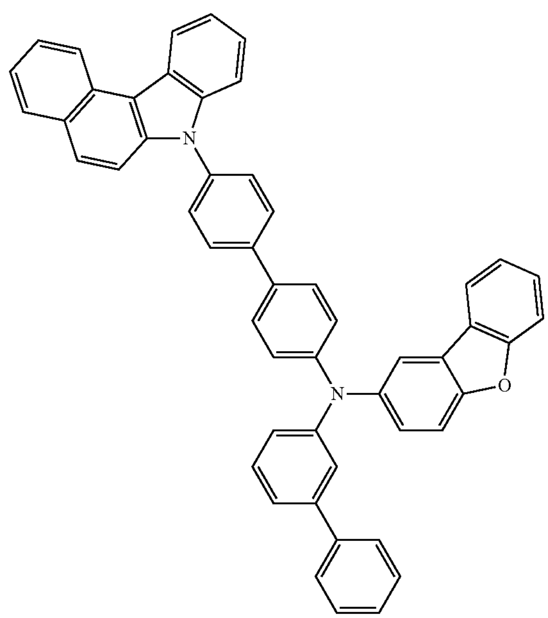

-continued
2-102
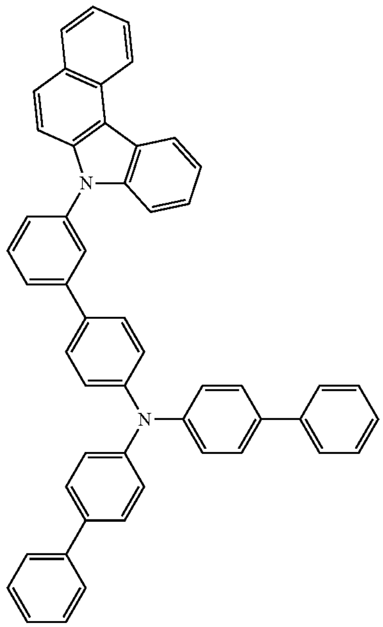
2-103
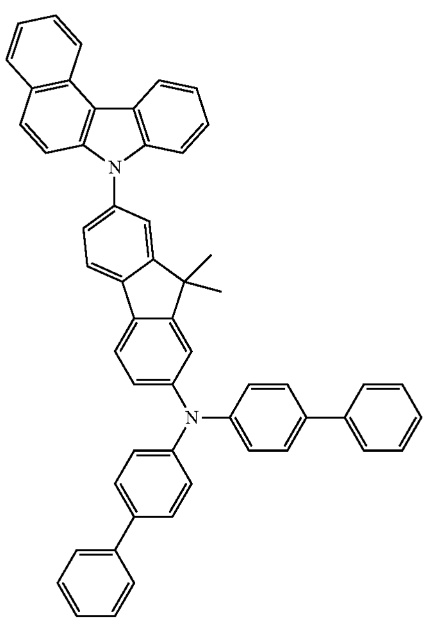
-continued
2-104
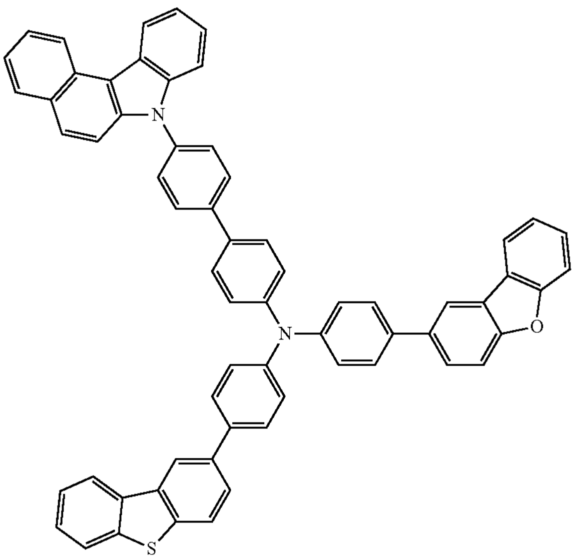
2-105
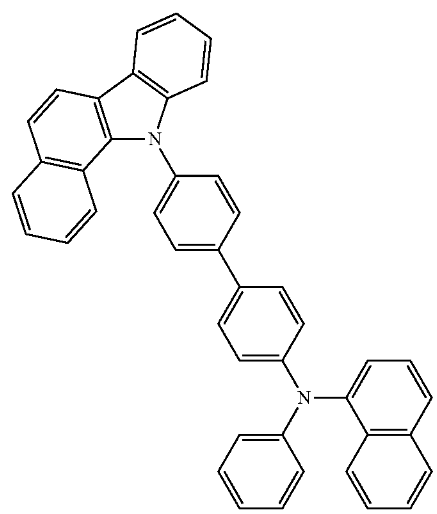
2-106
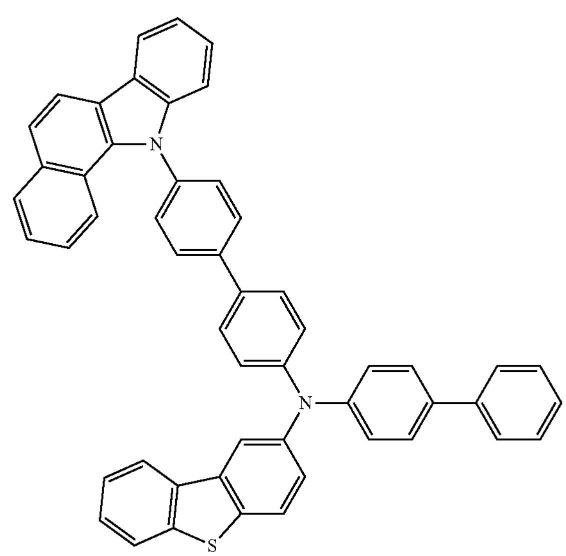

-continued
2-107
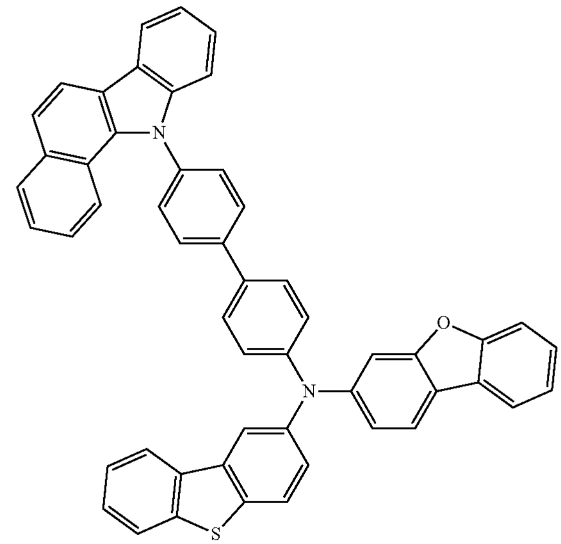
2-108
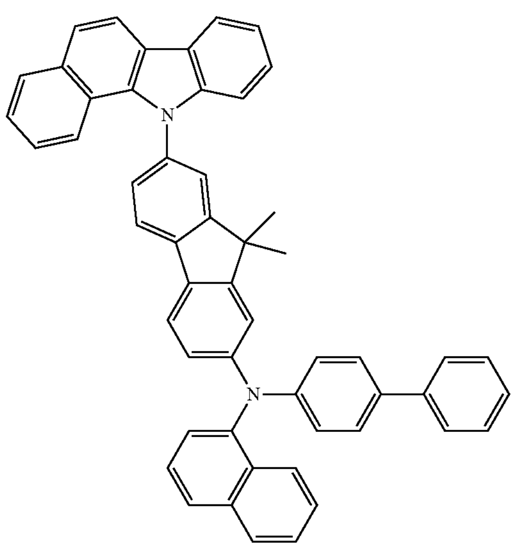
-continued
2-109
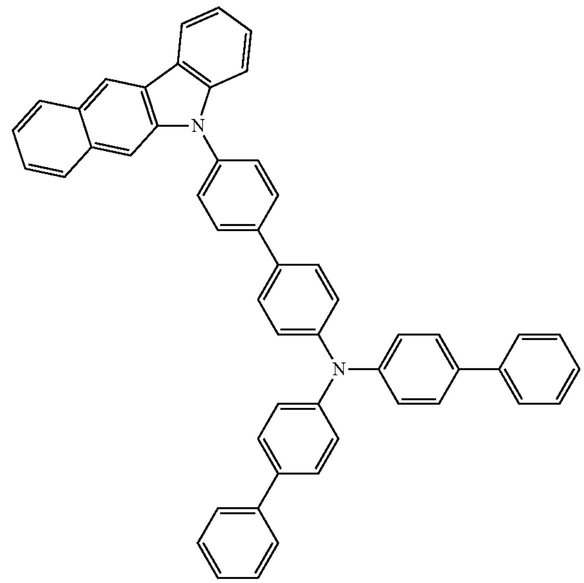
2-110
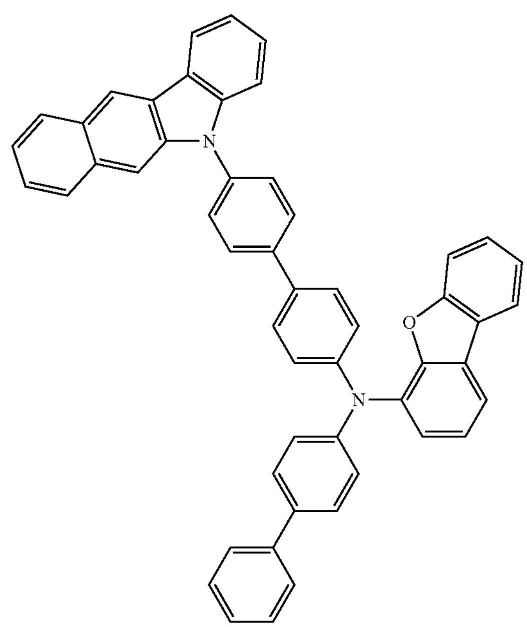

-continued
2-111
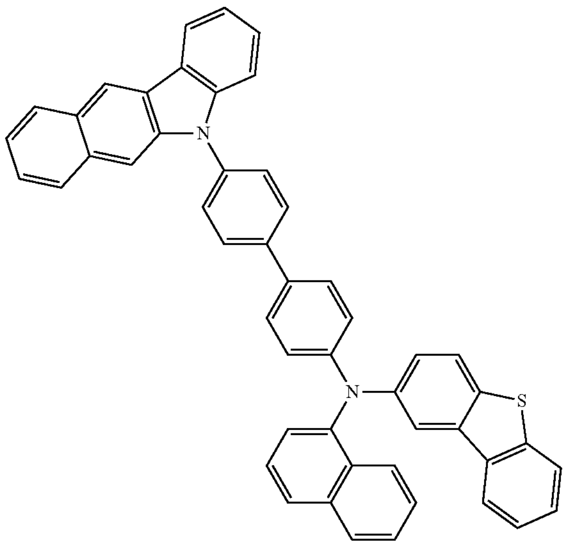
2-112
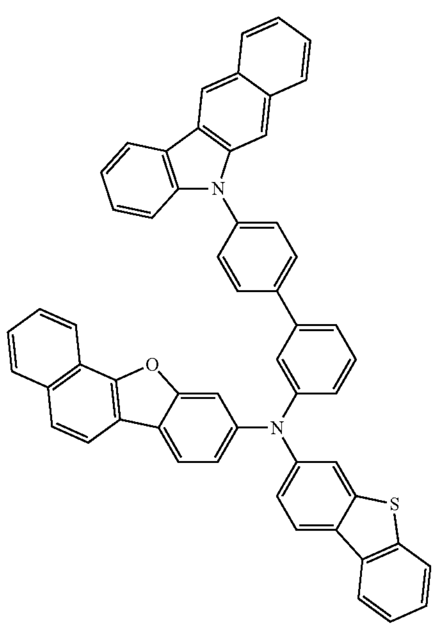
-continued
2-113
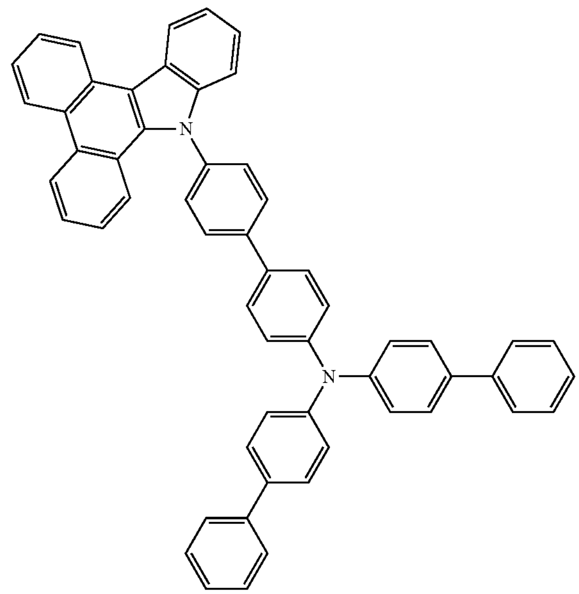
2-114
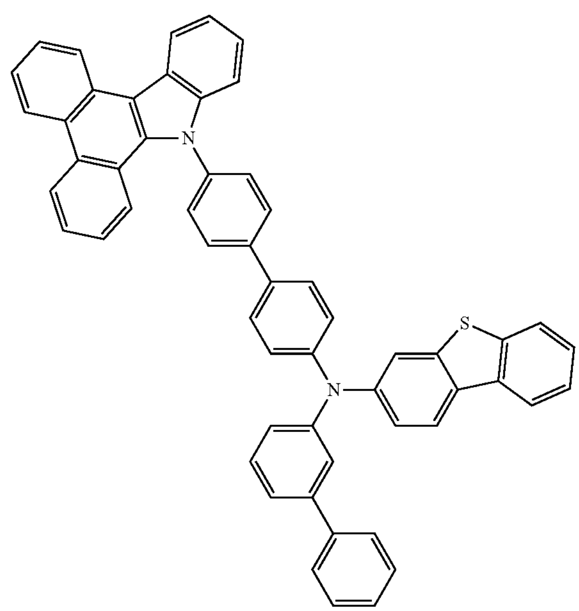

-continued
2-115
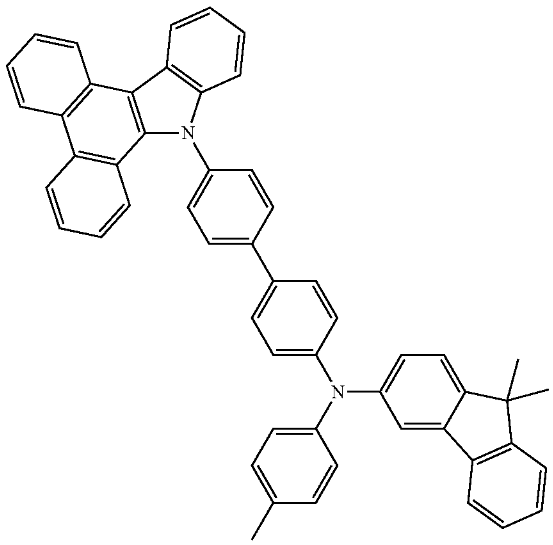
2-116
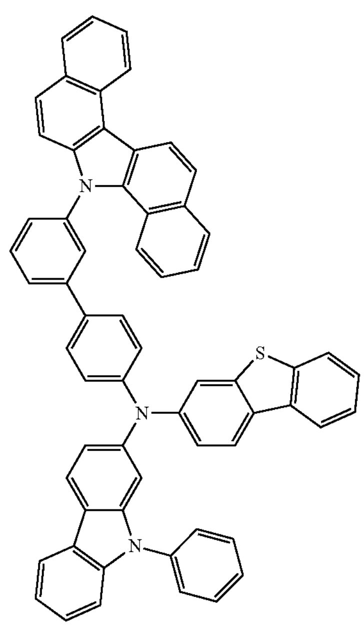
-continued
2-117
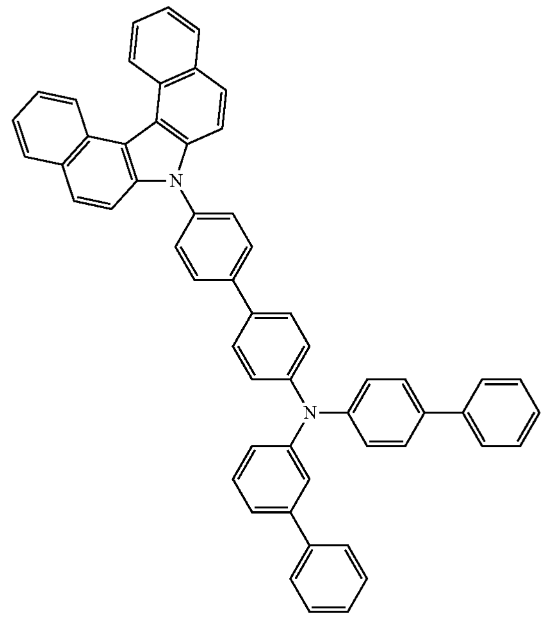
2-118
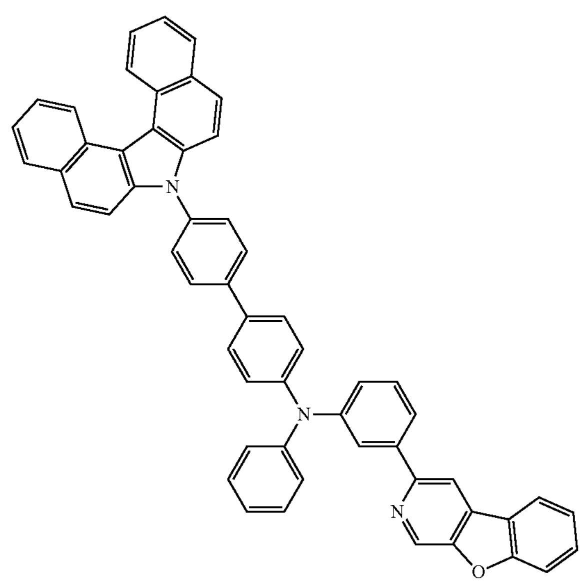

-continued
2-119
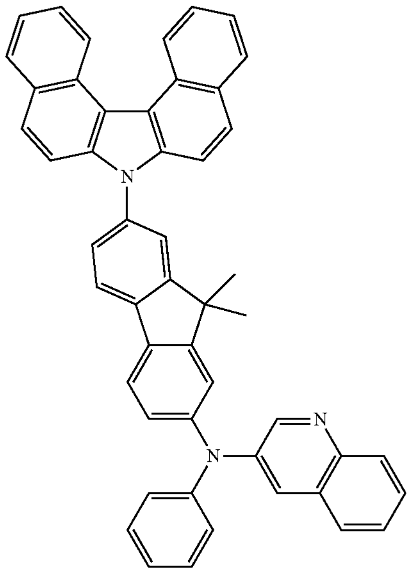
2-120
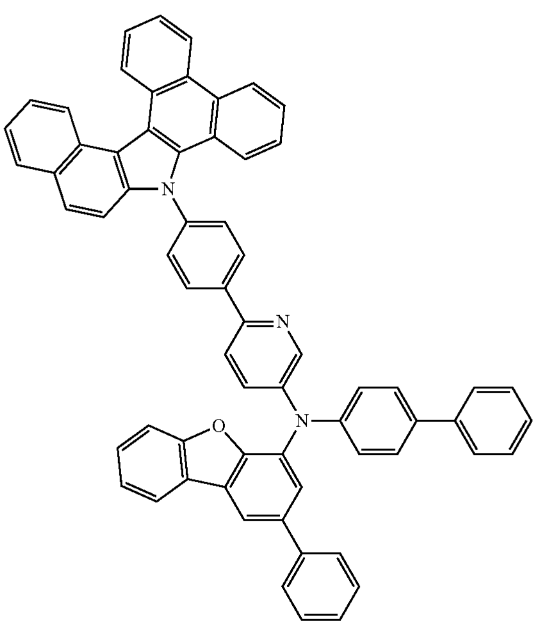
-continued
2-121
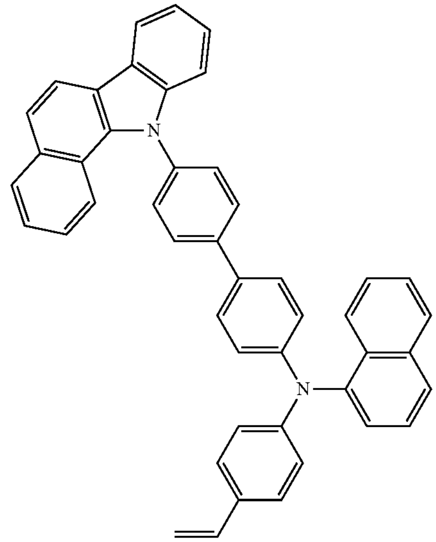
2-122
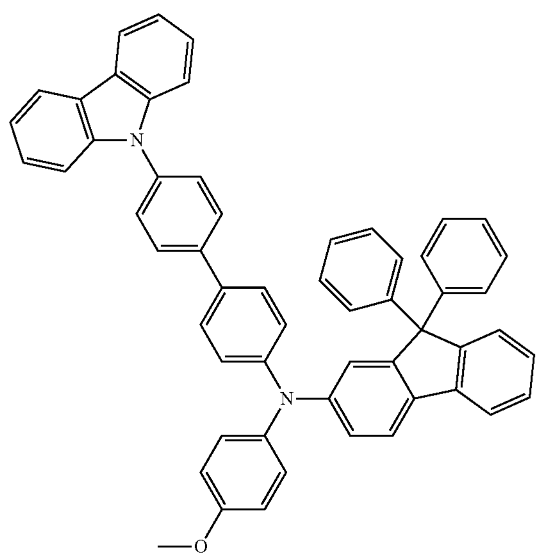

-continued
2-123
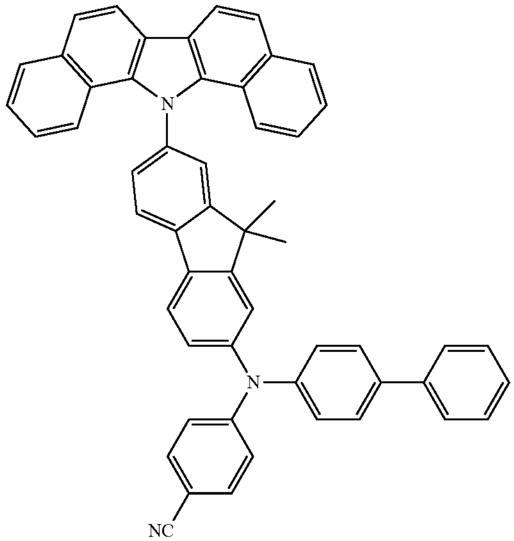
2-124
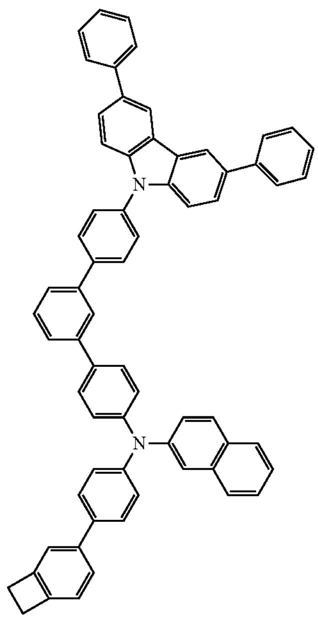
3-1
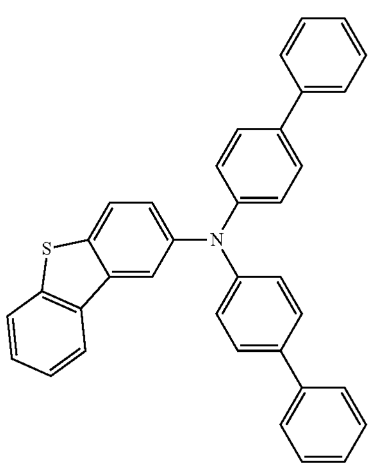
-continued
3-2
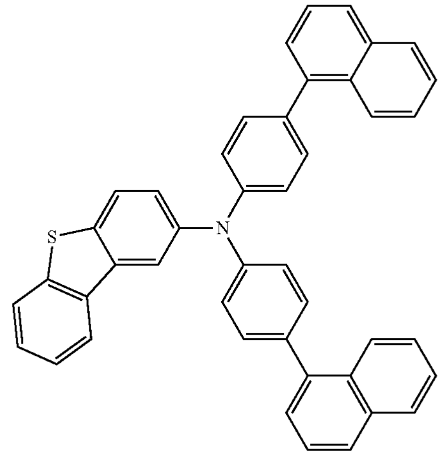
3-3
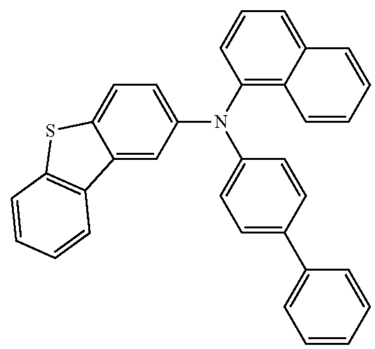
3-4
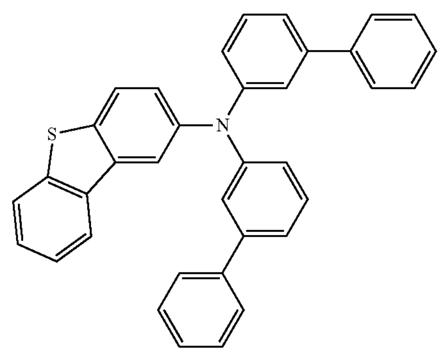
3-5
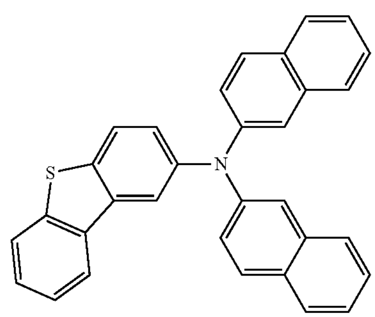

3-6
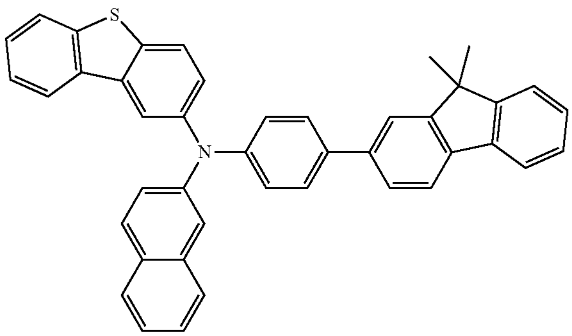
3-7
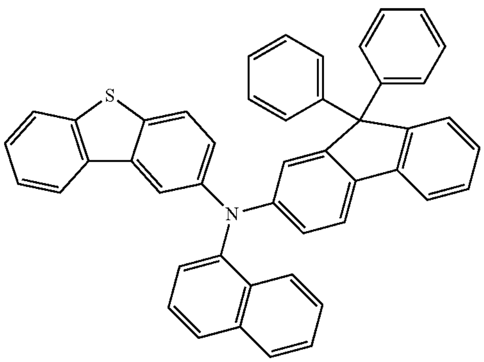
3-8
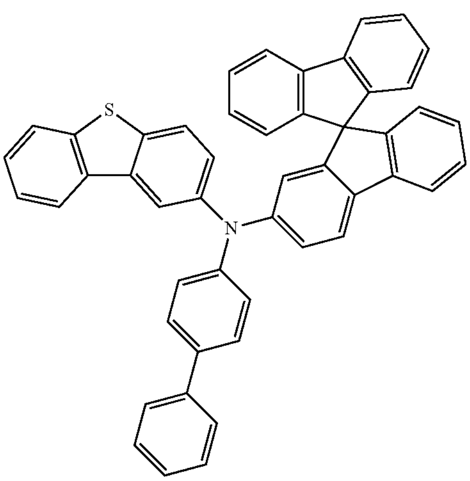
3-9
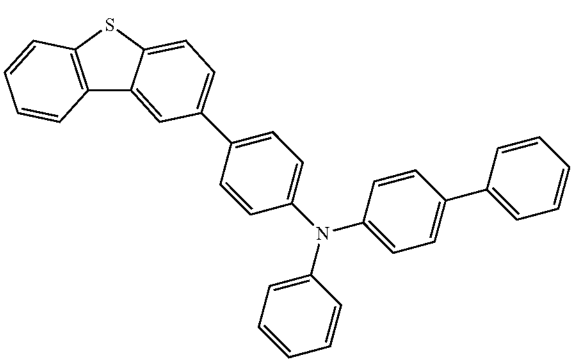
3-10
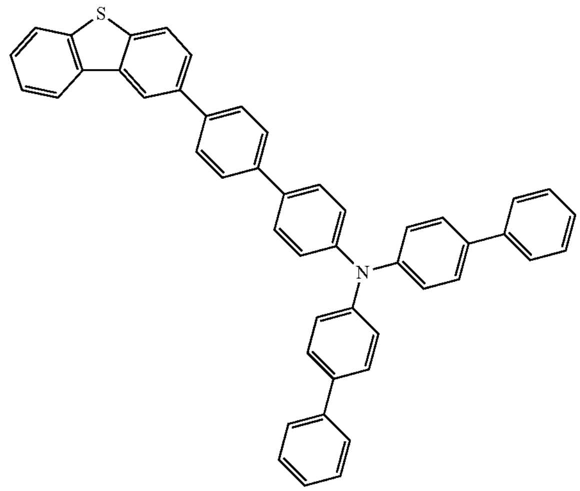
3-11
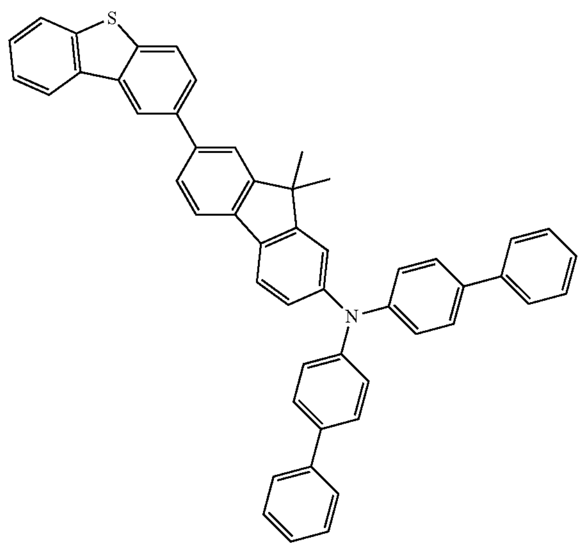
3-12
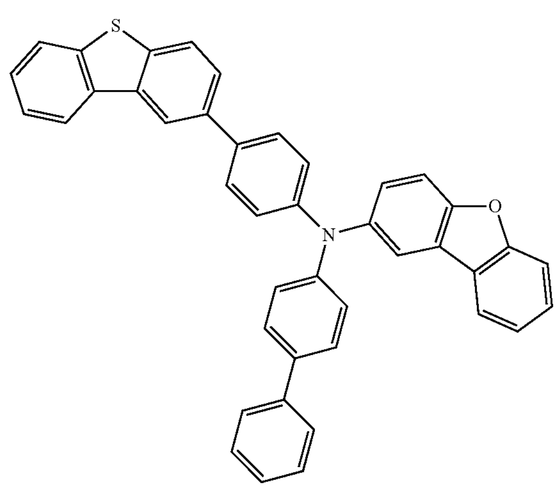

3-13
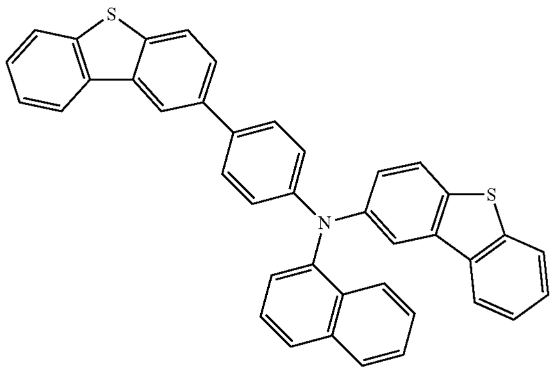
3-14
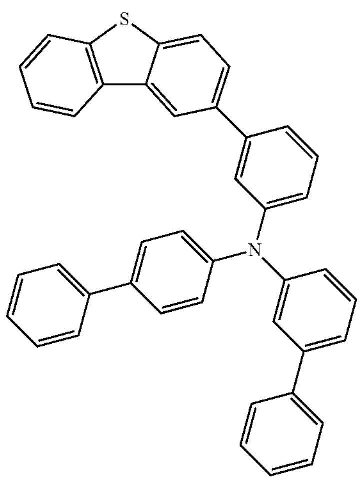
3-15
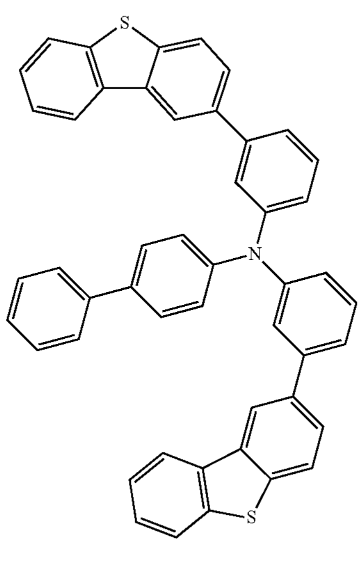
3-16
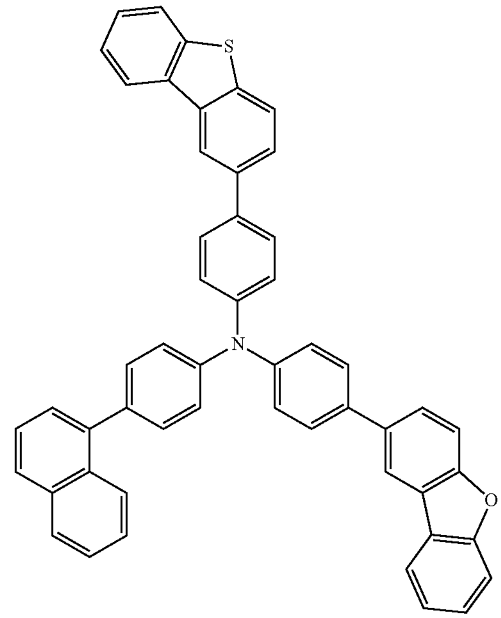
3-17
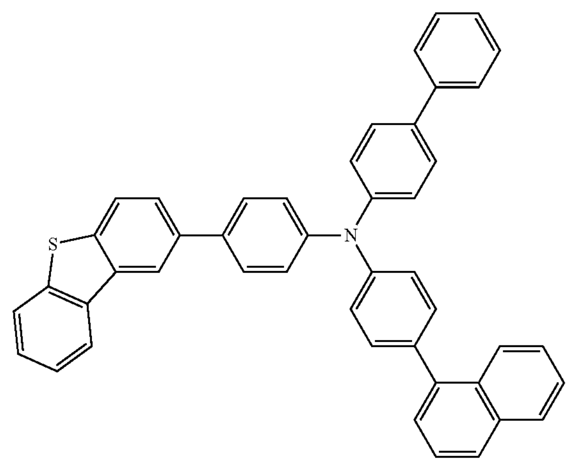
3-18
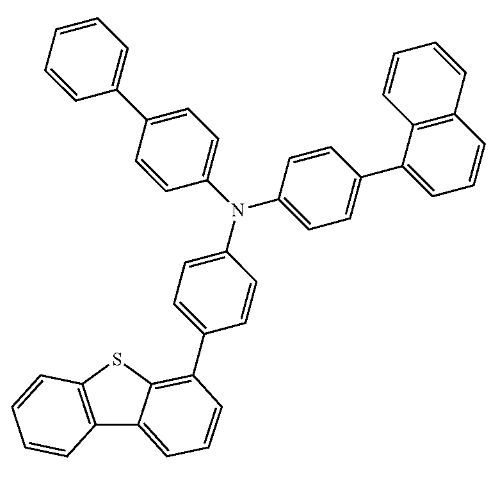

-continued
3-19
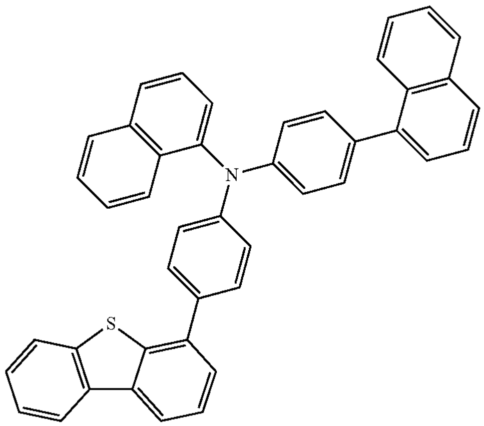
3-20
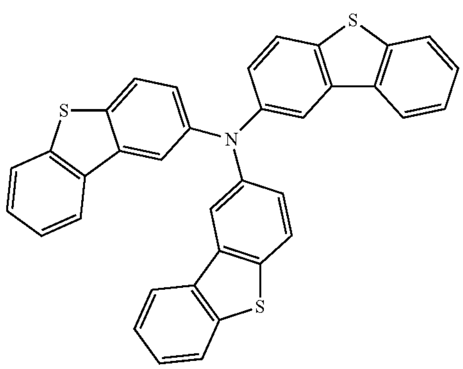
3-21
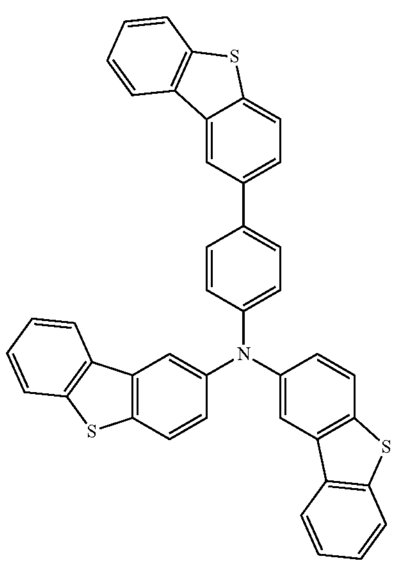
-continued
3-22
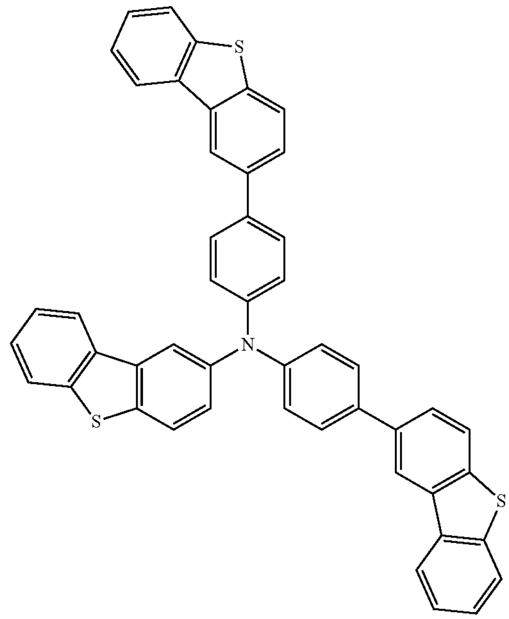
3-23
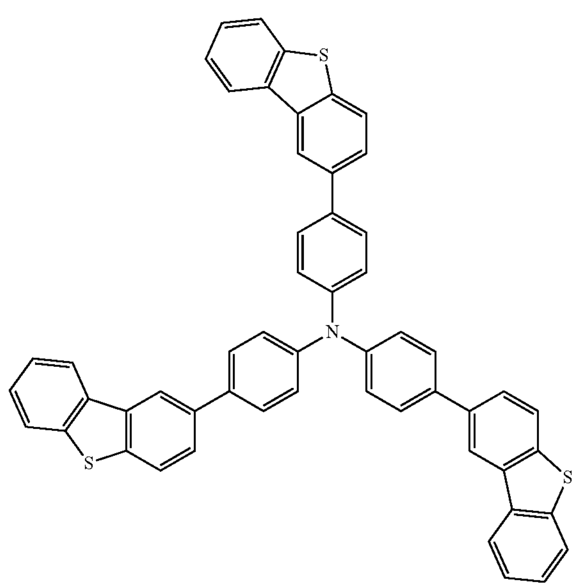

-continued
3-24
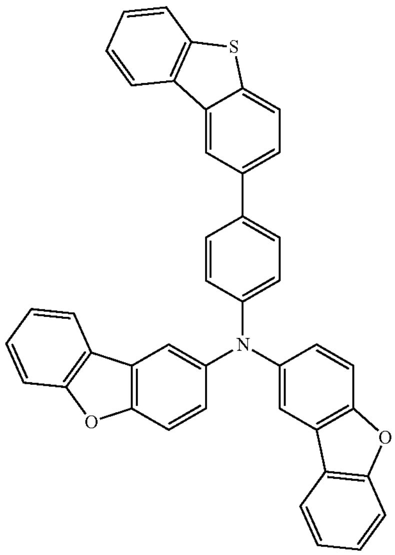
3-25
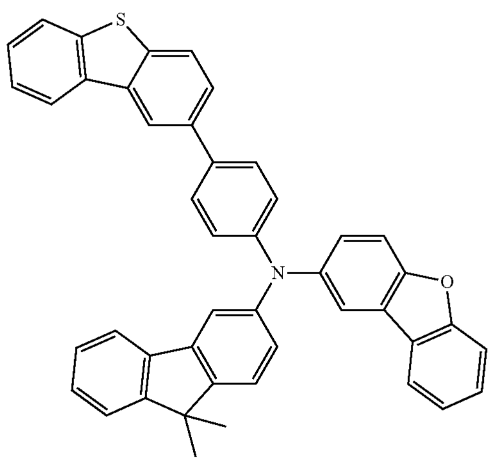
3-26
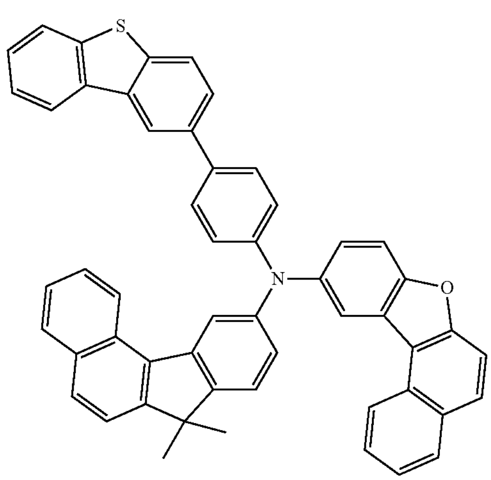
-continued
3-27
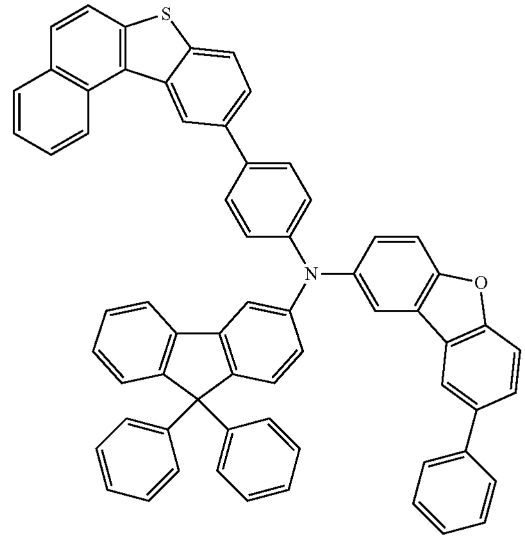
3-28
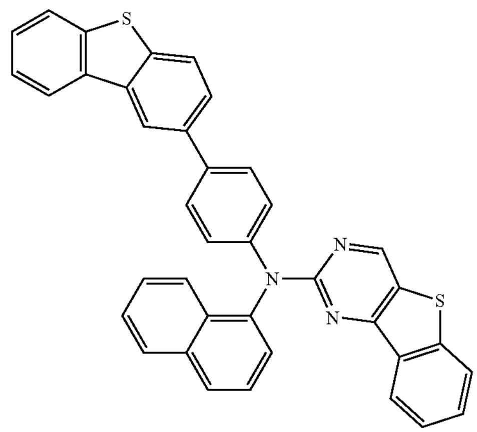
3-29
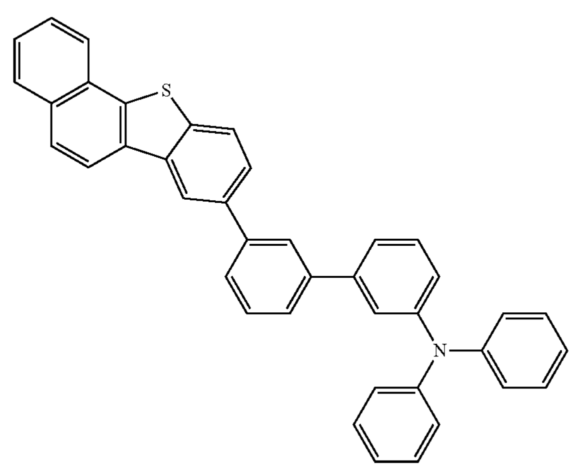

-continued
3-30
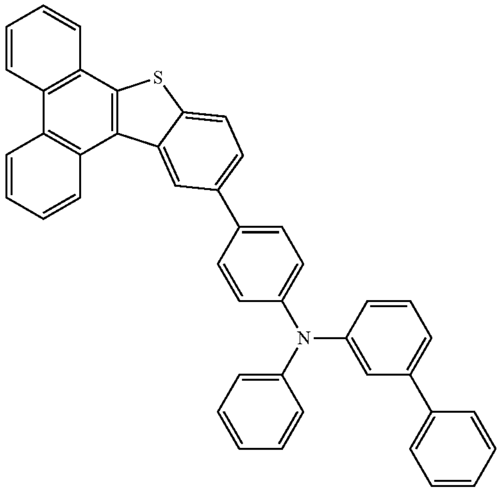
3-31
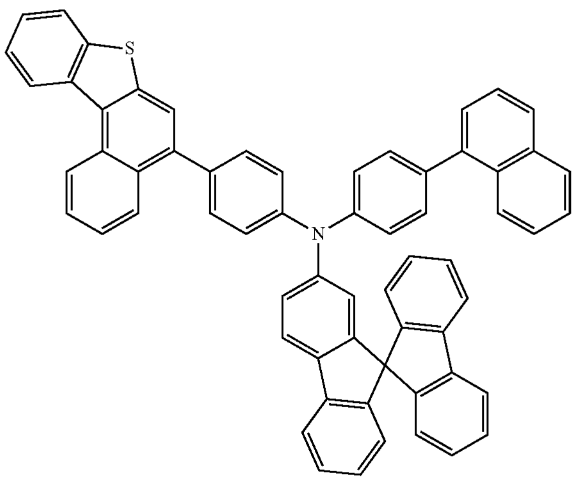
3-32
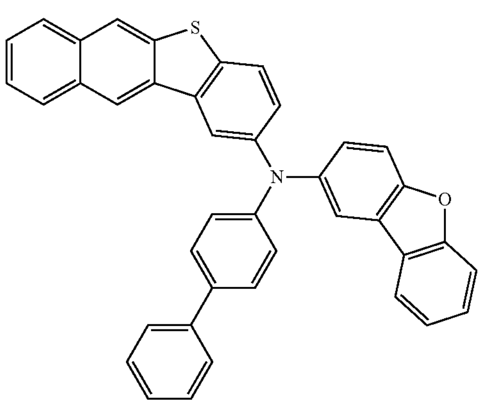
-continued
3-33
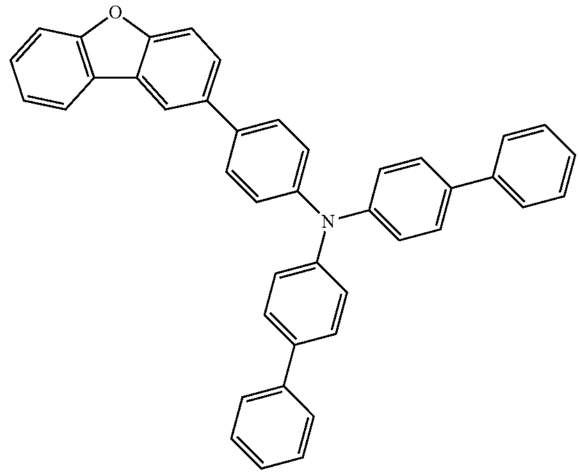
3-34
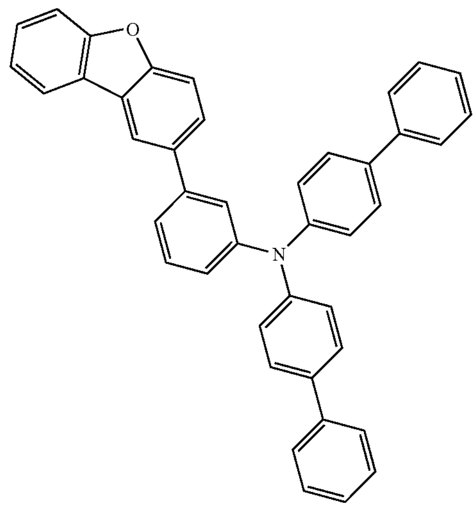
3-35
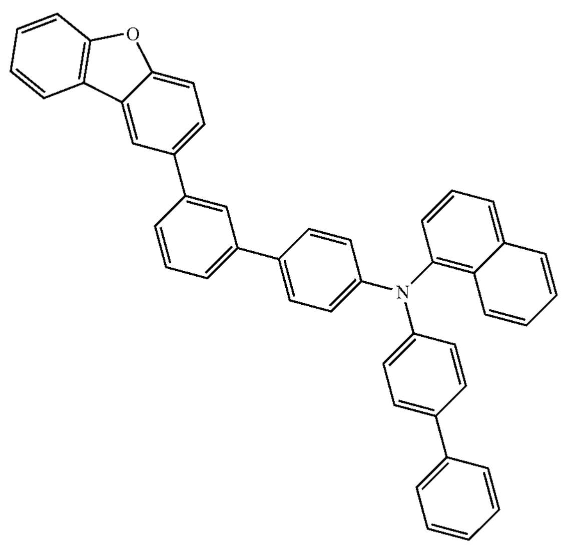

-continued
3-36
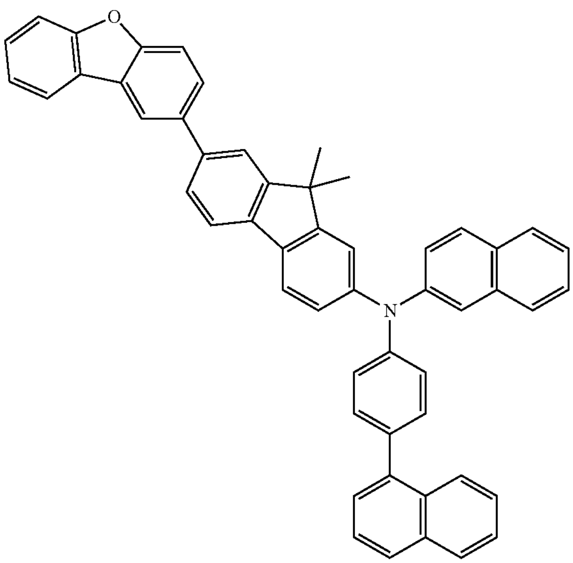
3-37
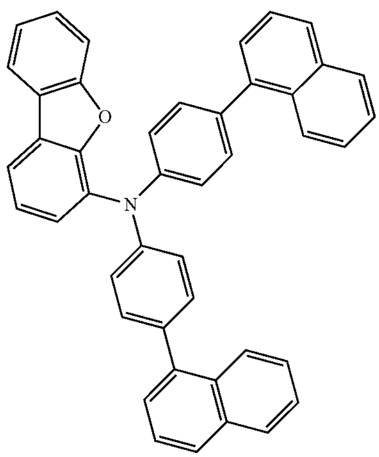
3-38
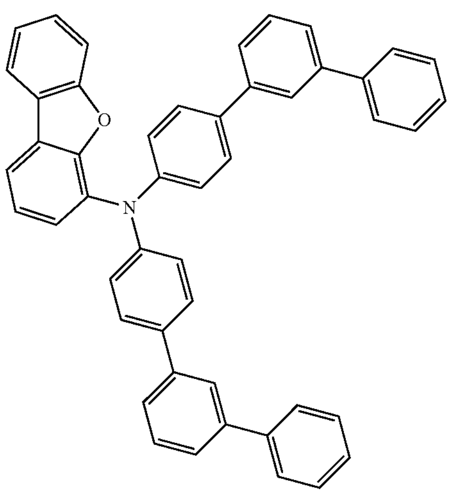
-continued
3-39
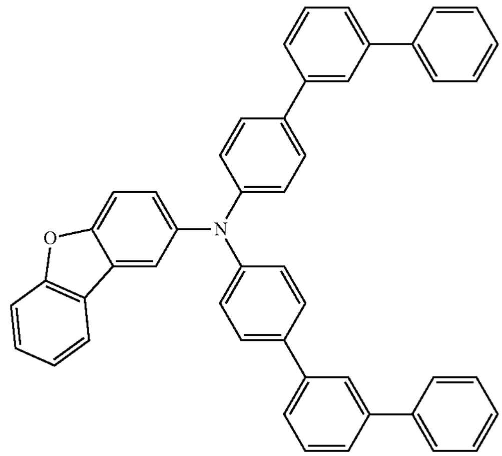
3-40
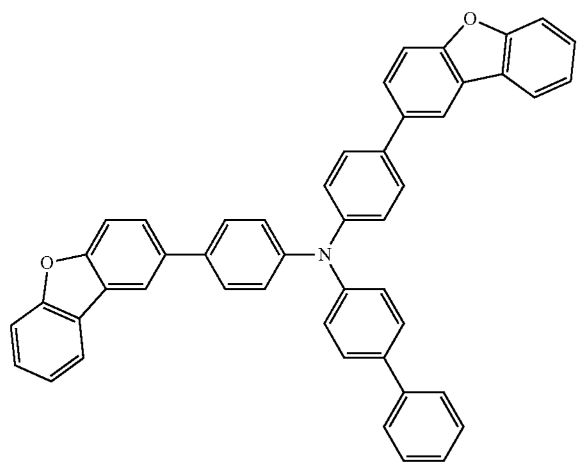
3-41
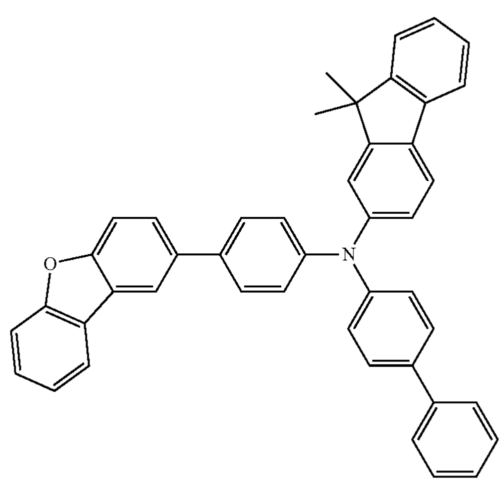

-continued
3-42
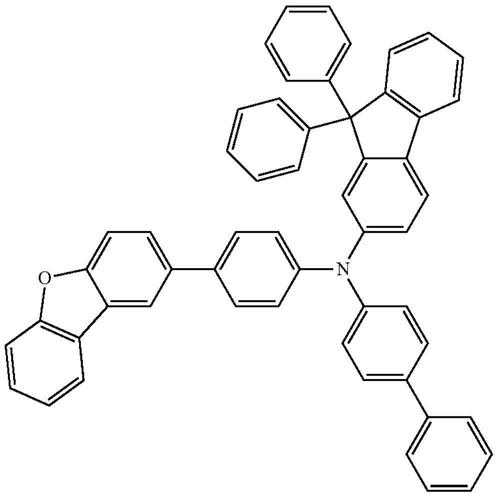
3-43
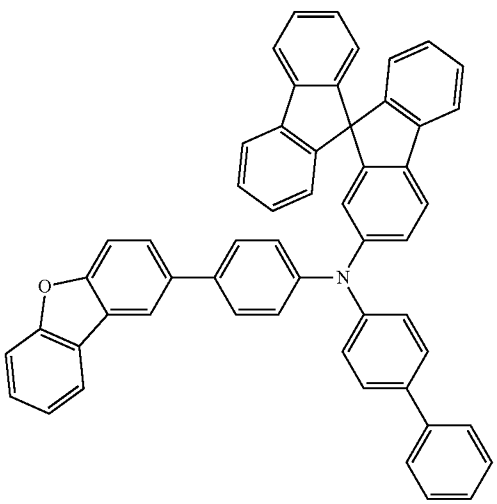
3-44
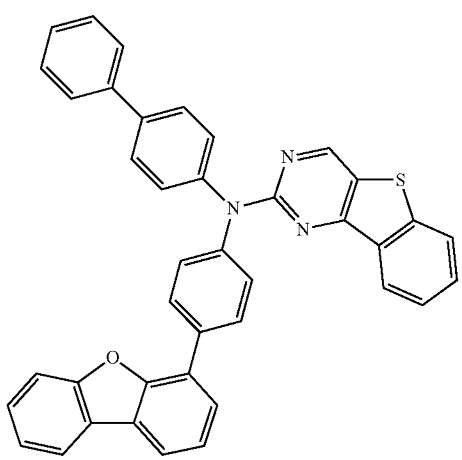
-continued
3-45
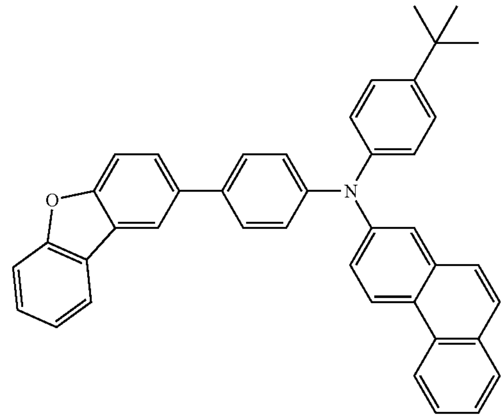
3-46
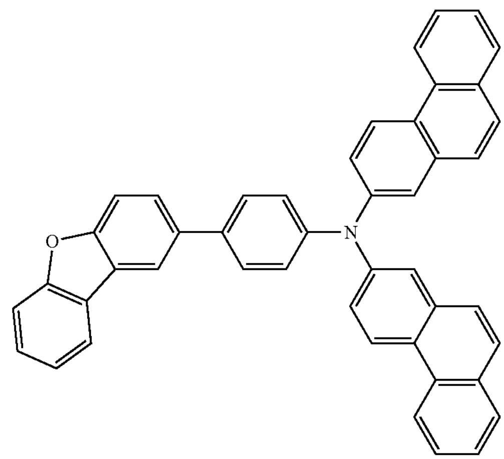
3-47
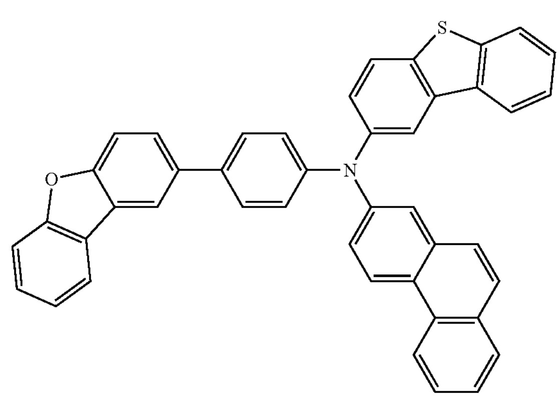

-continued
3-48
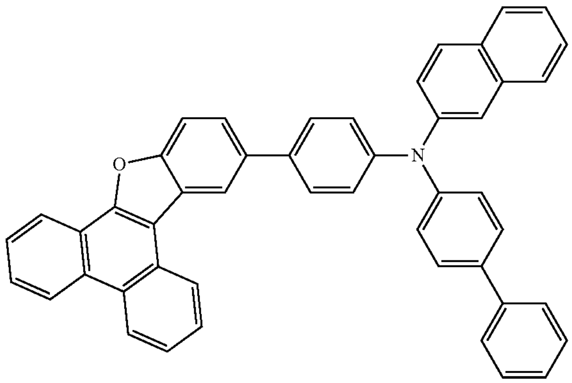
3-49
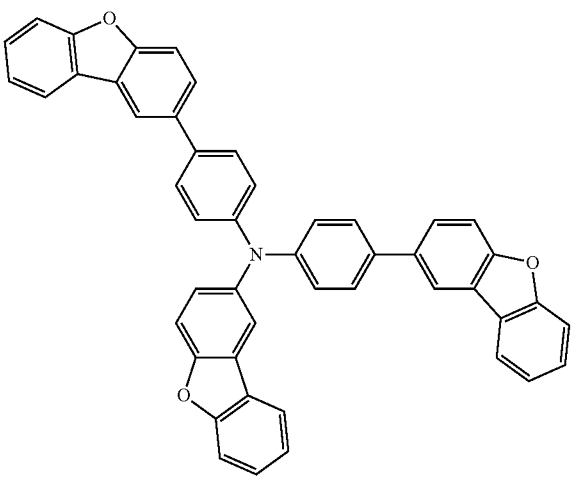
3-50
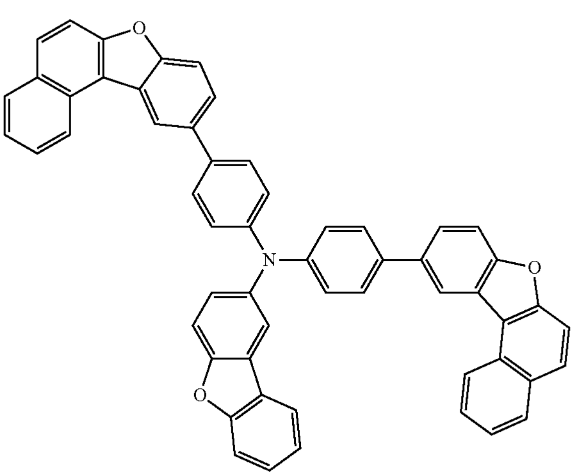
-continued
3-51
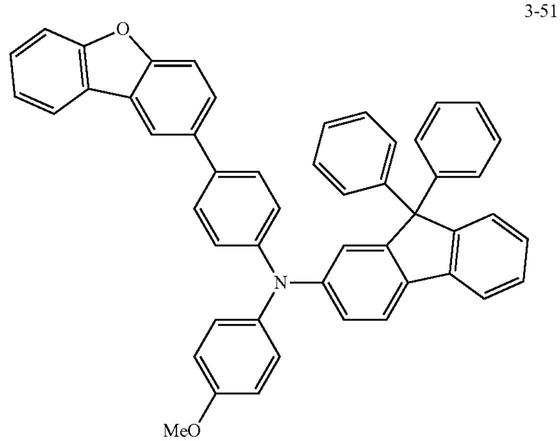
3-52
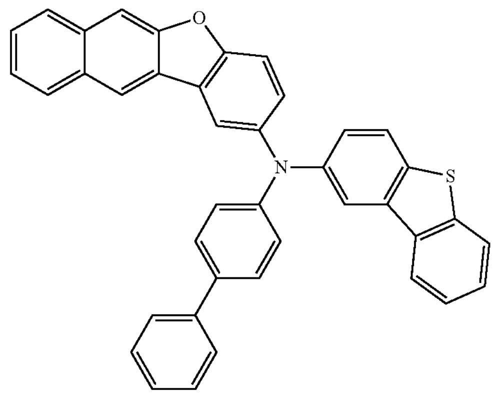
3-53
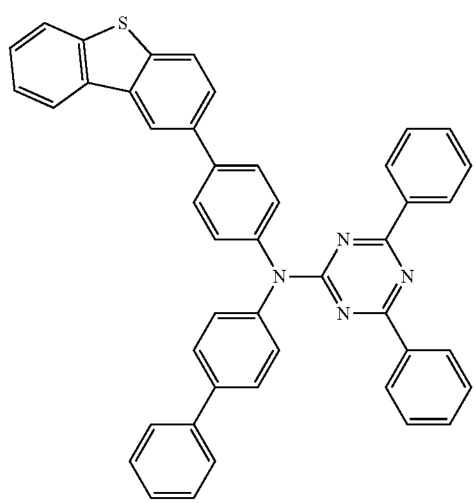

3-54
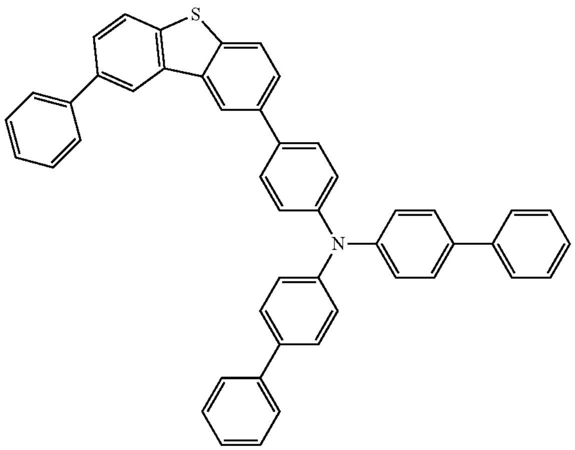
3-55
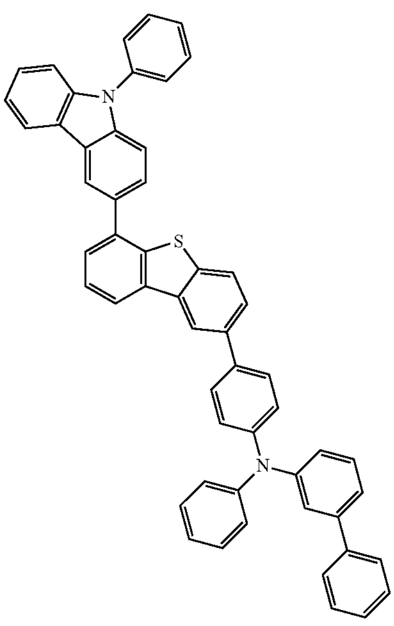
3-56
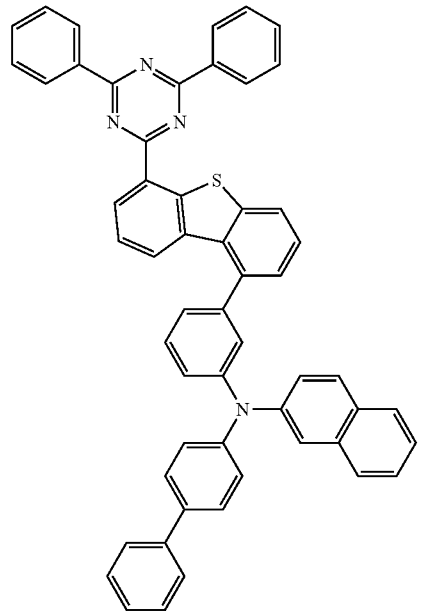
3-57
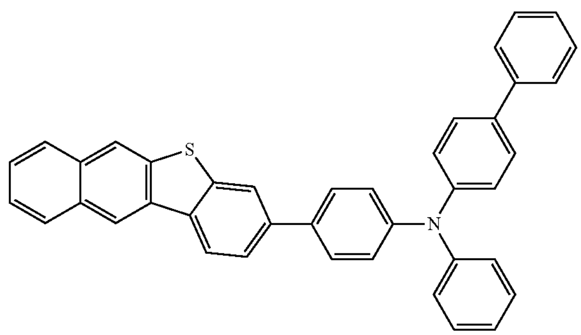
3-58
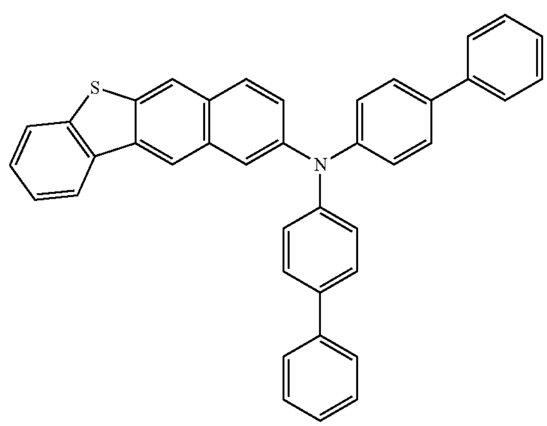

-continued
3-59
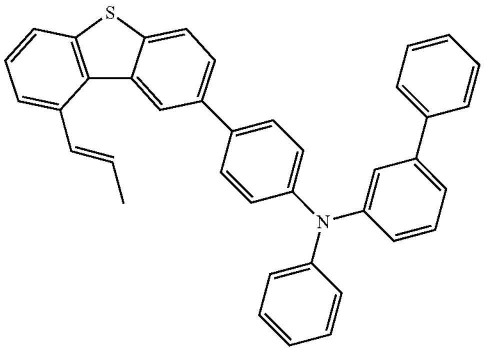
3-60
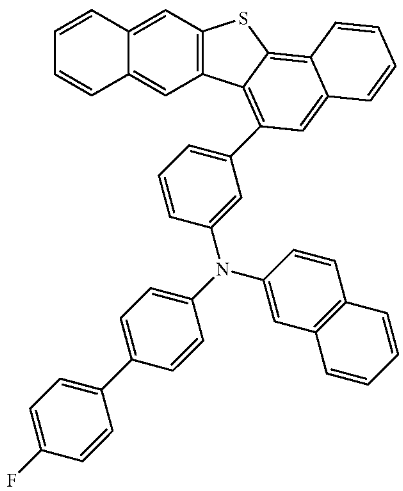
3-61
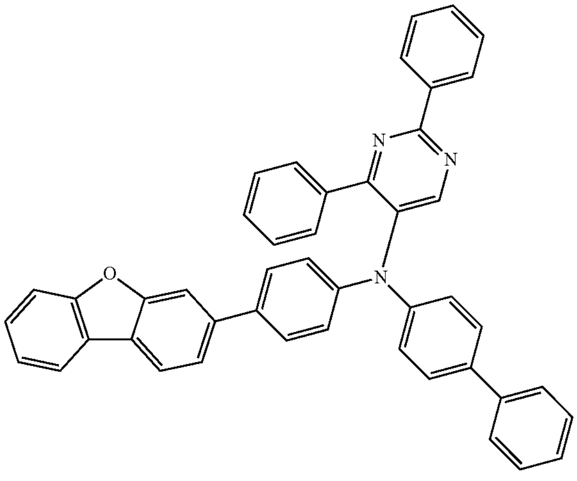
-continued
3-62
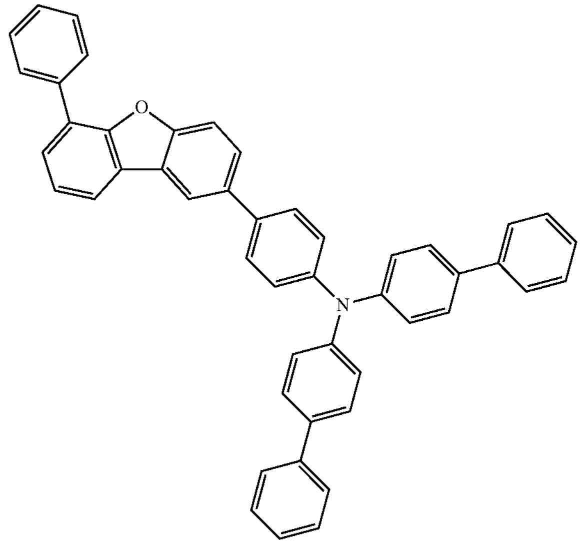
3-63
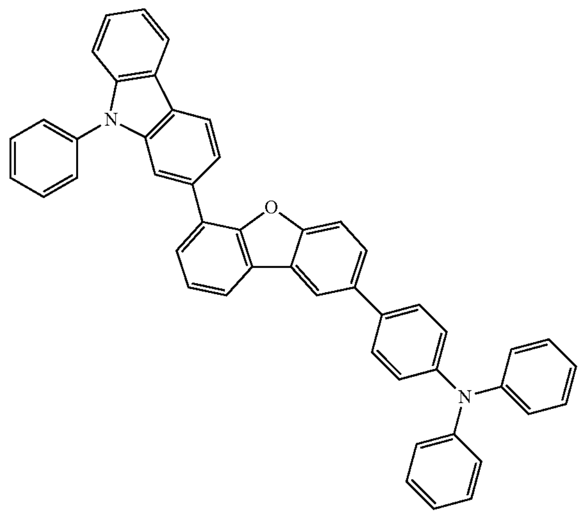
3-64
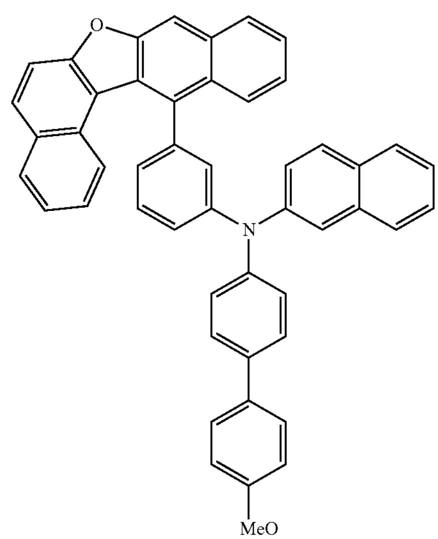

-continued
3-65
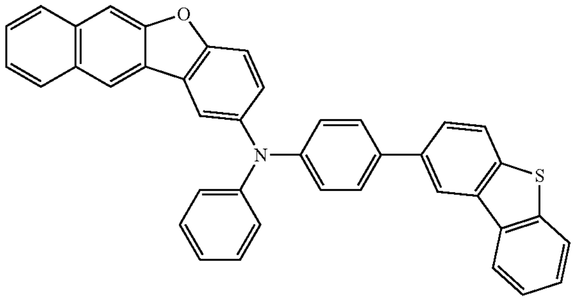
3-66
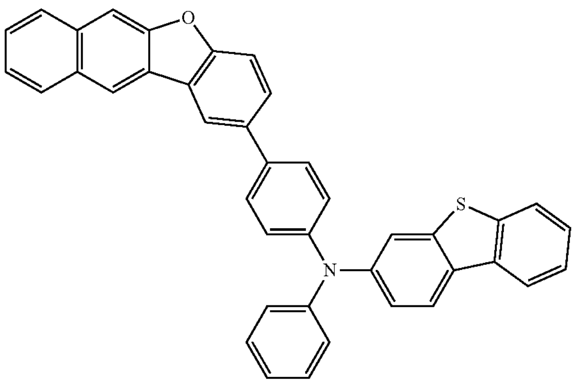
3-67
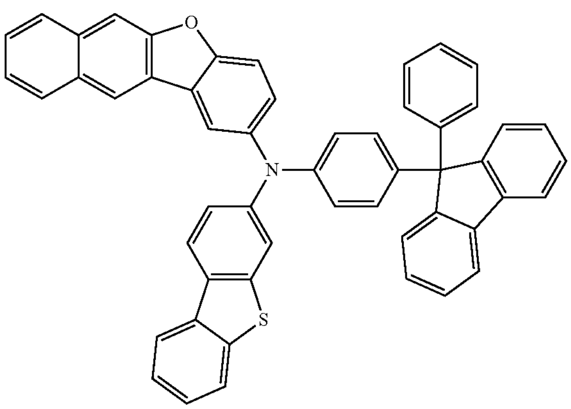
3-68
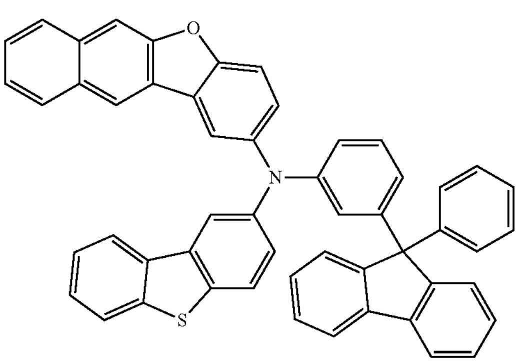
-continued
3-69
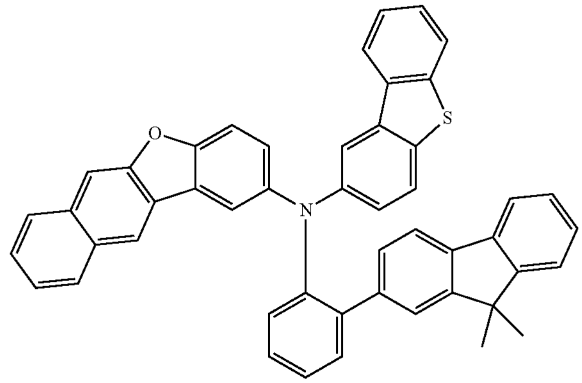
3-70
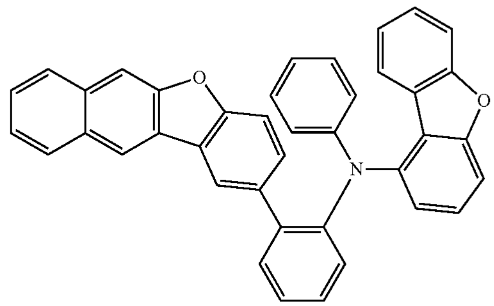
3-71
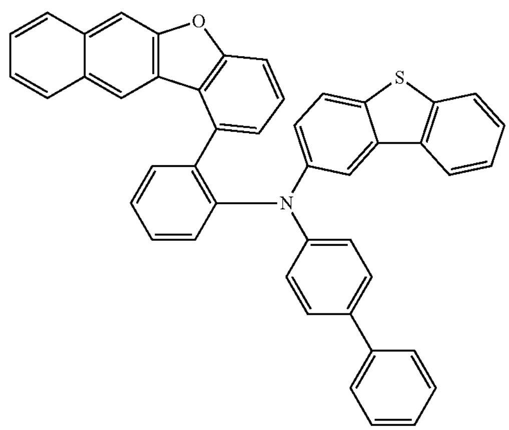
3-72
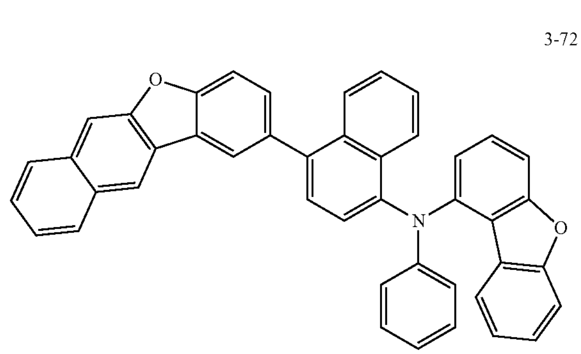

-continued
3-73
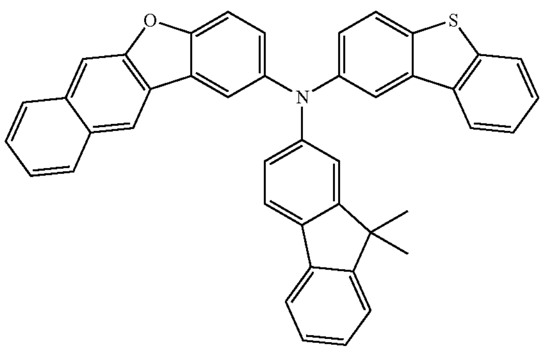
3-74
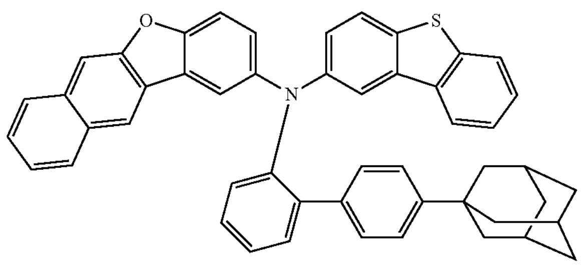
3-75
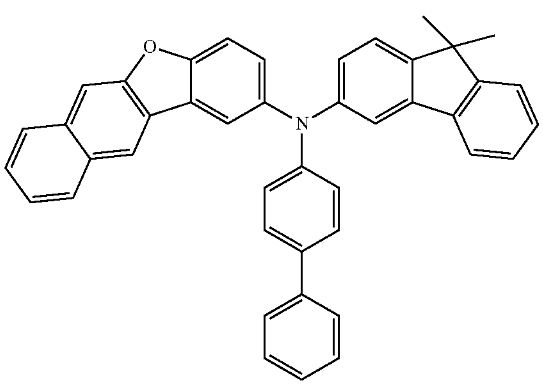
3-76
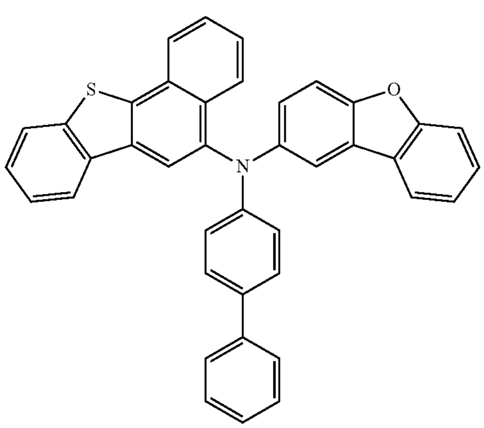
-continued
4-1
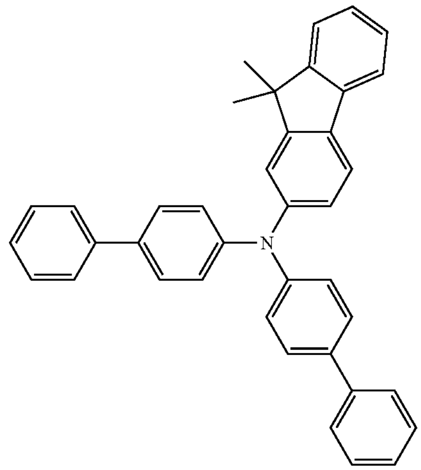
4-2
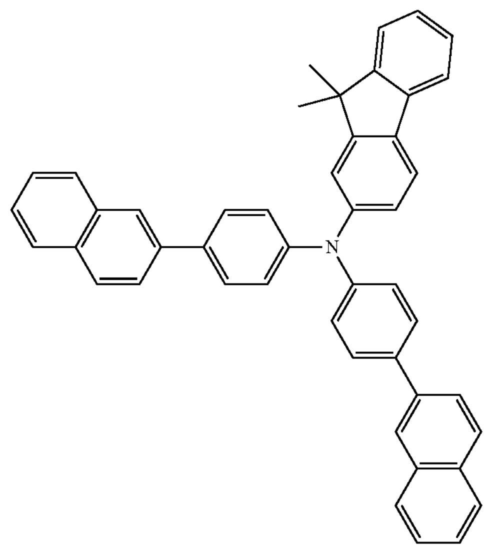
4-3
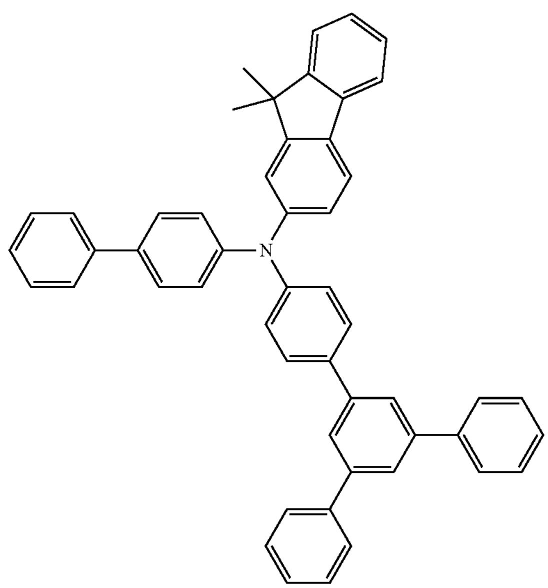

-continued
4-4
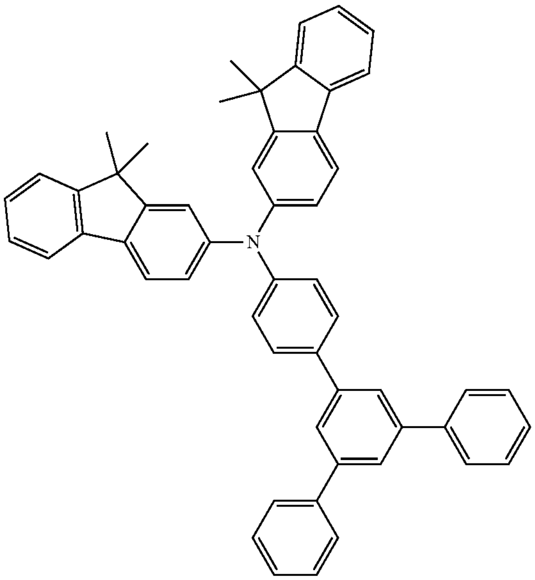
4-5
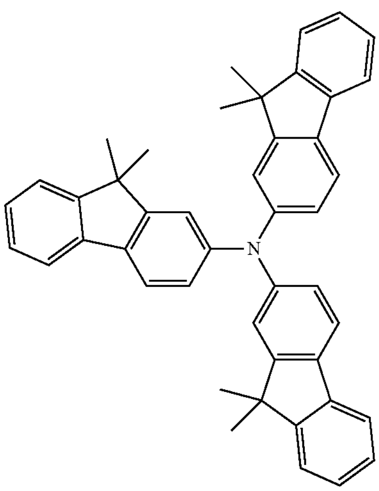
4-6
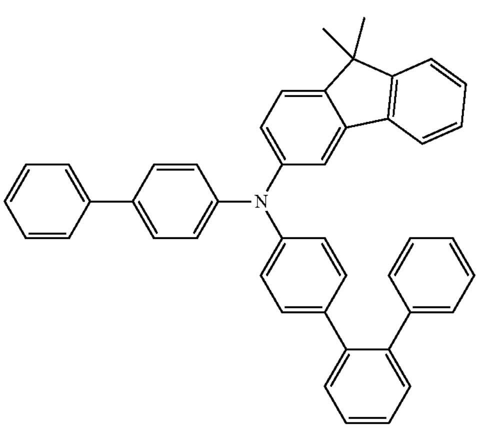
-continued
4-7
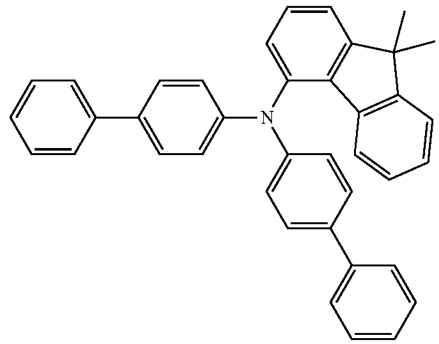
4-8
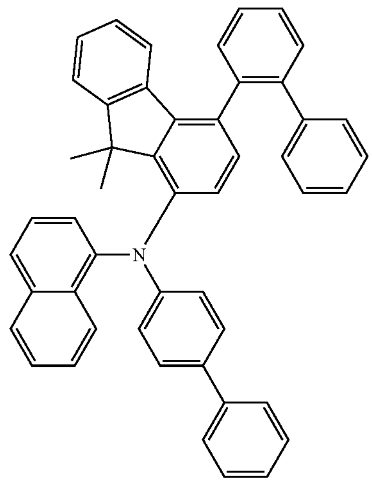
4-9
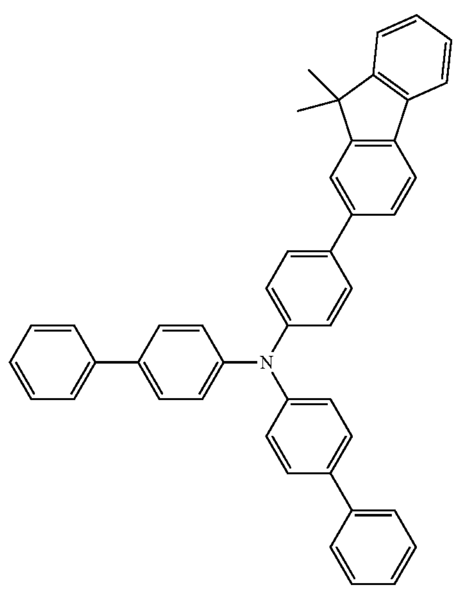

-continued
4-10
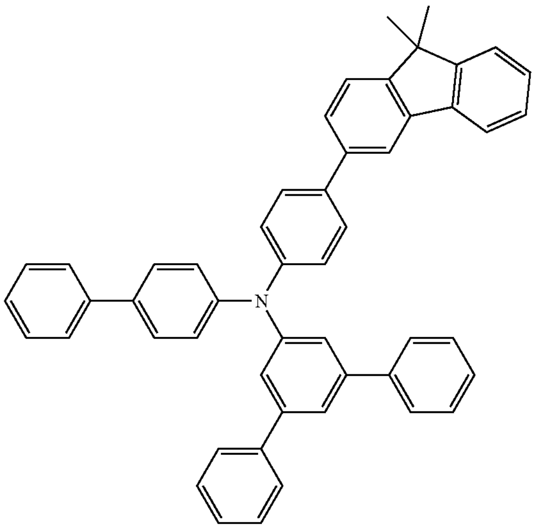
4-11
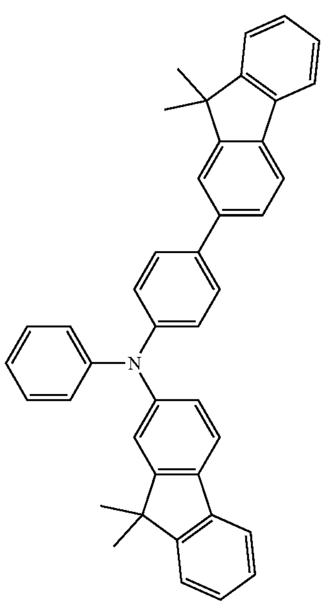
-continued
4-12
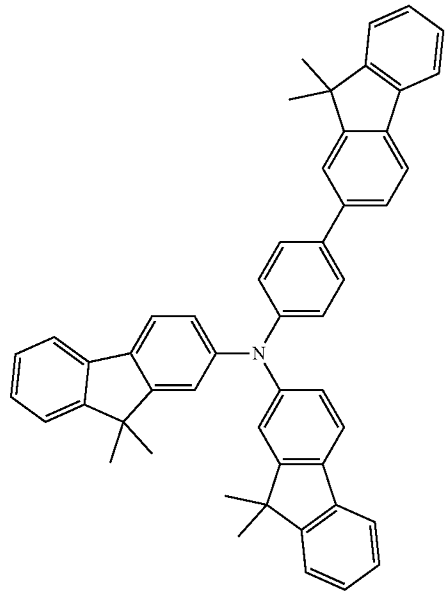
4-13
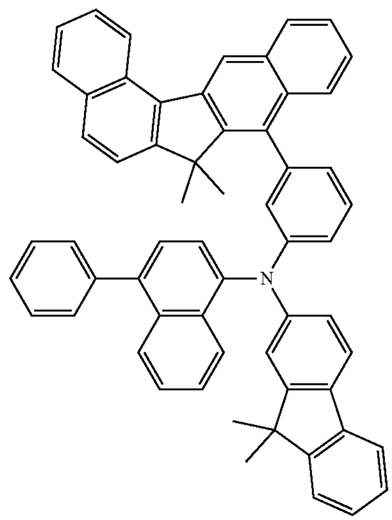
4-14
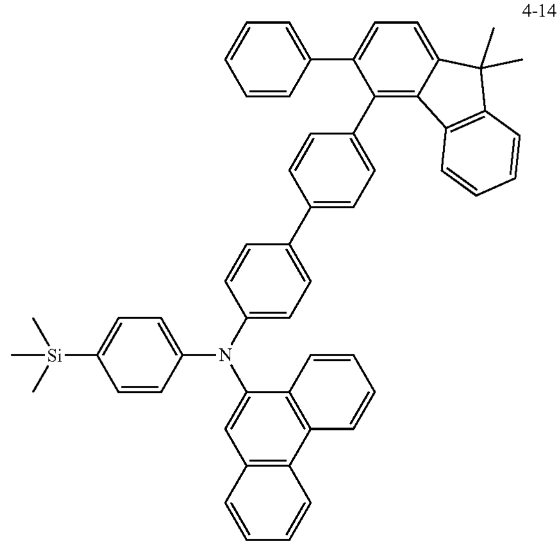

4-15
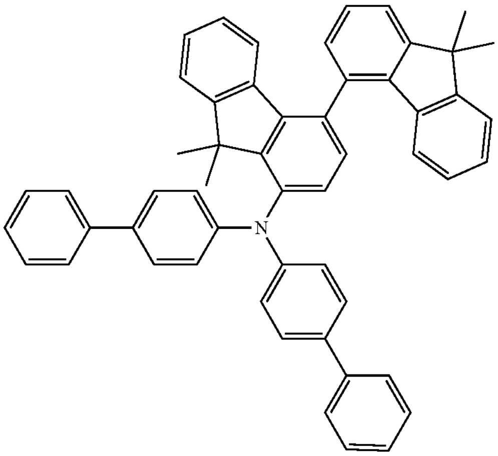
4-16
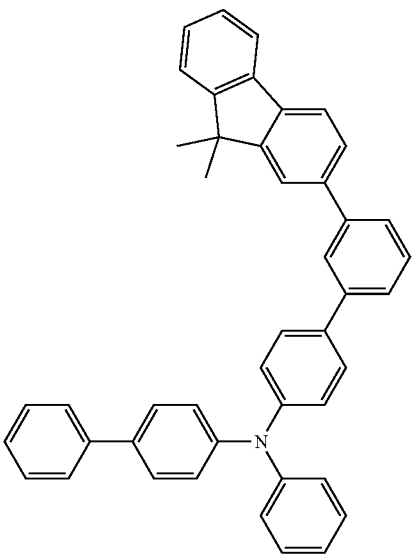
4-17
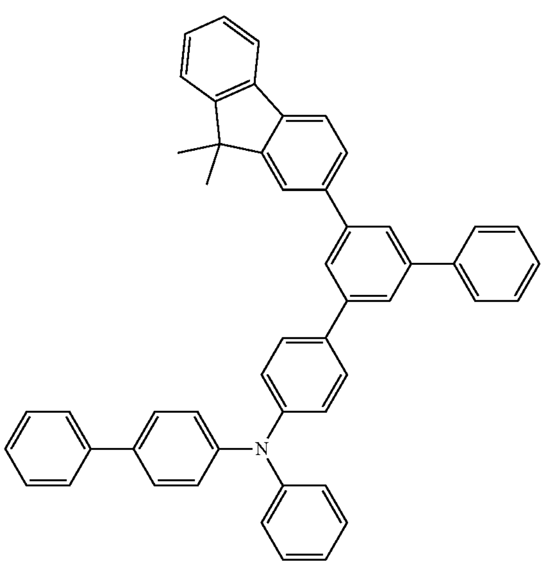
4-18
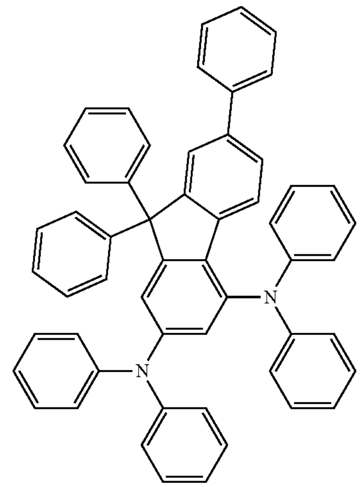
4-19
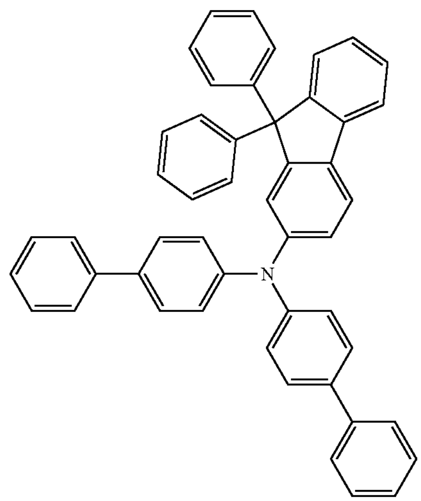
4-20
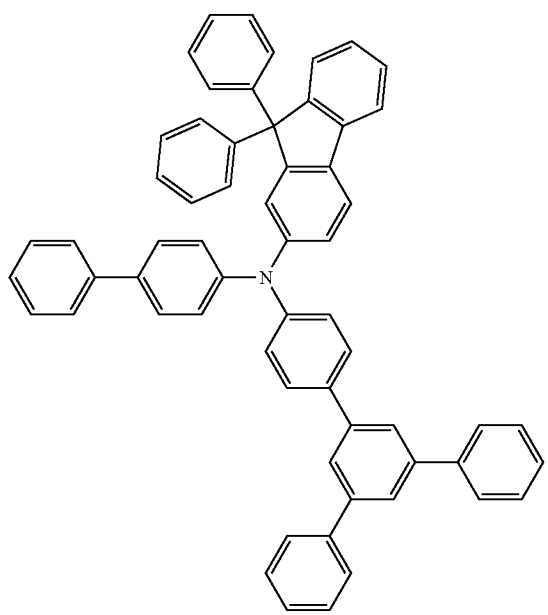

-continued
4-21
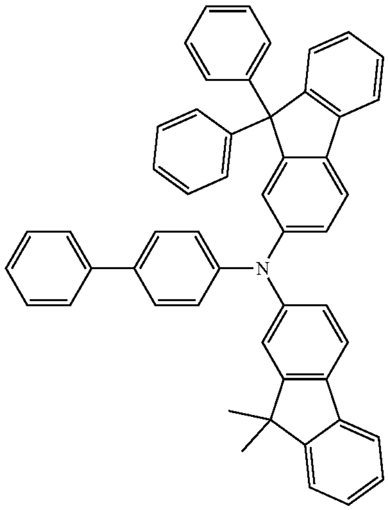
4-22
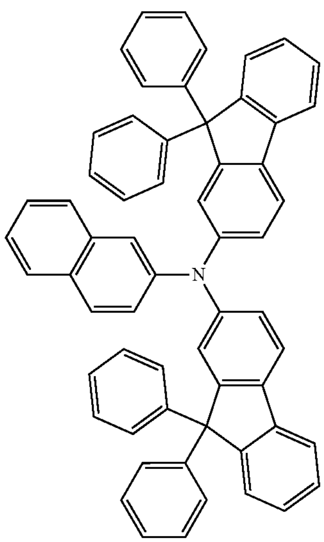
4-23
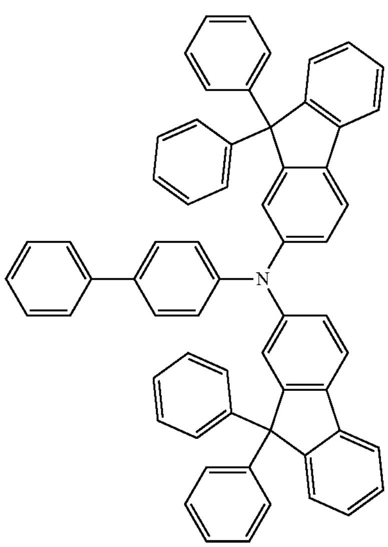
-continued
4-24
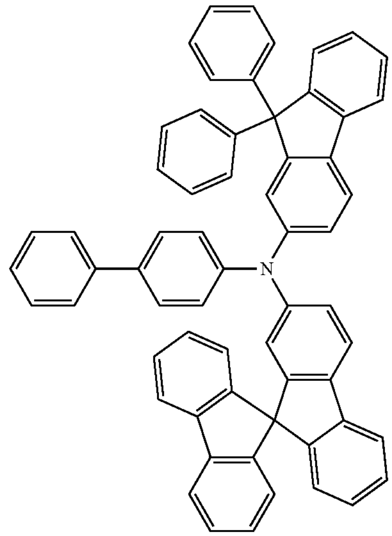
4-25
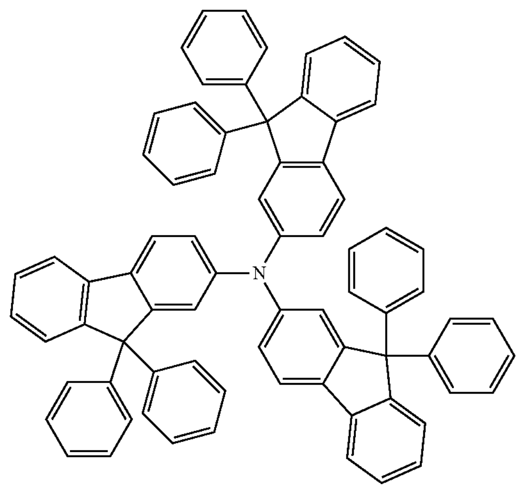
4-26
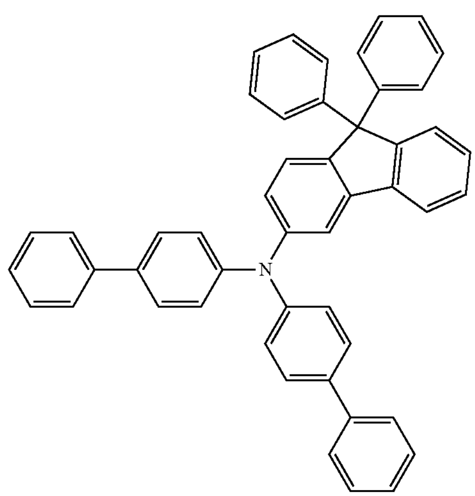

-continued
4-27
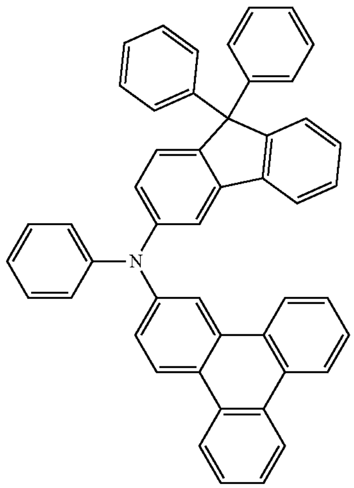
4-28
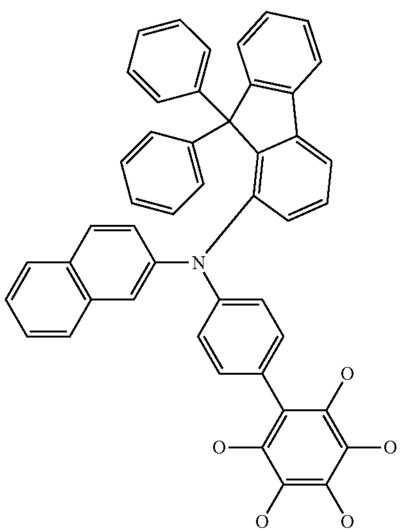
4-29
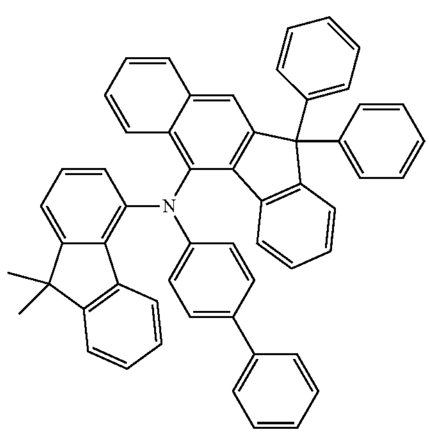
-continued
4-30
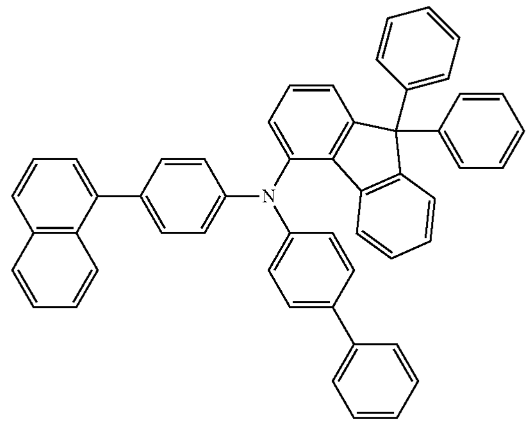
4-31
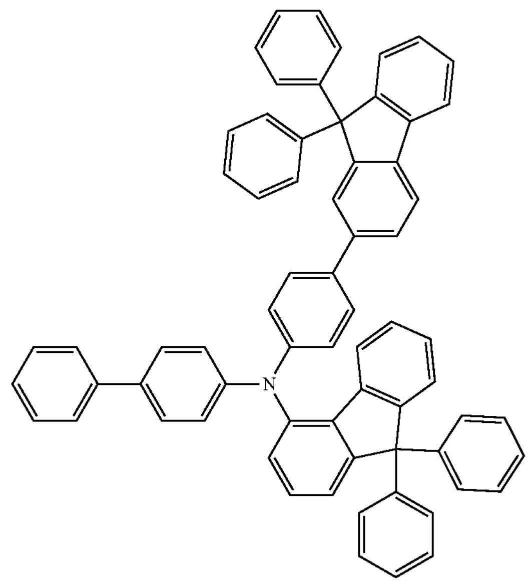
4-32
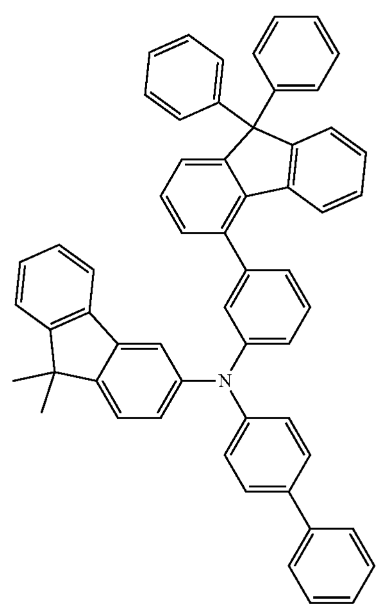

-continued
4-33
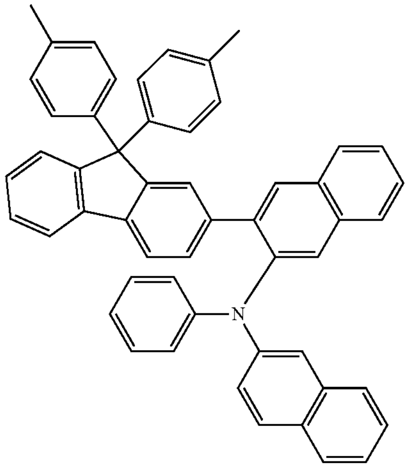
4-34
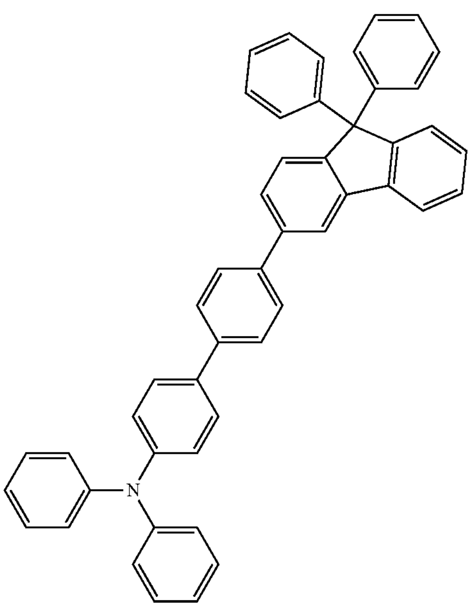
-continued
4-35
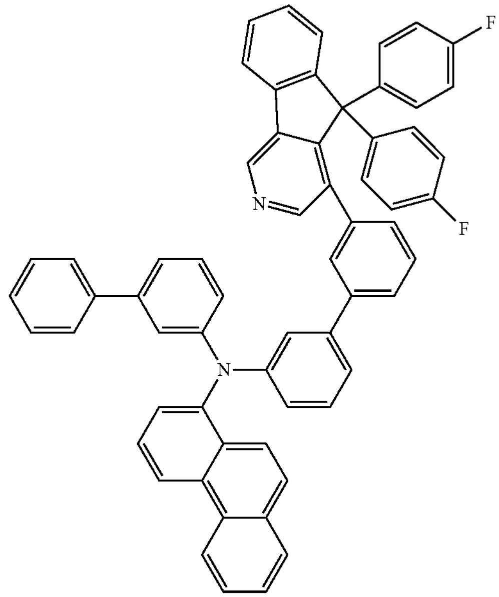
4-36
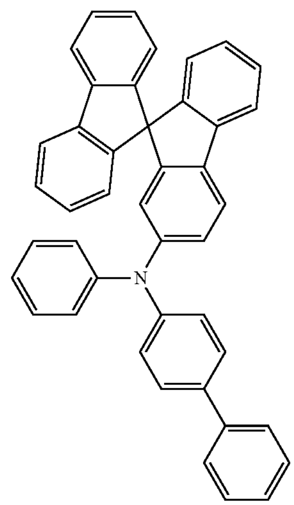
4-37
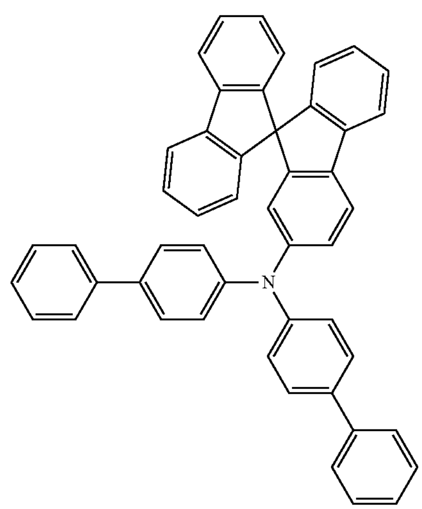

-continued
4-38
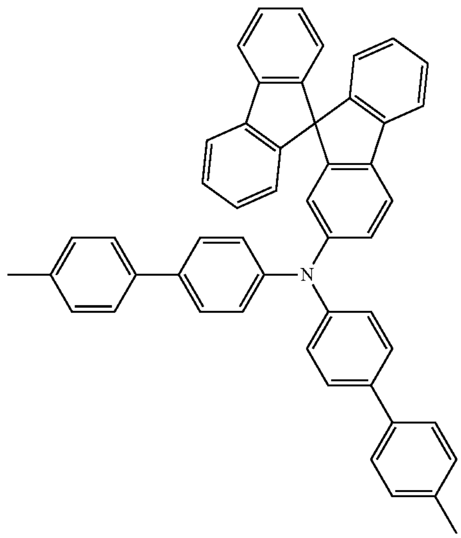
4-39
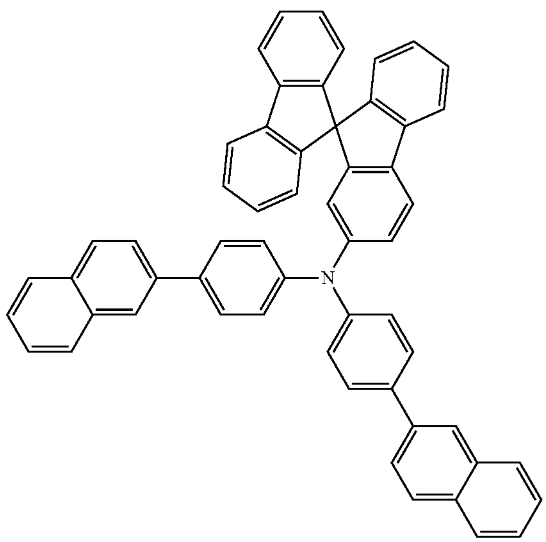
4-40
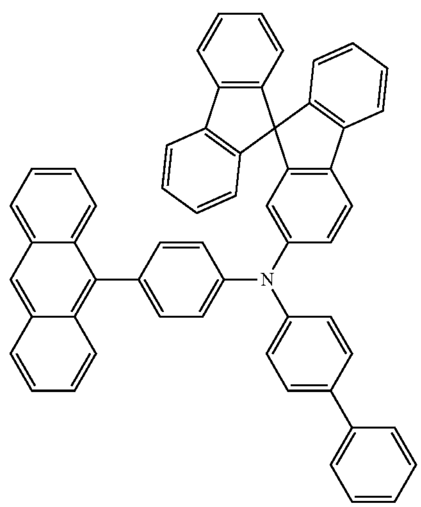
-continued
4-41
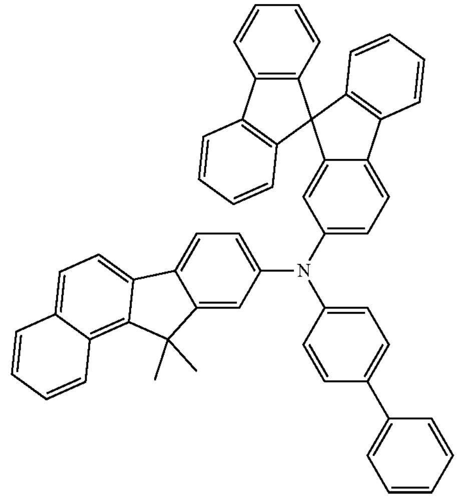
4-42
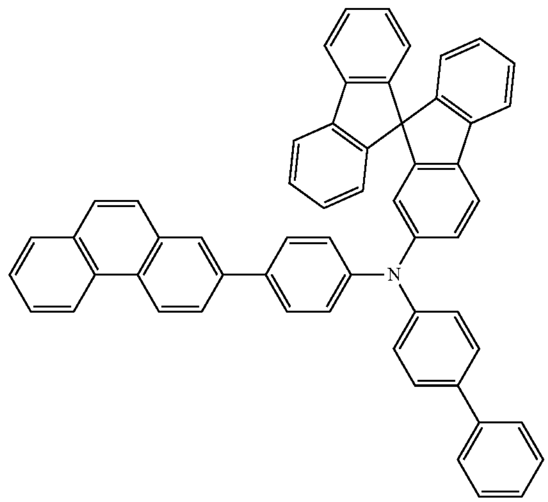
4-43
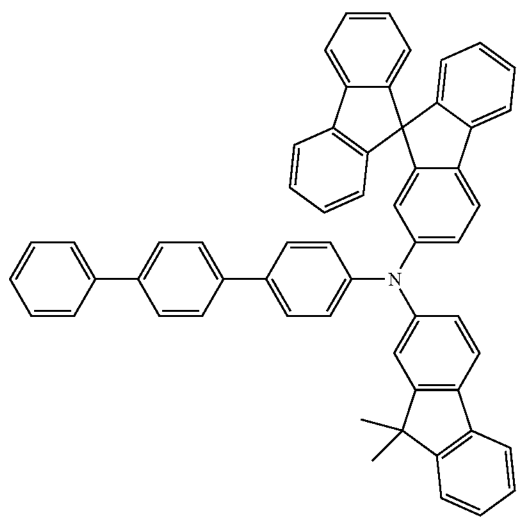

-continued
4-44
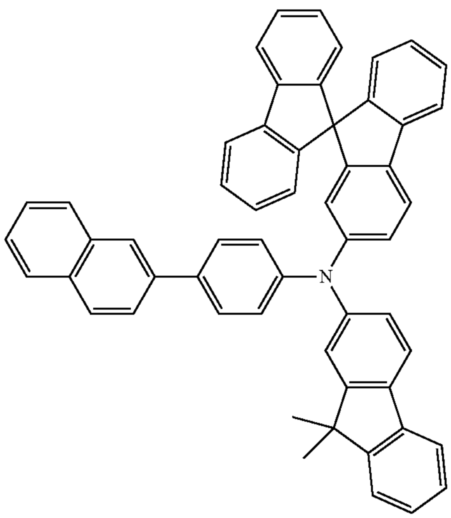
4-45
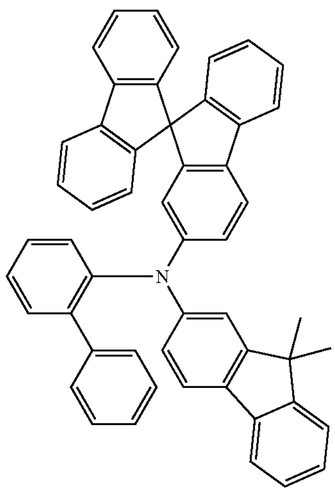
4-46
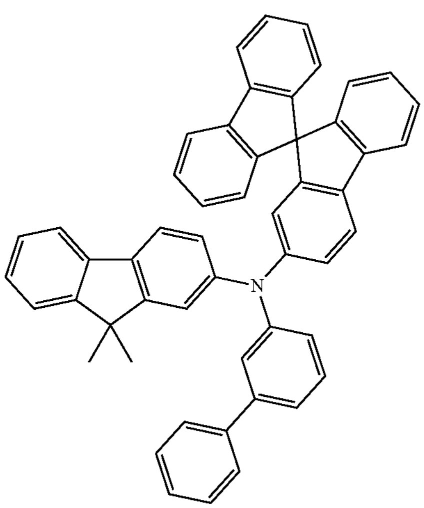
-continued
4-47
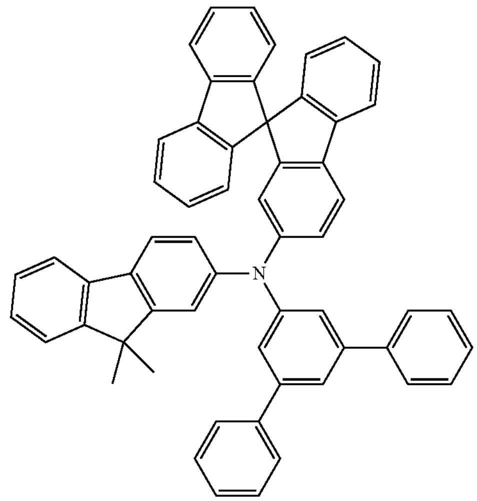
4-48
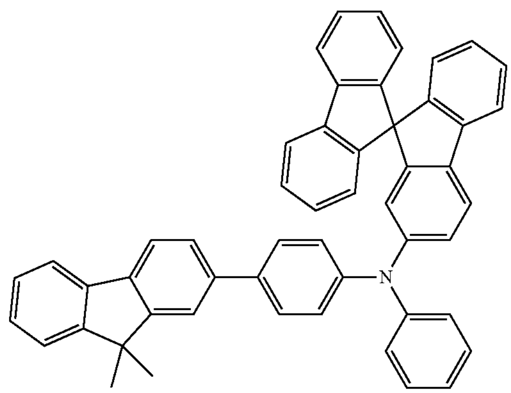
4-49
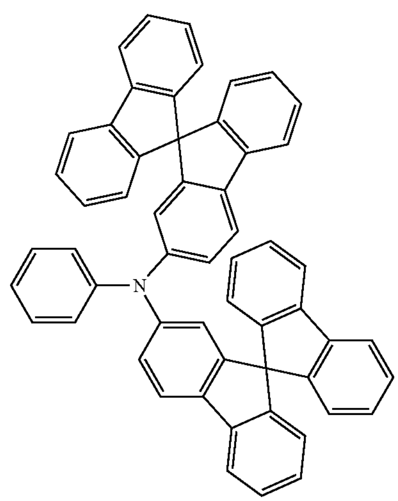

-continued
4-50
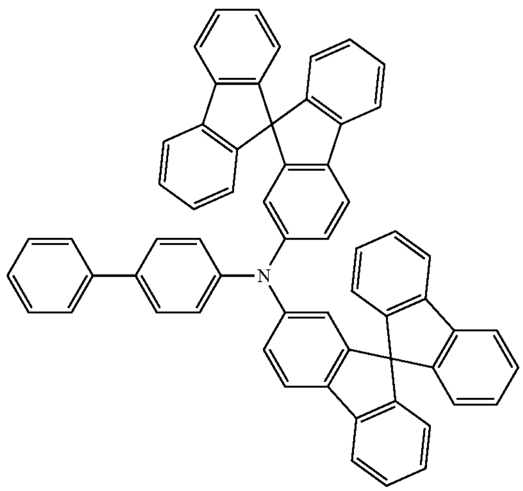
4-51
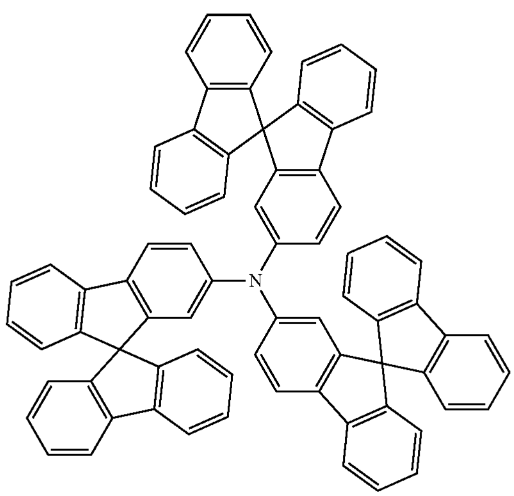
4-52
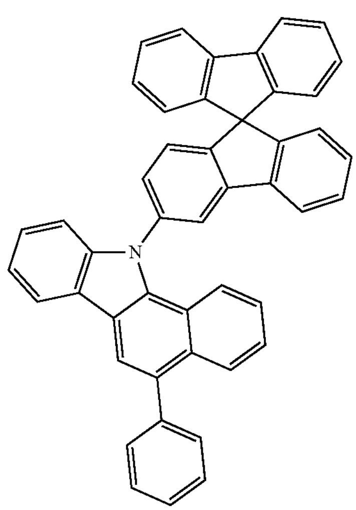
-continued
4-53
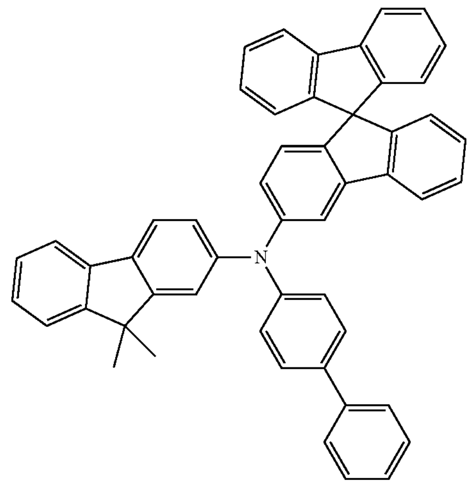
4-54
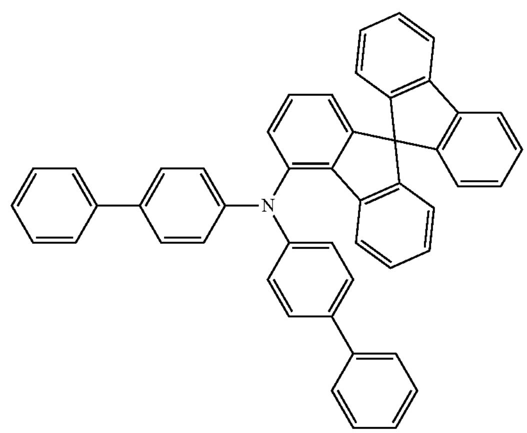
4-55
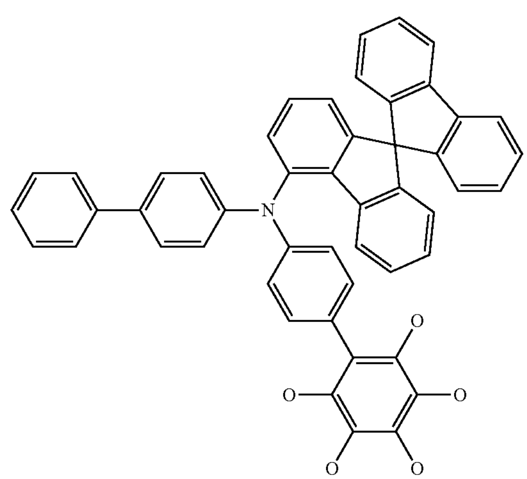

-continued
4-56
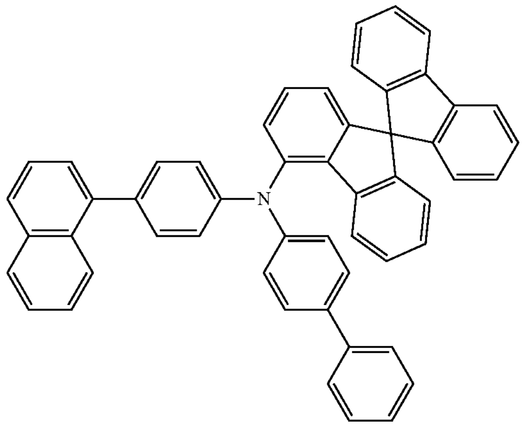
4-57
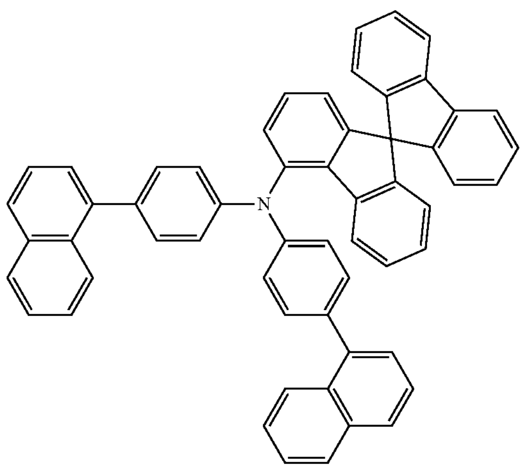
4-58
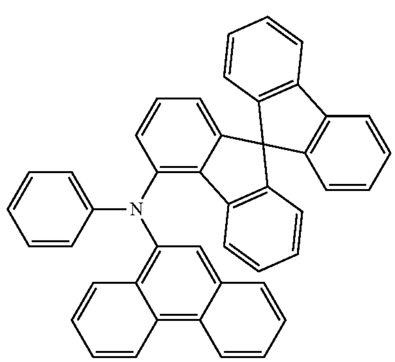
-continued
4-59
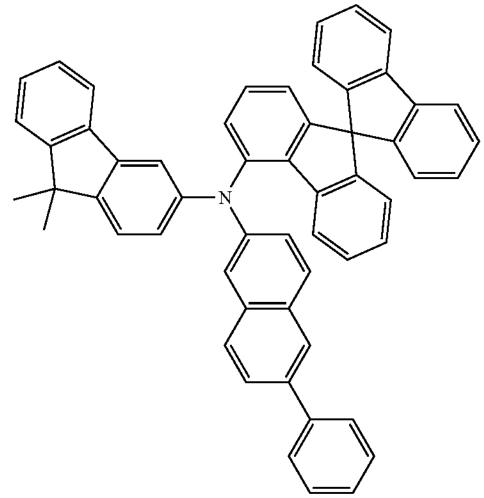
4-60
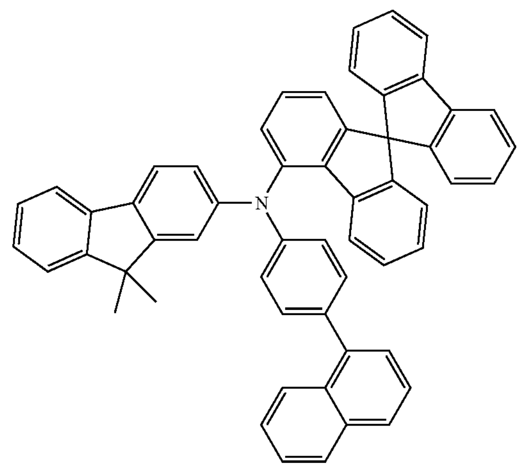
4-61
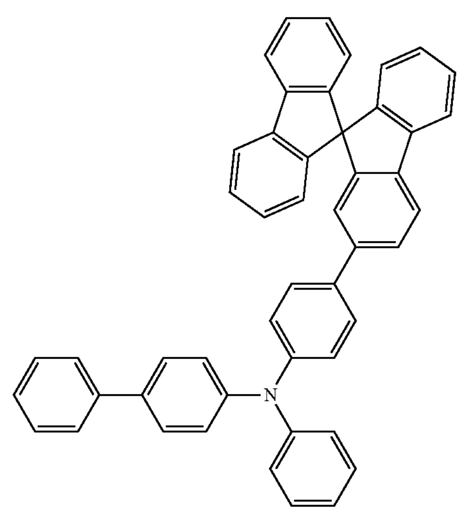

-continued
4-62
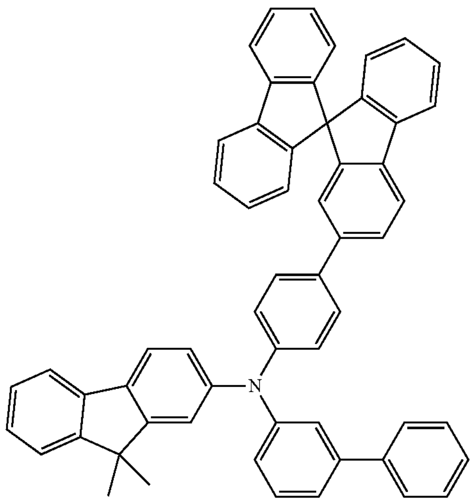
4-63
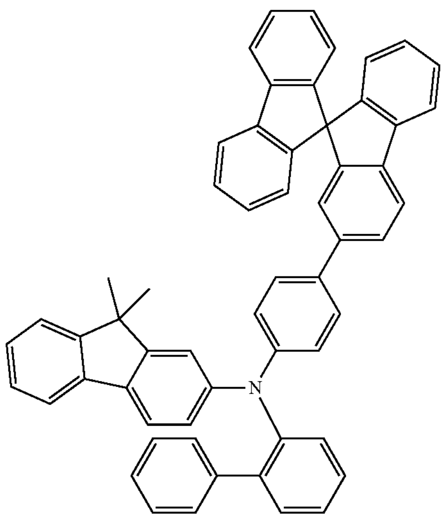
4-64
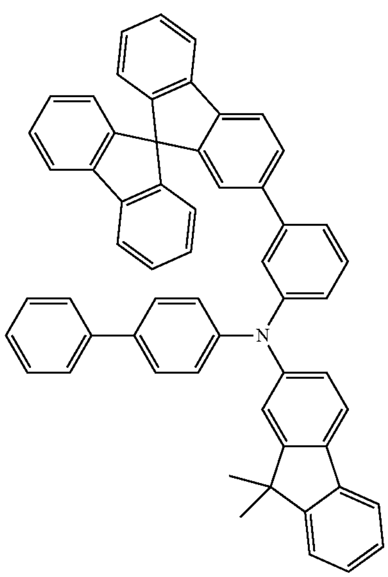
-continued
4-65
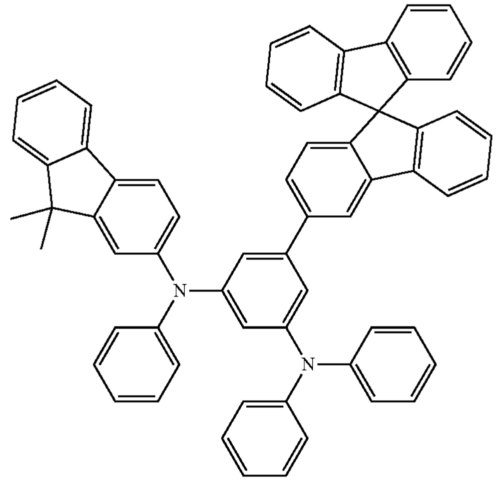
4-66
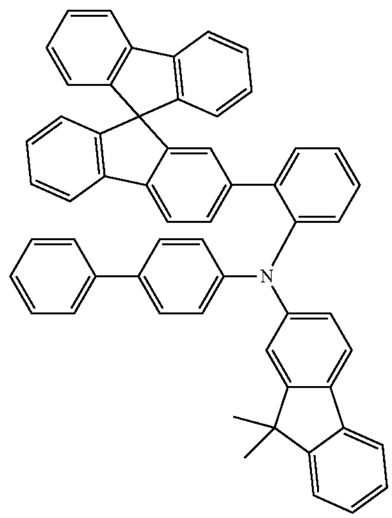
4-67
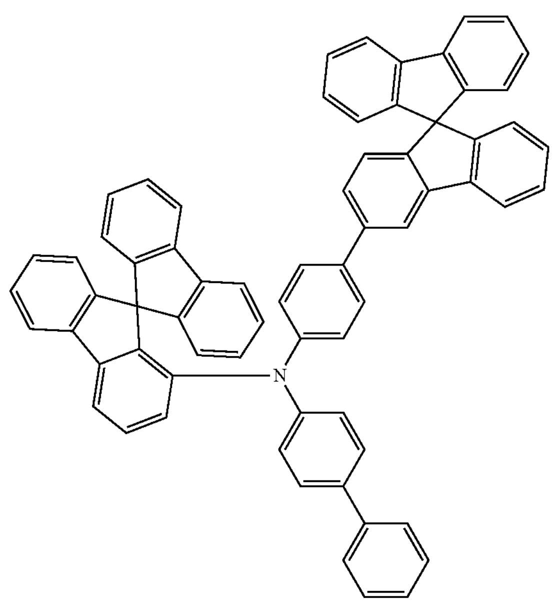

4-68
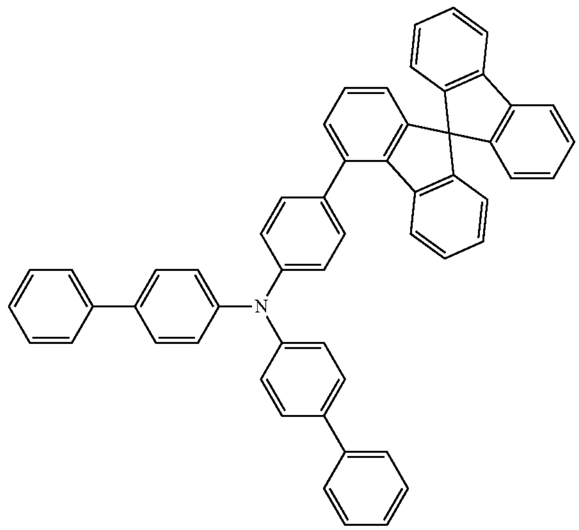
4-69
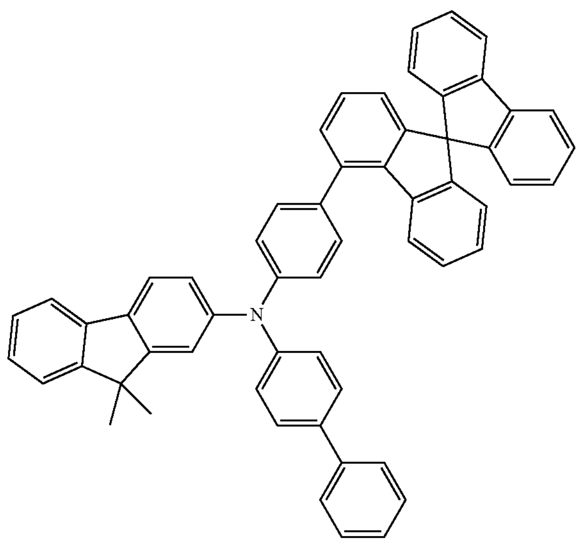
4-70
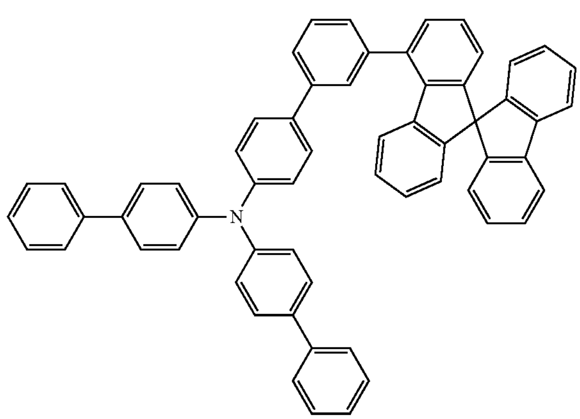
5-1
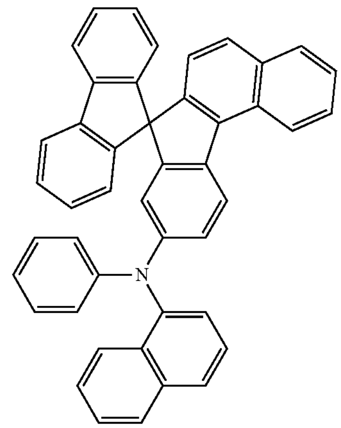
5-2
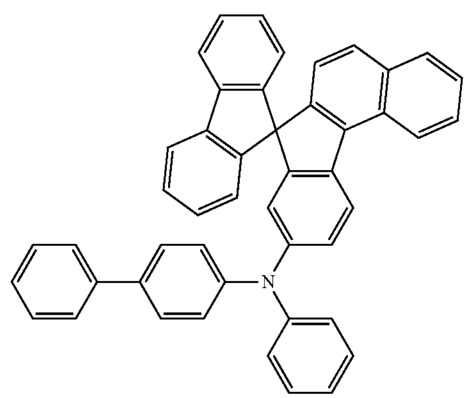
5-3
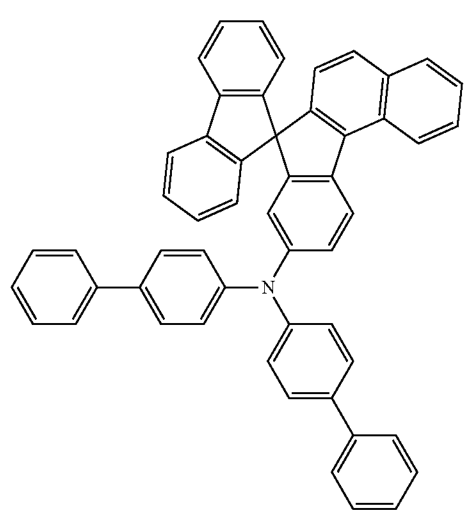

-continued
5-4
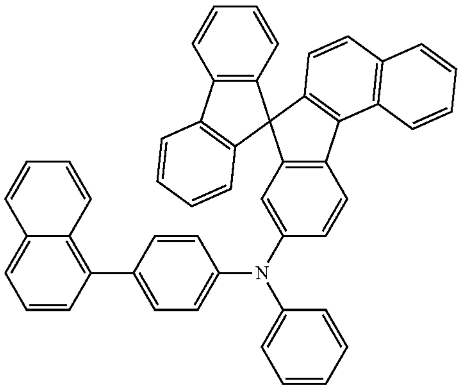
5-5
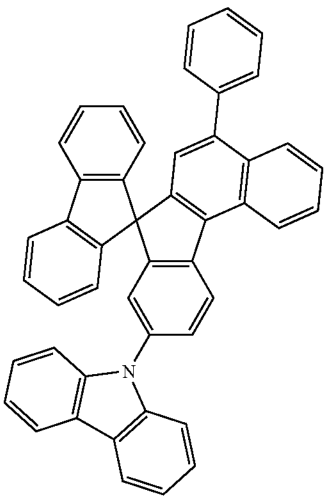
5-6
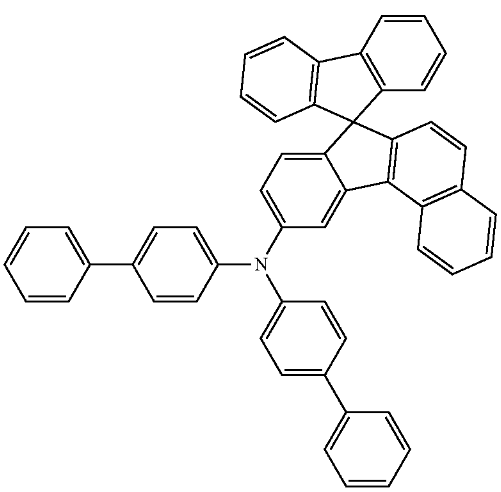
-continued
5-7
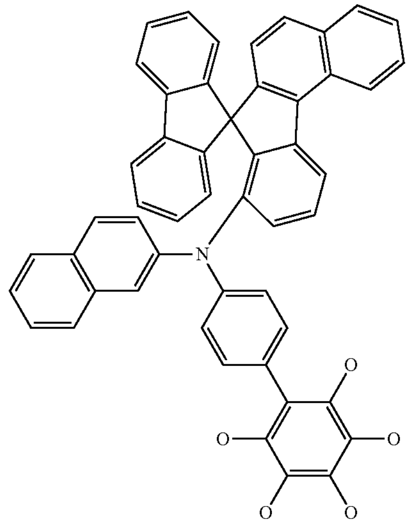
5-8
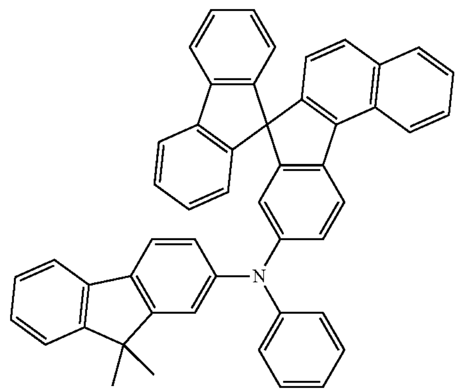
5-9
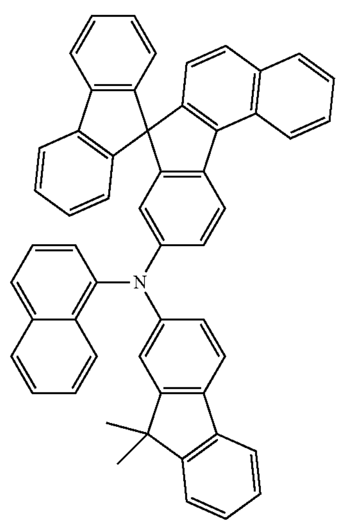

-continued
5-10
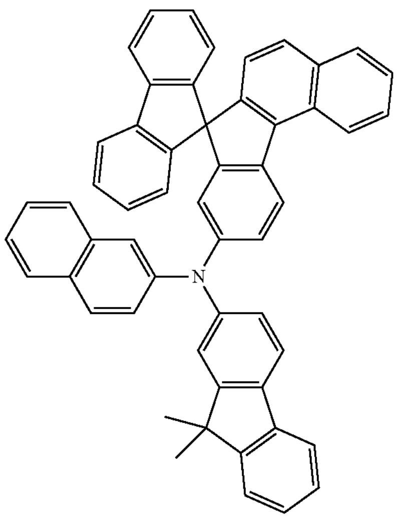
5-11
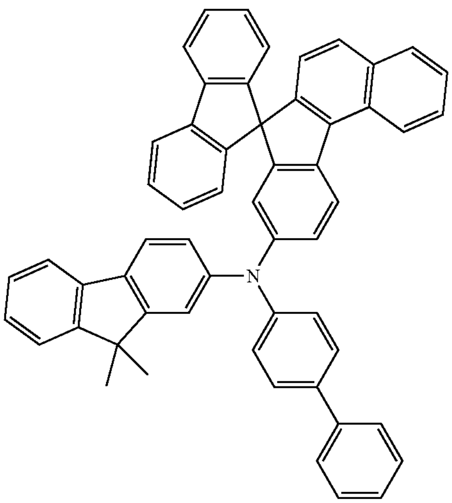
5-12
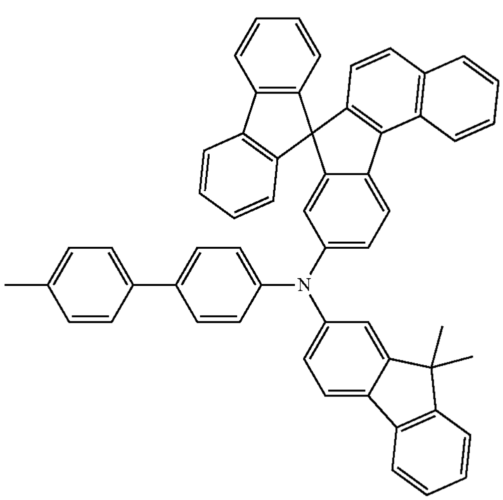
-continued
5-13
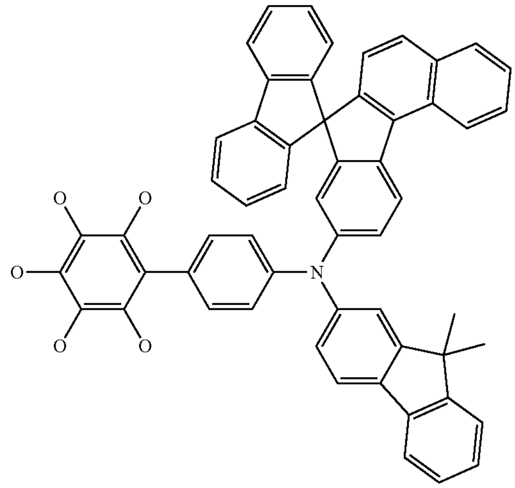
5-14
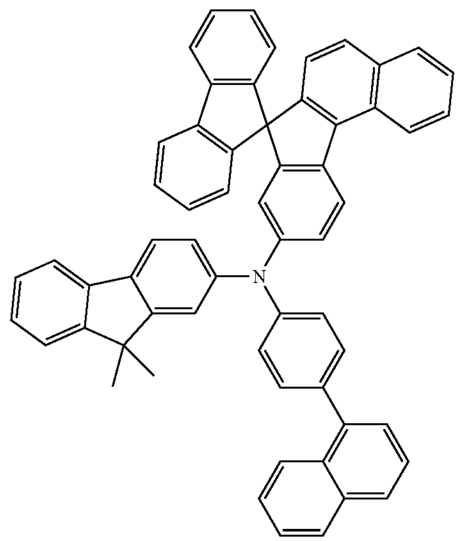
5-15
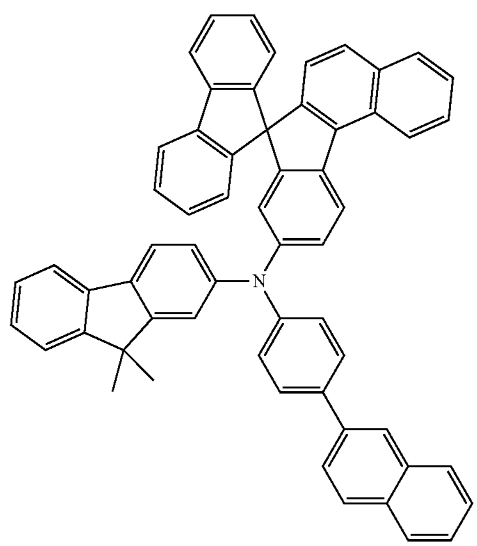

-continued
5-16
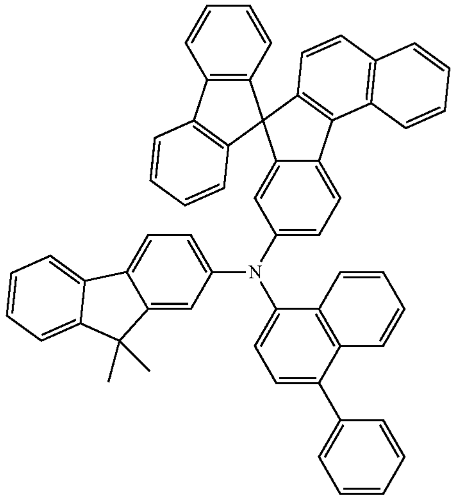
5-17
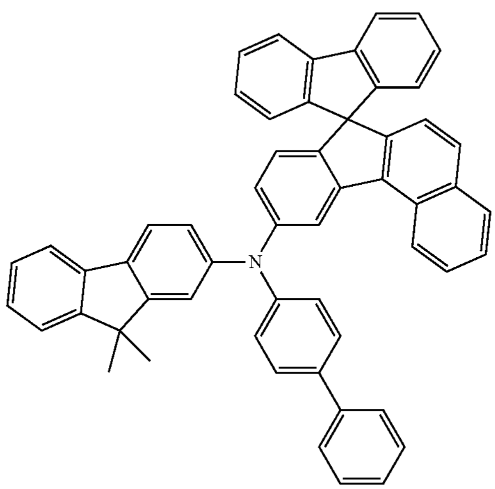
5-18
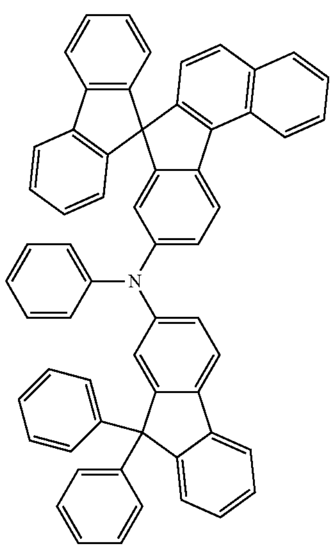
-continued
5-19
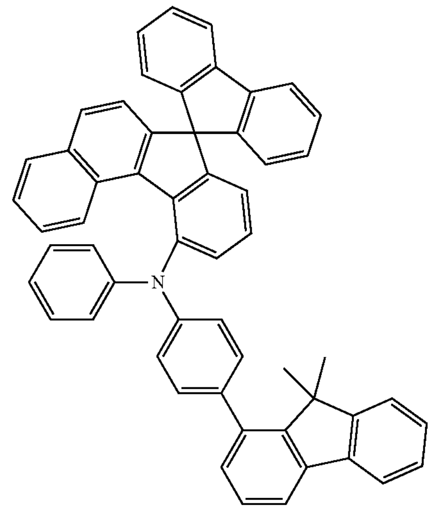
5-20
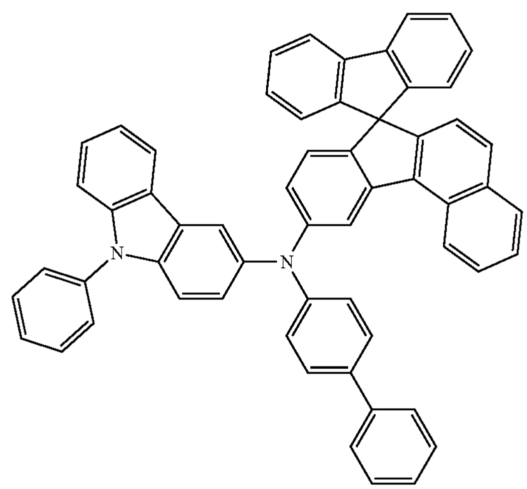
5-21
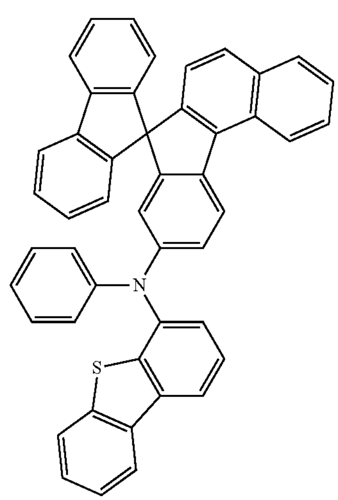

5-22
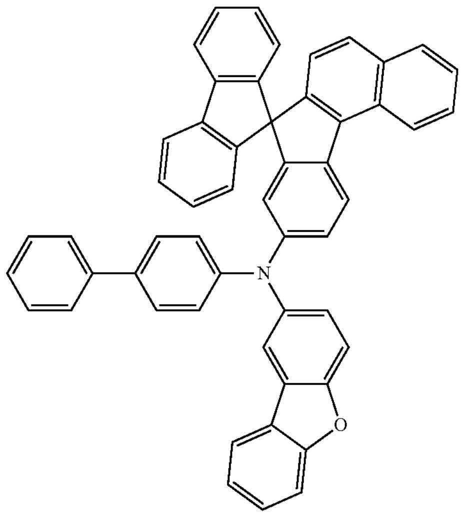
5-23
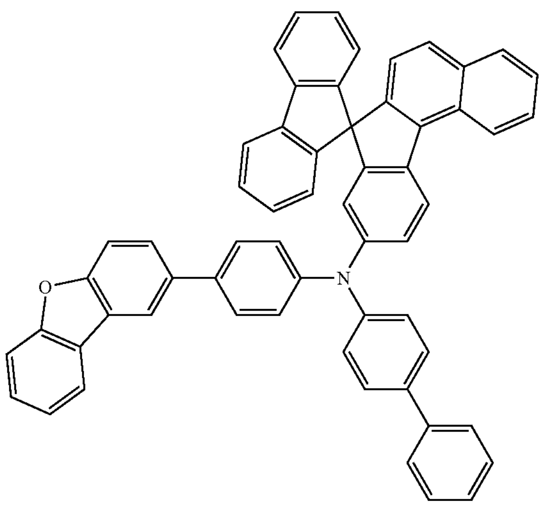
5-24
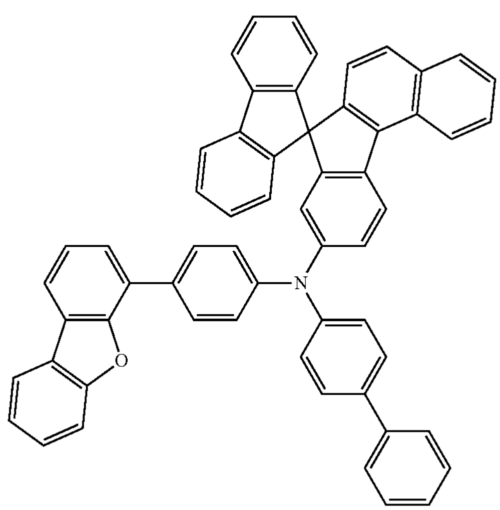
5-25
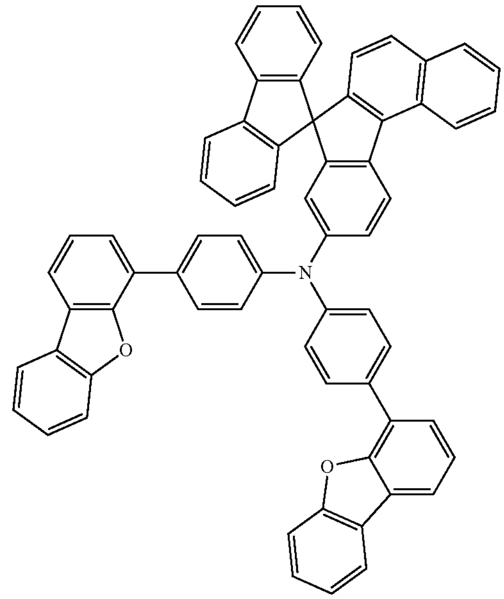
5-26
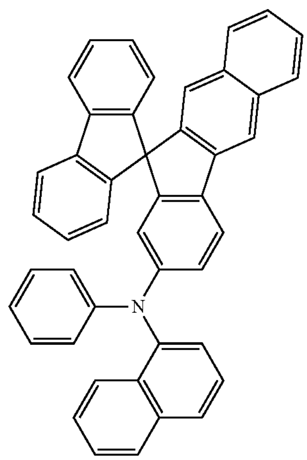
5-27
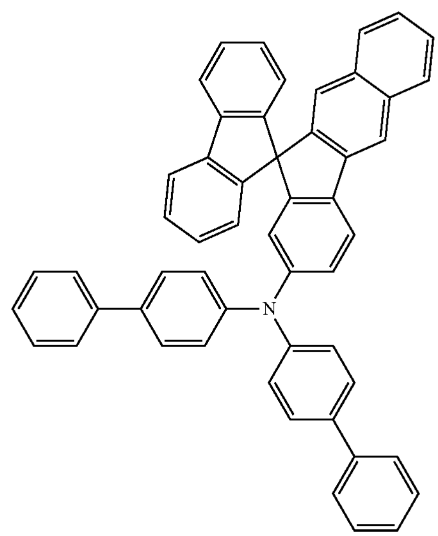

5-28
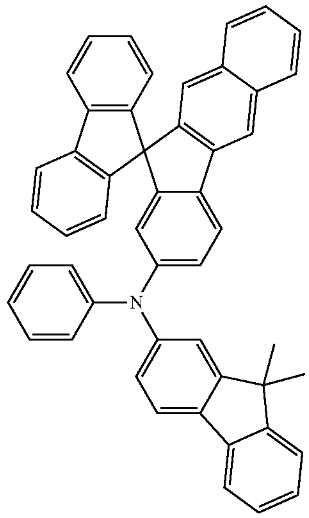
5-29
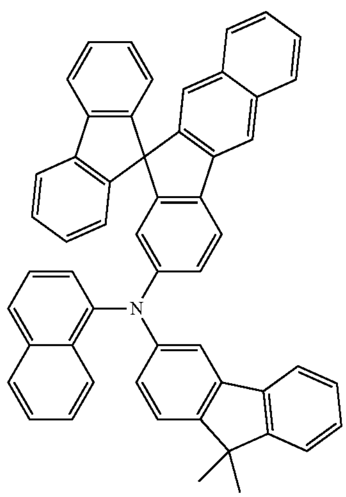
5-30
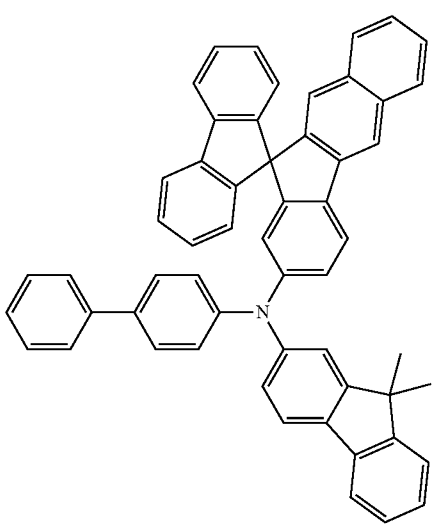
5-31
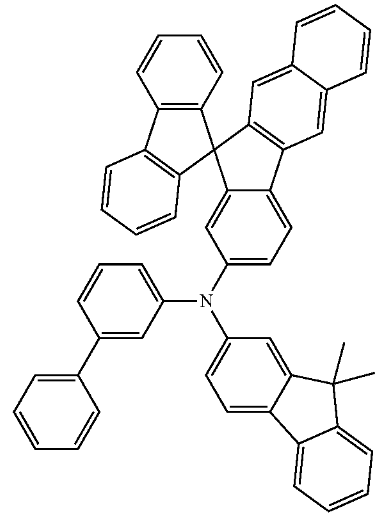
5-32
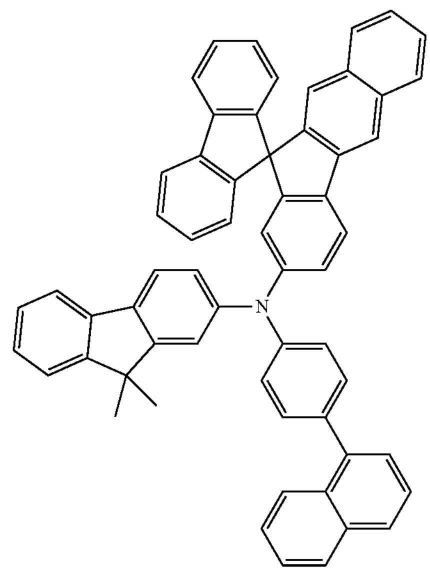
5-33
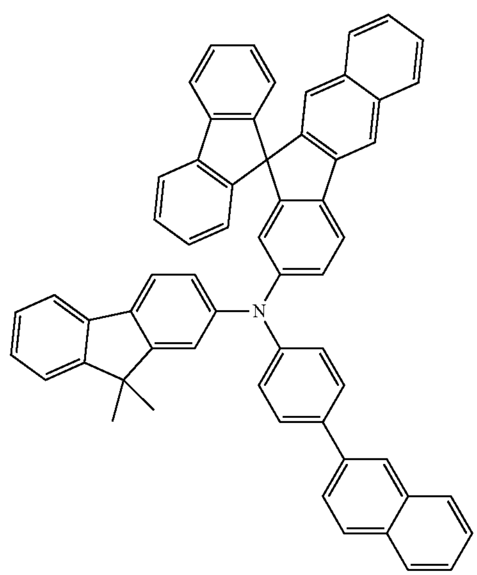

-continued
5-34
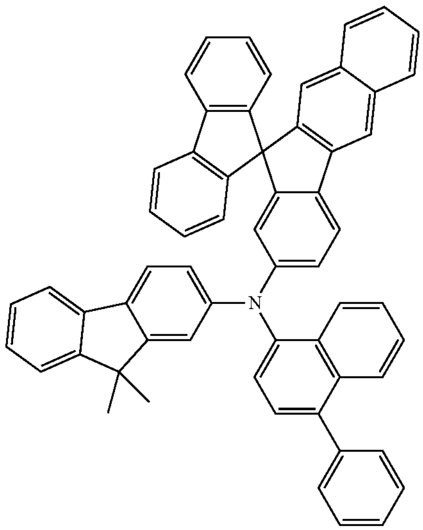
5-35
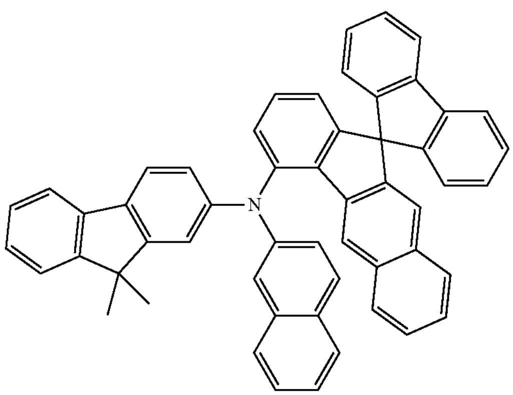
5-36
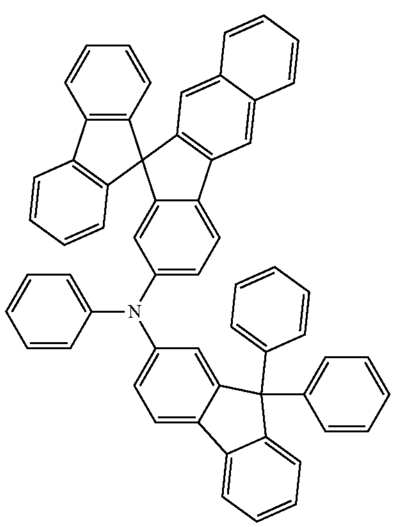
-continued
5-37
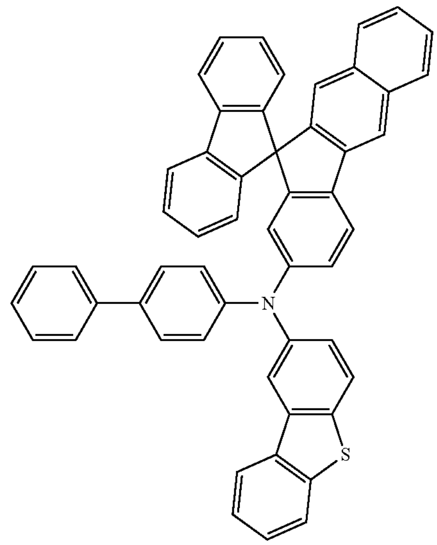
5-38
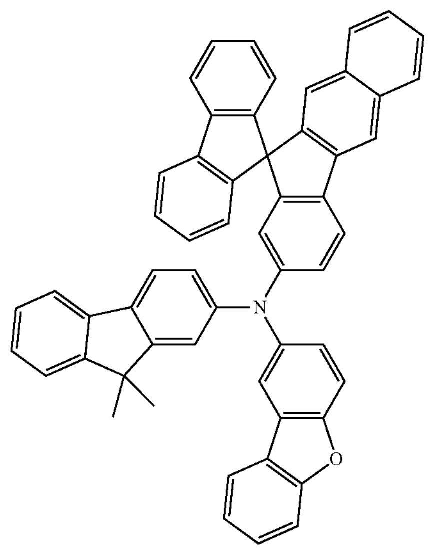
5-39
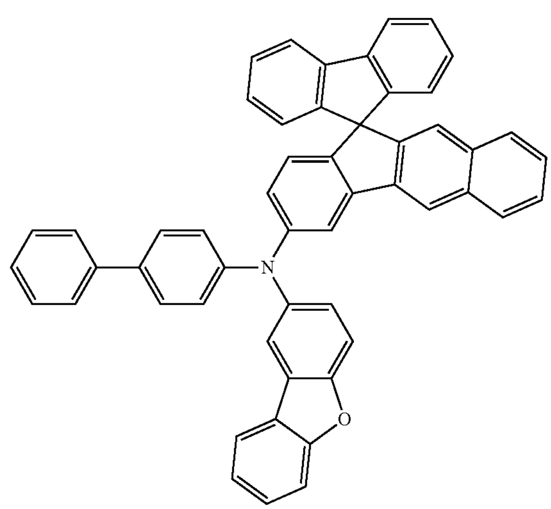

5-40
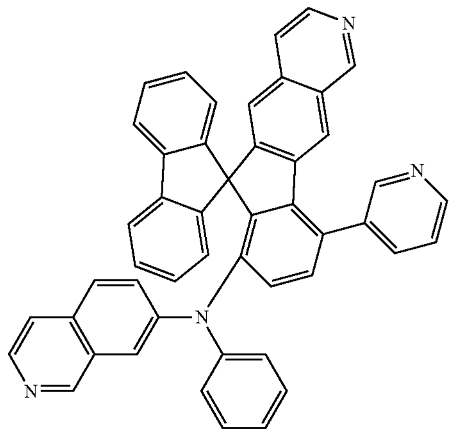
5-41
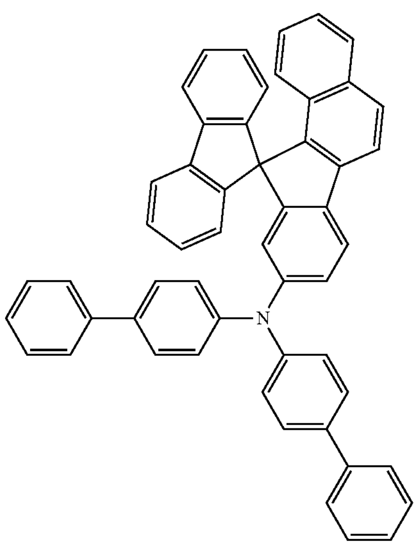
5-42
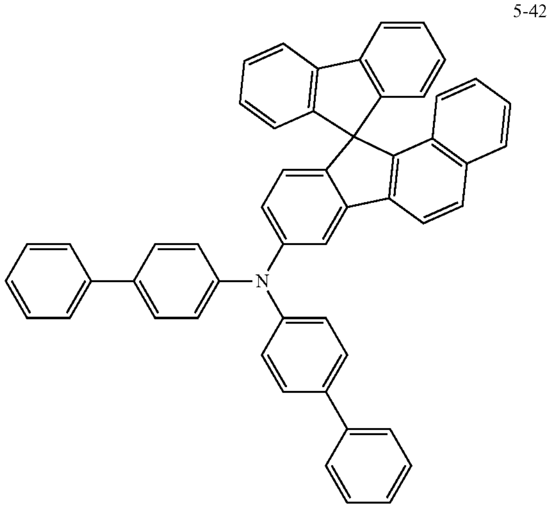
5-43
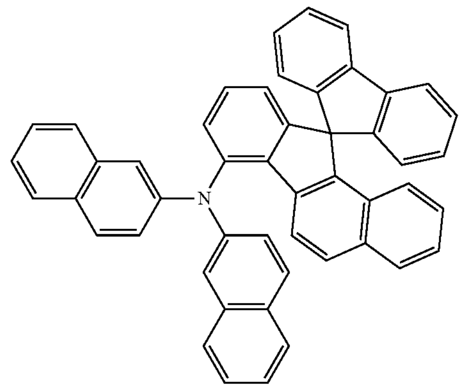
5-44
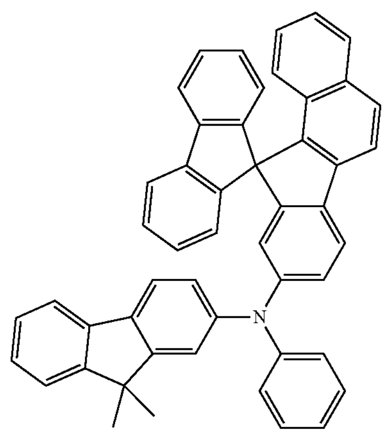
5-45
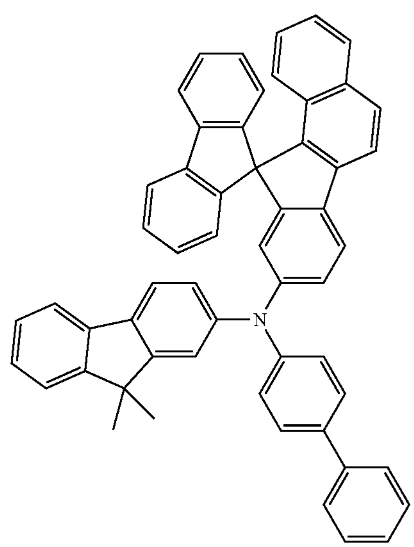

-continued
5-46
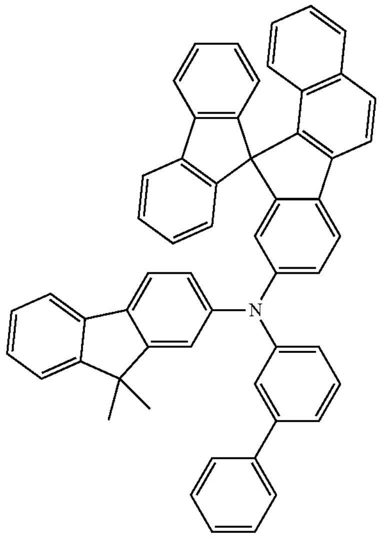
5-47
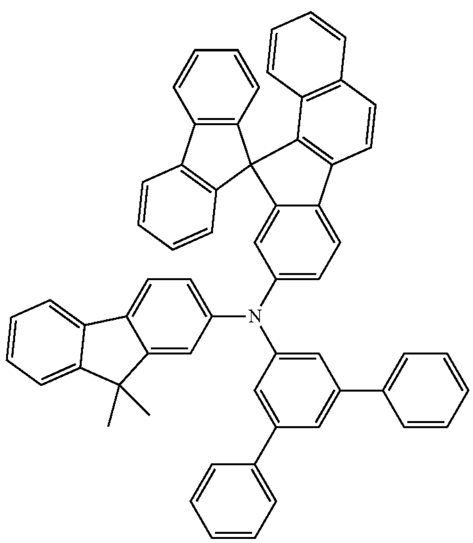
5-48
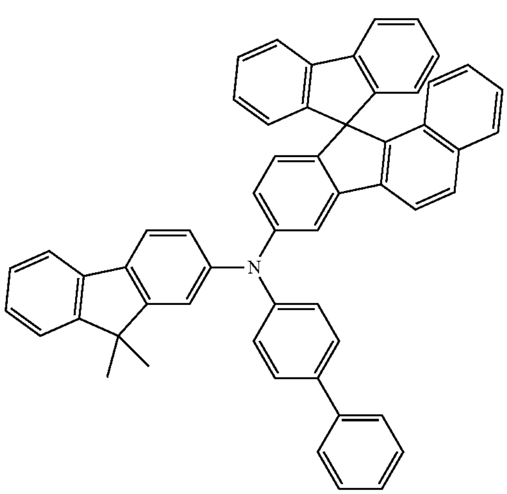
-continued
5-49
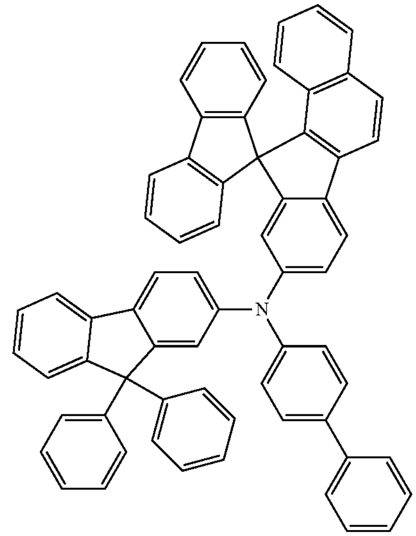
5-50
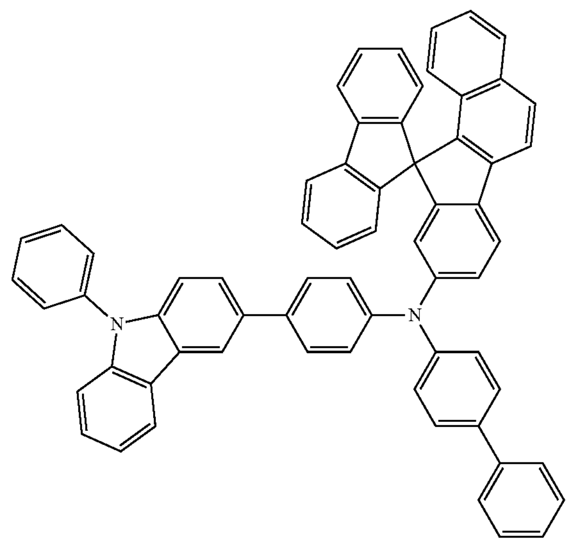
5-51
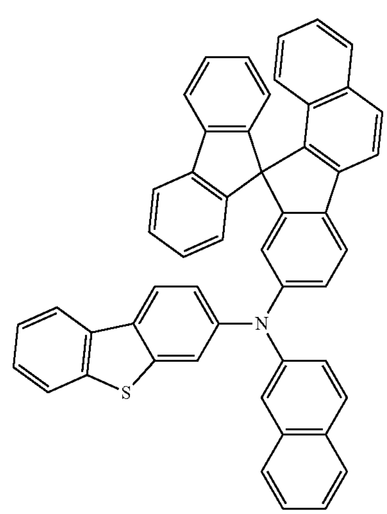

-continued
5-52
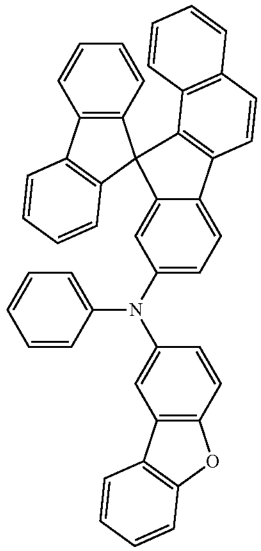
5-53
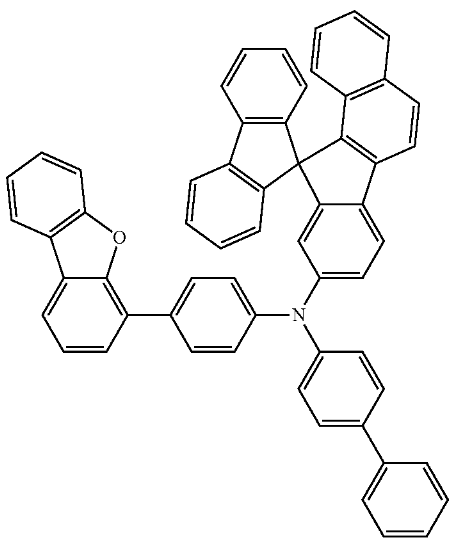
5-54
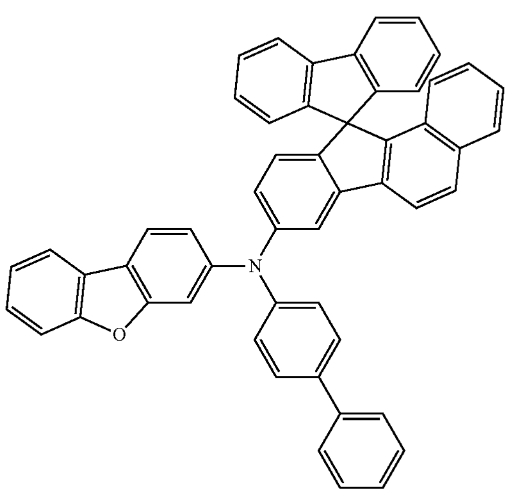
-continued
5-55
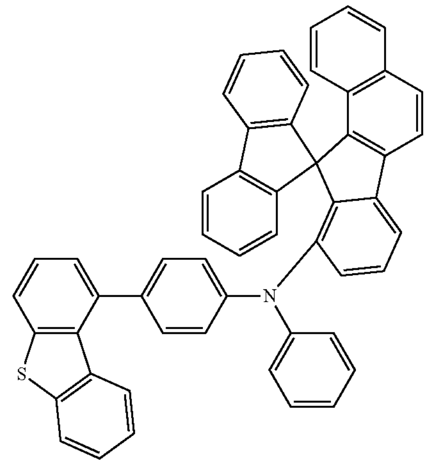
5-56
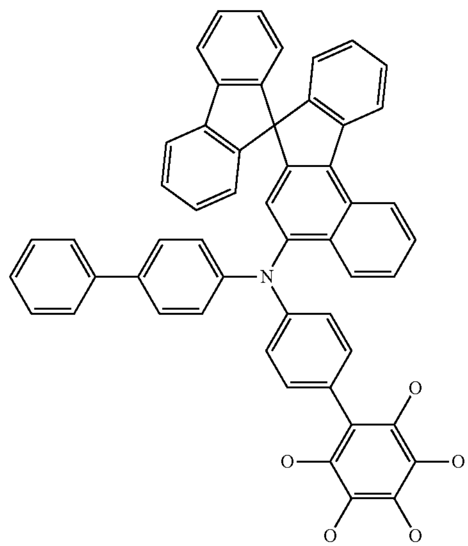
5-57
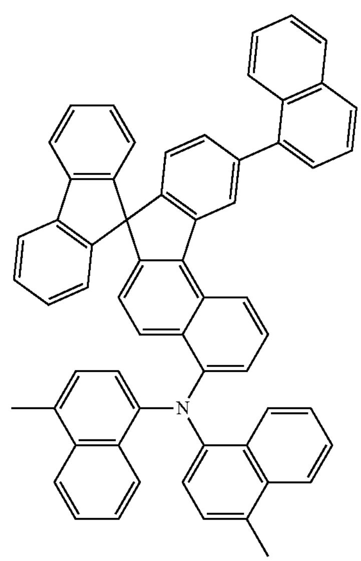

-continued
5-58
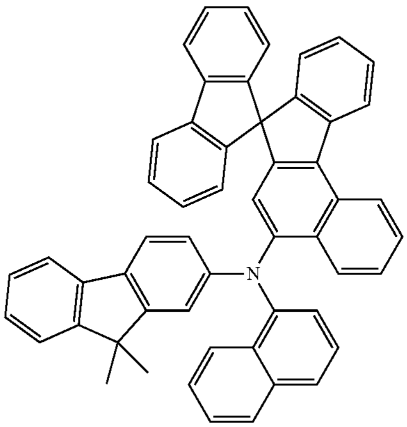
5-59
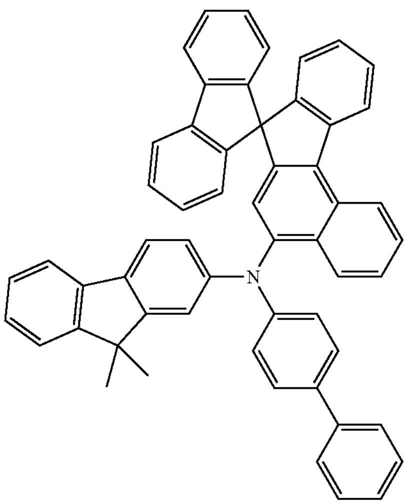
5-60
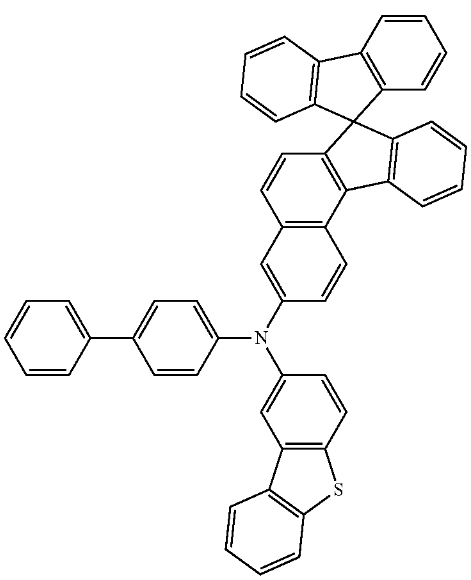
-continued
5-61
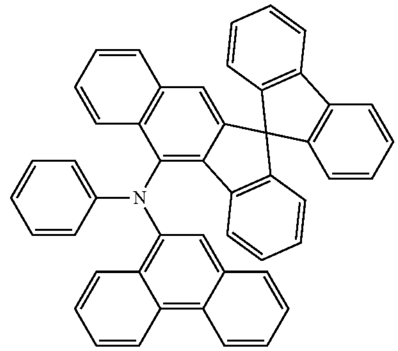
5-62
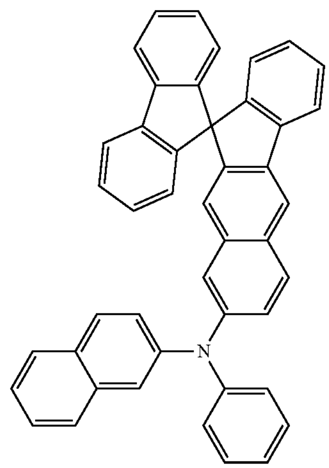
5-63
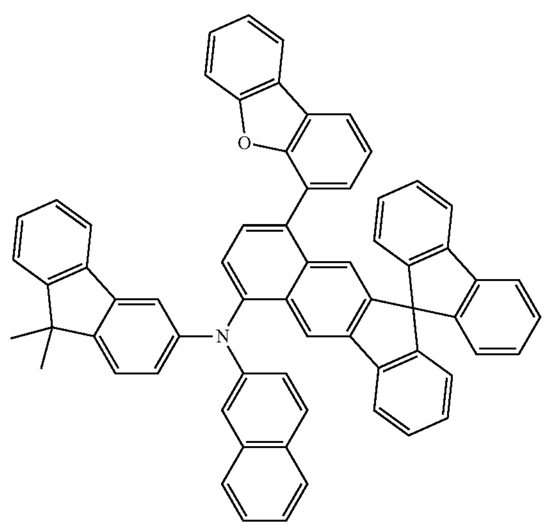

-continued
5-64
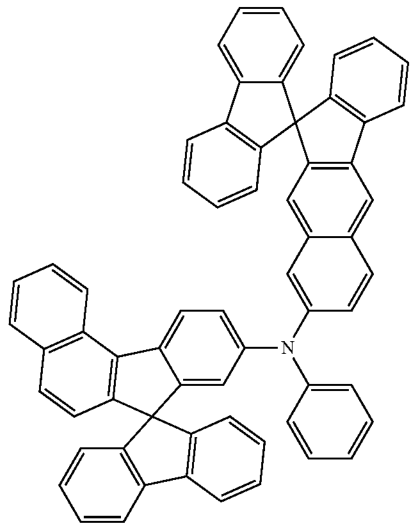
5-65
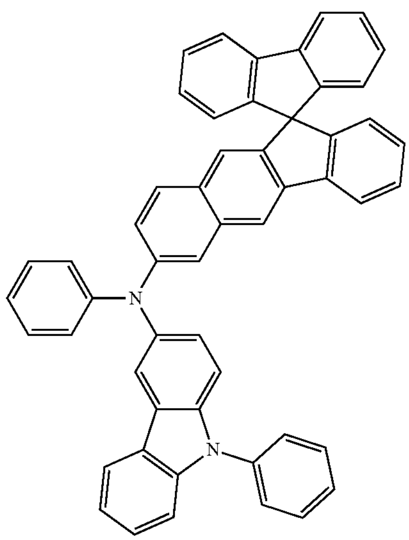
5-66
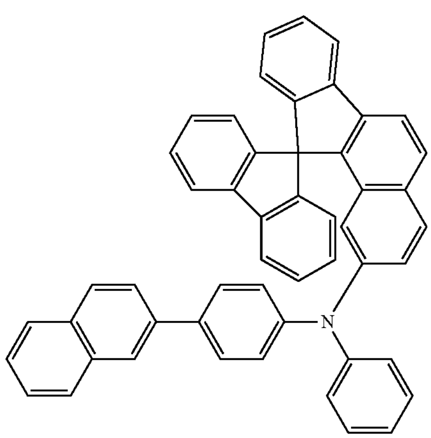
-continued
5-67
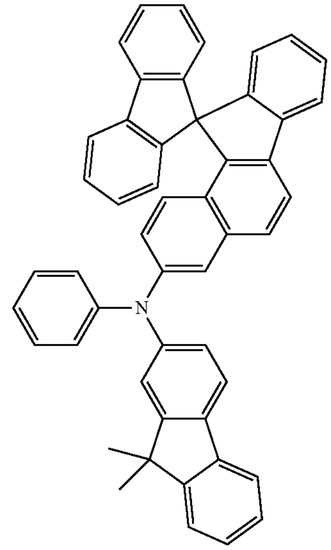
5-68
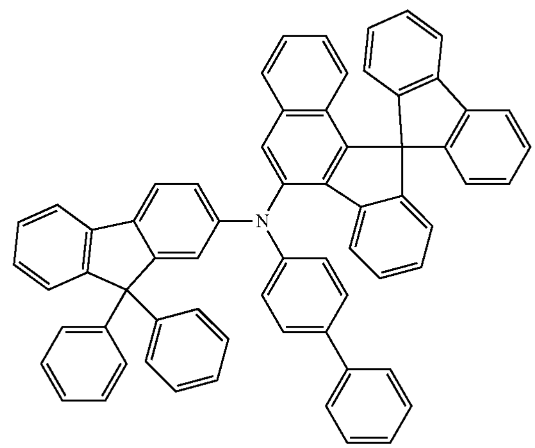
5-69
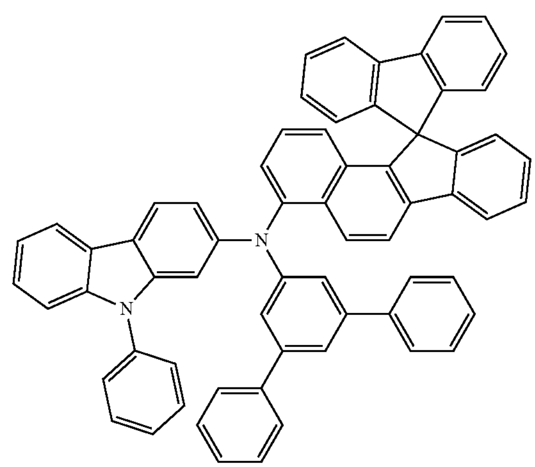

-continued
5-70
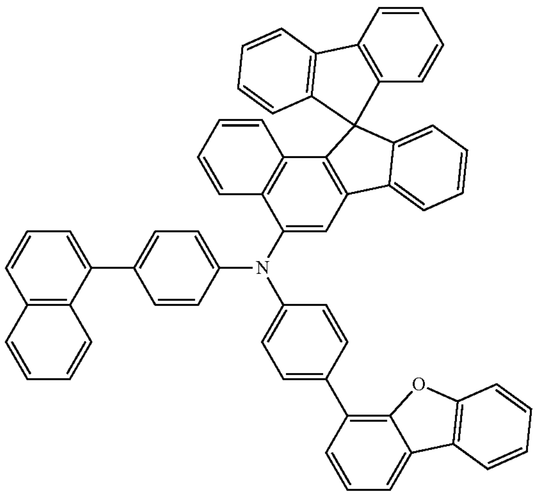
5-71
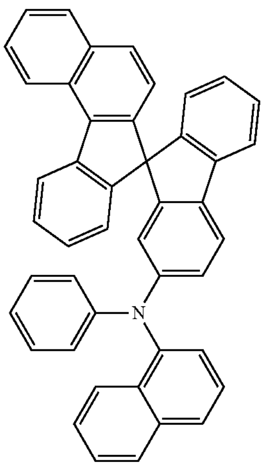
5-72
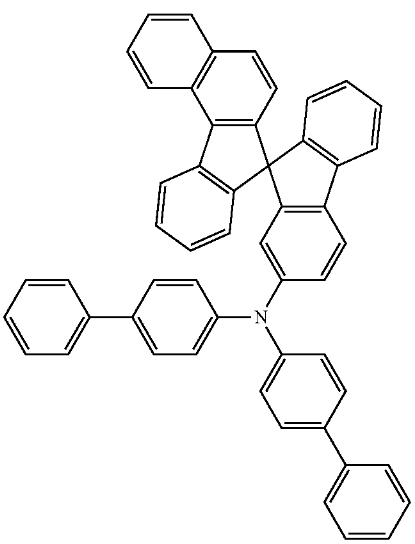
-continued
5-73
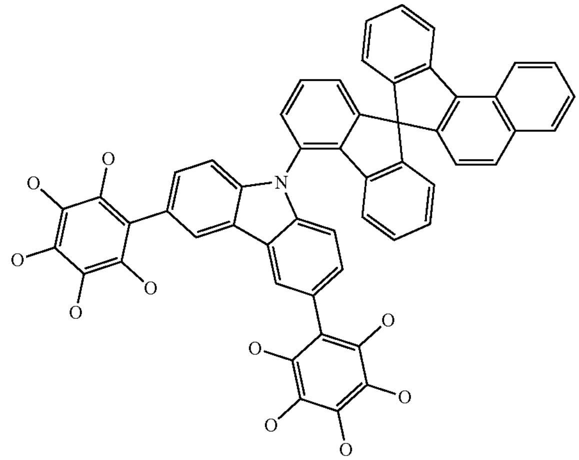
5-74
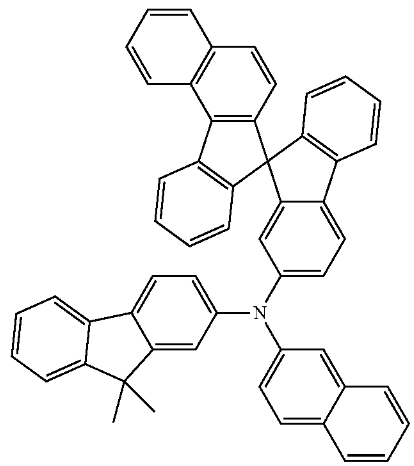
5-75
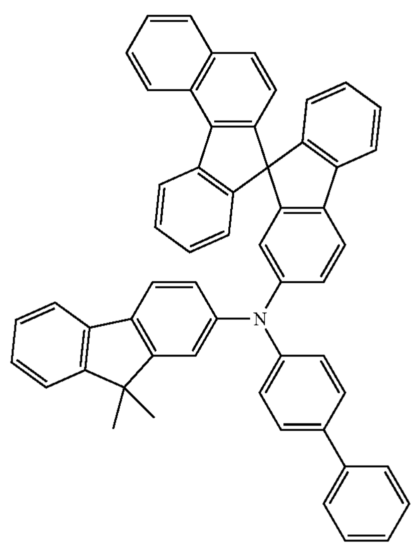

-continued
5-76
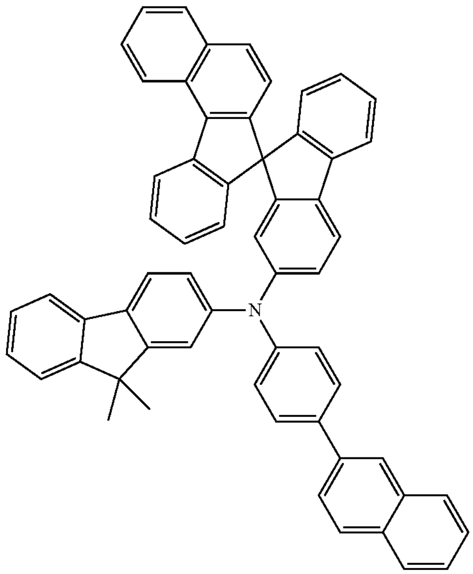
5-77
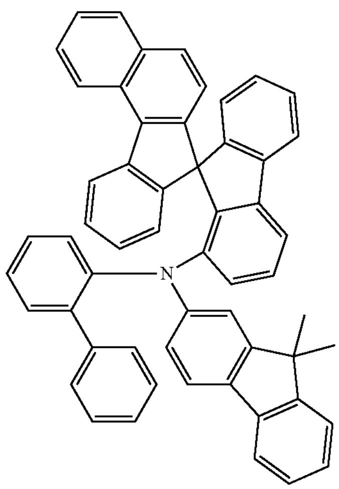
5-78
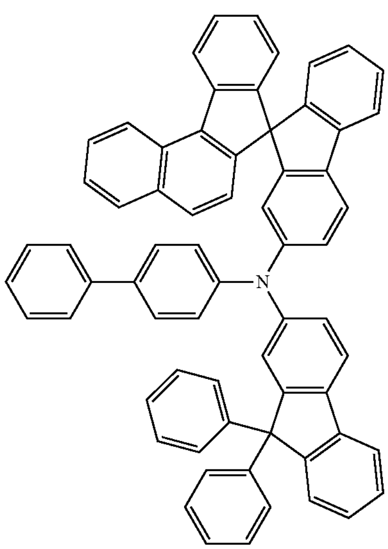
-continued
5-79
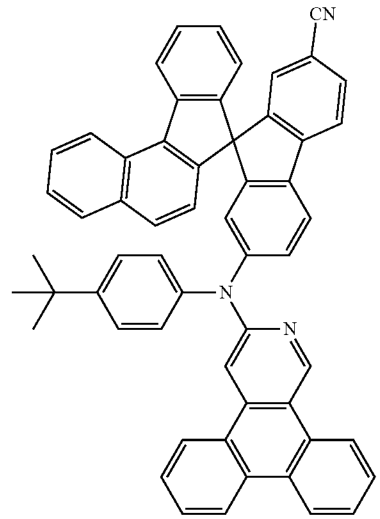
5-80
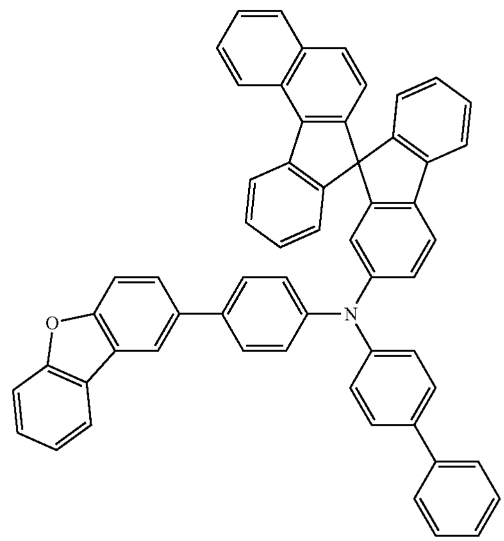
5-81
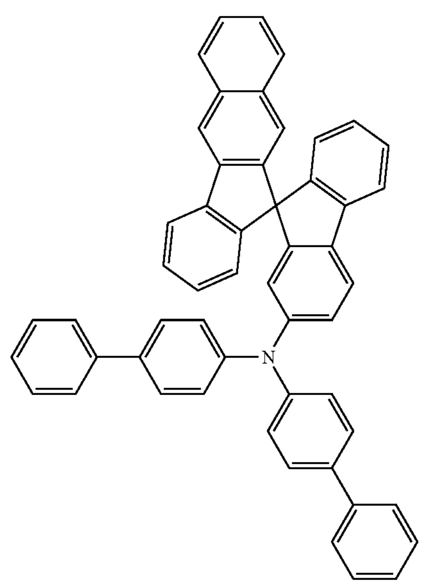

-continued
5-82
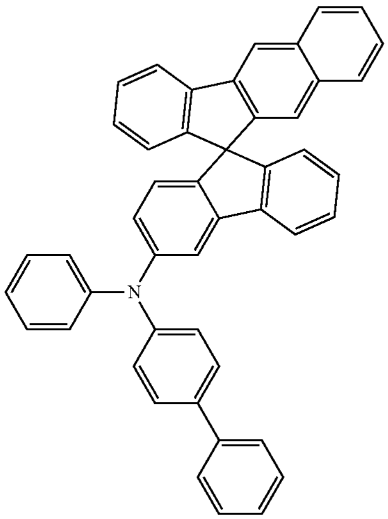
5-83
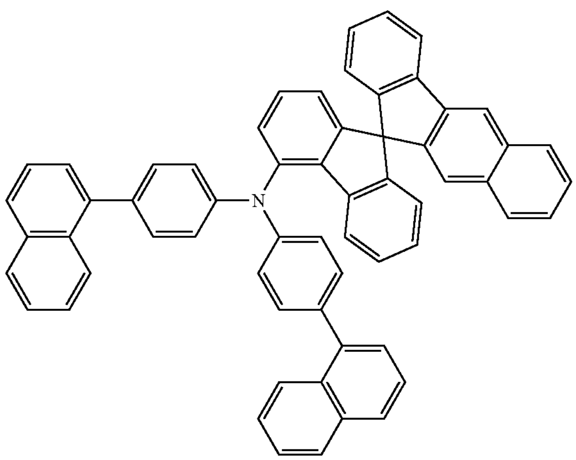
5-84
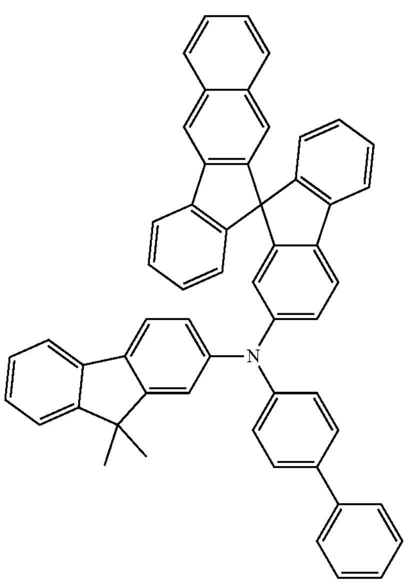
-continued
5-85
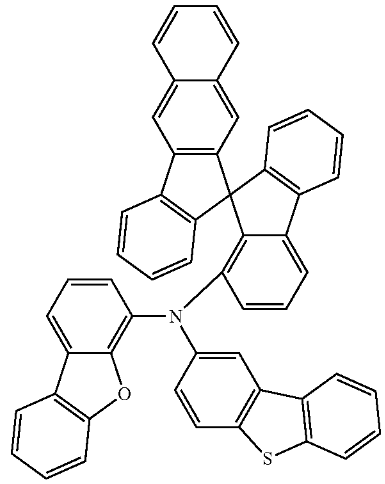
5-86
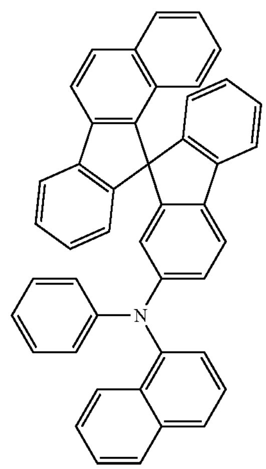
5-87
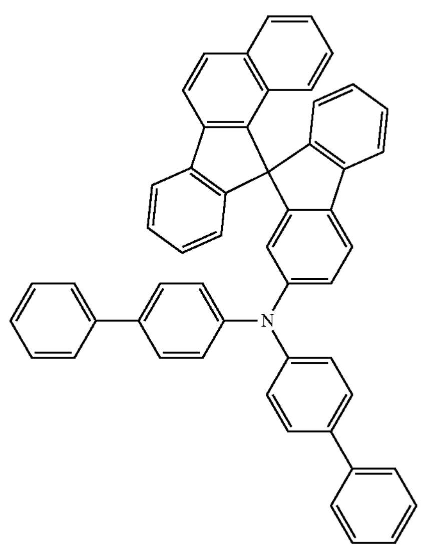

5-88
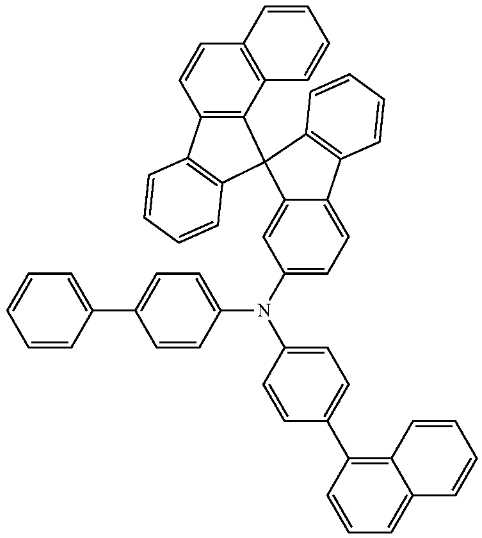
5-89
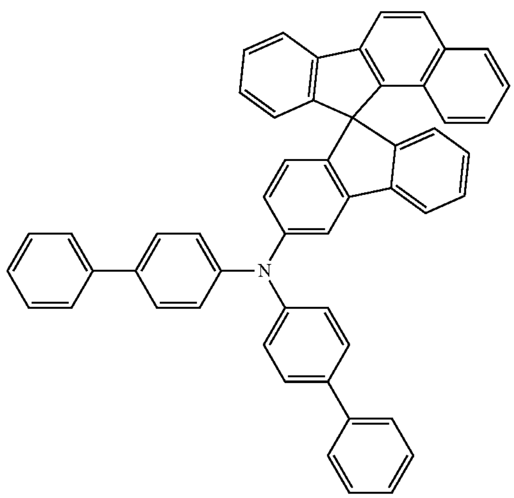
5-90
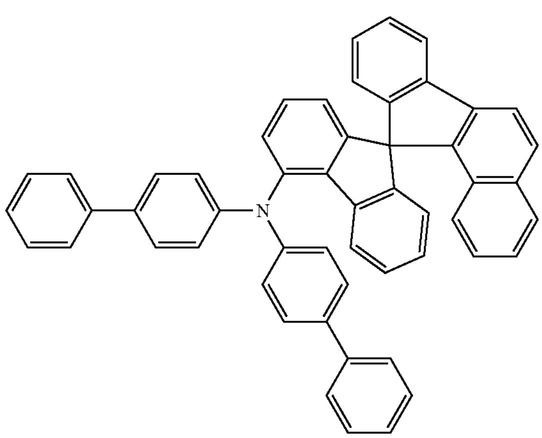
5-91
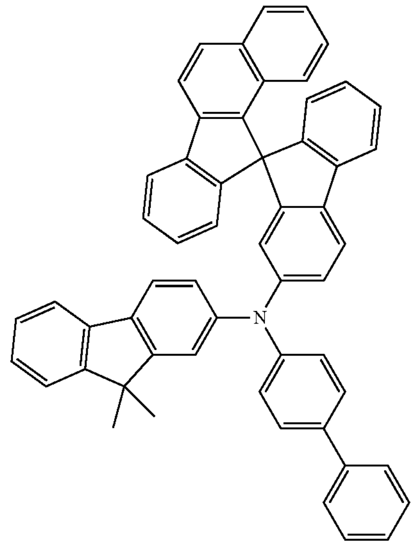
5-92
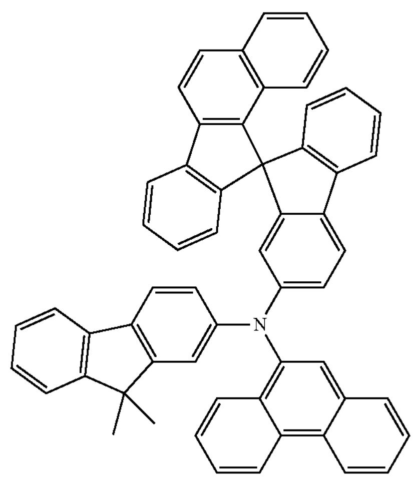
5-93
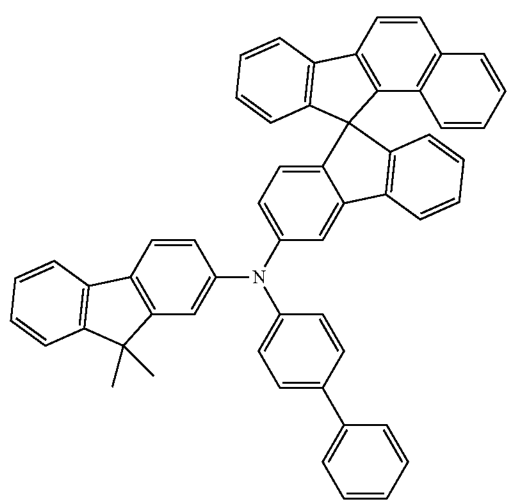

-continued
5-94
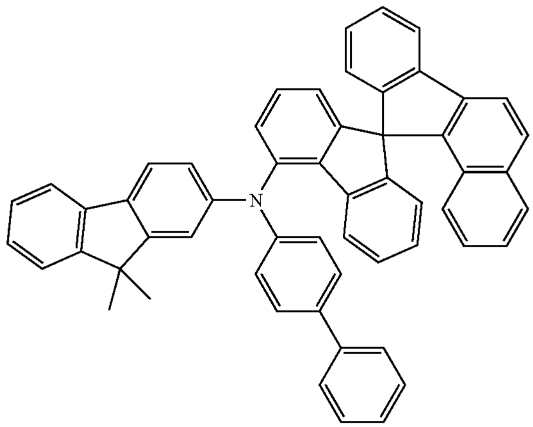
5-95
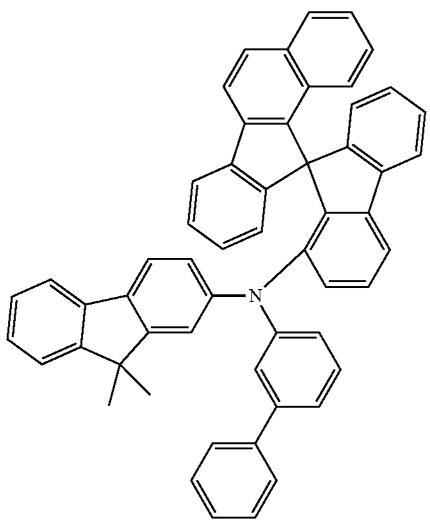
5-96
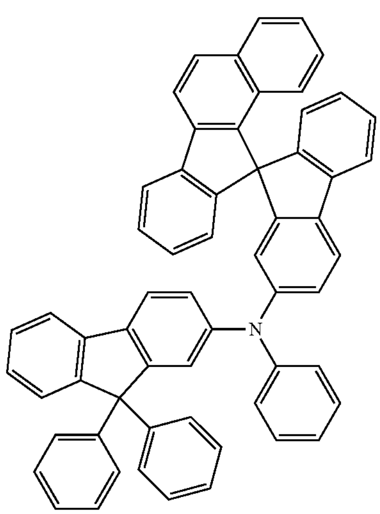
-continued
5-97
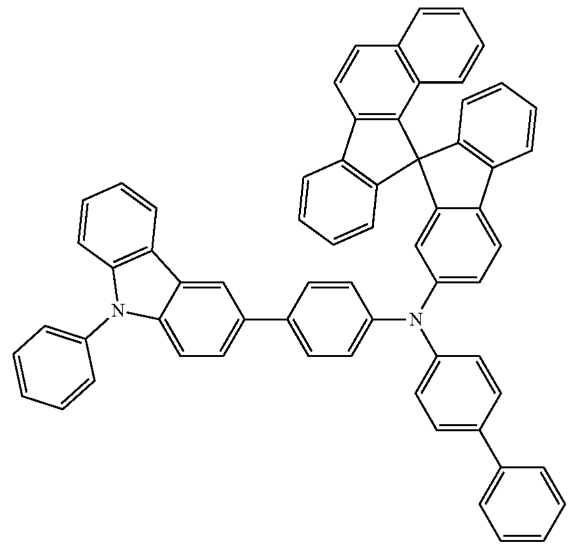
5-98
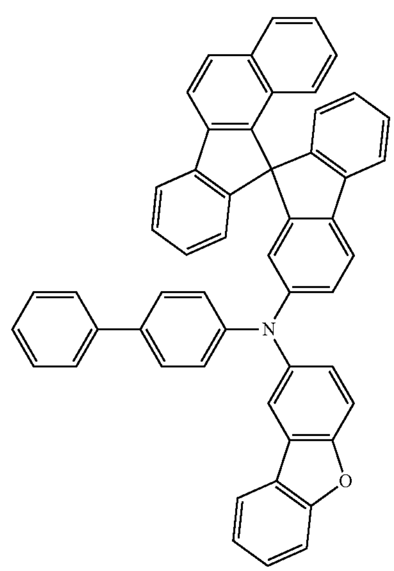

-continued
5-99
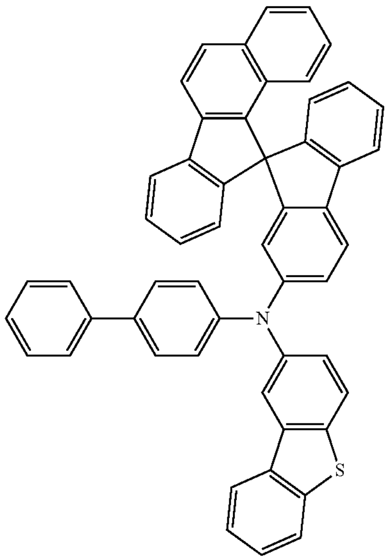
5-100
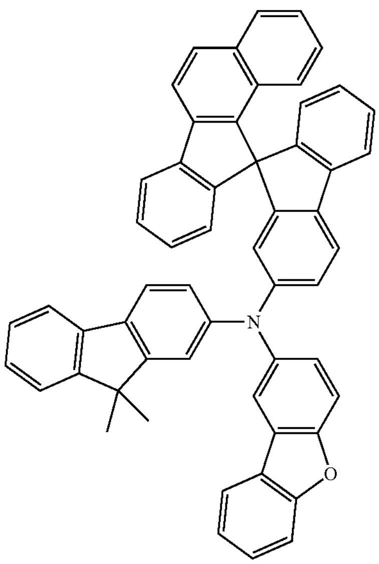
5-101
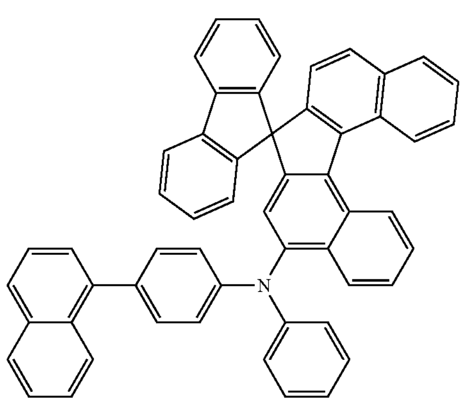
-continued
5-102
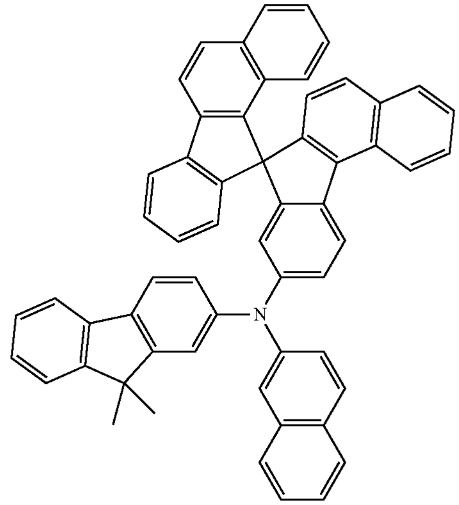
5-103
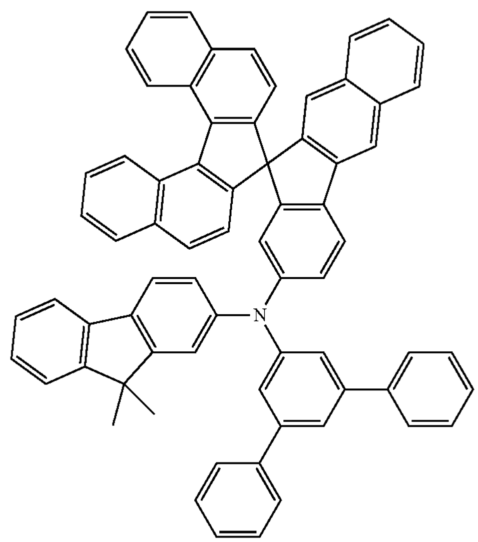
5-104
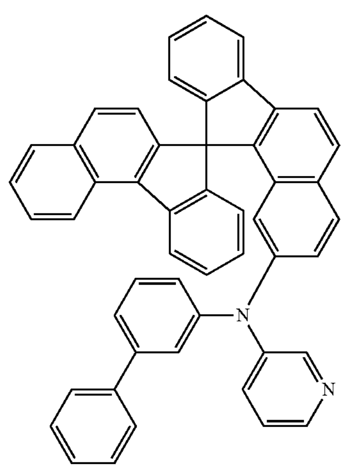

5-105
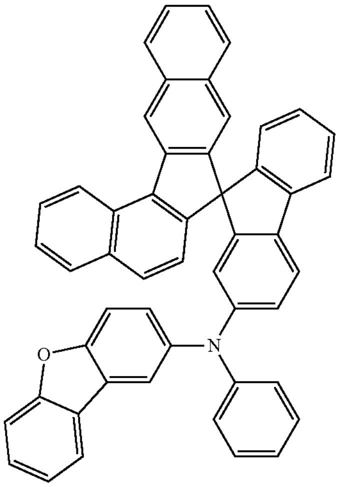
5-106
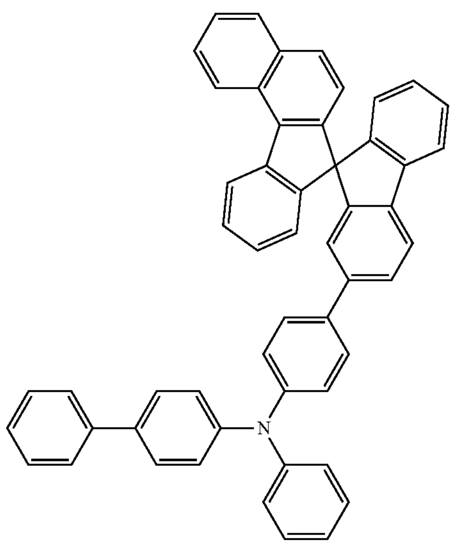
5-107
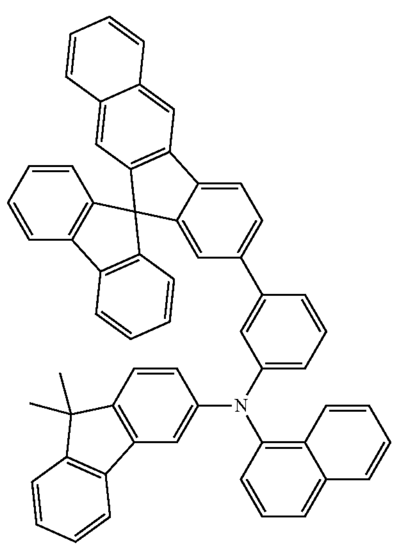
5-108
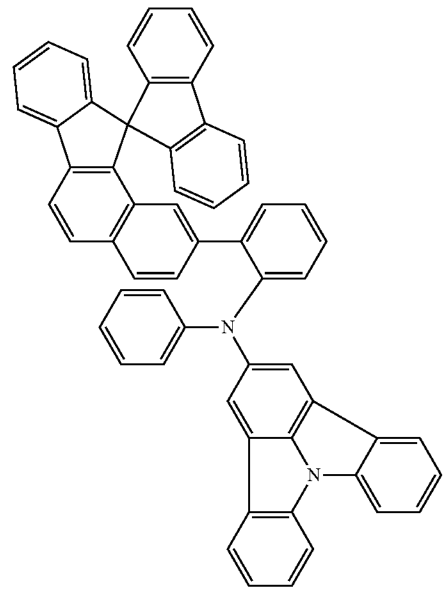
5-109
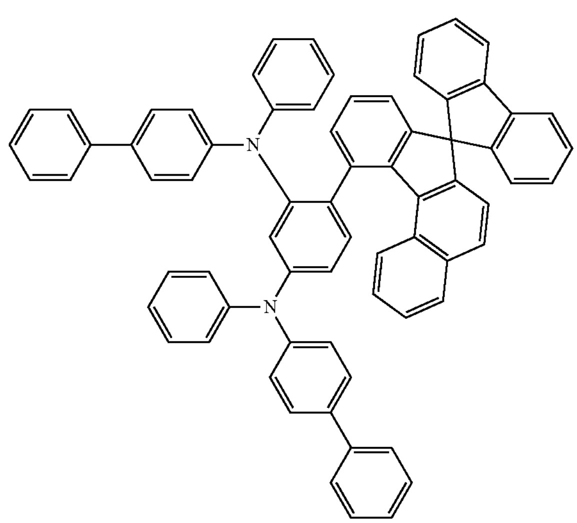

5-110
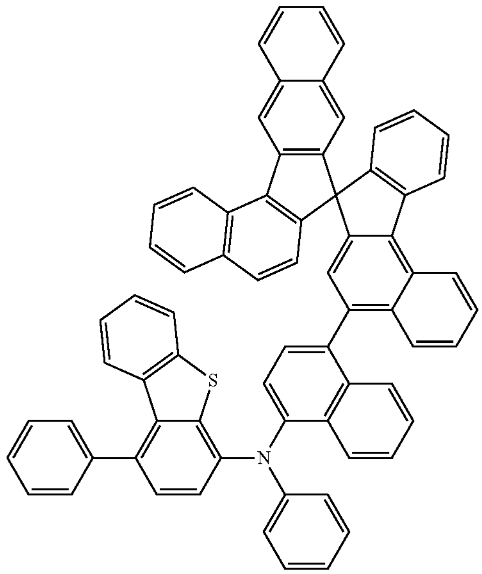
5-111
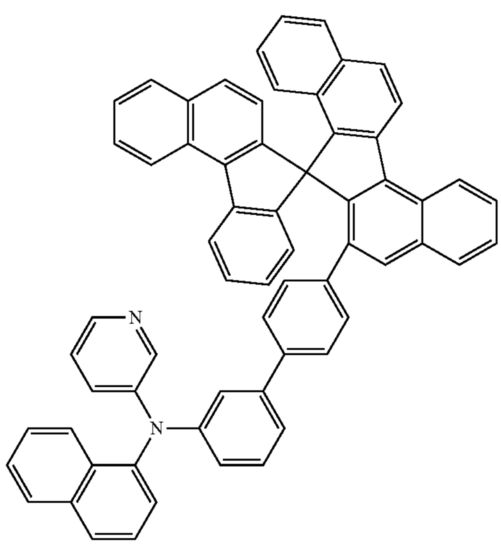
5-112
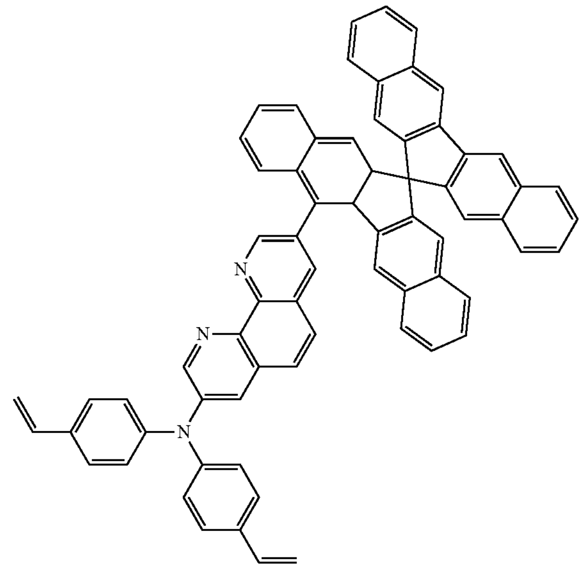
5-113
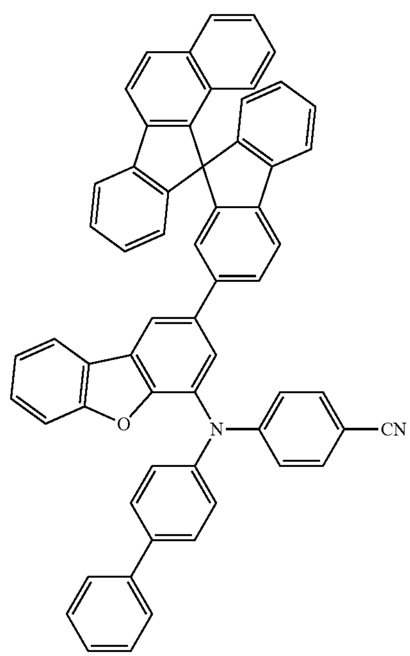

-continued
5-114
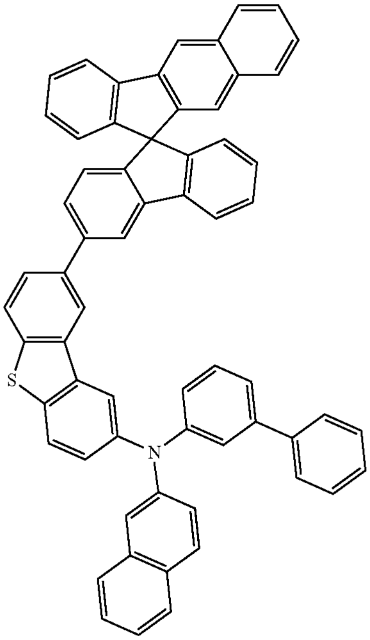
5-115
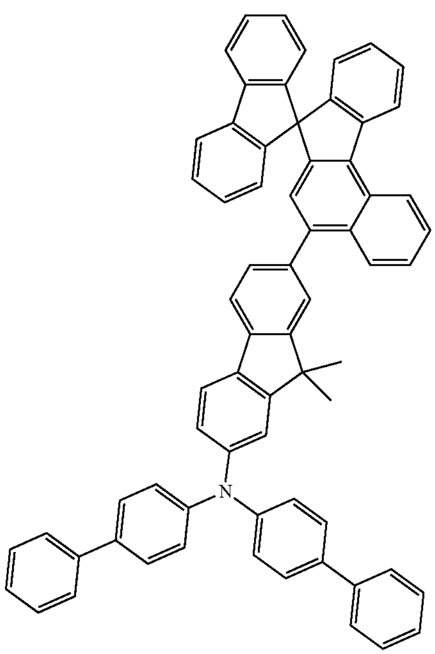
-continued
6-1
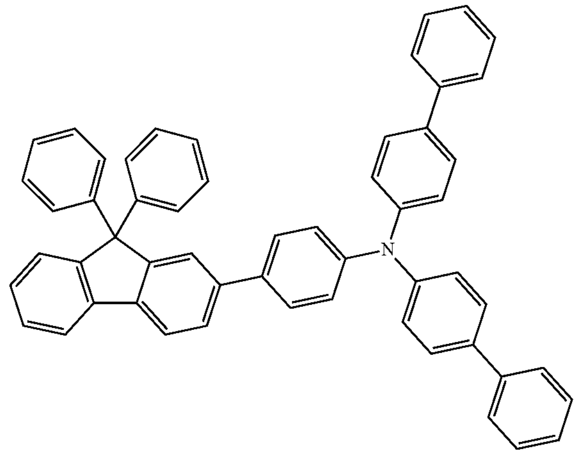
6-2
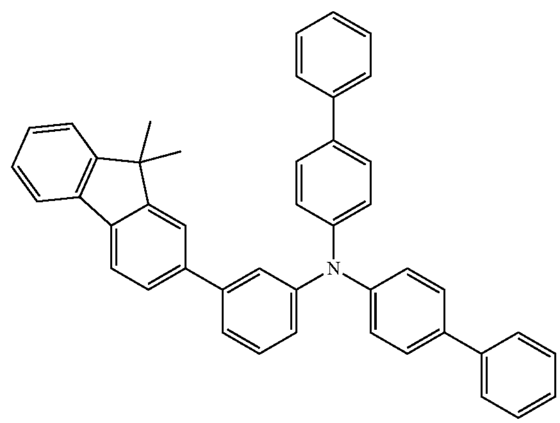
6-3
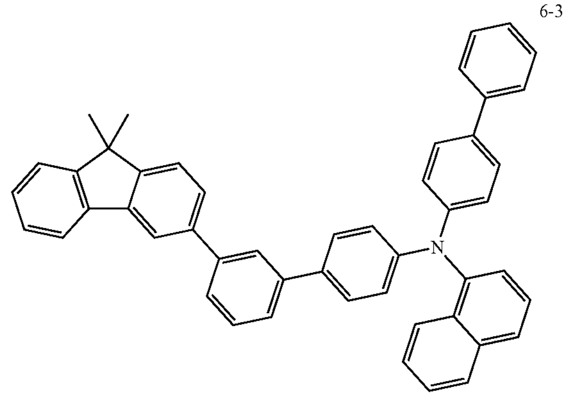

-continued
6-4
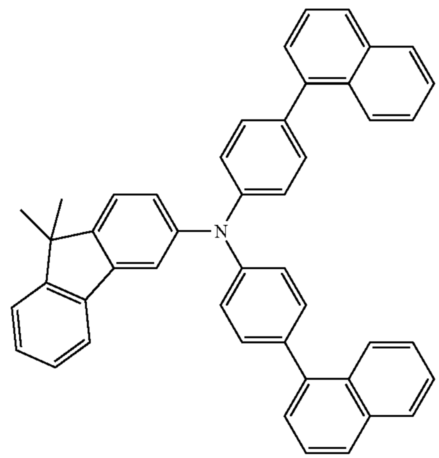
6-5
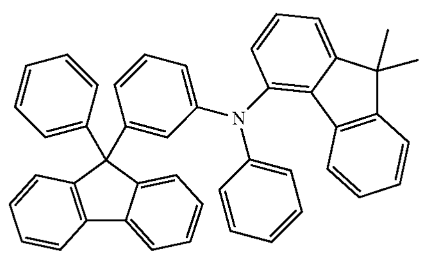
6-6
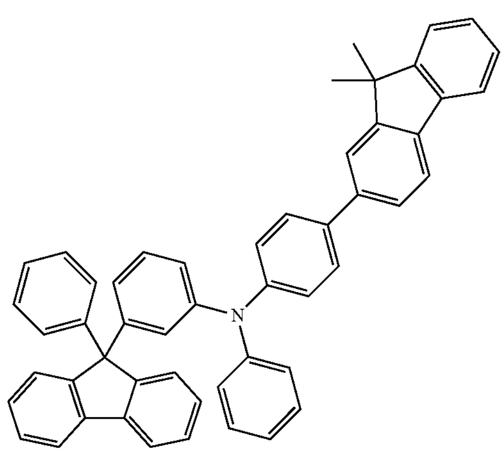
-continued
6-7
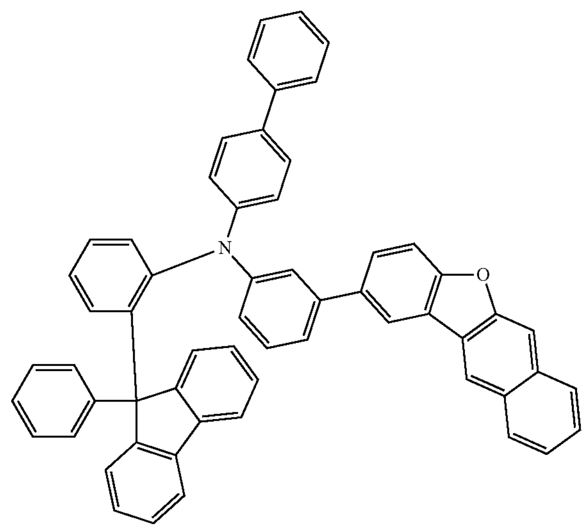
6-8
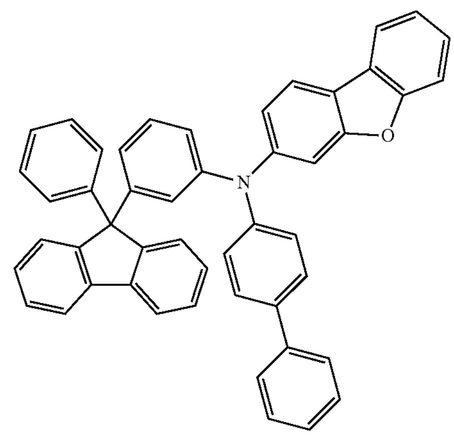
6-9
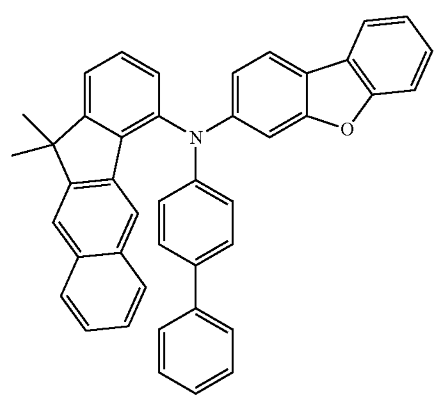

-continued
6-10
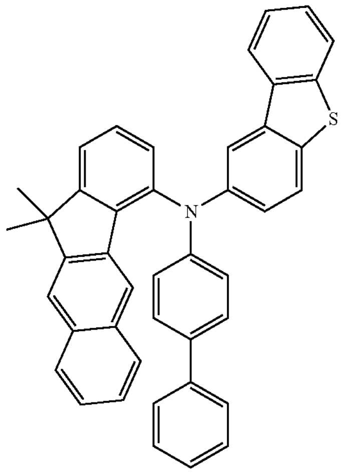
6-11
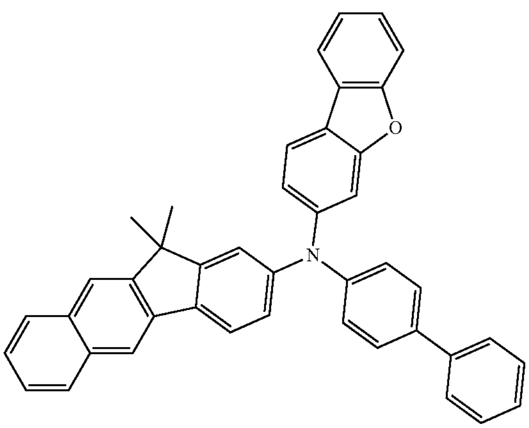
6-12
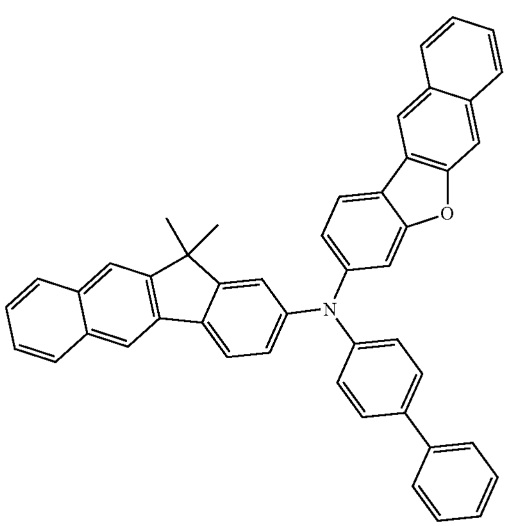
-continued
6-13
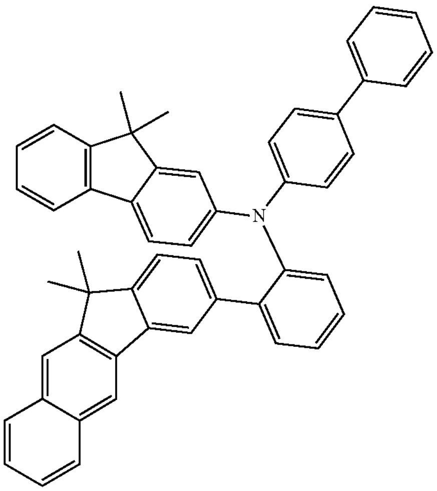
6-14
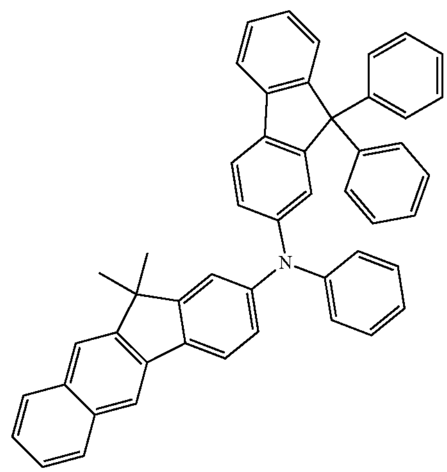
6-15
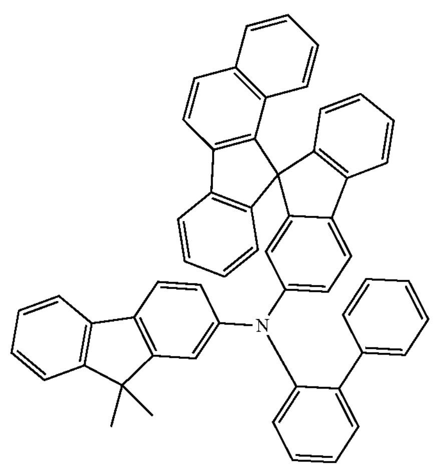

-continued
6-16
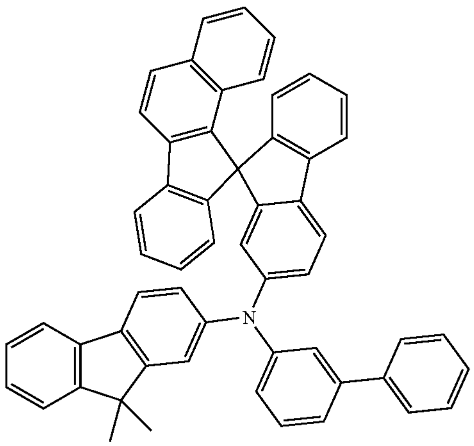
6-17
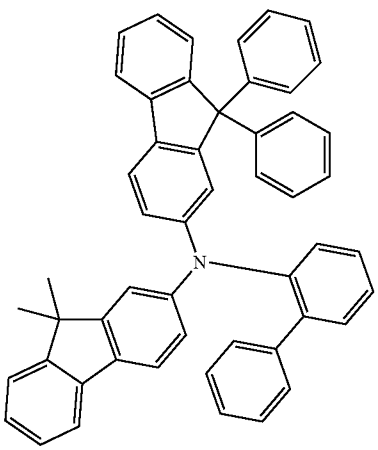
6-18
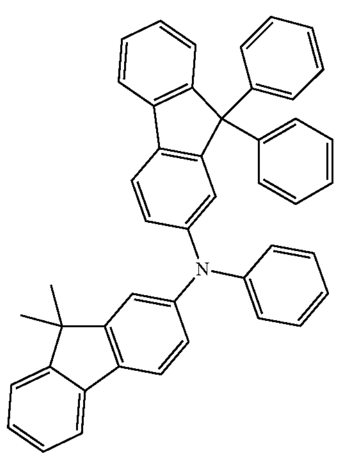
-continued
6-19
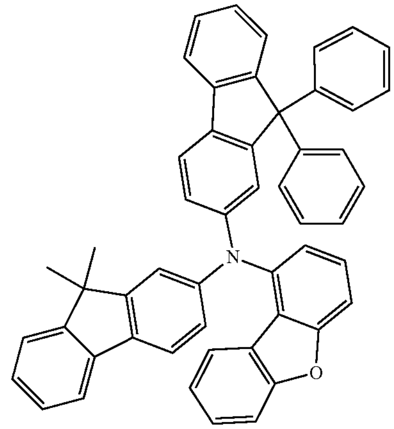
6-20
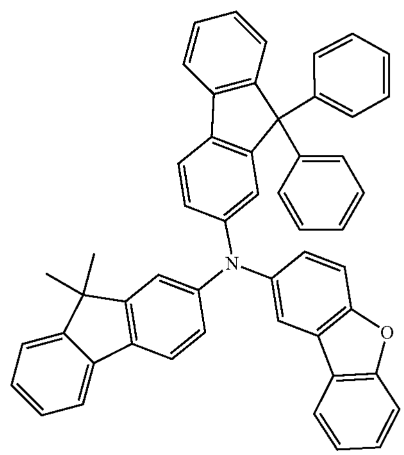
6-21
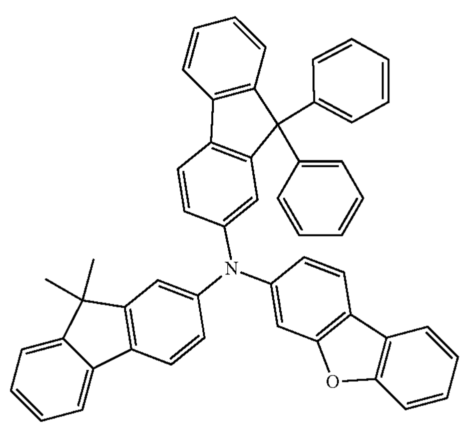

-continued
6-22
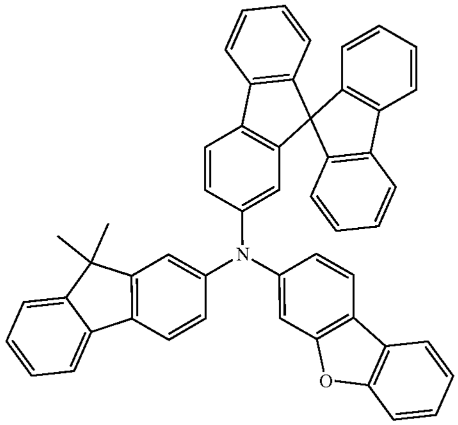
6-23
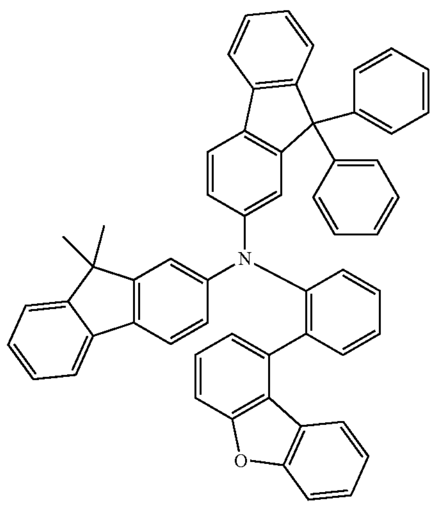
6-24
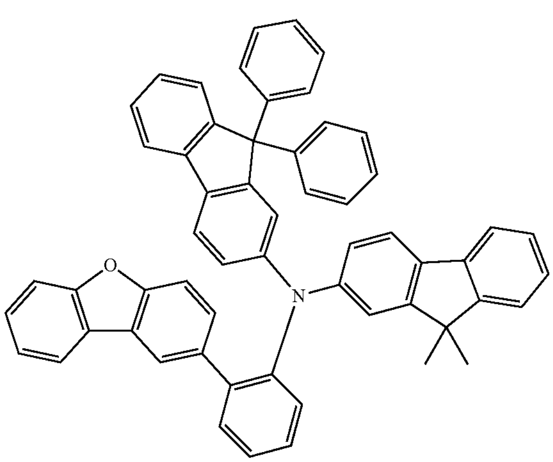
-continued
6-25
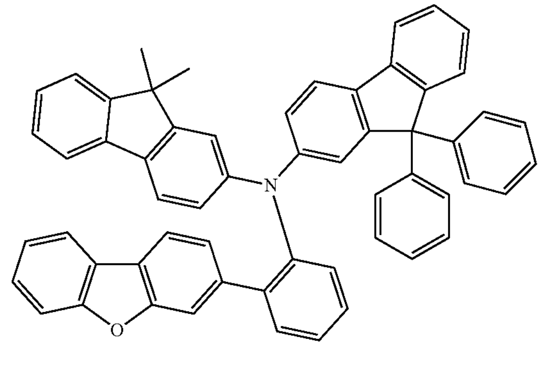
6-26
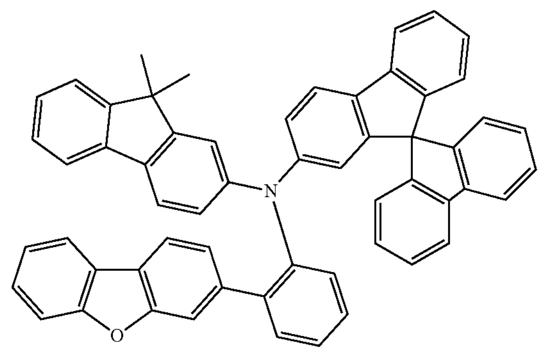
6-27
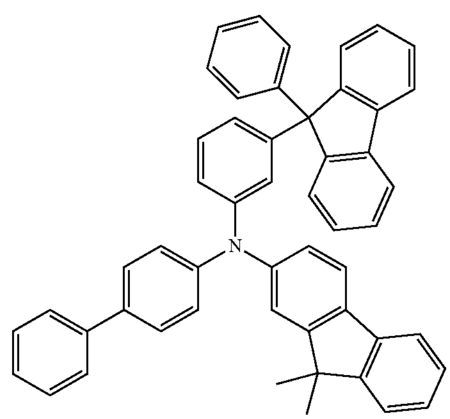

6-28
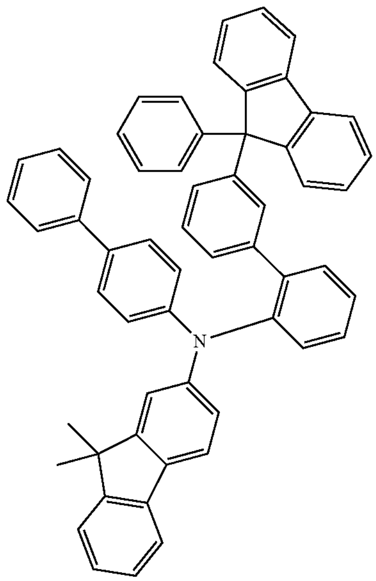
6-29
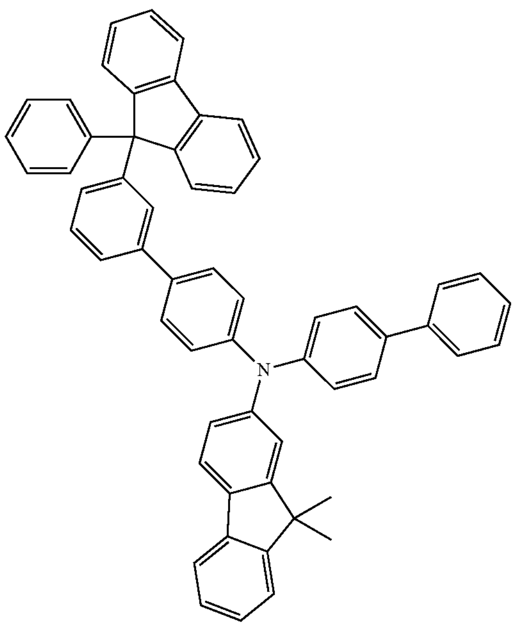
6-30
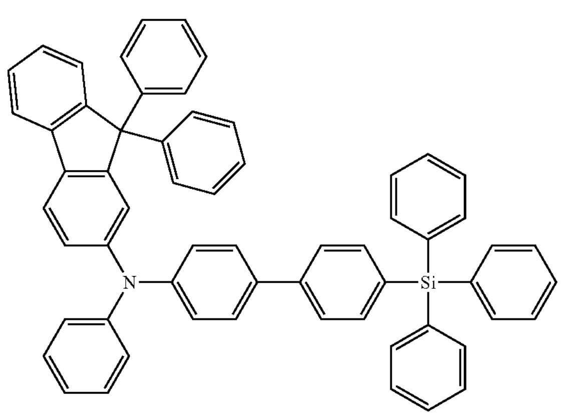
6-31
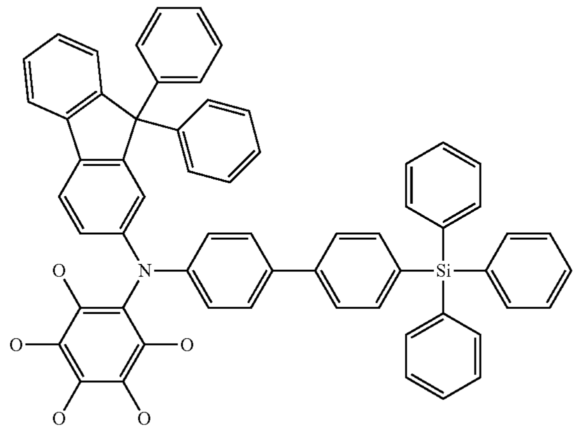
6-32
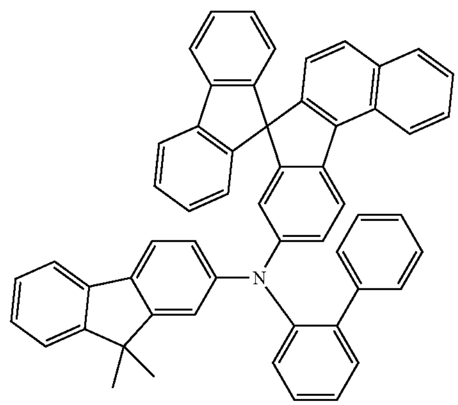
6-33
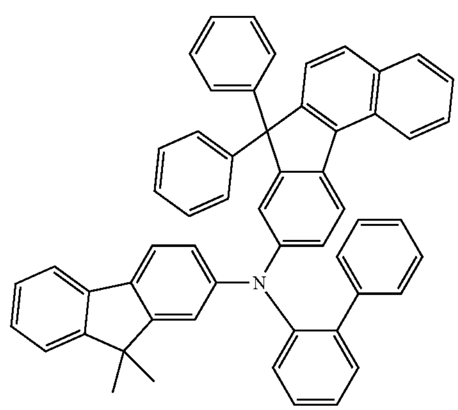

-continued
6-34
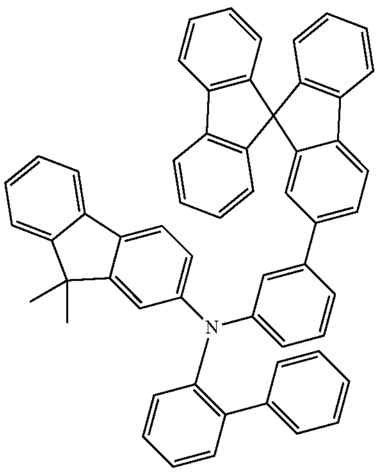
6-35
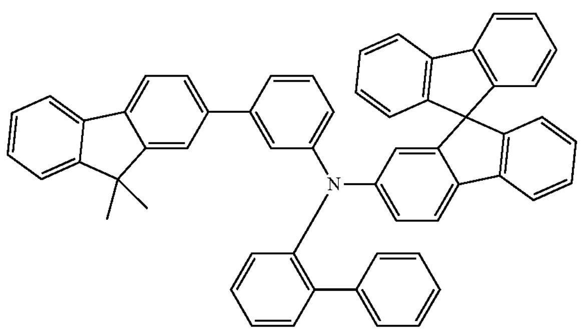
The fourth compound may include a radical of a compound represented by Formula A, be represented by Formula D, and be one of the following compound 7-1 to compound 10-189.
7-1
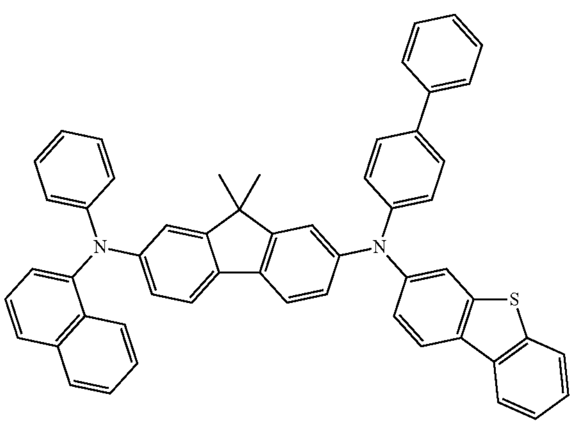
-continued
7-2
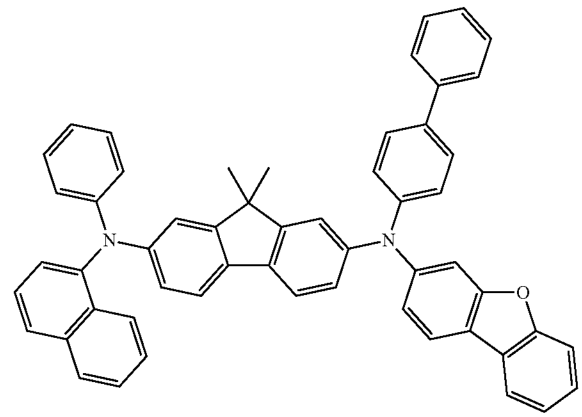
7-3
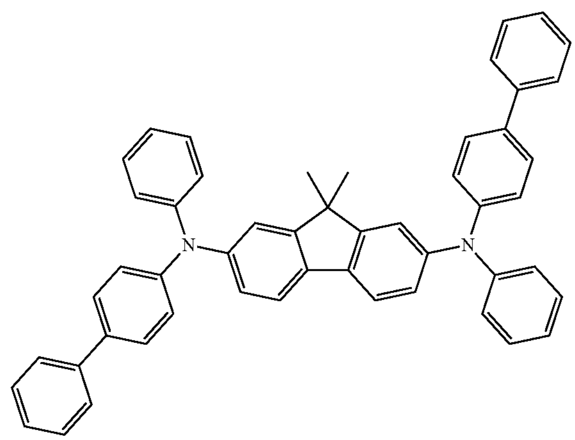
7-4
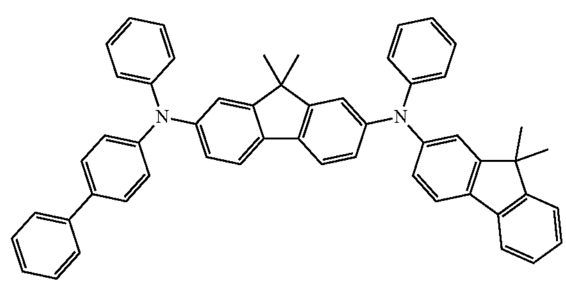

-continued
7-5
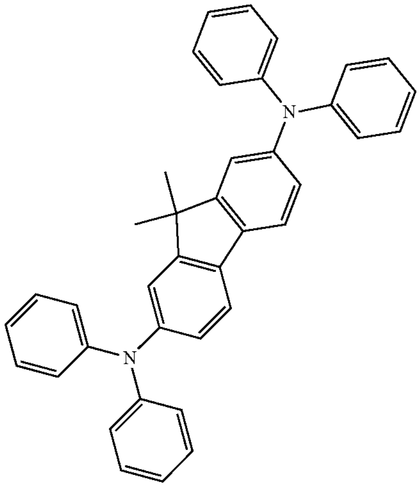
7-6
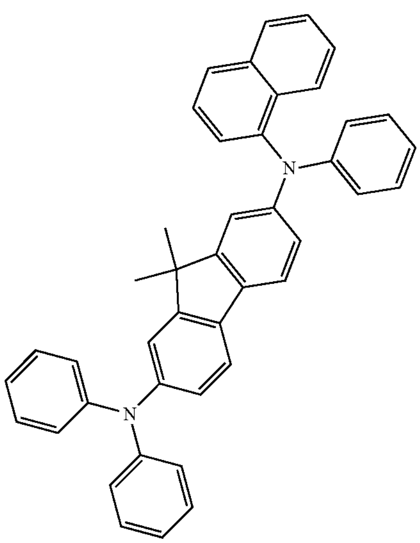
-continued
7-7
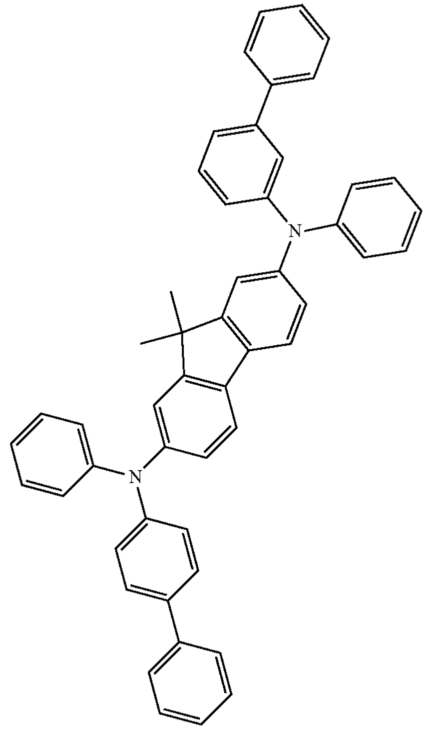
7-8
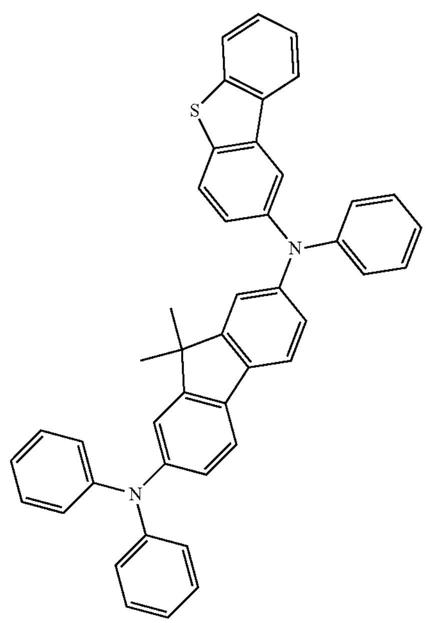

-continued
7-9
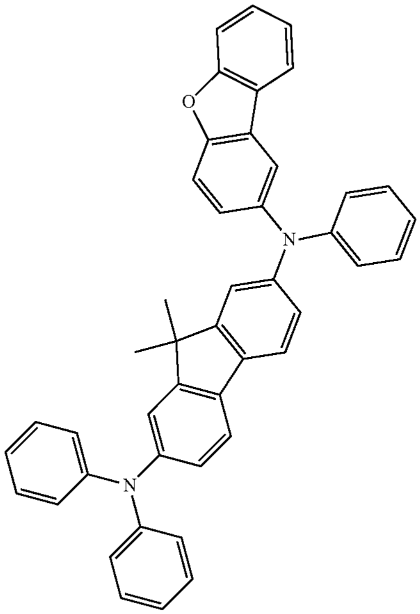
7-10
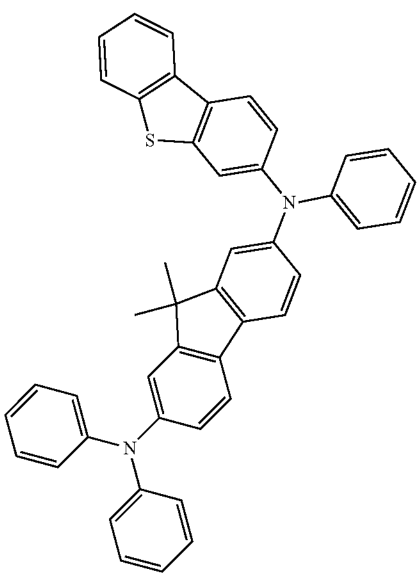
-continued
7-11
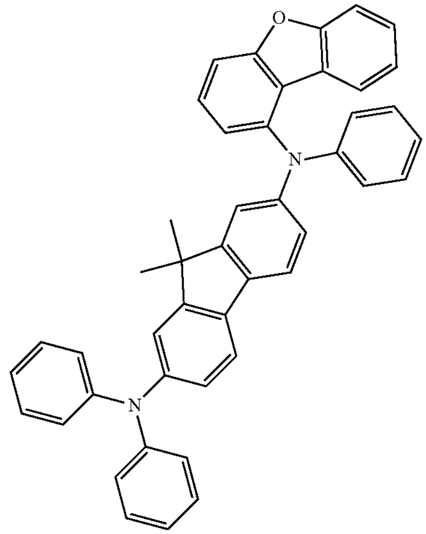
7-12
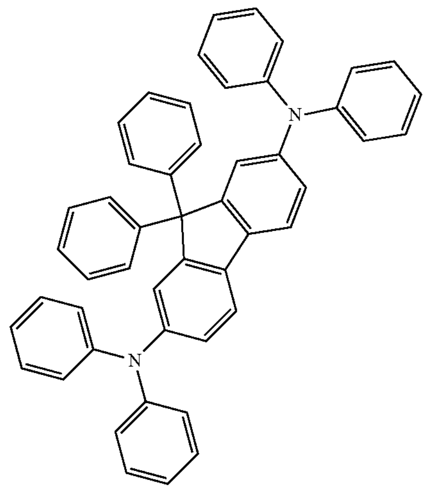
7-13
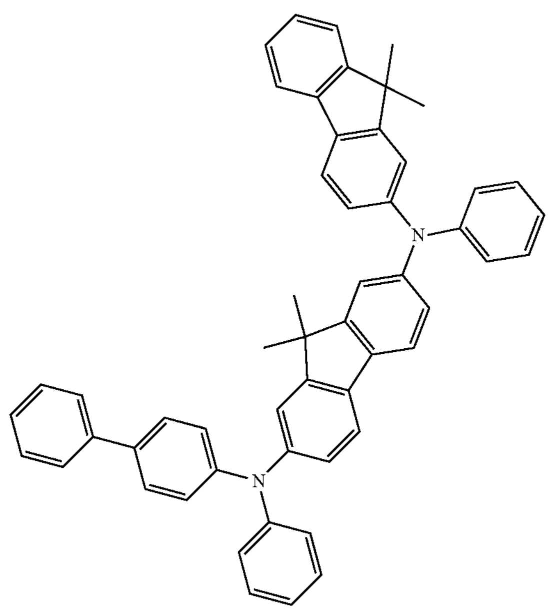

-continued
7-14
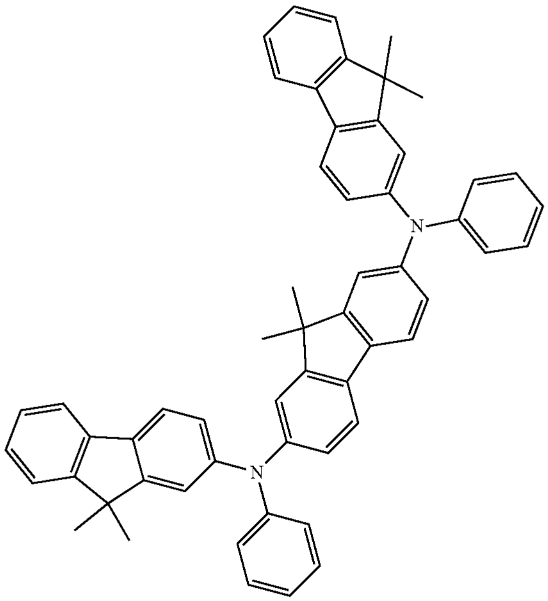
7-15
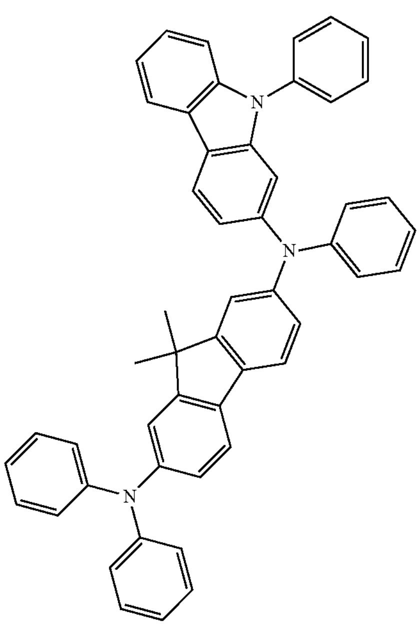
-continued
7-16
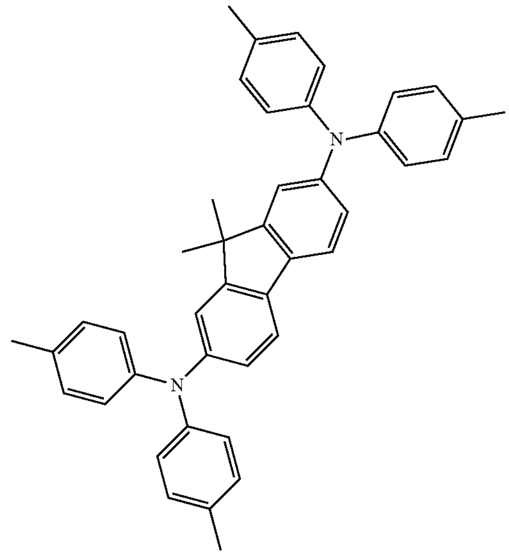
7-17
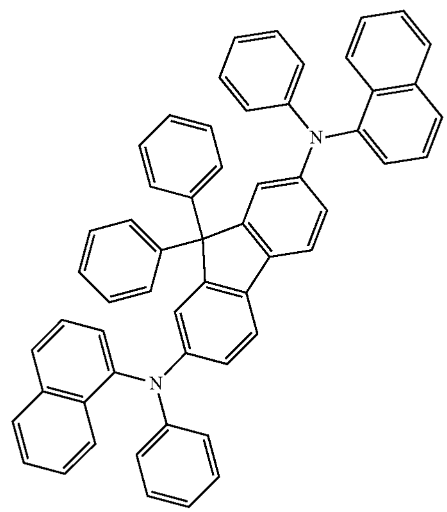
7-18
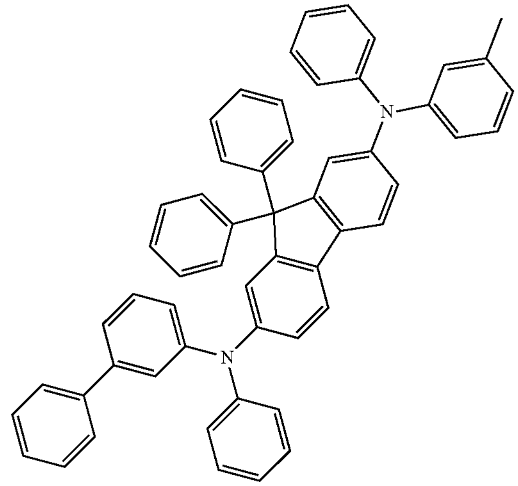

-continued
7-19
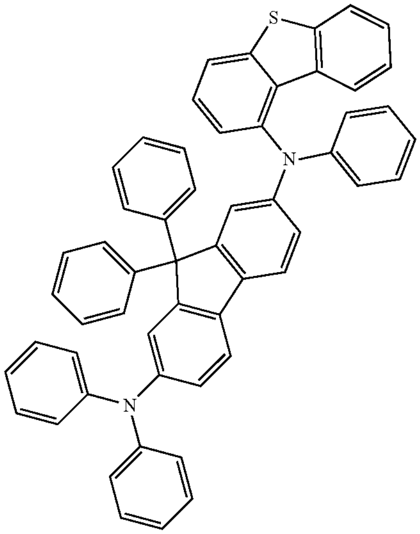
7-20
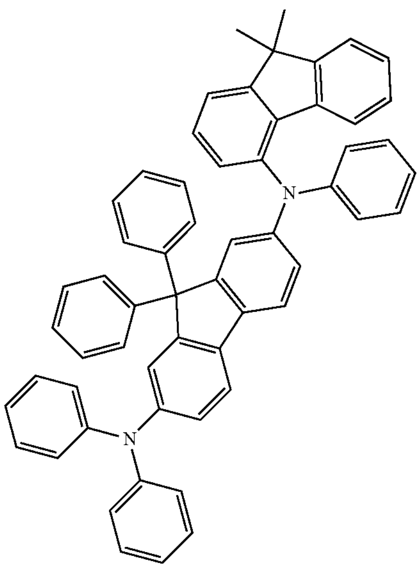
7-21
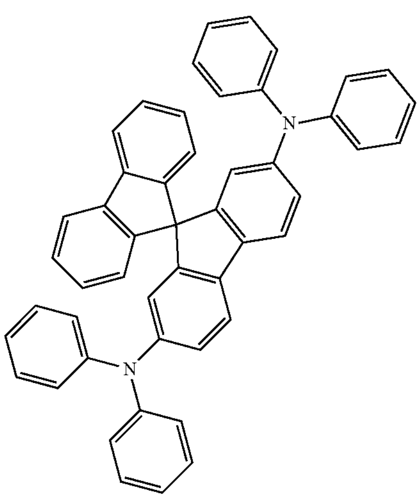
-continued
7-22
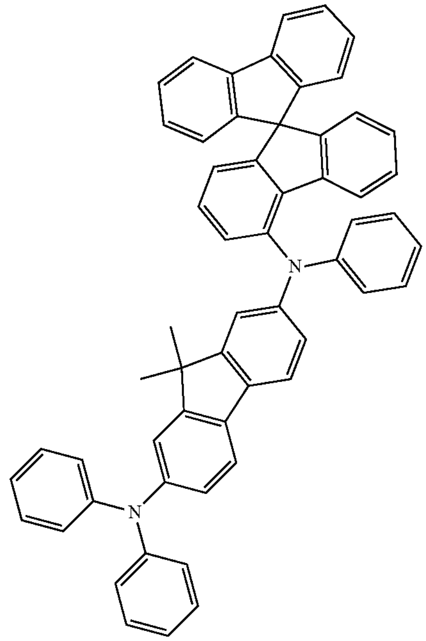
7-23
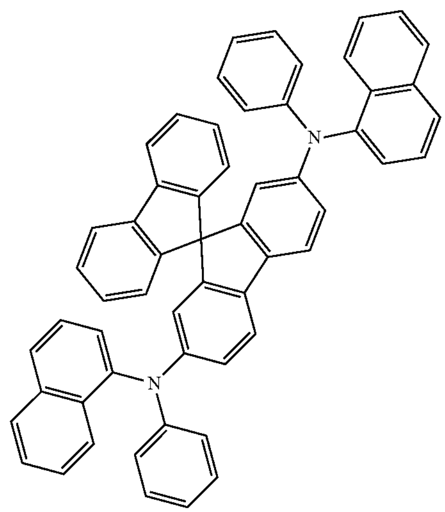
7-24
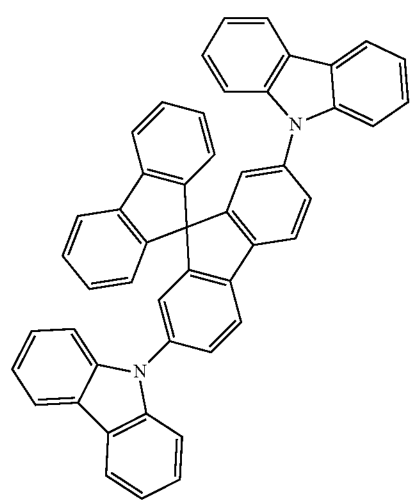

-continued
7-25
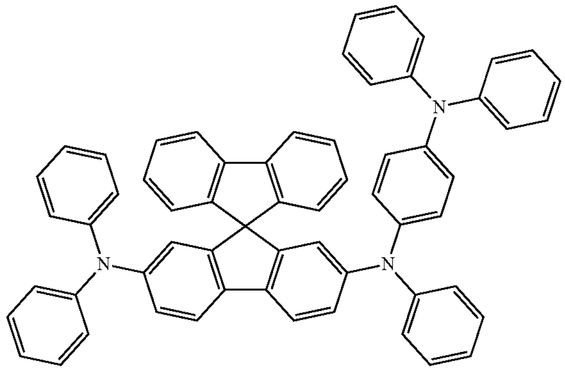
7-26
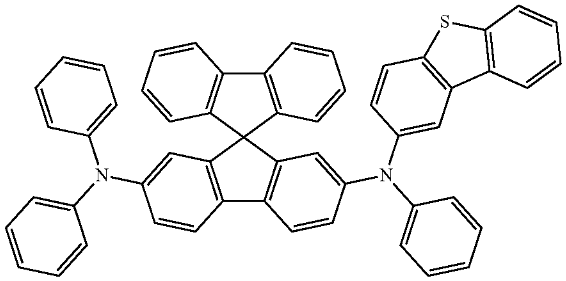
7-27
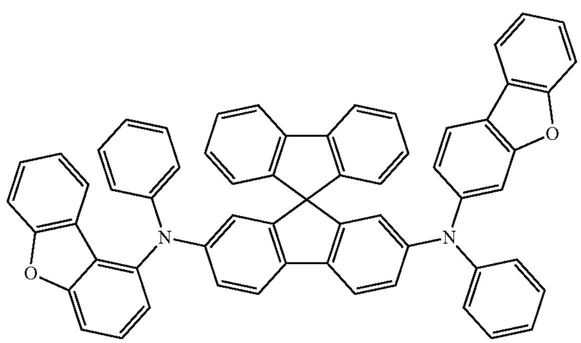
7-28
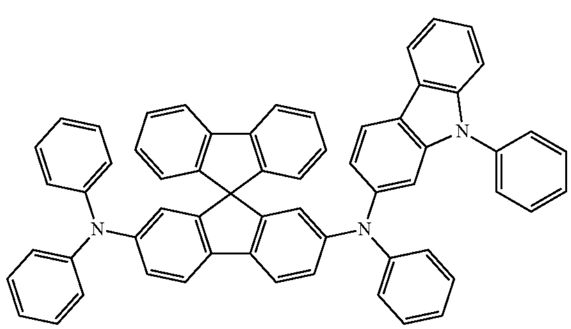
-continued
7-29
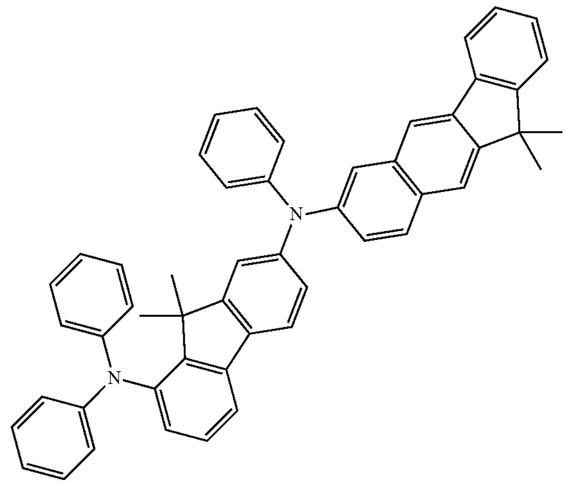
7-30
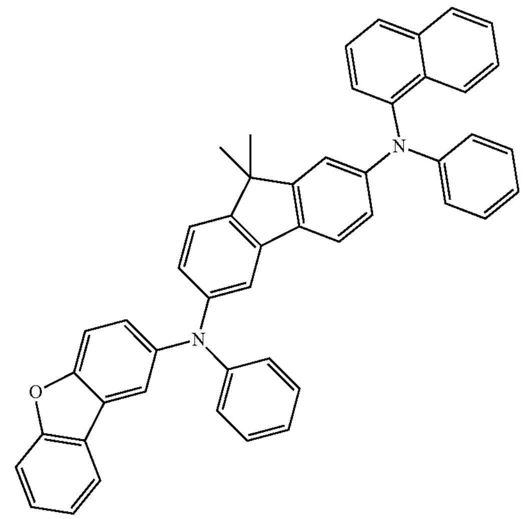
7-31
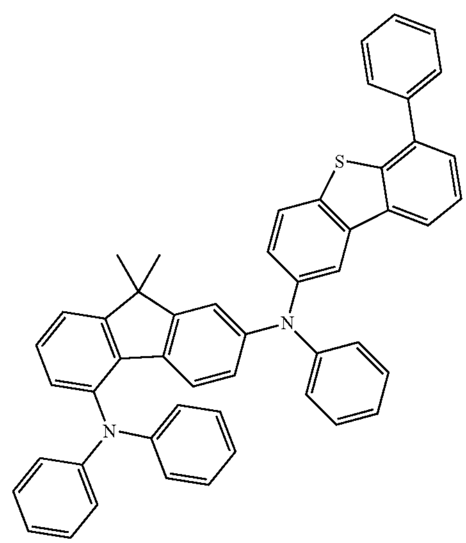

-continued
7-32
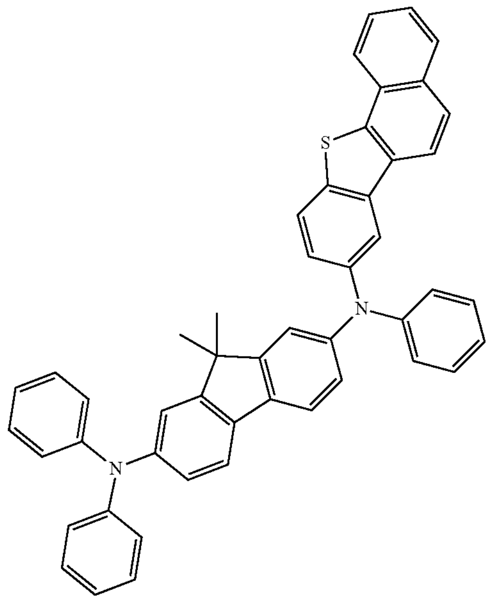
7-33
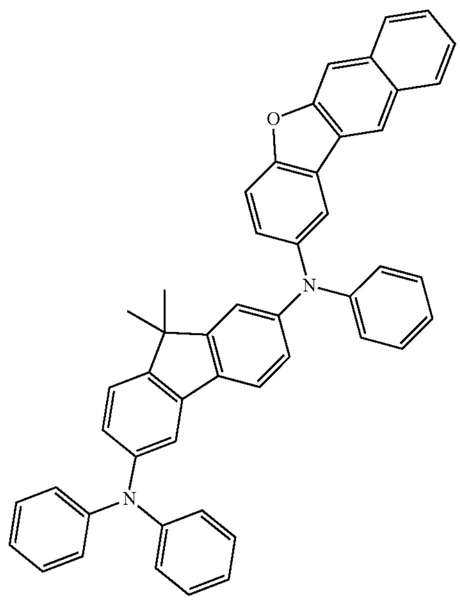
7-34
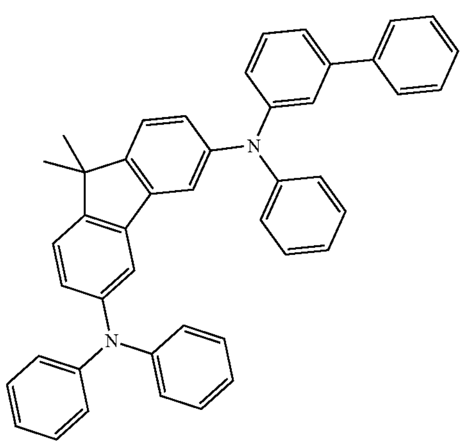
-continued
7-35
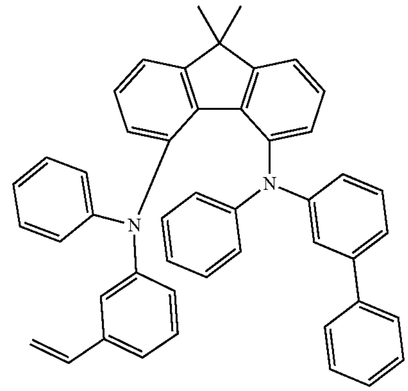
7-36
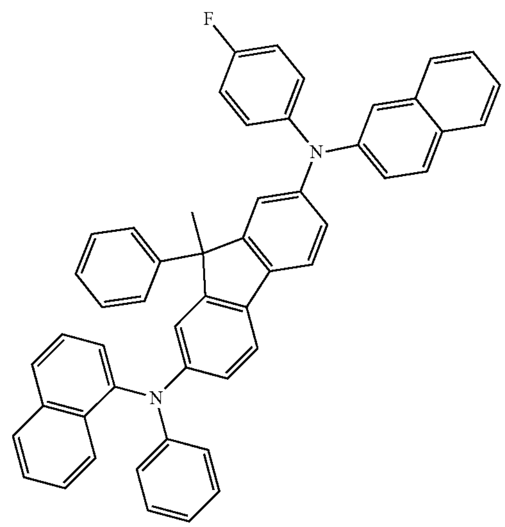
7-37
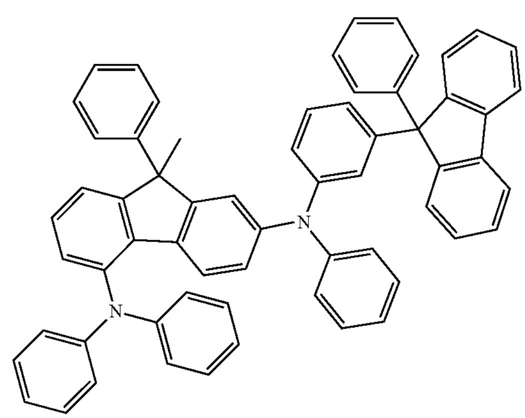

-continued
7-38
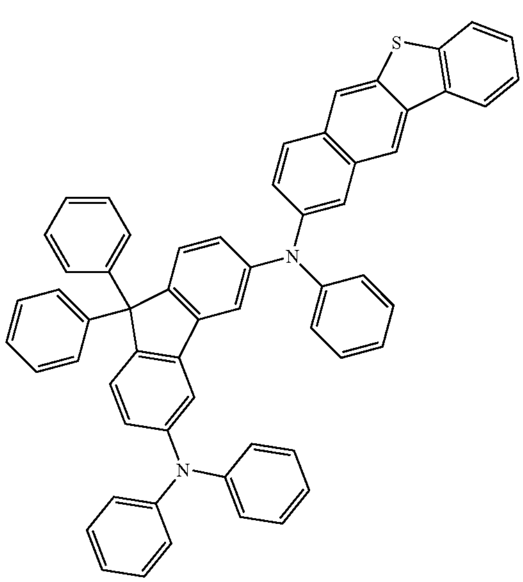
7-39
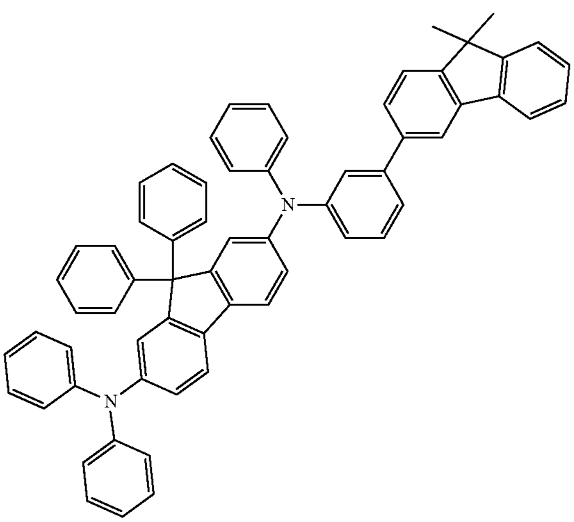
7-40
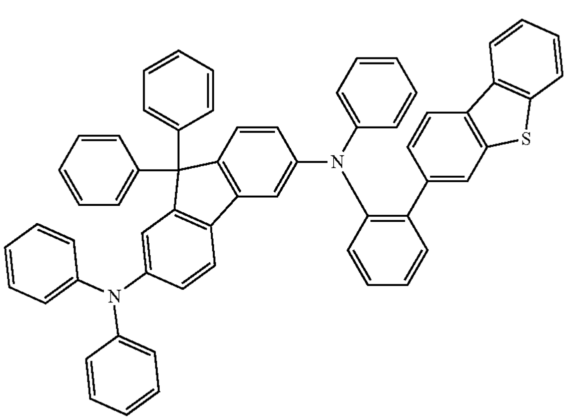
-continued
7-41
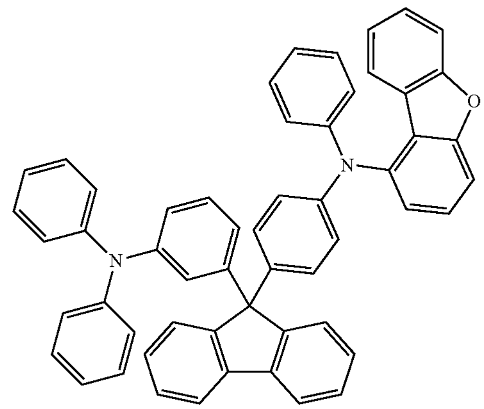
7-42
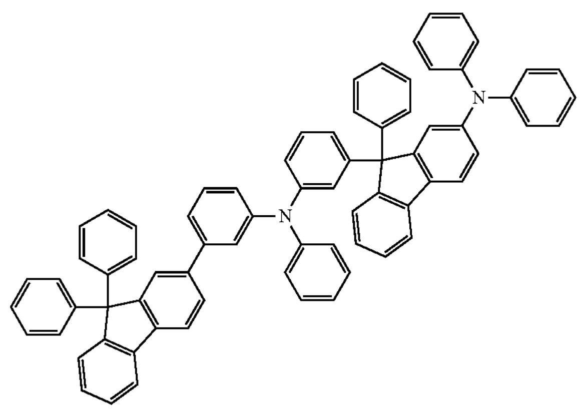
7-43
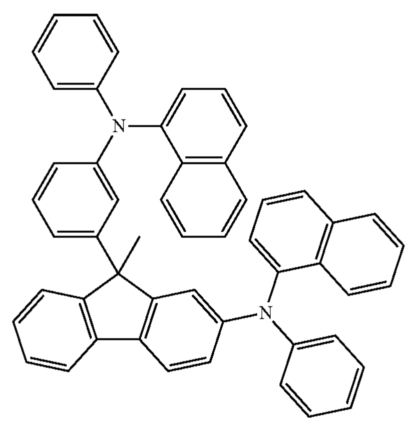

-continued
7-44
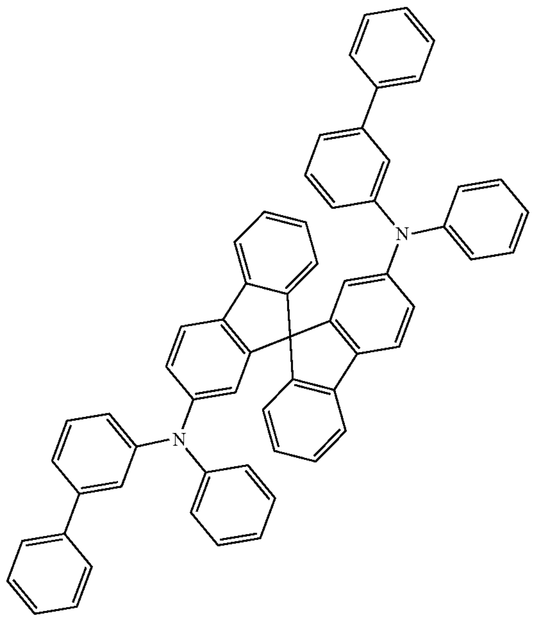
7-45
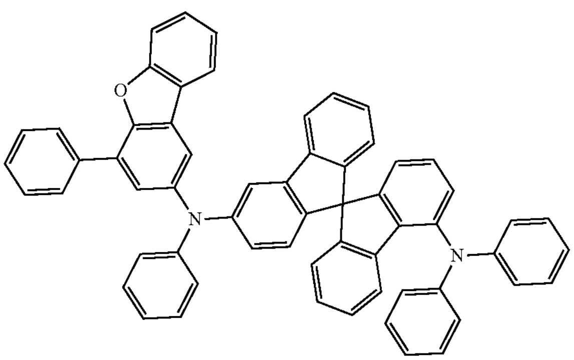
7-46
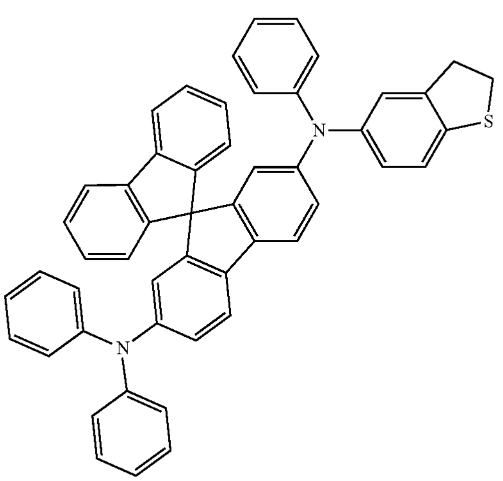
-continued
7-47
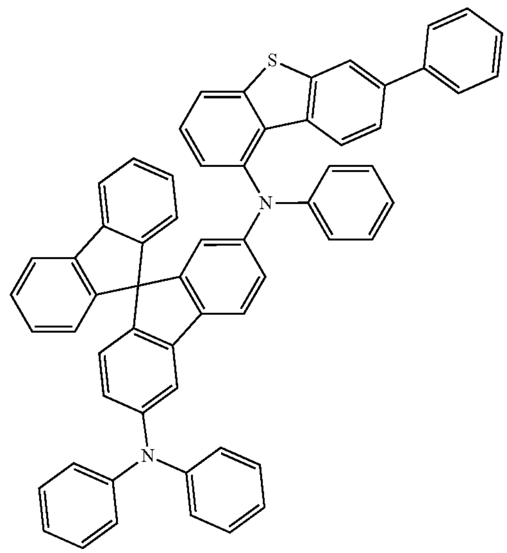
7-48
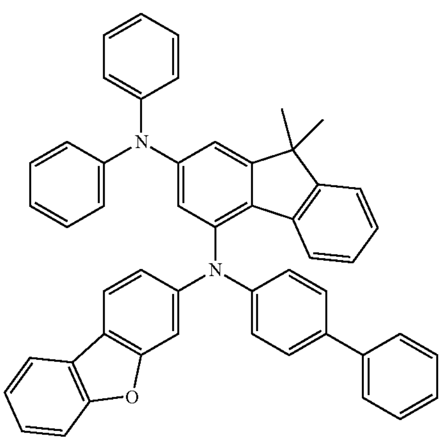
7-49
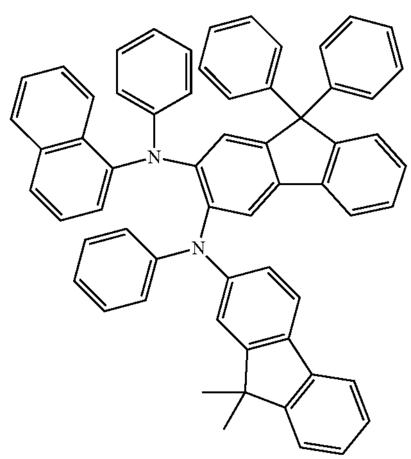

-continued
7-50
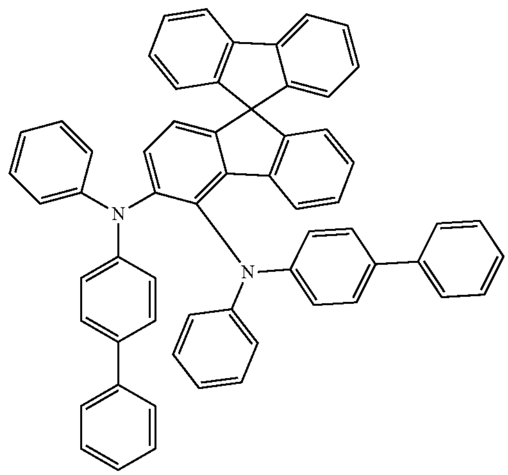
7-51
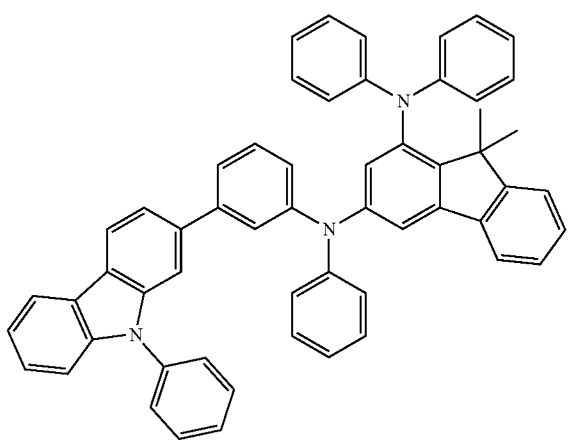
10-1
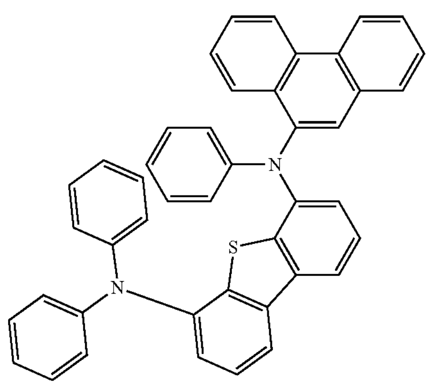
-continued
10-2
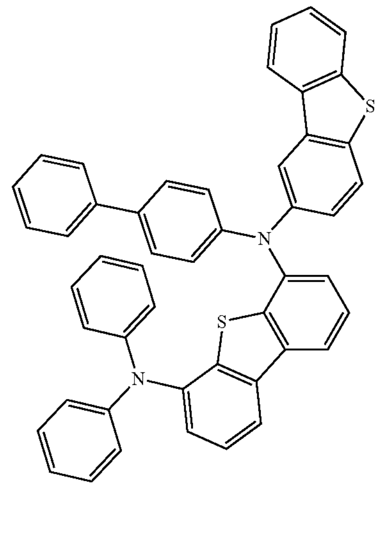
10-3
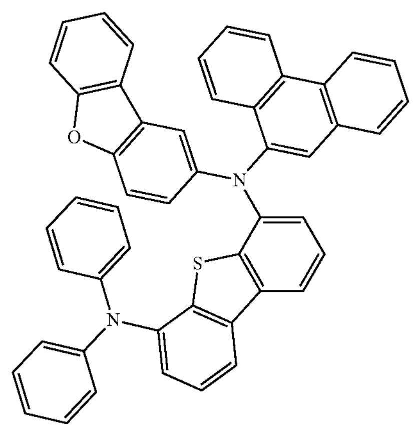
10-4
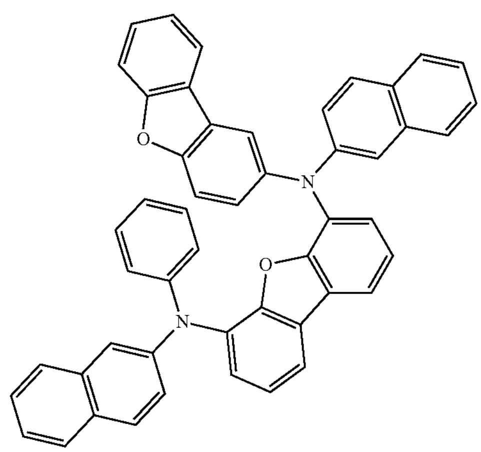

10-5
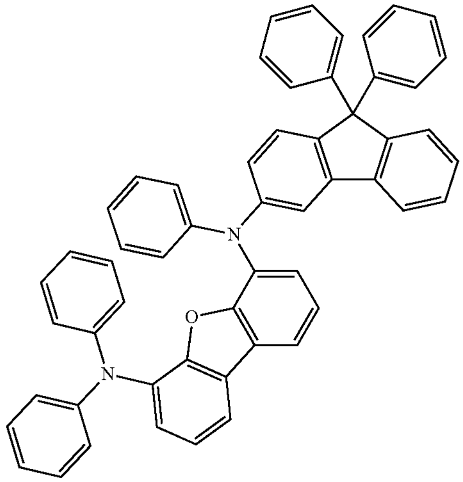
10-6
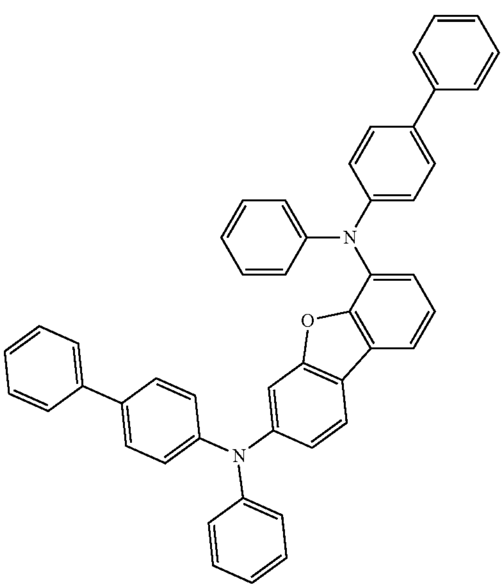
10-7
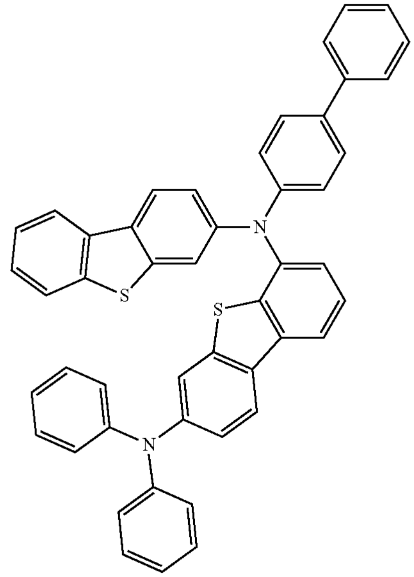
10-8
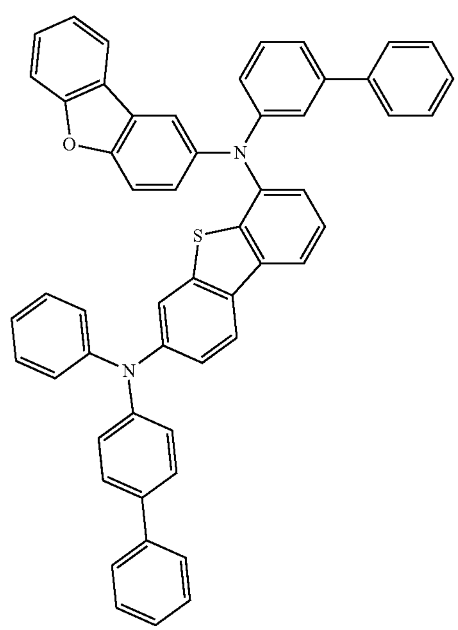

-continued
10-9
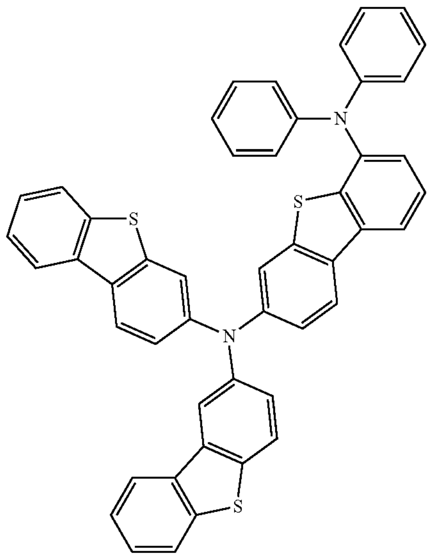
-continued
10-11
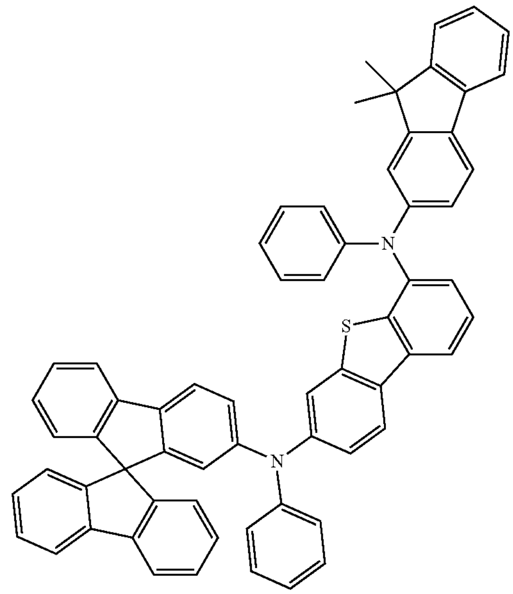
10-10
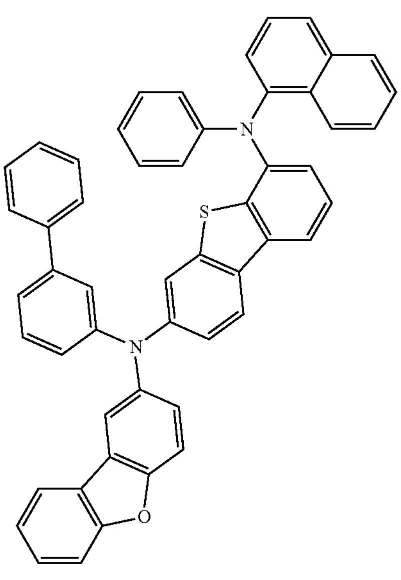
10-12
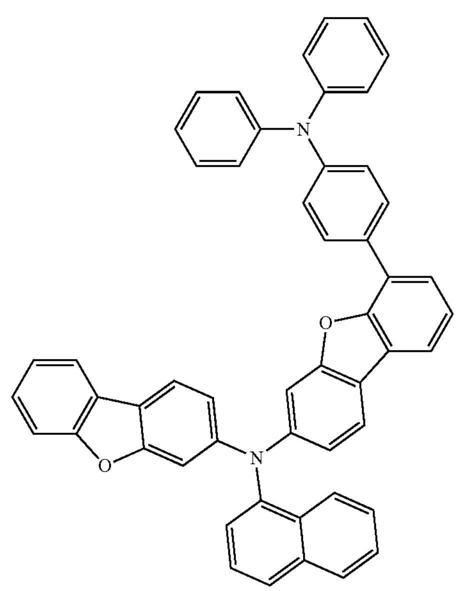

-continued
10-13
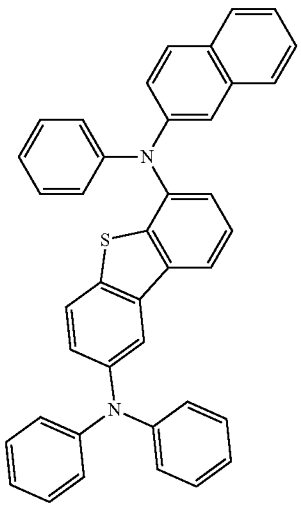
10-14
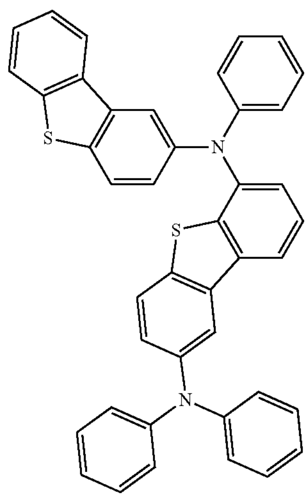
10-15
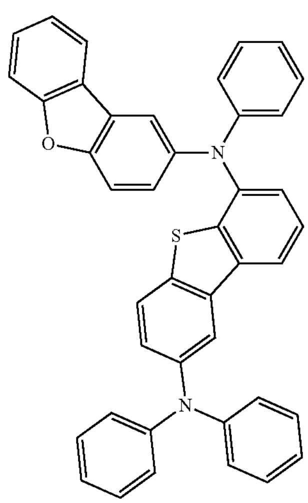
-continued
10-16
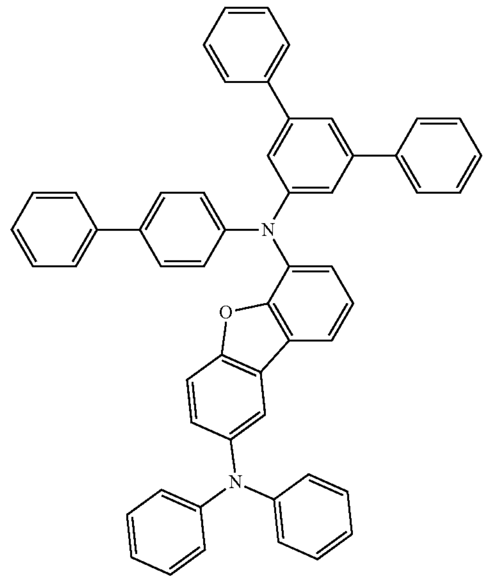
10-17
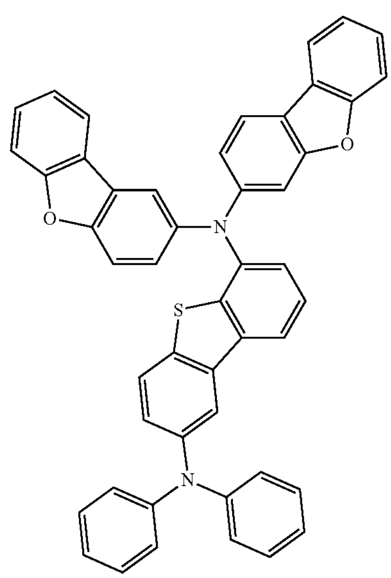

10-18
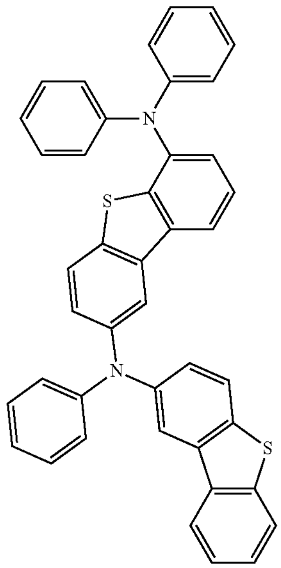
10-19
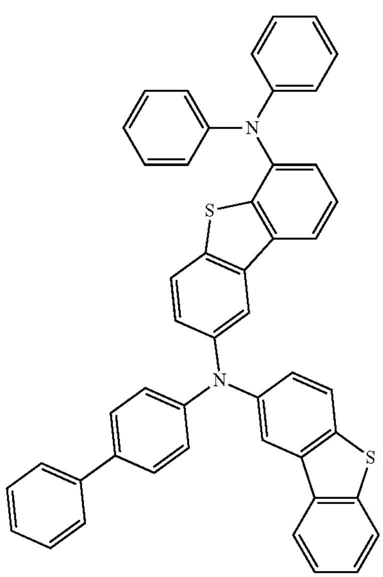
10-20
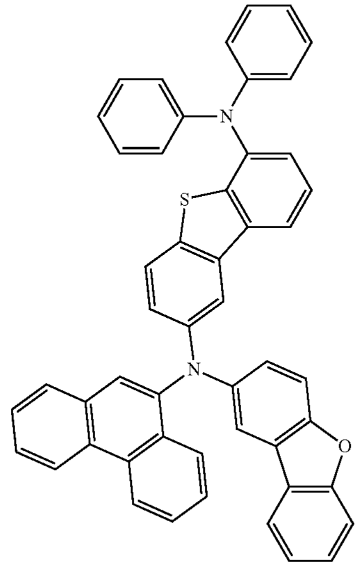
10-21
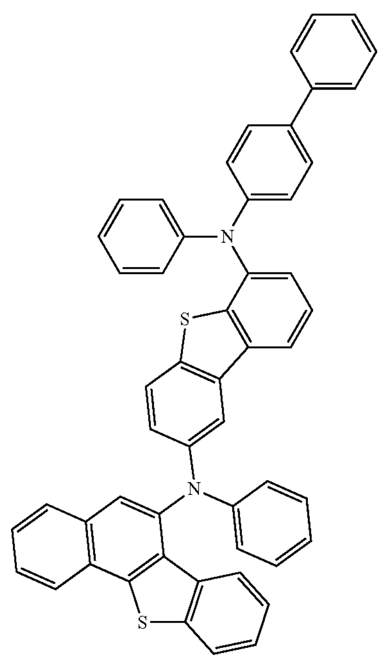

10-22
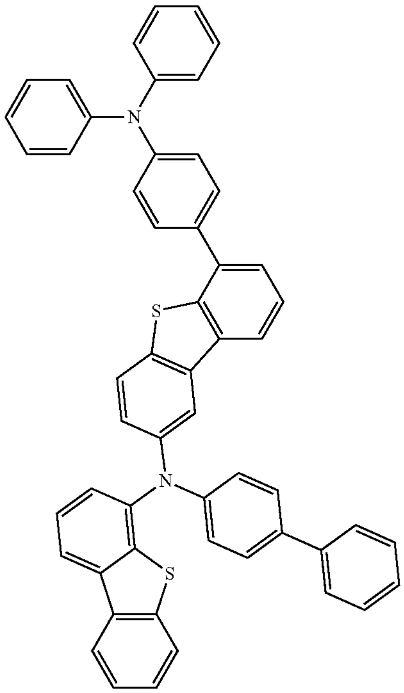
10-23
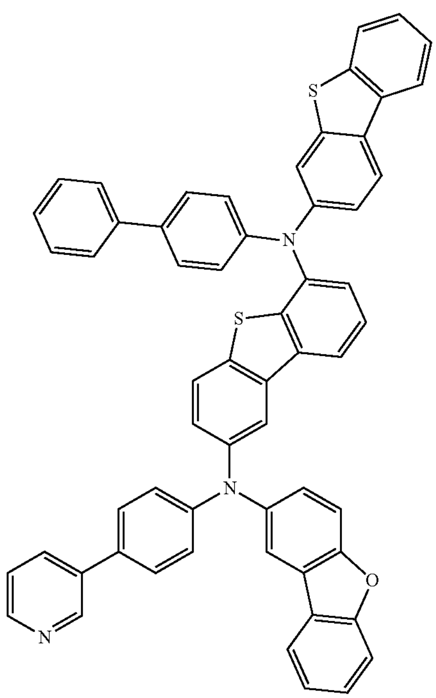
10-24
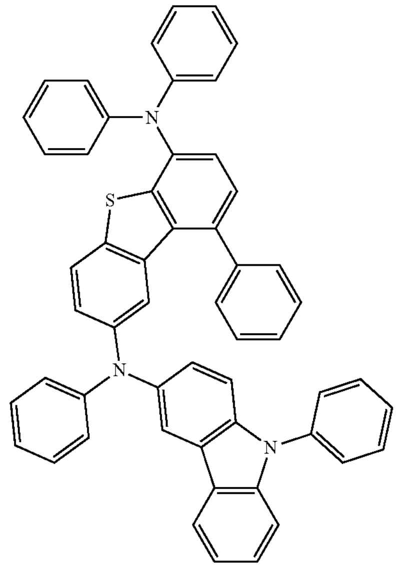
10-25
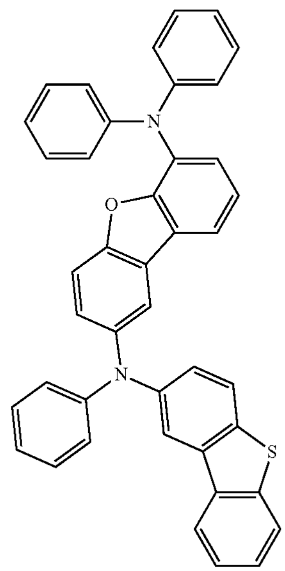
10-26
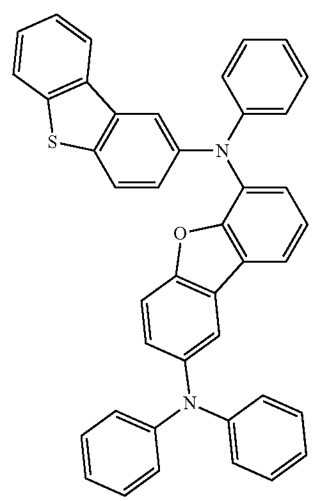

-continued
10-27
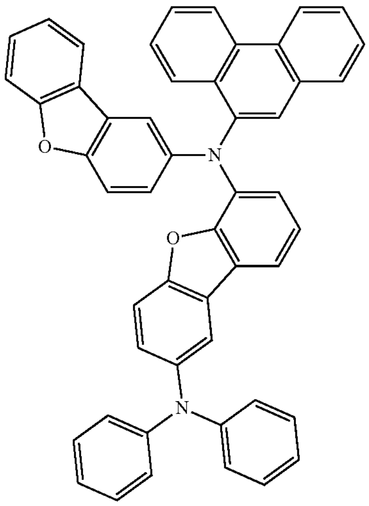
10-28
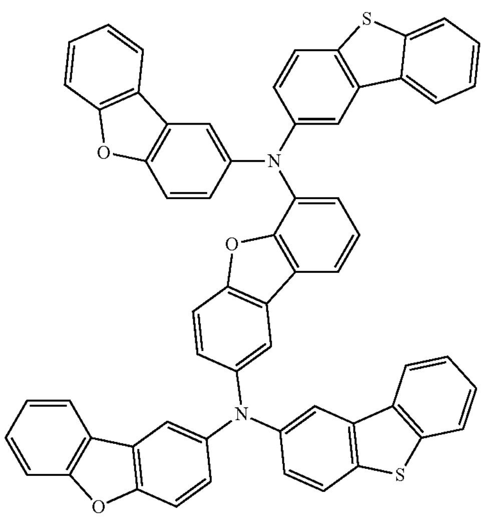
10-29
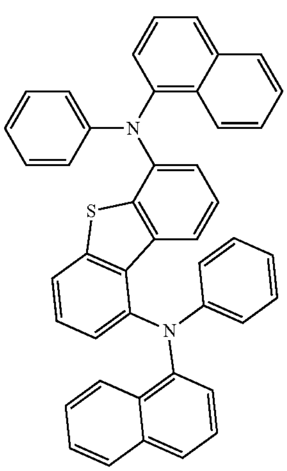
-continued
10-30
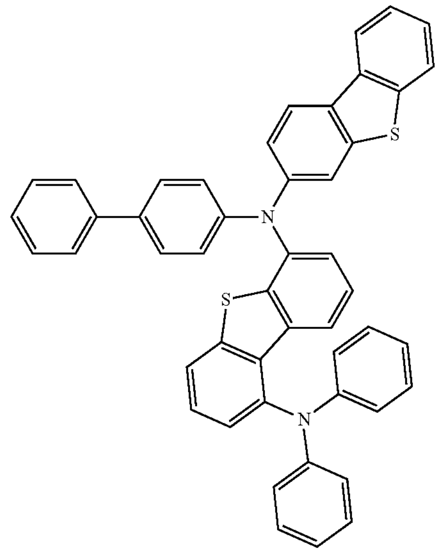
10-31
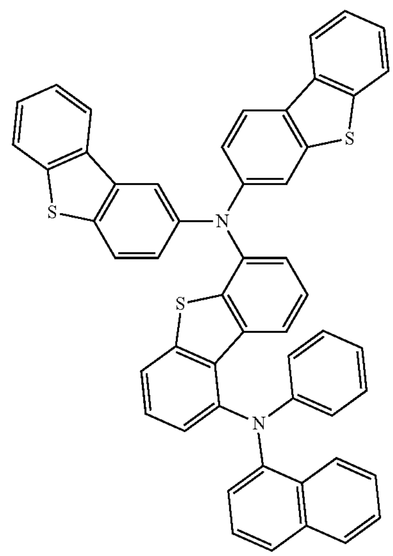
10-32
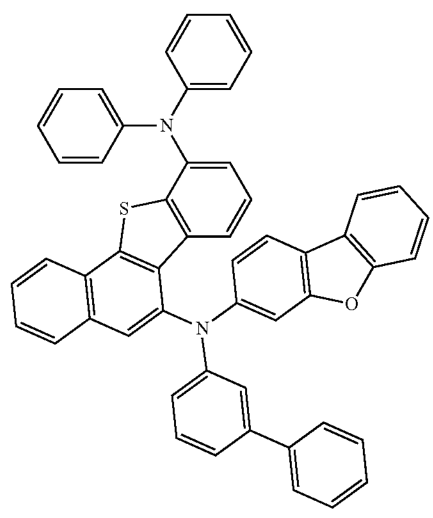

-continued
10-33
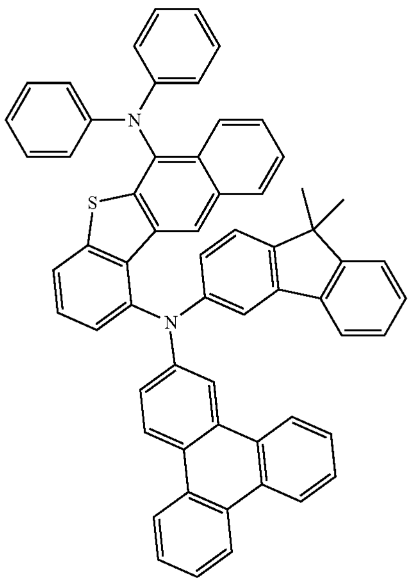
10-34
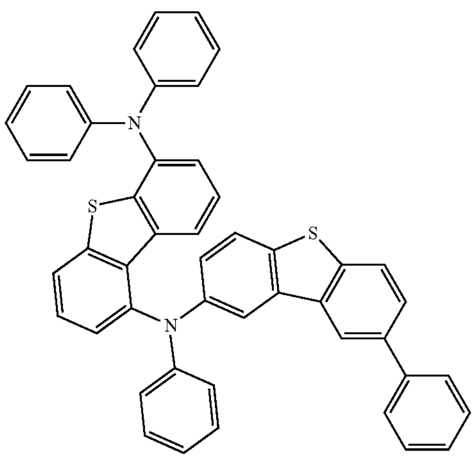
10-35
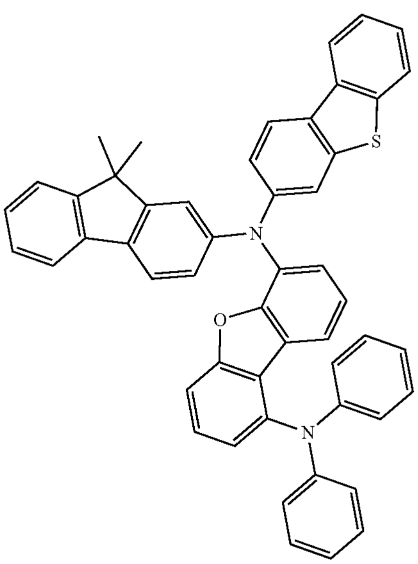
-continued
10-36
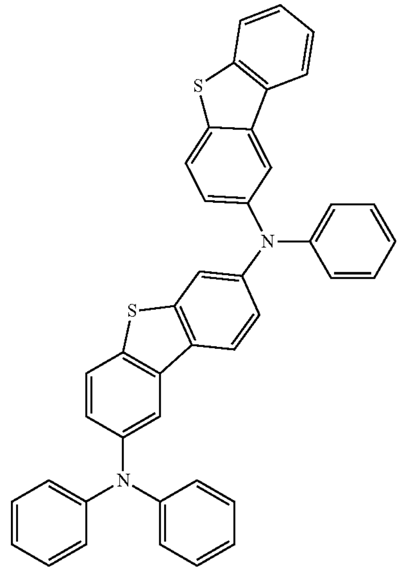
10-37
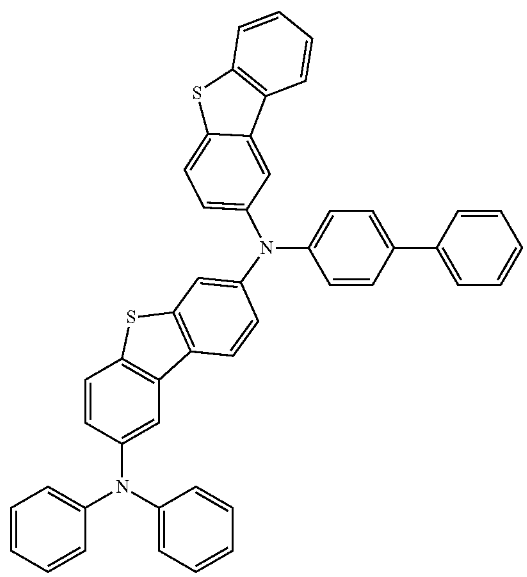
10-38
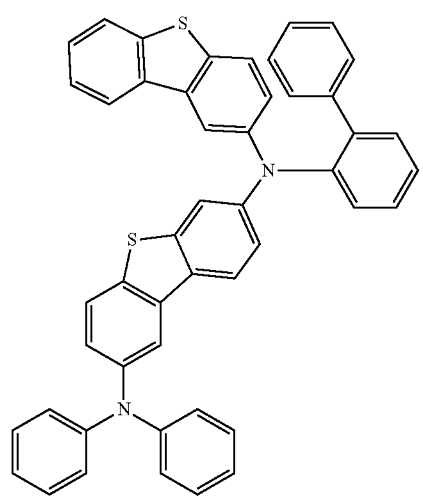

10-39
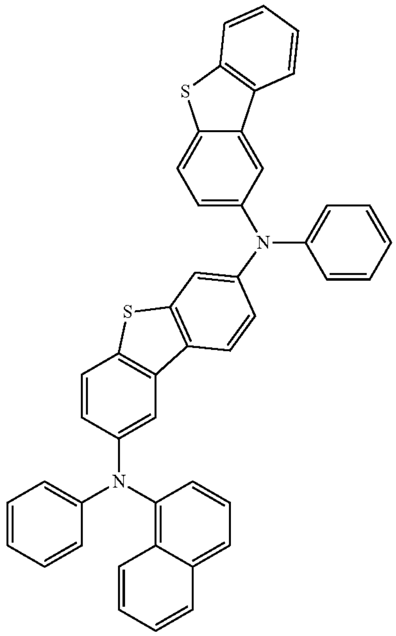
10-40
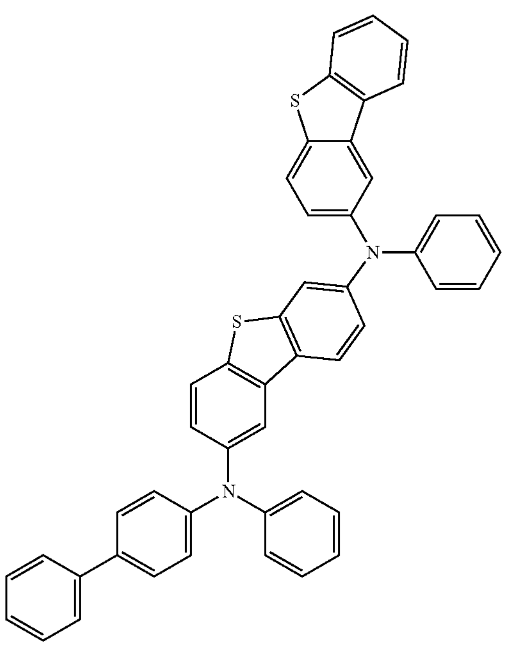
10-41
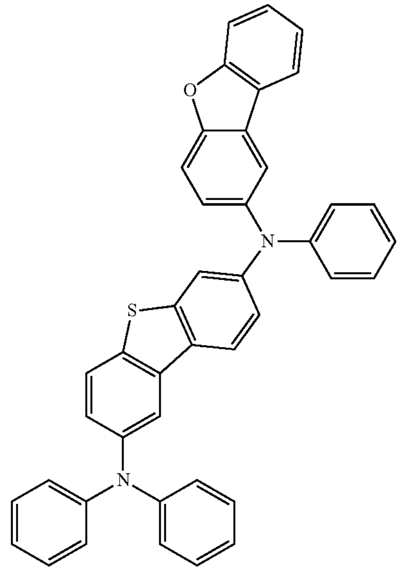
10-42
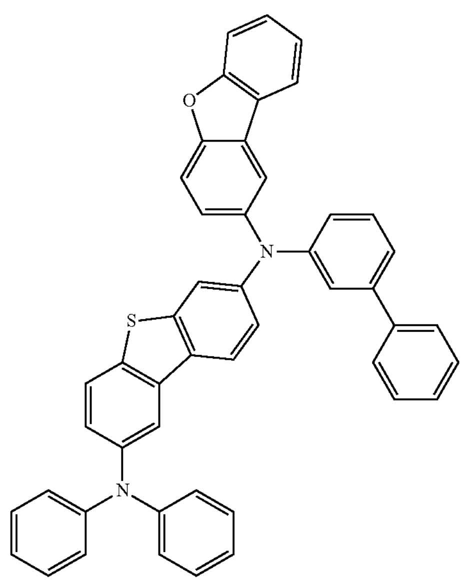

-continued
10-43
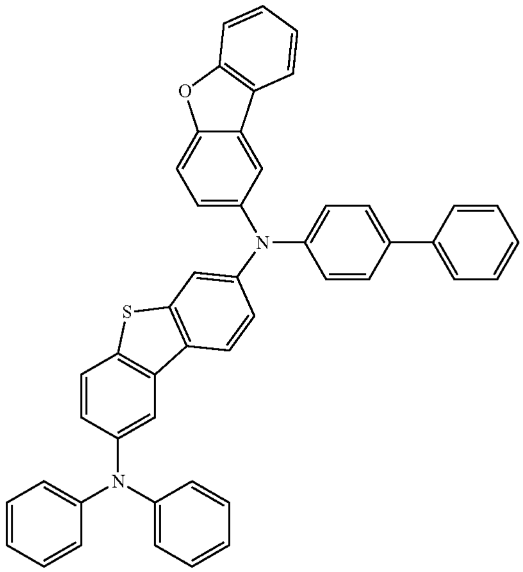
10-44
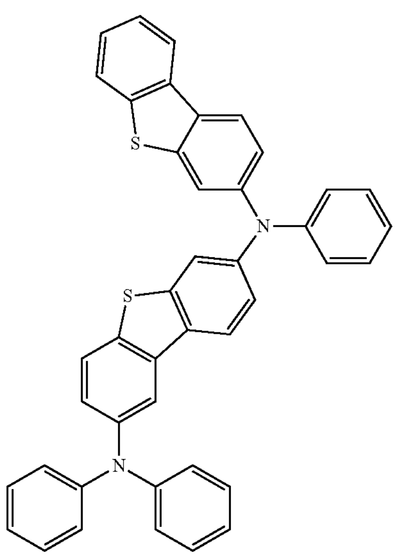
-continued
10-45
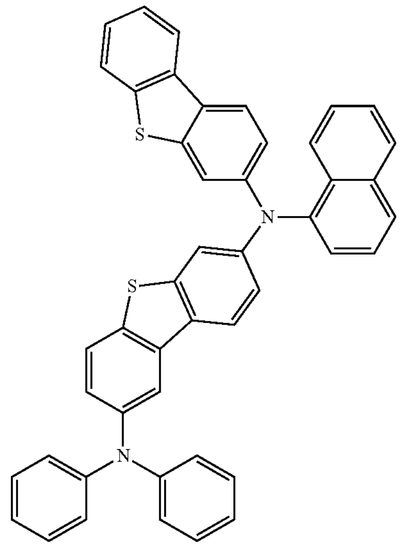
10-46
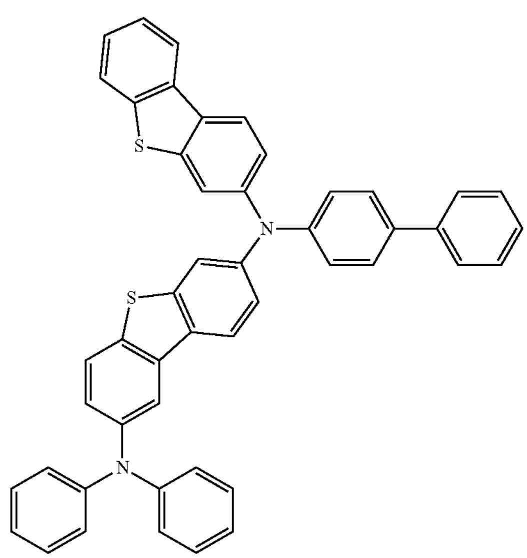

-continued
10-47
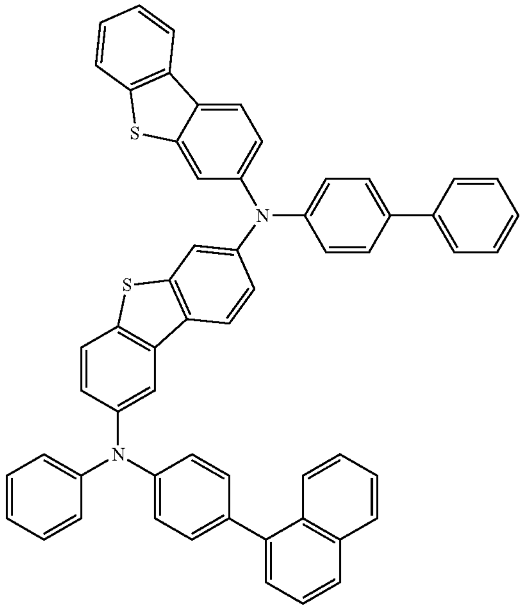
10-48
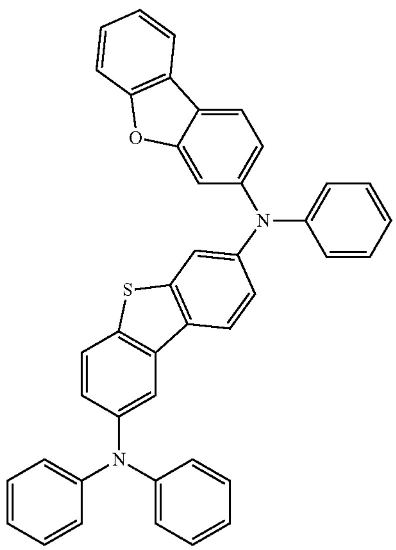
10-49
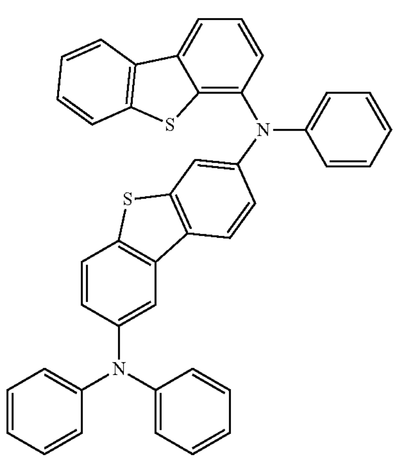
-continued
10-50
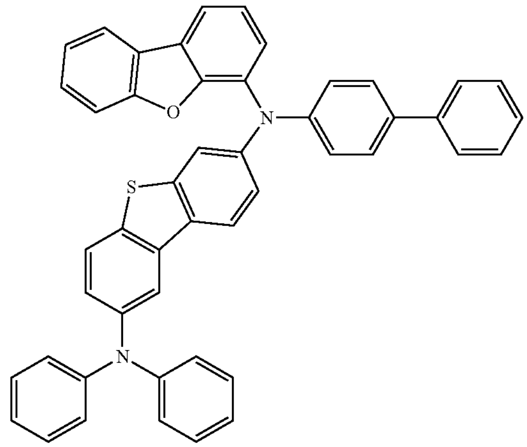
10-51
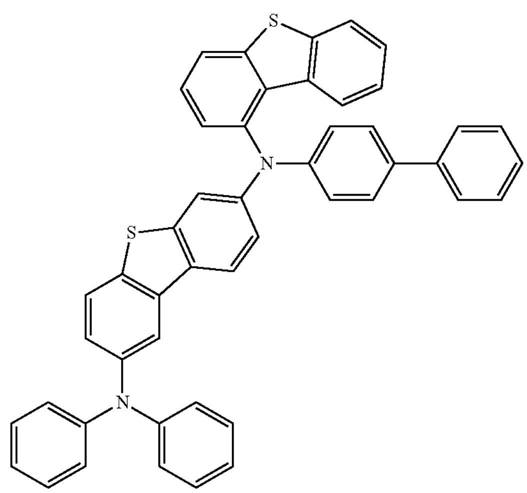
10-52
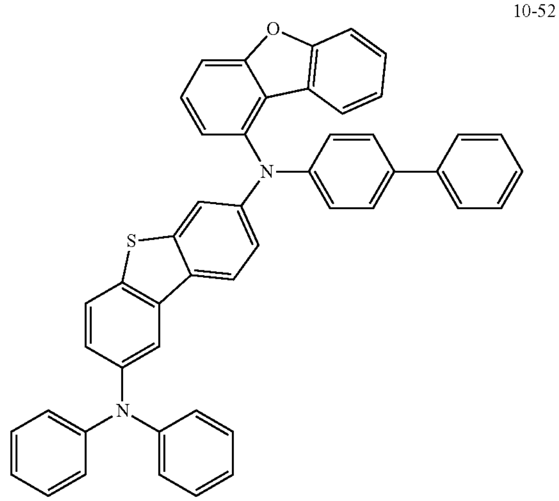

-continued
10-53
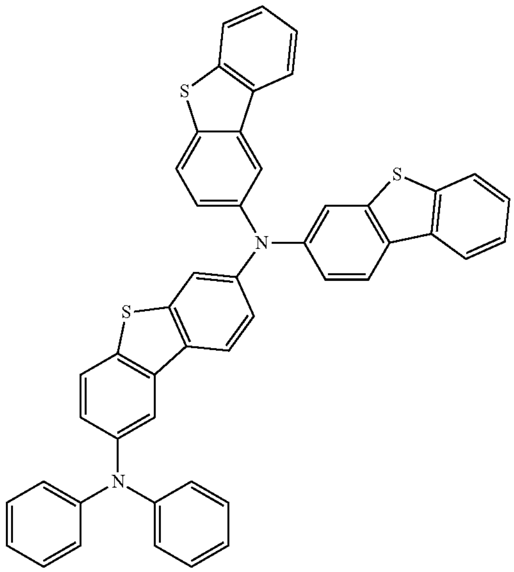
10-54
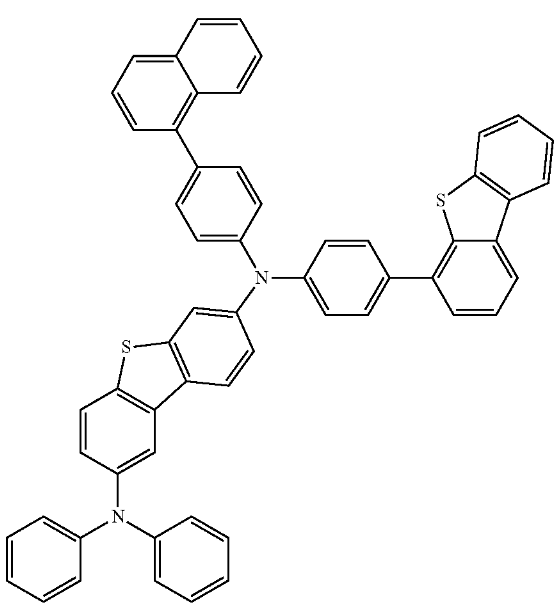
-continued
10-55
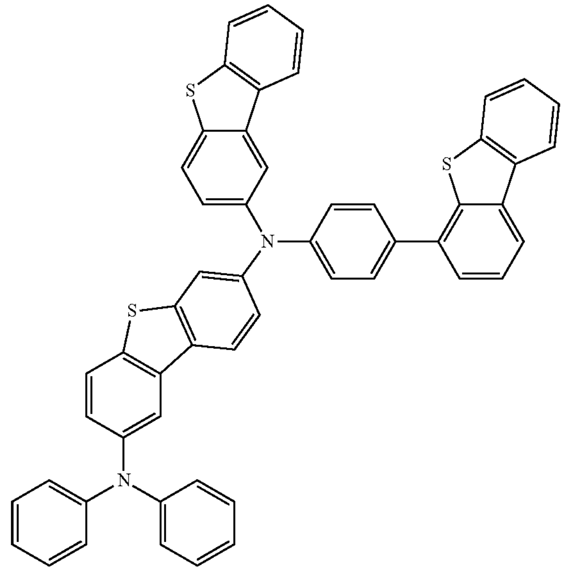
10-56
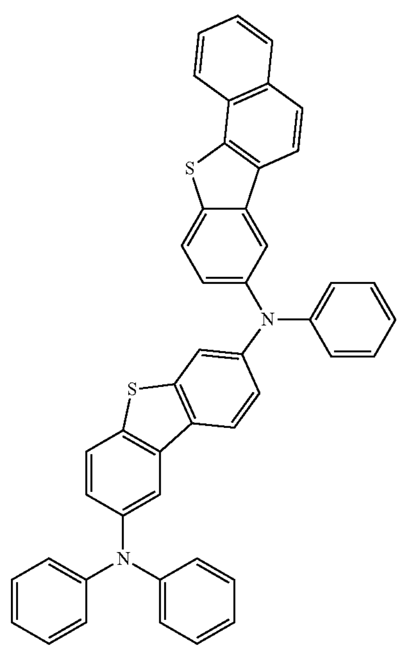

-continued
10-57
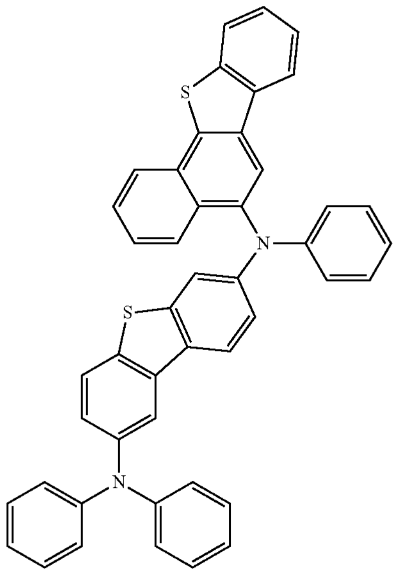
10-58
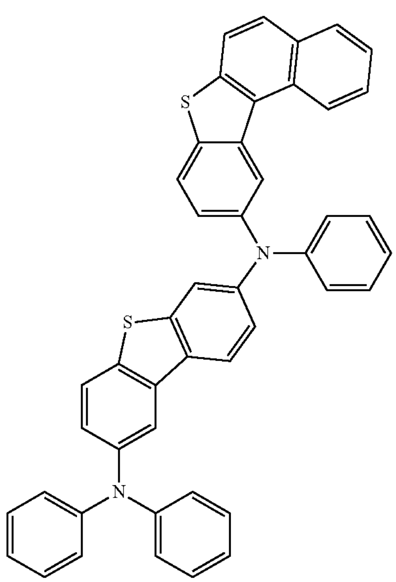
-continued
10-59
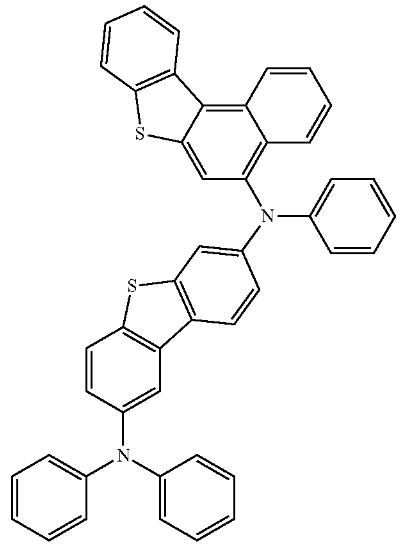
10-60
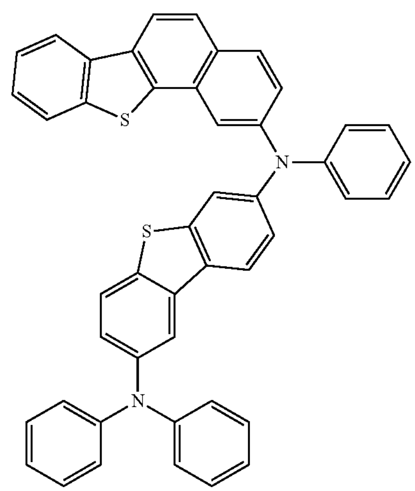
10-61
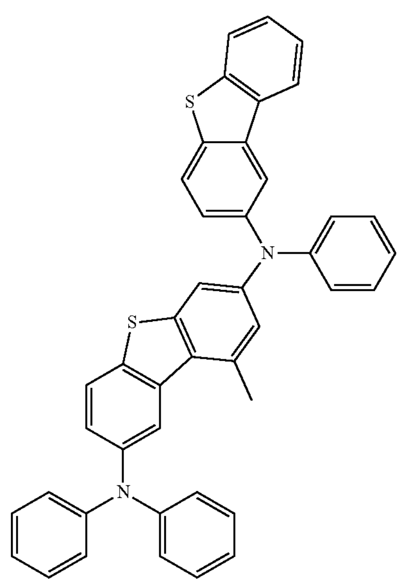

-continued
10-62
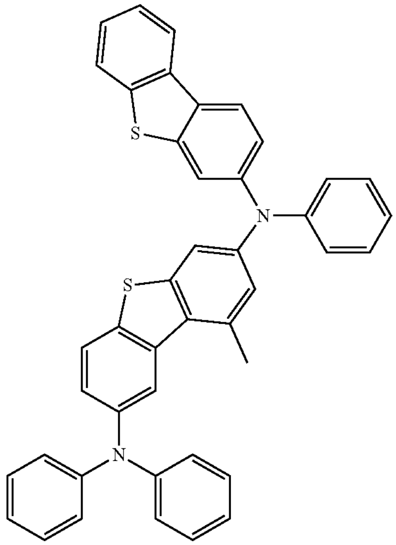
10-63
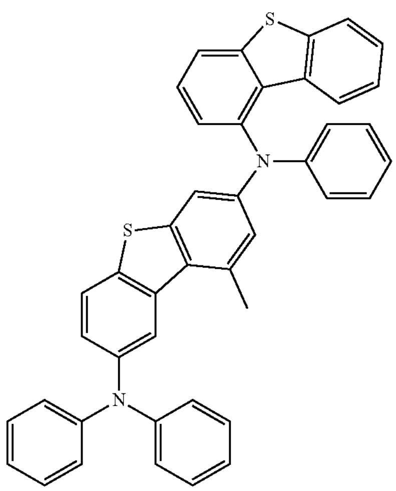
10-64
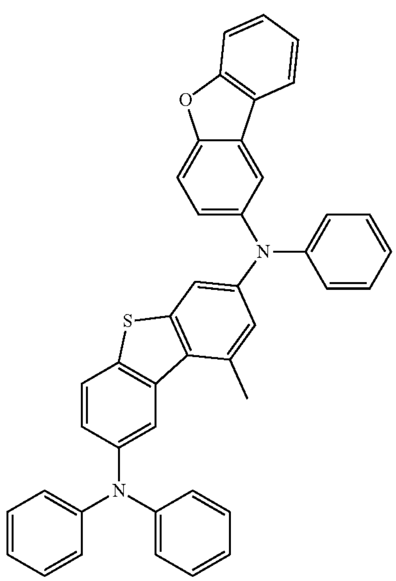
-continued
10-65
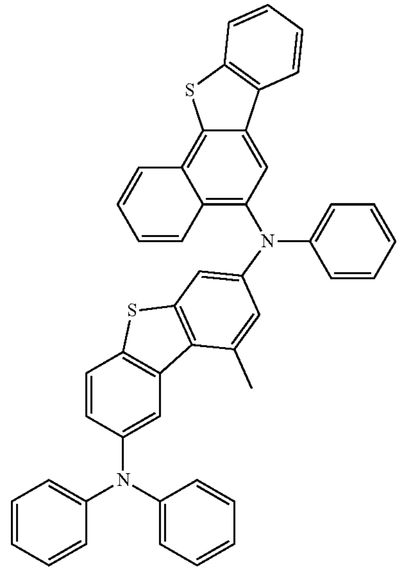
10-66
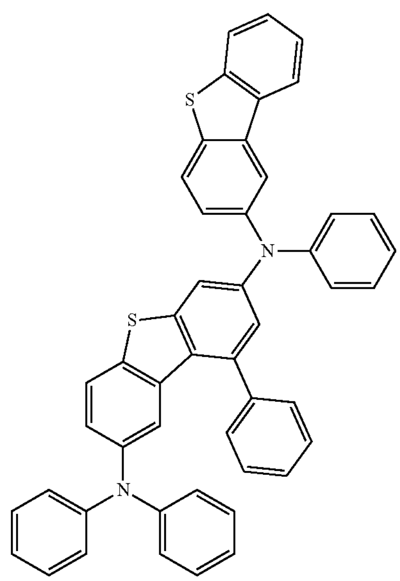

-continued
10-67
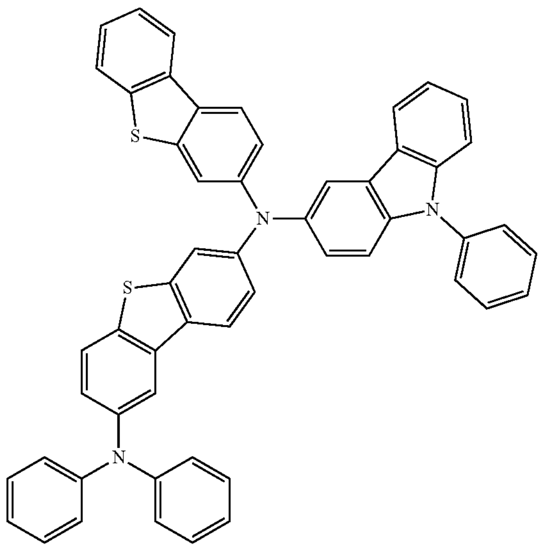
10-68
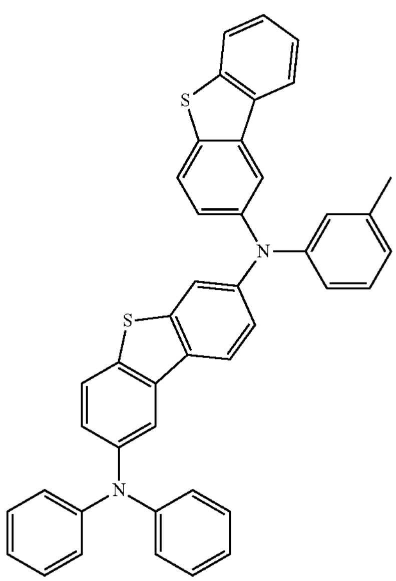
-continued
10-69
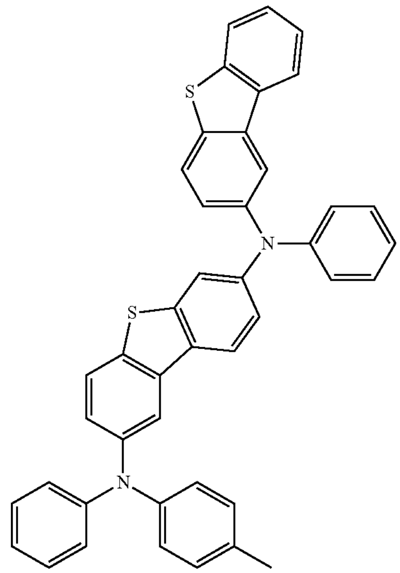
10-70
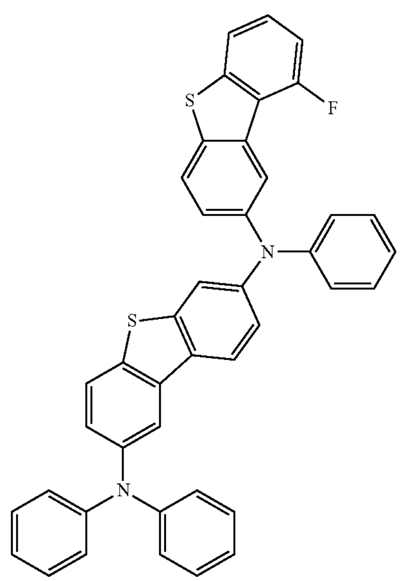

-continued
10-71
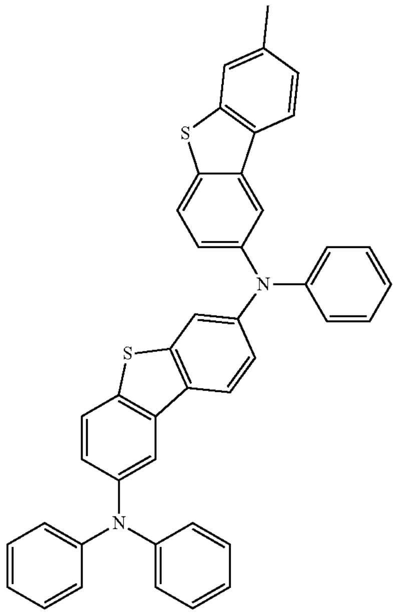
10-72
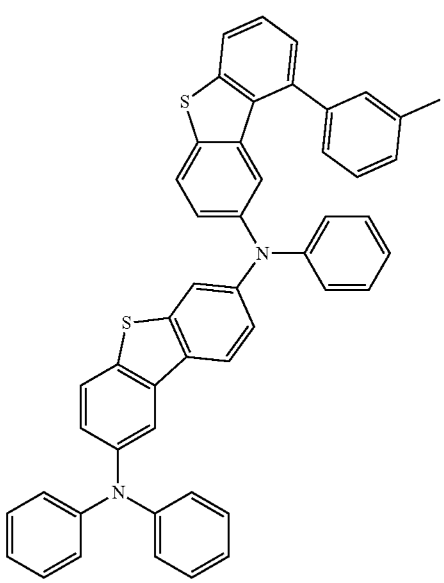
-continued
10-73
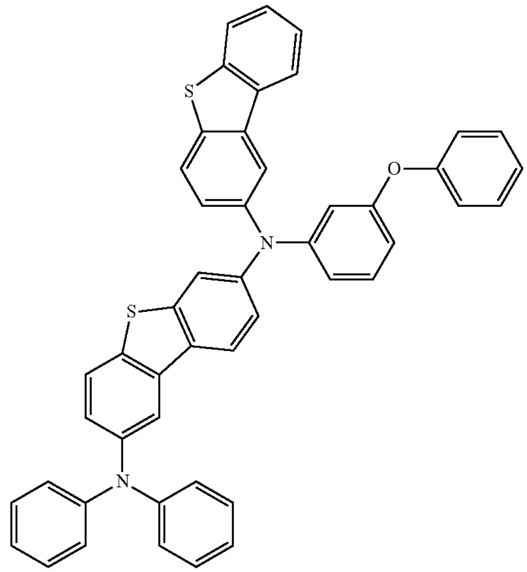
10-74
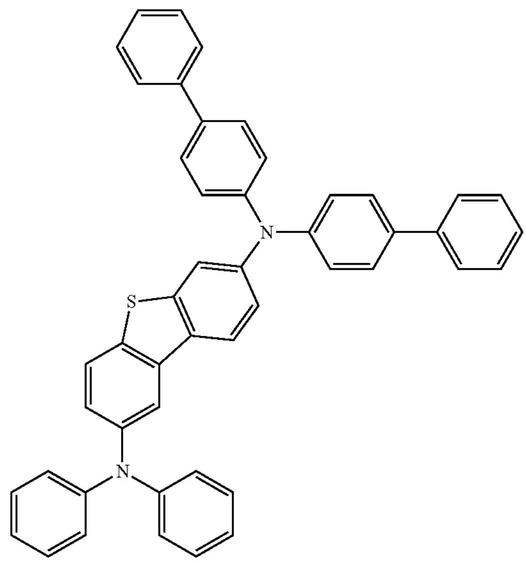
10-75
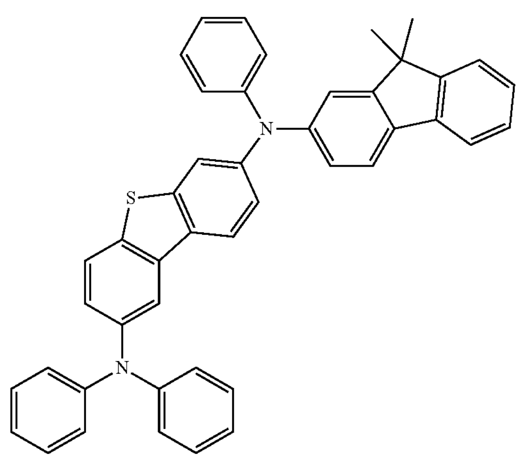

-continued
10-76
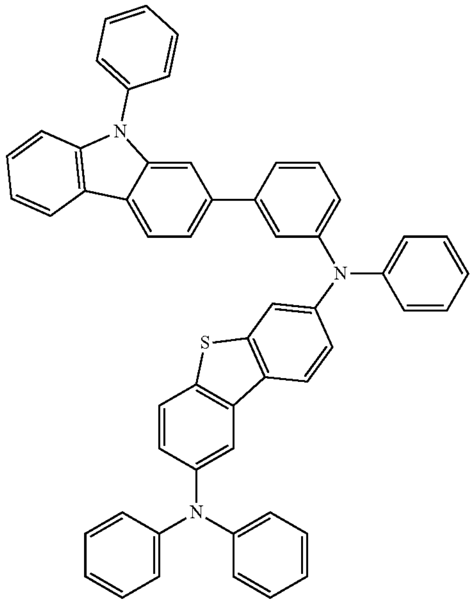
10-77
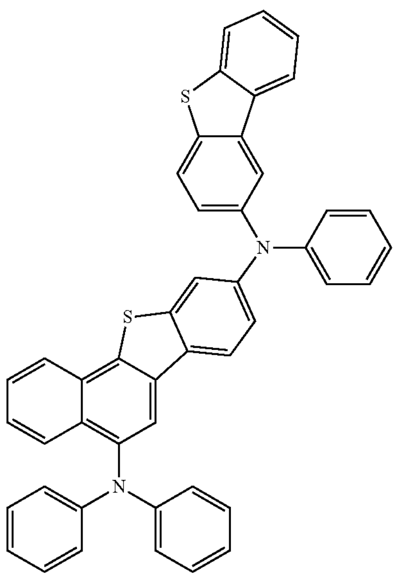
10-78
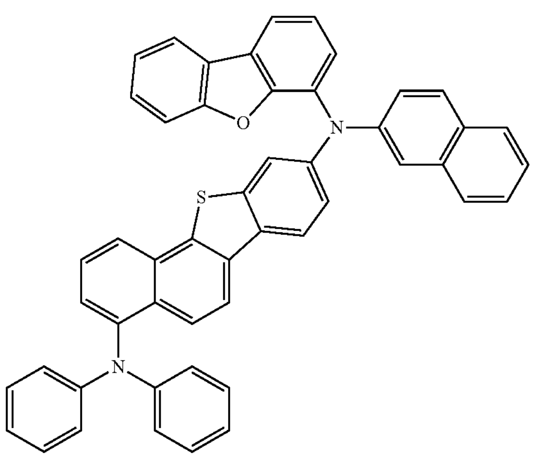
-continued
10-79
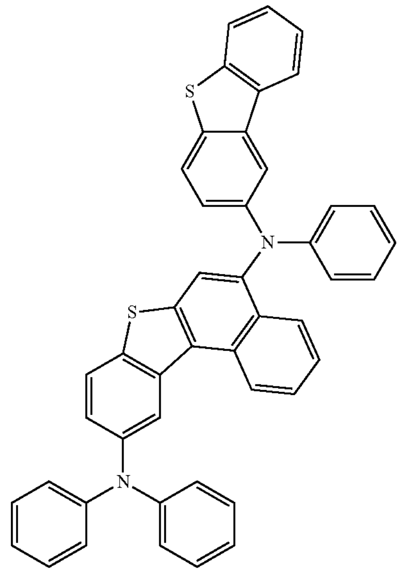
10-80
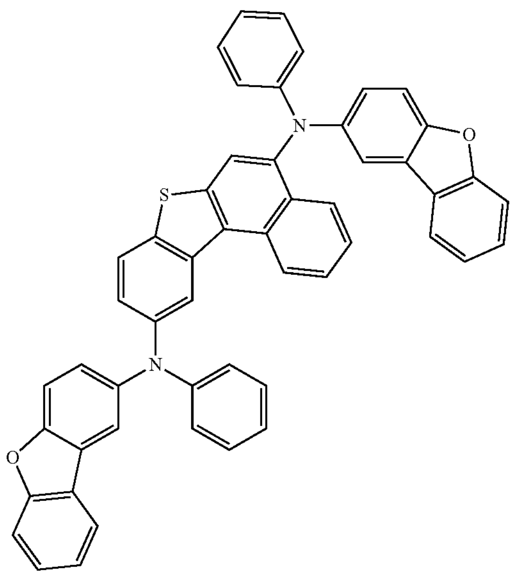
10-81
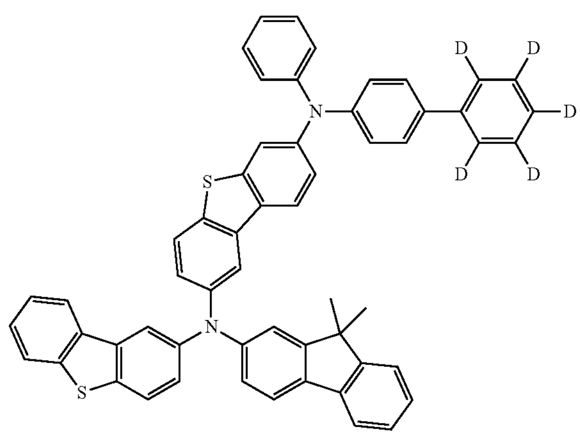

-continued
10-82
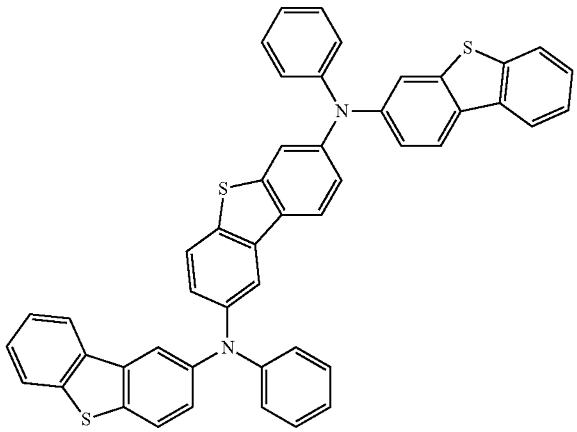
10-83
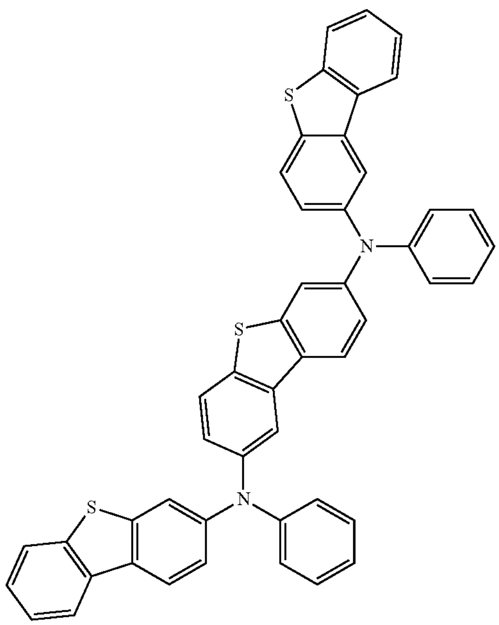
10-84
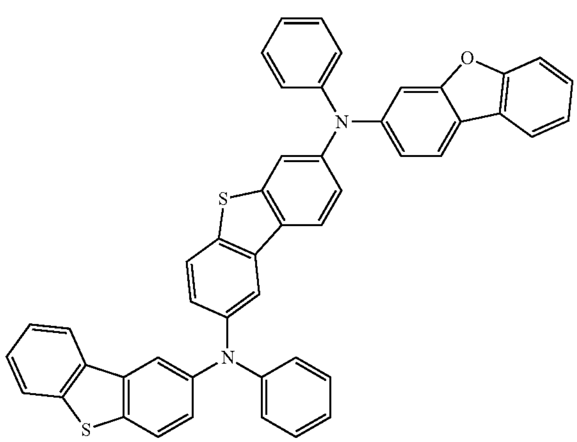
-continued
10-85
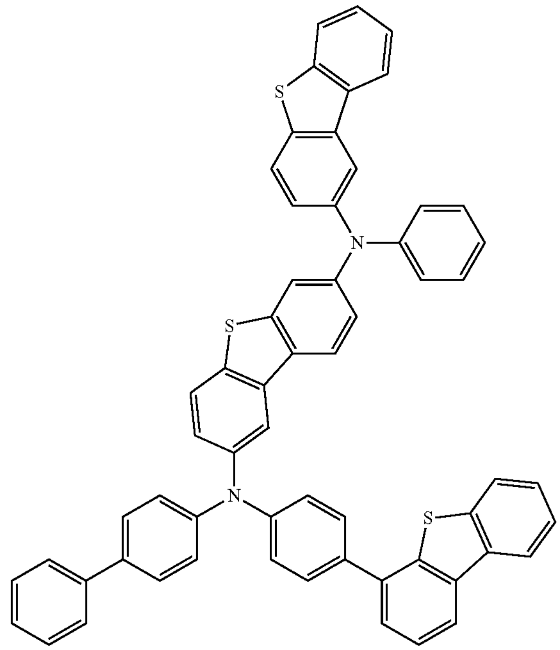
10-86
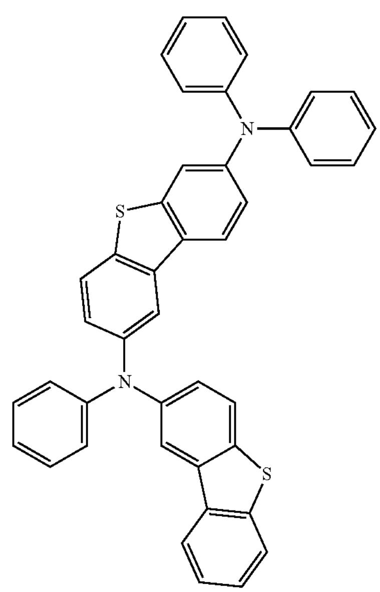

-continued
10-87
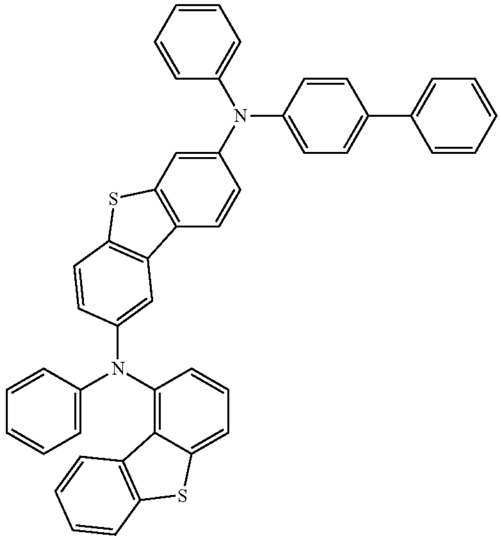
10-88
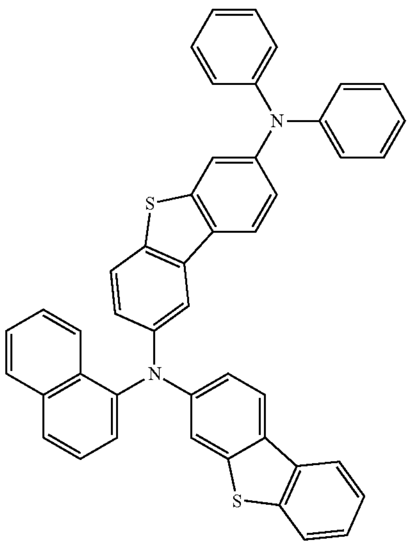
10-89
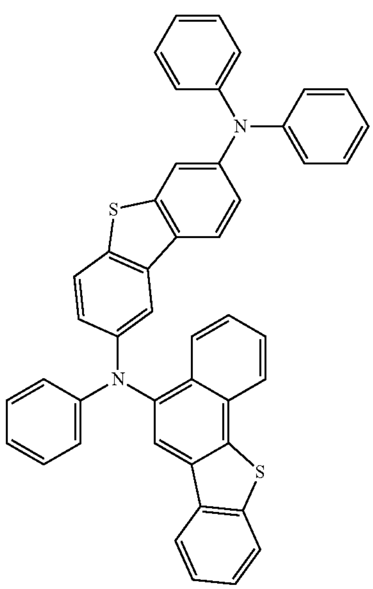
-continued
10-90
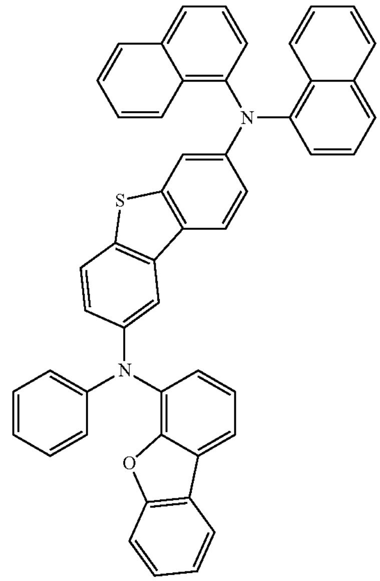
10-91
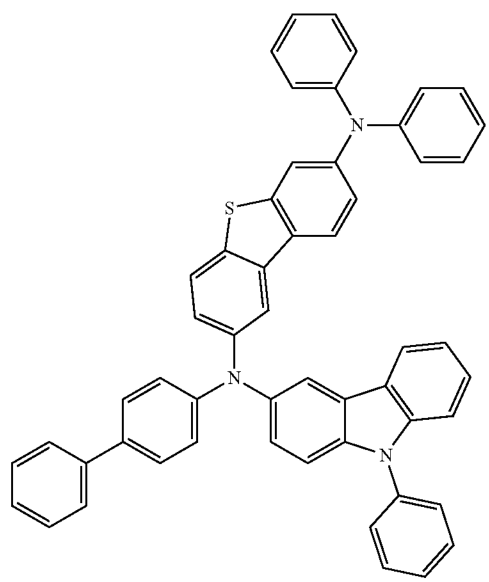

-continued
10-92
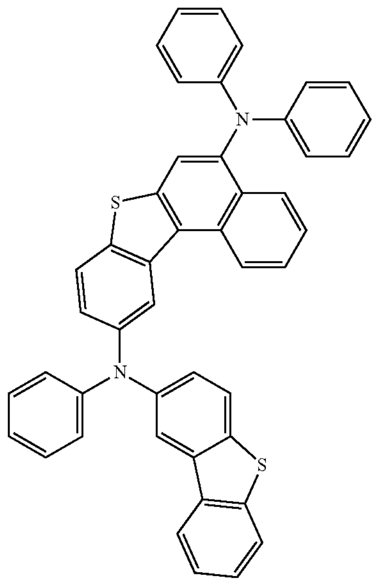
10-93
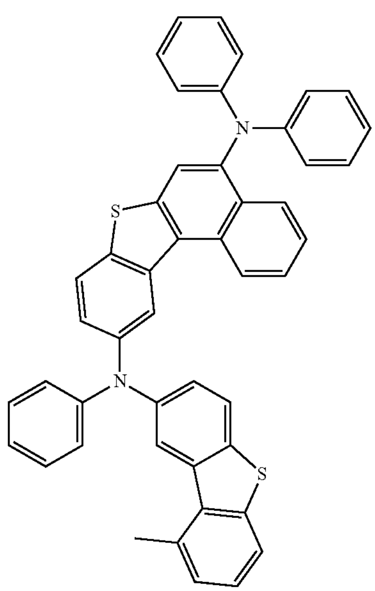
-continued
10-94
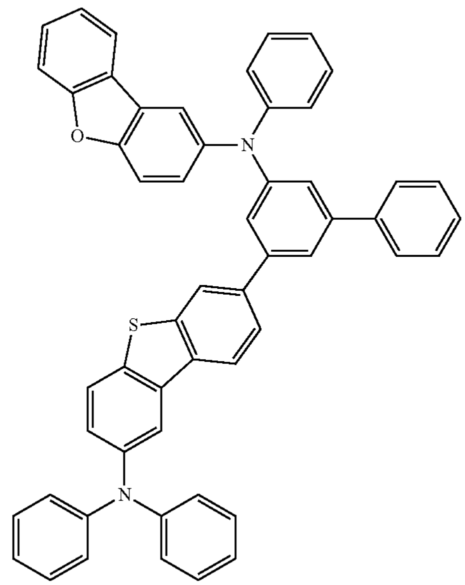
10-95
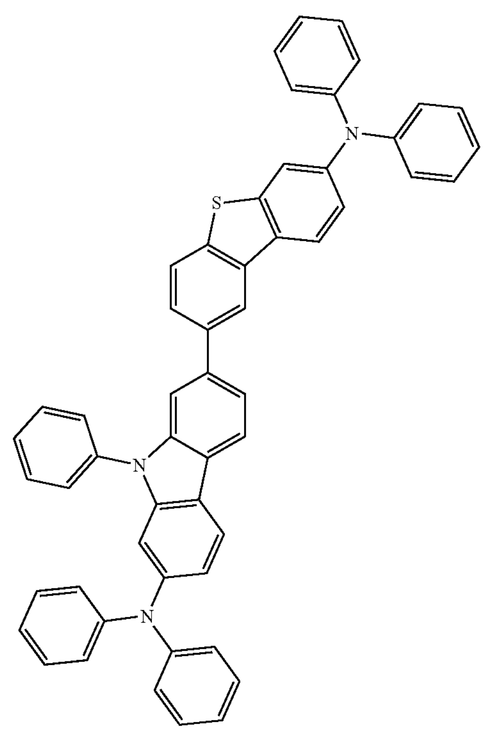

-continued
10-96
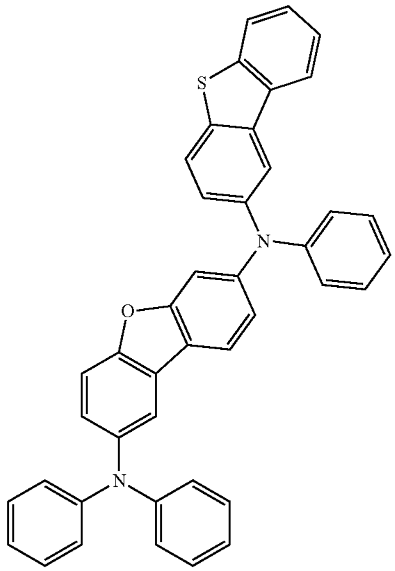
10-97
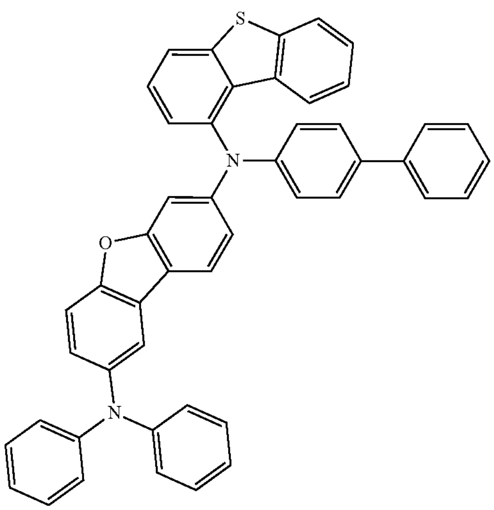
10-98
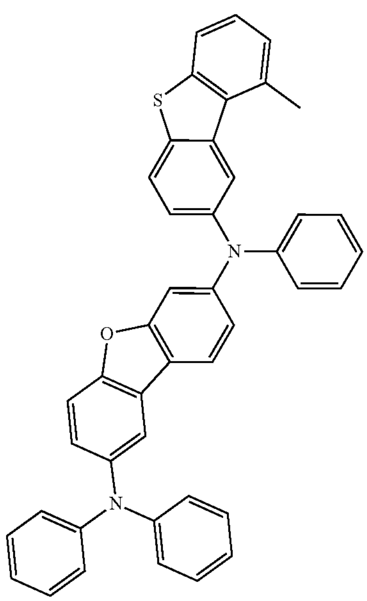
-continued
10-99
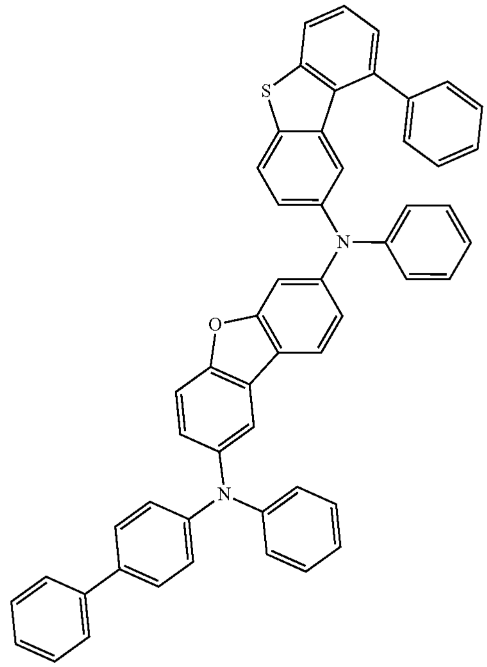
10-100
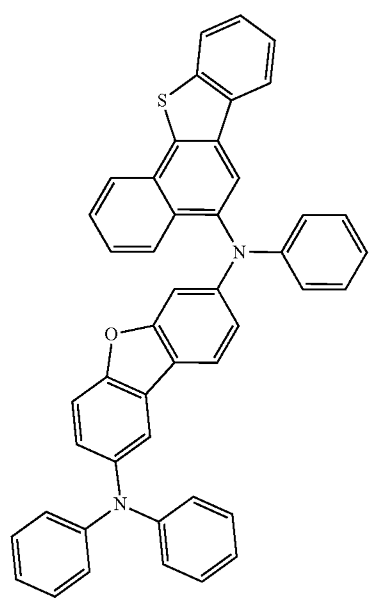

-continued
10-101
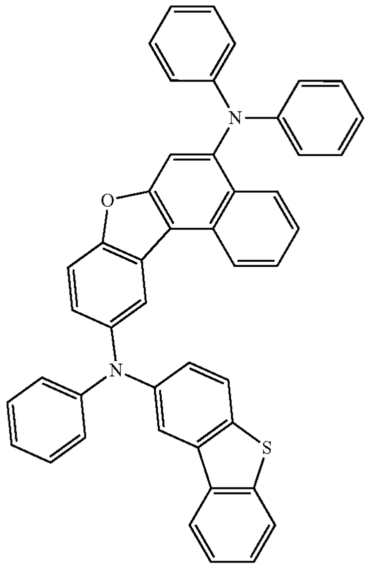
10-102
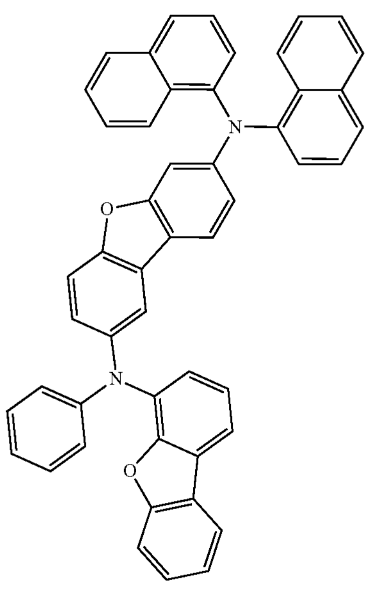
-continued
10-103
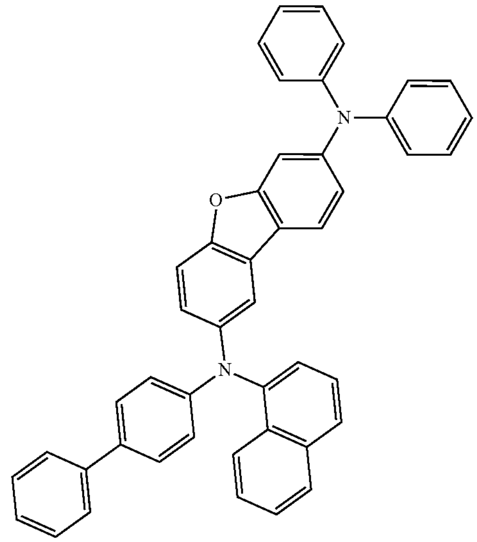
10-104
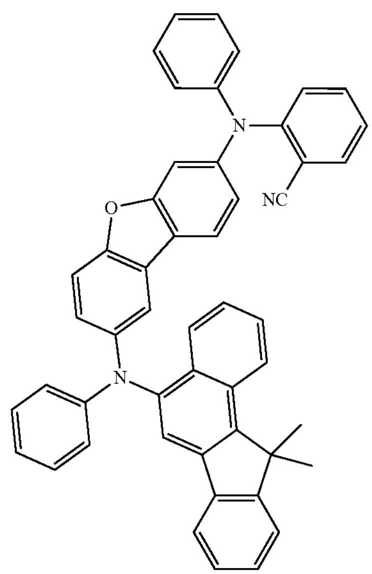

10-105
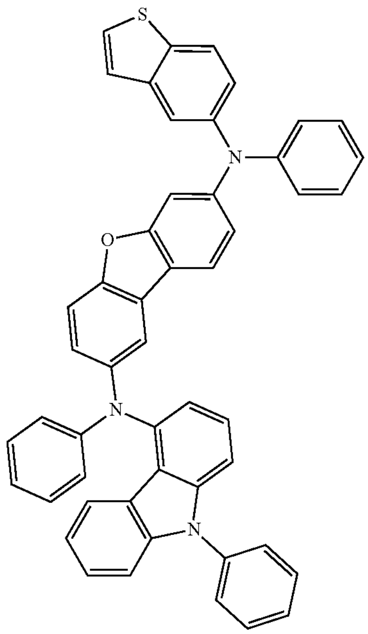
10-106
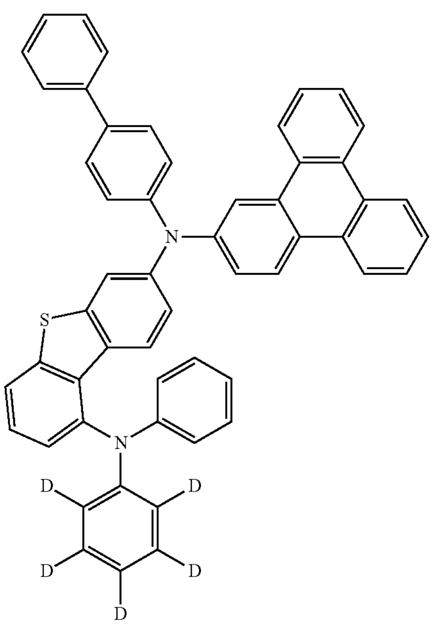
10-107
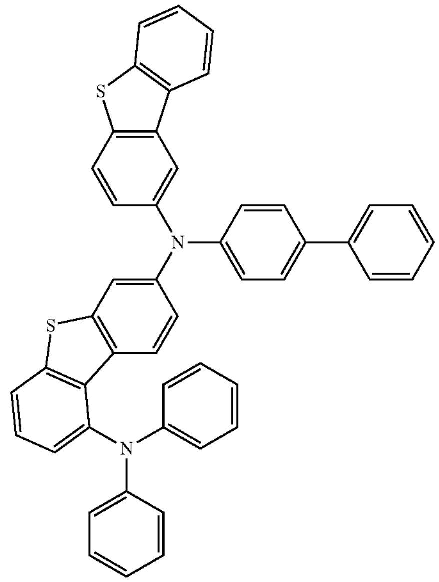
10-108
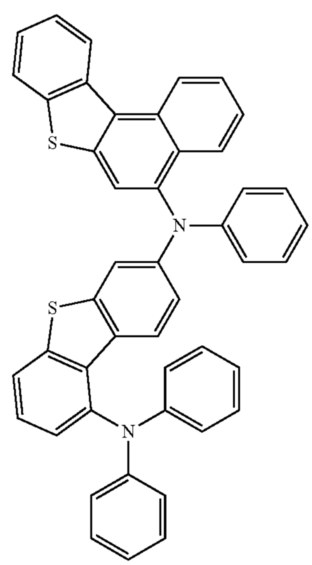

-continued
10-109
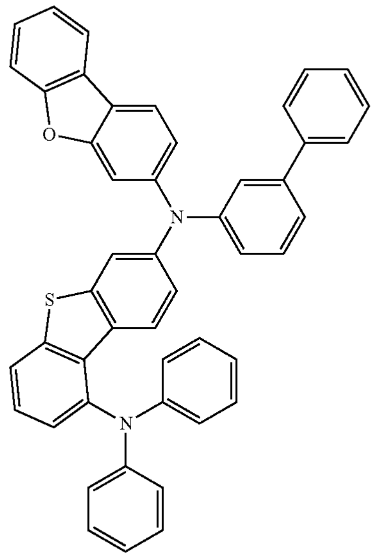
10-110
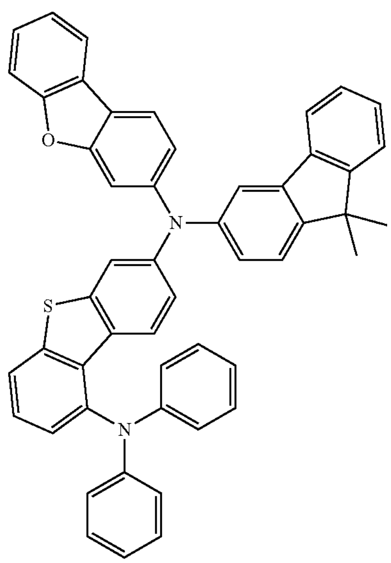
10-111
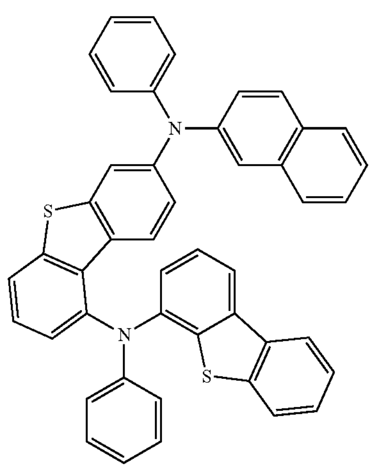
-continued
10-112
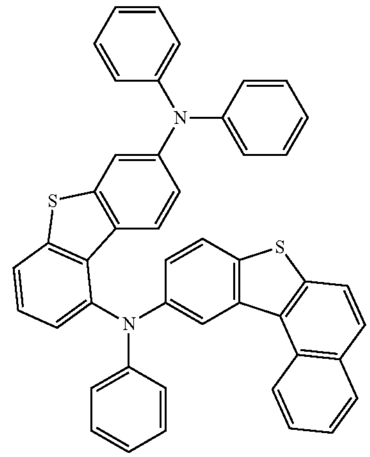
10-113
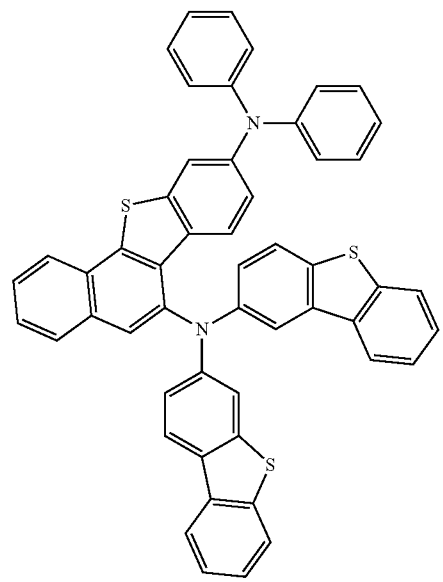
10-114
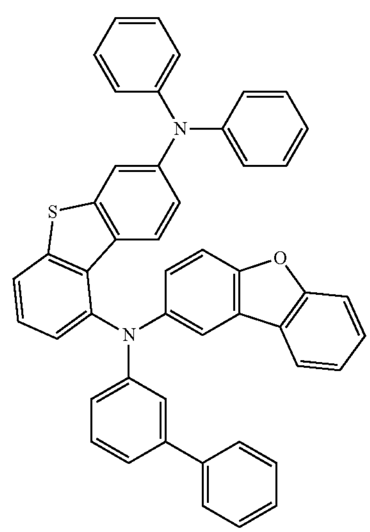

-continued
10-115
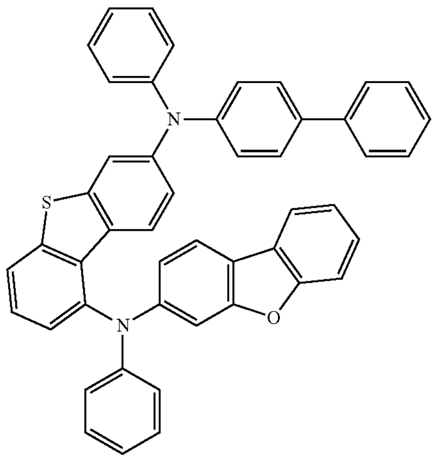
10-116
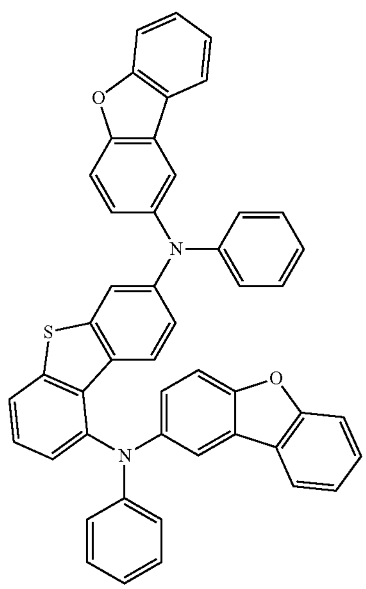
10-117
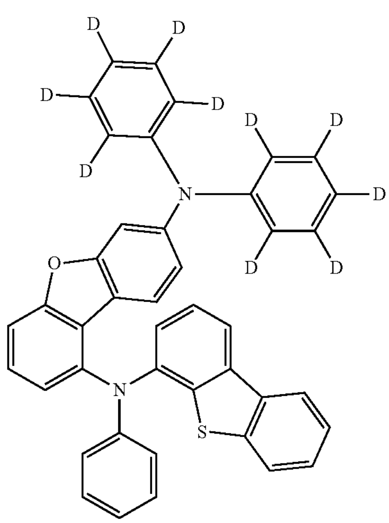
-continued
10-118
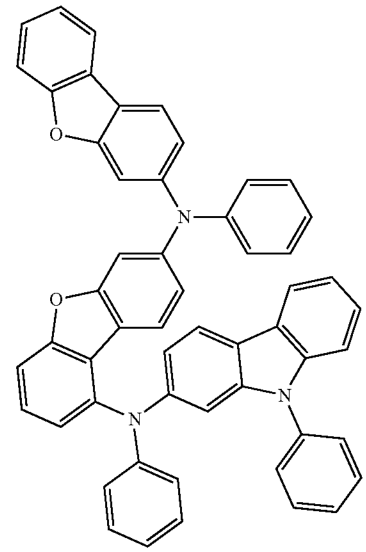
10-119
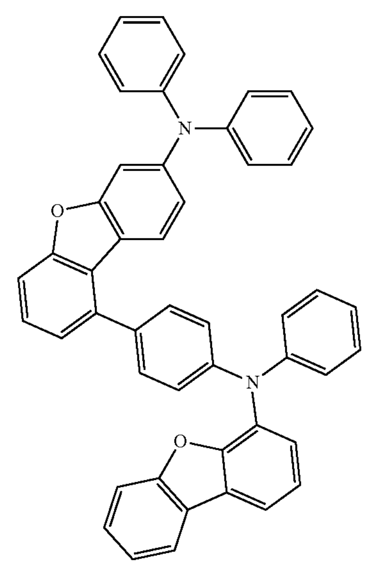

-continued
10-120
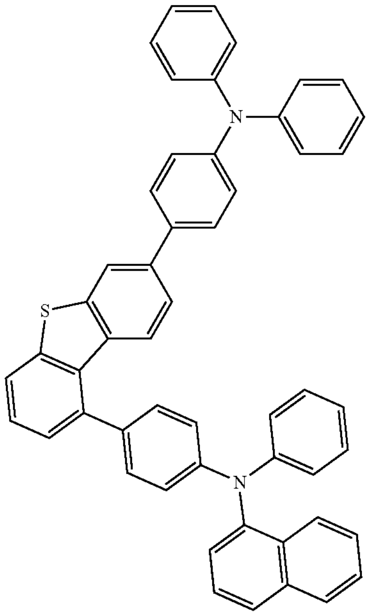
10-121
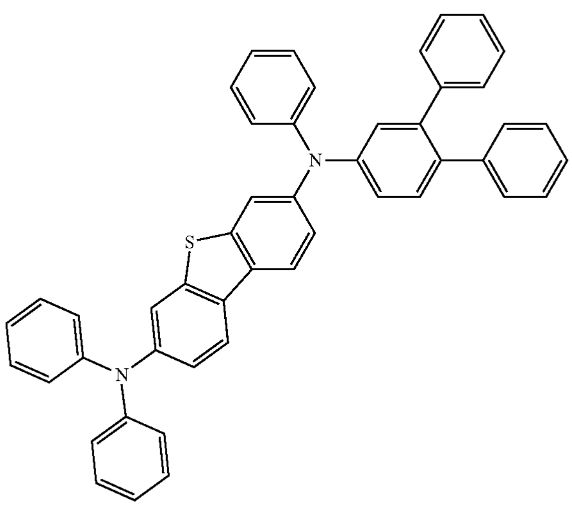
-continued
10-122
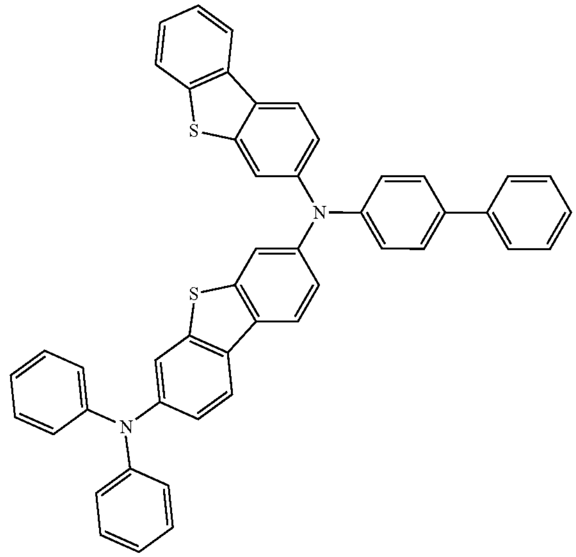
10-123
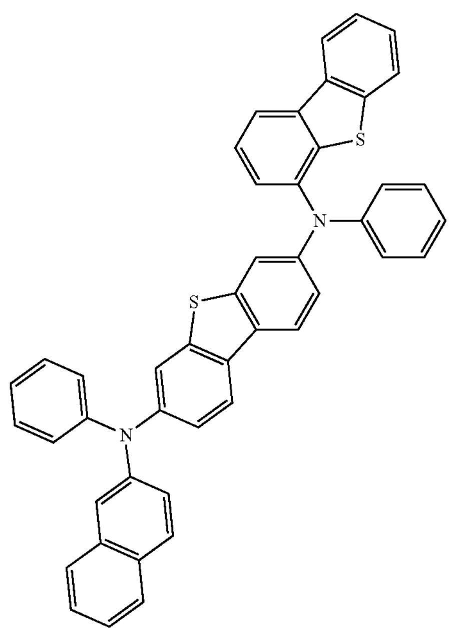

10-124
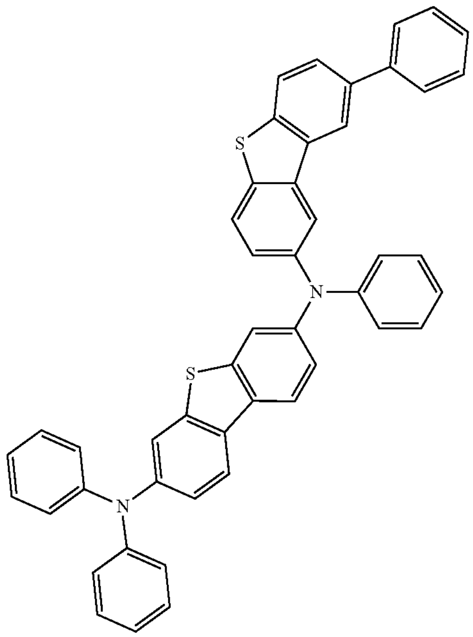
10-125
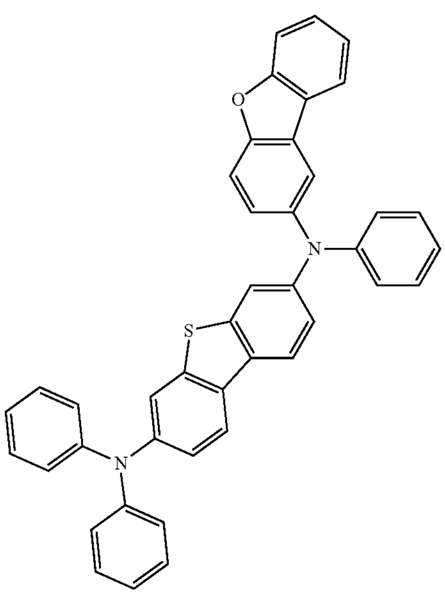
10-126
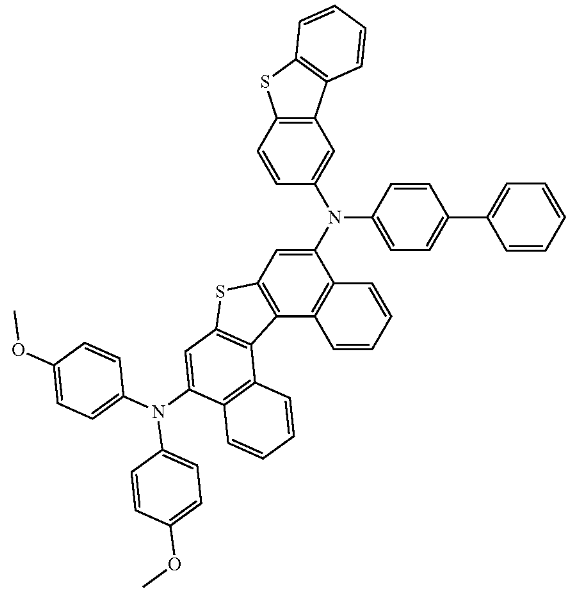
10-127
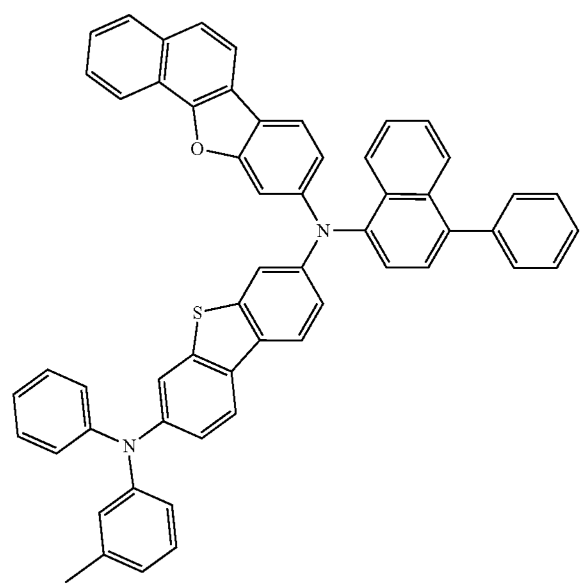

-continued
10-128
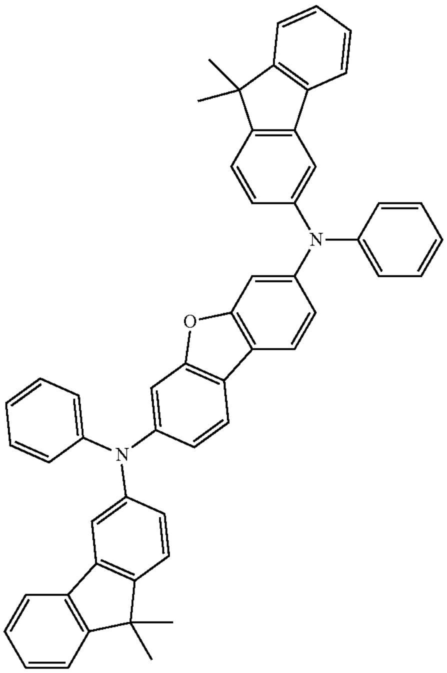
10-129
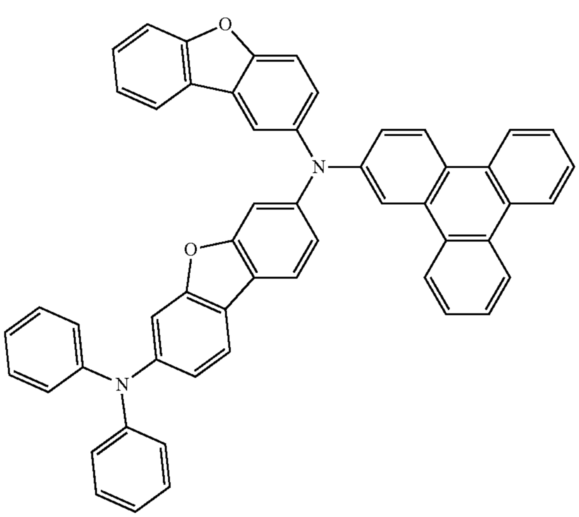
-continued
10-130
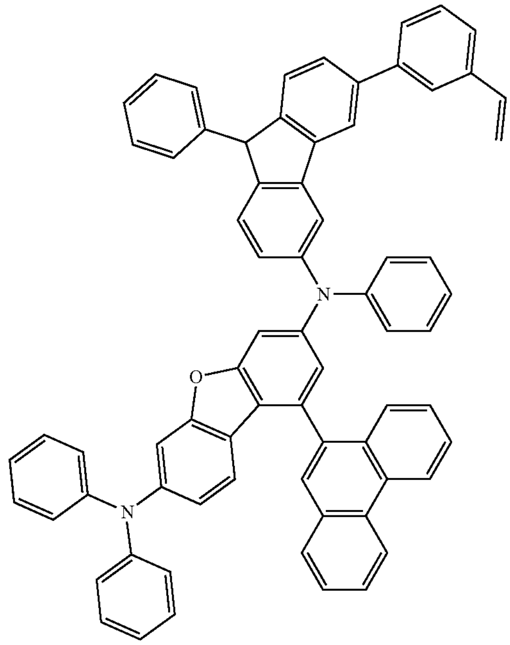
10-131
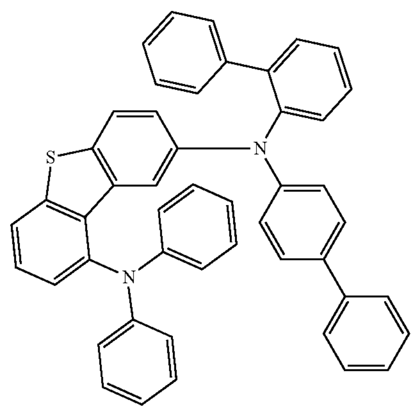
10-132
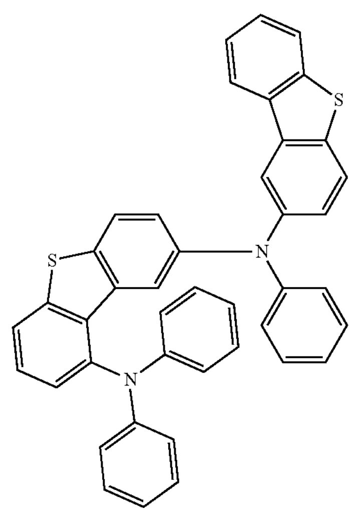

-continued
10-133
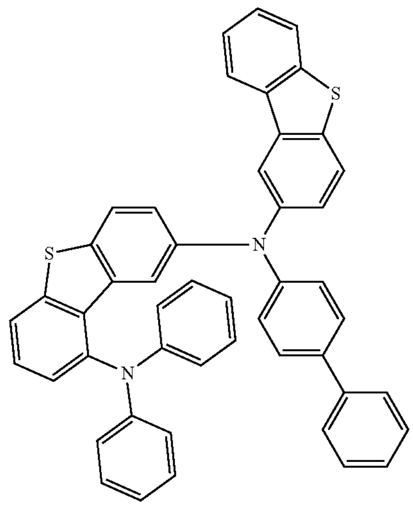
10-134
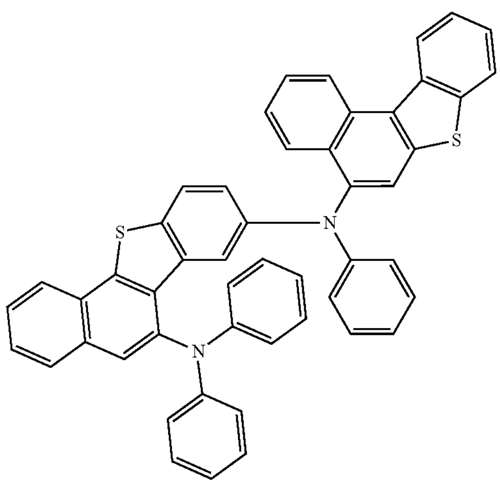
10-135
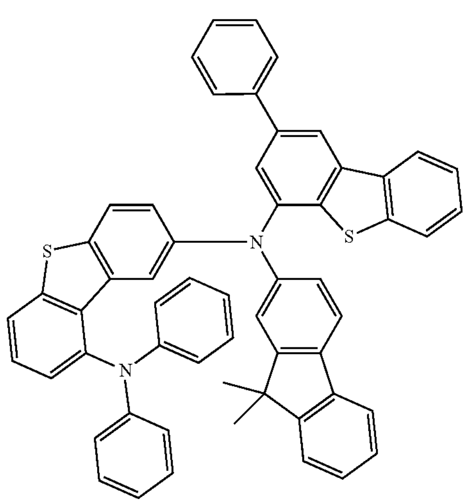
-continued
10-136
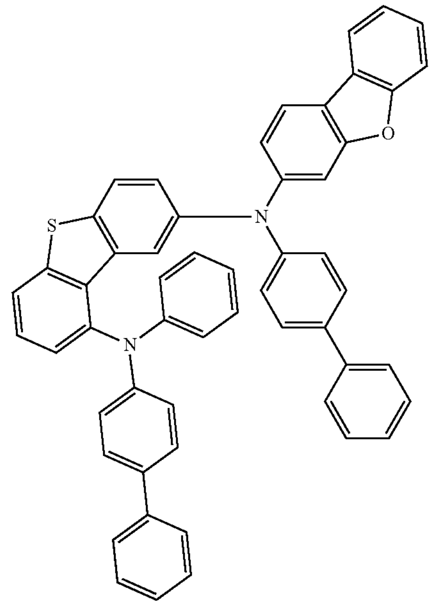
10-137
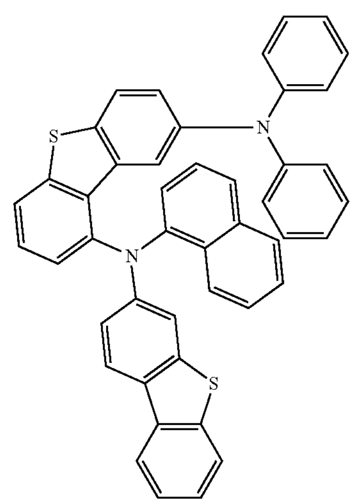
10-138
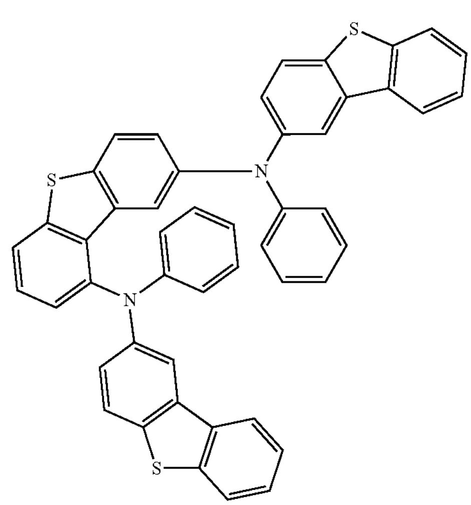

-continued
10-139
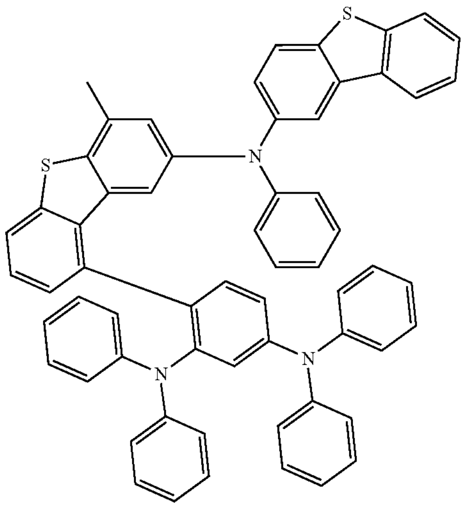
10-140
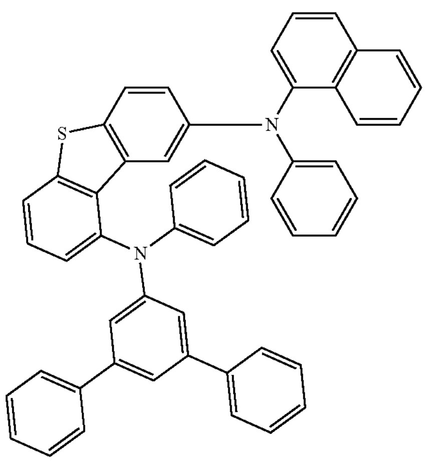
10-141
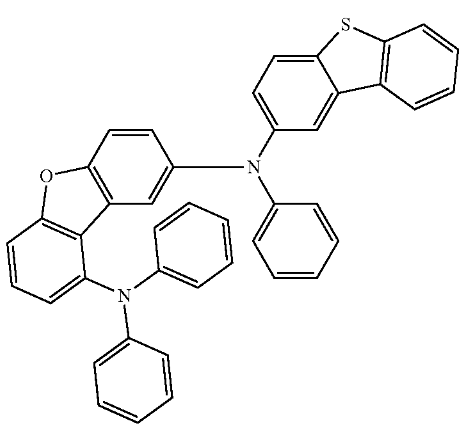
-continued
10-142
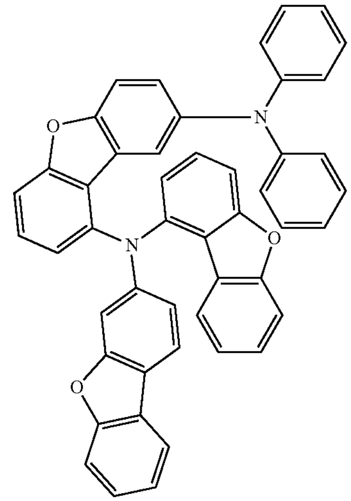
10-143
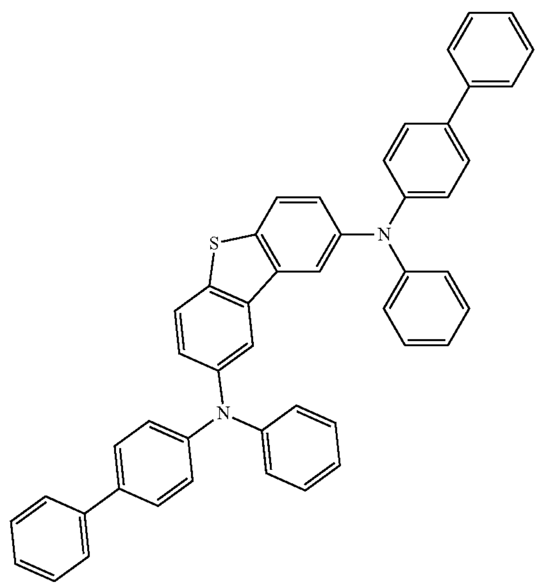
10-144
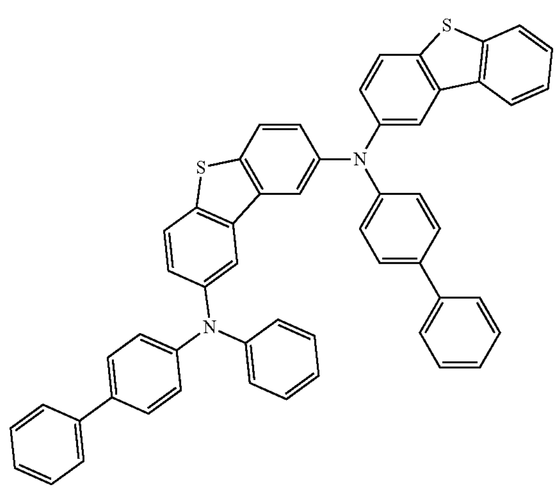

-continued
10-145
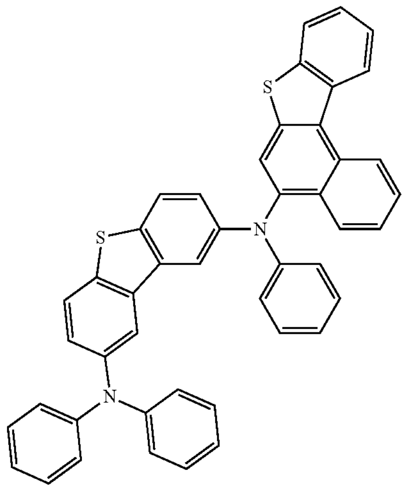
10-146
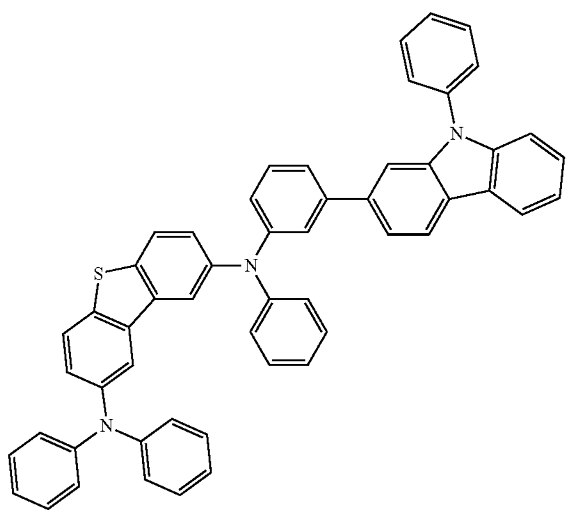
10-147
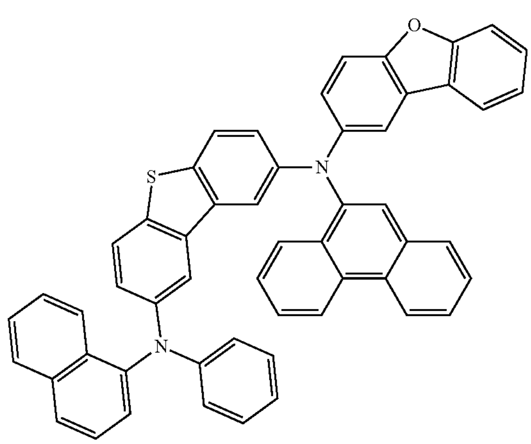
-continued
10-148
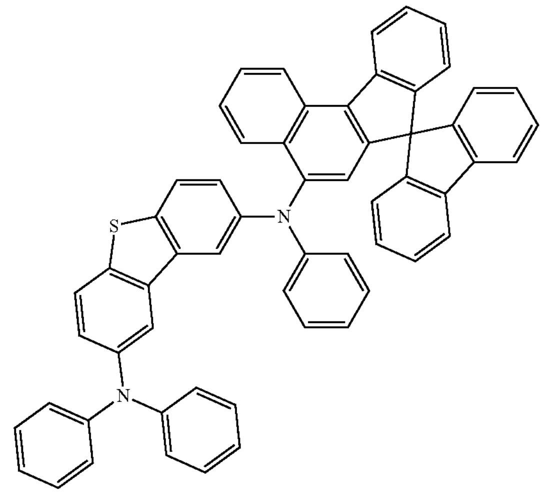
10-149
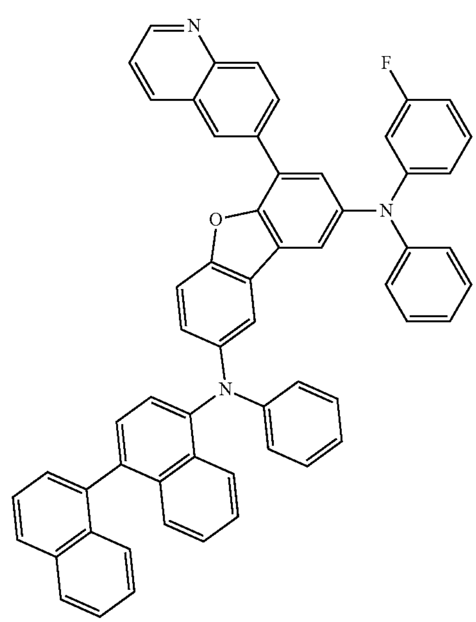

-continued
10-150
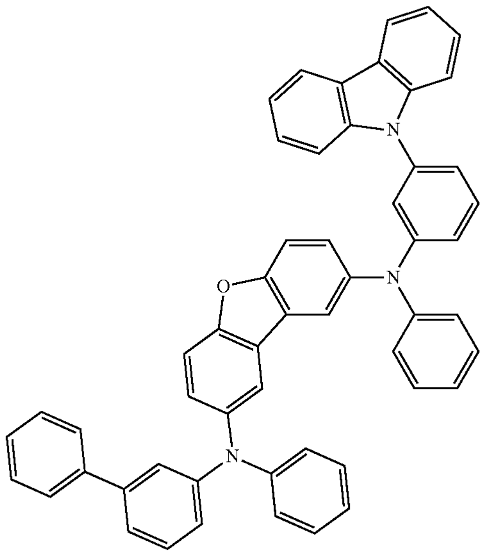
10-151
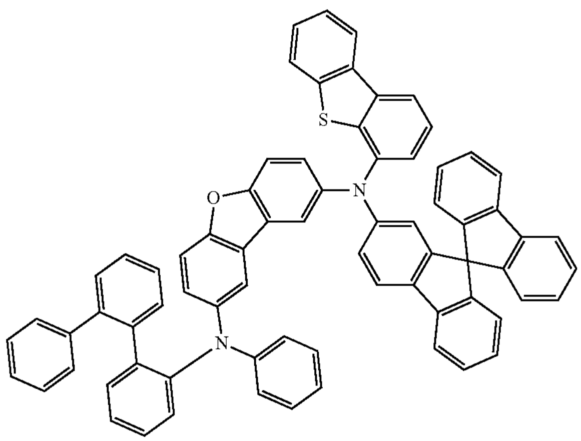
10-152
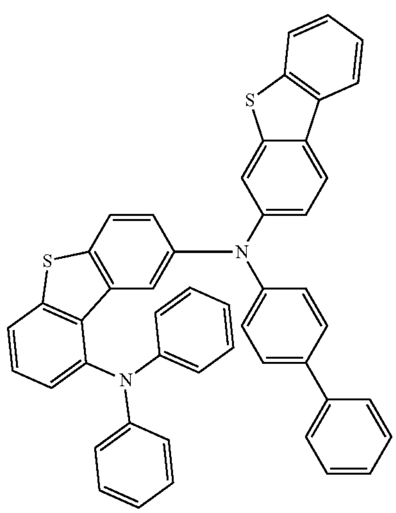
-continued
10-153
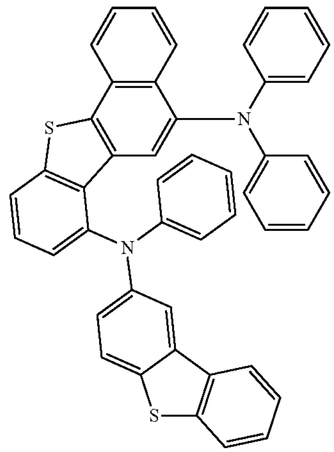
10-154
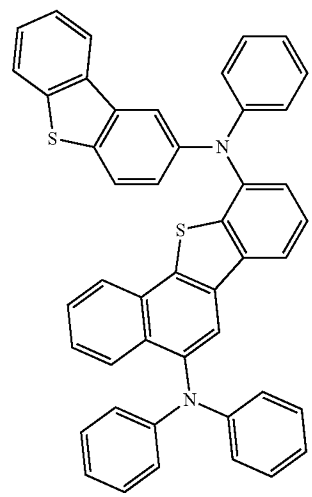
10-155
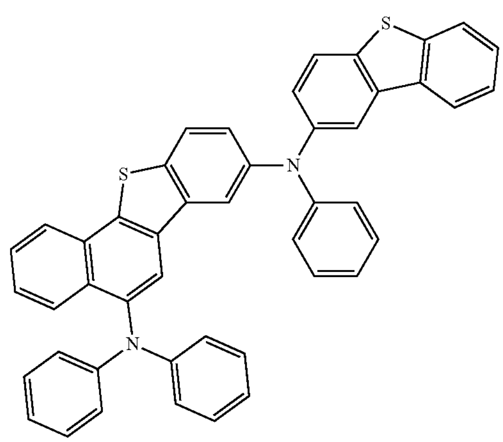

-continued
10-156
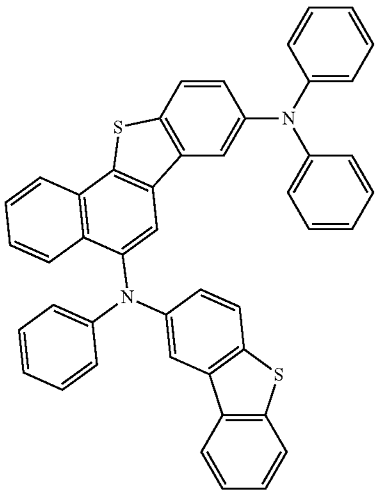
10-157
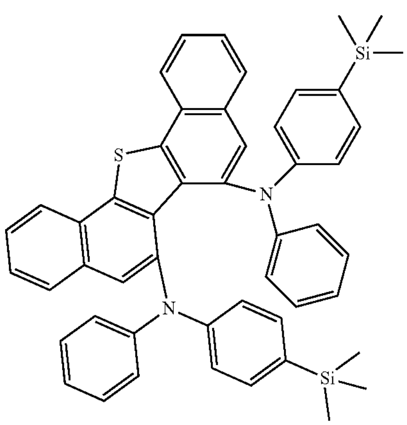
10-158
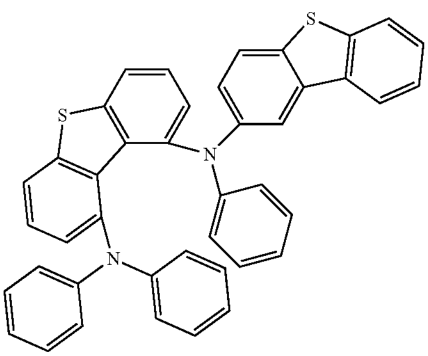
-continued
10-159
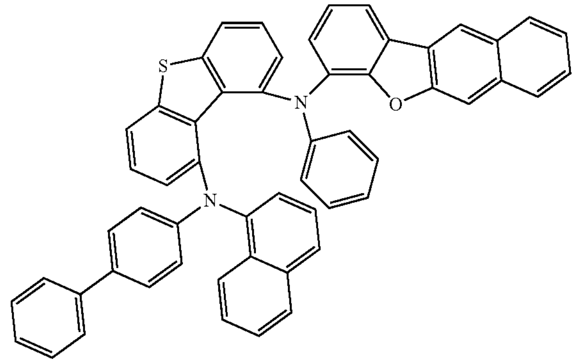
10-160
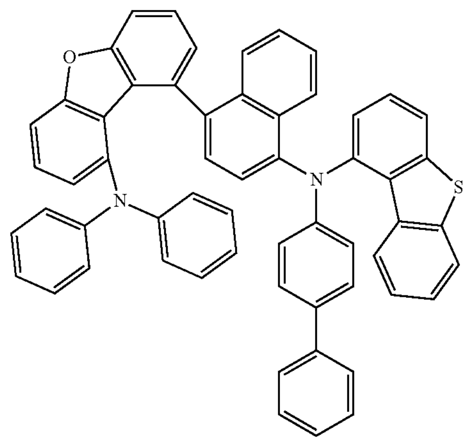
10-161
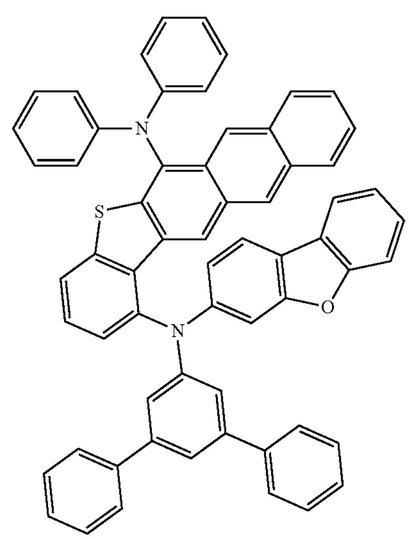

-continued
10-162
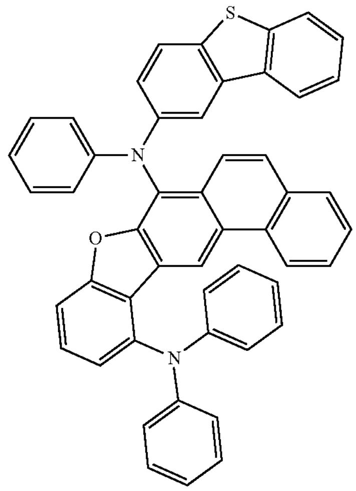
10-163
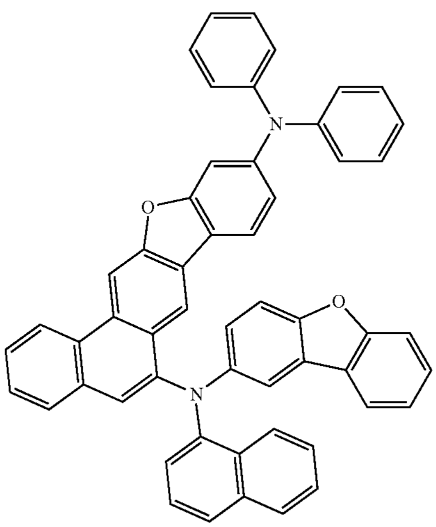
10-164
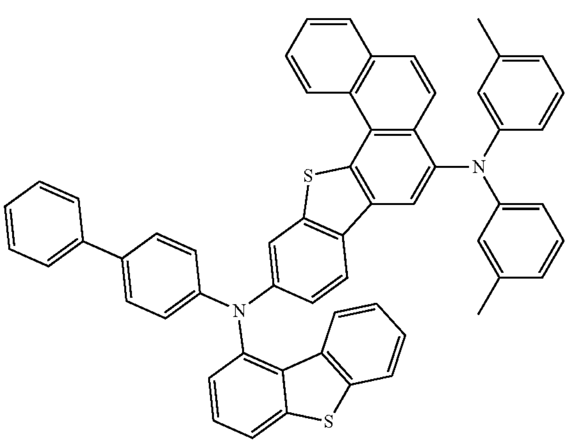
-continued
10-165
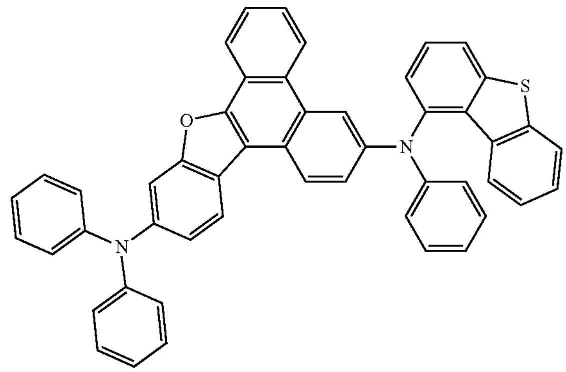
10-166
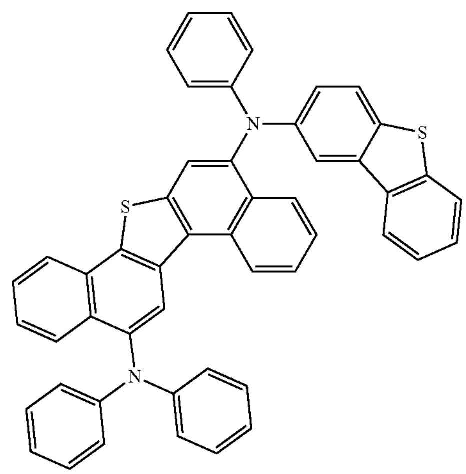
10-167
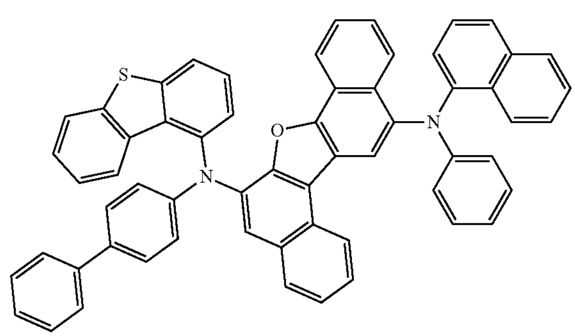

-continued
10-168
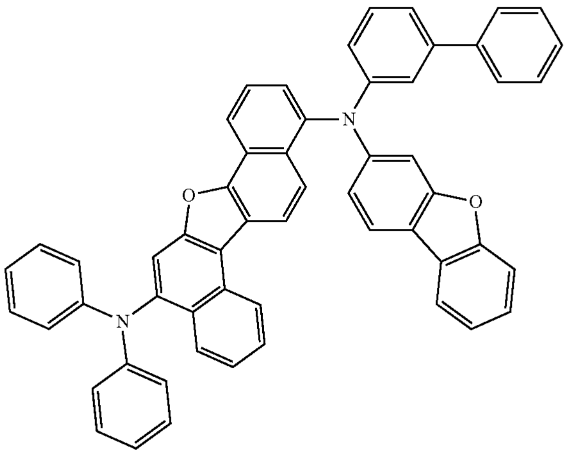
10-169
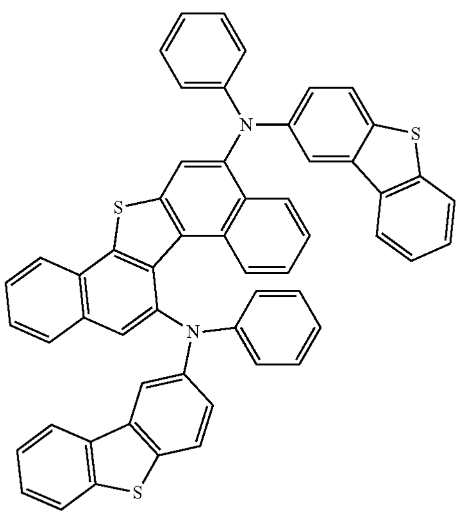
10-170
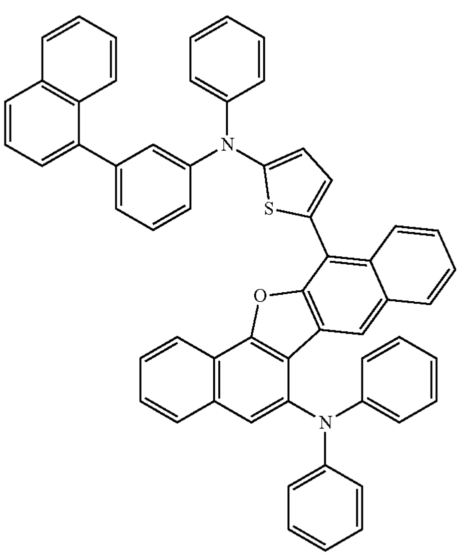
-continued
10-171
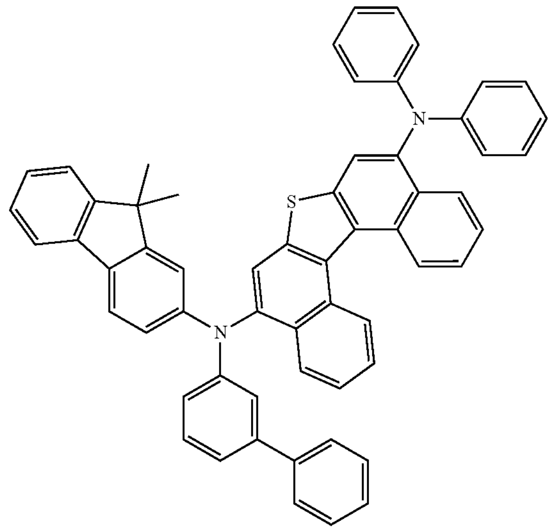
10-172
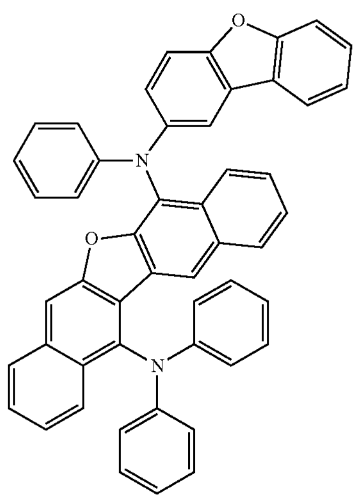
10-173
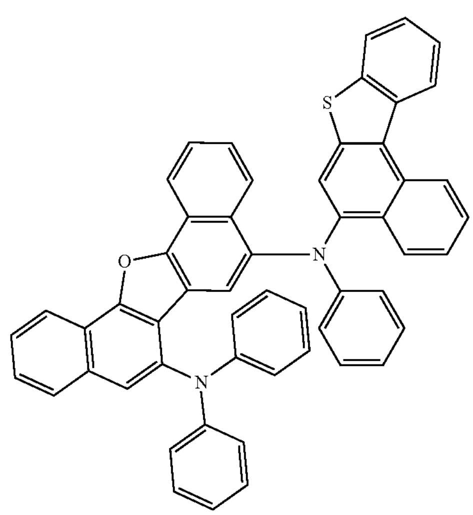

10-174
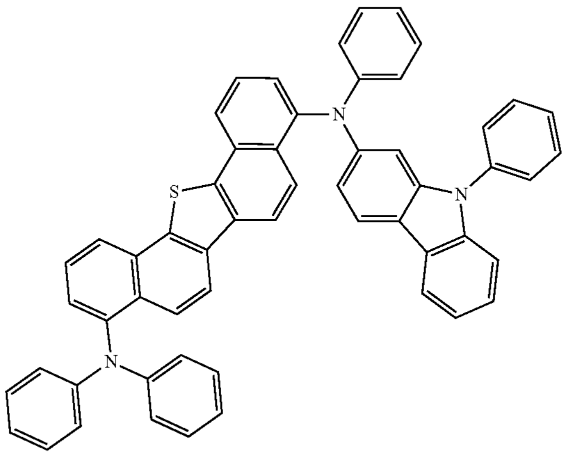
10-175
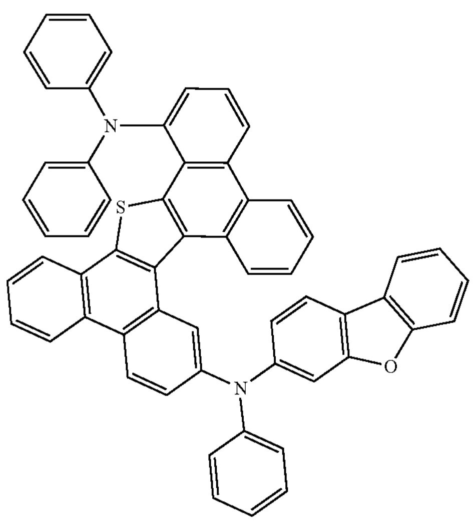
10-176
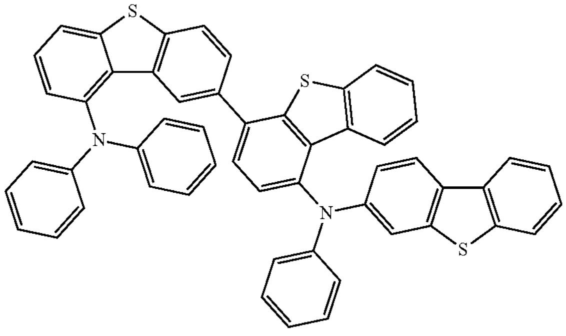
10-177
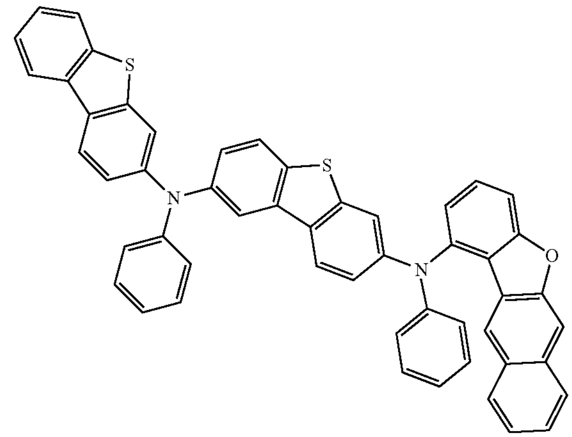
10-178
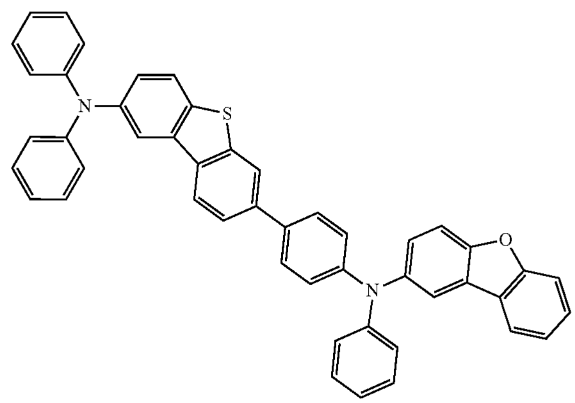
10-179
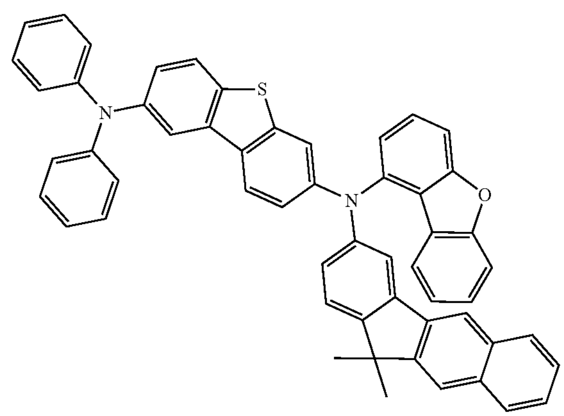
10-180
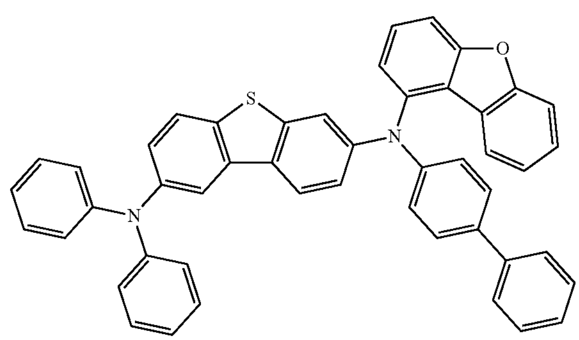

-continued
10-181
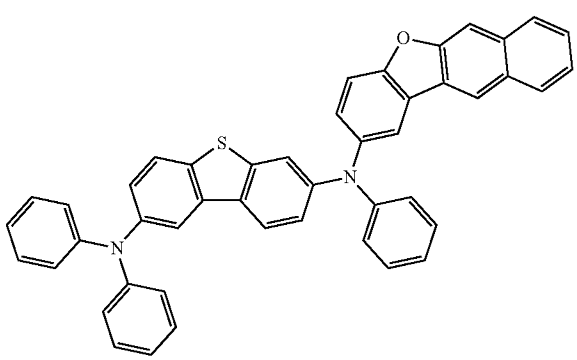
10-182
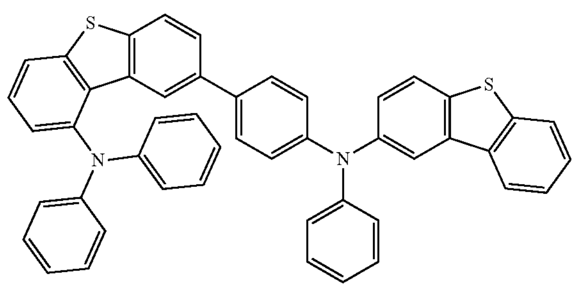
10-183
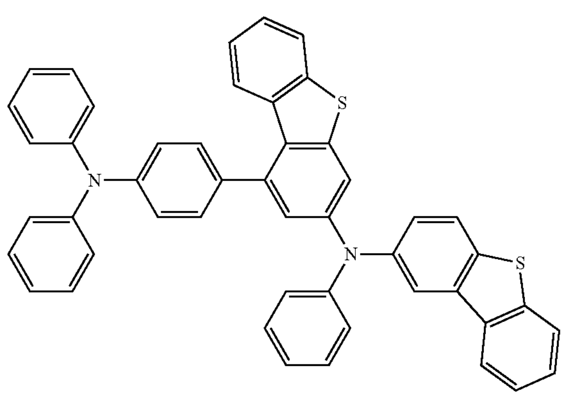
10-184
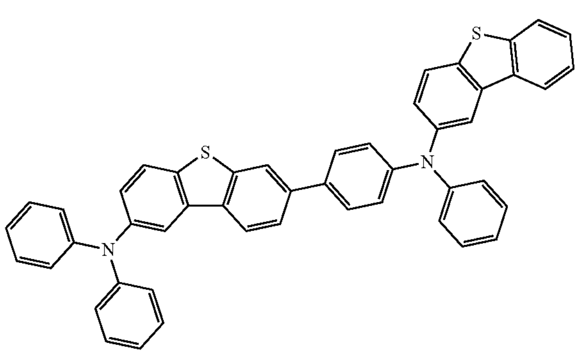
-continued
10-185
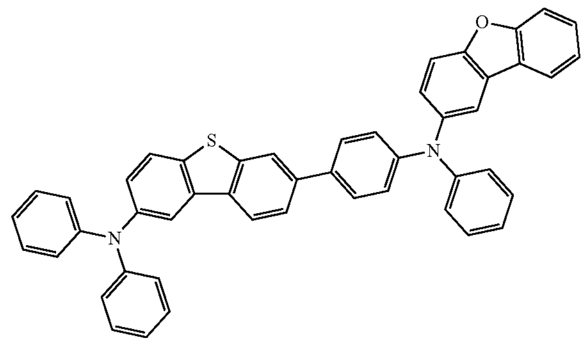
10-186
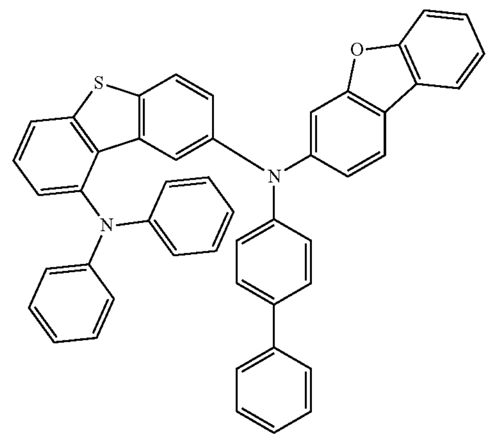
10-187
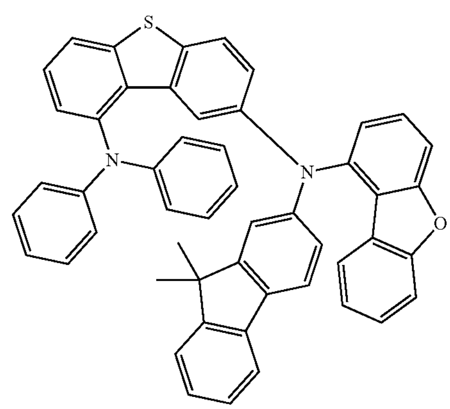
10-188
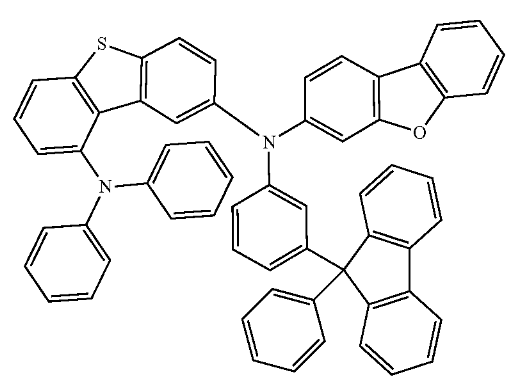

-continued
10-189
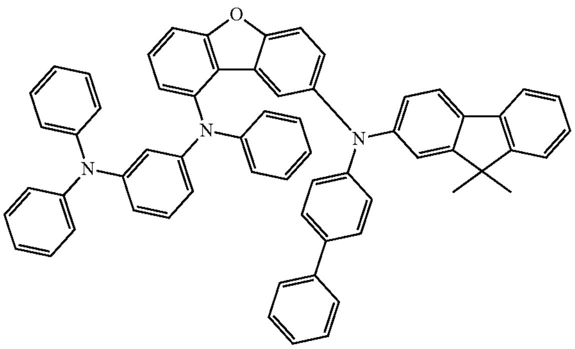
The fourth compound may include a radical of a compound represented by Formula B, be represented by Formula C or Formula D, and be one or more of the following Formula 11-1 to Formula 12-71.
11-1
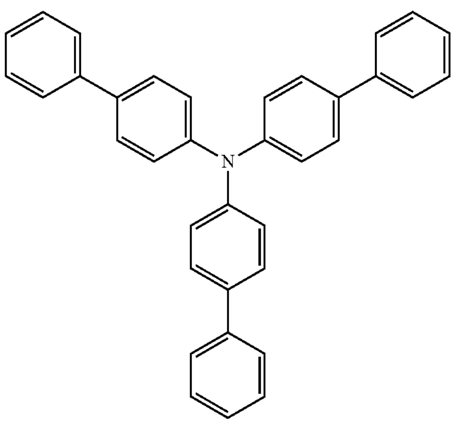
11-2
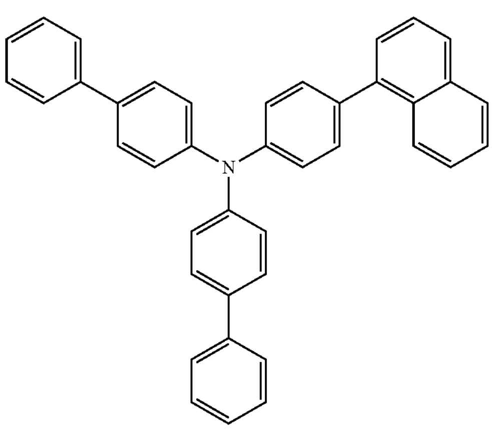
-continued
11-3
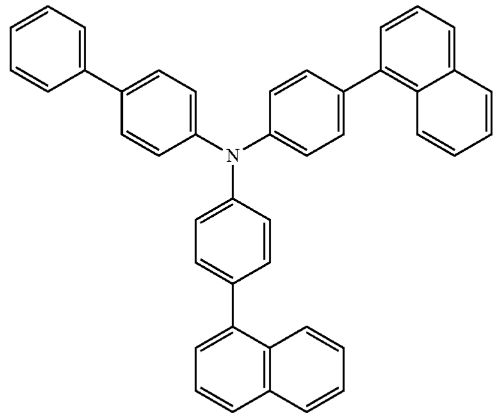
11-4
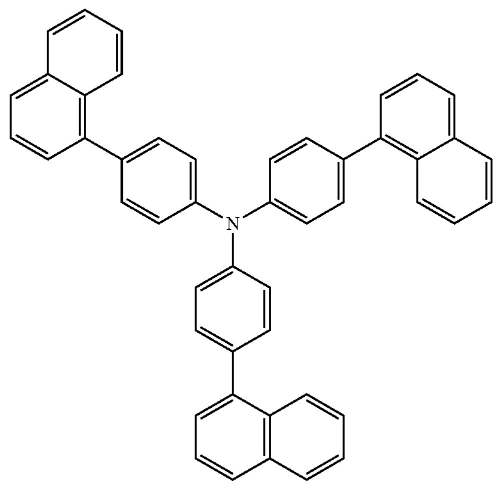
11-5
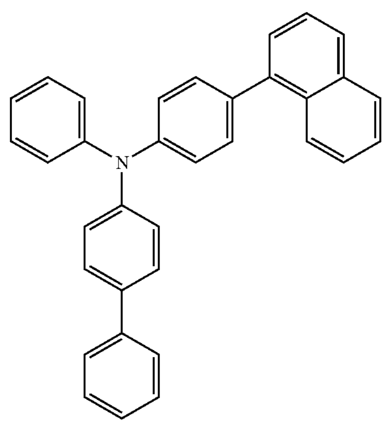
11-6
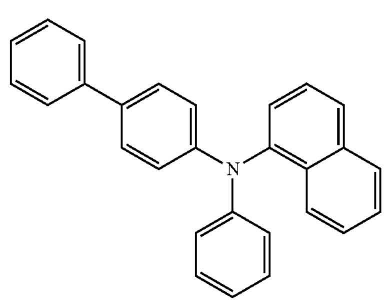

-continued
11-7
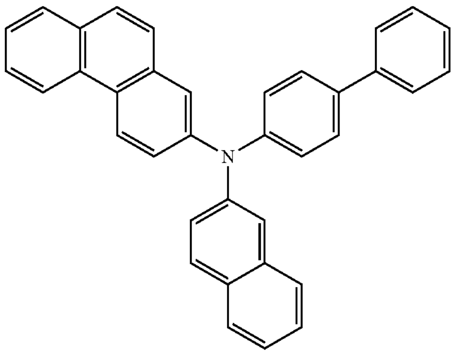
11-8
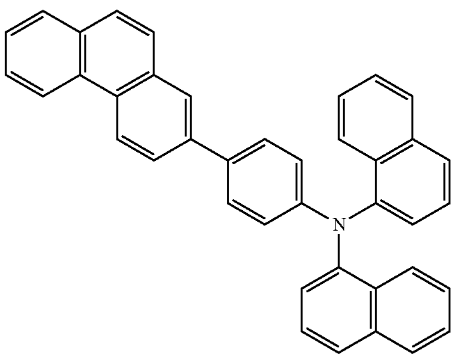
11-9
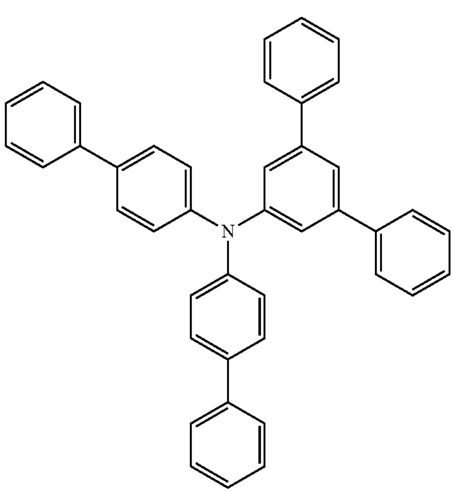
-continued
11-10
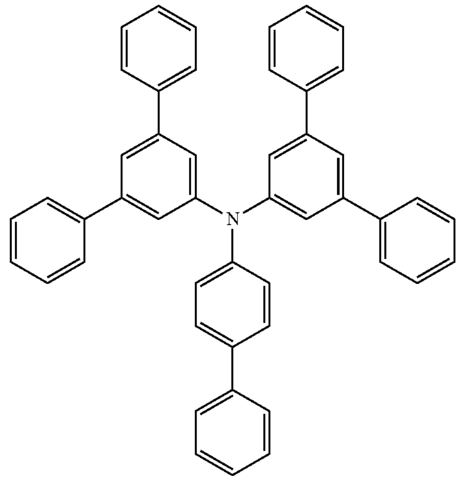
11-11
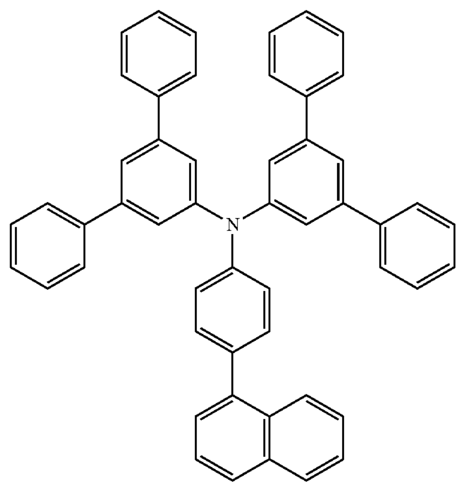
11-12
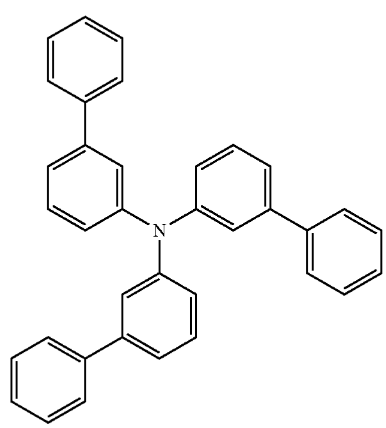

-continued
11-13
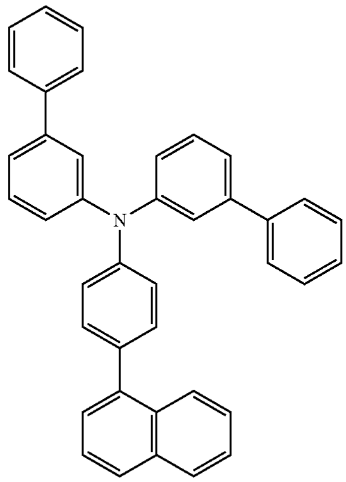
11-14
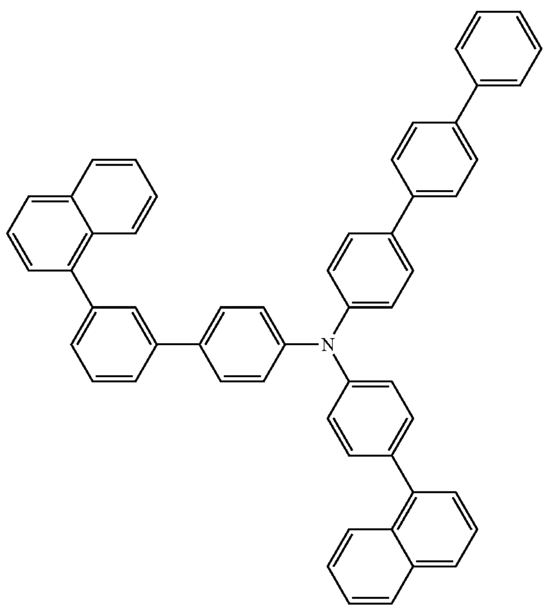
11-15
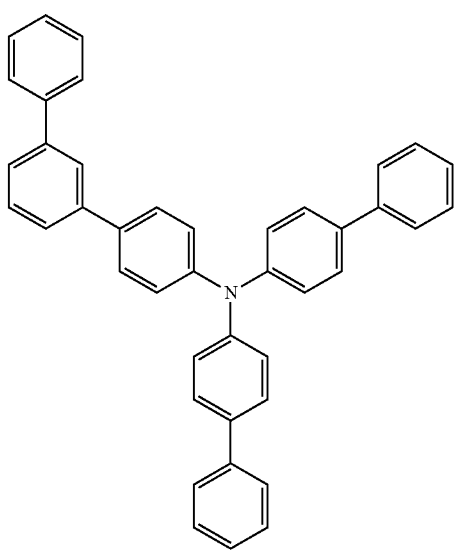
-continued
11-16
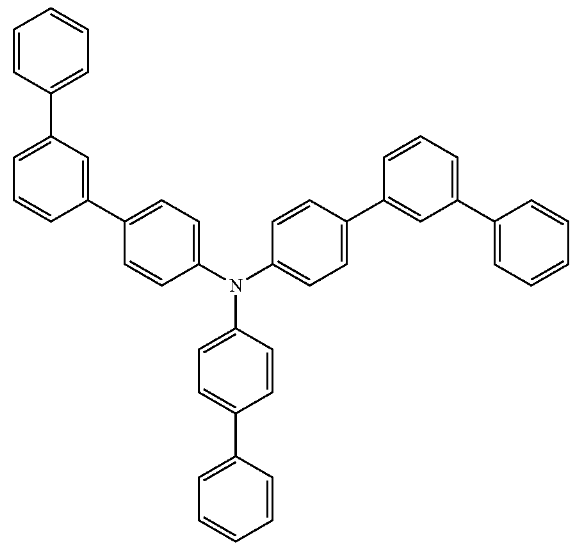
11-17
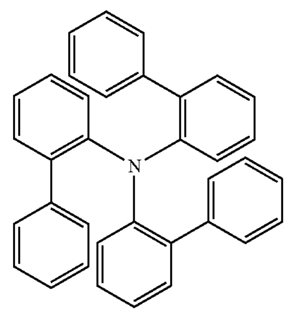
11-18
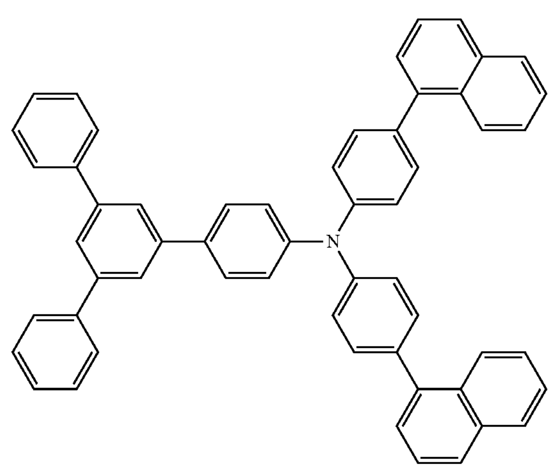

-continued
11-19
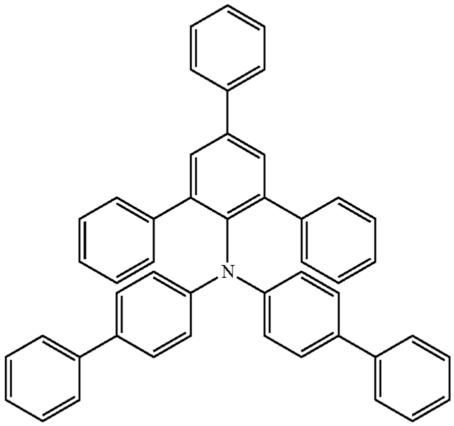
11-20
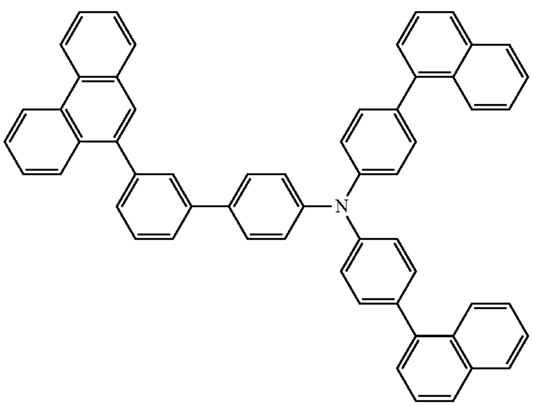
11-21
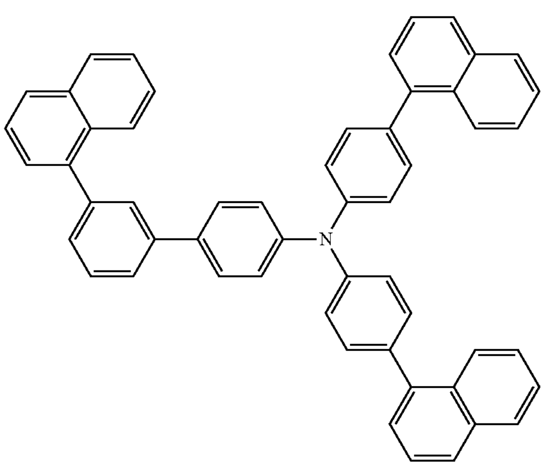
-continued
11-22
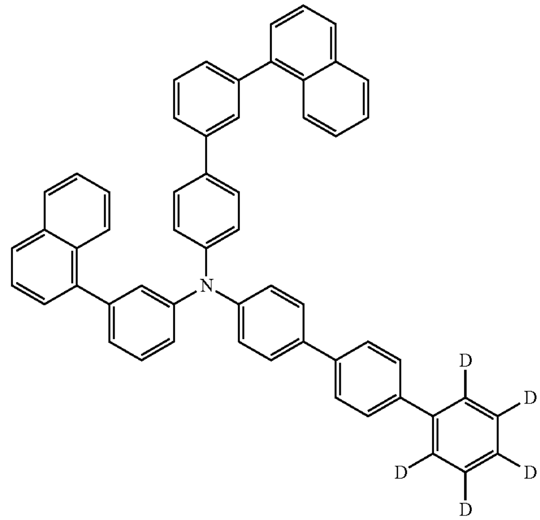
11-23
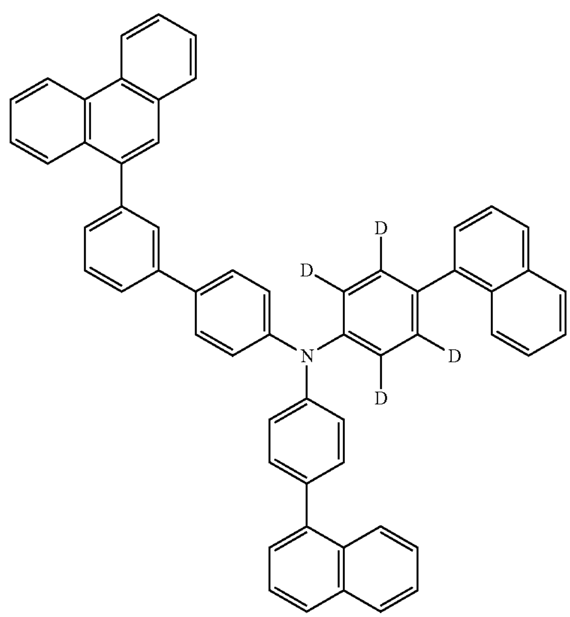

-continued
12-1
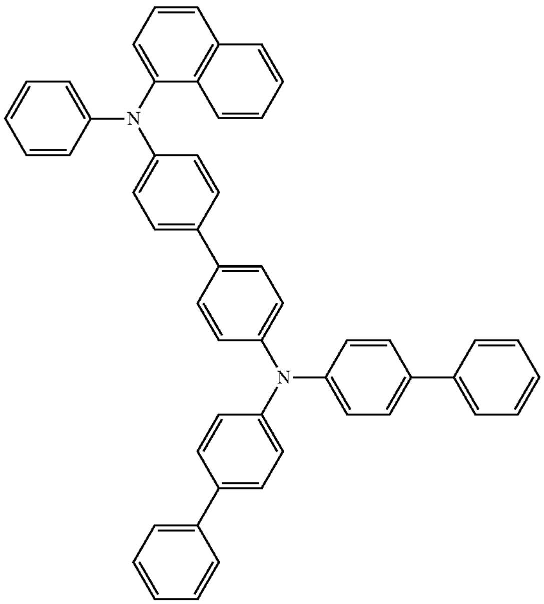
12-2
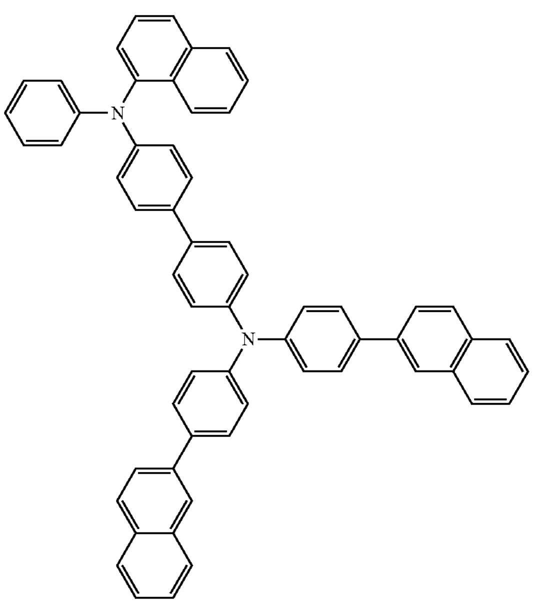
-continued
12-3
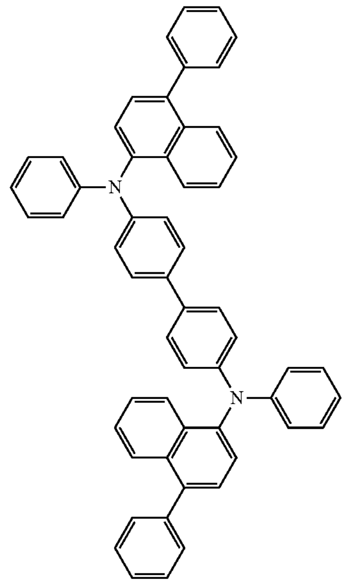
12-4
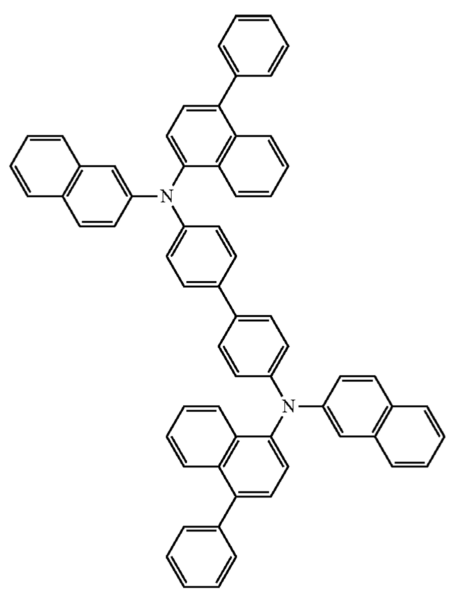

-continued
12-5
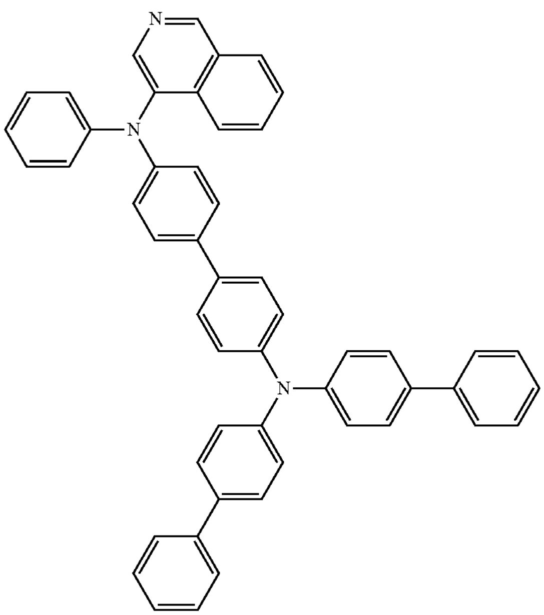
12-6
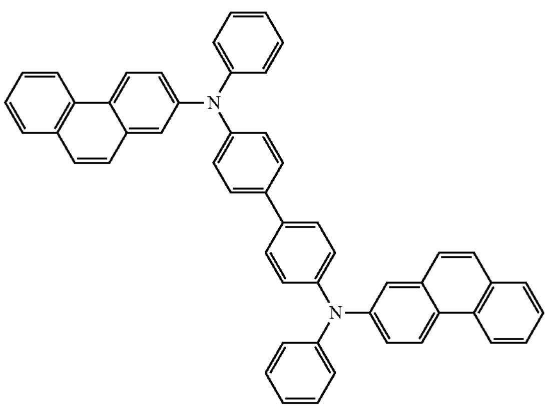
12-7
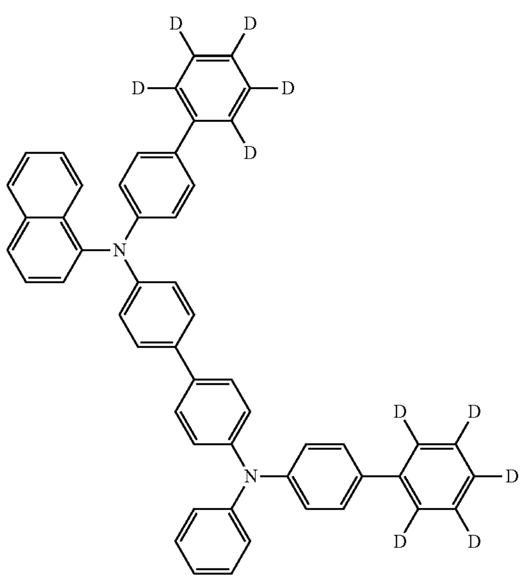
-continued
12-8
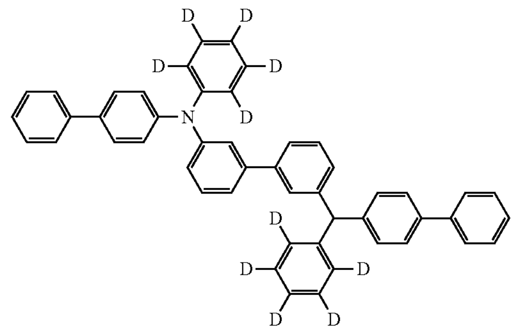
12-9
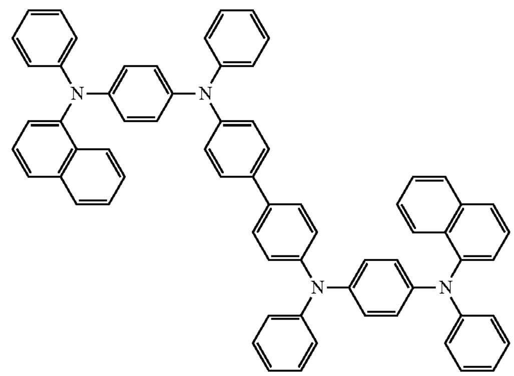
12-10
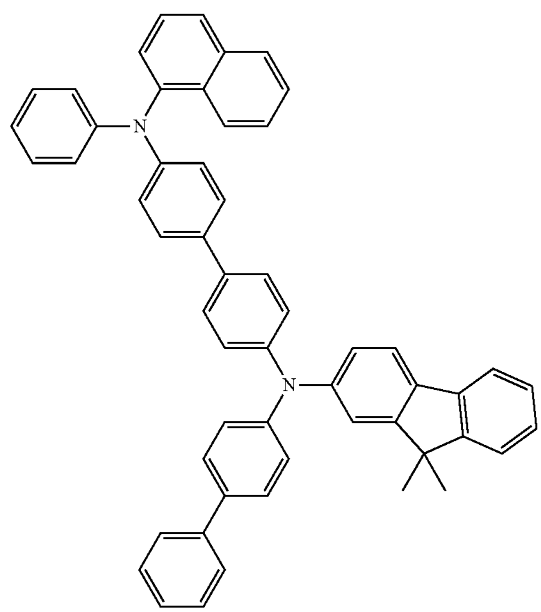

-continued
12-11
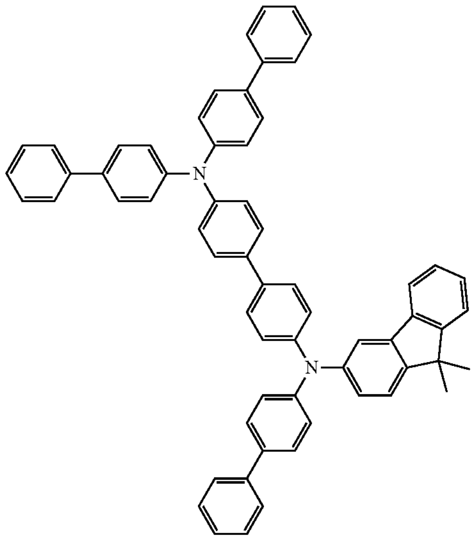
12-12
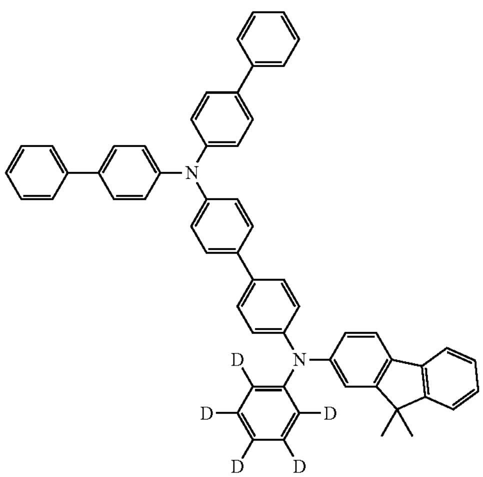
12-13
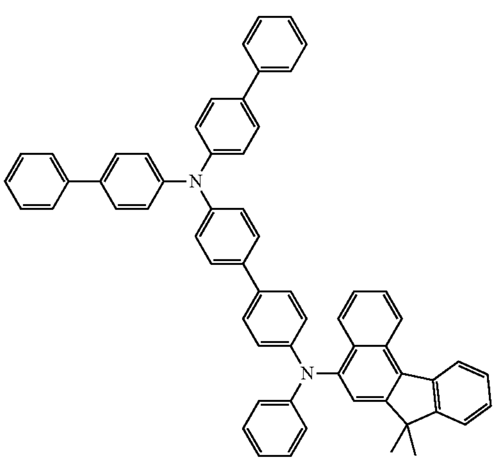
-continued
12-14
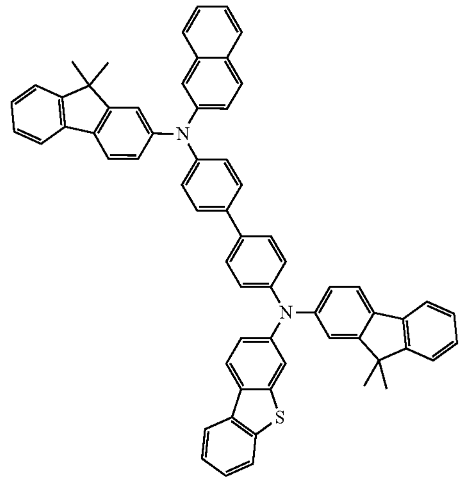
12-15
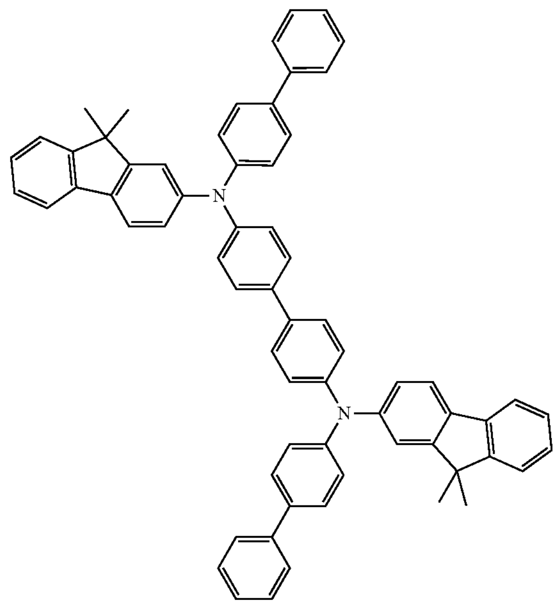
12-16
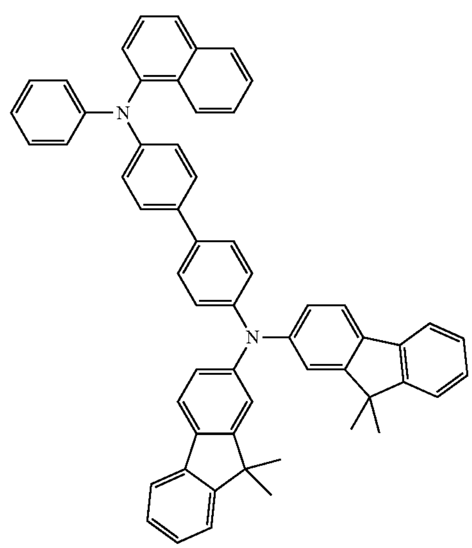

-continued
12-17
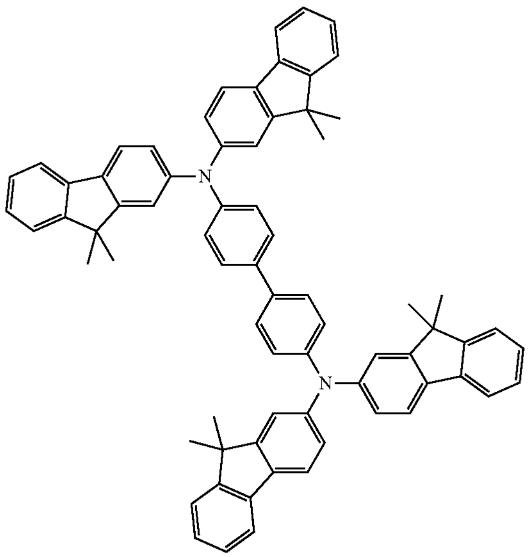
12-18
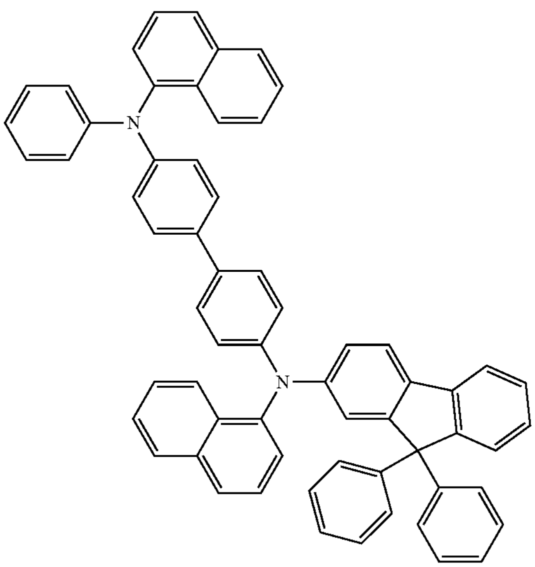
12-19
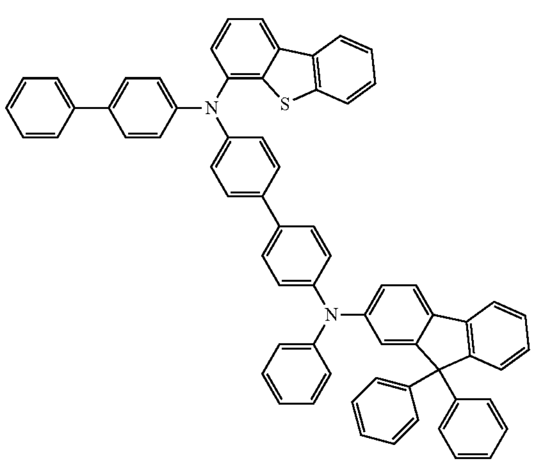
-continued
12-20
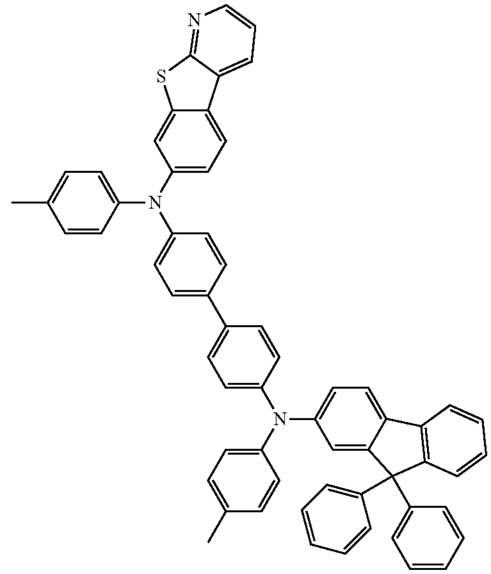
12-21
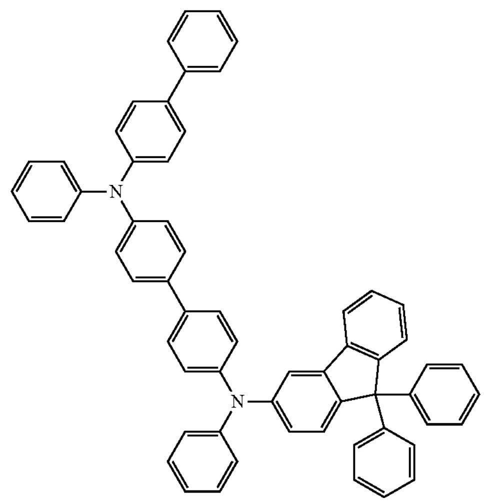
12-22
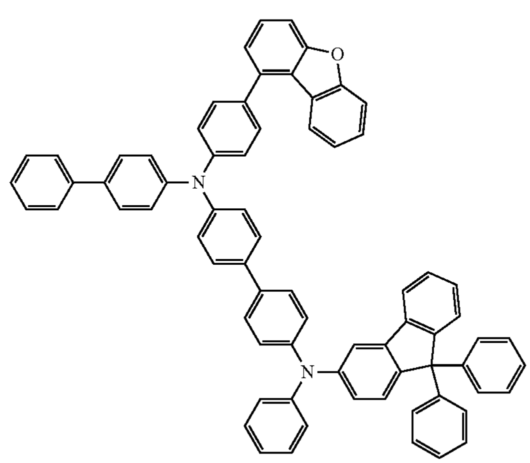

-continued
12-23
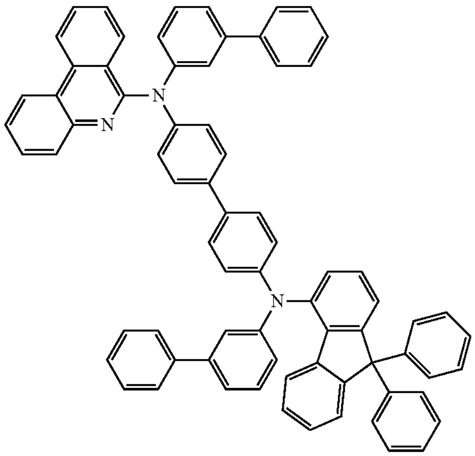
12-24
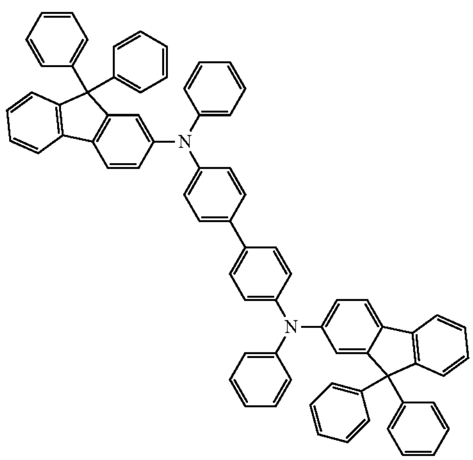
12-21
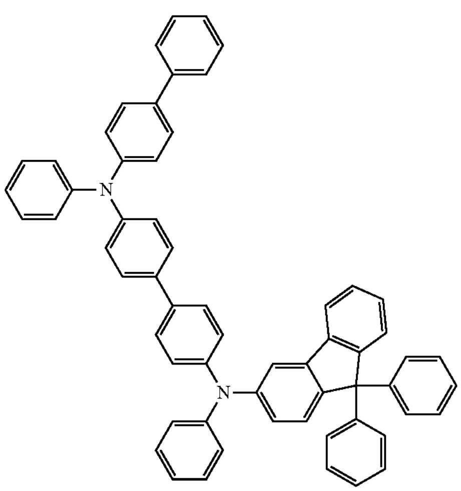
-continued
12-22
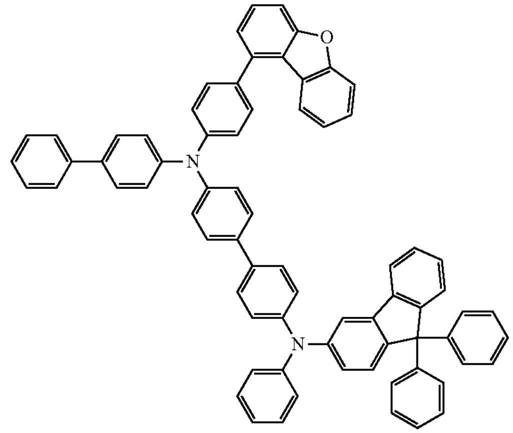
12-23
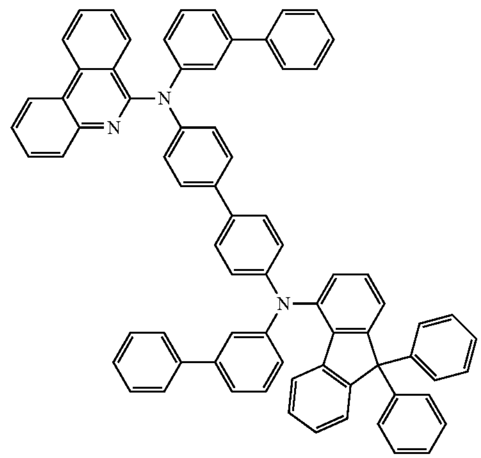
12-24
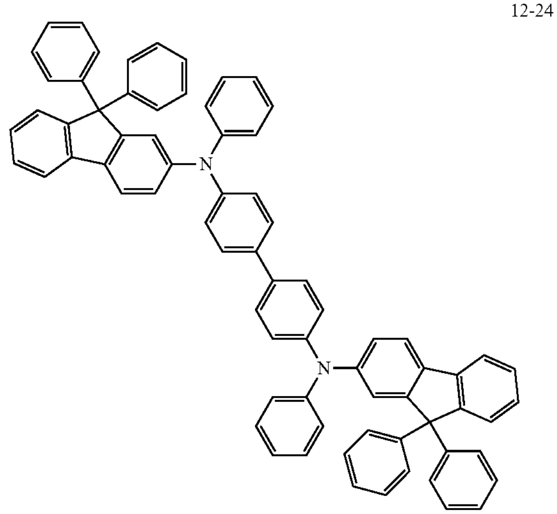

-continued
12-25
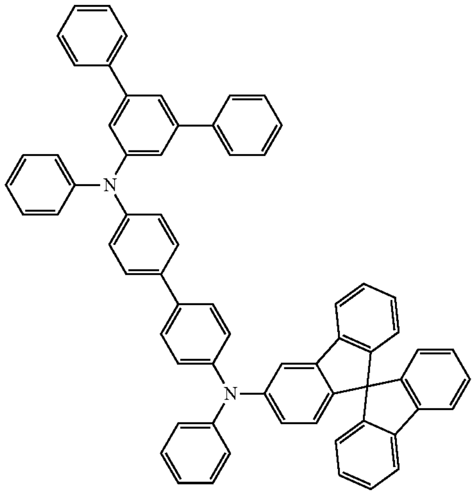
12-26
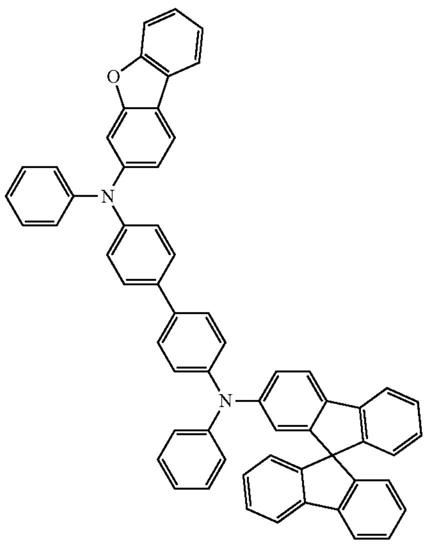
12-27
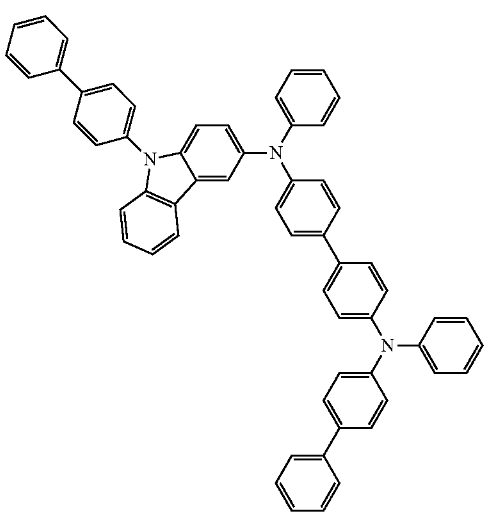
-continued
12-28
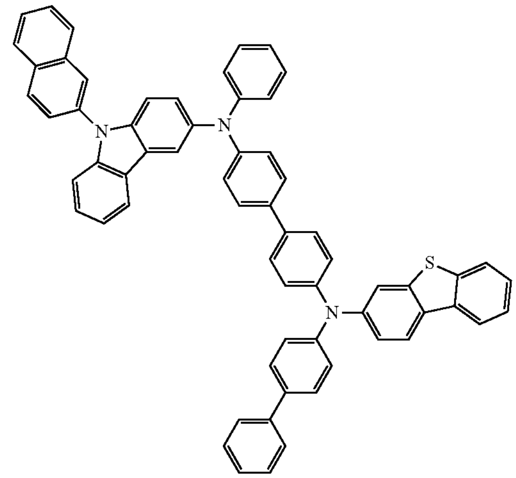
12-29
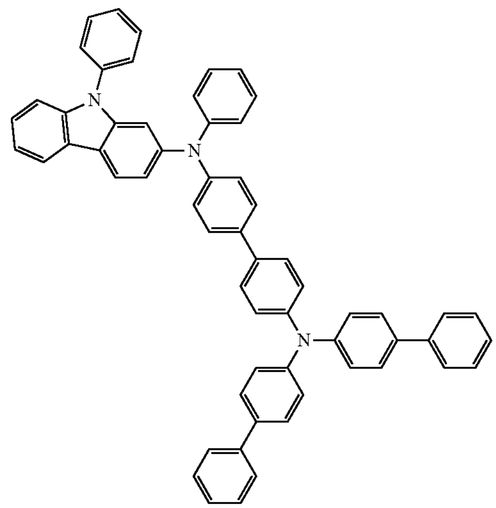
12-30
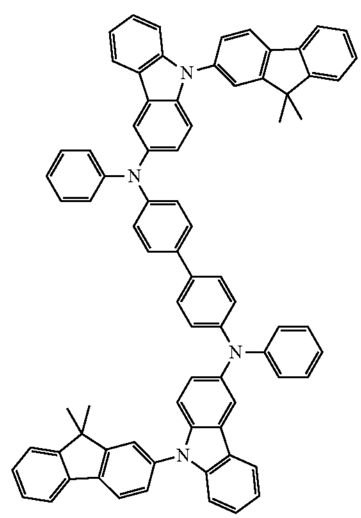

-continued
12-31
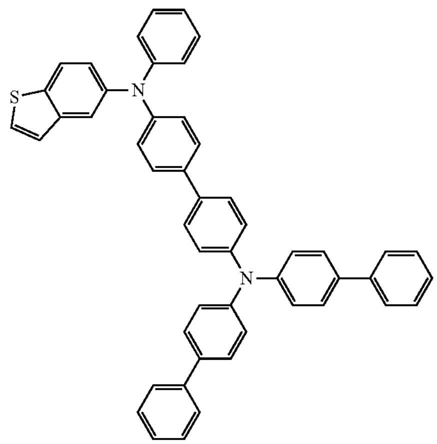
12-32
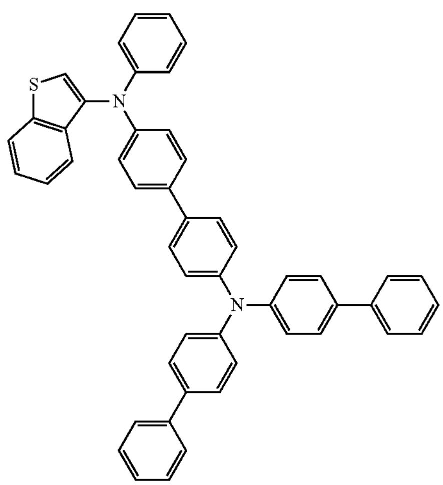
12-33
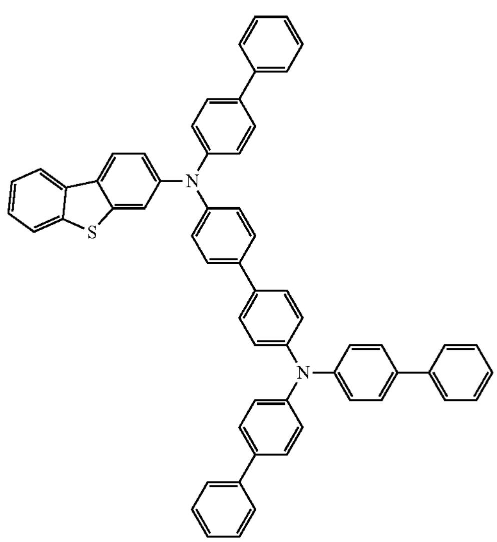
-continued
12-34
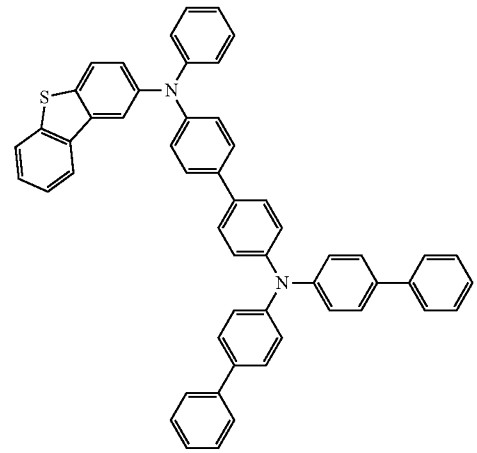
12-35
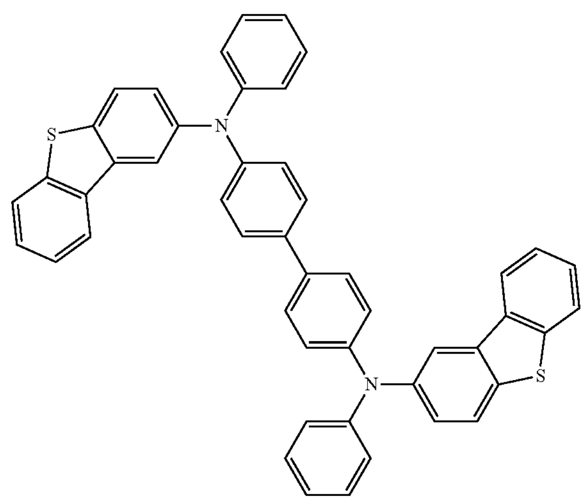
12-36
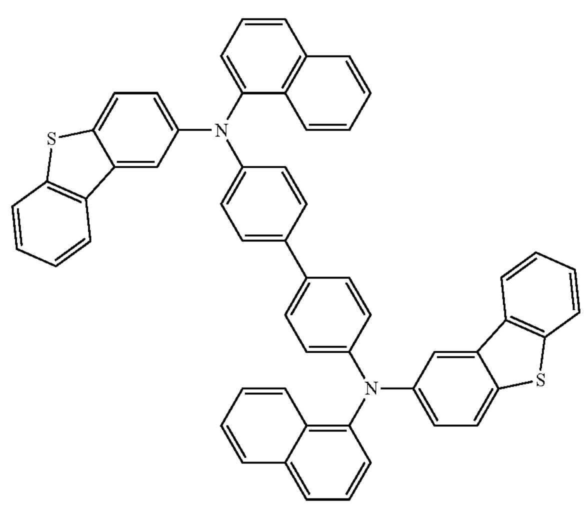

-continued
12-37
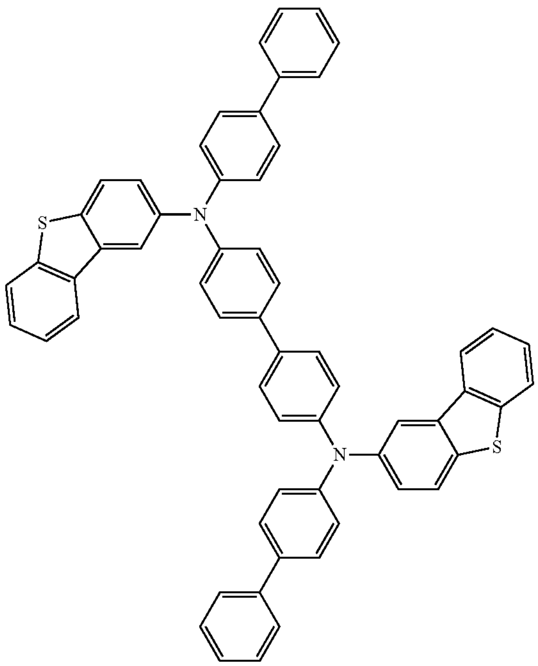
12-38
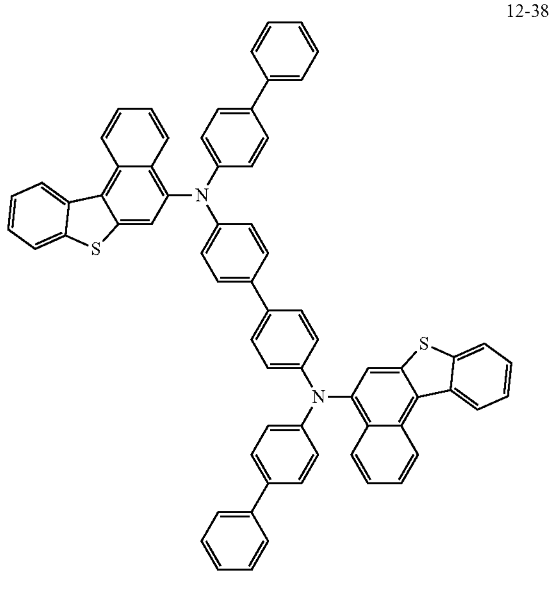
-continued
12-39
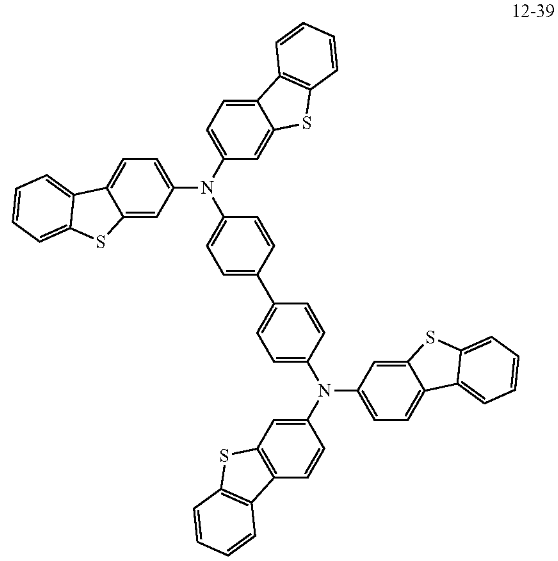
12-40
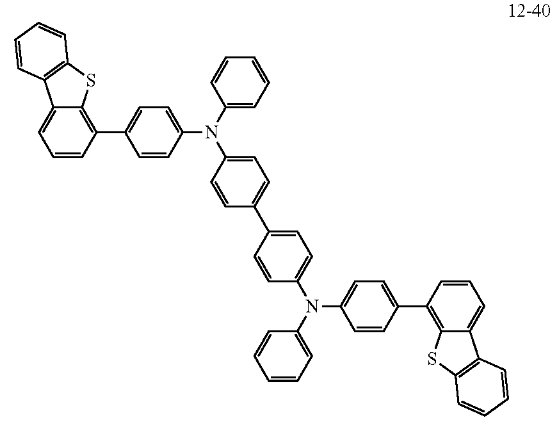
12-41
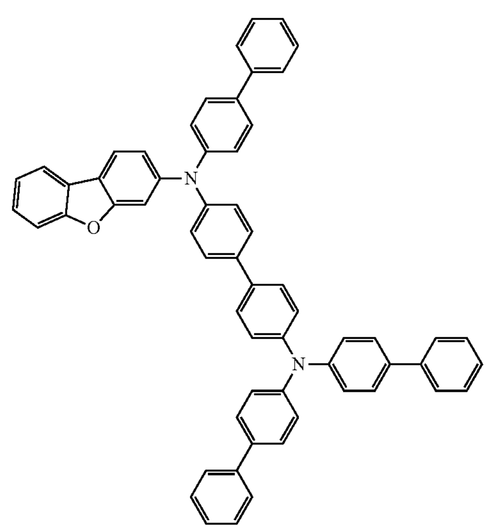

-continued
12-42
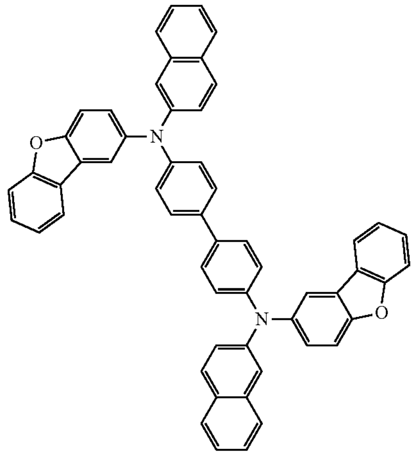
12-43
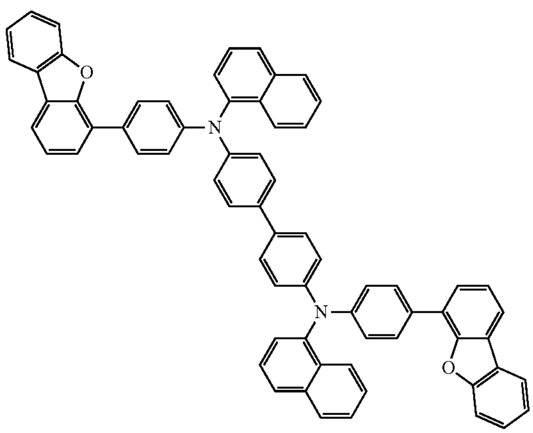
12-44
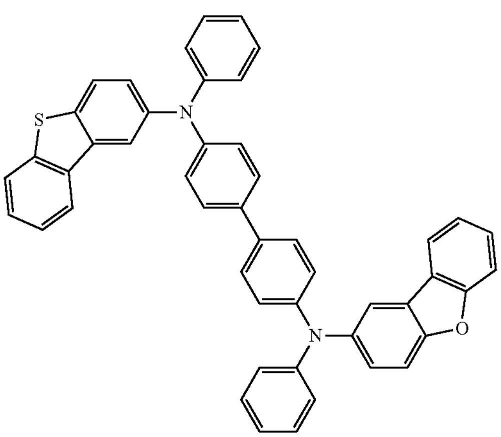
-continued
12-45
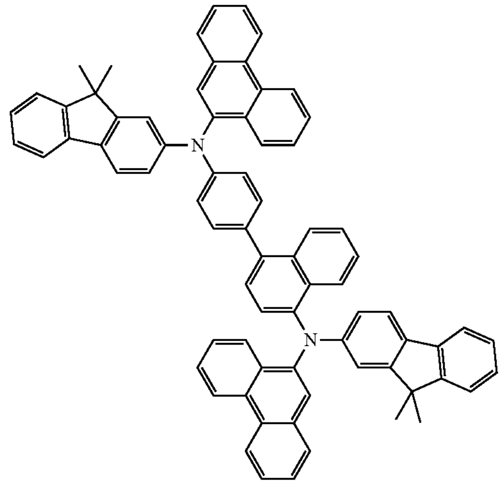
12-46
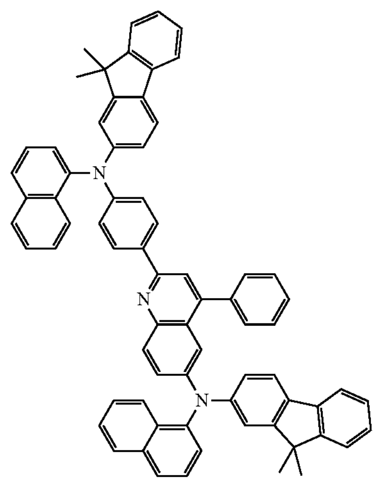
12-47
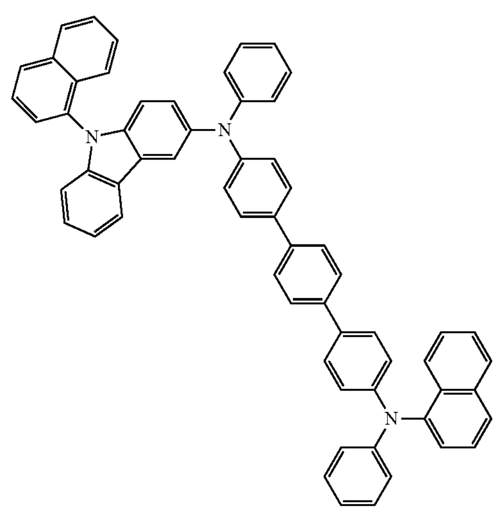

-continued
12-48
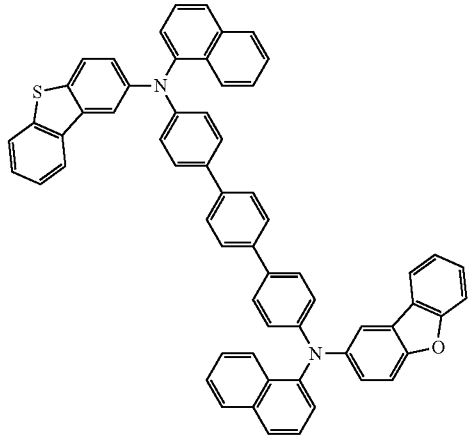
12-49
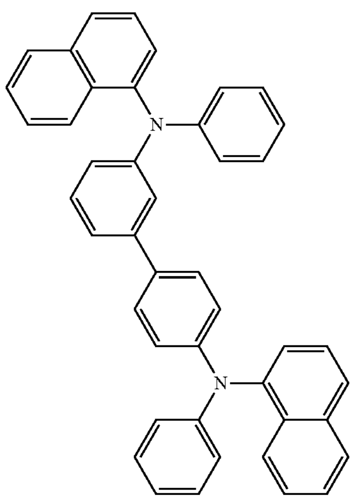
12-50
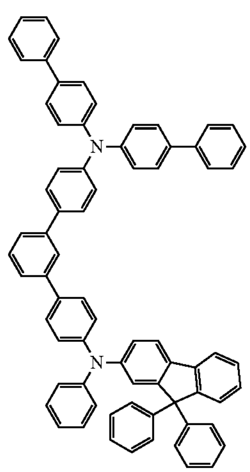
-continued
12-51
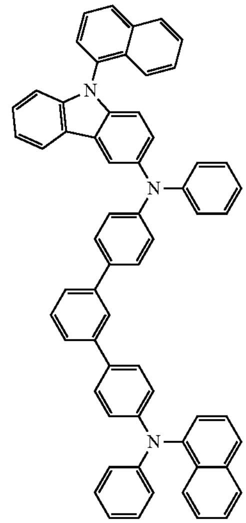
12-52
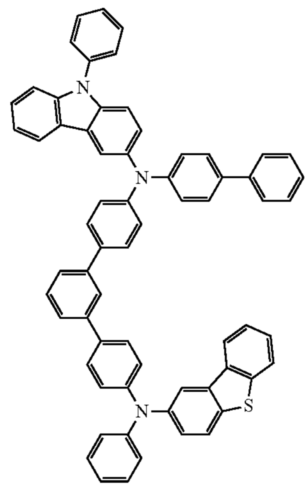
12-53
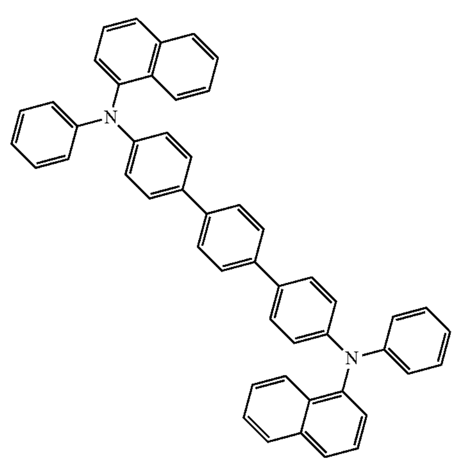

-continued
12-54
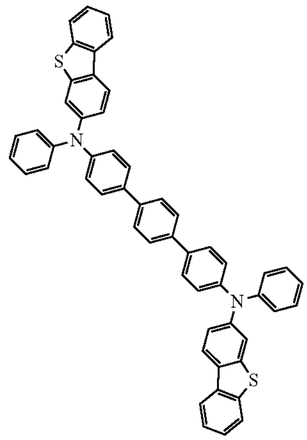
12-55
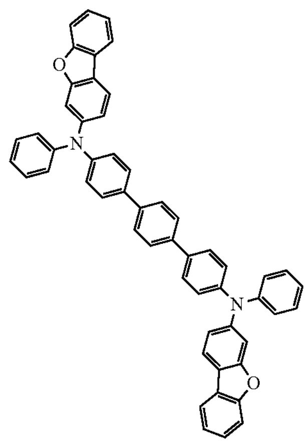
12-56
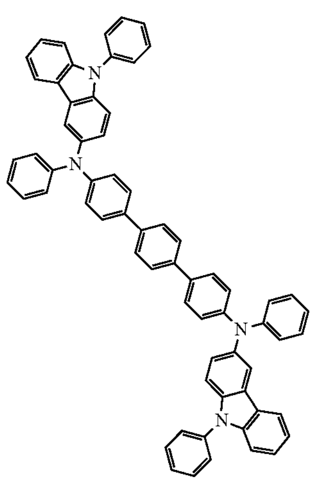
-continued
12-57
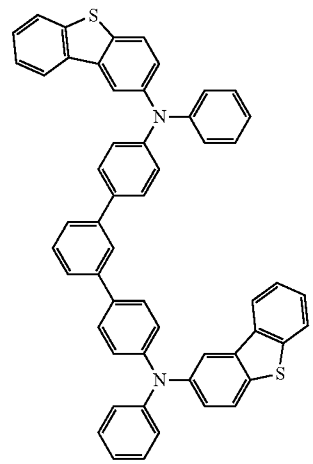
12-58
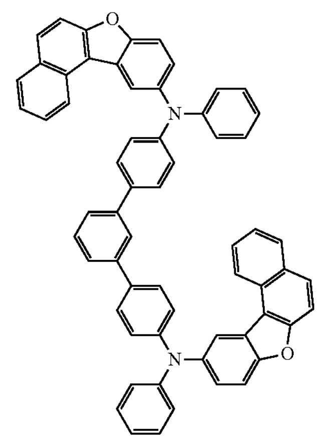
12-59
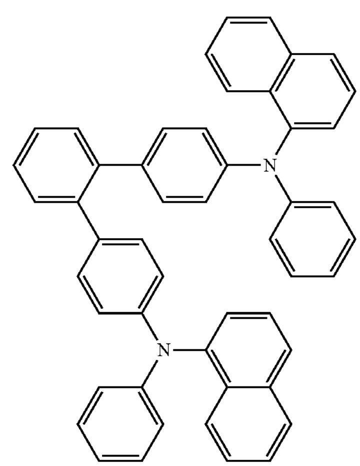

-continued
12-60
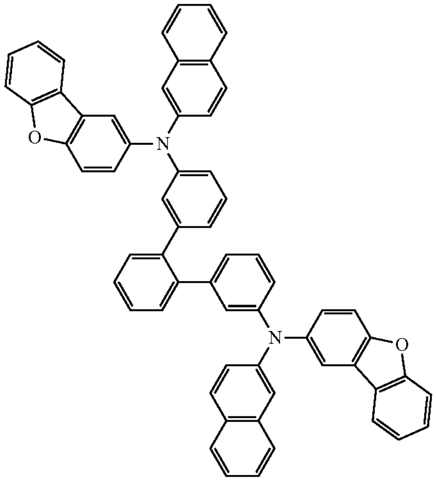
12-61
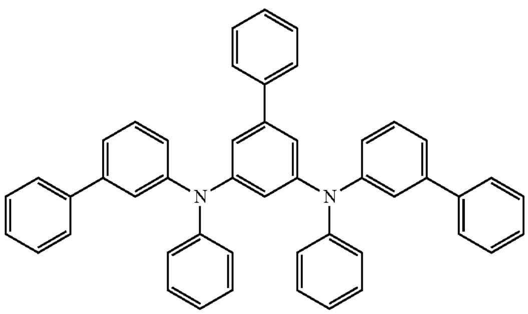
12-62
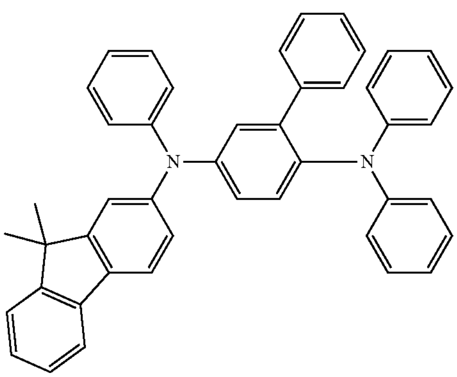
12-63
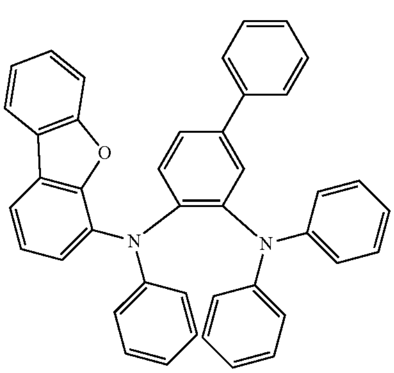
-continued
12-64
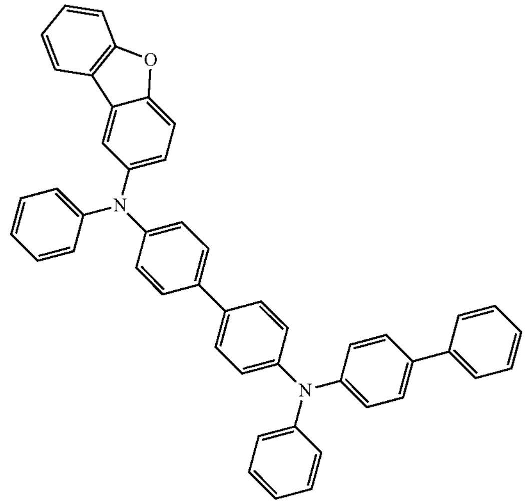
12-65
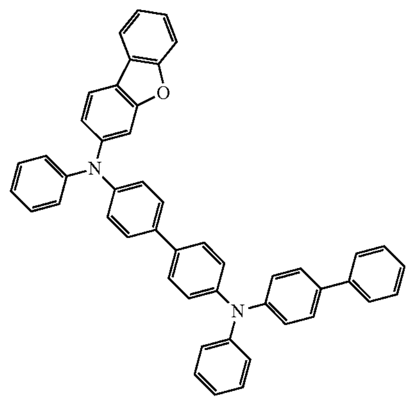
12-66
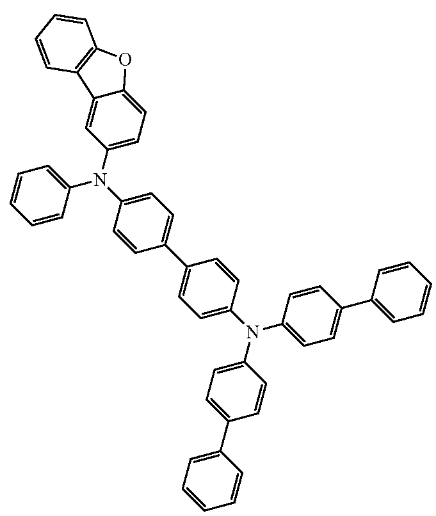

-continued 12-67

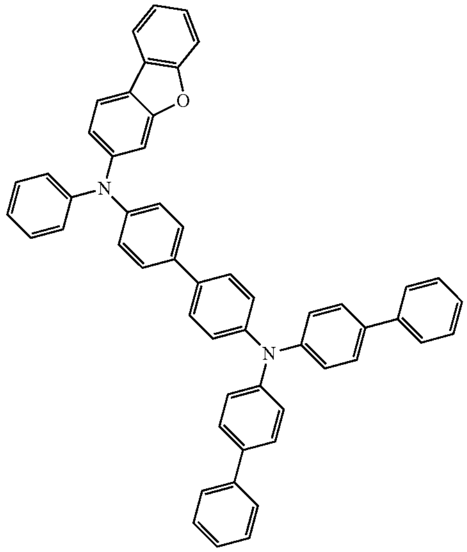

12-68

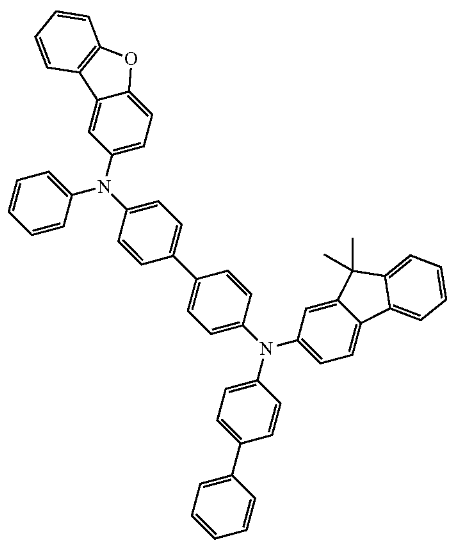

12-69

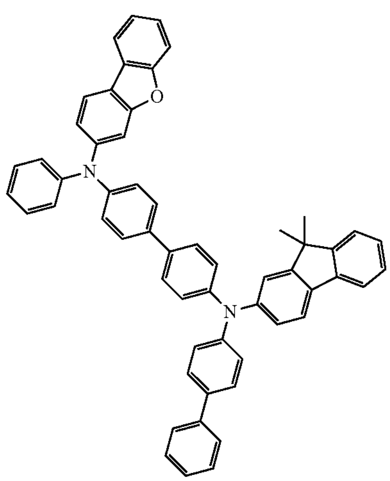

-continued 12-70

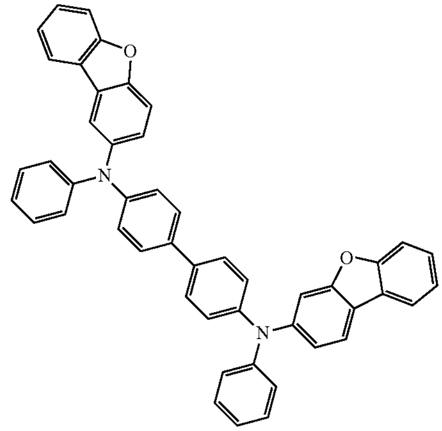

12-71

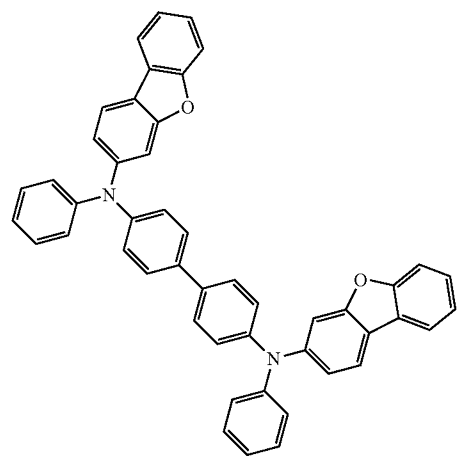

Regarding the sixth compound, what has been described above for the fourth compound may equally be applied, unless clearly stated otherwise.

The first doping material may be a P-type dopant. P-type dopants may be selected, for example, from quinodimethane compounds, azaindenofluorenedions, azaphenalenes, azatriphenylenes, I2, metal halides, transition metal halides, metal oxides, metal oxides including a metal from main group 3 or at least one transition metal, transition metal complexes, or complexes of Cu, Co, Ni, Pd, or Pt with ligands each including at least one oxygen atom as a bonding site. In another example, P-type dopants may be respectively selected from oxides of rhenium (Re), molybdenum (Mo), and tungsten (W). For example, P-type dopants may be respectively selected from $Re_2O_7$, $MoO_3$, $WO_3$, or $ReO_3$.

In another example, the first doping material may be represented by the following Formula E.

[Formula E]

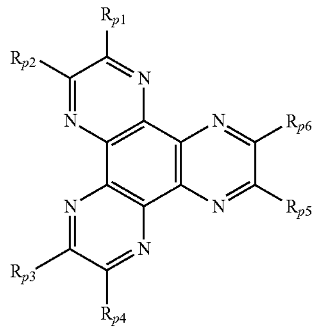

Hereinafter, Formula E will be described.

Each of $R_{p1}$ to $R_{p6}$ may be independently selected from the group consisting of hydrogen; a halogen group; a nitrile group; a nitro group; —$SO_2R$; —SOR; —$SO_2NR_2$; —$SO_3R$; a trifluoromethyl group; —COOR; —CONHR; —CONRR'; a $C_1$-$C_{30}$ alkoxyl group; a $C_1$-$C_{30}$ alkyl group; a $C_2$-$C_{20}$ alkenyl group; a $C_2$-$C_{30}$ heterocyclic group including at least one hetero atom of O, N, S, Si, or P; a fluorenyl group; a $C_6$-$C_{30}$ aryl group; a fused ring group of a $C_3$-$C_{30}$ aliphatic ring and $C_6$-$C_{30}$ aromatic ring; or —NRR'.

R and R' may be respectively selected from the group consisting of a $C_1$-$C_{30}$ alkyl group; a fluorenyl group; a $C_6$-$C_{30}$ aryl group; a fused ring group of a $C_3$-$C_{30}$ aliphatic ring and a $C_6$-$C_{30}$ aromatic ring; or a $C_2$-$C_{30}$ heterocyclic group including at least one hetero atom of O, N, S, Si, or P.

In Formula E, each of the aryl group, the fluorenyl group, the heterocyclic group, the fused ring group, the alkyl group, the alkenyl group, the alkynyl group, and the alkoxyl group may be substituted with one or more substituents selected from the group consisting of deuterium; a halogen group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{25}$ aryl group; a $C_6$-$C_{25}$ aryl group substituted with deuterium; a fluorenyl group; a $C_2$-$C_{20}$ heterocyclic group; or a $C_3$-$C_{20}$ cycloalkyl group.

In another example, the first doping material may be selected from the following E-1 to E-4.

<E-1>

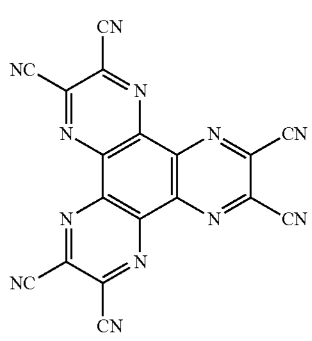

-continued

<E-2>

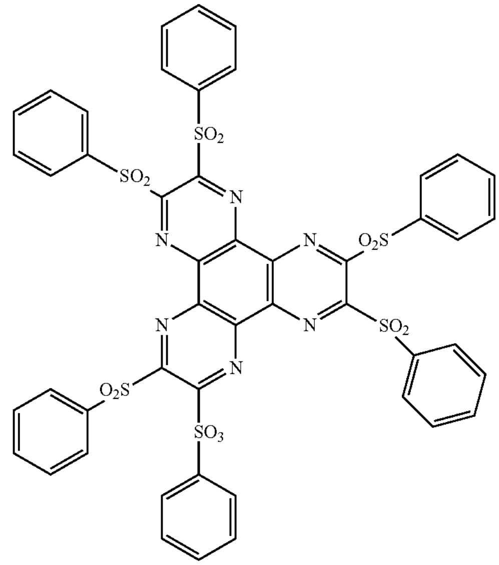

<E-3>

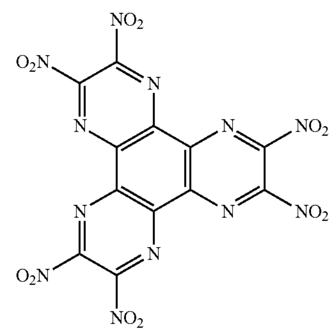

<E-4>

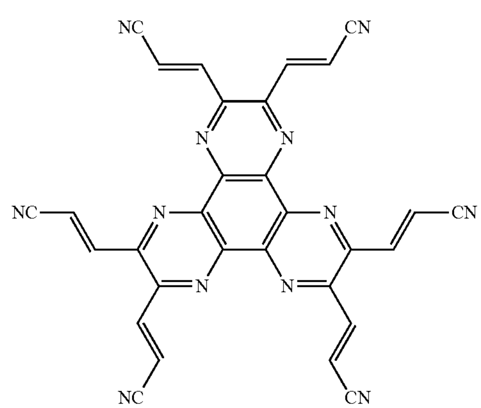

In another example, the first doping material may be selected from the following E-5 to E-14.

<E-5>

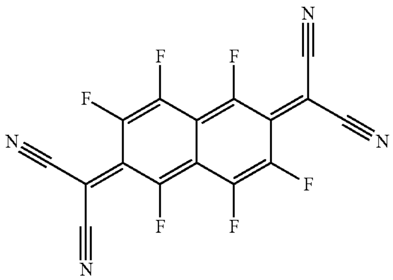

<E-6>

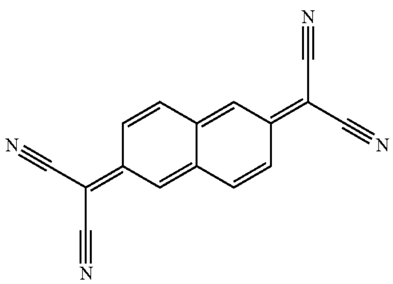

<E-7>

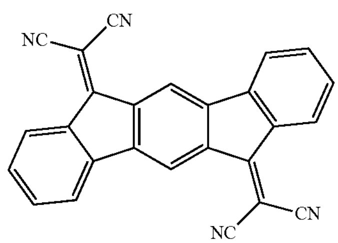

<E-8>

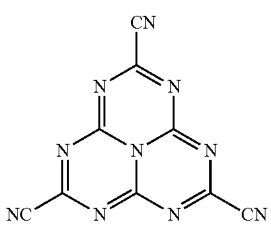

<E-9>

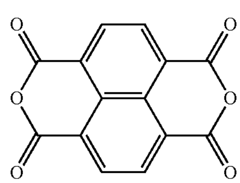

<E-10>

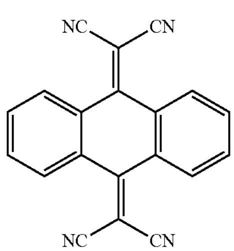

-continued

<E-11>

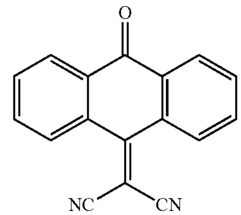

<E-12>

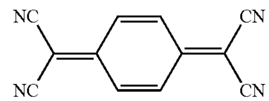

<E-13>

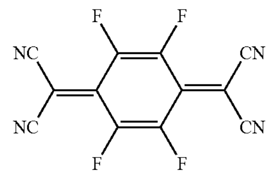

<E-14>

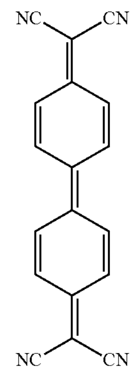

Regarding the second doping material to the fourth doping material, what has been described above for the first doping material may equally be applied, unless clearly stated otherwise.

In some embodiments of the present disclosure, the organic material layer 130 includes the first stack 141, the second stack 142, and the third stack 143. The first stack 141 may include the first hole transport region 1411, the first emission layer 1412, and the first electron transport region 1413. In these embodiments, the first hole transport region 1411 may include the first hole transport layer 1411*a* and the first auxiliary emission layer 1411*b*, the first hole transport layer 1411*a* or the first auxiliary emission layer 1411*b* may include the first compound represented by Formula 1, the thickness of the first hole transport layer 1411*a* may be from 250 Å to 700 Å, and 10% to 50% of the thickness of the first hole transport layer 1411*a* may be doped with the first doping material.

In some embodiments of the present disclosure, the organic material layer 130 may include the first stack 141, the second stack 142, and the third stack 143. The first stack 141 may include the first hole transport region 1411, the first emission layer 1412, and the first electron transport region 1413. In these embodiments, the first hole transport region 1411 may include the first hole transport layer 1411*a* and the first auxiliary emission layer 1411*b*, the first hole transport layer 1411*a* or the first auxiliary emission layer 1411*b* may include the first compound represented by Formula 1, the thickness of the first hole transport layer 1411*a* may be from 250 Å to 700 Å, and 10% to 50% of the thickness of the first hole transport layer 1411*a* may be doped with the first doping material. In these embodiments, the second stack 142 may include a second hole transport region 1421, a second emission layer 1422, and a second electron transport region 1423. In these embodiments, the second hole transport region 1421 may include a second hole transport layer 1421*a* and a second auxiliary emission layer 1421*b*, the second hole transport layer 1421*a* or the second auxiliary emission layer 1421*b* may include the second compound represented by Formula 1, the thickness of the second hole transport layer 1421*a* may be from 250 Å to 700 Å, and 10% to 50% of the thickness of the second hole transport layer 1421*a* may be doped with the second doping material. In these embodiments, the third stack 143 may include a third hole transport region 1431, a third emission layer 1432, and a third electron transport region 1433. In these embodiments, the third hole transport region 1431 may include a third hole transport layer 1431*a* and a third auxiliary emission layer 1431*b*, the third hole transport layer 1431*a* or the third auxiliary emission layer 1431*b* may include the third compound represented by Formula 1, the thickness of the third hole transport layer 1431*a* may be from 250 Å to 700 Å, and 10% to 50% of the thickness of the third hole transport layer 1431*a* may be doped with the third doping material.

In these embodiments, the thickness of the first hole transport layer 1411*a* may be from 400 Å to 500 Å, the thickness of the second hole transport layer 1421*a* may be from 500 Å to 650 Å, and the thickness of the third hole transport layer 1431*a* may be from 450 Å to 560 Å. For example, when the first electrode 110, the first stack 141, the second stack 142, the third stack 143, and the second electrode 120 are sequentially stacked, each of the first emission layer 1412, the second emission layer 1422, the first hole transport layer 1411*a*, the second hole transport layer 1421*a*, and the third hole transport layer 1431*a* meet the above-described thickness ranges, the third emission layer 1432 includes a blue host and a blue dopant, and the first hole transport layer 1411*a* or the first auxiliary emission layer 1411*b* includes the first compound, the second hole transport layer 1421*a* or the second auxiliary emission layer 1421*b* includes the second compound, and the third hole transport layer 1431*a* or the third auxiliary emission layer 1431*b* includes the third compound, an organic electronic device having superior efficiency or increased lifespan may be provided.

In these embodiments, the first hole transport layer 1411*a* may include the first doping material-doped layer 1411*aa* doped with the first doping material and the first doping material undoped layer 1411*ab* not doped with the first doping material. The first doping material-doped layer 1411*aa* may include the first compound and 5 to 15 parts by weight of the first doping material with respect to 100 parts by weight of the first compound. The second hole transport layer may include a second doping material-doped layer doped with a second doping material and a second doping material undoped layer not doped with the second doping material. The second doping material-doped layer may include the second compound and 5 to 15 parts by weight of the second doping material with respect to 100 parts by weight of the second compound. The third hole transport layer may include a third doping material-doped layer doped with the third doping material and a third doping material undoped layer not doped with the third doping material. The third doping material-doped layer may include the third compound and 5 to 15 parts by weight of the third doping material with respect to 100 parts by weight of the third compound.

In these embodiments, the first compound, the second compound, and the third compound may be the same compounds.

In some embodiments of the present disclosure, the organic material layer 130 may include the first stack 141, the second stack 142, and the third stack 143. The first stack 141 may include the first hole transport region 1411, the first emission layer 1412, and the first electron transport region 1413. In these embodiments, the first hole transport region 1411 may include the first hole transport layer 1411*a* and the first auxiliary emission layer 1411*b*, the first hole transport layer 1411*a* or the first auxiliary emission layer 1411*b* may include at least one of the first compound or the fourth compound represented by Formula 1, the thickness of the first hole transport layer 1411*a* may be from 250 Å to 700 Å, and 10% to 50% of the first hole transport layer 1411*a* may be doped with the first doping material.

In some embodiments of the present disclosure, the organic material layer 130 may include the first stack 141, the second stack 142, the third stack 143, and the fourth stack 144. The first stack 141 may include the first hole transport region 1411, the first emission layer 1412, and the first electron transport region 1413. In these embodiments, the first hole transport region 1411 may include the first hole transport layer 1411*a* and the first auxiliary emission layer 1411*b*, the first hole transport layer 1411*a* or the first auxiliary emission layer 1411*b* may include the first compound represented by Formula 1, the thickness of the first hole transport layer 1411*a* may be from 250 Å to 700 Å, and 10% to 50% of the first hole transport layer 1411*a* may be doped with the first doping material. In these embodiments, the fourth stack 144 may include the fourth hole transport region 1441, the fourth emission layer 1442, and the fourth electron transport region 1443. In these embodiments, the fourth hole transport region 1441 may include the fourth hole transport layer 1441*a* and the fourth auxiliary emission layer 1441*b*, the fourth hole transport layer 1441*a* or the fourth auxiliary emission layer 1441*b* may include may include at least one of the fifth compound or the sixth compound represented by Formula 1, the thickness of the fourth hole transport layer 1441*a* may be from 250 Å to 700 Å, and 10% to 50% of the fourth hole transport layer 1441*a* may be doped with the fourth doping material.

In embodiments of the present disclosure, at least one of the first emission layer 1412, the second emission layer 1422, or the third emission layer 1432 may be a blue light emission layer. When at least one of the first to third emission layers is a blue light emission layer and the first hole transport layer 1411*a* or the first auxiliary emission layer 1411*b* meets the above-described thickness and doping conditions while including the first compound, an organic electronic device superior in terms of efficiency, lifespan, or color purity may be provided.

Herein, the blue light emission layer may refer to an emission layer that emits light having a wavelength ranging from about 450 nm to about 495 nm when excited by electron-hole recombination therein.

In embodiments of the present disclosure, the first emission layer 1412, the second emission layer 1422, and the third emission layer 1432 may emit blue light. When the first to third emission layers are blue light emission layers and the first hole transport layer 1411*a* or the first auxiliary emission layer 1411*b* meets the above-described thickness and doping conditions while including the first compound, an organic electronic device superior in efficiency, lifespan, or color purity may be provided.

In embodiments of the present disclosure, one or two of the first emission layer 1412, the second emission layer 1422, and the third emission layer 1432 may be blue light emission layers, and one or two of the first emission layer 1412, the second emission layer 1422, and the third emission layer 1432 may be green light emission layers. When one or two of the first emission layer 1412, the second emission layer 1422, and the third emission layer 1432 are blue light emission layers, one or two of the first emission layer 1412, the second emission layer 1422, and the third emission layer 1432 are green light emission layers, and the first hole transport layer 1411*a* or the first auxiliary emission layer 1411*b* meets the above-described thickness and doping conditions while including the first compound, an organic electronic device superior in efficiency, lifespan, or color purity may be provided.

Herein, the green light emission layers may refer to emission layers each of which emits light having a wavelength ranging from about 495 nm to about 570 nm when excited by electron-hole recombination therein.

In embodiments of the present disclosure, two emission layers of the first emission layer 1412, the second emission layer 1422, and the third emission layer 1432 may be blue light emission layers, and the remaining one emission layer of the first emission layer 1412, the second emission layer 1422, and the third emission layer 1432 may be a green light emission layer. When two emission layers of the first emission layer 1412, the second emission layer 1422, and the third emission layer 1432 are blue light emission layers, the remaining one emission layer of the first emission layer 1412, the second emission layer 1422, and the third emission layer 1432 is a green light emission layer, and the first hole transport layer 1411*a* or the first auxiliary emission layer 1411*b* meets the above-described thickness and doping conditions while including the first compound, an organic electronic device superior in efficiency, lifespan, or color purity may be provided.

In embodiments of the present disclosure, when two emission layers of the first emission layer 1412, the second emission layer 1422, and the third emission layer 1432 are blue light emission layers and the remaining emission layer is a green light emission layer, the green light emission layer may be positioned between the two blue light emission layers. When the first hole transport layer 1411*a* or the first auxiliary emission layer 1411*b* includes the first compound and meets the above-described thickness and doping conditions while the first to third emission layers meet the above-described conditions, an organic electronic device superior in efficiency, lifespan, or color purity may be provided.

In embodiments of the present disclosure, at least one of the first emission layer 1412, the second emission layer 1422, or the third emission layer 1432 may be a multi-emission layer emitting green light and blue light.

Herein, the multi-emission layer emitting green light and blue light may refer to an emission layer emitting light having a wavelength ranging from about 450 nm to about 570 nm when excited by electron-hole recombination therein.

When at least one of the first emission layer 1412, the second emission layer 1422, or the third emission layer 1432 is a multi-emission layer emitting green light and blue light and the first hole transport layer 1411*a* or the first auxiliary emission layer 1411*b* meets the above-described thickness and doping conditions while including the first compound, an organic electronic device superior in efficiency, lifespan, or color purity may be provided.

In embodiments of the present disclosure, two emission layers of the first emission layer 1412 to the fourth emission layer 1442 may be blue light emission layers, whereas the remaining one emission layer different from the two emission layers may be a green light emission layer. When two emission layers of the first emission layer 1412 to the fourth emission layer 1442 are blue light emission layers, the remaining one emission layer different from the two emission layers is a green light emission layer, and the fourth hole transport layer 1441*a* or the fourth auxiliary emission layer 1441*b* meets the above-described thickness and doping conditions while including at least one of the fifth compound or the sixth compound, an organic electronic device superior in efficiency, lifespan, or color purity may be provided.

Hereinafter, the present disclosure will be described in detail with reference to, but is not limited to, examples of synthesis of the compound of the hole transport layer and examples of preparation of the organic electronic device.

SYNTHESIS EXAMPLES

A compound (e.g., the fourth compound, the sixth compound, the seventh compound, or the eighth compound described above) represented by Formula C and including a radical of a compound represented by Formula A or Formula B, according to the present disclosure, is prepared by, but is not limited to, reacting one of Sub 1-A to Sub 1-C with Sub 2 as in the following Reaction Formula 1.

[Reaction Formula 1]

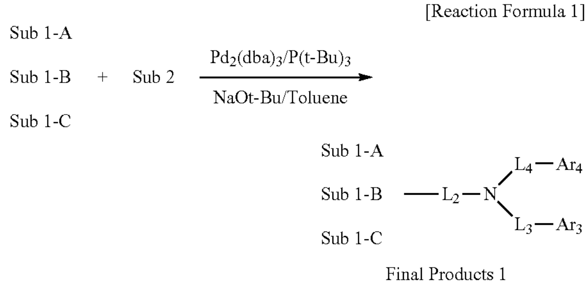

More specifically, Reaction Formula 1 may be represented by, but is not limited to, the following Reaction Formula 2 to Reaction Formula 4.

[Reaction Formula 2]

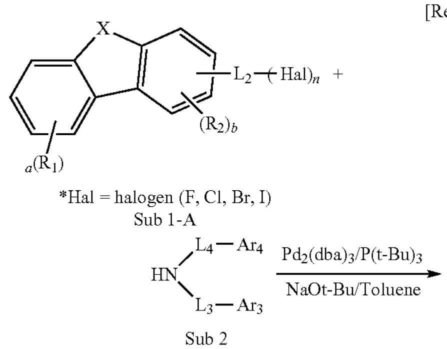

-continued

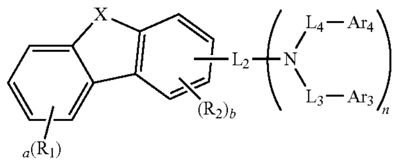

Final Products 1A

[Reaction Formula 3]

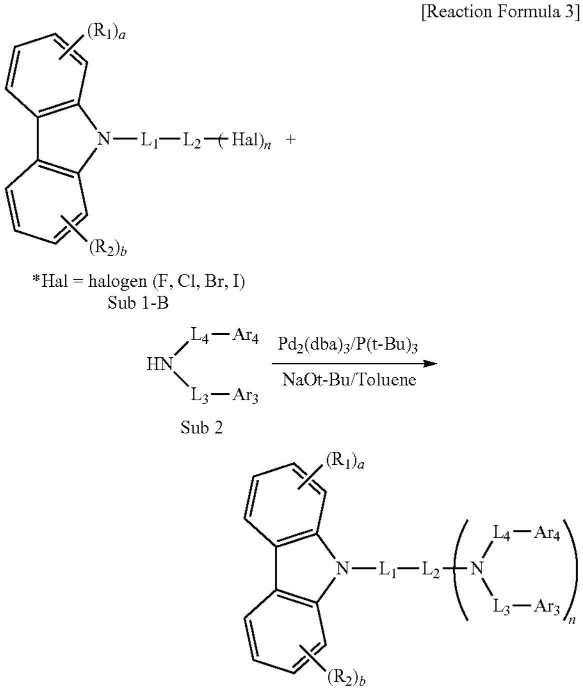

*Hal = halogen (F, Cl, Br, I)
Sub 1-B

Sub 2

Final Products 1B

[Reaction Formula 4]

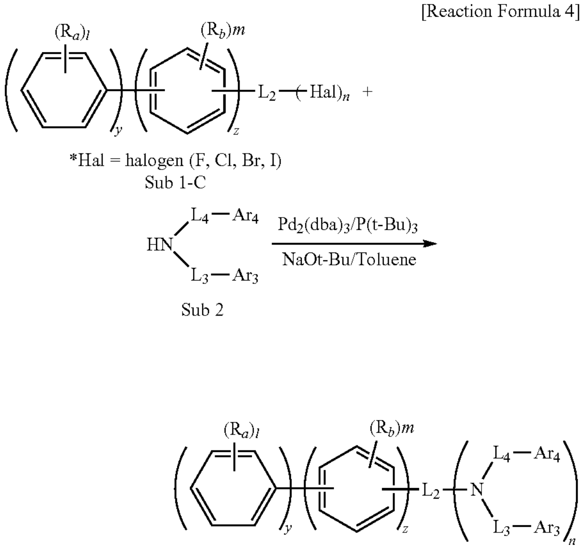

*Hal = halogen (F, Cl, Br, I)
Sub 1-C

Sub 2

Final Products 1C

Synthesis of Sub 1-A

Sub 1A of Reaction Formula 1 may be synthesized through, but is not limited to, a reaction path of the following Reaction Formula 5.

[Reaction Formula 5]

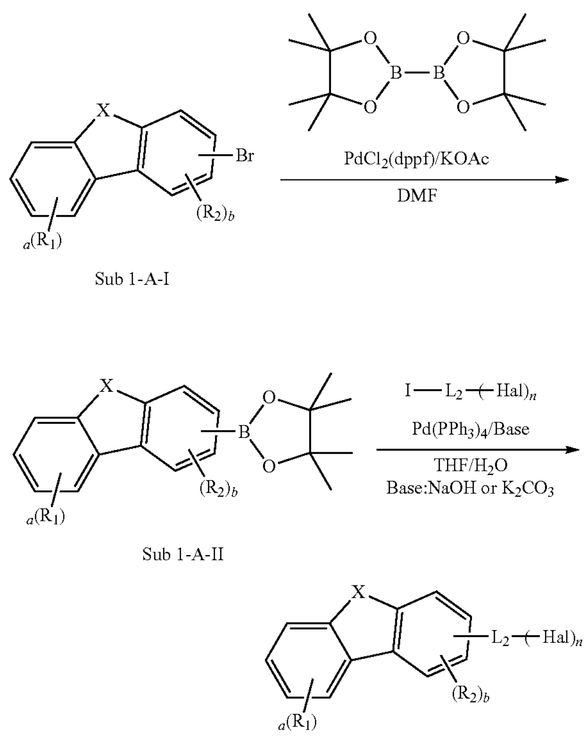

Sub 1-A-I

Sub 1-A-II

Sub 1-A

Synthesis of Sub 1-B

Sub 1B of Reaction Formula 2 may be synthesized through, but is not limited to, a reaction path of the following Reaction Formula 6.

[Reaction Formula 6]

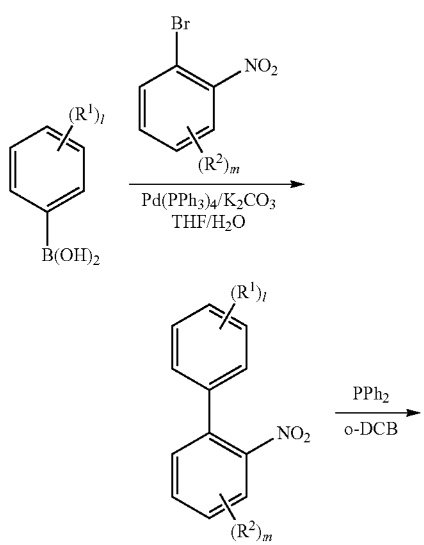

Sub 1-B-I

-continued

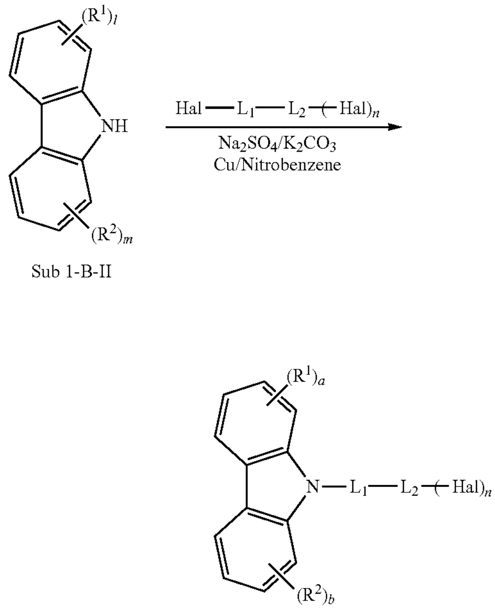

Sub 1-B-II

Sub 1-B

Synthesis of Sub 1-C

Sub 1C of Reaction Formula 3 may be synthesized through, but is not limited to, a reaction path of the following Reaction Formula 7.

[Reaction Formula 7]

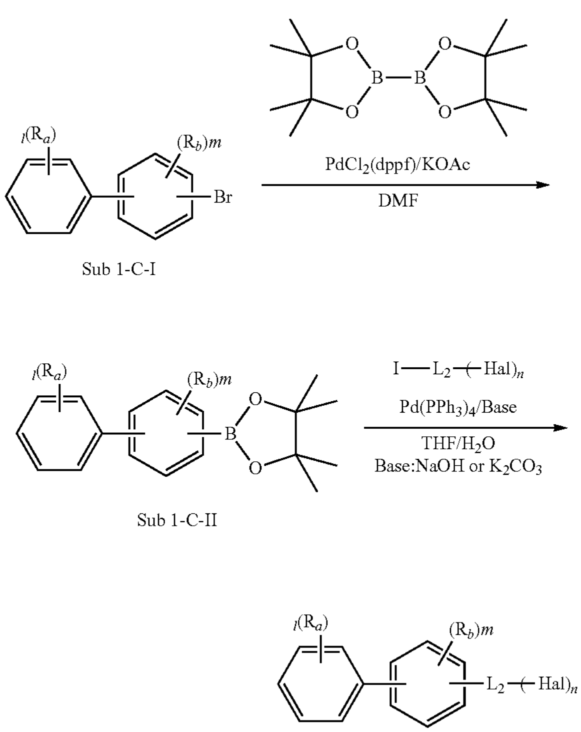

Sub 1-C-I

Sub 1-C-II

Sub 1-C

Illustration of Synthesis of Sub 1-A-3

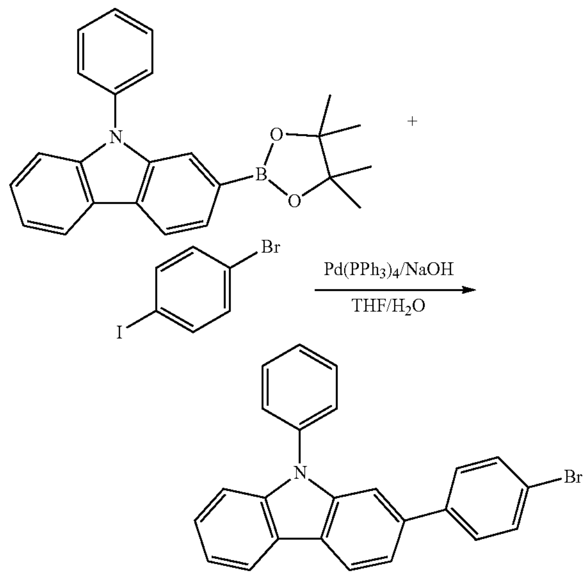

9-phenyl-2-(4, 4, 5, 5-tetramethyl-1,3,2-dioxaborolan-2-yl)-9H-carbazole (29.5 g, 80 mmol), THF 360 ml, 1-bromo-4-iodobenzene (23.8 g, 84 mmol), $Pd(PPh_3)_4$ (2.8 g, 2.4 mmol), NaOH (9.6 g, 240 mmol), and water 180 ml were added, followed by stirring and refluxing. When the reaction was completed, extraction was performed with ether and water, and then an organic layer was dried with $MgSO_4$ and concentrated. The resultant organic matter was subjected to silica gel column chromatography and recrystallization to create a product in an amount of 22.9 g (72%).

Illustration of Synthesis of Sub 1-A-5

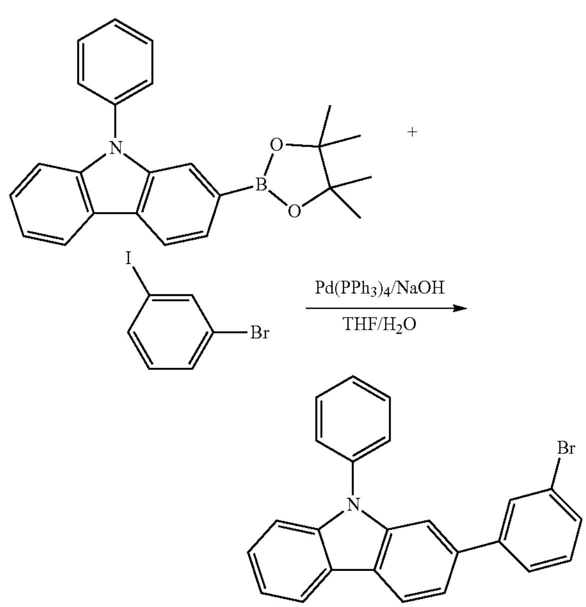

After 9-phenyl-2-(4,4,5,5-tetramethyl-1,3,2-dioxaborolan-2-yl)-9H-carbazole (73.92 g, 200.2 mmol) was dissolved with THE 880 ml in a round bottom flask, 1-bromo-2-iodobenzene (85.0 g, 300.3 mmol), $Pd(PPh_3)_4$ (11.6 g, 10 mmol), $K_2CO_3$ (83 g, 600.6 mmol), and water 440 ml were processed using the same experimental method as in Sub 1-A-3, thereby creating a product in an amount of 55.8 g (yield: 70%).

Sub 1-B-2 Synthesis Example

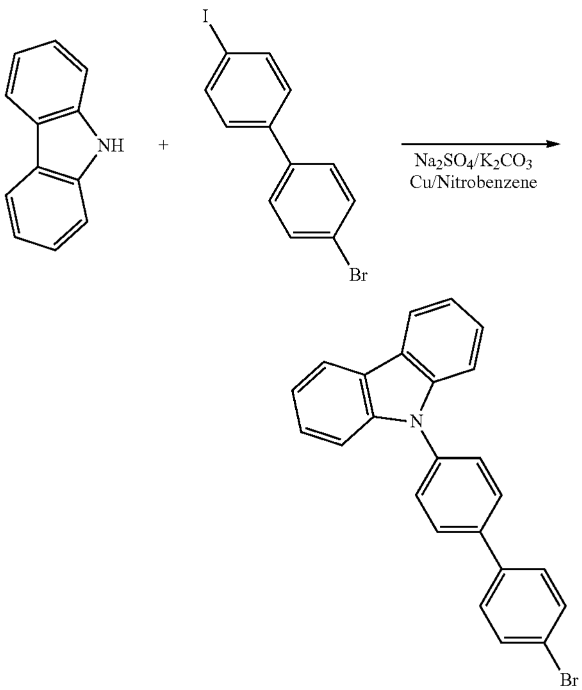

After 9H-carbazole (12 g, 71.8 mmol) was dissolved with nitrobenzene (450 ml) in a round bottom flask, 4-bromo-4'-iodo-1,1'-biphenyl (38.65 g, 107.6 mmol), $Na_2SO_4$ (10.19 g, 71.8 mmol), $K_2CO_3$ (9.92 g, 71.8 mmol), and Cu (1.37 g, 21.5 mmol) were added, followed by stirring at 200° C. When the reaction was completed, nitrobenzene was removed by distillation, extraction was performed with $CH_2Cl_2$ and water, and an organic layer was dried with $MgSO_4$ and concentrated. Afterwards, a resultant compound was subjected to silica gel column chromatography and recrystallization, thereby creating a product 21.15 g (yield: 74%).

Sub 1-A-53

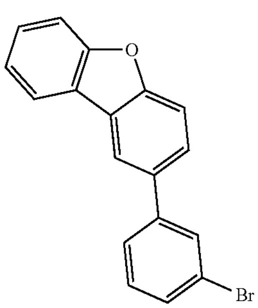

-continued

Sub 1-A-54

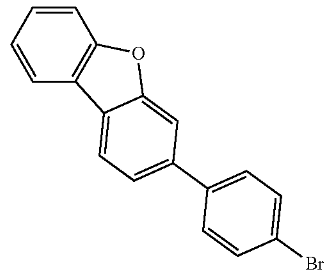

Sub 1-A-55

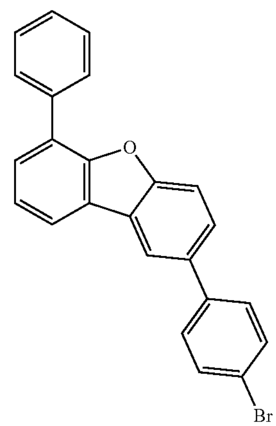

Sub 1-A-56

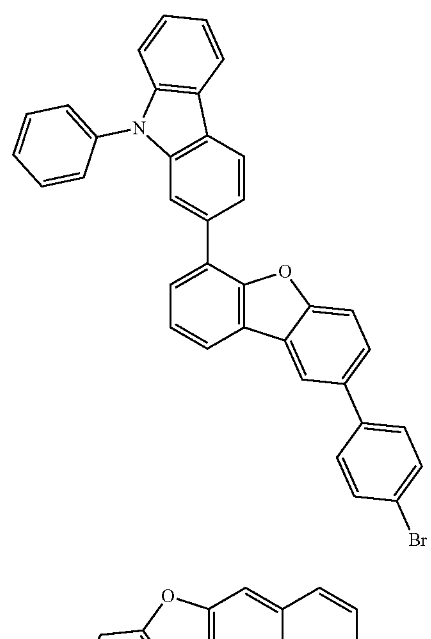

Sub 1-A-57

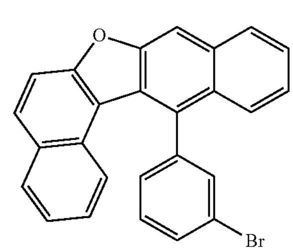

-continued
Sub 1-A-58
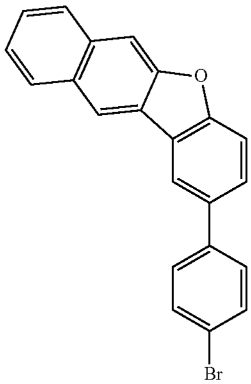
Sub 1-A-59
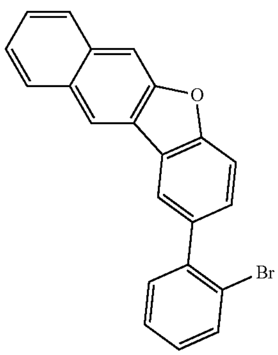
Sub 1-A-60
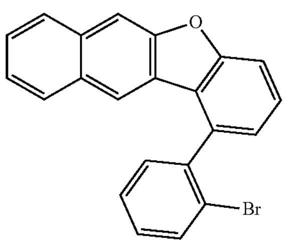
Sub 1-A-61
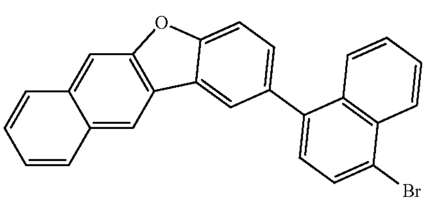
Sub 1-A-62
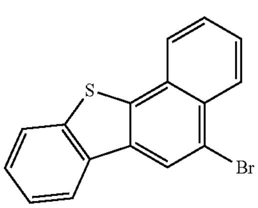
-continued
Sub 1-A-63
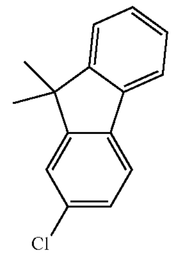
Sub 1-A-64
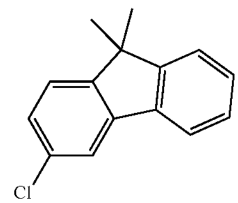
Sub 1-A-65
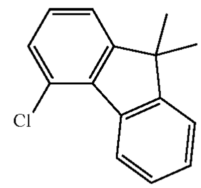
Sub 1-A-66
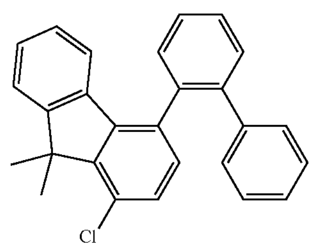
Sub 1-A-67
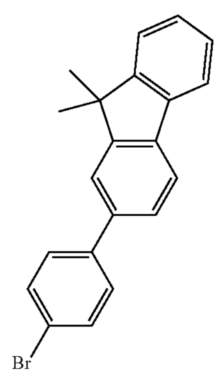

-continued
Sub 1-A-68
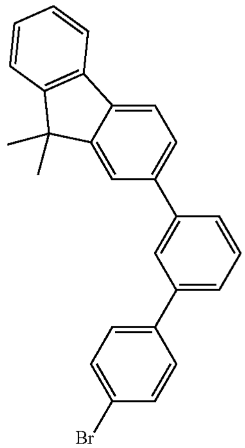
Sub 1-A-69
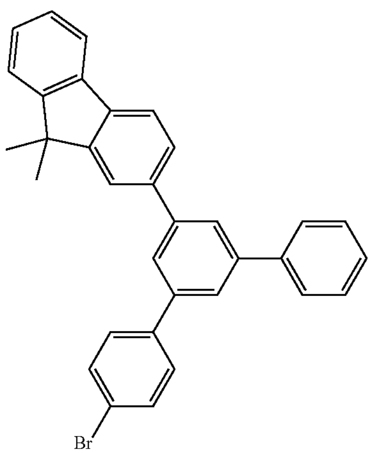
Sub 1-A-70
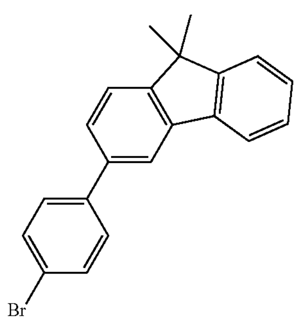
Sub 1-A-71
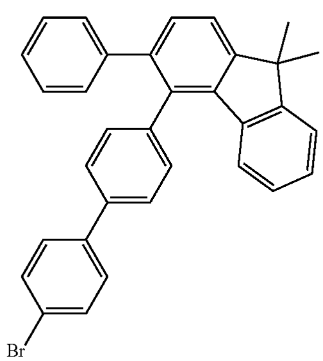
-continued
Sub 1-A-72
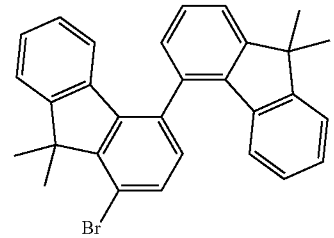
Sub 1-A-73
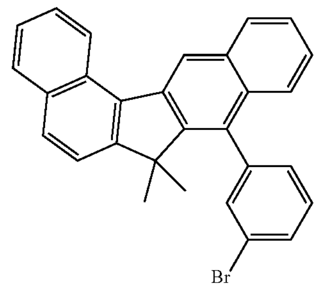
Sub 1-A-74
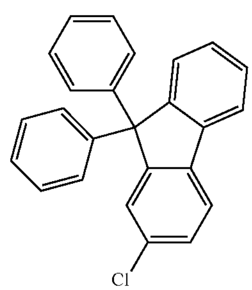
Sub 1-A-75
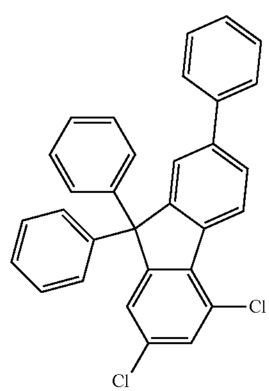
Sub 1-A-76
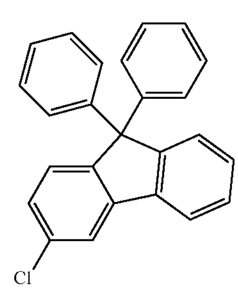

-continued
Sub 1-A-77
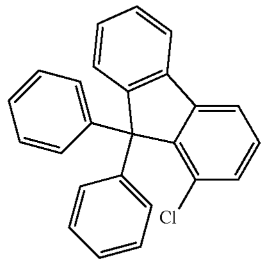
Sub 1-A-78
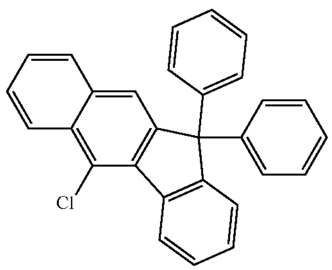
Sub 1-A-79
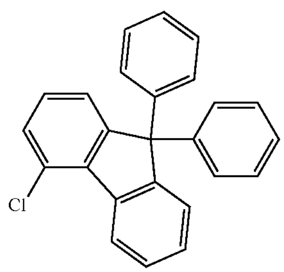
Sub 1-A-80
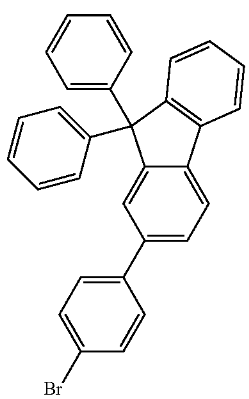
Sub 1-A-81
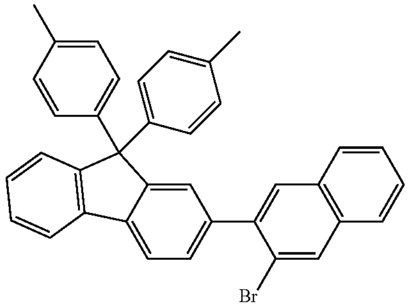
-continued
Sub 1-A-82
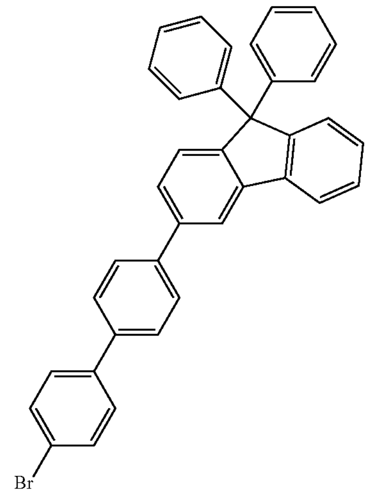
Sub 1-A-83
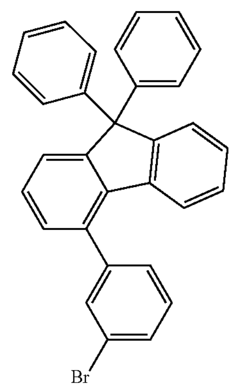
Sub 1-A-84
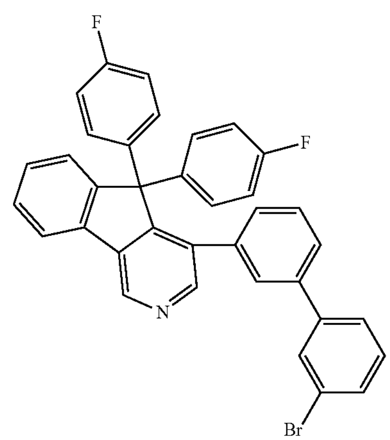
Sub 1-A-85
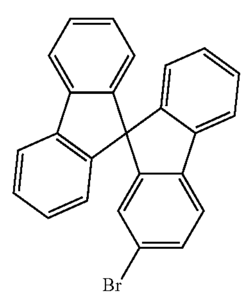

-continued
Sub 1-A-86
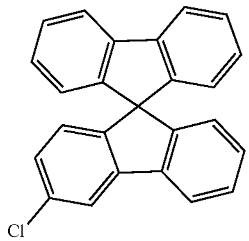
Sub 1-A-87
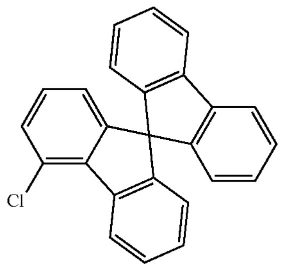
Sub 1-A-88
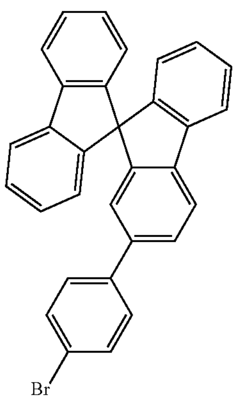
Sub 1-A-89
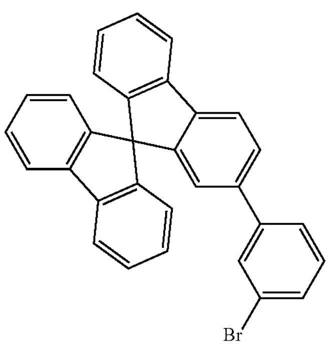
Sub 1-A-90
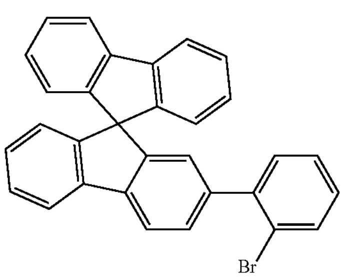
-continued
Sub 1-A-91
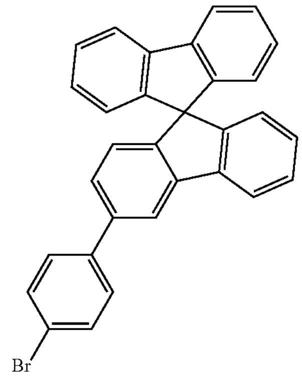
Sub 1-A-92
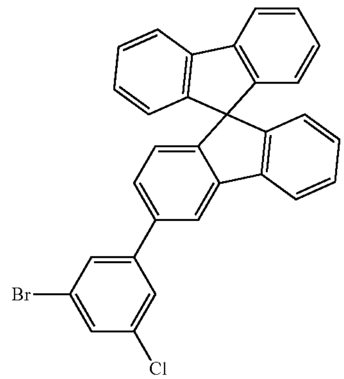
Sub 1-A-93
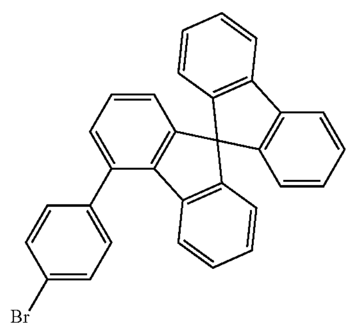
Sub 1-A-94
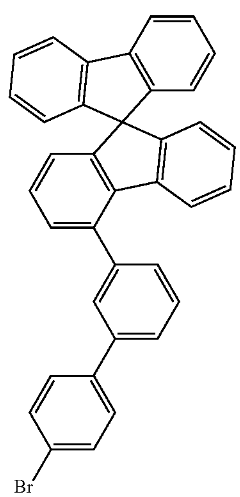

Sub 1-A-95
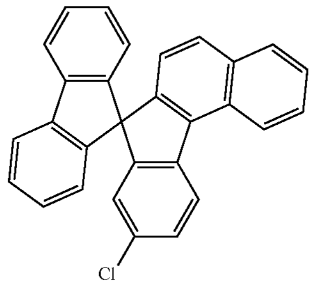
Sub 1-A-96
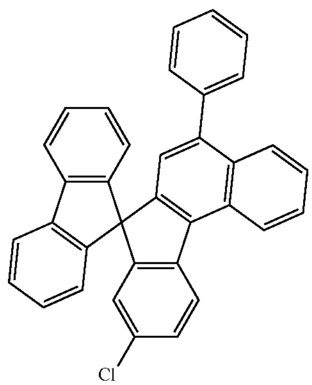
Sub 1-A-97
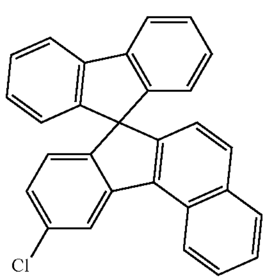
Sub 1-A-98
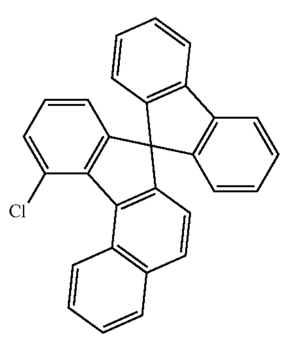
Sub 1-A-99
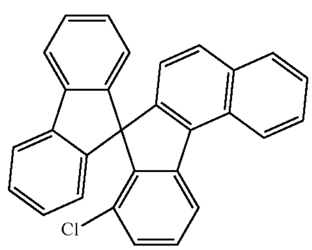
Sub 1-A-100
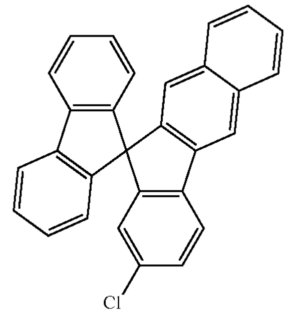
Sub 1-A-101
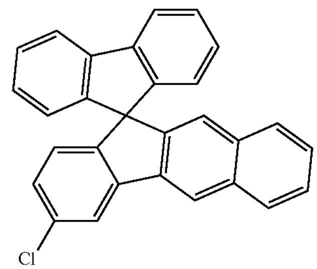
Sub 1-A-102
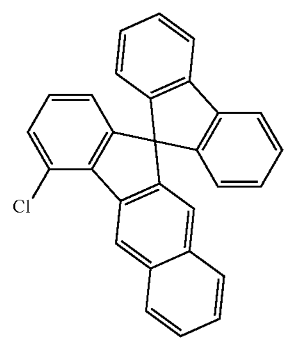
Sub 1-A-103
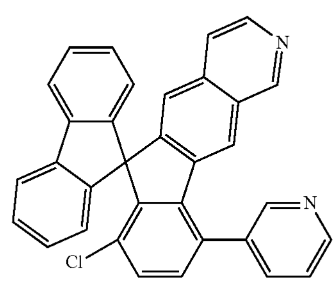
Sub 1-A-104
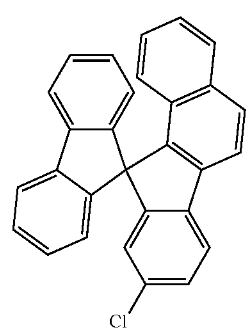

-continued
Sub 1-A-105
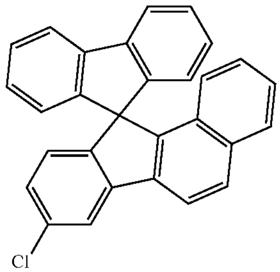
Sub 1-A-106
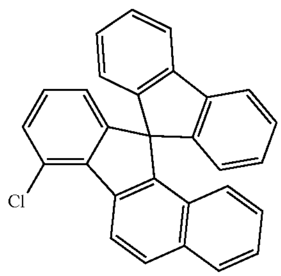
Sub 1-A-107
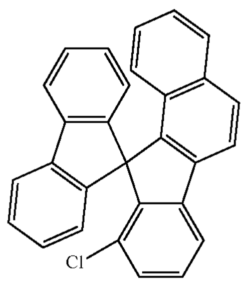
Sub 1-A-108
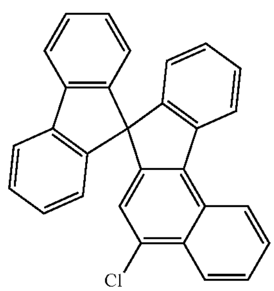
Sub 1-A-109
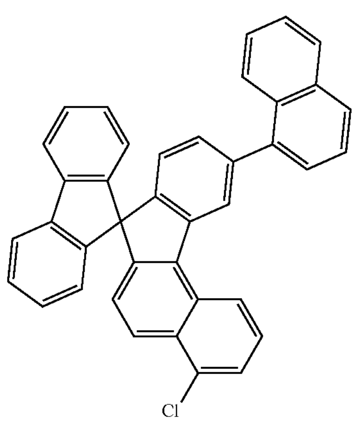
-continued
Sub 1-A-110
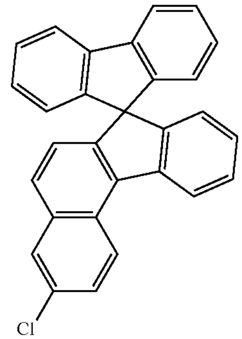
Sub 1-A-111
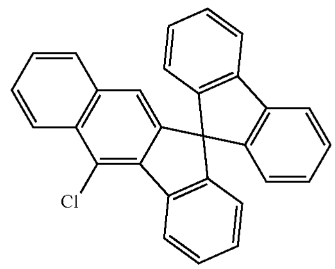
Sub 1-A-112
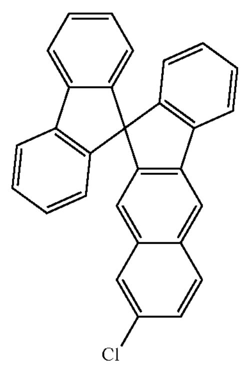
Sub 1-A-113
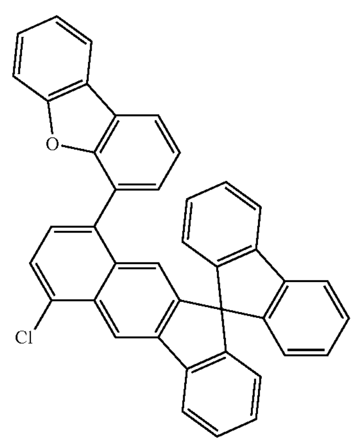

-continued
Sub 1-A-114
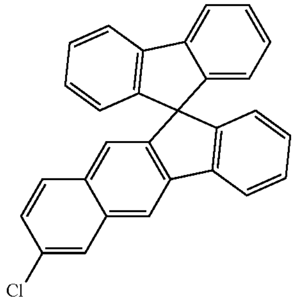
Sub 1-A-115
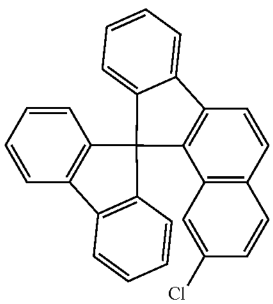
Sub 1-A-116
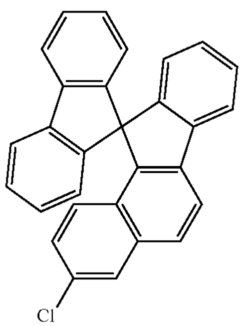
Sub 1-A-117
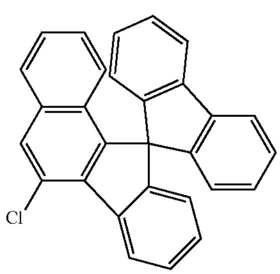
Sub 1-A-118
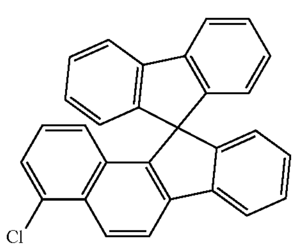
-continued
Sub 1-A-119
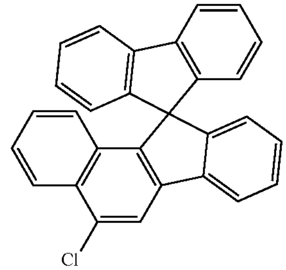
Sub 1-A-120
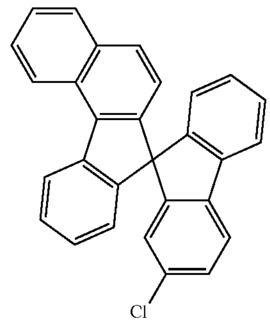
Sub 1-A-121
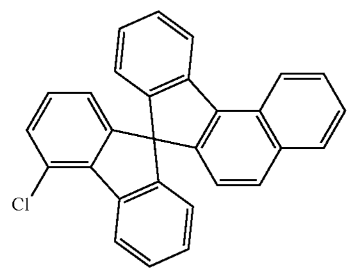
Sub 1-A-122
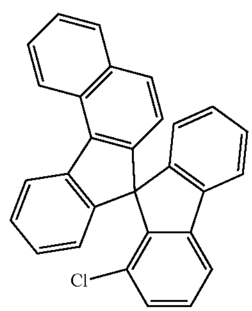
Sub 1-A-123
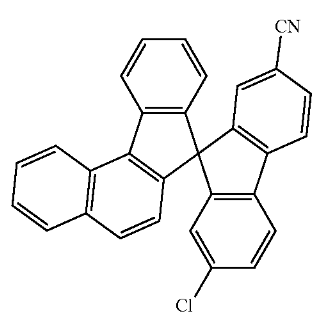

Sub 1-A-124
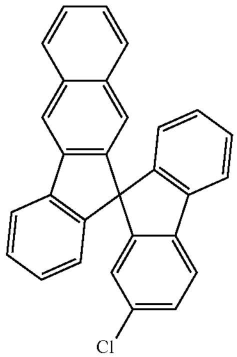
Sub 1-A-125
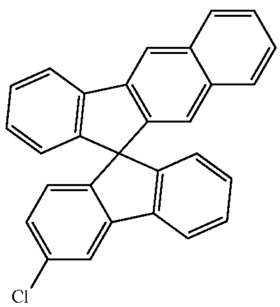
Sub 1-A-126
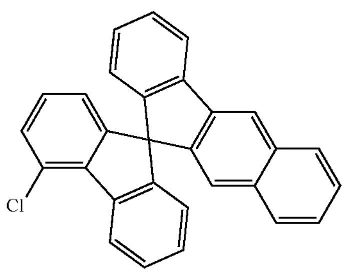
Sub 1-A-127
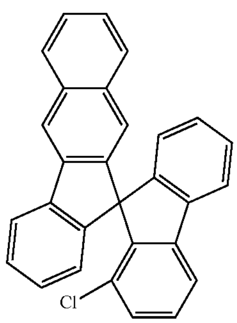
Sub 1-A-128
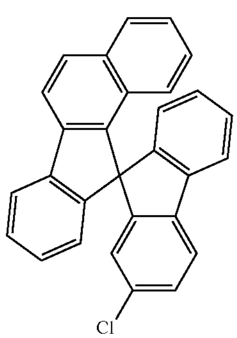
Sub 1-A-129
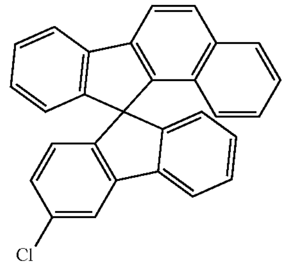
Sub 1-A-130
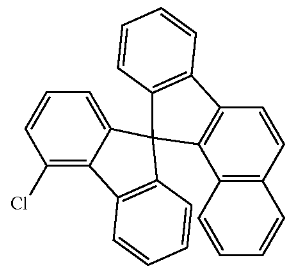
Sub 1-A-131
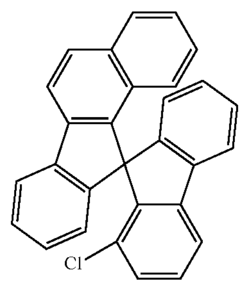
Sub 1-A-132
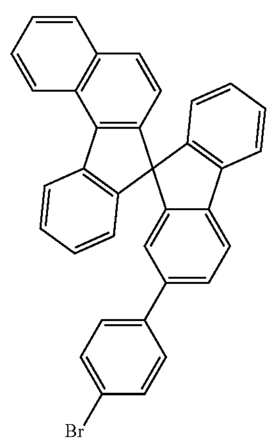

Sub 1-A-133
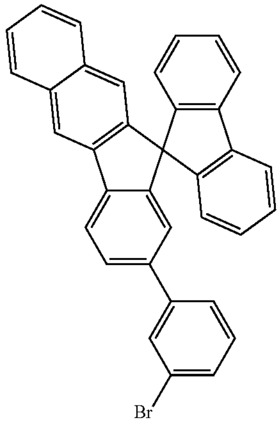
Sub 1-A-134
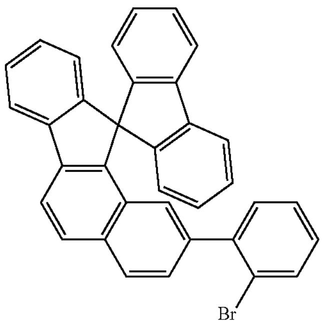
Sub 1-A-135
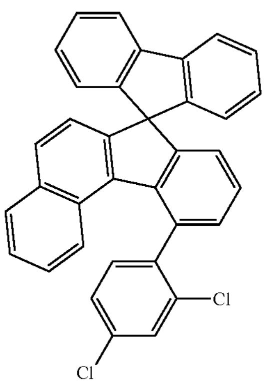
Sub 1-A-136
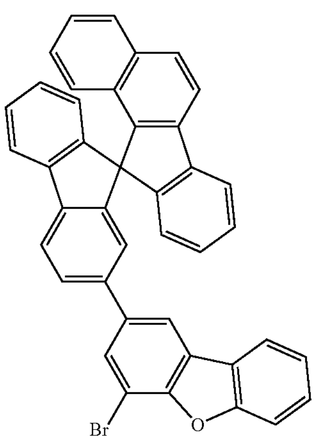
Sub 1-A-137
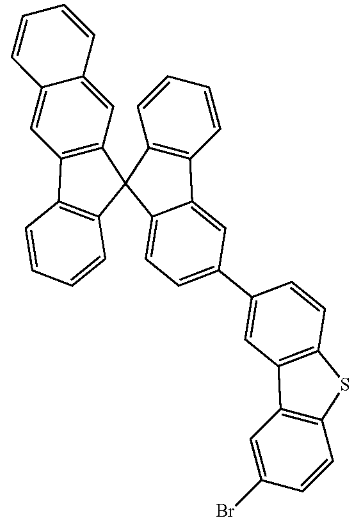
Sub 1-A-138
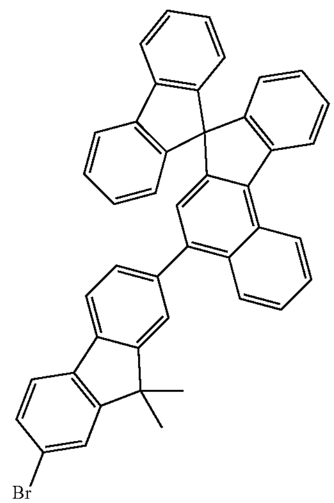
Sub 1-A-139
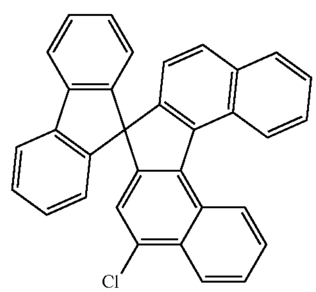
Sub 1-A-140
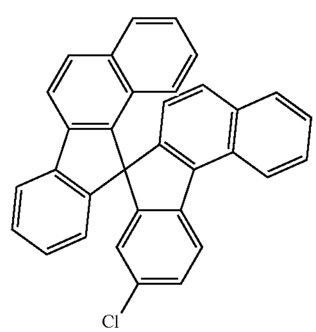

-continued
Sub 1-A-141
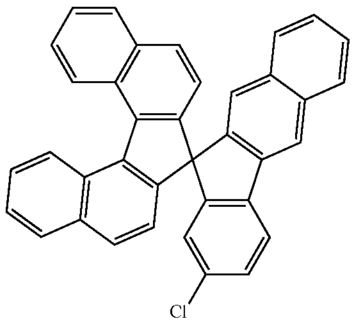
Sub 1-A-142
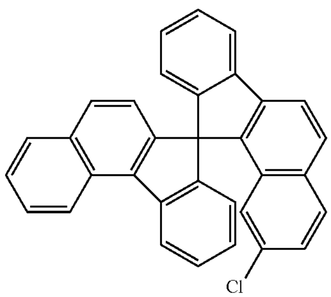
Sub 1-A-143
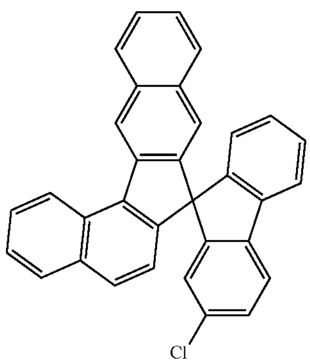
Sub 1-A-144
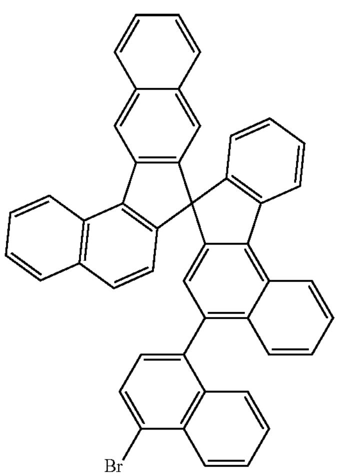
-continued
Sub 1-A-145
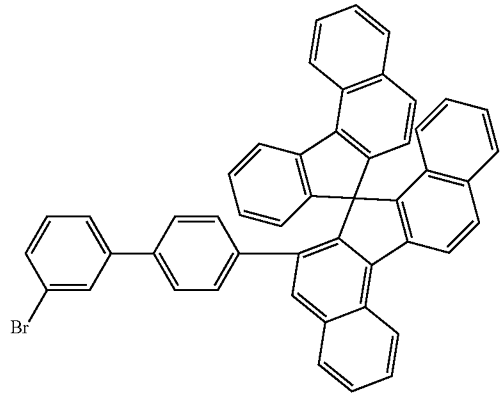
Sub 1-A-146
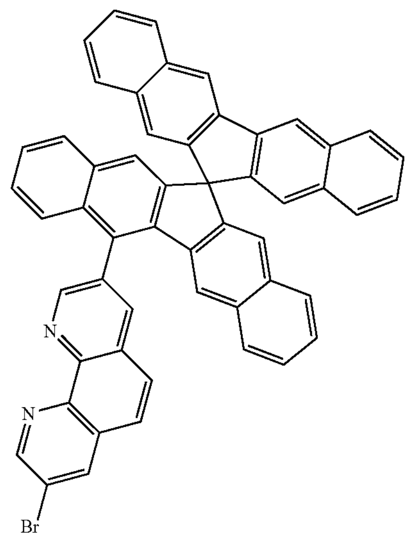
Sub 1-A-147
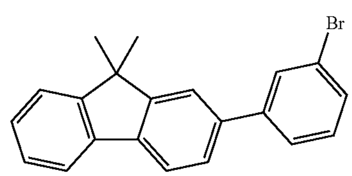
Sub 1-A-148
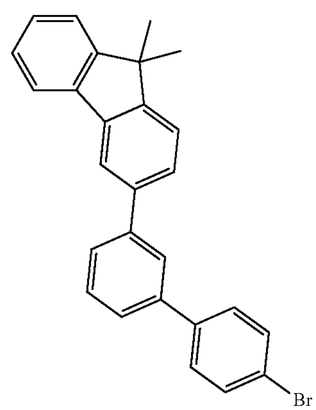

-continued
Sub 1-A-149
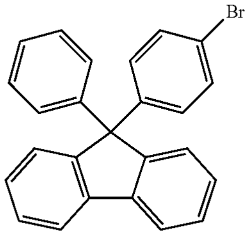
Sub 1-A-150
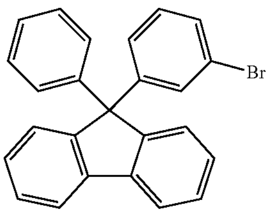
Sub 1-A-151
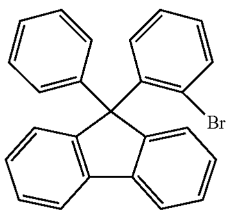
Sub 1-A-152
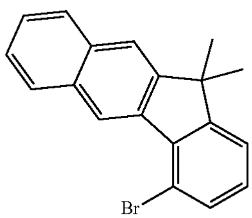
Sub 1-A-153
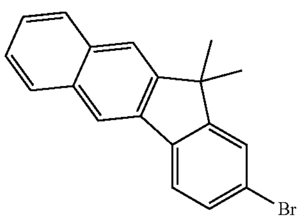
Sub 1-A-154
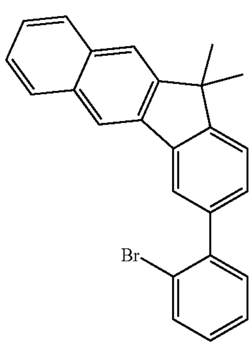
Sub 1-A-155
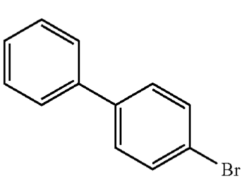
-continued
Sub 1-A-156
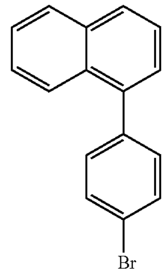
Sub 1-A-157
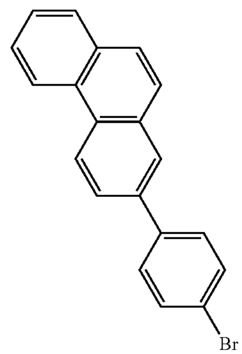
Sub 1-A-158
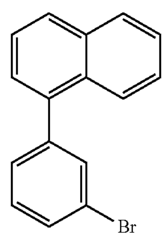
Sub 1-A-159
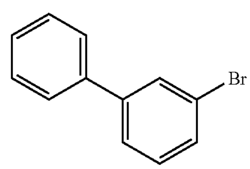
Sub 1-A-160
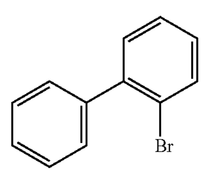
Sub 1-A-161
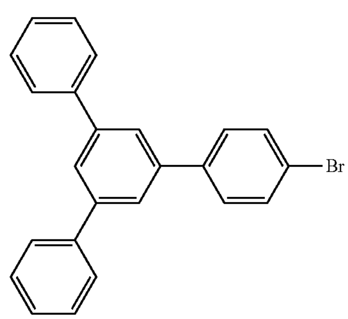

-continued

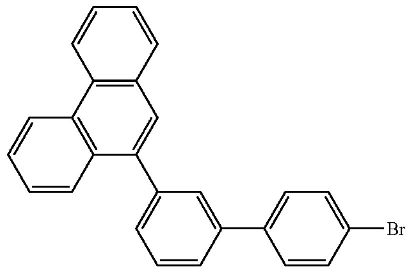

Sub 1-A-162

TABLE 1

| Compound | FD-MS | Compound | FD-MS |
|---|---|---|---|
| Sub 1-A-1 | m/z = 321.02($C_{18}H_{12}BrN$ = 322.21) | Sub 1-A-2 | m/z = 321.02($C_{18}H_{12}BrN$ = 322.21) |
| Sub 1-A-3 | m/z = 397.05($C_{24}H_{16}BrN$ = 398.30) | Sub 1-A-4 | m/z = 563.12($C_{37}H_{26}BrN$ = 564.53) |
| Sub 1-A-5 | m/z = 397.05($C_{24}H_{16}BrN$ = 398.30) | Sub 1-A-6 | m/z = 397.05($C_{24}H_{16}BrN$ = 398.30) |
| Sub 1-A-7 | m/z = 473.08($C_{30}H_{20}BrN$ = 474.40) | Sub 1-A-8 | m/z = 473.08($C_{30}H_{20}BrN$ = 474.40) |
| Sub 1-A-9 | m/z = 473.08($C_{30}H_{20}BrN$ = 474.40) | Sub 1-A-10 | m/z = 473.08($C_{30}H_{20}BrN$ = 474.40) |
| Sub 1-A-11 | m/z = 473.08($C_{30}H_{20}BrN$ = 474.40) | Sub 1-A-12 | m/z = 473.08($C_{30}H_{20}BrN$ = 474.40) |
| Sub 1-A-13 | m/z = 497.08($C_{32}H_{20}BrN$ = 498.42) | Sub 1-A-14 | m/z = 503.03($C_{30}H_{18}BrNS$ = 504.45) |
| Sub 1-A-15 | m/z = 487.06($C_{30}H_{18}BrNO$ = 488.38) | Sub 1-A-16 | m/z = 513.11($C_{33}H_{24}BrN$ = 514.47) |
| Sub 1-A-17 | m/z = 473.08($C_{30}H_{20}BrN$ = 474.40) | Sub 1-A-18 | m/z = 628.13($C_{39}H_{25}BrN_4$ = 629.56) |
| Sub 1-A-19 | m/z = 589.14($C_{39}H_{28}BrN$ = 590.56) | Sub 1-A-20 | m/z = 627.13($C_{40}H_{26}BrN_3$ = 628.57) |
| Sub 1-A-21 | m/z = 473.08($C_{30}H_{20}BrN$ = 474.40) | Sub 1-A-22 | m/z = 474.96($C_{24}H_{15}Br_2N$ = 477.20) |
| Sub 1-A-23 | m/z = 550.99($C_{30}H_{19}Br_2N$ = 553.30) | Sub 1-A-24 | m/z = 580.94($C_{30}H_{17}Br_2N$ = 580.34) |
| Sub 1-A-25 | m/z = 477.94($C_{21}H_{12}Br_2N_4$ = 480.16) | Sub 1-A-26 | m/z = 630.01($C_{33}H_{20}Br_2N_4$ = 632.36) |
| Sub 1-A-27 | m/z = 574.99($C_{32}H_{19}Br_2N$ = 577.32) | Sub 1-A-28 | m/z = 550.99($C_{30}H_{19}Br_2N$ = 553.30) |
| Sub 1-A-29 | m/z = 524.97($C_{28}H_{17}Br_2N$ = 527.26) | Sub 1-A-30 | m/z = 524.97($C_{28}H_{17}Br_2N$ = 527.26) |
| Sub 1-A-31 | m/z = 574.99($C_{32}H_{19}Br_2N$ = 577.32) | Sub 1-A-32 | m/z = 513.11($C_{33}H_{24}BrN$ = 514.47) |
| Sub 1-B-1 | m/z = 321.02($C_{18}H_{12}BrN$ = 322.20) | Sub 1-B-2 | m/z = 397.05($C_{24}H_{16}BrN$ = 398.29) |
| Sub 1-B-3 | m/z = 549.11($C_{36}H_{24}BrN$ = 550.49) | Sub 1-B-4 | m/z = 550.10($C_{35}H_{23}BrN_2$ = 551.47) |
| Sub 1-B-5 | m/z = 473.08($C_{10}H_{20}BrN$ = 474.39) | Sub 1-B-6 | m/z = 474.07($C_{29}H_{19}BrN_2$ = 475.38) |
| Sub 1-B-7 | m/z = 447.06($C_{28}H_{18}BrN$ = 448.35) | Sub 1-B-8 | m/z = 447.06($C_{28}H_{18}BrN$ = 448.35) |
| Sub 1-B-9 | m/z = 447.06($C_{28}H_{18}BrN$ = 448.35) | Sub 1-B-10 | m/z = 497.08($C_{32}H_{20}BrN$ = 498.41) |
| Sub 1-B-11 | m/z = 497.08($C_{32}H_{20}BrN$ = 498.41) | Sub 1-B-12 | m/z = 397.05($C_{24}H_{16}BrN$ = 398.29) |
| Sub 1-B-13 | m/z = 638.14($C_{42}H_{27}BrN_2$ = 639.58) | Sub 1-B-14 | m/z = 579.07($C_{36}H_{22}BrNS$ = 580.54) |
| Sub 1-B-15 | m/z = 451.09($C_{28}H_{22}BrN$ = 452.38) | Sub 1-B-16 | m/z = 564.12($C_{36}H_{25}BrN_2$ = 565.50) |
| Sub 1-B-17 | m/z = 447.06($C_{28}H_{18}BrN$ = 448.35) | Sub 1-B-18 | m/z = 397.05($C_{24}H_{16}BrN$ = 398.29) |
| Sub 1-B-19 | m/z = 397.05($C_{24}H_{16}BrN$ = 398.29) | Sub 1-B-20 | m/z = 447.06($C_{28}H_{18}BrN$ = 448.35) |
| Sub 1-B-21 | m/z = 497.08($C_{32}H_{20}BrN$ = 498.41) | Sub 1-B-22 | m/z = 397.05($C_{24}H_{16}BrN$ = 398.29) |
| Sub 1-B-23 | m/z = 397.05($C_{24}H_{16}BrN$ = 398.29) | Sub 1-B-24 | m/z = 421.05($C_{26}H_{16}BrN$ = 422.32) |
| Sub 1-B-25 | m/z = 447.06($C_{28}H_{18}BrN$ = 448.35) | Sub 1-B-26 | m/z = 473.08($C_{30}H_{20}BrN$ = 474.39) |
| Sub 1-B-27 | m/z = 625.14($C_{42}H_{28}BrN$ = 626.58) | Sub 1-B-28 | m/z = 548.09($C_{35}H_{21}BrN_2$ = 549.46) |
| Sub 1-B-29 | m/z = 427.00($C_{24}H_{14}BrNS$ = 428.34) | Sub 1-B-30 | m/z = 527.03($C_{32}H_{18}BrNS$ = 528.46) |
| Sub 1-B-31 | m/z = 427.00($C_{24}H_{14}BrNS$ = 428.34) | Sub 1-B-32 | m/z = 427.00($C_{24}H_{14}BrNS$ = 428.34) |
| Sub 1-B-33 | m/z = 411.03($C_{24}H_{14}BrNO$ = 412.28) | Sub 1-B-34 | m/z = 411.03($C_{24}H_{14}BrNO$ = 412.28) |
| Sub 1-B-35 | m/z = 437.08($C_{27}H_{20}BrN$ = 438.36) | Sub 1-B-36 | m/z = 563.12($C_{37}H_{26}BrN$ = 564.51) |
| Sub 1-B-37 | m/z = 590.14($C_{38}H_{27}BrN_2$ = 591.54) | Sub 1-B-38 | m/z = 487.09($C_{31}H_{22}BrN$ = 488.42) |
| Sub 1-B-39 | m/z = 487.09($C_{31}H_{22}BrN$ = 488.42) | Sub 1-B-40 | m/z = 487.09($C_{31}H_{22}BrN$ = 488.42) |
| Sub 1-B-41 | m/z = 537.11($C_{35}H_{24}BrN$ = 538.48) | Sub 1-B-42 | m/z = 537.11($C_{35}H_{24}BrN$ = 538.48) |
| Sub 1-B-43 | m/z = 437.08($C_{27}H_{20}BrN$ = 438.36) | Sub 1-B-44 | m/z = 561.11($C_{37}H_{24}BrN$ = 562.50) |
| Sub 1-B-45 | m/z = 561.11($C_{37}H_{24}BrN$ = 562.50) | Sub 1-B-46 | m/z = 559.09($C_{37}H_{22}BrN$ = 560.48) |
| Sub 1-B-47 | m/z = 559.09($C_{37}H_{22}BrN$ = 560.48) | Sub 1-B-48 | m/z = 762.17($C_{52}H_{31}BrN_2$ = 763.72) |
| Sub 1-A-33 | m/z = 261.95($C_{12}H_7BrS$ = 263.15) | Sub 1-A-34 | m/z = 337.98($C_{18}H_{11}BrS$ = 339.25) |
| Sub 1-A-35 | m/z = 414.01($C_{24}H_{15}BrS$ = 415.35) | Sub 1-A-36 | m/z = 454.04($C_{27}H_{19}BrS$ = 455.41) |
| Sub 1-A-37 | m/z = 337.98($C_{18}H_{11}BrS$ = 339.25) | Sub 1-A-38 | m/z = 337.98($C_{18}H_{11}BrS$ = 339.25) |
| Sub 1-A-39 | m/z = 387.99($C_{22}H_{13}BrS$ = 389.31) | Sub 1-A-40 | m/z = 464.02($C_{28}H_{17}BrS$ = 465.41) |
| Sub 1-A-41 | m/z = 438.01($C_{26}H_{15}BrS$ = 439.37) | Sub 1-A-42 | m/z = 387.99($C_{22}H_{13}BrS$ = 389.31) |
| Sub 1-A-43 | m/z = 311.96($C_{16}H_9BrS$ = 313.21) | Sub 1-A-44 | m/z = 414.01($C_{24}H_{15}BrS$ = 415.35) |
| Sub 1-A-45 | m/z = 569.06($C_{33}H_{20}BrN_3S$ = 570.51) | Sub 1-A-46 | m/z = 579.07($C_{36}H_{22}BrNS$ = 580.54) |
| Sub 1-A-47 | m/z = 387.99($C_{22}H_{13}BrS$ = 389.31) | Sub 1-A-48 | m/z = 311.96($C_{16}H_9BrS$ = 313.21) |
| Sub 1-A-49 | m/z = 378.01($C_{21}H_{15}BrS$ = 379.32) | Sub 1-A-50 | m/z = 438.01($C_{26}H_{15}BrS$ = 439.37) |
| Sub 1-A-51 | m/z = 398.03($C_{24}H_{15}BrO$ = 399.29) | Sub 1-A-52 | m/z = 438.06($C_{27}H_{19}BrO$ = 439.35) |
| Sub 1-A-53 | m/z = 245.97($C_{12}H_7BrO$ = 247.09) | Sub 1-A-54 | m/z = 322($C_{18}H_{11}BrO$ = 323.19) |
| Sub 1-A-55 | m/z = 372.01($C_{22}H_{13}BrO$ = 373.25) | Sub 1-A-56 | m/z = 422.03($C_{26}H_{15}BrO$ = 423.31) |
| Sub 1-A-57 | m/z = 295.98($C_{16}H_9BrO$ = 297.15) | Sub 1-A-58 | m/z = 322($C_{19}H_{11}BrO$ = 323.19) |
| Sub 1-A-59 | m/z = 322($C_{18}H_{11}BrO$ = 323.19) | Sub 1-A-60 | m/z = 322($C_{18}H_{11}BrO$ = 323.19) |
| Sub 1-A-61 | m/z = 398.03($C_{24}H_{15}BrO$ = 399.29) | Sub 1-A-62 | m/z = 563.09($C_{36}H_{22}BrNO$ = 564.48) |
| Sub 1-A-63 | m/z = 228.07($C_{15}H_{13}Cl$ = 228.72) | Sub 1-A-64 | m/z = 228.07($C_{15}H_{13}Cl$ = 228.72) |
| Sub 1-A-65 | m/z = 228.07($C_{15}H_{13}Cl$ = 228.72) | Sub 1-A-66 | m/z = 380.13($C_{27}H_{21}Cl$ = 380.92) |
| Sub 1-A-67 | m/z = 348.05($C_{21}H_{17}Br$ = 349.27) | Sub 1-A-68 | m/z = 424.08($C_{27}H_{21}Br$ = 425.37) |
| Sub 1-A-69 | m/z = 500.11($C_{33}H_{25}Br$ = 501.47) | Sub 1-A-70 | m/z = 348.05($C_{21}H_{17}Br$ = 349.27) |
| Sub 1-A-71 | m/z = 500.11($C_{33}H_{25}Br$ = 501.47) | Sub 1-A-72 | m/z = 464.11($C_{30}H_{25}Br$ = 465.43) |

TABLE 1-continued

| Compound | FD-MS | Compound | FD-MS |
|---|---|---|---|
| Sub 1-A-73 | m/z = 448.08($C_{29}H_{21}Br$ = 449.39) | Sub 1-A-74 | m/z = 352.10($C_{25}H_{17}Cl$ = 352.86) |
| Sub 1-A-75 | m/z = 462.09($C_{31}H_{20}Cl_2$ = 463.40) | Sub 1-A-76 | m/z = 352.10($C_{25}H_{17}Cl$ = 352.86) |
| Sub 1-A-77 | m/z = 352.10($C_{25}H_{17}Cl$ = 352.86) | Sub 1-A-78 | m/z = 402.12(C29H19Cl = 402.92) |
| Sub 1-A-79 | m/z = 352.10($C_{25}H_{17}Cl$ = 352.86) | Sub 1-A-80 | m/z = 472.08($C_{31}H_{21}Br$ = 473.41) |
| Sub 1-A-81 | m/z = 550.13($C_{37}H_{27}Br$ = 551.53) | Sub 1-A-82 | m/z = 548.11($C_{37}H_{25}Br$ = 549.51) |
| Sub 1-A-83 | m/z = 472.08($C_{31}H_{21}Br$ = 473.41) | Sub 1-A-84 | m/z = 585.09($C_{36}H_{22}BrF_2N$ = 586.48) |
| Sub 1-A-85 | m/z = 394.04($C_{25}H_{15}Br$ = 395.30) | Sub 1-A-86 | m/z = 350.09($C_{25}H_{15}Cl$ = 350.85) |
| Sub 1-A-87 | m/z = 350.09($C_{25}H_{15}Cl$ = 350.85) | Sub 1-A-88 | m/z = 470.07($C_{31}H_{19}Br$ = 471.40) |
| Sub 1-A-89 | m/z = 470.07($C_{31}H_{19}Br$ = 471.40) | Sub 1-A-90 | m/z = 470.07($C_{31}H_{19}Br$ = 471.40) |
| Sub 1-A-91 | m/z = 470.07($C_{31}H_{19}Br$ = 471.40) | Sub 1-A-92 | m/z = 504.03($C_{31}H_{18}BrCl$ = 505.84) |
| Sub 1-A-93 | m/z = 470.07($C_{31}H_{19}Br$ = 471.40) | Sub 1-A-94 | m/z = 546.10($C_{37}H_{23}Br$ = 547.50) |
| Sub 1-A-95 | m/z = 400.10($C_{29}H_{17}Cl$ = 400.91) | Sub 1-A-96 | m/z = 476.13($C_{35}H_{21}Cl$ = 477.00) |
| Sub 1-A-97 | m/z = 400.10($C_{29}H_{17}Cl$ = 400.91) | Sub 1-A-98 | m/z = 400.10($C_{29}H_{17}Cl$ = 400.91) |
| Sub 1-A-99 | m/z = 400.10($C_{29}H_{17}Cl$ = 400.91) | Sub 1-A-100 | m/z = 400.10($C_{29}H_{17}Cl$ = 400.91) |
| Sub 1-A-101 | m/z = 400.10($C_{29}H_{17}Cl$ = 400.91) | Sub 1-A-102 | m/z = 400.10($C_{29}H_{17}Cl$ = 400.91) |
| Sub 1-A-103 | m/z = 478.12($C_{33}H_{19}ClN_2$ = 478.98) | Sub 1-A-104 | m/z = 400.10($C_{29}H_{17}Cl$ = 400.91) |
| Sub 1-A-105 | m/z = 400.10($C_{29}H_{17}Cl$ = 400.91) | Sub 1-A-106 | m/z = 400.10($C_{29}H_{17}Cl$ = 400.91) |
| Sub 1-A-107 | m/z = 400.10($C_{29}H_{17}Cl$ = 400.91) | Sub 1-A-108 | m/z = 400.10($C_{29}H_{17}Cl$ = 400.91) |
| Sub 1-A-109 | m/z = 526.15($C_{39}H_{23}Cl$ = 527.06) | Sub 1-A-110 | m/z = 400.10($C_{29}H_{17}Cl$ = 400.91) |
| Sub 1-A-111 | m/z = 400.10($C_{29}H_{17}Cl$ = 400.91) | Sub 1-A-112 | m/z = 400.10($C_{29}H_{17}Cl$ = 400.91) |
| Sub 1-A-113 | m/z = 566.14($C_{41}H_{23}ClO$ = 567.08) | Sub 1-A-114 | m/z = 400.10($C_{29}H_{17}Cl$ = 400.91) |
| Sub 1-A-115 | m/z = 400.10($C_{29}H_{17}Cl$ = 400.91) | Sub 1-A-116 | m/z = 400.10($C_{29}H_{17}Cl$ = 400.91) |
| Sub 1-A-117 | m/z = 400.10($C_{29}H_{17}Cl$ = 400.91) | Sub 1-A-118 | m/z = 400.10($C_{29}H_{17}Cl$ = 400.91) |
| Sub 1-A-119 | m/z = 400.10($C_{29}H_{17}Cl$ = 400.91) | Sub 1-A-120 | m/z = 400.10($C_{29}H_{17}Cl$ = 400.91) |
| Sub 1-A-121 | m/z = 400.10($C_{29}H_{17}Cl$ = 400.91) | Sub 1-A-122 | m/z = 400.10($C_{29}H_{17}Cl$ = 400.91) |
| Sub 1-A-123 | m/z = 425.10($C_{30}H_{16}ClN$ = 425.92) | Sub 1-A-124 | m/z = 400.10($C_{29}H_{17}Cl$ = 400.91) |
| Sub 1-A-125 | m/z = 400.10($C_{29}H_{17}Cl$ = 400.91) | Sub 1-A-126 | m/z = 400.10($C_{29}H_{17}Cl$ = 400.91) |
| Sub 1-A-127 | m/z = 400.10($C_{29}H_{17}Cl$ = 400.91) | Sub 1-A-128 | m/z = 400.10($C_{29}H_{17}Cl$ = 400.91) |
| Sub 1-A-129 | m/z = 400.10($C_{29}H_{17}Cl$ = 400.91) | Sub 1-A-130 | m/z = 400.10($C_{29}H_{17}Cl$ = 400.91) |
| Sub 1-A-131 | m/z = 400.10($C_{29}H_{17}Cl$ = 400.91) | Sub 1-A-132 | m/z = 520.08($C_{35}H_{21}Br$ = 521.46) |
| Sub 1-A-133 | m/z = 520.08($C_{35}H_{21}Br$ = 521.46) | Sub 1-A-134 | m/z = 520.08($C_{35}H_{21}Br$ = 521.46) |
| Sub 1-A-135 | m/z = 510.09($C_{35}H_{20}Cl_2$ = 511.45) | Sub 1-A-136 | m/z = 610.09($C_{41}H_{23}BrO$ = 611.54) |
| Sub 1-A-137 | m/z = 626.07($C_{41}H_{23}BrS$ = 627.60) | Sub 1-A-138 | m/z = 636.15($C_{44}H_{29}Br$ = 637.62) |
| Sub 1-A-139 | m/z = 450.12($C_{33}H_{19}Cl$ = 450.97) | Sub 1-A-140 | m/z = 450.12($C_{33}H_{19}Cl$ = 450.97) |
| Sub 1-A-141 | m/z = 500.13($C_{37}H_{21}Cl$ = 501.03) | Sub 1-A-142 | m/z = 450.12($C_{33}H_{19}Cl$ = 450.97) |
| Sub 1-A-143 | m/z = 450.12($C_{33}H_{19}Cl$ = 450.97) | Sub 1-A-144 | m/z = 670.13($C_{47}H_{27}Br$ = 671.64) |
| Sub 1-A-145 | m/z = 696.15($C_{49}H_{29}Br$ = 697.68) | Sub 1-A-146 | m/z = 772.15($C_{53}H_{29}BrN_2$ = 773.73) |
| Sub 1-A-148 | m/z = 348.05($C_{21}H_{17}Br$ = 349.27) | Sub 1-A-149 | m/z = 424.08($C_{27}H_{21}Br$ = 425.37) |
| Sub 1-A-152 | m/z = 396.05($C_{25}H_{17}Br$ = 397.32) | Sub 1-A-154 | m/z = 322.04($C_{19}H_{15}B$ r= 323.23) |
| Sub 1A-155 | m/z = 231.99(C12H9Br = 233.11) | Sub 1-A-156 | m/z = 282(C16H11Br = 283.17) |
| Sub 1-A-157 | m/z = 332.02(C20H13Br = 333.23) | Sub 1-A-161 | m/z = 384.05(C24H17Br = 385.3) |

Illustration of Synthesis of Sub 2

Sub 2 of Reaction Formula 1 may be synthesized through, but is not limited to, a reaction path of the following Reaction Formula 8.

[Reaction Formula 8]

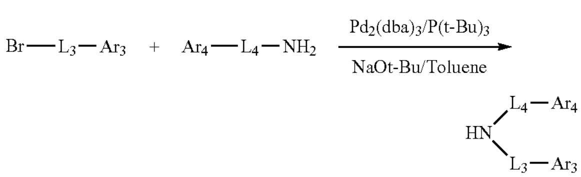

Sub 2

Synthesis of Sub 2-1

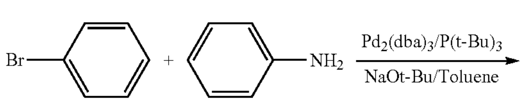

-continued

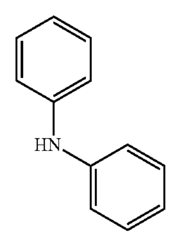

Bromobenzene (37.1 g, 236.2 mmol) was added to a round bottom flask, and then dissolved with toluene (2200 ml). Afterwards, aniline (20 g, 214.8 mmol), $Pd_2(dba)_3$ (9.83 g, 10.7 mmol), $P(t\text{-}Bu)_3$ (4.34 g, 21.5 mmol), and NaOt-Bu (62 g, 644.3 mmol) were sequentially added, followed by stirring at 100° C. When the reaction was completed, extraction was performed with ether and water, and then an organic layer was dried with $MgSO_4$ and concentrated. A resultant compound was subjected to silica gel column chromatography and recrystallization, thereby creating a product 28 g (yield: 77%).

Synthesis of Sub 2-80

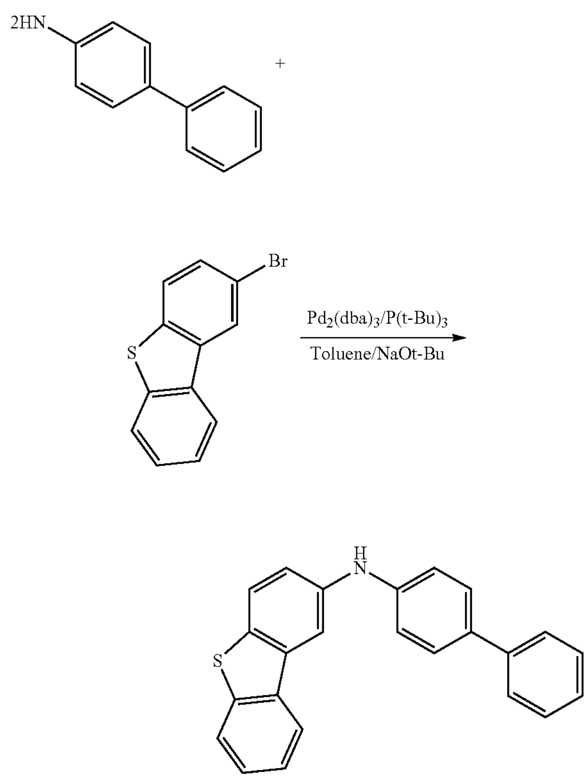

[1,1'-biphenyl]-4-amine (15 g, 88.64 mmol), 2-bromodibenzo[b,d]thiophene (23.32 g, 88.64 mmol), $Pd_2(dba)_3$ (2.43 g, 2.66 mmol), $P(t\text{-}Bu)_3$ (17.93 g, 88.64 mmol), NaOt-Bu (17.04 g, 177.27 mmol), and toluene (886 ml) were added to a round bottom flask, and then subjected to the same experimental method as in Sub 2-1, thereby creating a product 24.61 g (yield: 79%).

Synthesis of Sub 2-134

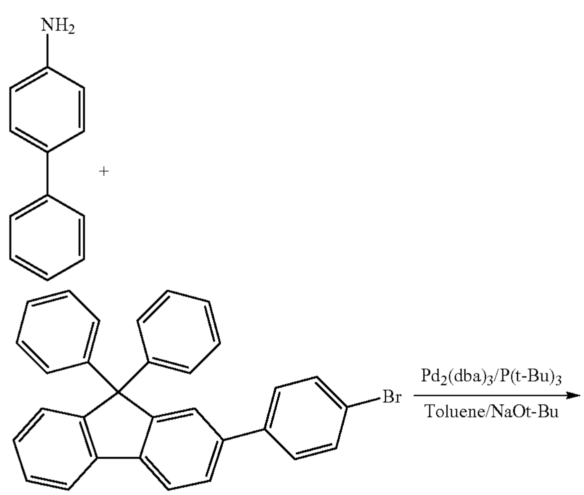

-continued

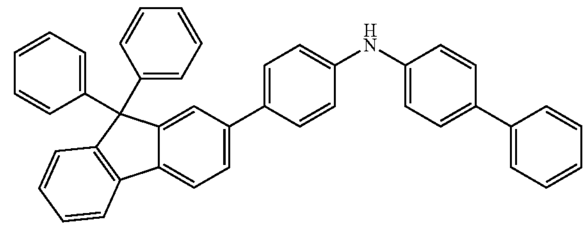

[1,1'-biphenyl]-4-amine (15, 88.6 mmol), 2-(4-bromophenyl)-9,9-diphenyl-9H-fluorene (46.2 g, 97.5 mmol), $Pd_2(dba)_3$ (4.06 g, 4.43 mmol), $P(t\text{-}Bu)_3$ (1.8 g, 8.86 mmol), NaOt-Bu (28.1 g, 292.5 mmol), and toluene (931 ml) were added to a round bottom flask, and subjected to the same experimental method as in Sub 2-1, thereby creating a product 34.9 g (yield: 70%).

Example of Synthesis of Sub 2-222

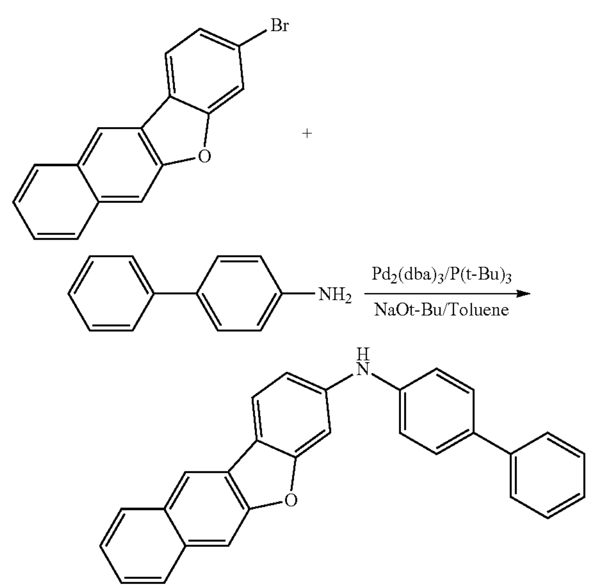

3-bromonaphtho[2,3-b]benzofuran (15 g, 50.48 mmol), [1,1'-biphenyl]-4-amine (8.54 g, 50.48 mmol), $Pd_2(dba)_3$ (1.39 g, 1.51 mmol), $P(t\text{-}Bu)_3$ (10.21 g, 50.48 mmol), NaOt-Bu (9.70 g, 100.96 mmol), and toluene (505 ml) were added to a round bottom flask, and subjected to the same experimental method as in Sub 2-1, thereby creating a product 13.82 g (yield: 71%).

Sub 2 may have, but is not limited to, the following examples.

Sub 2-1

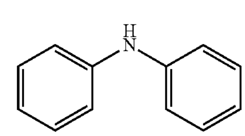

-continued
Sub 2-2
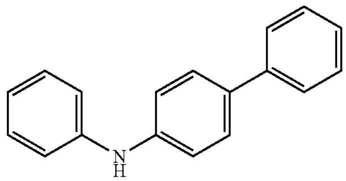
Sub 2-3
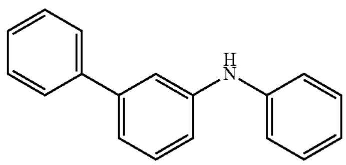
Sub 2-4
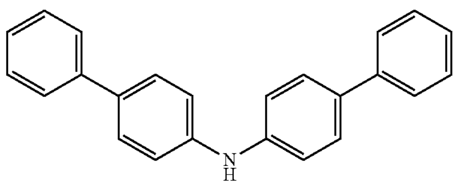
Sub 2-5
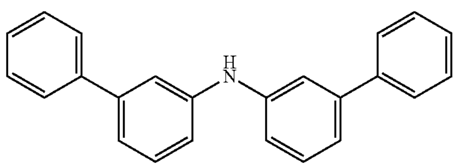
Sub 2-6
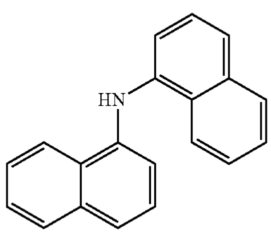
Sub 2-7
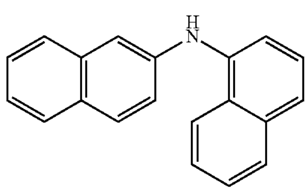
Sub 2-8
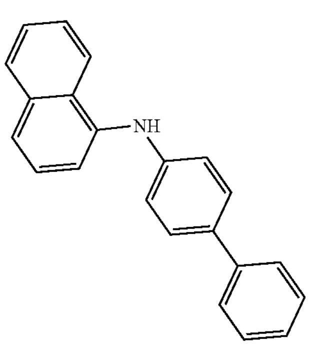
-continued
Sub 2-9
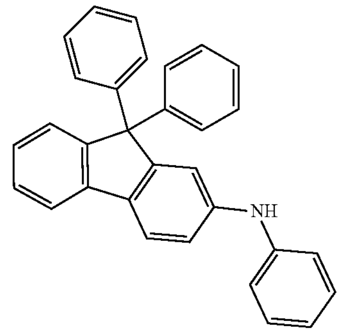
Sub 2-10
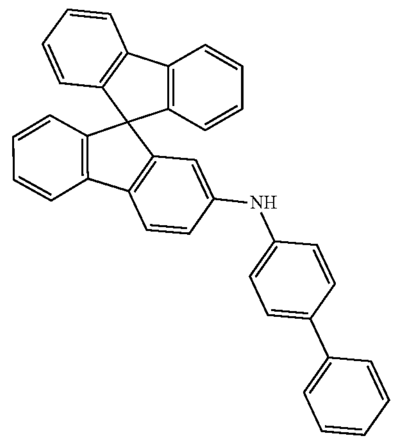
Sub 2-11
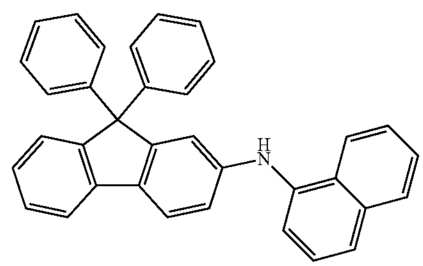
Sub 2-12
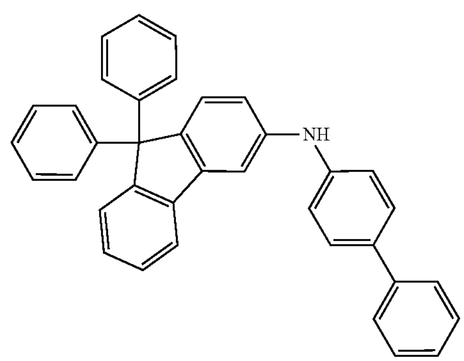
Sub 2-13
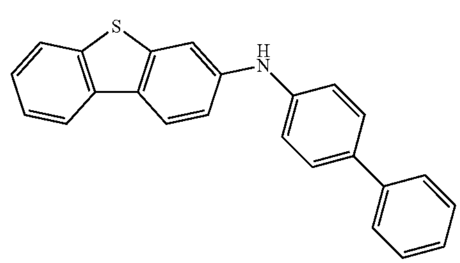

-continued
Sub 2-14
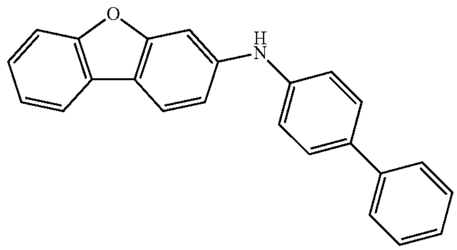
Sub 2-15
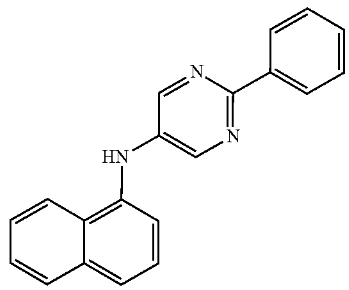
Sub 2-16
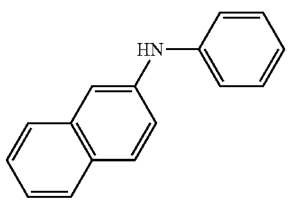
Sub 2-17
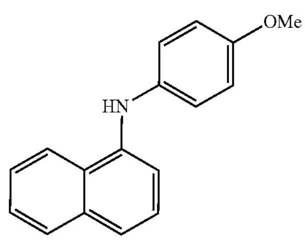
Sub 2-18
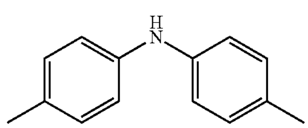
Sub 2-19
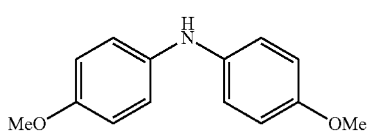
Sub 2-20
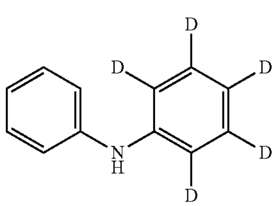
Sub 2-21
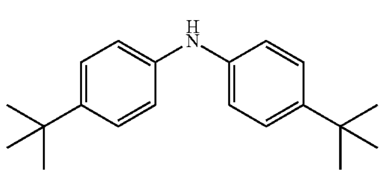
-continued
Sub 2-22
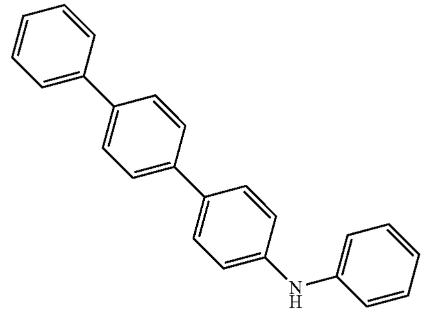
Sub 2-23
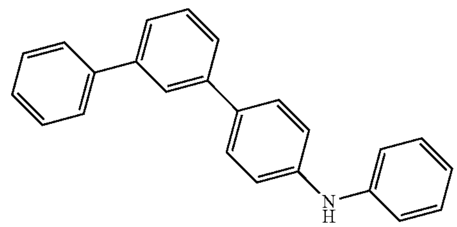
Sub 2-24
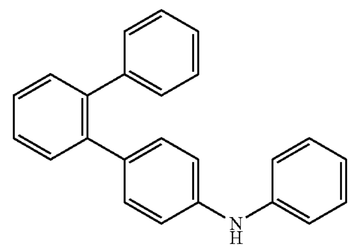
Sub 2-25
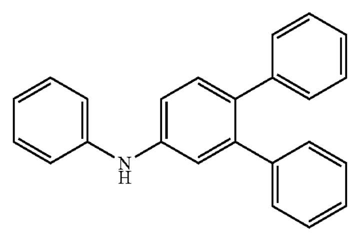
Sub 2-26
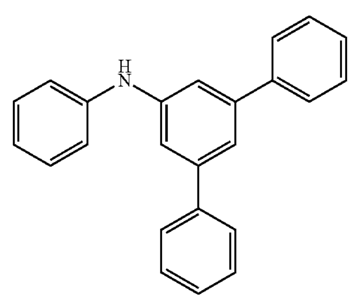
Sub 2-27
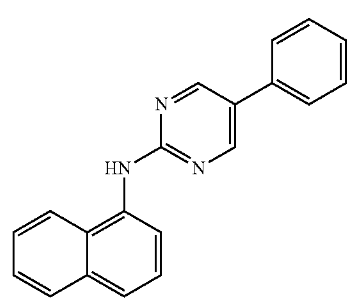

-continued
Sub-2-28
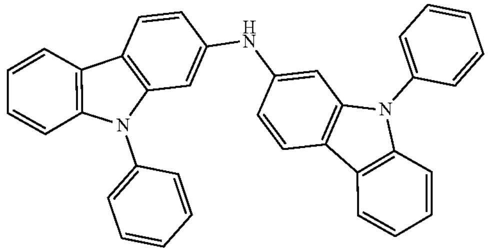
Sub 2-29
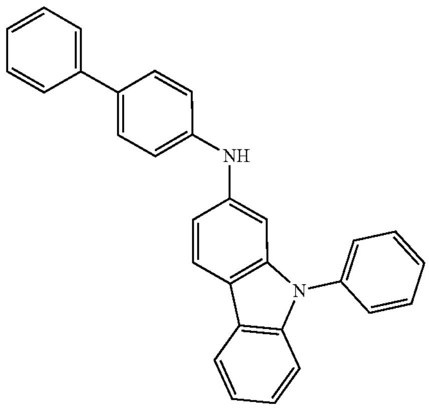
Sub 2-30
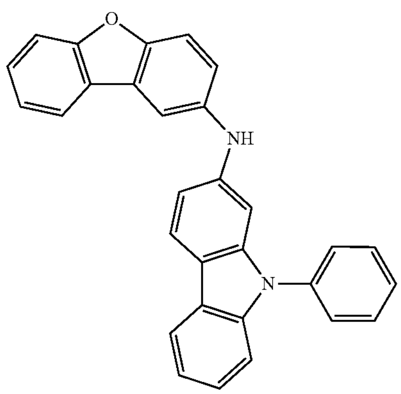
Sub 2-31
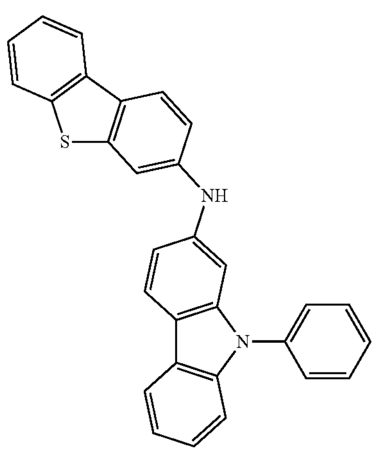
-continued
Sub 2-32
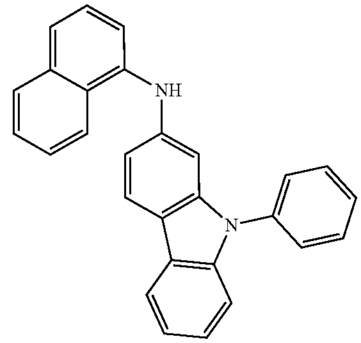
Sub 2-33
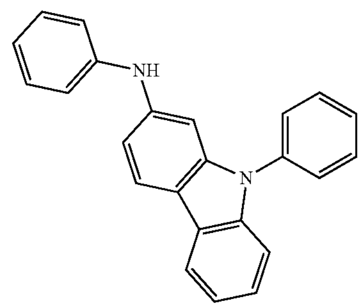
Sub 2-34
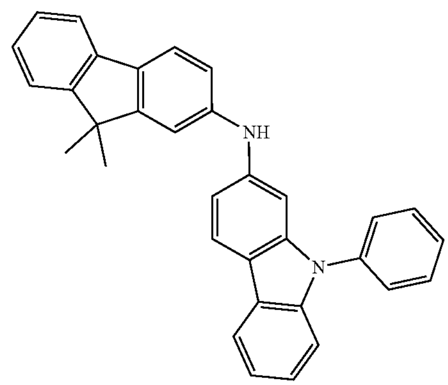
Sub 2-35
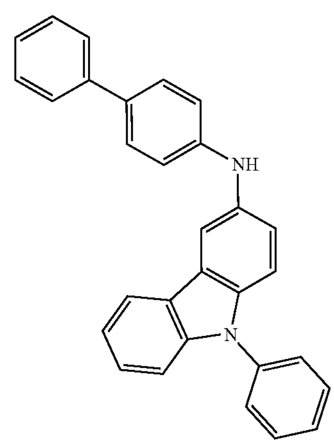

-continued
Sub 2-36
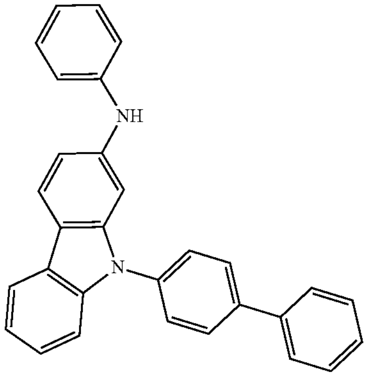
Sub 2-37
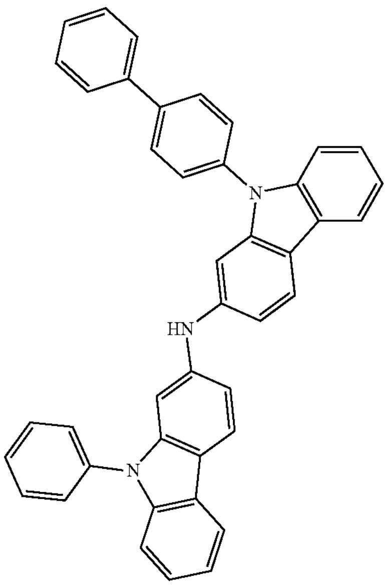
Sub 2-38
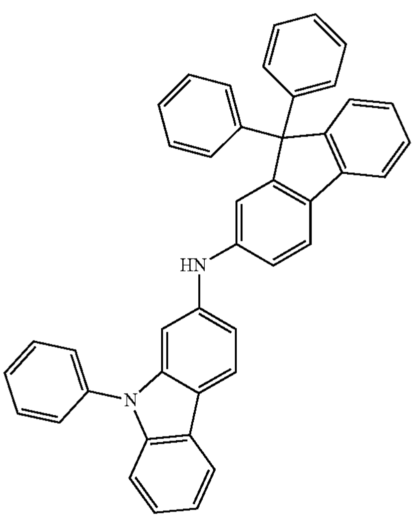
-continued
Sub 2-39
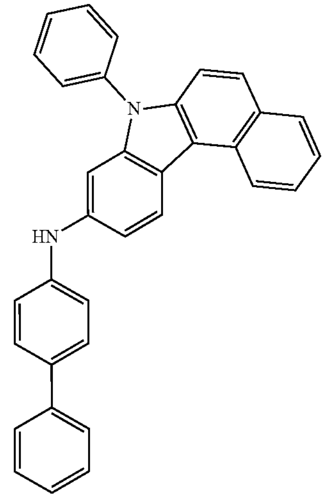
Sub 2-40
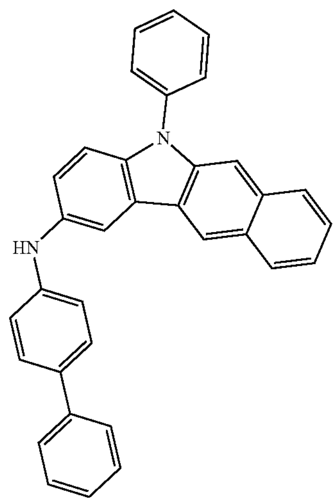
Sub 2-41
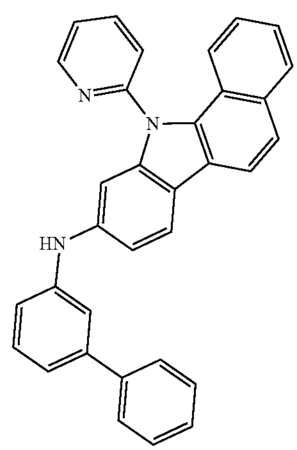

-continued
Sub 2-42
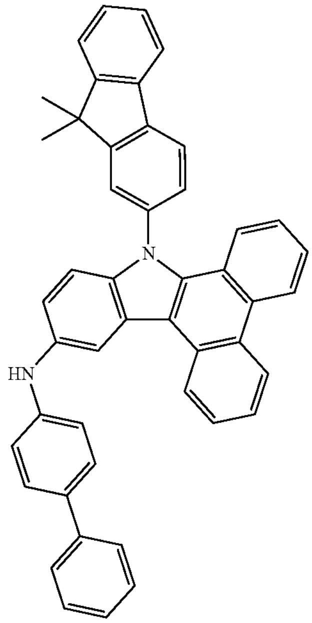
Sub 2-43
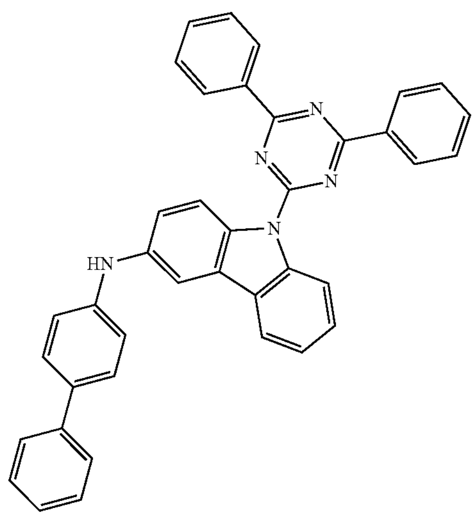
Sub 2-44
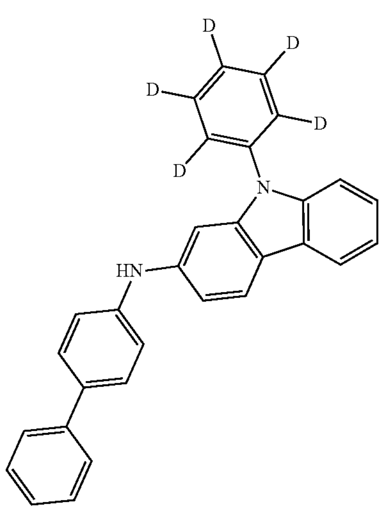
-continued
Sub 2-45
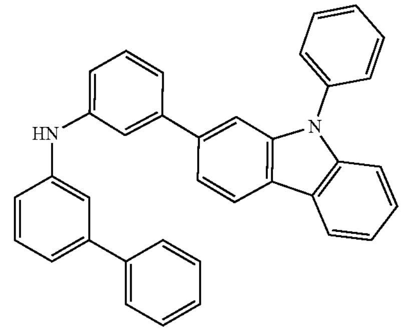
Sub 2-46
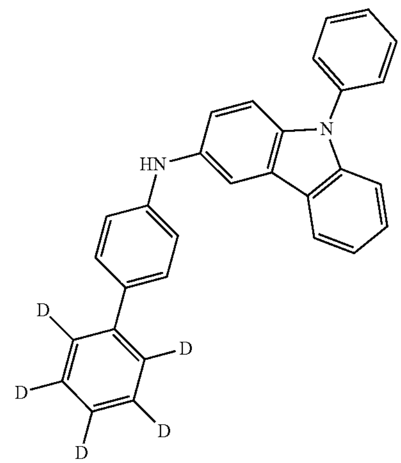
Sub 2-47
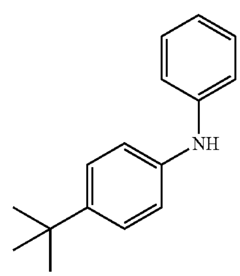
Sub 2-48
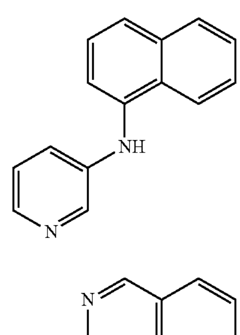
Sub 2-49
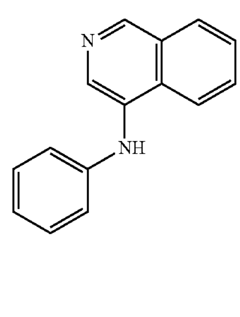

Sub 2-50
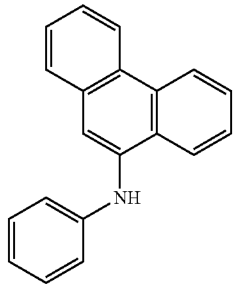
Sub 2-51
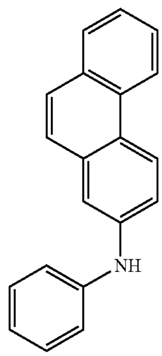
Sub 2-52
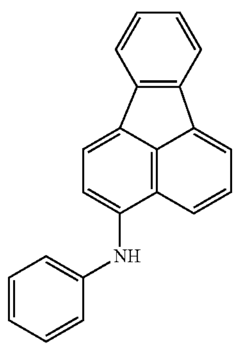
Sub 2-53
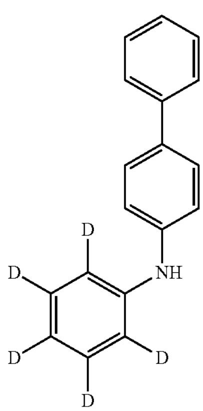
Sub 2-54
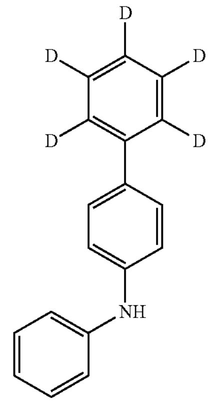
Sub 2-55
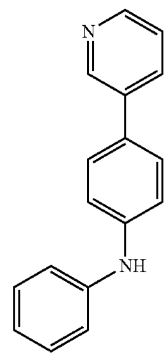
Sub 2-56
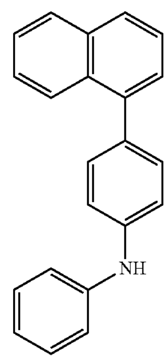
Sub 2-57
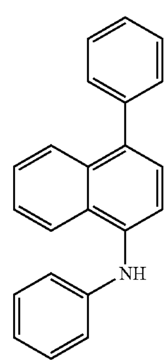

-continued
Sub 2-58
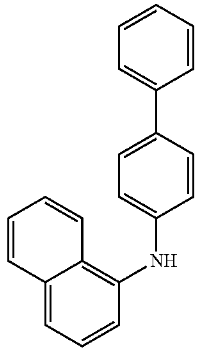
Sub 2-59
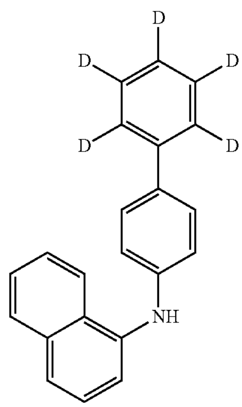
Sub 2-60
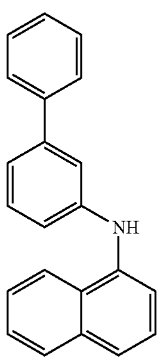
Sub 2-61
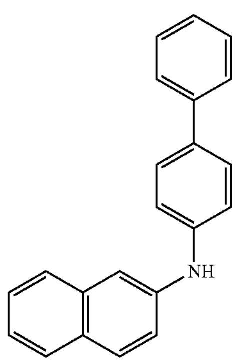
-continued
Sub 2-62
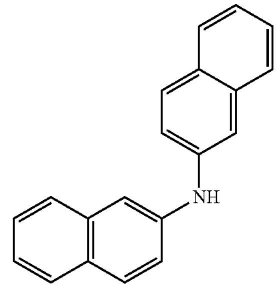
Sub 2-63
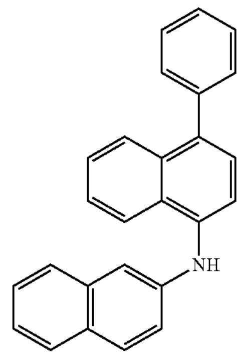
Sub 2-64
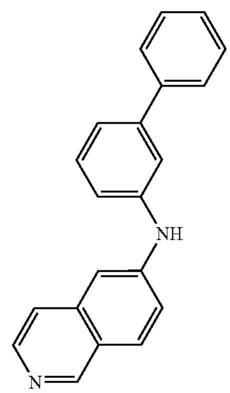
Sub 2-65
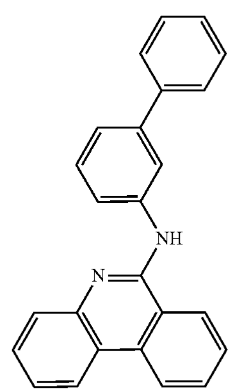

-continued
Sub 2-66
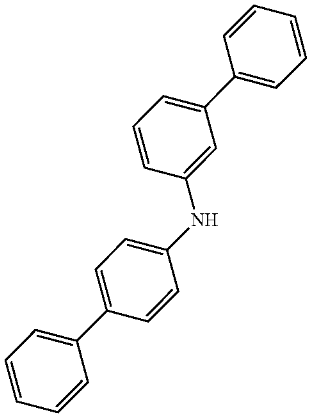
Sub 2-67
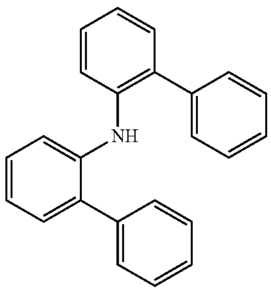
Sub 2-68
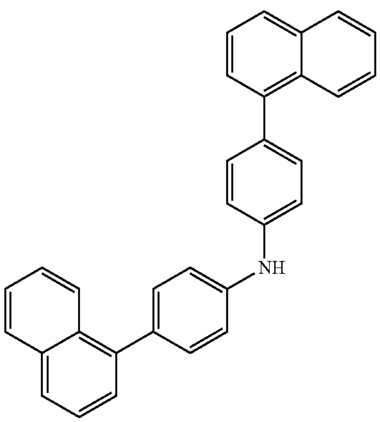
Sub 2-69
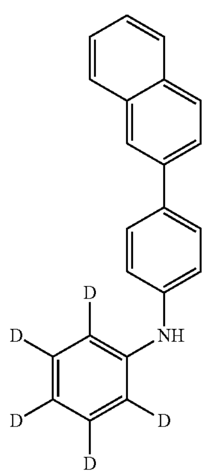
-continued
Sub 2-70
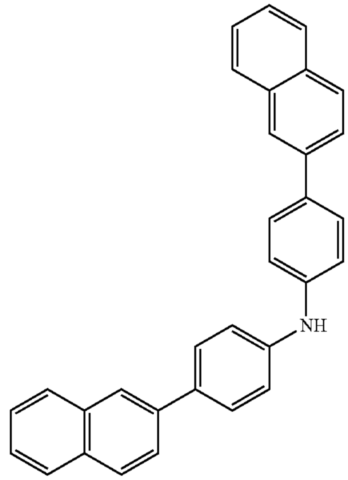
Sub 2-71
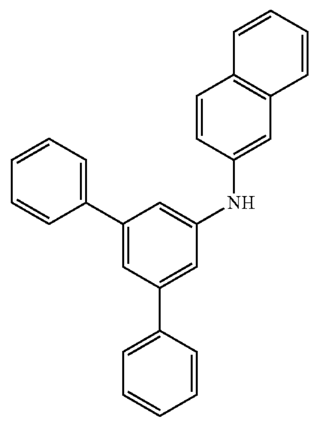
Sub 2-72
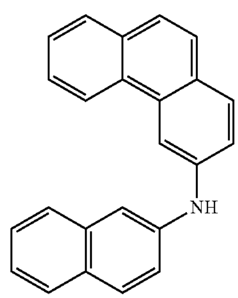
Sub 2-73
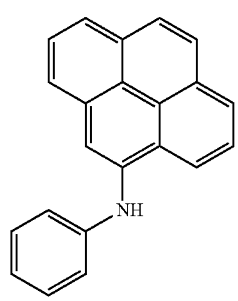

-continued
Sub 2-74
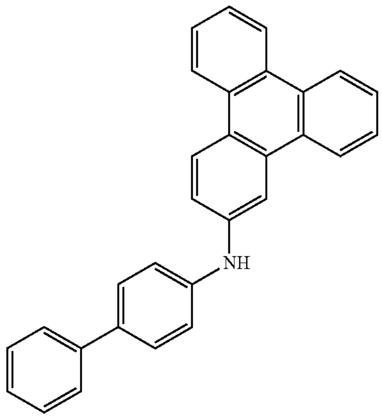
Sub 2-75
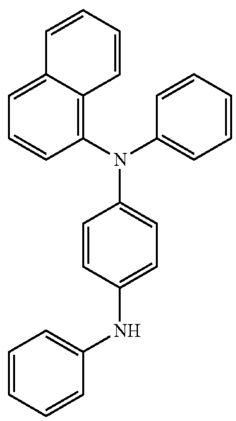
Sub 2-76
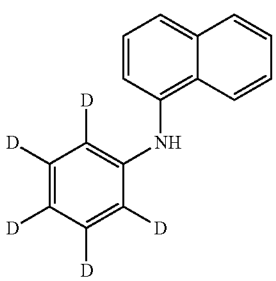
Sub 2-77
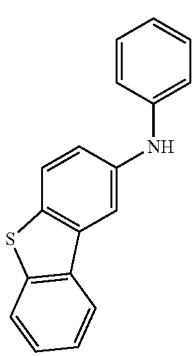
-continued
Sub 2-78
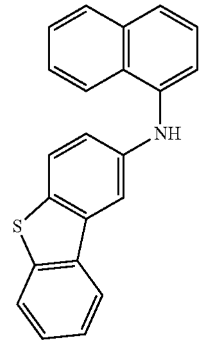
Sub 2-79
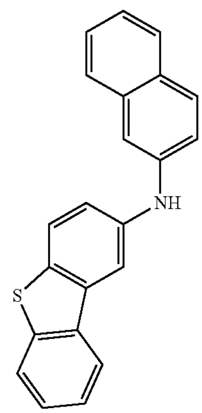
Sub 2-80
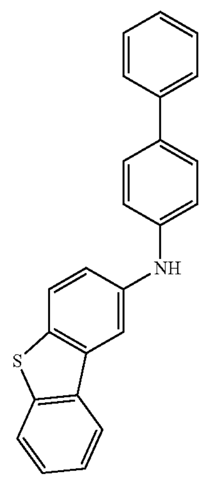
Sub 2-81
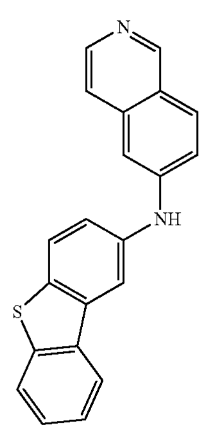

-continued
Sub 2-82
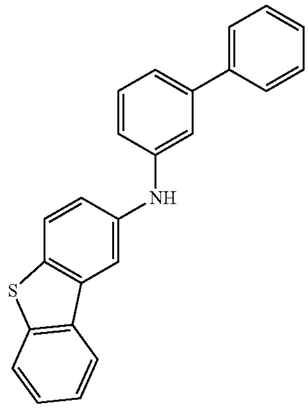
Sub 2-83
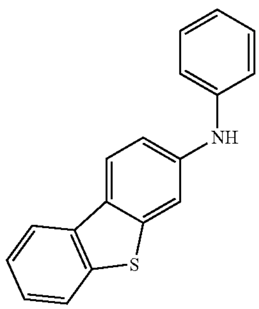
Sub 2-84
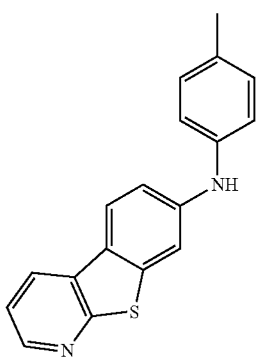
Sub 2-85
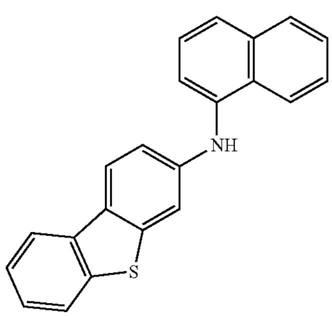
-continued
Sub 2-86
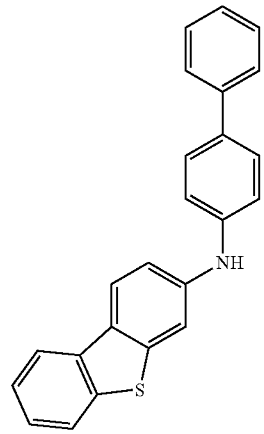
Sub 2-87
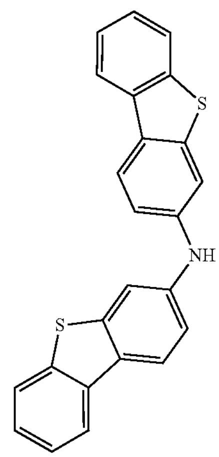
Sub 2-88
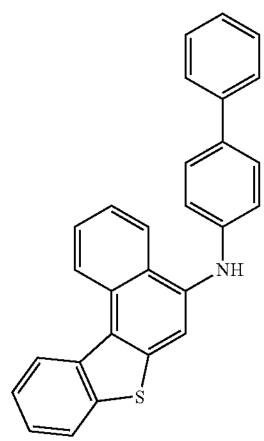
Sub 2-89
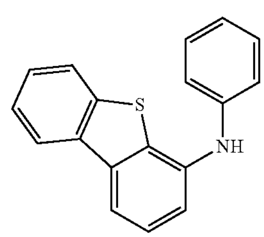

-continued
Sub 2-90
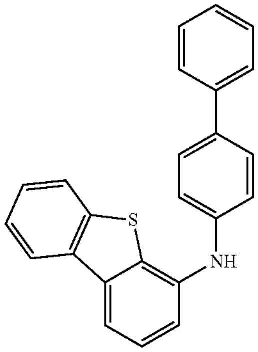
Sub 2-91
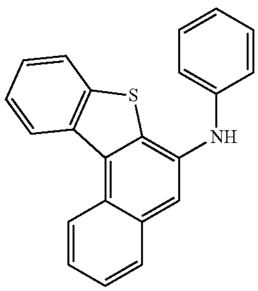
Sub 2-92
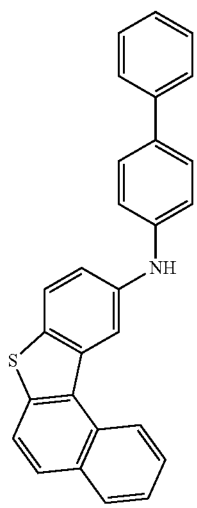
Sub 2-93
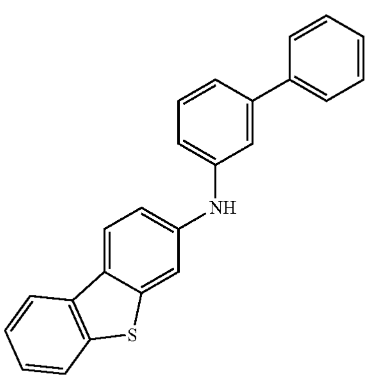
-continued
Sub 2-94
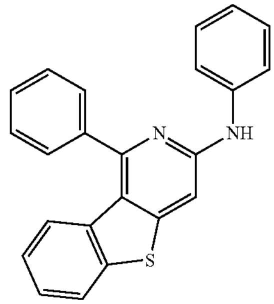
Sub 2-95
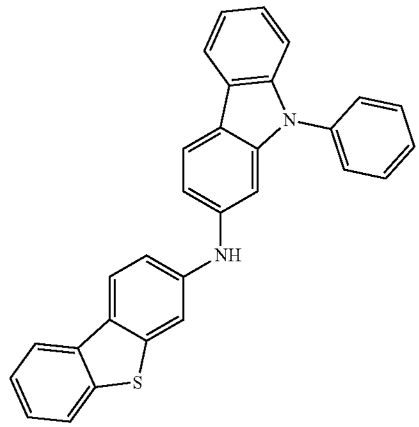
Sub 2-96
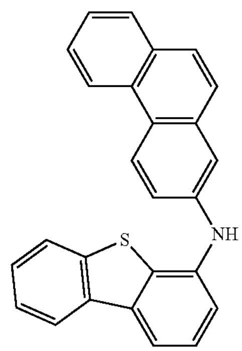
Sub 2-97
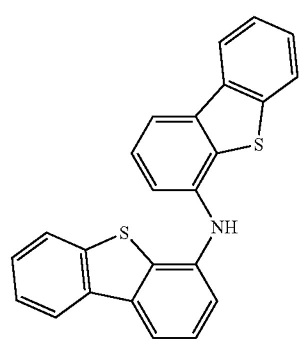

-continued
Sub 2-98
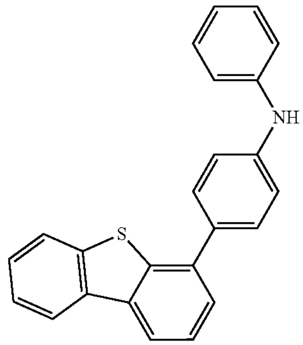
Sub 2-99
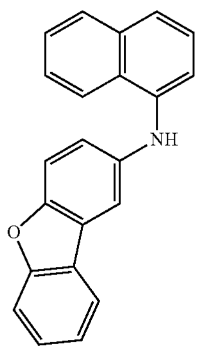
Sub 2-100
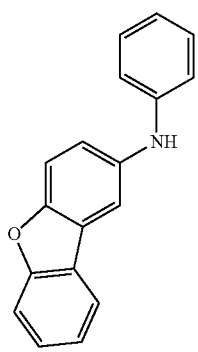
Sub 2-101
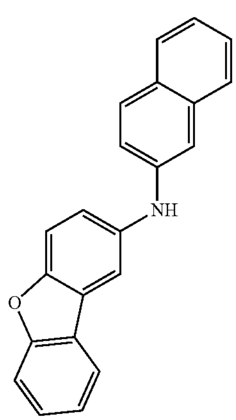
-continued
Sub 2-102
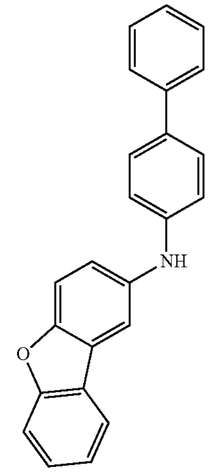
Sub 2-103
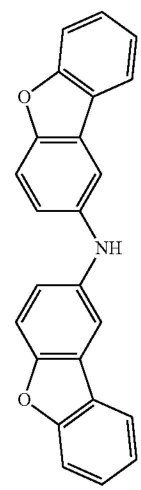
Sub 2-104
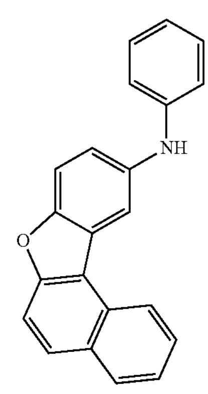

-continued
Sub 2-105
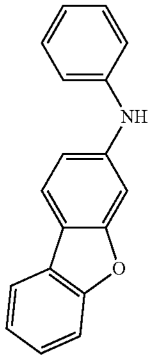
Sub 2-106
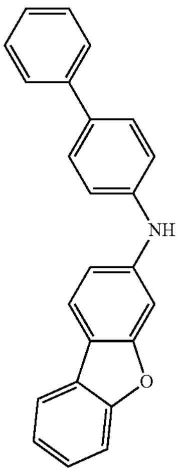
Sub 2-107
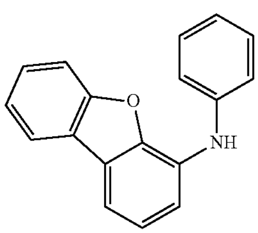
Sub 2-108
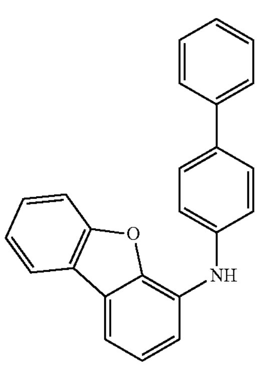
-continued
Sub 2-109
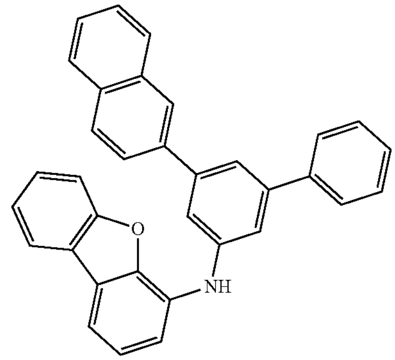
Sub 2-110
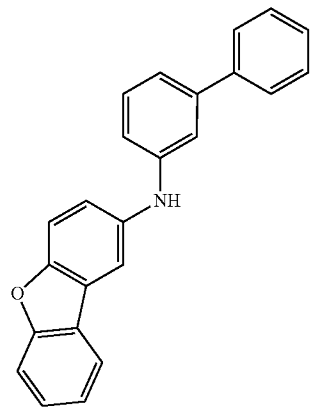
Sub 2-111
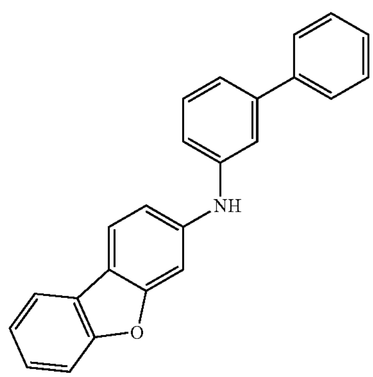
Sub 2-112
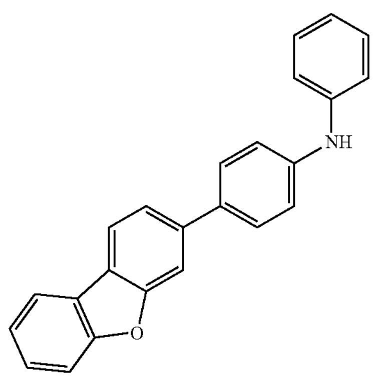

-continued
Sub 2-113
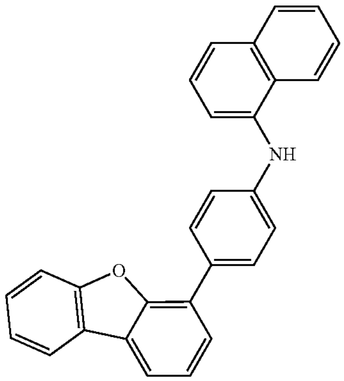
Sub 2-114
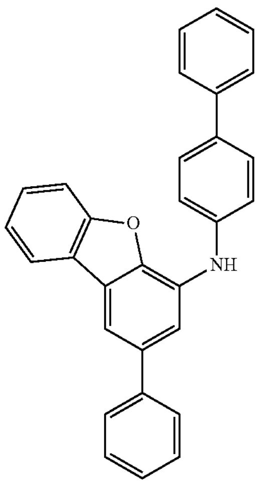
Sub 2-115
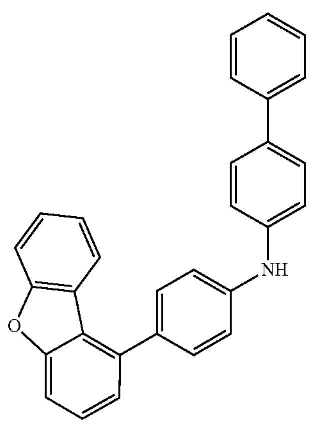
Sub 2-116
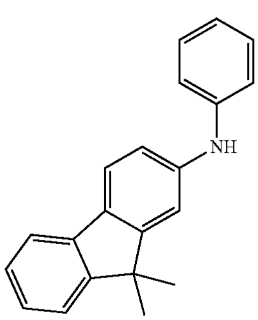
-continued
Sub 2-117
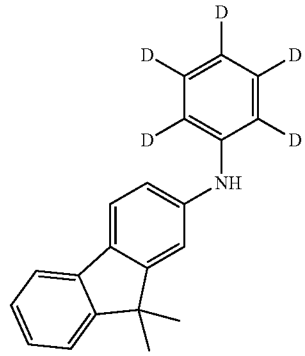
Sub 2-118
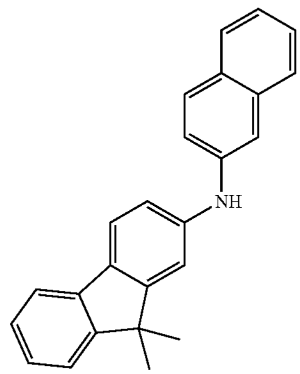
Sub 2-119
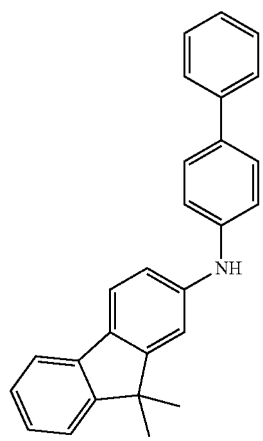
Sub 2-120
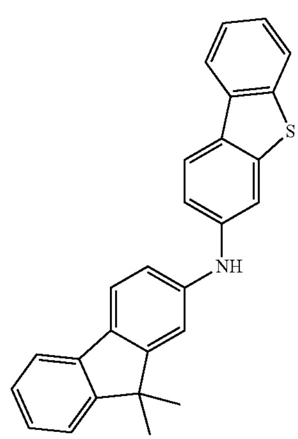

-continued
Sub 2-121
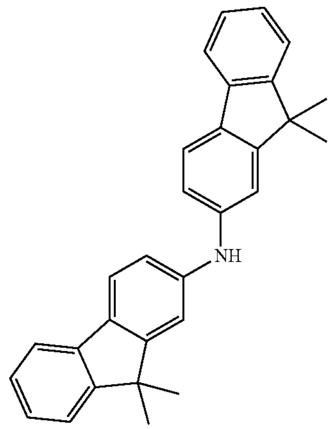
Sub 2-122
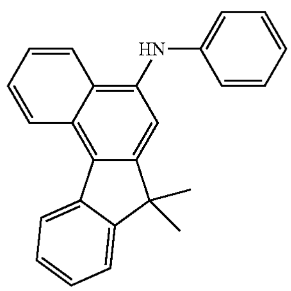
Sub 2-123
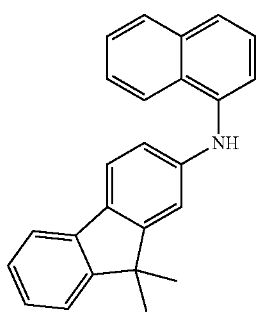
Sub 2-124
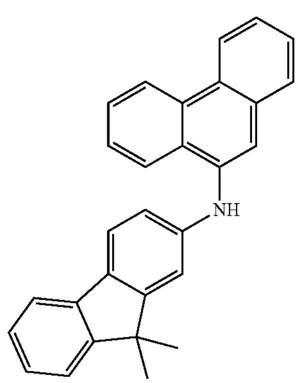
-continued
Sub 2-125
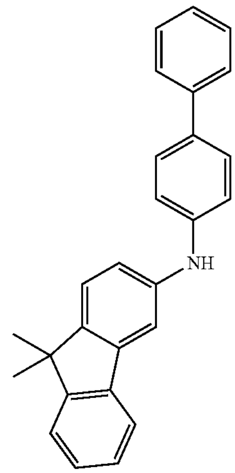
Sub 2-126
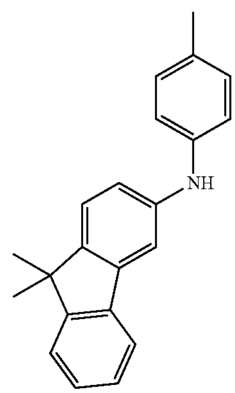
Sub 2-127
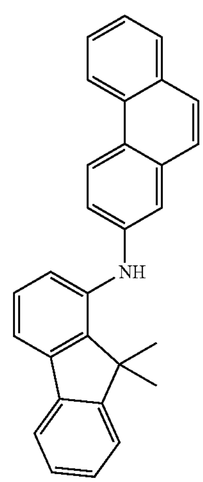

Sub 2-128
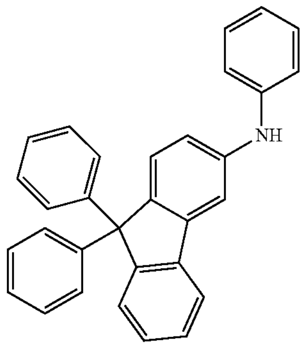
Sub 2-129
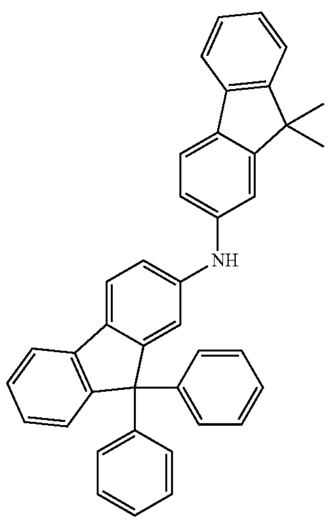
Sub 2-130
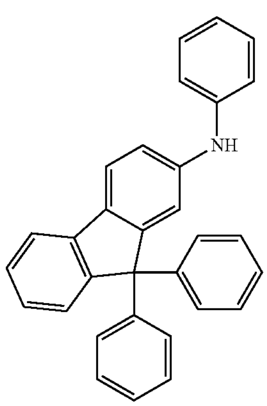
Sub 2-131
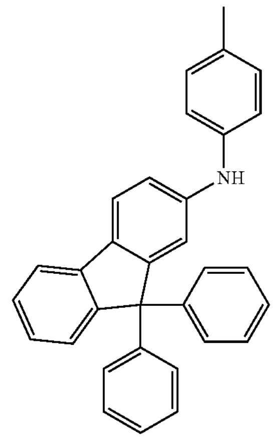
Sub 2-132
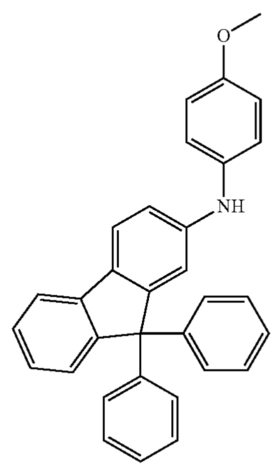
Sub 2-133
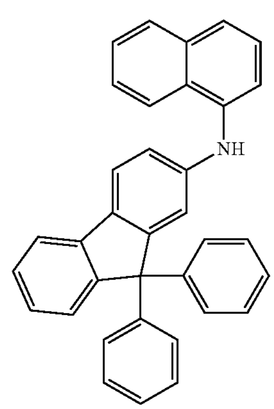

-continued
Sub 2-134
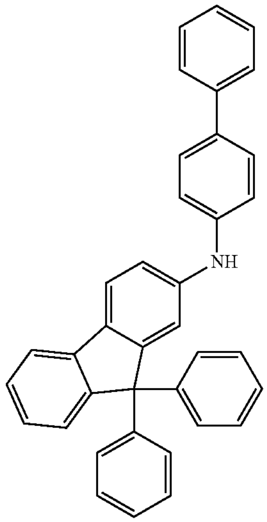
Sub 2-135
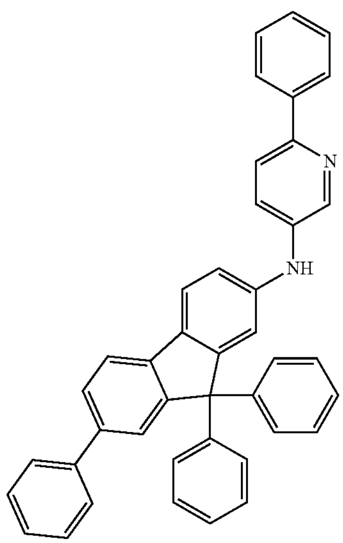
Sub 2-136
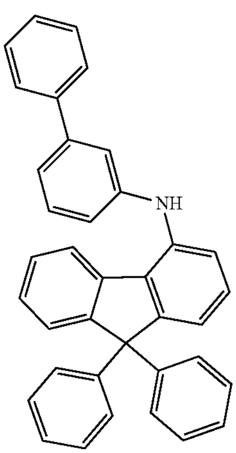
-continued
Sub 2-137
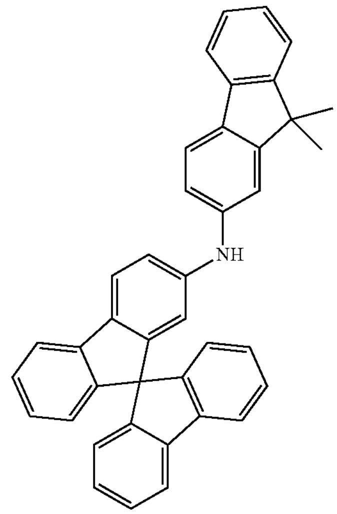
Sub 2-138
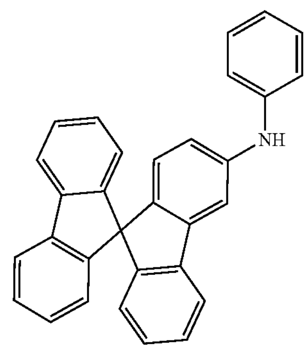
Sub 2-139
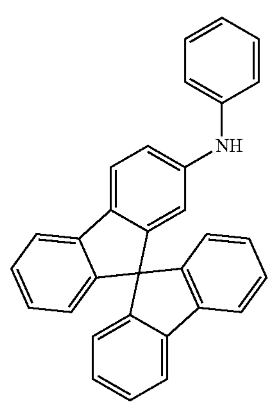

-continued
Sub 2-140
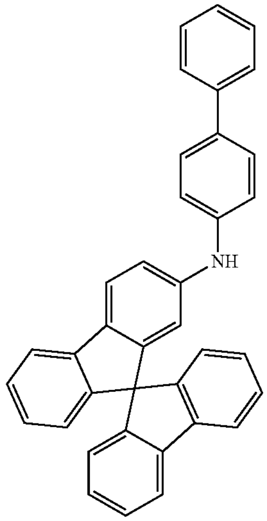
Sub 2-141
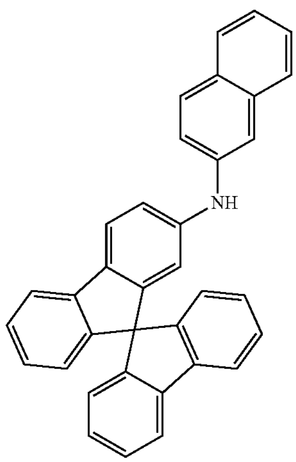
Sub 2-142
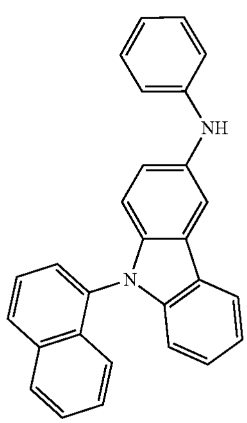
-continued
Sub 2-143
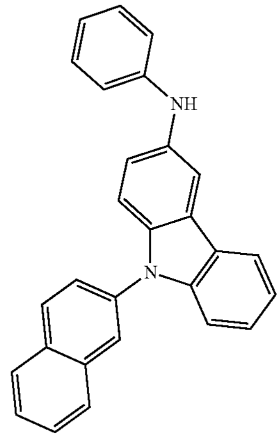
Sub 2-144
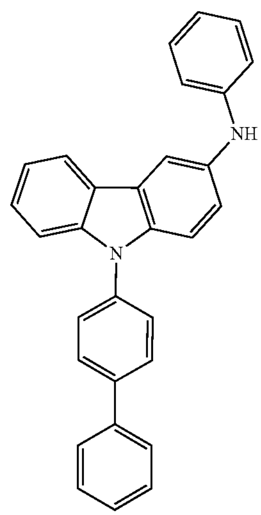
Sub 2-145
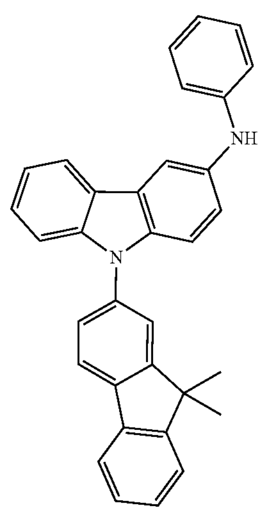

-continued
Sub 2-146
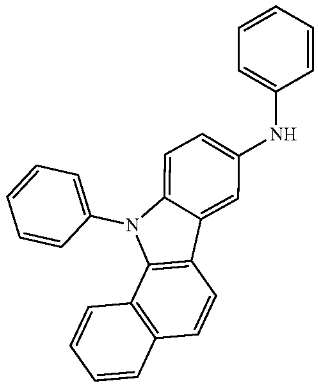
Sub 2-147
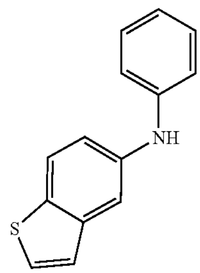
Sub 2-148
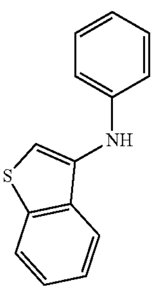
Sub 2-149
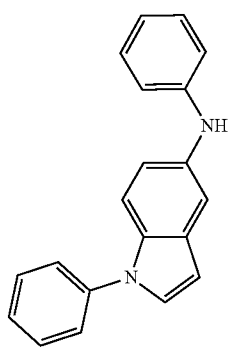
Sub 2-150
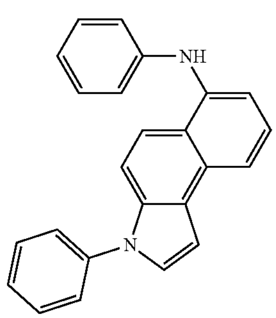
-continued
Sub 2-151
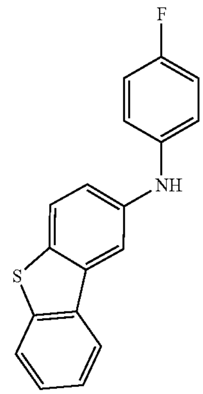
Sub 2-152
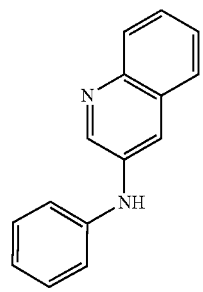
Sub 2-153
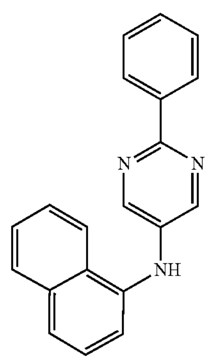
Sub 2-154
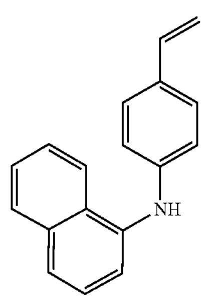

-continued
Sub 2-155
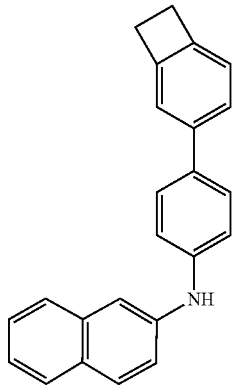
Sub 2-156
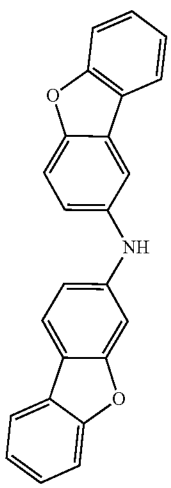
Sub 2-157
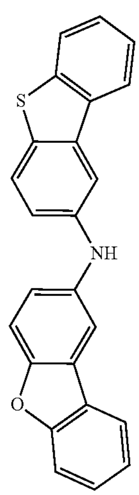
-continued
Sub 2-158
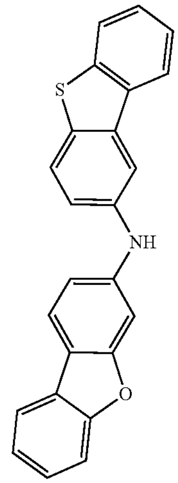
Sub 2-159
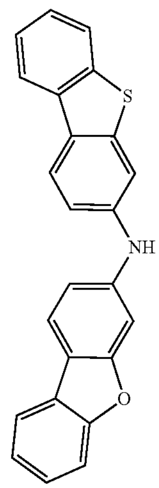
Sub 2-160
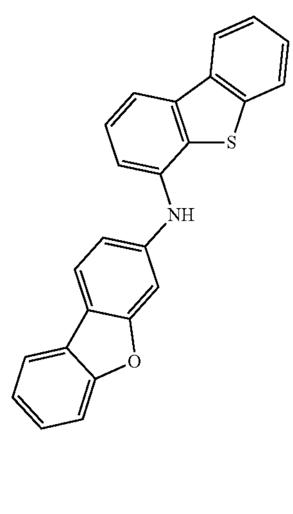

-continued
Sub 2-161
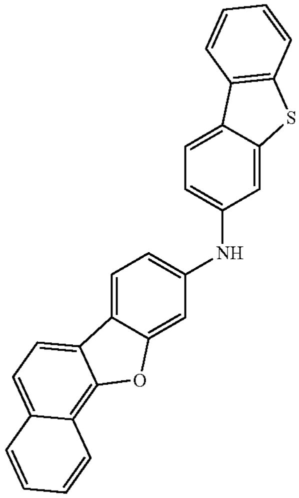
Sub 2-162
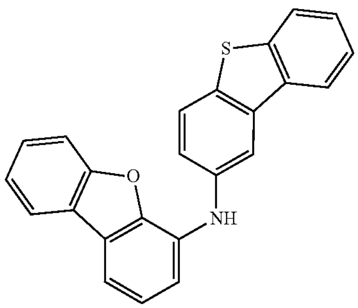
Sub 2-163
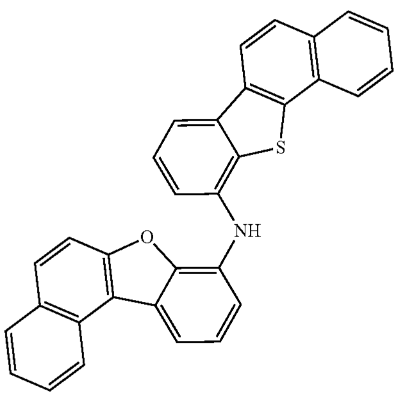
Sub 2-164
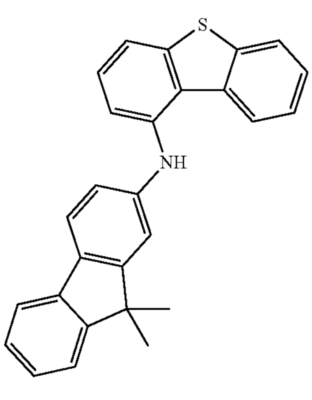
-continued
Sub 2-165
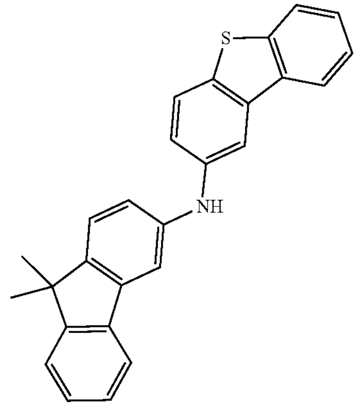
Sub 2-166
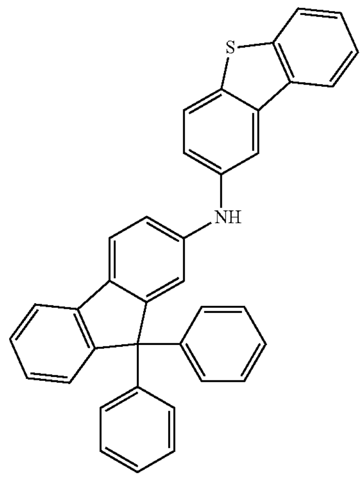
Sub 2-167
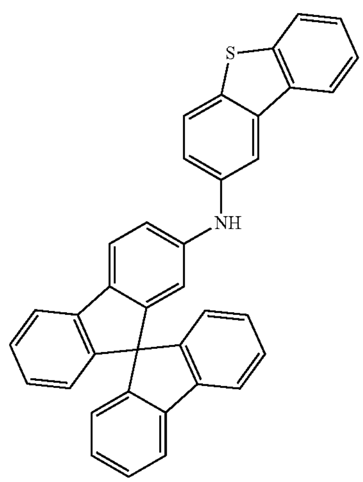

-continued
Sub 2-168
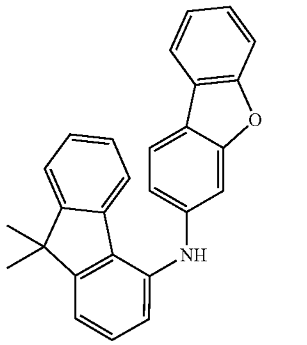
Sub 2-169
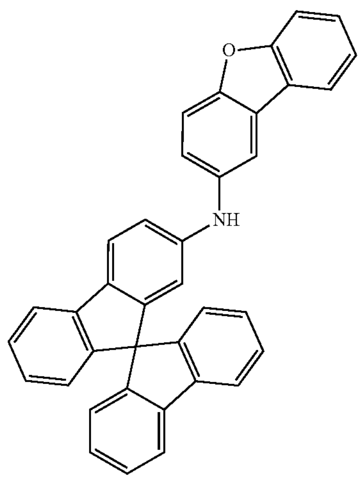
Sub 2-170
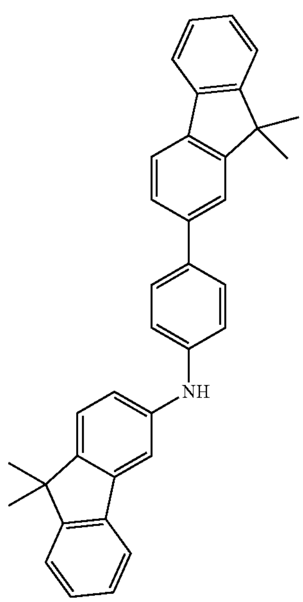
-continued
Sub 2-171
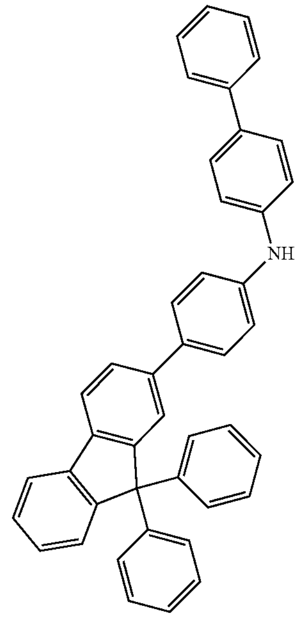
Sub 2-172
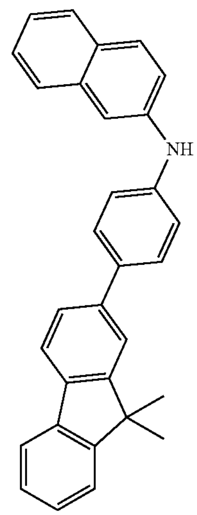
Sub 2-173
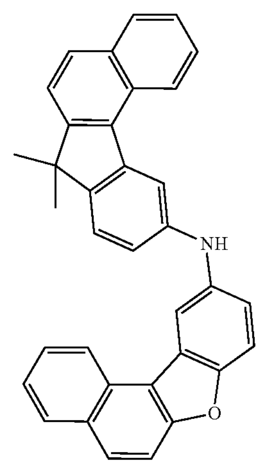

-continued
Sub 2-174
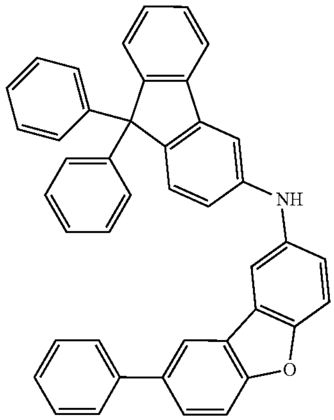
Sub 2-175
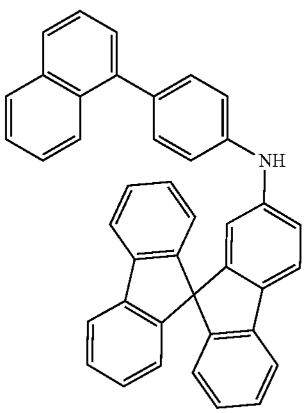
Sub 2-176
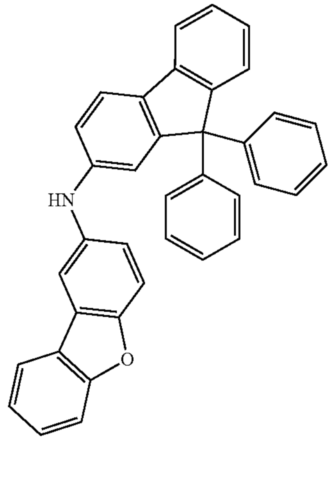
-continued
Sub 2-177
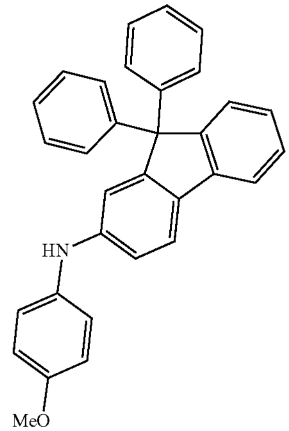
Sub 2-178
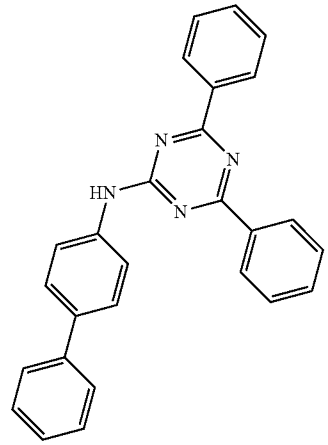
Sub 2-179
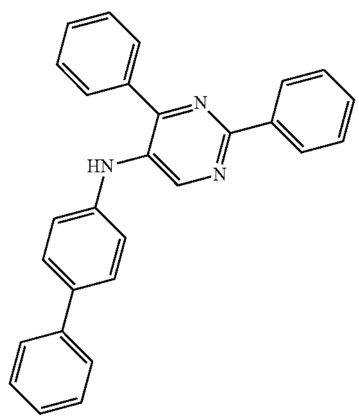
Sub 2-180
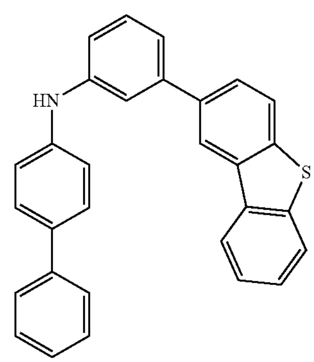

-continued
Sub 2-181
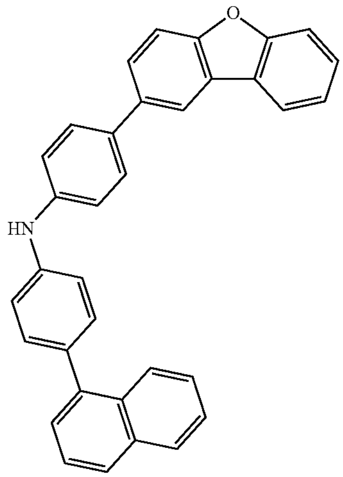
Sub 2-182
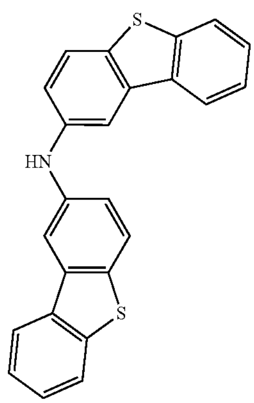
Sub 2-183
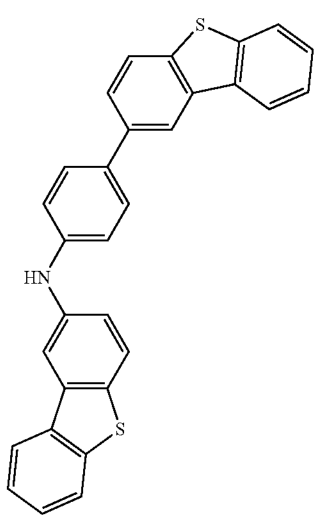
-continued
Sub 2-184
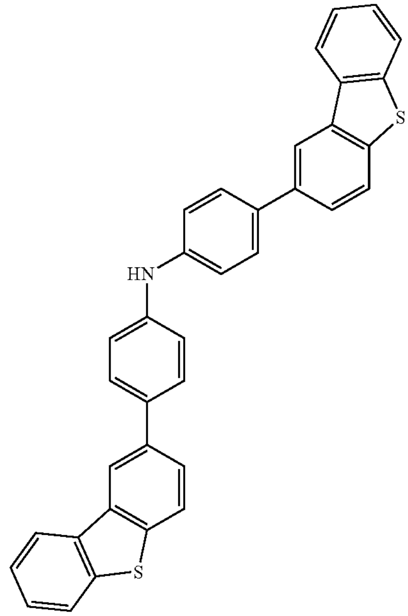
Sub 2-185
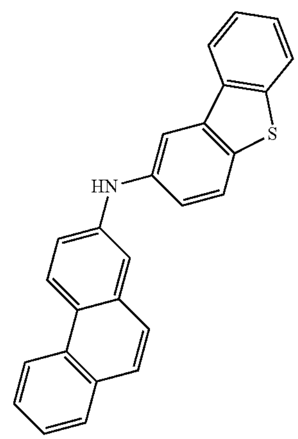
Sub 2-186
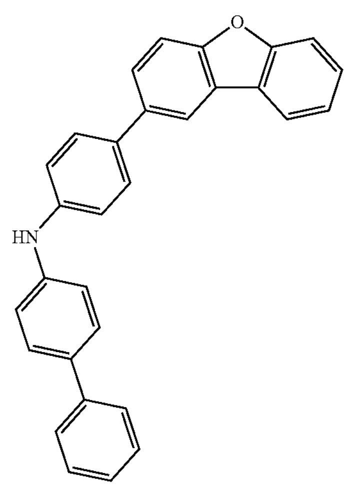

-continued
Sub 2-187
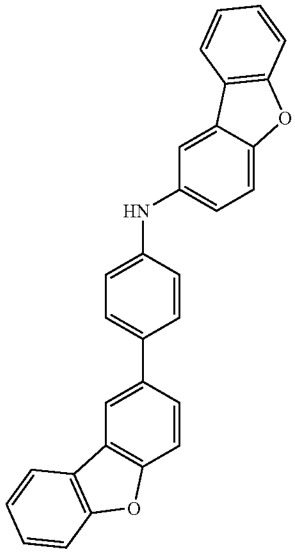
Sub 2-188
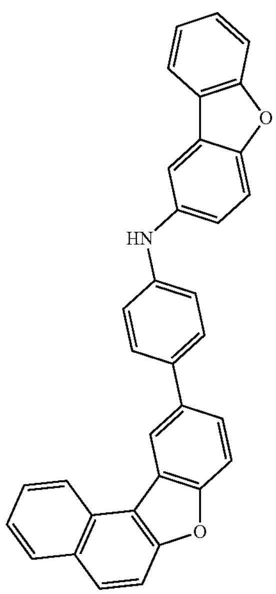
Sub 2-189
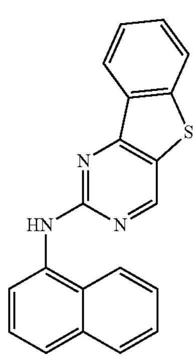
-continued
Sub 2-190
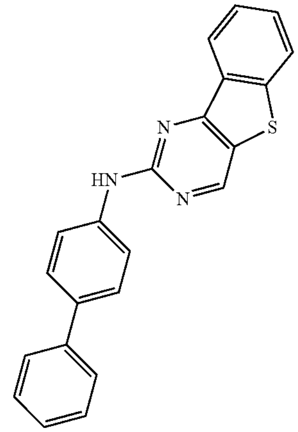
Sub 2-191
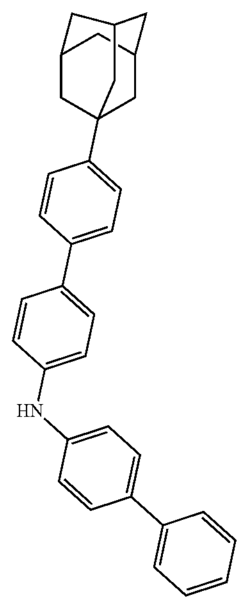
Sub 2-192
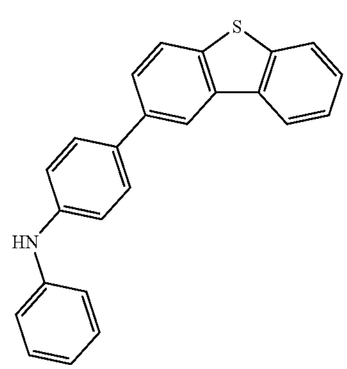

-continued
Sub 2-193
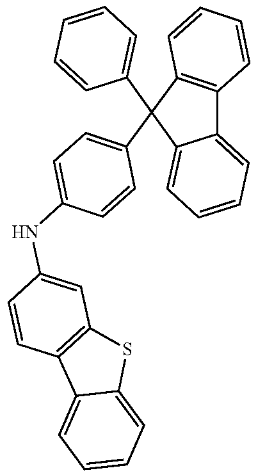
Sub 2-194
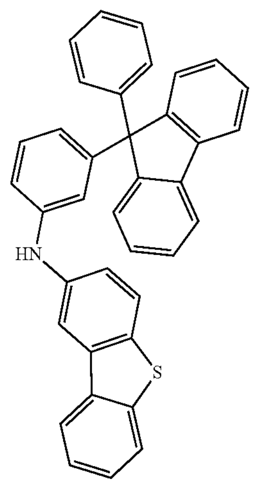
Sub 2-195
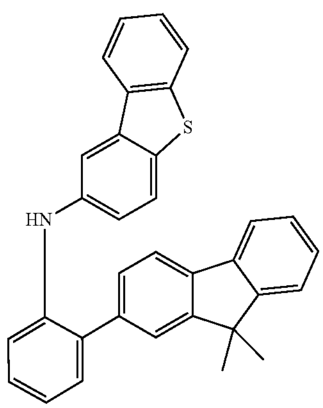
Sub 2-196
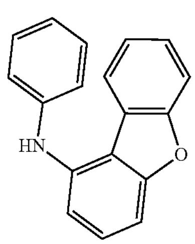
-continued
Sub 2-197
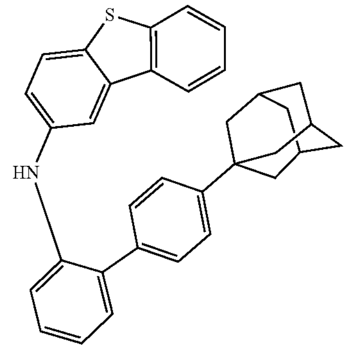
Sub 2-198
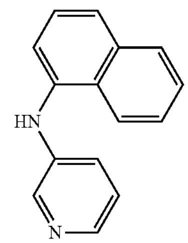
Sub 2-199
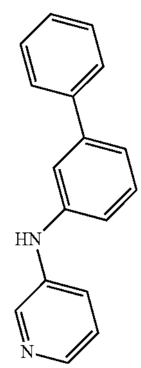
Sub 2-200
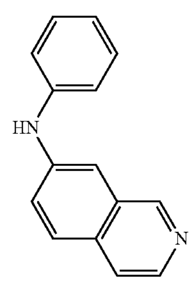

-continued
Sub 2-201
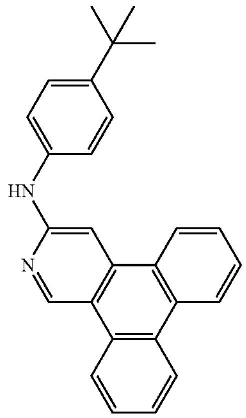
Sub 2-202
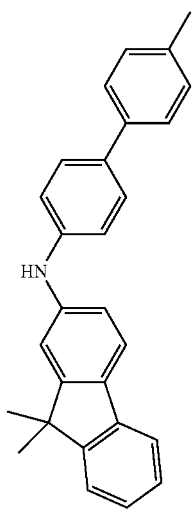
Sub 2-203
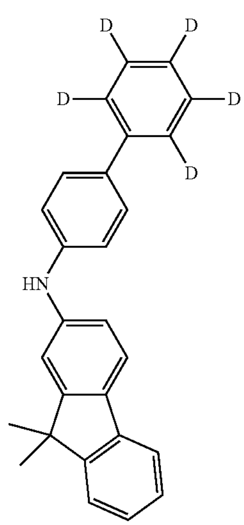
-continued
Sub 2-204
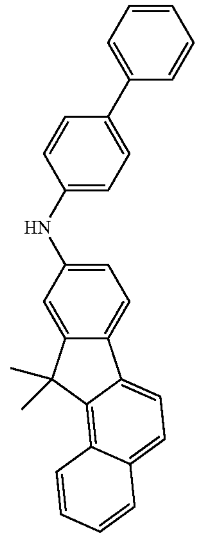
Sub 2-205
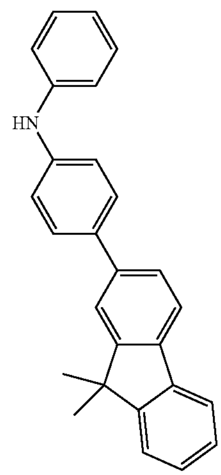
Sub 2-206
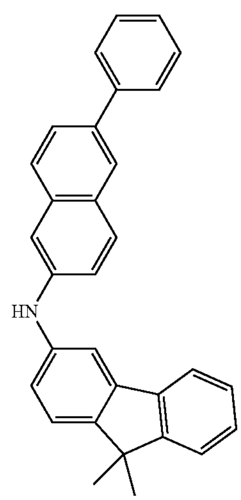

-continued
Sub 2-207
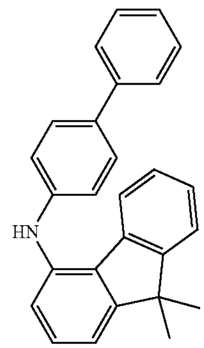
Sub 2-208
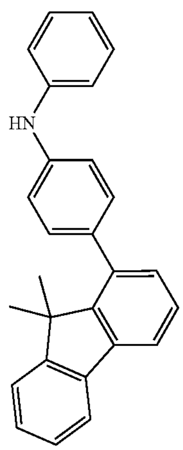
Sub 2-209
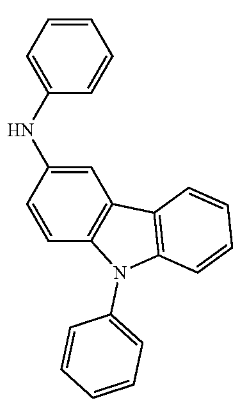
-continued
Sub 2-210
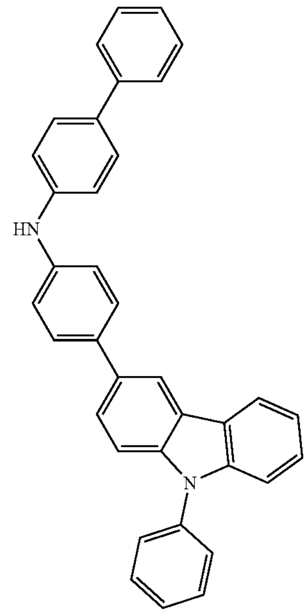
Sub 2-211
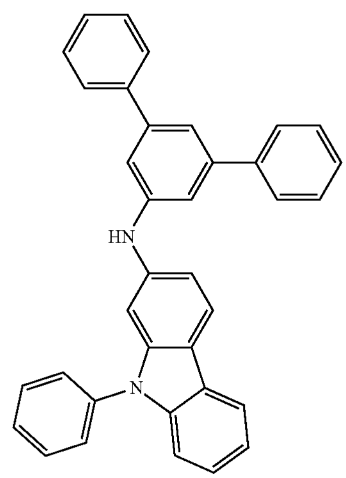
Sub 2-212
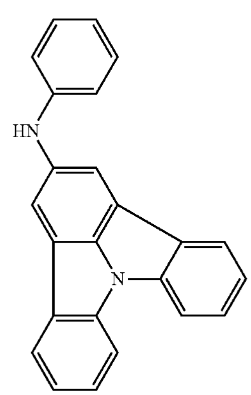

-continued
Sub 2-213
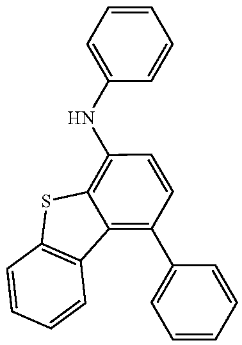
Sub 2-214
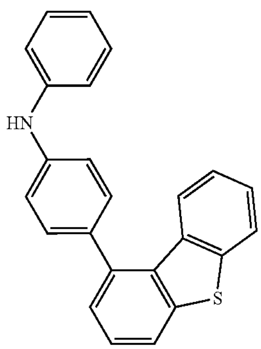
Sub 2-215
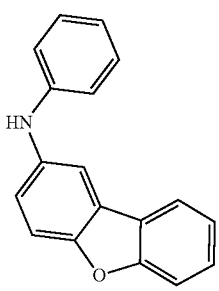
Sub 2-216
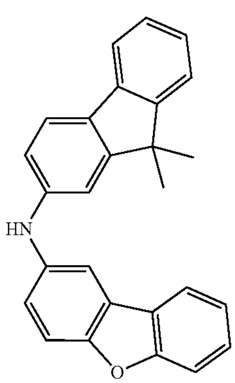
-continued
Sub 2-217
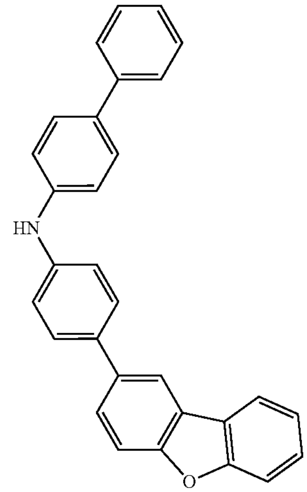
Sub 2-218
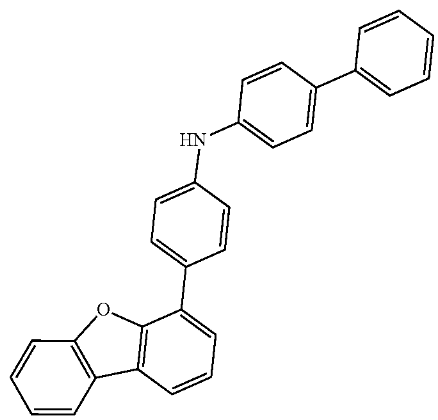
Sub 2-219
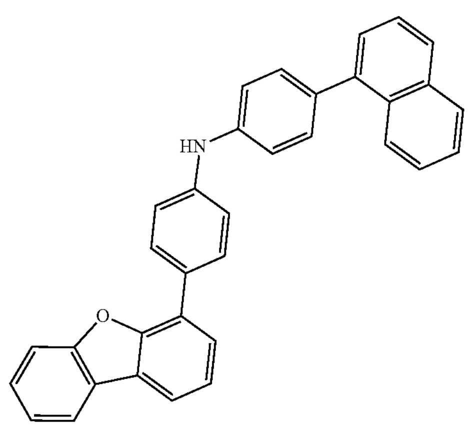

-continued

Sub 2-220

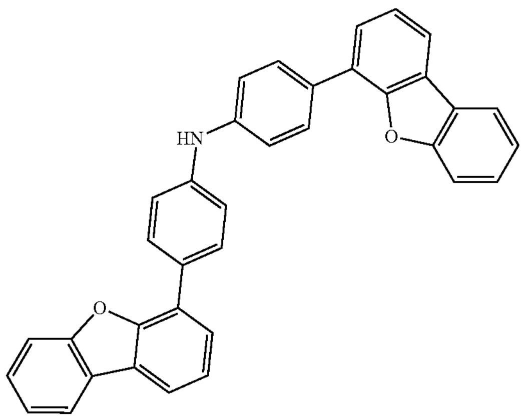

Sub 2-221

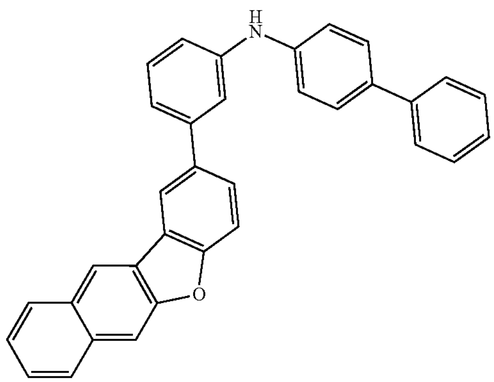

-continued

Sub 2-222

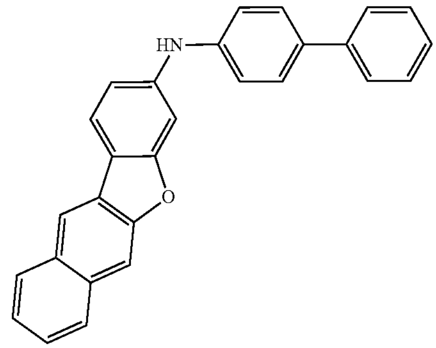

Sub 2-223

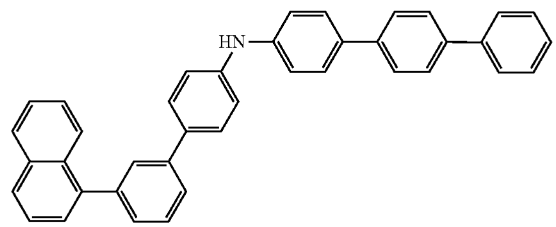

TABLE 2

| Compound | FD-MS | Compound | FD-MS |
|---|---|---|---|
| Sub 2-1 | m/z = 169.09($C_{12}H_{11}N$ = 169.22) | Sub 2-2 | m/z = 245.12($C_{18}H_{15}N$ = 245.32) |
| Sub 2-3 | m/z = 245.12($C_{18}H_{15}N$ = 245.32) | Sub 2-4 | m/z = 321.15($C_{24}H_{19}N$ = 321.41) |
| Sub 2-5 | m/z = 321.15($C_{24}H_{19}N$ = 321.41) | Sub 2-6 | m/z = 269.12($C_{20}H_{15}N$ = 269.34) |
| Sub 2-7 | m/z = 269.12($C_{20}H_{15}N$ = 269.34) | Sub 2-8 | m/z = 295.14($C_{22}H_{17}N$ = 295.38) |
| Sub 2-9 | m/z = 409.18($C_{31}H_{23}N$ = 409.52) | Sub 2-10 | m/z = 483.20($C_{37}H_{25}N$ = 483.60) |
| Sub 2-11 | m/z = 459.20($C_{35}H_{25}N$ = 459.58) | Sub 2-12 | m/z = 485.21($C_{37}H_{27}N$ = 485.62) |
| Sub 2-13 | m/z = 275.08($C_{18}H_{13}NS$ = 275.37) | Sub 2-14 | m/z = 335.13($C_{24}H_{17}NO$ = 335.40) |
| Sub 2-15 | m/z = 297.13($C2_{0}H_{15}N_3$ = 297.35) | Sub 2-16 | m/z = 219.10($C_{16}H_{13}N$ = 219.28) |
| Sub 2-17 | m/z = 249.12($C_{17}H_{15}NO$ = 249.31) | Sub 2-18 | m/z = 197.12($C_{14}H_{15}N$ = 197.28) |
| Sub 2-19 | m/z = 229.11($C_{14}H_{15}NO_2$ = 229.27) | Sub 2-20 | m/z = 174.12($C_{12}H_6D_5N$ = 174.25) |
| Sub 2-21 | m/z = 281.21($C_{20}H_{27}N$ = 281.44) | Sub 2-22 | m/z = 321.15($C_{24}H_{19}N$ = 321.41) |
| Sub 2-23 | m/z = 321.15($C_{24}H_{19}N$ = 321.41) | Sub 2-24 | m/z = 321.15($C_{24}H_{19}N$ = 321.41) |
| Sub 2-25 | m/z = 321.15($C_{24}H_{19}N$ = 321.41) | Sub 2-26 | m/z = 321.15($C_{24}H_{19}N$ = 321.41) |
| Sub 2-27 | m/z = 297.13($C_{20}H_{15}N_3$ = 297.35) | Sub 2-28 | m/z = 499.20($C_{36}H_{25}N_3$ = 499.60) |
| Sub 2-29 | m/z = 499.20($C_{36}H_{22}N_2$ = 410.51) | Sub 2-30 | m/z = 424.16($C_{30}H_{20}N_2O$ = 424.49) |
| Sub 2-31 | m/z = 440.13($C_{30}H_{20}N_2S$ = 440.56) | Sub 2-32 | m/z = 384.16($C_{28}H_{20}N_2$ = 384.47) |
| Sub 2-33 | m/z = 334.15($C_{24}H_{18}N_2$ = 334.41) | Sub 2-34 | m/z = 450.21($C_{33}H_{26}N_2$ = 450.57) |
| Sub 2-35 | m/z = 410.18($C_{30}H_{22}N_2$ = 410.51) | Sub 2-36 | m/z = 410.18($C_{30}H_{22}N_2$ = 410.51) |
| Sub 2-37 | m/z = 575.24($C_{42}H_{29}N_3$ = 575.70) | Sub 2-38 | m/z = 574.24($C_{43}H_{30}N_2$ = 574.71) |
| Sub 2-39 | m/z = 460.19($C_{34}H_{24}N_2$ = 460.57) | Sub 2-40 | m/z = 460.19($C_{34}H_{24}N_2$ = 460.57) |
| Sub 2-41 | m/z = 461.19($C_{33}H_{23}N_3$ = 461.56) | Sub 2-42 | m/z = 626.27($C_{47}H_{34}N_2$ = 626.79) |
| Sub 2-43 | m/z = 565.23($C_{39}H_{27}N_5$ = 565.67) | Sub 2-44 | m/z = 415.21($C_{30}H_{17}D_5N_2$ = 415.54) |
| Sub 2-45 | m/z = 486.21($C_{36}H_{26}N_2$ = 486.61) | Sub 2-46 | m/z = 415.21($C_{30}H_{17}D_5N_2$ = 415.54) |
| Sub 2-47 | m/z = 225.15($C_{16}H_{19}N$ = 225.33) | Sub 2-48 | m/z = 220.10($C_{15}H_{12}N_2$ = 220.27) |
| Sub 2-49 | m/z = 220.10($C_{15}H_{12}N_2$ = 220.27) | Sub 2-50 | m/z = 269.12($C_{20}H_{15}N$ = 269.34) |
| Sub 2-51 | m/z = 269.12($C_{20}H_{15}N$ = 269.34) | Sub 2-52 | m/z = 293.12($C_{22}H_{15}N$ = 293.36) |
| Sub 2-53 | m/z = 250.15($C_{18}H_{10}D_5N$ = 250.35) | Sub 2-54 | m/z = 250.15($C_{18}H_{10}D_5N$ = 250.35) |
| Sub 2-55 | m/z = 246.12($C_{17}H_{14}N_2$ = 246.31) | Sub 2-56 | m/z = 295.14($C_{22}H_{17}N$ = 295.38) |
| Sub 2-57 | m/z = 295.14($C_{22}H_{17}N$ = 295.38) | Sub 2-58 | m/z = 295.14($C_{22}H_{17}N$ = 295.38) |
| Sub 2-59 | m/z = 300.17($C_{22}H_{12}D_5N$ = 300.41) | Sub 2-60 | m/z = 295.14($C_{22}H_{17}N$ = 295.38) |
| Sub 2-61 | m/z = 295.14($C_{22}H_{17}N$ = 295.38) | Sub 2-62 | m/z = 269.12($C_{20}H_{15}N$ = 269.34) |
| Sub 2-63 | m/z = 345.15($C_{26}H_{19}N$ = 45.44) | Sub 2-64 | m/z = 296.13($C_{21}H_{16}N_2$ = 296.37) |
| Sub 2-65 | m/z = 346.15($C_{25}H_{18}N_2$ = 346.42) | Sub 2-66 | m/z = 321.15($C_{24}H_{19}N$ = 321.41) |

TABLE 2-continued

| Compound | FD-MS | Compound | FD-MS |
|---|---|---|---|
| Sub 2-67 | m/z = 321.15($C_{24}H_{19}N$ = 321.41) | Sub 2-68 | m/z = 421.18($C_{32}H_{23}N$ = 421.53) |
| Sub 2-69 | m/z = 300.17($C_{22}H_{12}D_5N$ = 300.41) | Sub 2-70 | m/z = 421.18($C_{32}H_{23}N$ = 421.53) |
| Sub 2-71 | m/z = 321.15($C_{24}H_{19}N$ = 321.41) | Sub 2-72 | m/z = 371.17($C_{28}H_{21}N$ = 371.47) |
| Sub 2-73 | m/z = 319.14($C_{24}H_{17}N$ = 319.40) | Sub 2-74 | m/z = 293.12($C_{22}H_{15}N$ = 293.36) |
| Sub 2-75 | m/z = 395.17($C_{30}H_{21}N$ = 395.49) | Sub 2-76 | m/z = 386.18($C_{28}H_{22}N_2$ = 386.49) |
| Sub 2-77 | m/z = 224.14($C_{16}H_8D_5N$ = 224.31) | Sub 2-78 | m/z = 275.08($C_{18}H_{13}NS$ = 275.37) |
| Sub 2-79 | m/z = 325.09($C_{22}H_{15}NS$ = 325.43) | Sub 2-80 | m/z = 325.09($C_{22}H_{15}NS$ = 325.43) |
| Sub 2-81 | m/z = 351.11($C_{24}H_{17}NS$ = 351.46) | Sub 2-82 | m/z = 326.09($C_{21}H_{14}N_2S$ = 326.41) |
| Sub 2-83 | m/z = 351.11($C_{24}H_{17}NS$ = 351.46) | Sub 2-84 | m/z = 275.08($C_{18}H_{13}NS$ = 275.37) |
| Sub 2-85 | m/z = 290.09($C_{18}H_{14}N_2S$ = 290.38) | Sub 2-86 | m/z = 325.09($C_{22}H_{15}NS$ = 325.43) |
| Sub 2-87 | m/z = 351.11($C_{24}H_{17}NS$ = 351.46) | Sub 2-88 | m/z = 381.06($C_{24}H_{15}NS_2$ = 381.51) |
| Sub 2-89 | m/z = 401.12($C_{28}H_{13}NS$ = 401.52) | Sub 2-90 | m/z = 275.08($C_{18}H_{13}NS$ = 275.37) |
| Sub 2-91 | m/z = 351.11($C_{24}H_{17}NS$ = 351.46) | Sub 2-92 | m/z = 325.09($C_{22}H_{15}NS$ = 325.43) |
| Sub 2 93 | m/z = 401.12($C_{28}H_{19}NS$ = 401.52) | Sub 2 94 | m/z = 351.11($C_{24}H_{17}NS$ = 351.46) |
| Sub 2-95 | m/z = 352.10($C_{23}H_{15}N_2S$ = 52.45) | Sub 2-96 | m/z = 440.13($C_{30}H_{20}N_2S$ = 440.56) |
| Sub 2-97 | m/z = 375.11($C_{26}H_{17}NS$ = 375.48) | Sub 2-98 | m/z = 381.06($C_{24}H_{15}NS_2$ = 381.51) |
| Sub 2-99 | m/z = 351.11($C_{24}H_{17}NS$ = 351.46) | Sub 2-100 | m/z = 309.12($C_{22}H_{15}NO$ = 309.36) |
| Sub 2-101 | m/z = 259.10($C_{18}H_{13}NO$ = 259.30) | Sub 2-102 | m/z = 309.12($C_{22}H_{15}NO$ = 309.36) |
| Sub 2-103 | m/z = 335.13($C_{24}H_{17}NO$ = 335.40) | Sub 2-104 | m/z = 349.11($C_{24}H_{15}NO_2$ = 349.38) |
| Sub 2-105 | m/z = 309.12($C_{22}H_{15}NO$ = 309.36) | Sub 2-106 | m/z = 259.10($C_{18}H_{13}NO$ = 259.30) |
| Sub 2-107 | m/z = 335.13($C_{24}H_{17}NO$ = 335.40) | Sub 2-108 | m/z = 259.10($C_{18}H_{13}NO$ = 259.30) |
| Sub 2-109 | m/z = 335.13($C_{24}H_{17}NO$ = 335.40) | Sub 2-110 | m/z = 461.18($C_{34}H_{23}NO$ = 461.55) |
| Sub 2-111 | m/z = 335.13($C_{24}H_{17}NO$ = 335.40) | Sub 2-112 | m/z = 335.13($C_{24}H_{17}NO$ = 335.40) |
| Sub 2-113 | m/z = 335.13($C_{24}H_{17}NO$ = 335.40) | Sub 2-114 | m/z = 385.15($C_{28}H_{19}NO$ = 385.46) |
| Sub 2-115 | m/z = 411.16($C_{30}H_{21}NO$ = 411.49) | Sub 2-116 | m/z = 411.16($C_{30}H_{21}NO$ = 411.49) |
| Sub 2-117 | m/z = 285.15($C_{21}H_{19}N$ = 285.38) | Sub 2-118 | m/z = 290.18($C_{21}H_{14}D_5N$ = 290.41) |
| Sub 2-119 | m/z = 335.17($C_{25}H_{21}N$ = 335.44) | Sub 2-120 | m/z = 361.18($C_{27}H_{23}N$ = 361.48) |
| Sub 2-121 | m/z = 391.14($C_{27}H_{21}NS$ = 391.53) | Sub 2-122 | m/z = 401.21($C_{30}H_{27}N$ = 401.54) |
| Sub 2-123 | m/z = 335.17($C_{25}H_{21}N$ = 335.44) | Sub 2-124 | m/z = 335.17($C_{25}H_{21}N$ = 335.44) |
| Sub 2-125 | m/z = 385.18($C_{29}H_{23}N$ = 385.50) | Sub 2-126 | m/z = 361.18($C_{27}H_{23}N$ = 361.48) |
| Sub 2-127 | m/z = 299.17($C_{22}H_{21}N$ = 299.41) | Sub 2-128 | m/z = 385.18($C_{29}H_{23}N$ = 385.50) |
| Sub 2-129 | m/z = 409.18($C_{31}H_{23}N$ = 409.52) | Sub 2-130 | m/z = 525.25($C_{40}H_{31}N$ = 525.68) |
| Sub 2-131 | m/z = 409.18($C_{31}H_{23}N$ = 409.52) | Sub 2-132 | m/z = 423.20($C_{32}H_{25}N$ = 423.55) |
| Sub 2-133 | m/z = 439.19($C_{32}H_{25}NO$ = 439.55) | Sub 2-134 | m/z = 459.20($C_{35}H_{25}N$ = 459.58) |
| Sub 2-135 | m/z = 485.21($C_{37}H_{27}N$ = 485.62) | Sub 2-136 | m/z = 562.24($C_{42}H_{30}N_2$ = 562.70) |
| Sub 2-137 | m/z = 485.21($C_{37}H_{27}N$ = 485.62) | Sub 2-138 | m/z = 523.23($C_{40}H_{29}N$ = 523.66) |
| Sub 2-139 | m/z = 407.17($C_{31}H_{21}N$ = 407.51) | Sub 2-140 | m/z = 407.17($C_{31}H_{21}N$ = 407.51) |
| Sub 2-141 | m/z = 483.20($C_{37}H_{25}N$ = 483.60) | Sub 2-142 | m/z = 457.18($C_{35}H_{23}N$ = 457.56) |
| Sub 2-143 | m/z = 410.18($C_{30}H_{22}N_2$ = 410.51) | Sub 2-144 | m/z = 384.16($C_{28}H_{20}N_2$ = 384.47) |
| Sub 2-145 | m/z = 384.16($C_{28}H_{20}N_2$ = 384.47) | Sub 2-146 | m/z = 410.18($C_{30}H_{22}N_2$ = 410.51) |
| Sub 2-147 | m/z = 450.21($C_{33}H_{26}N_2$ = 450.57) | Sub 2-148 | m/z = 384.16($C_{28}H_{20}N_2$ = 384.47) |
| Sub 2-149 | m/z = 225.06($C_{14}H_{11}NS$ = 225.31) | Sub 2-150 | m/z = 225.06($C_{14}H_{11}NS$ = 225.31) |
| Sub 2-151 | m/z = 284.13($C_{20}H_{16}N_2$ = 284.35) | Sub 2-152 | m/z = 334.15($C_{24}H_{18}N_2$ = 34.41) |
| Sub 2-153 | m/z = 293.07($C_{18}H_{12}FNS$ = 293.36) | Sub 2-154 | m/z = 220.10($C_{15}H_{12}N_2$ = 220.27) |
| Sub 2-155 | m/z = 297.13($C_{20}H_{15}N_3$ = 297.35) | Sub 2-156 | m/z = 245.12($C_{18}H_{15}N$ = 245.32) |
| Sub 2-157 | m/z = 321.15($C_{24}H_{19}N$ = 321.41) | Sub 2-158 | m/z = 349.11($C_{24}H_{15}NO_2$ = 349.38) |
| Sub 2-159 | m/z = 365.09($C_{24}H_{15}NOS$ = 365.45) | Sub 2-160 | m/z = 365.09($C_{24}H_{15}NOS$ = 365.45) |
| Sub 2-161 | m/z = 365.09($C_{24}H_{15}NOS$ = 365.45) | Sub 2-162 | m/z = 365.09($C_{24}H_{15}NOS$ = 365.45) |
| Sub 2-163 | m/z = 415.10($C_{28}H_{17}NOS$ = 415.51) | Sub 2-164 | m/z = 365.09($C_{24}H_{15}NOS$ = 365.45) |
| Sub 2-165 | m/z = 465.12($C_{32}H_{19}NOS$ = 465.57) | Sub 2-166 | m/z = 391.14($C_{27}H_{21}NS$ = 391.53) |
| Sub 2-167 | m/z = 391.14($C_{27}H_{21}NS$ = 391.53) | Sub 2-168 | m/z = 515.17($C_{37}H_{25}NS$ = 515.67) |
| Sub 2-169 | m/z = 513.16($C_{37}H_{23}NS$ = 513.65) | Sub 2-170 | m/z = 375.16($C_{27}H_{21}NO$ = 375.46) |
| Sub 2-171 | m/z = 497.18($C_{37}H_{23}NO$ = 497.58) | Sub 2-172 | m/z = 477.25($C_{36}H_{31}N$ = 477.64) |
| Sub 2-173 | m/z = 561.25($C_{43}H_{31}N$ = 561.73) | Sub 2-174 | m/z = 411.2($C_{31}H_{25}N$ = 411.55) |
| Sub 2-175 | m/z = 475.19($C_{35}H_{25}NO$ = 475.59) | Sub 2-176 | m/z = 575.22($C_{43}H_{29}NO$ = 575.71) |
| Sub 2-177 | m/z = 533.21($C_{41}H_{27}N$ = 533.67) | Sub 2-178 | m/z = 499.19($C_{37}H_{25}NO$ = 499.61) |
| Sub 2-179 | m/z = 439.19($C_{32}H_{25}NO$ = 439.56) | Sub 2-180 | m/z = 400.17($C_{27}H_{20}N_4$ = 400.49) |
| Sub 2-181 | m/z = 399.17($C_{28}H_{21}N_3$ = 399.5) | Sub 2-182 | m/z = 427.14($C_{30}H_{21}NS$ = 427.57) |
| Sub 2-183 | m/z = 461.18($C_{34}H_{23}NO$ = 461.56) | Sub 2-184 | m/z = 381.06($C_{24}H_{15}NS_2$ = 381.51) |
| Sub 2-185 | m/z = 457.1($C_{30}H_{19}NS_2$ = 457.61) | Sub 2-186 | m/z = 533.13($C_{36}H_{23}NS_2$ = 533.71) |
| Sub 2-187 | m/z = 375.11($C_{26}H_{17}NS$ = 375.49) | Sub 2-188 | m/z = 411.16($C_{30}H_{21}NO$ = 411.5) |
| Sub 2-189 | m/z = 425.14($C_{30}H_{19}NO_2$ = 425.49) | Sub 2-190 | m/z = 475.16($C_{34}H_{21}NO_2$ = 475.55) |
| Sub 2-191 | m/z = 327.08($C_{20}H_{13}N_3S$ = 327.41) | Sub 2-192 | m/z = 353.1($C_{22}H_{15}N_3S$ = 353.44) |
| Sub 2-193 | m/z = 455.26($C_{34}H_{33}N$ = 455.65) | Sub 2-194 | m/z = 351.11($C_{24}H_{17}NS$ = 351.47) |
| Sub 2-195 | m/z = 515.17($C_{37}H_{25}NS$ = 515.67) | Sub 2-196 | m/z = 515.17($C_{37}H_{25}NS$ = 515.67) |
| Sub 2-197 | m/z = 467.17($C_{33}H_{25}NS$ = 467.63) | Sub 2-198 | m/z = 259.1($C_{18}H_{13}NO$ = 259.31) |
| Sub 2-199 | m/z = 485.22($C_{34}H_{31}NS$ = 485.69) | Sub 2-200 | m/z = 220.10($C_{15}H_{12}N_2$ = 220.28) |
| Sub 2-201 | m/z = 246.12($C_{17}H_{14}N_2$ = 246.31) | Sub 2-202 | m/z = 220.10($C_{15}H_{12}N_2$ = 220.28) |
| Sub 2-203 | m/z = 376.19($C_{27}H_{24}N_2$ = 376.50) | Sub 2-204 | m/z = 375.20($C_{28}H_{25}N$ = 375.52) |
| Sub 2-205 | m/z = 366.21($C_{27}H_{18}D_5N$ = 366.52) | Sub 2-206 | m/z = 411.20($C_{31}H_{25}N$ = 411.55) |
| Sub 2-207 | m/z = 361.18($C_{27}H_{23}N$ = 361.49) | Sub 2-208 | m/z = 411.20($C_{31}H_{25}N$ = 411.55) |
| Sub 2-209 | m/z = 361.18($C_{27}H_{23}N$ = 361.49) | Sub 2-210 | m/z = 361.18($C_{27}H_{23}N$ = 361.49) |
| Sub 2-211 | m/z = 334.15($C_{24}H_{18}N_2$ = 334.42) | Sub 2-212 | m/z = 486.21($C_{36}H_{26}N_2$ = 486.62) |
| Sub 2-213 | m/z = 486.21($C_{36}H_{26}N_2$ = 486.62) | Sub 2-214 | m/z = 332.13($C_{24}H_{16}N_2$ = 332.41) |
| Sub 2-215 | m/z = 351.11($C_{24}H_{17}NS$ = 351.47) | Sub 2-216 | m/z = 351.11($C_{24}H_{17}NS$ = 351.47) |
| Sub 2-217 | m/z = 259.10($C_{18}H_{13}NO$ = 259.31) | Sub 2-218 | m/z = 375.16($C_{27}H_{21}NO$ = 375.47) |
| Sub 2-219 | m/z = 411.16($C_{30}H_{21}NO$ = 411.50) | Sub 2-220 | m/z = 411.16($C_{30}H_{21}NO$ = 411.50) |

TABLE 2-continued

| Compound | FD-MS | Compound | FD-MS |
|---|---|---|---|
| Sub 2-221 | m/z = 461.18($C_{34}H_{23}NO$ = 461.56) | Sub 2-222 | m/z = 385.15($C_{28}H_{19}NO$ = 385.47) |
| Sub 2-223 | m/z = 523.23(C40H29N = 523.68) | | |

Illustration of Synthesis of Final Product 1

Synthesis of 1-54

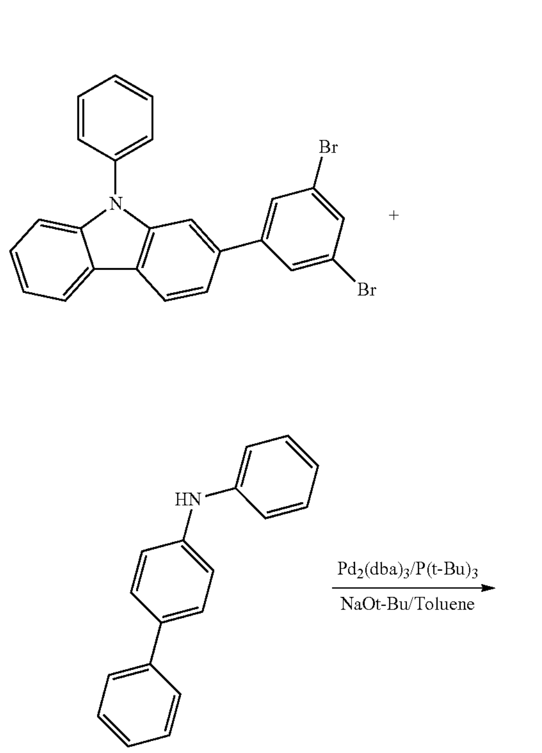

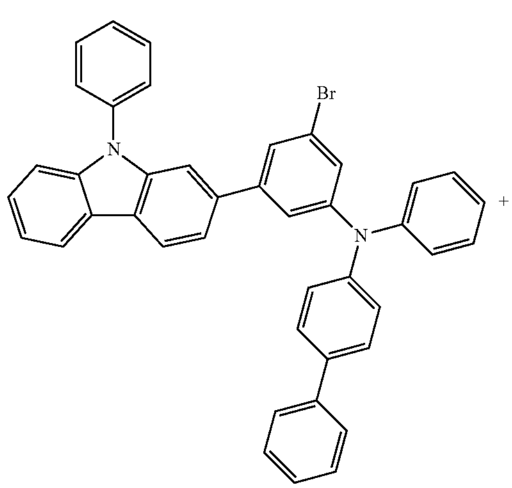

Inter_A-1

-continued

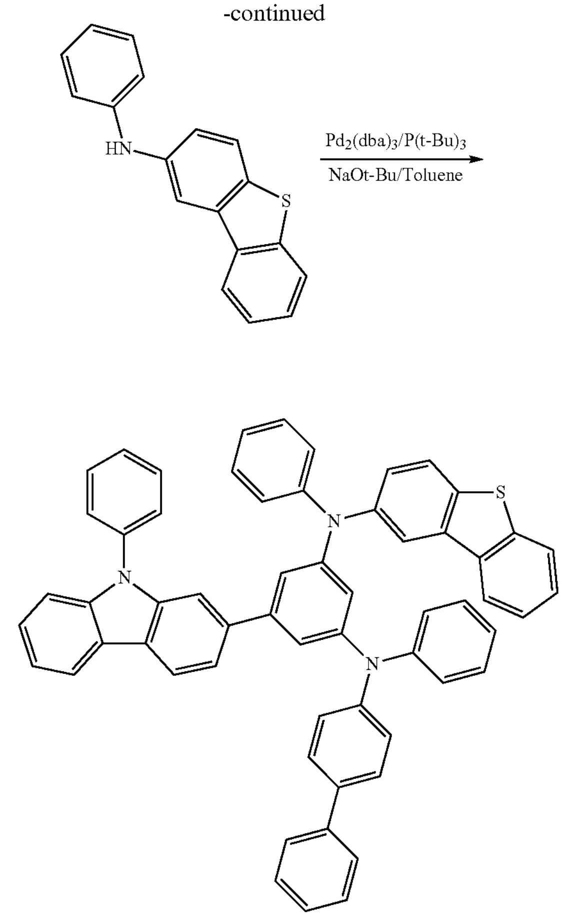

1) Synthesis of Inter_A-1

N-phenyl-[1,1'-biphenyl]-4-amine (11.6 g, 47.3 mmol), toluene (500 ml), 2-(3,5-dibromophenyl)-9-phenyl-9H-carbazole (24.8 g, 52.0 mmol), $Pd_2(dba)_3$ (2.4 g, 2.6 mmol), $P(t-Bu)_3$ (1.05 g, 5.2 mmol), and NaOt-Bu (13.6 g, 141.8 mmol) were added, followed by stirring at 100° C. When the reaction was completed, extraction was performed with $CH_2Cl_2$ and water, and then an organic layer was dried with $MgSO_4$ and concentrated. The resultant organic matter was subjected to silica gel column chromatography and recrystallization to create Inter_A-1 22.8 g (yield: 75%).

2) Synthesis of 1-54

N-phenyldibenzo[b,d]thiophen-2-amine (8 g, 29.05 mmol), Inter_A-1 (20.5 g, 32 mmol), toluene (305 ml), $Pd_2(dba)_3$ (1.5 g, 1.6 mmol), $P(t-Bu)_3$ (0.65 g, 3.2 mmol), and NaOt-Bu (8.4 g, 87.2 mmol) were subjected to the same experimental method as in Inter_A-1, thereby creating product 1-54 18 g (yield: 74%).

Synthesis of 2-9

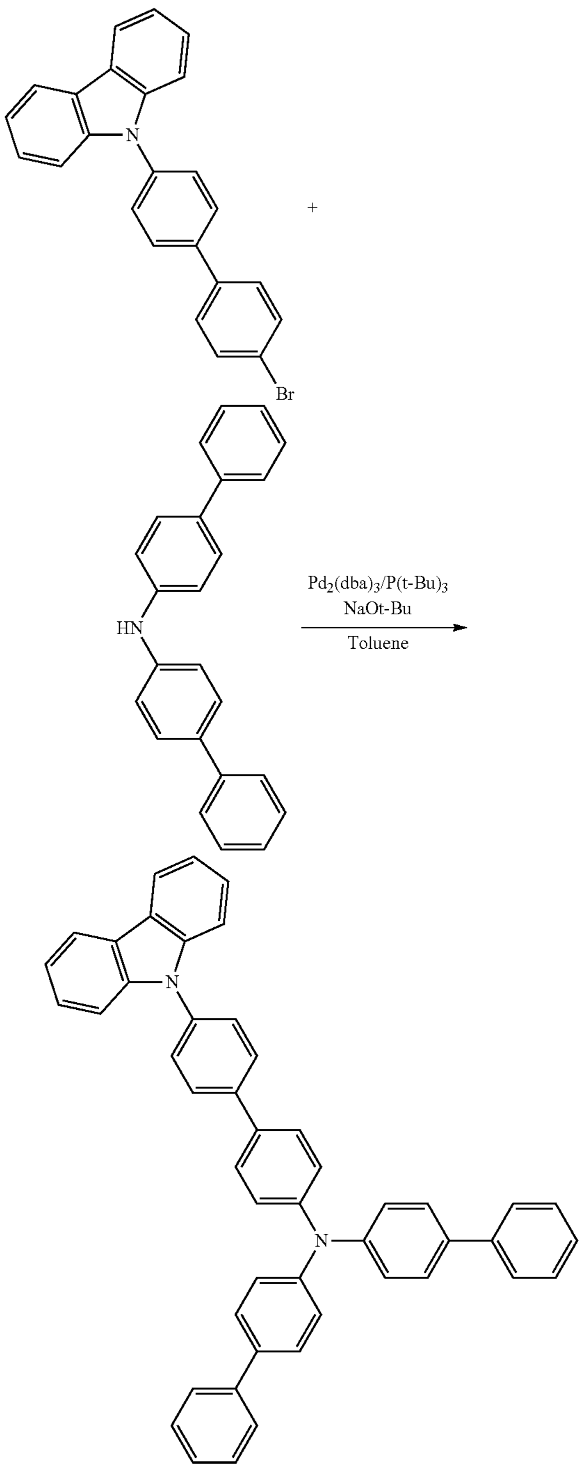

After Sub 2-26 (7 g, 21.8 mmol) was dissolved with toluene (230 ml) in a round bottom flask, Sub 1-2 (9.54 g, 24 mmol), $Pd_2(dba)_3$ (1 g, 1.1 mmol), 50% $P(t-Bu)_3$ (1.1 ml, 2.2 mmol), and NaOt-Bu (6.91 g, 71.9 mmol) were added, followed by stirring at 100° C. When the reaction was completed, extraction was performed with $CH_2Cl_2$ and water, and then an organic layer was dried with $MgSO_4$ and concentrated. A resultant compound was subjected to silica gel column chromatography and recrystallization, thereby creating a product 11.69 g (yield: 84%).

Synthesis of 3-52

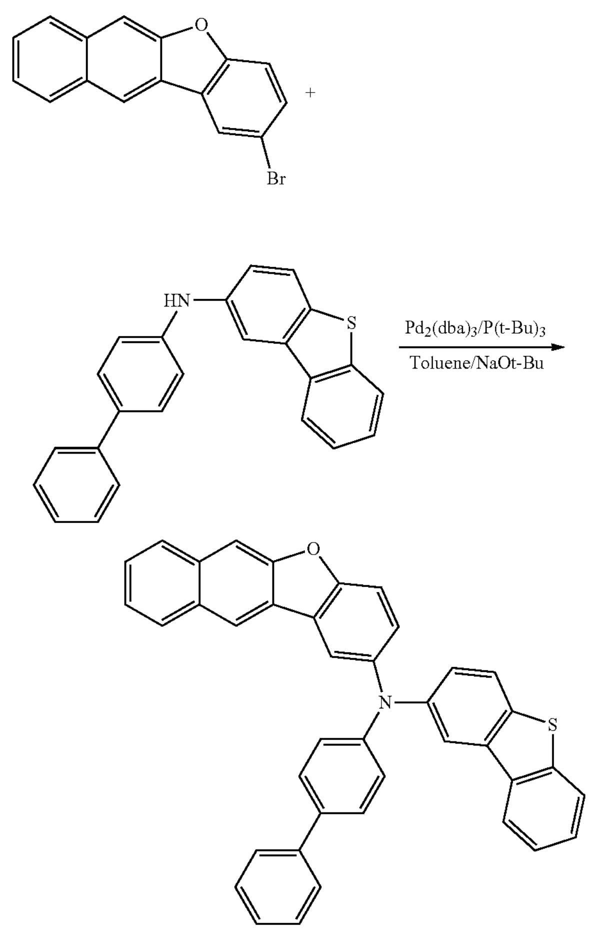

2-bromonaphtho[2,3-b]benzofuran (10 g, 33.65 mmol), N-([1,1'-biphenyl]-4-yl)dibenzo[b,d]thiophen-2-amine (11.83 g, 33.65 mmol), $Pd_2(dba)_3$ (0.92 g, 1.01 mmol), $P(t-Bu)_3$ (6.81 g, 33.65 mmol), NaOt-Bu (6.47 g, 67.31 mmol), and toluene (337 ml) were subjected to the same experimental method as in Synthesis 2-9, thereby creating a product 15.28 g (yield: 80%).

Synthesis of 6-12

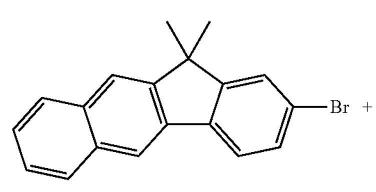

-continued

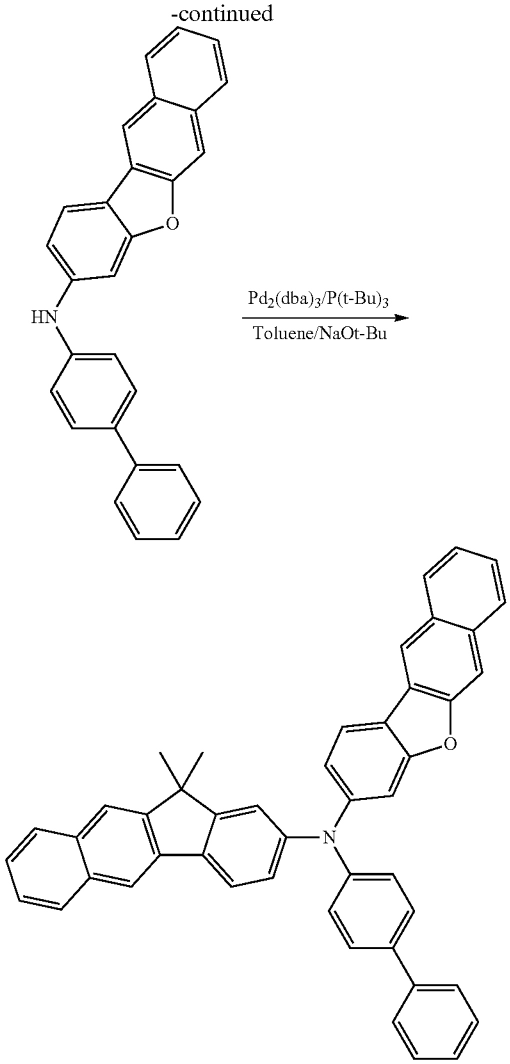

2-bromo-11,11-dimethyl-11H-benzo[b]fluorene (10 g, 30.94 mmol), N-([1,1'-biphenyl]-4-yl)naphtho[2,3-b]benzofuran-3-amine (11.93 g, 30.94 mmol), $Pd_2(dba)_3$ (0.85 g, 0.93 mmol), $P(t\text{-}Bu)_3$ (6.26 g, 30.94 mmol), NaOt-Bu (5.95 g, 61.88 mmol), and toluene (309 ml) were subjected to the same experimental method as in Synthesis 2-9, thereby creating a product 15.15 g (yield: 78%).

Synthesis of 11-4

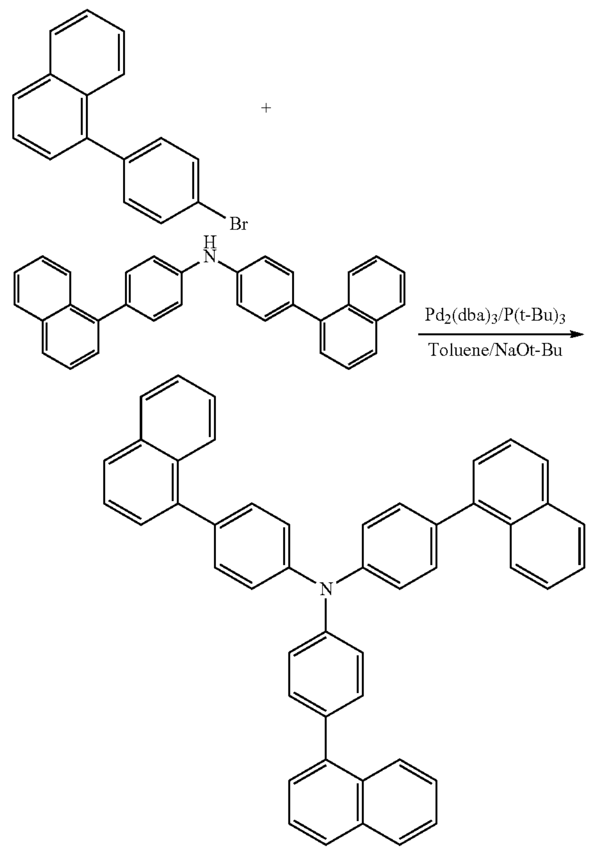

1-(4-bromophenyl)naphthalene (10 g, 35.3 mmol), bis(4-(naphthalen-1-yl)phenyl)amine (14.8 g, 35.31 mmol), $Pd_2(dba)_3$ (0.97 g, 1.06 mmol), $P(t\text{-}Bu)_3$ (7.14 g, 35.31 mmol), NaOt-Bu (6.79 g, 70.63 mmol), and toluene (353 ml) were subjected to the same experimental method as in Synthesis 2-9, thereby creating a product 16.9 g (yield: 78%).

TABLE 3

| Compound | FD-MS | Compound | FD-MS |
|---|---|---|---|
| 1-1 | m/z = 562.24($C_{42}H_{30}N_2$ = 562.72) | 1-2 | m/z = 602.27($C_{45}H_{34}N_2$ = 602.78) |
| 1-3 | m/z = 563.24($C_{41}H_{29}N_3$ = 563.70) | 1-4 | m/z = 714.30($C_{54}H_{38}N_2$ = 714.91) |
| 1-5 | m/z = 678.30($C_{51}H_{38}N_2$ = 678.88) | 1-6 | m/z = 802.33($C_{61}H_{42}N_2$ = 803.02) |
| 1-7 | m/z = 800.32($C_{61}H_{40}N_2$ = 801.01) | 1-8 | m/z = 563.24($C_{41}H_{29}N_3$ = 563.70) |
| 1-9 | m/z = 668.23($C_{48}H_{32}N_2S$ = 668.86) | 1-10 | m/z = 727.30($C_{54}H_{37}N_3$ = 727.91) |
| 1-11 | m/z = 652.25($C_{48}H_{34}N_2O$ = 652.80) | 1-12 | m/z = 662.27($C_{50}H_{34}N_2$ = 662.84) |
| 1-13 | m/z = 536.23($C_{40}H_{28}N_2$ = 536.68) | 1-14 | m/z = 586.24($C_{44}H_{30}N_2$ = 586.74) |
| 1-15 | m/z = 712.29($C_{54}H_{36}N_2$ = 712.90) | 1-16 | m/z = 714.30($C_{54}H_{38}N_2$ = 714.91) |
| 1-17 | m/z = 754.33($C_{57}H_{42}N_2$ = 754.98) | 1-18 | m/z = 957.38($C_{70}H_{47}N_5$ = 958.18) |
| 1-19 | m/z = 965.38($C_{73}H_{47}N_3$ = 966.20) | 1-20 | m/z = 719.24($C_{51}H_{33}N_3S$= 719.91) |
| 1-21 | m/z = 758.25($C_{54}H_{34}N_2OS$= 758.94) | 1-22 | m/z = 893.38($C_{67}H_{47}N_3$ = 894.13) |
| 1-23 | m/z = 652.25($C_{48}H_{32}N_2O$)=652.80) | 1-24 | m/z = 662.27($C_{50}H_{34}N_2$ = 662.84) |
| 1-25 | m/z = 562.24($C_{42}H_{30}N_2$ = 562.72) | 1-26 | m/z = 612.26($C_{46}H_{32}N_2$ = 612.78) |
| 1-27 | m/z = 688.29($C_{52}H_{36}N_2$ = 688.87) | 1-28 | m/z = 714.30($C_{54}H_{38}N_2$ = 714.91) |
| 1-29 | m/z = 754.33($C_{57}H_{42}N_2$ = 754.98) | 1-30 | m/z = 878.37($C_{67}H_{46}N_2$ = 879.12) |
| 1-31 | m/z = 876.35($C_{67}H_{44}N_2$ = 877.10) | 1-32 | m/z = 639.27($C_{47}H_{33}N_3$ = 369.80) |
| 1-33 | m/z = 768.26($C_{56}H_{36}N_2S$= 768.98) | 1-34 | m/z = 833.29($C_{60}H_{39}N_3S$= 834.05) |
| 1-35 | m/z = 742.26($C_{54}H_{34}N_2O_5$ = 742.88) | 1-36 | m/z = 778.333($C_{59}H_{42}N_2$ = 779.00) |

TABLE 3-continued

| Compound | FD-MS | Compound | FD-MS |
|---|---|---|---|
| 1-37 | m/z = 486.21($C_{36}H_{26}N_2$ = 486.62) | 1-38 | m/z = 536.23($C_{40}H_{28}N_2$ = 536.68) |
| 1-39 | m/z = 612.26($C_{46}H_{32}N_2$ = 612.78) | 1-40 | m/z = 638.27($C_{48}H_{34}N_2$ = 638.81) |
| 1-41 | m/z = 491.24($C_{36}H_{21}D_5N_2$ = 491.65) | 1-42 | m/z = 612.26($C_{46}H_{32}N_2$ = 612.78) |
| 1-43 | m/z = 794.28($C_{58}H_{38}N_2S$ = 795.02) | 1-44 | m/z = 656.26($C_{48}H_{33}FN_2$ = 656.80) |
| 1-45 | m/z = 717.29($C_{51}H_{35}N_5$ = 717.88) | 1-46 | m/z = 728.32($C_{55}H_{40}N_2$ = 728.94) |
| 1-47 | m/z = 842.34($C_{62}H_{42}N_4$ = 843.05) | 1-48 | m/z = 714.30($C_{54}H_{38}N_2$ = 714.91) |
| 1-49 | m/z = 653.28($C_{48}H_{35}N_3$ = 653.81) | 1-50 | m/z = 703.30($C_{52}H_{37}N_3$ = 703.87) |
| 1-51 | m/z = 805.35($C_{60}H_{43}N_3$ = 806.00) | 1-52 | m/z = 753.31($C_{56}H_{39}N_3$ = 753.93) |
| 1-53 | m/z = 818.34($C_{60}H_{42}N_4$ = 819.00) | 1-54 | m/z = 835.30($C_{60}H_{41}N_3S$ = 836.05) |
| 1-55 | m/z = 655.27($C_{46}H_{33}N_5$ = 655.79) | 1-56 | m/z = 885.32($C_{64}H_{43}N_3S$ = 886.11) |
| 1-57 | m/z = 759.27($C_{54}H_{37}N_3S$ = 759.96) | 1-58 | m/z = 706.28($C_{49}H_{34}N_6$ = 706.83) |
| 1-59 | m/z = 960.39($C_{69}H_{48}N_6$ = 961.16) | 1-60 | m/z = 853.35($C_{64}H_{43}N_3$ = 854.05) |
| 1-61 | m/z = 894.37($C_{66}H_{46}N_4$ = 895.10) | 1-62 | m/z = 834.38($C_{62}H_{38}D_5N_3$ = 835.06) |
| 1-63 | m/z = 855.36($C_{64}H_{45}N_3$ = 856.06) | 1-64 | m/z = 853.35($C_{64}H_{43}N_3$ = 854.05) |
| 1-65 | m/z = 794.37($C_{60}H_{46}N_2$ = 795.04) | 1-66 | m/z = 987.39($C_{71}H_{49}N_5O$ = 988.21) |
| 1-67 | m/z = 1021.44($C_{77}H_{55}N_3$ = 1022.31) | 1-68 | m/z = 737.23($C_{51}H_{32}FN_3S$ = 737.90) |
| 1-69 | m/z = 562.24($C_{42}H_{30}N_2$ = 562.72) | 1-70 | m/z = 602.27($C_{45}H_{34}N_2$ = 602.78) |
| 1-71 | m/z = 563.24($C_{41}H_{29}N_3$ = 563.70) | 1-72 | m/z = 714.30($C_{54}H_{38}N_2$ = 714.91) |
| 1-73 | m/z = 678.30($C_{51}H_{38}N_2$ = 678.88) | 1-74 | m/z = 802.33($C_{61}H_{42}N_2$ = 803.02) |
| 1-75 | m/z = 800.32($C_{61}H_{40}N_2$ = 801.01) | 1-76 | m/z = 563.24($C_{41}H_{29}N_3$ = 563.70) |
| 1-77 | m/z = 668.23($C_{48}H_{32}N_2S$ = 668.86) | 1-78 | m/z = 727.30($C_{54}H_{37}N_3$ = 727.91) |
| 1-79 | m/z = 652.25($C_{48}H_{32}N_2O$ = 652.80) | 1-80 | m/z = 662.27($C_{50}H_{34}N_2$ = 662.84) |
| 1-81 | m/z = 536.23($C_{40}H_{28}N_2$ = 536.68) | 1-82 | m/z = 586.24($C_{44}H_{30}N_2$ = 586.74) |
| 1-83 | m/z = 712.29($C_{54}H_{36}N_2$ = 712.90) | 1-84 | m/z = 714.30($C_{54}H_{38}N_2$ = 714.91) |
| 1-85 | m/z = 754.33($C_{57}H_{42}N_2$ = 754.98) | 1-86 | m/z = 957.38($C_{70}H_{47}N_5$ = 958.18) |
| 1-87 | m/z = 965.38($C_{73}H_{47}N_3$ = 966.20) | 1-88 | m/z = 719.24($C_{51}H_{33}N_3S$ = 719.91) |
| 1-89 | m/z = 758.24($C_{54}H_{34}N_2OS$ = 758.94) | 1-90 | m/z = 893.38($C_{67}H_{47}N_3$ = 894.13) |
| 1-91 | m/z = 652.25($C_{48}H_{32}N_2O$ = 652.80) | 1-92 | m/z = 662.27($C_{50}H_{34}N_2$ = 662.84) |
| 1-93 | m/z = 562.24($C_{42}H_{30}N_2$ = 562.72) | 1-94 | m/z = 612.26($C_{46}H_{32}N_2$ = 612.78) |
| 1-95 | m/z = 688.29($C_{52}H_{36}N_2$ = 688.87) | 1-96 | m/z = 714.30($C_{54}H_{38}N_2$ = 714.91) |
| 1-97 | m/z = 754.33($C_{57}H_{42}N_2$ = 754.98) | 1-98 | m/z = 878.37($C_{67}H_{46}N_2$ = 879.12) |
| 1-99 | m/z = 876.35($C_{67}H_{44}N_2$ = 877.10) | 1-100 | m/z = 639.27($C_{47}H_{33}N_3$ = 369.80) |
| 1-101 | m/z = 768.26($C_{56}H_{36}N_2S$ = 768.98) | 1-102 | m/z = 833.29($C_{60}H_{39}N_3S$ = 834.05) |
| 1-103 | m/z = 742.26($C_{54}H_{34}N_2O_3$ = 742.88) | 1-104 | m/z = 778.333($C_{59}H_{42}N_2$ = 779.00) |
| 1-105 | m/z = 486.21($C_{36}H_{26}N_2$ = 486.62) | 1-106 | m/z = 536.23($C_{40}H_{28}N_2$ = 536.68) |
| 1-107 | m/z = 612.26($C_{46}H_{32}N_2$ = 612.78) | 1-108 | m/z = 638.27($C_{48}H_{34}N_2$ = 638.81) |
| 1-109 | m/z = 491.24($C_{36}H_{21}D_5N_2$ = 491.65) | 1-110 | m/z = 612.26($C_{46}H_{32}N_2$ = 612.78) |
| 1-111 | m/z = 794.28($C_{58}H_{38}N_2S$ = 795.02) | 1-112 | m/z = 656.26($C_{48}H_{33}FN_2$ = 656.80) |
| 1-113 | m/z = 717.29($C_{51}H_{35}N_5$ = 717.88) | 1-114 | m/z = 728.32($C_{55}H_{40}N_2$ = 728.94) |
| 1-115 | m/z = 842.34($C_{62}H_{42}N_4$ = 843.05) | 1-116 | m/z = 714.30($C_{54}H_{38}N_2$ = 714.91) |
| 1-117 | m/z = 653.28($C_{48}H_{35}N_3$ = 653.81) | 1-118 | m/z = 703.30($C_{52}H_{37}N_3$ = 703.87) |
| 1-119 | m/z = 805.35($C_{60}H_{43}N_3$ = 806.00) | 1-120 | m/z = 753.31($C_{56}H_{39}N_3$ = 753.93) |
| 1-121 | m/z = 818.34($C_{60}H_{42}N_4$ = 819.00) | 1-122 | m/z = 835.30($C_{60}H_{41}N_3S$ = 836.05) |
| 1-123 | m/z = 655.27($C_{46}H_{33}N_5$ = 655.79) | 1-124 | m/z = 885.32($C_{64}H_{43}N_3S$ = 886.11) |
| 1-125 | m/z = 759.27($C_{54}H_{37}N_3S$ = 759.96) | 1-126 | m/z = 706.28($C_{49}H_{34}N_6$ = 706.83) |
| 1-127 | m/z = 960.39($C_{69}H_{48}N_6$ = 961.16) | 1-128 | m/z = 853.35($C_{64}H_{43}N_3$ = 854.05) |
| 1-129 | m/z = 894.37($C_{66}H_{46}N_4$ = 895.10) | 1-130 | m/z = 834.38($C_{62}H_{38}D_5N_3$ = 835.06) |
| 1-131 | m/z = 855.36($C_{64}H_{45}N_3$ = 856.06) | 1-132 | m/z = 853.35($C_{64}H_{43}N_3$ = 854.05) |
| 1-133 | m/z = 794.37($C_{60}H_{46}N_2$ = 795.04) | 1-134 | m/z = 987.39($C_{71}H_{49}N_5O$ = 988.21) |
| 1-135 | m/z = 1021.44($C_{77}H_{55}N_3$ = 1022.31) | 1-136 | m/z = 737.23($C_{51}H_{32}FN_3S$ = 737.90) |
| 1-137 | m/z = 650.27($C_{49}H_{34}N_2$ = 650.83) | | |
| 2-1 | m/z = 486.21($C_{36}H_{26}N_2$ = 486.61) | 2-2 | m/z = 541.26($C_{40}H_{23}D_5N_2$ = 541.69) |
| 2-3 | m/z = 612.26($C_{46}H_{32}N_2$ = 612.76) | 2-4 | m/z = 562.24($C_{42}H_{30}N_2$ = 562.70) |
| 2-5 | m/z = 636.26($C_{48}H_{32}N_2$ = 636.78) | 2-6 | m/z = 586.24($C_{44}H_{30}N_2$ = 586.72) |
| 2-7 | m/z = 712.29($C_{54}H_{36}N_2$ = 712.88) | 2-8 | m/z = 638.27($C_{48}H_{34}N_2$ = 638.80) |
| 2-9 | m/z = 638.27($C_{48}H_{34}N_2$ = 638.80) | 2-10 | m/z = 638.27($C_{48}H_{34}N_2$ = 638.80) |
| 2-11 | m/z = 638.27($C_{48}H_{34}N_2$ = 638.80) | 2-12 | m/z = 738.30($C_{56}H_{38}N_2$ = 738.91) |
| 2-13 | m/z = 653.28($C_{48}H_{35}N_3$ = 653.81) | 2-14 | m/z = 820.36($C_{60}H_{44}N_4$ = 821.02) |
| 2-15 | m/z = 651.27($C_{48}H_{33}N3$ = 651.80) | 2 16 | m/z = 642.21($C_{46}H_{30}N_2S$ = 642.81) |
| 2-17 | m/z = 668.23($C_{48}H_{32}N_2S$ = 668.85) | 2-18 | m/z = 668.23($C_{48}H_{32}N_2S$ = 668.85) |
| 2-19 | m/z = 692.23($C_{50}H_{32}N_2S$ = 692.87) | 2-20 | m/z = 708.26($C_{51}H_{36}N_2S$ = 708.91) |
| 2-21 | m/z = 794.28($C_{58}H_{38}N_2S$ = 795.00) | 2-22 | m/z = 698.19($C_{48}H_3N_2S_2$ = 698.90) |
| 2-23 | m/z = 652.25($C_{48}H_{32}N_2O$ = 652.78) | 2-24 | m/z = 778.30($C_{58}H_{38}N_2O$ = 778.94) |
| 2-25 | m/z = 753.28($C_{55}H_{35}N_3O$ = 753.89) | 2-26 | m/z = 666.23($C_{48}H_{30}N_2O_2$ = 666.76) |
| 2-27 | m/z = 682.21($C_{48}H_{30}N_2OS$ = 682.83) | 2-28 | m/z = 682.21($C_{48}H_{30}N_2OS$ = 682.83) |
| 2-29 | m/z = 678.30($C_{51}H_{38}N_2$ = 678.86) | 2-30 | m/z = 702.30($C_{53}H_{38}N_2$ = 702.88) |
| 2-31 | m/z = 692.28($C_{51}H_{35}N_2O$ = 692.84) | 2-32 | m/z = 708.26($C_{51}H_{36}N_2S$ = 708.91) |
| 2-33 | m/z = 794.37($C_{60}H_{46}N_2$ = 795.02) | 2-34 | m/z = 802.33($C_{61}H_{42}N_2$ = 803.00) |
| 2-35 | m/z = 879.36($C_{66}H_{45}N_3$ = 880.08) | 2-36 | m/z = 842.37($C_{64}H_{46}N_2$ = 843.06) |
| 2-37 | m/z = 832.29($C_{61}H_{40}N_2S$ = 833.05) | 2-38 | m/z = 724.29($C_{55}H_{36}N_2$ = 724.89) |
| 2-39 | m/z = 800.32($C_{61}H_{40}N_2$ = 800.98) | 2-40 | m/z = 840.35($C_{64}H_{44}N_2$ = 841.05) |
| 2-41 | m/z = 830.28($C_{61}H_{38}N_2S$ = 831.03) | 2-42 | m/z = 814.30($C_{61}H_{38}N_2O$ = 814.97) |
| 2-43 | m/z = 638.27($C_{48}H_{34}N_2$ = 638.80) | 2-44 | m/z = 803.33($C_{60}H_{41}N_3$ = 803.99) |
| 2-45 | m/z = 638.27($C_{48}H_{34}N_2$ = 638.80) | 2-46 | m/z = 668.23($C_{48}H_{32}N_2S$ = 668.85) |
| 2-47 | m/z = 678.30($C_{51}H_{38}N_2$ = 678.86) | 2-48 | m/z = 835.30($C_{60}H_{41}N_3S$ =836.05) |
| 2-49 | m/z = 682.21($C_{48}H_{30}N_2OS$ = 682.83) | 2-50 | m/z = 668.23($C_{48}H_{32}N_2S$ = 668.85) |
| 2-51 | m/z = 612.26($C_{46}H_{32}N_2$ = 612.76) | 2-52 | m/z = 638.27($C_{48}H_{34}N_2$ = 638.80) |
| 2-53 | m/z = 782.24($C_{56}H_{34}N_2OS$ = 782.95) | 2-54 | m/z = 790.33($C_{60}H_{42}N_2$ = 790.99) |

TABLE 3-continued

| Compound | FD-MS | Compound | FD-MS |
|---|---|---|---|
| 2-55 | m/z = 805.31($C_{59}H_{39}N_3O$ = 805.96) | 2-56 | m/z = 664.29($C_{50}H_{36}N_2$ = 664.83) |
| 2-57 | m/z = 803.33($C_{60}H_{41}N_3$ = 803.99) | 2-58 | m/z = 768.26($C_{56}H_{36}N_2S$ = 768.96) |
| 2-59 | m/z = 650.27($C_{49}H_{34}N_2$ = 650.81) | 2-60 | m/z = 688.29($C_{52}H_{36}N_2$ = 688.86) |
| 2-61 | m/z = 744.26($C_{54}H_{36}N_2S$ = 744.94) | 2-62 | m/z = 667.21($C_{47}H_{29}N_3S$ = 667.82) |
| 2-63 | m/z = 642.21($C_{46}H_{30}N_2S$ = 642.81) | 2-64 | m/z = 566.18($C_{40}H_{26}N_2S$ = 566.71) |
| 2-65 | m/z = 699.18($C_{47}H_{29}N_3S_2$ = 699.88) | 2-66 | m/z = 682.21($C_{48}H_{30}N_2OS$ = 682.83) |
| 2-67 | m/z = 742.24($C_{34}H_{34}N_2S$ = 742.93) | 2-68 | m/z = 652.25($C_{48}H_{32}N_2O$ = 652.78) |
| 2-69 | m/z = 652.25($C_{48}H_{32}N_2O$ = 652.78) | 2-70 | m/z = 678.30($C_{51}H_{38}N_2$ = 678.86) |
| 2-71 | m/z = 657.32($C_{49}H_{31}D_5N_2$ = 657.85) | 2-72 | m/z = 576.26($C_{43}H_{32}N_2$ = 576.73) |
| 2-73 | m/z = 642.30($C_{48}H_{38}N_2$ = 642.83) | 2-74 | m/z = 766.33($C_{58}H_{42}N_2$ = 766.97) |
| 2-75 | m/z = 767.33($C_{57}H_{41}N_3$ = 767.96) | 2-76 | m/z = 708.26($C_{51}H_{36}N_2S$ = 708.91) |
| 2-77 | m/z = 692.28($C_{51}H_{35}N_2O$ = 692.84) | 2-78 | m/z = 706.26($C_{51}H_{34}N_2O_2$ = 706.83) |
| 2-79 | m/z = 722.24($C_{51}H_{34}N_2OS$ = 722.89) | 2-80 | m/z = 666.27($C_{49}H_{34}N_2O$ = 666.81) |
| 2-81 | m/z = 603.27($C_{44}H_{33}N_3$ = 603.75) | 2-82 | m/z = 778.33($C_{59}H_{42}N_2$ = 778.98) |
| 2-83 | m/z = 755.33($C_{56}H_{41}N_3$ = 755.94) | 2-84 | m/z = 802.33($C_{61}H_{42}N_2$ = 803.00) |
| 2-85 | m/z = 778.31($C_{57}H_{38}N_4$ = 778.94) | 2-86 | m/z = 890.37($C_{68}H_{46}N_2$ = 891.11) |
| 2-87 | m/z = 756.26($C_{55}H_{35}N_2S$ = 756.95) | 2-88 | m/z = 846.27($C_{61}H_{38}N_2OS$ = 847.03) |
| 2-89 | m/z = 776.32($C_{59}H_{40}N_2$ = 776.96) | 2-90 | m/z = 648.26($C_{49}H_{32}N_2$ = 648.79) |
| 2-91 | m/z = 800.32($C_{61}H_{40}N_2$ = 800.98) | 2-92 | m/z = 830.28($C_{61}H_{38}N_2S$ = 831.03) |
| 2-93 | m/z = 864.31($C_{65}H_{40}N_2O$ =8 65.03) | 2-94 | m/z = 840.35($C_{64}H_{44}N_2$ = 841.05) |
| 2-95 | m/z = 936.35($C_{72}H_{44}N_2$ = 937.13) | 2-96 | m/z = 844.25($C_{61}H_{36}N_2OS$ = 845.02) |
| 2-97 | m/z = 927.36($C_{70}H_{45}N_3$ = 928.13) | 2-98 | m/z = 688.29($C_{52}H_{36}N_2$ = 688.86) |
| 2-99 | m/z = 652.29($C_{49}H_{35}N_2$ = 652.82) | 2-100 | m/z = 826.33($C_{63}H_{42}N_2$ = 827.02) |
| 2-101 | m/z = 702.27($C_{52}H_{34}N_2O$ = 702.84) | 2-102 | m/z = 688.29($C_{52}H_{36}N_2$ = 688.86) |
| 2-103 | m/z = 728.32($C_{55}H_{40}N_2$ = 728.92) | 2-104 | m/z = 884.29($C_{64}H_{40}N_2OS$ = 885.08) |
| 2-105 | m/z = 586.24($C_{44}H_{30}N_2$ = 586.72) | 2-106 | m/z = 718.24($C_{52}H_{34}N_2S$ = 718.90) |
| 2-107 | m/z = 732.22($C_{52}H_{32}N_2OS$ = 732.89) | 2-108 | m/z = 702.30($C_{53}H_{38}N_2$ = 702.88) |
| 2-25 | m/z = 753.28($C_{55}H_{35}N_3O$ = 753.89) | 2-26 | m/z = 666.23($C_{48}H_{30}N_2O_2$ = 666.76) |
| 2-27 | m/z = 682.21($C_{48}H_{30}N_2OS$ = 682.83) | 2-28 | m/z = 682.21($C_{48}H_{30}N_2OS$ = 682.83) |
| 2-29 | m/z = 678.30($C_{51}H_{38}N_2$ = 678.86) | 2-30 | m/z = 702.30($C_{53}H_{38}N_2$ = 702.88) |
| 2-31 | m/z = 692.28($C_{51}H_{36}N_2O$ = 692.84) | 2-32 | m/z = 708.26($C_{51}H_{36}N_2S$ = 708.91) |
| 2-33 | m/z = 794.37($C_{60}H_{46}N_2$ = 795.02) | 2-34 | m/z = 802.33($C_{61}H_{42}N_2$ = 803.00) |
| 2-35 | m/z = 879.36($C_{66}H_{45}N_3$ = 880.08) | 2-36 | m/z = 842.37($C_{64}H_{46}N_2$ = 843.06) |
| 2-37 | m/z = 832.29($C_{61}H_{40}N_2S$ = 833.05) | 2-38 | m/z = 724.29($C_{55}H_{36}N_2$ = 724.89) |
| 2-39 | m/z = 800.32($C_{61}H_{40}N_2$ = 800.98) | 2-40 | m/z = 840.35($C_{64}H_{44}N_2$ = 841.05) |
| 2-41 | m/z = 830.28($C_{61}H_{38}N_2S$ = 831.03) | 2-42 | m/z = 814.30($C_{61}H_{38}N_2O$ = 814.97) |
| 2-43 | m/z = 638.27($C_{48}H_{34}N_2$ = 638.80) | 2-44 | m/z = 803.33($C_{60}H_{41}N_3$ = 803.99) |
| 2-45 | m/z = 638.27($C_{48}H_{34}N_2$ = 638.80) | 2-46 | m/z = 668.23($C_{48}H_{32}N_2S$ = 668.85) |
| 2-47 | m/z = 678.30($C_{51}H_{38}N_2$ = 678.86) | 2-48 | m/z = 835.30($C_{60}H_{41}N_3S$ = 836.05) |
| 2-49 | m/z = 682.21($C_{48}H_{30}N_2OS$ = 682.83) | 2-50 | m/z = 668.23($C_{48}H_{32}N_2S$ = 668.85) |
| 2-51 | m/z = 612.26($C_{46}H_{32}N_2$ = 612.76) | 2-52 | m/z = 638.27($C_{48}H_{34}N_2$ = 638.80) |
| 2-53 | m/z = 782.24($C_{56}H_{34}N_2OS$ = 782.95) | 2-54 | m/z = 790.33($C_{60}H_{42}N_2$ = 790.99) |
| 2-55 | m/z = 805.31($C_{59}H_{39}N_3O$ = 805.96) | 2-56 | m/z = 664.29($C_{50}H_{36}N_2$ = 664.83) |
| 2-57 | m/z = 803.33($C_{60}H_{41}N_3$ = 803.99) | 2-58 | m/z = 768.26($C_{56}H_{36}N_2S$ = 768.96) |
| 2-59 | m/z = 650.27($C_{49}H_{34}N_2$ = 650.81) | 2-60 | m/z = 688.29($C_{52}H_{36}N_2$ = 688.86) |
| 2-61 | m/z = 744.26($C_{54}H_{36}N_2S$ = 744.94) | 2-62 | m/z = 667.21($C_{47}H_{29}N_3S$ = 667.82) |
| 2-63 | m/z = 642.21($C_{46}H_{30}N_2S$ =6 42.81) | 2-64 | m/z = 566.18($C_{40}H_{26}N_2S$ = 566.71) |
| 2-65 | m/z = 699.18($C_{47}H_{29}N_3S_2$ = 699.88) | 2-66 | m/z = 682.21($C_{48}H_{30}N_2OS$ = 682.83) |
| 2-67 | m/z = 742.24($C_{54}H_{34}N_2S$ = 742.93) | 2-68 | m/z = 652.25($C_{48}H_{32}N_2O$ = 652.78) |
| 2-69 | m/z = 652.25($C_{48}H_{32}N_2O$ = 652.78) | 2-70 | m/z = 678.30($C_{51}H_{38}N_2$ = 678.86) |
| 2-71 | m/z = 657.32($C_{49}H_{31}D_5N_2$ = 657.85) | 2-72 | m/z = 576.26($C_{43}H_{32}N_2$ = 576.73) |
| 2-73 | m/z = 642.30($C_{48}H_{38}N_2$ = 642.83) | 2-74 | m/z = 766.33($C_{58}H_{42}N_2$ = 766.97) |
| 2-75 | m/z = 767.33($C_{57}H_{41}N_3$ = 767.96) | 2-76 | m/z = 708.26($C_{51}H_{36}N_2S$ = 708.91) |
| 2-77 | m/z = 692.28($C_{51}H_{35}N_2O$ = 692.84) | 2-78 | m/z = 706.26($C_{51}H_{34}N_2O_2$ = 706.83) |
| 2-79 | m/z = 722.24($C_{51}H_{34}N_2OS$ = 722.89) | 2-80 | m/z = 666.27($C_{49}H_{34}N_2O$ = 666.81) |
| 2-81 | m/z = 603.27($C_{44}H_{33}N_3$ = 603.75) | 2-82 | m/z = 778.33($C_{59}H_{42}N_2$ = 778.98) |
| 2-83 | m/z = 755.33($C_{56}H_{41}N_3$ = 755.94) | 2-84 | m/z = 802.33($C_{61}H_{42}N_2$ = 803.00) |
| 2-85 | m/z = 778.31($C_{57}H_{38}N_4$ = 778.94) | 2-86 | m/z = 890.37($C_{68}H_{46}N_2$ = 891.11) |
| 2-87 | m/z = 756.26($C_{55}H_{36}N_2S$ = 756.95) | 2-88 | m/z = 846.27($C_{61}H_{38}N_2OS$ = 847.03) |
| 2-89 | m/z = 776.32($C_{59}H_{40}N_2$ = 776.96) | 2-90 | m/z = 648.26($C_{49}H_{32}N_2$ = 648.79) |
| 2-91 | m/z = 800.32($C_{61}H_{40}N_2$ = 800.98) | 2-92 | m/z = 830.28($C_{61}H_{38}N_2S$ =831.03) |
| 2-93 | m/z = 864.31($C_{65}H_{40}N_2O$ = 865.03) | 2-94 | m/z = 840.35($C_{64}H_{44}N_2$ = 841.05) |
| 2-95 | m/z = 936.35($C_{72}H_{44}N_2$ = 937.13) | 2-96 | m/z = 844.25($C_{61}H_{36}N_2OS$ = 845.02) |
| 2-97 | m/z = 927.36($C_{70}H_{45}N_3$ = 928.13) | 2-98 | m/z = 688.29($C_{52}H_{36}N_2$ = 688.86) |
| 2-99 | m/z = 652.29($C_{49}H_{35}N_2$ = 652.82) | 2-100 | m/z = 826.33($C_{63}H_{42}N_2$ = 827.02) |
| 2-101 | m/z = 702.27($C_{52}H_{34}N_2O$ = 702.84) | 2-102 | m/z = 688.29($C_{52}H_{36}N_2$ = 688.86) |
| 2-103 | m/z = 728.32($C_{55}H_{40}N_2$ = 728.92) | 2-104 | m/z = 884.29($C_{64}H_{40}N_2OS$ = 885.08) |
| 2-105 | m/z = 586.24($C_{44}H_{30}N_2$ = 586.72) | 2-106 | m/z = 718.24($C_{52}H_{34}N_2S$ = 718.90) |
| 2-107 | m/z = 732.22($C_{52}H_{32}N_2OS$ = 732.89) | 2-108 | m/z = 702.30($C_{53}H_{38}N_2$ = 702.88) |
| 2-109 | m/z = 688.29($C_{52}H_{54}N_2$ = 688.86) | 2-110 | m/z = 702.27($C_{52}H_{34}N_2O$ = 702.84) |
| 2-111 | m/z = 692.23($C_{50}H_{32}N_2S$ = 692.87) | 2-112 | m/z = 782.24($C_{56}H_{34}N_2OS$ = 782.95) |
| 2-113 | m/z = 738.30($C_{56}H_{38}N_2$ = 738.91) | 2-114 | m/z = 768.26($C_{56}H_{36}N_2S$ = 768.96) |
| 2-115 | m/z = 716.32($C_{54}H_{40}N_2$ = 716.91) | 2-116 | m/z = 857.29($C_{62}H_{39}N_3S$ = 858.06) |
| 2-117 | m/z = 738.30($C_{56}H_{38}N_2$ = 738.91) | 2-118 | m/z = 753.28($C_{55}H_{35}N_3O$ = 753.89) |
| 2-119 | m/z = 677.28($C_{50}H_{35}N_3$ = 677.83) | 2-120 | m/z = 879.32($C_{65}H_{41}N_3O$ = 880.04) |
| 2-121 | m/z = 612.26($C_{46}H_{32}N_2$ = 612.76) | 2-122 | m/z = 756.31($C_{56}H_{40}N_2O$ = 756.93) |
| 2-123 | m/z = 727.30($C_{54}H_{37}N_3$ = 727.89) | 2-124 | m/z = 866.37($C_{66}H_{46}N_2$ = 867.08) |
| 3-1 | m/z = 503.17($C_{36}H_{25}NS$ = 503.66) | 3-2 | m/z = 603.20($C_{44}H_{29}NS$ = 603.77) |

TABLE 3-continued

| Compound | FD-MS | Compound | FD-MS |
|---|---|---|---|
| 3-3 | m/z = 477.16($C_{34}H_{23}NS$ = 477.62) | 3-4 | m/z = 503.17($C_{36}H_{25}NS$ = 503.66) |
| 3-5 | m/z = 451.14($C_{32}H_{21}NS$ = 451.58) | 3-6 | m/z = 593.22($C_{43}H_{31}NS$ = 593.78) |
| 3-7 | m/z = 641.22($C_{47}H_{31}NS$ = 641.82) | 3-8 | m/z = 665.22($C_{49}H_{31}NS$ =665.84) |
| 3-9 | m/z = 503.17($C_{36}H_{25}NS$ = 503.66) | 3-10 | m/z = 655.23($C_{48}H_{33}NS$ = 655.85) |
| 3-11 | m/z = 695.26($C_{51}H_{37}NS$ = 695.91) | 3-12 | m/z = 593.18($C_{42}H_{27}NOS$ = 593.73) |
| 3-13 | m/z = 583.14($C_{40}H_{25}NS_2$ = 583.76) | 3-14 | m/z = 579.20($C_{42}H_{29}NS$ = 579.75) |
| 3-15 | m/z = 685.19($C_{48}H_{31}NS_2$ = 685.90) | 3-16 | m/z = 719.23($C_{52}H_{33}NOS$ = 719.89) |
| 3-17 | m/z = 629.22($C_{46}H_{31}NS$ = 629.81) | 3-18 | m/z = 629.22($C_{46}H_{31}NS$ = 629.81) |
| 3-19 | m/z = 603.20($C_{44}H_{29}NS$ = 603.77) | 3-20 | m/z = 563.08($C_{36}H_{21}NS_3$ = 563.75) |
| 3-21 | m/z = 639.11($C_{42}H_{25}NS_3$ = 639.85) | 3-22 | m/z = 715.15($C_{48}H_{29}NS_3$ = 715.95) |
| 3-23 | m/z = 791.18($C_{54}H_{33}NS_3$ = 792.04) | 3-24 | m/z = 607.16($C_{42}H_{25}NO_2S$ = 607.72) |
| 3-25 | m/z = 633.21($C_{45}H_{31}NOS$ = 633.80) | 3-26 | m/z = 733.24($C_{53}H_{35}NOS$ = 733.92) |
| 3-27 | m/z = 883.29($C_{65}H_{41}NOS$ = 884.09) | 3-28 | m/z = 585.13($C_{38}H_{23}N_3S_2$ = 585.74) |
| 3-29 | m/z = 553.19($C_{40}H_{27}NS$ = 553.71) | 3-30 | m/z = 603.20($C_{44}H_{29}NS$ = 603.77) |
| 3-31 | m/z = 841.28($C_{63}H_{39}NS$ = 842.06) | 3-32 | m/z = 567.17($C_{40}H_{25}NOS$ = 567.71) |
| 3-33 | m/z = 563.22($C_{42}H_{29}NO$ = 563.69) | 3-34 | m/z = 563.22($C_{42}H_{29}NO$ = 563.69) |
| 3-35 | m/z = 613.24($C_{46}H_{31}NO$ = 613.74) | 3-36 | m/z = 703.29($C_{53}H_{37}NO$ =7 03.87) |
| 3-37 | m/z = 587.22($C_{44}H_{29}NO$ = 587.71) | 3-38 | m/z = 639.26($C_{48}H_{33}NO$ = 639.78) |
| 3-39 | m/z = 639.26($C_{48}H_{33}NO$ = 639.78) | 3-40 | m/z = 653.24($C_{48}H_{31}NO_2$ = 653.77) |
| 3-41 | m/z = 603.26($C_{45}H_{33}NO$ = 603.75) | 3-42 | m/z = 727.29($C_{55}H_{37}NO$ = 727.89) |
| 3-43 | m/z = 725.27($C_{55}H_{35}NO$ = 725.87) | 3-44 | m/z = 595.17($C_{40}H_{25}N_3OS$ = 595.71) |
| 3-45 | m/z = 567.26($C_{42}H_{33}NO$ = 567.72) | 3-46 | m/z = 611.22($C_{46}H_{29}NO$ = 611.73) |
| 3-47 | m/z = 617.18($C_{44}H_{27}NOS$ = 617.76) | 3-48 | m/z = 637.24($C_{48}H_{31}NO$ = 637.77) |
| 3-49 | m/z = 667.21($C_{48}H_{29}NO_3$ = 667.75) | 3-50 | m/z = 767.25($C_{56}H_{33}NO_3$ = 767.87) |
| 3-51 | m/z = 681.27($C_{50}H_{35}NO_2$ = 681.82) | 3-52 | m/z = 567.17($C_{40}H_{25}NOS$ = 567.71 |
| 3-53 | m/z = 658.22($C_{45}H_{30}N_4S$ = 658.82) | 3-54 | m/z = 655.23($C_{48}H_{33}NS$ = 655.86) |
| 3-55 | m/z = 744.26($C_{54}H_{36}N_2S$ = 744.96) | 3-56 | m/z = 784.27($C_{55}H_{36}N_4S$ = 784.98) |
| 3-57 | m/z = 553.19($C_{40}H_{27}NS$ = 553.72) | 3-58 | m/z = 553.19($C_{40}H_{27}NS$ = 553.72) |
| 3-59 | m/z = 543.2($C_{39}H_{29}NS$ = 543.73) | 3-60 | m/z = 671.21($C_{48}H_{30}FNS$ = 671.83) |
| 3-61 | m/z = 641.25($C_{46}H_{31}N_3O$ = 641.77) | 3-62 | m/z = 639.26($C_{48}H_{33}NO$ = 639.8) |
| 3-63 | m/z = 652.25($C_{48}H_{32}N_2O$ = 652.8) | 3-64 | m/z = 667.25($C_{49}H_{33}NO_2$ = 667.81) |
| 3-65 | m/z = 567.17($C_{40}H_{25}NOS$ = 567.71) | 3-66 | m/z = 567.17($C_{40}H_{25}NOS$ = 567.71) |
| 3-67 | m/z = 731.23($C_{53}H_{33}NOS$ = 731.91) | 3-68 | m/z = 731.23($C_{53}H_{33}NOS$ = 731.91) |
| 3-69 | m/z = 683.23($C_{49}H_{33}NOS$ = 683.87) | 3-70 | m/z = 551.19($C_{40}H_{25}NO_2$ = 551.65) |
| 3-71 | m/z = 643.2($C_{45}H_{29}NOS$ = 643.8) | 3-72 | m/z = 601.2($C_{44}H_{27}NO_2$ = 601.71) |
| 3-73 | m/z = 607.2($C_{43}H_{29}NOS$ = 607.77) | 3-74 | m/z = 701.28($C_{50}H_{20}NOS$ = 701.93) |
| 3-75 | m/z = 577.24($C_{43}H_{31}NO$ = 577.73) | 3-76 | m/z = 567.17($C_{40}H_{25}NOS$ = 567.71) |
| 4-1 | m/z = 513.25($C_{39}H_{31}N$ = 513.68) | 4-2 | m/z = 613.28($C_{47}H_{35}N$ = 613.80) |
| 4-3 | m/z = 665.31($C_{51}H_{39}N$ = 665.88) | 4-4 | m/z = 705.34($C_{54}H_{43}N$ = 705.95) |
| 4-5 | m/z = 593.31($C_{45}H_{39}N$ = 593.81) | 4-6 | m/z = 589.28($C_{45}H_{35}N$ = 589.78) |
| 4-7 | m/z = 513.25($C_{39}H_{31}N$ = 513.68) | 4-8 | m/z = 639.29($C_{49}H_{37}N$ = 639.84) |
| 4-9 | m/z = 589.28($C_{45}H_{35}N$ = 589.78) | 4-10 | m/z = 665.31($C_{51}H_{39}N$ = 665.88) |
| 4-11 | m/z = 553.28($C_{42}H_{35}N$ = 553.75) | 4-12 | m/z = 669.34($C_{51}H_{43}N$ = 669.91) |
| 4-13 | m/z = 779.36($C_{60}H_{45}N$ = 780.03) | 4-14 | m/z = 761.35($C_{56}H_{47}NSi$ = 762.08) |
| 4-15 | m/z = 705.34($C_{54}H_{43}N$ = 705.95) | 4-16 | m/z = 589.28($C_{45}H_{35}N$ = 589.78) |
| 4-17 | m/z = 665.31($C_{51}H_{39}N$ = 665.88) | 4-18 | m/z = 728.32($C_{55}H_{40}N_2$ =728.94) |
| 4-19 | m/z = 637.28($C_{49}H_{35}N$ = 637.83) | 4-20 | m/z = 789.34($C_{61}H_{43}N$ = 790.02) |
| 4-21 | m/z = 677.31($C_{52}H_{39}N$ = 677.89) | 4-22 | m/z = 775.32($C_{60}H_{41}N$ = 776.00) |
| 4-23 | m/z = 801.34($C_{62}H_{43}N$ = 802.03) | 4-24 | m/z = 799.32($C_{62}H_{41}N$ = 800.02) |
| 4-25 | m/z = 965.40($C_{75}H_{51}N$ = 966.24) | 4-26 | m/z = 637.28($C_{49}H_{35}N$ = 637.83) |
| 4-27 | m/z = 635.26($C_{49}H_{33}N$ = 635.81) | 4-28 | m/z = 616.29($C_{47}H_{28}D_5N$ = 616.82) |
| 4-29 | m/z = 727.32($C_{56}H_{41}N$ = 727.95) | 4-30 | m/z = 687.29($C_{53}H_{37}N$ = 687.89) |
| 4-31 | m/z = 877.37($C_{68}H_{47}N$ = 878.13) | 4-32 | m/z = 753.34($C_{58}H_{43}N$ = 753.99) |
| 4-33 | m/z = 689.31($C_{53}H_{39}N$ = 689.90) | 4-34 | m/z = 637.28($C_{49}H_{35}N$ = 637.83) |
| 4-35 | m/z = 850.32($C_{62}H_{40}F_2N_2$ = 851.01) | 4-36 | m/z = 559.23($C_{43}H_{29}N$ = 559.71) |
| 4-37 | m/z = 635.26($C_{49}H_{33}N$ = 635.81) | 4-38 | m/z = 663.29($C_{51}H_{37}N$ = 663.86) |
| 4-39 | m/z = 735.29($C_{57}H_{37}N$ = 735.93) | 4-40 | m/z = 735.29($C_{57}H_{37}N$ = 735.93) |
| 4-41 | m/z = 725.31($C_{56}H_{39}N$ = 725.94) | 4-42 | m/z = 735.29($C_{57}H_{37}N$ = 735.93) |
| 4-43 | m/z = 751.32($C_{88}H_{41}N$ = 751.97) | 4-44 | m/z = 725.31($C_{56}H_{39}N$ = 725.94) |
| 4-45 | m/z = 675.29($C_{52}H_{37}N$ = 675.88) | 4-46 | m/z = 675.29($C_{52}H_{37}N$ = 675.88) |
| 4-47 | m/z = 751.32($C_{58}H_{41}N$ = 751.97) | 4-48 | m/z = 675.29($C_{52}H_{37}N$ = 675.88) |
| 4-49 | m/z = 721.28($C_{56}H_{35}N$ = 721.90) | 4-50 | m/z = 797.31($C_{62}H_{39}N$ = 798.00) |
| 4-51 | m/z = 959.36($C_{75}H_{45}N$ = 960.19) | 4-52 | m/z = 607.23($C_{47}H_{29}N$ = 607.76) |
| 4-53 | m/z = 675.29($C_{52}H_{37}N$ = 675.88) | 4-54 | m/z = 635.26($C_{49}H_{33}N$ = 635.81) |
| 4-55 | m/z = 640.29($C_{49}H_{28}D_5N$ = 640.84) | 4-56 | m/z = 685.28($C_{53}H_{35}N$ = 685.87) |
| 4-57 | m/z =735.29($C_{57}H_{37}N$ = 735.93) | 4-58 | m/z = 583.23($C_{45}H_{29}N$ = 583.73) |
| 4-59 | m/z = 725.31($C_{56}H_{39}N$ = 725.94) | 4-60 | m/z = 725.31($C_{56}H_{39}N$ = 725.94) |
| 4-61 | m/z = 635.26($C_{49}H_{33}N$ = 635.81) | 4-62 | m/z = 751.32($C_{58}H_{41}N$ = 751.97) |
| 4-63 | m/z = 751.32($C_{58}H_{41}N$ = 751.97) | 4-64 | m/z = 751.32($C_{58}H_{41}N$ = 751.97) |
| 4-65 | m/z = 842.37($C_{64}H_{46}N_2$ = 843.09) | 4-66 | m/z = 751.32($C_{58}H_{11}N$ = 751.97) |
| 4-67 | m/z = 873.34($C_{68}H_{43}N$ = 874.10) | 4-68 | m/z = 711.29($C_{55}H_{37}N$ = 711.91) |
| 4-69 | m/z = 751.32($C_{58}H_{41}N$ = 751.97) | 4-70 | m/z = 787.32($C_{61}H_{41}N$ = 788.01) |
| 5-1 | m/z = 583.23($C_{45}H_{29}N$ = 583.73) | 5-2 | m/z = 609.25($C_{47}H_{31}N$ = 609.77) |
| 5-3 | m/z = 685.28($C_{53}H_{35}N$ = 685.87) | 5-4 | m/z = 659.26($C_{51}H_{33}N$ = 659.83) |
| 5-5 | m/z = 607.23($C_{47}H_{29}N$ = 607.76) | 5-6 | m/z = 685.28($C_{53}H_{35}N$ = 685.87) |
| 5-7 | m/z = 664.29($C_{51}H_{28}D_5N$ = 664.86) | 5-8 | m/z = 649.28($C_{50}H_{35}N$ = 649.84) |
| 5-9 | m/z = 699.29($C_{54}H_{37}N$ = 699.90) | 5-10 | m/z = 699.29($C_{54}H_{37}N$ = 699.90) |
| 5-11 | m/z = 725.31($C_{56}H_{39}N$ = 725.94) | 5-12 | m/z = 739.32($C_{57}H_{41}N$ = 739.96) |

TABLE 3-continued

| Compound | FD-MS | Compound | FD-MS |
|---|---|---|---|
| 5-13 | m/z = 730.34($C_{56}H_{34}D_5N$ = 730.97) | 5-14 | m/z = 775.32($C_{60}H_{41}N$ = 776.00) |
| 5-15 | m/z = 775.32($C_{60}H_{41}N$ = 776.00) | 5-16 | m/z = 775.32($C_{60}H_{41}N$ = 776.00) |
| 5-17 | m/z = 725.31($C_{56}H_{39}N$ = 725.94) | 5-18 | m/z = 773.31($C_{60}H_{39}N$ = 773.98) |
| 5-19 | m/z = 725.31($C_{56}H_{39}N$ = 725.94) | 5-20 | m/z = 774.30($C_{59}H_{38}N_2$ = 774.97) |
| 5-21 | m/z = 639.20($C_{47}H_{29}NS$ = 639.82) | 5-22 | m/z = 699.26($C_{53}H_{33}NO$ = 699.85) |
| 5-23 | m/z = 775.29($C_{59}H_{37}NO$ = 775.95) | 5-24 | m/z = 775.29($C_{59}H_{37}NO$ = 775.95) |
| 5-25 | m/z = 865.30($C_{65}H_{39}NO_2$ = 866.03) | 5-26 | m/z = 583.23($C_{45}H_{29}N$ = 583.73) |
| 5-27 | m/z = 685.28($C_{53}H_{35}N$ = 685.87) | 5-28 | m/z = 649.28($C_{50}H_{35}N$ = 649.84) |
| 5-29 | m/z = 699.29($C_{54}H_{37}N$ = 699.90) | 5-30 | m/z = 725.31($C_{56}H_{39}N$ = 725.94) |
| 5-31 | m/z = 725.31($C_{56}H_{39}N$ = 725.94) | 5-32 | m/z = 775.32($C_{60}H_{41}N$ = 776.00) |
| 5-33 | m/z = 775.32($C_{60}H_{41}N$ = 776.00) | 5-34 | m/z = 775.32($C_{60}H_{41}N$ = 776.00) |
| 5-35 | m/z = 699.29($C_{54}H_{37}N$ = 699.90) | 5-36 | m/z = 773.31($C_{60}H_{39}N$ = 773.98) |
| 5-37 | m/z = 715.23($C_{53}H_{33}NS$ = 715.91) | 5-38 | m/z = 739.29($C_{56}H_{37}NO$ = 739.92) |
| 5-39 | m/z = 699.26($C_{53}H_{33}NO$ = 699.85) | 5-40 | m/z = 662.25($C_{48}H_{30}N_4$ = 662.80) |
| 5-41 | m/z = 685.28($C_{53}H_{35}N$ = 685.87) | 5-42 | m/z = 685.28($C_{53}H_{35}N$ = 685.87) |
| 5-43 | m/z = 633.25($C_{49}H_{31}N$ = 633.79) | 5-44 | m/z = 649.28($C_{50}H_{35}N$ = 649.84) |
| 5-45 | m/z = 725.31($C_{56}H_{39}N$ = 725.94) | 5-46 | m/z = 725.31($C_{56}H_{39}N$ = 725.94) |
| 5-47 | m/z = 801.34($C_{62}H_{43}N$ = 802.03) | 5-48 | m/z = 725.31($C_{56}H_{39}N$ = 725.94) |
| 5-49 | m/z = 849.34($C_{66}H_{43}N$ = 850.08) | 5-50 | m/z = 850.33($C_{65}H_{42}N_2$ = 851.07) |
| 5-51 | m/z = 689.22($C_{51}H_{31}NS$ = 689.88) | 5-52 | m/z = 623.22($C_{47}H_{29}NO$ = 623.76) |
| 5-53 | m/z = 775.29($C_{59}H_{37}NO$ = 775.95) | 5-54 | m/z = 699.26($C_{53}H_{33}NO$ = 699.85) |
| 5-55 | m/z = 715.23($C_{53}H_{33}NS$ = 715.91) | 5-56 | m/z = 690.31($C_{53}H_{30}D_5N$ = 690.90) |
| 5-57 | m/z = 787.32($C_{61}H_{41}N$ = 788.01) | 5-58 | m/z = 699.29($C_{54}H_{37}N$ = 699.90) |
| 5-59 | m/z = 725.31($C_{56}H_{39}N$ = 725.94) | 5-60 | m/z = 715.23($C_{53}H_{33}NS$ = 715.91) |
| 5-61 | m/z = 633.25($C_{49}H_{31}N$ = 633.79) | 5-62 | m/z = 583.23($C_{45}H_{29}N$ = 583.73) |
| 5-63 | m/z = 865.33($C_{66}H_{43}NO$ = 866.08) | 5-64 | m/z = 821.31($C_{64}H_{39}N$ = 822.02) |
| 5-65 | m/z = 698.27($C_{53}H_{34}N_2$ = 698.87) | 5-66 | m/z = 659.26($C_{51}H_{33}N$ = 659.83) |
| 5-67 | m/z = 649.28($C_{50}H_{35}N$ = 649.84) | 5-68 | m/z = 849.34($C_{66}H_{43}N$ = 850.08) |
| 5-69 | m/z = 850.33($C_{65}H_{42}N_2$ = 851.07) | 5-70 | m/z = 825.30($C_{63}H_{39}NO$ = 826.01) |
| 5-71 | m/z = 583.23($C_{45}H_{29}N$ = 583.73) | 5-72 | m/z = 685.28($C_{53}H_{35}N$ = 685.87) |
| 5-73 | m/z = 693.32($C_{53}H_{23}D_{10}N$ = 693.92) | 5-74 | m/z = 699.29($C_{54}H_{37}N$ = 699.90) |
| 5-75 | m/z = 725.31($C_{56}H_{39}N$ = 725.94) | 5-76 | m/z = 775.32($C_{60}H_{41}N$ = 776.00) |
| 5-77 | m/z = 725.31($C_{56}H_{39}N$ = 725.94) | 5-78 | m/z = 849.34($C_{66}H_{43}N$ = 850.08) |
| 5-79 | m/z = 765.31($C_{57}H_{39}N_3$ = 765.96) | 5-80 | m/z = 775.29($C_{59}H_{37}NO$ = 775.95) |
| 5-81 | m/z = 685.28($C_{53}H_{35}N$ = 685.87) | 5-82 | m/z = 609.25($C_{47}H_{31}N$ = 609.77) |
| 5-83 | m/z = 785.31($C_{61}H_{39}N$ = 785.99) | 5-84 | m/z = 725.31($C_{56}H_{39}N$ = 725.94) |
| 5-85 | m/z = 729.21($C_{53}H_{31}NOS$ = 729.90) | 5-86 | m/z = 583.23($C_{45}H_{29}N$ = 583.73) |
| 5-87 | m/z = 685.28($C_{53}H_{35}N$ = 685.87) | 5-88 | m/z = 735.29 (C57H37N=) |
| 5-89 | m/z = 685.28($C_{53}H_{35}N$ = 685.87) | 5-90 | m/z = 685.28($C_{53}H_{35}N$ = 685.87) |
| 5-91 | m/z = 725.31($C_{56}H_{39}N$ = 725.94) | 5-92 | m/z = 749.31($C_{58}H_{39}N$ = 749.96) |
| 5-93 | m/z = 725.31($C_{56}H_{39}N$ = 725.94) | 5-94 | m/z = 725.31($C_{56}H_{39}N$ = 725.94) |
| 5-95 | m/z = 725.31($C_{56}H_{39}N$ = 725.94) | 5-96 | m/z = 773.31($C_{60}H_{39}N$ = 773.98) |
| 5-97 | m/z = 850.33($C_{55}H_{42}N_2$ = 851.07) | 5-98 | m/z = 699.26($C_{53}H_{33}NO$ = 699.85) |
| 5-99 | m/z = 715.23($C_{53}H_{33}NS$ = 715.91) | 5-100 | m/z = 739.29($C_{56}H_{37}NO$ = 739.92) |
| 5-101 | m/z = 709.28($C_{55}H_{35}N$ = 709.89) | 5-102 | m/z = 749.31($C_{58}H_{39}N$ = 749.96) |
| 5-103 | m/z = 901.37($C_{70}H_{47}N$ = 902.15) | 5-104 | m/z = 660.26($C_{50}H_{32}N_2$ = 660.82) |
| 5-105 | m/z = 673.24($C_{51}H_{31}NO$ = 673.82) | 5-106 | m/z = 685.28($C_{53}H_{35}N$ = 685.87) |
| 5-107 | m/z = 775.32($C_{60}H_{41}N$ = 776.00) | 5-108 | m/z = 772.29(C59H36N2 = 772.95) |
| 5-109 | m/z = 928.38($C_{71}H_{48}N_2$ = 929.18) | 5-110 | m/z = 941.31 ($C_{71}H_{43}NS$ = 942.19) |
| 5-111 | m/z = 836.32($C_{64}H_{40}N_2$ = 837.04) | 5-112 | m/z = 913.35($C_{69}H_{43}N_3$ = 914.12) |
| 5-113 | m/z = 800.28($C_{60}H_{36}N_2O$ = 800.96) | 5-114 | m/z = 841.28($C_{63}H_{39}NS$ = 842.07) |
| 5-115 | m/z = 877.37($C_{58}H_{47}N$ = 878.13) | | |
| 6-1 | m/z = 713.31($C_{55}H_{39}N$ = 713.92) | 6-2 | m/z = 589.28($C_{45}H_{35}N$ = 589.78) |
| 6-3 | m/z = 639.29($C_{49}H_{37}N$ = 639.84) | 6-4 | m/z = 613.28($C_{47}H_{35}N$ = 613.8) |
| 6-5 | m/z = 601.28($C_{46}H_{35}N$ = 601.79) | 6-6 | m/z = 677.31($C_{52}H_{39}N$ = 677.89) |
| 6-7 | m/z = 777.3($C_{59}H_{39}NO$ = 777.97) | 6-8 | m/z = 651.26($C_{49}H_{33}NO$ = 651.81) |
| 6-9 | m/z = 577.24($C_{43}H_{31}NO$ = 577.73) | 6-10 | m/z = 593.22($C_{43}H_{31}NS$ = 593.79) |
| 6-11 | m/z = 577.24($C_{43}H_{31}NO$ = 577.73) | 6-12 | m/z = 627.26($C_{47}H_{33}NO$ = 627.79) |
| 6-13 | m/z = 679.32($C_{52}H_{41}N$ = 679.91) | 6-14 | m/z = 651.29($C_{50}H_{37}N$ = 651.85) |
| 6-15 | m/z = 725.31($C_{56}H_{39}N$ = 725.94) | 6-16 | m/z = 725.31($C_{56}H_{39}N$ = 725.94) |
| 6-17 | m/z = 677.31($C_{52}H_{39}N$ = 677.89) | 6-18 | m/z = 601.28($C_{46}H_{35}N$ = 601.79) |
| 6-19 | m/z = 691.29($C_{52}H_{37}NO$ = 691.87) | 6-20 | m/z = 691.29($C_{52}H_{37}NO$ = 691.87) |
| 6-21 | m/z = 691.29($C_{52}H_{37}NO$ = 691.87) | 6-22 | m/z = 689.27($C_{52}H_{35}NO$ = 689.86) |
| 6-23 | m/z = 767.32($C_{58}H_{41}NO$ = 767.97) | 6-24 | m/z = 767.32($C_{58}H_{41}NO$ = 767.97) |
| 6-25 | m/z = 767.32($C_{58}H_{41}NO$ = 767.97) | 6-26 | m/z = 765.3($C_{58}H_{39}NO$ = 765.96) |
| 6-27 | m/z = 677.31($C_{52}H_{39}N$ = 677.89) | 6-28 | m/z = 753.34($C_{58}H_{43}N$ = 753.99) |
| 6-29 | m/z = 753.34($C_{58}H_{4}3N$ = 753.99) | 6-30 | m/z = 819.33($C_{61}H_{45}NSi$ = 820.12) |
| 6-31 | m/z = 824.36($C_{31}H_{45}D_5NSi$ = 825.15) | | |
| 11-1 | m/z = 473.21($C_{36}H_{27}N$ = 473.61) | 11-2 | m/z = 523.23($C_{40}H_{29}N$ = 523.66) |
| 11-3 | m/z = 573.25($C_{44}H_{31}N$ = 573.72) | 11-4 | m/z = 623.26($C_{48}H_{33}N$ = 623.78) |
| 11-5 | m/z = 447.20($C_{34}H_{25}N$ = 447.57) | 11-6 | m/z = 371.17($C_{28}H_{21}N$ = 371.47) |
| 11-7 | m/z = 471.20($C_{36}H_{25}N$ = 471.59) | 11-8 | m/z = 521.21($C_{40}H_{27}N$ = 521.65) |
| 11-9 | m/z = 549.25($C_{42}H_{31}N$ = 549.70) | 11-10 | m/z = 625.28($C_{48}H_{35}N$ = 625.80) |
| 11-11 | m/z = 675.29($C_{52}H_{37}N$ = 675.86) | 11-12 | m/z = 473.21($C_{36}H_{27}N$ = 473.61) |
| 11-13 | m/z = 523.23($C_{40}H_{29}N$ = 523.66) | 11-14 | m/z = 623.26($C_{48}H_{33}N$ = 623.78) |
| 11-15 | m/z = 549.25($C_{42}H_{31}N$ = 549.70) | 11-16 | m/z = 625.28($C_{48}H_{35}N$ = 625.80) |
| 11-17 | m/z = 473.21($C_{36}H_{27}N$ = 473.62) | 11-18 | m/z = 725.31($C_{56}H_{39}N$ = 725.94) |
| 11-19 | m/z = 625.28($C_{48}H_{35}N$ = 625.82) | 11-20 | m/z = 749.31($C_{58}H_{39}N$ = 749.96) |

TABLE 3-continued

| Compound | FD-MS | Compound | FD-MS |
|---|---|---|---|
| 11-21 | m/z = 699.29($C_{54}H_{37}N$ = 699.9) | 11-22 | m/z = 730.34($C_{56}H_{34}D_5N$ = 730.97) |
| 11-23 | m/z = 753.33($C_{58}H_{35}D_4N$ = 753.98) | | |

Synthesis Example 2

A compound (e.g., the fourth compound, the sixth compound, the seventh compound, or the eighth compound described above) represented by Formula D and including a radical of a compound Formula A or Formula B, according to the present disclosure, is prepared by, but is not limited to, reacting Sub 3-A to Sub 3-D with Sub 4 as in the following Reaction Formula 9.

[Reaction Formula 9]

[Reaction Formula 9]

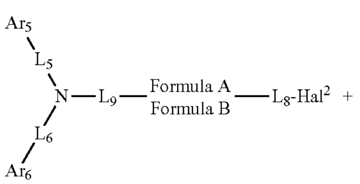

Sub 3-A, Sub 3-B
Sub 3-C, Sub 3-D

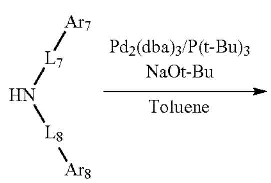

Sub 4

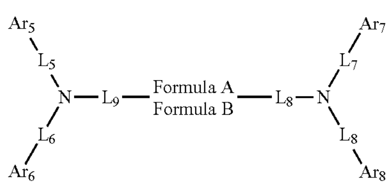

Final Products 2

More specifically, Reaction Formula 8 may be represented by, but is not limited to, the following Reaction Formula 10 to Reaction Formula 13.

[Reaction Formula 10]

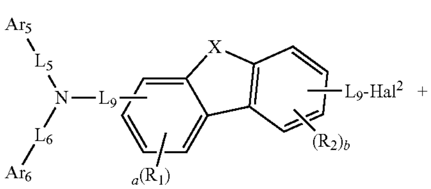

*$Hal^2$ = halogen (F, Cl, Br, I)
Sub 3-A

-continued

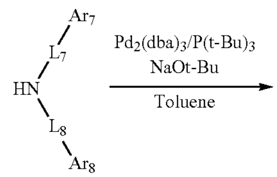

Sub 4

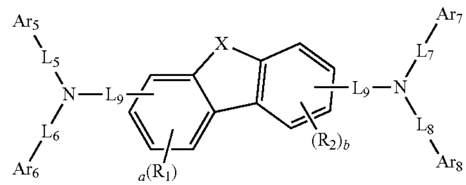

Final Product 2A

[Reaction Formula 11]

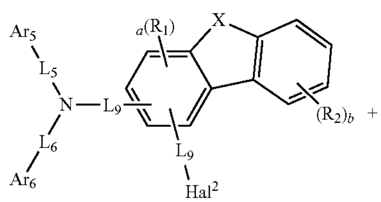

*$Hal^2$ = halogen (F, Cl, Br, I)
Sub 3-B

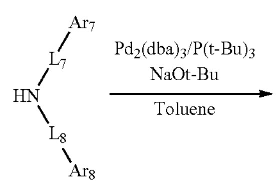

Sub 4

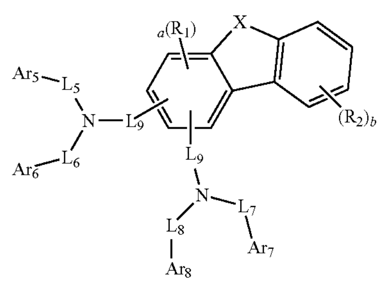

Final Product 2B

[Reaction Formula 12]

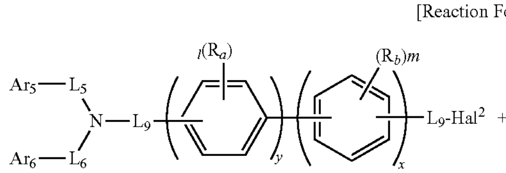

*$Hal^2$ = halogen (F, Cl, Br, I)
Sub 3-C

-continued

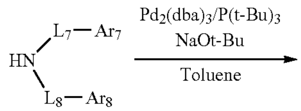

Sub 4

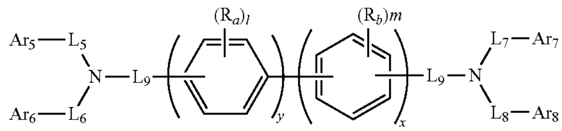

Final Product 2C

[Reaction Formula 13]

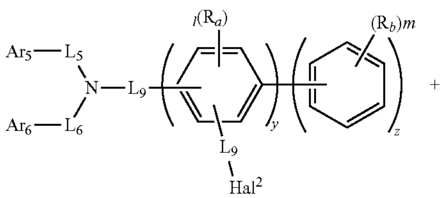

*$Hal^2$ = halogen (F, Cl, Br, I)

Sub 3-D

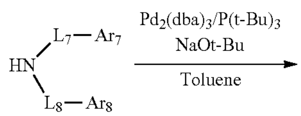

Sub 4

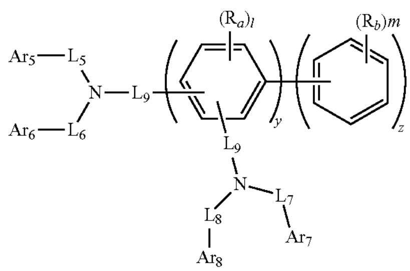

Final Product 2D

Synthesis of Sub 3-A and Sub 3-B

Sub 3-A and Sub 3-B of Reaction Formula 10 and Reaction Formula 11 may be synthesized through, but are not limited to, a reaction path of the following Reaction Formula 14 and Reaction Formula 15.

[Reaction Formula 14]

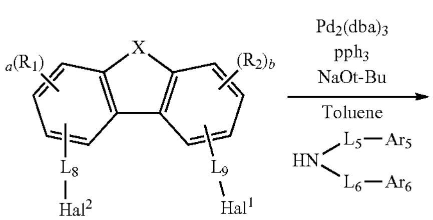

-continued

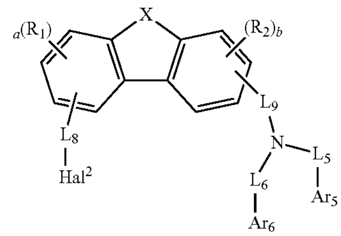

Sub 3-A

[Reaction Formula 15]

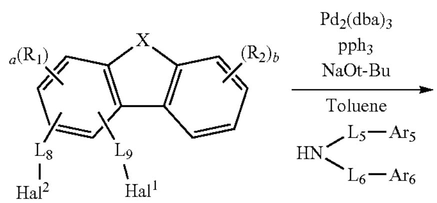

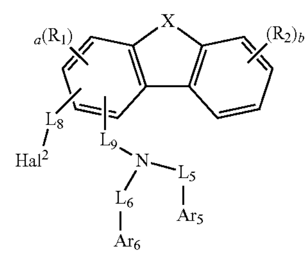

Sub 3-B

Synthesis of Sub 3-C and Sub 3-D

Sub 3-C and Sub 3-D of Reaction Formula 12 and Reaction Formula 13 may be synthesized through, but are not limited to, a reaction path of the following Reaction Formula 16 and Reaction Formula 17.

[Reaction Formula 16]

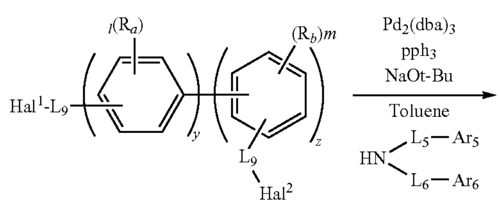

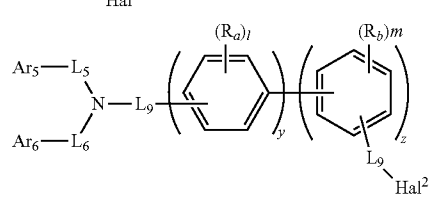

Sub 3-C

-continued

[Reaction Formula 17]

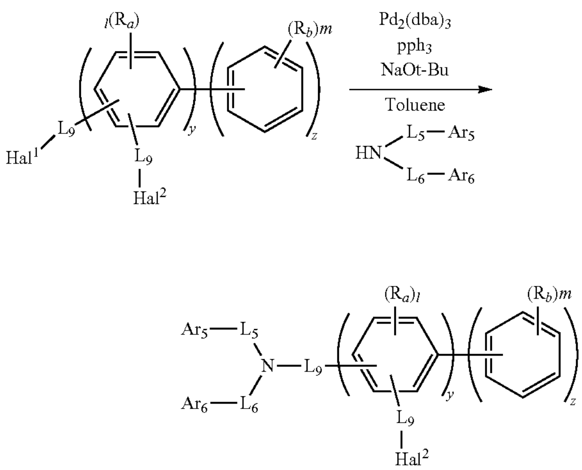

Sub 3-D

1. Sub 3-1 Synthesis Example

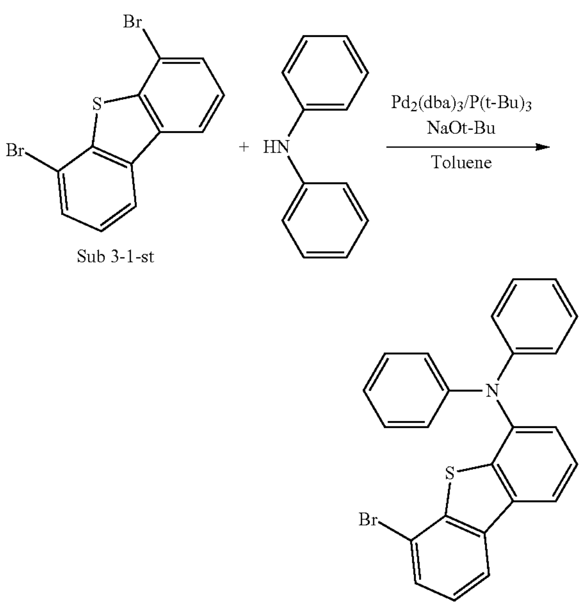

Sub 3-1-st

Sub 3-1

After diphenylamine (15.22 g, 89.94 mmol) serving as a starting material was dissolved with toluene (750 ml) in a round bottom flask, Sub 3-1-st (CAS Registry Number: 669773-34-6) (46.14 g, 134.91 mmol), $Pd_2(dba)_3$ (2.47 g, 2.70 mmol), $P(t\text{-}Bu)_3$ (1.82 g, 8.99 mmol), and NaOt-Bu (25.93 g, 269.81 mmol) were added, followed by stirring at 0° C. When the reaction was completed, extraction was performed with $CH_2Cl_2$ and water, and an organic layer was dried with $MgSO_4$ and concentrated. Afterwards, a resultant compound was subjected to silica gel column chromatography and recrystallization, thereby creating a product 23.61 g (yield: 61%).

2. Sub 3-63 Synthesis Example

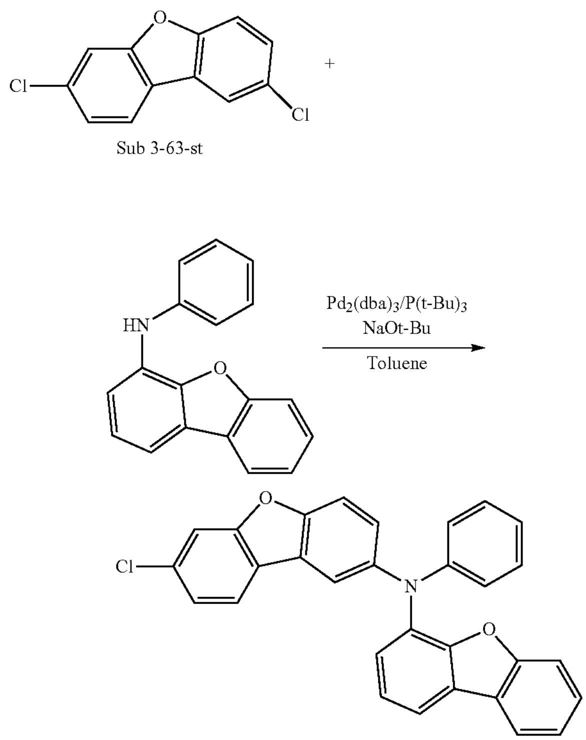

Sub 3-63-st

Sub 3-63

After sub 3-63-st (10 g, 42.18 mmol), $Pd_2(dba)_3$ (1.16 g, 1.27 mmol) $P(t\text{-}Bu)_3$ (8.53 g, 42.18 mmol), NaOt-Bu (8.11 g, 84.36 mmol), and toluene ml) were added (422 to N-phenyldibenzo[b,d]furan-4-amine (10.94 g, 42.18 mmol) serving as a starting material, a synthesis method of Sub 3-1 was used to create a product 13 g (yield: 67%).

3. Sub 3-157 Synthesis Example

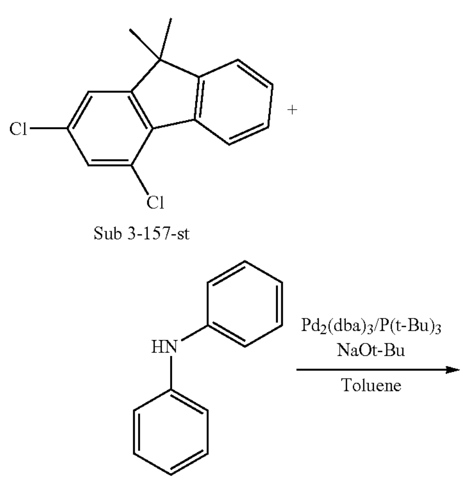

Sub 3-157-st

-continued
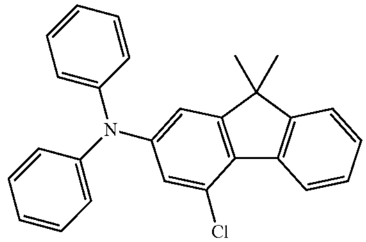
Sub 3-157
After Sub 3-157-st (16.08 g, 95 mmol), $Pd_2(dba)_3$ (2.61 g, 2.85 mmol) $P(t\text{-}Bu)_3$ (19.22 g, 95 mmol), NaOt-Bu (18.26 g, 190 mmol), and toluene (950 ml) were added to diphenylamine (25 g, 95 mmol) serving as a starting material, a synthesis method of Sub 3-1 was used to create a product 24.45 g (yield: 65%).
Sub 3-A to Sub 3-D may have, but are not limited to, the following examples.
Sub 3-1
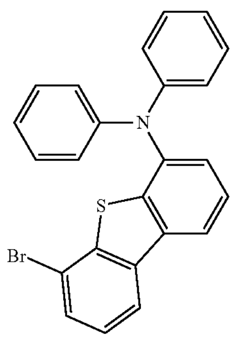
Sub 3-2
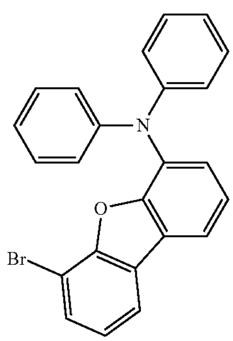
Sub 3-3
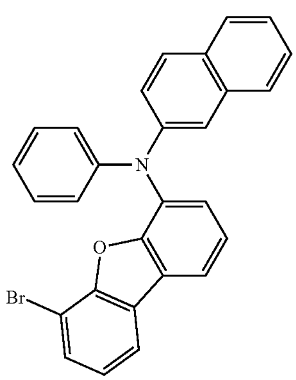
-continued
Sub 3-4
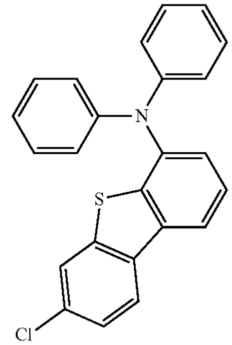
Sub 3-5
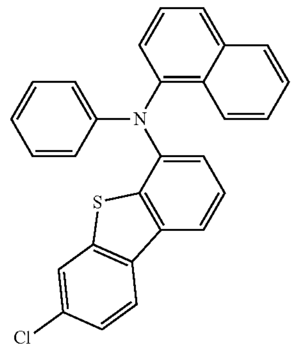
Sub 3-6
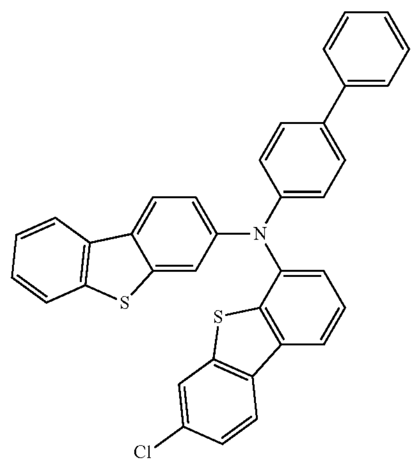
Sub 3-7
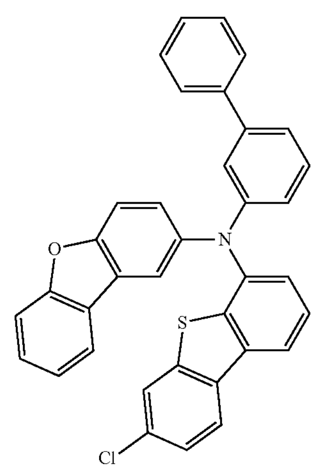

-continued
Sub 3-8
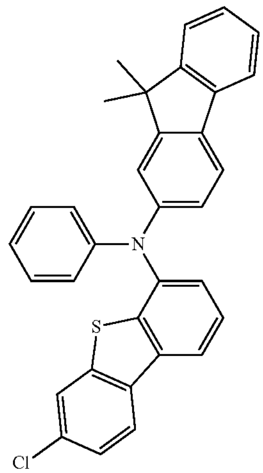
Sub 3-9
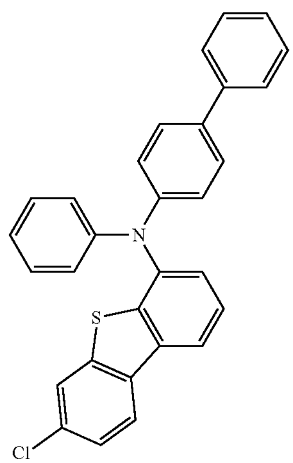
Sub 3-10
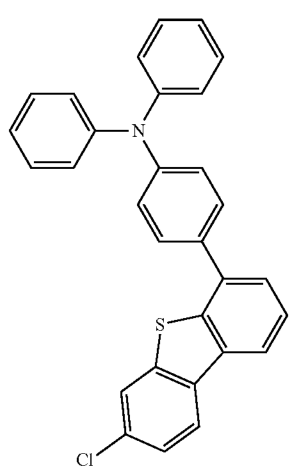
-continued
Sub 3-11
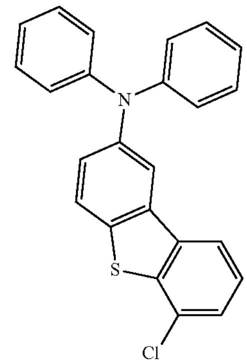
Sub 3-12
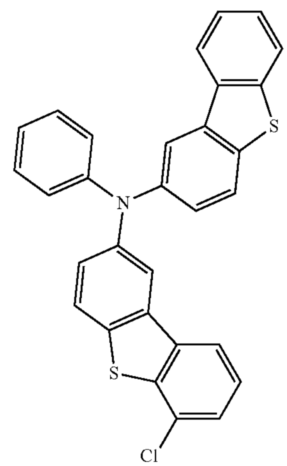
Sub 3-13
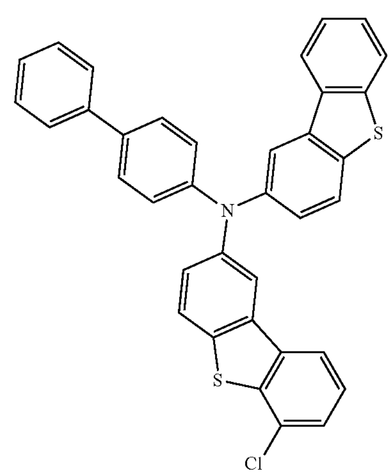

-continued
Sub 3-14
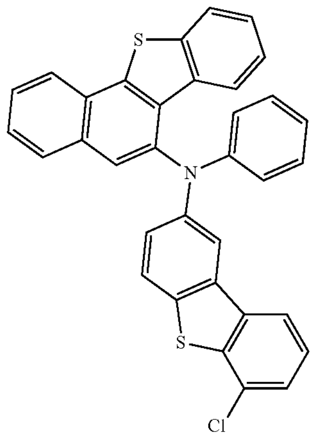
Sub 3-15
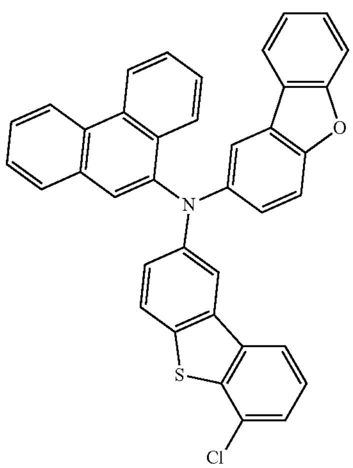
Sub 3-16
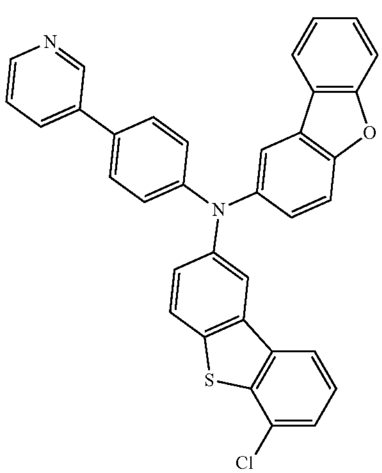
-continued
Sub 3-17
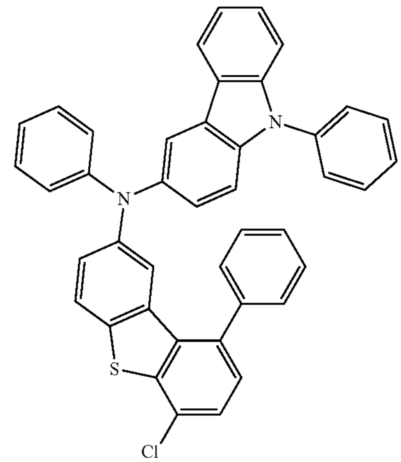
Sub 3-18
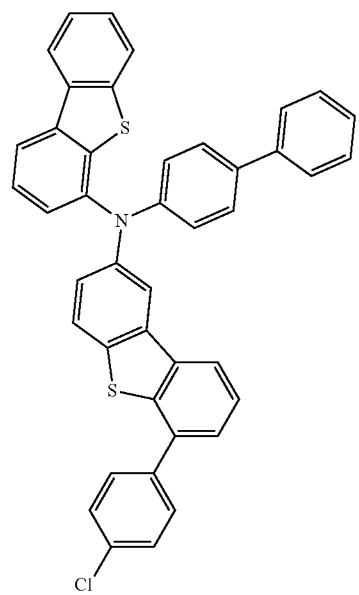
Sub 3-19
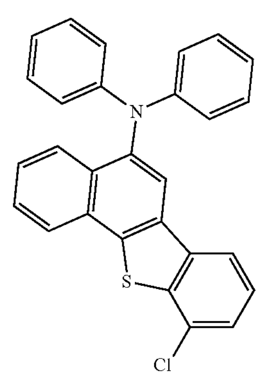

-continued
Sub 3-20
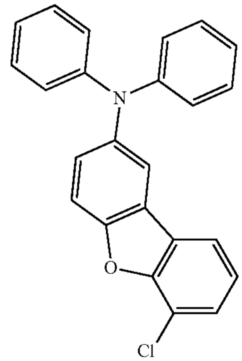
Sub 3-21
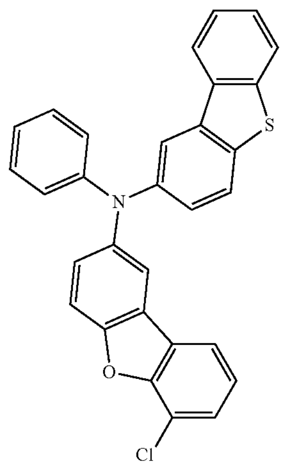
Sub 3-22
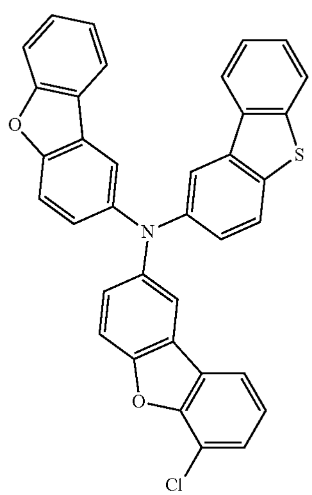
-continued
Sub 3-23
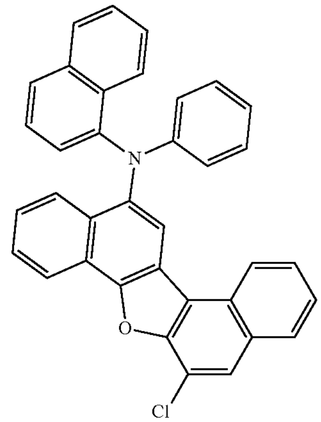
Sub 3-24
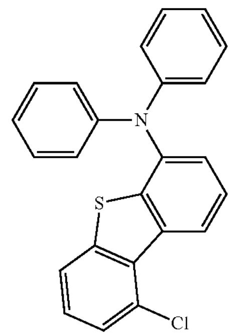
Sub 3-25
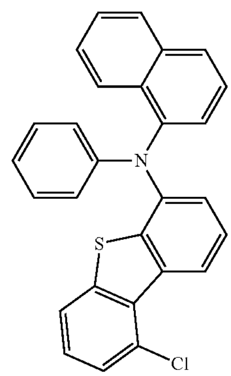
Sub 3-26
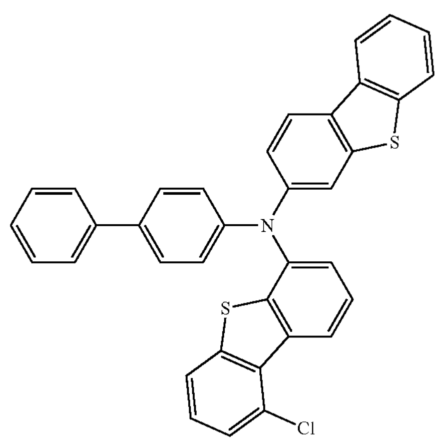

-continued
Sub 3-27
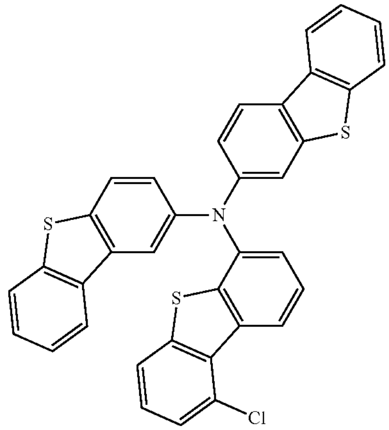
Sub 3-28
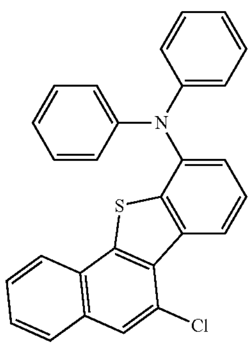
Sub 3-29
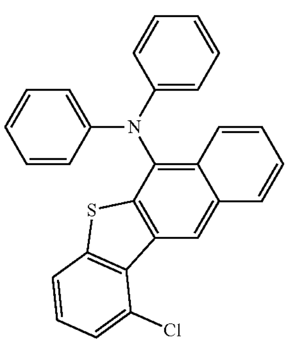
Sub 3-30
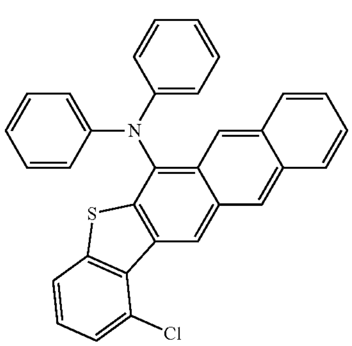
-continued
Sub 3-31
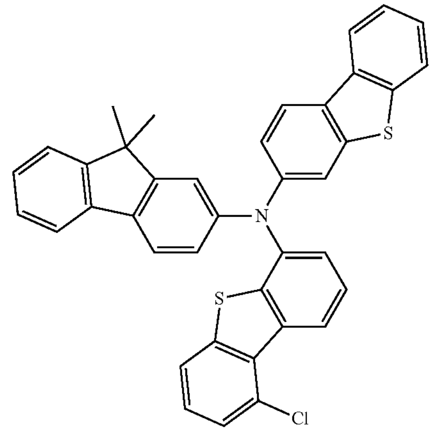
Sub 3-32
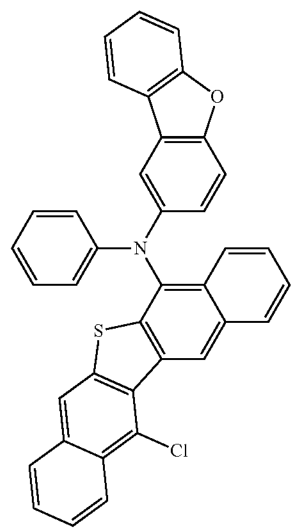
Sub 3-33
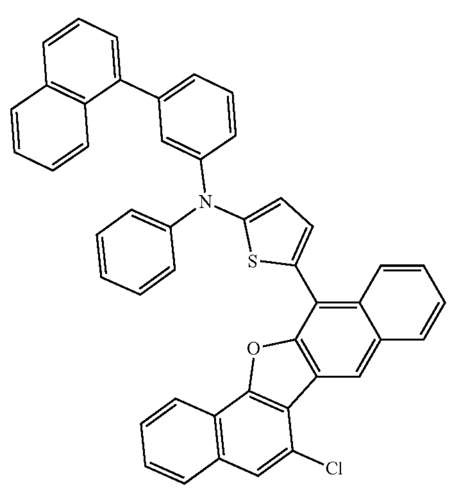

Sub 3-34
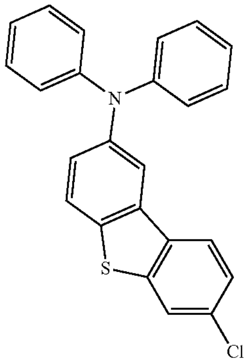
Sub 3-35
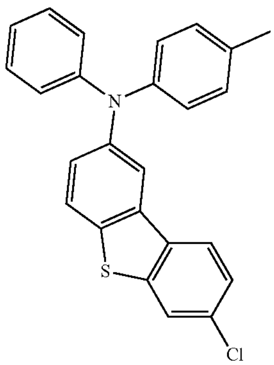
Sub 3-36
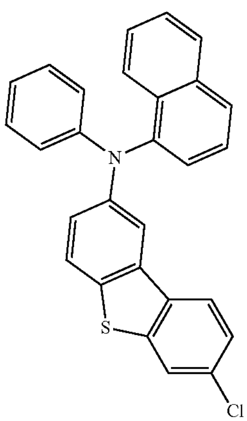
Sub 3-37
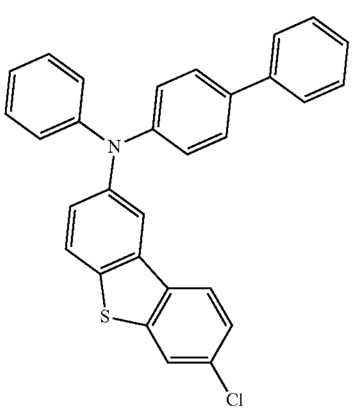
Sub 3-38
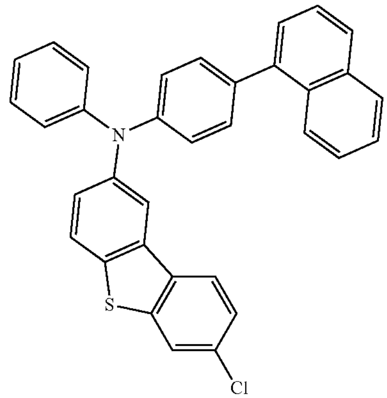
Sub 3-39
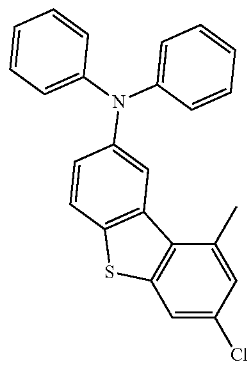
Sub 3-40
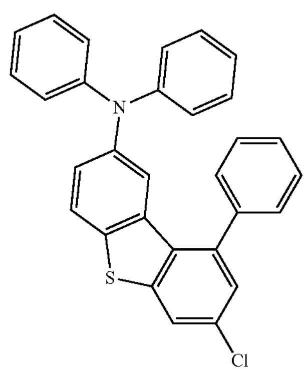
Sub 3-41
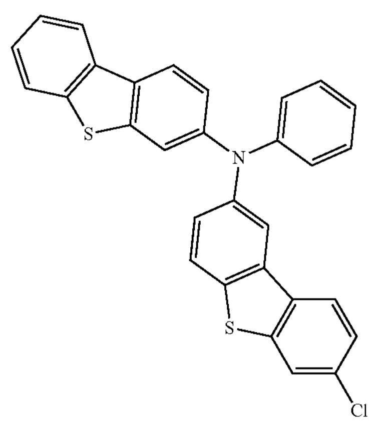

-continued
Sub 3-42
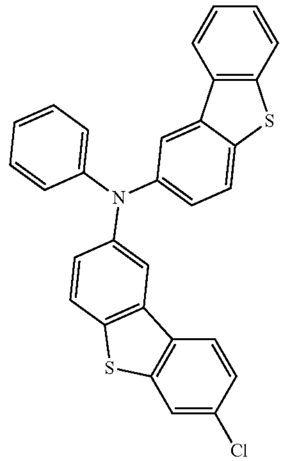
Sub 3-43
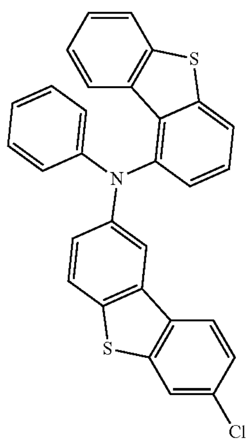
Sub 3-44
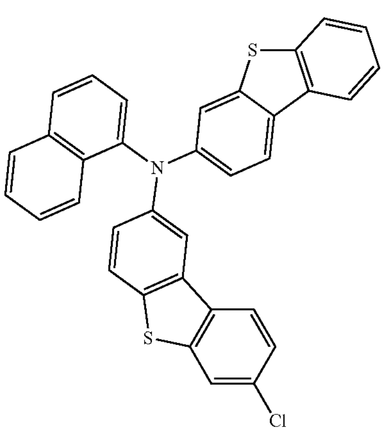
-continued
Sub 3-45
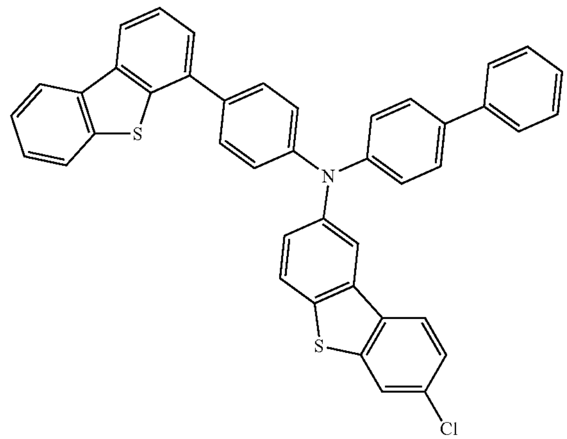
Sub 3-46
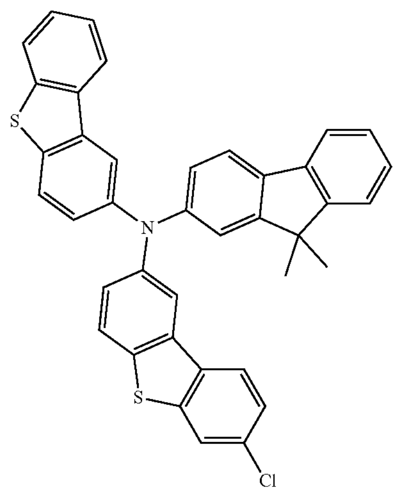
Sub 3-47
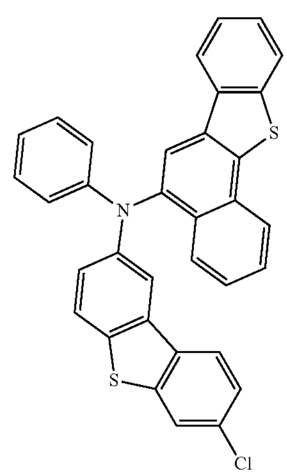

-continued
Sub 3-48
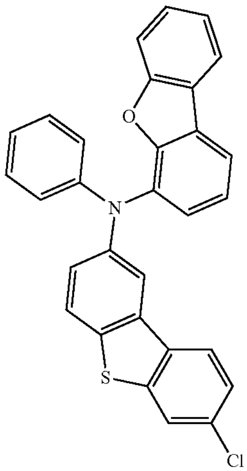
Sub 3-49
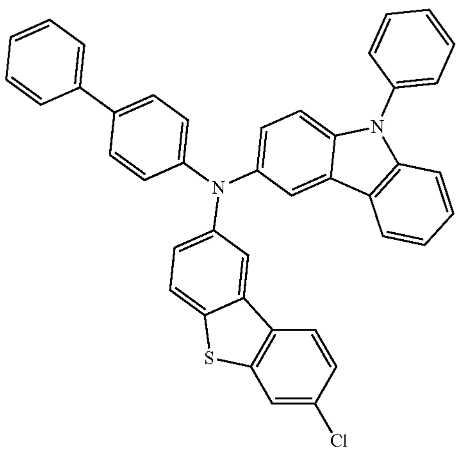
Sub 3-50
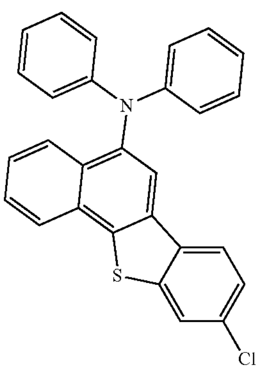
Sub 3-51
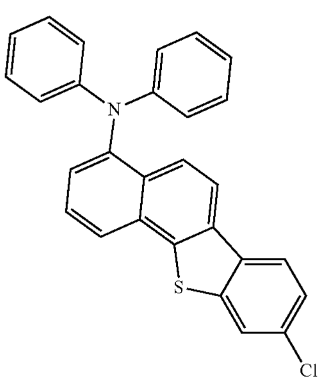
-continued
Sub 3-52
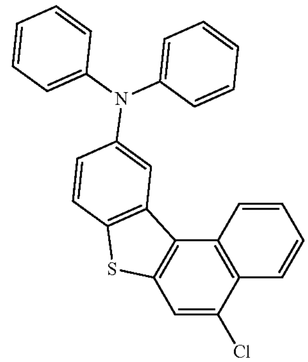
Sub 3-53
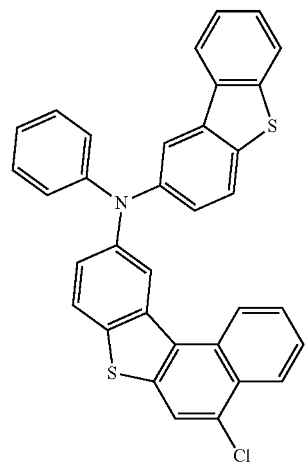
Sub 3-54
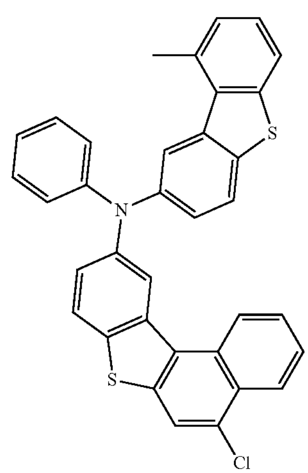

-continued
Sub 3-55
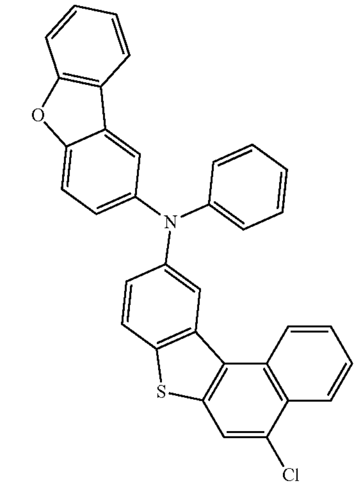
Sub 3-56
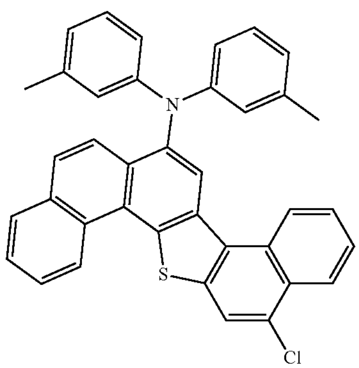
Sub 3-57
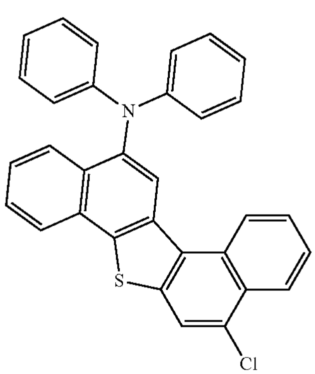
-continued
Sub 3-58
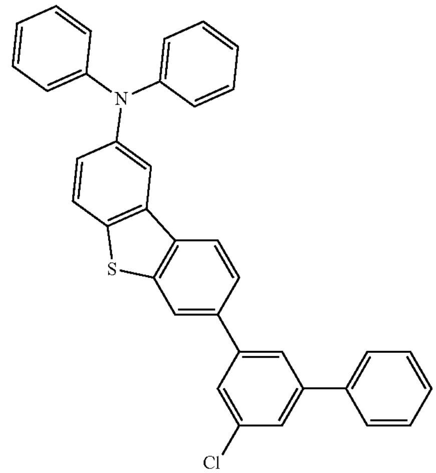
Sub 3-59
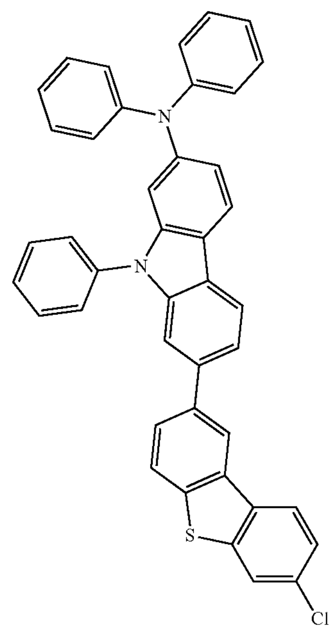
Sub 3-60
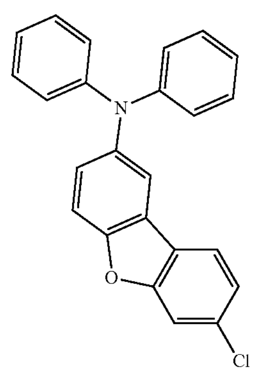

-continued
Sub 3-61
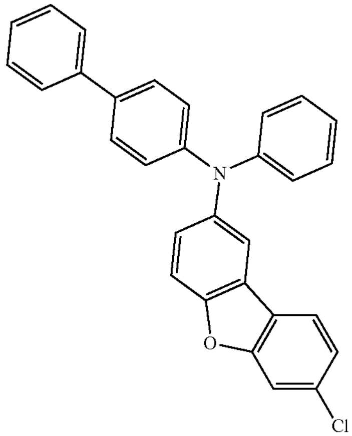
Sub 3-62
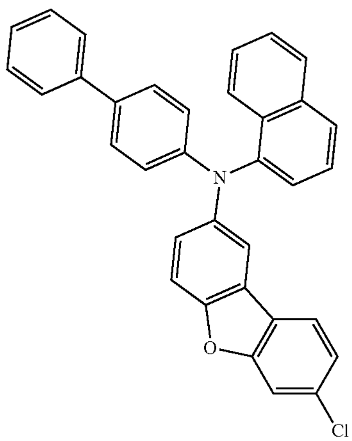
Sub 3-63
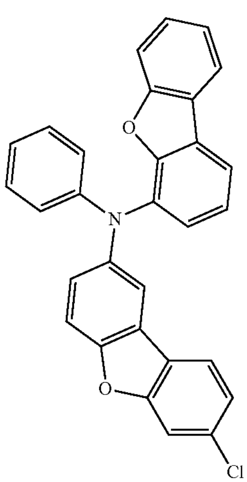
-continued
Sub 3-64
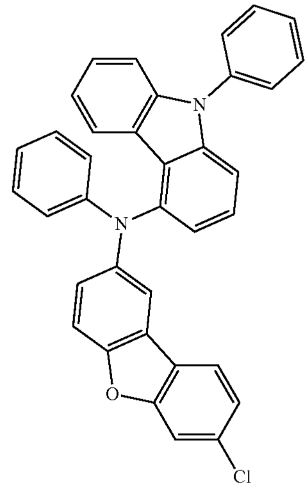
Sub 3-65
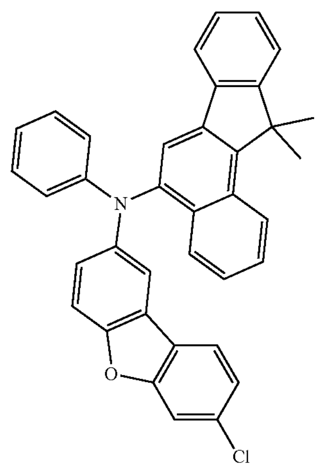
Sub 3-66
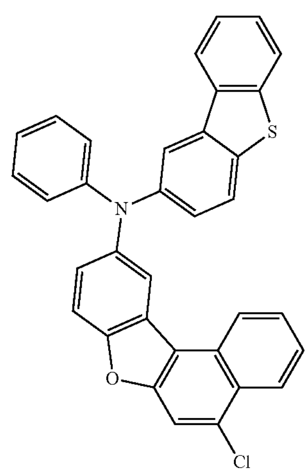

-continued
Sub 3-67
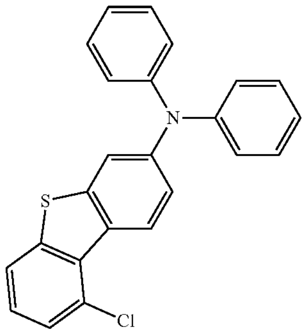
Sub 3-68
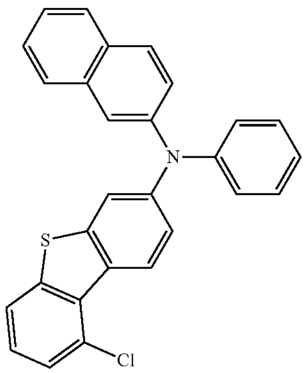
Sub 3-69
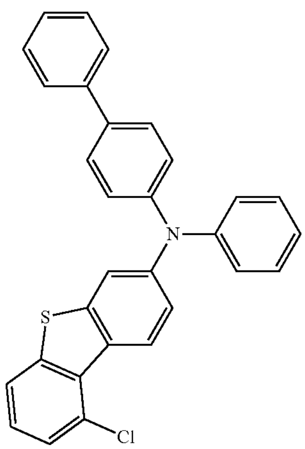
Sub 3-70
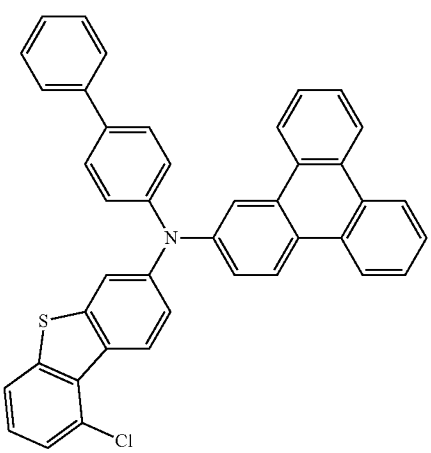
-continued
Sub 3-71
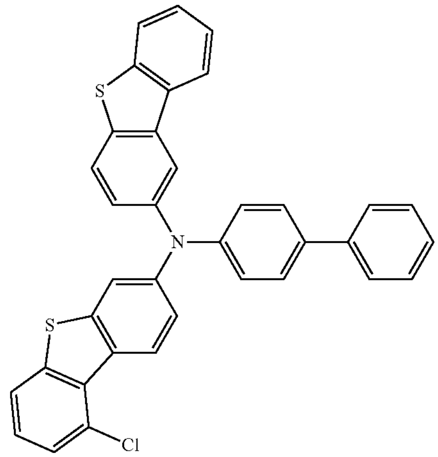
Sub 3-72
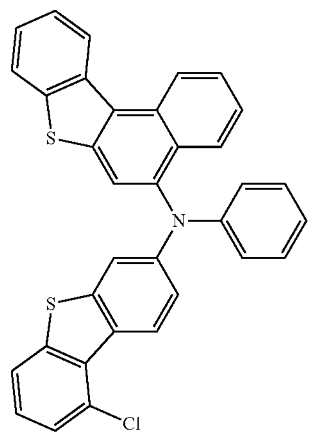
Sub 3-73
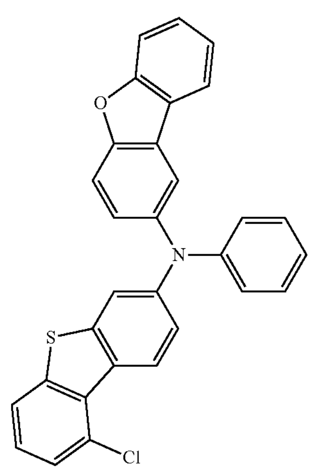

-continued
Sub 3-74
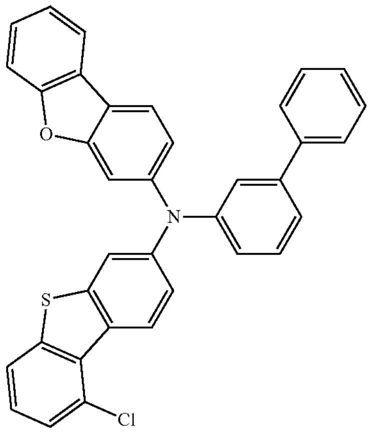
Sub 3-75
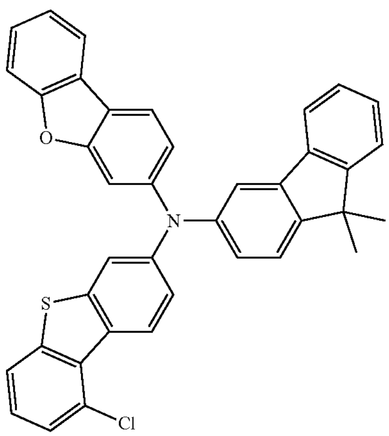
Sub 3-76
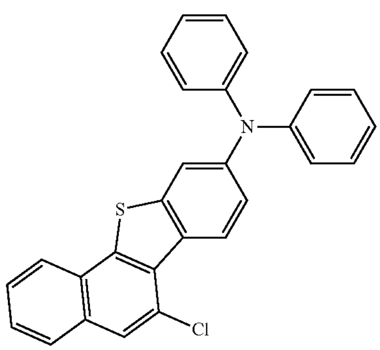
Sub 3-77
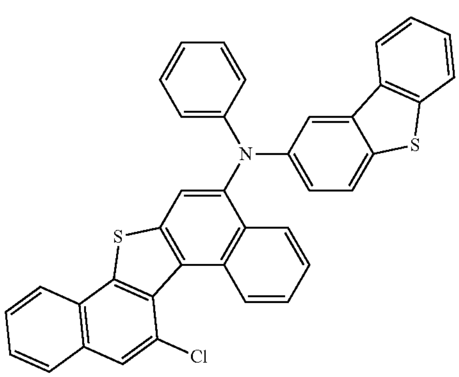
-continued
Sub 3-78
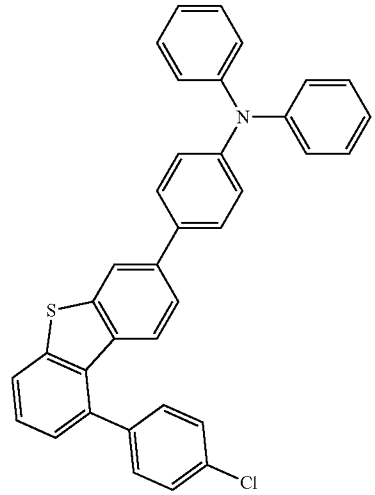
Sub 3-79
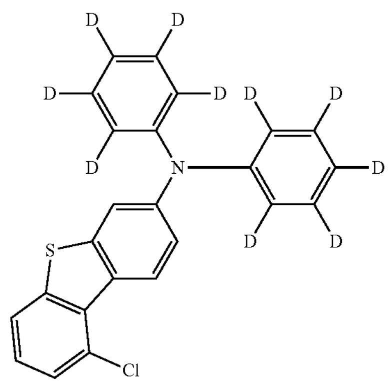
Sub 3-80
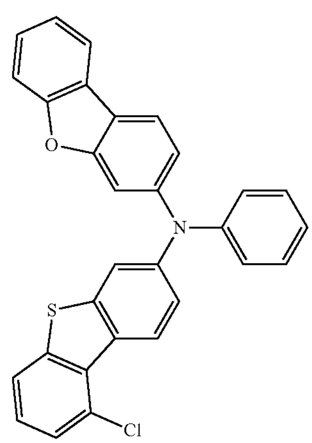

-continued
Sub 3-81
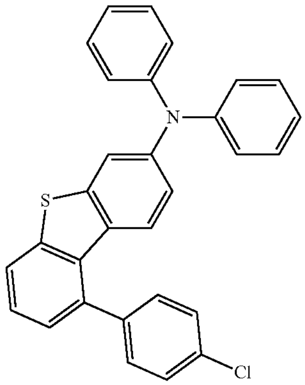
Sub 3-82
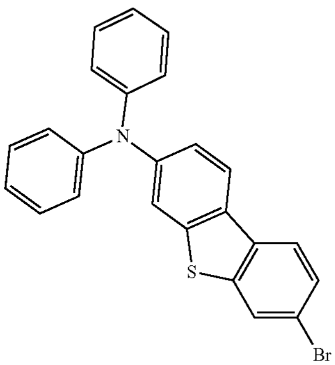
Sub 3-83
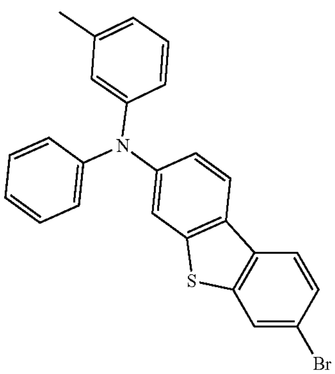
Sub 3-84
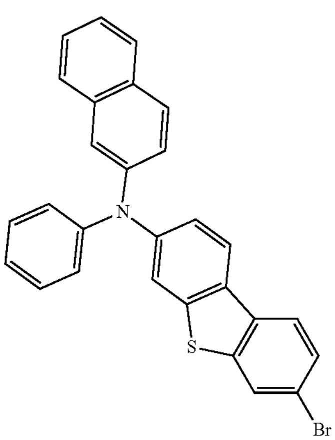
-continued
Sub 3-85
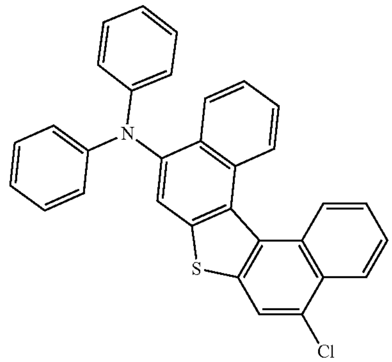
Sub 3-86
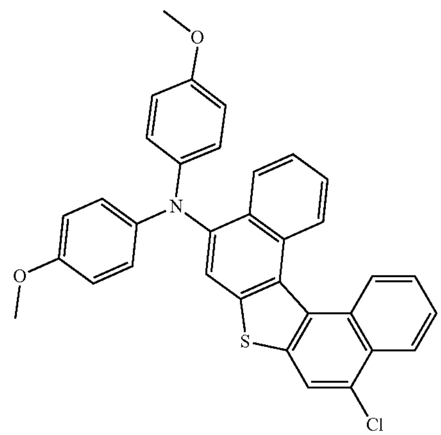
Sub 3-87
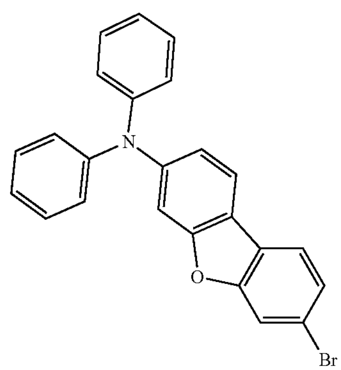
Sub 3-88
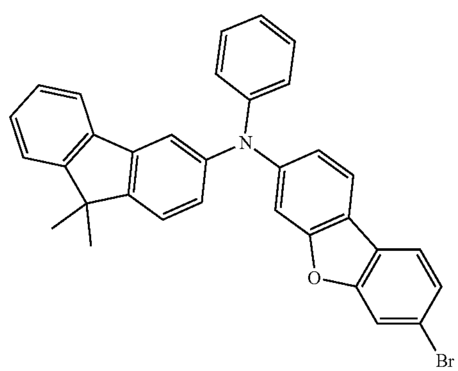

Sub 3-89
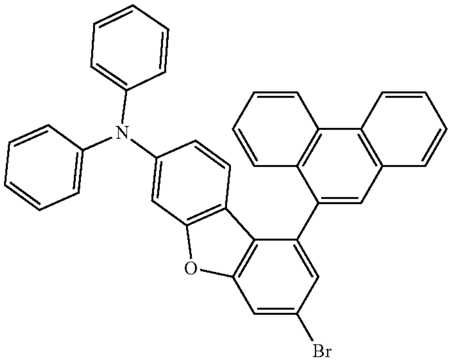
Sub 3-90
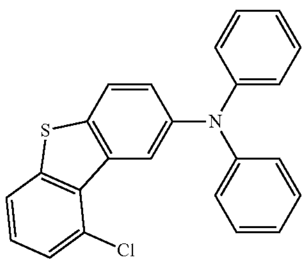
Sub 3-91
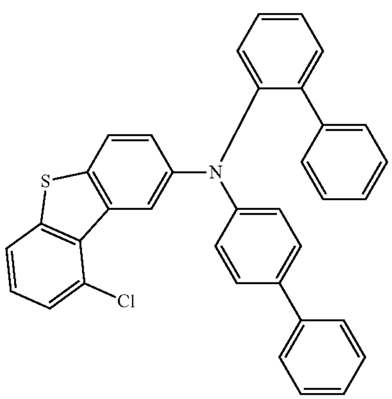
Sub 3-92
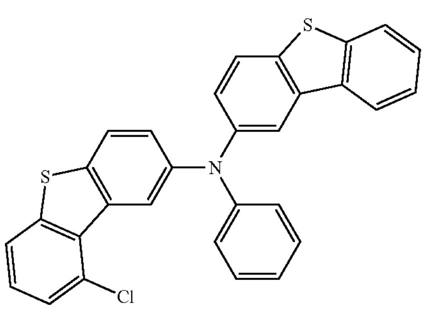
Sub 3-93
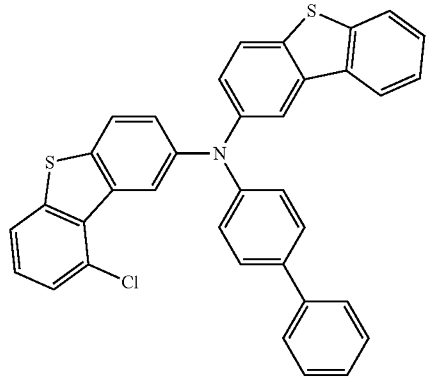
Sub 3-94
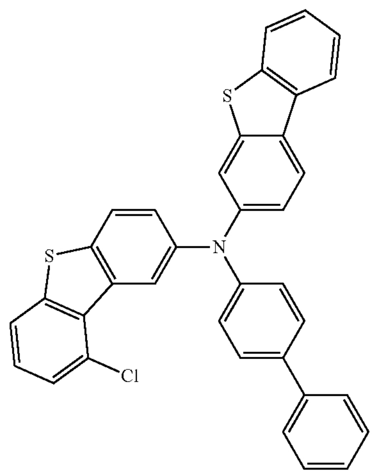
Sub 3-95
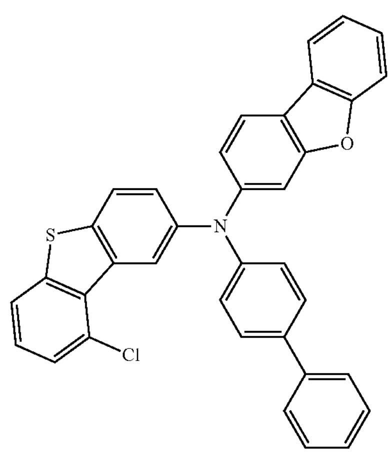

-continued
Sub 3-96
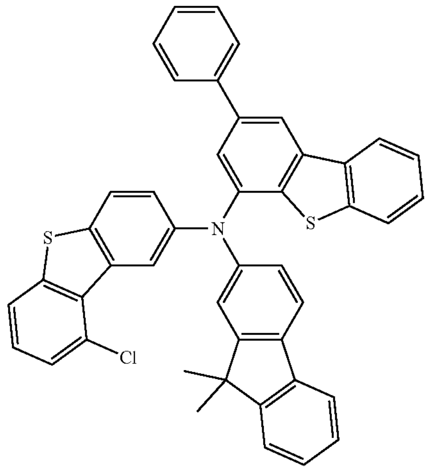
Sub 3-97
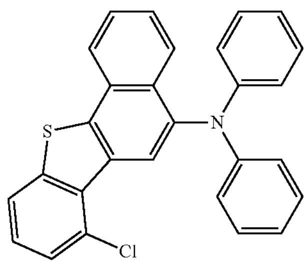
Sub 3-98
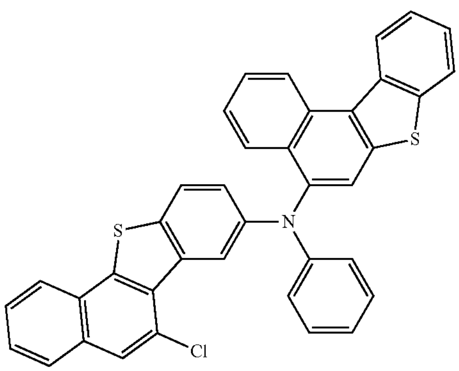
Sub 3-99
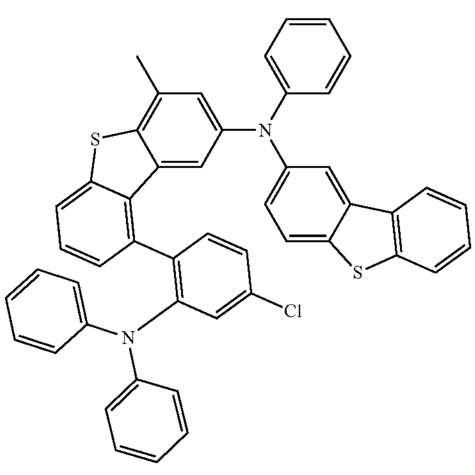
-continued
Sub 3-100
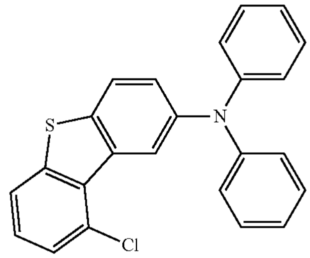
Sub 3-101
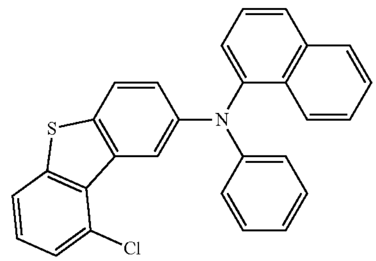
Sub 3-102
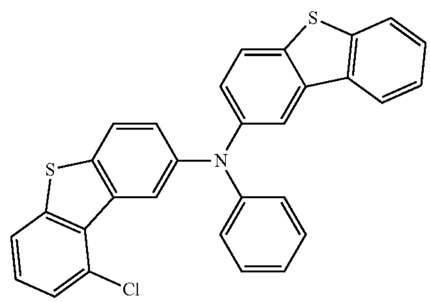
Sub 3-103
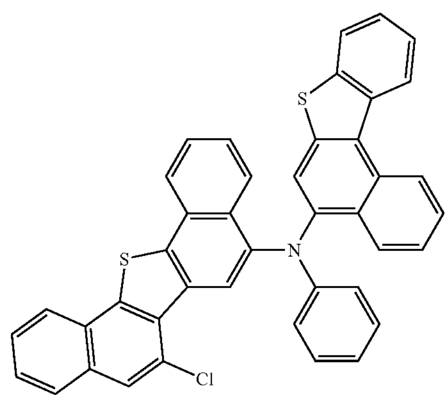
Sub 3-104
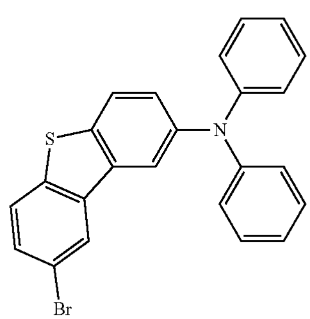

-continued
Sub 3-105
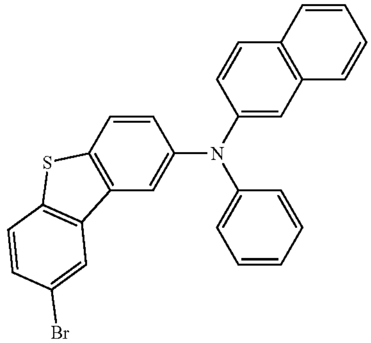
Sub 3-106
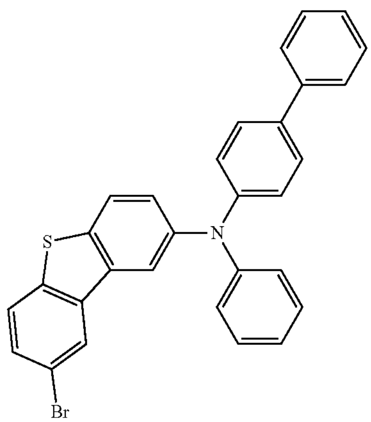
Sub 3-107
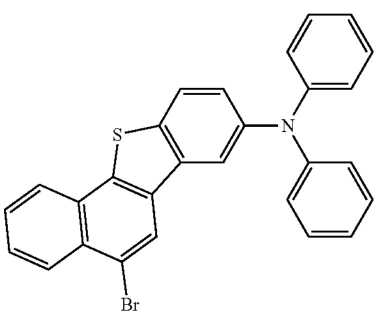
Sub 3-108
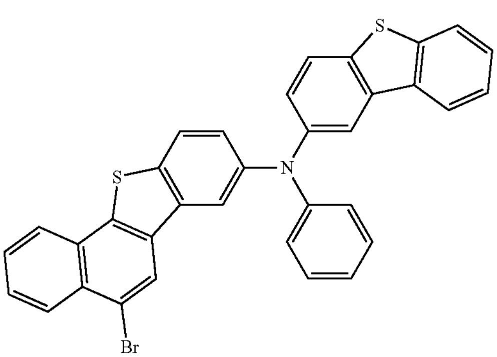
-continued
Sub 3-109
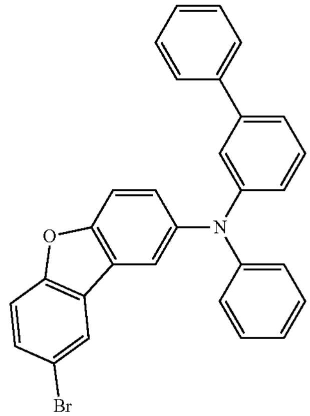
Sub 3-110
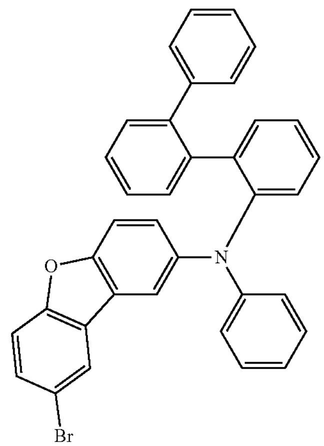
Sub 3-111
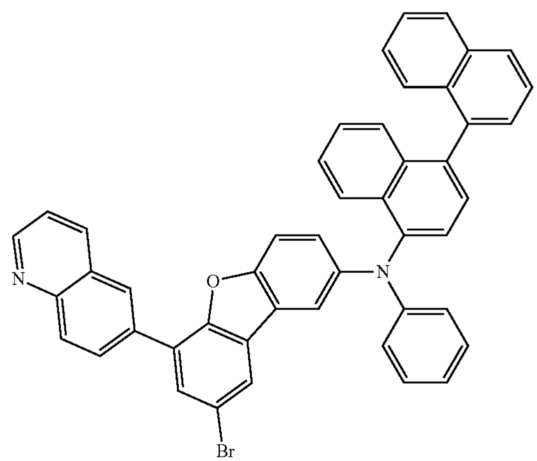
Sub 3-112
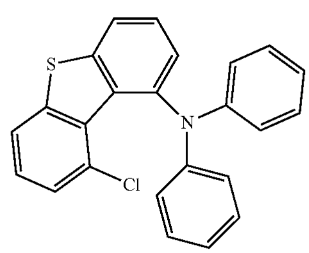

-continued
Sub 3-113
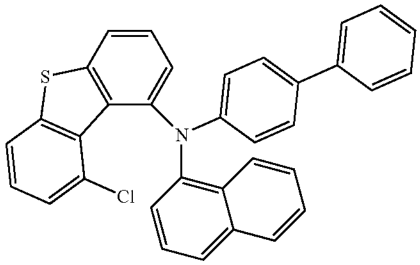
Sub 3-114
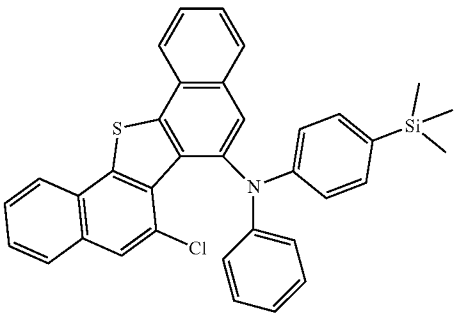
Sub 3-115
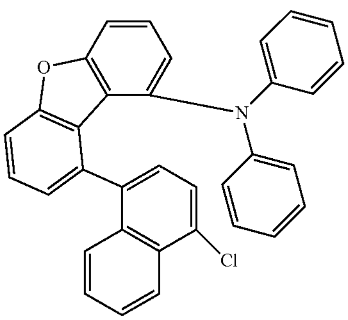
Sub 3-116
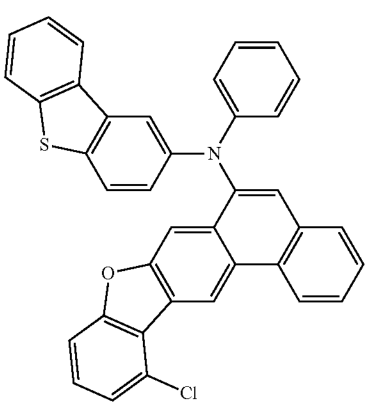
-continued
Sub 3-117
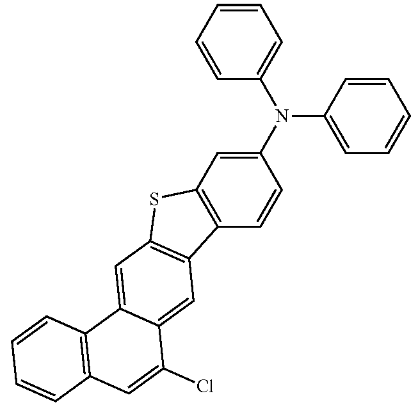
Sub 3-118
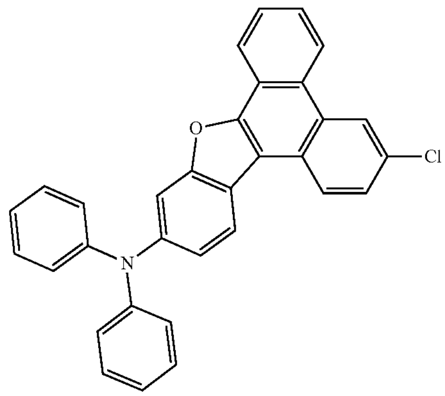
Sub 3-119
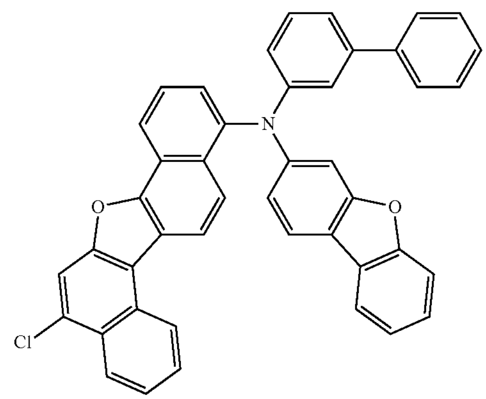
Sub 3-120
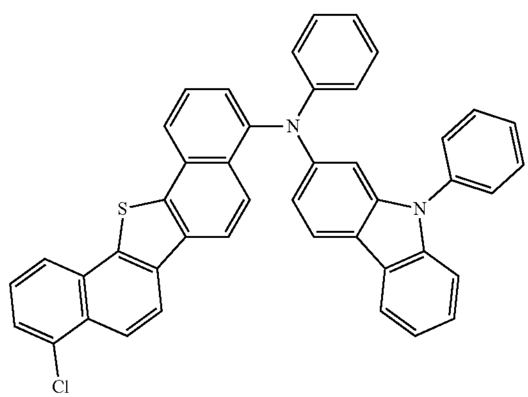

Sub 3-121
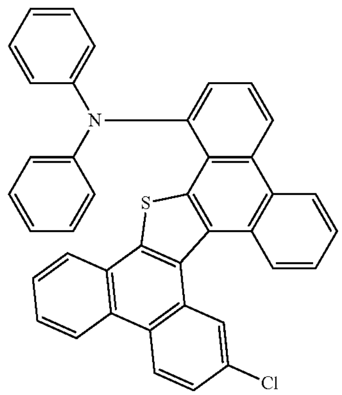
Sub 3-122
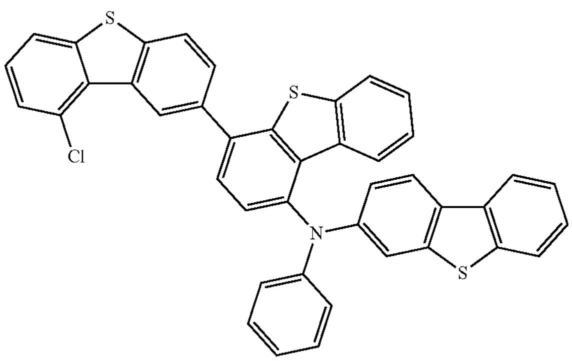
Sub 3-123
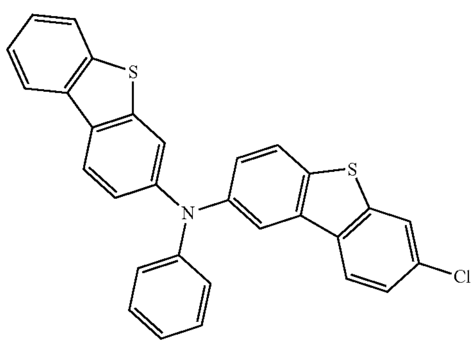
Sub 3-124
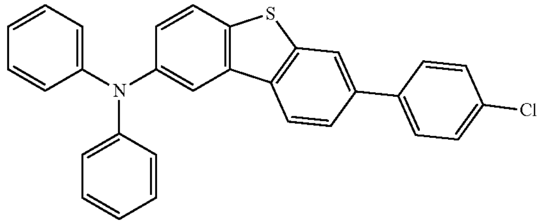
Sub 3-125
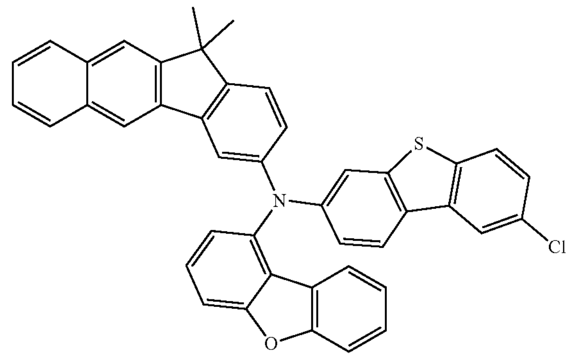
Sub 3-126
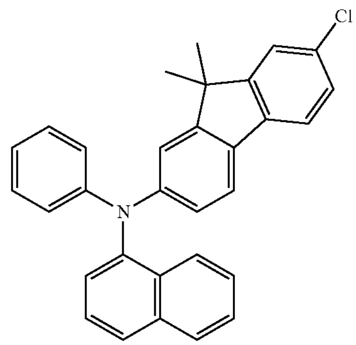
Sub 3-127
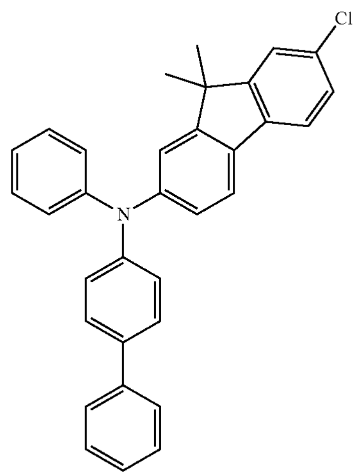
Sub 3-128
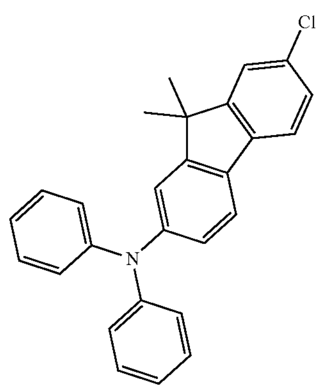

-continued
Sub 3-129
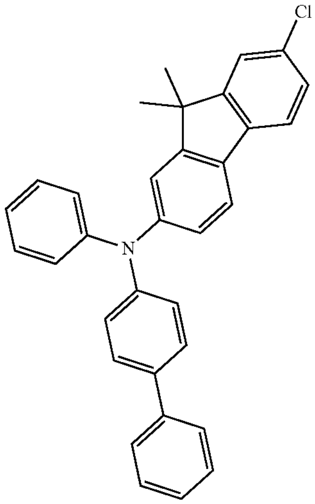
Sub 3-130
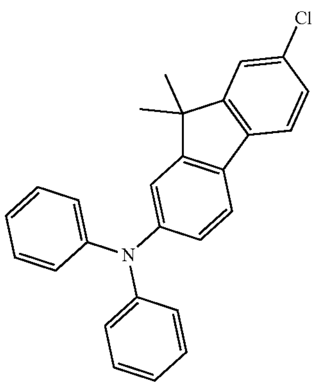
Sub 3-131
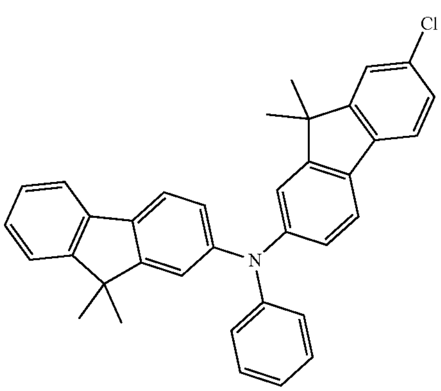
-continued
Sub 3-132
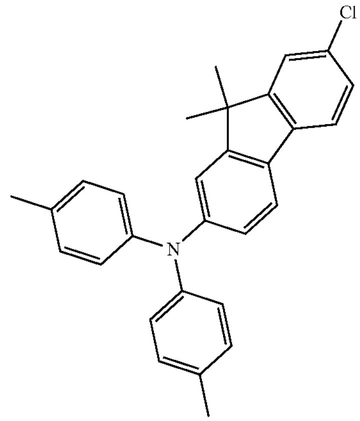
Sub 3-133
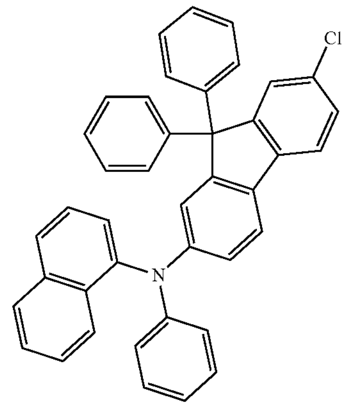
Sub 3-134
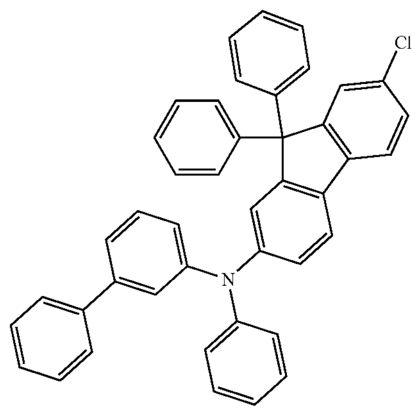
Sub 3-135
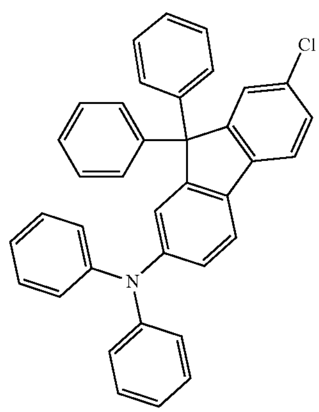

-continued
Sub 3-136
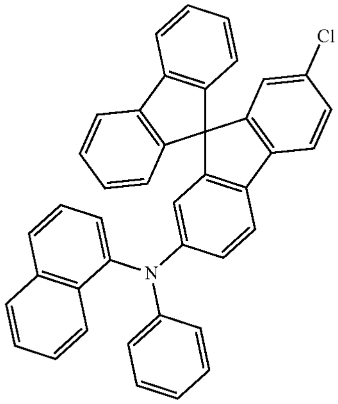
Sub 3-137
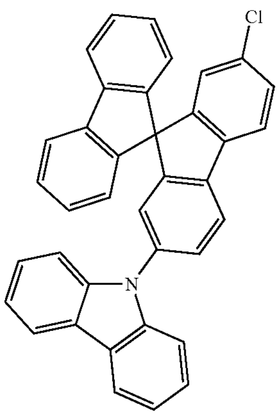
Sub 3-138
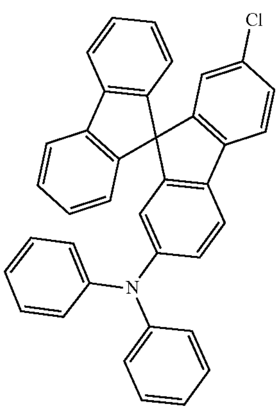
Sub 3-139
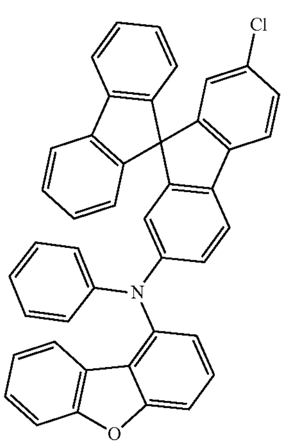
-continued
Sub 3-140
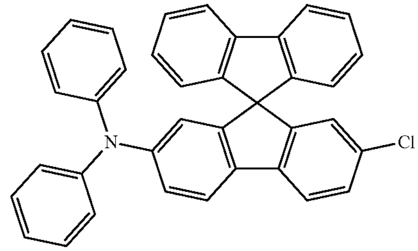
Sub 3-141
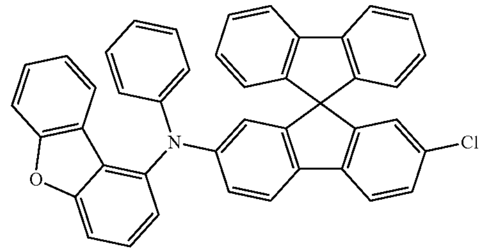
Sub 3-142
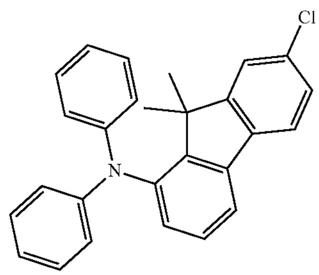
Sub 3-143
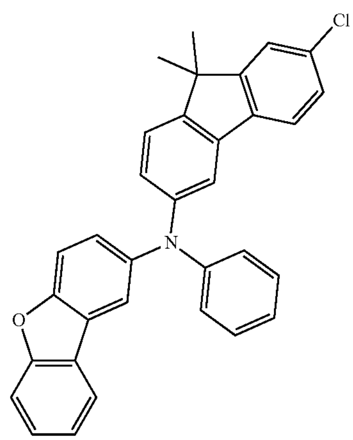
Sub 3-144
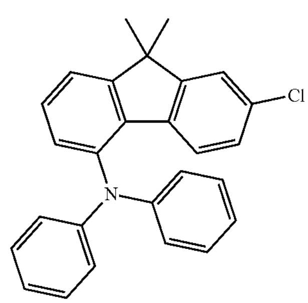

-continued
Sub 3-145
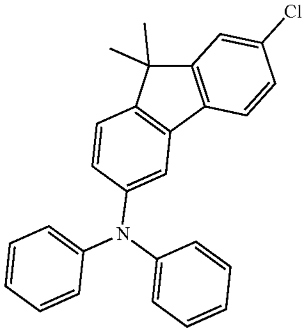
Sub 3-146
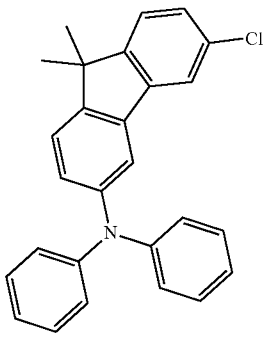
Sub 3-147
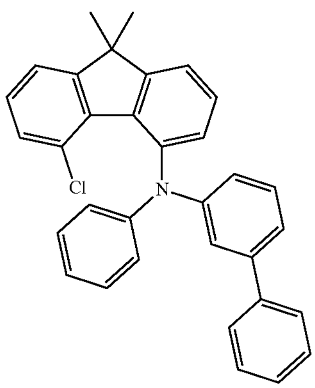
Sub 3-148
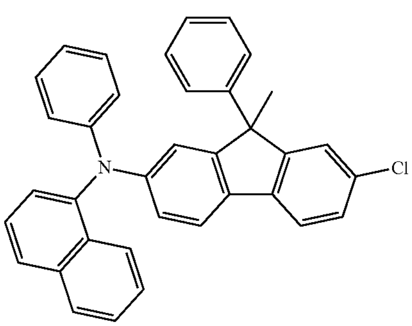
-continued
Sub 3-149
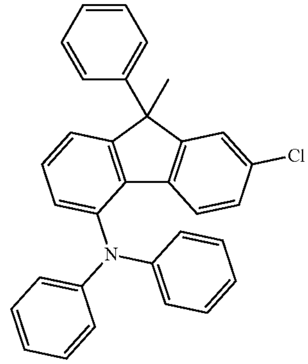
Sub 3-150
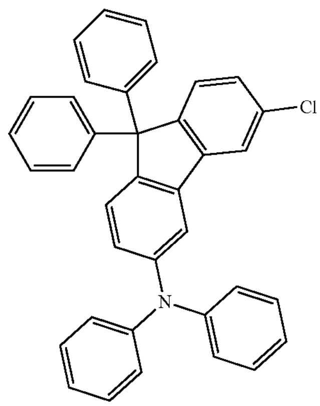
Sub 3-151
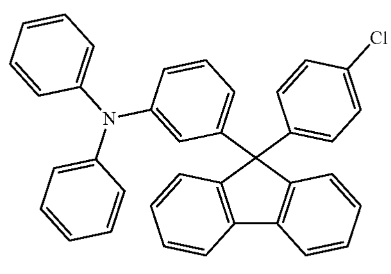
Sub 3-152
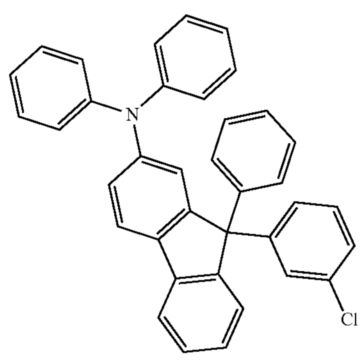

-continued
Sub 3-153
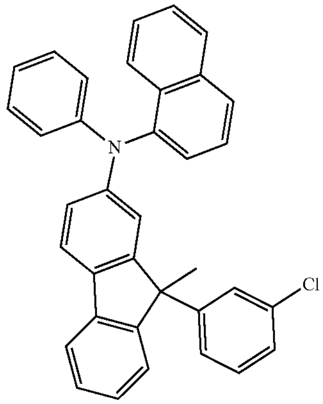
Sub 3-154
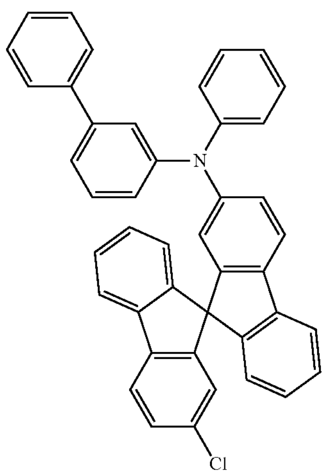
Sub 3-155
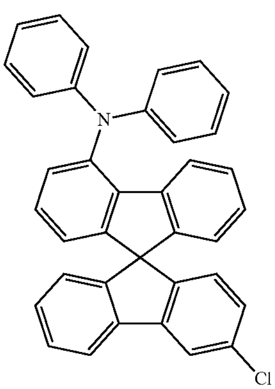
-continued
Sub 3-156
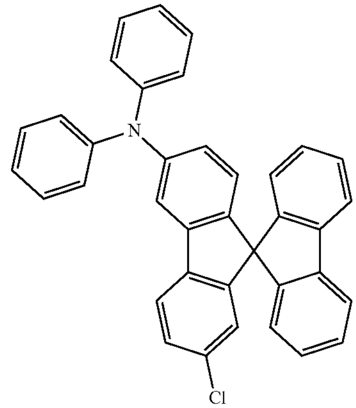
Sub 3-157
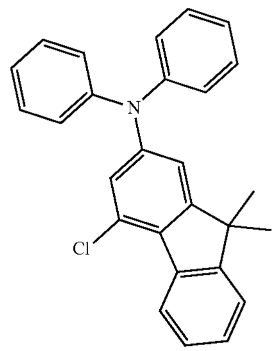
Sub 3-158
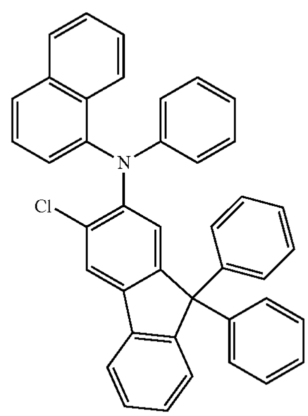
Sub 3-159
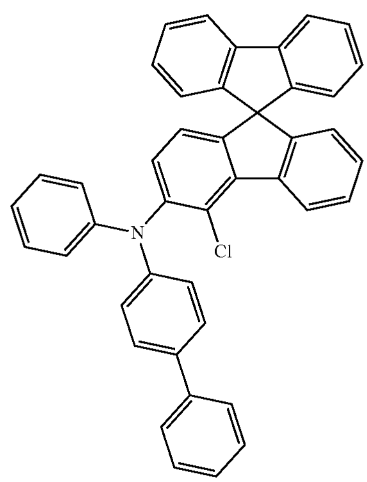

-continued
Sub 3-160
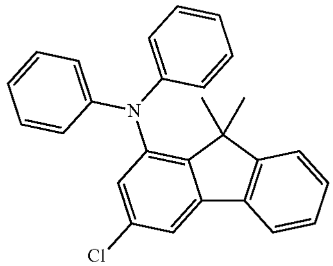
Sub 3-161
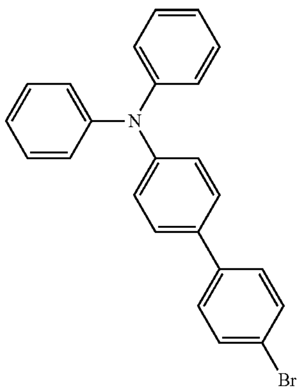
Sub 3-162
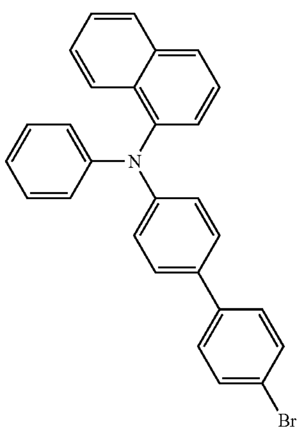
Sub 3-163
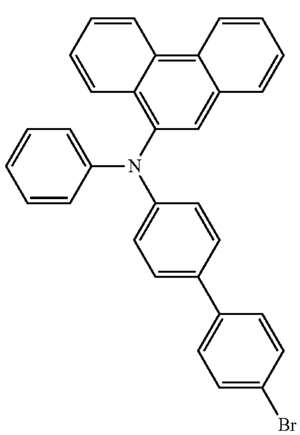
-continued
Sub 3-164
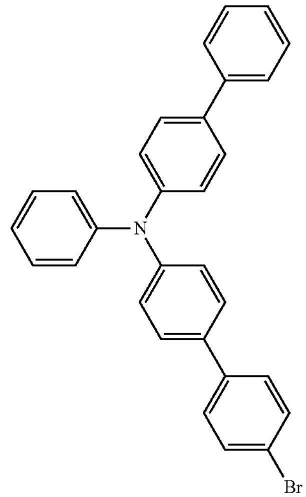
Sub 3-165
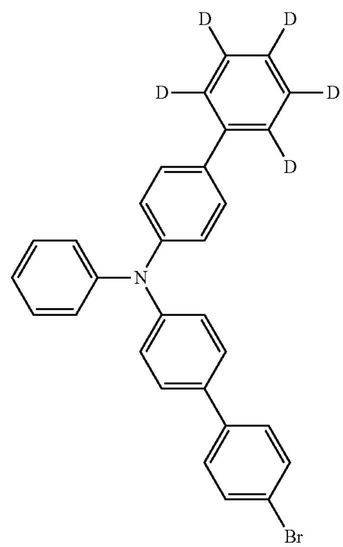
Sub 3-166
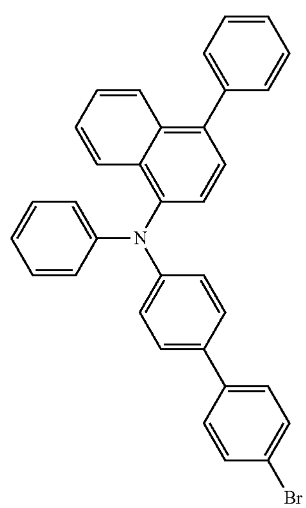

-continued
Sub 3-167
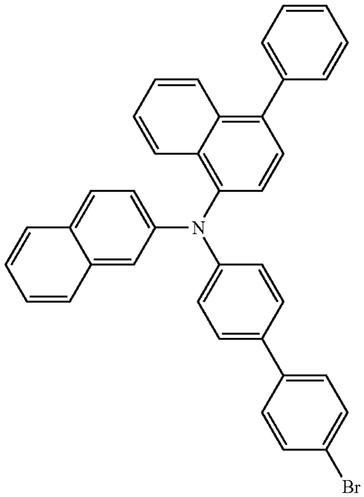
Sub 3-168
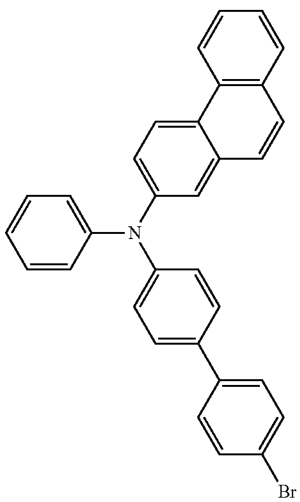
Sub 3-169
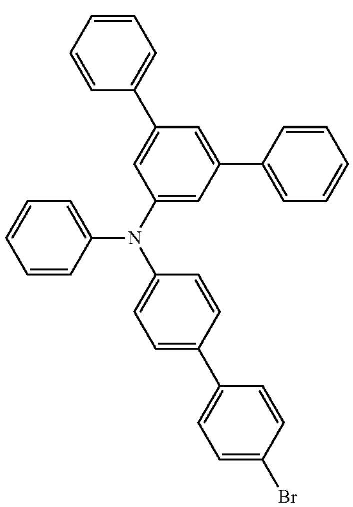
-continued
Sub 3-170
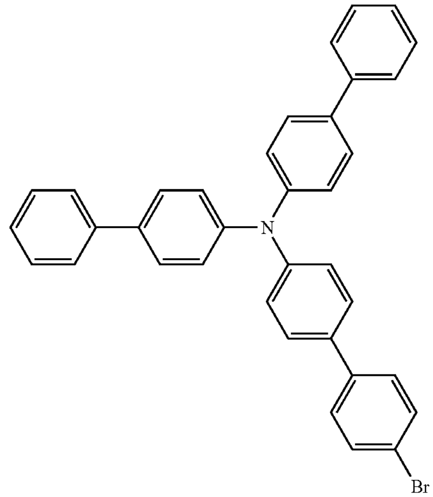
Sub 3-171
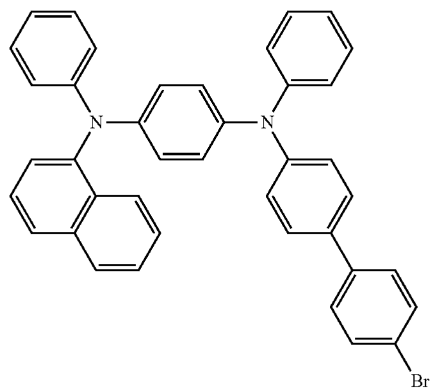
Sub 3-172
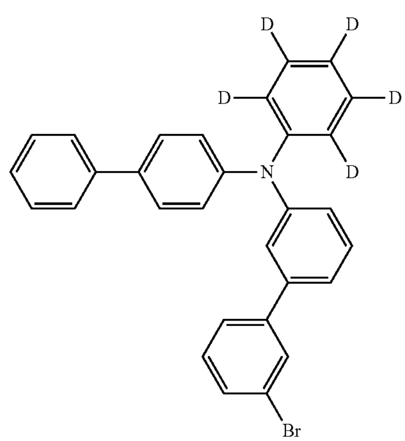

-continued
Sub 3-173
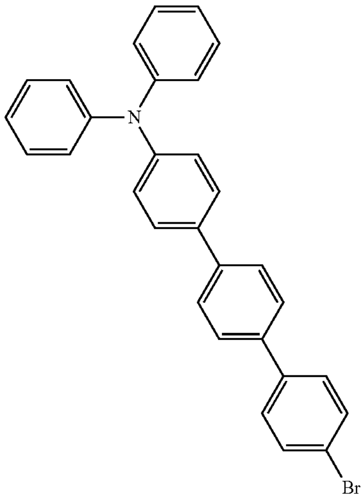
Sub 3-174
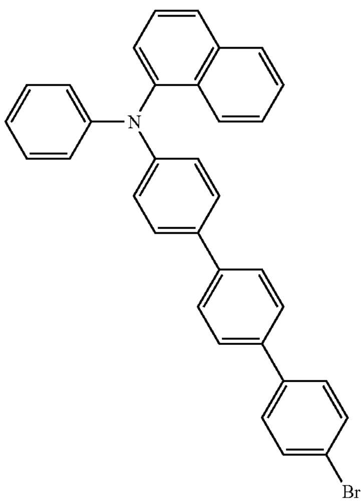
Sub 3-175
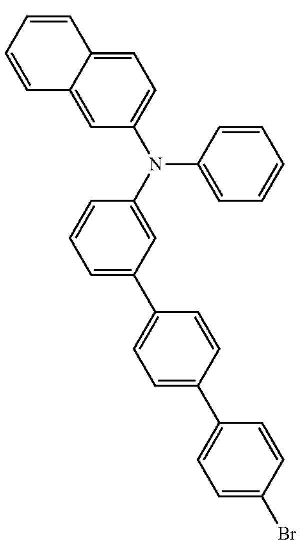
-continued
Sub 3-176
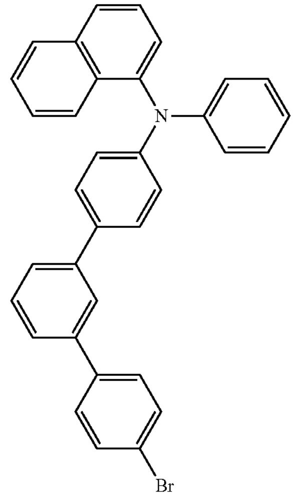
Sub 3-177
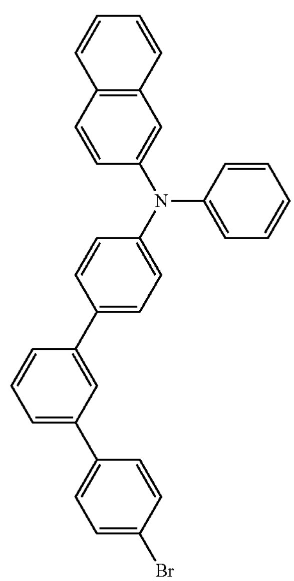

-continued
Sub 3-178
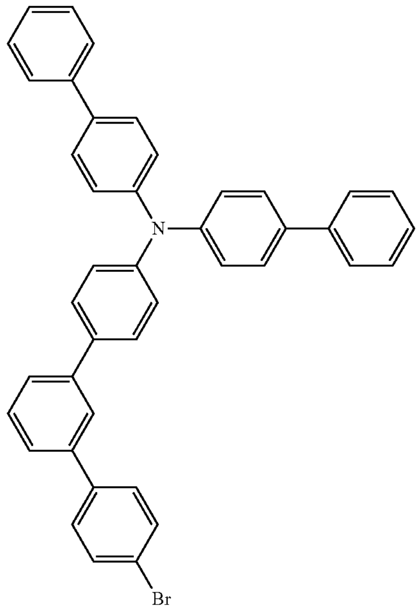
Sub 3-179
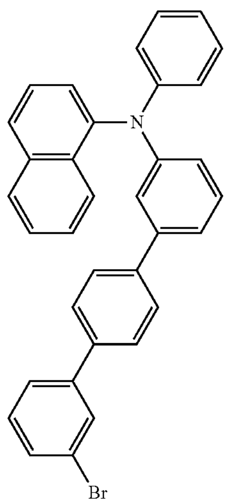
Sub 3-180
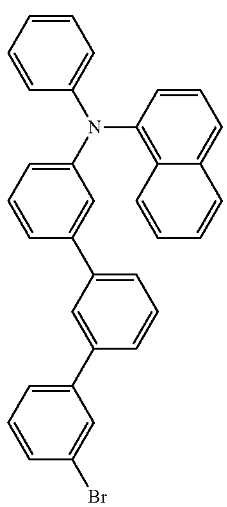
-continued
Sub 3-181
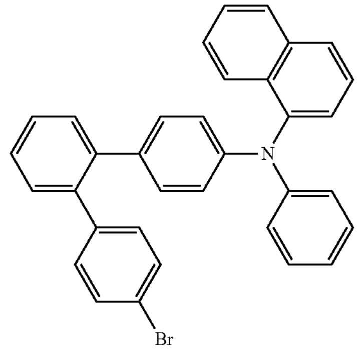
Sub 3-182
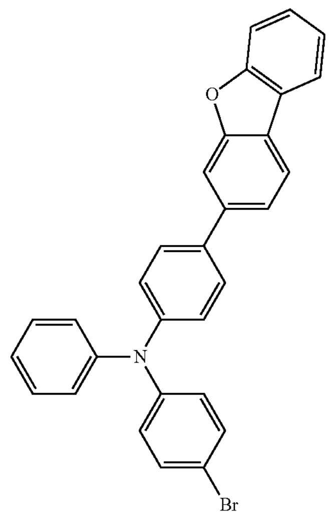
Sub 3-183
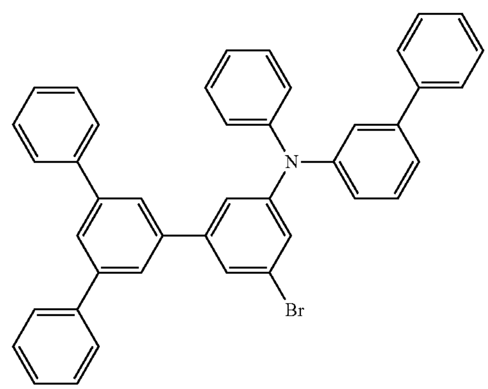
Sub 3-184
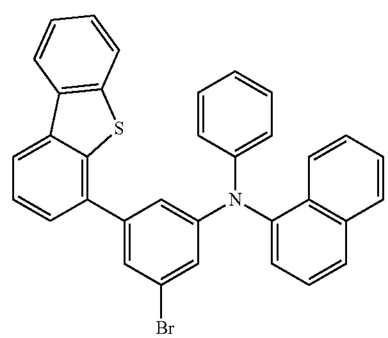

-continued
Sub 3-185
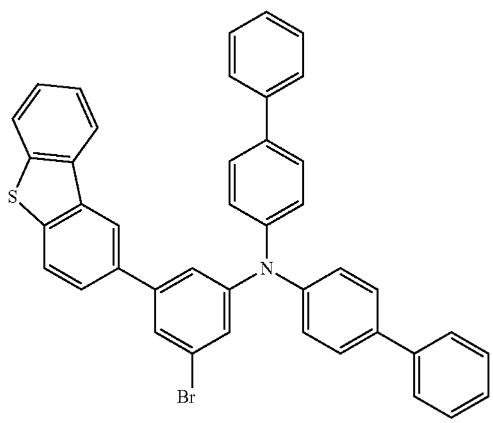
Sub 3-186
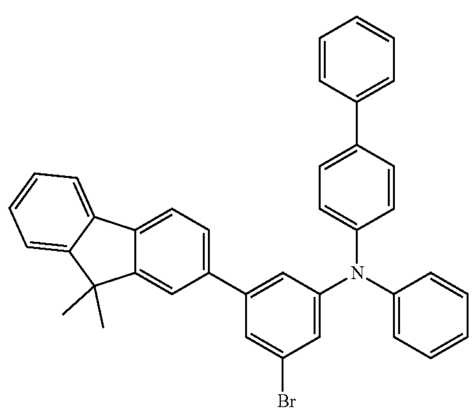
Sub 3-187
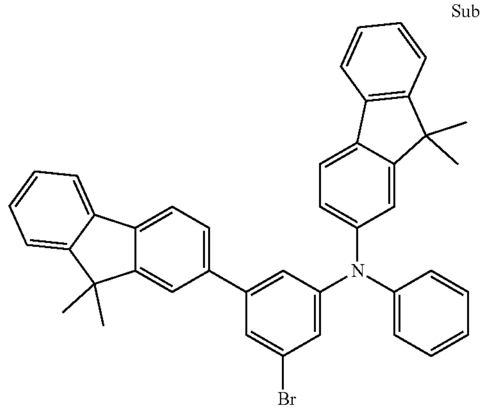
-continued
Sub 3-188
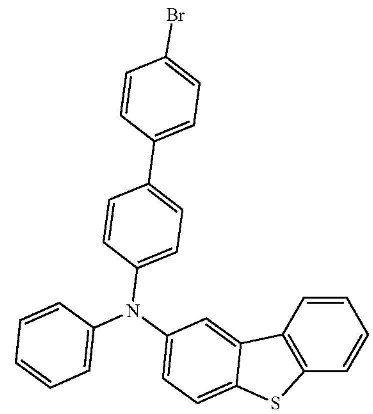
Sub 3-189
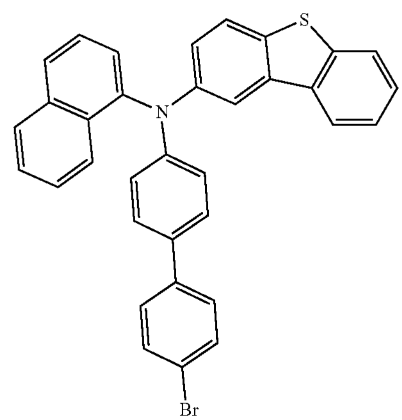
Sub 3-190
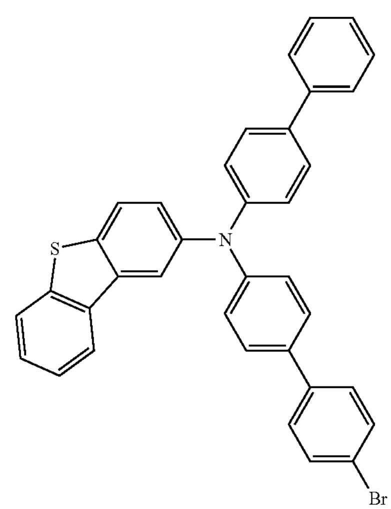

Sub 3-191
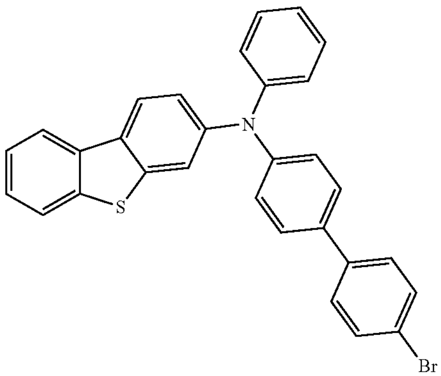
Sub 3-192
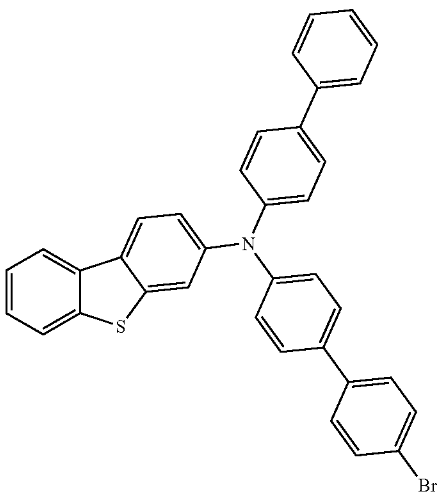
Sub 3-193
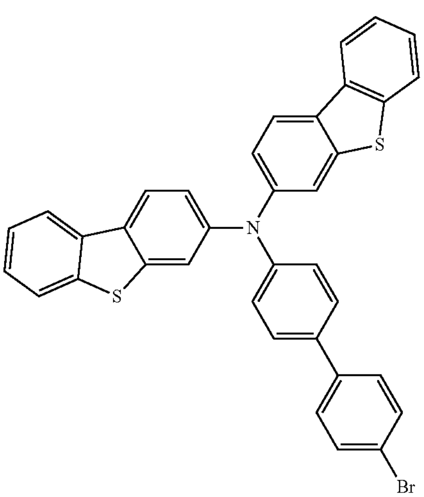
Sub 3-194
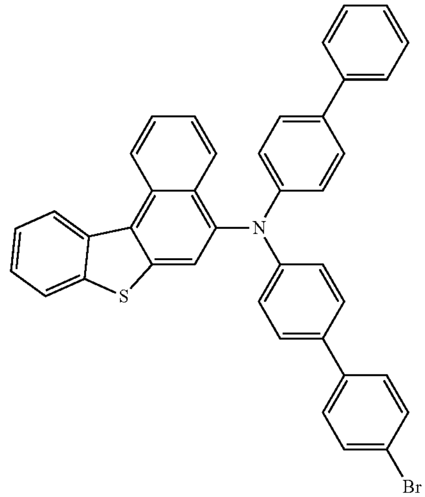
Sub 3-195
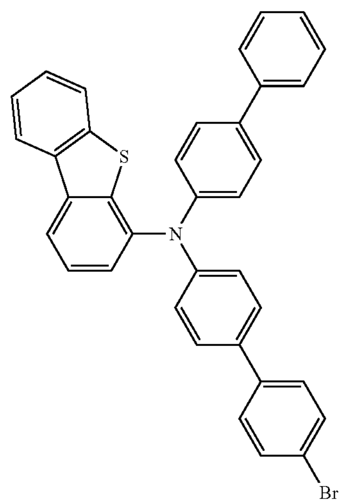
Sub 3-196
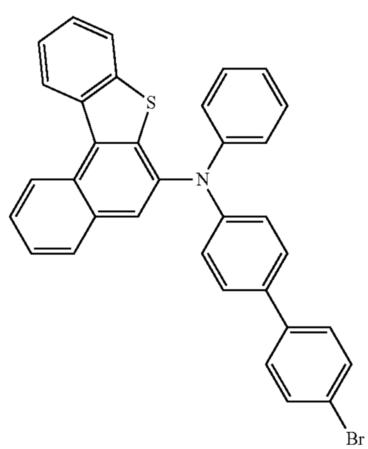

-continued
Sub 3-197
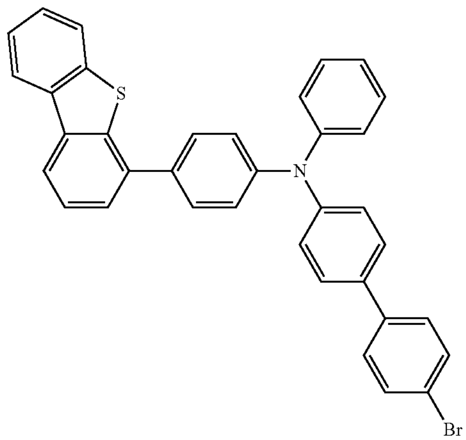
Sub 3-198
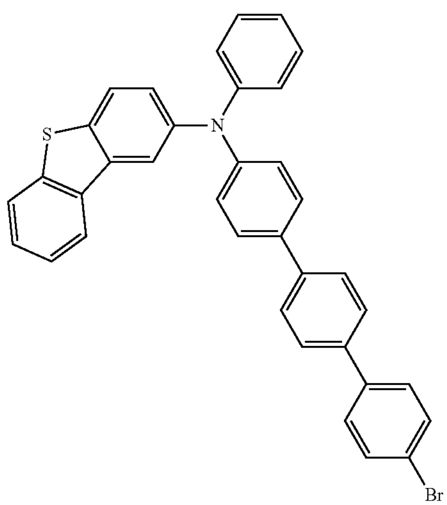
Sub 3-199
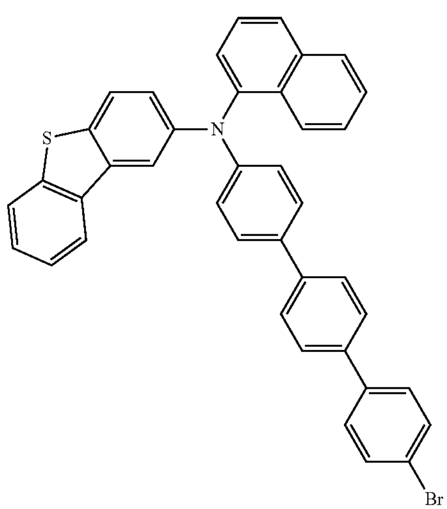
-continued
Sub 3-200
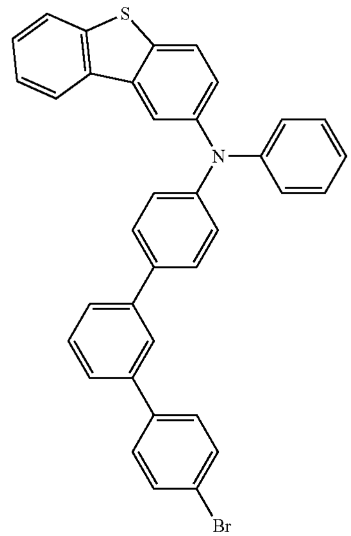
Sub 3-201
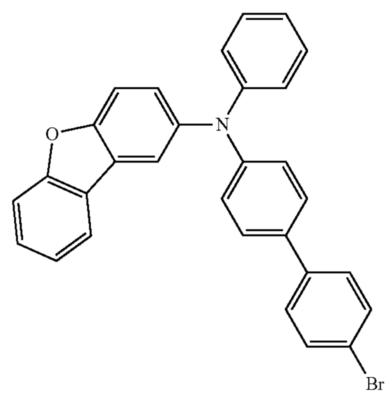
Sub 3-202
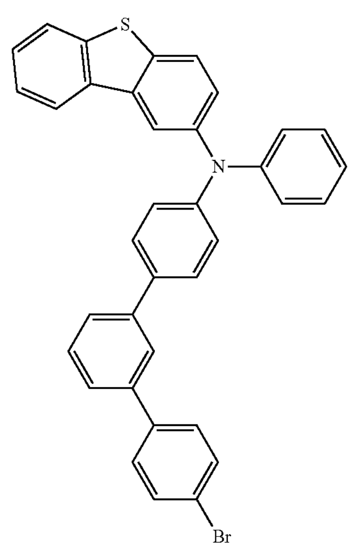

-continued
Sub 3-203
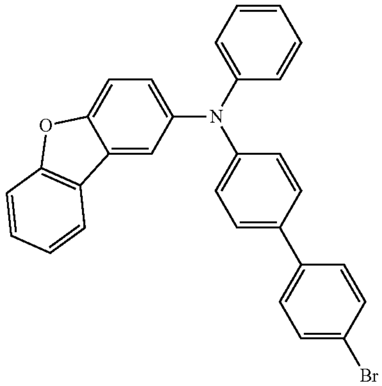
Sub 3-204
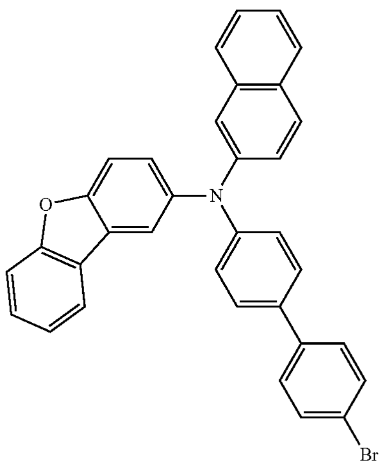
Sub 3-205
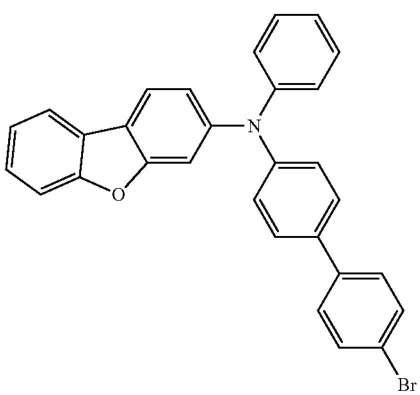
-continued
Sub 3-206
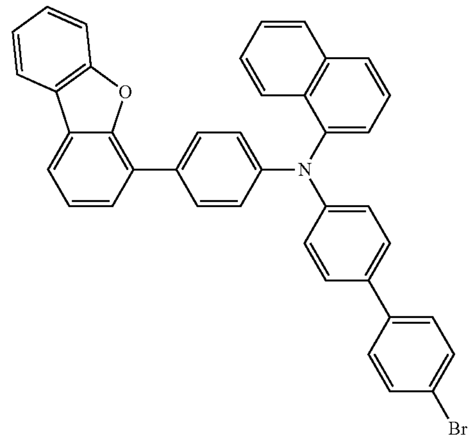
Sub 3-207
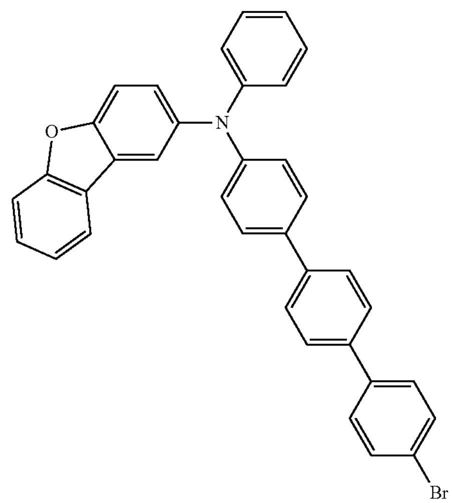
Sub 3-208
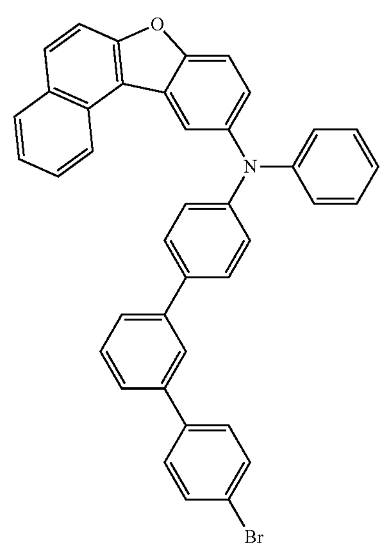

-continued
Sub 3-209
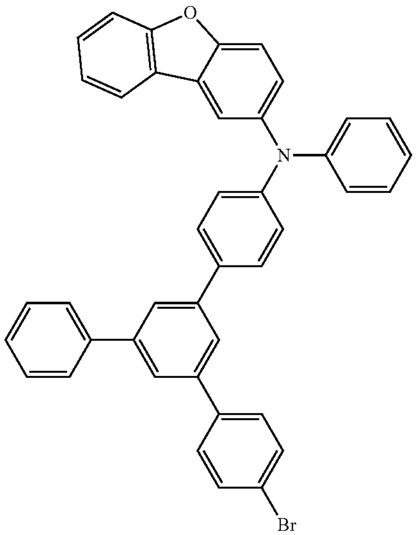
Sub 3-210
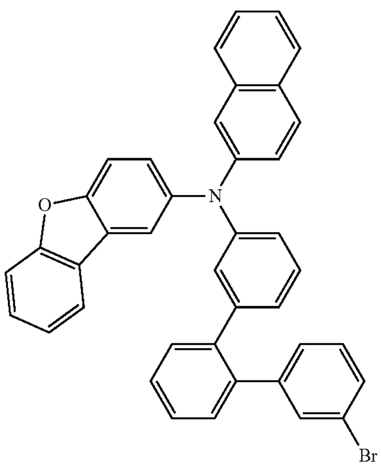
Sub 3-211
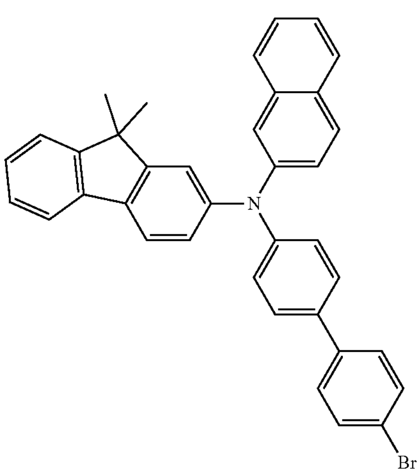
-continued
Sub 3-212
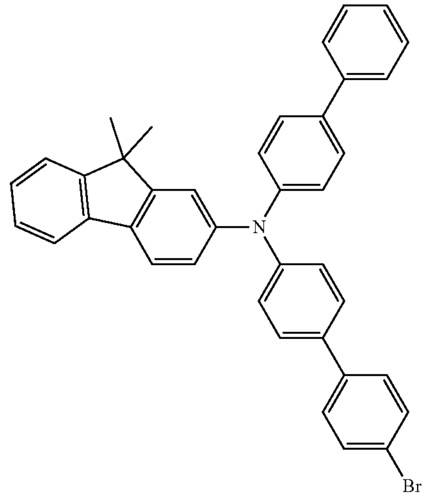
Sub 3-213
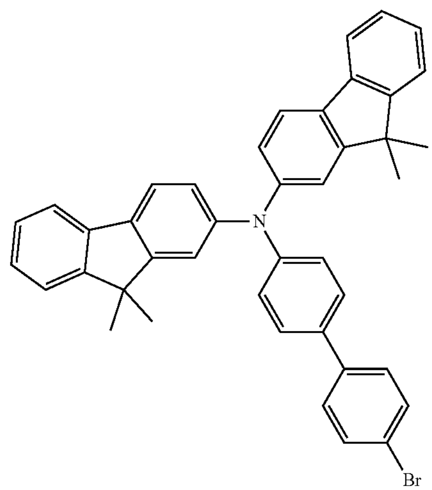
Sub 3-214
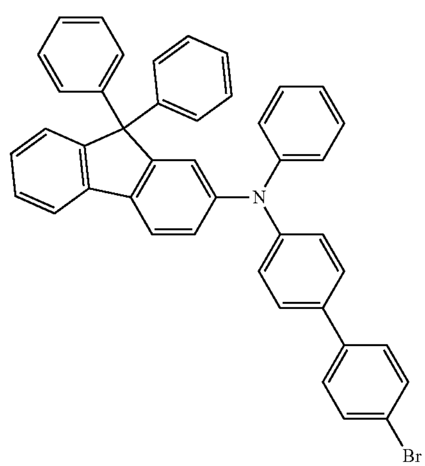

-continued
Sub 3-215
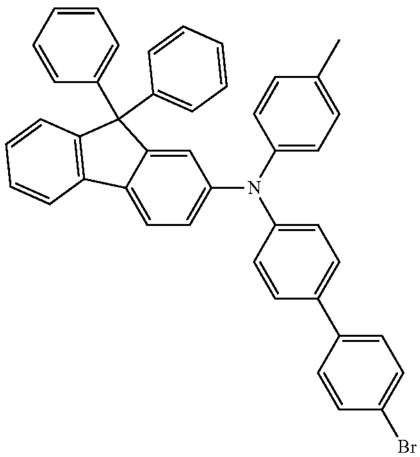
Sub 3-216
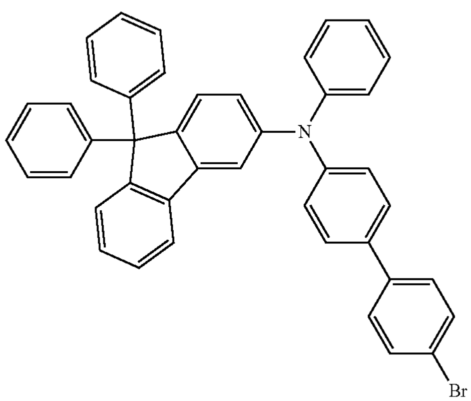
Sub 3-217
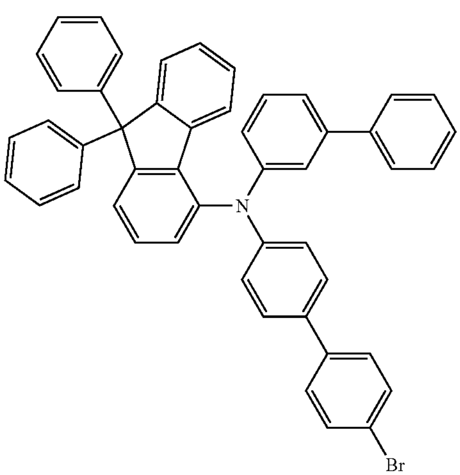
-continued
Sub 3-218
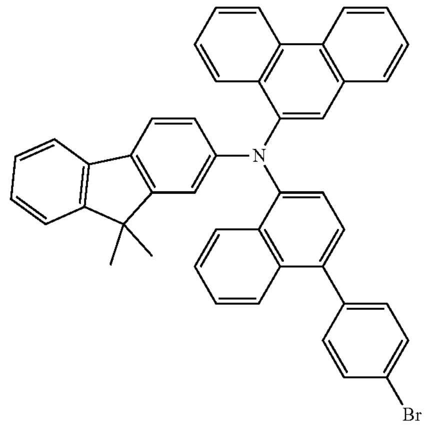
Sub 3-219
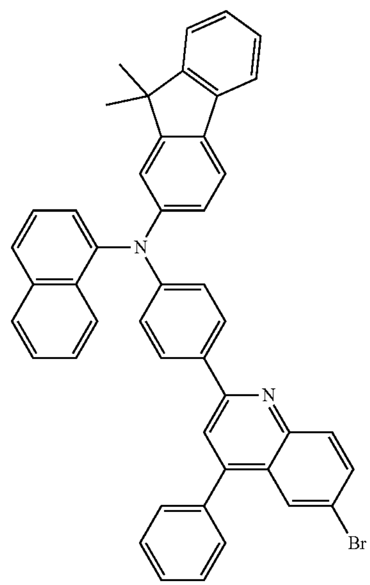
Sub 3-220
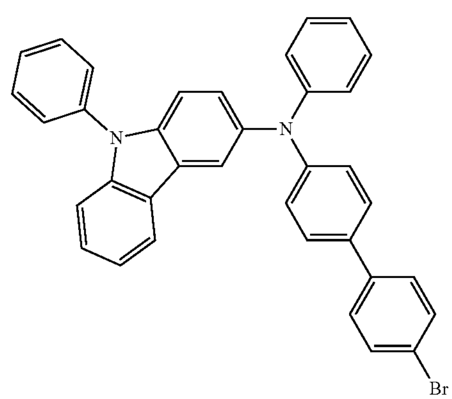

-continued
Sub 3-221
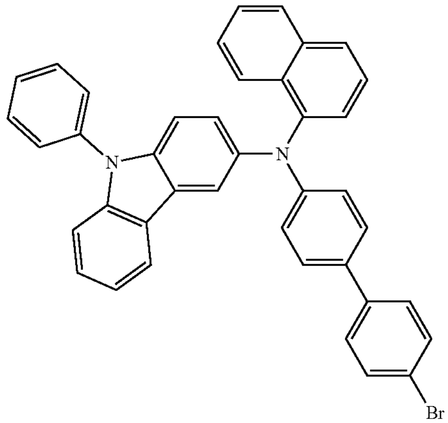
Sub 3-222
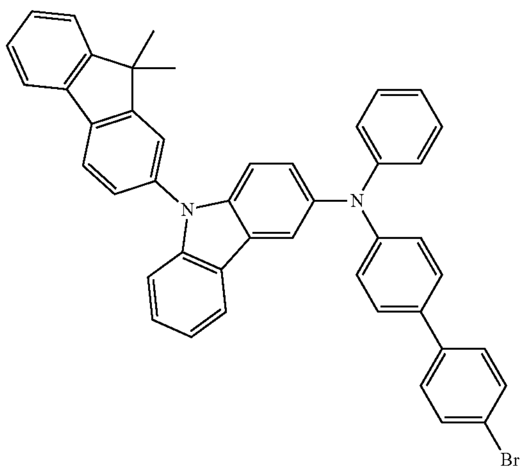
Sub 3-223
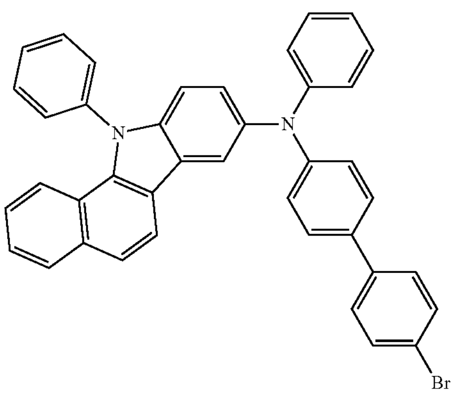
-continued
Sub 3-224
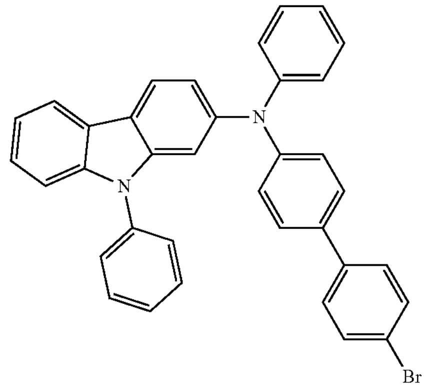
Sub 3-225
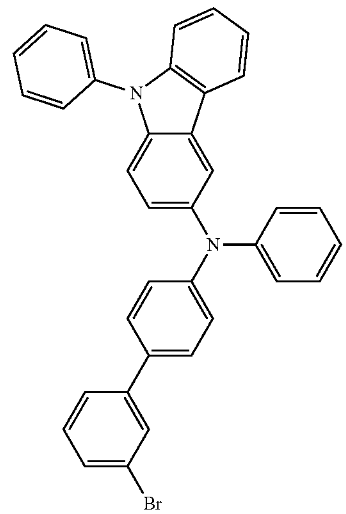
Sub 3-226
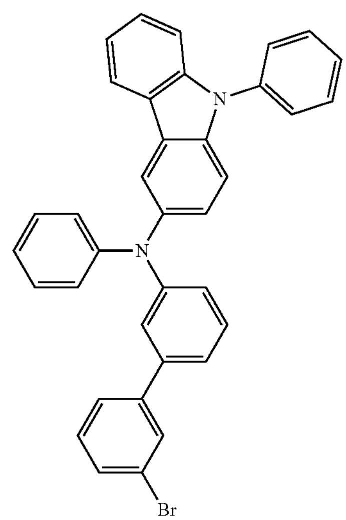
TABLE 4
| Compound | FD-MS | Compound | FD-MS |
|---|---|---|---|
| Sub 3-1 | m/z = 429.02($C_{24}H_{16}BrNS$ = 430.36) | Sub 3-2 | m/z = 413.04($C_{24}H_{16}BrNO$ = 414.30) |
| Sub 3-3 | m/z = 463.06($C_{28}H_{18}BrNO$ = 454.36) | Sub 3-4 | m/z = 385.07($C_{24}H_{16}ClNS$ = 385.91) |
| Sub 3-5 | m/z = 435.08($C_{28}H_{18}ClNS$ = 435.9) | Sub 3-6 | m/z = 567.09($C_{36}H_{22}ClNS_2$ = 568.15) |
| Sub 3-7 | m/z = 551.11($C_{36}H_{22}ClNOS$ = 552.09) | Sub 3-8 | m/z = 501.13($C_{33}H_{24}ClNS$ = 502.07) |
| Sub 3-9 | m/z = 445.12($C_{30}H_{20}ClNO$ = 445.95) | Sub 3-10 | m/z = 445.12($C_{30}H_{20}ClNO$ = 445.95) |

TABLE 4-continued

| Compound | FD-MS | Compound | FD-MS |
|---|---|---|---|
| Sub 3-11 | m/z = 385.07($C_{24}H_{16}ClNS$ = 385.91) | Sub 3-12 | m/z = 49106($C_{30}H_{18}ClNS_2$ = 492.05) |
| Sub 3-13 | m/z = 567.09($C_{36}H_{22}ClNS_2$ = 568.15) | Sub 3-14 | m/z = 541.07($C_{34}H_{20}ClNS_2$ = 542.11) |
| Sub 3-15 | m/z = 575.11($C_{38}H_{22}ClNOS$ = 576.11) | Sub 3-16 | m/z = 552.11($C_{35}H_{21}ClN_2OS$ = 553.08) |
| Sub 3-17 | m/z = 626.16($C_{42}H_{27}ClN_2S$ = 627.20) | Sub 3-18 | m/z = 643.12($C_{42}H_{26}ClNS_2$ = 644.25) |
| Sub 3-19 | m/z = 435.08($C_{28}H_{18}ClNS$ = 435.97) | Sub 3-20 | m/z = 369.09($C_{24}H_{16}ClNO$ = 369.85) |
| Sub 3-21 | m/z = 475.08($C_{30}H_{18}ClNOS$ = 475.99) | Sub 3-22 | m/z = 565.09($C_{36}H_{20}ClN_2OS$ = 566.07) |
| Sub 3-23 | m/z = 519.14($C_{36}H_{22}ClNO$ = 520.03) | Sub 3-24 | m/z = 385.07($C_{24}H_{16}ClNS$ = 385.91) |
| Sub 3-25 | m/z = 435.08($C_{28}H_{18}ClNS$ = 435.97) | Sub 3-26 | m/z = 567.09($C_{36}H_{22}ClNS_2$ = 568.15) |
| Sub 3-27 | m/z = 597.04($C_{36}H_{20}ClNS_3$ = 598.19) | Sub 3-28 | m/z = 435.08($C_{28}H_{18}ClNS$ = 435.97) |
| Sub 3-29 | m/z = 435.08($C_{28}H_{18}ClNS$ = 435.97) | Sub 3-30 | m/z = 485.10($C_{32}H_{20}ClNS$ = 486.03) |
| Sub 3-31 | m/z = 591.14($C_{39}H_{26}ClNOS$ = 592.15) | Sub 3-32 | m/z = 559.13($C_{38}H_{22}ClNO_2$ = 560.05) |
| Sub 3-33 | m/z = 677.16($C_{46}H_{28}ClNOS$ = 678.25) | Sub 3-34 | m/z = 385.07($C_{24}H_{16}ClNS$ = 385.91) |
| Sub 3-35 | m/z = 399.08($C_{25}H_{18}ClNS$ = 399.94) | Sub 3-36 | m/z = 435.08($C_{28}H_{18}ClNS$ = 435.97) |
| Sub 3-37 | m/z = 461.10($C_{30}H_{20}ClNS$ = 462.01) | Sub 3-38 | m/z = 511.12($C_{34}H_{22}ClNS$ = 512.07) |
| Sub 3-39 | m/z = 399.08($C_{25}H_{18}ClNS$ = 399.94) | Sub 3-40 | m/z = 461.10($C_{30}H_{20}ClNS$ = 462.01) |
| Sub 3-41 | m/z = 491.06($C_{30}H_{18}ClNS_2$ = 492.05) | Sub 3-42 | m/z = 491.06($C_{30}H_{10}ClNS_2$ = 492.05) |
| Sub 3-43 | m/z = 491.06($C_{30}H_{18}ClNS_2$ = 492.05) | Sub 3-44 | m/z = 541.07($C_{34}H_{20}ClNS_2$ = 542.11) |
| Sub 3-45 | m/z = 643.12($C_{42}H_{26}ClNS_2$ = 644.25) | Sub 3-46 | m/z = 607.12($C_{39}H_{26}ClNS_2$ = 608.21) |
| Sub 3-47 | m/z = 541.07($C_{34}H_{20}ClNS_2$ = 542.11) | Sub 3-48 | m/z = 475.08($C_{30}H_{18}ClNOS$ = 475.99) |
| Sub 3-49 | m/z = 626.16($C_{42}H_{27}ClN_2S$ = 627.20) | Sub 3-50 | m/z = 435.08($C_{28}H_{18}ClNS$ = 435.97) |
| Sub 3-51 | m/z = 435.08($C_{28}H_{18}ClNS$ = 435.97) | Sub 3-52 | m/z = 435.08($C_{28}H_{18}ClNS$ = 435.97) |
| Sub 3-53 | m/z = 541.07($C_{34}H_{20}ClNS_2$ = 542.11) | Sub 3-54 | m/z = 555.09($C_{35}H_{22}ClNS_2$ = 556.14) |
| Sub 3-55 | m/z = 525.10($C_{34}H_{20}ClNOS$ = 526.05) | Sub 3-56 | m/z = 513.13($C_{32}H_{24}ClNS$ = 514.08) |
| Sub 3-57 | m/z = 485.10($C_{32}H_{20}ClNS$ = 486.03) | Sub 3-58 | m/z = 537.13($C_{36}H_{24}ClNS$ = 538.11) |
| Sub 3-59 | m/z = 626.16($C_{42}H_{27}ClN_2S$ = 627.20) | Sub 3-60 | m/z = 369.09($C_{24}H_{16}ClN$ = 369.85) |
| Sub 3-61 | m/z = 445.12($C_{30}H_{20}ClNO$ = 445.95) | Sub 3-62 | m/z = 495.14($C_{34}H_{22}ClNO$ = 496.01) |
| Sub 3-63 | m/z = 459.10($C_{30}H_{18}ClNO_2$ = 459.93) | Sub 3-64 | m/z = 534.15($C_{36}H_{23}ClNO_2$ = 535.04) |
| Sub 3-65 | m/z = 535.17($C_{37}H_{26}ClNO$ = 536.07) | Sub 3-66 | m/z = 525.10($C_{34}H_{20}ClNOS$ = 526.05) |
| Sub 3-67 | m/z = 385.07($C_{24}H_{16}ClNS$ = 385.91) | Sub 3-68 | m/z = 435.08($C_{28}H_{18}ClNS$ = 435.97) |
| Sub 3-69 | m/z = 461.10($C_{30}H_{20}ClNS$ = 462.01) | Sub 3-70 | m/z = 611.15($C_{42}$H2ClNS = 612.19) |
| Sub 3-71 | m/z = 567.09($C_{36}H_{22}ClNS_2$ = 568.15) | Sub 3-72 | m/z = 541.07($C_{34}H_{20}$ClNS2 = 542.11) |
| Sub 3-73 | m/z = 475.08($C_{30}H_{18}ClNOS$ = 475.99) | Sub 3-74 | m/z = 551.11($C_{36}H_{22}ClNOS$ = 552.09) |
| Sub 3-75 | m/z = 591.14($C_{39}H_{26}ClNOS$ = 592.13) | Sub 3-76 | m/z = 435.08($C_{28}H_{18}ClNS$ = 435.97) |
| Sub 3-77 | m/z = 591.09($C_{38}H_{22}ClNS_2$ = 592.17) | Sub 3-78 | m/z = 537.13($C_{36}H_{24}ClNS$ = 538.11) |
| Sub 3-79 | m/z = 379.15($C_{24}$H6$D_{10}$ClNO = 379.91) | Sub 3-80 | m/z = 459.10($C_{30}H_{18}ClNO_2$ = 459.93) |
| Sub 3-81 | m/z = 445.12($C_{30}H_{20}ClNO$ = 445.95) | Sub 3-82 | m/z = 429.02($C_{24}H_{16}BrNS$ = 430.36) |
| Sub 3-83 | m/z = 443.03($C_{25}H_{18}BrNS$ = 444.39) | Sub 3-84 | m/z = 479.03($C_{28}H_{18}BrNS$ = 480.42) |
| Sub 3-85 | m/z = 485.10($C_{32}H_{20}ClNS$ = 486.03) | Sub 3-86 | m/z = 545.12($C_{34}H_{24}ClNO_2S$ = 546.08) |
| Sub 3-87 | m/z = 413.04($C_{24}H_{16}BrNO$ = 414.30) | Sub 3-88 | m/z = 529.10($C_{33}H_{24}BrNO$ = 530.47) |
| Sub 3-89 | m/z = 589.10($C_{38}H_{24}BrNO$ = 590.52) | Sub 3-90 | m/z = 385.07($C_{24}H_{16}ClNS$ = 385.91) |
| Sub 3-91 | m/z = 537.13($C_{36}H_{24}ClNS$ = 538.11) | Sub 3-92 | m/z = 491.06($C_{30}H_{18}ClNS_2$ = 492.05) |
| Sub 3-93 | m/z = 567.09($C_{36}H_{22}ClNS_2$ = 568.15) | Sub 3-94 | m/z = 567.09($C_{36}H_{22}ClNS_2$ = 568.15) |
| Sub 3-95 | m/z = 551.11($C_{36}H_{22}ClNS$ = 552.09) | Sub 3-96 | m/z = 683.15($C_{45}H_{30}ClNS_2$ = 684.31) |
| Sub 3-97 | m/z = 435.08($C_{28}H_{18}ClNS$ = 435.97) | Sub 3-98 | m/z = 591.09($C_{38}H_{22}ClNS_2$ = 592.17) |
| Sub 3-99 | m/z = 748.18($C_{49}H_{33}ClN_2S_2$ = 749.39) | Sub 3-100 | m/z = 369.09($C_{24}H_{16}ClNO$ = 369.85) |
| Sub 3-101 | m/z = 419.11($C_{28}H_{18}ClNO$ = 419.91) | Sub 3-102 | m/z = 475.08($C_{30}H_{18}ClNOS$ = 475.99) |
| Sub 3-103 | m/z = 625.13($C_{42}$24ClNOS = 626.17) | Sub 3-104 | m/z = 429.02($C_{24}H_{16}BrNS$ = 430.36) |
| Sub 3-105 | m/z = 479.03($C_{28}H_{18}BrNS$ = 480.42) | Sub 3-106 | m/z = 505.05($C_{30}H_{20}BrNS$ = 506.46) |
| Sub 3-107 | m/z = 435.08($C_{28}H_{18}ClNS$ = 435.97) | Sub 3-108 | m/z = 541.07($C_{34}H_{20}ClNS_2$ = 542.11) |
| Sub 3-109 | m/z = 489.07($C_{30}H_{20}BrNO$ = 490.40) | Sub 3-110 | m/z = 565.10($C_{36}H_{24}BrNO$ = 566.50) |
| Sub 3-111 | m/z = 716.15($C_{47}H_{29}BrN_2O$ = 717.67) | Sub 3-112 | m/z = 385.07($C_{24}H_{16}ClNS$ = 385.91) |
| Sub 3-113 | m/z = 511.12($C_{34}H_{22}ClNS$ = 512.07) | Sub 3-114 | m/z = 557.14($C_{35}H_{28}ClNSSi$ = 558.21) |
| Sub 3-115 | m/z = 495.14($C_{34}H_{22}ClNO$ = 496.01) | Sub 3-116 | m/z = 575.11($C_{38}H_{22}ClNOS$ = 576.11) |
| Sub 3-117 | m/z = 469.12($C_{32}H_{20}ClNO$ = 469.97) | Sub 3-118 | m/z = 469.12($C_{32}H_{20}ClNO$ = 469.97) |
| Sub 3-119 | m/z = 635.17($C_{44}H_{26}ClNO_2$ = 636.15) | Sub 3-120 | m/z = 650.16($C_{44}H_{27}ClN_2S$ = 651.22) |
| Sub 3-121 | m/z = 585.13($C_{40}H_{24}ClNS$ = 586.15) | Sub 3-122 | m/z 673.08($C_{42}H_{24}$ClNS3 674.29) |
| Sub 3-123 | m/z = 491.06($C_{30}H_{18}ClNS_2$ = 492.05) | Sub 3-124 | m/z = 461.1($C_{30}H_{20}ClNS$ = 462.01) |
| Sub 3-125 | m/z = 641.16($C_{43}H_{28}ClNOS$ = 642.21) | Sub 3-126 | m/z = 445.16($C_{31}H_{24}ClN$ = 445.99) |
| Sub 3-127 | m/z = 471.18($C_{33}H_{26}ClN$ = 472.03) | Sub 3-128 | m/7 = 395.14($C_{27}H_{22}ClN$ = 395.93) |
| Sub 3-129 | m/z = 471.18($C_{33}H_{26}ClN$ = 472.03) | Sub 3-130 | m/z = 395.14($C_{27}H_{22}ClN$ = 395.93) |
| Sub 3-131 | m/z = 511.21($C_{36}H_{30}ClN$ = 512.09) | Sub 3-132 | m/z = 423.18($C_{29}H_{26}ClN$ = 423.98) |
| Sub 3-133 | m/z = 569.19($C_{41}H_{28}ClN$ = 570.13) | Sub 3-134 | m/z = 595.21($C_{43}H_{30}ClN$ = 596.17) |
| Sub 3-135 | m/z = 519.18($C_{37}H_{26}ClN$ = 520.07) | Sub 3-136 | m/z = 567.18($C_{41}H_{26}ClN$ = 568.12) |
| Sub 3-137 | m/z = 515.14($C_{37}H_{22}ClN$ = 516.04) | Sub 3-138 | m/z = 517.16($C_{37}H_{24}ClN$ = 518.06) |
| Sub 3-139 | m/z = 607.17($C_{43}H_{26}ClNO$ = 608.14) | Sub 3-140 | m/z = 517.16($C_{37}H_{24}ClN$ = 518.06) |
| Sub 3-141 | m/z = 607.17($C_{43}H_{26}ClNO$ = 608.14) | Sub 3-142 | m/z = 395.14($C_{27}H_{22}ClN$ = 395.93) |
| Sub 3-143 | m/z = 485.15($C_{33}H_{24}ClNO$ = 486.01) | Sub 3-148 | m/z = 507.18($C_{36}H_{26}ClN$ = 508.06) |
| Sub 3-149 | m/z = 457.16($C_{32}H_{24}ClN$ = 458) | Sub 3-150 | m/z = 519.18($C_{37}H_{26}ClN$ = 520.07) |
| Sub 3-161 | m/z = 399.06($C_{24}H_{18}BrN$ = 400.32) | Sub 3-162 | m/z = 449.08($C_{28}H_{20}BrN$ = 450.38) |
| Sub 3-163 | m/z = 499.09($C_{32}H_{22}BrN$ = 500.44) | Sub 3-164 | m/z = 475.09($C_{30}H_{22}BrN$ = 476.42) |
| Sub 3-165 | m/z = 480.12($C_{30}H_{17}$D5BrN = 481.45) | Sub 3-166 | m/z = 525.11($C_{34}H_{24}BrN$ = 526.48) |
| Sub 3-167 | m/z = 575.12($C_{38}H_{26}BrN$ = 576.54) | Sub 3-167 | m/z = 551.12($C_{36}H_{26}BrN$ = 552.52) |
| Sub 3-171 | m/z = 616.15(C4Q$H_{29}BrN_2$ = 617.59) | Sub 3-178 | m/z = 627.16($C_{42}H_{30}BrN$ = 628.61) |
| Sub 3-182 | m/z = 489.07($C_{30}H_{20}BrNO$ = 490.4) | Sub 3-184 | m/z = 555.07($C_{34}H_{22}BrNS$ = 556.52) |
| Sub 3-185 | m/z = 657.11($C_{42}H_{28}BrNS$ = 658.66) | Sub 3-186 | m/z = 591.16($C_{39}H_{30}BrN$ = 592.58) |
| Sub 3-187 | m/z = 631.19($C_{42}H_{34}BrN$ = 632.65) | Sub 3-188 | m/z = 505.05($C_{30}H_{20}BrNS$ = 506.46) |
| Sub 3-190 | m/z = 581.08($C_{36}H_{24}BrNS$ = 582.56) | Sub 3-193 | m/z = 611.04($C_{36}H_{22}BrNS_2$ = 612.6) |
| Sub 3-194 | m/z = 631.1($C_{40}H_{26}BrNS$ = 632.62) | Sub 3-204 | m/z = 539.09($C_{34}H_{22}BrNO$ = 540.46) |

TABLE 4-continued

| Compound | FD-MS | Compound | FD-MS |
|---|---|---|---|
| Sub 3-206 | m/z = 615.12($C_{40}H_{26}BrNO$ = 616.56) | Sub 3-209 | m/z = 641.14($C_{42}H_{28}BrNO$ = 642.6) |
| Sub 3-211 | m/z = 565.14($C_{37}H_{28}BrN$ = 566.54) | Sub 3-212 | m/z = 591.16($C_{30}H_{30}BrN$ = 592.58) |

Illustration of Synthesis of Sub 4

Synthesis methods for Sub 4 of Reaction Formula 8 may be the same as, but are not limited to, the synthesis methods for Sub 2. Compounds belonging to Sub 4 may be the same as, but are not limited to, the compounds of Sub 2.

Synthesis of Final Product 2

After Sub 3 (1 equivalent) was dissolved with toluene in a round bottom flask, Sub 4 (1 equivalent), $Pd_2(dba)_3$ (0.03 equivalent), $(t\text{-}Bu)_3P$ (0.1 equivalent), and NaOt-Bu (3 equivalents) were stirred at 100° C. When the reaction was completed, extraction was performed with $CH_2Cl_2$ and water, and an organic layer was dried with $MgSO_4$ and concentrated. Afterwards, a resultant compound was subjected to silica gel column chromatography and recrystallization, thereby creating Final Product 2.

Some compounds according to the present disclosure were prepared by synthesis methods disclosed in Korean Patent Nos. 10-1668448 (patented on Oct. 17, 2016) and 10-1789998 (patented on Oct. 19, 2017) of the applicant.

1. Synthesis Example of 10-37

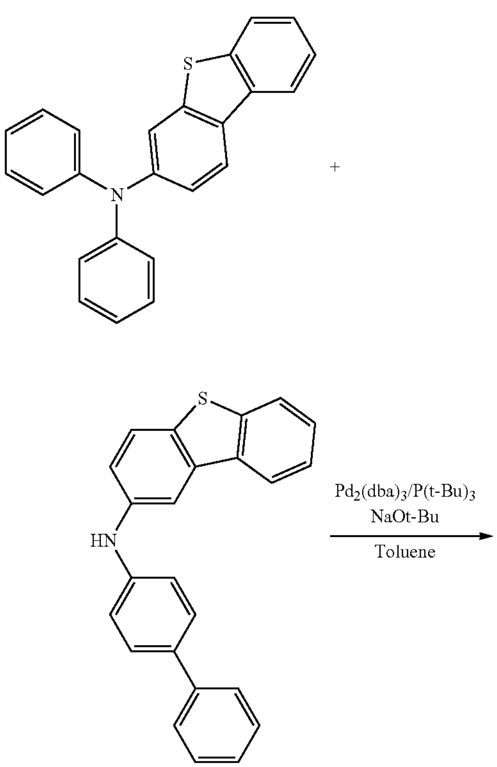

-continued

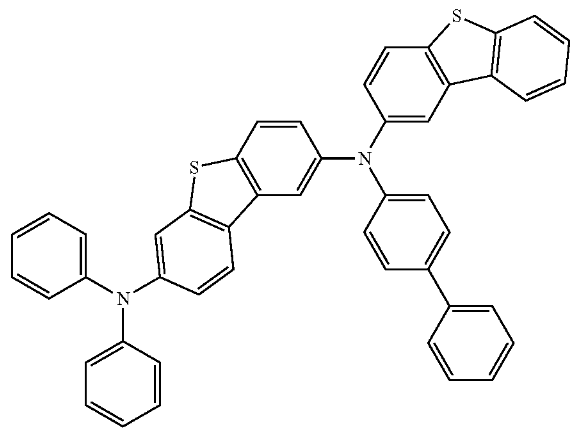

N-([1,1'-biphenyl]-4-yl)dibenzo[b,d]thiophen-2-amine (4.32 g, 12.29 mmol), $Pd_2(dba)_3$ (0.34 g, 0.37 mmol) P(t-Bu)$_3$ (0.25 g, 1.23 mmol), NaOt-Bu (3.54 g, 36.87 mmol), and toluene (125 ml) were added to N,N-diphenyldibenzo[b,d]thiophen-3-amine (5.29 g, 12.29 mmol) created in the above synthesis, and then a product 6.81 g (yield: 79%) was created using the synthesis method.

2. 7-8 Synthesis Example

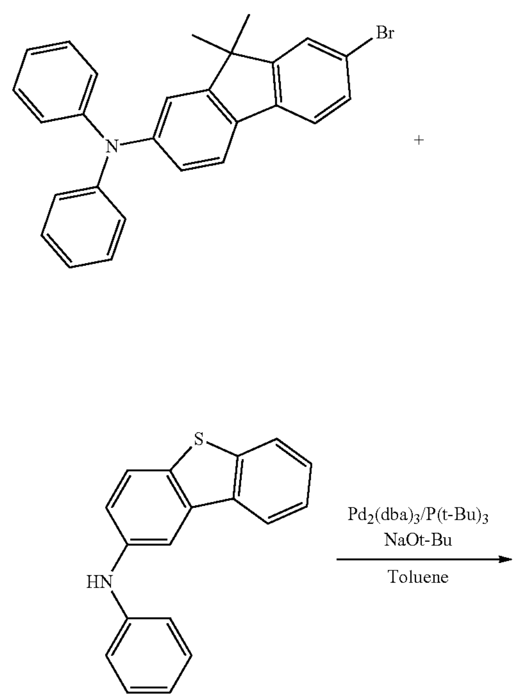

-continued

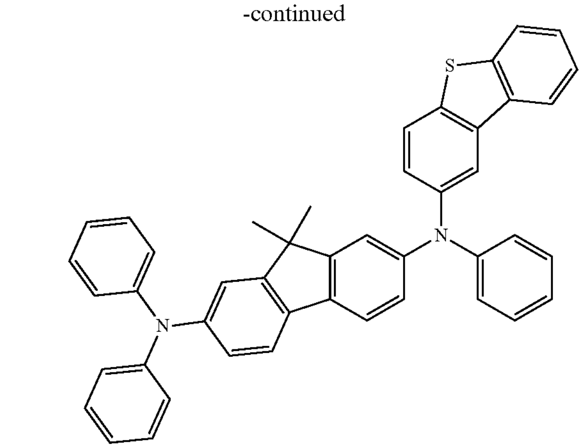

N-phenyldibenzo[b,d]thiophen-2-amine (5 g, 18.2 mmol), $Pd_2(dba)_3$ (0.5 g, 0.55 mmol) $P(t\text{-}Bu)_3$ (0.23 g, 1.1 mmol), NaOt-Bu (5.3 g, 54.6 mmol), and toluene (100 ml) were added to 7-bromo-9,9-dimethyl-N,N-diphenyl-9H-fluoren-2-amine (8 g, 18.2 mmol) created by the above synthesis, and then a product 8.9 g (yield: 76%) was created using the above 10-37 synthesis method.

3. 10-176 Synthesis Example

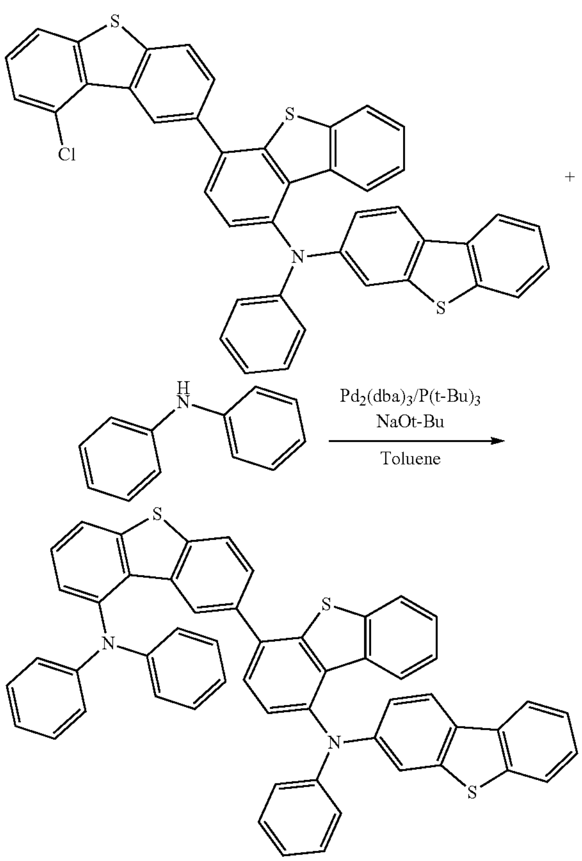

Diphenylamine (6.27 g, 37.08 mmol), $Pd_2(dba)_3$ (1.02 g, 1.11 mmol) $P(t\text{-}Bu)_3$ (7.50 g, 37.08 mmol), NaOt-Bu (7.13 g, 74.15 mmol), and toluene (371 ml) were added to 9-chloro-N-(dibenzo[b,d]thiophen-3-yl)-N-phenyl-[2,4'-bidibenzo[b,d]thiophen]-1'-amine (25 g, 37.08 mmol) created by the above synthesis, and then a product 8.9 g (yield: 72%) was created using the above 10-37 synthesis method.

4. 12-1 Synthesis Example

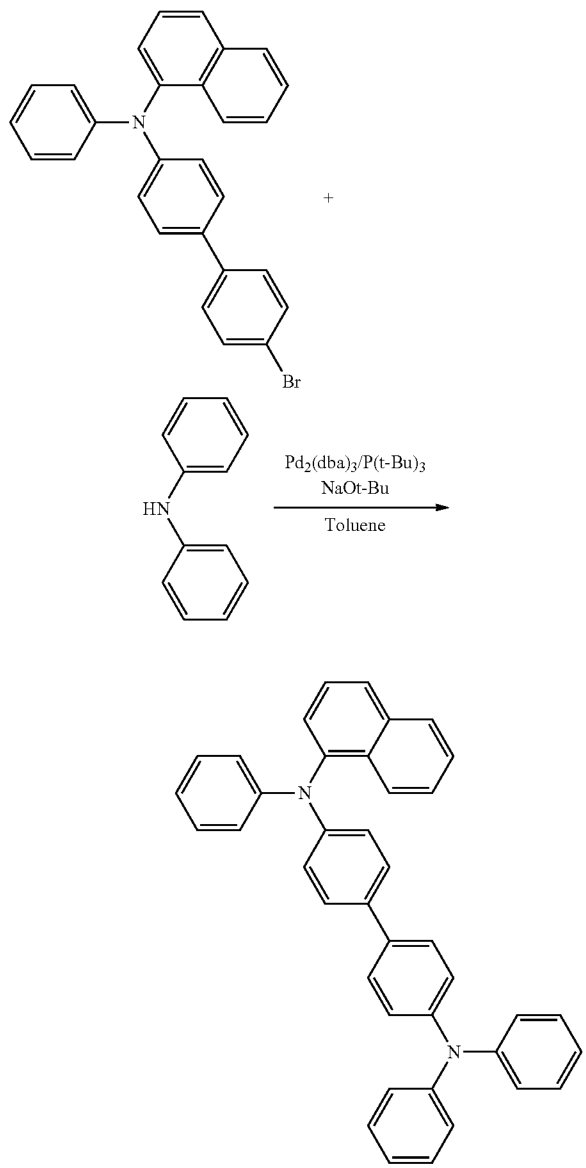

Diphenylamine (9.39 g, 55.51 mmol), $Pd_2(dba)_3$ (1.52 g, 1.67 mmol) $P(t\text{-}Bu)_3$ (11.23 g, 55.51 mmol), NaOt-Bu (10.67 g, 111.02 mmol), and toluene (555 ml) were added to N-(4'-bromo-[1,1'-biphenyl]-4-yl)-N-phenylnaphthalen-1-amine (25 g, 55.51 mmol) created by the above synthesis, and then a product 21.77 g (yield: 81%) was created using the above 10-37 synthesis method.

In the meantime, FD-MS values of the compounds 7-1 to 12-63 prepared according to Synthesis Examples of the present disclosure as described above are illustrated in Table 5 below.

TABLE 5

| Compound | FD-MS | Compound | FD-MS |
|---|---|---|---|
| 7-1 | m/z = 760.29($C_{55}H_{40}N_2S$ = 761) | 7-2 | m/z = 744.31($C_{55}H_{40}N_2O$ = 44.94) |
| 7-3 | m/z = 680.32($C_{51}H_{40}N_2$ = 680.91) | 7-4 | m/z = 720.35($C_{54}H_{44}N_2$ = 720.96) |
| 7-5 | m/z = 528.26($C_{39}H_{32}N_2$ = 528.7) | 7-6 | m/z = 578.27($C_{43}H_{34}N_2$ = 578.76) |
| 7-7 | m/z = 680.32($C_{51}H_{40}N_2$ = 680.9) | 7-8 | m/z = 634.24($C_{45}H_{34}N_2S$ = 634.84) |
| 7-9 | m/z = 618.27($C_{45}H_{3454}N_2$ = 618.78) | 7-10 | m/z = 634.24($C_{45}H_{34}N_2S$ = 634.84) |
| 7-11 | m/z = 618.27($C_{45}H_{34}N_2$ = 618.78) | 7-12 | m/z = 652.29($C_{49}H_{36}N_2$ = 652.34) |
| 7-13 | m/z = 720.35($C_{54}H_{44}N_2$ = 720.96) | 7-14 | m/z = 760.38($C_{57}H_{48}N_2$ = 761.03) |
| 7-15 | m/z = 693.31($C_{51}H_{39}N_3$ = 693.89) | 7-16 | m/z = 584.32($C_{43}H_{40}N_2$ = 584.81) |
| 7-17 | m/z = 752.32($C_{57}H_{40}N_2$ = 752.96) | 7-18 | m/z = 742.33($C_{56}H_{42}N_2$ = 742.97) |
| 7-19 | m/z = 758.28($C_{55}H_{38}N_2S$ = 758.98) | 7-20 | m/z = 768.35($C_{58}H_{44}N_2$ = 769) |
| 7-21 | m/z = 650.27($C_{49}H_{34}N_2$ = 650.83) | 7-22 | m/z = 766.33($C_{58}H_{42}N_2$ = 766.99) |
| 7-23 | m/z = 750.3($C_{57}H_{38}N_2$ = 750.95) | 7-24 | m/z = 646.24($C_{49}H_{30}N_2$ = 646.79) |
| 7-25 | m/z = 817.35($C_6H_{43}N_3$ = 818.04) | 7-26 | m/z = 756.26($C_{55}H_{36}N_2S$ = 756.97) |
| 7-27 | m/z = 830.29($C_{61}H_{38}N_2O_2$ = 830.99) | 7-28 | m/z = 815.33($C_{61}H_{41}N_3$ = 816.02) |
| 7-29 | m/z = 694.33($C_{52}H_{42}N_2$ = 694.92) | 7-30 | m/z = 668.28($C_{49}H_{36}N_2$ = 668.84) |
| 7-31 | m/z = 710.28($C_5H_{38}N_2S$ = 710.94) | 7-32 | m/z = 684.26($C_{49}H_{36}N_2S$ = 684.9) |
| 7-33 | m/z = 668.28($C_{49}H_{36}N_2O$ = 668.84) | 7-34 | m/z = 604.29($C_{45}H_{36}N_2$ = 604.8) |
| 7-35 | m/z = 630.3($C_{47}H_{38}N_2$ = 630.84) | 7-36 | m/z = 708.29($C_{52}H_{37}FN_2$ = 708.88) |
| 7-37 | m/z = 830.37($C_{63}H_{45}N_2$ = 831.08) | 7-38 | m/z = 808.29($C_{59}H_{40}N_2S$ = 809.04) |
| 7-39 | m/z = 844.38($C_{64}H_{48}N_2$ = 845.1) | 7-40 | m/z = 834.31($C_{61}H_{42}N_2S$ = 835.08) |
| 7-41 | m/z = 742.3($C_{55}H_{38}N_2O$ = 742.92) | 7-42 | m/z = 968.41($C_{74}H_{52}N_2$ = 969.24) |
| 7-43 | m/z = 690.3($C_{52}H_{38}N_2$ = 690.89) | 7-44 | m/z = 802.33($C_{61}H_{42}N_2$ = 803.02) |
| 7-45 | m/z = 816.3($C_{61}H_{40}N_2O$ = 817) | 7-46 | m/z = 708.26($C_5H_{36}N_2S$ = 708.92) |
| 7-47 | m/z = 832.29($C_{61}H_{40}N_2S$ = 833.07) | 7-48 | m/z = 694.3($C_{51}H_{38}N_2$ = 694.88) |
| 7-49 | m/z = 818.37($C_{62}H_{46}N_2$ = 819.06) | 7-50 | m/z = 802.33($C_{61}H_{42}N_2$ = 803.02) |
| 7-51 | m/z = 769.35($C_{57}H_{43}N_3$ = 769.99) | | |
| 10-1 | m/z-618.21($C_{44}H_{30}N_2S$-618.80) | 10-2 | m/z-700.20($C_{48}H_{32}N_2S_2$-700.92) |
| 10-3 | m/z = 708.22($C_{50}H_{32}N_2OS$ = 708.88) | 10-4 | m/z = 692.25($C_{50}H_{32}N_2O_2$ = 692.82) |
| 10-5 | m/z = 742.30($C_{55}H_{38}N_2O$ = 742.92) | 10-6 | m/z = 654.27($C_{48}H_{34}N_2O$ = 654.81) |
| 10-7 | m/z = 700.20($C_{48}H_{32}N_2S_2$ = 700.92) | 10-8 | m/z = 760.25($C_{54}H_{36}N_2OS$ = 760.96) |
| 10-9 | m/z = 730.16($C_{48}H_{30}N_2S_3$ = 730.96) | 10-10 | m/z = 734.24($C_{52}H_{34}N_2OS$ = 734.92) |
| 10-11 | m/z = 872.32($C_{64}H_{44}N_2S$ = 873.13) | 10-12 | m/z = 718.26($C_{52}H_{34}N_2O_2$ = 718.86) |
| 10-13 | m/z = 568.20($C_4)H_2N_2S$ = 568.74) | 10-14 | m/z = 624.17($C_{42}H_{25}N_2S_2$ = 624.82) |
| 10-15 | m/z = 658.21($C_{46}H_{30}N_2OS$ = 658.82) | 10-16 | m/z = 730.30($C_{54}H_{38}N_2O$ = 730.91) |
| 10-17 | m/z = 698.20($C_{48}H_{30}N_2O_2S$ = 698.84) | 10-18 | m/z = 624.17($C_{50}H_{32}N_2S_2$ = 624.82) |
| 10-19 | m/z = 700.20($C_{48}H_{32}N_2S_2$ = 700.92) | 10-20 | m/z = 708.22($C_{50}H_{32}N_2OS$ = 708.88) |
| 10-21 | m/z = 750.22($C_{52}H_{34}N_2S_2$ = 750.98) | 10-22 | m/z = 776.23($C_{54}H_{36}N_2S_2$ = 777.02) |
| 10-23 | m/z = 867.24($C_{59}H_{37}N_3OS_2$ = 868.09) | 10-24 | m/z = 759.27($C_{54}H_{37}N_3S$ = 759.97) |
| 10-25 | m/z = 608.19($C_{42}H_{28}N_2OS$ = 608.76) | 10-26 | m/z = 608.19($C_{42}H_{28}N_2OS$ = 608.76) |
| 10-27 | m/z = 692.25($C_{50}H_{32}N_2O_2$ = 692.82) | 10-28 | m/z = 894.20($C_{60}H_{34}N_2O_3S_2$ = 895.06) |
| 10-29 | m/z = 618.21($C_{44}H_{30}N_2S$ = 618.80) | 10-30 | m/z = 700.20($C_{48}H_{32}N_2S_2$ = 700.92) |
| 10-31 | m/z = 780.17($C_{52}H_{32}N_2S_3$ = 781.02) | 10-32 | m/z = 734.24($C_{52}H_{34}N_2OS$ = 734.92) |
| 10-33 | m/z = 834.31($C_{61}H_{42}N_2S$ = 835.08) | 10-34 | m/z = 700.20($C_{48}H_{32}N_2S_2$ = 700.92) |
| 10-35 | m/z = 724.25($C_{51}H_{36}N_2OS$ = 724.92) | 10-36 | m/z = 624.17($C_{42}H_{28}N_2S_2$ = 624.82) |
| 10-37 | m/z = 700.20($C_{48}H_{32}N_2S_2$ = 700.92) | 10-38 | m/z = 700.20($C_{48}H_{32}N_2S_2$ = 700.92) |
| 10-39 | m/z = 674.19($C_{46}H_{30}N_2S_2$ = 674.88) | 10-40 | m/z = 700.20($C_{48}H_{32}N_3S_2$ = 700.92) |
| 10-41 | m/z = 608.19($C_{42}H_{28}N_2OS$ = 608.76) | 10-42 | m/z = 684.22($C_{48}H_{32}N_2OS$ = 984.86) |
| 10-43 | m/z = 684.22($C_{48}H_{32}N_2OS$ = 684.86) | 10-44 | m/z = 624.17($C_{42}H_{28}N_2S_2$ = 624.82) |
| 10-45 | m/z = 826.25($C_{46}H_{30}N_2S_2$ = 827.08) | 10-46 | m/z = 700.20($C_{48}H_{32}N_2S_2$ = 700.92) |
| 10-47 | m/z = 624.17($C_{58}H_{38}N_2S_2$ = 624.82) | 10-48 | m/z = 608.19($C_{42}H_{28}N_2OS$ = 608.76) |
| 10-49 | m/z = 700.20($C_{42}H_{28}N_2S_2$ = 700.92) | 10-50 | m/z = 684.22($C_{48}H_{32}N_2OS$ = 684.86) |
| 10-51 | m/z = 730.16($C_{48}H_{32}N_2S_2$ = 730.96) | 10-52 | m/z = 684.22($C_{48}H_{32}N_2OS$ = 684.86) |
| 10-53 | m/z = 806.19($C_{48}H_{30}N_2S_3$ = 807.06) | 10-54 | m/z = 826.25($C_{58}H_{38}N_2S_2$ = 827.08) |
| 10-55 | m/z = 674.19($C_{54}H_{34}N_2S_3$ = 674.88) | 10-56 | m/z = 674.19($C_{46}H_{30}N_2S_2$ = 674.88) |
| 10-57 | m/z = 674.19($C_{46}H_{30}N_2S_2$ = 674.88) | 10-58 | m/z = 974.19($C_{46}H_{30}N_2S_3$ = 674.88) |
| 10-59 | m/z = 638.19($C_{46}H_{30}N_2S_2$ = 638.85) | 10-60 | m/z = 674.19($C_{46}H_{30}N_2S_2$ = 674.88) |
| 10-61 | m/z = 638.19($C_{43}H_{30}N_2S_2$ = 638.85) | 10-62 | m/z = 638.19($C_{43}H_{30}N_2S2$ = 638.85) |
| 10-63 | m/z = 638.19($C_{43}H_{30}N_2S_3$ = 638.85) | 10-64 | m/z = 622.21($C_{43}H_{30}N_2OS$ = 622.79) |
| 10-65 | m/z = 688.20($C_{47}H_{32}N_2S_2$ = 688.91) | 10-66 | m/z = 700.20($C_{48}H_{32}N_2S_2$ = 700.92) |
| 10-67 | m/z = 789.23($C_{54}H_{35}N_3S_2$ = 790.02) | 10-68 | m/z = 638.19($C_{43}H_{30}N_2S_2$ = 638.85) |
| 10-69 | m/z = 638.19($C_{43}H_{30}N_2S_2$ = 638.85) | 10-70 | m/z = 642.16($C_{42}H_{27}FN_2S_2$ = 642.81) |
| 10-71 | m/z = 638.19($C_{43}H_{30}N_2S_2$ = 638.85) | 10-72 | m/z = 714.22($C_{49}H_{34}N_2S_2$ = 814.95) |
| 10-73 | m/z = 716.20($C_{48}H_{32}N_2OS_2$ = 716.92) | 10-74 | m/z = 670.24($C_{48}H_{34}N_2S$ = 670.87) |
| 10-75 | m/z = 634.24($C_{45}H_{34}N2S$ = 634.84) | 10-76 | m/z = 759.27($C_{54}H_{37}N_3S$ = 759.97) |
| 10-77 | m/z = 674.19($C_{46}H_{30}N_2S_2$ = 674.88) | 10-78 | m/z = 708.22($C_{50}H_{32}N_2OS$ = 708.88) |
| 10-79 | m/z = 674.19($C_{46}H_{30}N_2S_2$ = 674.88) | 10-80 | m/z = 748.22($C_{52}H_{32}N_2O_2S$ = 748.90) |
| 10-81 | m/z = 821.29($C_{57}H_{35}D_5N_2S_2$ = 822.11) | 10-82 | m/z = 730.16($C_{48}H_{30}N_2S_3$ = 730.96) |
| 10-83 | m/z = 730.16($C_{48}H_{30}N_2S_3$ = 730.96) | 10-84 | m/z = 714.18($C_{48}H_{30}N_2OS_2$ = 714.90) |
| 10-85 | m/z = 882.22($C_{60}H_{38}N_2S_3$ = 883.16) | 10-86 | m/z = 624.17($C_{42}H_{28}N_2S_2$ = 624.82) |
| 10-87 | m/z = 700.20($C_{48}H_{32}N_2S_2$ = 700.92) | 10-88 | m/z = 674.19($C_{46}H_{30}N_2S_2$ = 671.88) |
| 10-89 | m/z = 674.19($C_{46}H_{30}N_2S_3$ = 674.88) | 10-90 | m/z = 708.22($C_{50}H_{32}N_2OS$ = 708.88) |
| 10-91 | m/z = 759.27($C_{54}H_{37}N_3S$ = 759.97) | 10-92 | m/z = 674.19($C_{46}H_{30}N_2S_2$ = 674.88) |
| 10-93 | m/z = 688.20($C_{47}H_{32}N_2S_2$ = 688.91) | 10-94 | m/z = 760.25($C_{54}H_{36}N_2OS$ = 760.96) |
| 10-95 | m/z = 759.27($C_{54}H_{37}NS$ = 759.97) | 10-96 | m/z = 608.19($C_{42}H_{28}N_2OS$ = 608.76) |
| 10-97 | m/z = 684.22($C_{48}H_{32}NOS$ = 684.86) | 10-98 | m/z = 622.21($C_{43}H_{30}N_2OS$ = 622.79) |
| 10-99 | m/z = 760.25($C_{54}H_{36}NOS$ = 760.96) | 10-100 | m/z = 658.21($C_{46}H_{30}N_2OS$ = 658.82) |
| 10-101 | m/z = 658.21($C_{46}H_{30}NOS$ = 658.82) | 10-102 | m/z = 692.25($C_{50}H_{32}N_2O_2$ = 692.82) |
| 10-103 | m/z = 628.25($C_{46}H_{32}NO$ = 628.78) | 10-104 | m/z = 693.28($C_{50}H_{35}N_3O$ = 693.85) |

TABLE 5-continued

| Compound | FD-MS | Compound | FD-MS |
|---|---|---|---|
| 10-105 | m/z = 723.23($C_{50}H_{33}NOS$ = 723.89) | 10-106 | m/z = 749.29($C_{54}H_{31}D_5N_2S$ = 749.99) |
| 10-107 | m/z = 700.20($C_{48}H_{32}NS_2$ = 700.92) | 10-108 | m/z = 674.19($C_{46}H_{30}N_2S_2$ = 674.88) |
| 10-109 | m/z = 684.22($C_{48}H_{32}N_2OS$ = 684.86) | 10-110 | m/z = 724.25($C_{51}H_{36}N_2OS$ = 724.92) |
| 10-111 | m/z = 674.19($C_{46}H_{30}N_2S_2$ = 674.88) | 10-112 | m/z = 674.19($C_{46}H_{30}N_2S_2$ = 674.88) |
| 10-113 | m/z = 780.17($C_{52}H_{32}N_2S_3$ = 781.02) | 10-114 | m/z = 684.22($C_{48}H_{32}N_2OS$ = 684.86) |
| 10-115 | m/z = 684.22($C_{48}H_{32}N_2OS$ = 684.86) | 10-116 | m/z = 698.20($C_{48}H_{30}N_2O_2S$ = 698.84) |
| 10-117 | m/z = 618.26($C_{42}H_{18}D_{10}N_2OS$ = 618.82) | 10-118 | m/z = 757.27($C_{54}H_{35}N_3O_2$ = 757.89) |
| 10-119 | m/z = 668.25($C_{48}H_{32}N_2O_2$ = 668.80) | 10-120 | m/z = 720.26($C_{52}H_{36}N_2S$ = 720.93) |
| 10-121 | m/z = 670.24($C_{48}H_{34}N_2S$ = 670.87) | 10-122 | m/z = 700.20($C_{48}H_{32}N_2S_2$ = 700.92) |
| 10-123 | m/z = 674.19($C_{46}H_{30}N_2S_2$ = 674.88) | 10-124 | m/z = 700.20($C_{48}H_{32}N_2S_2$ = 700.92) |
| 10-125 | m/z = 608.19($C_{42}H_{28}N_2OS$ = 608.76) | 10-126 | m/z = 860.25($C_{58}H_{40}N_2O_2S_2$ = 861.09) |
| 10-127 | m/z = 798.27($C_{57}H_{38}N_2OS$ = 799.00) | 10-128 | m/z = 734.33($C_{54}H_{42}N_2O$ = 734.94) |
| 10-129 | m/z = 742.26($C_{54}H_{34}N_2O_2$ = 742.88) | 10-130 | m/z = 945.37($C_{70}H_{47}N_3O$ = 946.17) |
| 10-131 | m/z = 670.24($C_{48}H_{34}N_2S$ = 670.87) | 10-132 | m/z = 624.17($C_{42}H_{28}N_2S_2$ = 624.82) |
| 10-133 | m/z = 700.20($C_{48}H_{32}N_2S_2$ = 700.92) | 10-134 | m/z = 724.20($C_{50}H_{32}N_2S_2$ = 724.94) |
| 10-135 | m/z = 816.26($C_{57}H_{40}N_2S_2$ = 817.08) | 10-136 | m/z = 760.25($C_{54}H_{36}N_2OS$ = 766.96) |
| 10-137 | m/z = 674.19($C_{46}H_{30}N_2S_2$ = 674.88) | 10-138 | m/z = 730.16($C_{48}H_{30}N_2S_3$ = 730.96) |
| 10-139 | m/z = 881.29($C_{61}H_{43}N_3S_2$ = 882.16) | 10-140 | m/z = 704.28($C_{52}H_{36}N_2O$ = 704.87) |
| 10-141 | m/z = 608.19($C_{42}H_{28}N_2OS$ = 608.76) | 10-142 | m/z = 682.23($C_{48}H_{30}N_2O_3$ = 682.78) |
| 10-143 | m/z = 670.24($C_{48}H_{34}N_2S$ = 670.87) | 10-144 | m/z = 776.23($C_{54}H_{36}N_2S_2$ = 777.02) |
| 10-145 | m/z = 674.19($C_{46}H_{30}N_2S_2$ = 674.88) | 10-146 | m/z = 759.27($C_{54}H_{37}N_3S$ = 759.97) |
| 10-147 | m/z = 758.24($C_{54}H_{34}N_2OS$ = 758.94) | 10-148 | m/z = 806.28($C_{59}H_{38}N_2S$ = 807.03) |
| 10-149 | m/z = 823.30($C_{59}H_{38}FN_3O$ = 823.97) | 10-150 | m/z = 743.29($C_{54}H_{37}N_3O$ = 743.91) |
| 10-151 | m/z = 998.33($C_{73}H_{46}N_2OS$ = 999.24) | 10-152 | m/z = 700.20($C_{48}H_{32}N_2S_2$ = 700.92) |
| 10-153 | m/z = 674.19($C_{46}H_{30}N_2S_2$ = 674.88) | 10-154 | m/z = 674.19($C_{46}H_{30}N_2S_2$ = 674.88) |
| 10-155 | m/z = 674.19($C_{46}H_{30}N_2S_2$ = 674.88) | 10-156 | m/z = 674.19($C_{42}H_{28}N_2S_2$ = 674.88) |
| 10-157 | m/z = 762.29($C_{50}H_{46}N_2SSi_2$ = 762.16) | 10-158 | m/z = 624.17($C_{42}H_{28}N_2S_2$ = 624.82) |
| 10-159 | m/z = 784.25($C_{56}H_{36}N_2OS$ = 784.98) | 10-160 | m/z = 810.27($C_{58}H_{38}N_2OS$ = 811.02) |
| 10-161 | m/z = 860.29($C_{62}H_{40}N_2OS$ = 861.08) | 10-162 | m/z = 708.22($C_{50}H_{32}N_2OS$ = 708.88) |
| 10-163 | m/z = 742.26($C_{54}H_{34}N_2O_2$ = 742.88) | 10-164 | m/z = 828.26($C_{58}H_{40}N_2S_2$ = 829.09) |
| 10-165 | m/z = 708.22($C_{50}H_{32}N_2OS$ = 708.88) | 10-166 | m/z = 724.20($C_{50}H_{32}N_2S_2$ = 724.94) |
| 10-167 | m/z = 834.27($C_{60}H_{38}N_2OS$ = 835.04) | 10-168 | m/z = 768.28($C_{56}H_{36}N_2O_2$ = 768.92) |
| 10-169 | m/z = 830.19($C_{56}H_{34}N_2S_3$ = 831.08) | 10-170 | m/z = 810.27($C_{58}H_{38}N_2OS$ = 811.02) |
| 10-171 | m/z = 810.31($C_{59}H_{42}N_2S$ = 811.06) | 10-172 | m/z = 692.25($C_{50}H_{32}N_2O_2$ = 692.82) |
| 10-173 | m/z = 758.24($C_{54}H_{34}N_2OS$ = 728.94) | 10-174 | m/z = 783.27($C_{56}H_{37}N_3S$ = 783.99) |
| 10-175 | m/z = 808.25($C_{58}H_{36}N_2OS$ = 809.00) | 10-176 | m/z = 806.19($C_{54}H_{34}N_2S_3$ = 807.06) |
| 10-177 | m/z = 764.2($C_{52}H_{32}N_2OS_2$ = 764.96) | 10-178 | m/z = 684.22($C_{48}H_{32}N_2OS$ = 684.86) |
| 10-179 | m/z = 774.27($C_{55}H_{38}N_2OS$ = 774.98) | 10-180 | m/z = 684.22($C_{48}H_{32}N_3OS$ = 684.86) |
| 10-181 | m/z = 658.21($C_{46}H_{30}N_2OS$ = 658.82) | 10-182 | m/z = 700.2($C_{48}H_{32}N_2S_2$ = 700.92) |
| 10-183 | m/z = 700.2($C_{48}H_{32}N_2S_2$ = 700.92) | 10-184 | m/z = 700.2($C_{48}H_{32}N_2S_2$ = 700.92) |
| 10-185 | m/z = 684.22($C_{48}H_{32}N_2OS$ = 684.86) | 10-186 | m/z = 684.22($C_{48}H_{32}N_3OS$ = 684.86) |
| 10-187 | m/z = 724.25($C_{51}H_{36}N_2OS$ = 724.92) | 10-188 | m/z = 832.31($C_{61}H_{40}N_2O_2$ = 833 |
| 10-189 | m/z = 861.37($C_{63}H_{47}N_3O$ = 862.09) | | |
| 12-1 | m/z = 690.30($C_{52}H_{38}N_2$ = 690.87) | 12-2 | m/z = 790.33($C_{60}H_{42}N2$ = 790.99) |
| 12-3 | m/z = 740.32($C_{56}H_{40}N_2$ = 740.93) | 12-4 | m/z = 840.35($C_{64}H_{44}N_2$ = 841.05) |
| 12-5 | m/z = 691.30($C_{51}H_{37}N_3$ = 691.86) | 12-6 | m/z = 688.29($C_{52}H_{36}N_2$ = 688.86) |
| 12-7 | m/z = 700.37($C_{52}H_{28}D_{10}N_2$ = 700.93) | 12-8 | m/z = 650.35($C_{48}H_{26}D_{10}N_2$ = 650.87) |
| 12-9 | m/z = 922.40($C_{68}H_{50}N_4$ = 923.15) | 12-10 | m/z = 730.33($C_{55}H_{42}N_2$ = 730.94) |
| 12-11 | m/z = 832.38($C_{63}H_{48}N_2$ = 833.07) | 12-12 | m/z = 761.38($C_{57}H_{39}D_5N_2$ = 762.00) |
| 12-13 | m/z = 806.37($C_{61}H_{46}N_2$ = 804.03) | 12-14 | m/z = 876.35($C_{64}H_{48}N_2S$ = 877.14) |
| 12-15 | m/z = 872.41($C_{66}H_{52}N_2$ = 873.13) | 12-16 | m/z = 770.37($C_{58}H_{46}N_2$ = 771.00) |
| 12-17 | m/z = 952.48($C_{72}H_{60}N_2$ = 953.26) | 12-18 | m/z = 828.35($C_{64}H_{48}N_2$ = 829.04) |
| 12-19 | m/z = 910.34($C_{67}H_{46}N_2S$ = 911.16) | 12-20 | m/z = 863.33($C_{62}H_{45}N_3S$ = 864.11) |
| 12-21 | m/z = 804.35($C_{61}H_{44}N_2$ = 905.02) | 12-22 | m/z = 970.39($C_{73}H_{50}N_2O$ = 971.19) |
| 12-23 | m/z = 981.41($C_{74}H5N_3$ = 982.22) | 12-24 | m/z = 968.41($C_{74}H_{52}N_2$ = 969.22) |
| 12-25 | m/z = 878.37($C_{67}H_{46}N_2$ = 879.10) | 12-26 | m/z = 816.31($C_{61}H_{40}N_2O$ = 816.98) |
| 12-27 | m/z = 805.35($C_{60}H_{43}N_3$ = 806.00) | 12-28 | m/z = 885.82($C_{64}H_{43}N_3S$ = 886.11) |
| 12-29 | m/z = 805.35($C_{60}H_{43}N_3$ = 806.00) | 12-30 | m/z = 1050.47($C_{78}H_{58}N_4$ = 1051.32) |
| 12-31 | m/z = 696.26($C_{50}H_{36}N_2S$ = 696.90) | 12-32 | m/z = 696.26($C_{50}H_{36}N_2S$ = 696.90) |
| 12-33 | m/z = 822.31($C_{60}H_{42}N_2S$ = 823.05) | 12-34 | m/z = 746.28($C_{54}H_{38}N_2S$ = 746.96) |
| 12-35 | m/z = 700.20($C_{48}H_{32}N_2S_2$ = 700.91) | 12-36 | m/z = 800.23($C_{56}H_{36}N_2S_2$ = 801.03) |
| 12-37 | m/z = 852.26($C_{60}H_{40}N_2S_2$ = 853.10) | 12-38 | m/z = 952.29($C_{68}H_{44}N_2S_2$ = 953.22) |
| 12-39 | m/z = 912.18($C_{60}H_{36}N_2S_4$ = 913.20) | 12-40 | m/z = 852.26($C_{60}H_{40}N_2S_2$ = 853.10) |
| 12-41 | m/z = 806.33($C_{60}H_{42}N_2O$ = 806.99) | 12-42 | m/z = 768.28($C_{56}H_{36}N_2O_2$ = 768.90) |
| 12-43 | m/z = 920.34($C_{68}H_{44}N_2O_2$ = 921.09) | 12-44 | m/z = 684.22($C_{48}H_{32}N_2OS$ = 684.85) |
| 12-45 | m/z = 970.43($C_{74}H_{54}N_2$ = 971.23) | 12-46 | m/z = 947.42($C_{71}H_{53}N_3$ = 948.20) |
| 12-47 | m/z = 829.35($C_{62}H_{43}N_3$ = 830.02) | 12-48 | m/z = 860.29($C_{62}H_{40}N_2OS$ = 861.06) |
| 12-49 | m/z = 664.29($C_{50}H_{35}N_2$ = 664.83) | 12-50 | m/z = 956.41($C_{73}H_{52}N_2$ = 957.21) |
| 12-51 | m/z = 829.35($C_{62}H_{43}N_3$ = 830.02) | 12-52 | m/z = 911.33($C_{66}H_{45}N_3S$ = 912.15) |
| 12-53 | m/z = 664.29($C_{50}H_{35}N_2$ = 664.83) | 12-54 | m/z = 776.23($C_{54}H_{36}N_2S_2$ = 777.01) |
| 12-55 | m/z = 744.28($C_{54}H_{35}N_2O_2$ = 744.88) | 12-56 | m/z = 894.37($C_{66}H_{46}N_4$ = 895.10) |
| 12-57 | m/z = 776.23($C_{54}H_{36}N_2S_2$ = 777.01) | 12-58 | m/z = 844.31($C_{62}H_{40}N_2O_2$ = 844.99) |
| 12-59 | m/z = 664.29($C_{50}H_{35}N_2$ = 664.83) | 12-60 | m/z = 844.31($C_{62}H_{40}N_2O_2$ = 844.99) |
| 12-61 | m/z = 640.29($C_{48}H_{36}N_2$ = 640.83) | 12-62 | m/z = 604.29($C_{45}H_{36}N_2$ = 604.8) |
| 12-63 | m/z = 578.24($C_{42}H_{30}N_2O$ = 578.72) | 12-64 | m/z = 654.27($C_{48}H_{34}N_2O$ = 654.81) |
| 12-66 | m/z = 730.3($C_{54}H_{38}N_2O$ = 730.91) | 12-68 | m/z = 770.33($C_{57}H_{42}N_2O$ = 770.98) |
| 12-70 | m/z = 668.25($C_{48}H_{32}N_2O_2$ = 668.8) | | |

Evaluation of Fabrication of Organic Electronic Device

When the organic electronic device according to the present disclosure is a top-emission device and the anode is formed on the substrate before the organic material layer and the cathode are formed, the anode may be formed of not only a transparent material but also an opaque material having superior light reflectivity.

When the organic electronic device according to the present disclosure is a bottom-emission device and the anode is formed on the substrate before the organic material layer and the cathode are formed, the anode should be formed of a transparent material or, when formed of an opaque material, be provided as a thin film as thin as possible so as to be transparent.

Hereinafter, the following Examples will be proposed by fabricating a top-emission tandem organic electronic device, but embodiments of the present disclosure are not limited thereto. The tandem organic electronic device according to an embodiment of the present disclosure is fabricated such that a plurality of stacks are connected through one or more charge generation layers.

[Example 1 to Example 45] Tandem Organic Electronic Device with Two Stacks Connected Tandem organic electronic devices respectively including two stacks connected were fabricated with a structure of anode/hole transport region/emission layer/electron transport region/electron injection layer/cathode. Specifically, a film of N,N'-Bis (1-naphthalenyl)-N,N'-bis-phenyl-(1,1'-biphenyl)-4,4'-diamine (hereinafter, abbreviated as NPB) doped with HATCN 10% was deposited at a thickness of 10 nm on an anode formed on a glass substrate, thereby forming a hole injection layer. Afterwards, a hole transport layer I was formed by depositing a compound I (i.e., a first hole transport material) represented by Formula C or Formula D and including a radical of a compound represented by Formula A at a thickness of 15 nm, and a hole transport layer II was formed on the hole transport layer I by depositing a compound II (i.e., a second hole transport material) represented by Formula C or Formula D and including a radical of a compound represented by Formula A or Formula B at a thickness of 5 nm. DPVBi was used as a host on the hole transport layer, and BCzVBi 5% by weight was added as a dopant, thereby depositing an emission layer of 20 nm. A film of Alq3 was deposited at a thickness of 30 nm as an electron transport layer. Subsequently, charge generation layers were formed to connect two stacks. That is, an N-type charge generation layer was formed by depositing Bphen doped with Li 2%, and a P-type charge generation layer was formed by depositing NPB doped with HATCN 10%. Afterwards, a hole transport region, an emission layer, and an electron transport region were sequentially deposited as described above, thereby forming a second stack. Thereafter, an electron injection layer was formed by depositing Liq at a thickness of 1.5 nm, and then a cathode was formed by depositing Ag:Mg at a thickness of 150 nm. Consequently, tandem organic electronic devices were fabricated.

Electroluminescence (EL) properties of organic electronic emission devices according to Examples and Comparative Examples fabricated as above were measured using PR-650 available from Photo Research, Inc. by applying a forward bias DC voltage to the devices, and as a result of the measurement, T95 lifespans of the devices were tested using lifetime test equipment available from Mcscience Inc. The following table illustrates the results of the fabrication and test of the devices.

Comparative Examples 1 and 2

Tandem organic electronic devices were fabricated in the same method as Examples, except that NPB and compound 4-21 of the present disclosure were respectively used as the first hole transport material and the hole transport layer II was not used.

Comparative Example 3

A tandem organic electronic device was fabricated in the same method as Examples, except that NPB was used as the first hole transport material and compound 6-30 of the present disclosure was used as the second hole transport material.

TABLE 6

| | $1^{st}$ HTM | $2^{nd}$ HTM | Driving voltage | Current (mA/cm$^2$) | Luminance (csd/m$^2$) | Efficiency (cd/A) | T (95) | CIE (x) | CIE (y) |
|---|---|---|---|---|---|---|---|---|---|
| Comp. Ex. 1 | NPB | — | 10.5 | 13.6 | 1500 | 11.0 | 60.4 | 0.131 | 0.100 |
| Comp. Ex. 2 | 4-21 | — | 10.3 | 13.4 | 1500 | 11.2 | 63.1 | 0.131 | 0.100 |
| Comp. Ex. 3 | NPB | 6-30 | 10.0 | 13.0 | 1500 | 11.5 | 67.3 | 0.131 | 0.100 |
| Ex. 1 | 1-137 | 6-30 | 9.5 | 11.0 | 1500 | 13.6 | 80.1 | 0.131 | 0.100 |
| Ex. 2 | 4-21 | 6-30 | 9.5 | 11.3 | 1500 | 13.3 | 80.3 | 0.131 | 0.100 |
| Ex. 3 | 4-45 | 6-30 | 9.4 | 11.3 | 1500 | 13.3 | 81.1 | 0.131 | 0.100 |
| Ex. 4 | 5-91 | 6-30 | 9.5 | 11.0 | 1500 | 13.6 | 80.8 | 0.130 | 0.100 |
| Ex. 5 | 6-14 | 6-30 | 9.5 | 11.0 | 1500 | 13.6 | 82.0 | 0.130 | 0.100 |
| Ex. 6 | 6-15 | 6-30 | 9.4 | 11.2 | 1500 | 13.4 | 81.5 | 0.132 | 0.100 |
| Ex. 7 | 6-32 | 6-30 | 9.4 | 11.4 | 1500 | 13.2 | 81.2 | 0.130 | 0.100 |
| Ex. 8 | 6-33 | 6-30 | 9.4 | 11.5 | 1500 | 13.1 | 81.9 | 0.131 | 0.100 |
| Ex. 9 | 6-35 | 6-30 | 9.5 | 11.5 | 1500 | 13.1 | 80.4 | 0.132 | 0.100 |
| Ex. 10 | 1-137 | 6-31 | 9.4 | 16.0 | 1500 | 13.3 | 82.1 | 0.132 | 0.100 |
| Ex. 11 | 4-21 | 6-31 | 9.4 | 16.0 | 1500 | 13.0 | 82.3 | 0.130 | 0.100 |
| Ex. 12 | 4-45 | 6-31 | 9.3 | 16.1 | 1500 | 12.9 | 83.1 | 0.132 | 0.100 |
| Ex. 13 | 5-91 | 6-31 | 9.4 | 16.0 | 1500 | 13.2 | 82.9 | 0.131 | 0.100 |
| Ex. 14 | 6-14 | 6-31 | 9.4 | 16.0 | 1500 | 13.1 | 84.1 | 0.132 | 0.100 |
| Ex. 15 | 6-15 | 6-31 | 9.3 | 16.1 | 1500 | 13.1 | 83.6 | 0.130 | 0.100 |
| Ex. 16 | 6-32 | 6-31 | 9.3 | 16.1 | 1500 | 12.9 | 83.3 | 0.131 | 0.100 |
| Ex. 17 | 6-33 | 6-31 | 9.3 | 16.1 | 1500 | 12.8 | 83.8 | 0.131 | 0.100 |
| Ex. 18 | 6-35 | 6-31 | 9.4 | 16.0 | 1500 | 12.8 | 82.6 | 0.132 | 0.100 |
| Ex. 19 | 1-137 | 11-14 | 9.1 | 1.7 | 1500 | 14.2 | 88.4 | 0.131 | 0.100 |
| Ex. 20 | 4-21 | 11-14 | 9.1 | 1.7 | 1500 | 14.0 | 88.5 | 0.131 | 0.100 |
| Ex. 21 | 4-45 | 11-14 | 9.0 | 1.7 | 1500 | 13.9 | 89.0 | 0.132 | 0.100 |

TABLE 6-continued

| | 1st HTM | 2nd HTM | Driving voltage | Current (mA/cm²) | Luminance (csd/m²) | Efficiency (cd/A) | T (95) | CIE (x) | CIE (y) |
|---|---|---|---|---|---|---|---|---|---|
| Ex. 22 | 5-91 | 11-14 | 9.1 | 1.7 | 1500 | 14.1 | 88.9 | 0.131 | 0.100 |
| Ex. 23 | 6-14 | 11-14 | 9.1 | 1.7 | 1500 | 14.1 | 90.0 | 0.131 | 0.100 |
| Ex. 24 | 6-15 | 11-14 | 9.0 | 1.7 | 1500 | 14.0 | 89.6 | 0.131 | 0.100 |
| Ex. 25 | 6-32 | 11-14 | 9.0 | 1.7 | 1500 | 13.9 | 89.4 | 0.131 | 0.100 |
| Ex. 26 | 6-33 | 11-14 | 9.0 | 1.7 | 1500 | 13.8 | 89.7 | 0.131 | 0.100 |
| Ex. 27 | 6-35 | 11-14 | 9.1 | 1.7 | 1500 | 13.7 | 88.7 | 0.130 | 0.100 |
| Ex. 28 | 1-137 | 11-20 | 9.2 | 10.4 | 1500 | 14.4 | 86.4 | 0.130 | 0.100 |
| Ex. 29 | 4-21 | 11-20 | 9.2 | 10.6 | 1500 | 14.2 | 86.7 | 0.130 | 0.100 |
| Ex. 30 | 4-45 | 11-20 | 9.1 | 10.6 | 1500 | 14.1 | 87.2 | 0.131 | 0.100 |
| Ex. 31 | 5-91 | 11-20 | 9.2 | 10.4 | 1500 | 14.4 | 87.1 | 0.131 | 0.100 |
| Ex. 32 | 6-14 | 11-20 | 9.2 | 10.5 | 1500 | 14.3 | 88.3 | 0.130 | 0.100 |
| Ex. 33 | 6-15 | 11-20 | 9.1 | 10.6 | 1500 | 14.2 | 87.8 | 0.131 | 0.100 |
| Ex. 34 | 6-32 | 11-20 | 9.1 | 10.6 | 1500 | 14.1 | 87.5 | 0.130 | 0.100 |
| Ex. 35 | 6-33 | 11-20 | 9.1 | 10.7 | 1500 | 14.0 | 88.0 | 0.132 | 0.100 |
| Ex. 36 | 6-35 | 11-20 | 9.2 | 10.7 | 1500 | 14.0 | 86.9 | 0.131 | 0.100 |
| Ex. 37 | 1-137 | 11-21 | 9.3 | 10.8 | 1500 | 13.9 | 84.3 | 0.131 | 0.100 |
| Ex. 38 | 4-21 | 11-21 | 9.3 | 10.9 | 1500 | 13.7 | 84.6 | 0.131 | 0.100 |
| Ex. 39 | 4-45 | 11-21 | 9.2 | 11.0 | 1500 | 13.6 | 85.2 | 0.132 | 0.100 |
| Ex. 40 | 5-91 | 11-21 | 9.3 | 10.8 | 1500 | 13.9 | 85.0 | 0.132 | 0.100 |
| Ex. 41 | 6-14 | 11-21 | 9.3 | 10.9 | 1500 | 13.8 | 86.2 | 0.131 | 0.100 |
| Ex. 42 | 6-15 | 11-21 | 9.2 | 10.9 | 1500 | 13.8 | 85.7 | 0.131 | 0.100 |
| Ex. 43 | 6-32 | 11-21 | 9.2 | 11.0 | 1500 | 13.6 | 85.4 | 0.131 | 0.100 |
| Ex. 44 | 6-33 | 11-21 | 9.2 | 11.1 | 1500 | 13.5 | 85.9 | 0.131 | 0.100 |
| Ex. 45 | 6-35 | 11-21 | 9.3 | 11.2 | 1500 | 13.4 | 84.7 | 0.131 | 0.100 |

[Examples 46 to 90] Tandem Organic Electronic Device with Three Stacks Connected Tandem organic electronic devices were fabricated in the same method as Examples 1 to 45, except that the tandem organic electronic devices were fabricated by connecting three stacks.

Comparative Examples 4 and 5

Tandem organic electronic devices were fabricated in the same method as Example 46, except that NPB and compound 4-21 of the present disclosure were respectively used as the first hole transport material and the hole transport layer II was not used.

Comparative Example 6

A tandem organic electronic device was fabricated in the same method as Example 46, except that NPB was used as the first hole transport material and compound 6-30 of the present disclosure was used as the second hole transport material.

TABLE 7

| | 1st HTM | 2nd HTM | Driving voltage | Current (mA/cm²) | Luminance (csd/m²) | Efficiency (cd/A) | T (95) | CIE (x) | CIE (y) |
|---|---|---|---|---|---|---|---|---|---|
| Comp. Ex. 4 | NPB | — | 15.4 | 11.5 | 1500 | 13.0 | 90.1 | 0.126 | 0.100 |
| Comp. Ex. 5 | 4-21 | — | 15.3 | 11.4 | 1500 | 13.2 | 92.8 | 0.126 | 0.100 |
| Comp. Ex. 6 | NPB | 6-30 | 15.1 | 11.1 | 1500 | 13.5 | 96.0 | 0.126 | 0.100 |
| Ex. 46 | 1-137 | 6-30 | 14.5 | 9.6 | 1500 | 15.6 | 112.1 | 0.126 | 0.100 |
| Ex. 47 | 4-21 | 6-30 | 14.5 | 9.7 | 1500 | 15.4 | 112.4 | 0.126 | 0.100 |
| Ex. 48 | 4-45 | 6-30 | 14.4 | 9.8 | 1500 | 15.3 | 113.0 | 0.127 | 0.100 |
| Ex. 49 | 5-91 | 6-30 | 14.5 | 9.7 | 1500 | 15.5 | 112.9 | 0.126 | 0.100 |
| Ex. 50 | 6-14 | 6-30 | 14.5 | 9.7 | 1500 | 15.5 | 114.1 | 0.126 | 0.100 |
| Ex. 51 | 6-15 | 6-30 | 14.1 | 9.7 | 1500 | 15.5 | 113.5 | 0.125 | 0.100 |
| Ex. 52 | 6-32 | 6-30 | 14.4 | 9.9 | 1500 | 15.2 | 113.2 | 0.126 | 0.100 |
| Ex. 53 | 6-33 | 6-30 | 14.4 | 9.9 | 1500 | 15.2 | 113.8 | 0.125 | 0.100 |
| Ex. 54 | 6-35 | 6-30 | 14.5 | 9.9 | 1500 | 15.1 | 112.7 | 0.126 | 0.100 |
| Ex. 55 | 1-137 | 6-31 | 14.4 | 9.8 | 1500 | 15.3 | 110.0 | 0.127 | 0.100 |
| Ex. 56 | 4-21 | 6-31 | 14.4 | 9.9 | 1500 | 15.1 | 110.3 | 0.127 | 0.100 |
| Ex. 57 | 4-45 | 6-31 | 14.3 | 10.0 | 1500 | 15.0 | 111.1 | 0.125 | 0.100 |
| Ex. 58 | 5-91 | 6-31 | 14.4 | 9.8 | 1500 | 15.3 | 110.9 | 0.125 | 0.100 |
| Ex. 59 | 6-14 | 6-31 | 14.4 | 9.9 | 1500 | 15.2 | 112.0 | 0.126 | 0.100 |
| Ex. 60 | 6-15 | 6-31 | 14.3 | 9.9 | 1500 | 15.1 | 111.4 | 0.126 | 0.100 |
| Ex. 61 | 6-32 | 6-31 | 14.3 | 10.1 | 1500 | 14.9 | 111.3 | 0.126 | 0.100 |
| Ex. 62 | 6-33 | 6-31 | 14.3 | 10.1 | 1500 | 14.8 | 111.7 | 0.126 | 0.100 |
| Ex. 63 | 6-35 | 6-31 | 14.4 | 10.1 | 1500 | 14.8 | 110.5 | 0.126 | 0.100 |
| Ex. 64 | 1-137 | 11-14 | 14.1 | 9.3 | 1500 | 16.2 | 118.4 | 0.126 | 0.100 |
| Ex. 65 | 4-21 | 11-14 | 14.1 | 9.4 | 1500 | 16.0 | 118.5 | 0.125 | 0.100 |
| Ex. 66 | 4-45 | 11-14 | 14.0 | 9.4 | 1500 | 15.9 | 118.9 | 0.127 | 0.100 |
| Ex. 67 | 5-91 | 11-14 | 14.1 | 9.3 | 1500 | 16.1 | 118.7 | 0.125 | 0.100 |
| Ex. 68 | 6-14 | 11-14 | 14.1 | 9.3 | 1500 | 16.1 | 119.9 | 0.127 | 0.100 |
| Ex. 69 | 6-15 | 11-14 | 14.0 | 9.4 | 1500 | 16.0 | 119.3 | 0.126 | 0.100 |
| Ex. 70 | 6-32 | 11-14 | 14.0 | 9.4 | 1500 | 15.9 | 119.0 | 0.125 | 0.100 |
| Ex. 71 | 6-33 | 11-14 | 14.0 | 9.5 | 1500 | 15.8 | 119.6 | 0.126 | 0.100 |

TABLE 7-continued

| | 1st HTM | 2nd HTM | Driving voltage | Current (mA/cm²) | Luminance (csd/m²) | Efficiency (cd/A) | T (95) | CIE (x) | CIE (y) |
|---|---|---|---|---|---|---|---|---|---|
| Ex. 72 | 6-35 | 11-14 | 14.1 | 9.6 | 1500 | 15.7 | 118.6 | 0.126 | 0.100 |
| Ex. 73 | 1-137 | 11-20 | 14.2 | 9.1 | 1500 | 16.4 | 116.3 | 0.127 | 0.100 |
| Ex. 74 | 4-21 | 11-20 | 14.2 | 9.3 | 1500 | 16.2 | 116.5 | 0.125 | 0.100 |
| Ex. 75 | 4-45 | 11-20 | 14.1 | 9.3 | 1500 | 16.2 | 117.0 | 0.127 | 0.100 |
| Ex. 76 | 5-91 | 11-20 | 14.2 | 9.1 | 1500 | 16.4 | 116.8 | 0.125 | 0.100 |
| Ex. 77 | 6-14 | 11-20 | 14.2 | 9.2 | 1500 | 16.3 | 118.2 | 0.127 | 0.100 |
| Ex. 78 | 6-15 | 11-20 | 14.1 | 9.3 | 1500 | 16.2 | 117.5 | 0.127 | 0.100 |
| Ex. 79 | 6-32 | 11-20 | 14.1 | 9.3 | 1500 | 16.1 | 117.2 | 0.125 | 0.100 |
| Ex. 80 | 6-33 | 11-20 | 14.1 | 9.3 | 1500 | 16.1 | 117.9 | 0.125 | 0.100 |
| Ex. 81 | 6-35 | 11-20 | 14.2 | 9.4 | 1500 | 16.0 | 116.7 | 0.125 | 0.100 |
| Ex. 82 | 1-137 | 11-21 | 14.3 | 9.4 | 1500 | 15.9 | 114.3 | 0.127 | 0.100 |
| Ex. 83 | 4-21 | 11-21 | 14.3 | 9.6 | 1500 | 15.7 | 114.5 | 0.127 | 0.100 |
| Ex. 84 | 4-45 | 11-21 | 14.2 | 9.6 | 1500 | 15.6 | 115.3 | 0.126 | 0.100 |
| Ex. 85 | 5-91 | 11-21 | 14.3 | 9.4 | 1500 | 15.9 | 115.1 | 0.126 | 0.100 |
| Ex. 86 | 6-14 | 11-21 | 14.3 | 9.5 | 1500 | 15.8 | 116.2 | 0.126 | 0.100 |
| Ex. 87 | 6-15 | 11-21 | 14.2 | 9.6 | 1500 | 15.7 | 115.7 | 0.127 | 0.100 |
| Ex. 88 | 6-32 | 11-21 | 14.2 | 9.6 | 1500 | 15.6 | 115.4 | 0.126 | 0.100 |
| Ex. 89 | 6-33 | 11-21 | 14.2 | 9.7 | 1500 | 15.5 | 116.0 | 0.126 | 0.100 |
| Ex. 90 | 6-35 | 11-21 | 14.3 | 9.7 | 1500 | 15.4 | 114.8 | 0.126 | 0.100 |

[Examples 91 to 135] Tandem Organic Electronic Devices with Four Stacks Connected Tandem organic electronic devices were fabricated in the same method as Examples 1 to 45, except that the tandem organic electronic devices were fabricated by connecting four stacks.

Comparative Examples 7 and 8

Tandem organic electronic devices were fabricated in the same method as Example 91, except that NPB and compound 4-21 of the present disclosure were respectively used as the first hole transport material and the hole transport layer II was not used.

Comparative Example 9

A tandem organic electronic device was fabricated in the same method as Example 9, except that NPB was used as the first hole transport material and compound 6-30 of the present disclosure was used as the second hole transport material.

TABLE 8

| | 1st HTM | 2nd HTM | Driving voltage | Current (mA/cm²) | Luminance (csd/m²) | Efficiency (cd/A) | T (95) | CIE (x) | CIE (y) |
|---|---|---|---|---|---|---|---|---|---|
| Comp. Ex. 7 | NPB | — | 20.5 | 10.7 | 1500 | 14.0 | 110.0 | 0.125 | 0.100 |
| Comp. Ex. 8 | 4-21 | — | 20.2 | 10.6 | 1500 | 14.2 | 112.6 | 0.124 | 0.100 |
| Comp. Ex. 9 | NPB | 6-30 | 20.2 | 10.3 | 1500 | 14.5 | 117.4 | 0.125 | 0.100 |
| Ex. 91 | 1-137 | 6-30 | 19.5 | 9.0 | 1500 | 16.6 | 130.0 | 0.125 | 0.100 |
| Ex. 92 | 4-21 | 6-30 | 19.5 | 9.1 | 1500 | 16.4 | 130.4 | 0.125 | 0.100 |
| Ex. 93 | 4-45 | 6-30 | 19.4 | 9.2 | 1500 | 16.3 | 131.0 | 0.125 | 0.100 |
| Ex. 94 | 5-91 | 6-30 | 19.5 | 9.1 | 1500 | 16.5 | 130.7 | 0.125 | 0.100 |
| Ex. 95 | 6-14 | 6-30 | 19.5 | 9.1 | 1500 | 16.5 | 132.0 | 0.124 | 0.100 |
| Ex. 96 | 6-15 | 6-30 | 19.4 | 9.1 | 1500 | 16.4 | 131.5 | 0.125 | 0.100 |
| Ex. 97 | 6-32 | 6-30 | 19.4 | 9.2 | 1500 | 16.3 | 131.3 | 0.125 | 0.100 |
| Ex. 98 | 6-33 | 6-30 | 19.4 | 9.3 | 1500 | 16.2 | 131.8 | 0.124 | 0.100 |
| Ex. 99 | 6-35 | 6-30 | 19.5 | 9.3 | 1500 | 16.1 | 130.1 | 0.125 | 0.100 |
| Ex. 100 | 1-137 | 6-31 | 19.4 | 9.2 | 1500 | 16.3 | 132.2 | 0.125 | 0.100 |
| Ex. 101 | 4-21 | 6-31 | 19.4 | 9.3 | 1500 | 16.1 | 132.5 | 0.125 | 0.100 |
| Ex. 102 | 4-45 | 6-31 | 19.3 | 9.4 | 1500 | 16.0 | 133.0 | 0.125 | 0.100 |
| Ex. 103 | 5-91 | 6-31 | 19.4 | 9.2 | 1500 | 16.3 | 132.9 | 0.125 | 0.100 |
| Ex. 104 | 6-14 | 6-31 | 19.4 | 9.3 | 1500 | 16.2 | 134.1 | 0.124 | 0.100 |
| Ex. 105 | 6-15 | 6-31 | 19.3 | 9.3 | 1500 | 16.1 | 133.6 | 0.124 | 0.100 |
| Ex. 106 | 6-32 | 6-31 | 19.3 | 9.4 | 1500 | 15.9 | 133.3 | 0.124 | 0.100 |
| Ex. 107 | 6-33 | 6-31 | 19.3 | 9.5 | 1500 | 15.8 | 133.8 | 0.125 | 0.100 |
| Ex. 108 | 6-35 | 6-31 | 19.4 | 9.5 | 1500 | 15.8 | 132.7 | 0.125 | 0.100 |
| Ex. 109 | 1-137 | 11-14 | 19.1 | 8.7 | 1500 | 17.2 | 138.4 | 0.125 | 0.100 |
| Ex. 110 | 4-21 | 11-14 | 19.1 | 8.9 | 1500 | 16.9 | 138.5 | 0.126 | 0.100 |
| Ex. 111 | 4-45 | 11-14 | 19.0 | 8.9 | 1500 | 16.9 | 139.0 | 0.125 | 0.100 |
| Ex. 112 | 5-91 | 11-14 | 19.1 | 8.8 | 1500 | 17.1 | 138.8 | 0.126 | 0.100 |
| Ex. 113 | 6-14 | 11-14 | 19.1 | 8.8 | 1500 | 17.1 | 140.0 | 0.125 | 0.100 |
| Ex. 114 | 6-15 | 11-14 | 19.0 | 8.8 | 1500 | 17.0 | 139.4 | 0.125 | 0.100 |
| Ex. 115 | 6-32 | 11-14 | 19.0 | 8.9 | 1500 | 16.8 | 139.2 | 0.125 | 0.100 |
| Ex. 116 | 6-33 | 11-14 | 19.0 | 9.0 | 1500 | 16.7 | 139.7 | 0.124 | 0.100 |
| Ex. 117 | 6-35 | 11-14 | 19.1 | 9.0 | 1500 | 16.7 | 138.6 | 0.125 | 0.100 |
| Ex. 118 | 1-137 | 11-20 | 19.2 | 8.6 | 1500 | 17.4 | 136.3 | 0.126 | 0.100 |
| Ex. 119 | 4-21 | 11-20 | 19.2 | 8.7 | 1500 | 17.2 | 136.6 | 0.125 | 0.100 |
| Ex. 120 | 4-45 | 11-20 | 19.1 | 8.7 | 1500 | 17.2 | 137.3 | 0.125 | 0.100 |
| Ex. 121 | 5-91 | 11-20 | 19.2 | 8.6 | 1500 | 17.4 | 137.1 | 0.125 | 0.100 |

TABLE 8-continued

| | 1st HTM | 2nd HTM | Driving voltage | Current (mA/cm$^2$) | Luminance (csd/m$^2$) | Efficiency (cd/A) | T (95) | CIE (x) | CIE (y) |
|---|---|---|---|---|---|---|---|---|---|
| Ex. 122 | 6-14 | 11-20 | 19.2 | 8.6 | 1500 | 17.4 | 138.3 | 0.125 | 0.100 |
| Ex. 123 | 6-15 | 11-20 | 19.1 | 8.7 | 1500 | 17.3 | 137.9 | 0.125 | 0.100 |
| Ex. 124 | 6-32 | 11-20 | 19.1 | 8.8 | 1500 | 17.1 | 137.6 | 0.125 | 0.100 |
| Ex. 125 | 6-33 | 11-20 | 19.1 | 8.8 | 1500 | 17.1 | 138.1 | 0.124 | 0.100 |
| Ex. 126 | 6-35 | 11-20 | 19.2 | 8.8 | 1500 | 17.0 | 136.8 | 0.124 | 0.100 |
| Ex. 127 | 1-137 | 11-21 | 19.3 | 8.9 | 1500 | 16.9 | 134.2 | 0.124 | 0.100 |
| Ex. 128 | 4-21 | 11-21 | 19.3 | 9.0 | 1500 | 16.7 | 134.3 | 0.125 | 0.100 |
| Ex. 129 | 4-45 | 11-21 | 19.2 | 9.0 | 1500 | 16.7 | 135.1 | 0.124 | 0.100 |
| Ex. 130 | 5-91 | 11-21 | 19.3 | 8.9 | 1500 | 16.9 | 134.8 | 0.125 | 0.100 |
| Ex. 131 | 6-14 | 11-21 | 19.3 | 8.9 | 1500 | 16.8 | 136.2 | 0.124 | 0.100 |
| Ex. 132 | 6-15 | 11-21 | 19.2 | 8.9 | 1500 | 16.8 | 135.7 | 0.126 | 0.100 |
| Ex. 133 | 6-32 | 11-21 | 19.2 | 9.0 | 1500 | 16.6 | 135.4 | 0.124 | 0.100 |
| Ex. 134 | 6-33 | 11-21 | 19.2 | 9.1 | 1500 | 16.5 | 135.9 | 0.125 | 0.100 |
| Ex. 135 | 6-35 | 11-21 | 19.3 | 9.1 | 1500 | 16.4 | 134.6 | 0.126 | 0.100 |

As seen from the result of Tables 6 to 8, it can be appreciated that, when the hole transport region was formed using compound I and compound II of the present disclosure (Examples 1 to 135), the electrical characteristics of the devices were improved than either when NPB or compound 4-21 of the present disclosure, i.e., the first compound represented by Formula C or Formula D and including a radical of a compound represented by Formula A, was used only for the first hole transport layer (Comparative Examples 1, 2 4, 5, 7, and 8) or when NPB was used for the first hole transport material and compound 6-30 of the present disclosure represented by Formula C or Formula D was used for the second hole transport material (Comparative Examples 3, 6, and 9).

Describing in detail, the device characteristics of Comparative Examples 2, 5, and 8, in which compound 4-21 of the present disclosure was used, were more improved than those of Comparative Examples 1, 4, and 7, in which NPB was used for the first hole transport material, and the device characteristics of Comparative Examples 3, 6, and 9, in which NPB was used for the first hole transport material and compound 6-30 of the present disclosure was used for the second hole transport material, were more improved than those of Comparative Examples 1, 2, 4, 5, 7, and 8, in which only the first hole transport material was used. In addition, it can be appreciated that, in Examples 1 to 135, in which the first compound represented by Formula C or Formula D and including the radical of the compound represented by Formula A was used for the first hole transport material and the second compound represented by Formula C or Formula D and including radical of the compound represented by Formula A or Formula B was used for the second hole transport material, the device characteristics, such as the driving voltage, efficiency, and lifespan, were more improved than those of Comparative Examples 1 to 9.

It is considered that the use of the compounds of the present disclosure for the first hole transport material and the second hole transport material caused an appropriate number of holes in the emission layer to efficiently move so as to balance holes and electrons in the emission layer and prevent degradations in the interface of the emission layer, thereby increasing the efficiency and lifespan.

In the meantime, referring to Examples 1 to 45, Examples 46 to 90, and Examples 91 to 135 according to the present disclosure, it can be appreciated that the efficiency and lifespan among the device characteristics were improved with increases in the number of the stacks connected. Specifically, in the devices according to Examples 46 to 90, in which three stacks were connected, the driving voltage was increased but the efficiency and lifespan were improved compared to those of Examples 1 to 45, in which two stacks were connected. In addition, in Examples 91 to 135, in which four stacks were connected, the driving voltage was increased but the efficiency and lifespan were improved compared to those of Examples 46 to 90. It is considered that the efficiency and lifespan were improved proportionally to increases in the number of the stacks, due to the multiphoton emission structure in which excitons are generated to emit light energy in each of the stacks.

In addition, referring to Examples 1 to 45, Examples 46 to 90, and Examples 91 to 135 according to the present disclosure, it can be seen that the values of the color coordinates (CIE x) gradually decreased with increases in the number of the stacks connected. It is considered that the color purity was improved as the full width at half maximum (FWHM) of an emission wavelength was reduced with increases in the number of the stacks.

The final product represented by Formula 1 according to the present disclosure may be synthesized by, but is not limited to, the following Reaction Formula 18.

Hal is I, Br, or Cl.

[Reaction Formula 18]

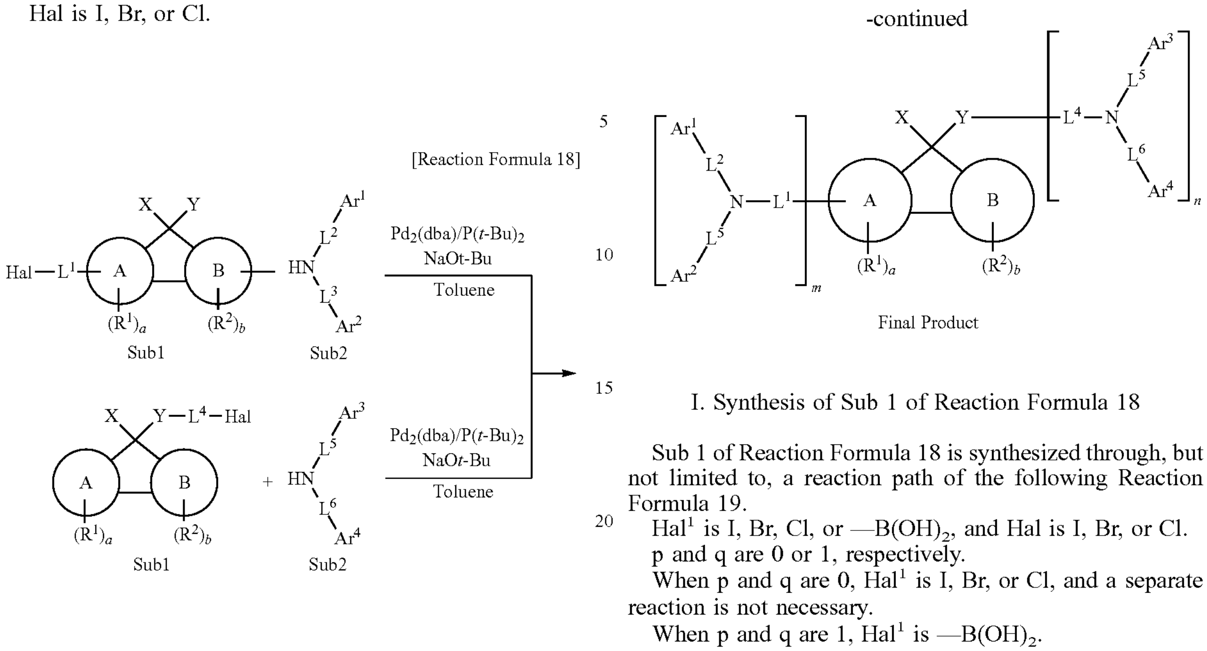

-continued

I. Synthesis of Sub 1 of Reaction Formula 18

Sub 1 of Reaction Formula 18 is synthesized through, but not limited to, a reaction path of the following Reaction Formula 19.

$Hal^1$ is I, Br, Cl, or —$B(OH)_2$, and Hal is I, Br, or Cl.

p and q are 0 or 1, respectively.

When p and q are 0, $Hal^1$ is I, Br, or Cl, and a separate reaction is not necessary.

When p and q are 1, $Hal^1$ is —$B(OH)_2$.

[Reaction Formula 19]

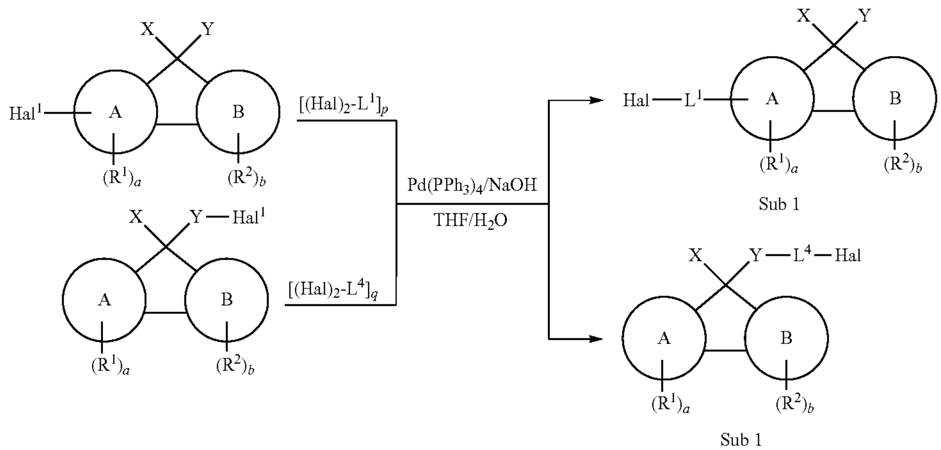

1. Example of Synthesis of Sub 1-6

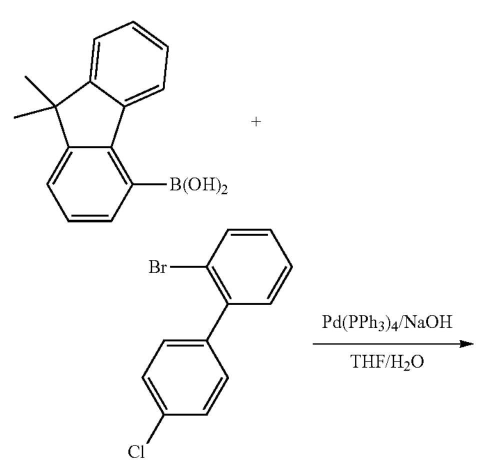

-continued

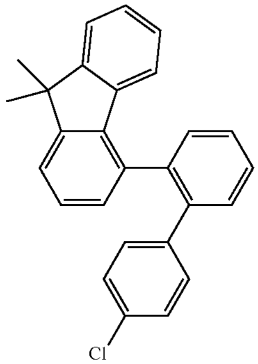

Sub 1-6

After adding (9,9-dimethyl-9H-fluoren-4-yl) boronic acid (50.0 g, 210.0 mmol; 50 g, 125.8 mmol) to a round bottom flask, 2-bromo-4'-chloro-1,1'-biphenyl (56.2 g, 210.0 mmol), $Pd(PPh_3)_4$ (14.6 g, 12.6 mmol), NaOH (25.2 g, 630.0 mmol), and water (525 ml) were added, followed by stirring and refluxing. When the reaction was completed, extraction was performed with $CH_2Cl_2$ and water, and then an organic layer was dried with $MgSO_4$ and concentrated. The resultant organic matter was subjected to silica gel column chromatography and recrystallization to create a product in an amount of 65.0 g (yield: 81.3%).

The compounds belonging to Sub 1 of Reaction Formula 18 may be, but are not limited to, the following compounds, and Table 9 illustrates field desorption-mass spectrometry (FD-MS) values of the compounds belonging to Sub 1.

Sub 1-1

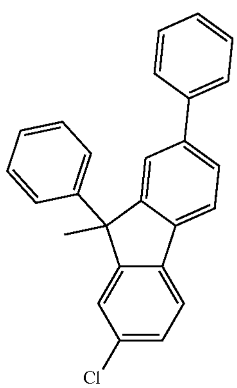

Sub 1-2

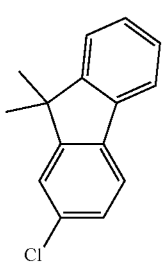

-continued

Sub 1-3

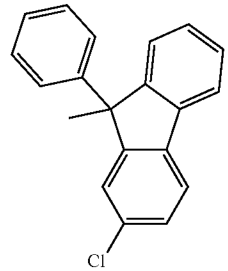

Sub 1-4

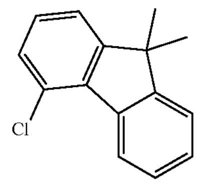

Sub 1-5

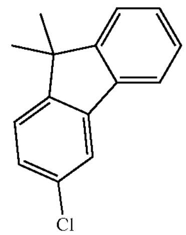

Sub 1-6

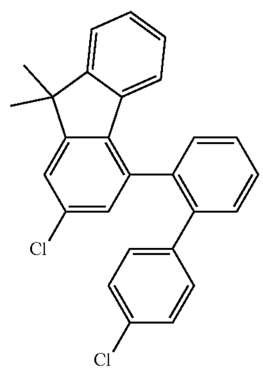

Sub 1-7

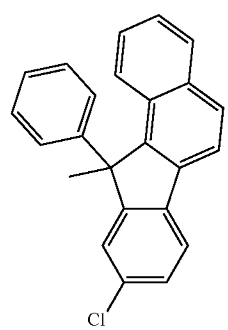

-continued
Sub 1-8
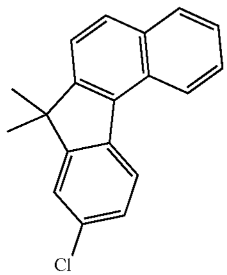
Sub 1-9
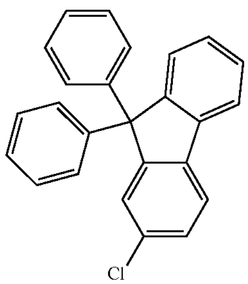
Sub 1-10
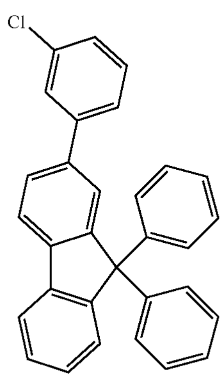
Sub 1-11
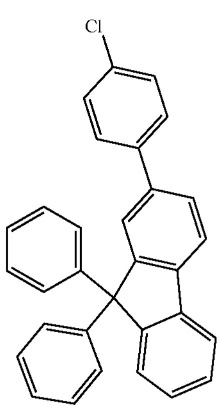
-continued
Sub 1-12
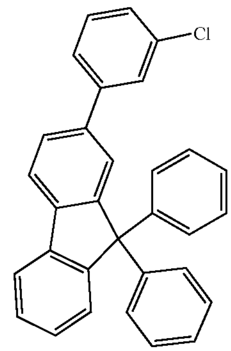
Sub 1-13
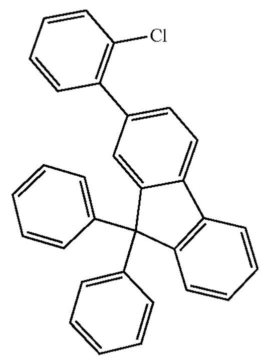
Sub 1-14
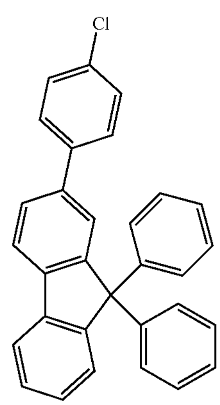
Sub 1-15
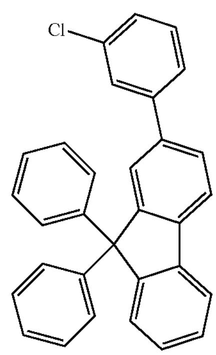

-continued
Sub 1-16
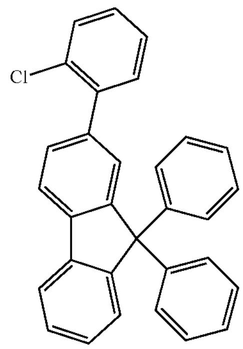
Sub 1-17
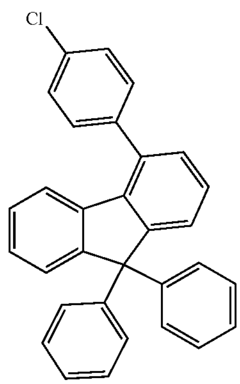
Sub 1-18
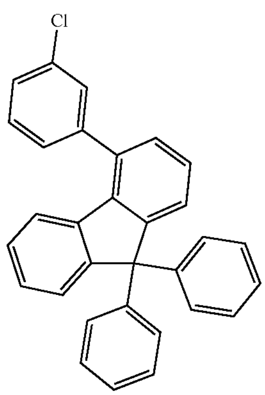
Sub 1-19
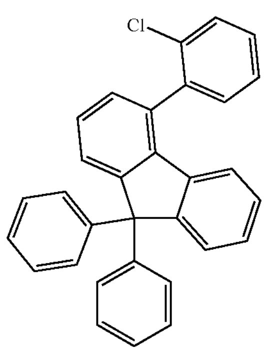
-continued
Sub 1-20
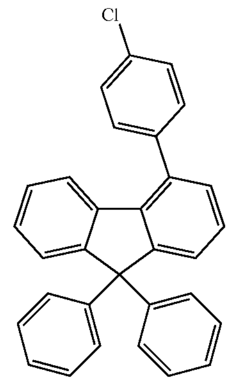
Sub 1-21
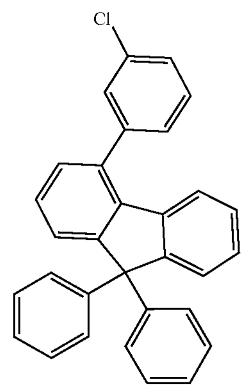
Sub 1-22
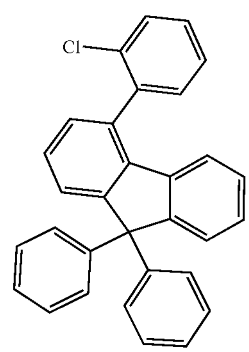
Sub 1-23
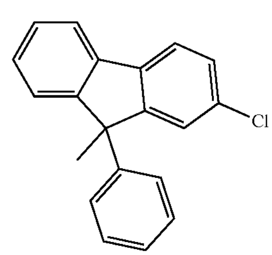

-continued
Sub 1-24
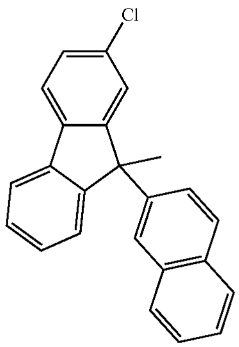
Sub 1-25
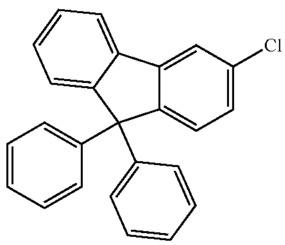
Sub 1-26
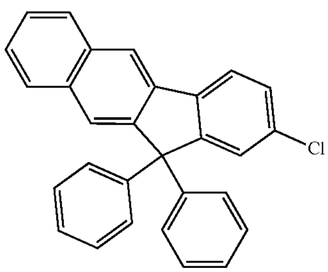
Sub 1-27
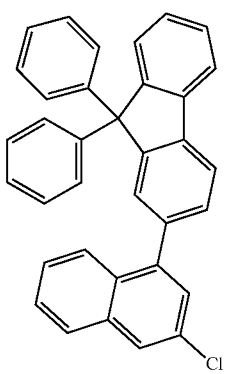
Sub 1-28
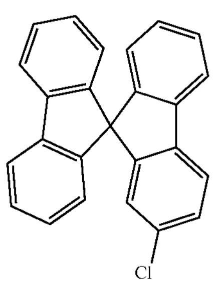
-continued
Sub 1-29
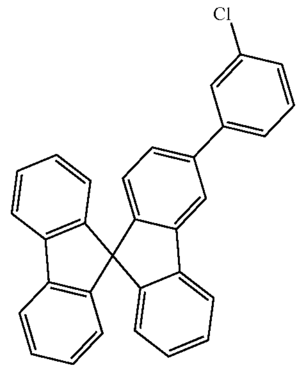
Sub 1-30
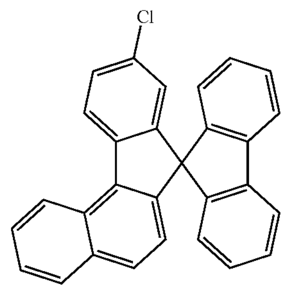
Sub 1-31
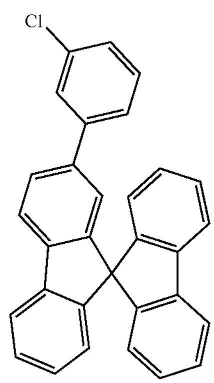
Sub 1-32
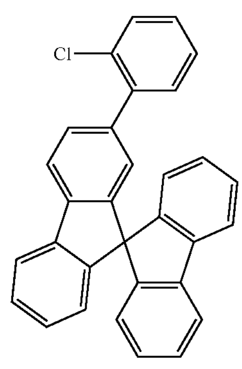

-continued
Sub 1-33
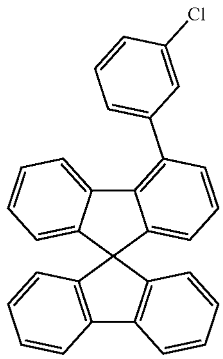
Sub 1-34
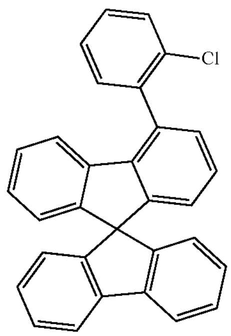
Sub 1-35
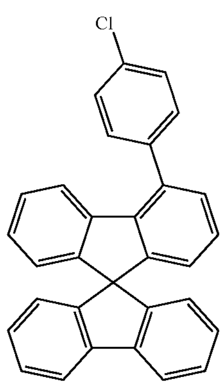
Sub 1-36
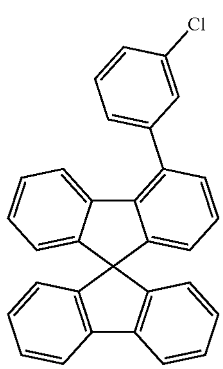
-continued
Sub 1-37
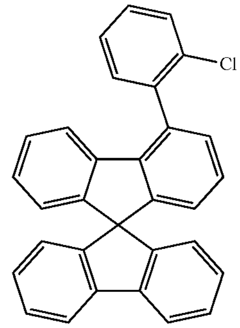
Sub 1-38
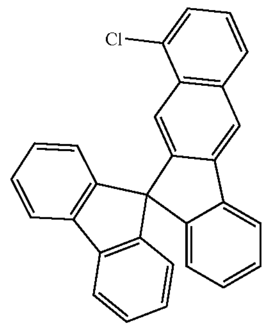
Sub 1-39
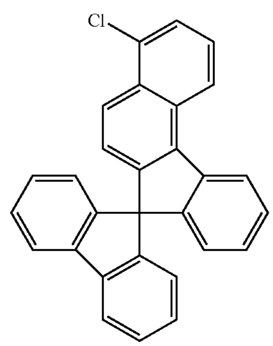
Sub 1-40
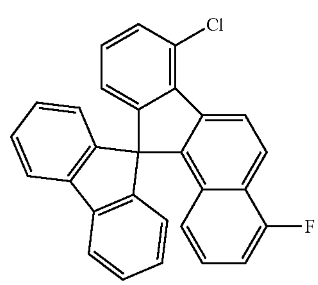
Sub 1-41
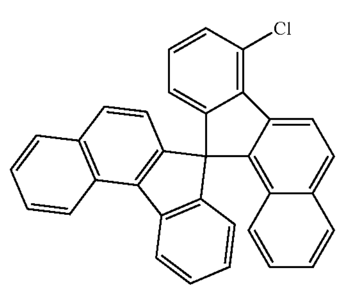

-continued
Sub 1-42
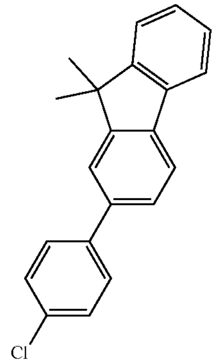
Sub 1-43
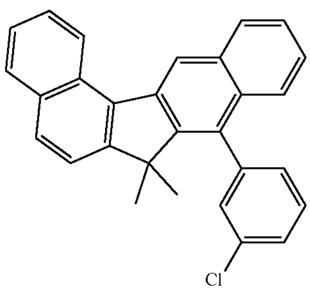
Sub 1-44
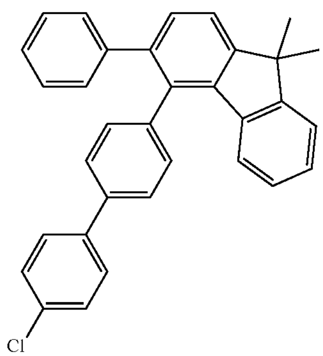
Sub 1-45
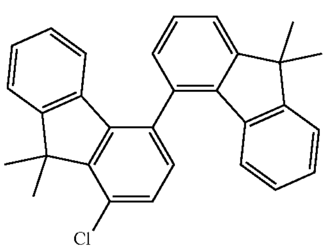
-continued
Sub 1-46
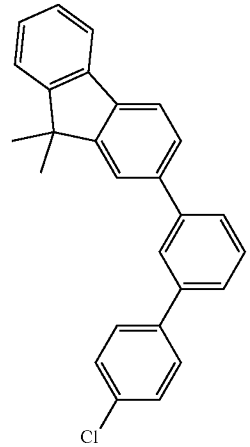
Sub 1-47
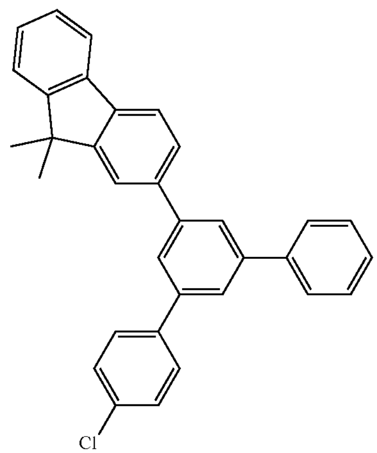
Sub 1-48
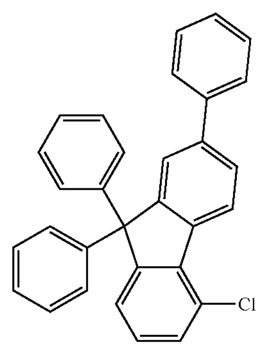
Sub 1-49
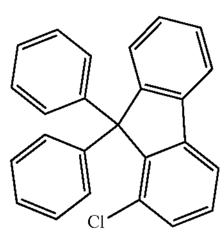

-continued
Sub 1-50
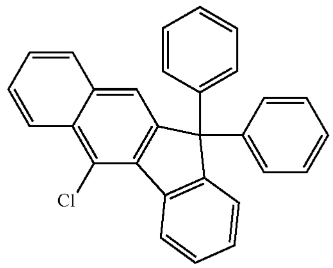
Sub 1-51
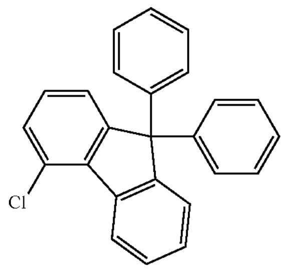
Sub 1-52
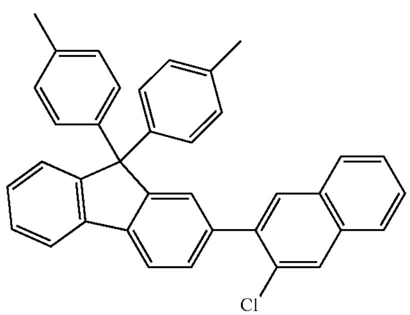
Sub 1-53
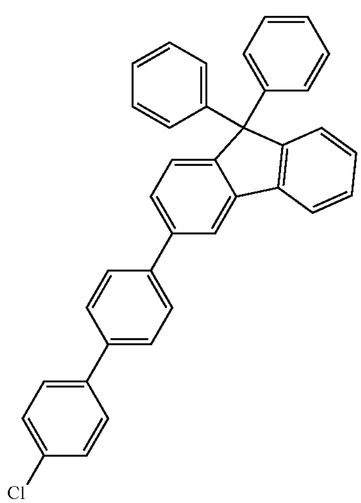
-continued
Sub 1-54
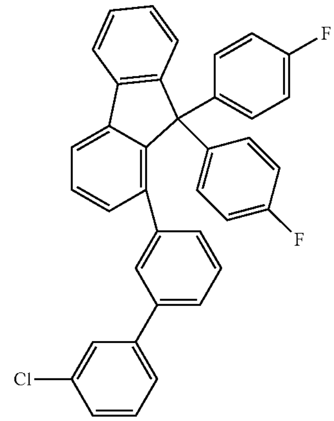
Sub 1-55
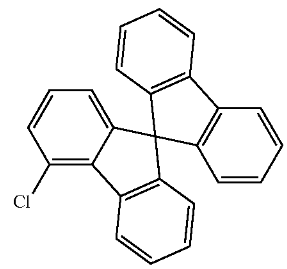
Sub 1-56
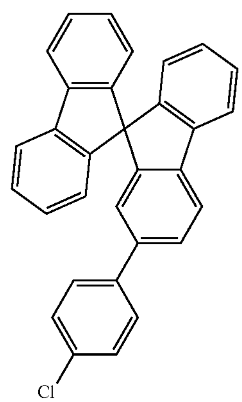
Sub 1-57
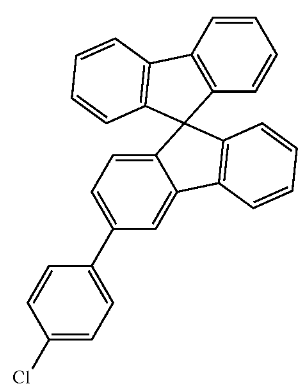

-continued
Sub 1-58
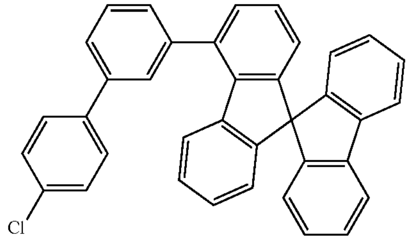
Sub 1-59
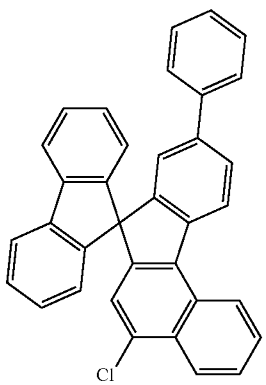
Sub 1-60
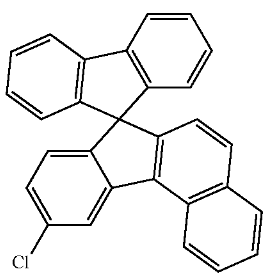
Sub 1-61
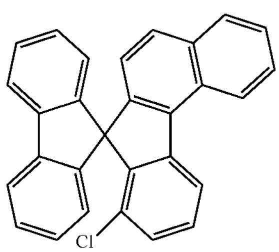
Sub 1-62
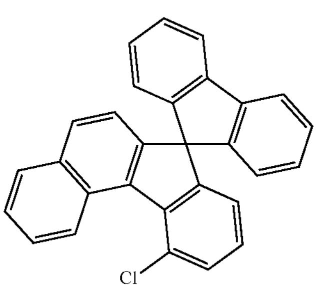
-continued
Sub 1-63
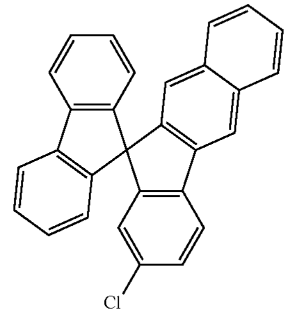
Sub 1-64
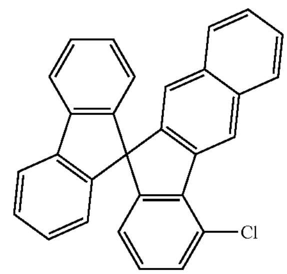
Sub 1-65
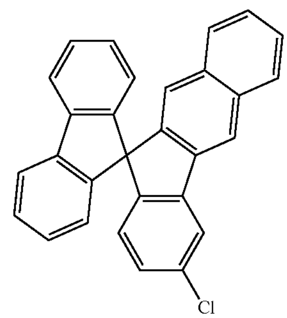
Sub 1-66
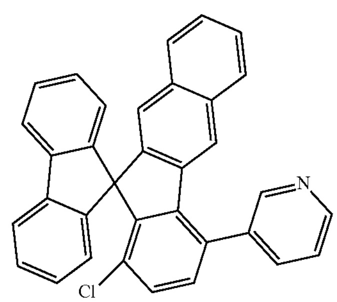
Sub 1-67
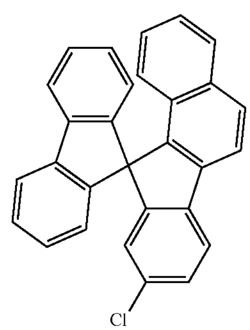

-continued
Sub 1-68
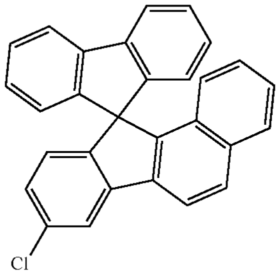
Sub 1-69
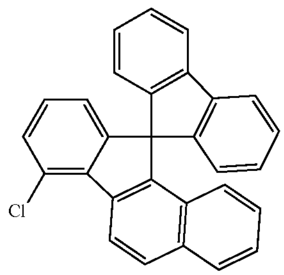
Sub 1-70
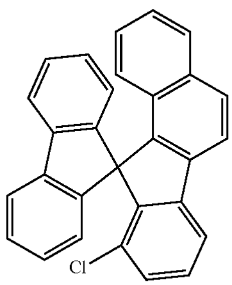
Sub 1-71
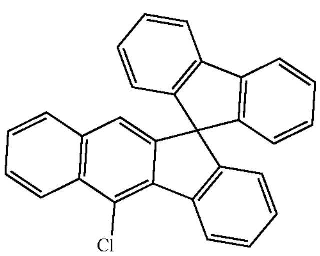
Sub 1-72
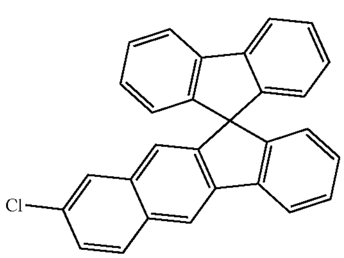
-continued
Sub 1-73
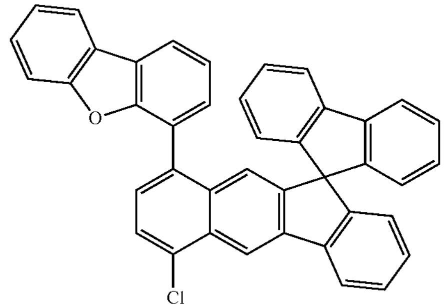
Sub 1-74
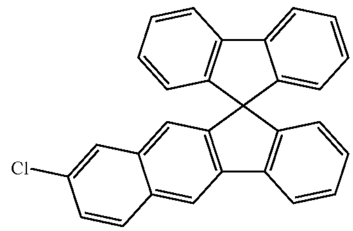
Sub 1-75
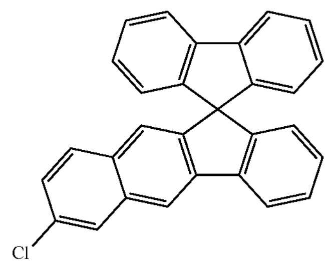
Sub 1-76
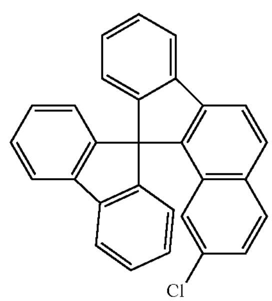
Sub 1-77
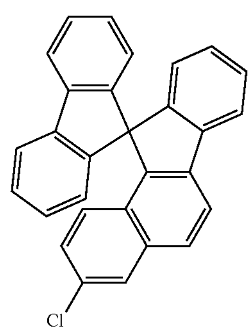

-continued
Sub 1-78
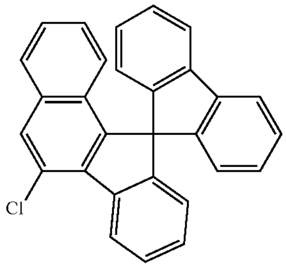
Sub 1-79
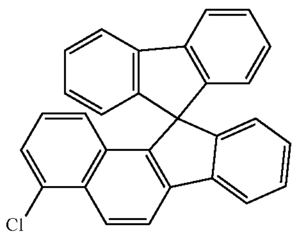
Sub 1-80
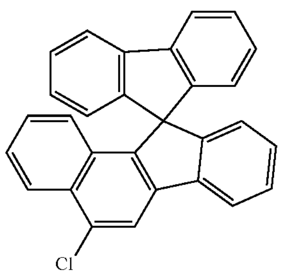
Sub 1-81
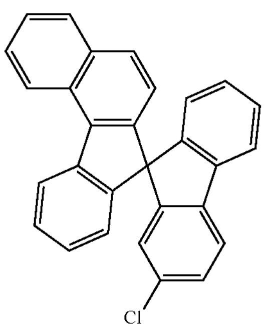
Sub 1-82
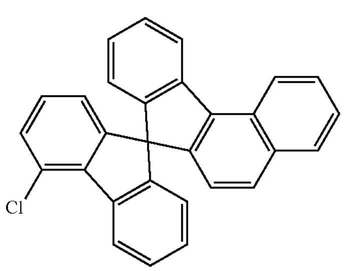
-continued
Sub 1-83
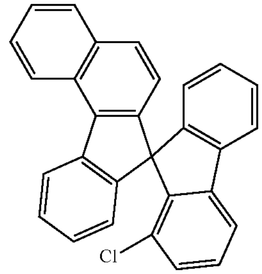
Sub 1-84
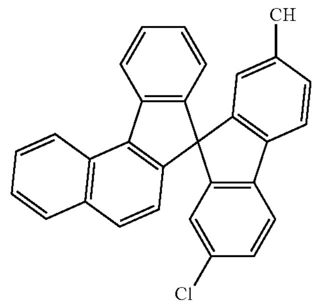
Sub 1-85
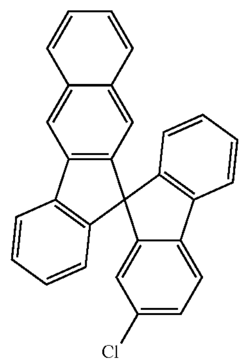
Sub 1-86
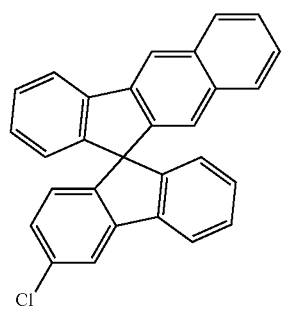
Sub 1-87
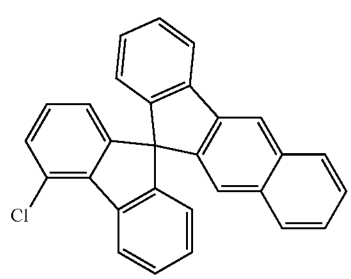

Sub 1-88
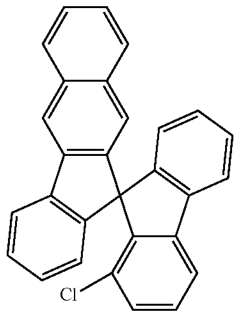
Sub 1-89
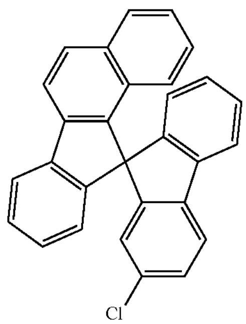
Sub 1-90
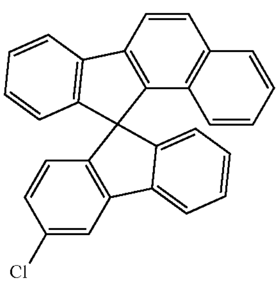
Sub 1-91
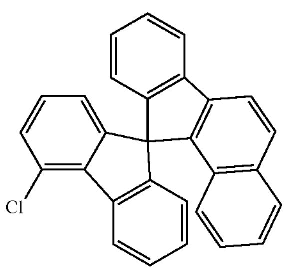
Sub 1-92
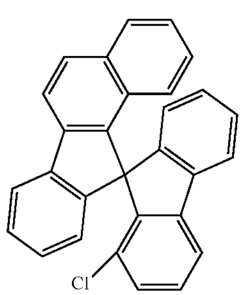
Sub 1-93
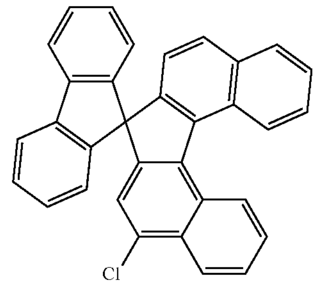
Sub 1-94
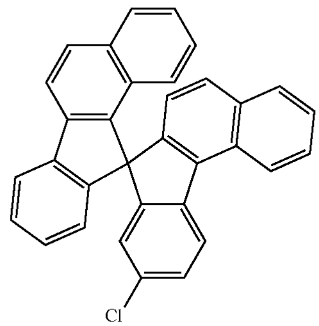
Sub 1-95
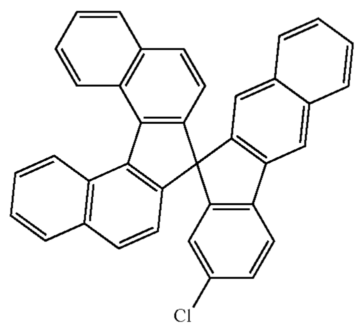
Sub 1-96
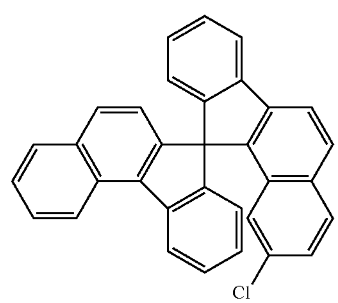
Sub 1-97
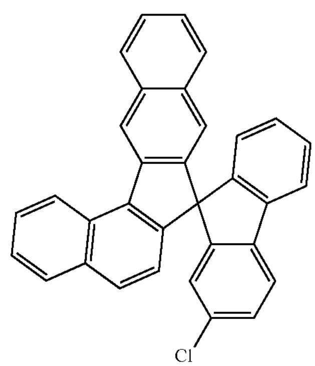

-continued
Sub 1-98
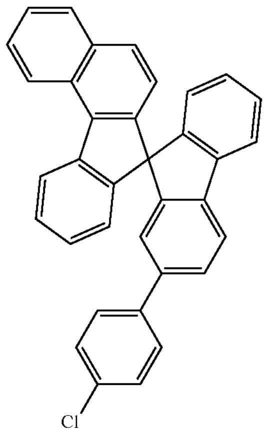
Sub 1-99
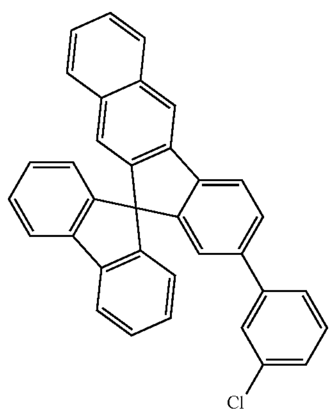
Sub 1-100
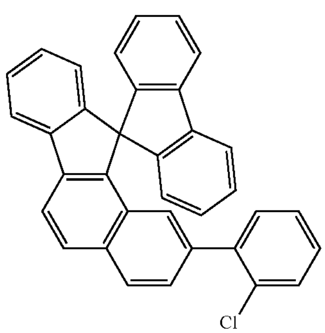
Sub 1-101
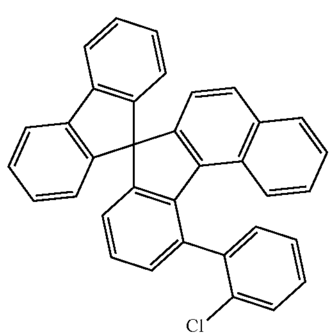
-continued
Sub 1-102
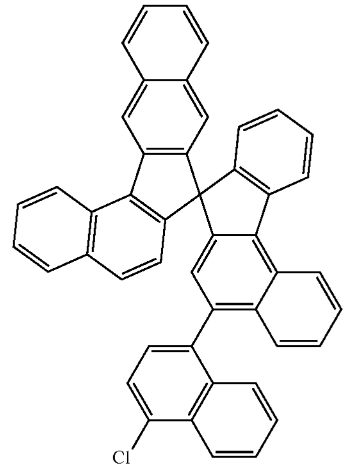
Sub 1-103
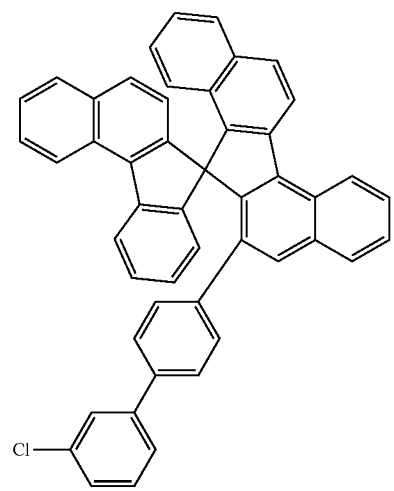
Sub 1-104
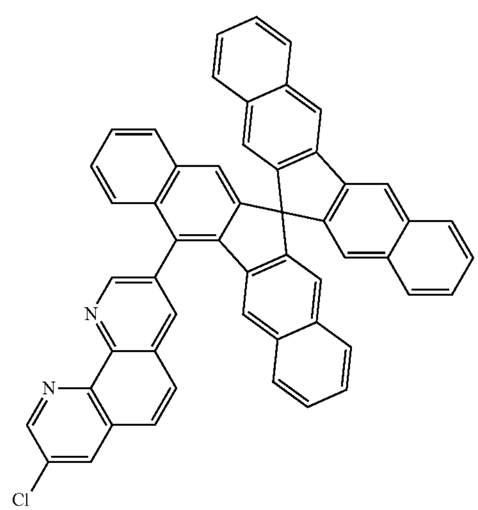

-continued
Sub 1-105
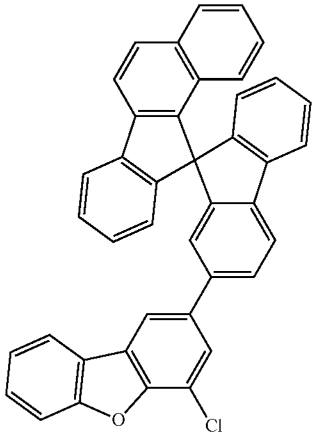
Sub 1-106
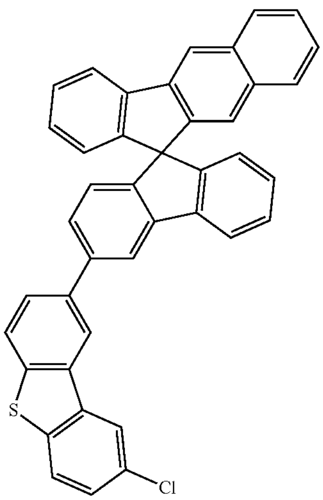
Sub 1-107
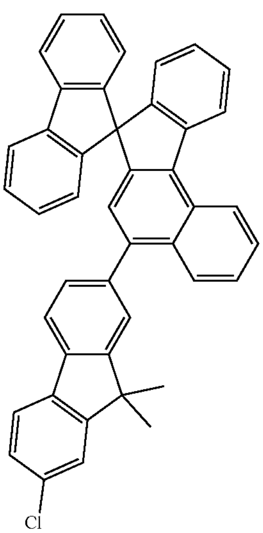
-continued
Sub 1-108
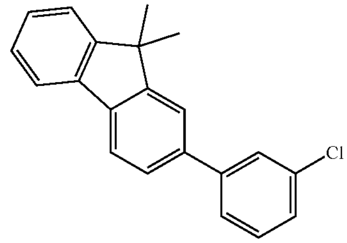
Sub 1-109
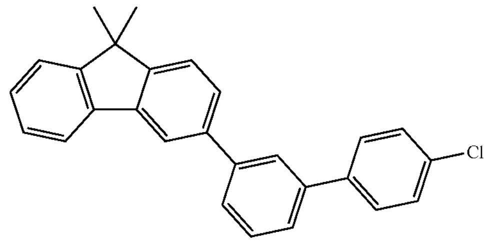
Sub 1-110
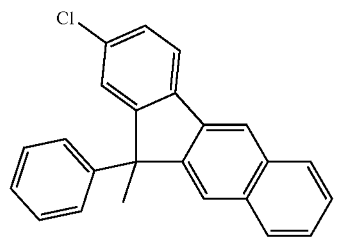
Sub 1-111
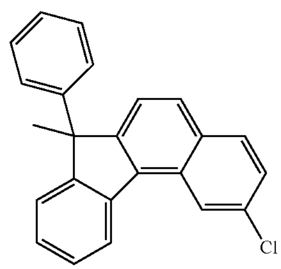
Sub 1-112
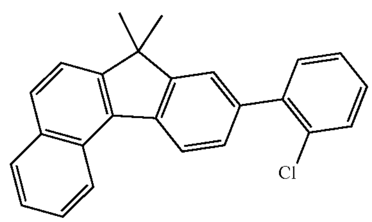
Sub 1-113
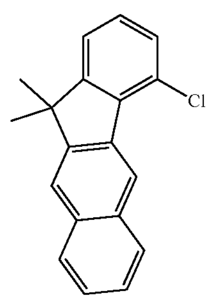

Sub 1-114

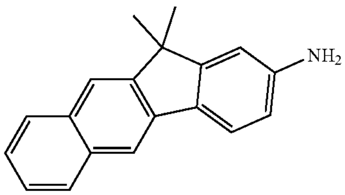

Sub 1-115

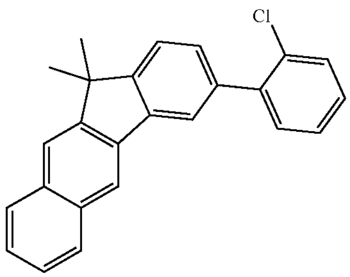

Sub 1-116

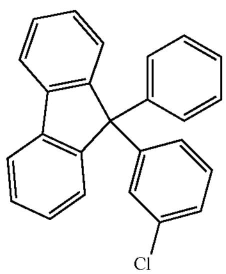

Sub 1-117

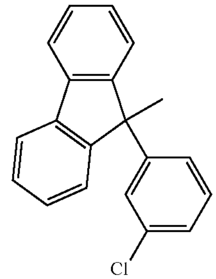

Sub 1-118

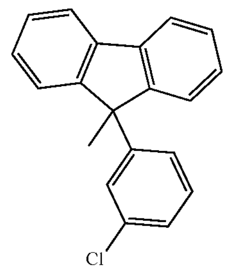

TABLE 9

| Compound | FD-MS | Compound | FD-MS |
|---|---|---|---|
| Sub 1-1 | m/z = 366.12($C_{26}H_{19}Cl$ = 366.89) | Sub 1-2 | m/z = 228.07($C_{15}H_{13}Cl$ = 228.72) |
| Sub 1-3 | m/z = 290.09($C_{20}H_{15}Cl$ = 290.79) | Sub 1-4 | m/z = 228.07($C_{15}H_{13}Cl$ = 228.72) |
| Sub 1-5 | m/z = 228.07($C_{15}H_{13}Cl$ = 228.72) | Sub 1-6 | m/z = 380.13($C_{27}H_{21}Cl$ = 380.92) |
| Sub 1-7 | m/z = 340.1($C_{24}H_{17}Cl$ = 340.85) | Sub 1-8 | m/z = 428.09($C_{19}H_{15}Cl$ = 278.78) |
| Sub 1-9 | m/z = 352.1($C_{25}H_{17}Cl$ = 352.86) | Sub 1-10 | m/z = 428.13($C_{31}H_{21}Cl$ = 428.96) |
| Sub 1-11 | m/z = 428.13($C_{31}H_{21}Cl$ = 423.96) | Sub 1-12 | m/z = 423.13($C_{31}H_{21}Cl$ = 428.96) |
| Sub 1-13 | m/z = 428.13($C_{31}H_{21}Cl$ = 428.96) | Sub 1-14 | m/z = 428.13($C_{31}H_{21}Cl$ = 428.96) |
| Sub 1-15 | m/z = 428.13($C_{31}H_{21}Cl$ = 428.96) | Sub 1-16 | m/z = 428.13($C_{31}H_{21}Cl$ = 428.96) |
| Sub 1-17 | m/z = 428.13($C_{31}H_{21}Cl$ = 428.96) | Sub 1-18 | m/z = 428.13($C_{31}H_{21}Cl$ = 428.96) |
| Sub 1-19 | m/z = 428.13($C_{31}H_{21}Cl$ = 428.96) | Sub 1-20 | m/z = 428.13($C_{31}H_{21}Cl$ = 428.96) |
| Sub 1-21 | m/z = 428.13($C_{31}H_{21}Cl$ = 428.96) | Sub 1-22 | m/z = 428.13($C_{31}H_{21}Cl$ = 428.96) |
| Sub 1-23 | m/z = 290.09($C_{20}H_{15}Cl$ = 290.79) | Sub 1-24 | m/z = 340.1($C_{24}H_{17}Cl$ = 340.85) |
| Sub 1-25 | m/z = 352.1($C_{25}H_{17}Cl$ = 352.86) | Sub 1-26 | m/z = 402.12($C_{29}H_{19}Cl$ = 402.92) |
| Sub 1-27 | m/z = 478.15($C_{35}H_{23}Cl$ = 479.02) | Sub 1-28 | m/z = 350.09($C_{25}H_{15}Cl$ = 350.85) |
| Sub 1-29 | m/z = 426.12($C_{31}H_{19}Cl$ = 426.94) | Sub 1-30 | m/z = 400.1($C_{29}H_{17}Cl$ = 400.91) |
| Sub 1-31 | m/z = 426.12($C_{31}H_{19}Cl$ = 426.94) | Sub 1-32 | m/z = 426.12($C_{31}H_{19}Cl$ = 426.94) |
| Sub 1-33 | m/z = 426.12($C_{31}H_{19}Cl$ = 426.94) | Sub 1-34 | m/z = 426.12($C_{31}H_{19}Cl$ = 426.94) |
| Sub 1-35 | m/z = 426.12($C_{31}H_{19}Cl$ = 426.94) | Sub 1-36 | m/z = 426.12($C_{31}H_{19}Cl$ = 426.94) |
| Sub 1-37 | m/z = 426.12($C_{31}H_{19}Cl$ = 426.94) | Sub 1-38 | m/z = 400.1($C_{29}H_{17}Cl$ = 400.91) |
| Sub 1-39 | m/z = 400.1($C_{29}H_{17}Cl$ = 400.91) | Sub 1-40 | m/z = 418.09($C_{29}H_{16}ClF$ = 418.9) |
| Sub 1-41 | m/z = 450.12($C_{33}H_{19}Cl$ = 450.97) | Sub 1-42 | m/z = 304.1($C_{21}H_{17}Cl$ = 304.82) |
| Sub 1-43 | m/z = 404.13($C_{29}H_{21}Cl$ = 404.94) | Sub 1-44 | m/z = 456.16($C_{33}H_{25}Cl$ = 457.01) |
| Sub 1-45 | m/z = 420.16($C_{30}H_{25}Cl$ = 420.98) | Sub 1-46 | m/z = 380.13($C_{27}H_{21}Cl$ = 380.92) |
| Sub 1-47 | m/z = 456.16($C_{33}H_{25}Cl$ = 457.01) | Sub 1-48 | m/z = 428.13($C_{31}H_{21}Cl$ = 428.96) |
| Sub 1-49 | m/z = 352.1($C_{25}H_{17}Cl$ = 352.86) | Sub 1-50 | m/z = 402.12($C_{29}H_{19}Cl$ = 402.92) |
| Sub 1-51 | m/z = 352.1($C_{25}H_{17}Cl$ = 352.86) | Sub 1-52 | m/z = 506.18($C_{37}H_{27}Cl$ = 507.07) |
| Sub 1-53 | m/z = 504.16($C_{37}H_{25}Cl$ = 505.06) | Sub 1-54 | m/z = 540.15($C_{37}H_{23}CF_2$ = 541.04) |
| Sub 1-55 | m/z = 350.09($C_{25}H_{15}Cl$ = 350.85) | Sub 1-56 | m/z = 426.12($C_{31}H_{19}Cl$ = 426.94) |
| Sub 1-57 | m/z = 426.12($C_{31}H_{19}Cl$ = 426.94) | Sub 1-58 | m/z = 502.15($C_{37}H_{23}Cl$ = 503.04) |
| Sub 1-59 | m/z = 476.13($C_{35}H_{21}Cl$ = 477.00) | Sub 1-60 | m/z = 476.13($C_{35}H_{21}Cl$ = 477.00) |
| Sub 1-61 | m/z = 400.1($C_{29}H_{17}Cl$ = 400.91) | Sub 1-62 | m/z = 400.1($C_{29}H_{17}Cl$ = 400.91) |
| Sub 1-63 | m/z = 400.1($C_{29}H_{17}Cl$ = 400.91) | Sub 1-64 | m/z = 400.1($C_{29}H_{17}Cl$ = 400.91) |
| Sub 1-65 | m/z = 400.1($C_{29}H_{17}Cl$ = 400.91) | Sub 1-66 | m/z = 477.13($C_{34}H_{20}CN$ = 477.99) |
| Sub 1-67 | m/z = 400.1($C_{29}H_{17}Cl$ = 400.91) | Sub 1-68 | m/z = 400.1($C_{29}H_{17}Cl$ = 400.91) |
| Sub 1-69 | m/z = 400.1($C_{29}H_{17}Cl$ = 400.91) | Sub 1-70 | m/z = 400.1($C_{29}H_{17}Cl$ = 400.91) |
| Sub 1-71 | m/z = 400.1($C_{29}H_{17}Cl$ = 400.91) | Sub 1-72 | m/z = 400.1($C_{29}H_{17}Cl$ = 400.91) |
| Sub 1-73 | m/z = 566.14($C_{41}H_{23}ClO$ = 567.08) | Sub 1-74 | m/z = 400.1($C_{29}H_{17}Cl$ = 400.91) |

TABLE 9-continued

| Compound | FD-MS | Compound | FD-MS |
|---|---|---|---|
| Sub 1-75 | m/z = 400.1($C_{29}H_{17}Cl$ = 400.91) | Sub 1-76 | m/z = 400.1($C_{29}H_{17}Cl$ = 400.91) |
| Sub 1-77 | m/z = 400.1($C_{29}H_{17}Cl$ = 400.91) | Sub 1-78 | m/z = 400.1($C_{29}H_{17}Cl$ = 400.91) |
| Sub 1-79 | m/z = 400.1($C_{29}H_{17}Cl$ = 400.91) | Sub 1-80 | m/z = 400.1($C_{29}H_{17}Cl$ = 400.91) |
| Sub 1-81 | m/z = 400.1($C_{29}H_{17}Cl$ = 400.91) | Sub 1-82 | m/z = 400.1($C_{29}H_{17}Cl$ = 400.91) |
| Sub 1-83 | m/z = 400.1($C_{29}H_{17}Cl$ = 400.91) | Sub 1-84 | m/z = 425.1($C_{30}H_{16}ClN$ = 425.92) |
| Sub 1-85 | m/z = 400.1($C_{29}H_{17}Cl$ = 400.91) | Sub 1-86 | m/z = 400.1($C_{29}H_{17}Cl$ = 400.91) |
| Sub 1-87 | m/z = 400.1($C_{29}H_{17}Cl$ = 400.91) | Sub 1-88 | m/z = 400.1($C_{29}H_{17}Cl$ = 400.91) |
| Sub 1-89 | m/z = 400.1($C_{29}H_{17}Cl$ = 400.91) | Sub 1-90 | m/z = 400.1($C_{29}H_{17}Cl$ = 400.91) |
| Sub 1-91 | m/z = 400.1($C_{29}H_{17}Cl$ = 400.91) | Sub 1-92 | m/z = 400.1($C_{29}H_{17}Cl$ = 400.91) |
| Sub 1-93 | m/z = 450.12($C_{33}H_{19}Cl$ = 450.97) | Sub 1-94 | m/z = 450.12($C_{33}H_{19}Cl$ = 450.97) |
| Sub 1-95 | m/z = 500.13($C_{37}H_{21}Cl$ = 501.03) | Sub 1-96 | m/z = 450.12($C_{35}H_{19}Cl$ = 450.97) |
| Sub 1-97 | m/z = 450.12($C_{33}H_{19}Cl$ = 450.97) | Sub 1-98 | m/z = 476.13($C_{35}H_{21}Cl$ = 477.00) |
| Sub 1-99 | m/z = 476.13($C_{35}H_{21}Cl$ = 477.00) | Sub 1-100 | m/z = 476.13($C_{35}H_{21}Cl$ = 477.00) |
| Sub 1-101 | m/z = 476.13($C_{35}H_{21}Cl$ = 477.00) | Sub 1-102 | m/z = 626.18($C_{47}H_{27}Cl$ = 627.18) |
| Sub 1-103 | m/z = 652.2($C_{49}H_{29}Cl$ = 653.22) | Sub 1-104 | m/z = 728.2($C_{53}H_{29}ClN_2$ = 729.28) |
| Sub 1-105 | m/z = 566.14($C_{41}H_{23}ClO$ = 567.08) | Sub 1-106 | m/z = 582.12($C_{41}H_{23}ClS$ = 583.15) |
| Sub 1-107 | m/z = 592.2($C_{44}H_{29}Cl$ = 593.17) | Sub 1-108 | m/z = 304.1($C_{21}H_{17}Cl$ = 304.82) |
| Sub 1-109 | m/z = 380.13($C_{27}H_{21}Cl$ = 380.92) | Sub 1-110 | m/z = 340.1($C_{24}H_{17}Cl$ = 340.85) |
| Sub 1-111 | m/z = 340.1($C_{24}H_{17}Cl$ = 340.85) | Sub 1-112 | m/z = 354.12($C_{25}H_{19}Cl$ = 354.88) |
| Sub 1-113 | m/z = 278.09($C_{19}H_{15}Cl$ = 278.78) | Sub 1-114 | m/z = 259.14($C_{19}H_{17}N$ = 259.35) |
| Sub 1-115 | m/z = 354.12($C_{25}H_{19}Cl$ = 354.88) | Sub 1-116 | m/z = 352.1($C_{25}H_{17}Cl$ = 352.86) |
| Sub 1-117 | m/z = 290.09($C_{20}H_{15}Cl$ = 290.79) | Sub 1-118 | m/z = 290.09($C_{20}H_{15}Cl$ = 290.79) |

II. Synthesis of Sub 2

Sub 2 of Reaction Formula 18 is synthesized through, but not limited to, a reaction path of the following Reaction Formula 20.

[Reaction Formula 20]

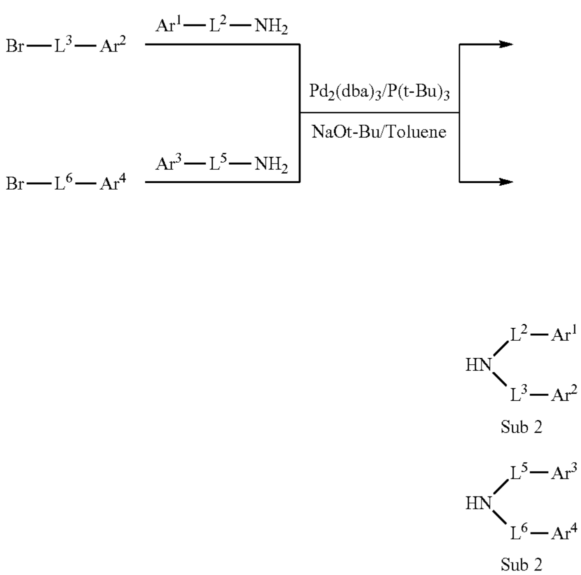

1. Synthesis of Sub 2-73

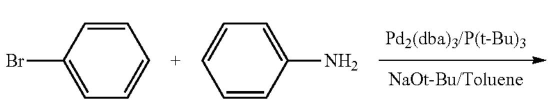

-continued

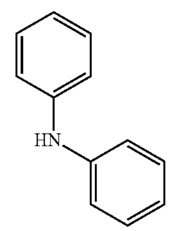

Sub 2-73

Bromobenzene (37.1 g, 236.2 mmol) was added to a round bottom flask, dissolved with toluene (2200 ml), and then aniline (20 g, 214.8 mmol), $Pd_2(dba)_3$ (9.83 g, 10.7 mmol), $P(t-Bu)_3$ (4.34 g, 21.5 mmol), and NaOt-Bu (62 g, 644.3 mmol) were sequentially added, followed by stirring at 100° C. When the reaction was completed, extraction was performed with ether and water, and then an organic layer was dried with $MgSO_4$ and concentrated. The resultant organic matter was subjected to silica gel column chromatography and recrystallization to create a product in an amount of 28 g (yield: 77%)

2. Synthesis of Sub 2-111

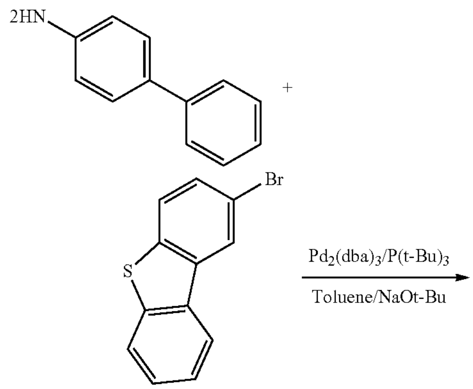

-continued

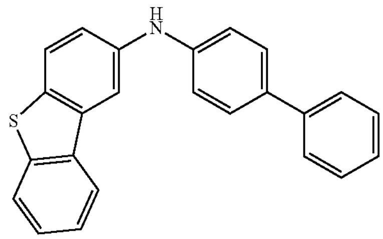

Sub 2-111

[1,1'-biphenyl]-4-amine (15 g, 88.64 mmol), 2-bromodibenzo[b,d]thiophene (23.32 g, 88.64 mmol), $Pd_2(dba)_3$ (2.43 g, 2.66 mmol), $P(t\text{-}Bu)_3$ (17.93 g, 88.64 mmol), NaOt-Bu (17.04 g, 177.27 mmol), and toluene (886 mL) were added to a round bottom flask, and then an experiment was performed in the same manner as Sub 2-73, thereby creating a product in an amount of 24.6 g (yield 79%).

The compounds belonging to Sub 2 of Reaction Formula 18 may be, but are not limited to, the following compounds, and Table 10 illustrates field desorption-mass spectrometry (FD-MS) values of the compounds belonging to Sub 2.

Sub 2-1

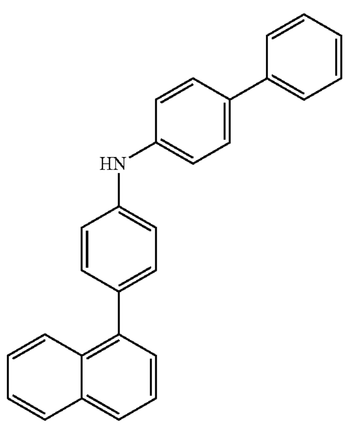

Sub 2-2

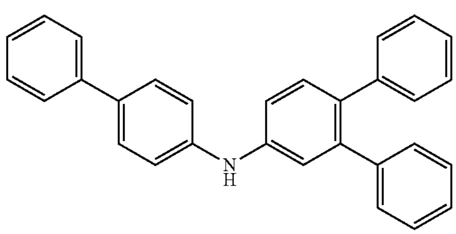

Sub 2-3

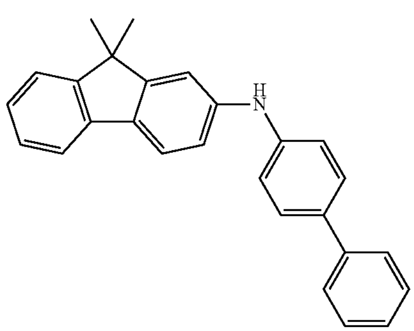

-continued

Sub 2-4

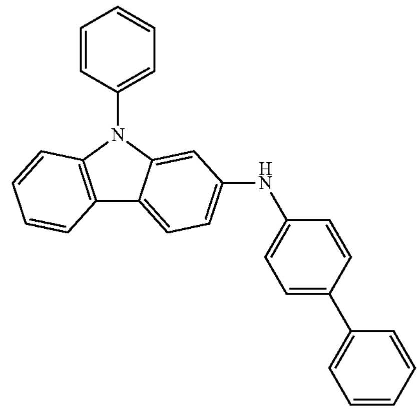

Sub 2-5

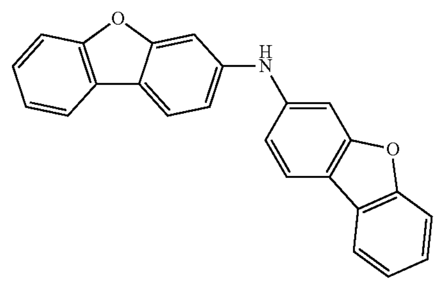

Sub 2-6

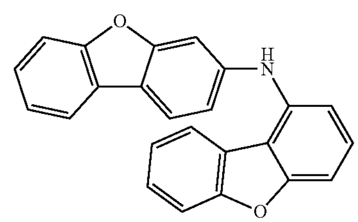

Sub 2-7

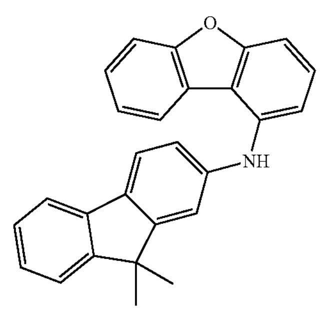

Sub 2-8

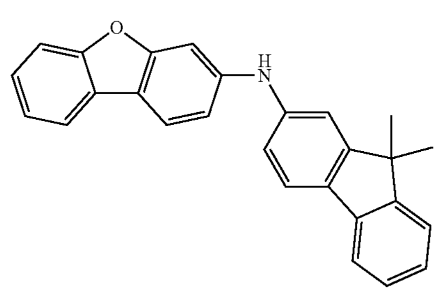

-continued
Sub 2-9
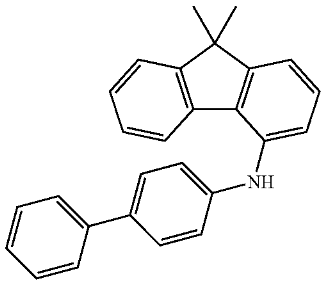
Sub 2-10
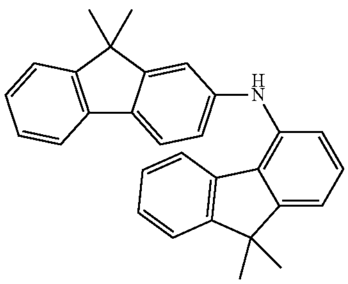
Sub 2-11
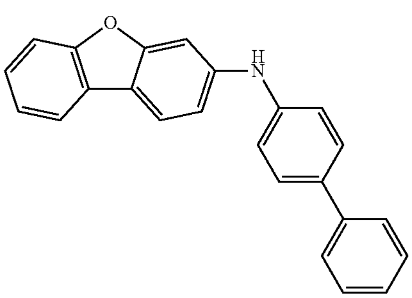
Sub 2-12
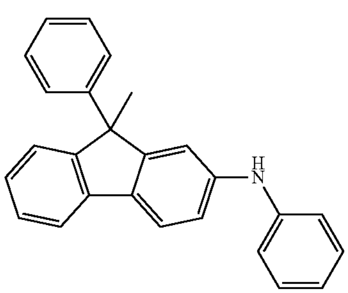
-continued
Sub 2-13
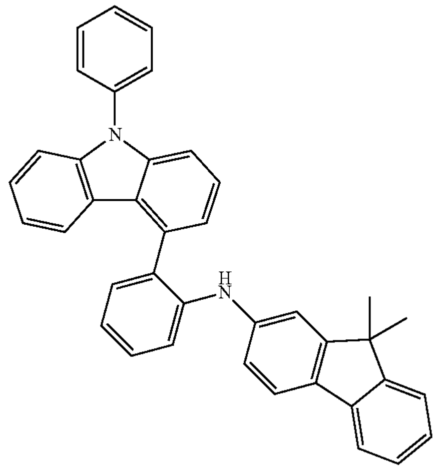
Sub 2-14
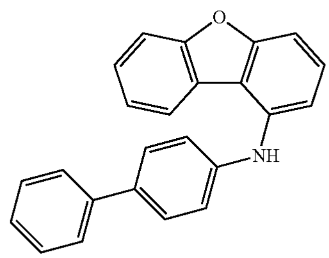
Sub 2-15
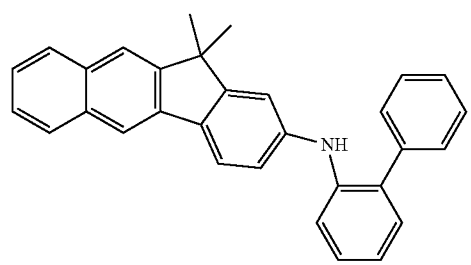
Sub 2-16
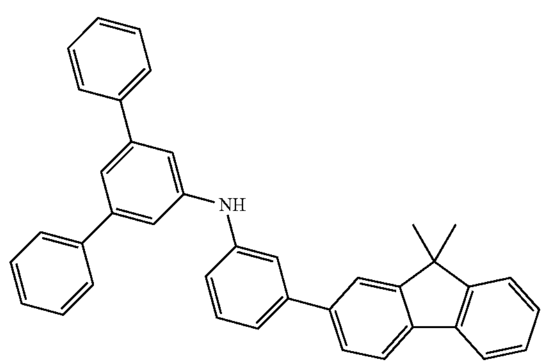

-continued
Sub 2-17
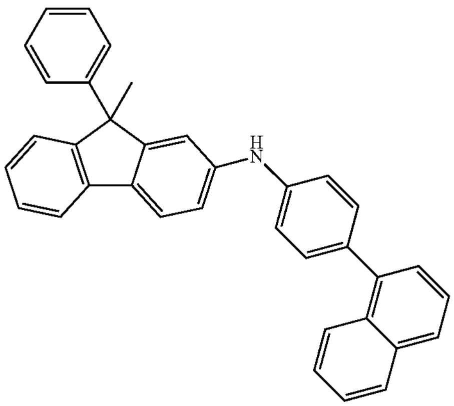
Sub 2-18
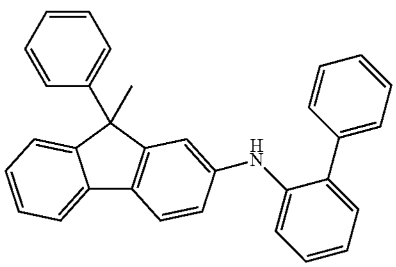
Sub 2-19
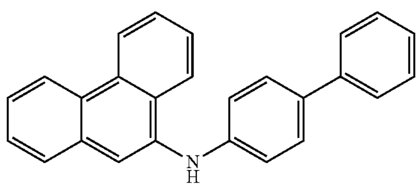
Sub 2-20
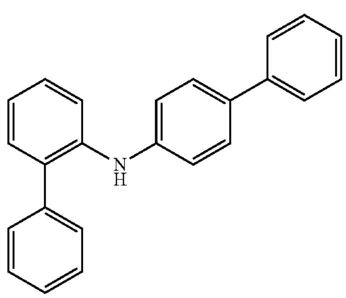
Sub 2-21
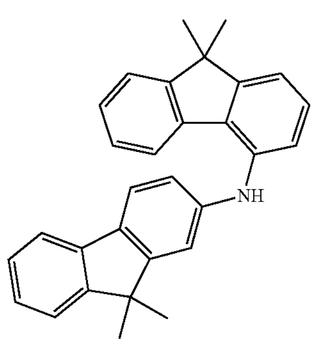
-continued
Sub 2-22
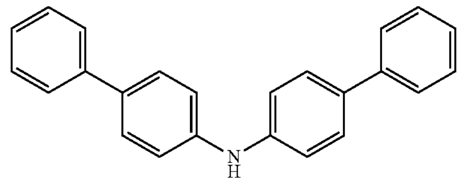
Sub 2-23
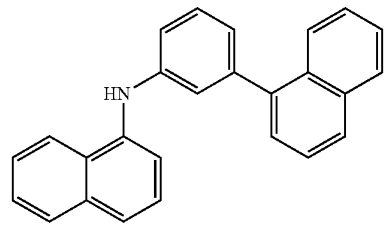
Sub 2-24
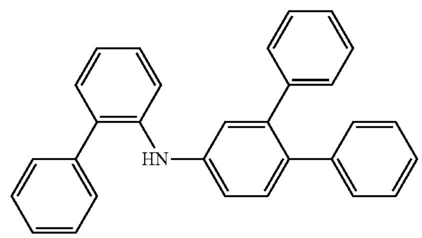
Sub 2-25
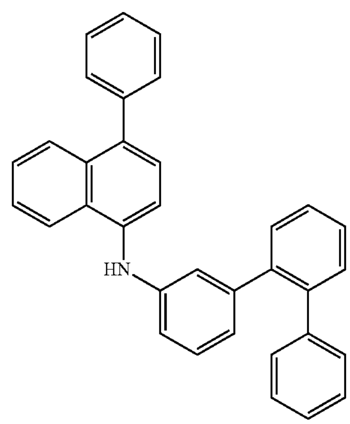
Sub 2-26
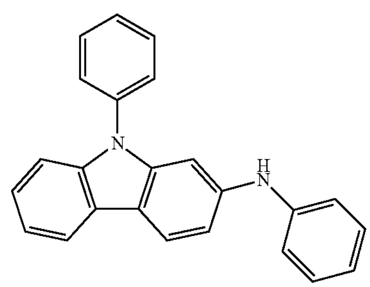
Sub 2-27
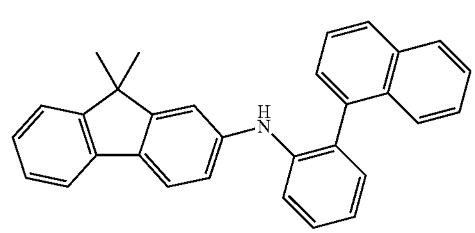

Sub-2-28
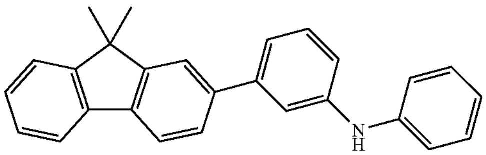
Sub 2-29
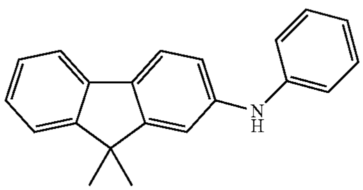
Sub 2-30
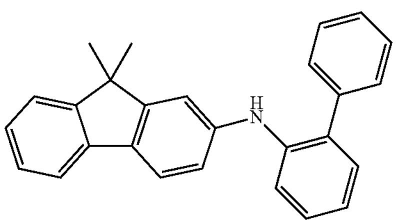
Sub 2-31
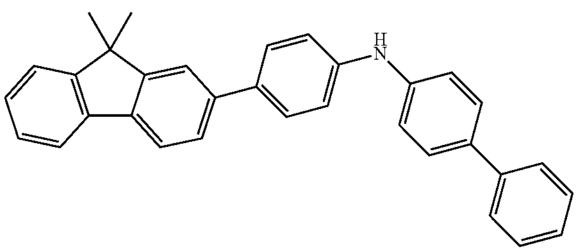
Sub 2-32
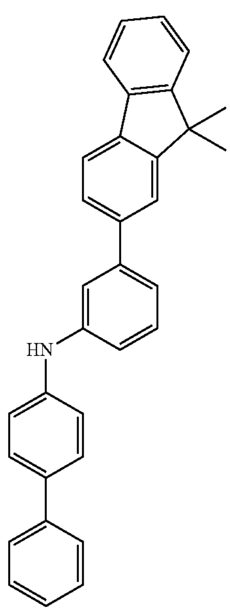
Sub 2-33
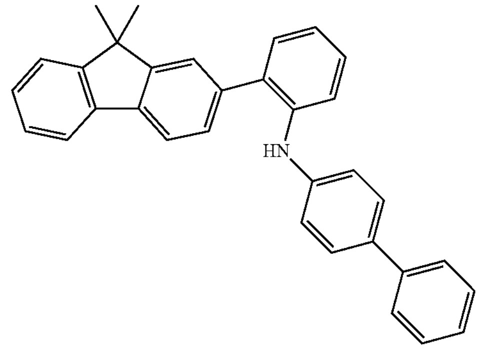
Sub 2-34
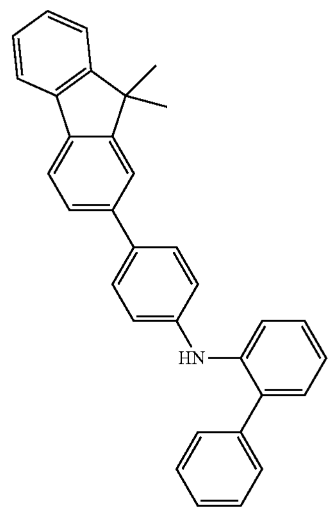
Sub 2-35
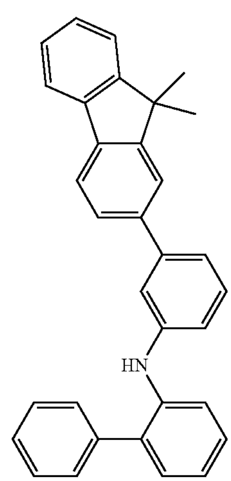

-continued
Sub 2-36
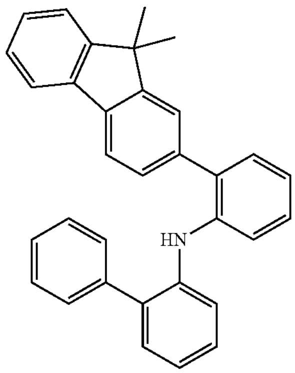
Sub 2-37
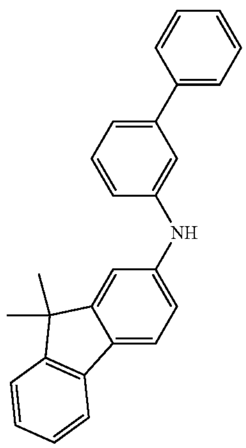
Sub 2-38
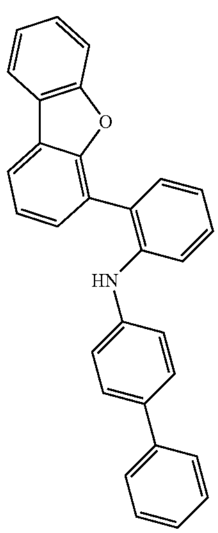
-continued
Sub 2-39
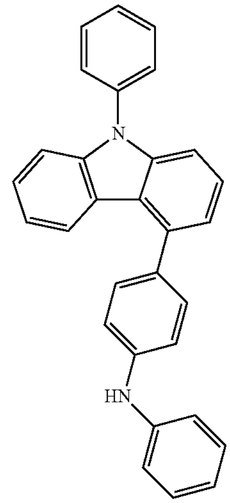
Sub 2-40
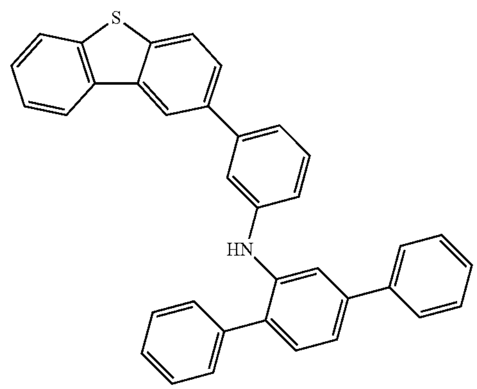
Sub 2-41
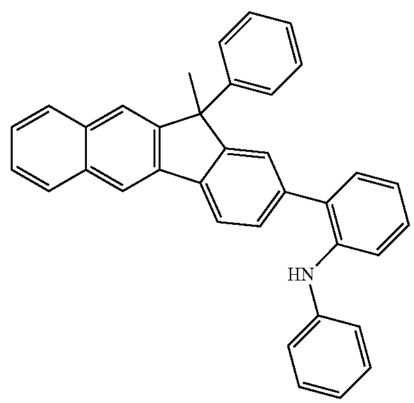
Sub 2-42
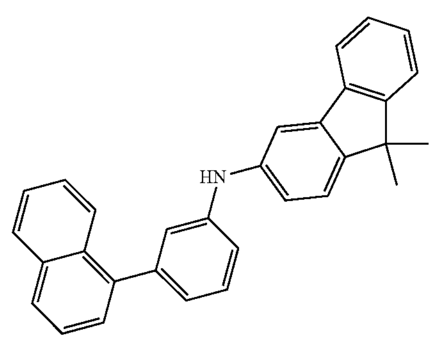

-continued
Sub 2-43
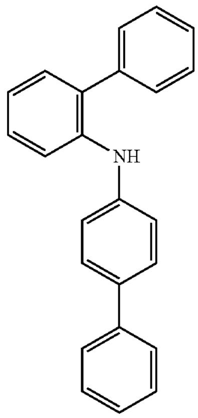
Sub 2-44
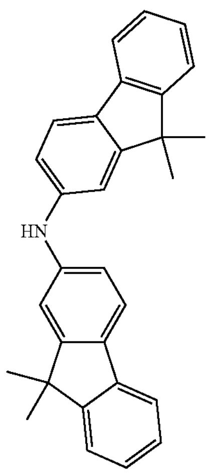
Sub 2-45
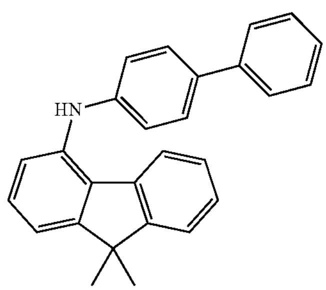
Sub 2-46
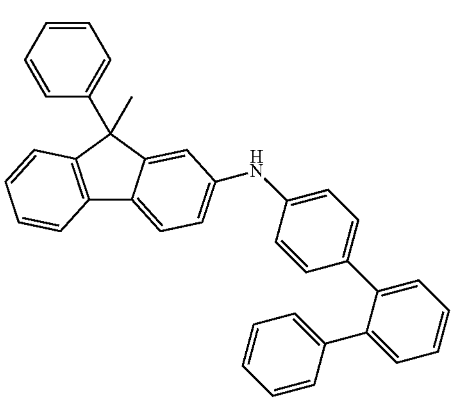
-continued
Sub 2-47
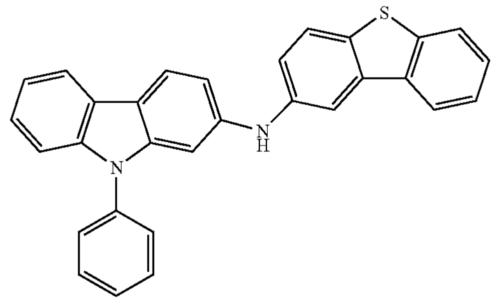
Sub 2-48
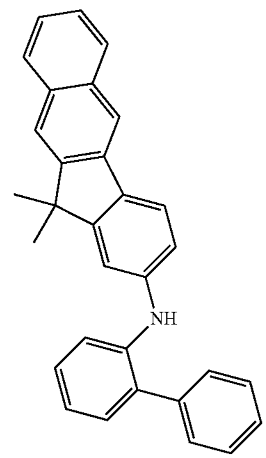
Sub 2-49
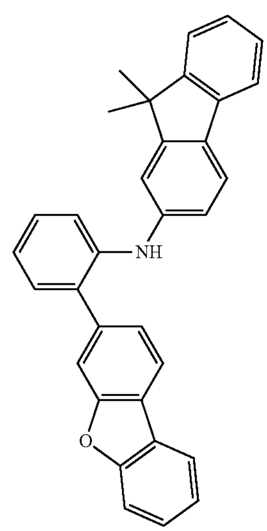

-continued
Sub 2-50
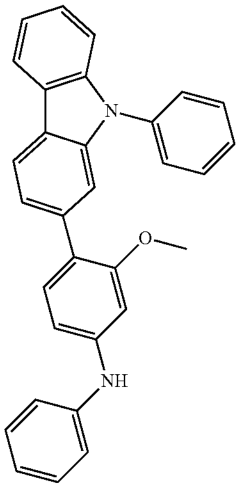
Sub 2-51
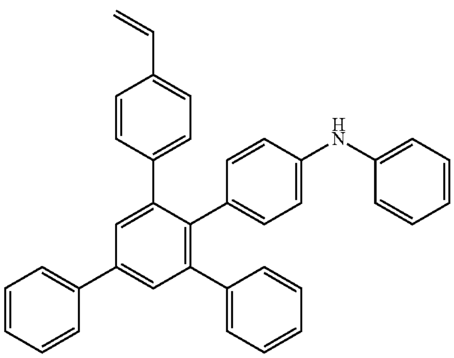
Sub 2-52
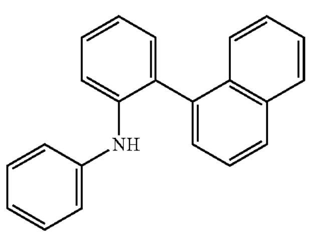
Sub 2-53
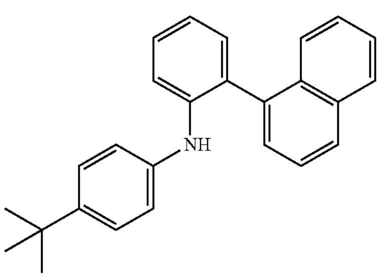
-continued
Sub 2-54
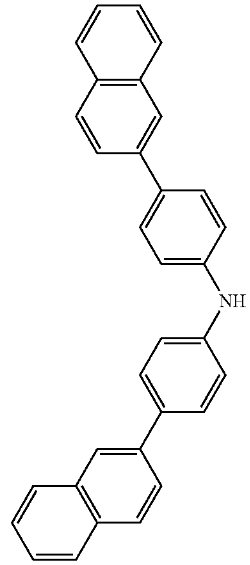
Sub 2-55
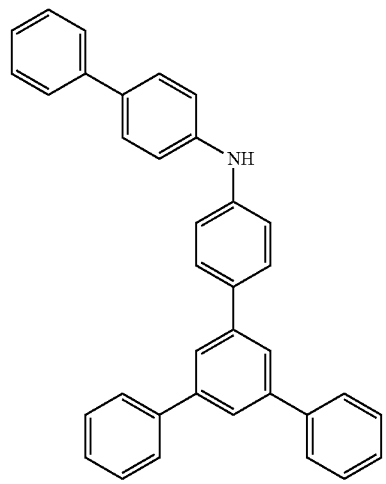
Sub 2-56
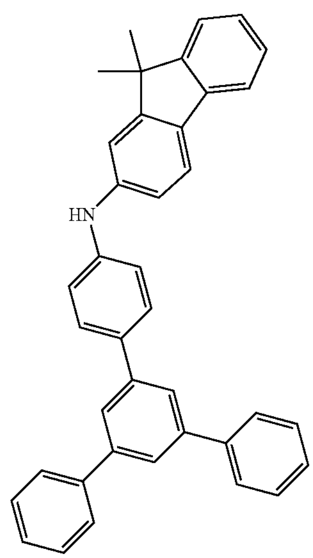

-continued
Sub 2-57
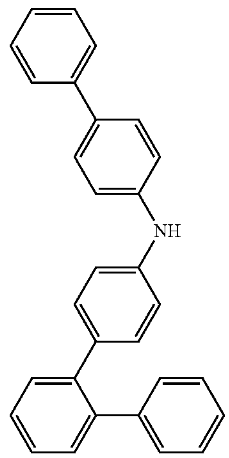
Sub 2-58
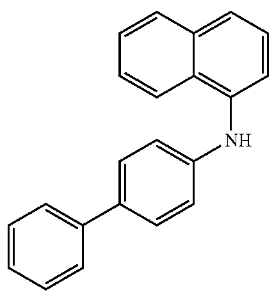
Sub 2-59
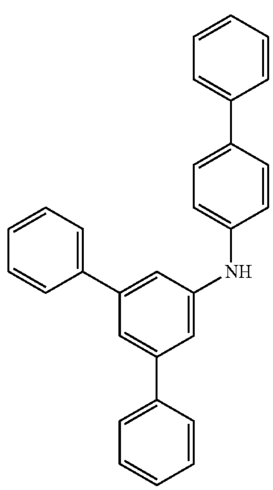
Sub 2-60
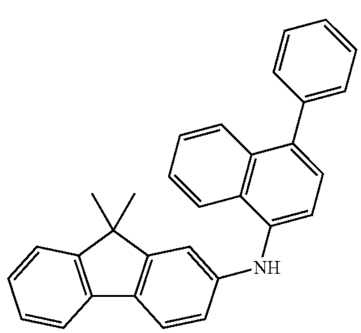
-continued
Sub 2-61
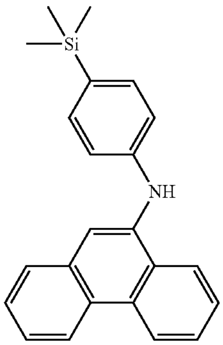
Sub 2-62
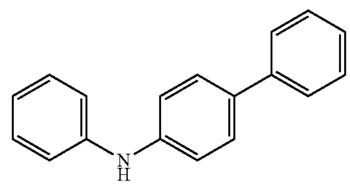
Sub 2-63
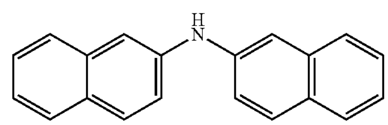
Sub 2-64
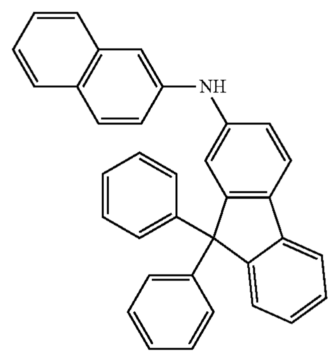
Sub 2-65
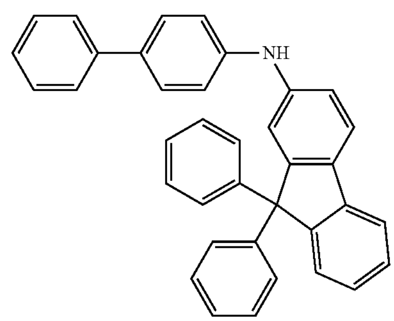
Sub 2-66
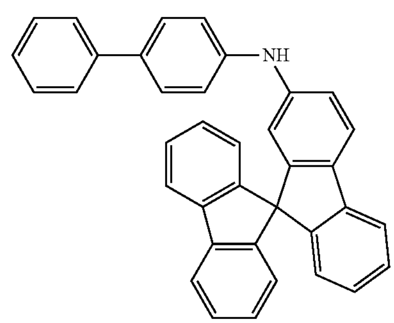

Sub 2-67
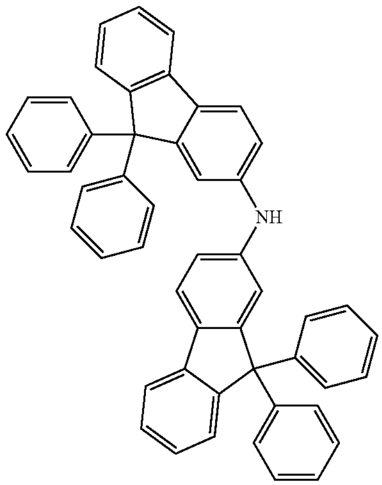
Sub 2-68
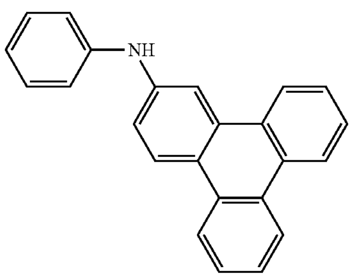
Sub 2-69
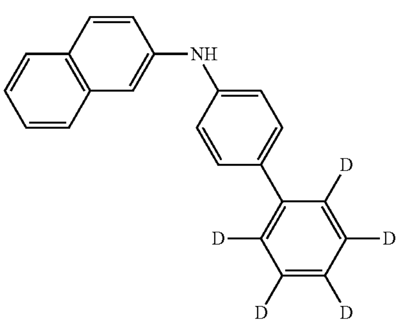
Sub 2-70
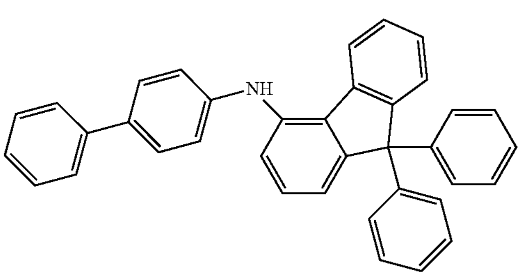
Sub 2-71
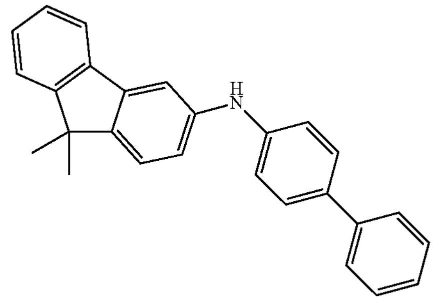
Sub 2-72
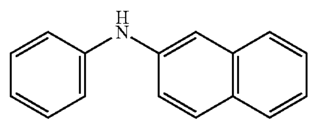
Sub 2-73
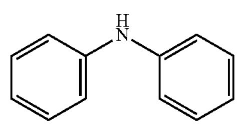
Sub 2-74
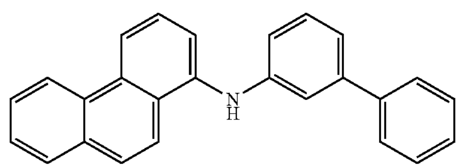
Sub 2-75
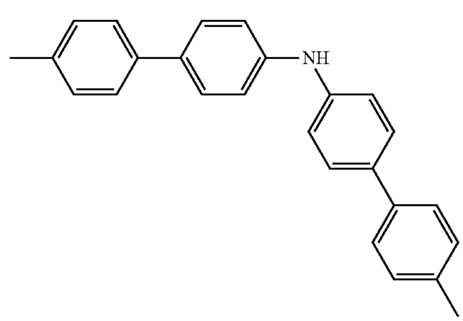

Sub 2-76
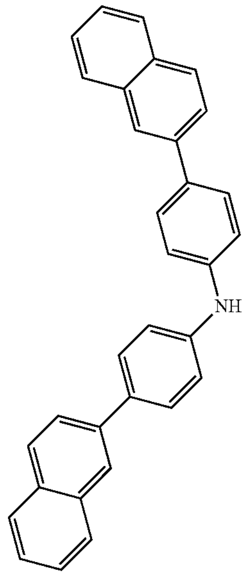
Sub 2-77
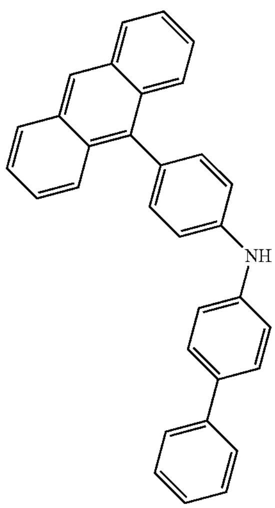
Sub 2-78
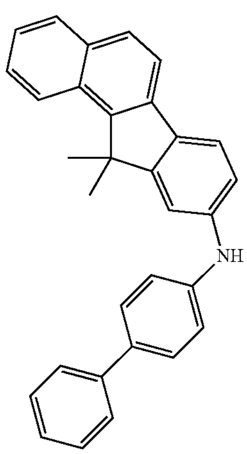
Sub 2-79
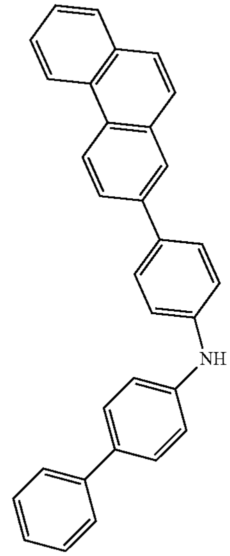
Sub 2-80
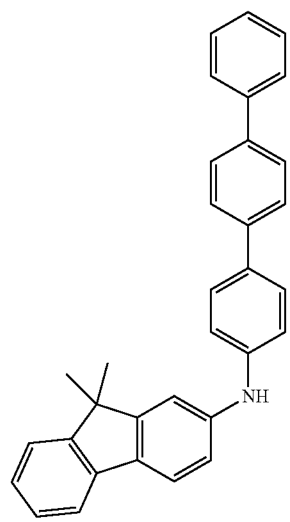
Sub 2-81
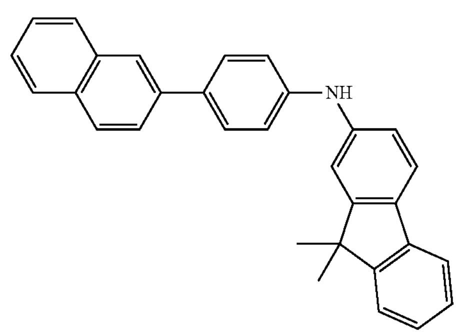

-continued
Sub 2-82
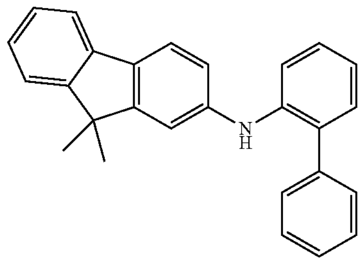
Sub 2-83
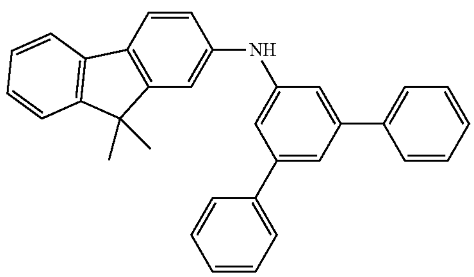
Sub 2-84
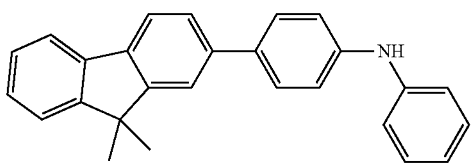
Sub 2-85
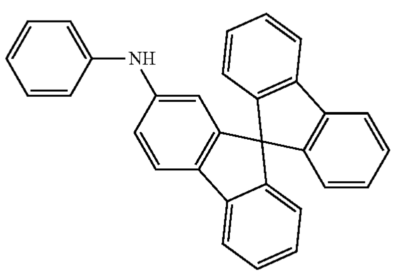
Sub 2-86
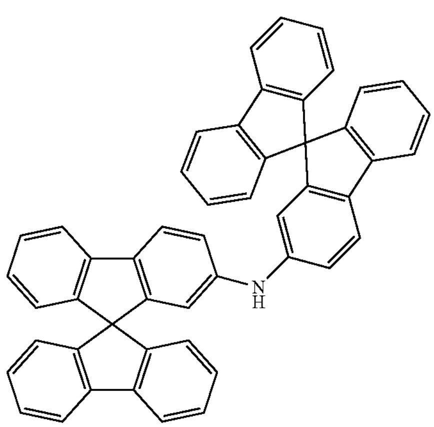
-continued
Sub 2-87
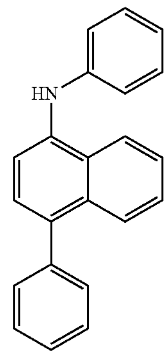
Sub 2-88
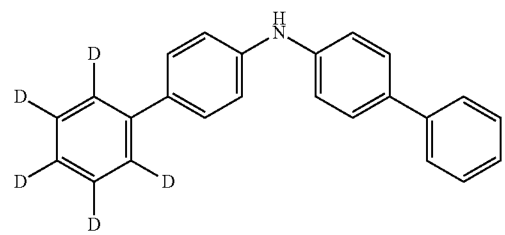
Sub 2-89
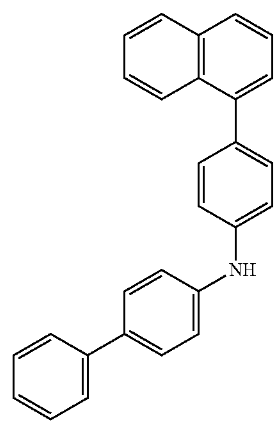
Sub 2-90
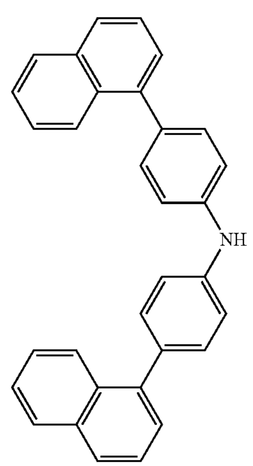

-continued
Sub 2-91
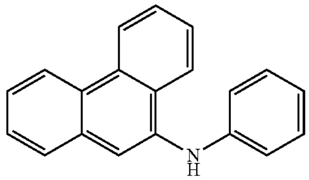
Sub 2-92
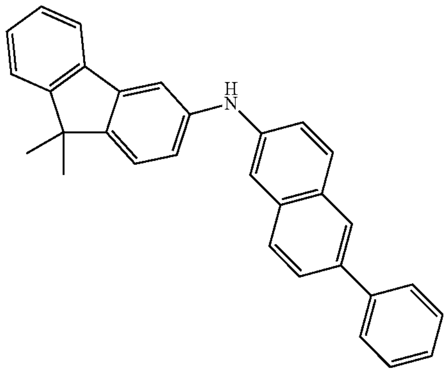
Sub 2-93
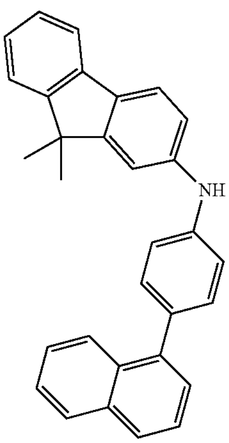
Sub 2-94
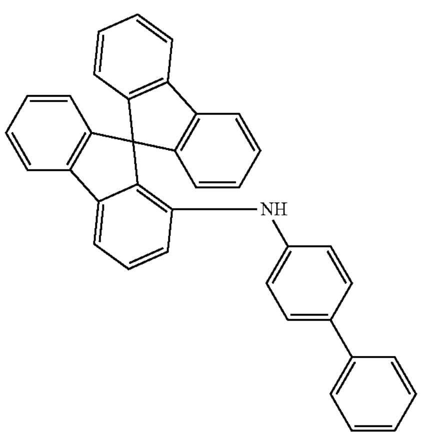
Sub 2-95
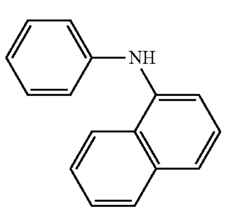
-continued
Sub 2-96
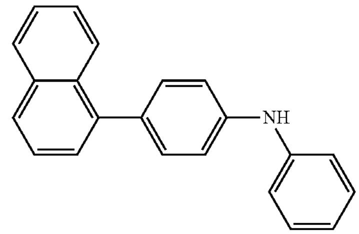
Sub 2-97
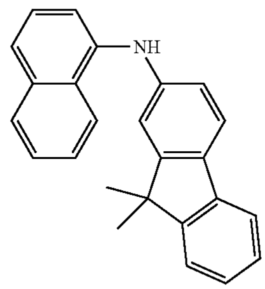
Sub 2-98
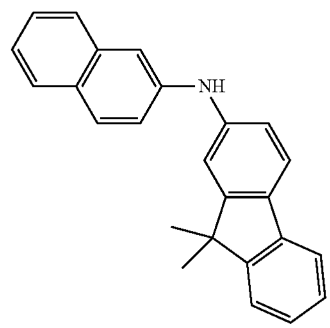
Sub 2-99
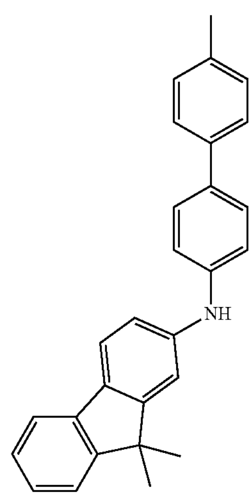

-continued
Sub 2-100
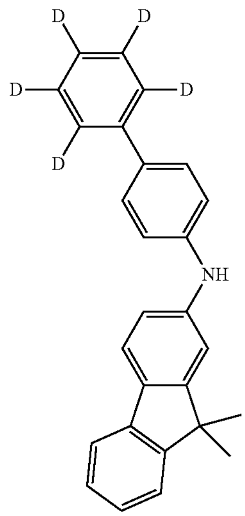
Sub 2-101
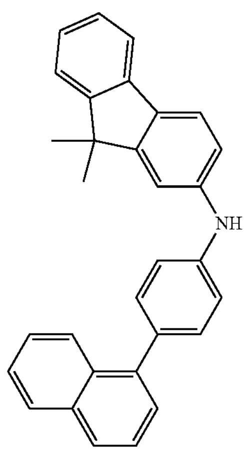
Sub 2-102
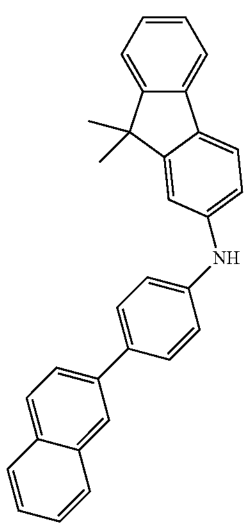
-continued
Sub 2-103
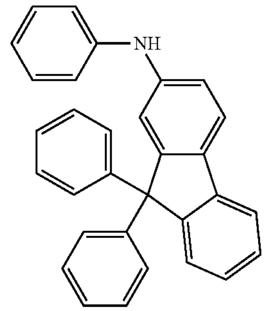
Sub 2-104
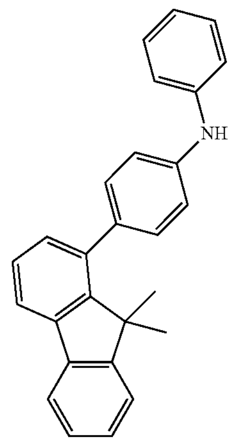
Sub 2-105
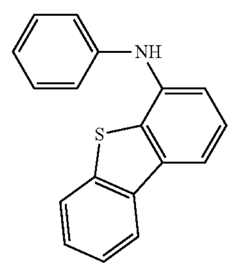
Sub 2-106
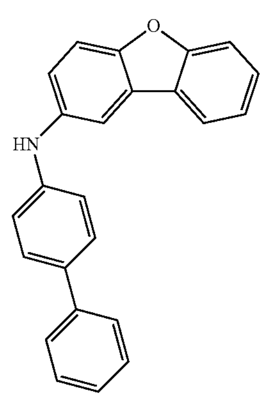

Sub 2-107
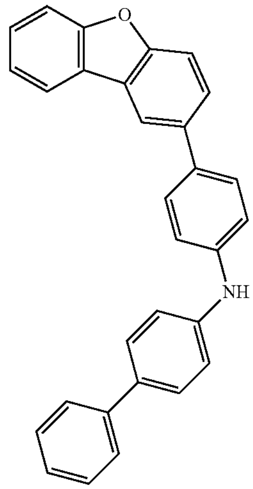
Sub 2-108
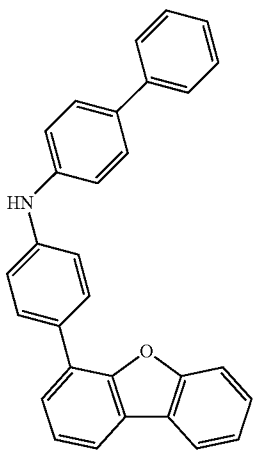
Sub 2-109
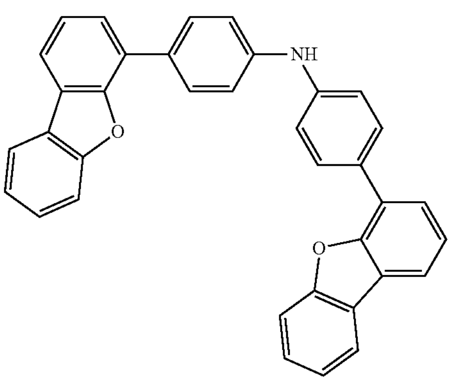
Sub 2-110
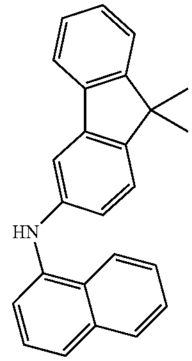
Sub 2-111
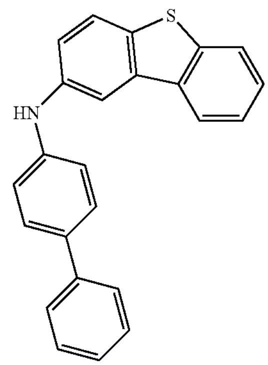
Sub 2-112
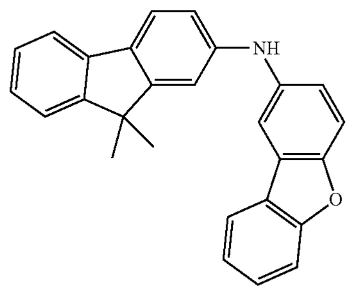
Sub 2-113
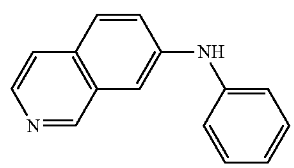
Sub 2-114
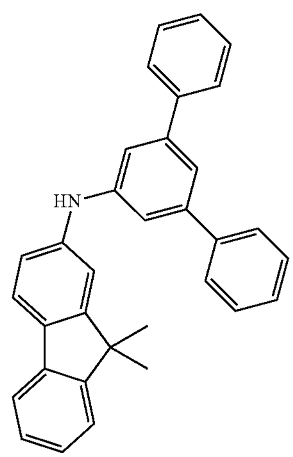

Sub 2-115
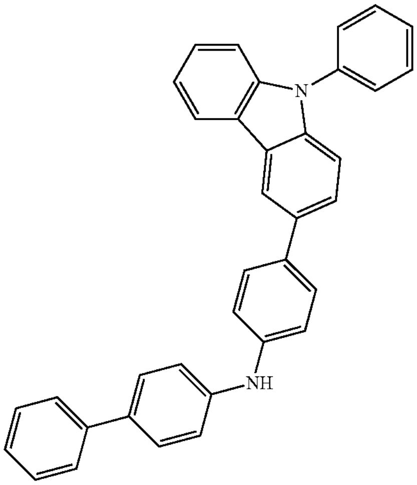
Sub 2-116
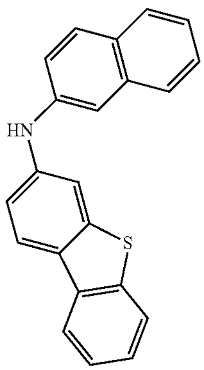
Sub 2-117
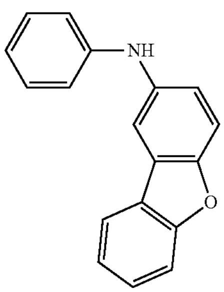
Sub 2-118
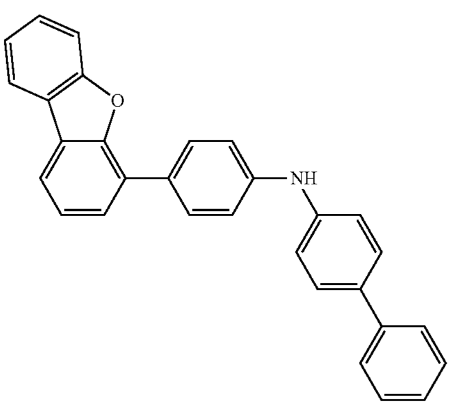
Sub 2-119
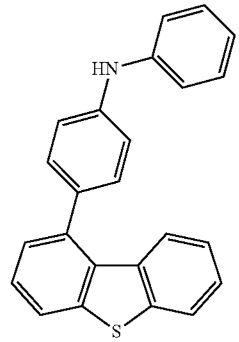
Sub 2-120
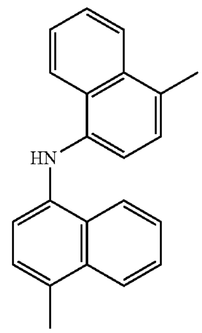
Sub 2-121
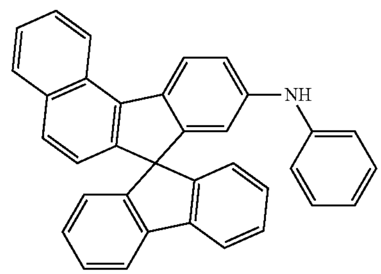
Sub 2-122
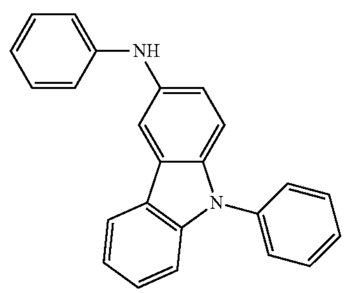
Sub 2-123
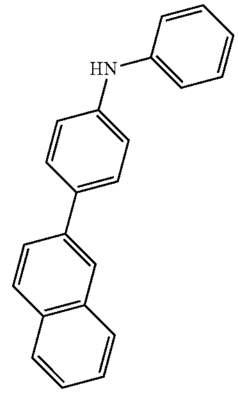

Sub 2-124
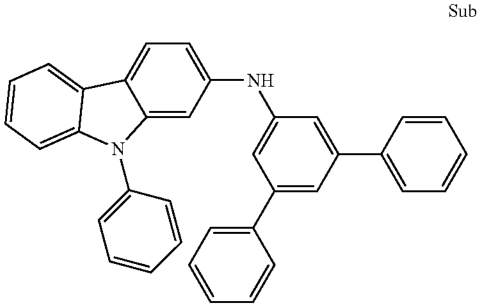
Sub 2-125
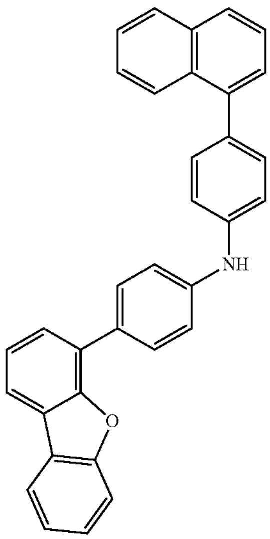
Sub 2-126
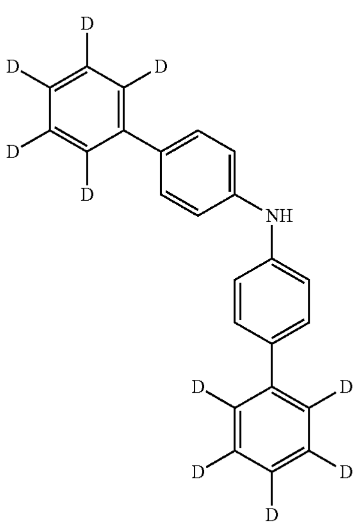
Sub 2-127
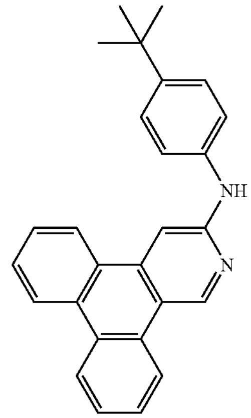
Sub 2-128
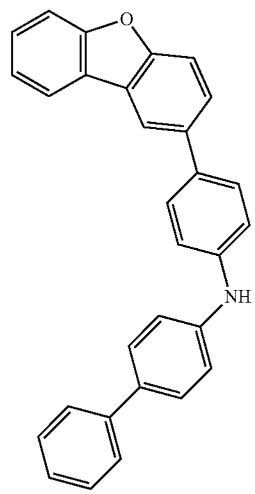
Sub 2-129
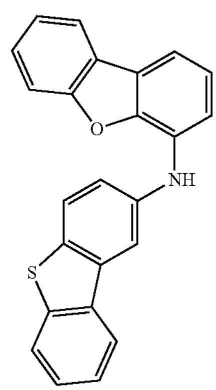

Sub 2-130
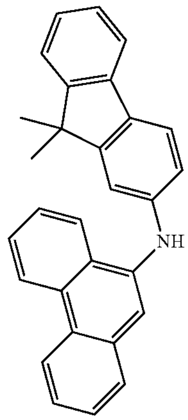
Sub 2-131
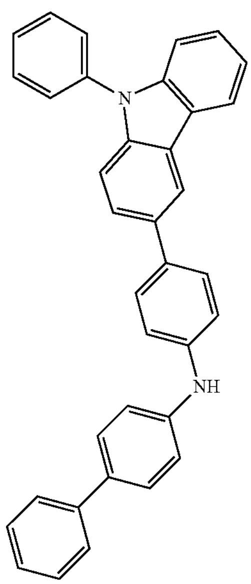
Sub 2-132
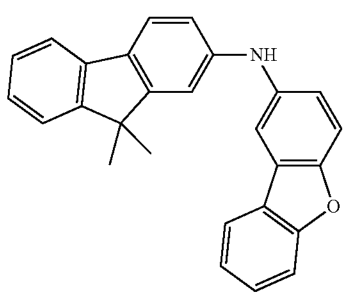
Sub 2-133
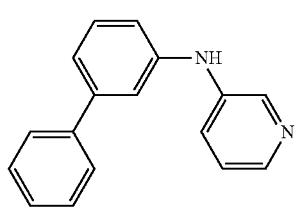
Sub 2-134
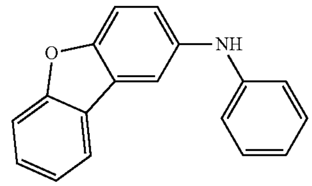
Sub 2-135
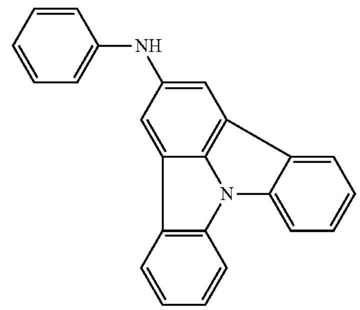
Sub 2-136
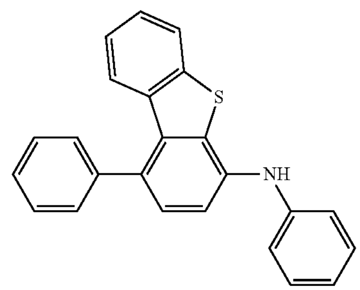
Sub 2-137
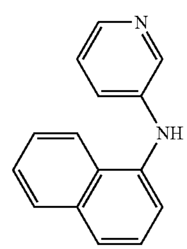
Sub 2-138
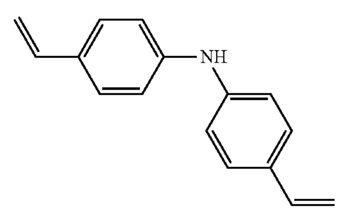
Sub 2-139
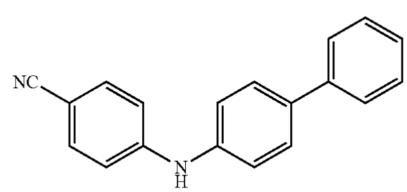
Sub 2-140
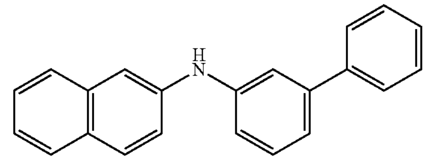

-continued
Sub 2-141
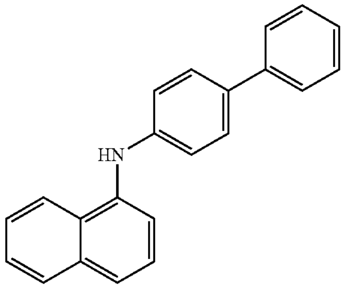
Sub 2-142
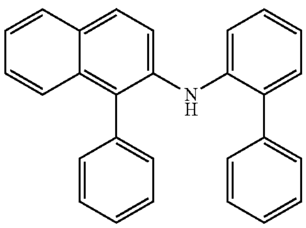
Sub 2-143
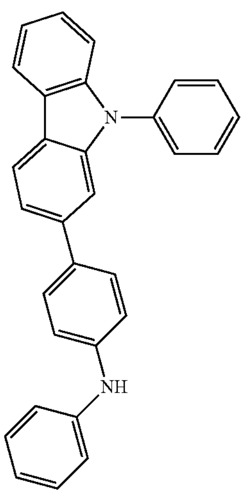
Sub 2-144
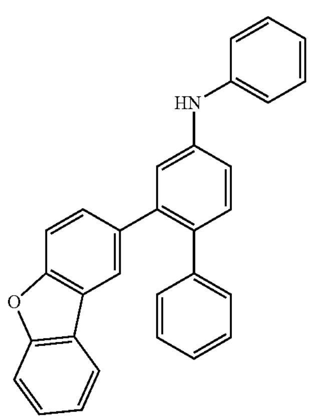
-continued
Sub 2-145
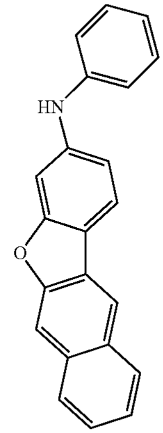
Sub 2-146
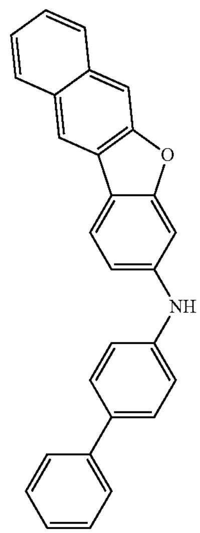
Sub 2-147
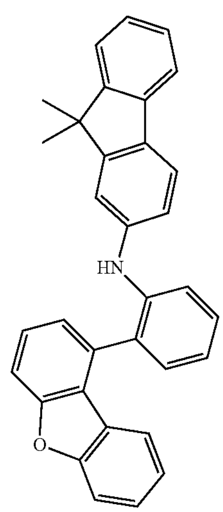

-continued
Sub 2-148
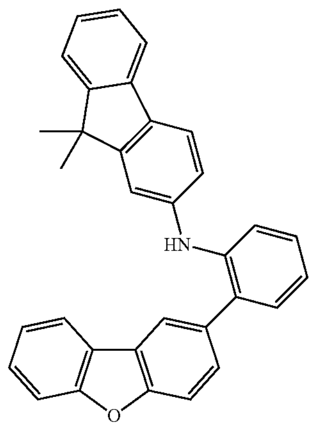
Sub 2-149
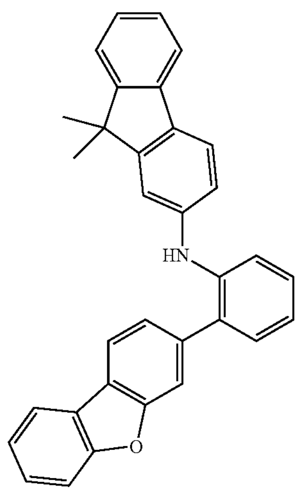
Sub 2-150
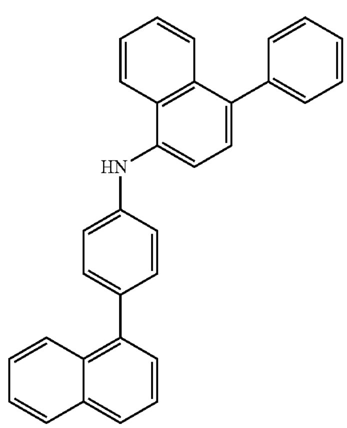
-continued
Sub 2-151
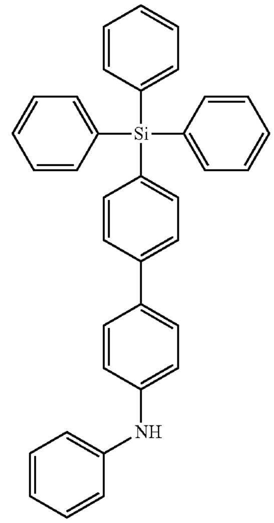
Sub 2-152
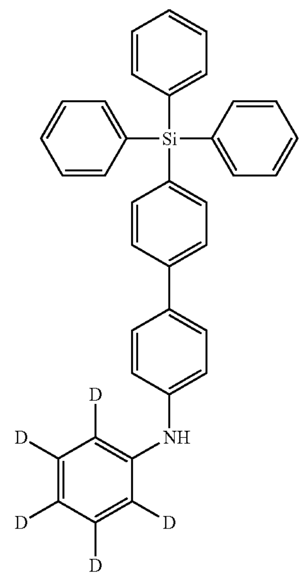
Sub 2-153
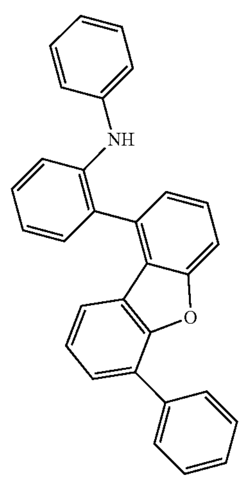

-continued

Sub 2-154

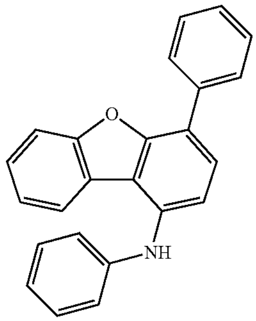

TABLE 10

| Compound | FD-MS | Compound | FD-MS |
|---|---|---|---|
| Sub 2-1 | m/z = 371.17($C_{28}H_{21}N$ = 371.48) | Sub 2-2 | m/z = 397.18($C_{30}H_{23}N$ = 397.52) |
| Sub 2-3 | m/z = 361.18($C_{27}H_{23}N$ = 381.49) | Sub 2-4 | m/z = 410.18($C_{30}H_{22}N_2$ = 410.52) |
| Sub 2-5 | m/z = 349.1($C_{24}H_{15}NO_2$ = 349.39) | Sub 2-6 | m/z = 349.11($C_{24}H_{15}NO_2$ = 349.39) |
| Sub 2-7 | m/z = 375.16($C_{27}H_{21}NO$ = 375.47) | Sub 2-8 | m/z = 375.16($C_{27}H_{21}NO$ = 375.47) |
| Sub 2-9 | m/z = 381.18($C_{27}H_{23}N$ = 361.49) | Sub 2-10 | m/z = 401.21($C_{30}H_{27}N$ = 401.55) |
| Sub 2-11 | m/z = 335.13($C_{24}H_{17}NO$ = 335.41) | Sub 2-12 | m/z = 347.17($C_{26}H_{21}N$ = 347.46) |
| Sub 2-13 | m/z = 526.24($C_{39}H_{30}N_2$ = 526.68) | Sub 2-14 | m/z = 335.13($C_{24}H_{17}NO$ = 335.41) |
| Sub 2-15 | m/z = 411.2($C_{31}H_{25}N$ = 411.55) | Sub 2-16 | m/z = 513.25($C_{39}H_{31}N$ = 513.68) |
| Sub 2-17 | m/z = 473.21($C_{36}H_{27}N$ = 473.62) | Sub 2-18 | m/z = 423.2($C_{32}H_{25}N$ = 423.56) |
| Sub 2-19 | m/z = 345.15($C_{26}H_{19}N$ = 345.45) | Sub 2-20 | m/z = 321.15($C_{24}H_{19}N$ = 321.42) |
| Sub 2-21 | m/z = 401.21($C_{30}H_{27}N$ = 401.55) | Sub 2-22 | m/z = 321.15($C_{24}H_{19}N$ = 321.42) |
| Sub 2-23 | m/z = 345.15($C_{26}H_{19}N$ = 345.45) | Sub 2-24 | m/z = 397.18($C_{30}H_{23}N$ = 397.52) |
| Sub 2-25 | m/z = 447.2($C_{34}H_{25}N$ = 447.58) | Sub 2-26 | m/z = 334.15($C_{24}H_{18}N_2$ = 334.42) |
| Sub 2-27 | m/z = 411.2($C_{31}H_{25}N$ = 411.55) | Sub 2-28 | m/z = 361.18($C_{27}H_{23}N$ = 361.49) |
| Sub 2-29 | m/z = 285.15($C_{21}H_{19}N$ = 285.39) | Sub 2-30 | m/z = 361.18($C_{27}H_{23}N$ = 361.49) |
| Sub 2-31 | m/z = 437.21($C_{33}H_{27}N$ = 437.59) | Sub 2-32 | m/z = 437.21($C_{33}H_{27}N$ = 437.59) |
| Sub 2-33 | m/z = 437.21($C_{33}H_{27}N$ = 437.59) | Sub 2-34 | m/z = 437.21($C_{33}H_{27}N$ = 437.59) |
| Sub 2-35 | m/z = 437.21($C_{33}H_{27}N$ = 437.59) | Sub 2-36 | m/z = 437.21($C_{33}H_{27}N$ = 437.59) |
| Sub 2-37 | m/z = 361.18($C_{27}H_{23}N$ = 361.49) | Sub 2-38 | m/z = 411.16($C_{30}H_2NO$ = 411.50) |
| Sub 2-39 | m/z = 410.18($C_{30}H_{22}N_2$ = 410.52) | Sub 2-40 | m/z = 53.17($C_{36}H_{25}NS$ = 503.66) |
| Sub 2-41 | m/z = 473.21($C_{36}H_{27}N$ = 473.62) | Sub 2-42 | m/z = 411.2($C_{31}H_{25}N$ = 411.55) |
| Sub 2-43 | m/z = 321.15($C_{24}H_{19}N$ = 321.42) | Sub 2-44 | m/z = 401.21($C_{30}H_{27}N$ = 401.55) |
| Sub 2-45 | m/z = 361.18($C_{27}H_{23}N$ = 361.49) | Sub 2-46 | m/z = 499.23($C_{38}H_{29}N$ = 499.66) |
| Sub 2-47 | m/z = 440.13($C_{30}H_{20}N_2S$ = 440.56) | Sub 2-48 | m/z = 411.2($C_{31}H_{25}N$ = 411.55) |
| Sub 2-49 | m/z = 451.19($C_{33}H_{25}NO$ = 451.57) | Sub 2-50 | m/z = 440.19($C_{31}H_{24}N_2O$ = 440.55) |
| Sub 2-51 | m/z = 499.23($C_{38}H_{29}N$ = 499.66) | Sub 2-52 | m/z = 295.14($C_{22}H_{17}N$ = 295.39) |
| Sub 2-53 | m/z = 351.2($C_{26}H_{25}N$ = 351.49) | Sub 2-54 | m/z = 421.18($C_{32}H_{23}N$ = 421.54) |
| Sub 2-55 | m/z = 473.21($C_{36}H_{27}N$ = 473.62) | Sub 2-56 | m/z = 513.25($C_{39}H_{31}N$ = 513.68) |
| Sub 2-57 | m/z = 397.18($C_{30}H_{23}N$ = 397.52) | Sub 2-58 | m/z = 295.14($C_{22}H_{17}N$ = 295.39) |
| Sub 2-59 | m/z = 397.18($C_{30}H_{23}N$ = 397.52) | Sub 2-60 | m/z = 411.2($C_{31}H_{25}N$ = 411.55) |
| Sub 2-61 | m/z = 341.16($C_{23}H_{23}NSi$ = 341.53) | Sub 2-62 | m/z = 245.12($C_{18}H_{15}N$ = 245.33) |
| Sub 2-63 | m/z = 269.12($C_{20}H_{15}N$ = 269.35) | Sub 2-64 | m/z = 459.2($C_{35}H_{25}N$ = 459.59) |
| Sub 2-65 | m/z = 485.21($C_{37}H_{27}N$ = 485.63) | Sub 2-66 | m/z = 483.2($C_{37}H_{25}N$ = 483.61) |
| Sub 2-67 | m/z = 649.28($C_{50}H_{35}N$ = 649.84) | Sub 2-68 | m/z = 319.14($C_{24}H_{17}N$ = 319.41) |
| Sub 2-69 | m/z = 300.17($C_{22}H_{12}D_5N$ = 300.42) | Sub 2-70 | m/z = 485.21($C_{37}H_{27}N$ = 485.63) |
| Sub 2-71 | m/z = 361.18($C_{27}H_{23}N$ = 361.49) | Sub 2-72 | m/z = 219.1($C_{16}H_{13}N$ = 219.29) |
| Sub 2-73 | m/z = 169.09($C_{12}H_{11}N$ = 169.23) | Sub 2-74 | m/z = 345.15($C_{26}H_{19}N$ = 345.45) |
| Sub 2-75 | m/z = 349.18($C_{26}H_{23}N$ = 349.48) | Sub 2-76 | m/z = 421.18($C_{32}H_{23}N$ = 421.54) |
| Sub 2-77 | m/z = 421.18($C_{32}H_{23}N$ = 421.54) | Sub 2-78 | m/z = 411.2($C_{31}H_{25}N$ = 411.55) |
| Sub 2-79 | m/z = 421.18($C_{32}H_{23}N$ = 421.54) | Sub 2-80 | m/z = 437.21($C_{33}H_{27}N$ = 737.59) |
| Sub 2-81 | m/z = 411.2($C_{31}H_{25}N$ = 411.55) | Sub 2-82 | m/z = 361.18($C_{27}H_{23}N$ = 361.49) |
| Sub 2-83 | m/z = 437.21($C_{33}H_{27}N$ = 437.59) | Sub 2-84 | m/z = 361.18($C_{27}H_{23}N$ = 361.49) |
| Sub 2-85 | m/z = 407.17($C_{31}H_{21}N$ = 407.52) | Sub 2-86 | m/z = 645.25($C_{50}H_{31}N$ = 645.81) |
| Sub 2-87 | m/z = 295.14($C_{22}H_{17}N$ = 295.39) | Sub 2-88 | m/z = 326.18($C_{24}H_{14}D_5N$ = 326.45) |
| Sub 2-89 | m/z = 371.17($C_{28}H_{21}N$ = 371.48) | Sub 2-90 | m/z = 421.18($C_{32}H_{23}N$ = 421.54) |
| Sub 2-91 | m/z = 269.12($C_{20}H_{15}N$ = 269.35) | Sub 2-92 | m/z = 411.2($C_{31}H_{25}N$ = 411.55) |
| Sub 2-93 | m/z = 411.2($C_{31}H_{25}N$ = 411.55) | Sub 2-94 | m/z = 483.2($C_{37}H_{25}N$ = 483.61) |
| Sub 2-95 | m/z = 219.1($C_{16}H_{13}N$ = 219.29) | Sub 2-96 | m/z = 295.14($C_{22}H_{17}N$ = 295.39) |
| Sub 2-97 | m/z = 335.17($C_{25}H_{21}N$ = 335.45) | Sub 2-98 | m/z = 335.17($C_{25}H_{21}N$ = 335.45) |
| Sub 2-99 | m/z = 375.2($C_{28}H_{25}N$ = 375.52) | Sub 2-100 | m/z = 366.21($C_{27}H_{18}D_5N$ = 366.52) |
| Sub 2-101 | m/z = 411.2($C_{31}H_{25}N$ = 411.55) | Sub 2-102 | m/z = 411.2($C_{31}H_{25}N$ = 411.55) |
| Sub 2-103 | m/z = 409.18($C_{31}H_{23}N$ = 409.53) | Sub 2-104 | m/z = 361.18($C_{27}H_{23}N$ = 361.49) |
| Sub 2-105 | m/z = 275.08($C_{18}H_{13}NS$ = 275.37) | Sub 2-106 | m/z = 335.13($C_{24}H_{17}NO$ = 335.41) |
| Sub 2-107 | m/z = 411.16($C_{30}H_{21}NO$ = 411.50) | Sub 2-108 | m/z = 411.16($C_{30}H_{21}NO$ = 411.50) |
| Sub 2-109 | m/z = 501.17($C_{36}H_{23}NO_2$ = 501.59) | Sub 2-110 | m/z = 335.17($C_{25}H_{21}N$ = 335.45) |
| Sub 2-111 | m/z = 351.11($C_{24}H_{17}NS$ = 351.47) | Sub 2-112 | m/z = 375.16($C_{27}H_{21}NO$ = 375.47) |
| Sub 2-113 | m/z = 220.1($C_{15}H_{12}N_2$ = 220.28) | Sub 2-114 | m/z = 437.21($C_{33}H_{27}N$ = 437.59) |

TABLE 10-continued

| Compound | FD-MS | Compound | FD-MS |
|---|---|---|---|
| Sub 2-115 | m/z = 486.21($C_{36}H_{26}N_2$ = 486.62) | Sub 2-116 | m/z = 325.09($C_{22}H_{15}NS$ = 325.43) |
| Sub 2-117 | m/z = 259.1($C_{18}H_{13}NO$ = 259.31) | Sub 2-118 | m/z = 411.16($C_{30}H_{21}NO$ = 411.50) |
| Sub 2-119 | m/z = 351.11($C_{24}H_{17}NS$ = 351.47) | Sub 2-120 | m/z = 297.15($C_{22}H_{19}N$ = 297.40) |
| Sub 2-121 | m/z = 457.18($C_{35}H_{23}N$ = 457.86) | Sub 2-122 | m/z = 334.15($C_{24}H_{18}N_2$ = 334.42) |
| Sub 2-123 | m/z = 295.14($C_{22}H_{17}N$ = 295.39) | Sub 2-124 | m/z = 486.21($C_{36}H_{26}N_2$ = 486.62) |
| Sub 2-125 | m/z = 451.18($C_{34}H_{23}NO$ = 461.56) | Sub 2-126 | m/z = 331.21($C_{24}H9D_{10}N$ = 331.48) |
| Sub 2-127 | m/z = 376.19($C_{27}H_{24}N_2$ = 376.50) | Sub 2-128 | m/z = 411.16($C_{30}H_{21}NO$ = 411.50) |
| Sub 2-129 | m/z = 365.09($C_{24}H_{15}NOS$ = 365.45) | Sub 2-130 | m/z = 385.18($C_{29}H_{23}N$ = 385.51) |
| Sub 2-131 | m/z = 486.21($C_{36}H_{26}N_2$ = 486.62) | Sub 2-132 | m/z = 375.16($C_{27}H_{21}NO$ = 375.47) |
| Sub 2-133 | m/z = 246.12($C_{17}H_{14}N_2$ = 246.31) | Sub 2-134 | m/z = 259.1($C_{18}H_{13}NO$ = 25931 |
| Sub 2-135 | m/z = 332.13($C_{24}H_{16}N_2$ = 332.41) | Sub 2-136 | m/z = 351.11($C_{24}H_{17}NS$ = 351.47) |
| Sub 2-137 | m/z = 220.1($C_{15}H_{12}N_2$ = 220.28) | Sub 2-138 | m/z = 221.12($C_{16}H_{15}N$ = 221.30) |
| Sub 2-139 | m/z = 270.12($C_{19}H_{14}N_2$ = 270.34) | Sub 2-140 | m/z = 295.14($C_{22}H_{17}N$ = 295.39) |
| Sub 2-141 | m/z = 295.14($C_{22}H_{17}N$ = 295.39) | Sub 2-142 | m/z = 371.17($C_{28}H_{21}N$ = 371.48) |
| Sub 2-143 | m/z = 410.18($C_{30}H_{22}N_2$ = 410.52) | Sub 2-144 | m/z = 411.16($C_{30}H_{21}NO$ = 411.5) |
| Sub 2-145 | m/z = 309.12($C_{22}H_{15}NO$ = 309.37) | Sub 2-146 | m/z = 385.15($C_{28}H_{19}NO$ = 385.47) |
| Sub 2-147 | m/z = 451.19($C_{33}H_{25}NO$ = 451.57) | Sub 2-148 | m/z = 451.19($C_{33}H_{25}NO$ = 451.57) |
| Sub 2-149 | m/z = 451.19($C_{33}H_{25}NO$ = 451.57) | Sub 2-150 | m/z = 421.18($C_{32}H_{23}N$ = 421.54) |
| Sub 2-151 | m/z = 503.21($C_{36}H_{29}NSi$ = 503.72) | Sub 2-152 | m/z = 508.24($C_{36}H_{24}D_5NSi$ = 508.75) |
| Sub 2-153 | m/z = 411.16($C_{30}H_{21}NO$ = 411.5) | Sub 2-154 | m/z = 335.13($C_{24}H_{17}NO$ = 335.41) |

III. Synthesis of Final Product

1. Example of Synthesis of P1-4

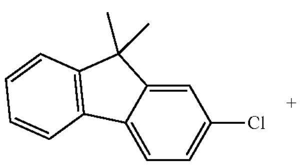

Sub 1-2

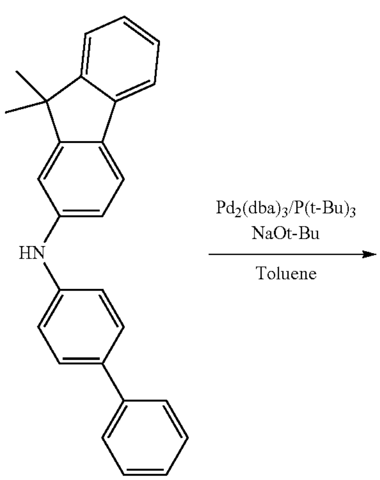

Sub 2-3

-continued

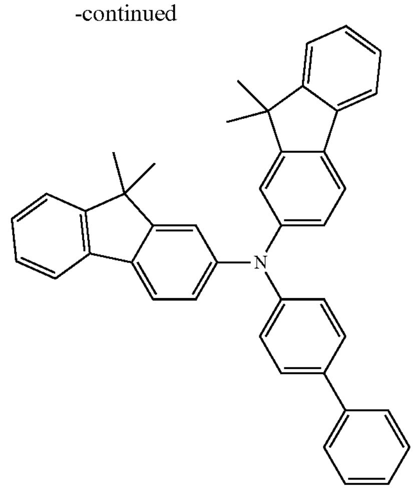

P1-4

Sub 1-2 (10.0 g, 43.7 mmol), Sub 2-3 (15.8 g, 43.7 mmol), $Pd_2(dba)_3$ (1.2 g, 1.3 mmol), $P(t\text{-}Bu)_3$ (0.5 g, 2.6 mmol), NaOt-Bu (8.4 g, 87.4 mmol), and toluene (219 ml) were added to a round bottom flask, and then an experiment was performed in the same manner as Sub 2-73, thereby creating a product in an amount of 17.4 g (yield: 72%).

2. Example of Synthesis of P2-13

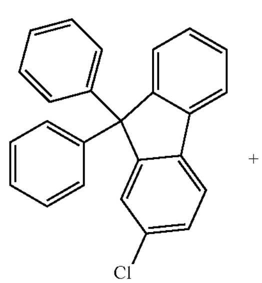

Sub 1-9

-continued

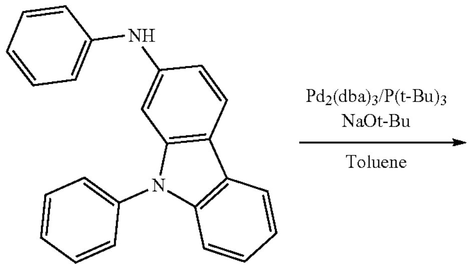

Sub 2-26

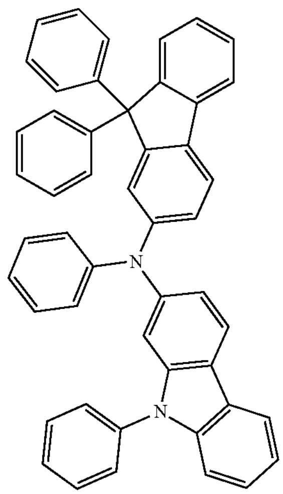

P2-13

Sub 1-9 (10.0 g, 28.3 mmol), Sub 2-26 (9.5 g, 28.3 mmol), $Pd_2(dba)_3$ (0.8 g, 0.9 mmol), $P(t\text{-}Bu)_3$ (0.3 g, 1.7 mmol), NaOt-Bu (5.4 g, 56.7 mmol), and toluene (142 ml) were added to a round bottom flask, and then an experiment was performed in the same manner as Sub 2-73, thereby creating a product in an amount of 13.9 g (yield: 75).

3. Example of Synthesis of P3-15

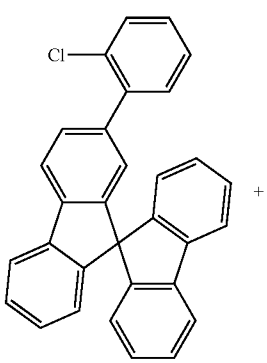

Sub 1-31

-continued

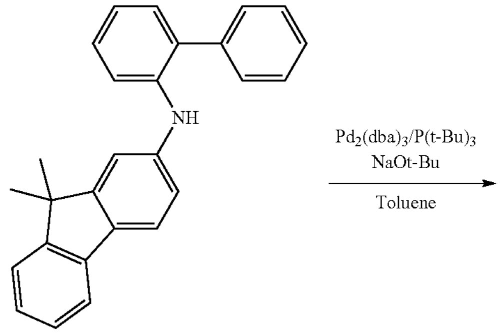

Sub 2-82

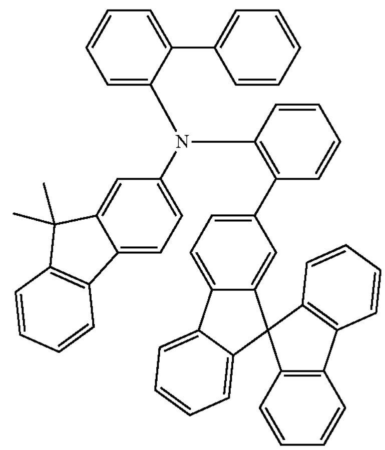

P3-15

Sub 1-31 (10.0 g, 23.4 mmol), Sub 2-82 (8.5 g, 23.4 mmol), $Pd_2(dba)_3$ (0.6 g, 0.7 mmol), $P(t\text{-}Bu)_3$ (0.3 g, 1.4 mmol), NaOt-Bu (4.5 g, 46.8 mmol), and toluene (117 ml) were added to a round bottom flask, and then an experiment was performed in the same manner as Sub 2-73, thereby creating a product in an amount of 12.2 g (yield: 69%).

4. Example of Synthesis of P4-21

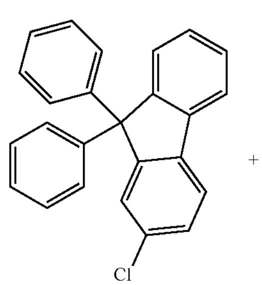

Sub 1-9

-continued

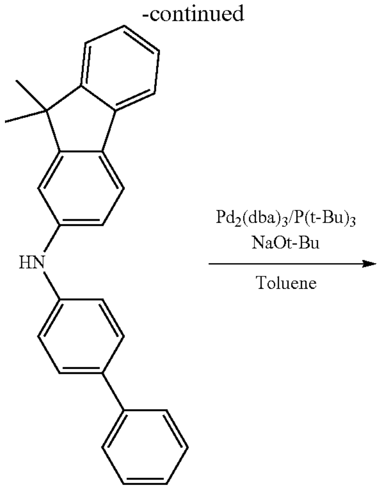

Sub 2-3

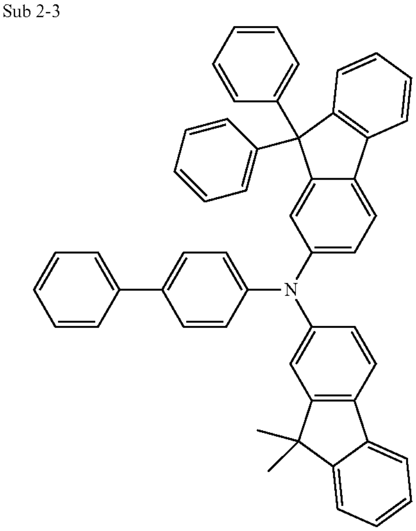

P4-21

Sub 1-9 (10.0 g, 28.3 mmol), Sub 2-3 (10.2 g, 28.3 mmol), $Pd_2(dba)_3$ (0.8 g, 0.9 mmol), $P(t\text{-}Bu)_3$ (0.3 g, 1.7 mmol), NaOt-Bu (5.4 g, 56.7 mmol), and toluene (142 ml) were added to a round bottom flask, and then an experiment was performed in the same manner as Sub 2-73, thereby creating a product in an amount of 13.7 g (yield: 72%).

5. Example of Synthesis of P5-38

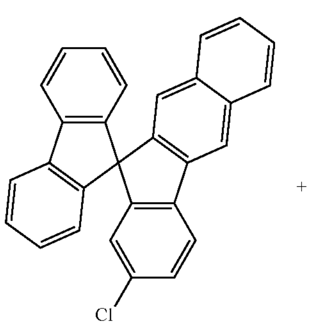

Sub 1-63

-continued

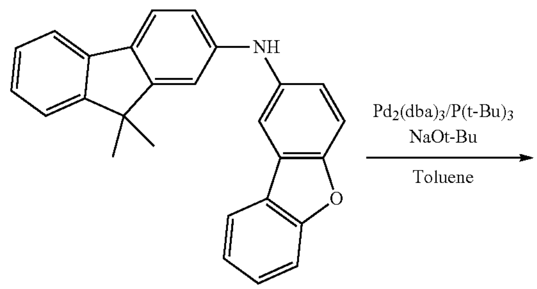

Sub 2-112

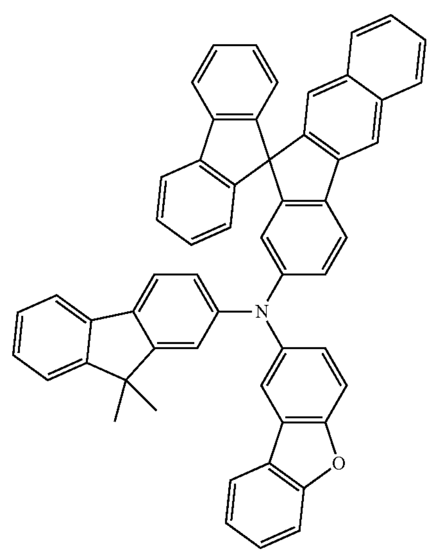

P5-38

Sub 1-63 (10.0 g, 24.9 mmol), Sub 2-112 (9.4 g, 24.9 mmol), $Pd_2(dba)_3$ (0.7 g, 0.8 mmol), $P(t\text{-}Bu)_3$ (0.3 g, 1.5 mmol), NaOt-Bu (4.8 g, 49.9 mmol), and toluene (125 ml) were added to a round bottom flask, and then an experiment was performed in the same manner as Sub 2-73, thereby creating a product in an amount of 13.1 g (yield: 70%).

6. Example of Synthesis of P6-9

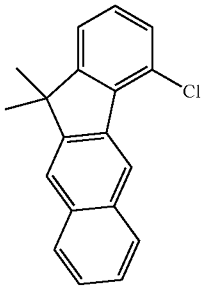

Sub 1-113

+

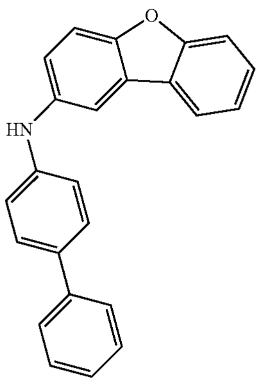

Sub 2-106

$Pd_2(dba)_3/P(t\text{-}Bu)_3$
NaOt-Bu
→
Toluene

-continued

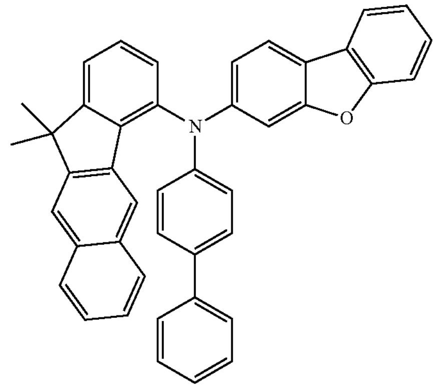

P6-9

Sub 1-113 (10.0 g, 35.9 mmol), Sub 2-106 (12.0 g, 35.9 mmol), $Pd_2(dba)_3$ (1.0 g, 1.1 mmol), $P(t\text{-}Bu)_3$ (0.4 g, 2.2 mmol), NaOt-Bu (6.9 g, 71.7 mmol), and toluene (179 ml) were added to a round bottom flask, and then an experiment was performed in the same manner as Sub 2-73, thereby creating a product in an amount of 15.7 g (yield: 76%).

The FD-MS values of the compounds prepared by the above-described synthesis examples of according to the present disclosure are illustrated in Table 11.

TABLE 11

| Compound | FD-MS | Compound | FD-MS |
|---|---|---|---|
| P1-1 | m/z = 701.31($C_{54}H_{39}N$ = 701.91) | P1-2 | m/z = 563.26($C_{43}H_{33}N$ = 563.74) |
| P1-3 | m/z = 651.29($C_{50}H_{37}N$ = 651.85) | P1-4 | m/z = 553.28($C_{42}H_{35}N$ = 553.75) |
| P1-5 | m/z = 553.28($C_{42}H_{35}N$ = 553.75) | P1-6 | m/z = 602.27($C_{45}H_{34}N_2$ = 602.78) |
| P1-7 | m/z = 541.2($C_{39}H_{27}NO_2$ = 541.65) | P1-8 | m/z = 541.2($C_{39}H_{27}NO_2$ = 541.65) |
| P1-9 | m/z = 567.26($C_{42}H3NO$ = 567.73) | P1-10 | m/z = 567.26($C_{42}H_{33}NO$ = 567.73) |
| P1-11 | m/z = 553.28($C_{42}H_{35}N$ = 553.75) | P1-12 | m/z = 593.31($C_{45}H_{39}N$ = 593.81) |
| P1-13 | m/z = 527.22($C_{39}H_{29}NO$ = 527.67) | P1-14 | m/z = 601.28($C_{46}H_{35}N$ = 601.79) |
| P1-15 | m/z = 718.33($C_{54}H_{42}N_2$ = 718.94) | P1-16 | m/z = 679.29($C_{51}H_{37}NO$ = 679.86) |
| P1-17 | m/z = 603.29($C_{46}H_{37}N$ = 603.81) | P1-18 | m/z = 705.34($C_{54}H_{43}N$ = 705.95) |
| P1-19 | m/z = 727.32($C_{56}H_{41}N$ = 727.95) | P1-20 | m/z = 615.29($C_{47}H_{37}N$ = 615.82) |
| P2-1 | m/z = 661.28($C_{51}H_{35}N$ = 661.85) | P2-2 | m/z = 637.28($C_{49}H_{35}N$ = 637.83) |
| P2-2 | m/z = 677.31($C_{52}H_{39}N$ = 677.89) | P2-4 | m/z = 717.34($C_{55}H_{43}N$ = 717.96) |
| P2-3 | m/z = 717.34($C_{55}H_{43}N$ = 717.96) | P2-6 | m/z = 637.28($C_{49}H_{35}N$ = 637.83) |
| P2-4 | m/z = 637.28($C_{49}H_{35}N$ = 637.83) | P2-8 | m/z = 599.26($C_{46}H3N$ = 599.78) |
| P2-5 | m/z = 651.29($C_{50}H_{37}N$ = 651.85) | P2-10 | m/z = 701.31($C_{54}H_{39}N$ = 701.91) |
| P2-6 | m/z = 651.26($C_{49}H_{33}NO$ = 651.81) | P2-12 | m/z = 665.24($C_{49}H_{31}NO_2$ = 665.79) |
| P2-7 | m/z = 650.27($C_{49}H_{34}N_2$ = 650.83) | P2-14 | m/z = 727.32($C_{56}H_{41}N$ = 727.95) |
| P2-8 | m/z = 677.31($C_{52}H_{39}N$ = 677.89) | P2-16 | m/z = 677.31($C_{52}H_{39}N$ = 677.89) |
| P2-9 | m/z = 753.34($C_{58}H_{43}N$ = 753.99) | P2-18 | m/z = 753.34($C_{58}H_{43}N$ = 753.99) |
| P2-10 | m/z = 753.34($C_{58}H_{43}N$ = 753.99) | P2-20 | m/z = 753.34($C_{58}H_{43}N$ = 753.99) |
| P2-11 | m/z = 753.34($C_{58}H_{43}N$ = 753.99) | P2-22 | m/z = 753.34($C_{58}H_{43}N$ = 753.99) |
| P2-12 | m/z = 753.34($C_{58}H_{43}N$ = 753.99) | P2-24 | m/z = 753.34($C_{58}H_{43}N$ = 753.99) |
| P2-13 | m/z = 753.34($C_{58}H_{43}N$ = 753.99) | P2-26 | m/z = 753.34($C_{58}H_{43}N$ = 753.99) |
| P2-14 | m/z = 753.34($C_{58}H_{43}N$ = 753.99) | P2-28 | m/z = 753.34($C_{58}H_{43}N$ = 753.99) |
| P2-15 | m/z = 753.34($C_{58}H_{43}N$ = 753.99) | P2-30 | m/z = 753.34($C_{58}H_{43}N$ = 753.99) |
| P2-16 | m/z = 753.34($C_{58}H_{43}N$ = 753.99) | P2-32 | m/z = 753.34($C_{58}H_{43}N$ = 753.99) |
| P2-17 | m/z = 753.34($C_{58}H_{43}N$ = 753.99) | P2-34 | m/z = 753.34($C_{58}H_{43}N$ = 753.99) |
| P2-18 | m/z = 753.34($C_{58}H_{43}N$ = 753.99) | P2-36 | m/z = 665.27($C_{50}H_{35}NO$ = 665.84) |
| P2-19 | m/z = 714.3($C_{54}H_{38}N_2$ = 714.91) | P2-38 | m/z = 819.3($C_{61}H_{41}NS$ = 820.07) |
| P2-20 | m/z = 839.36($C_{65}H_{45}N$ = 840.08) | P2-40 | m/z = 853.37($C_{66}H_{47}N$ = 854.11) |
| P3-1 | m/z = 635.26($C_{49}H_{33}N$ = 635.81) | P3-2 | m/z = 675.29($C_{52}H_{37}N$ = 675.88) |
| P3-3 | m/z = 715.32($C_{55}H_{41}N$ = 715.94) | P3-4 | m/z = 715.32($C_{55}H_{41}N$ = 715.94) |
| P3-5 | m/z = 689.27($C_{52}H_{35}NO$ = 689.86) | P3-6 | m/z = 663.22($C_{49}H_{29}NO_2$ = 663.78) |
| P3-7 | m/z = 649.24($C_{49}H_{31}NO$ = 649.79) | P3-8 | m/z = 675.29($C_{52}H_{37}N$ = 675.88) |
| P3-9 | m/z = 813.34($C_{63}H_{43}N$ = 814.04) | P3-10 | m/z = 830.28($C_{61}H_{38}N_2S$ = 831.05) |
| P3-11 | m/z = 725.31($C_{56}H_{39}N$ = 725.94) | P3-12 | m/z = 725.31($C_{56}H_{39}N$ = 725.94) |

TABLE 11-continued

| Compound | FD-MS | Compound | FD-MS |
|---|---|---|---|
| P3-13 | m/z = 765.3($C_{58}H_{39}NO$ = 765.96) | P3-14 | m/z = 751.32($C_{58}H_{41}N$ = 751.97) |
| P3-15 | m/z = 751.32($C_{58}H_{41}N$ = 751.97) | P3-16 | m/z = 751.32($C_{58}H_{41}N$ = 751.97) |
| P3-17 | m/z = 751.32($C_{58}H_{41}N$ = 751.97) | P3-18 | m/z = 751.32($C_{58}H_{41}N$ = 751.97) |
| P3-19 | m/z = 751.32($C_{58}H_{41}N$ = 751.97) | P3-20 | m/z = 751.32($C_{58}H_{41}N$ = 751.97) |
| P3-21 | m/z = 751.32($C_{58}H_{41}N$ = 751.97) | P3-22 | m/z = 751.32($C_{58}H_{41}N$ = 751.97) |
| P3-23 | m/z = 751.32($C_{58}H_{41}N$ = 751.97) | P3-24 | m/z = 751.32($C_{58}H_{41}N$ = 751.97) |
| P3-25 | m/z = 675.29($C_{52}H_{37}N$ = 675.88) | P3-26 | m/z = 751.32($C_{58}H_{41}N$ = 751.97) |
| P3-27 | m/z = 804.31($C_{60}H_{40}N_2O$ = 804.99) | P3-28 | m/z = 863.36($C_{67}H_{45}N$ = 864.10) |
| P3-29 | m/z = 677.25($C_{51}H_{32}FN$ = 677.82) | P3-30 | m/z = 765.34($C_{59}H_{43}N$ = 766.00) |
| P4-1 | m/z = 513.25($C_{39}H_{31}N$ = 513.68) | P4-2 | m/z = 613.28($C_{47}H_{35}N$ = 613.80) |
| P4-3 | m/z = 665.31($C_{51}H_{39}N$ = 665.88) | P4-4 | m/z = 705.34($C_{54}H_{43}N$ = 705.95) |
| P4-5 | m/z = 593.31($C_{45}H_{39}N$ = 593.81) | P4-6 | m/z = 589.28($C_{45}H_{35}N$ = 589.78) |
| P4-7 | m/z = 513.25($C_{39}H_{31}N$ = 513.68) | P4-8 | m/z = 639.29($C_{49}H_{37}N$ = 639.84) |
| P4-9 | m/z = 589.28($C_{45}H_{35}N$ = 589.78) | P4-10 | m/z = 665.31($C_{31}H_{39}N$ = 665.88) |
| P4-11 | m/z = 553.28($C_{42}H_{35}N$ = 553.75) | P4-12 | m/z = 669.34($C_{51}H_{43}N$ = 669.91) |
| P4-13 | m/z = 779.36($C_{60}H_{45}N$ = 780.03) | P4-14 | m/z = 761.35($C_{56}H_{47}NSi$ = 762.08) |
| P4-15 | m/z = 705.34($C_{54}H_{43}N$ = 705.95) | P4-16 | m/z = 589.28($C_{45}H_{35}N$ = 589.78) |
| P4-17 | m/z = 665.31($C_{51}H_{39}N$ = 665.88) | P4-18 | m/z = 661.28($C_{51}H_{35}N$ = 661.85) |
| P4-19 | m/z = 637.28($C_{49}H_{35}N$ = 637.83) | P4-20 | m/z = 789.34($C_{61}H_{43}N$ = 790.02) |
| P4-21 | m/z = 677.31($C_{52}H_{39}N$ = 677.89) | P4-22 | m/z = 775.32($C_{60}H_{41}N$ = 776.00) |
| P4-23 | m/z = 801.34($C_{62}H_{43}N$ = 802.03) | P4-24 | m/z = 799.32($C_{62}H_{41}N$ = 800.02) |
| P4-25 | m/z = 965.4($C_{75}H_{51}N$ = 966.24) | P4-26 | m/z = 637.28($C_{49}H_{35}N$ = 637.83) |
| P4-27 | m/z = 635.26($C_{49}H_{33}N$ = 635.81) | P4-28 | m/z = 616.29($C_{47}H_{28}D_5N$ = 616.82) |
| P4-29 | m/z = 727.32($C_{56}H_{41}N$ = 727.95) | P4-30 | m/z = 687.29($C_{53}H_{37}N$ = 687.89) |
| P4-31 | m/z = 877.37($C_{68}H_{47}N$ = 878.13) | P4-32 | m/z = 753.34($C_{58}H_{43}N$ = 753.99) |
| P4-33 | m/z = 689.31($C_{53}H_{39}N$ = 689.90) | P4-34 | m/z = 637.28($C_{49}H_{35}N$ = 637.83) |
| P4-35 | m/z = 849.32($C_{63}H_{41}F2N$ = 850.02) | P4-36 | m/z = 559.23($C_{43}H_{29}N$ = 559.71) |
| P4-37 | m/z = 635.26($C_{49}H_{33}N$ = 635.81) | P4-38 | m/z = 663.29($C_{51}H_{37}N$ = 663.86) |
| P4-39 | m/z = 735.29($C_{57}H_{37}N$ = 735.93) | P4-40 | m/z = 735.29($C_{57}H_{37}N$ = 735.93) |
| P4-41 | m/z = 725.31($C_{36}H_{39}N$ = 725.94) | P4-42 | m/z = 735.29($C_{57}H_{37}N$ = 735.93) |
| P4-43 | m/z = 751.32($C_{58}H_{41}N$ = 751.97) | P4-44 | m/z = 725.31($C_{36}H_{39}N$ = 725.94) |
| P4-45 | m/z = 675.29($C_{52}H_{37}N$ = 675.88) | P4-46 | m/z = 675.29($C_{52}H_{37}N$ = 675.88) |
| P4-47 | m/z = 751.32($C_{58}H_{41}N$ = 751.97) | P4-48 | m/z = 675.29($C_{52}H_{37}N$ = 675.88) |
| P4-49 | m/z = 721.28($C_{56}H_{35}N$ = 721.9) | P4-50 | m/z = 797.31($C_{62}H_{39}N$ = 798.00) |
| P4-51 | m/z = 959.36($C_{75}H_{45}N$ = 960.19) | P4-52 | m/z = 609.25($C_{47}H_{31}N$ = 609.77) |
| P4-53 | m/z = 675.29($C_{52}H_{37}N$ = 675.88) | P4-54 | m/z = 635.26($C_{19}H_{33}N$ = 635.81) |
| P4-55 | m/z = 640.29($C_{49}H_{28}D_5N$ = 640.84) | P4-56 | m/z = 685.28($C_{53}H_{35}N$ = 685.87) |
| P4-57 | m/z = 735.29($C_{57}H_{37}N$ = 735.93) | P4-58 | m/z = 583.23($C_{45}H_{29}N$ = 583.73) |
| P4-59 | m/z = 725.31($C_{56}H_{39}N$ = 725.94) | P4-60 | m/z = 725.31($C_{56}H_{39}N$ = 725.94) |
| P4-61 | m/z = 635.26($C_{49}H_{33}N$ = 635.81) | P4-62 | m/z = 751.32($C_{58}H_{41}N$ = 751.97) |
| P4-63 | m/z = 751.32($C_{58}H_{41}N$ = 751.97) | P4-64 | m/z = 751.32($C_{59}H_{41}N$ = 751.97) |
| P4-65 | m/z = 751.32($C_{58}H_{41}N$ = 751.97) | P4-66 | m/z = 751.32($C_{58}H_{41}N$ = 751.97) |
| P4-67 | m/z = 873.34($C_{68}H_{43}N$ = 874.10) | P4-68 | m/z = 711.29($C_{55}H_{37}N$ = 711.91) |
| P4-69 | m/z = 751.32($C_{58}H_{41}N$ = 751.97) | P4-70 | m/z = 787.32($C_{61}H_{41}N$ = 788.01) |
| P5-1 | m/z = 583.23($C_{25}H_{29}N$ = 583.73) | P5-2 | m/z = 609.25($C_{47}H_{31}N$ = 609.77) |
| P5-3 | m/z = 685.28($C_{53}H_{35}N$ = 685.87) | P5-4 | m/z = 659.26($C_{51}H3N$ = 659.83) |
| P5-5 | m/z = 609.25($C_{47}H_{31}N$ = 609.77) | P5-6 | m/z = 685.28($C_{33}H_{35}N$ = 685.87) |
| P5-7 | m/z = 664.29($C_{51}H_{28}D_5N$ = 664.86) | P5-8 | m/z = 649.28($C_{50}H_{35}N$ = 649.84) |
| P5-9 | m/z = 649.28($C_{50}H_{35}N$ = 649.84) | P5-10 | m/z = 699.29($C_{54}H_{37}N$ = 699.90) |
| P5-11 | m/z = 725.31($C_{56}H_{39}N$ = 725.94) | P5-12 | m/z = 739.32($C_{57}H1N$ = 739.96) |
| P5-13 | m/z = 730.34($C_{56}H_{34}D_5N$ = 730.97) | P5-14 | m/z = 775.32($C6H_{41}N$ = 776.00) |
| P5-15 | m/z = 775.32($C_{60}H_{41}N$ = 776.00) | P5-16 | m/z = 775.32($C_{60}H_{41}N$ = 776.00) |
| P5-17 | m/z = 725.31($C_{56}H_{39}N$ = 725.94) | P5-18 | m/z = 773.31($C_{60}H_{39}N$ = 773.98) |
| P5-19 | m/z = 725.31($C_{56}H_{39}N$ = 725.94) | P5-20 | m/z = 774.3($C_{59}H_{38}N_2$ = 774.97) |
| P5-21 | m/z = 639.2($C_{47}H_{29}NS$ = 639.82) | P5-22 | m/z = 699.26($C_{53}H_{33}NO$ = 699.85) |
| P5-23 | m/z = 775.29($C_{59}H_{37}NO$ = 775.95) | P5-24 | m/z = 775.29($C_{59}H_{37}NO$ = 775.95) |
| P5-25 | m/z = 865.3($C_{65}H_{39}NO_2$ = 866.03) | P5-26 | m/z = 583.23($C_{45}H_{29}N$ = 583.73) |
| P5-27 | m/z = 685.28($C_{53}H_{35}N$ = 685.87) | P5-28 | m/z = 649.28($C_{50}H_{35}N$ = 649.84) |
| P5-29 | m/z = 699.29($C_{54}H_{37}N$ = 699.90) | P5-30 | m/z = 725.31($C_{56}H_{39}N$ = 725.94) |
| P5-31 | m/z = 725.31($C_{56}H_{39}N$ = 725.94) | P5-32 | m/z = 775.32($C6H_{41}N$ = 776.00) |
| P5-33 | m/z = 775.32($C_{60}H_{41}N$ = 776.00) | P5-34 | m/z = 775.32($C_{60}H_{41}N$ = 776.00) |
| P5-35 | m/z = 699.29($C_{54}H_{37}N$ = 699.90) | P5-36 | m/z = 773.31($C_{60}H_{39}N$ = 773.98) |
| P5-37 | m/z = 715.23($C_{53}H_{33}NS$ = 715.91) | P5-38 | m/z = 739.29($C_{56}H_{37}NO$ = 739.92) |
| P5-39 | m/z = 699.26($C_{53}H_{33}NO$ = 699.85) | P5-40 | m/z = 661.25($C_{49}H_{31}N_3$ = 661.81) |
| P5-41 | m/z = 685.28($C_{53}H_{35}N$ = 685.87) | P5-42 | m/z = 685.28($C_{53}H_{35}N$ = 685.87) |
| P5-43 | m/z = 633.25($C_{49}H_{31}N$ = 633.79) | P5-44 | m/z = 649.28($C_{50}H_{35}N$ = 649.84) |
| P5-45 | m/z = 725.31($C_{56}H_{39}N$ = 725.94) | P5-46 | m/z = 725.31($C_{56}H_{39}N$ = 725.94) |
| P5-47 | m/z = 801.34($C_{62}H_{43}N$ = 802.03) | P5-48 | m/z = 725.31($C_{66}H_{39}N$ = 725.94) |
| P5-49 | m/z = 849.34($C_{66}H_{43}N$ = 850.08) | P5-50 | m/z = 850.33($C_{65}H_{42}N_2$ = 851.07) |
| P5-51 | m/z = 689.22($C_{51}H_{31}NS$ = 689.88) | P5-52 | m/z = 623.22($C_{17}H_{29}NO$ = 623.76) |
| P5-53 | m/z = 775.29(59$H_{37}NO$ = 775.95) | P5-54 | m/z = 699.26($C_{53}H_{33}NO$ = 699.85) |
| P5-55 | m/z = 715.23($C_{53}H_{33}NS$ = 715.91) | P5-56 | m/z = 690.31($C_{53}H_{30}D_5N$ = 690.90) |
| P5-57 | m/z = 787.32($C_{61}H_{41}N$ = 788.01) | P5-58 | m/z = 699.29($C_{54}H_{37}N$ = 699.90) |
| P5-59 | m/z = 725.31($C_{36}H_{39}N$ = 725.94) | P5-60 | m/z = 715.23($C_{33}H_{33}NS$ = 715.91) |
| P5-61 | m/z = 633.25($C_{49}H_{31}N$ = 633.79) | P5-62 | m/z = 583.23($C_{45}H_{29}N$ = 583.73) |
| P5-63 | m/z = 865.33($C_{66}H_{43}NO$ = 866.08) | P5-64 | m/z = 821.31($C_{64}H_{39}N$ = 822.02) |
| P5-65 | m/z = 698.27($C_{53}H_{34}N_2$ = 698.87) | P5-66 | m/z = 659.26($C_{51}H_{33}N$ = 659.83) |
| P5-67 | m/z = 649.28($C_{50}H_{35}N$ = 649.84) | P5-68 | m/z = 849.34($C_{65}H_{43}N$ = 850.08) |

TABLE 11-continued

| Compound | FD-MS | Compound | FD-MS |
|---|---|---|---|
| P5-69 | m/z = 850.33($C_{65}H_{42}N_2$ = 851.07) | P5-70 | m/z = 825.3($C_{63}H_{39}NO$ = 826.01) |
| P5-71 | m/z = 583.23($C_{45}H_{29}N$ = 583.73) | P5-72 | m/z = 685.28($C_{53}H_{35}N$ = 685.87) |
| P5-73 | m/z = 695.34($C_{53}H_{25}D_{10}N$ = 695.93) | P5-74 | m/z = 699.29($C_{54}H_{37}N$ = 699.90) |
| P5-75 | m/z = 725.31($C_{36}H_{39}N$ = 725.94) | P5-76 | m/z = 775.32($C_{60}H_{41}N$ = 776.00) |
| P5-77 | m/z = 725.31($C_{56}H_{39}N$ = 725.94) | P5-78 | m/z = 849.34($C_{66}H_{43}N$ = 850.08) |
| P5-79 | m/z = 765.31($C_{57}H_{39}N_3$ = 765.96) | P5-80 | m/z = 775.29($C_{59}H_{37}NO$ = 775.95) |
| P5-81 | m/z = 685.28($C_{33}H_{35}N$ = 685.87) | P5-82 | m/z = 609.25($C_{47}H_{31}N$ = 609.77) |
| P5-83 | m/z = 785.31($C_{61}H_{39}N$ = 785.99) | P5-84 | m/z = 725.31($C_{56}H_{39}N$ = 725.94) |
| P5-85 | m/z = 729.21($C_{53}H_{31}NOS$ = 729.90) | P5-86 | m/z = 583.23($C_{45}H_{29}N$ = 583.73) |
| P5-87 | m/z = 685.28($C_{53}H_{35}N$ = 685.87) | P5-88 | m/z = 735.29($C_{57}H_{37}N$ = 735.93) |
| P5-89 | m/z = 685.28($C_{53}H_{35}N$ = 685.87) | P5-90 | m/z = 685.28($C_{53}H_{35}N$ = 685.87) |
| P5-91 | m/z = 725.31($C_{56}H_{39}N$ = 725.94) | P5-92 | m/z = 749.31($C_{58}H_{39}N$ = 749.96) |
| P5-93 | m/z = 725.31($C_{56}H_{39}N$ = 725.94) | P5-94 | m/z = 725.31($C_{56}H_{39}N$ = 725.94) |
| P5-95 | m/z = 725.31($C_{56}H_{39}N$ = 725.94) | P5-96 | m/z = 773.31($C_{60}H_{39}N$ = 773.98) |
| P5-97 | m/z = 850.33($C_{65}H_{42}N_2$ = 851.07) | P5-98 | m/z = 699.26($C_{53}H_{33}NO$ = 699.85) |
| P5-99 | m/z = 715.23($C_{53}H_{33}NS$ = 715.91) | P5-100 | m/z = 739.29($C_{56}H_{37}NO$ = 739.92) |
| P5-101 | m/z = 709.28($C_{55}H_{35}N$ = 709.89) | P5-102 | m/z = 749.31($C_{58}H_{39}N$ = 749.96) |
| P5-103 | m/z = 901.37($C_{70}H_{47}N$ = 902.15) | P5-104 | m/z = 660.26($C_{50}H_{32}N$ = = 660.82) |
| P5-105 | m/z = 673.24($C_{51}H_{31}NO$ = 673.82) | P5-106 | m/z = 685.28($C_{53}H_{35}N$ = 685.87) |
| P5-107 | m/z = 775.32($C_{60}H_{41}N$ = 776.00) | P5-108 | m/z = 772.29($C_{59}H_{36}N_2$ = 772.95) |
| P5-109 | m/z = 685.28($C_{53}H_{35}N$ = 685.87) | P5-110 | m/z = 941.31($C_{71}H_{43}NS$ = 942.19) |
| P5-111 | m/z = 836.32($C_{64}H_{40}N_2$ = 837.04) | P5-112 | m/z = 913.35($C_{69}H_{43}N_3$ = 914.12) |
| P5-113 | m/z = 800.28($C_{60}H_{36}N_2O$ = 800.96) | P5-114 | m/z = 841.28($C_{63}H_{39}NS$ = 842.07) |
| P5-115 | m/z = 877.37($C_{68}H_{47}N$ = 878.13) | | |
| P6-1 | m/z = 713.31($C_{55}H_{39}N$ = 713.92) | P6-2 | m/z = 589.28($C_{45}H_{35}N$ = 589.78) |
| P6-3 | m/z = 639.29($C_{49}H_{37}N$ = 639.84) | P6-4 | m/z = 613.28($C_{47}H_{35}N$ = 613.80) |
| P6-5 | m/z = 625.28($C_{48}H_{35}N$ = 625.82) | P6-6 | m/z = 714.3($C_{54}H_{38}N_2$ = 714.91) |
| P6-7 | m/z = 715.29($C_{54}H_{37}NO$ = 715.9) | P6-8 | m/z = 627.26($C_{47}H_{33}NO$ = 627.79) |
| P6-9 | m/z = 577.24($C_{43}H_{31}NO$ = 577.73) | P6-10 | m/z = 593.22($C_{43}H_{31}NS$ = 593.79) |
| P6-11 | m/z = 577.24($C_{43}H_{31}NO$ = 577.73) | P6-12 | m/z = 627.26($C_{47}H_{37}NO$ = 627.79) |
| P6-13 | m/z = 679.32($C_{52}H_{41}N$ = 679.91) | P6-14 | m/z = 651.29($C_{50}H_{37}N$ = 651.85) |
| P6-15 | m/z = 725.31($C_{56}H_{39}N$ = 725.94) | P6-16 | m/z = 725.31($C_{56}H_{39}N$ = 725.94) |
| P6-17 | m/z = 677.31($C_{52}H_{39}N$ = 677.89) | P6-18 | m/z = 601.28($C_{46}H_{35}N$ = 601.79) |
| P6-19 | m/z = 691.29($C_{52}H_{37}NO$ = 691.87) | P6-20 | m/z = 691.29($C_{52}H_{37}NO$ = 691.87) |
| P6-21 | m/z = 691.29($C_{52}H_{37}NO$ = 691.87) | P6-22 | m/z = 689.27($C_{52}H_{35}NO$ = 689.86) |
| P6-23 | m/z = 767.32($C_{58}H_{41}NO$ = 767.97) | P6-24 | m/z = 767.32($C_{58}H_{41}NO$ = 767.97) |
| P6-25 | m/z = 767.32($C_{58}H_{41}NO$ = 767.97) | P6-26 | m/z = 765.3($C_{58}H_{39}NO$ = 765.96) |
| P6-27 | m/z = 737.31($C_{57}H_{39}N$ = 737.95) | P6-28 | m/z = 713.31($C_{55}H_{39}N$ = 713.92) |
| P6-29 | m/z = 637.28($C_{49}H_{35}N$ = 637.83) | P6-30 | m/z = 819.33($C_{61}H_{45}NSi$ = 820.12) |
| P6-31 | m/z = 824.36($C_{61}H_{45}D_5NSi$ = 825.15) | P6-32 | m/z = 725.31($C_{56}H_{39}N$ = 725.94) |
| P6-33 | m/z = 727.32($C_{56}H_{41}N$ = 727.95) | P6-34 | m/z = 751.32($C_{58}H_{41}N$ = 751.97) |
| P6-35 | m/z = 751.32($C_{58}H_{41}N$ = 751.97) | P6-36 | m/z = 603.26($C_{45}H_{33}NO$ = 603.77) |
| P6-37 | m/z = 767.32($C_{58}H_{41}NO$ = 767.97) | P6-38 | m/z = 726.3($C_{55}H_{38}N_2$ = 726.92) |
| P6-39 | m/z = 651.26($C_{49}H_{33}NO$ = 651.81) | | |

Evaluation of Fabrication of Organic Electronic Device

When the organic electronic device according to the present disclosure is a top-emission device and the anode is formed on the substrate before the organic material layer and the cathode are formed, the anode material may be implemented as not only a transparent material but also an opaque material having superior light reflectivity.

When the organic electronic device according to the present disclosure is a bottom-emission device and the anode is formed on the substrate before the organic material layer and the cathode are formed, the anode material should be implemented as a transparent material or, when formed of an opaque material, provided as a thin film as thin as possible so as to be transparent.

Hereinafter, the following Examples will be proposed by fabricating a top-emission tandem organic electronic device, but embodiments of the present disclosure are not limited thereto. The tandem organic electronic device according to an embodiment of the present disclosure is fabricated such that a plurality of stacks are connected through one or more charge generation layers. Although the same compound has been used for the hole transport layers of each of the three stacks in the tandem organic electronic device according to an embodiment of the present disclosure, the present disclosure is not limited thereto.

[Example 136] Tandem Organic Electronic Device with Three Stacks Connected

A tandem organic electronic device including three stacks connected were fabricated with a structure of first electrode (anode)/first hole transport region/first emission layer/first electron transport region/charge generation layer/second hole transport region/second emission layer/second electron transport region/charge generation layer/third hole transport region/third emission layer/third electron transport region/electron injection layer/second electrode (cathode).

Specifically, a hole injection layer was formed by vacuum-depositing 4,4',4"-Tris[2-naphthyl(phenyl)amino] triphenylamine (hereinafter, abbreviated as TNATA) at a thickness of 60 nm an anode formed on a glass substrate, a first hole transport layer of a first stack was formed at a thickness of 11 nm (35% of a total thickness 30 nm) by doping compound P1-4 represented by Formula 1 of the present disclosure (hereinafter, referred to as first HTM) with HATCN serving as a doping material, and then P1-4 represented by Formula 1 of the present disclosure was formed at a thickness of 19 nm on the first hole transport layer. Subsequently, a first emission layer having a thickness of 20 nm was deposited on the first hole transport layer using DPVBi as a host and 5% by weight of BCzVBi as a dopant. An electron transport layer was formed at a thickness of 30 nm using Alq3. Afterwards, a charge generation layer was formed by doping Bphen with 2% of Li for connection to a second stack. In addition, a second hole transport layer of the second stack was formed at a thickness of 14 nm (25% of a total thickness of 55 nm) by doping compound P1-4 represented by Formula 1 of the present disclosure (hereinafter, referred to as second HTM) with 10% of HATCN serving as a doping material, and then P1-4 represented by Formula 1 of the present disclosure was formed at a thickness of 41 nm on the second hole transport layer. Afterwards, as described above, a second emission layer, a second electron transport region, and a charge generation layer were formed sequentially. Finally, a third hole transport layer of a third stack was formed at a thickness of 10 nm (20% of a total thickness of 50 nm) by doping compound P1-4 represented by Formula 1 of the present disclosure (hereinafter, referred to as third HTM) with 10% of HATCN serving as a doping material, and then P1-4 represented by Formula 1 of the present disclosure was formed at a thickness of 40 nm on the third hole transport layer. After a third emission layer and a third electron transport region are sequentially deposited as described above, an electron injection layer of Liq was formed at a thickness of 1.5 nm, and then a cathode was formed by depositing Ag:Mg at a thickness of 150 nm. In this manner, the tandem organic electronic device was fabricated.

Electroluminescence (EL) properties of organic electronic emission devices according to Examples and Comparative Examples fabricated in this manner were measured using PR-650 available from Photo Research, Inc. by applying a forward bias DC voltage to the devices, and as a result of the measurement, T95 lifespans of the devices were tested using lifetime test equipment available from Mcscience Inc. The following table illustrates the results of the fabrication and test of the devices.

Examples 137 to 170

Organic electronic emission devices were fabricated in the same method as Example 136, except that compounds illustrated in the following Table 12 were used as hole transport materials of the first to third stacks.

TABLE 12

| | 1st HTM | 2nd HTM | 3rd HTM | Driving voltage (V) | Current ($mA/cm^2$) | Luminance ($csd/m^2$) | Efficiency (cd/A) | T (95) | CIE (x) | CIE (y) |
|---|---|---|---|---|---|---|---|---|---|---|
| Comp. Ex. 10 | ref1 | — | — | 15.4 | 18.8 | 1500 | 8 | 90.1 | 0.137 | 0.100 |
| Comp. Ex. 11 | ref2 | — | — | 13 | 15 | 1500 | 10 | 95.4 | 0.135 | 0.100 |
| Ex. 136 | | P1-4 | | 9.2 | 6.6 | 1500 | 22.6 | 137.9 | 0.125 | 0.100 |
| Ex. 137 | | P1-8 | | 9.7 | 6.9 | 1500 | 21.7 | 134.5 | 0.127 | 0.100 |
| Ex. 138 | | P1-11 | | 9.6 | 6.4 | 1500 | 23.3 | 131.8 | 0.126 | 0.100 |
| Ex. 139 | | P1-13 | | 9.2 | 6.8 | 1500 | 22.1 | 136.3 | 0.125 | 0.100 |
| Ex. 140 | | P1-16 | | 9.4 | 6.8 | 1500 | 21.9 | 140.8 | 0.125 | 0.100 |
| Ex. 141 | | P1-16 | | 9.5 | 6.3 | 1500 | 23.8 | 139 | 0.125 | 0.100 |
| Ex. 142 | | P1-17 | | 9.3 | 6.7 | 1500 | 22.3 | 143.2 | 0.125 | 0.100 |
| Ex. 143 | | P1-20 | | 9.8 | 6.8 | 1500 | 22.2 | 130.6 | 0.125 | 0.100 |
| Ex. 144 | | P2-2 | | 10.8 | 7.8 | 1500 | 19.2 | 150 | 0.126 | 0.100 |
| Ex. 145 | | P2-3 | | 11.2 | 7.2 | 1500 | 20.9 | 156.9 | 0.126 | 0.100 |
| Ex. 146 | | P2-6 | | 12.3 | 6.3 | 1500 | 23.7 | 145.6 | 0.127 | 0.100 |
| Ex. 147 | | P2-11 | | 11 | 7.6 | 1500 | 19.8 | 158.2 | 0.127 | 0.100 |
| Ex. 148 | | P2-13 | | 10.9 | 7 | 1500 | 21.4 | 157.3 | 0.125 | 0.100 |
| Ex. 149 | | P2-30 | | 11.4 | 7.4 | 1500 | 20.3 | 151.7 | 0.127 | 0.100 |
| Ex. 150 | | P2-33 | | 11.5 | 7.5 | 1500 | 20 | 153.9 | 0.126 | 0.100 |
| Ex. 151 | | P3-2 | | 10.1 | 8.4 | 1500 | 17.8 | 164 | 0.126 | 0.100 |
| Ex. 152 | | P3-8 | | 10.3 | 8.5 | 1500 | 17.7 | 163.2 | 0.126 | 0.100 |
| Ex. 153 | | P3-11 | | 10.4 | 8.7 | 1500 | 17.2 | 166.1 | 0.127 | 0.100 |
| Ex. 154 | | P3-12 | | 10.2 | 8.5 | 1500 | 17.7 | 167.5 | 0.126 | 0.100 |
| Ex. 155 | | P3-13 | | 10.6 | 8.2 | 1500 | 18.4 | 161.6 | 0.127 | 0.100 |
| Ex. 156 | | P3-22 | | 10 | 8.3 | 1500 | 18 | 165.9 | 0.125 | 0.100 |
| Ex. 157 | | P3-25 | | 10 | 8.4 | 1500 | 17.9 | 168.3 | 0.127 | 0.100 |
| Ex. 158 | | P4-1 | | 9.1 | 7 | 1500 | 21.5 | 133.1 | 0.126 | 0.100 |
| Ex. 159 | | P4-19 | | 10.8 | 7.9 | 1500 | 19 | 148.5 | 0.127 | 0.100 |
| Ex. 160 | | P4-21 | | 11.6 | 7.4 | 1500 | 20.4 | 154.8 | 0.126 | 0.100 |
| Ex. 161 | | P4-37 | | 10.5 | 8.9 | 1500 | 16.8 | 162.7 | 0.127 | 0.100 |
| Ex. 162 | | P4-63 | | 10 | 8.5 | 1500 | 17.7 | 166.4 | 0.125 | 0.100 |
| Ex. 163 | | P5-25 | | 10.7 | 8.9 | 1500 | 16.9 | 159.5 | 0.125 | 0.100 |
| Ex. 164 | | P5-38 | | 10.6 | 8 | 1500 | 18.7 | 160.2 | 0.126 | 0.100 |
| Ex. 165 | | P5-97 | | 10.5 | 8.8 | 1500 | 17.1 | 161.2 | 0.126 | 0.100 |
| Ex. 166 | | P5-107 | | 10 | 8.3 | 1500 | 18.1 | 160.6 | 0.126 | 0.100 |
| Ex. 167 | | P6-5 | | 11.6 | 6.3 | 1500 | 24 | 146.1 | 0.126 | 0.100 |
| Ex. 168 | | P6-8 | | 9.9 | 7 | 1500 | 21.5 | 142 | 0.127 | 0.100 |
| Ex. 169 | | P6-21 | | 11.1 | 7.1 | 1500 | 21.1 | 147.5 | 0.125 | 0.100 |
| Ex. 170 | | P6-35 | | 10 | 8.3 | 1500 | 18.1 | 169.8 | 0.125 | 0.100 |

Comparative Examples 10 and 11

Organic electronic emission devices were fabricated in the same method as Example, except that only the single stack was formed and the following ref 1 and ref 2 were used as hole transport materials.

[ref 1 and ref2]

ref 1

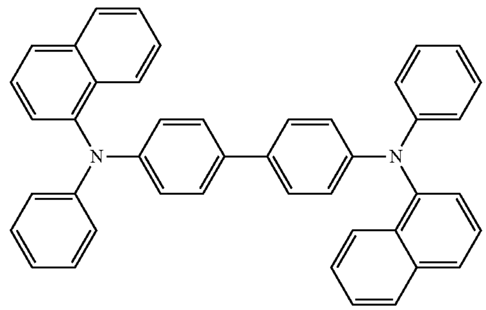

ref 2

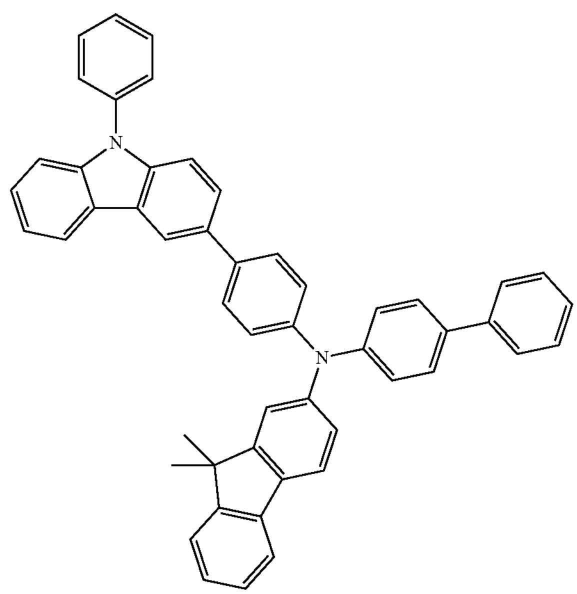

As seen from the result of Table 12, it can be appreciated that, when the tandem organic light-emitting devices each including three stacks were fabricated using the compound represented by Formula 1 of the present disclosure as the hole transport material (Examples 136 to 170), the electrical characteristics of the devices were improved than when organic light-emitting devices each including a single stack using the ref 1 compound and the ref 2 compound as the hole transport materials (Comparative Examples 10 and 11). Describing in detail, in Examples 136 to 170 and Comparative Examples 10 and 11, the materials of the hole transport layers were doped with the doping materials at the same in the thickness, whereas different numbers of stacks were connected. As in Examples 136 to 170, it can be appreciated that the efficiency and lifespan among the device characteristics were significantly improved with increases in the number of the stacks connected. It is considered that the efficiency and lifespan were improved proportionally to increases in the number of the stacks, due to the multiphoton emission structure in which excitons are generated to emit light energy in each of the stacks.

It can also be seen that the values of the color coordinates (CIE x) gradually decrease, due to the device structure including three stacks as in Examples of the present disclosure. It is considered that the color purity was improved as the full width at half maximum (FWHM) of an emission wavelength was reduced with increases in the number of the stacks In the meantime, it can be seen that, when the compound represented by Formula 1 of the present disclosure was used as the first hole transport layer material, the device characteristics were more improved than when the refl material or the ref 2 material including N were used as first hole transport layer. When the compound of the present disclosure was used as the hole transport layer material, an appropriate number of holes can be efficiently moved in the emission layer to balance holes and electrons in the emission layer and prevent degradations in the interface of the emission layer, thereby increasing the efficiency and lifespan.

[Examples 171 and 174] Tandem Organic Electronic Device with Three Stacks Connected Tandem organic light-emitting devices were fabricated in the same method as Example 136, except that the compounds P1-17 and P3-8 were used as the hole transport materials of the first to third stacks as illustrated in the following Table 13 and the portions corresponding to 15% of the thickness of the hole transport layers were doped with HATCN, each of the hole transport layers being 50 nm thick.

Examples 172 and 175

Tandem organic light-emitting devices were fabricated in the same method as Example 136, except that the compounds P1-17 and P3-8 were used as the hole transport materials of the first to third stacks as illustrated in the following Table 13 and the portions corresponding to 20% of the thickness of the hole transport layers were doped with HATCN, each of the hole transport layers being 50 nm thick.

Examples 173 and 176

Tandem organic light-emitting devices were fabricated in the same method as Example 136, except that the compounds P1-17 and P3-8 were used as the hole transport materials of the first to third stacks as illustrated in the following Table 13 and the portions corresponding to 25% of the thickness of the hole transport layers were doped with HATCN, each of the hole transport layers being 50 nm thick.

Comparative Examples 12 and 14

Tandem organic light-emitting devices were fabricated in the same method as Example 136, except that the compounds P1-17 and P3-8 were used as the hole transport materials of the first to third stacks as illustrated in the following Table 13 and the portions corresponding to 10% of the thickness of the hole transport layers were doped with HATCN, each of the hole transport layers being 50 nm thick.

Comparative Examples 13 and 15

Tandem organic light-emitting devices were fabricated in the same method as Example 1, except that the compounds P1-17 and P3-8 were used as the hole transport materials of the first to third stacks as illustrated in the following Table 13 and the portions corresponding to 55% of the thickness of the hole transport layers were doped with HATCN, each of the hole transport layers being 50 nm thick.

TABLE 13

| | 1st to 3rd HTM | Thickness ratio[1)] | Driving voltage (V) | Current (mA/cm$^2$) | Luminance (csd/m$^2$) | Efficiency (cd/A) | Lifespan T(95) |
|---|---|---|---|---|---|---|---|
| Comp. Ex. 12 | P1-71 | 10% | 10.1 | 9.7 | 1500 | 15.4 | 97.4 |
| Comp. Ex. 13 | P1-71 | 55% | 10.6 | 10.1 | 1500 | 14.9 | 98.3 |
| Comp. Ex. 14 | P3-8 | 10% | 11.1 | 12.3 | 1500 | 12.2 | 111 |
| Comp. Ex. 15 | P3-8 | 55% | 11.6 | 13 | 1500 | 11.5 | 112.6 |
| Ex. 171 | P1-71 | 15% | 9.7 | 6.7 | 1500 | 22.5 | 143.7 |
| Ex. 172 | P1-71 | 20% | 9.6 | 6.6 | 1500 | 22.9 | 144.2 |
| Ex. 173 | P1-71 | 25% | 9.4 | 6.5 | 1500 | 23.1 | 144.8 |
| Ex. 174 | P3-8 | 15% | 10.6 | 8.3 | 1500 | 18.1 | 163.5 |
| Ex. 175 | P3-8 | 20% | 10.2 | 8.1 | 1500 | 18.6 | 164.1 |
| Ex. 176 | P3-8 | 25% | 9.9 | 7.9 | 1500 | 19 | 164.4 |

Notes)
Thickness ratio[1)]: Thickness ratio (% of thickness of hole transport layer)

As illustrated in Table 13, the tandem devices were fabricated and measured by varying the ratio of the portion of the hole transport layer doped with the doping material with respect to the thickness of the hole transport layer in each of the first to third stacks according to the present disclosure. In the illustrative description of the compounds, P1-17 and P3-8 were taken as examples. As seen from the results of Table 13, it can be appreciated that, when the hole transport layer is doped with the doping material so that the ratio of the thickness of the hole transport layer doped with the doping material is less than 15% of the total thickness of the hole transport layer or is greater than 50% of the total thickness of the hole transport layer, the results regarding the driving voltage, efficiency, and lifespan of the devices gradually decline compared to the results regarding Examples 171 to 176, in which the hole transport layer was doped with the doping material at 15%, 20%, and 25% ratios.

The results depend on the thickness of the portion of the hole transport layer doped with the doping material, i.e., are proportional to the weight ratio of the doping material added to the hole transport layer. When the portion of the hole transport layer doped with the doping material is too thin, the generation of holes and electric charges is insignificant, and holes are not properly injected into the emission layer. Consequently, the device characteristics may be degraded, which is problematic. In contrast, when the thickness of the portion of the hole transport layer doped with the doping material is too thick, there may be problems in terms of the occurrence of short-circuit or an increase in the total cost consumed for the fabrication of the devices.

The above description is only intended to illustrate the present disclosure, and those having ordinary knowledge in the art to which the present disclosure pertains could make various modifications without departing from the essential features of the present disclosure. The foregoing embodiments disclosed herein shall be interpreted as being illustrative, while not being limitative, of the principle and scope of the present disclosure. It should be understood that the scope of the present disclosure shall be defined by the appended Claims and all of their equivalents fall within the scope of the present disclosure.

DESCRIPTION OF REFERENCE NUMERALS OF DRAWINGS

110: first electrode
120: second electrode
130: organic material layer
141: first stack
142: second stack
143: third stack
144: fourth stack
150: charge generation layer
160: capping layer

The invention claimed is:

1. An organic electronic device comprising:

a first electrode;

a second electrode; and an organic material layer positioned between the first electrode and the second electrode and comprising a first stack, a second stack, and a third stack, wherein the first stack comprises a first hole transport region, a first emission layer, and a first electron transport region, the first hole transport region comprises a first hole transport layer and a first auxiliary emission layer, the first hole transport layer or the first auxiliary emission layer comprises a first compound represented by the following Formula 1, the thickness of the first hole transport layer ranges from 250 Å to 700 Å, and 10% to 50% of the thickness of the first hole transport layer is doped with a first doping material,

[Formula 1]

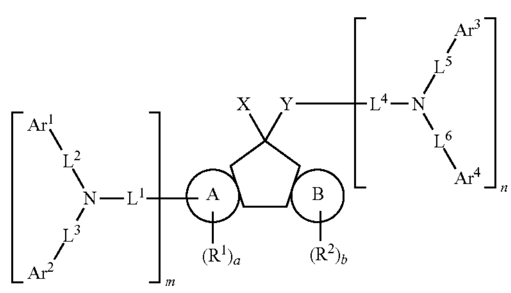

wherein each of m and n is independently 0 or 1, where m+n is 1, each of $Ar^1$ and $Ar^2$ is selected from the group consisting of a $C_6$-$C_{60}$ aryl group; a fluorenyl group; a $C_2$-$C_{60}$ heterocyclic group including at least one hetero atom of O, N, S, Si, or P; or a fused ring group of a $C_3$-$C_{60}$ aliphatic ring and a $C_6$-$C_{60}$ aromatic ring, each of $Ar^3$ and $Ar^4$ is independently selected from the group consisting of a $C_6$-$C_{60}$ aryl group; a fluorenyl group; a $C_2$-$C_{60}$ heterocyclic group including at least one hetero atom of O, N, S, Si, or P; or a fused ring group of a $C_3$-$C_{60}$ aliphatic ring and a $C_6$-$C_{60}$ aromatic ring, each of $L^1$ to $L^6$ is independently selected from the group consisting of a single bond; a $C_6$-$C_{60}$ arylene group; a fluorenylene group; a $C_2$-$C_{60}$ heterocyclic group including at least one hetero atom of O, N, S, Si, or P; or a fused ring group of a $C_3$-$C_{60}$ aliphatic ring and a $C_6$-$C_{60}$ aromatic ring, X is selected from the group consisting of hydrogen; deuterium; a $C_6$-$C_{30}$ aryl group; a fluorenyl group; a $C_2$-$C_{30}$ heterocyclic group including at least one hetero atom of O, N, S, Si, or P; a fused ring group of a $C_3$-$C_{30}$ aliphatic ring and a $C_6$-$C_{30}$ aromatic ring; a $C_1$-$C_{30}$ alkyl group; a $C_2$-$C_{20}$ alkenyl group; or a $C_2$-$C_{20}$ alkynyl group, i) when n is 0, Y is selected from the group consisting of hydrogen; deuterium; a $C_6$-$C_{30}$ aryl group; a fluorenyl group; a $C_2$-$C_{30}$ heterocyclic group including at least one hetero atom of O, N, S, Si, or P; a fused ring group of a $C_3$-$C_{30}$ aliphatic ring and a $C_6$-$C_{30}$ aromatic ring; a $C_1$-$C_{30}$ alkyl group; a $C_2$-$C_{20}$ alkenyl group; or a $C_2$-$C_{20}$ alkynyl group, and ii) when n is 1, Y is selected from the group consisting of a $C_6$-$C_{60}$ arylene group; a fluorenylene group; a $C_2$-$C_{60}$ heterocyclic group including at least one hetero atom of O, N, S, Si, or P; or a fused ring group of a $C_3$-$C_{60}$ aliphatic ring and a $C_6$-$C_{60}$ aromatic ring, X and Y are bonded to form a spiro compound, each of ring A and ring B is independently a $C_6$-$C_{10}$ aryl group, each of $R^1$ and $R^2$ is independently selected from the group consisting of deuterium; a halogen; a $C_6$-$C_{30}$ aryl group; a fluorenyl group; a $C_2$-$C_{30}$ heterocyclic group including at least one hetero atom of O, N, S, Si, or P; a fused ring group of a $C_3$-$C_{30}$ aliphatic ring and a $C_6$-$C_{30}$ aromatic ring; a $C_1$-$C_{30}$ alkyl group; a $C_2$-$C_{20}$ alkenyl group; a $C_2$-$C_{20}$ alkynyl group; a $C_1$-$C_{30}$ alkoxyl group; or a $C_6$-$C_{30}$ aryloxy group, a is an integer from 0 to 7, and b is an integer from 0 to 8, each of the aryl group, the fluorenyl group, the heterocyclic group, the fused ring group, the alkyl group, the alkenyl group, the alkynyl group, the alkoxyl group, the aryloxy group, the arylene group, and the fluorenylene group is further substituted with one or more substituents selected from the group consisting of deuterium; a halogen group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{25}$ aryl group; a $C_6$-$C_{25}$ aryl group substituted with deuterium; a fluorenyl group; a $C_2$-$C_{20}$ heterocyclic group; or a $C_3$-$C_{20}$ cycloalkyl group, and each of the further substituted substituents is capable of being further substituted with one or more substituents selected from the group consisting of deuterium; a halogen group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{25}$ aryl group; a $C_6$-$C_{25}$ aryl group substituted with deuterium; a fluorenyl group; a $C_2$-$C_{20}$ heterocyclic group; or a $C_3$-$C_{20}$ cycloalkyl group, and the substituents are bonded to each other to form a ring.

2. The device of claim 1, wherein each of the first hole transport layer and the first auxiliary emission layer of the first stack comprises the first compound represented by Formula 1.

3. The device of claim 1, wherein the first compound is represented by any one of the following Formula 2 to Formula 5:

[Formula 2]

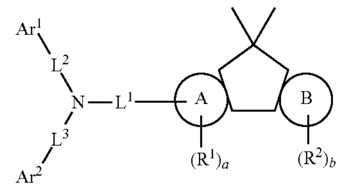

[Formula 3]

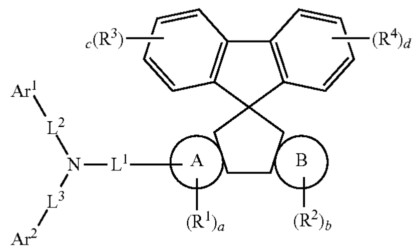

[Formula 4]

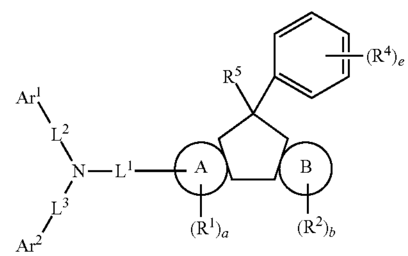

[Formula 5]

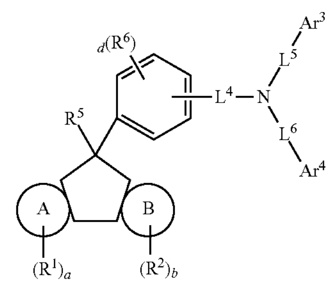

wherein each of c and d is independently an integer from 0 to 4, and e is an integer from 0 to 5, i) each of $R^3$, $R^4$, and $R^6$ is independently selected from the group consisting of deuterium; a halogen; a $C_6$-$C_{30}$ aryl group; a fluorenyl group; a $C_2$-$C_{30}$ heterocyclic group including at least one hetero atom of O, N, S, Si, or P; a fused ring group of a $C_3$-$C_{30}$ aliphatic ring and a $C_6$-$C_{30}$ aromatic ring; a $C_1$-$C_{30}$ alkyl group; a $C_2$-$C_{20}$ alkenyl group; a $C_2$-$C_{20}$ alkynyl group; a $C_1$-$C_{30}$ alkoxyl group; or a $C_6$-$C_{30}$ aryloxy group, and ii) a plurality of $R^3$s, a plurality of $R^4$s, and a plurality of $R^6$s are bonded to each other to form rings, respectively, $R^5$ is selected from the group consisting of hydrogen; deuterium; a halogen; a $C_6$-$C_{30}$ aryl group; a fluorenyl group; a $C_2$-$C_{30}$ heterocyclic group including at least one hetero atom of O, N, S, Si, or P; a fused ring group of a $C_3$-$C_{30}$ aliphatic ring and a $C_6$-$C_{30}$ aromatic ring; a $C_1$-$C_{30}$ alkyl group; a $C_2$-$C_{20}$ alkenyl group; a $C_2$-$C_{20}$ alkynyl group; a $C_1$-$C_{30}$ alkoxyl group; or a $C_6$-$C_{30}$ aryloxy group, $Ar^1$ to $Ar^4$, $L^1$ to $L^6$, $R^1$, $R^2$, a, and b are the same as those defined in claim 1.

4. The device of claim 1, wherein the first compound is represented by one of the following Formulas 6 to 9:

[Formula 6]

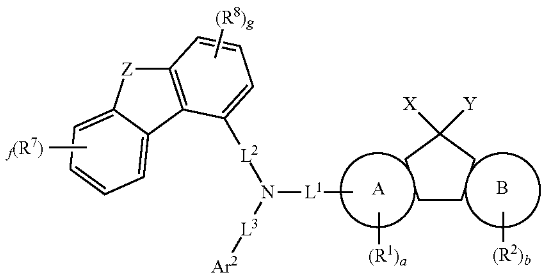

[Formula 7]

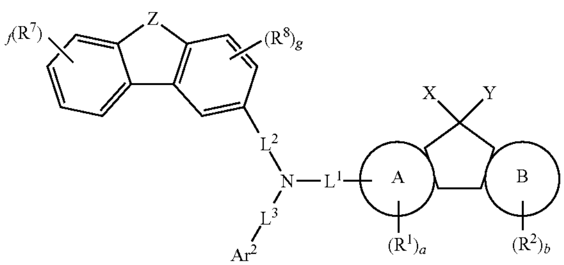

[Formula 8]

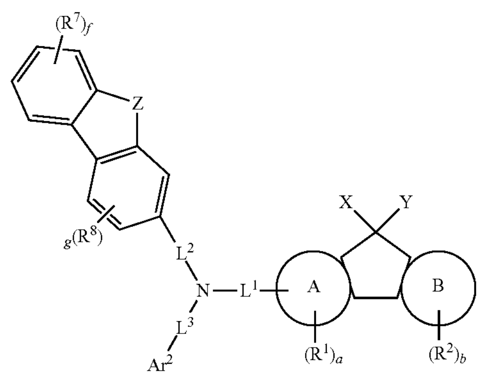

[Formula 9]

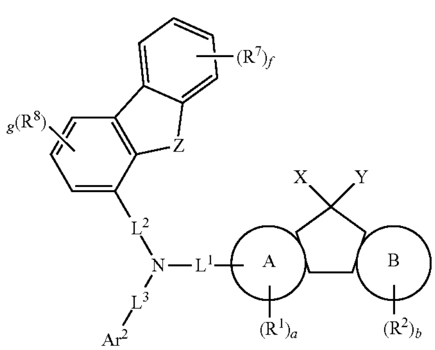

wherein Z is O, S, NR', or CR'R",

R' and R" are respectively and independently selected from the group consisting of a $C_1$-$C_{30}$ alkyl group; a $C_6$-$C_{30}$ aryl group; or a $C_3$-$C_{30}$ heterocyclic group including at least one hetero atom of O, N, S, Si, or P, or bonded to each other to form spiro compounds, i) each of $R^7$ and $R^8$ is independently selected from the group consisting of deuterium; a halogen; a $C_6$-$C_{30}$ aryl group; a fluorenyl group; a $C_2$-$C_{30}$ heterocyclic group including at least one hetero atom of O, N, S, Si, or P; a fused ring group of a $C_3$-$C_{30}$ aliphatic ring and a $C_6$-$C_{30}$ aromatic ring; a $C_1$-$C_{30}$ alkyl group; a $C_2$-$C_{20}$ alkenyl group; a $C_2$-$C_{20}$ alkynyl group; a $C_1$-$C_{30}$ alkoxyl group; or a $C_6$-$C_{30}$ aryloxy group, and ii) a plurality of $R^7$s and a plurality of $R^8$s are bonded to each other to form rings, respectively, f is an integer from 0 to 4, and g is an integer from 0 to 3, and $Ar^2$, $L^1$ to $L^3$, ring A, ring B, X, Y, $R^1$, $R^2$, a, and b are the same as those defined in claim 1.

5. The device of claim 1, wherein the first compound is represented by one of the following Formulas 10 to 12,

[Formula 10]

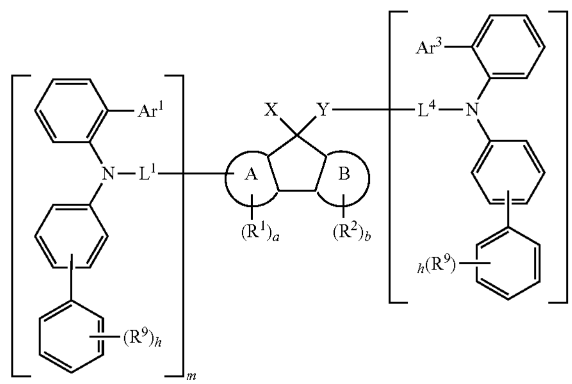

[Formula 11]

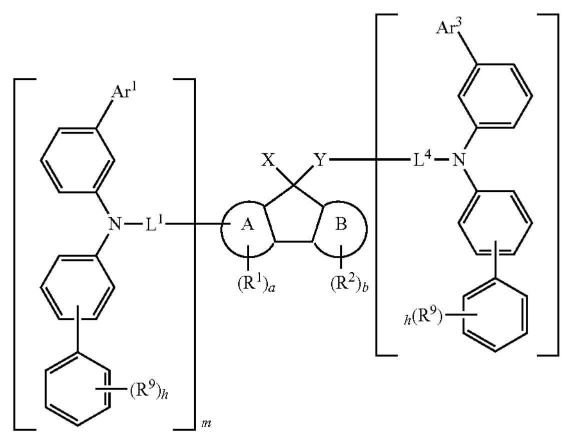

[Formula 12]

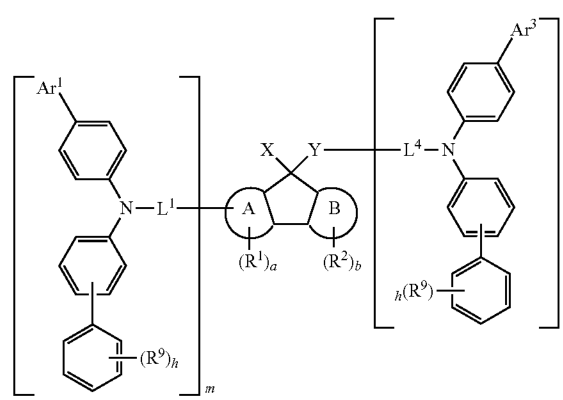

wherein $R^9$ i) is independently selected from the group consisting of deuterium; a halogen; a $C_6$-$C_{30}$ aryl group; a fluorenyl group; a $C_2$-$C_{30}$ heterocyclic group including at least one heteroatom of O, N, S, Si, or P; a fused ring group of a $C_3$-$C_{30}$ aliphatic ring and a $C_6$-$C_{30}$ aromatic ring; a $C_1$-$C_{30}$ alkyl group; a $C_2$-$C_{20}$ alkenyl group; a $C_2$-$C_{20}$ alkynyl group; a $C_1$-$C_{30}$ alkoxyl group; or a $C_6$-$C_{30}$ aryloxy group, and ii) a plurality of Ros are bonded to each other to form a ring, and $Ar^1$, $Ar^3$, $L^1$, $L^4$, ring A, ring B, X, Y, $R^1$, $R^2$, a, and b are the same as those defined in claim 1.

6. The device of claim 1, wherein the first compound comprises one or more of the following compounds:

P1-1

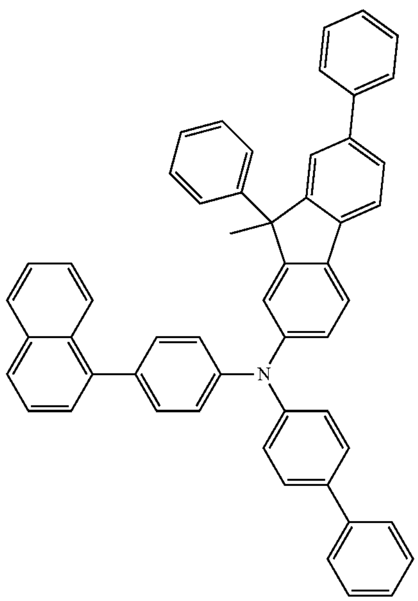

P1-2

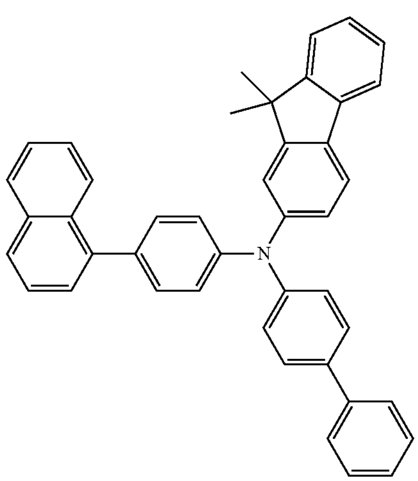

-continued

P1-3

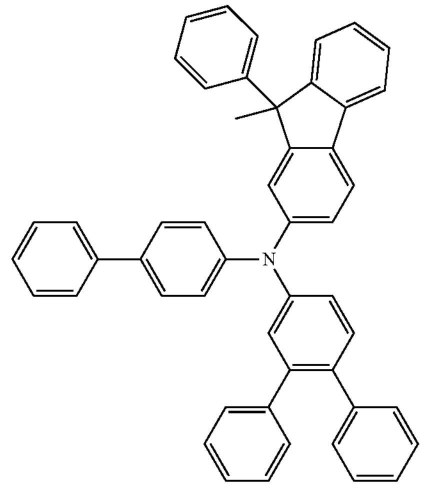

P1-4

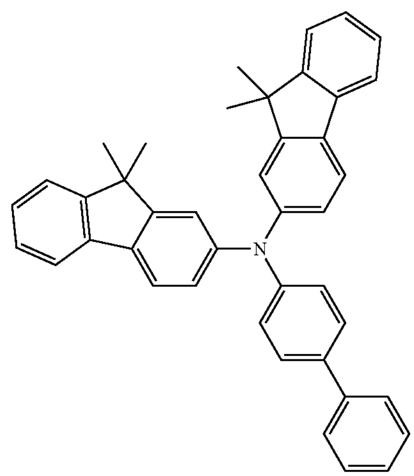

P1-5

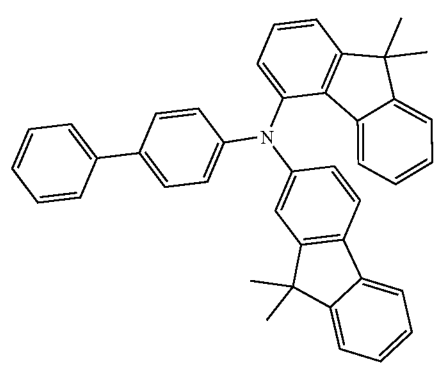

-continued
P1-6
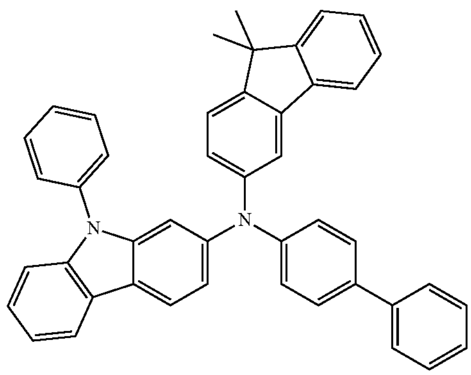
P1-7
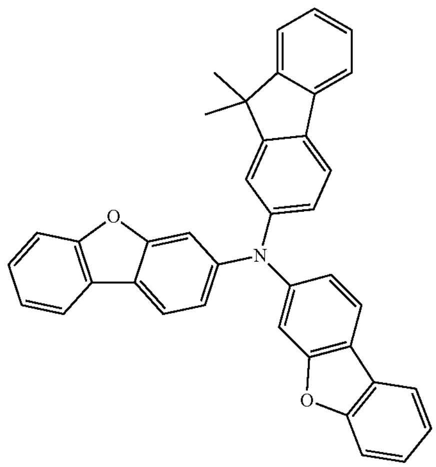
P1-8
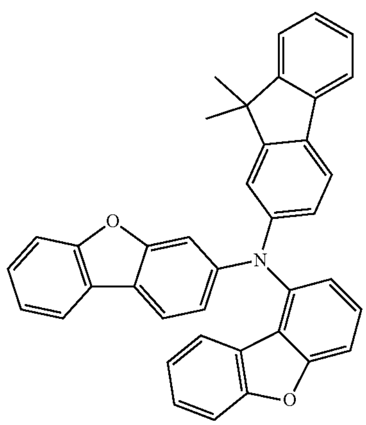
P1-9
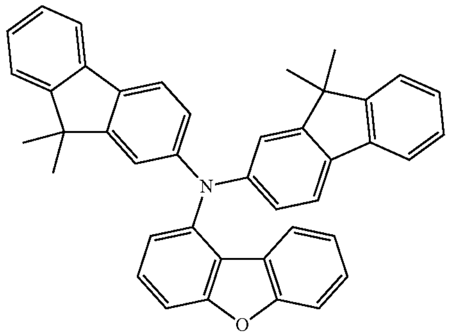
-continued
P-10
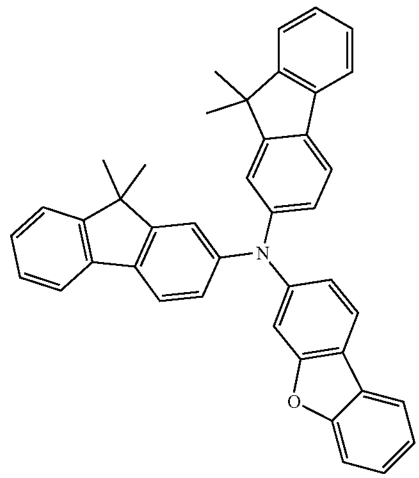
P1-11
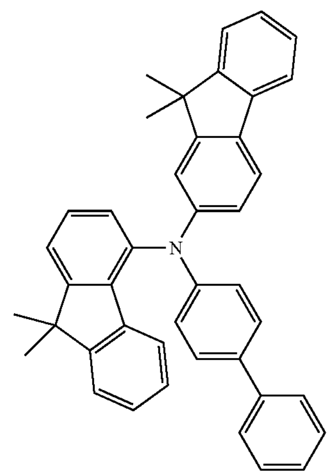
P1-12
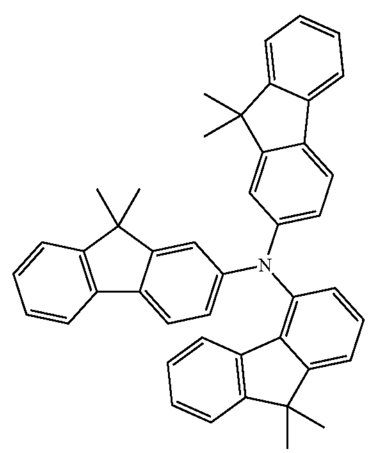

-continued
P1-13
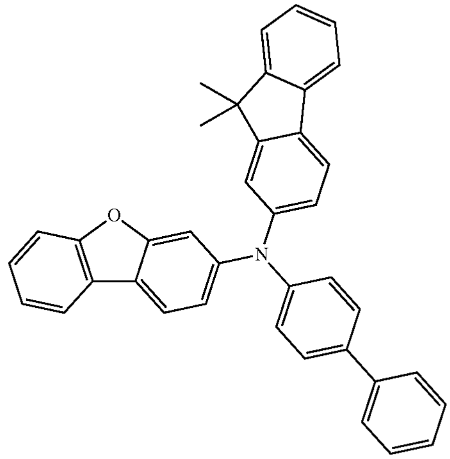
P1-14
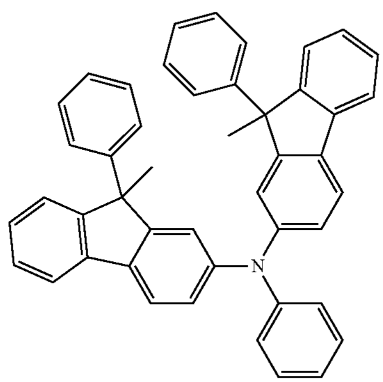
P1-15
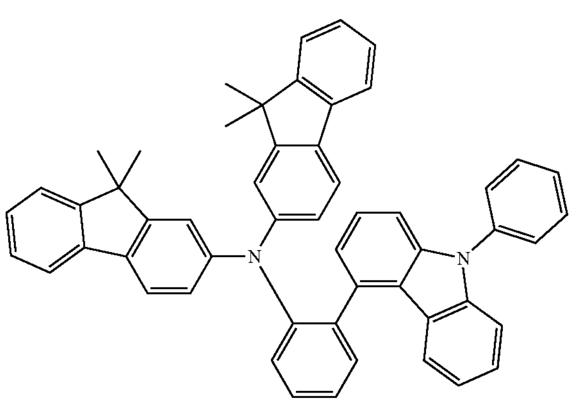
-continued
P1-16
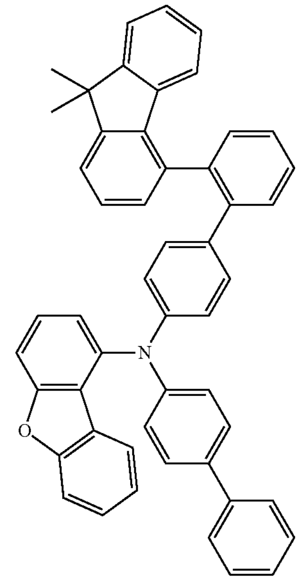
P1-17
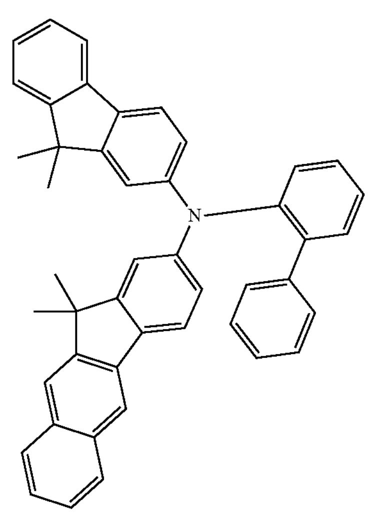

-continued
P1-18
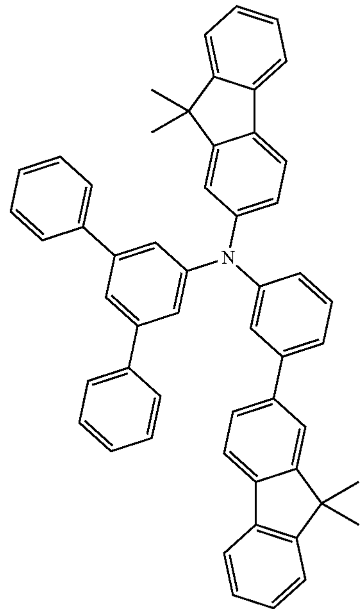
P1-19
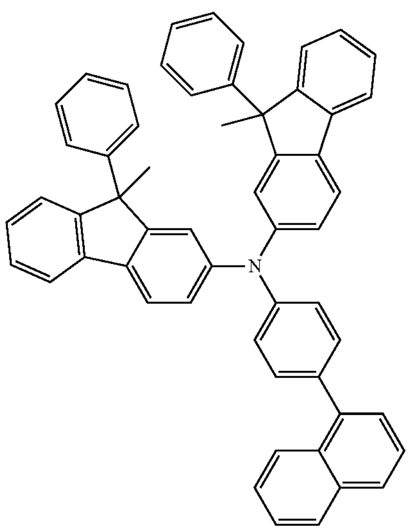
P1-20
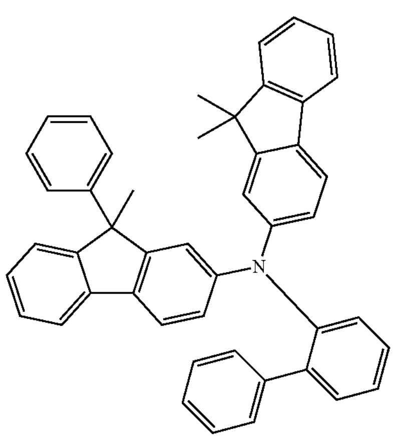
-continued
P2-1
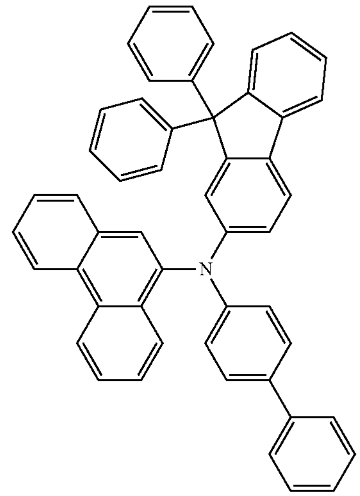
P2-2
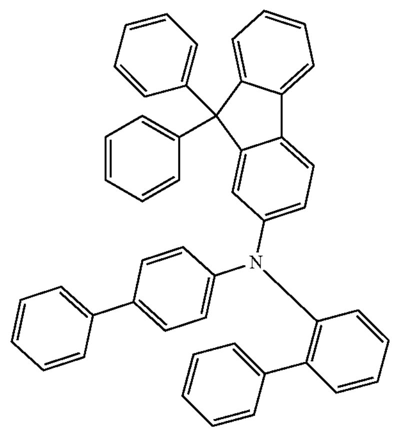
P2-3
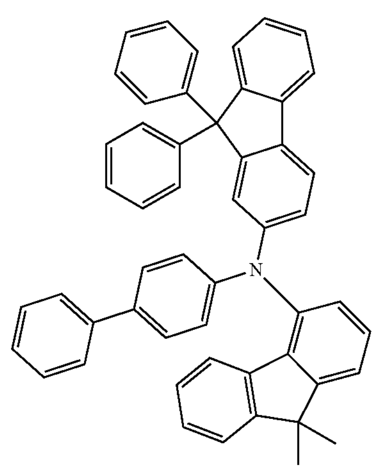

-continued
P2-4
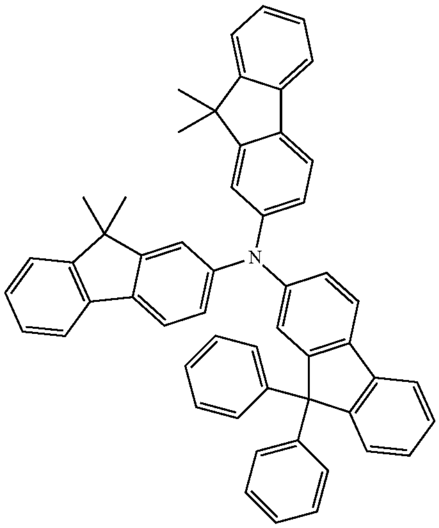
P2-5
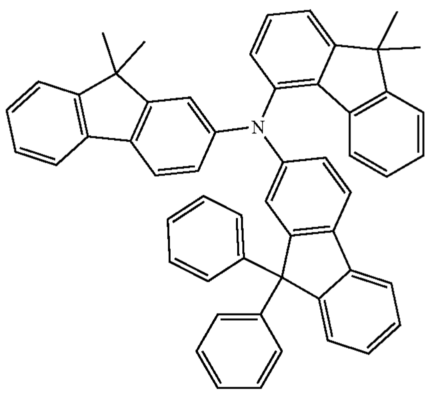
P2-6
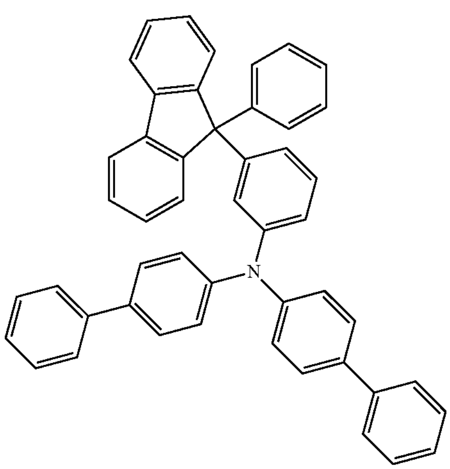
-continued
P2-7
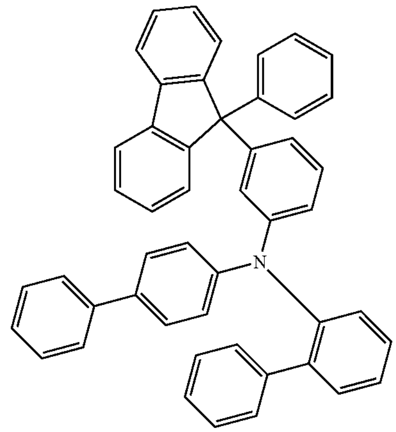
P2-8
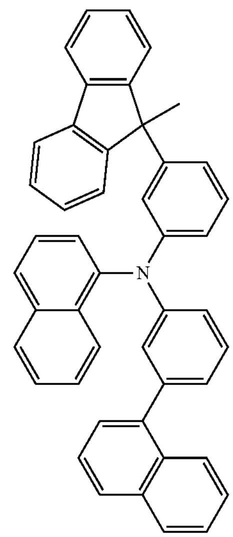
P2-9
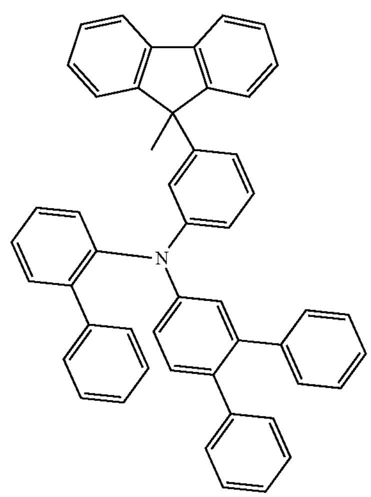

-continued
P2-10
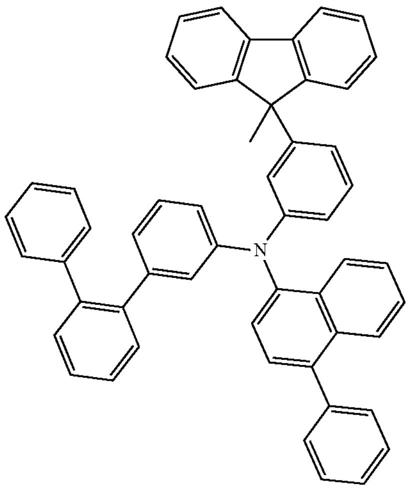
P2-11
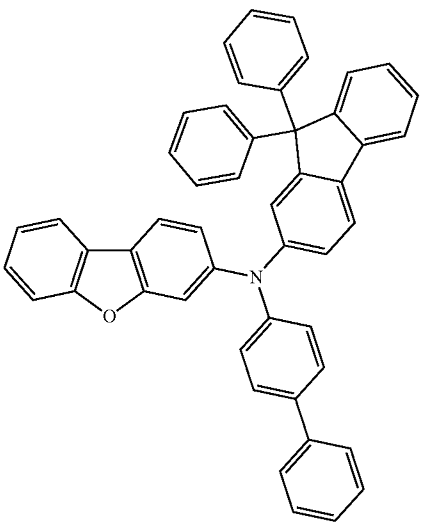
P2-12
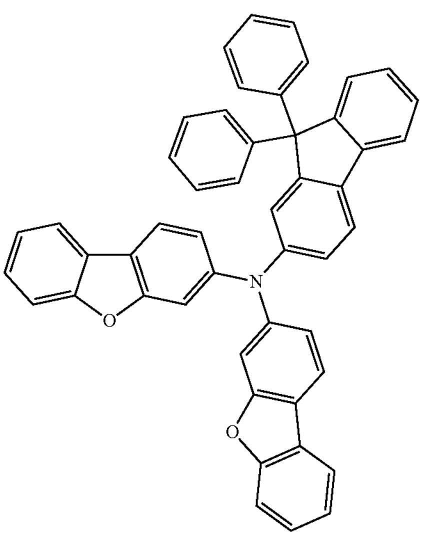
-continued
P2-13
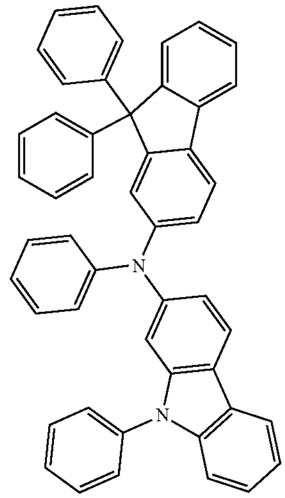
P2-14
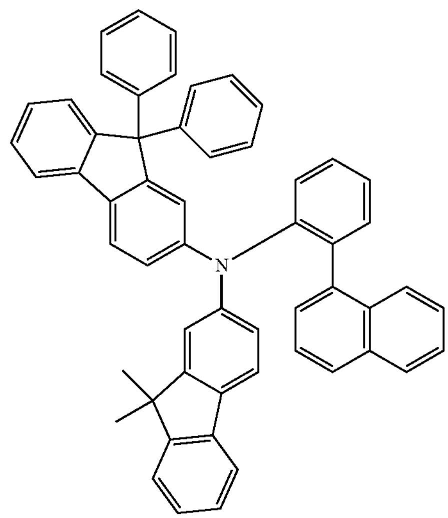
P2-15
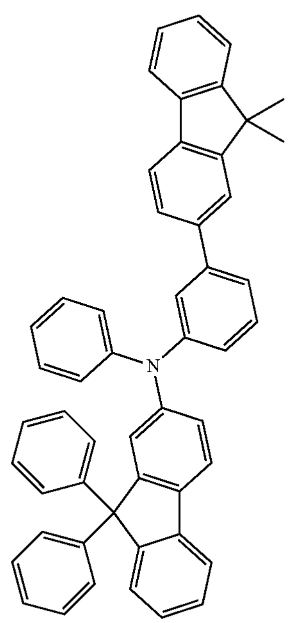

-continued
P2-16
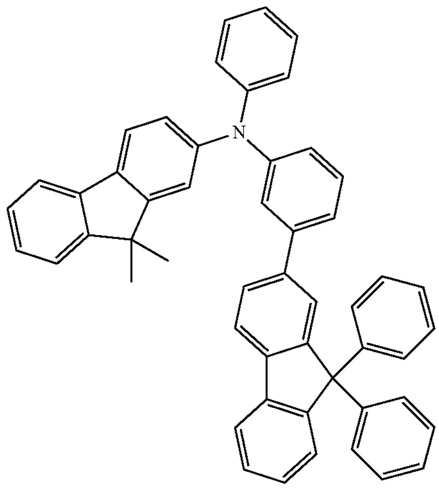
P2-17
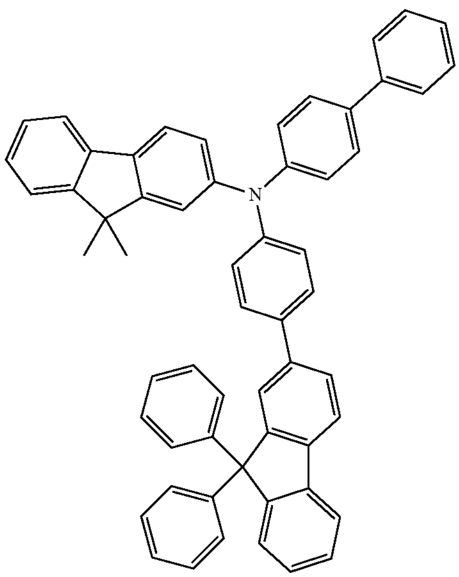
P2-18
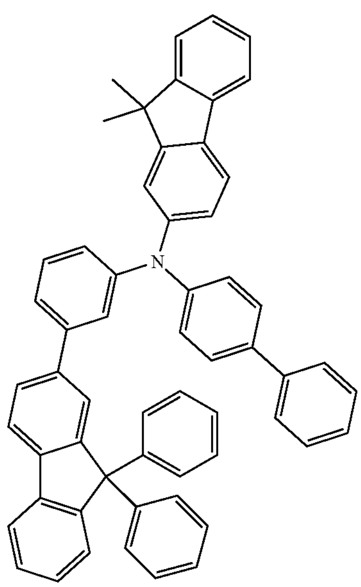
-continued
P2-19
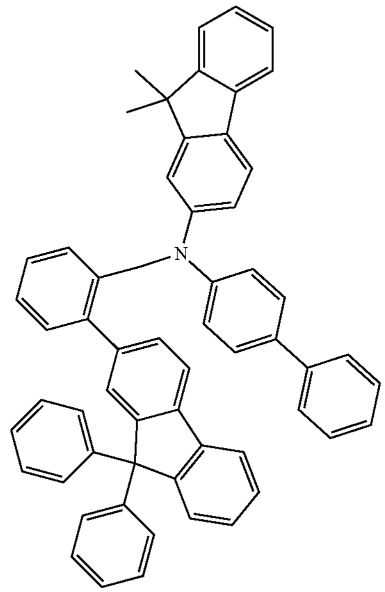
P2-20
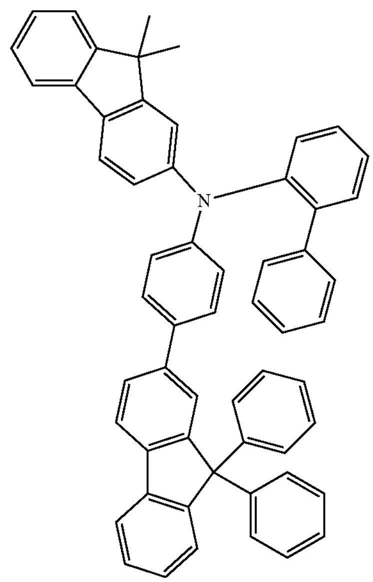
P2-21
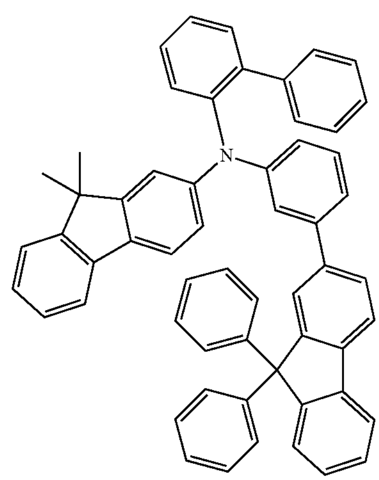

-continued
P2-22
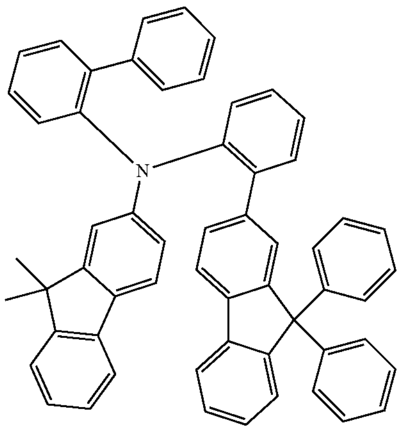
P2-23
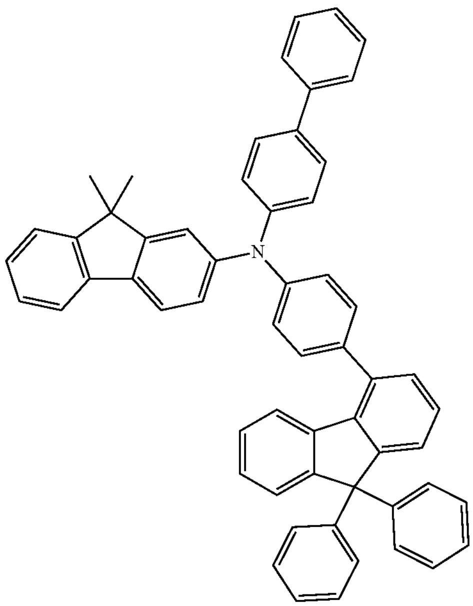
P2-24
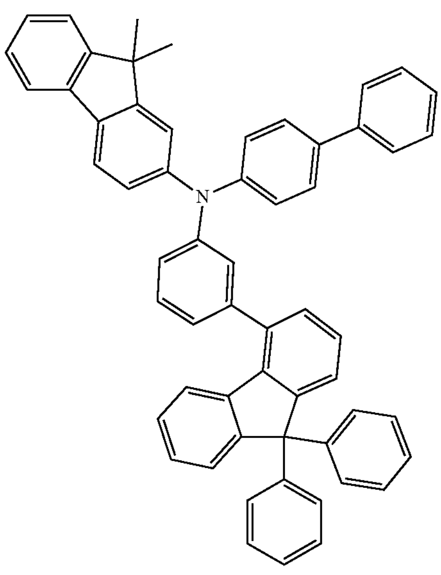
-continued
P2-25
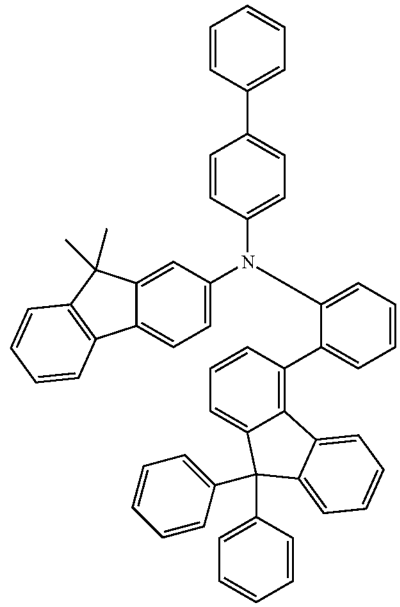
P2-26
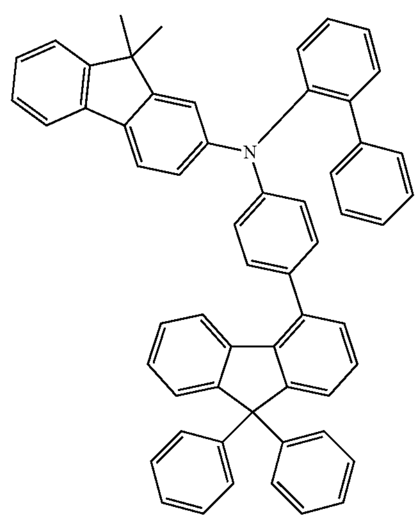

-continued
P2-27
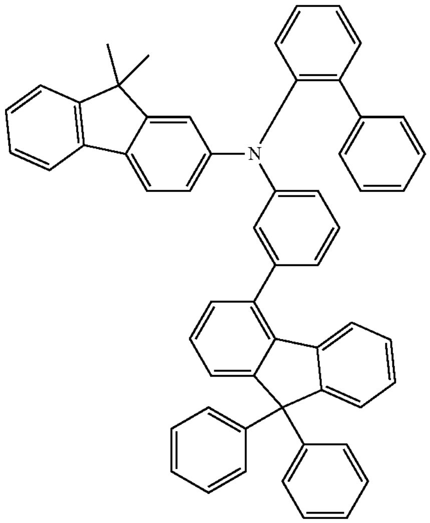
P2-28
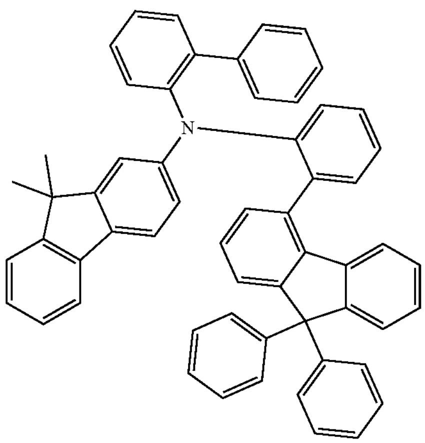
P2-29
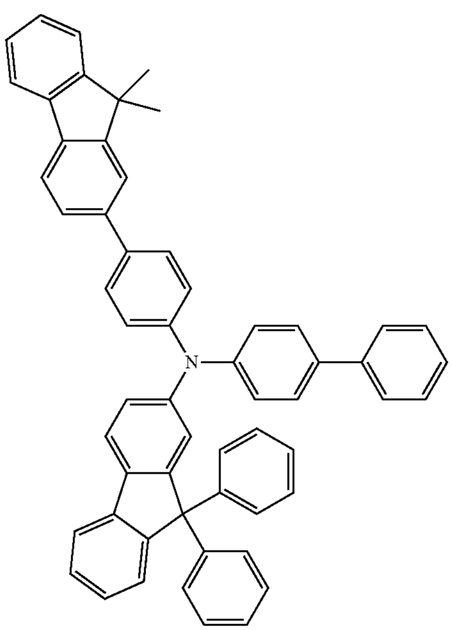
-continued
P2-30
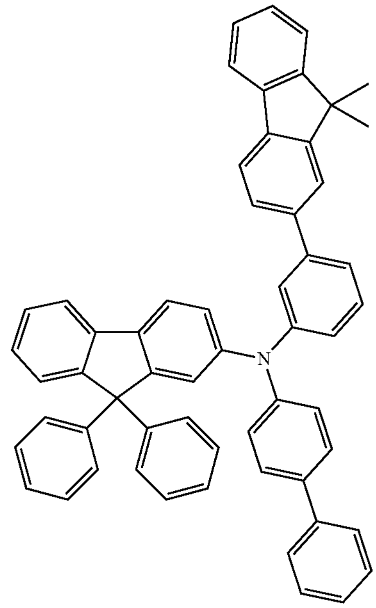
P2-31
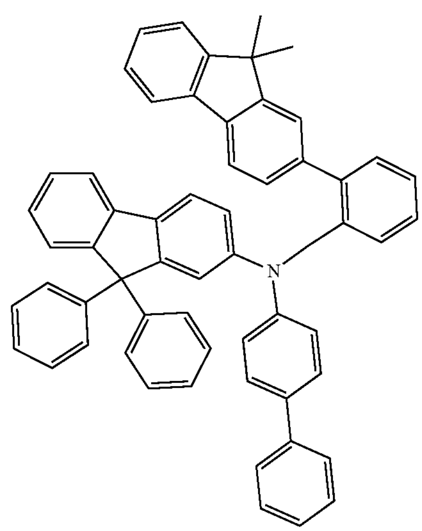

-continued
P2-32
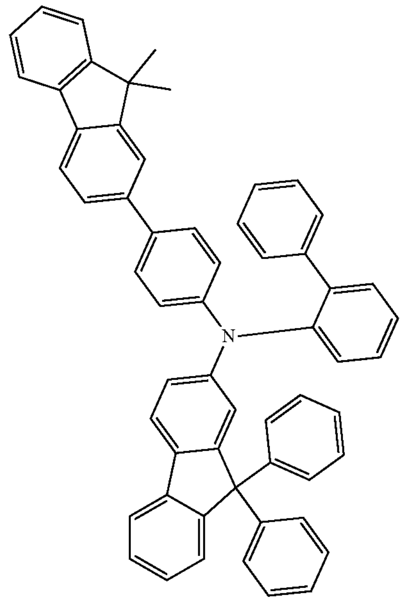
P2-33
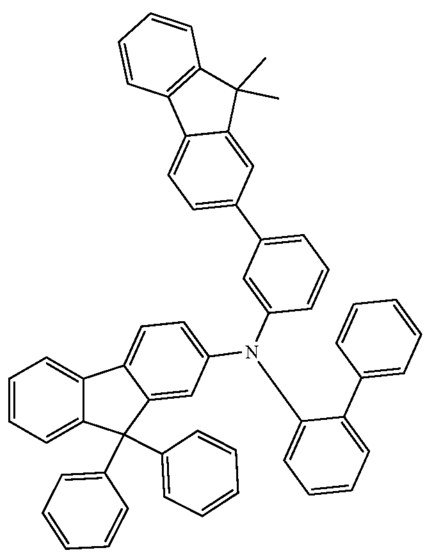
P2-34
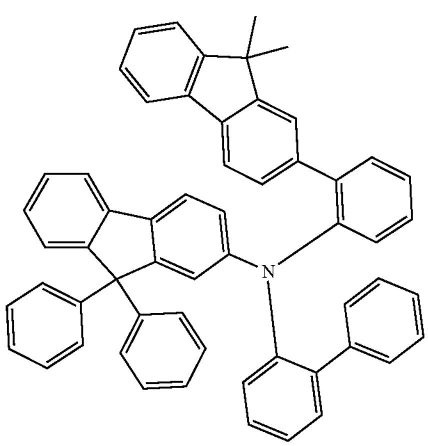
-continued
P2-35
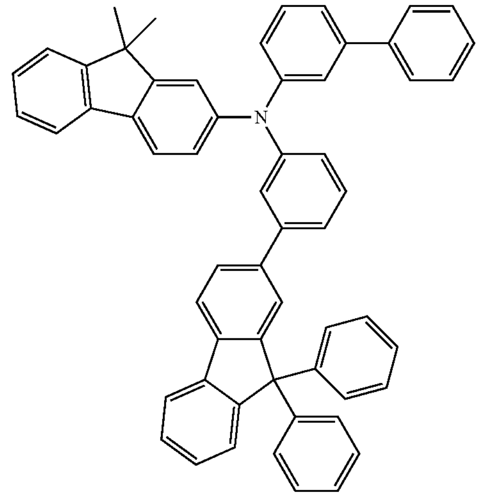
P2-36
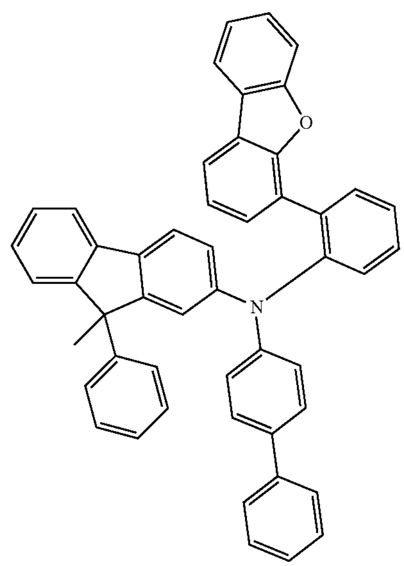

-continued
P2-37
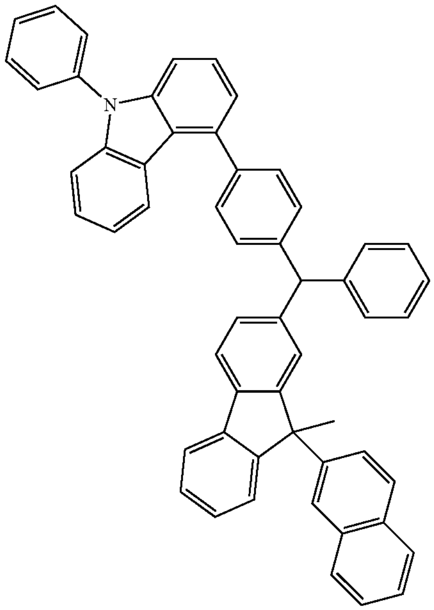
P2-38
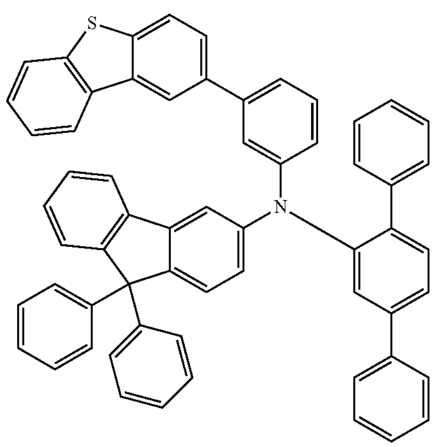
P2-39
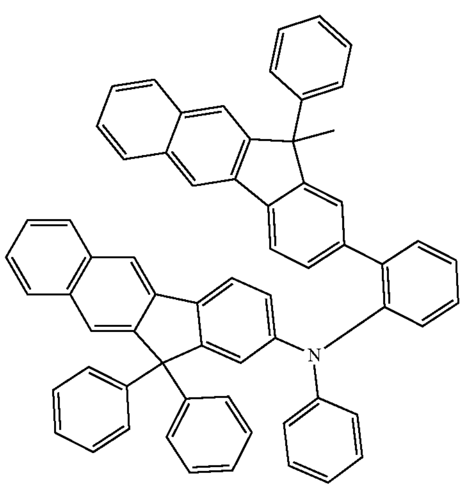
-continued
P2-40
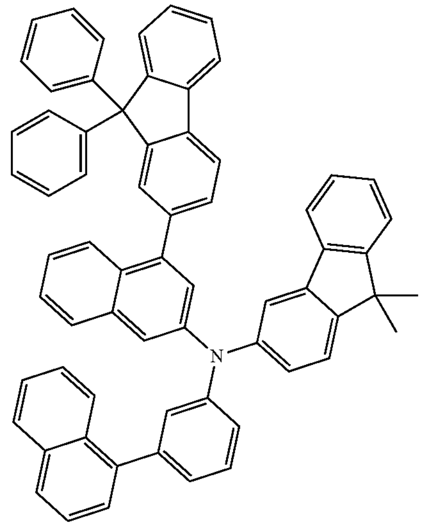
P3-1
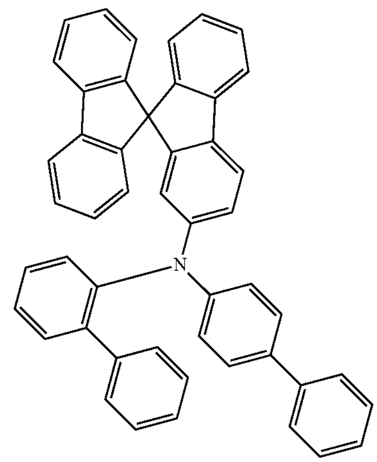
P3-2
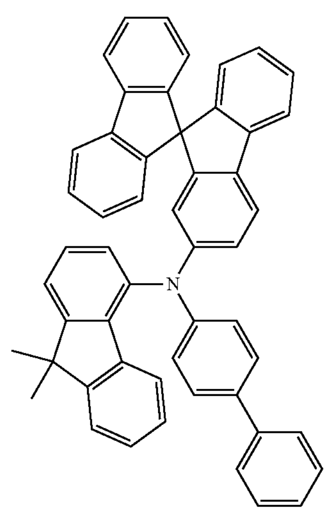

-continued
P3-3
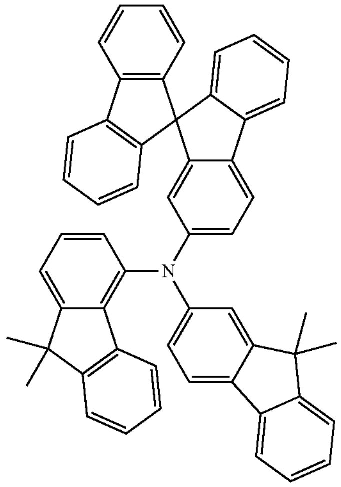
P3-4
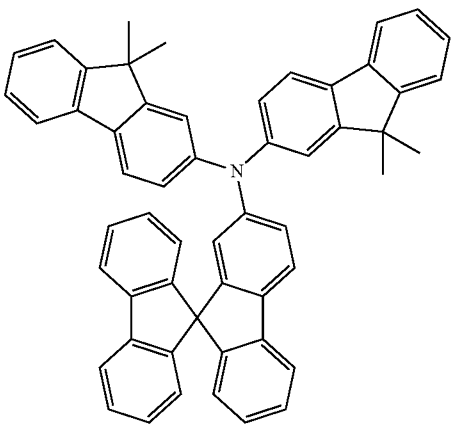
P3-5
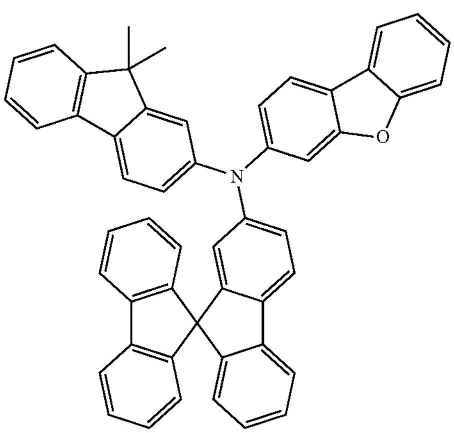
-continued
P3-6
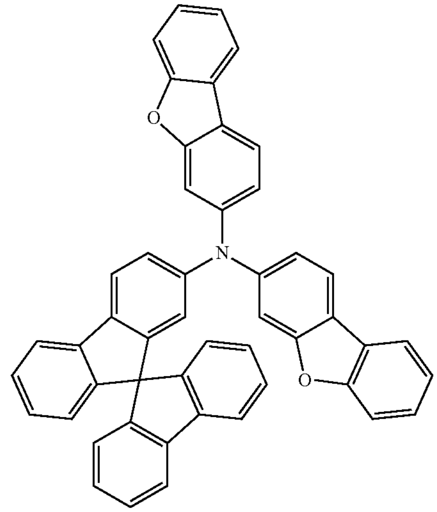
P3-7
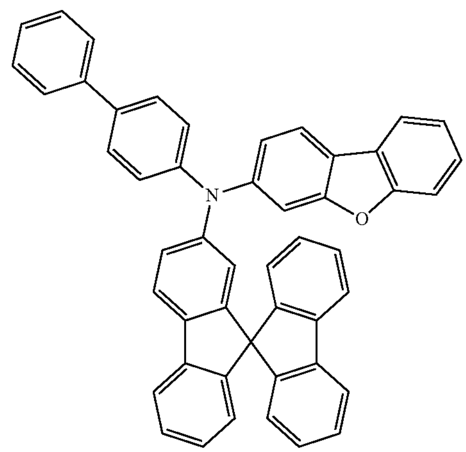
P3-8
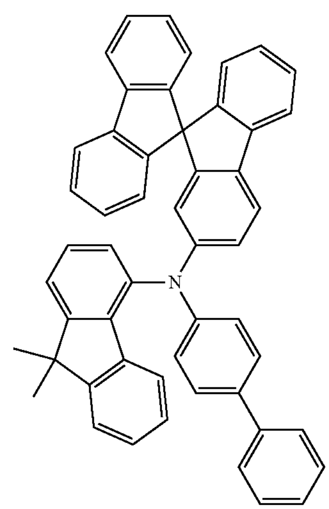

-continued
P3-9
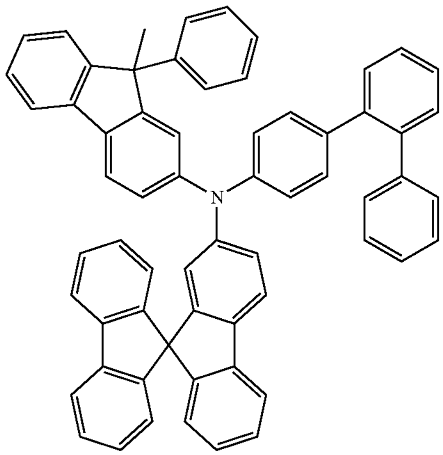
P3-10
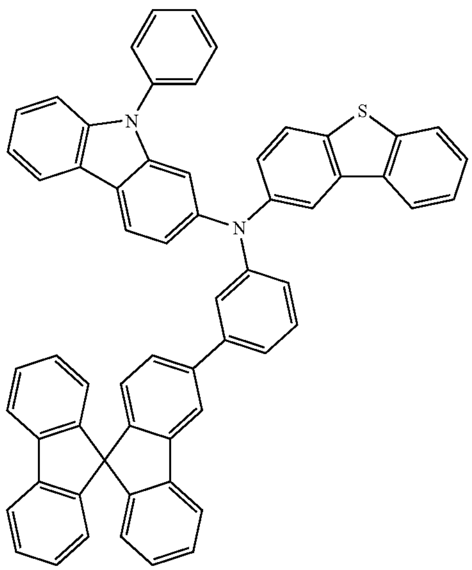
P3-11
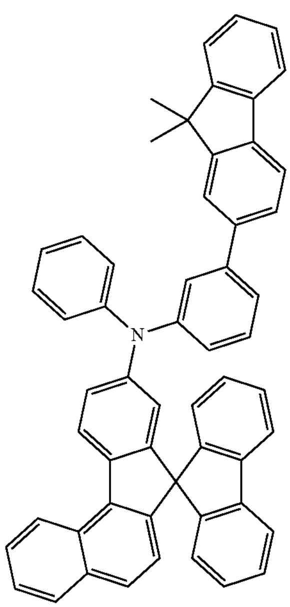
-continued
P3-12
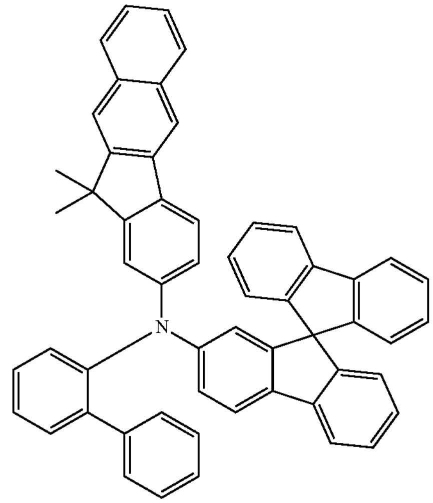
P3-13
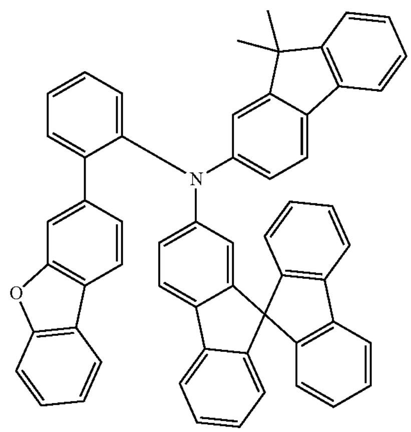
P3-14
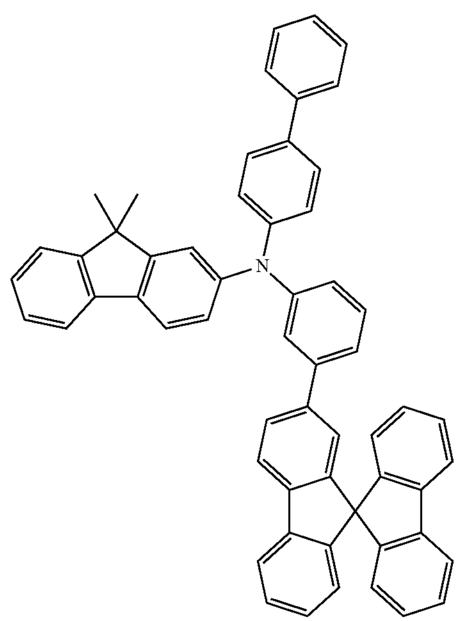

-continued
P3-15
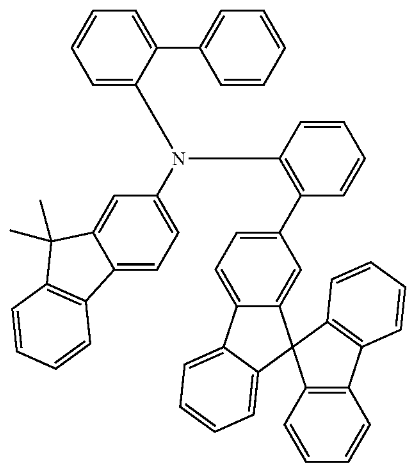
P3-16
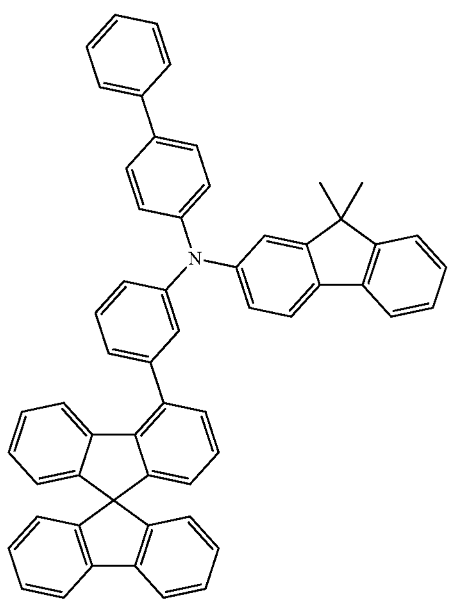
P3-17
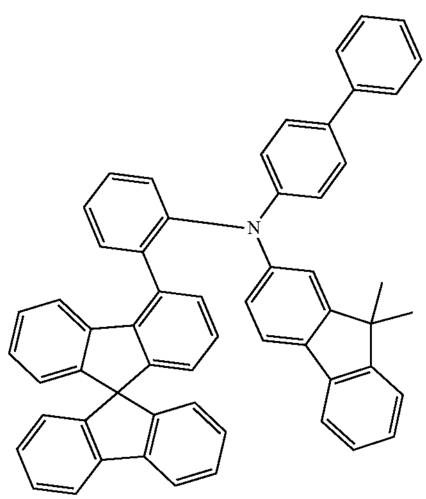
-continued
P3-18
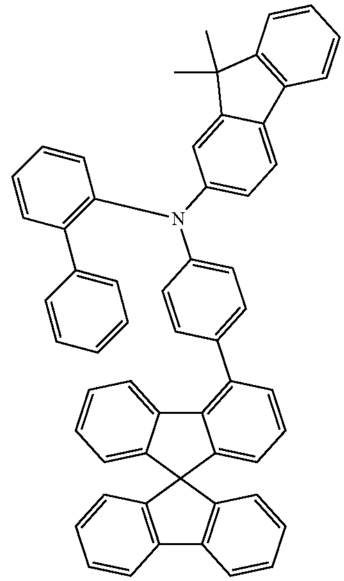
P3-19
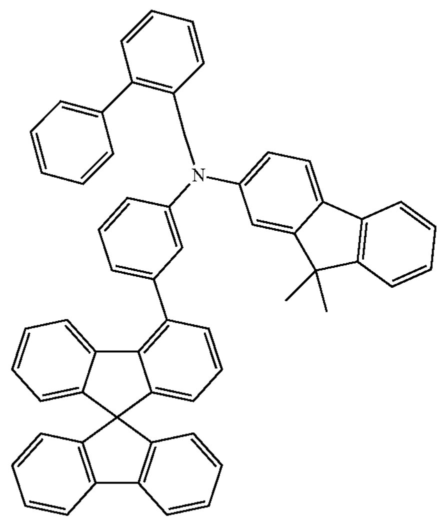
P3-20
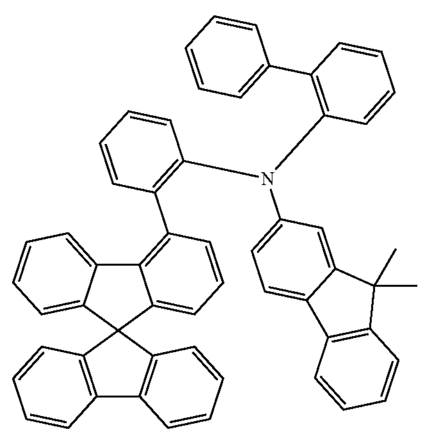

-continued
P3-21
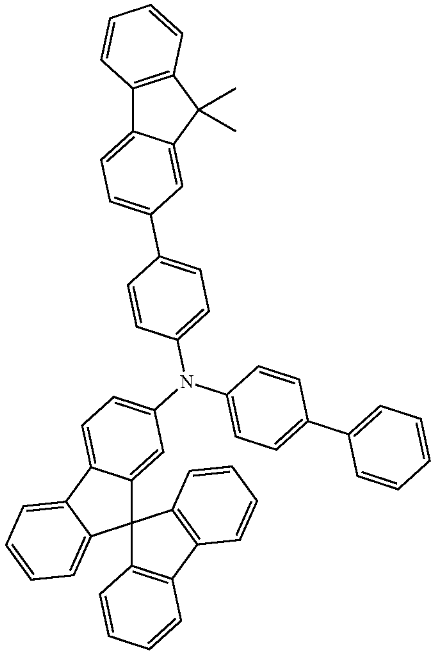
P3-22
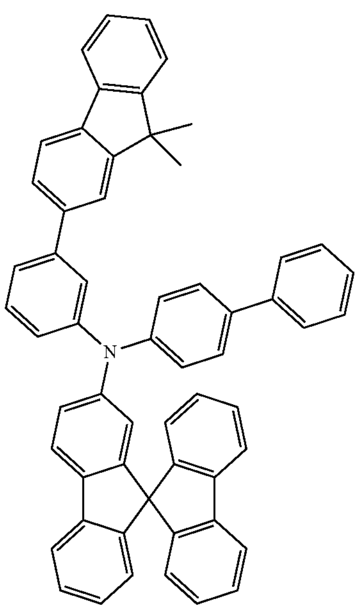
-continued
P3-23
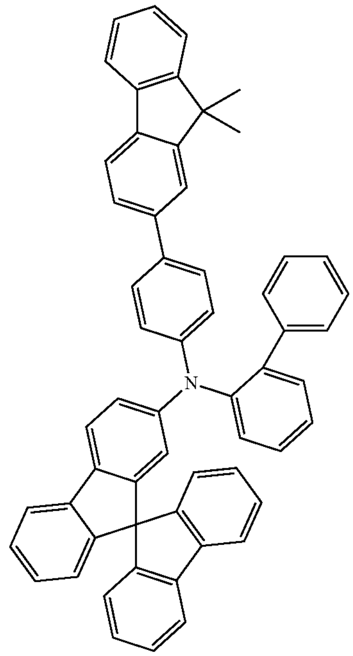
P3-24
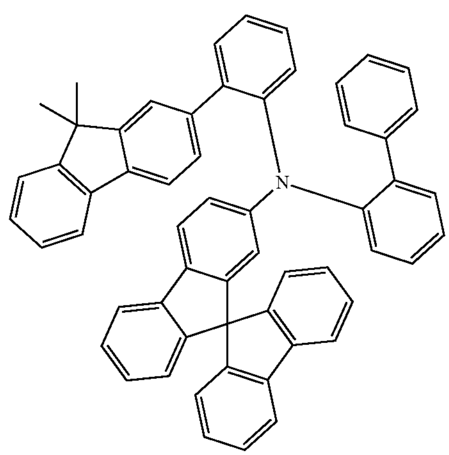

-continued
P3-25
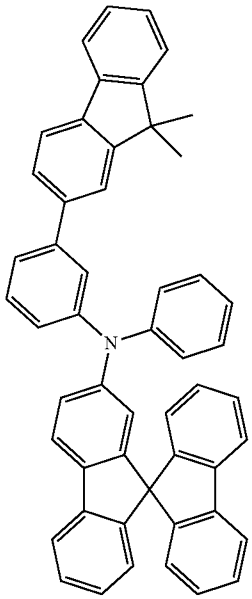
P3-26
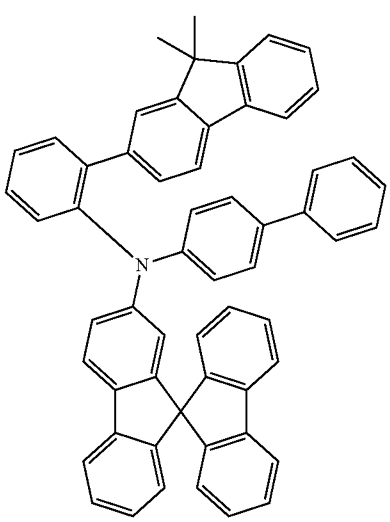
-continued
P3-27
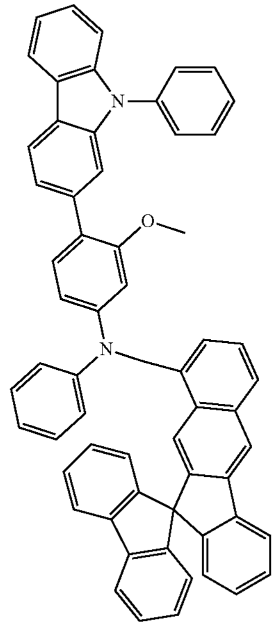
P3-28
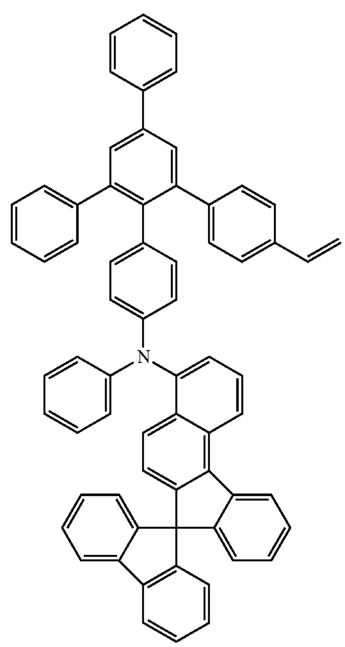

-continued
P3-29
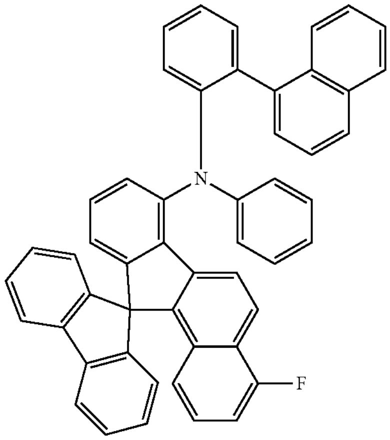
P3-30
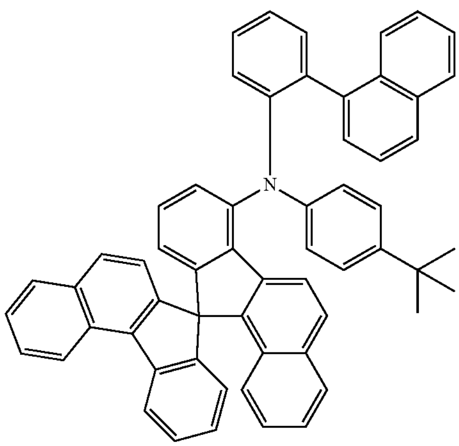
P4-1
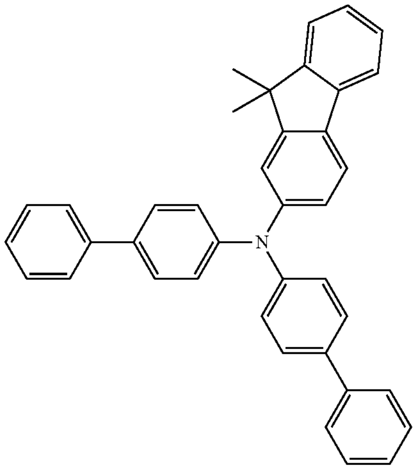
-continued
P4-2
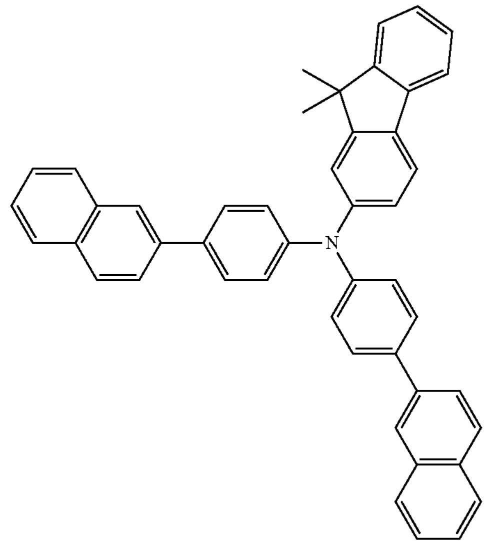
P4-3
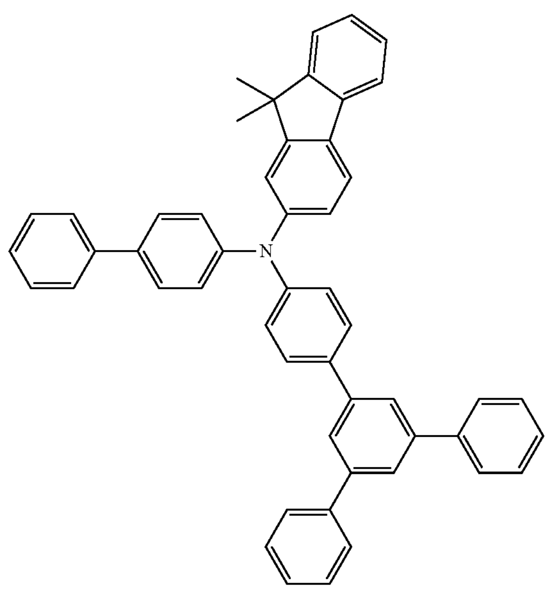

-continued
P4-4
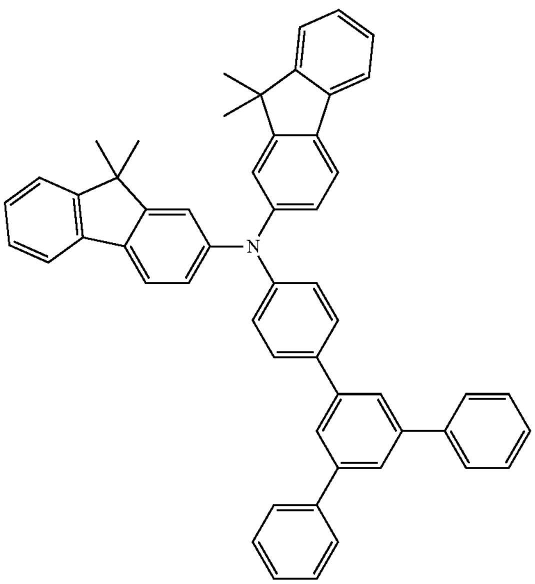
P4-5
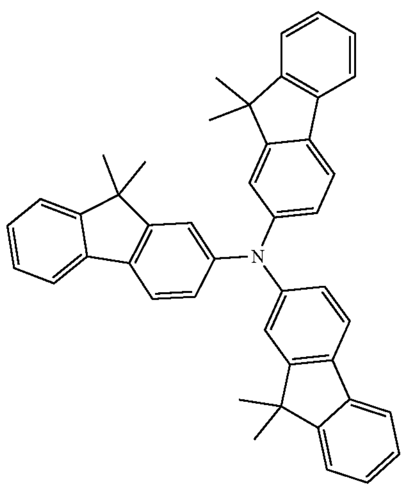
P4-6
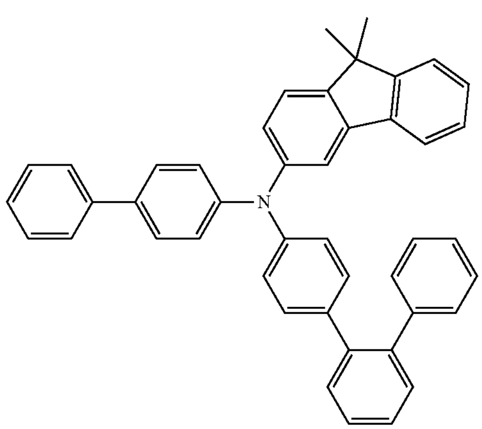
-continued
P4-7
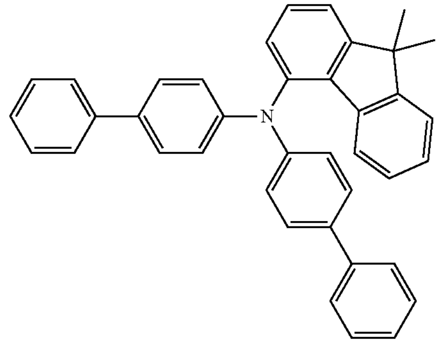
P4-8
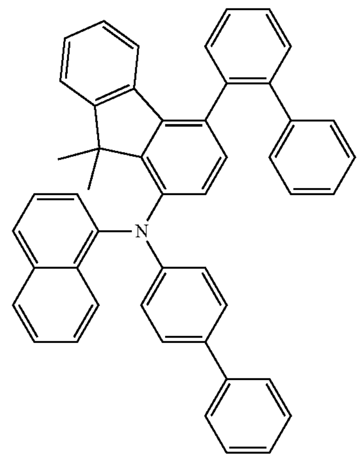
P4-9
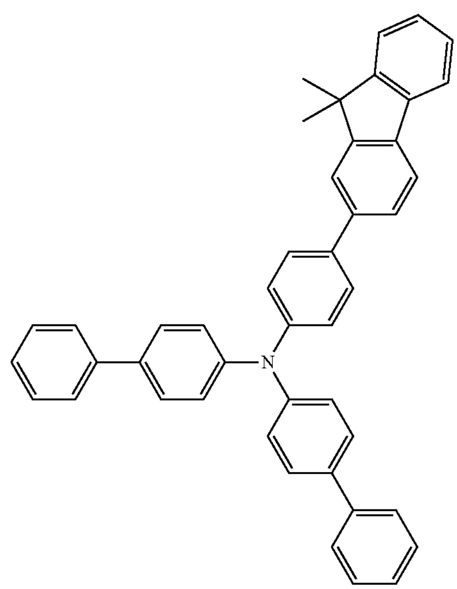

P4-10
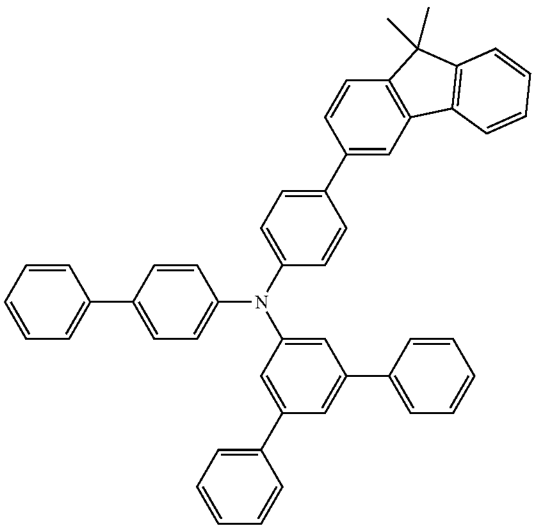
P4-11
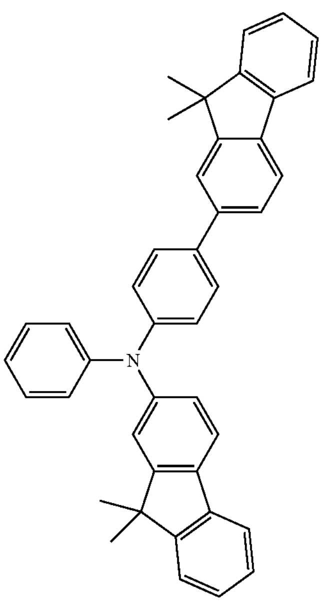
P4-12
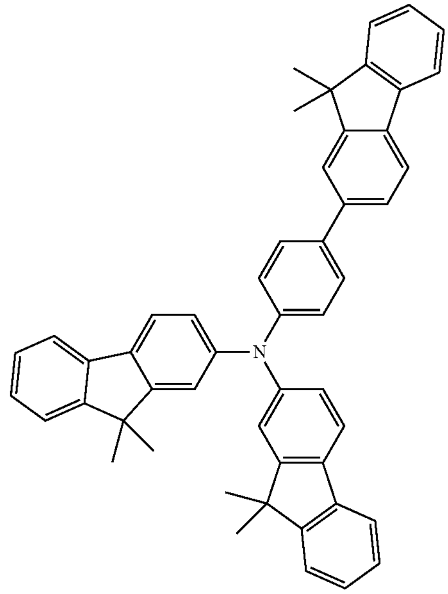
P4-13
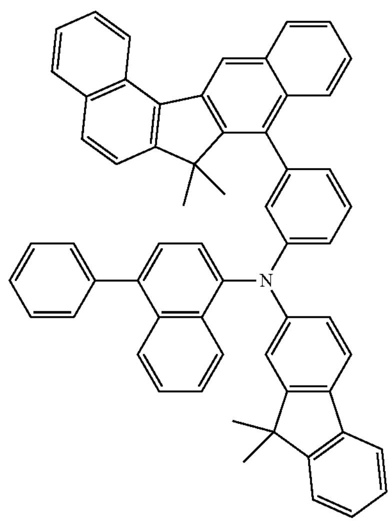
P4-14
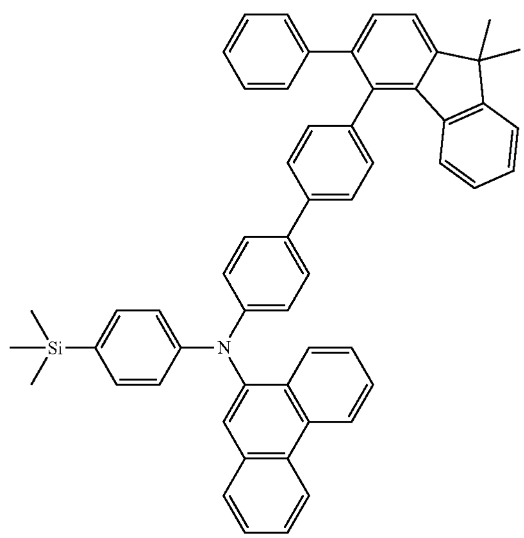

-continued
P4-15
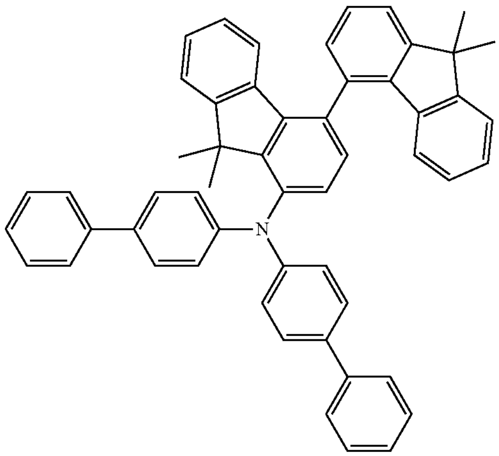
P4-16
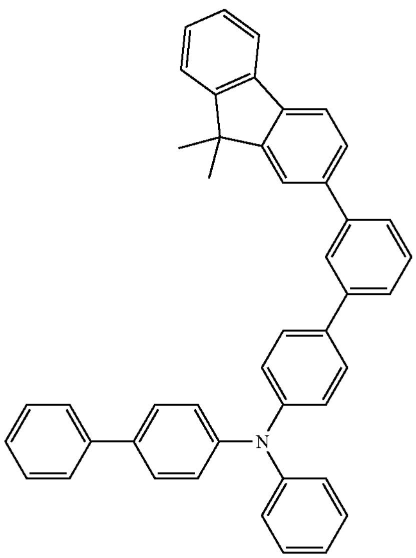
P4-17
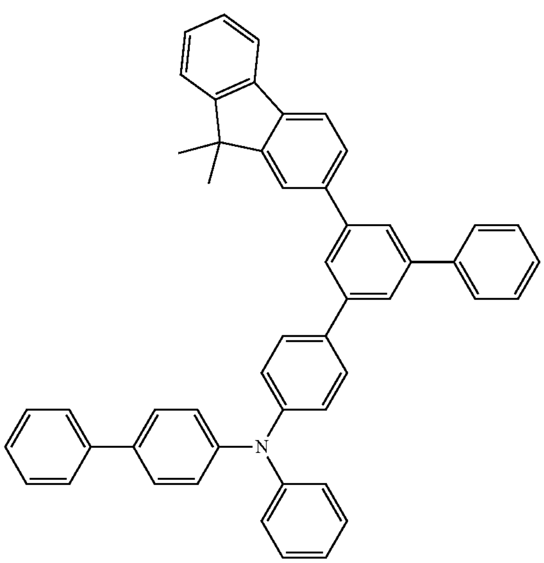
-continued
P4-18
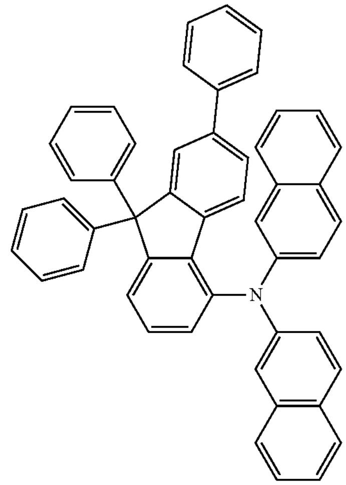
P4-19
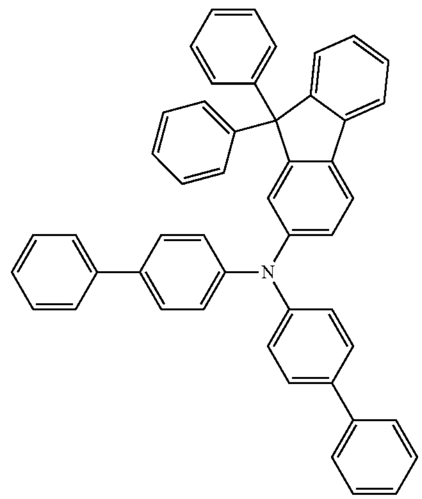
P4-20
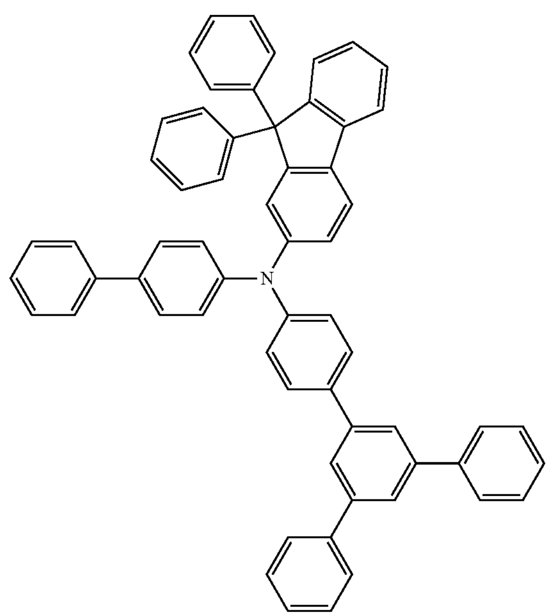

-continued
P4-21
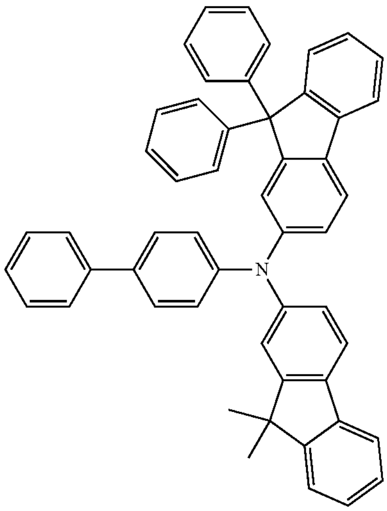
P4-22
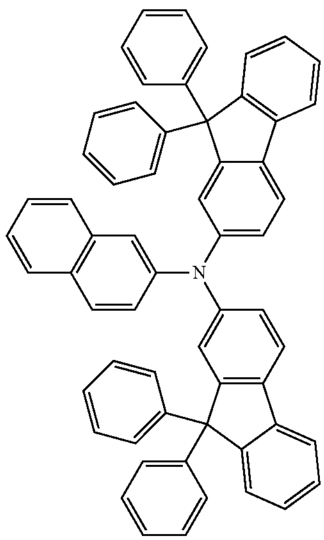
P4-23
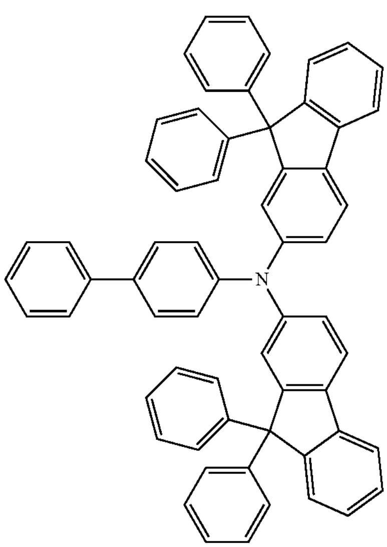
-continued
P4-24
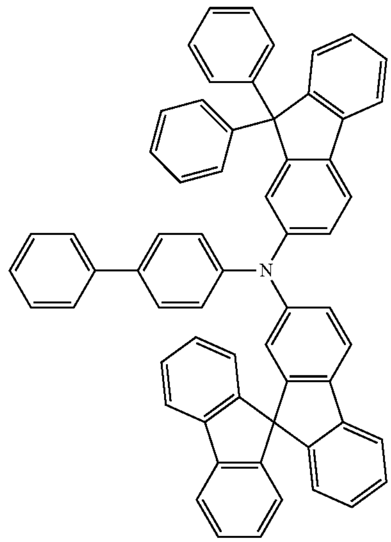
P4-25
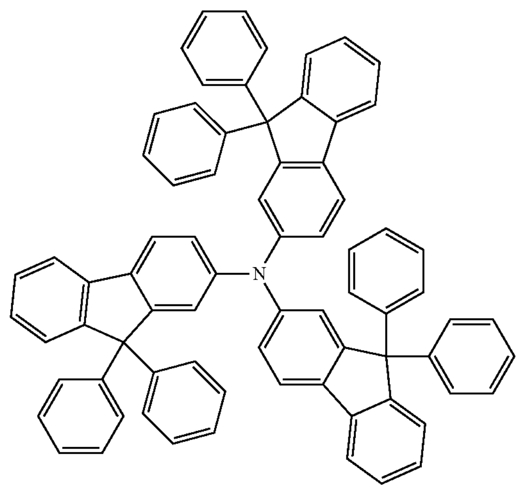
P4-26
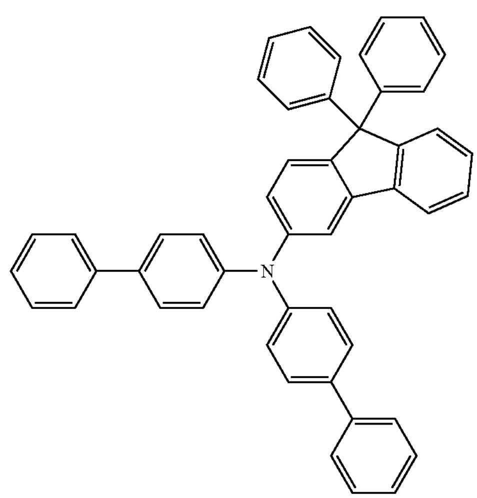

-continued
P4-27
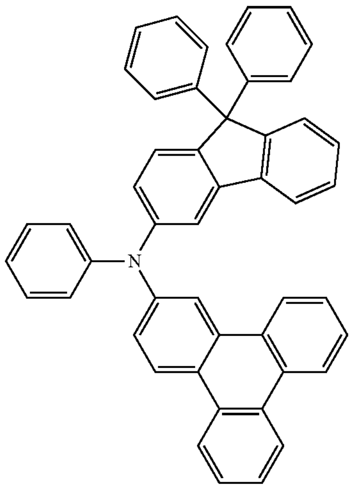
P4-28
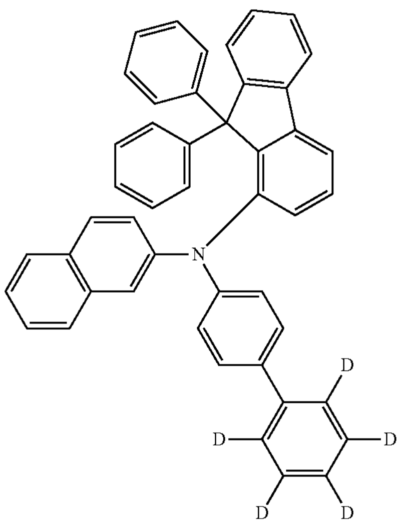
P4-29
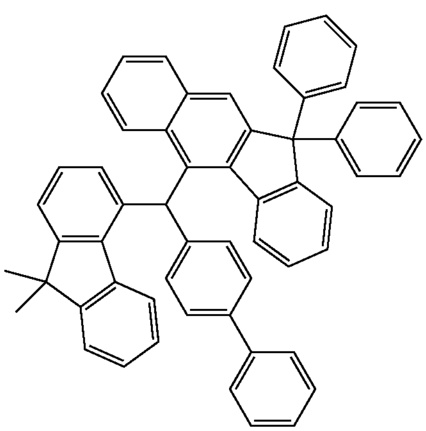
-continued
P4-30
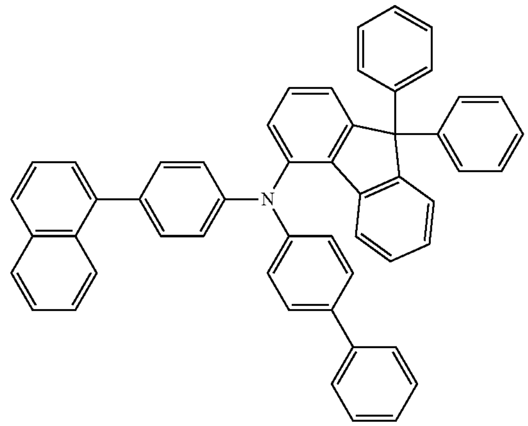
P4-31
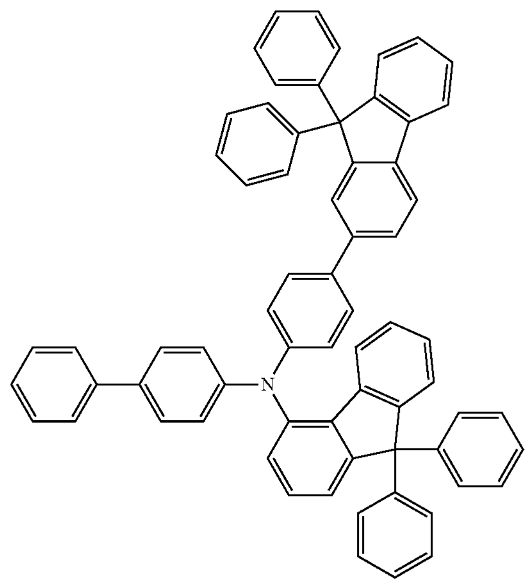
P4-32
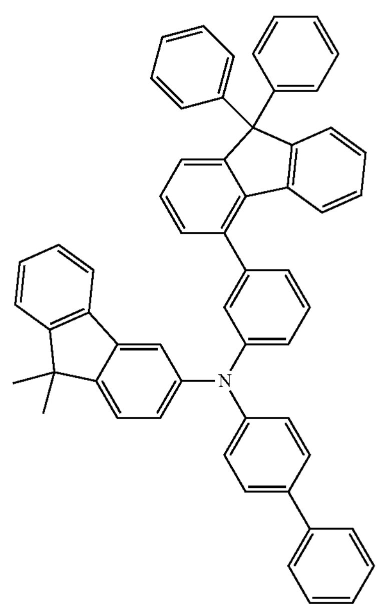

-continued
P4-33
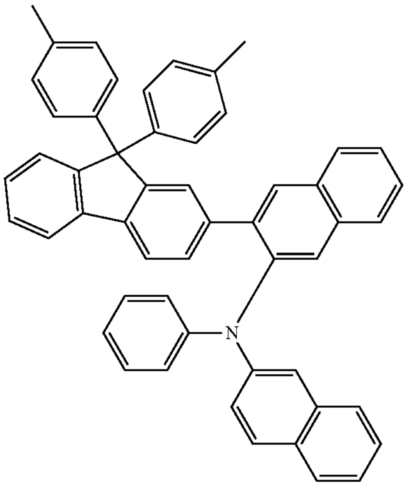
P4-34
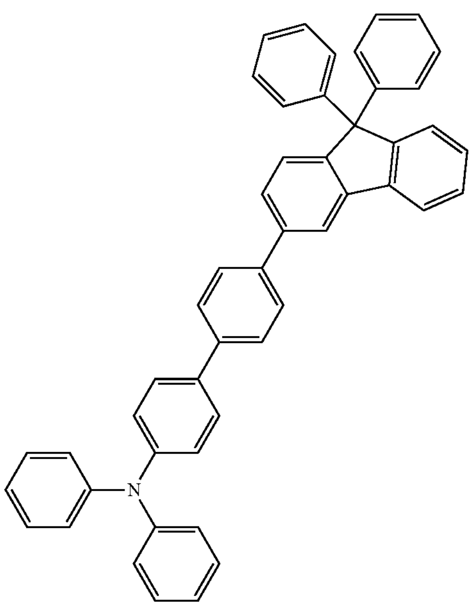
-continued
P4-35
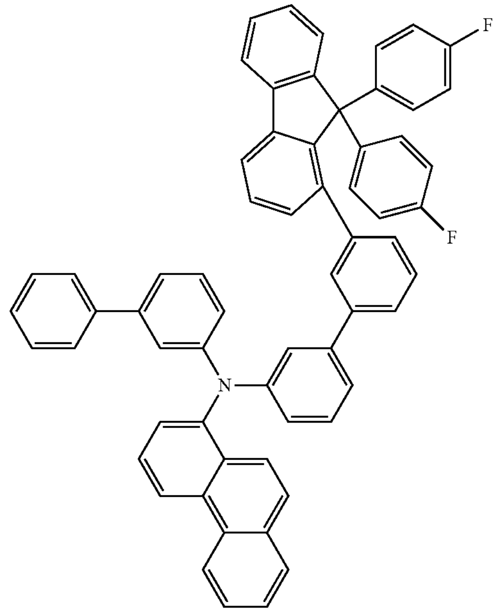
P4-36
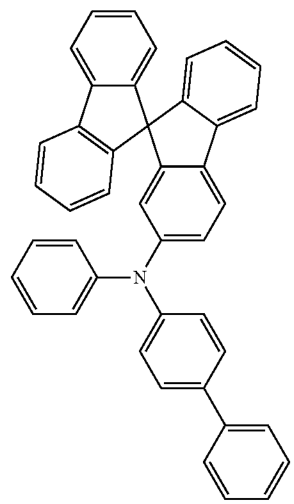
P4-37
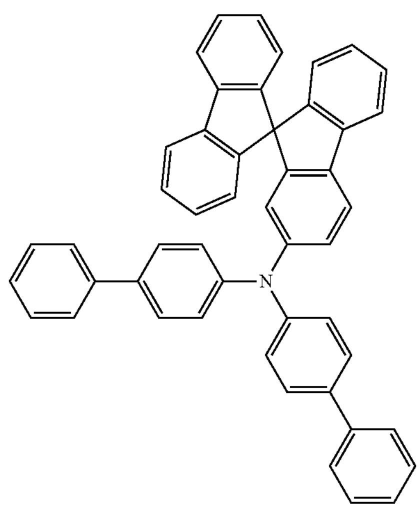

-continued
P4-38
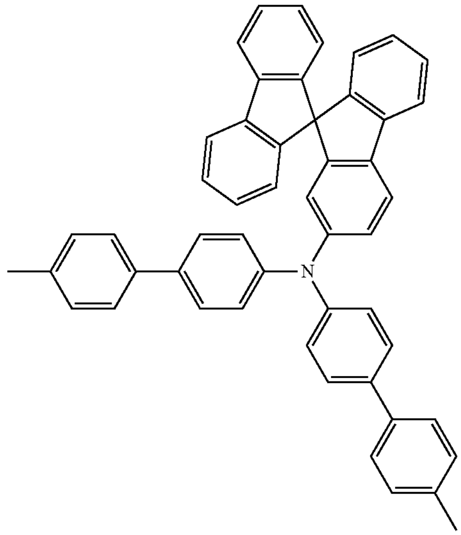
P4-39
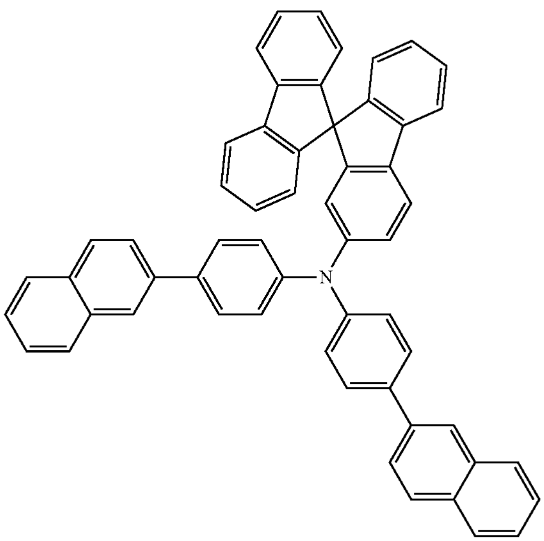
P4-40
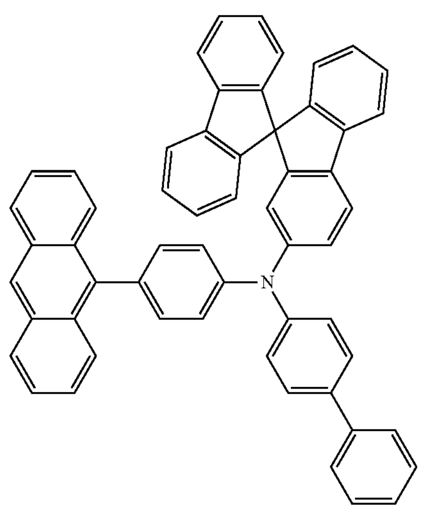
-continued
P4-41
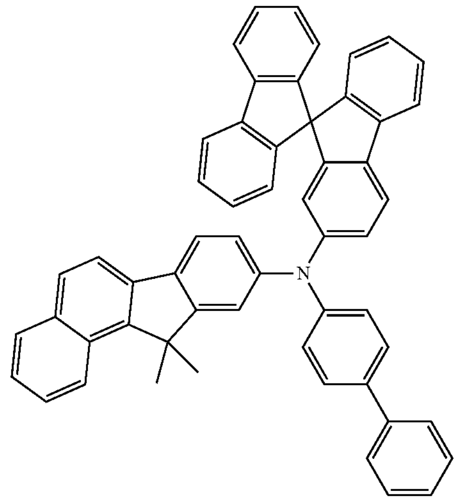
P4-42
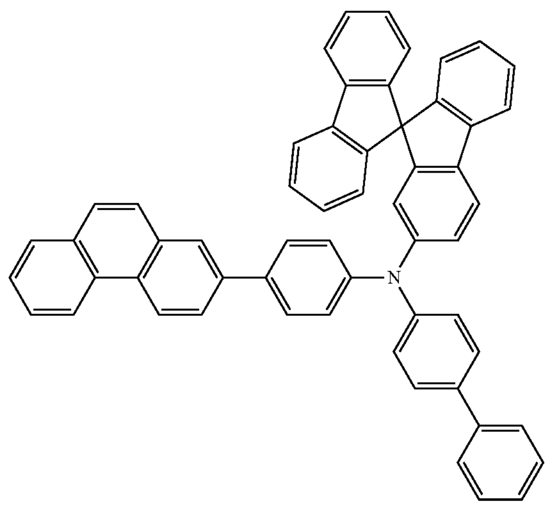
P4-43
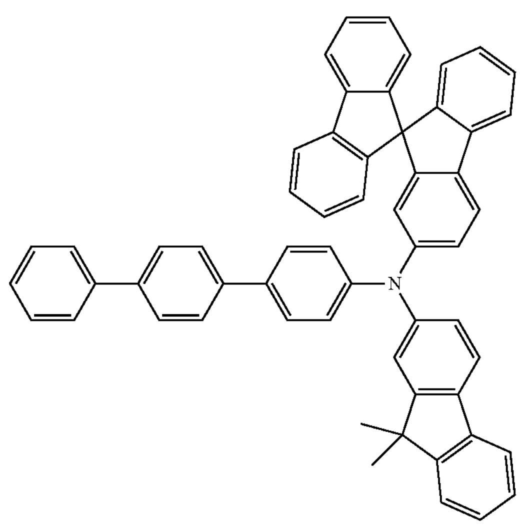

-continued
P4-44
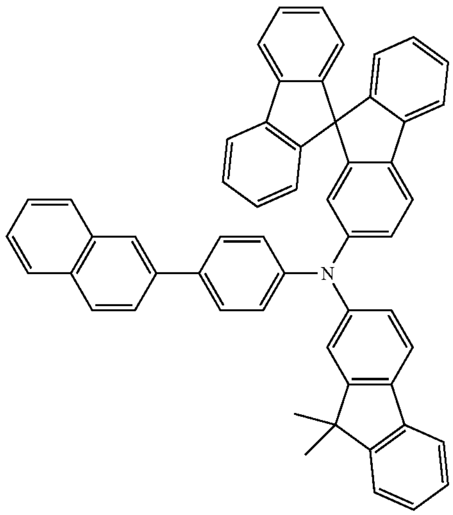
P4-45
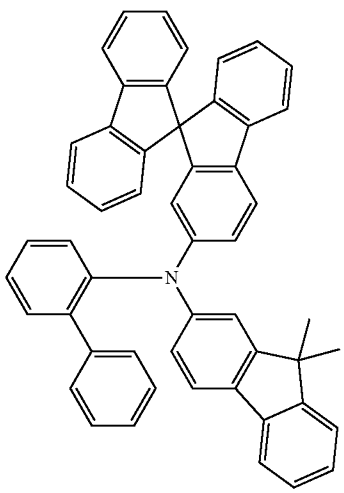
P4-46
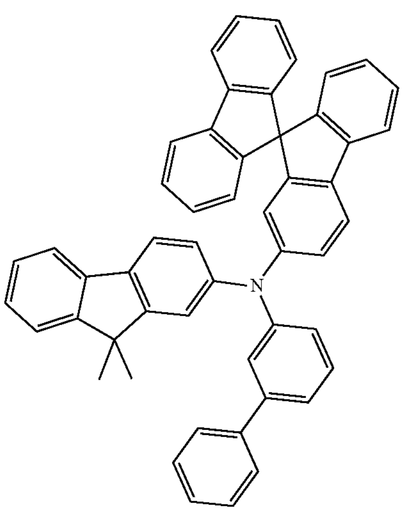
-continued
P4-47
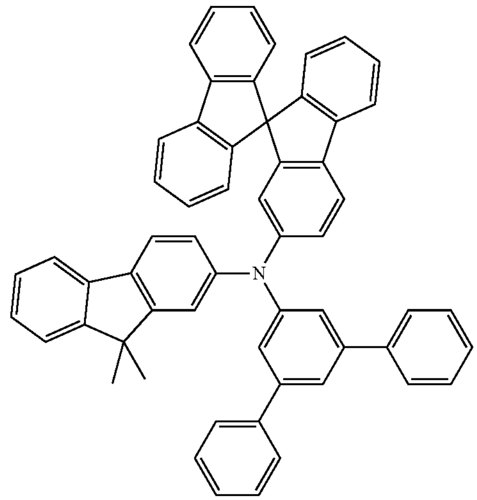
P4-48
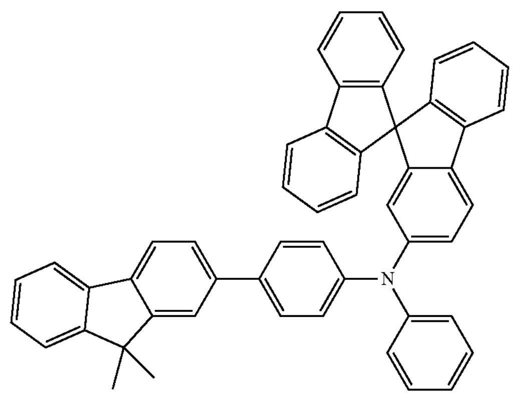
P4-49
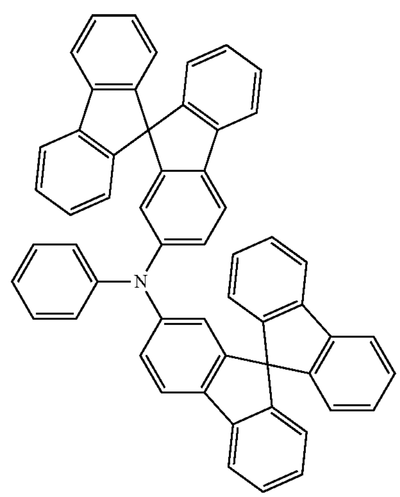

-continued
P4-50
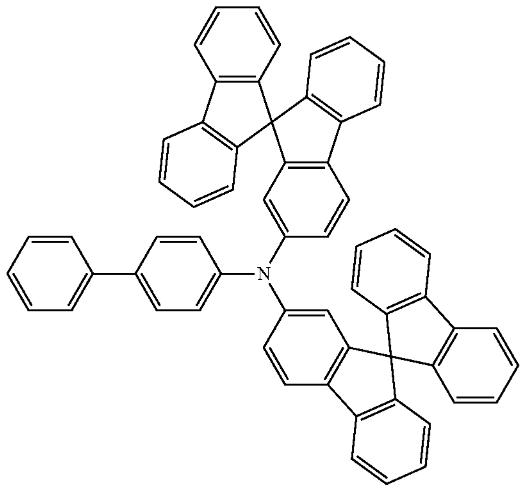
P4-51
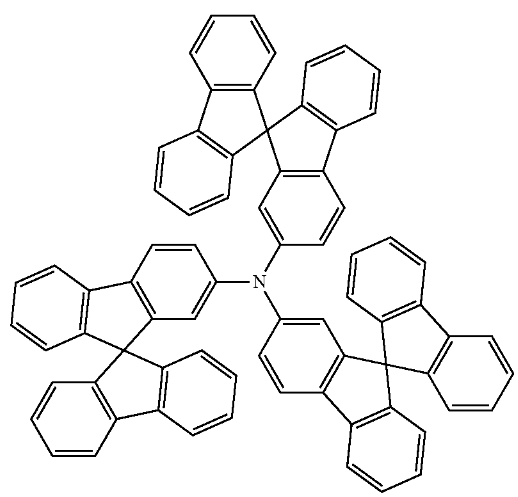
P4-52
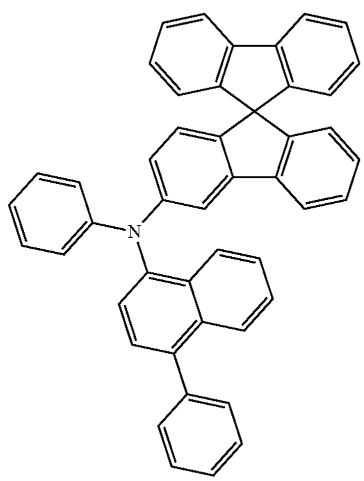
-continued
P4-53
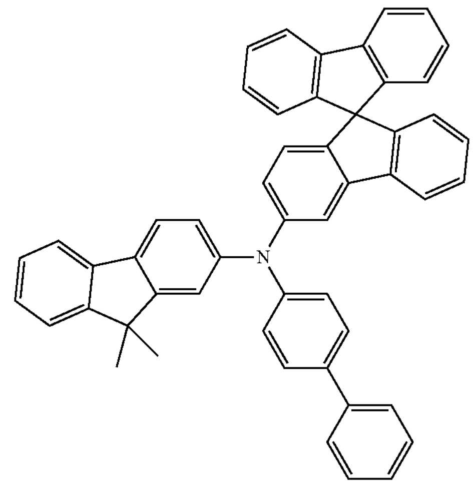
P4-54
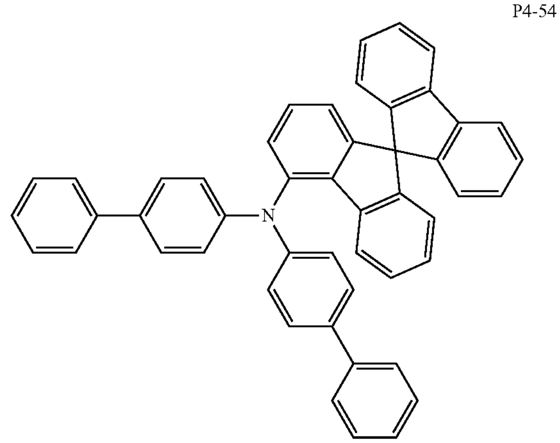
P4-55
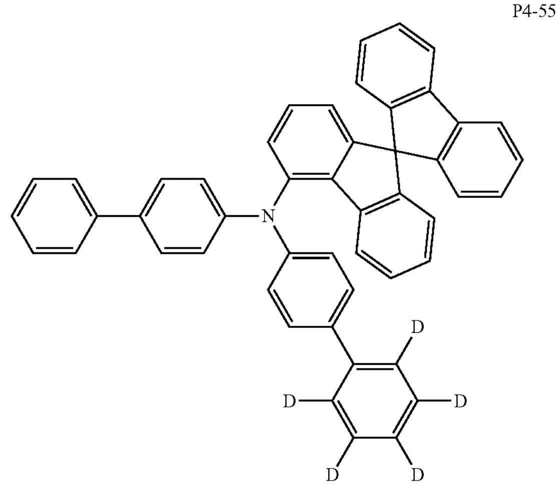

-continued
P4-56
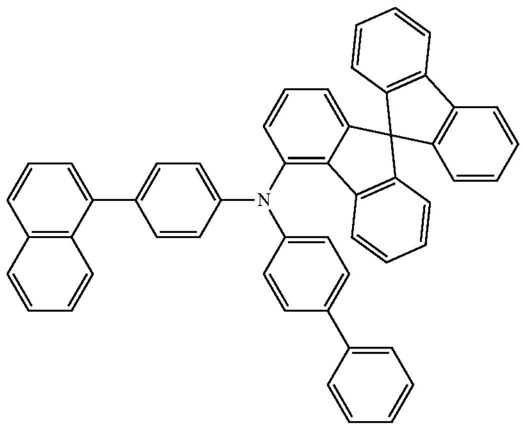
P4-57
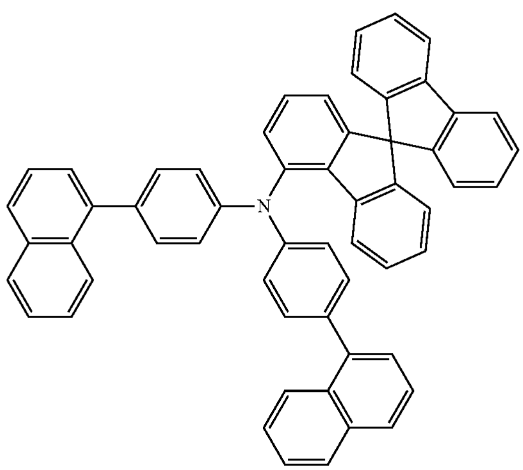
P4-58
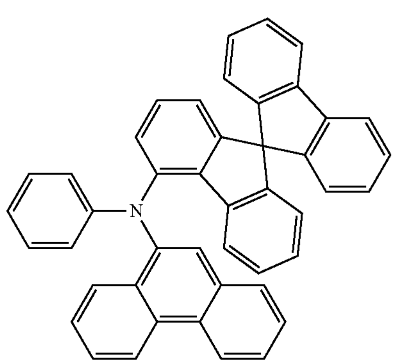
-continued
P4-59
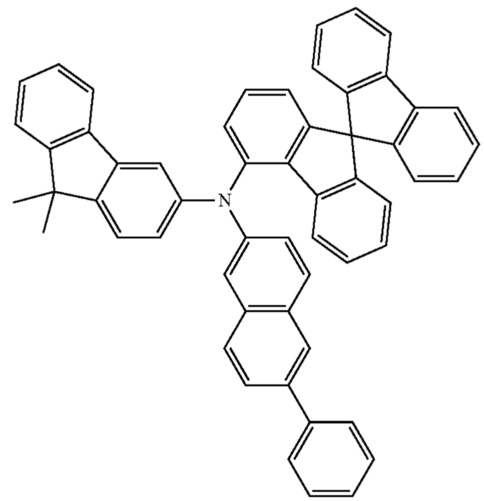
P4-60
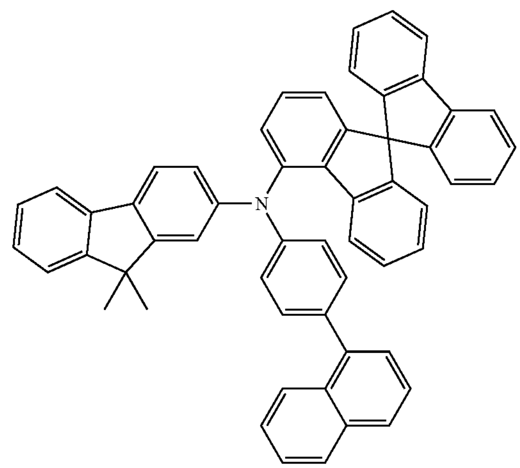
P4-61
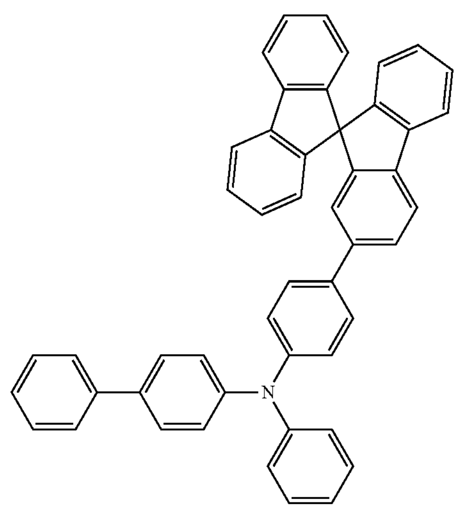

-continued
P4-62
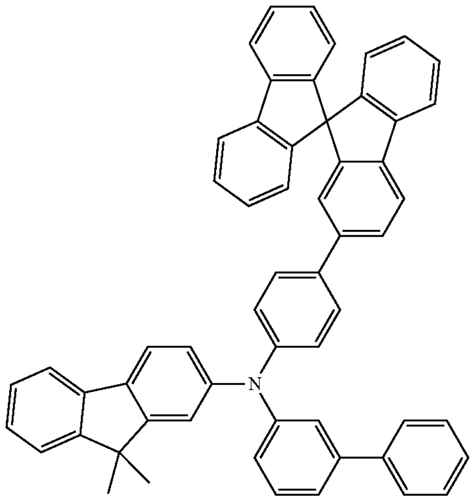
P4-63
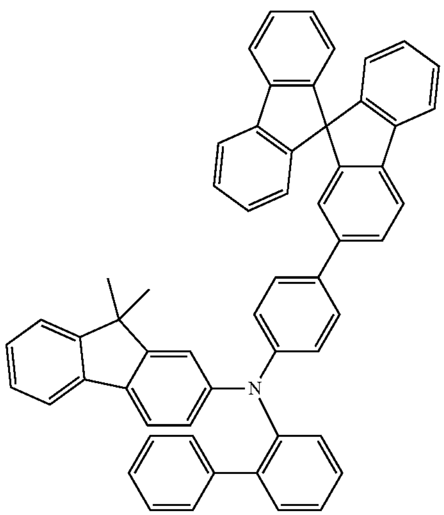
P4-64
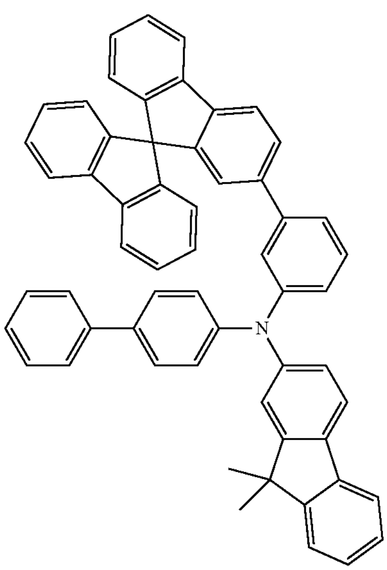
-continued
P4-65
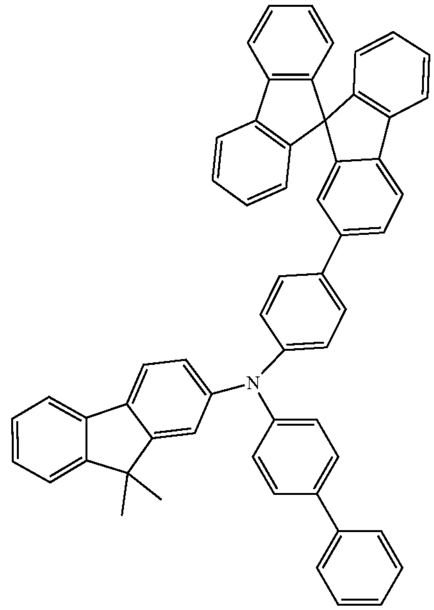
P4-66
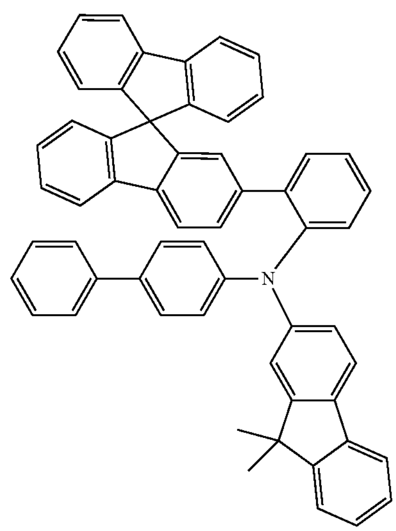

-continued
P4-67
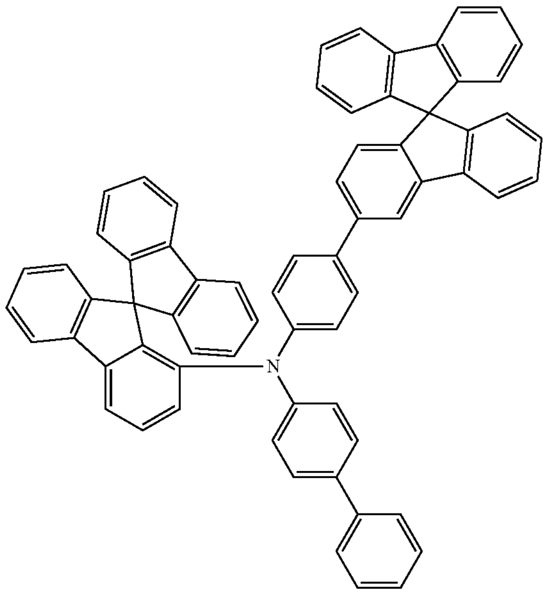
P4-68
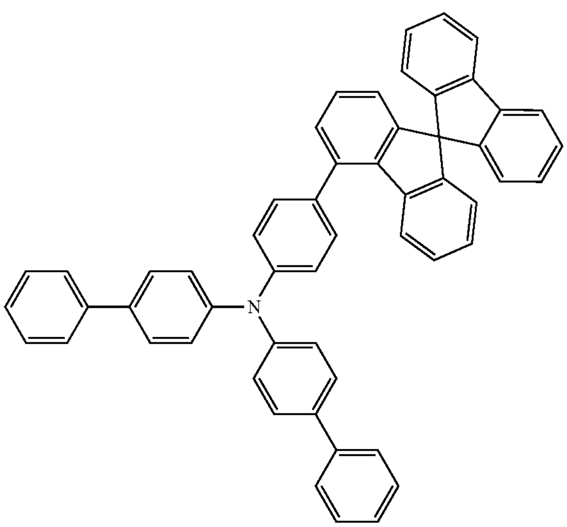
-continued
P4-69
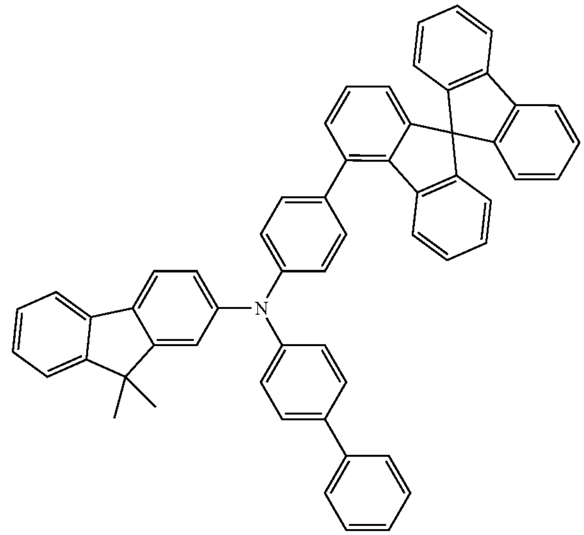
P4-70
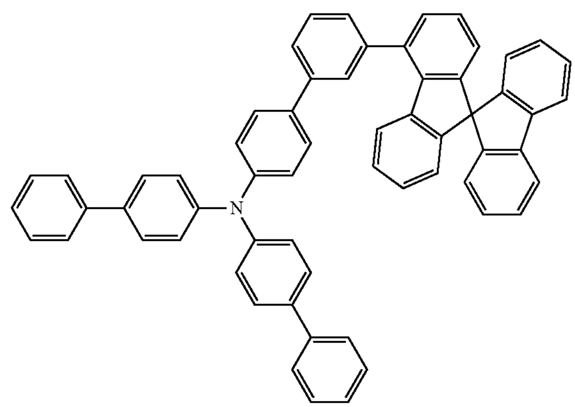
P5-1
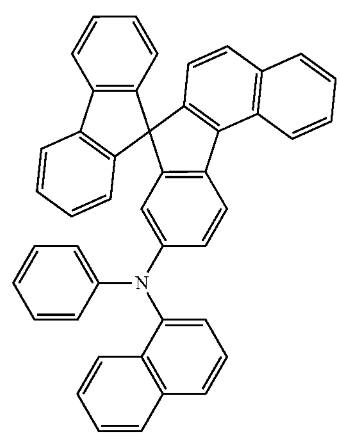

-continued
P5-2
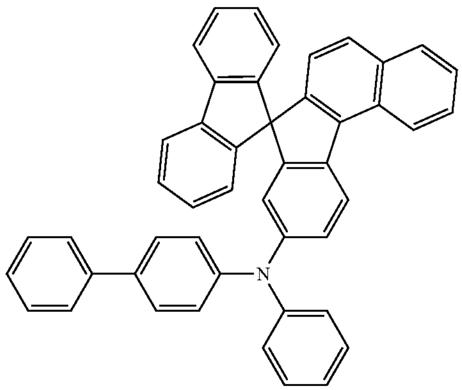
P5-3
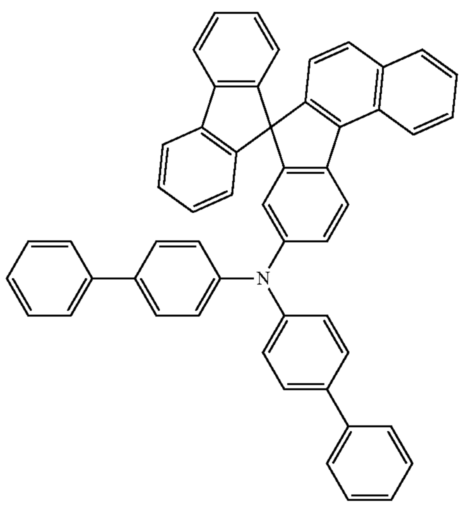
P5-4
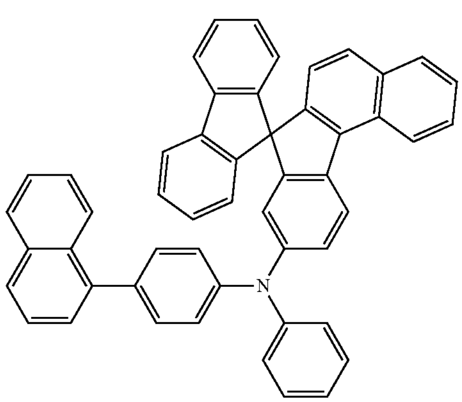
-continued
P5-5
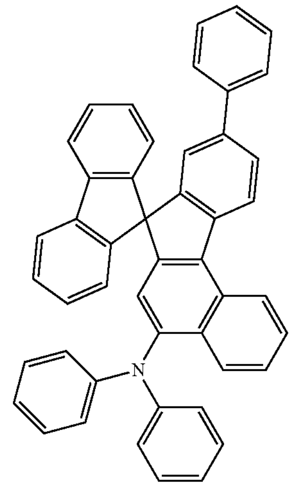
P5-6
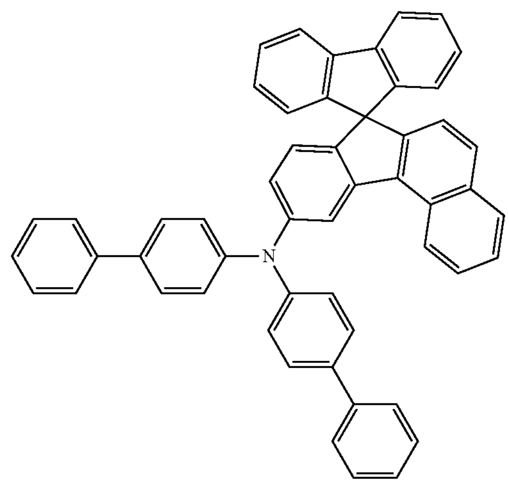
P5-7
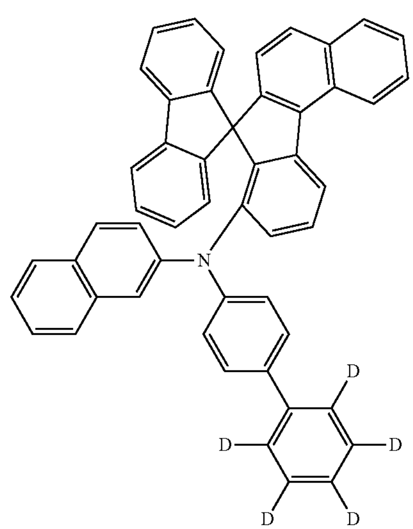

-continued
P5-8
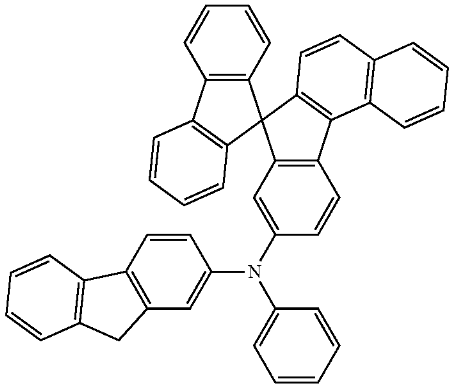
P5-9
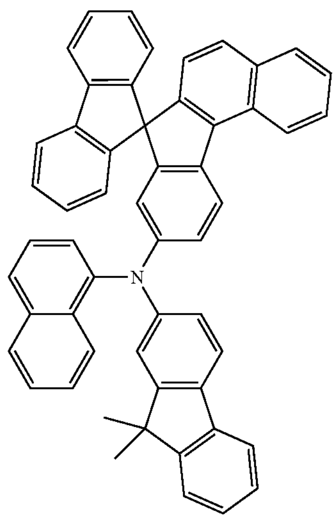
P5-10
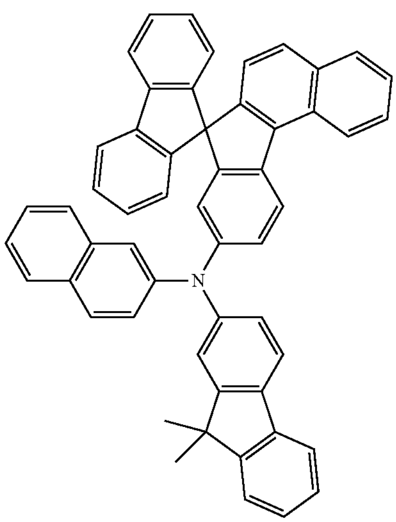
-continued
P5-11
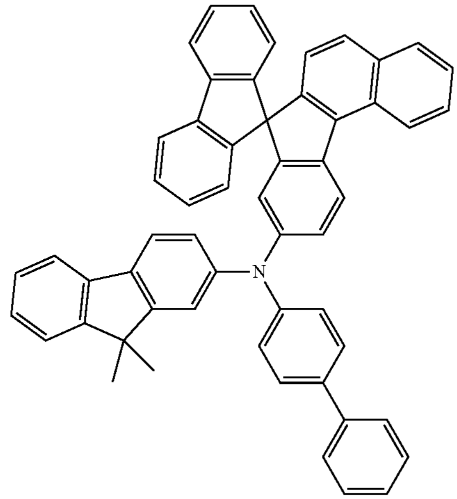
P5-12
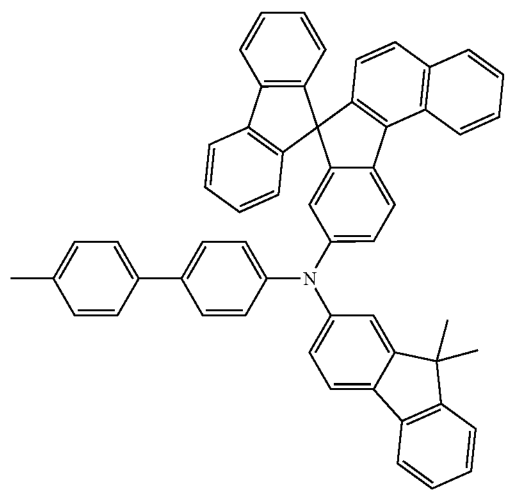
P5-13
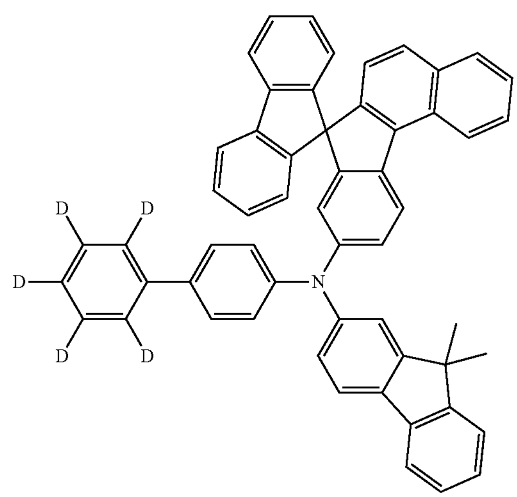

P5-14
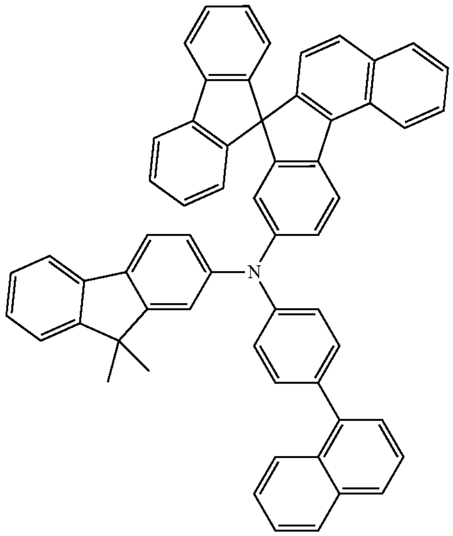
P5-15
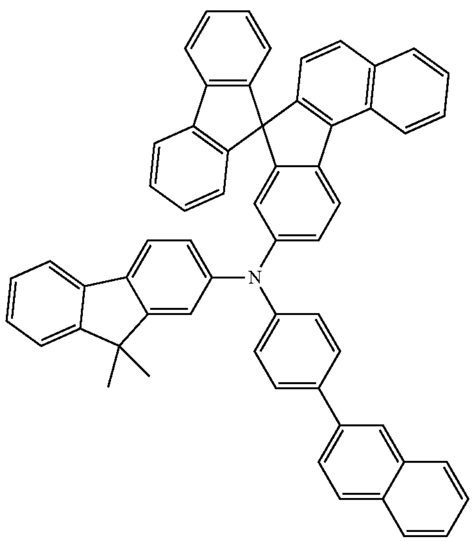
P5-16
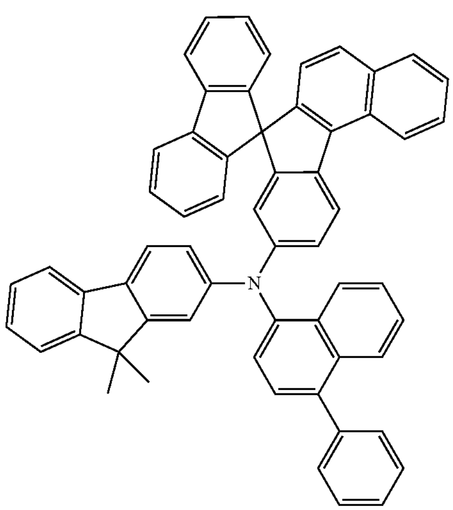
P5-17
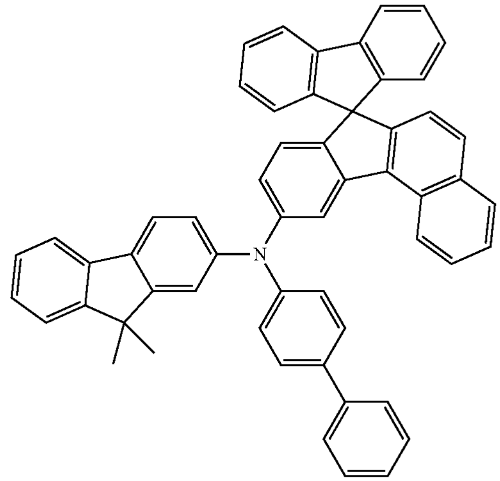
P5-18
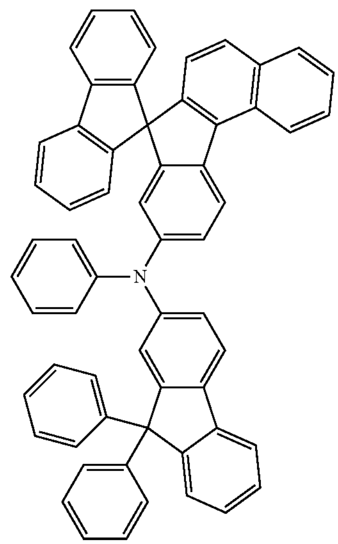
P5-19
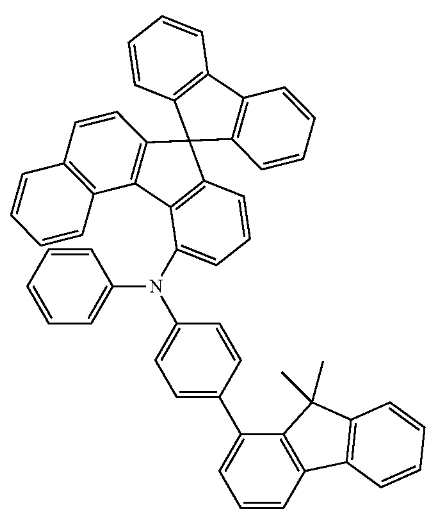

P5-20
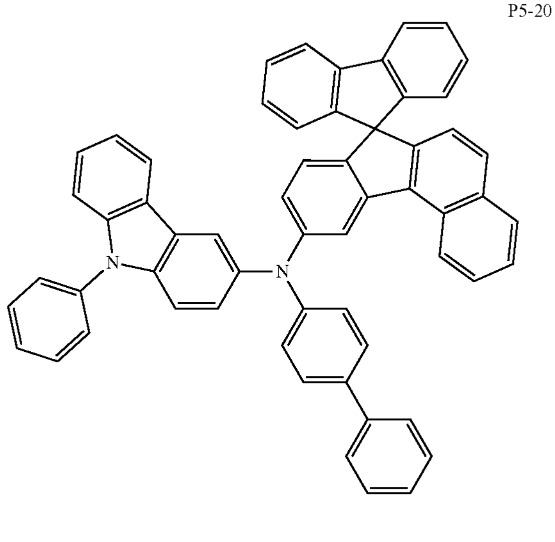
P5-21
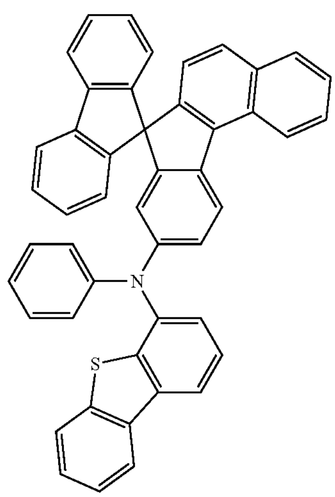
P5-22
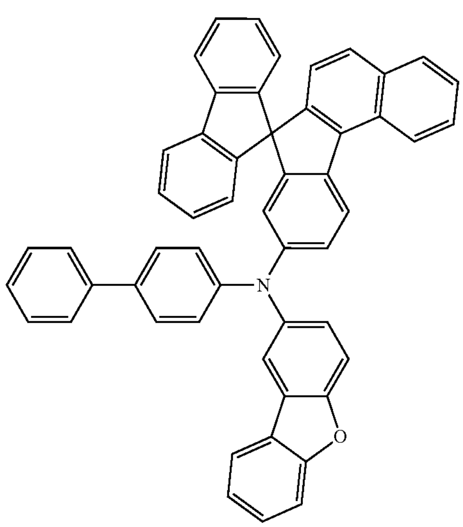
P5-23
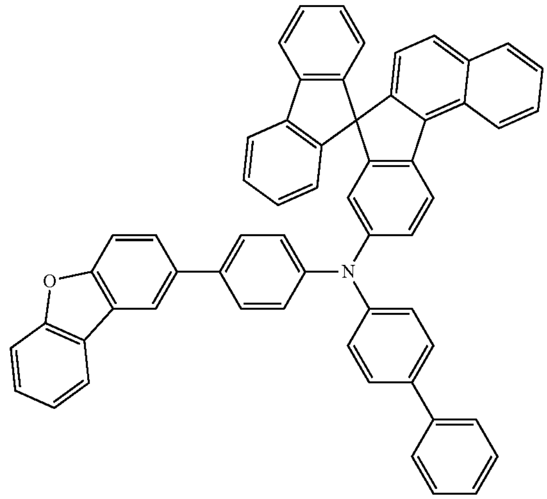
P5-24
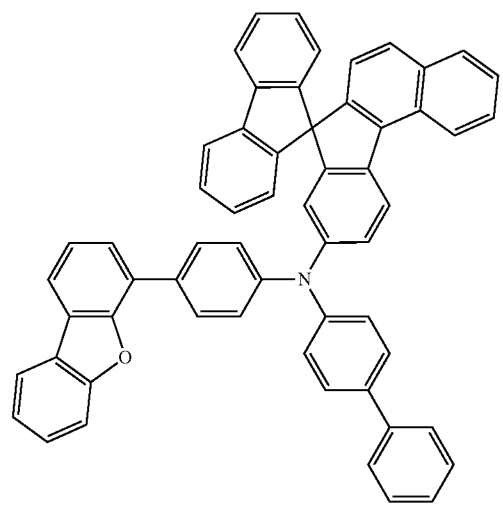
P5-25
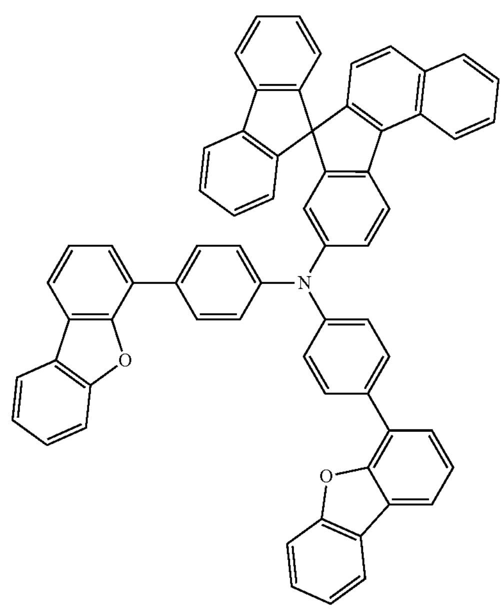

-continued
P5-26
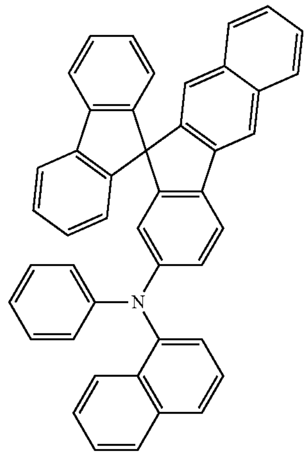
P5-27
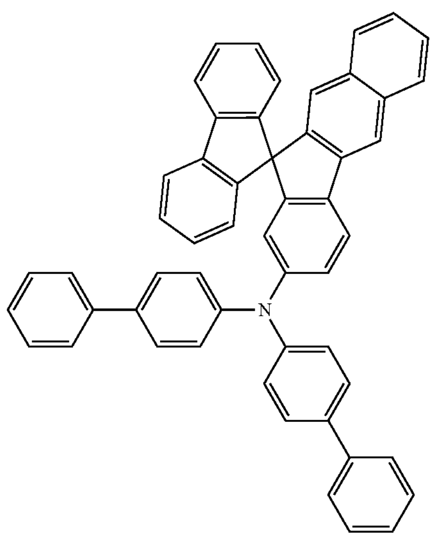
P5-28
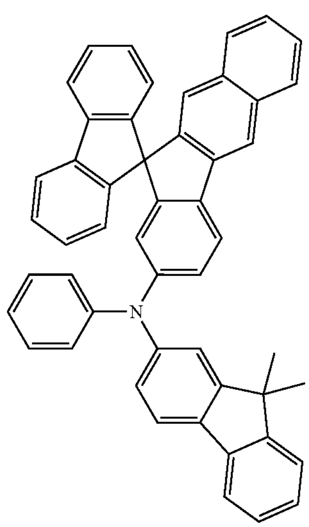
-continued
P5-29
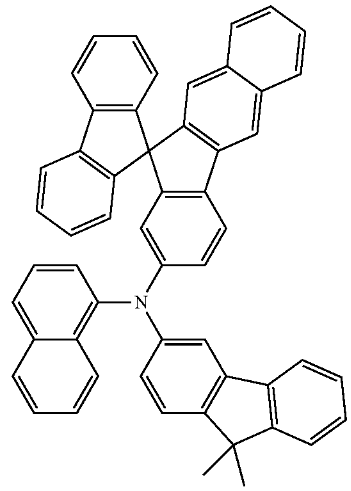
P5-30
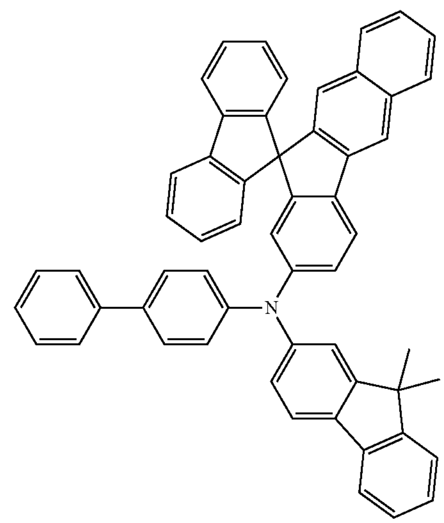
P5-31
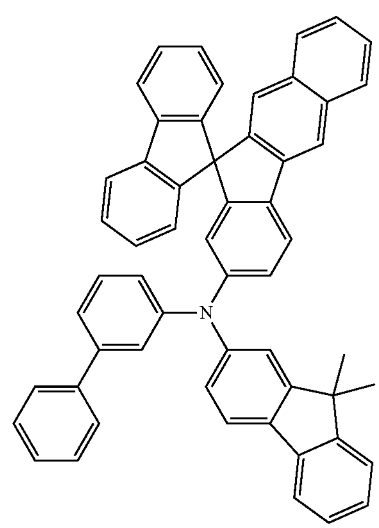

-continued
P5-32
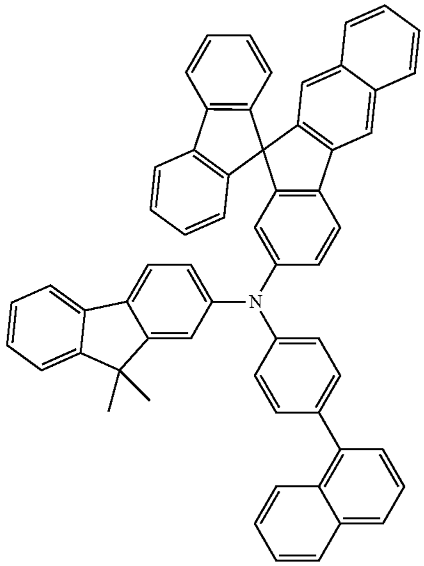
P5-33
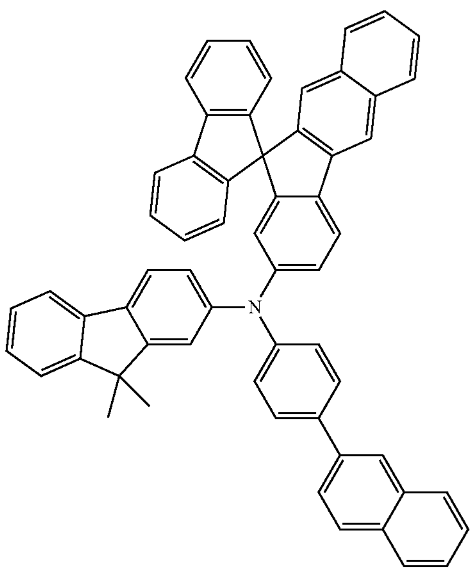
P5-34
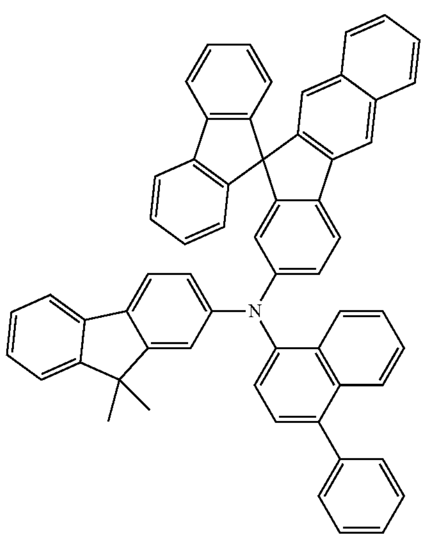
-continued
P5-35
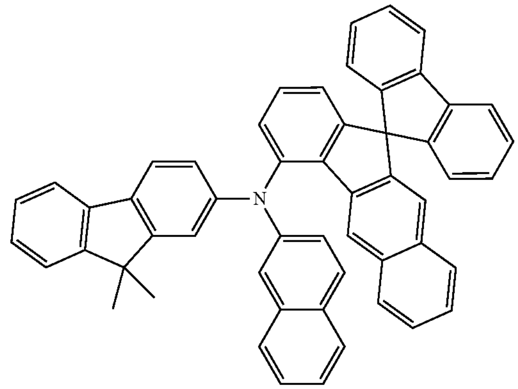
P5-36
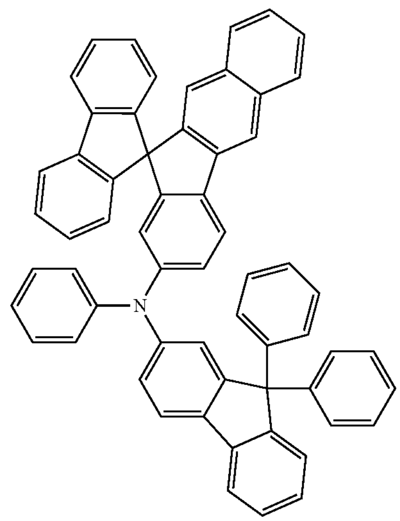
P5-37
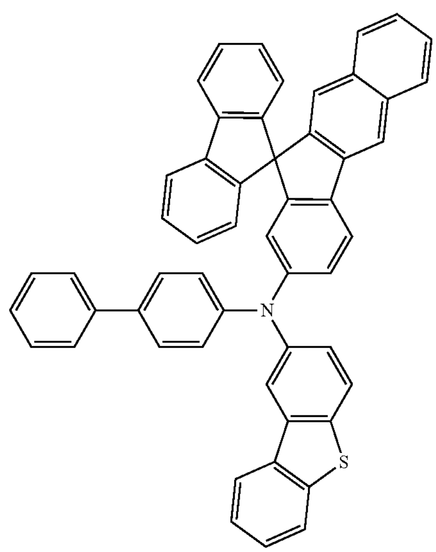

-continued
P5-38
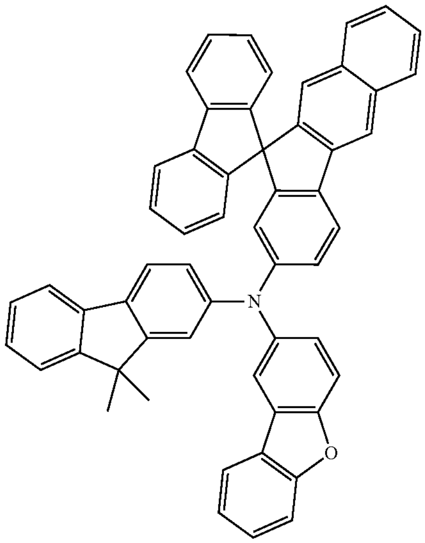
P5-39
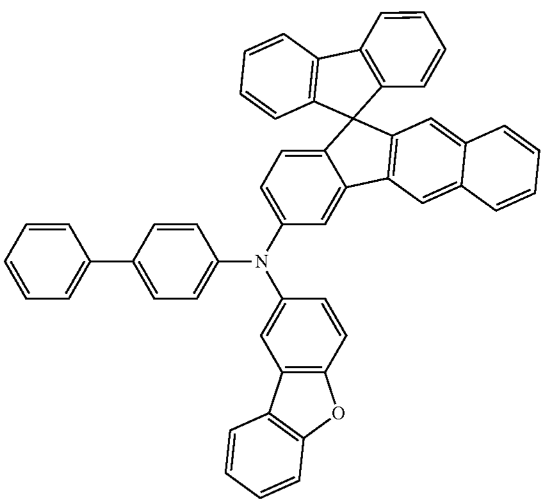
P5-40
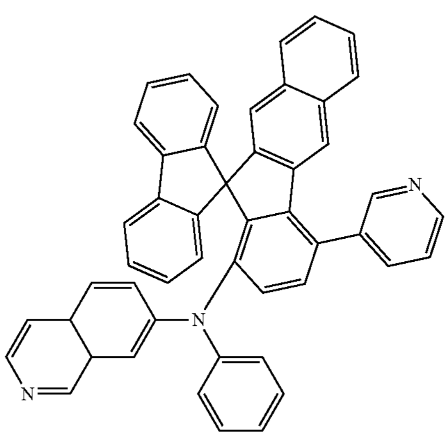
-continued
P5-41
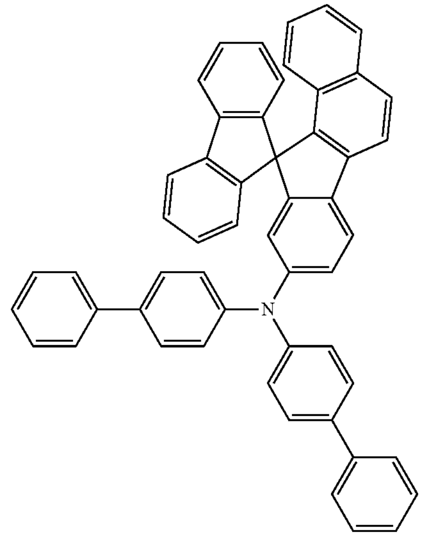
P5-42
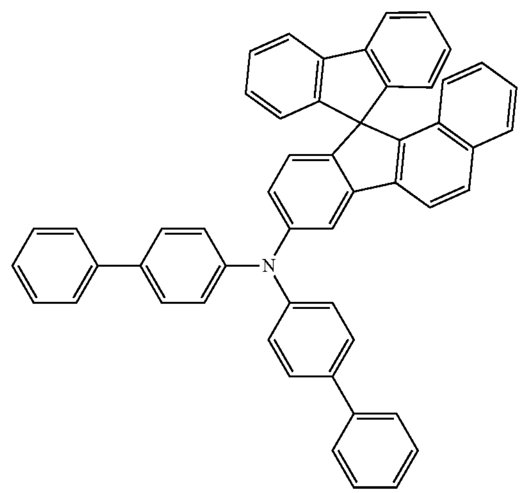
P5-43
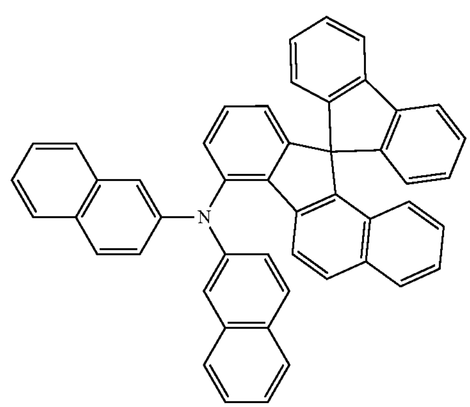

P5-44
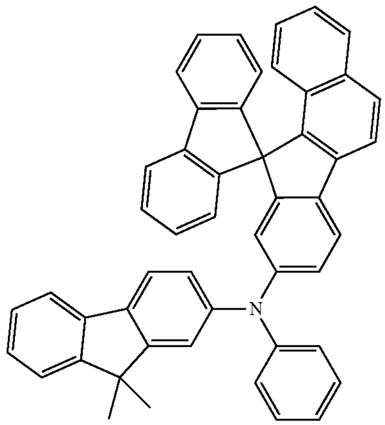
P5-45
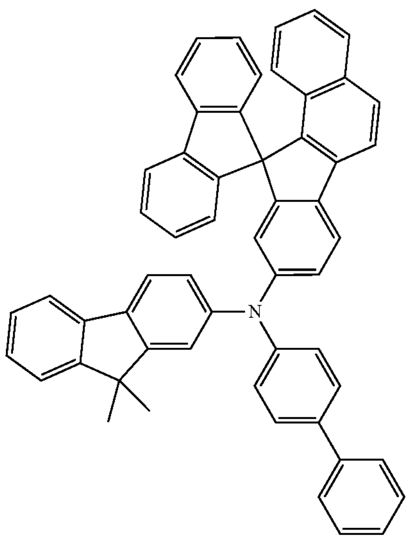
P5-46
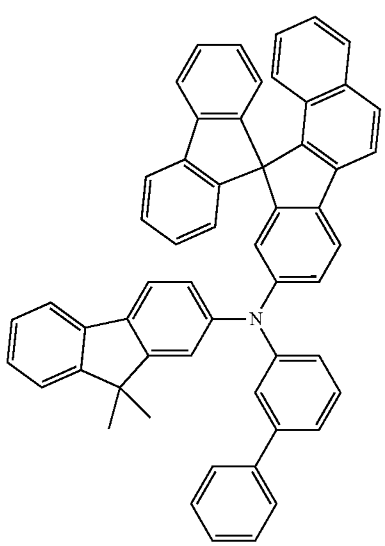
P5-47
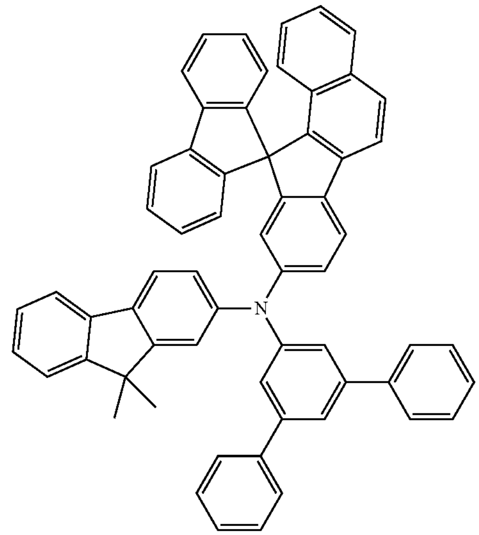
P5-48
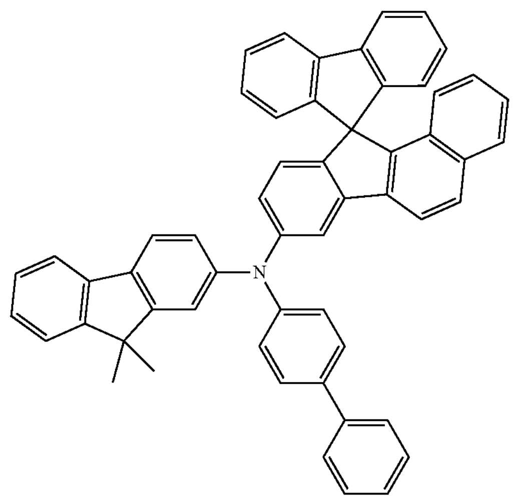
P5-49
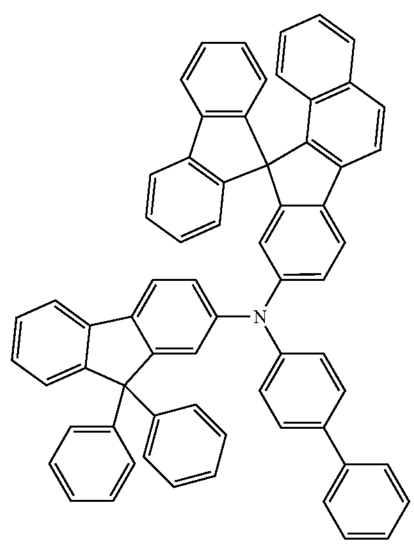

-continued
P5-50
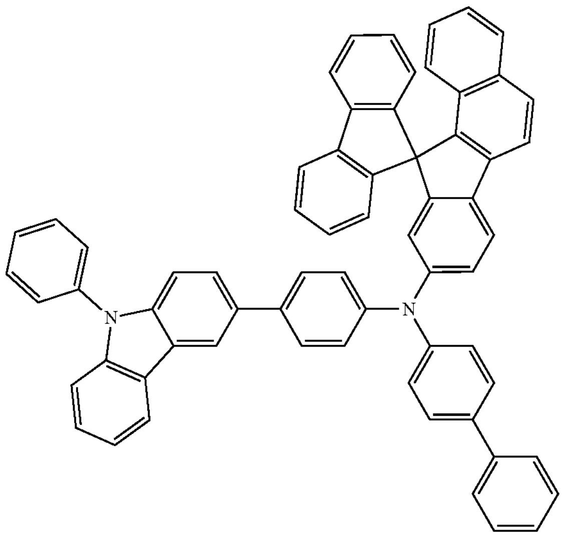
P5-51
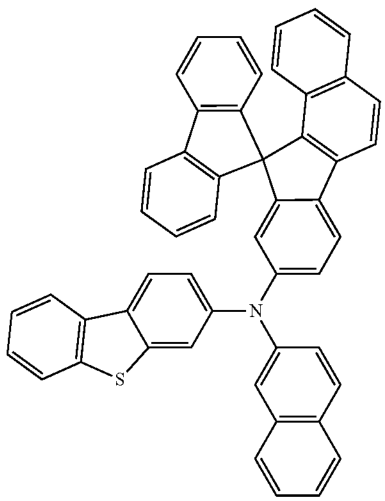
P5-52
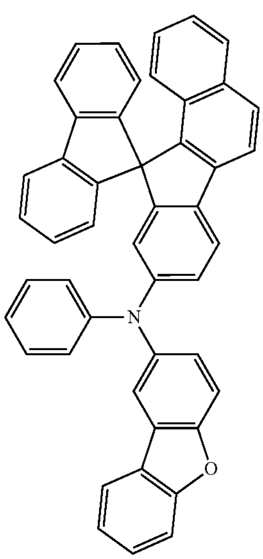
-continued
P5-53
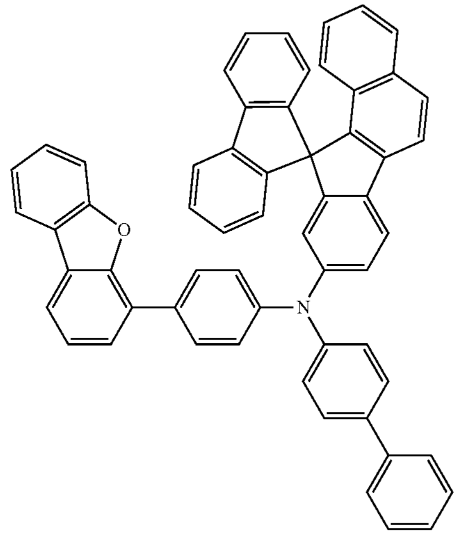
P5-54
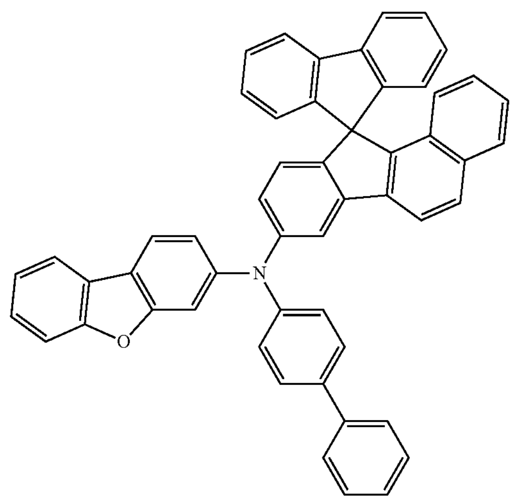
P5-55
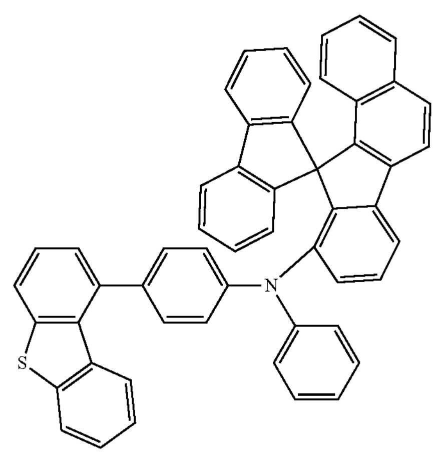

-continued
P5-56
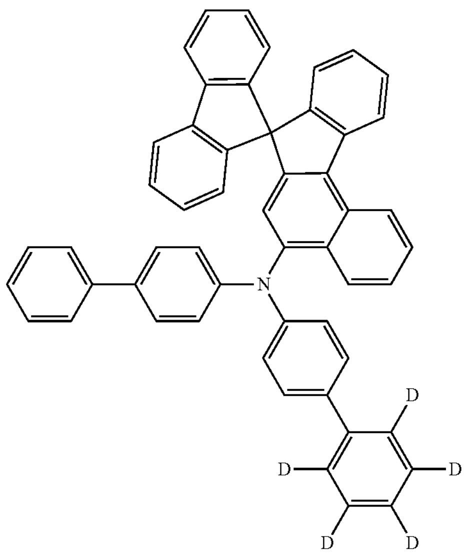
P5-57
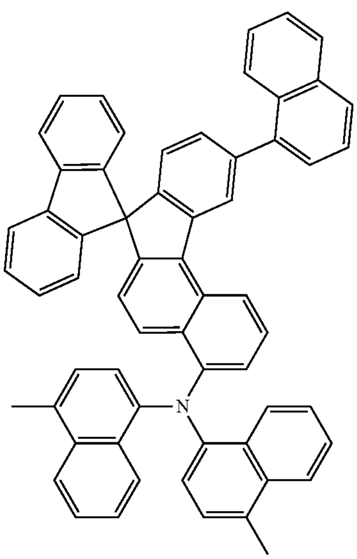
P5-58
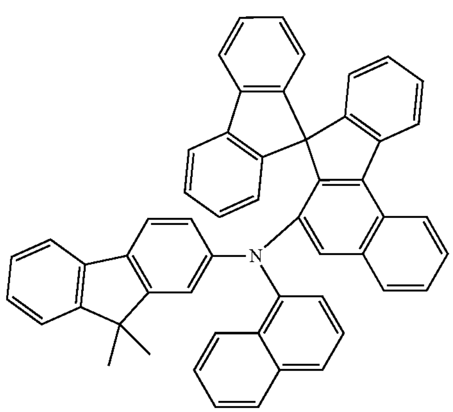
-continued
P5-59
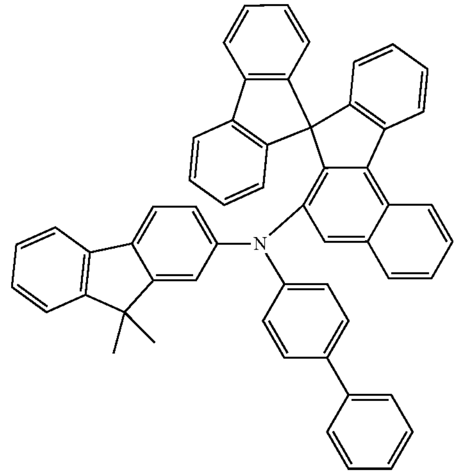
P5-60
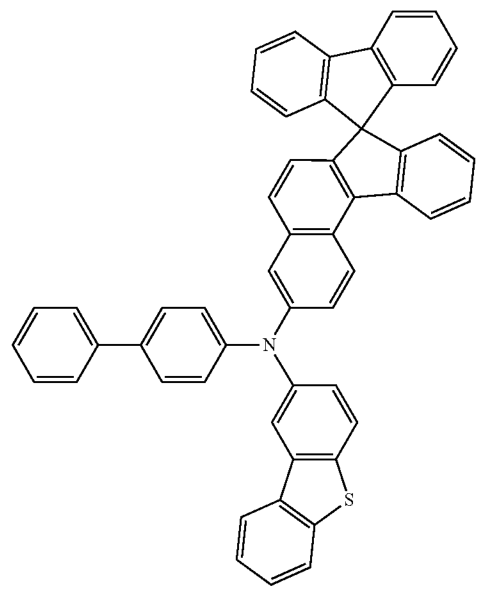
P5-61
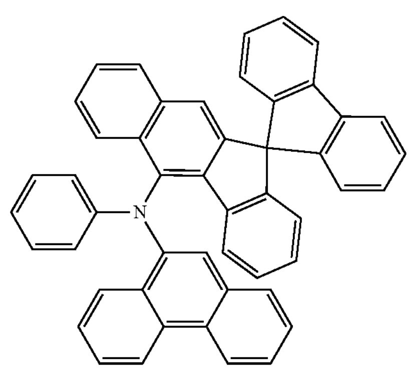

-continued
P5-62
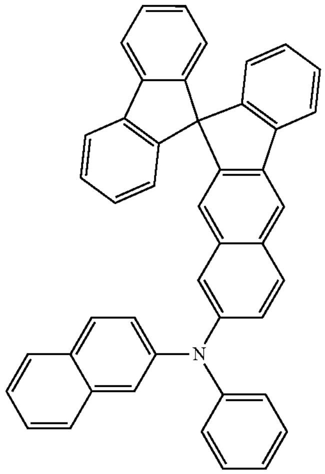
P5-63
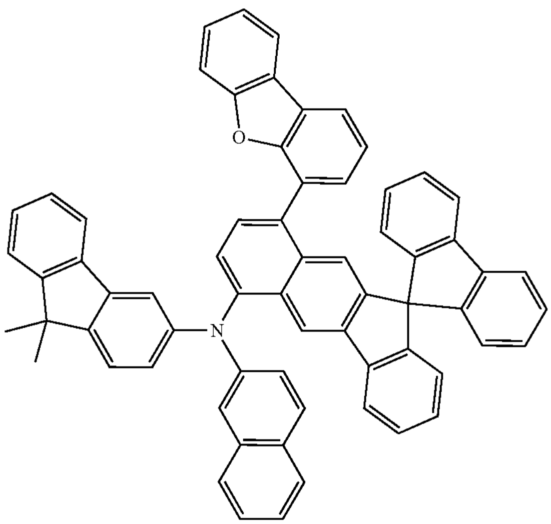
P5-64
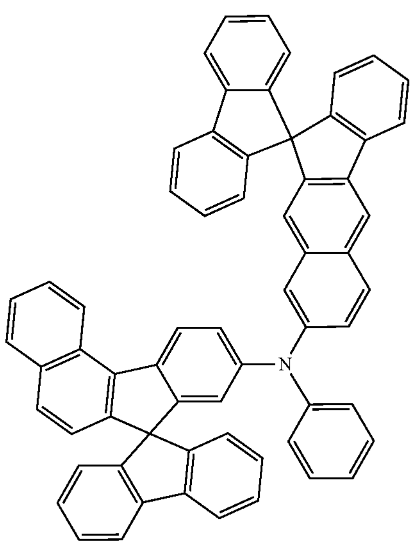
-continued
P5-65
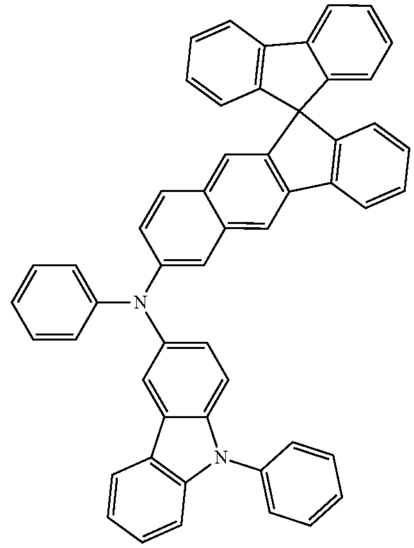
P5-66
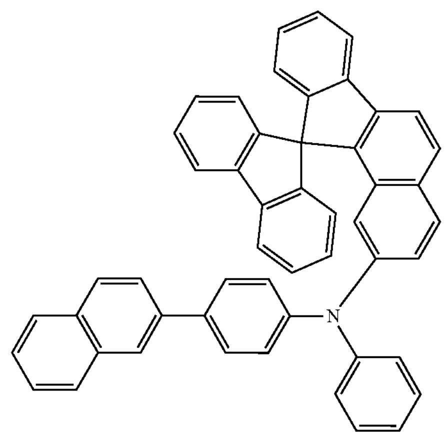
P5-67
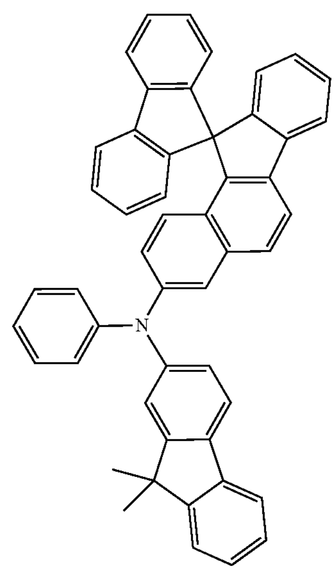

-continued
P5-68
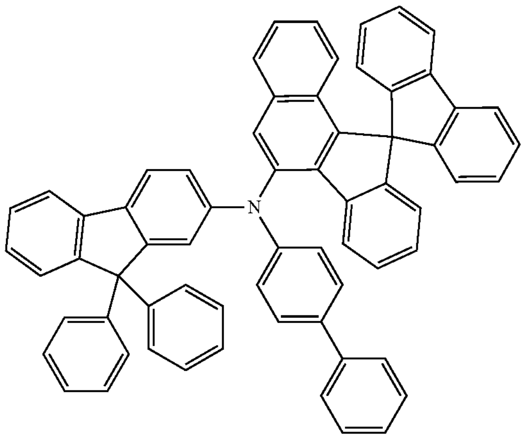
P5-69
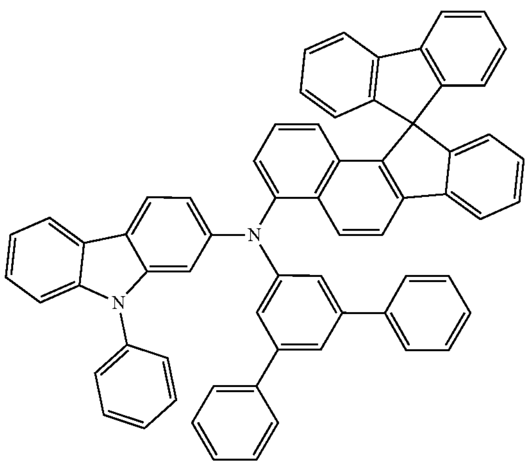
P5-70
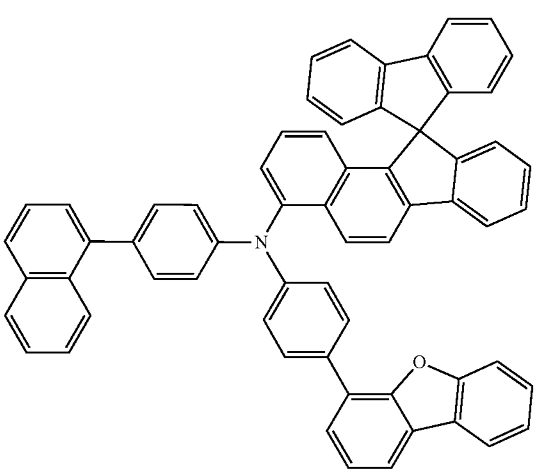
-continued
P5-71
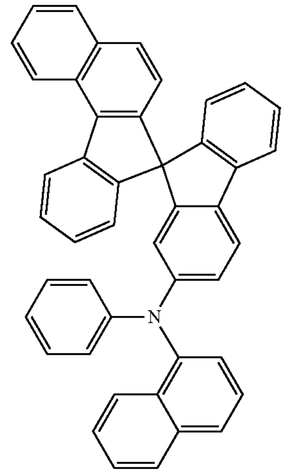
P5-72
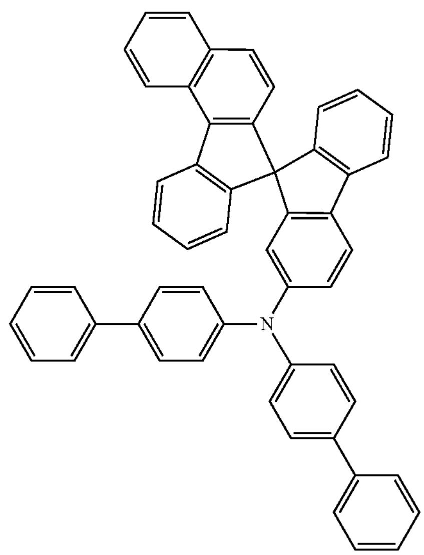
P5-73
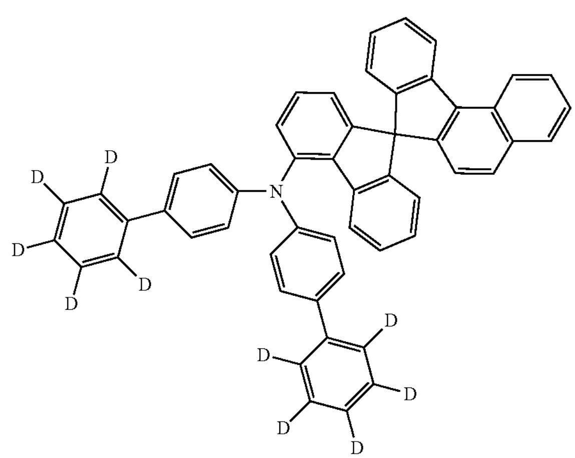

-continued
P5-74
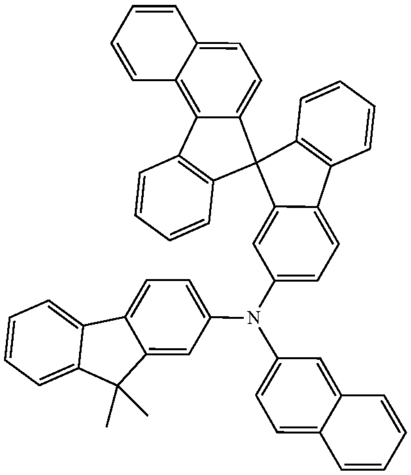
P5-75
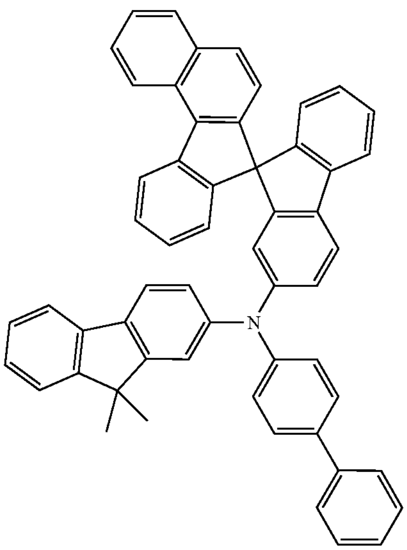
P5-76
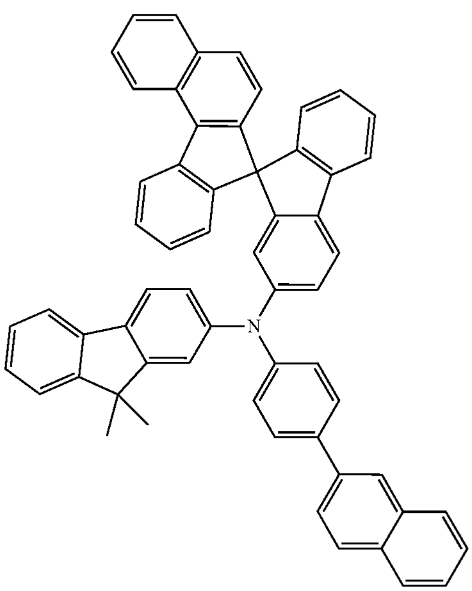
-continued
P5-77
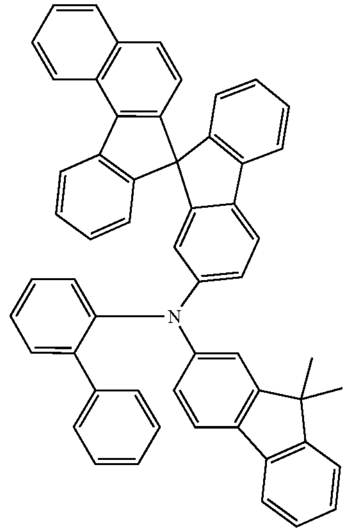
P5-78
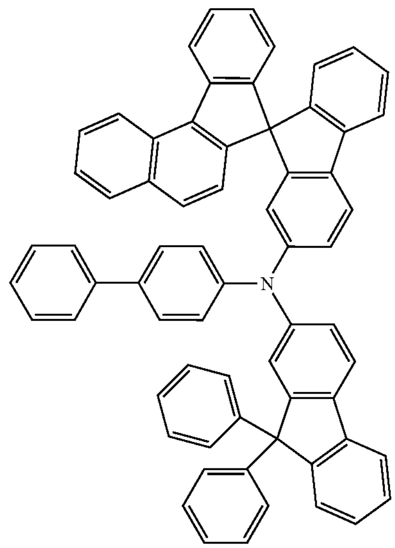
P5-79
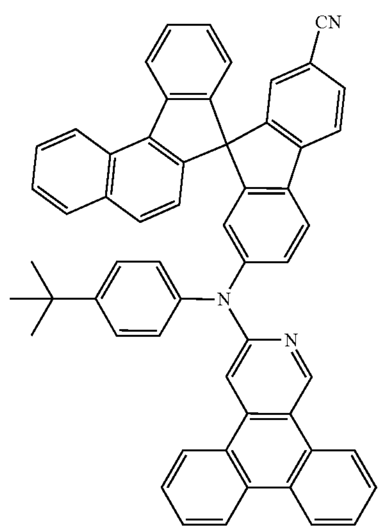

-continued
P5-80
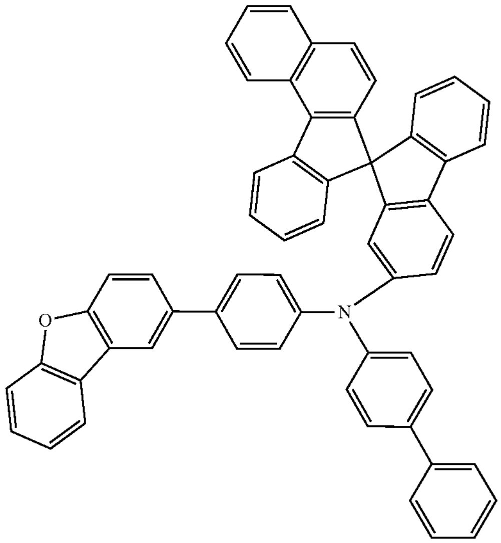
P5-81
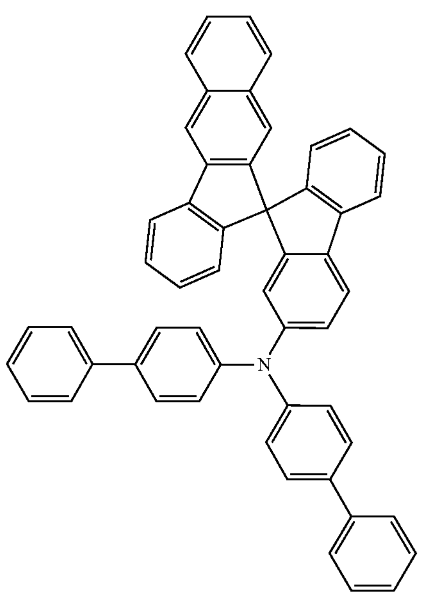
-continued
P5-82
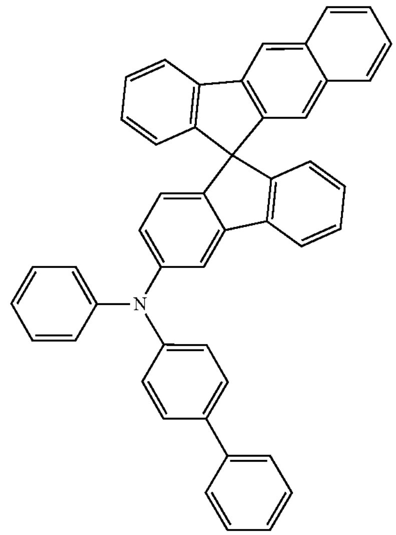
P5-83
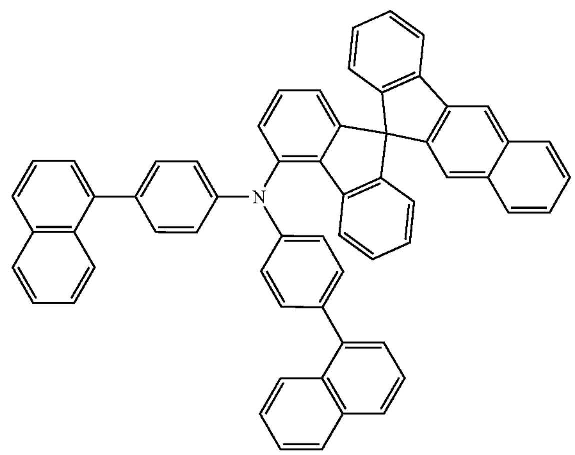
P5-84
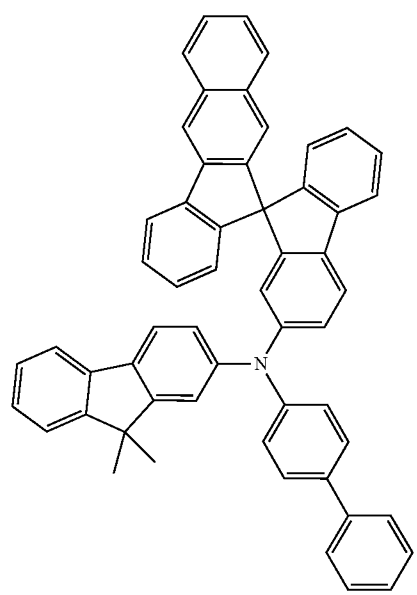

-continued
P5-85
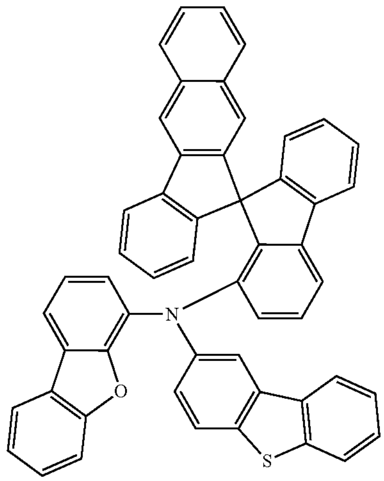
P5-86
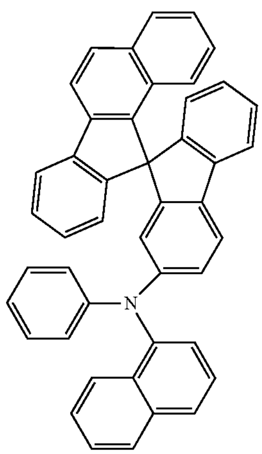
P5-87
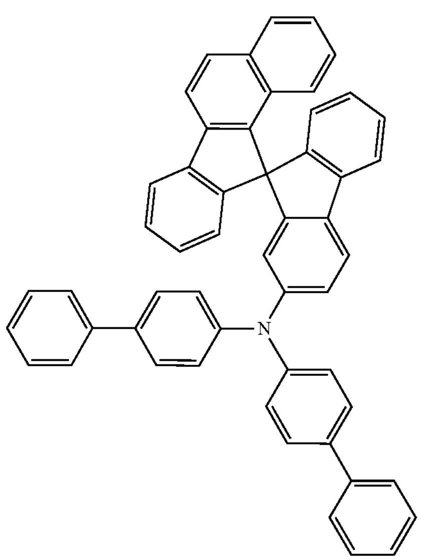
-continued
P5-88
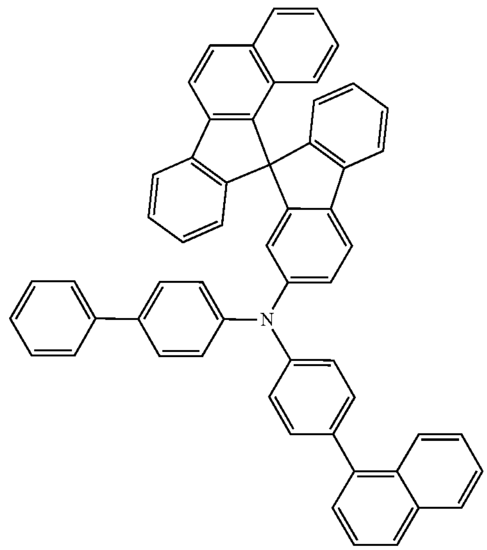
P5-89
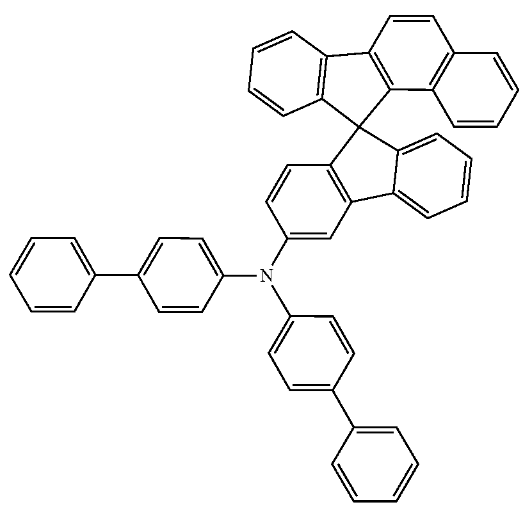
P5-90
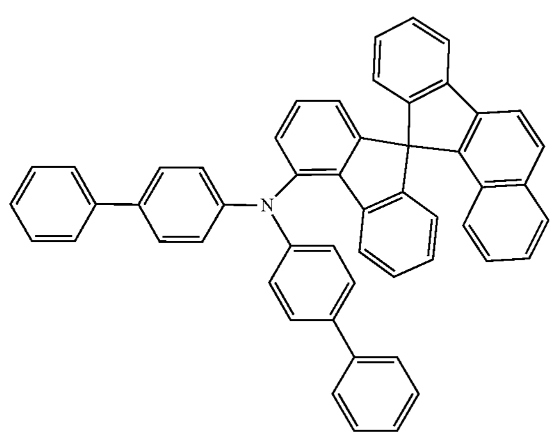

-continued
P5-91
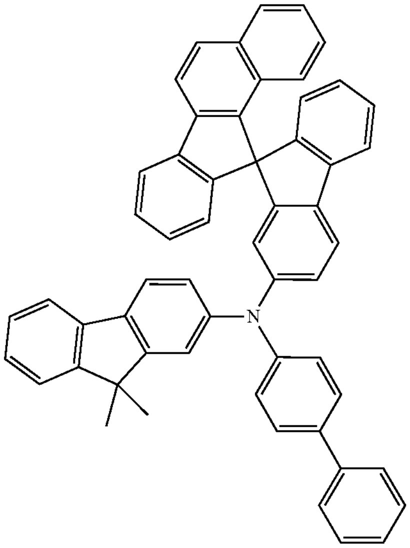
P5-92
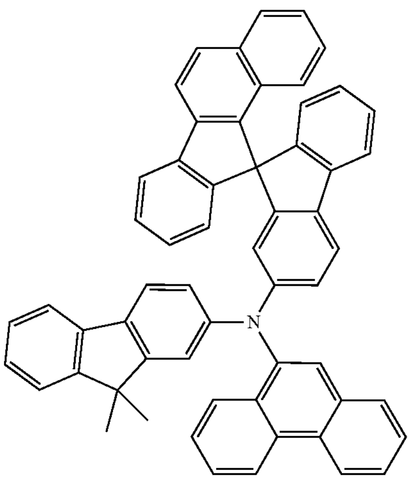
P5-93
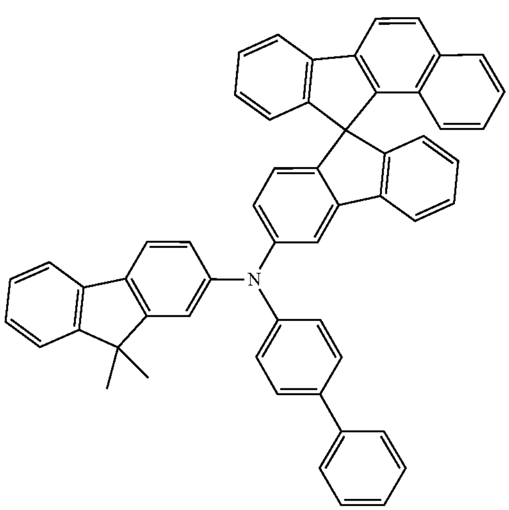
-continued
P5-94
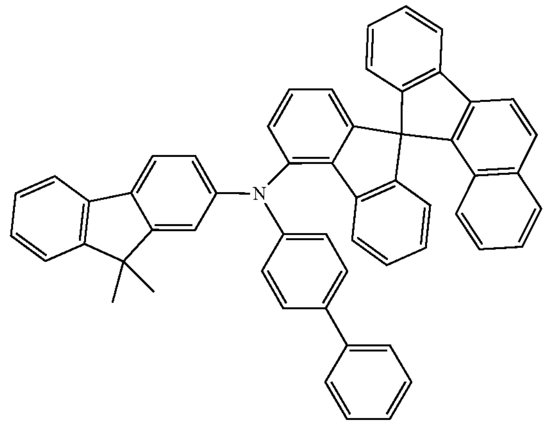
P5-95
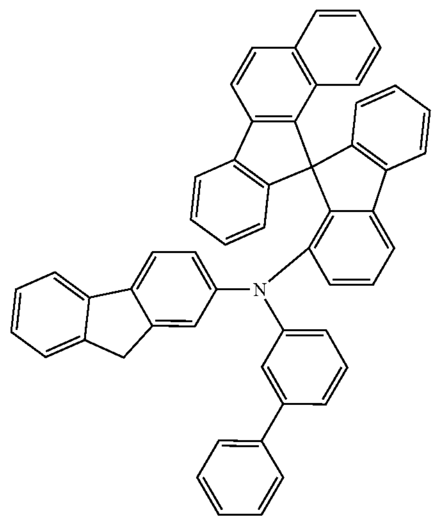
P5-96
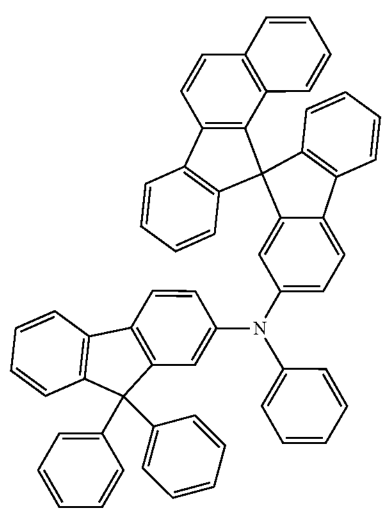

-continued
P5-97
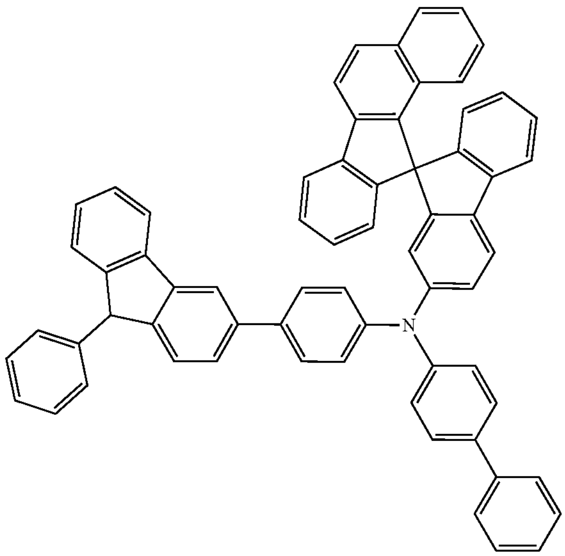
P5-98
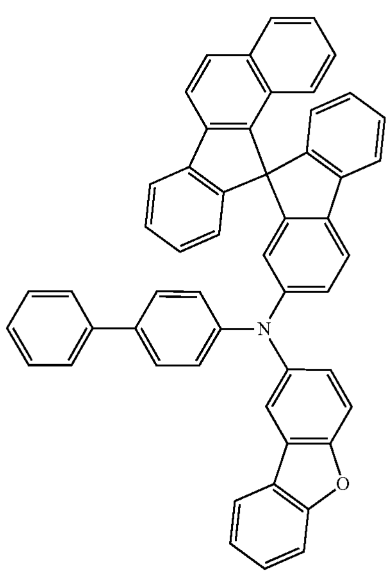
-continued
P5-99
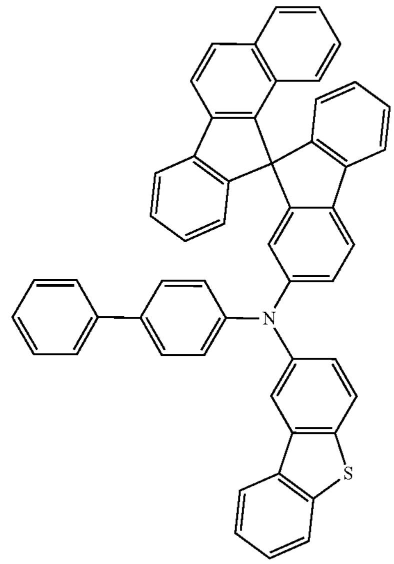
P5-100
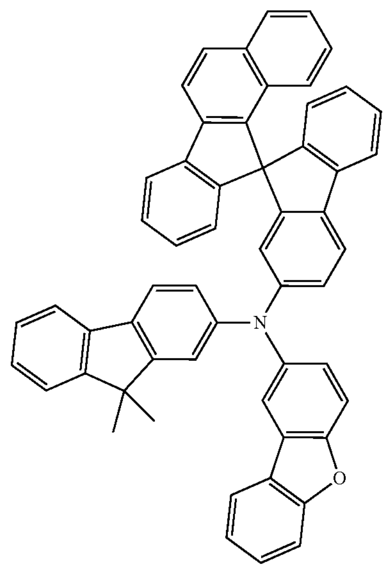
P5-101
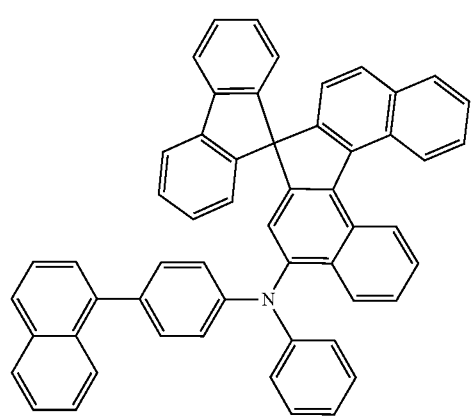

-continued
P5-102
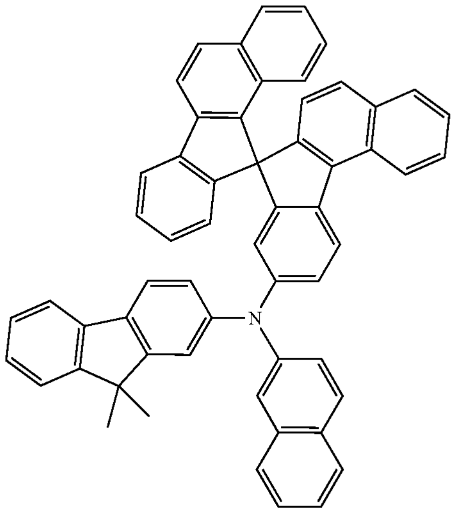
P5-103
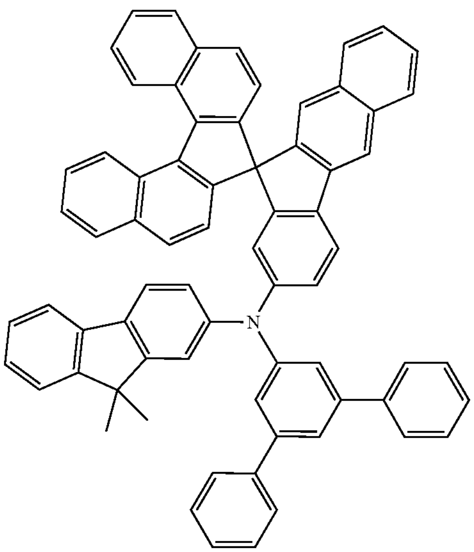
P5-104
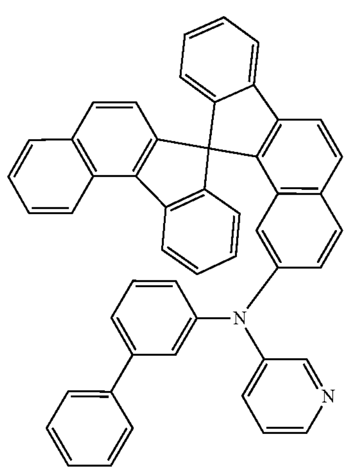
-continued
P5-105
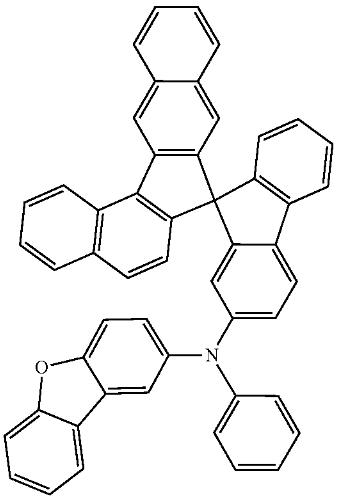
P5-106
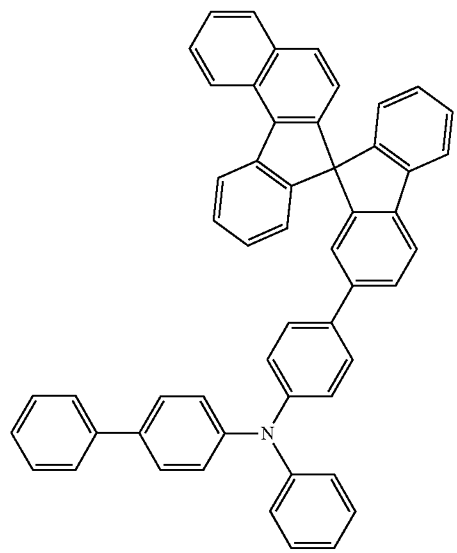
P5-107
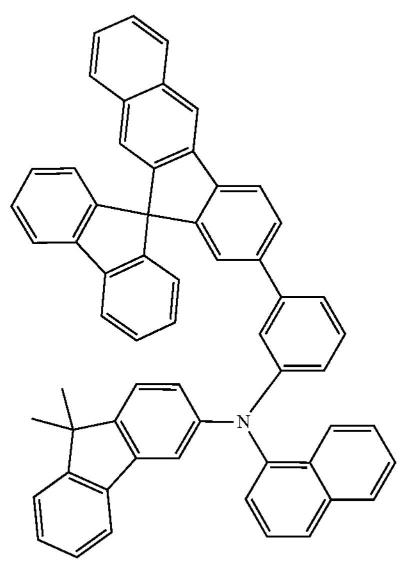

-continued
P5-108
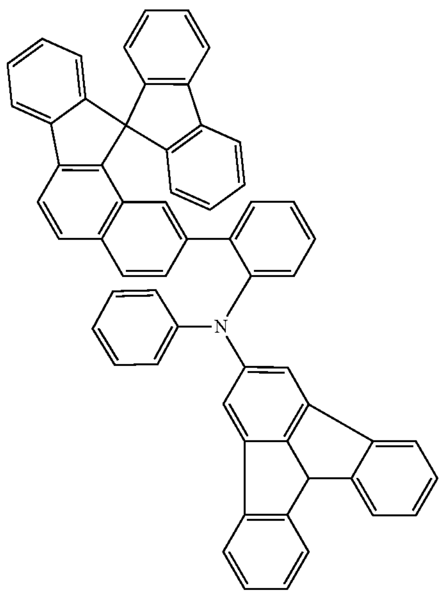
P5-109
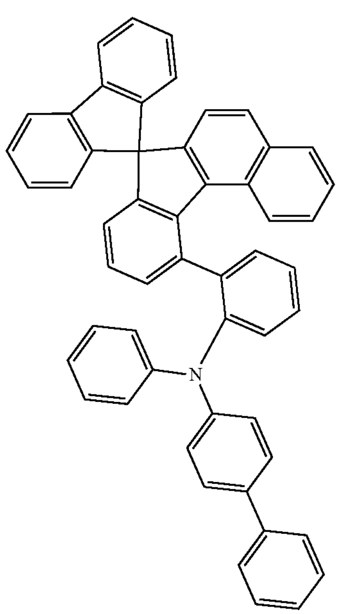
-continued
P5-110
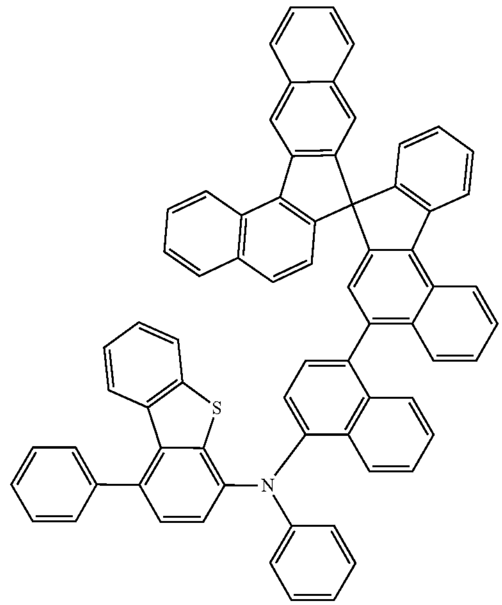
P5-111
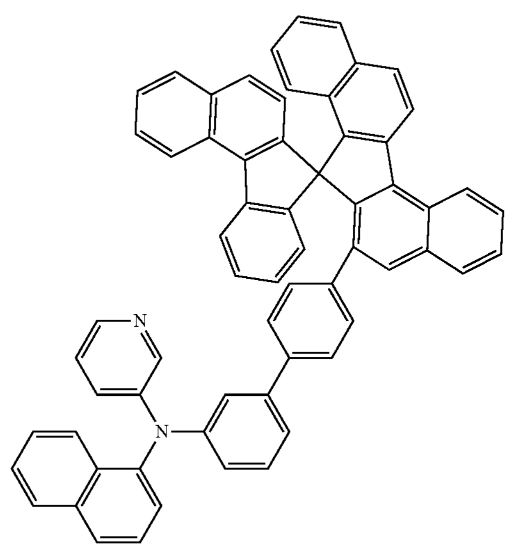

-continued
P5-112
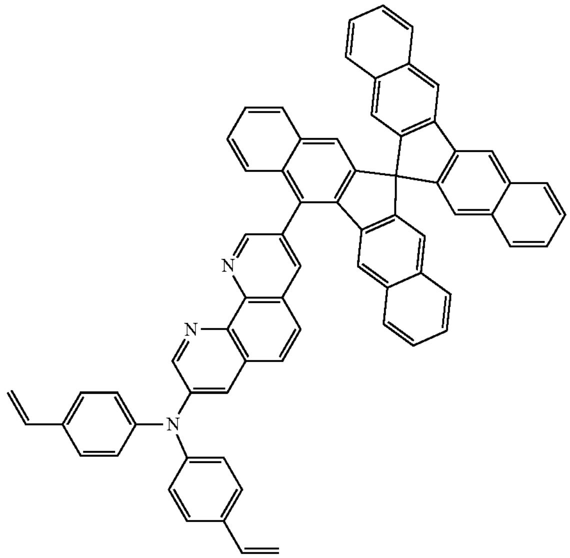
P5-113
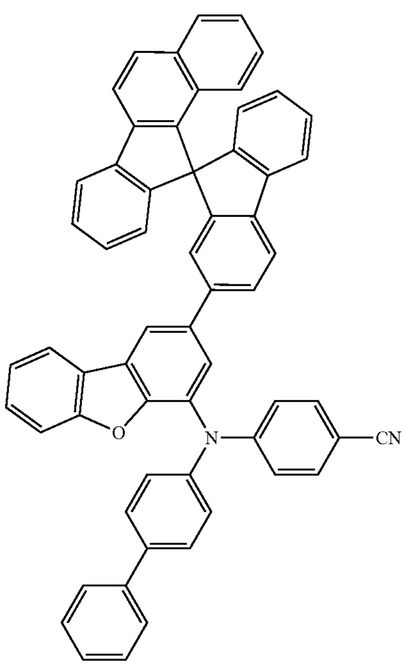
-continued
P5-114
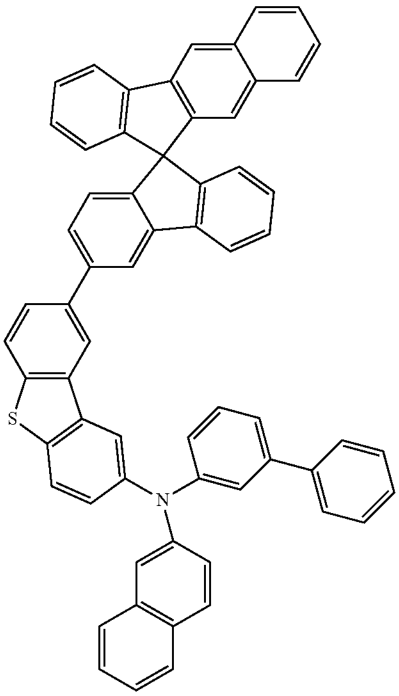
P5-115
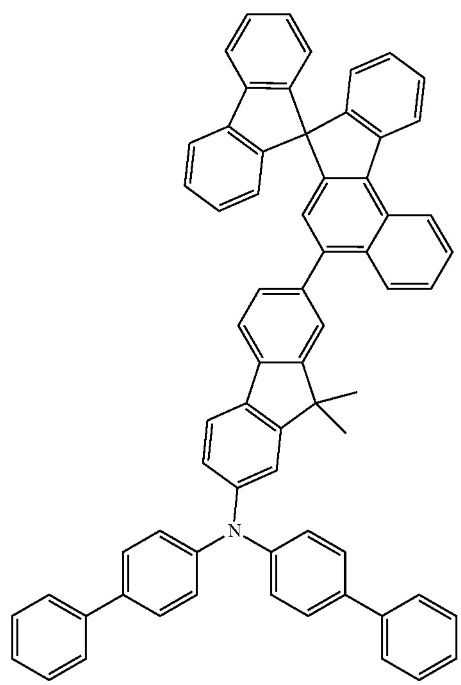

-continued
P6-1
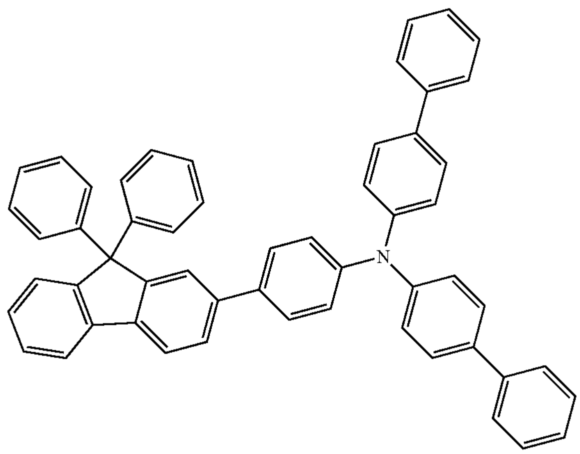
P6-2
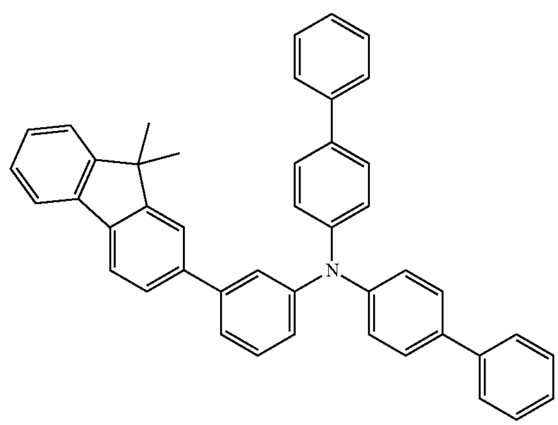
P6-3
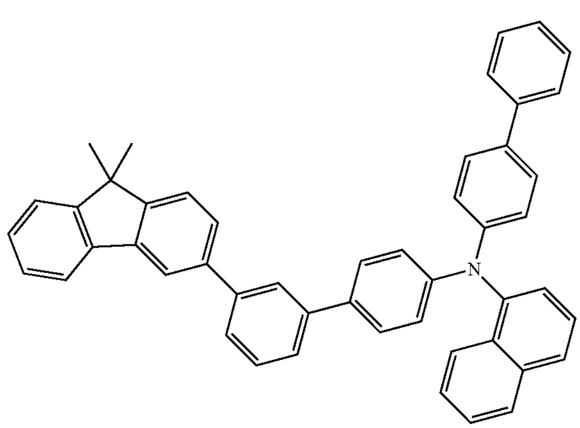
-continued
P6-4
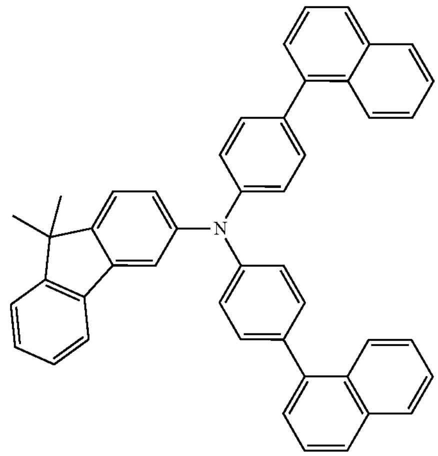
P6-5
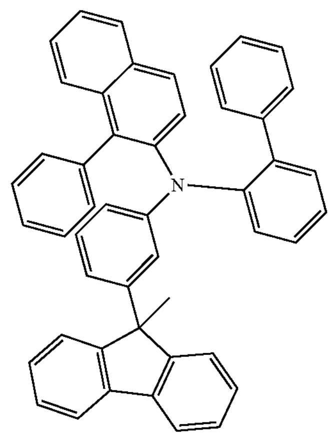
P6-6
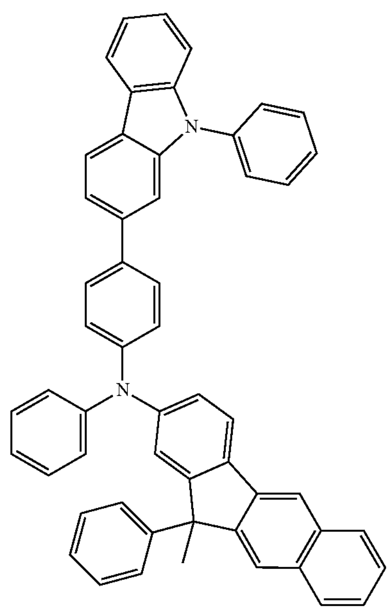

-continued
P6-7
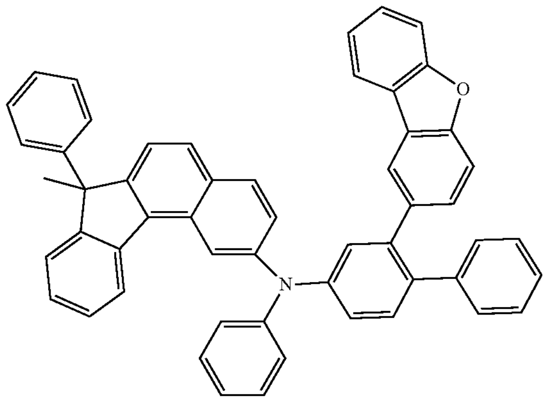
P6-8
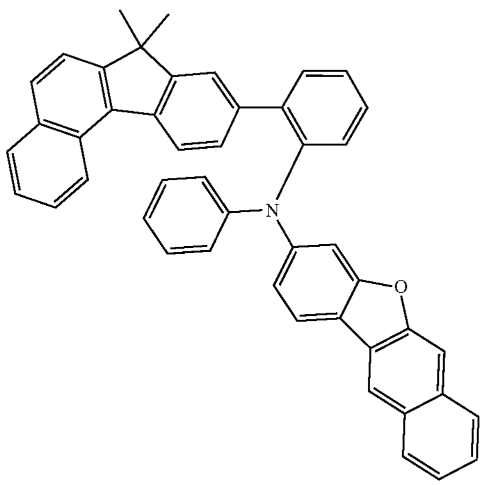
P6-9
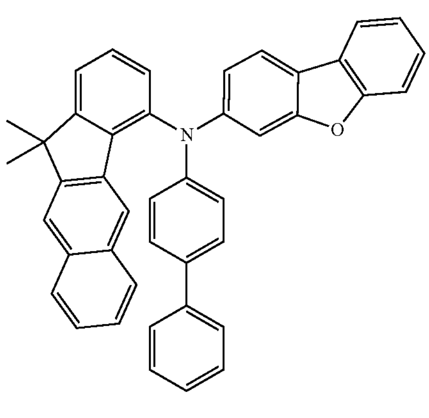
-continued
P6-10
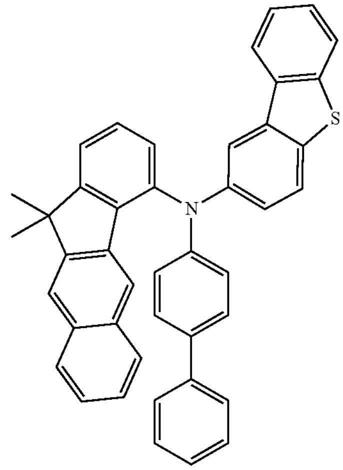
P6-11
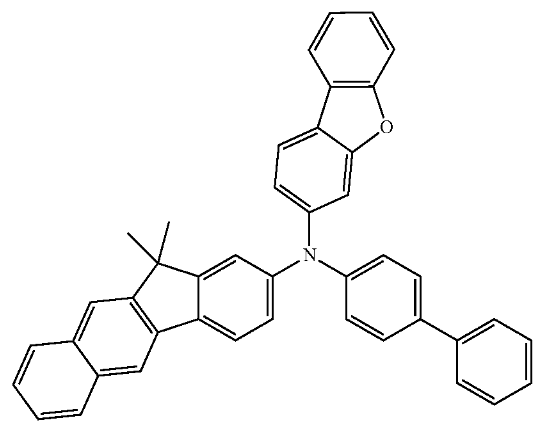
P6-12
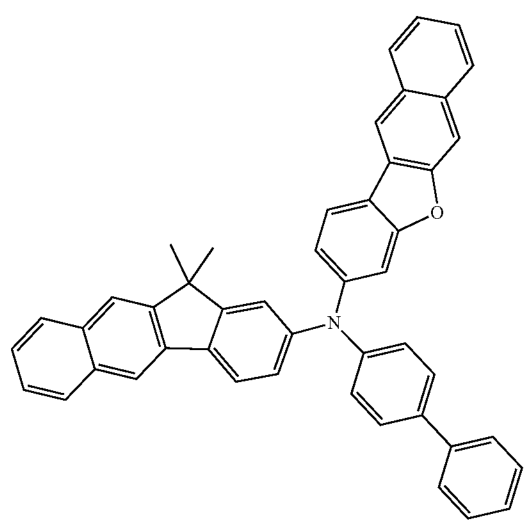

P6-13
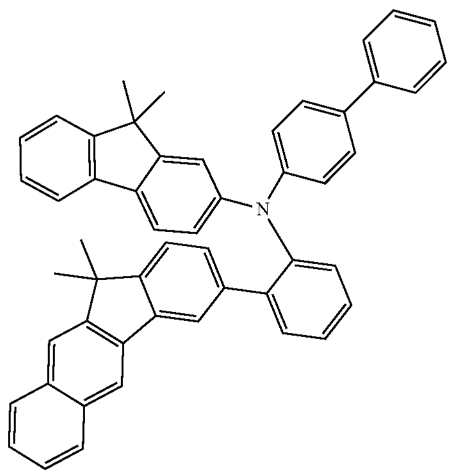
P6-14
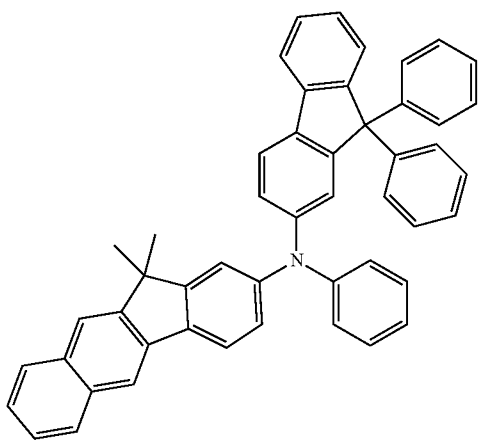
P6-15
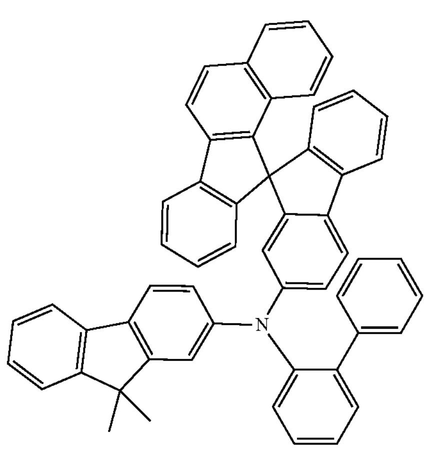
P6-16
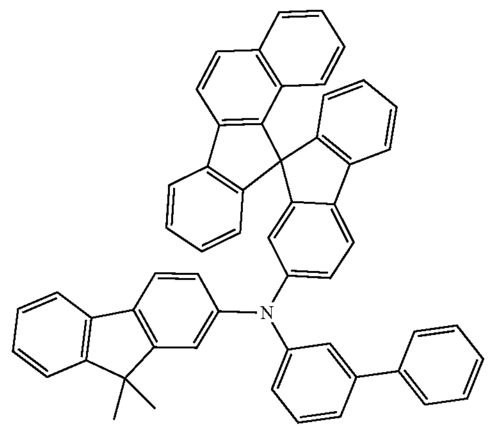
P6-17
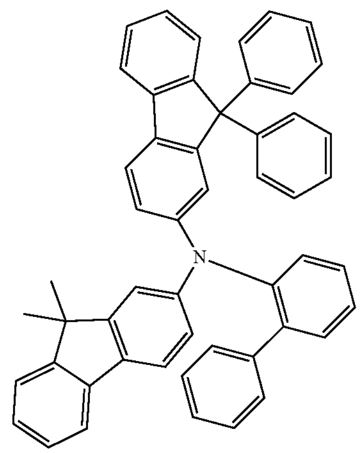
P6-18
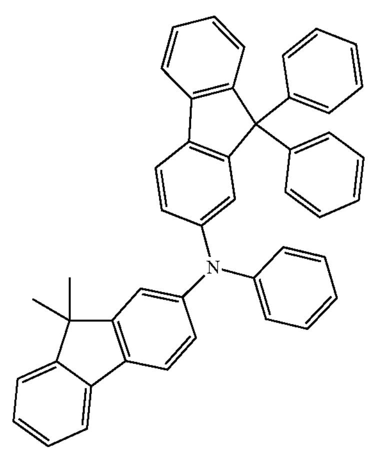

-continued
P6-19
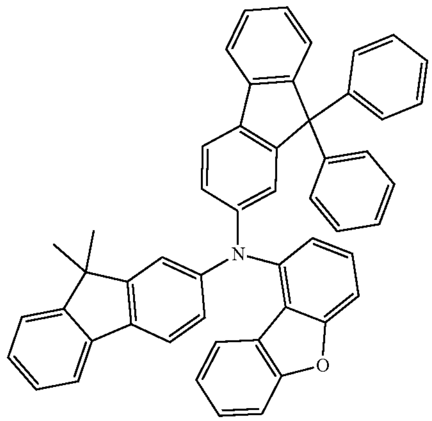
P6-20
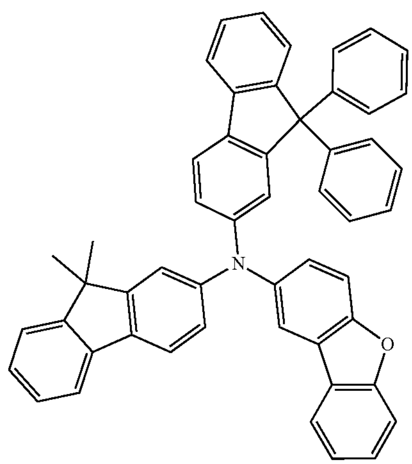
P6-21
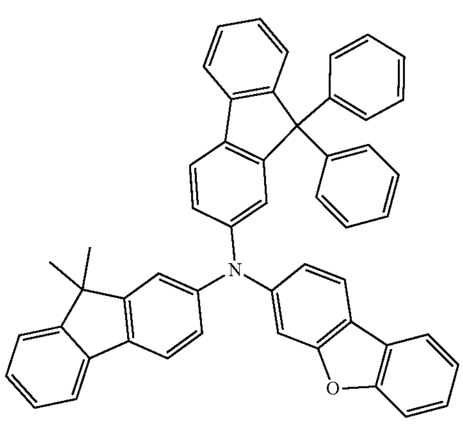
-continued
P6-22
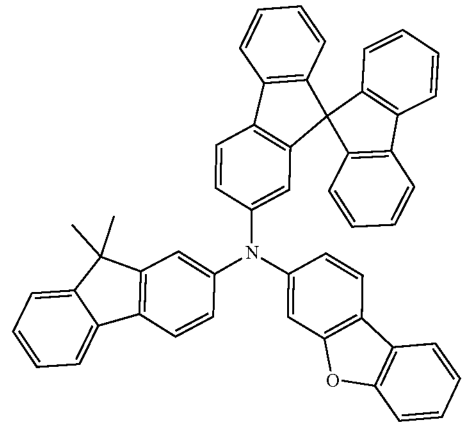
P6-23
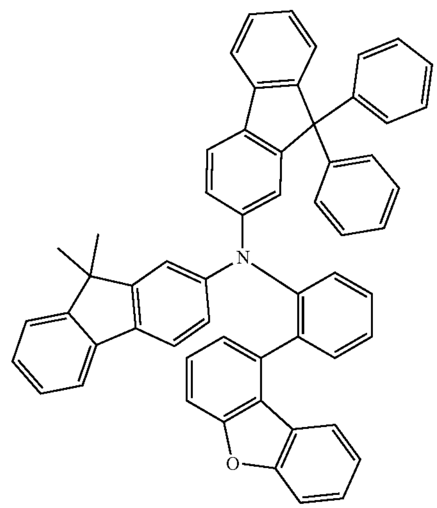
P6-24
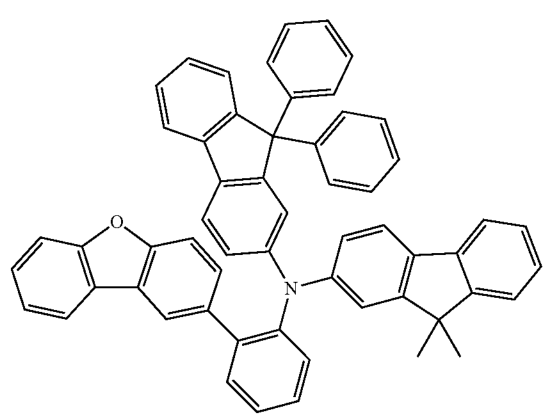

-continued
P6-25
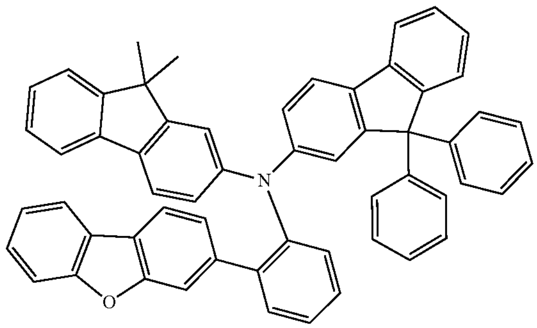
P6-26
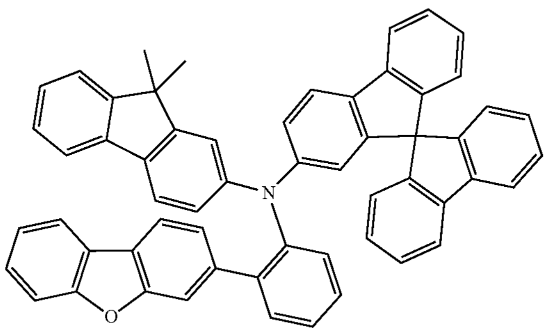
P6-27
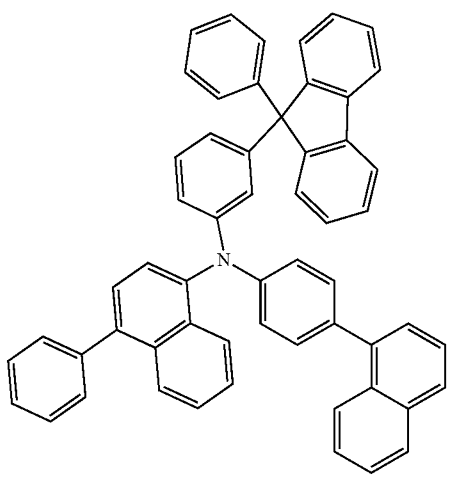
P6-28
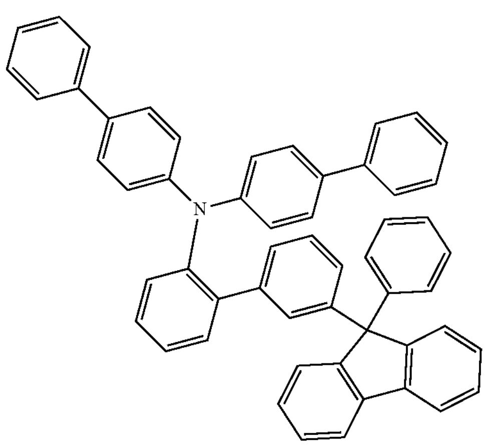
-continued
P6-29
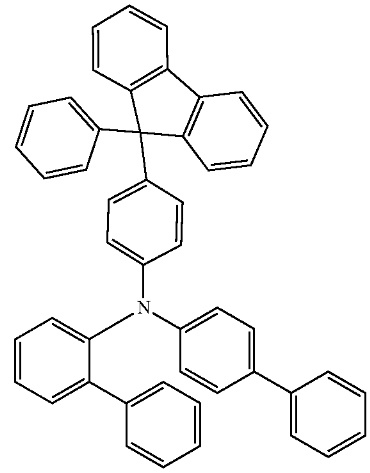
P6-30
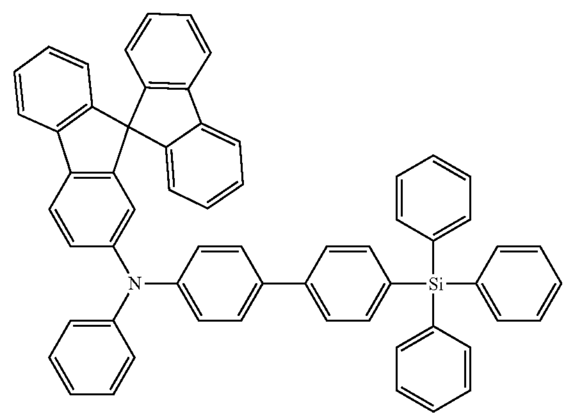
P6-31
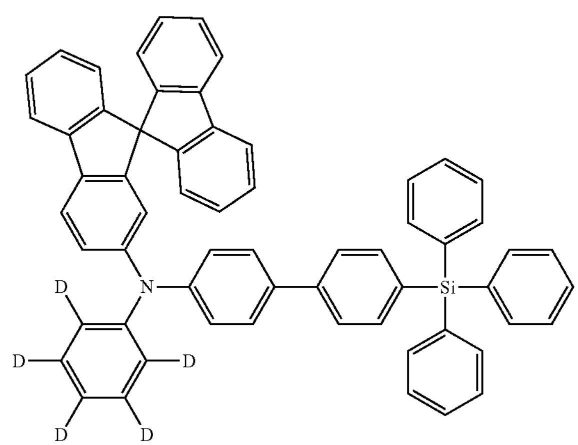

-continued
P6-32
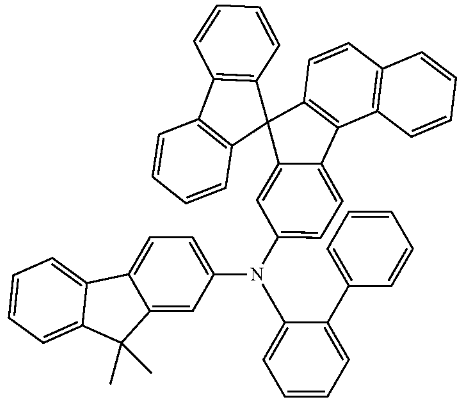
P6-33
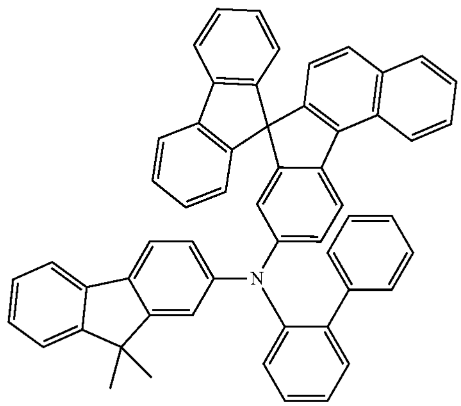
P6-34
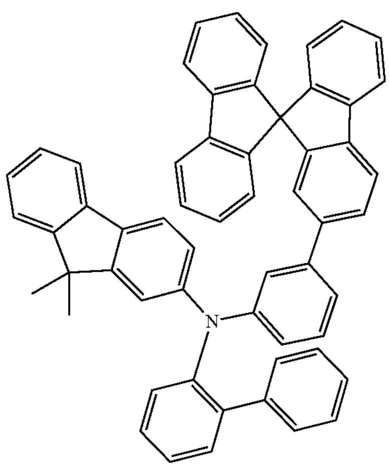
P6-35
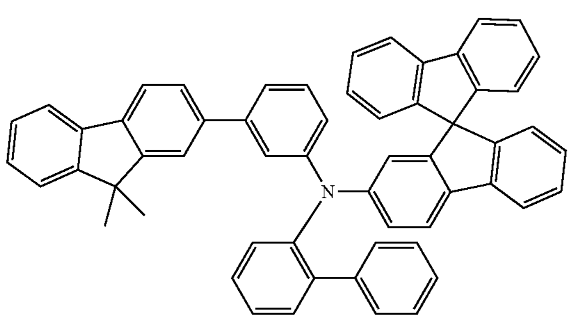
-continued
P6-36
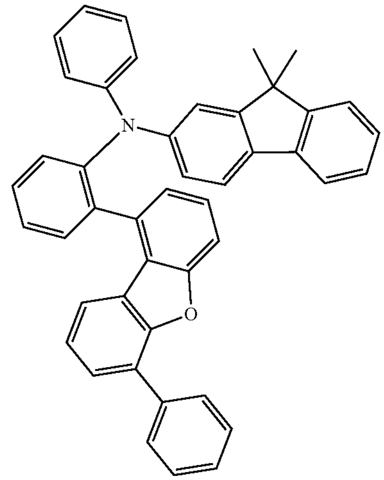
P6-37
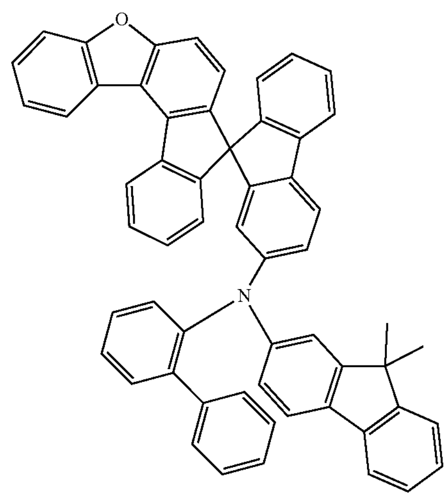
P6-38
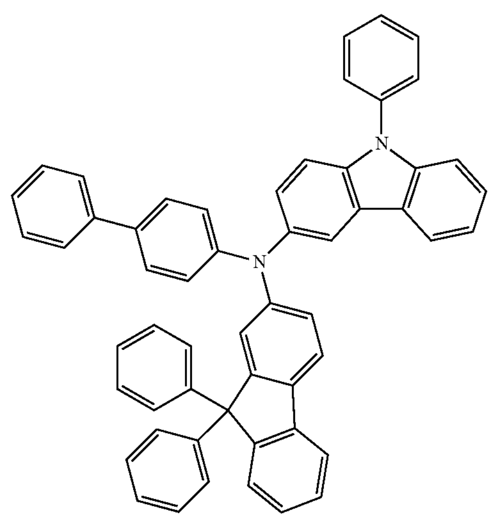

-continued

P6-39

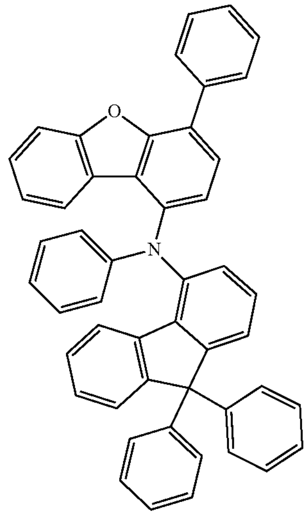

7. The device of claim 1, wherein the first doping material is represented by the following Formula E:

[Formula E]

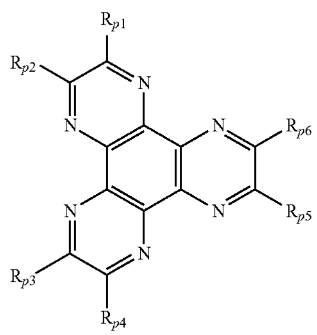

wherein, in Formula E, each of $R_{p1}$ to $R_{p6}$ is independently selected from the group consisting of hydrogen; a halogen group; a nitrile group; a nitro group; —$SO_2R$; —SOR; —$SO_2NR_2$; —$SO_3R$; a trifluoromethyl group; —COOR; —CONHR; —CONRR'; a $C_1$-$C_{30}$ alkoxyl group; a $C_1$-$C_{30}$ alkyl group; a $C_2$-$C_{20}$ alkenyl group; a $C_2$-$C_{30}$ heterocyclic group including at least one hetero atom of O, N, S, Si, or P; a fluorenyl group; a $C_6$-$C_{30}$ aryl group; a fused ring group of a $C_3$-$C_{30}$ aliphatic 10 ring and a $C_6$-$C_{30}$ aromatic ring; or —NRR', R and R' are respectively selected from the group consisting of a $C_1$-$C_{30}$ alkyl group; a fluorenyl group; a $C_6$-$C_{30}$ aryl group; a fused ring group of a $C_3$-$C_{30}$ aliphatic ring and a $C_6$-$C_{30}$ aromatic ring; or a $C_2$-$C_{30}$ heterocyclic group including at least one hetero atom of O, N, S, Si, or P, and in Formula E, each of the aryl group, the fluorenyl group, the heterocyclic group, the fused ring group, the alkyl group, the alkenyl group, the alkynyl group, and the alkoxyl group is substituted with one or more substituents selected from the group consisting of deuterium; a halogen group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{25}$ aryl group; a $C_6$-$C_{25}$ aryl group substituted with deuterium; a fluorenyl group; a $C_2$-$C_{20}$ heterocyclic group; or a $C_3$-$C_{20}$ cycloalkyl group.

8. The device of claim 1, wherein the first hole transport layer comprises a first doping material-doped layer doped with the first doping material and a first doping material undoped layer not doped with the first doping material, and the first doping material-doped layer comprises the first compound and 5 to 15 parts by weight of the first doping material with respect to 100 parts by weight of the first compound.

9. The device of claim 1, wherein the second stack comprises a second hole transport region, a second emission layer, and a second electron transport region, the second hole transport region comprises a second hole transport layer and a second auxiliary emission layer, the second hole transport layer or the second auxiliary emission layer comprises a second compound represented by Formula 1, the thickness of the second hole transport layer ranges from 250 Å to 700 Å, 10% to 50% of the thickness of the second hole transport layer is doped with a second doping material, the third stack comprises a third hole transport region, a third emission layer, and a third electron transport region, the third hole transport region comprises a third hole transport layer and a third auxiliary emission layer, the third hole transport layer or the third auxiliary emission layer comprises a third compound represented by Formula 1, the thickness of the third hole transport layer ranges from 250 Å to 700 Å, and 10% to 50% of the thickness of the third hole transport layer is doped with a third doping material.

10. The device of claim 9, wherein the first compound, the second compound, and the third compound are the same compounds.

11. The device of claim 1, wherein the first hole transport layer or the first auxiliary emission layer comprises at least one of the first compound or the fourth compound, the fourth compound comprises a radical of a compound represented by the following Formula A or Formula B and is represented by at least one of the following Formula C or Formula D, the thickness of the second hole transport layer ranges from 250 Å to 700 Å, 10% to 50% of the thickness of the second hole transport layer is doped with a second doping material,

[Formulas A, B, C, and D]

<Formula A>

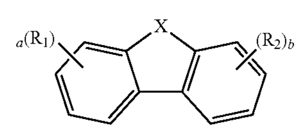

<Formula B>

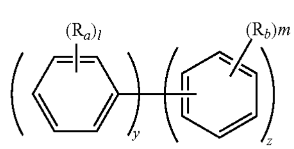

-continued

<Formula C>

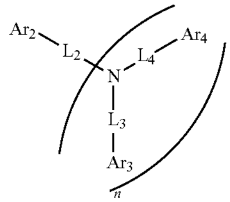

<Formula D>

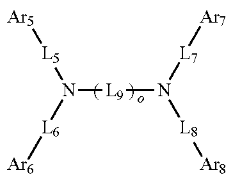

wherein, in Formula A,

1) Each of a and b is independently an integer from 0 to 4,
2) X is O, S, CR'R", or N-$L_1$-$Ar_1$,
3) $R_1$ and $R_2$ are respectively and independently selected from the group consisting of deuterium; tritium; a halogen; a cyano group; a nitro group; a $C_6$-$C_{60}$ aryl group; a fluorenyl group; a $C_2$-$C_{60}$ heterocyclic group including at least one hetero atom of O, N, S, Si, or P; a fused ring group of a $C_3$-$C_{60}$ aliphatic ring and a $C_6$-$C_{60}$ aromatic ring; a $C_1$-$C_{50}$ alkyl group; a $C_2$-$C_{20}$ alkenyl group; a $C_2$-$C_{20}$ alkynyl group; a $C_1$-$C_{30}$ alkoxyl group; or a $C_6$-$C_{30}$ aryloxy group, and the plurality of $R_1$s and the plurality of $R_2$s are bonded to form rings, respectively,
4) R' and R" are respectively and independently selected from the group consisting of hydrogen; deuterium; a $C_6$-$C_{60}$ aryl group; a fluorenyl group; a $C_2$-$C_{60}$ heterocyclic group including at least one hetero atom of O, N, S, Si, or P; or a fused ring group of a $C_3$-$C_{60}$ aliphatic ring and a $C_6$-$C_{60}$ aromatic ring, and the R' and R" are bonded to each other to form a ring,
5) $L_1$ is selected from the group consisting of a single bond; a $C_6$-$C_{60}$ arylene group; a fluorenylene group; a $C_2$-$C_{60}$ heterocyclic group including at least one hetero atom of O, N, S, Si, or P; or a fused ring group of a $C_3$-$C_{60}$ aliphatic ring and a $C_6$-$C_{60}$ aromatic ring, and
6) $Ar_1$ is selected from the group consisting of a $C_6$-$C_{60}$ aryl group; a fluorenyl group; a $C_2$-$C_{60}$ heterocyclic group including at least one hetero atom of O, N, S, Si, or P; or a fused ring group of a $C_3$-$C_{60}$ aliphatic ring and a $C_6$-$C_{60}$ aromatic ring, in Formula B, 1) l is an integer from 0 to 5, m is an integer from 0 to 4, each of y and z is an integer from 0 to 4, where y+z is not 0,
2) $R_a$ and $R_b$ are respectively and independently selected from the group consisting of deuterium; tritium; a halogen; a cyano group; a nitro group; a $C_6$-$C_{60}$ aryl group; a fluorenyl group; a $C_2$-$C_{60}$ heterocyclic group including at least one hetero atom of O, N, S, Si, or P; a fused ring group of a $C_3$-$C_{60}$ aliphatic ring and a $C_6$-$C_{60}$ aromatic ring; a $C_1$-$C_{50}$ alkyl group; a $C_2$-$C_{20}$ alkenyl group; a $C_2$-$C_{20}$ alkynyl group; a $C_1$-$C_{30}$ alkoxyl group; or a $C_6$-$C_{30}$ aryloxy group, and the plurality of $R_a$s and the plurality of $R_b$s are bonded to form rings, respectively, in Formula C, 1) N is 1 or 2,
2) $Ar_2$ is a radical of a compound represented by Formula A or a radical of a compound represented by Formula B,
3) Each of $Ar_3$ and $Ar_4$ is independently selected from the group consisting of a $C_6$-$C_{60}$ aryl group; a fluorenyl group; a $C_2$-$C_{60}$ heterocyclic group including at least one hetero atom of O, N, S, Si, or P; or a fused ring group of a $C_3$-$C_{60}$ aliphatic ring and a $C_6$-$C_{60}$ aromatic ring,
4) Each of $L_2$ to $L_4$ is independently selected from the group consisting of a single bond; a $C_6$-$C_{60}$ arylene group; a fluorenylene group; or a $C_2$-$C_{60}$ heterocyclic group including at least one hetero atom of O, N, S, Si, or P, and in Formula D, 1) o is an integer from 1 to 4,
2) Each of $Ar_5$ to $Ar_8$ is independently selected from the group consisting of a $C_6$-$C_{60}$ aryl group; a fluorenyl group; a $C_2$-$C_{60}$ heterocyclic group including at least one hetero atom of O, N, S, Si, or P; or a fused ring group of a $C_3$-$C_{60}$ aliphatic ring and a $C_6$-$C_{60}$ aromatic ring,
3) Each of $L_5$ to $L_9$ is independently selected from the group consisting of a single bond; a $C_6$-$C_{60}$ arylene group; a fluorenylene group; a $C_2$-$C_{60}$ heterocyclic group including at least one hetero atom of O, N, S, Si, or P; or a fused ring group of a $C_3$-$C_{60}$ aliphatic ring and a $C_6$-$C_{60}$ aromatic ring, wherein $L_9$ is a radical of a compound represented by Formula A or a radical of a compound represented by Formula B, and in Formulas A to D, each of the aryl group, the fluorenyl group, the heterocyclic group, the fused ring group, the alkyl group, the alkenyl group, the alkynyl group, the alkoxyl group, the aryloxy group, the arylene group, and the fluorenylene group is further substituted with one or more substituents selected from the group consisting of deuterium; a nitro group; a nitrile group; a halogen group; an amino group; a $C_1$-$C_{20}$ alkylthio group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{25}$ aryl group; $C_6$-$C_{25}$ aryl group substituted with deuterium; a fluorenyl group; a $C_2$-$C_{20}$ heterocyclic group; a $C_3$-$C_{20}$ cycloalkyl group; a $C_7$-$C_{20}$ arylalkyl group; or a $C_8$-$C_{20}$ arylalkenyl group, wherein the further substituted substituents are bonded to form a ring, and each of the further substituted substituents is further substituted with one or more substituents selected from the group consisting of deuterium; a nitro group; a nitrile group; a halogen group; an amino group; a $C_1$-$C_{20}$ alkylthio group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{25}$ aryl group; a $C_6$-$C_{25}$ aryl group substituted with deuterium; a fluorenyl group; a $C_2$-$C_{20}$ heterocyclic group; a $C_3$-$C_{20}$ cycloalkyl group; a $C_7$-$C_{20}$ arylalkyl group; or a $C_8$-$C_{20}$ arylalkenyl group, wherein the substituents are bonded to form a ring.

12. The device of claim 9, wherein the first hole transport layer comprises a first doping material-doped layer doped with the first doping material and a first doping material undoped layer not doped with the first doping material, the first doping material-doped layer comprises the first compound and 5 to 15 parts by weight of the first doping material with respect to 100 parts by weight of the first compound, the second hole transport layer comprises a second doping material-doped layer doped with the second doping material and a second doping material undoped layer not doped with the second doping material, the second doping material-doped layer comprises the second compound and 5 to 15 parts by weight of the second doping material with respect to 100 parts by weight of the second compound, the third hole transport layer comprises a third doping material-doped layer doped with a third doping material and a third doping material undoped layer not doped with the third doping material, and the third doping material-doped layer comprises the third compound and 5 to 15 parts by weight of the third doping material with respect to 100 parts by weight of the third compound.

13. The device of claim 10, wherein the first hole transport layer comprises a first doping material-doped layer doped with the first doping material and a first doping material undoped layer not doped with the first doping material, and the first doping material-doped layer comprises at least one of the first compound or the fourth compound, and comprises 5 to 15 parts by weight of the first doping material with respect to 100 parts by weight of a total amount of the first compound and the fourth compound.

14. The device of claim 1, wherein the organic material layer further comprises a fourth stack, wherein the fourth stack comprises a fourth hole transport region, a fourth emission layer, and a fourth electron transport region, the fourth hole transport region comprises a fourth hole transport layer and a fourth auxiliary emission layer, the fourth hole transport layer or the fourth auxiliary emission layer comprises at least one of a fifth compound or a sixth compound, the fifth compound is represented by Formula 1, the sixth compound comprises a radical of a compound represented by the following Formula A or Formula B and is represented by the following Formula C or Formula D, the thickness of the fourth hole transport layer ranges from 250 Å to 700 Å, 10% to 50% of the thickness of the fourth hole transport layer is doped with a fourth doping material,

[Formulas A, B, C, and D]

<Formula A>

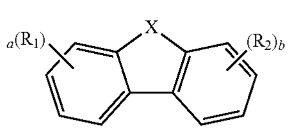

<Formula B>

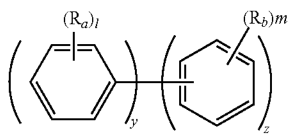

<Formula C>

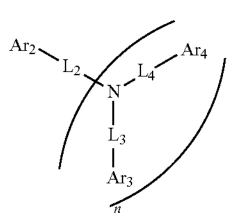

-continued

<Formula D>

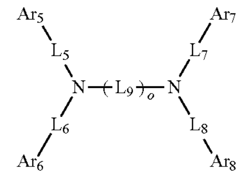

wherein, in Formula A, 1) each of a and b is independently an integer from 0 to 4, 2) X is O, S, CR'R", or N-$L_1$-$Ar_1$, 3) $R_1$ and $R_2$ are respectively and independently selected from the group consisting of deuterium; tritium; a halogen; a cyano group; a nitro group; a $C_6$-$C_{60}$ aryl group; a fluorenyl group; a $C_2$-$C_{60}$ heterocyclic group including at least one hetero atom of O, N, S, Si, or P; a fused ring group of a $C_3$-$C_{60}$ aliphatic ring and a $C_6$-$C_{60}$ aromatic ring; a $C_1$-$C_{50}$ alkyl group; a $C_2$-$C_{20}$ alkenyl group; a $C_2$-$C_{20}$ alkynyl group; a $C_1$-$C_{30}$ alkoxyl group; or a $C_6$-$C_{30}$ aryloxy group, and the plurality of $R_1$s and the plurality of $R_2$s are bonded to form rings, respectively, 4) R' and R" are respectively and independently selected from the group consisting of hydrogen; deuterium; a $C_6$-$C_{60}$ aryl group; a fluorenyl group; a $C_2$-$C_{60}$ heterocyclic group including at least one hetero atom of O, N, S, Si, or P; or a fused ring group of a $C_3$-$C_{60}$ aliphatic ring and a $C_6$-$C_{60}$ aromatic ring, and the R' and R" are bonded to each other to form a ring, 5) $L_1$ is selected from the group consisting of a single bond; a $C_6$-$C_{60}$ arylene group; a fluorenylene group; a $C_2$-$C_{60}$ heterocyclic group including at least one hetero atom of O, N, S, Si, or P; or a fused ring group of a $C_3$-$C_{60}$ aliphatic ring and a $C_6$-$C_{60}$ aromatic ring, and 6) $Ar_1$ is selected from the group consisting of a $C_6$-$C_{60}$ aryl group; a fluorenyl group; a $C_2$-$C_{60}$ heterocyclic group including at least one hetero atom of O, N, S, Si, or P; or a fused ring group of a $C_3$-$C_{60}$ aliphatic ring and a $C_6$-$C_{60}$ aromatic ring, in Formula B, 1) l is an integer from 0 to 5, m is an integer from 0 to 4, each of y and z is an integer from 0 to 4, where y+z is not 0, 2) $R_a$ and $R_b$ are respectively and independently selected from the group consisting of deuterium; tritium; a halogen; a cyano group; a nitro group; a $C_6$-$C_{60}$ aryl group; a fluorenyl group; a $C_2$-$C_{60}$ heterocyclic group including at least one hetero atom of O, N, S, Si, or P; a fused ring group of a $C_3$-$C_{60}$ aliphatic ring and a $C_6$-$C_{60}$ aromatic ring; a $C_1$-$C_{50}$ alkyl group; a $C_2$-$C_{20}$ alkenyl group; a $C_2$-$C_{20}$ alkynyl group; a $C_1$-$C_{30}$ alkoxyl group; or a $C_6$-$C_{30}$ aryloxy group, and the plurality of $R_a$s and the plurality of Ris are bonded to form rings, respectively, in Formula C, 1) N is 1 or 2, 2) $Ar_2$ is a radical of a compound represented by Formula A or a radical of a compound represented by Formula B, 3) Each of $Ar_3$ and $Ar_4$ is independently selected from the group consisting of a $C_6$-$C_{60}$ aryl group; a fluorenyl group; a $C_2$-$C_{60}$ heterocyclic group including at least one hetero atom of O, N, S, Si, or P; or a fused ring group of a $C_3$-$C_{60}$ aliphatic ring and a $C_6$-$C_{60}$ aromatic ring, 4) Each of $L_2$ to $L_4$ is independently selected from the group consisting of a single bond; a $C_6$-$C_{60}$ arylene group; a fluorenylene group; or a $C_2$-$C_{60}$ heterocyclic group including at least one hetero atom of O, N, S, Si, or P, and in Formula D, 1) o is an integer from 1 to 4, 2) Each of $Ar_5$ to $Ar_8$ is independently selected from the group consisting of a $C_6$-$C_{60}$ aryl group; a fluorenyl group; a $C_2$-$C_{60}$ heterocyclic group including at least one hetero atom of O, N, S, Si, or P; or a fused ring group of a $C_3$-$C_{60}$ aliphatic ring and a $C_6$-$C_{60}$ aromatic ring, 3) Each of $L_5$ to $L_9$ is independently selected from the group consisting of a single bond; a $C_6$-$C_{60}$ arylene group; a fluorenylene group; a $C_2$-$C_{60}$ heterocyclic group including at least one hetero atom of O, N, S, Si, or P; or a fused ring group of a $C_3$-$C_{60}$ aliphatic ring and a $C_6$-$C_{60}$ aromatic ring, wherein $L_9$ is a radical of a compound represented by Formula A or a radical of a compound represented by Formula B, and in Formulas A to D, each of the aryl group, the fluorenyl group, the heterocyclic group, the fused ring group, the alkyl group, the alkenyl group, the alkynyl group, the alkoxyl group, the aryloxy group, the arylene group, and the fluorenylene group is further substituted with one or more substituents selected from the group consisting of deuterium; a nitro group; a nitrile group; a halogen group; an amino group; a $C_1$-$C_{20}$ alkylthio group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{25}$ aryl group; $C_6$-$C_{25}$ aryl group substituted with deuterium; a fluorenyl group; a $C_2$-$C_{20}$ heterocyclic group; a $C_3$-$C_{20}$ cycloalkyl group; a $C_7$-$C_{20}$ arylalkyl group; or a $C_8$-$C_{20}$ arylalkenyl group, wherein the further substituted substituents are bonded to form a ring, and each of the further substituted substituents is further substituted with one or more substituents selected from the group consisting of deuterium; a nitro group; a nitrile group; a halogen group; an amino group; a $C_1$-$C_{20}$ alkylthio group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{25}$ aryl group; a $C_6$-$C_{25}$ aryl group substituted with deuterium; a fluorenyl group; a $C_2$-$C_{20}$ heterocyclic group; a $C_3$-$C_{20}$ cycloalkyl group; a $C_7$-$C_{20}$ arylalkyl group; or a $C_8$-$C_{20}$ arylalkenyl group, wherein the substituents are bonded to form a ring.

15. The device of claim 1, wherein at least one of the first emission layer, the second emission layer, or the third emission layer is a blue light emission layer.

16. The device of claim 1, wherein each of the first emission layer, the second emission layer, and the third emission layer is a blue light emission layer.

17. The device of claim 1, wherein one or two of the first emission layer, the second emission layer, and the third emission layer are blue light emission layers, and one or two of the first emission layer, the second emission layer, and the third emission layer may be green light emission layers.

18. The device of claim 1, wherein two emission layers of the first emission layer, the second emission layer, and the third emission layer are blue light emission layers, and the remaining one emission layer of the first emission layer, the second emission layer, and the third emission layer is a green light emission layer.

19. The device of claim 18, wherein the green light emission layer is positioned between the two blue light emission layers.

20. The device of claim 1, wherein at least one of the first emission layer, the second emission layer, or the third emission layer is a multi-emission layer emitting green light and blue light.

21. The device of claim 14, wherein two light emission layers of the first to fourth emission layers are blue light emission layers, and the remaining one emission layer different from the blue light emission layers is a green light emission layer.

22. The device of claim 14, wherein the fourth hole transport layer comprises the fifth compound.

* * * * *